US012266665B2

(12) United States Patent
Miyamoto et al.

(10) Patent No.: US 12,266,665 B2
(45) Date of Patent: Apr. 1, 2025

(54) CIRCUIT BOARD, SEMICONDUCTOR APPARATUS, AND ELECTRONIC EQUIPMENT

(71) Applicant: SONY SEMICONDUCTOR SOLUTIONS CORPORATION, Kanagawa (JP)

(72) Inventors: Takashi Miyamoto, Kanagawa (JP); Masahiro Takahashi, Kanagawa (JP); Yoshiyuki Akiyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 566 days.

(21) Appl. No.: 17/285,694

(22) PCT Filed: Oct. 11, 2019

(86) PCT No.: PCT/JP2019/040170
§ 371 (c)(1),
(2) Date: Apr. 15, 2021

(87) PCT Pub. No.: WO2020/085113
PCT Pub. Date: Apr. 30, 2020

(65) Prior Publication Data
US 2021/0343764 A1 Nov. 4, 2021

(30) Foreign Application Priority Data
Oct. 25, 2018 (JP) ................................. 2018-200531

(51) Int. Cl.
*H04N 25/709* (2023.01)
*H10F 39/00* (2025.01)
*H05K 1/18* (2006.01)

(52) U.S. Cl.
CPC ......... *H10F 39/802* (2025.01); *H04N 25/709* (2023.01)

(58) Field of Classification Search
CPC .. H01L 27/14603; H04N 25/709; H05K 1/07; H05K 1/18; H05K 1/22; H05K 1/24; H05K 1/25
(Continued)

(56) References Cited

U.S. PATENT DOCUMENTS 4,811,082 A * 3/1989 Jacobs .................. H01L 23/538 257/664
5,285,018 A * 2/1994 Pence, IV ............. H01R 12/52 257/E23.079
(Continued)

FOREIGN PATENT DOCUMENTS

CN 104081527 A 10/2014
CN 105789231 A 7/2016
(Continued)

OTHER PUBLICATIONS

International Search Report and Written Opinion of PCT Application No. PCT/JP2019/040170, issued on Dec. 24, 2019, 15 pages of ISRWO.

(Continued)

*Primary Examiner* — Timothy J Thompson
*Assistant Examiner* — Michael F McAllister
(74) *Attorney, Agent, or Firm* — CHIP LAW GROUP

(57) ABSTRACT

The present technology relates to a circuit board, a semiconductor apparatus, and electronic equipment that are configured to make it possible to more effectively suppress the occurrence of noise in signals. A circuit board includes first conductors arranged regularly in a first direction, second conductors arranged regularly in the first direction, and third conductors arranged regularly in the first direction. A first
(Continued)

power supply connected to the first conductors, a second power supply connected to the second conductors, and a third power supply connected to the third conductors are different power supplies. The present technology can be applied to a circuit board of a semiconductor apparatus and the like, for example.

18 Claims, 267 Drawing Sheets

(58) Field of Classification Search
USPC .......................................................... 174/261
See application file for complete search history.

(56) References Cited

U.S. PATENT DOCUMENTS

| | | | | |
|---|---|---|---|---|
| 5,288,949 | A * | 2/1994 | Crafts | H01L 23/5386 174/250 |
| 5,504,370 | A * | 4/1996 | Lin | H01L 23/49575 257/676 |
| 5,633,479 | A * | 5/1997 | Hirano | H05K 1/0253 174/262 |
| 5,686,764 | A * | 11/1997 | Fulcher | H01L 23/50 257/E23.079 |
| 5,818,315 | A * | 10/1998 | Moongilan | H01P 3/08 174/117 FF |
| 5,847,420 | A | 12/1998 | Kuge et al. | |
| 5,912,809 | A * | 6/1999 | Steigerwald | H05K 1/0262 174/262 |
| 5,994,766 | A * | 11/1999 | Shenoy | H01L 23/528 257/664 |
| 6,172,305 | B1 * | 1/2001 | Tanahashi | H01L 23/50 257/E23.079 |
| 6,255,600 | B1 * | 7/2001 | Schaper | H05K 1/0289 174/255 |
| 6,442,041 | B2 * | 8/2002 | Rehm | H05K 1/0224 257/E23.173 |
| 6,489,574 | B1 * | 12/2002 | Otaki | H05K 1/112 174/262 |
| 6,519,191 | B1 | 2/2003 | Morishita | |
| 6,844,620 | B2 * | 1/2005 | Chang | H01L 23/50 257/691 |
| 7,405,363 | B2 * | 7/2008 | Inoue | H05K 1/117 174/255 |
| 7,436,008 | B2 * | 10/2008 | Ho | H01L 23/5225 257/E23.153 |
| 7,939,443 | B2 * | 5/2011 | Fox | H01L 21/823475 438/599 |
| 8,063,480 | B2 * | 11/2011 | Mukaibara | H05K 1/0233 257/691 |
| 8,791,371 | B2 * | 7/2014 | Choi | H05K 1/0225 174/262 |
| 10,043,755 | B2 * | 8/2018 | Betsui | H01L 25/18 |
| 11,778,738 | B2 * | 10/2023 | Hwangbo | H05K 1/141 174/261 |
| 2001/0013422 | A1 * | 8/2001 | Schaper | H01L 23/5383 174/250 |
| 2001/0052792 | A1 | 12/2001 | Doishi et al. | |
| 2002/0108779 | A1 * | 8/2002 | Ohsaka | H05K 1/0216 174/261 |
| 2004/0100778 | A1 * | 5/2004 | Vinciarelli | H05K 1/141 361/768 |
| 2007/0200218 | A1 * | 8/2007 | Mukaibara | H05K 1/0233 257/691 |
| 2010/0062727 | A1 * | 3/2010 | Kemmochi | H05K 1/0243 455/84 |
| 2011/0061898 | A1 * | 3/2011 | Mutnury | G06F 30/367 174/250 |
| 2011/0132650 | A1 * | 6/2011 | Becker | H01L 21/76838 700/121 |
| 2011/0254617 | A1 | 10/2011 | Ishii et al. | |
| 2011/0317384 | A1 * | 12/2011 | Makaibara | H05K 1/0233 361/764 |
| 2013/0063902 | A1 * | 3/2013 | Yoshida | H05K 1/0209 361/728 |
| 2013/0343024 | A1 * | 12/2013 | Hoshi | H05K 1/181 361/783 |
| 2016/0249456 | A1 * | 8/2016 | Youn | H05K 1/115 |
| 2017/0156208 | A1 * | 6/2017 | Chang | H05K 1/115 |
| 2017/0207158 | A1 | 7/2017 | Kang et al. | |
| 2018/0286910 | A1 * | 10/2018 | Kobayashi | H01L 27/14636 |
| 2019/0353686 | A1 * | 11/2019 | Fushimi | H02M 7/003 |
| 2019/0356235 | A1 * | 11/2019 | Shindo | B60L 15/2045 |
| 2019/0357392 | A1 * | 11/2019 | Ikeda | H01G 2/08 |

FOREIGN PATENT DOCUMENTS

| | | | |
|---|---|---|---|
| CN | 106992162 | A | 7/2017 |
| CN | 108695349 | A | 10/2018 |
| JP | 07-245347 | A | 9/1995 |
| JP | 2000-048568 | A | 2/2000 |
| JP | 2001-127254 | A | 5/2001 |
| JP | 2011-222919 | A | 11/2011 |
| JP | 2014-057426 | A | 3/2014 |
| JP | 2015-220250 | A | 12/2015 |
| JP | 2017-103517 | A | 6/2017 |
| JP | 2017-130660 | A | 7/2017 |
| JP | 2018-170471 | A | 11/2018 |
| KR | 10-1999-0088380 | A | 12/1999 |
| KR | 10-2017-0086924 | A | 7/2017 |
| WO | 2013/115075 | A1 | 8/2013 |

OTHER PUBLICATIONS

Office Action for CN Patent Application No. 201980069144.3, issued on Jun. 28, 2024, 07 pages of English Translation and 09 pages of Office Action.

* cited by examiner

FIRST COMPARATIVE EXAMPLE

FIRST CONFIGURATION EXAMPLE

SECOND CONFIGURATION EXAMPLE

SECOND COMPARATIVE EXAMPLE

THIRD COMPARATIVE EXAMPLE

THIRD CONFIGURATION EXAMPLE

FOURTH CONFIGURATION EXAMPLE

FIFTH CONFIGURATION EXAMPLE

SIXTH CONFIGURATION EXAMPLE

SEVENTH CONFIGURATION EXAMPLE

EIGHTH CONFIGURATION EXAMPLE

NINTH CONFIGURATION EXAMPLE

TENTH CONFIGURATION EXAMPLE

ELEVENTH CONFIGURATION EXAMPLE

TWELFTH CONFIGURATION EXAMPLE

THIRTEENTH CONFIGURATION EXAMPLE

ELEVENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FIFTEENTH CONFIGURATION EXAMPLE

FIFTEENTH CONFIGURATION EXAMPLE

FIFTEENTH CONFIGURATION EXAMPLE

SIXTEENTH CONFIGURATION EXAMPLE

SIXTEENTH CONFIGURATION EXAMPLE

SIXTEENTH CONFIGURATION EXAMPLE

SEVENTEENTH CONFIGURATION EXAMPLE

SEVENTEENTH CONFIGURATION EXAMPLE

SEVENTEENTH CONFIGURATION EXAMPLE

EIGHTEENTH CONFIGURATION EXAMPLE

NINETEENTH CONFIGURATION EXAMPLE

NINETEENTH CONFIGURATION EXAMPLE

TWENTIETH CONFIGURATION EXAMPLE

TWENTY-FIRST CONFIGURATION EXAMPLE

TWENTY-SECOND CONFIGURATION EXAMPLE

TWENTY-THIRD CONFIGURATION EXAMPLE

TWENTY-FOURTH CONFIGURATION EXAMPLE

TWENTY-FIFTH CONFIGURATION EXAMPLE

TWENTY-SIXTH CONFIGURATION EXAMPLE

TWENTY-SEVENTH CONFIGURATION EXAMPLE

TWENTY-EIGHTH CONFIGURATION EXAMPLE

CONDUCTOR LAYER C
WYCA
GYC
WYCB

1211A
FYC
1211B
165C
CONDUCTOR LAYER A + CONDUCTOR LAYER C

CONDUCTOR LAYER A
WYA
FYA
GYA
GXA
WXA
FXA 1201
165A
CONDUCTOR LAYER B + CONDUCTOR LAYER C

CONDUCTOR LAYER B
WYB
FYB
GYB
GXB
WXB
FXB 1202
165B
CONDUCTOR LAYER A + CONDUCTOR LAYER B
Y
X
Z
: Vdd WIRE
: Vss WIRE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
GXA
WXA
FXA
1201
165A

CONDUCTOR LAYER B + CONDUCTOR LAYER C

CONDUCTOR LAYER B
WYB
FYB
GYB
GXB
WXB
FXB
1202
165B

CONDUCTOR LAYER A + CONDUCTOR LAYER B
Y
X
Z
: Vdd WIRE
: Vss WIRE
FIRST CONFIGURATION EXAMPLE

CONDUCTOR LAYER C
WYCA2
WYCA1
GYC
WYCB2
WYCB1

FYC
1222A
1222B
165C
CONDUCTOR LAYER A + CONDUCTOR LAYER C

CONDUCTOR LAYER A
WYA
FYA
GYA
GXA
WXA
FXA 1201
165A
CONDUCTOR LAYER B + CONDUCTOR LAYER C

CONDUCTOR LAYER B
WYB
FYB
GYB
GXB
WXB
FXB 1202
165B
CONDUCTOR LAYER A + CONDUCTOR LAYER B
Y
X
Z
: Vdd WIRE
: Vss WIRE
SECOND CONFIGURATION EXAMPLE

CONDUCTOR LAYER C
WYCA2
WYCA1
GYC
WYCB
WYCB
FYC
1223B
1223A
1223B
1223A
165C

CONDUCTOR LAYER A + CONDUCTOR LAYER C

CONDUCTOR LAYER A
WYA
FYA
GYA
GXA
WXA
FXA
1201
165A

CONDUCTOR LAYER B + CONDUCTOR LAYER C

CONDUCTOR LAYER B
WYB
FYB
GYB
GXB
WXB
FXB
1202
165B

CONDUCTOR LAYER A + CONDUCTOR LAYER B
Y
X
Z
: Vdd WIRE
: Vss WIRE
THIRD CONFIGURATION EXAMPLE

CONDUCTOR LAYER C
WYCA
WYCA
GYC
WYCB2
WYCB1
FYC
1223B
1223A
1223B
1223A
165C

CONDUCTOR LAYER A + CONDUCTOR LAYER C

CONDUCTOR LAYER A
WYA
FYA
GYA
GXA
WXA
FXA
1201
165A

CONDUCTOR LAYER B + CONDUCTOR LAYER C

CONDUCTOR LAYER B
WYB
FYB
GYB
GXB
WXB
FXB
1202
165B

CONDUCTOR LAYER A + CONDUCTOR LAYER B
Y
X
Z
: Vdd WIRE
: Vss WIRE
THIRD CONFIGURATION EXAMPLE

CONDUCTOR LAYER C
WYCA
GYC
WYCB
FYC
1221A
1221B
165C

CONDUCTOR LAYER A
WYA
FYA
GYA
GXA
WXA
FXA
1241
1201
165A

CONDUCTOR LAYER B
WYB
FYB
GYB
GXB
WXB
FXB
1242
1202
165B

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRE
: Vss WIRE
FOURTH CONFIGURATION EXAMPLE

CONDUCTOR LAYER C
WXCB
WXCA
GXC
FXC
1251A
1251B
165C

CONDUCTOR LAYER A + CONDUCTOR LAYER C

CONDUCTOR LAYER A
WYA
FYA
GYA
FXA
WXA
GXA
1241
1201
165A

CONDUCTOR LAYER B + CONDUCTOR LAYER C

CONDUCTOR LAYER B
WYB
FYB
GYB
FXB
WXB
GXB
1242
1202
165B

CONDUCTOR LAYER A + CONDUCTOR LAYER B
Y
X
Z
: Vdd WIRE
: Vss WIRE
FOURTH CONFIGURATION EXAMPLE

CONDUCTOR LAYER C
WYCA
GYC
WYCB

CONDUCTOR LAYER A
WYA
FYA
GYA
FXA
WXA
GXA

CONDUCTOR LAYER B
WYB
FYB
GYB
FXB
WXB
GXB

CONDUCTOR LAYER A + CONDUCTOR LAYER C
FYC
1221A
1221B
165C

CONDUCTOR LAYER B + CONDUCTOR LAYER C
1241
1201
165A

CONDUCTOR LAYER A + CONDUCTOR LAYER B
1242
1202
165B
Y
X
Z
: Vdd WIRE
: Vss WIRE
EIGHTH CONFIGURATION EXAMPLE

CONDUCTOR LAYER C
WXCB
WXCA
GXC
FXC
1251A
1251B
165C

CONDUCTOR LAYER A + CONDUCTOR LAYER C

CONDUCTOR LAYER A
WYA
FYA
GYA
FXA
WXA
GXA
1241
1201
165A

CONDUCTOR LAYER B + CONDUCTOR LAYER C

CONDUCTOR LAYER B
WYB
FYB
GYB
FXB
WXB
GXB
1242
1202
165B

CONDUCTOR LAYER A + CONDUCTOR LAYER B
Y
X
Z
: Vdd WIRE
: Vss WIRE
EIGHTH CONFIGURATION EXAMPLE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
FXA
WXA
GXA
1201
1241
1243
165A

CONDUCTOR LAYER B + CONDUCTOR LAYER C

CONDUCTOR LAYER B
WYB
FYB
GYB
FXB
WXB
GXB
1242
1202
165B

CONDUCTOR LAYER A + CONDUCTOR LAYER B
Y
X
Z
: Vdd WIRE
: Vss WIRE
NINTH CONFIGURATION EXAMPLE

CONDUCTOR LAYER C
1251A
1251B
165C
FXC
GXC
WXCA
WXCB

CONDUCTOR LAYER A
1243
1241
1201
165A
GXA
WXA
FXA
WYA
FYA
GYA

CONDUCTOR LAYER B
1242
1202
165B
GXB
WXB
FXB
WYB
FYB
GYB

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRE
: Vss WIRE
NINTH CONFIGURATION EXAMPLE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
FXA
WXA
GXA
1201
1241
1243
165A

CONDUCTOR LAYER B + CONDUCTOR LAYER C

CONDUCTOR LAYER B
WYB
FYB
GYB
FXB
WXB
GXB
1242
1244
1202
165B

CONDUCTOR LAYER A + CONDUCTOR LAYER B
Y
X
Z
: Vdd WIRE
: Vss WIRE
NINTH CONFIGURATION EXAMPLE

CONDUCTOR LAYER C 1251A
1251B
165C
FXC
GXC
WXCA
WXCB

CONDUCTOR LAYER A 1243
1241
1201
165A
GXA
WXA
FXA
WYA
FYA
GYA

CONDUCTOR LAYER B 1242
1244
1202
165B
GXB
WXB
FXB
WYB
FYB
GYB
CONDUCTOR LAYER A + CONDUCTOR LAYER C
CONDUCTOR LAYER B + CONDUCTOR LAYER C
CONDUCTOR LAYER A + CONDUCTOR LAYER B
Y
X
Z
: Vdd WIRE
: Vss WIRE
NINTH CONFIGURATION EXAMPLE

CONDUCTOR LAYER C
165C
1251A
1251B
FXC
GXC
WXCA
WXCB

CONDUCTOR LAYER A + CONDUCTOR LAYER C

CONDUCTOR LAYER A
165A
1243
1241
1201
GXA
WXA
FXA
WYA
FYA
GYA

CONDUCTOR LAYER B + CONDUCTOR LAYER C

CONDUCTOR LAYER B
165B
1242
1244
1202
GXB
WXB
FXB
WYB
FYB
GYB

CONDUCTOR LAYER A + CONDUCTOR LAYER B
Y
X
Z
: Vdd WIRE
: Vss WIRE
NINTH CONFIGURATION EXAMPLE

CONDUCTOR LAYER C
WYCA
GYC
WYCB
FYC
1291A
1291B
165C

CONDUCTOR LAYER A + CONDUCTOR LAYER C

CONDUCTOR LAYER A
WYA
FYA
GYA
FXA
WXA
GXA
1241
1201
165A

CONDUCTOR LAYER B + CONDUCTOR LAYER C

CONDUCTOR LAYER B
WYB
FYB
GYB
FXB
WXB
GXB
1242
1202
165B

CONDUCTOR LAYER A + CONDUCTOR LAYER B
Y
X
Z
: Vdd WIRE
: Vss WIRE
TENTH CONFIGURATION EXAMPLE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
FXA
WXA
GXA
1241
1311
165A

CONDUCTOR LAYER B + CONDUCTOR LAYER C

CONDUCTOR LAYER B
WYB
FYB
GYB
FXB
WXB
GXB
1242
1312
165B

CONDUCTOR LAYER A + CONDUCTOR LAYER B
Y
X
Z
: Vdd WIRE
: Vss WIRE
ELEVENTH CONFIGURATION EXAMPLE

CONDUCTOR LAYER C
FYC
1221A
1221B
165C
WYCA
GYC
WYCB

CONDUCTOR LAYER A
1321
165A

CONDUCTOR LAYER B
1242
1312
165B
GXB
WXB
FXB
WYB
FYB
GYB

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRE
: Vss WIRE
TWELFTH CONFIGURATION EXAMPLE

CONDUCTOR LAYER C
WYCA
GYC
WYCB
FYC
1221A
1221B
165C

CONDUCTOR LAYER A + CONDUCTOR LAYER C

CONDUCTOR LAYER A
WYA
FYA
GYA
FXA
WXA
GXA
1331
165A

CONDUCTOR LAYER B + CONDUCTOR LAYER C

CONDUCTOR LAYER B
WYB
FYB
GYB
FXB
WXB
GXB
1242
1312
165B

CONDUCTOR LAYER A + CONDUCTOR LAYER B
Y
X
Z
: Vdd WIRE
: Vss WIRE
THIRTEENTH CONFIGURATION EXAMPLE

CONDUCTOR LAYER C
WYCA
GYC
WYCB
FXC
WXCA, WXCB
GXC
FYC
1341A
1341B
165C

CONDUCTOR LAYER A
WYA
FYA
GYA
FXA
WXA
GXA
1241
1311
165A

CONDUCTOR LAYER B
WYB
FYB
GYB
FXB
WXB
GXB
1242
1312
165B

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRE
: Vss WIRE
FOURTEENTH CONFIGURATION EXAMPLE

CONDUCTOR LAYER C
WYCA
GYC
WYCB
FXC
WXCA, WXCB
GXC
FYC
1341B
1341A
165C

CONDUCTOR LAYER A
WYA
FYA
GYA
FXA
WXA
GXA
1241
1311
165A

CONDUCTOR LAYER B
WYB
FYB
GYB
FXB
WXB
GXB
1242
1312
165B

CONDUCTOR LAYER A + CONDUCTOR LAYER C

CONDUCTOR LAYER B + CONDUCTOR LAYER C

CONDUCTOR LAYER A + CONDUCTOR LAYER B
Y
X
Z
: Vdd WIRE
: Vss WIRE
FOURTEENTH CONFIGURATION EXAMPLE

CONDUCTOR LAYER C

CONDUCTOR LAYER A

CONDUCTOR LAYER B

CONDUCTOR LAYER A + CONDUCTOR LAYER C

CONDUCTOR LAYER B + CONDUCTOR LAYER C

CONDUCTOR LAYER A + CONDUCTOR LAYER B

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

FOURTEENTH CONFIGURATION EXAMPLE

0/12 PITCH DISPLACEMENT
(NOT DISPLACED)

1/12 PITCH DISPLACEMENT
(PITCH DISPLACEMENT = 1A)

2/12 PITCH DISPLACEMENT
(PITCH DISPLACEMENT = 2A)

3/12 PITCH DISPLACEMENT
(PITCH DISPLACEMENT = 3A)

: Vss WIRE

: Vdd WIRE

Y
Z
X

WITH RELAY CONDUCTOR

WITH RELAY CONDUCTOR

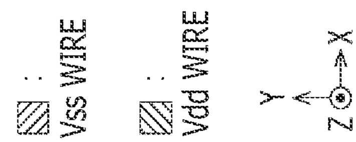
FIG. 187B
4/9 PITCH DISPLACEMENT
(PITCH DISPLACEMENT = 4A)
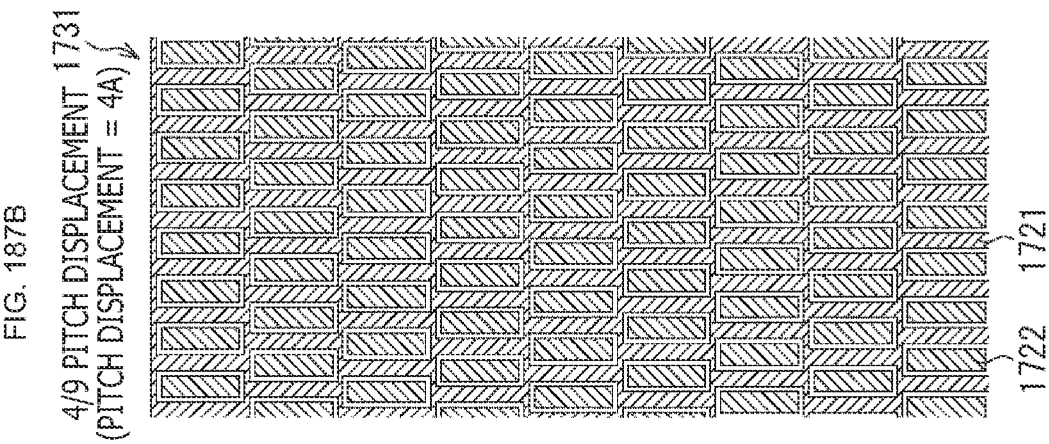
FIG. 187A
3/9 PITCH DISPLACEMENT
(PITCH DISPLACEMENT = 3A)
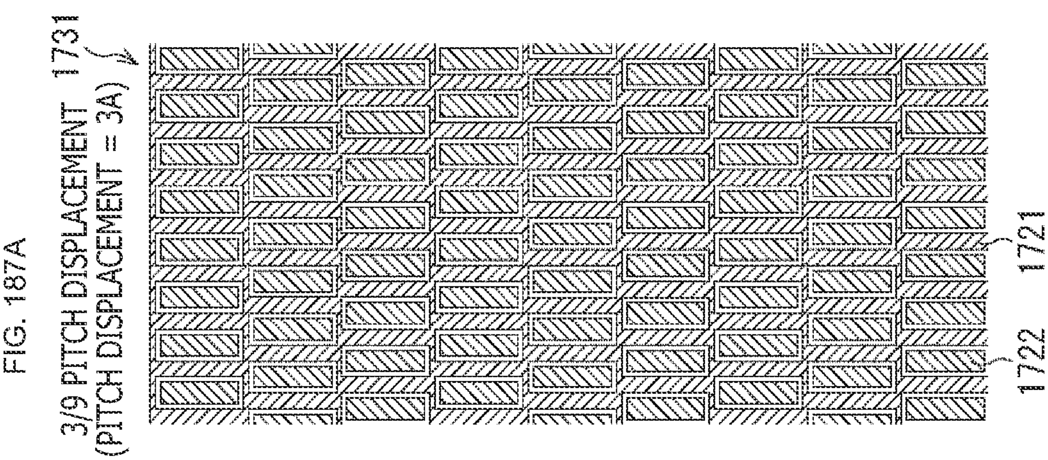

0/14 PITCH DISPLACEMENT (NOT DISPLACED)

1/14 PITCH DISPLACEMENT (PITCH DISPLACEMENT = 1A)

2/14 PITCH DISPLACEMENT (PITCH DISPLACEMENT = 2A)

3/14 PITCH DISPLACEMENT (PITCH DISPLACEMENT = 3A)

4/14 PITCH DISPLACEMENT
(PITCH DISPLACEMENT = 4A)

5/14 PITCH DISPLACEMENT
(PITCH DISPLACEMENT = 5A)

6/14 PITCH DISPLACEMENT
(PITCH DISPLACEMENT = 6A)

7/14 PITCH DISPLACEMENT
(PITCH DISPLACEMENT = 7A)

WITH RELAY CONDUCTOR

3/16 PITCH DISPLACEMENT
(PITCH DISPLACEMENT = 3A)

4/16 PITCH DISPLACEMENT
(PITCH DISPLACEMENT = 4A)

5/16 PITCH DISPLACEMENT
(PITCH DISPLACEMENT = 5A)

: Vss WIRE

: Vdd WIRE

Y, Z, X

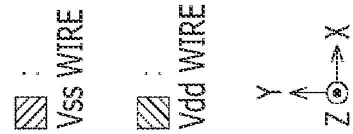
FIG. 198C
8/16 PITCH DISPLACEMENT
(PITCH DISPLACEMENT = 8A)
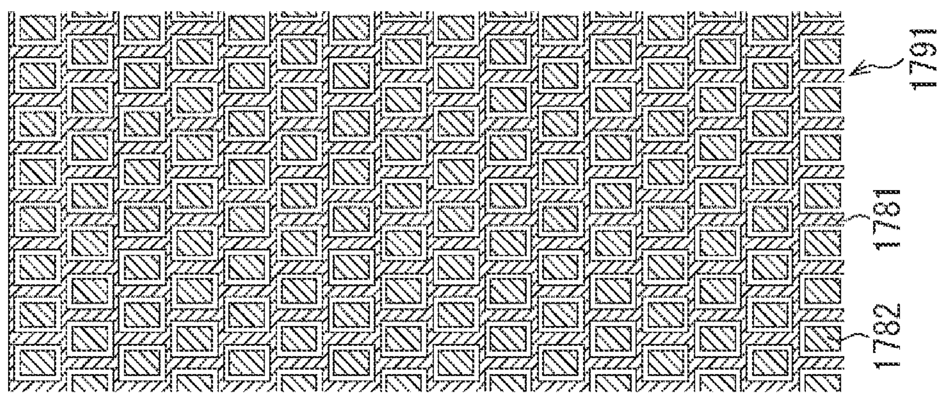
FIG. 198B
7/16 PITCH DISPLACEMENT
(PITCH DISPLACEMENT = 7A)
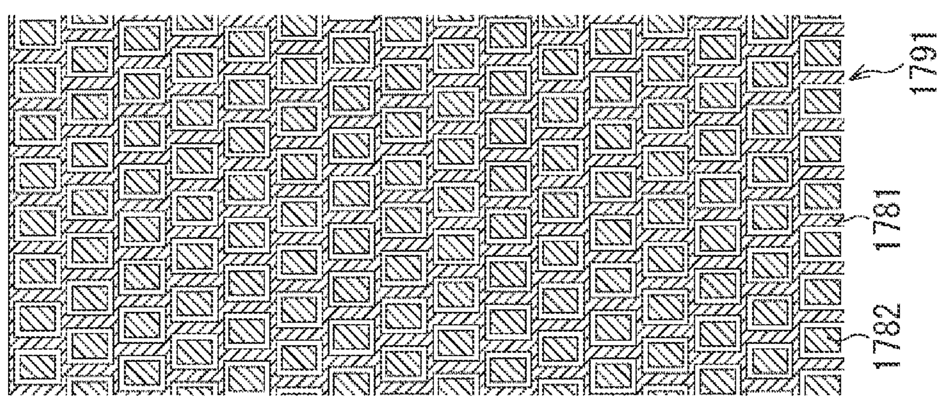
FIG. 198A
6/16 PITCH DISPLACEMENT
(PITCH DISPLACEMENT = 6A)
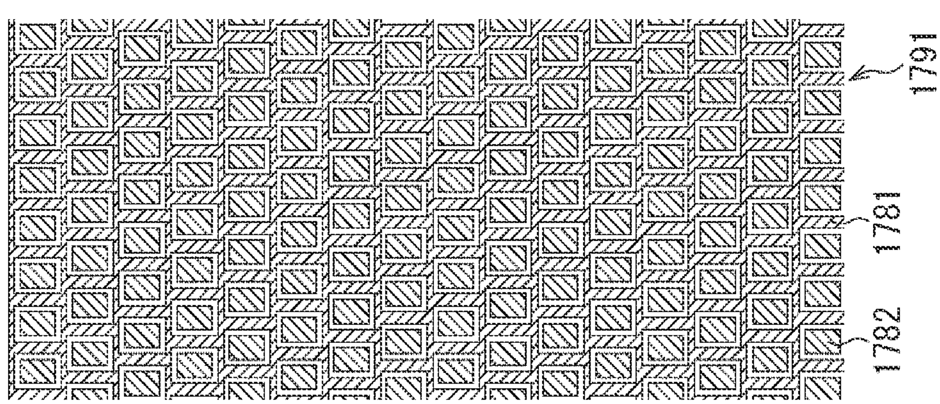

WITH RELAY CONDUCTOR

WITHOUT RELAY CONDUCTOR

WITHOUT RELAY CONDUCTOR

0/12 PITCH DISPLACEMENT (NOT DISPLACED)

1/12 PITCH DISPLACEMENT (PITCH DISPLACEMENT = 1A)

2/12 PITCH DISPLACEMENT (PITCH DISPLACEMENT = 2A)

3/12 PITCH DISPLACEMENT (PITCH DISPLACEMENT = 3A)

4/12 PITCH DISPLACEMENT
(PITCH DISPLACEMENT = 4A)

5/12 PITCH DISPLACEMENT
(PITCH DISPLACEMENT = 5A)

6/12 PITCH DISPLACEMENT
(PITCH DISPLACEMENT = 6A)

WITH RELAY CONDUCTOR

WITHOUT RELAY CONDUCTOR

FIRST CONFIGURATION EXAMPLE

FIRST CONFIGURATION EXAMPLE

CONDUCTOR LAYER A
FXAS1
FXAD
FXAS2
WXAD
WXAS1
WXAS2
GXA
2101
2102
2103
165A
FIRST CONFIGURATION EXAMPLE

CONDUCTOR LAYER B
FXBS1
FXBD
FXBS2
WXBD
WXBS2
WXBS1
GXB
2121
2123
2122
165B
: Vdd WIRE
: Vss1 WIRE
: Vss2 WIRE
Y
Z
X

FIRST CONFIGURATION EXAMPLE

FIRST CONFIGURATION EXAMPLE

: Vdd WIRE : Vss1 WIRE : Vss2 WIRE

Y
Z X

FIRST CONFIGURATION EXAMPLE

FIRST CONFIGURATION EXAMPLE

CONDUCTOR LAYER B

CONDUCTOR LAYER A

SECOND CONFIGURATION EXAMPLE

SECOND CONFIGURATION EXAMPLE

SECOND CONFIGURATION EXAMPLE

THIRD CONFIGURATION EXAMPLE

CONDUCTOR LAYER A + CONDUCTOR LAYER B

CONDUCTOR LAYER A + CONDUCTOR LAYER B

THIRD CONFIGURATION EXAMPLE

CONDUCTOR LAYER B

CONDUCTOR LAYER A

THIRD CONFIGURATION EXAMPLE

CONDUCTOR LAYER A

CONDUCTOR LAYER A

THIRD CONFIGURATION EXAMPLE

FOURTH CONFIGURATION EXAMPLE

CONDUCTOR LAYER A + CONDUCTOR LAYER B

CONDUCTOR LAYER A + CONDUCTOR LAYER B

FIFTH CONFIGURATION EXAMPLE

CONDUCTOR LAYER B

CONDUCTOR LAYER A

FIFTH CONFIGURATION EXAMPLE

CONDUCTOR LAYER A

CONDUCTOR LAYER A

FIFTH CONFIGURATION EXAMPLE

CONDUCTOR LAYER A
WYA
GYA
FYA
FXA
WXA
GXA
2301a
165A

CONDUCTOR LAYER B
WYB
GYB
FYB
FXB
WXB
GXB
2302
165B

CONDUCTOR LAYER C
WYC
GYC
FYC
FXC
GXC
WXC
2301b
165C

CONDUCTOR LAYER A + CONDUCTOR LAYER B

CONDUCTOR LAYER A + CONDUCTOR LAYER C

CONDUCTOR LAYER B + CONDUCTOR LAYER C
SIXTH CONFIGURATION EXAMPLE
Y
X
Z
: Vdd WIRE
: Vss1 WIRE
: Vss2 WIRE

CONDUCTOR LAYER A
2311
2301
2311
165A
WYA
GYA
FYA
GXA
WXA
FXA

CONDUCTOR LAYER B
2302
165B
WYB
GYB
FYB
GXB
WXB
FXB

CONDUCTOR LAYER C
2312
2303
2312
165C
WYC
GYC
FYC
GXC
WXC
FXC

CONDUCTOR LAYER A + CONDUCTOR LAYER B

CONDUCTOR LAYER A + CONDUCTOR LAYER C

CONDUCTOR LAYER B + CONDUCTOR LAYER C
Y
X
Z
: Vdd WIRE
: Vss1 WIRE
: Vss2 WIRE
SIXTH CONFIGURATION EXAMPLE

CONDUCTOR LAYER A
2331
165A
WYA
GYA
FYA
FXA
WXA
GXA

CONDUCTOR LAYER B
2332
165B
GYB
WYB
FYB
FXB
WXB
GXB

CONDUCTOR LAYER C
2333
165C
WYC
GYC
FYC
FXC
WXC
GXC

CONDUCTOR LAYER A + CONDUCTOR LAYER B

CONDUCTOR LAYER A + CONDUCTOR LAYER C

CONDUCTOR LAYER B + CONDUCTOR LAYER C
SEVENTH CONFIGURATION EXAMPLE
Y
X
Z
: Vdd WIRE
: Vss1 WIRE
: Vss2 WIRE

CONDUCTOR LAYER A
WYA
GYA
FYA
WXA
GXA
FXA
2341
2331
2341
165A

CONDUCTOR LAYER B
WYB
GYB
FYB
WXB
GXB
FXB
2332
165B

CONDUCTOR LAYER C
WYC
GYC
FYC
WXC
GXC
FXC
2342
2333
2342
165C

CONDUCTOR LAYER A + CONDUCTOR LAYER B

CONDUCTOR LAYER A + CONDUCTOR LAYER C

CONDUCTOR LAYER B + CONDUCTOR LAYER C
SEVENTH CONFIGURATION EXAMPLE
Y
X
Z
: Vdd WIRE
: Vss1 WIRE
: Vss2 WIRE

CONDUCTOR LAYER A
2331
165A
WYA
GYA
FYA
FXA
WXA
GXA

CONDUCTOR LAYER B
2351
2332
165B
WYB
GYB
FYB
FXB
WXB
GXB

CONDUCTOR LAYER C
2353
2352
2333
165C
WYC
GYC
FYC
FXC
WXC
GXC

CONDUCTOR LAYER A + CONDUCTOR LAYER B

CONDUCTOR LAYER A + CONDUCTOR LAYER C

CONDUCTOR LAYER B + CONDUCTOR LAYER C
Y
X
Z
: Vdd WIRE
: Vss1 WIRE
: Vss2 WIRE
EIGHTH CONFIGURATION EXAMPLE

CONDUCTOR LAYER A
WYA
GYA
FYA
FXA
WXA
GXA
2361
165A

CONDUCTOR LAYER B
WYB
GYB
FYB
FXB
WXB
GXB
2372
2371
2362
2372
2371
165B

CONDUCTOR LAYER C
WYC
GYC
FYC
FXC
WXC
GXC
2352
2353
2333
2352
2353
165C

CONDUCTOR LAYER A + CONDUCTOR LAYER B

CONDUCTOR LAYER A + CONDUCTOR LAYER C

CONDUCTOR LAYER B + CONDUCTOR LAYER C
Y
X
Z
: Vdd WIRE
: Vss1 WIRE
: Vss2 WIRE
EIGHTH CONFIGURATION EXAMPLE

CONDUCTOR LAYER A
2361
165A
WYA
GYA
FYA
WXA
GXA
FXA

CONDUCTOR LAYER B
2363
2362
165B
WYB
GYB
FYB
WXB
GXB
FXB

CONDUCTOR LAYER C
2352
2353
2333
2333
165C
2352
2353
WYC
GYC
FYC
WXC
GXC
FXC

CONDUCTOR LAYER A + CONDUCTOR LAYER B

CONDUCTOR LAYER A + CONDUCTOR LAYER C

CONDUCTOR LAYER B + CONDUCTOR LAYER C
Y
X
Z
: Vdd WIRE
: Vss1 WIRE
: Vss2 WIRE
EIGHTH CONFIGURATION EXAMPLE

NINTH CONFIGURATION EXAMPLE

CIRCUIT BOARD, SEMICONDUCTOR APPARATUS, AND ELECTRONIC EQUIPMENT

CROSS REFERENCE TO RELATED APPLICATIONS

This application is a U.S. National Phase of International Patent Application No. PCT/JP2019/040170 filed on Oct. 11, 2019, which claims priority benefit of Japanese Patent Application No. JP 2018-200531 filed in the Japan Patent Office on Oct. 25, 2018. Each of the above-referenced applications is hereby incorporated herein by reference in its entirety.

TECHNICAL FIELD

The present technology relates to a circuit board, a semiconductor apparatus, and electronic equipment, and particularly relates to a circuit board, a semiconductor apparatus, and electronic equipment that are configured to make it possible to more effectively suppress the occurrence of noise in signals.

BACKGROUND ART

In solid-state image pickup apparatuses represented by CMOS (complementary metal oxide semiconductor) image sensors, noise can occur in pixel signals generated by each pixel due to the internal configurations of the solid-state image pickup apparatuses.

For example, there are some active elements such as transistors and diodes inside a solid-state image pickup apparatus that generate minute hot carrier light emissions, and in a case in which the hot carrier light emissions leak into photoelectric converting units formed in pixels, noise occurs in pixel signals.

As a known method of suppressing noise due to hot carrier light emissions that are generated from active elements, there is a technology of giving a light-blocking structure to wires formed between active elements and photoelectric converting units (see PTL 1, for example).

In addition, for example, noise (inductive noise) is generated in pixel signals in some cases because of an induced electromotive force resulting from a magnetic field that occurs due to the internal configuration of a solid-state image pickup apparatus. Specifically, when a pixel signal is to be read out from a pixel, a conductor loop is formed on a pixel array by a control line through which a control signal for selecting a pixel from which a pixel signal is to be read out is transferred, and a signal line through which the pixel signal read out from the selected pixel is transferred.

Then, if there is a wire near the conductor loop including the control line and the signal line, magnetic flux passing through the conductor loop occurs as a result of a change of a current flowing through the wire, and this generates an induced electromotive force in the conductor loop, and generates inductive noise in the pixel signal, in some cases. Hereinafter, a conductor loop to which magnetic flux is generated as a result of a change of a current flowing through a nearby wire, and in which an induced electromotive force is generated thereby is referred to as a Victim conductor loop.

As a method of suppressing inductive noise inside electronic equipment, there is a method of cancelling magnetic flux that is generated by wires inside the electronic equipment, by forming the wires as two layers of mesh wires (see PTL 2, for example).

CITATION LIST

Patent Literature

[PTL 1]
PCT Patent Publication No. WO2013/115075
[PTL 2]
Japanese Patent Laid-open No. 2014-57426

SUMMARY

Technical Problem

It should be noted however that the invention described in PTL 2 mentioned above can suppress inductive noise, but does not take into consideration blocking of hot carrier light emissions.

The present technology has been made in view of such a situation and makes it possible to more effectively suppress the occurrence of noise in signals.

Solution to Problem

A circuit board of a first aspect of the present technology includes first conductors arranged regularly in a first direction, second conductors arranged regularly in the first direction, and third conductors arranged regularly in the first direction. A first power supply connected to the first conductors, a second power supply connected to the second conductors, and a third power supply connected to the third conductors are different power supplies.

A semiconductor apparatus of a second aspect of the present technology includes a circuit board. The circuit board includes first conductors arranged regularly in a first direction, second conductors arranged regularly in the first direction, and third conductors arranged regularly in the first direction. A first power supply connected to the first conductors, a second power supply connected to the second conductors, and a third power supply connected to the third conductors are different power supplies.

Electronic equipment of a third aspect of the present technology includes a semiconductor apparatus including a circuit board. The circuit board includes first conductors arranged regularly in a first direction, second conductors arranged regularly in the first direction, and third conductors arranged regularly in the first direction. A first power supply connected to the first conductors, a second power supply connected to the second conductors, and a third power supply connected to the third conductors are different power supplies.

In the configurations in the first to third aspects of the present technology, first conductors arranged regularly in a first direction, second conductors arranged regularly in the first direction, and third conductors arranged regularly in the first direction are provided in a circuit board. A first power supply connected to the first conductors, a second power supply connected to the second conductors, and a third power supply connected to the third conductors are different power supplies.

The circuit board, the semiconductor apparatus, and the electronic equipment may be independent apparatuses or may be modules to be incorporated into other apparatuses.

Figure 120A:
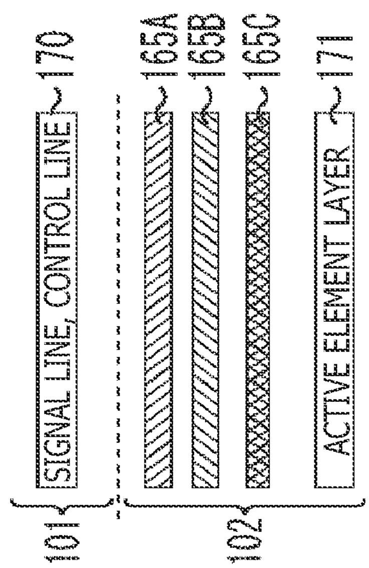
Figure 120B:
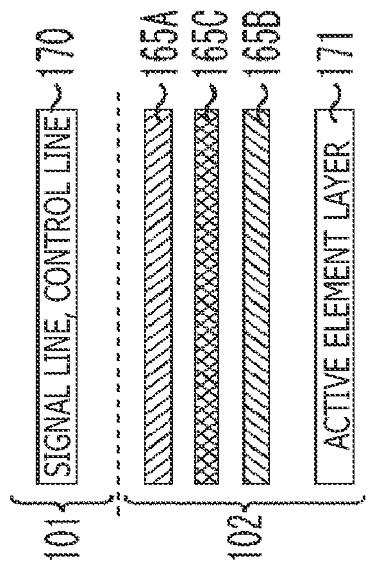
Figure 120C:
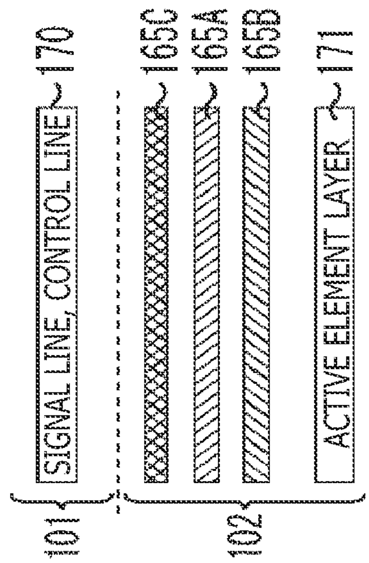

FIGS. 120A, 120B, and 120C are figures depicting arrangement examples in a case in which there are three conductor layers.

FIGS. 121A, 121B, 121C, 121D, 121E, and 121F are figures for explaining a problem in a case in which there are three conductor layers.

FIGS. 122A, 122B, 122C, 122D, 122E, and 122F are figures depicting a first configuration example of three conductor layers.

FIGS. 123A, 123B, 123C, 123D, 123E, and 123F are figures depicting a second configuration example of three conductor layers.

FIGS. 124A, 124B, 124C, 124D, 124E, and 124F are figures depicting a first modification example of the second configuration example of three conductor layers.

FIGS. 125A, 125B, 125C, 125D, 125E, and 125F is are figures depicting a second modification example of the second configuration example of three conductor layers.

FIGS. 126A, 126B, 126C, 126D, 126E, and 126F are figures depicting a third configuration example of three conductor layers.

FIGS. 127A, 127B, 127C, 127D, 127E, and 127F are figures depicting a modification example of the third configuration example of three conductor layers.

FIGS. 128A, 128B, 128C, 128D, 128E, and 128F are figures depicting a fourth configuration example of three conductor layers.

FIGS. 129A, 129B, 129C, 129D, 129E, and 129F are figures depicting a first modification example of the fourth configuration example of three conductor layers.

FIGS. 130A, 130B, 130C, 130D, 130E, and 130F are figures depicting a second modification example of the fourth configuration example of three conductor layers.

FIGS. 131A, 131B, 131C, 131D, 131E, and 131F are figures depicting a fifth configuration example of three conductor layers.

FIGS. 132A, 132B, 132C, 132D, 132E, and 132F are figures depicting a sixth configuration example of three conductor layers.

FIGS. 133A, 133B, 133C, 133D, 133E, and 133F are figures depicting a modification example of the sixth configuration example of three conductor layers.

FIGS. 134A, 134B, 134C, 134D, 134E, and 134F are figures depicting a seventh configuration example of three conductor layers.

FIGS. 135A, 135B, 135C, 135D, 135E, and 135F are figures depicting an eighth configuration example of three conductor layers.

FIGS. 136A, 136B, 136C, 136D, 136E, and 136F is are figures depicting a first modification example of the eighth configuration example of three conductor layers.

FIGS. 137A, 137B, 137C, 137D, 137E, and 137F are figures depicting a second modification example of the eighth configuration example of three conductor layers.

FIGS. 138A, 138B, 138C, 138D, 138E, and 138F are figures depicting a third modification example of the eighth configuration example of three conductor layers.

FIGS. 139A, 139B, 139C, 139D, 139E, and 139F are figures depicting a fourth modification example of the eighth configuration example of three conductor layers.

FIGS. 140A, 140B, 140C, 140D, 140E, and 140F are figures depicting a fifth modification example of the eighth configuration example of three conductor layers.

FIGS. 141A, 141B, 141C, 141D, 141E, and 141F are figures depicting a ninth configuration example of three conductor layers.

FIGS. 142A, 142B, 142C, 142D, 142E, and 142F are figures depicting a first modification example of the ninth configuration example of three conductor layers.

FIGS. 143A, 143B, 143C, 143D, 143E, and 143F are figures depicting a second modification example of the ninth configuration example of three conductor layers.

FIGS. 144A, 144B, 144C, 144D, 144E, and 144F are figures depicting a third modification example of the ninth configuration example of three conductor layers.

FIGS. 145A, 145B, 145C, 145D, 145E, and 145F are figures depicting a fourth modification example of the ninth configuration example of three conductor layers.

FIGS. 146A, 146B, 146C, 146D, 146E, and 146F are figures depicting a tenth configuration example of three conductor layers.

FIGS. 147A, 147B, 147C, 147D, 147E, and 147F are figures depicting a modification example of the tenth configuration example of three conductor layers.

FIGS. 148A, 148B, 148C, 148D, 148E, and 148F are figures depicting an eleventh configuration example of three conductor layers.

FIGS. 149A, 149B, 149C, 149D, 149E, and 149F are figures depicting a twelfth configuration example of three conductor layers.

FIGS. 150A, 150B, 150C, 150D, 150E, and 150F are figures depicting a first modification example of the twelfth configuration example of three conductor layers.

FIGS. 151A, 151B, 151C, 151D, 151E, and 151F are figures depicting a second modification example of the twelfth configuration example of three conductor layers.

FIGS. 152A, 152B, 152C, 152D, 152E, and 152F are figures depicting a thirteenth configuration example of three conductor layers.

FIGS. 153A, 153B, 153C, 153D, 153E, and 153F are figures depicting a fourteenth configuration example of three conductor layers.

FIGS. 154A, 154B, 154C, 154D, 154E, and 154F are figures depicting a first modification example of the fourteenth configuration example of three conductor layers.

FIGS. 155A, 155B, 155C, 155D, 155E, and 155F are figures depicting a second modification example of the fourteenth configuration example of three conductor layers.

Figure 156A:
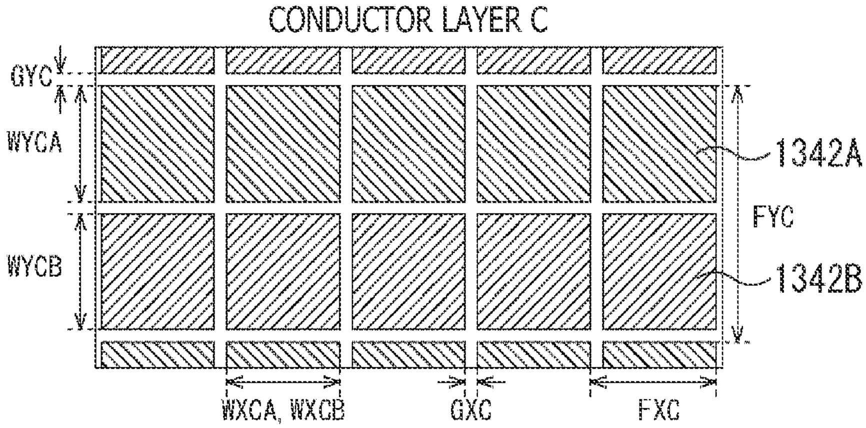
Figure 156B:
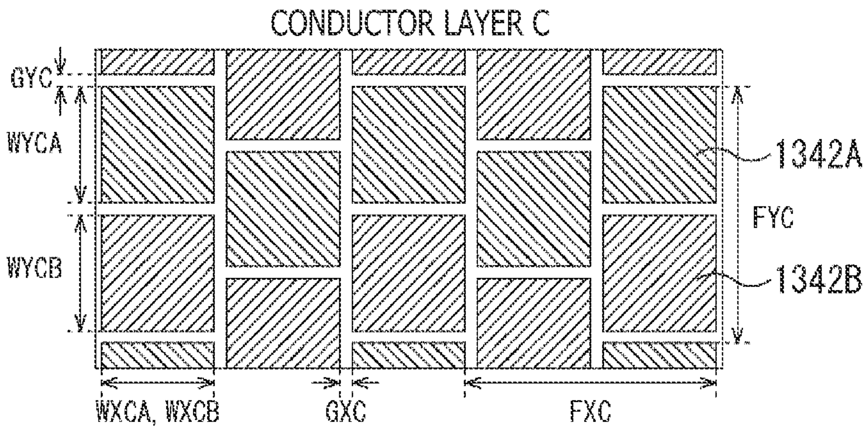
Figure 156C:
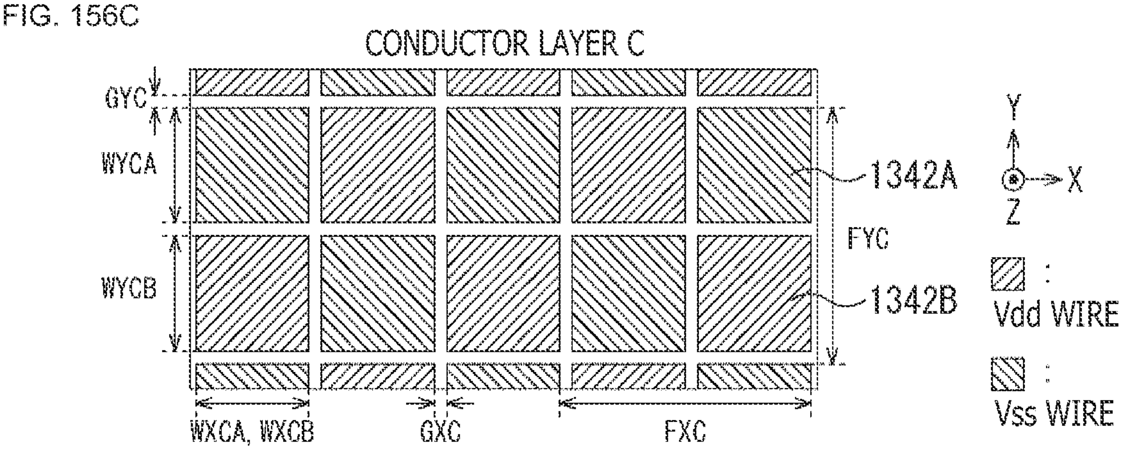

FIGS. 156A, 156B, and 156C are figures depicting a third modification example to a fifth modification example of the fourteenth configuration example of three conductor layers.

Figure 157A:
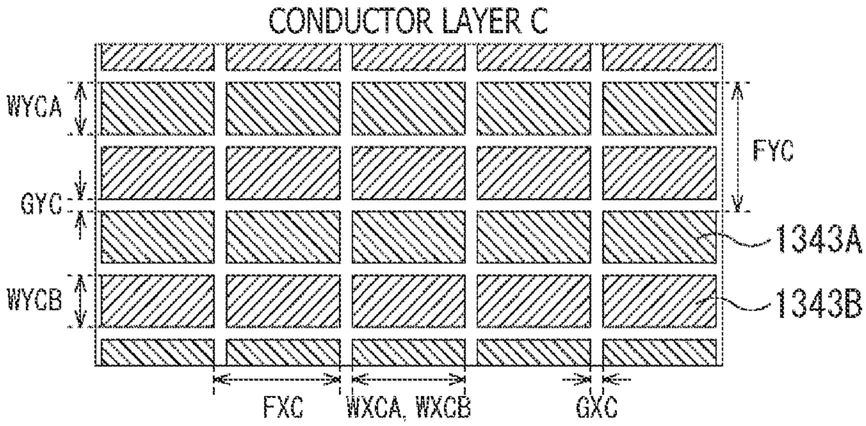
Figure 157B:
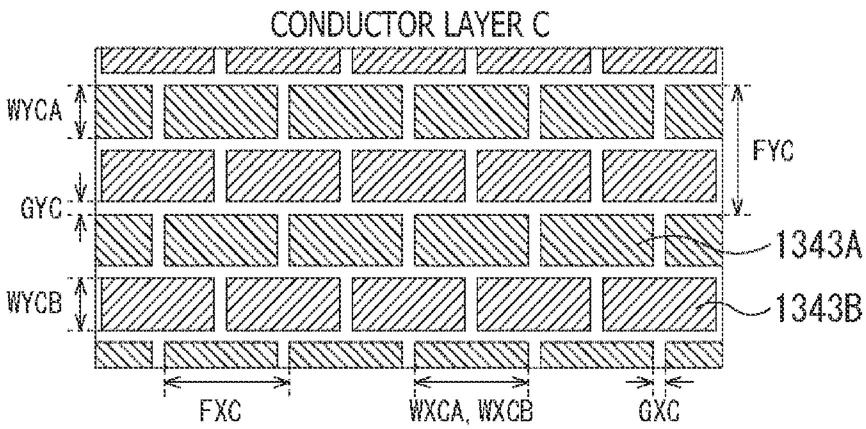
Figure 157C:
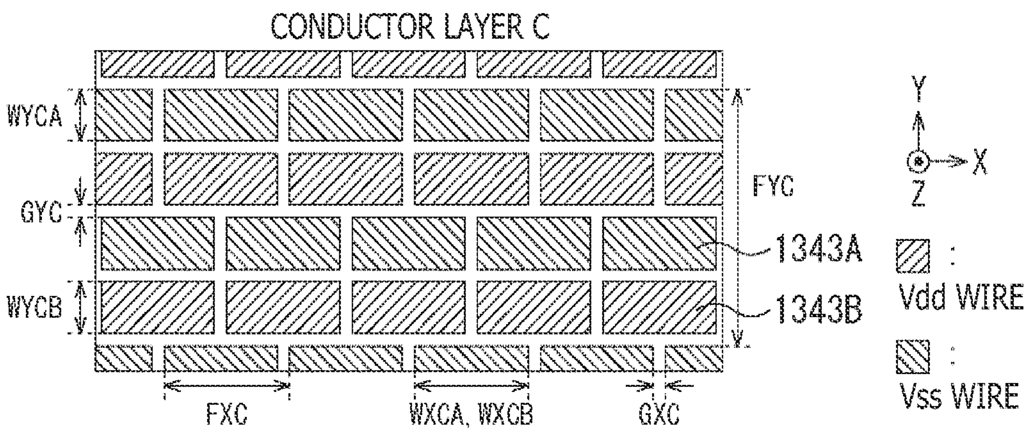

FIGS. 157A, 157B, and 157C are figures depicting a sixth modification example to an eighth modification example of the fourteenth configuration example of three conductor layers.

Figure 158A:
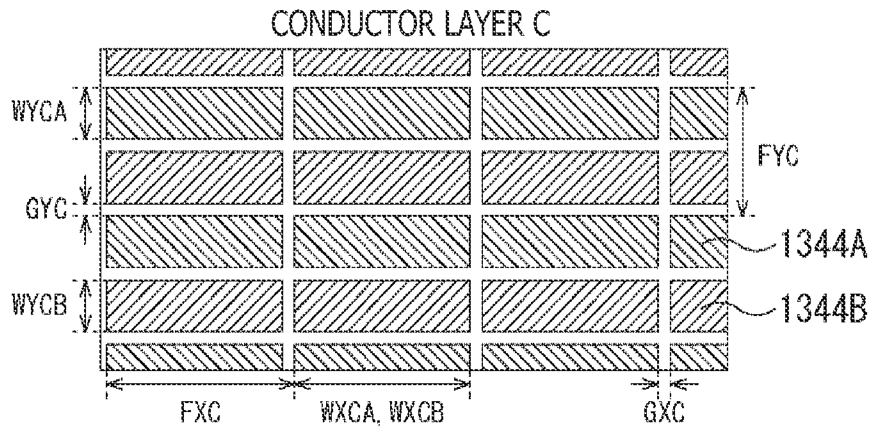
Figure 158B:
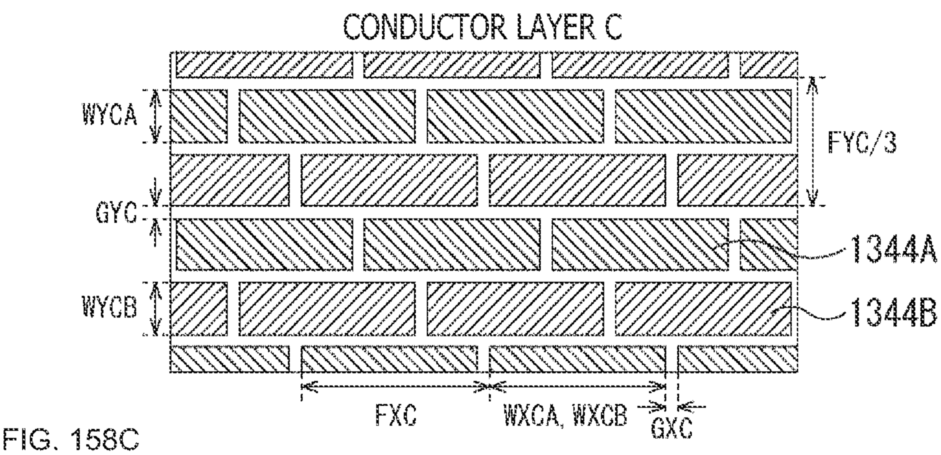
Figure 158C:
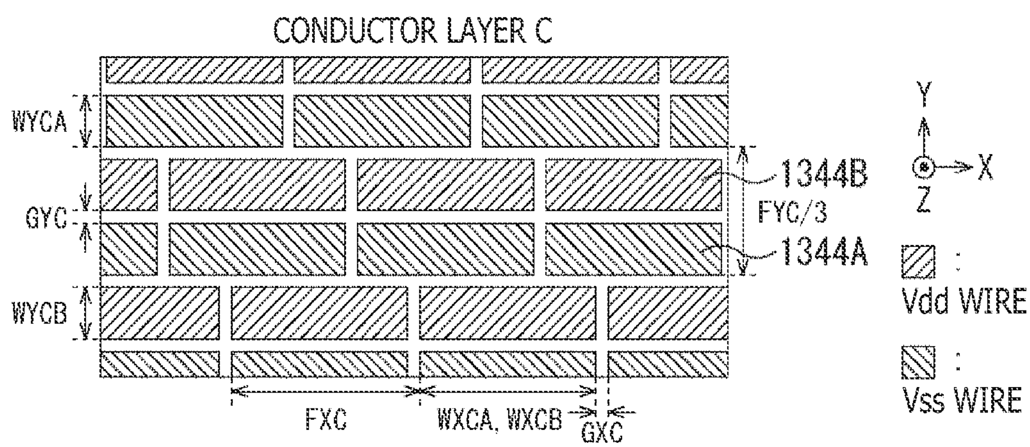

FIGS. 158A, 158B, and 158C are figures depicting a ninth modification example to an eleventh modification example of the fourteenth configuration example of three conductor layers.

Figure 159A:
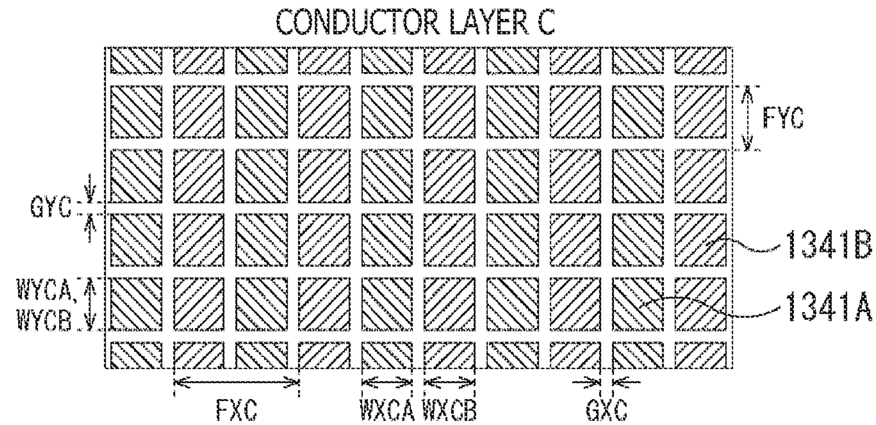
Figure 159B:
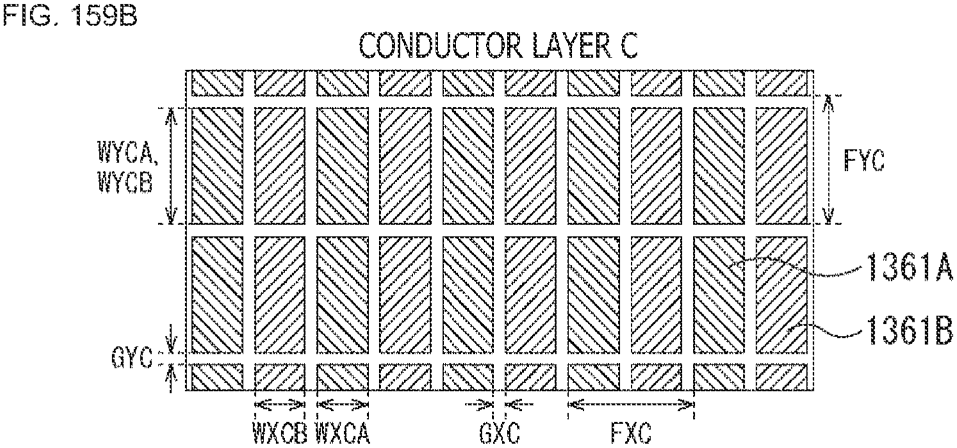
Figure 159C:
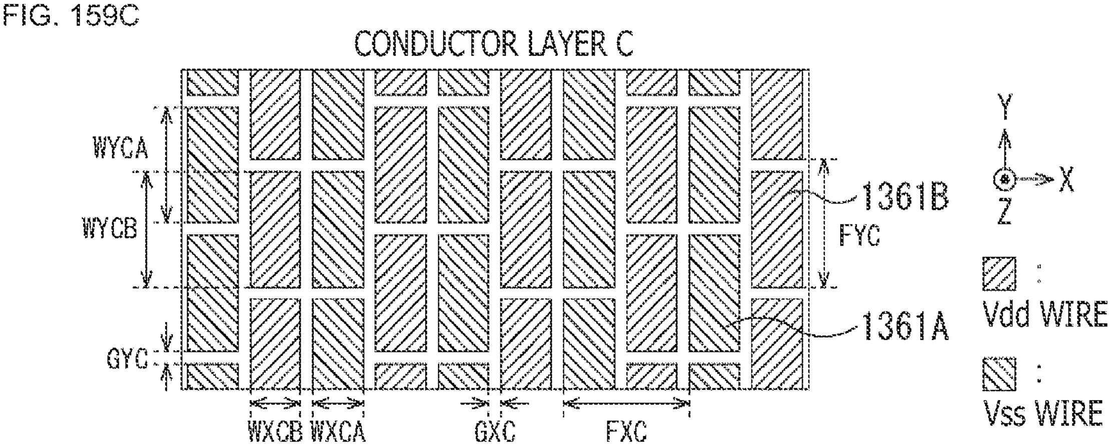

FIGS. 159A, 159B, and 159C are figures depicting a twelfth modification example to a fourteenth modification example of the fourteenth configuration example of three conductor layers.

Figure 160A:
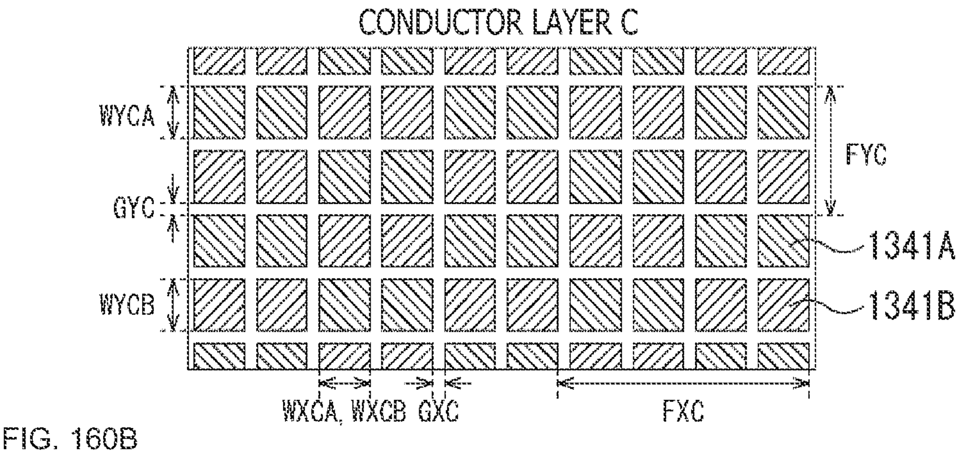
Figure 160B:
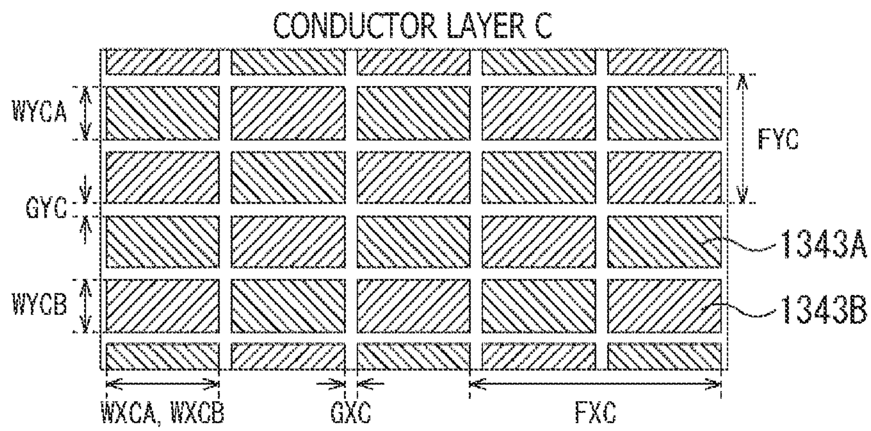
Figure 160C:
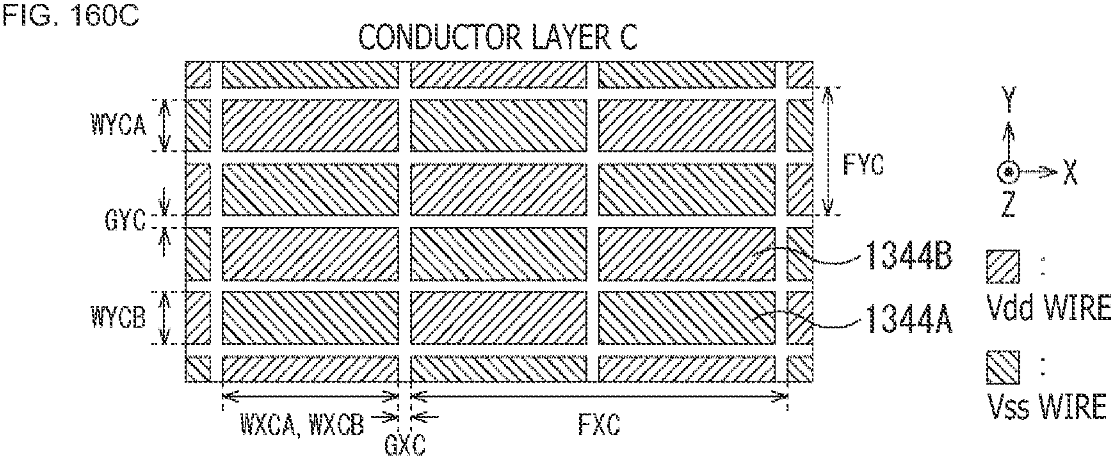

FIGS. 160A, 160B, and 160C are figures depicting a fifteenth modification example to a seventeenth modification example of the fourteenth configuration example of three conductor layers.

Figure 161A:
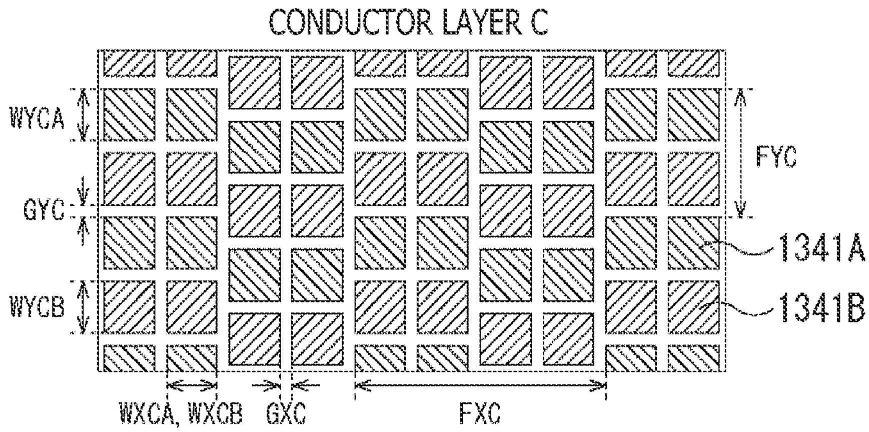
Figure 161B:
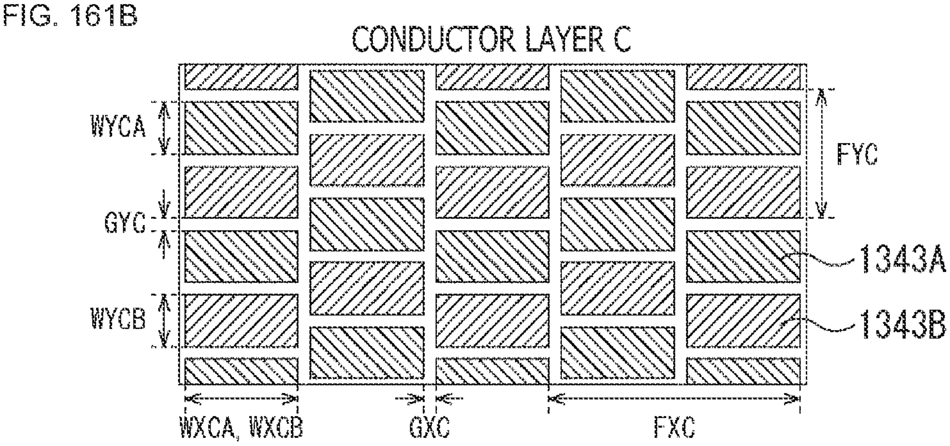
Figure 161C:
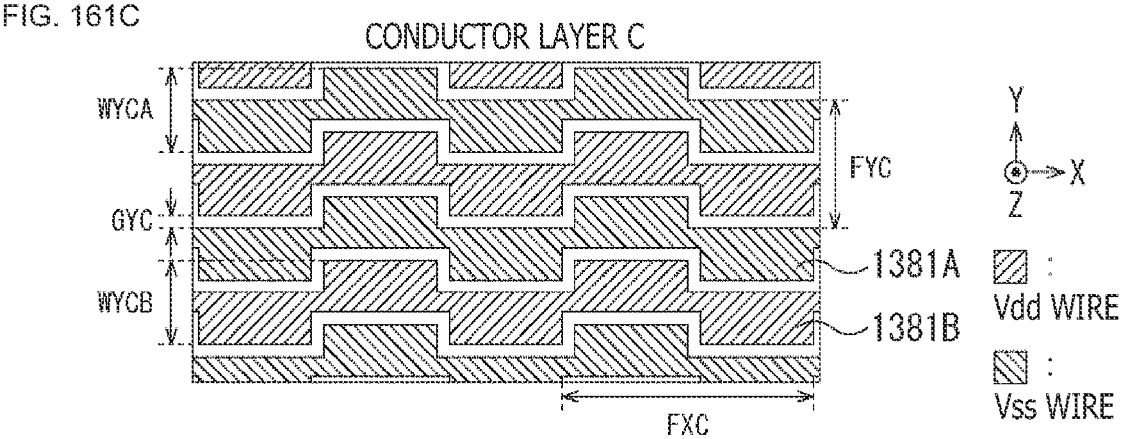

FIGS. 161A, 161B, and 161C are figures depicting an eighteenth modification example to a twentieth modification example of the fourteenth configuration example of three conductor layers.

Figure 162A:
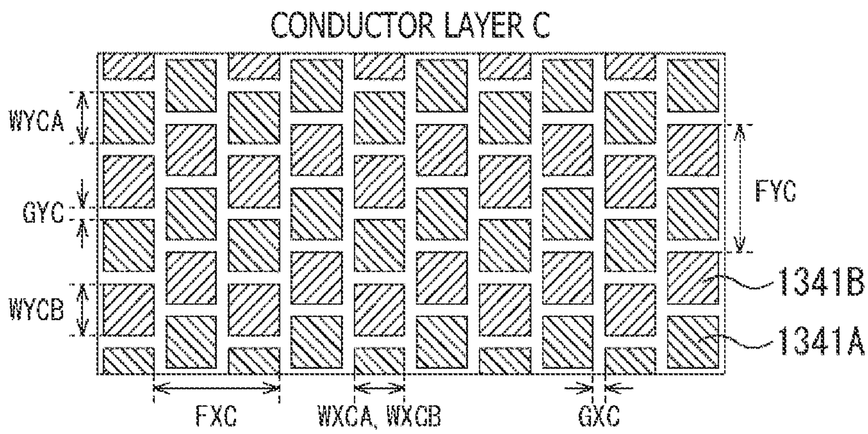
Figure 162B:
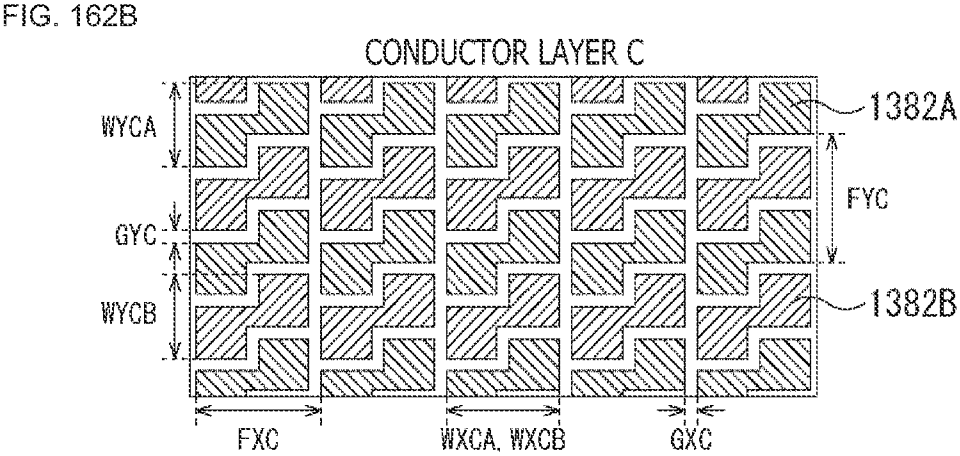
Figure 162C:
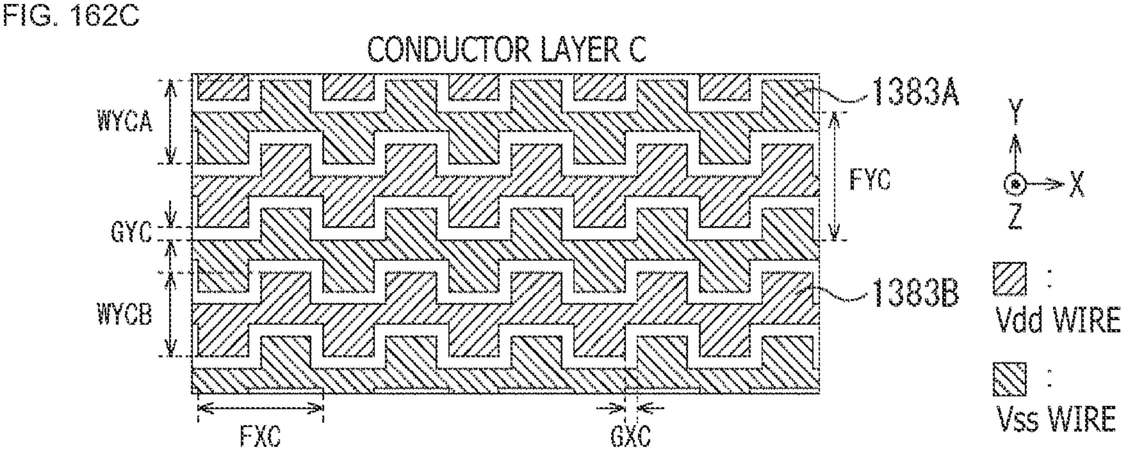

FIGS. 162A, 162B, and 162C are figures depicting a twenty-first modification example to a twenty-third modification example of the fourteenth configuration example of three conductor layers.

Figure 163A:
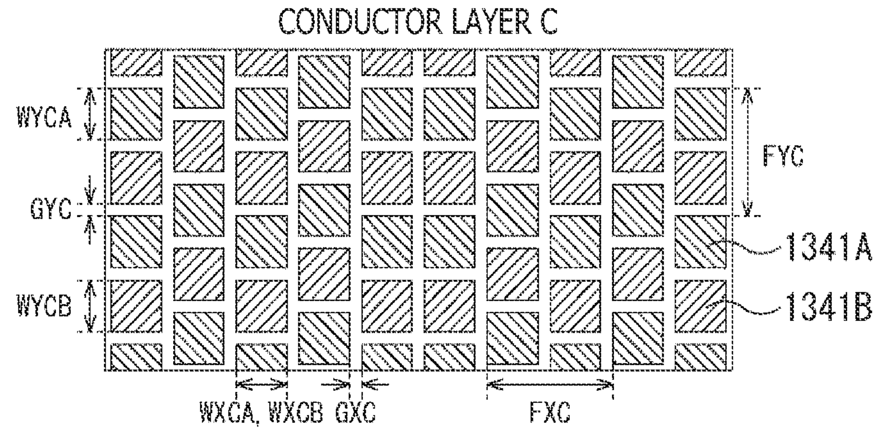
Figure 163B:
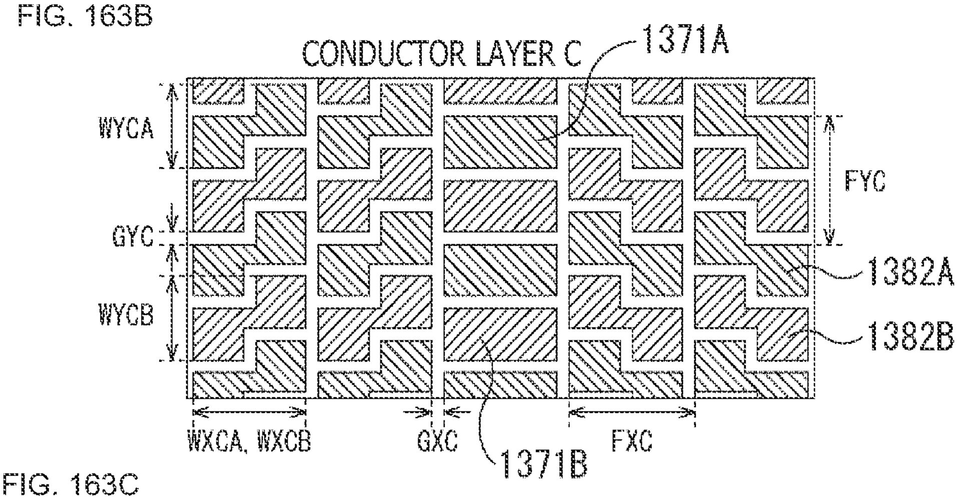
Figure 163C:
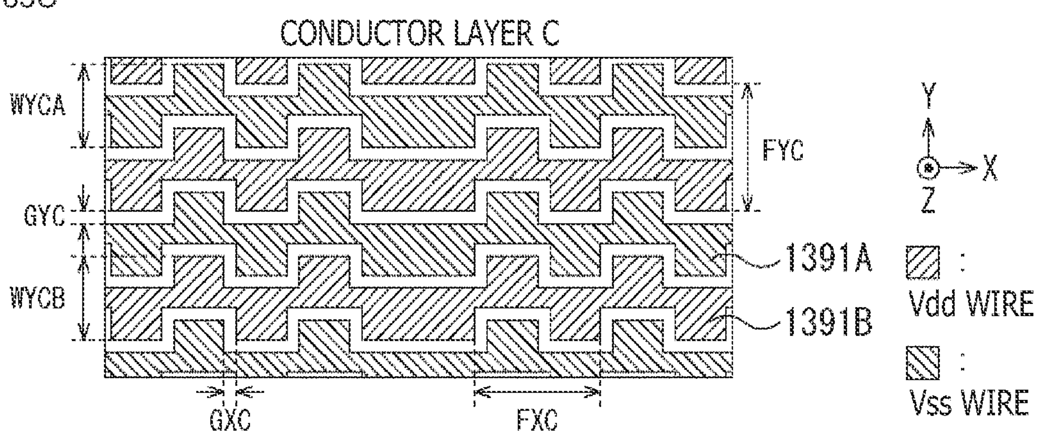

FIGS. 163A, 163B, and 163C are figures depicting a twenty-fourth modification example to a twenty-sixth modification example of the fourteenth configuration example of three conductor layers.

Figure 164:
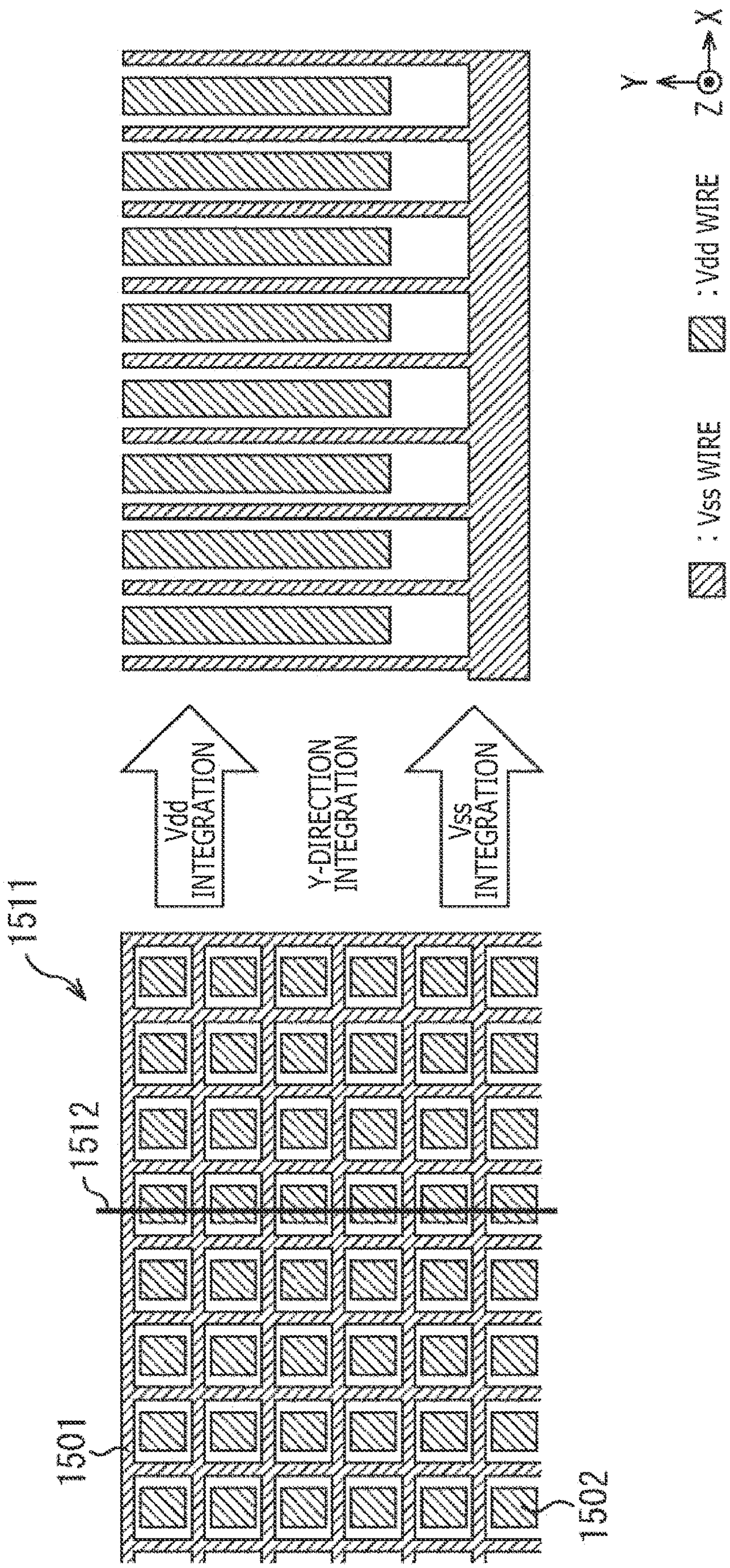

FIG. 164 is a figure for explaining capacitive noise of a mesh conductor.

Figure 165:
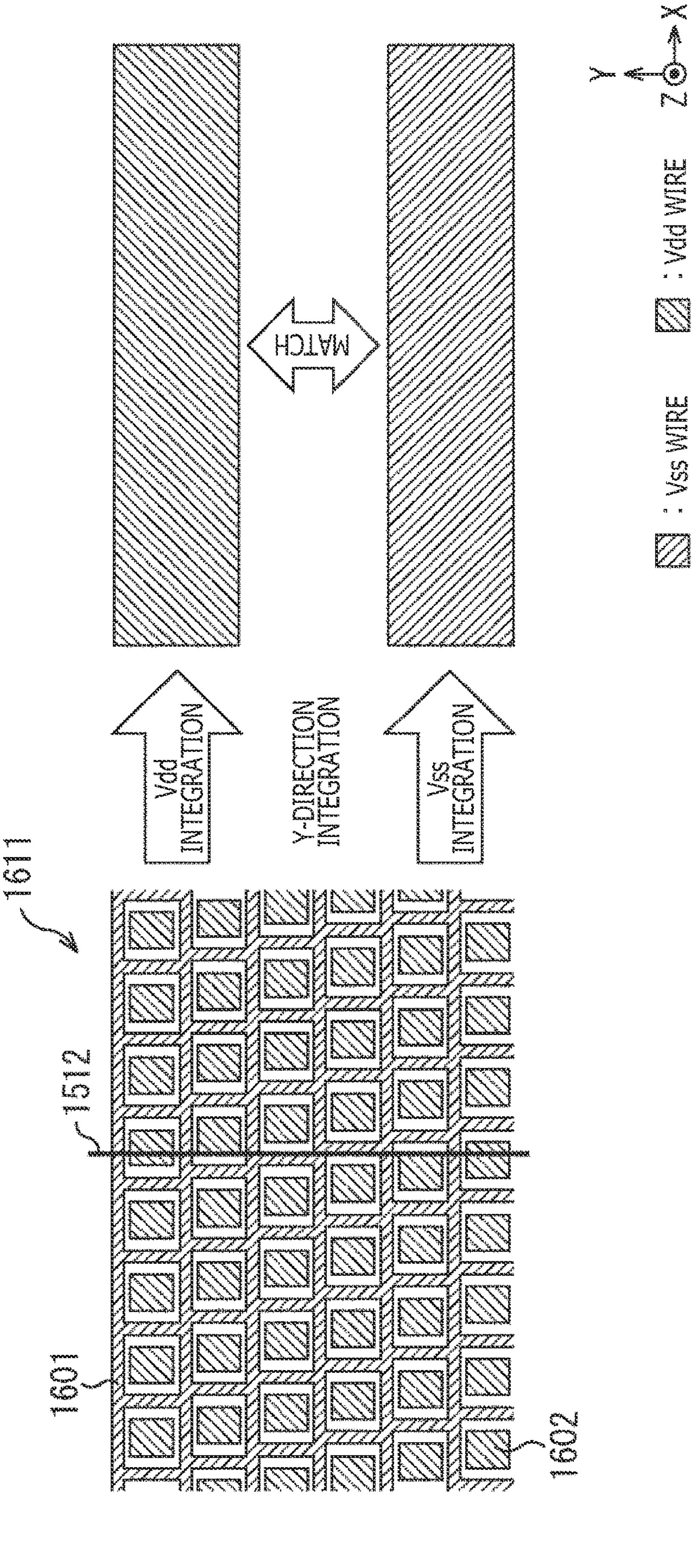

FIG. 165 is a figure for explaining capacitive noise of a mesh conductor for which a predetermined displacement amount is set.

Figure 166:
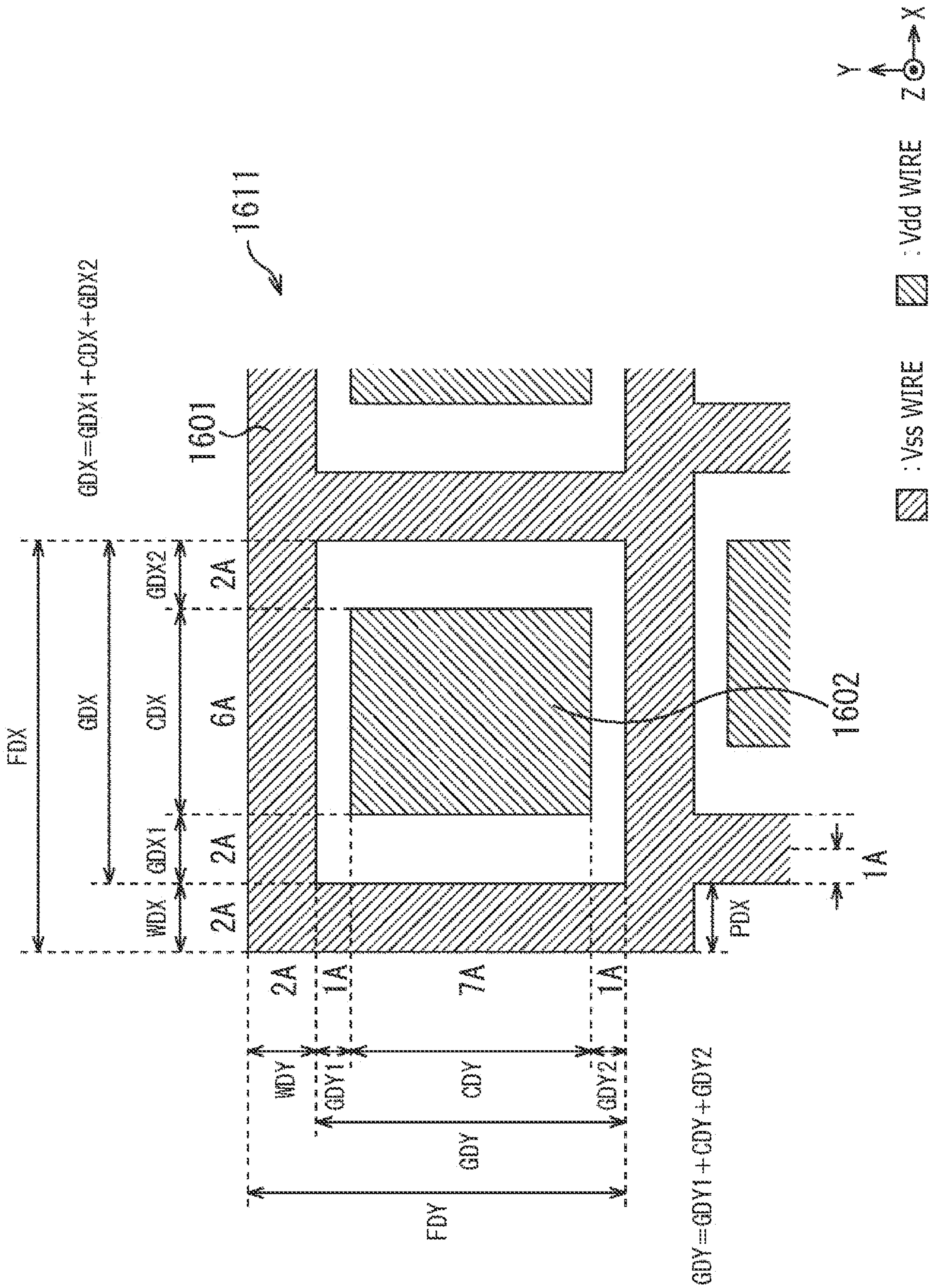

FIG. 166 is a figure for explaining conductor widths and gap widths in a first displacement configuration example of a mesh conductor.

FIGS. 167A, 167B, 167C, and 167D are plan views of the first displacement configuration example of a mesh conductor.

Figures 168A, 168B, 168C:
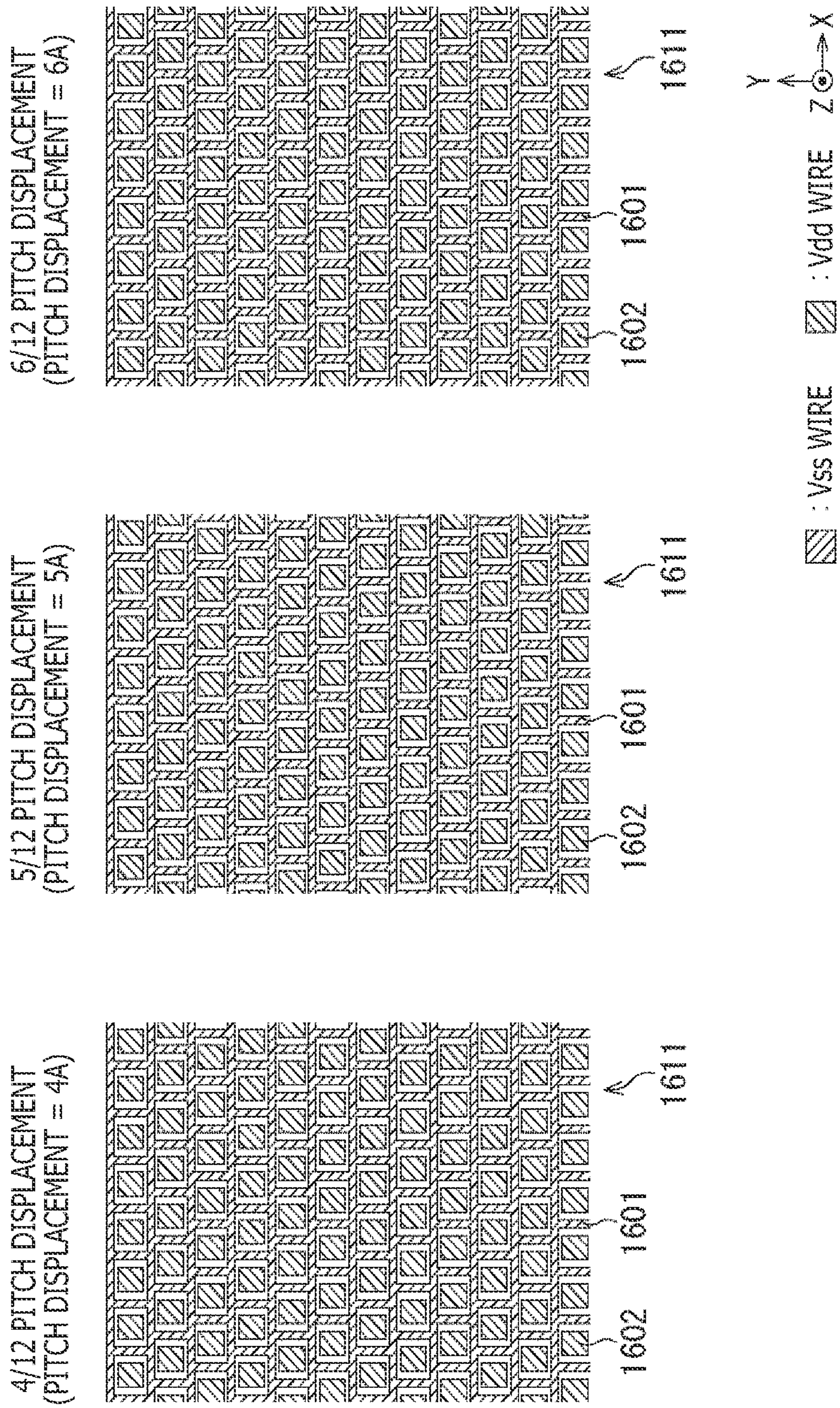

FIGS. 168A, 168B, and 168C are plan views of the first displacement configuration example of a mesh conductor.

Figure 169:
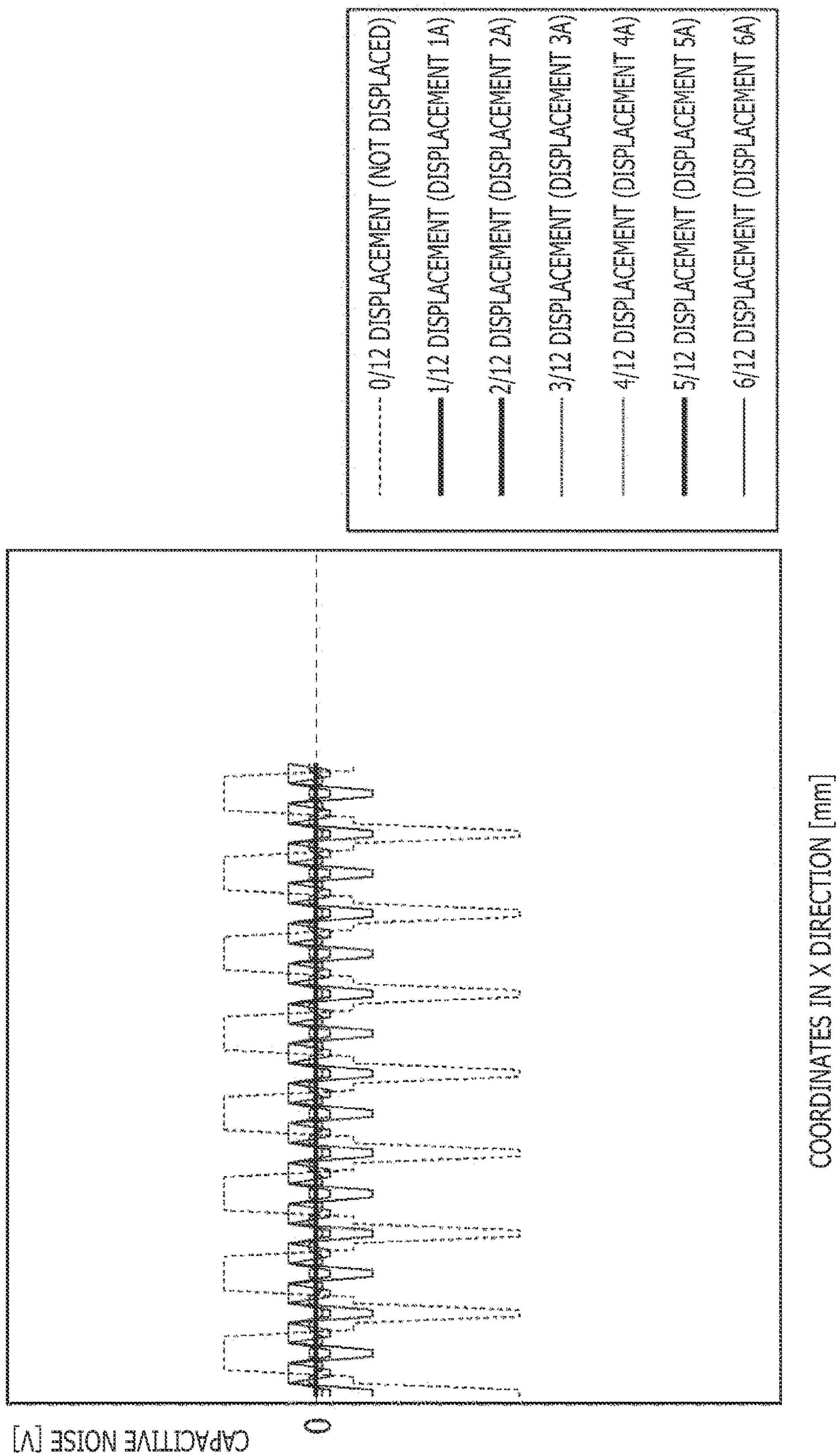

FIG. 169 is a figure depicting theoretical values of capacitive noise in the first displacement configuration example.

Figure 170:
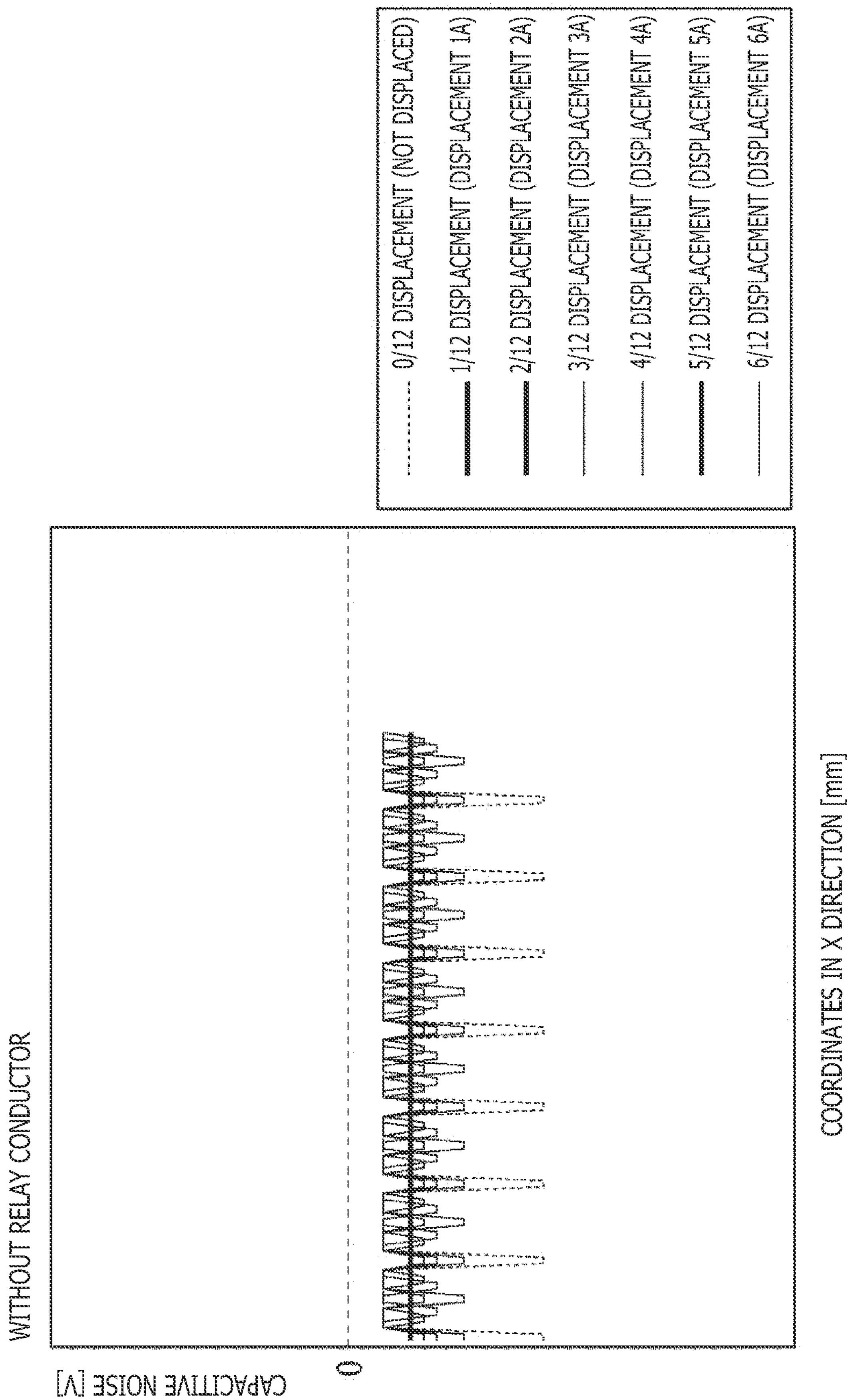

FIG. 170 is a figure depicting theoretical values of capacitive noise in the first displacement configuration example.

Figure 171:
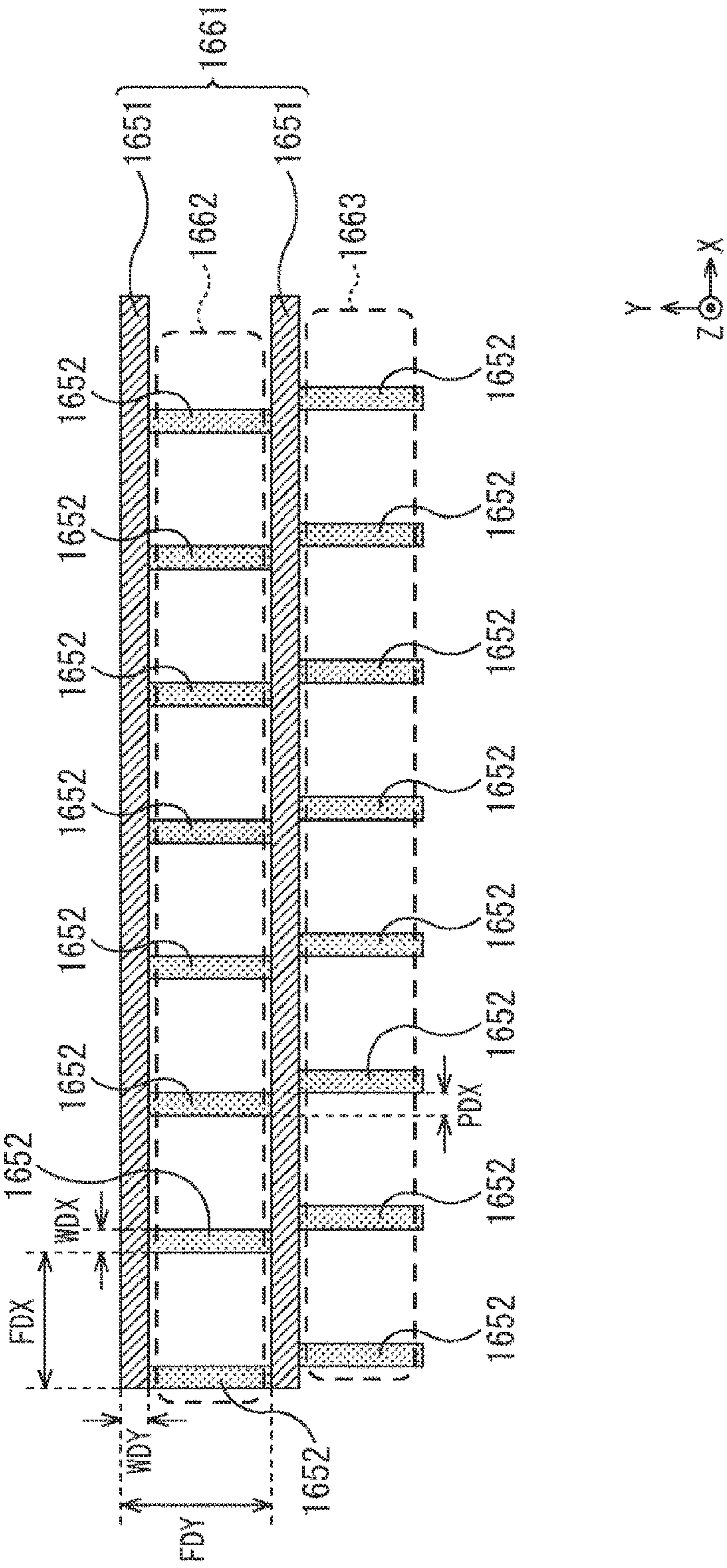

FIG. 171 is a figure for explaining a definition of a mesh conductor.

Figure 172:
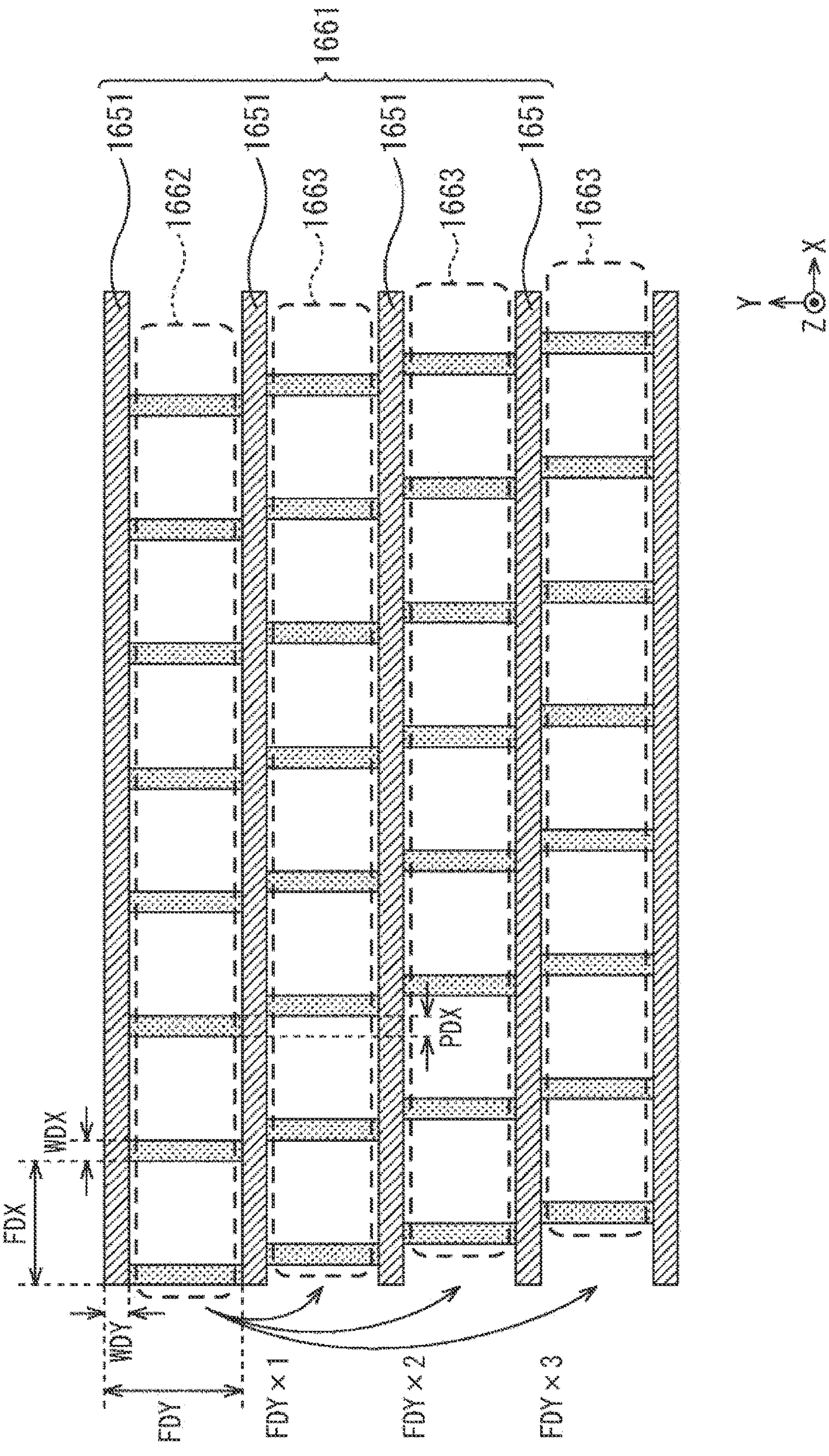

FIG. 172 is a figure for explaining a definition of a mesh conductor.

Figure 173A:
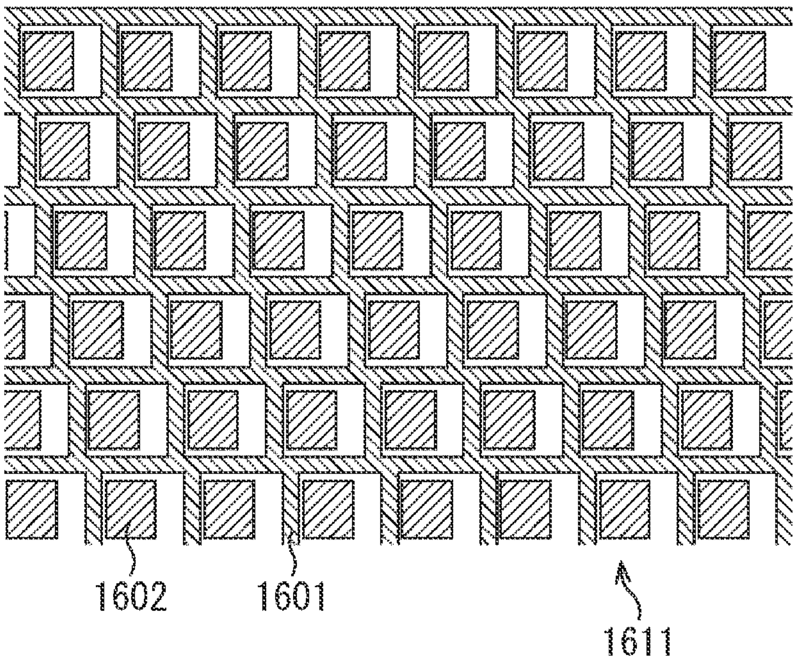
Figure 173B:
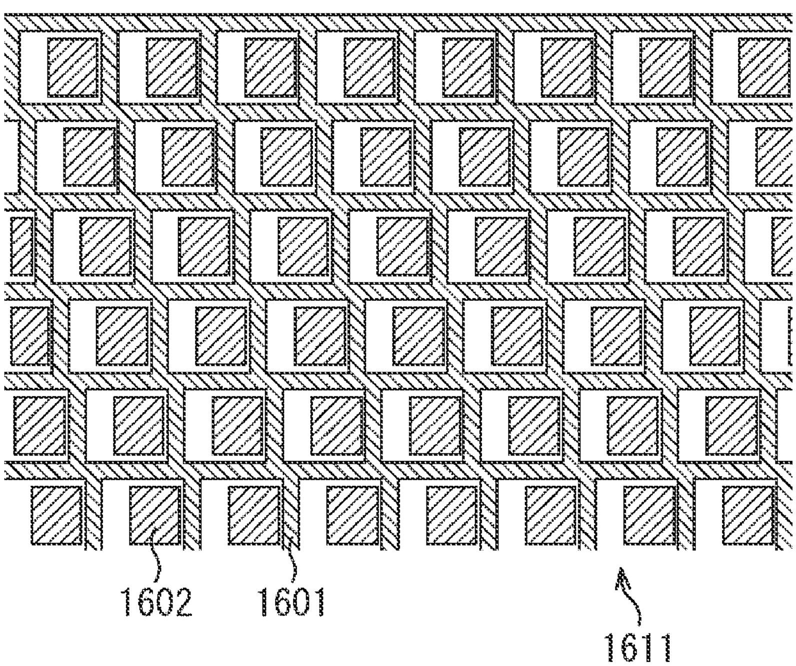
Figure 173B:

FIGS. 173A and 173B are plan views depicting first and second modification examples of the first displacement configuration example.

Figure 174A:
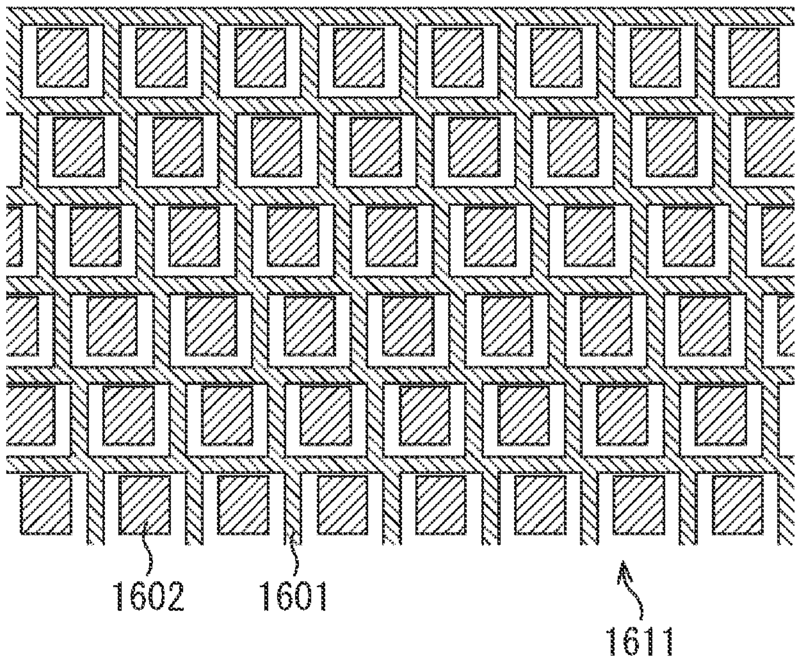
Figure 174B:
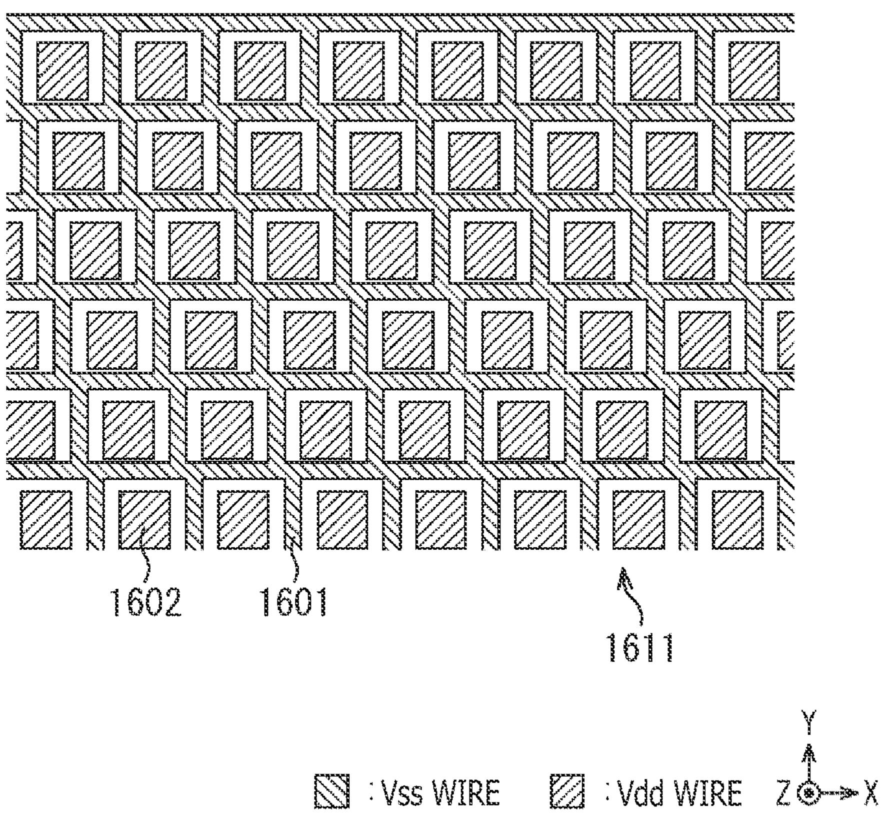

FIGS. 174A and 174B are plan views depicting third and fourth modification examples of the first displacement configuration example.

Figure 175A:
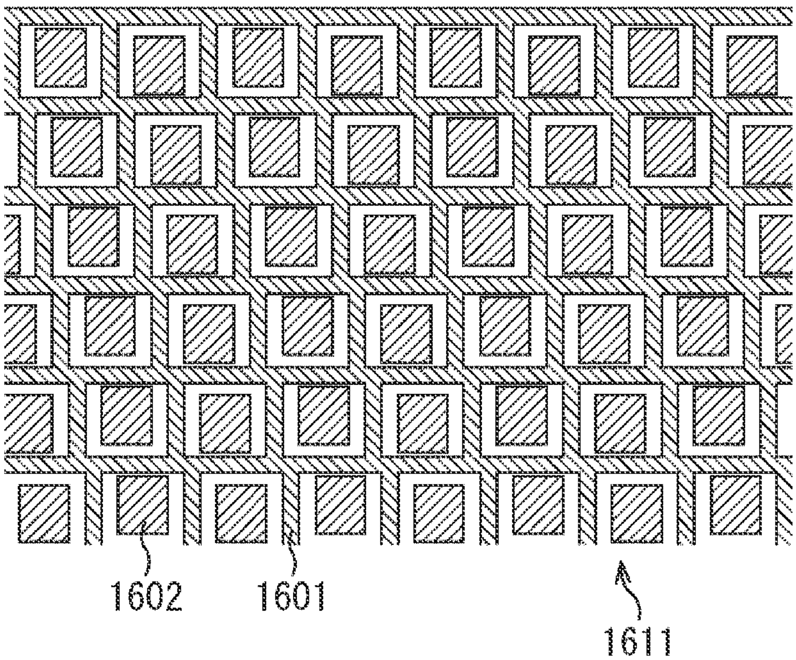
Figure 175B:
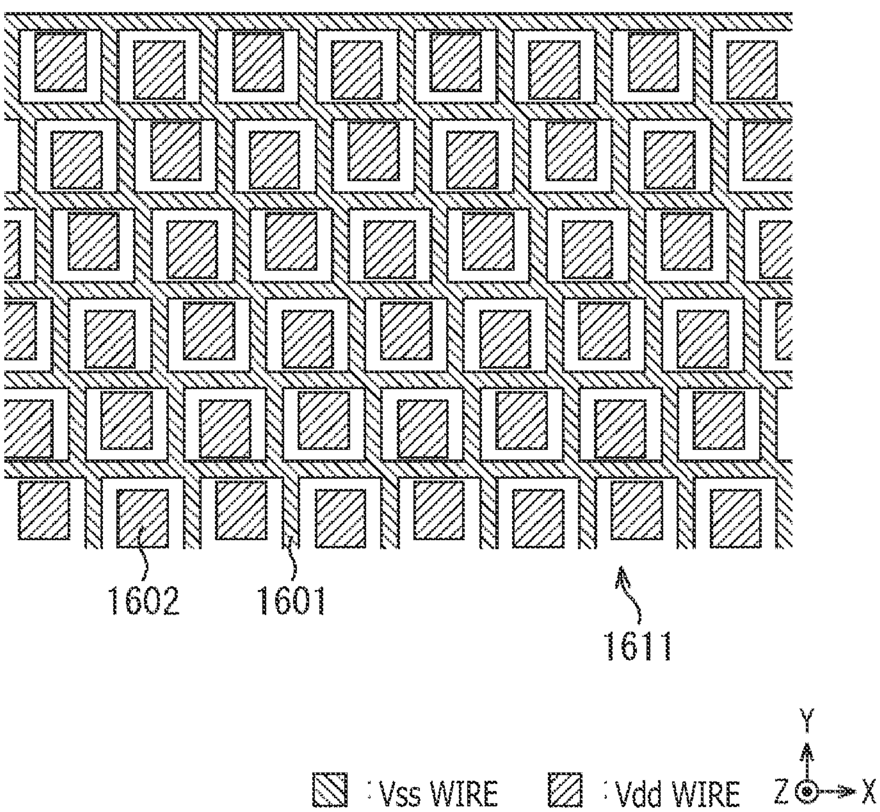

FIGS. 175A and 175B are plan views depicting fifth and sixth modification examples of the first displacement configuration example.

Figure 176A:
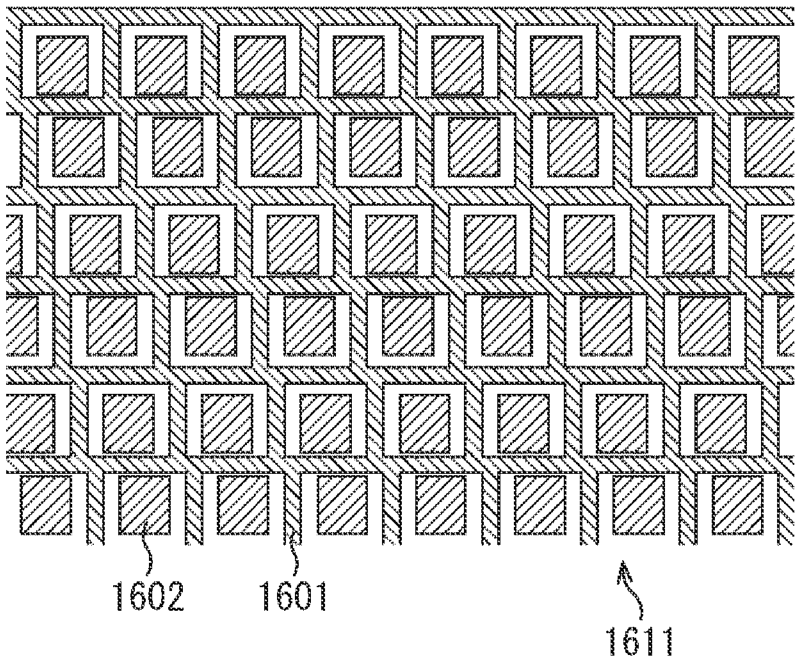
Figure 176B:
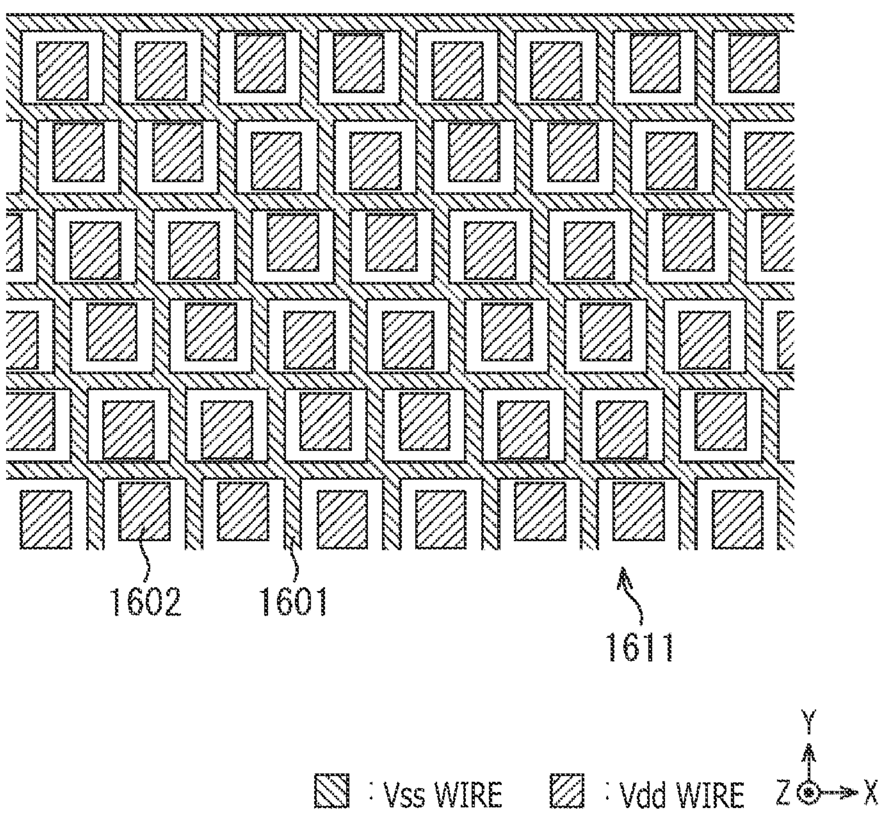

FIGS. 176A and 176B are plan views depicting seventh and eighth modification examples of the first displacement configuration example.

Figure 177A:
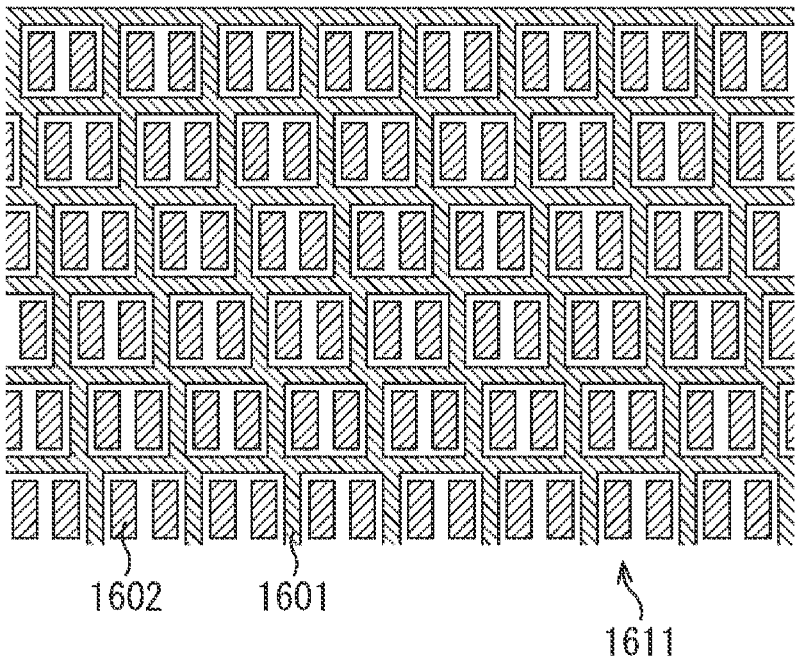
Figure 177B:
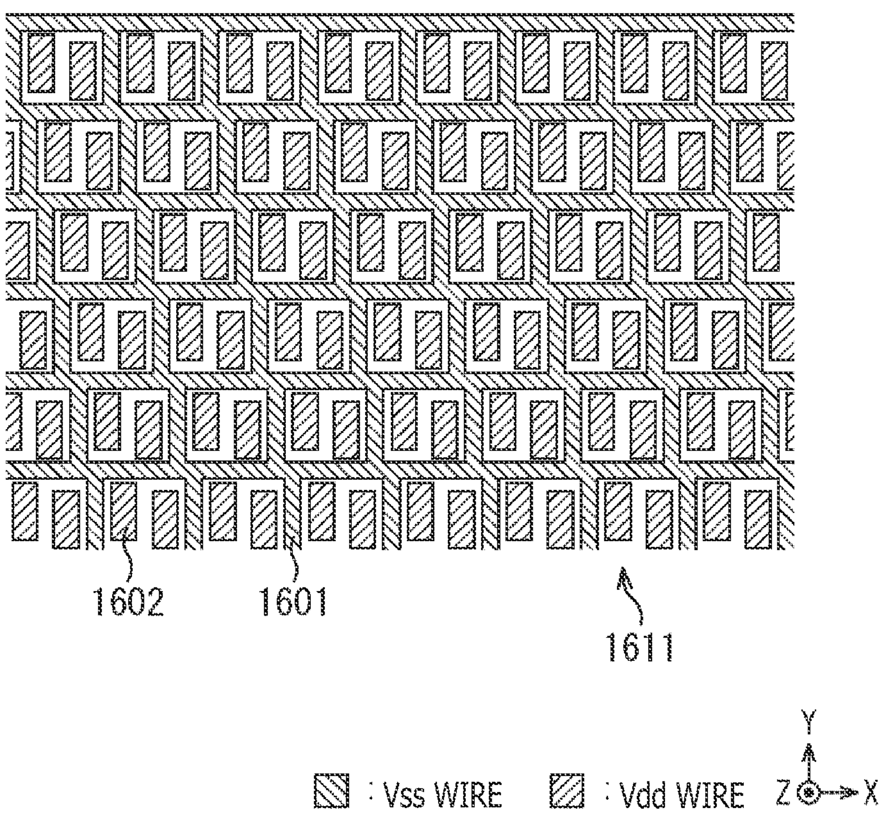

FIGS. 177A and 177B are plan views depicting ninth and tenth modification examples of the first displacement configuration example.

Figure 178A:
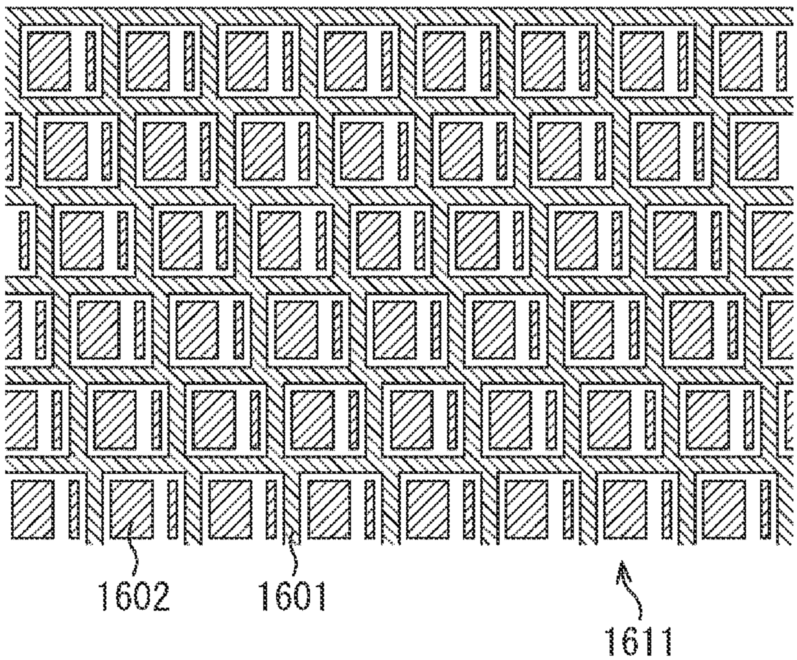
Figure 178B:
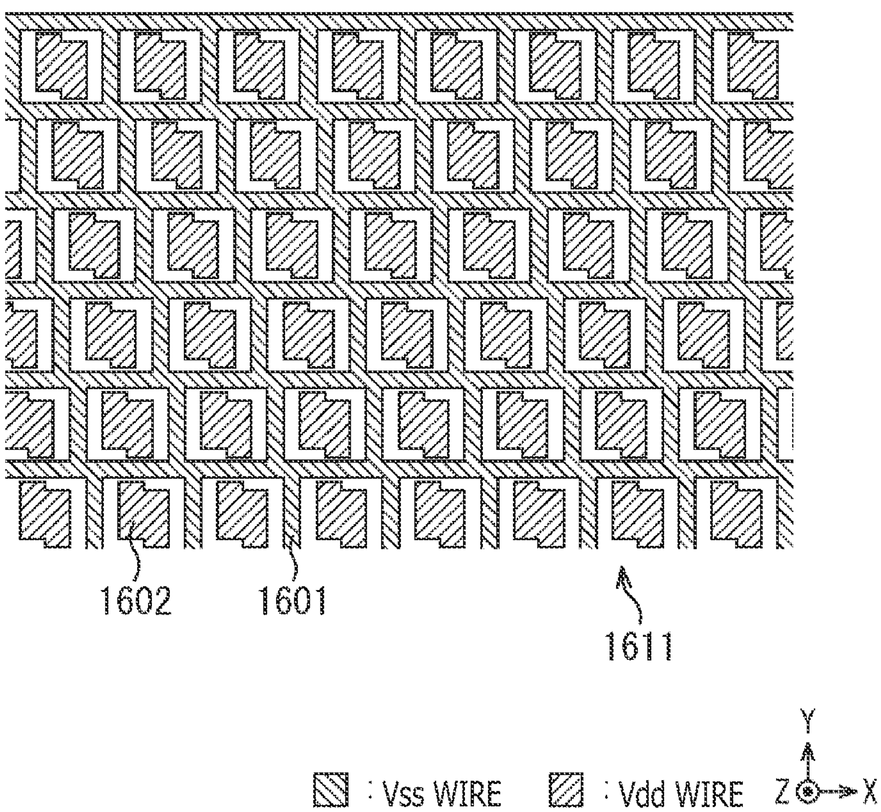

FIGS. 178A and 178B are plan views depicting eleventh and twelfth modification examples of the first displacement configuration example.

Figure 179A:
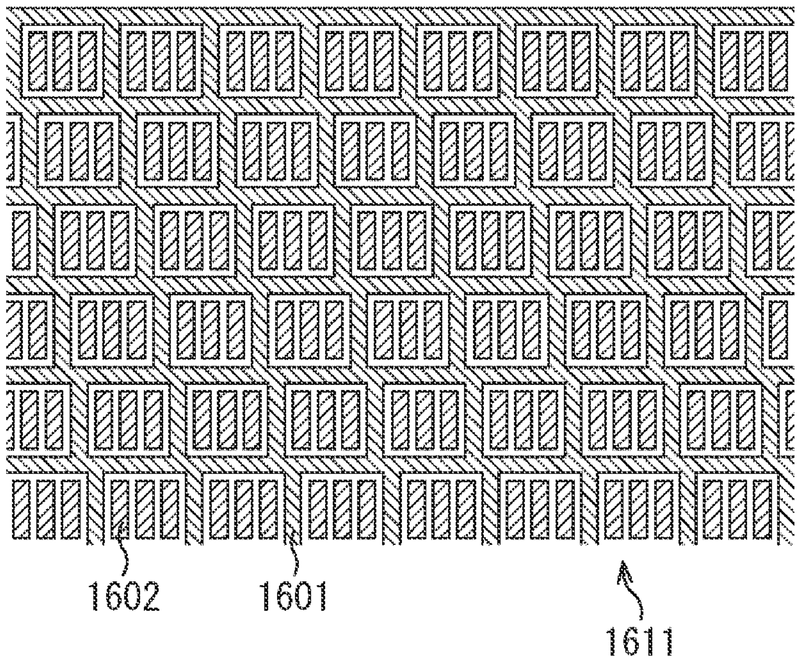
Figure 179B:
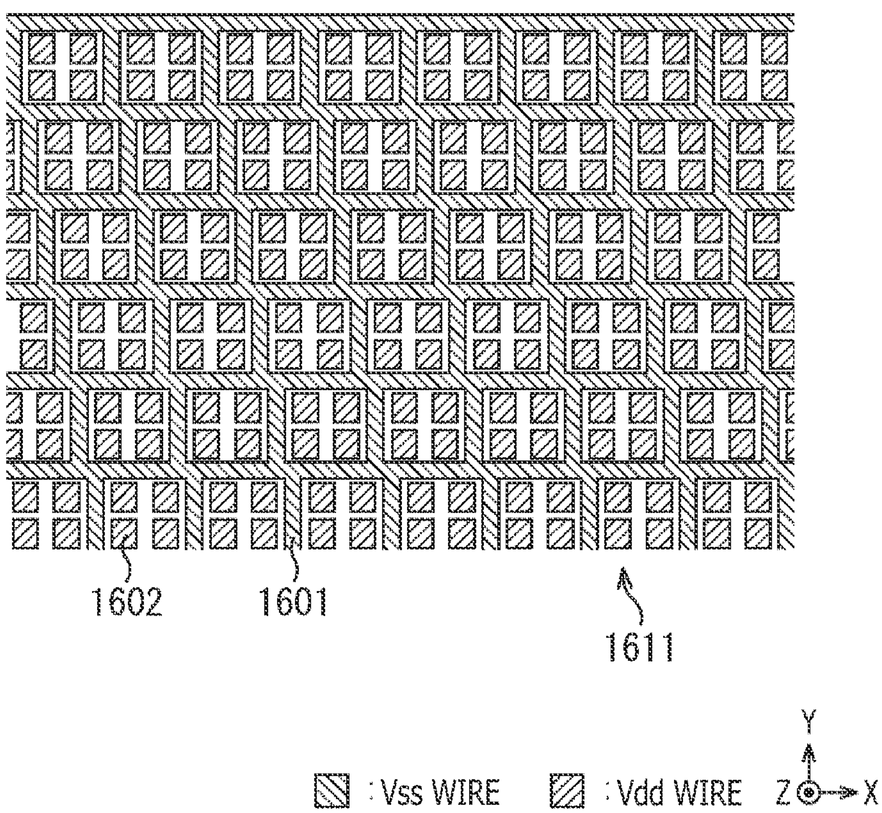

FIGS. 179A and 179B are plan views depicting thirteenth and fourteenth modification examples of the first displacement configuration example.

Figure 180A:
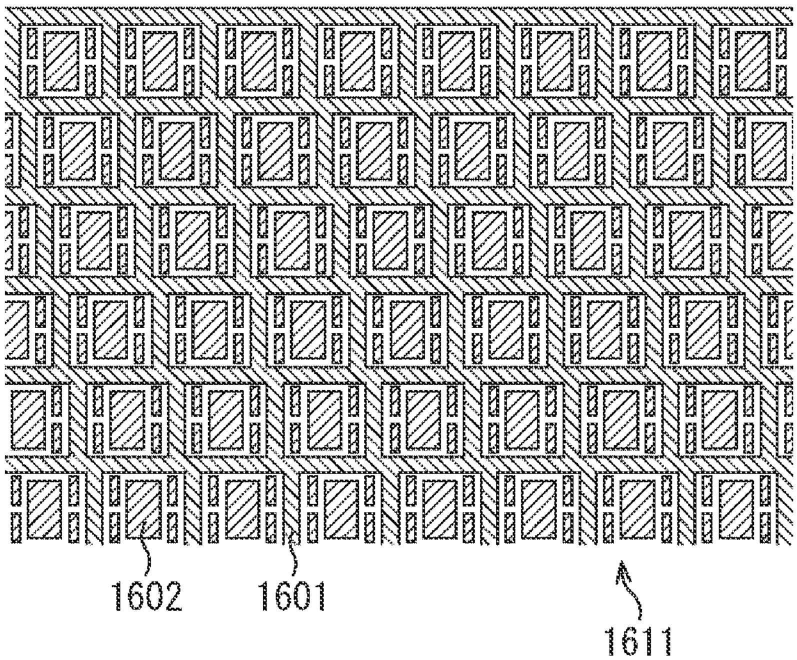
Figure 180B:
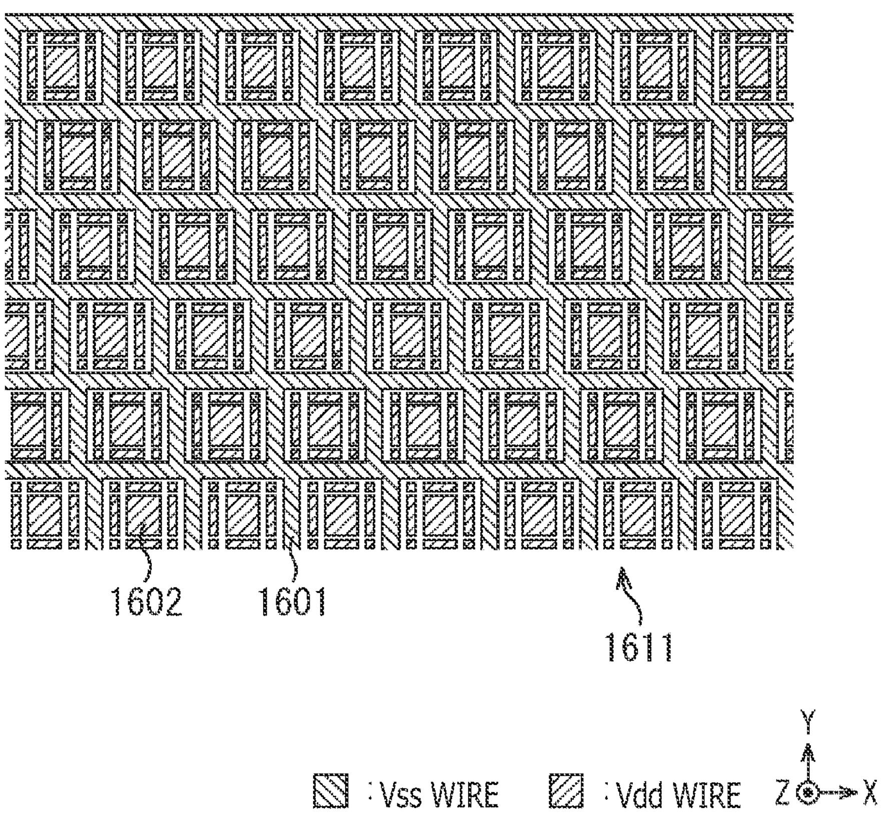

FIGS. 180A and 180B are plan views depicting fifteenth and sixteenth modification examples of the first displacement configuration example.

Figure 181A:
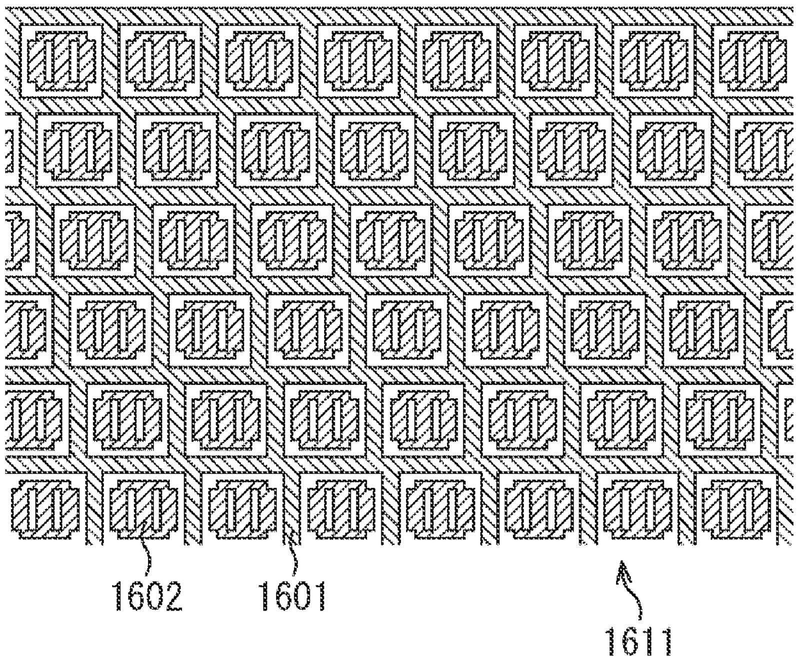
Figure 181B:
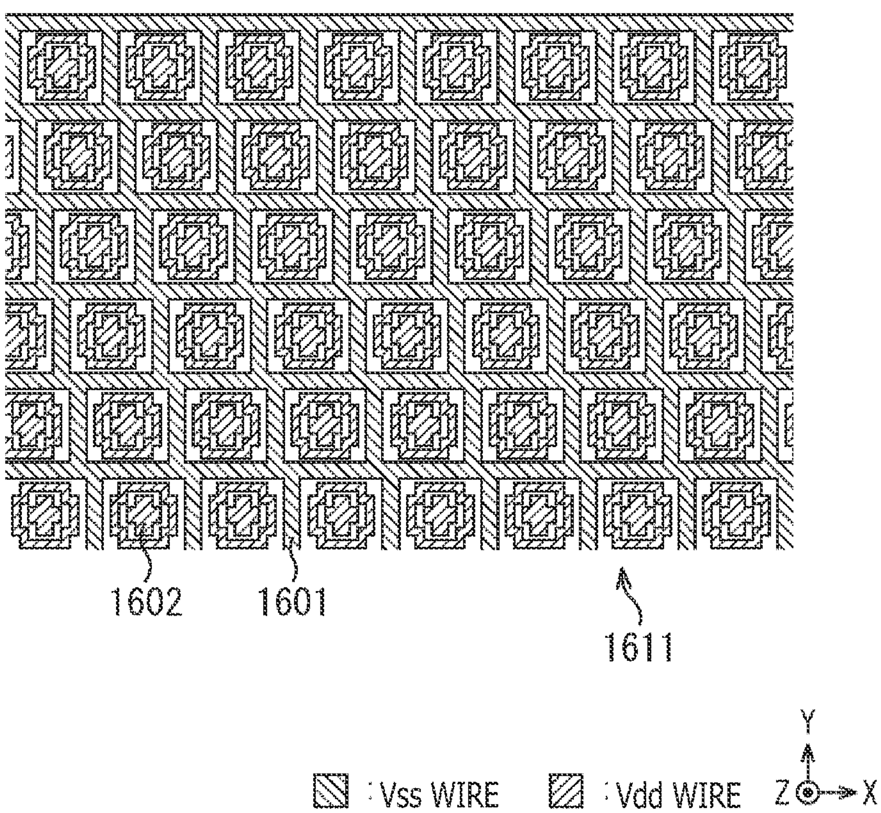

FIGS. 181A and 181B are plan views depicting seventeenth and eighteenth modification examples of the first displacement configuration example.

Figure 182:
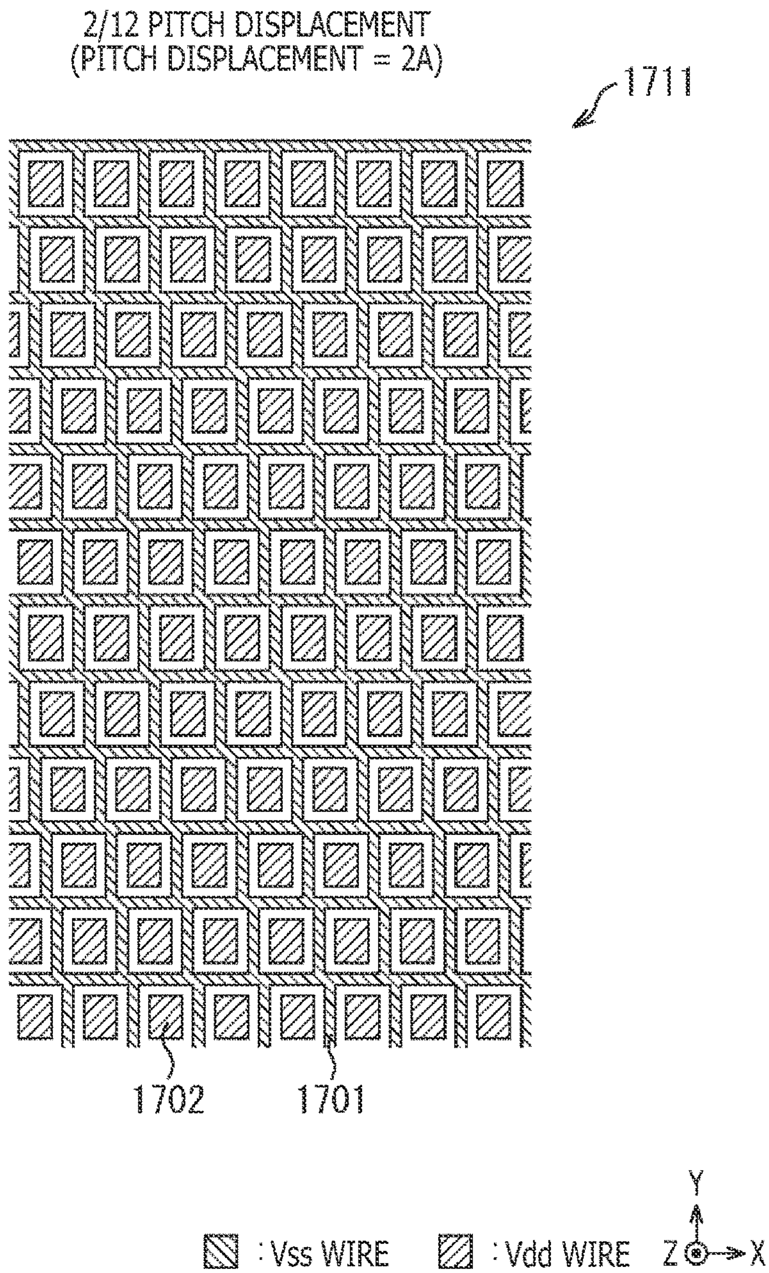

FIG. 182 is a plan view of a second displacement configuration example of a mesh conductor.

Figure 183:
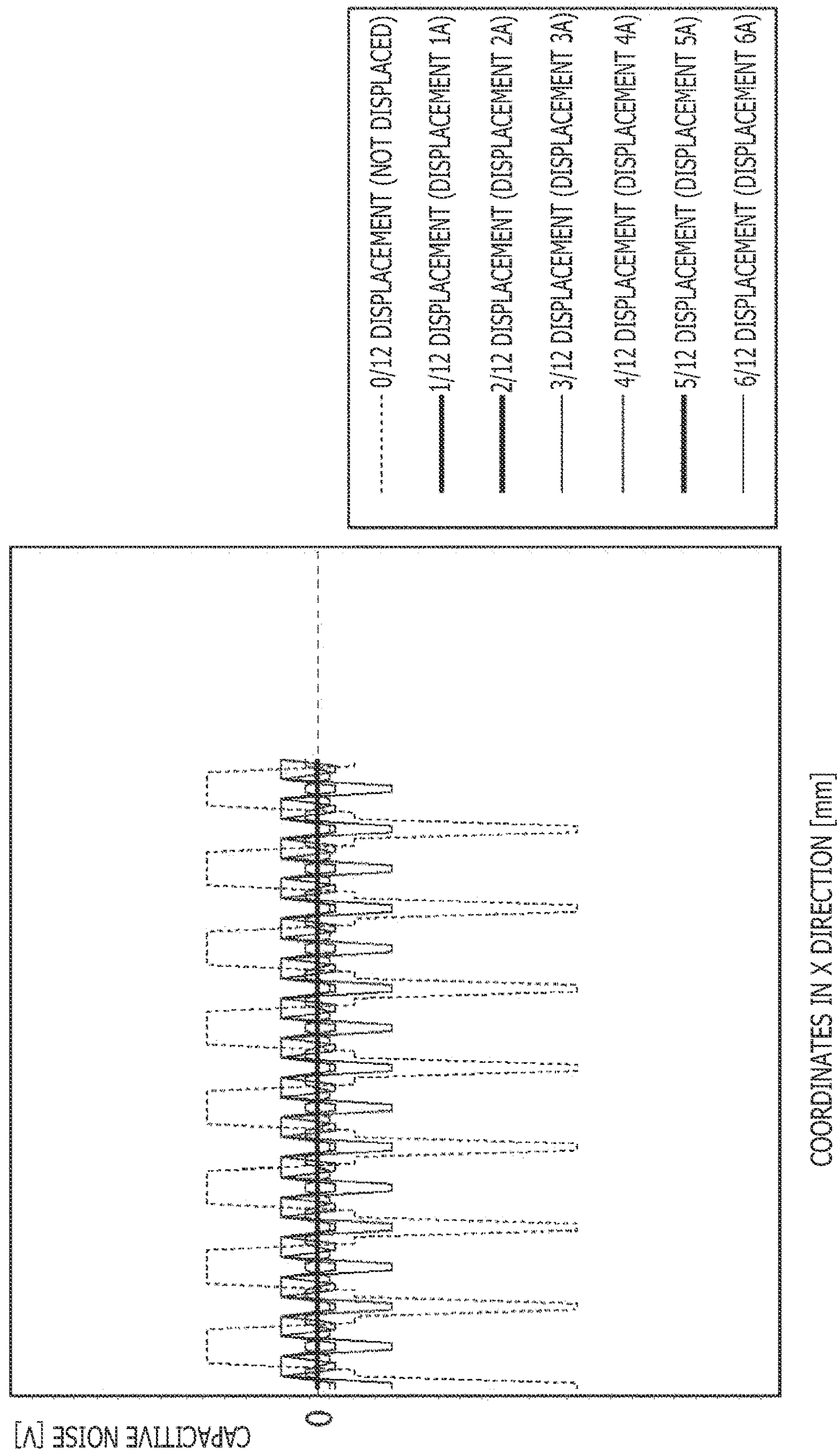

FIG. 183 is a figure depicting theoretical values of capacitive noise in the second displacement configuration example.

Figure 184:
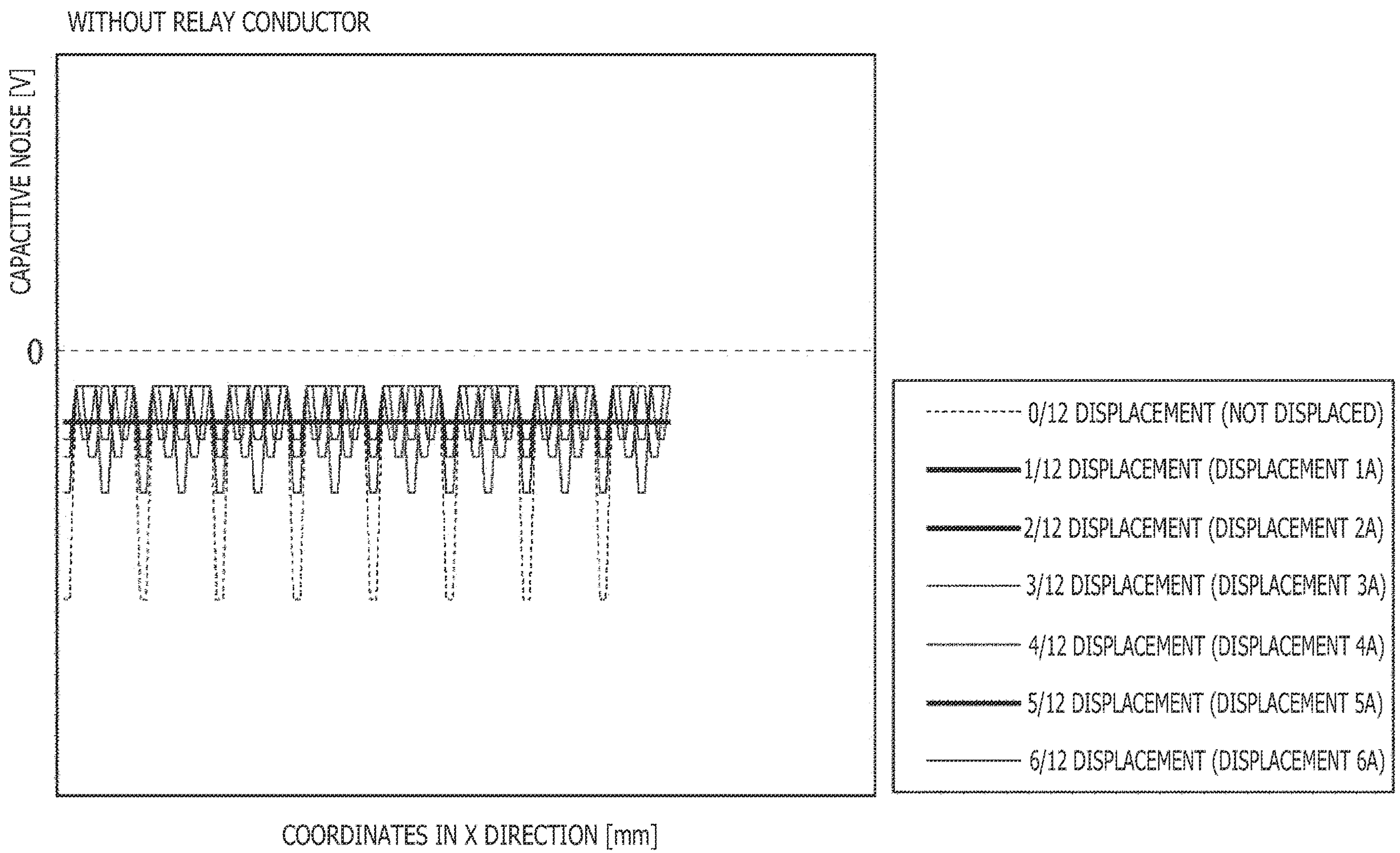

FIG. 184 is a figure depicting theoretical values of capacitive noise in the second displacement configuration example.

Figure 185:
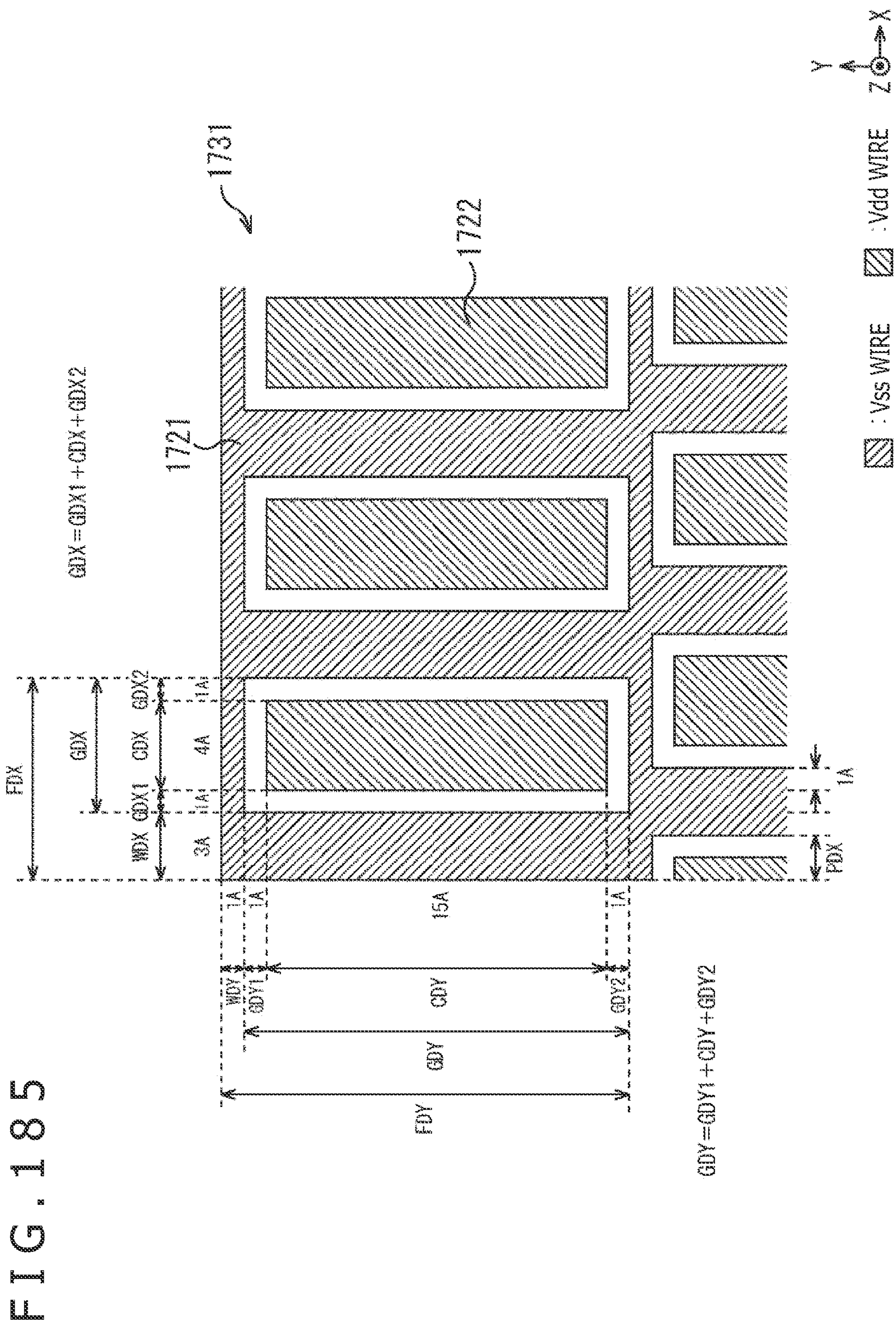

FIG. 185 is a figure for explaining conductor widths and gap widths in a third displacement configuration example of a mesh conductor.

Figures 186A, 186B, 186C:
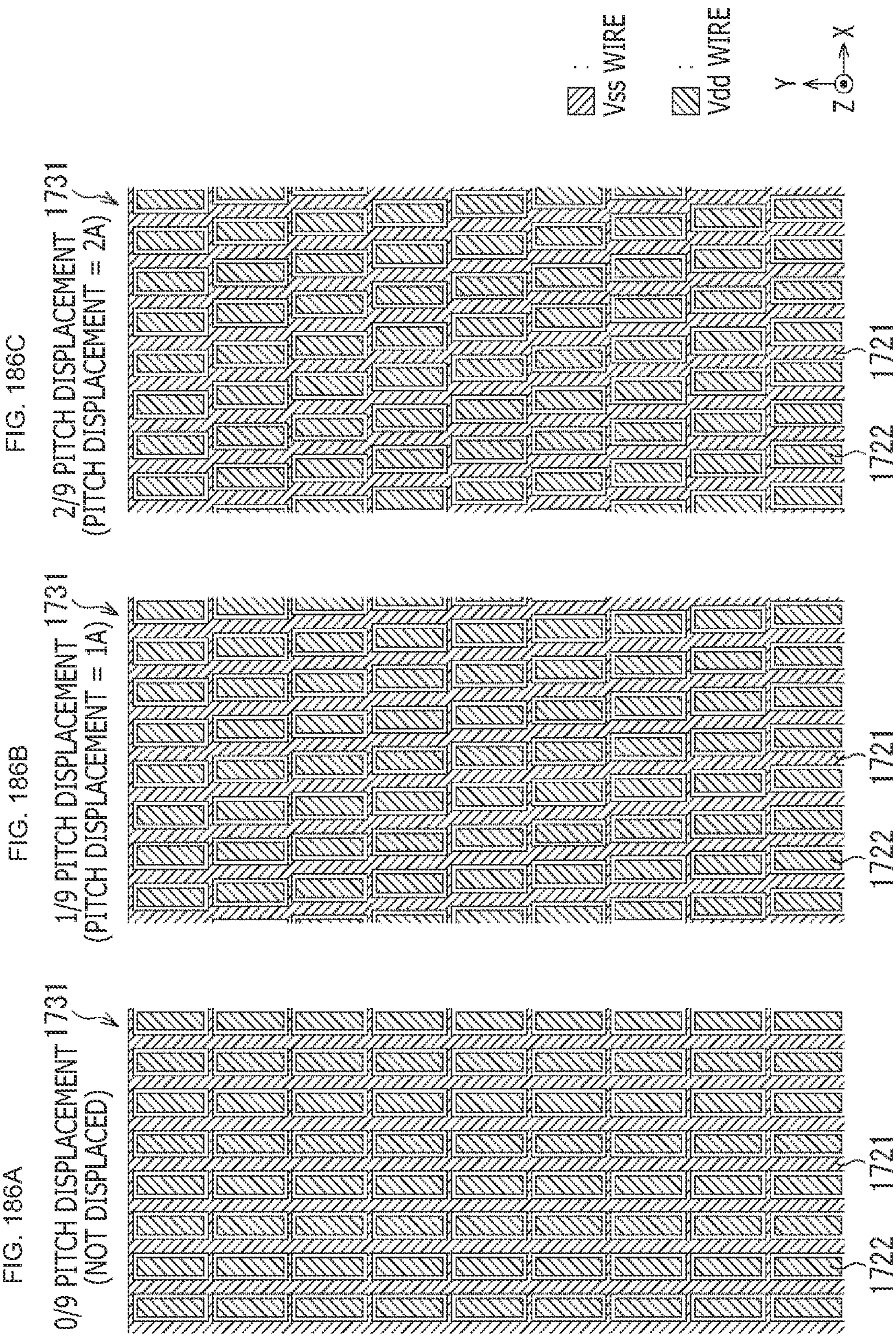

FIGS. 186A, 186B, and 186C are plan views of the third displacement configuration example of a mesh conductor.

FIGS. 187A and 187B is are plan views of the third displacement configuration example of a mesh conductor.

Figure 188:
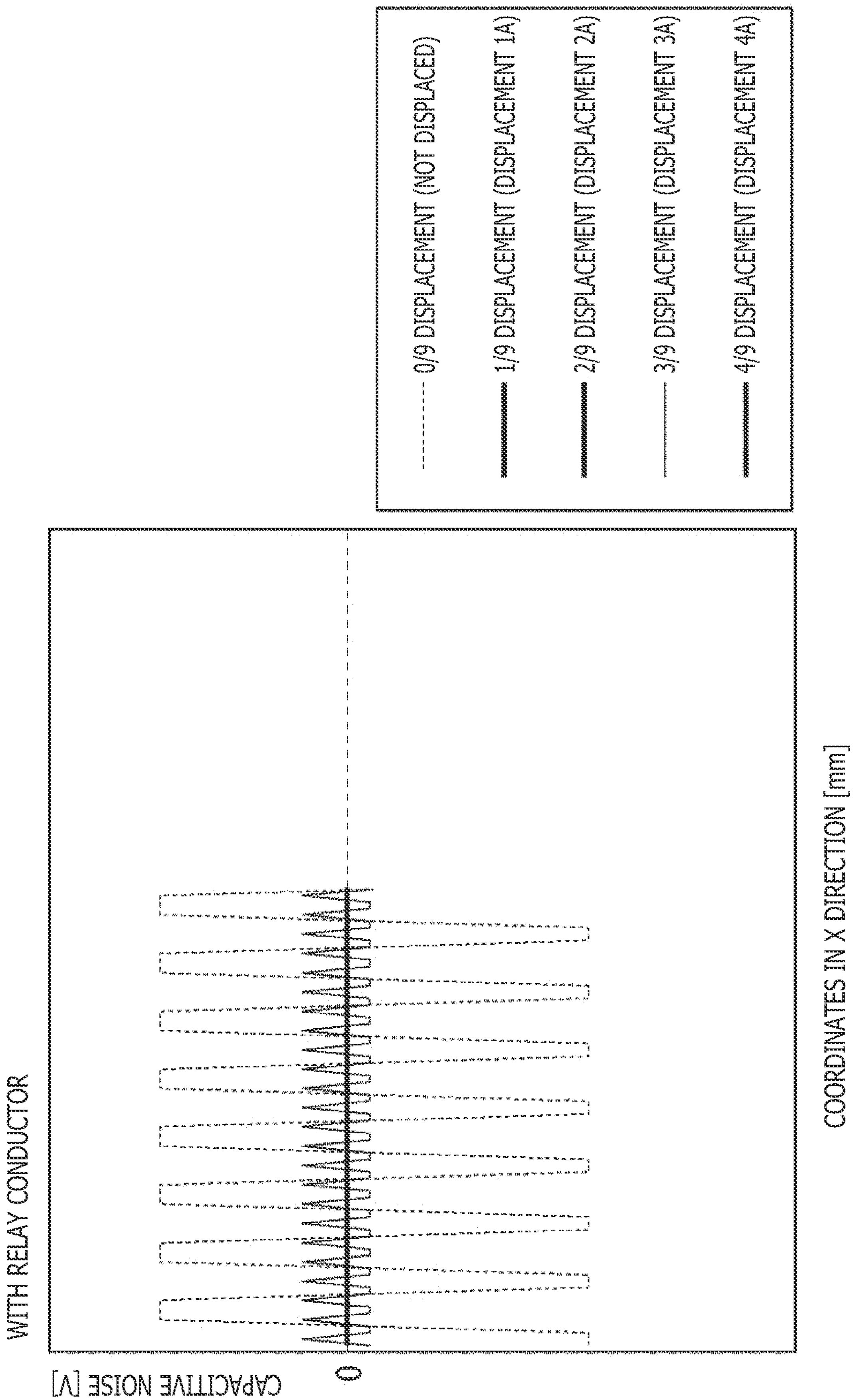

FIG. 188 is a figure depicting theoretical values of capacitive noise in the third displacement configuration example.

Figure 189:
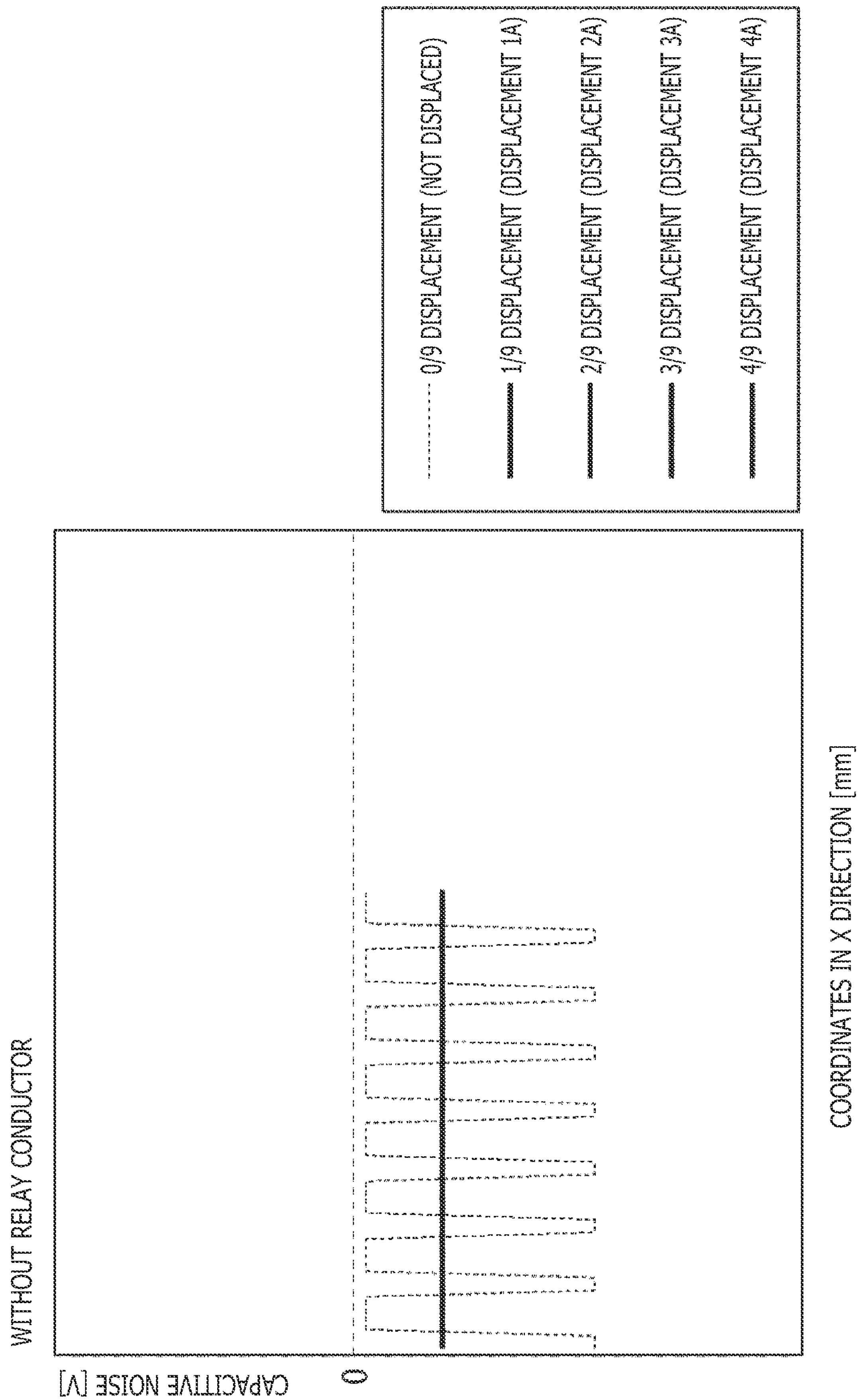

FIG. 189 is a figure depicting theoretical values of capacitive noise in the third displacement configuration example.

Figure 190:
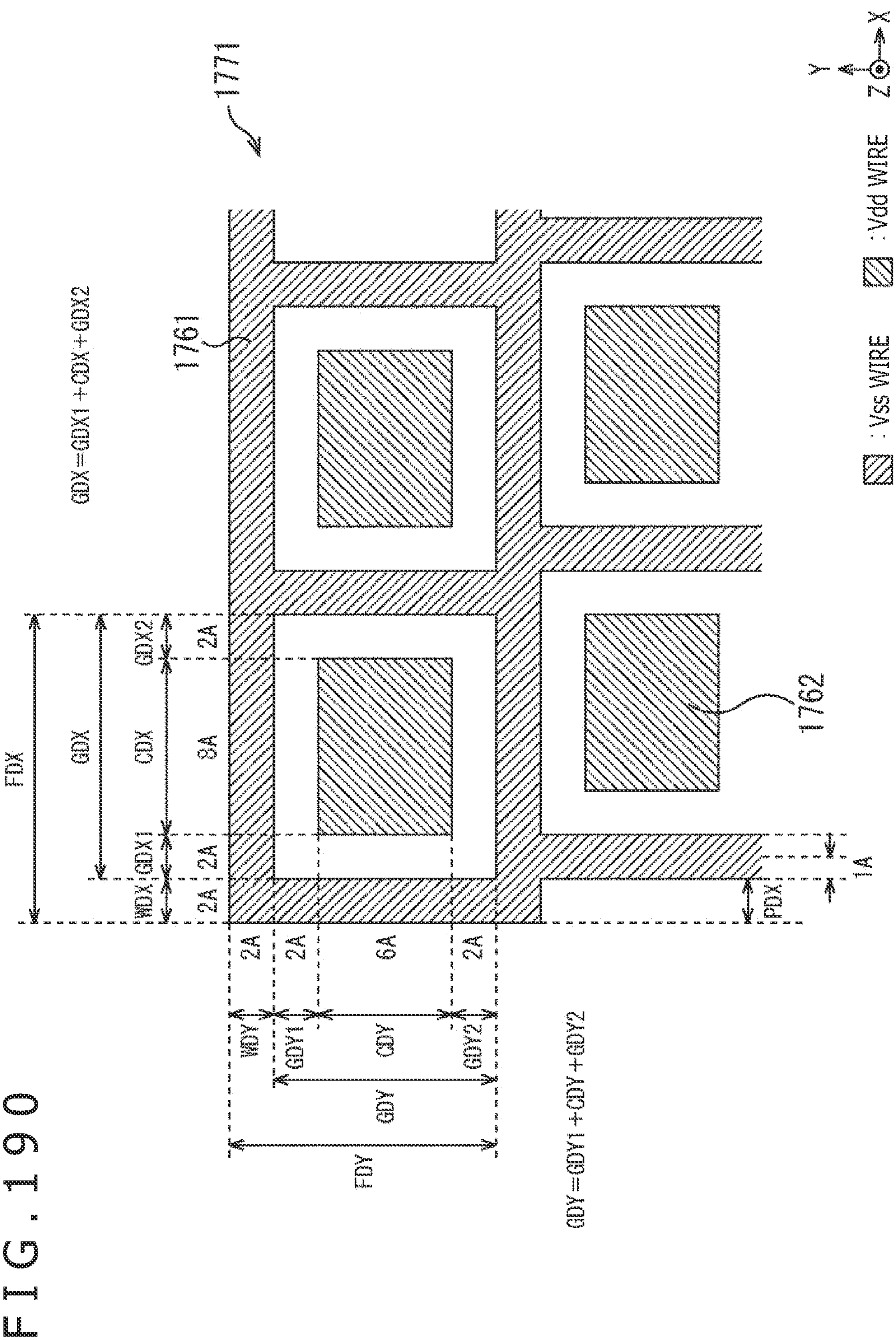

FIG. 190 is a figure for explaining conductor widths and gap widths in a fourth displacement configuration example of a mesh conductor.

FIGS. 191A, 191B, 191C, and 191D are plan views of the fourth displacement configuration example of a mesh conductor.

FIGS. 192A, 192B, 192C, and 192D are plan views of the fourth displacement configuration example of a mesh conductor.

Figure 193:
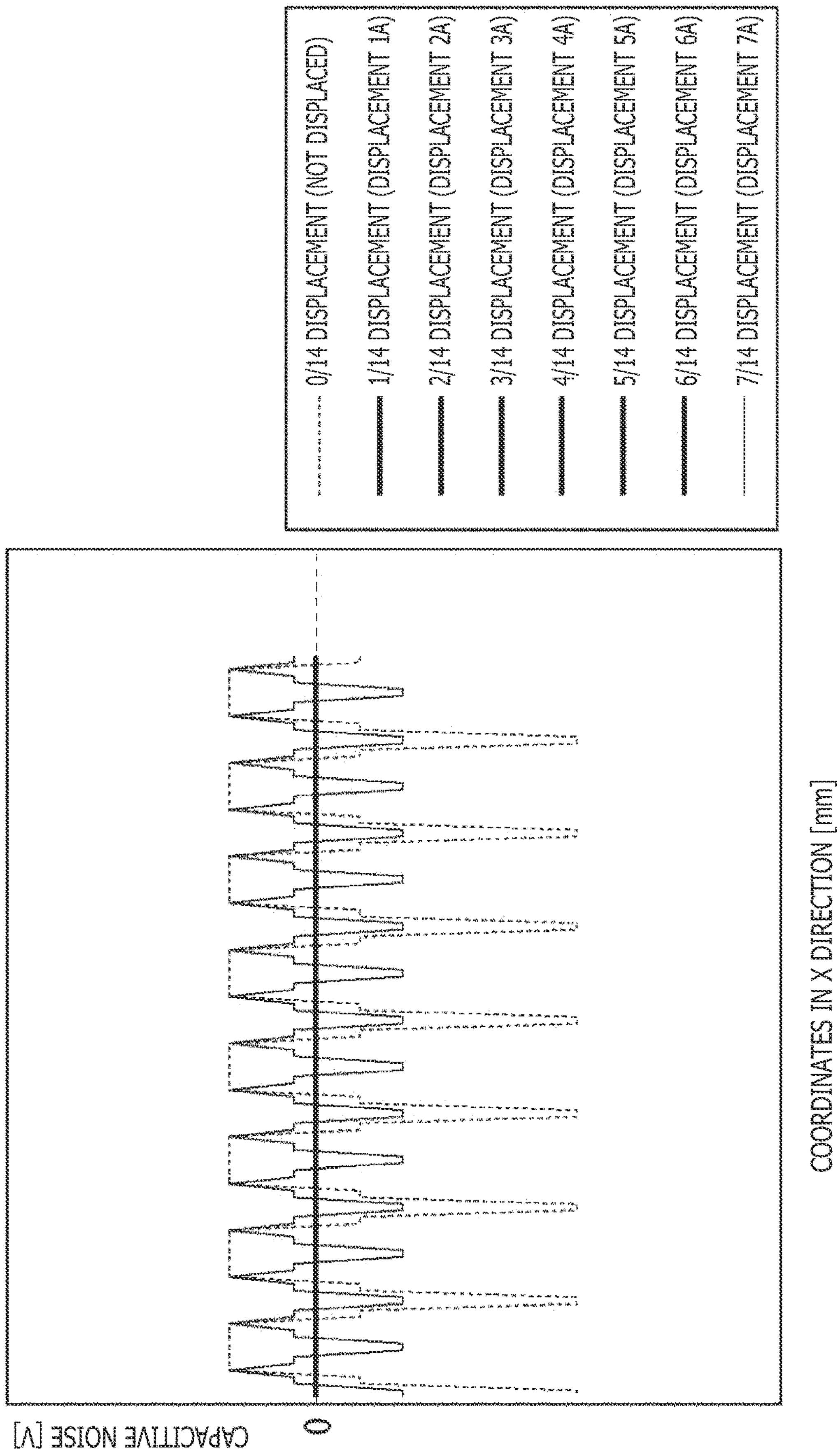

FIG. 193 is a figure depicting theoretical values of capacitive noise in the fourth displacement configuration example.

Figure 194:
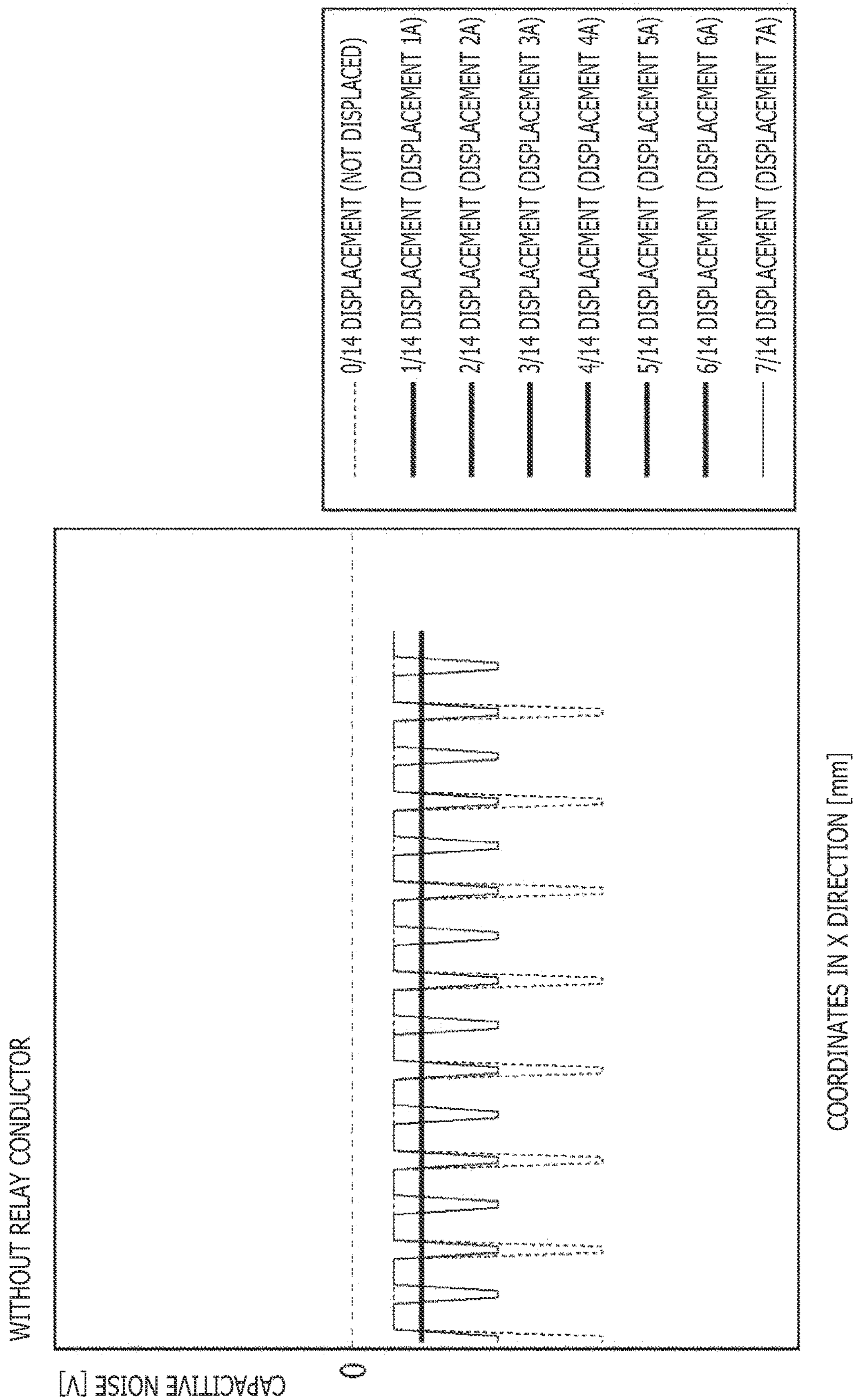

FIG. 194 is a figure depicting theoretical values of capacitive noise in the fourth displacement configuration example.

Figure 195:
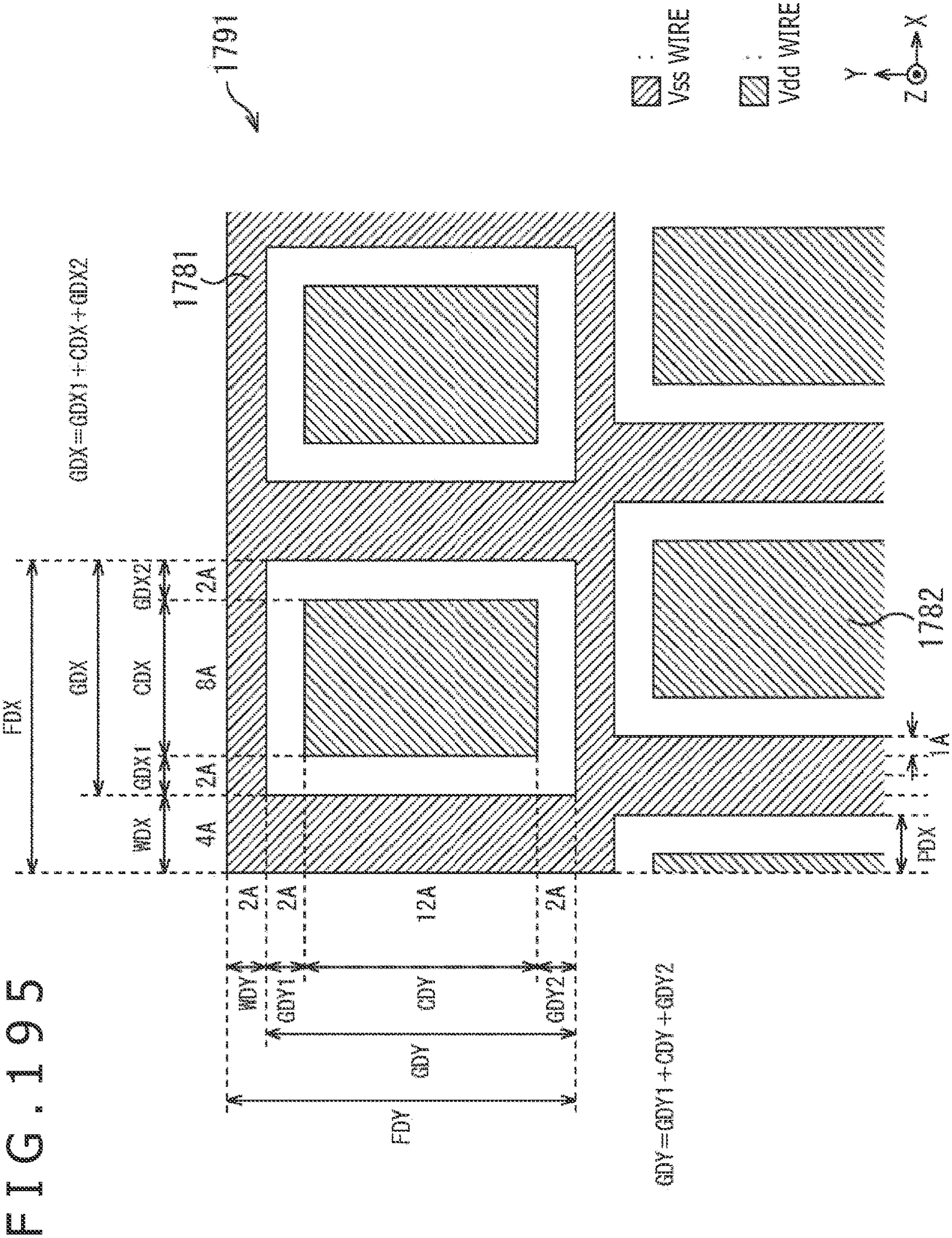

FIG. 195 is a figure for explaining conductor widths and gap widths in a fifth displacement configuration example of a mesh conductor.

Figures 196A, 196B, 196C:
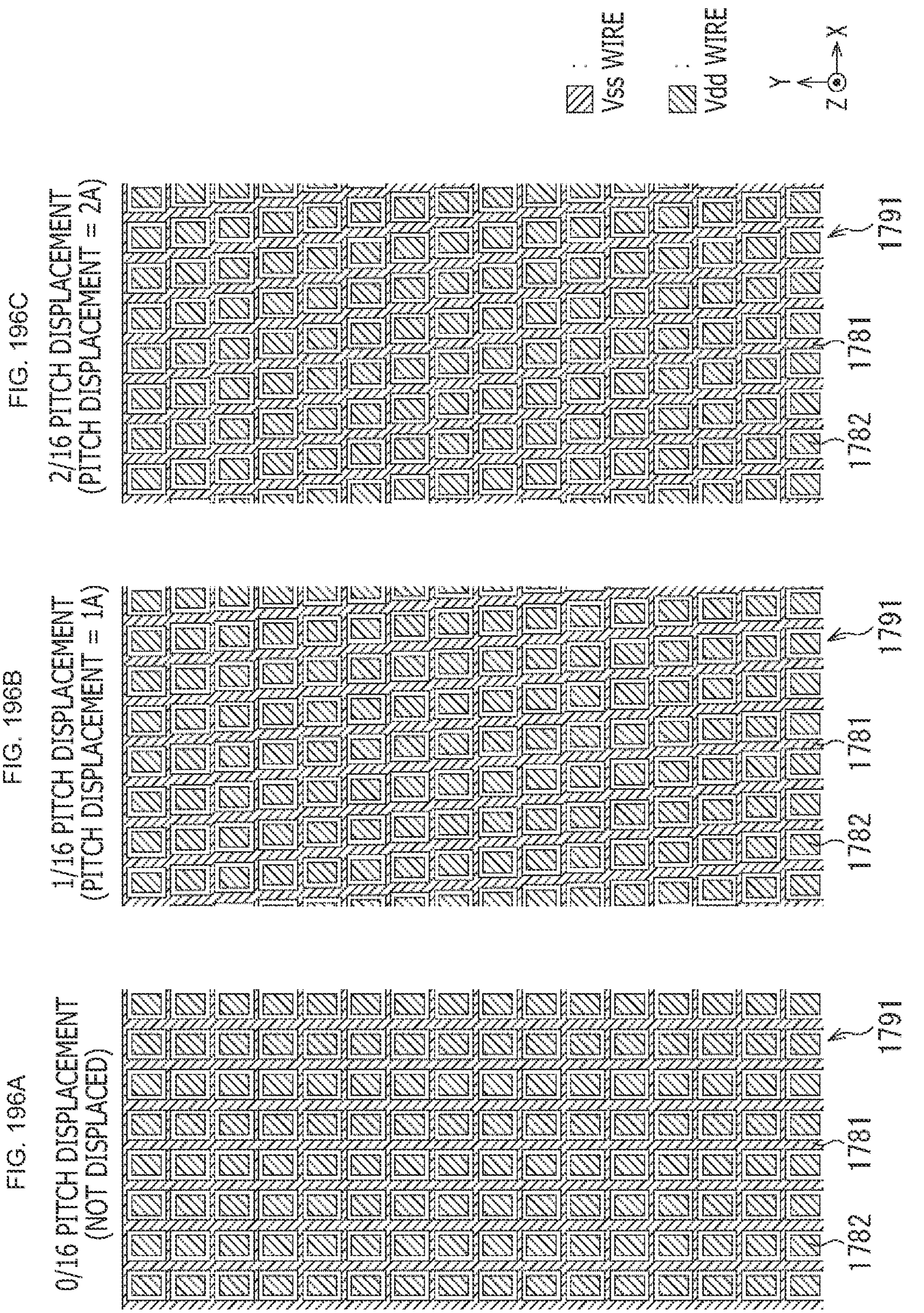

FIGS. 196A, 196B, and 196C are plan views of the fifth displacement configuration example of a mesh conductor.

Figure 197A:
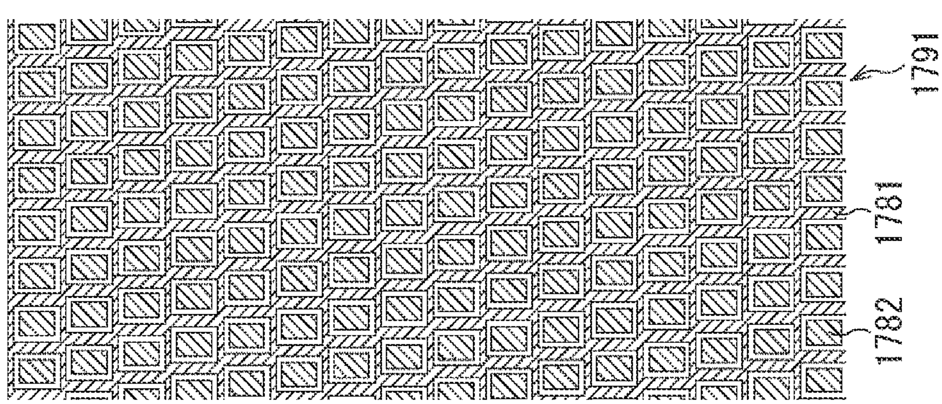
Figure 197B:
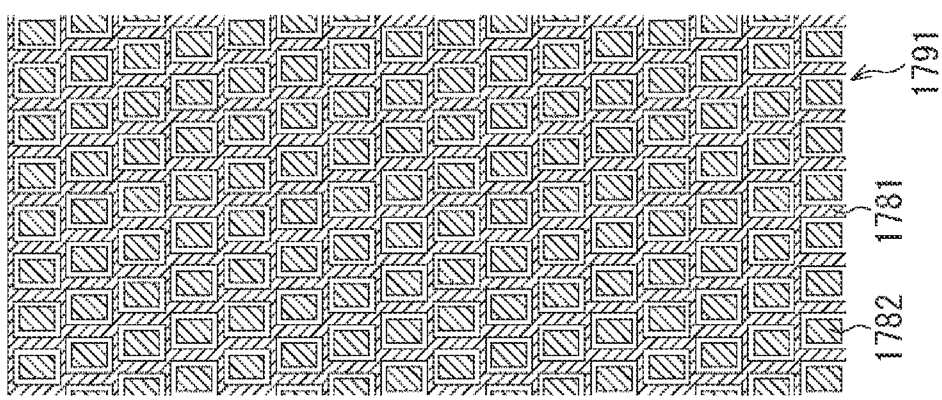
Figure 197C:
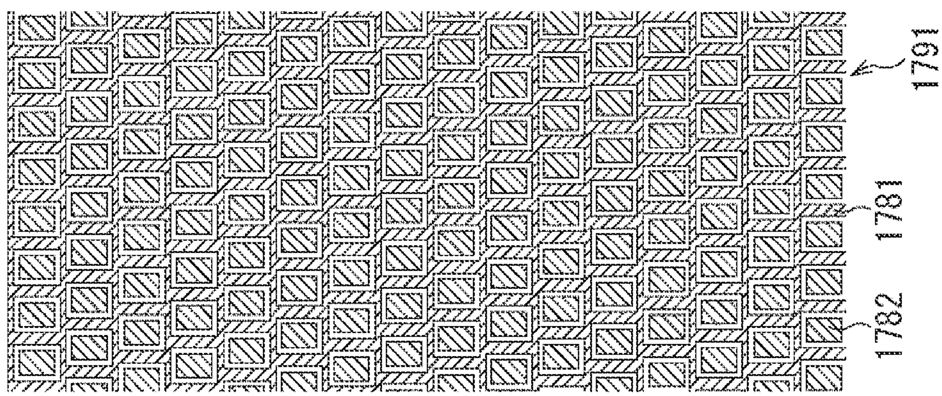

FIGS. 197A, 197B, and 197C are plan views of the fifth displacement configuration example of a mesh conductor.

FIGS. 198A, 198B, and 198C are plan views of the fifth displacement configuration example of a mesh conductor.

Figure 199:
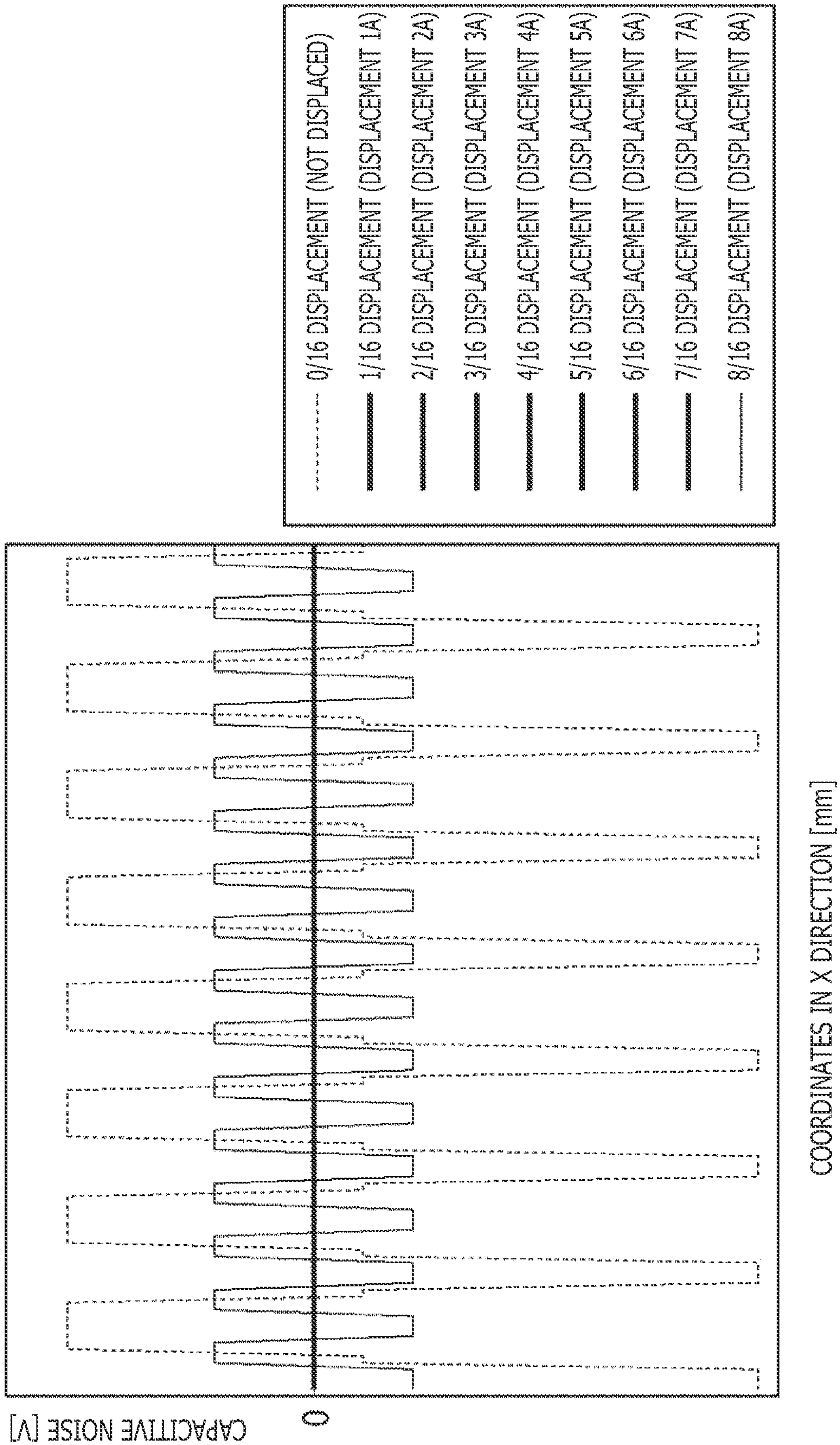

FIG. 199 is a figure depicting theoretical values of capacitive noise in the fifth displacement configuration example.

Figure 200:
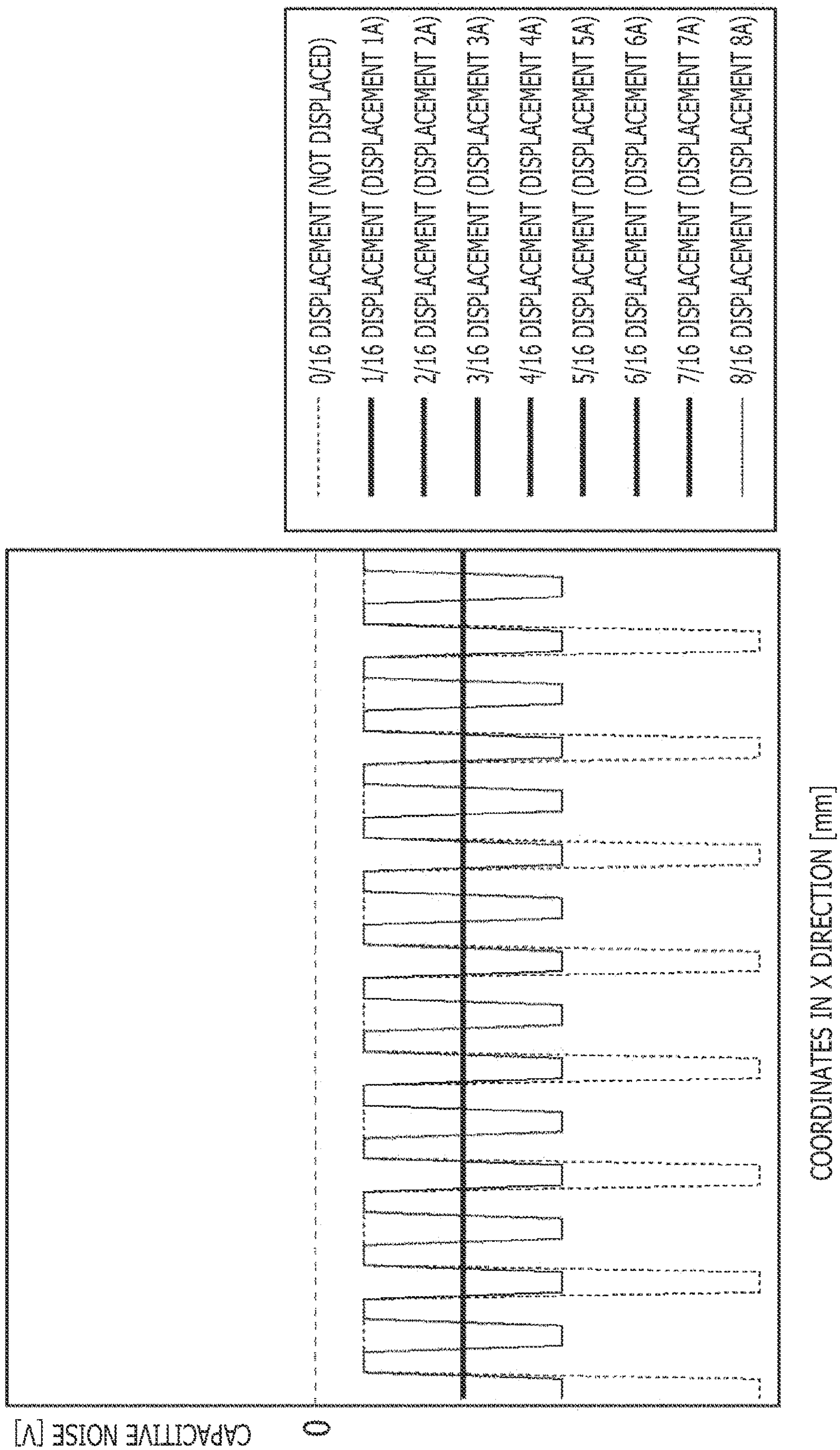

FIG. 200 is a figure depicting theoretical values of capacitive noise in the fifth displacement configuration example.

Figure 201:
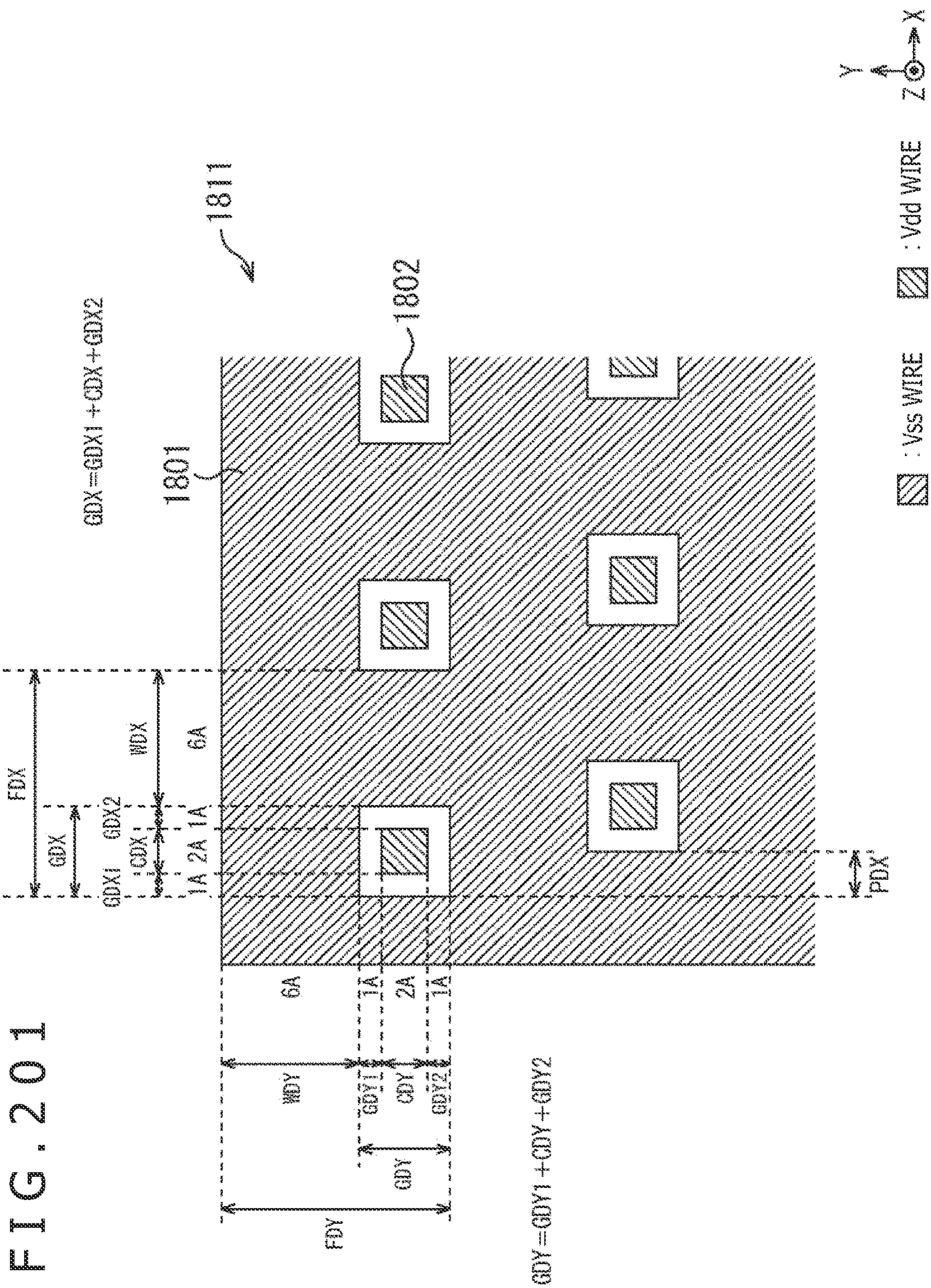

FIG. 201 is a figure for explaining conductor widths and gap widths in a sixth displacement configuration example of a mesh conductor.

Figure 202C:
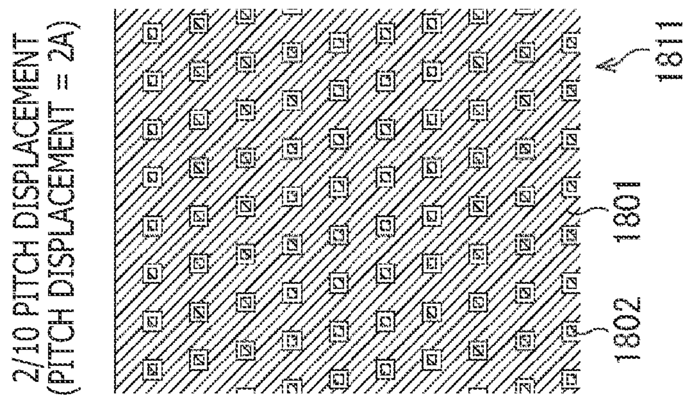
Figure 202B:
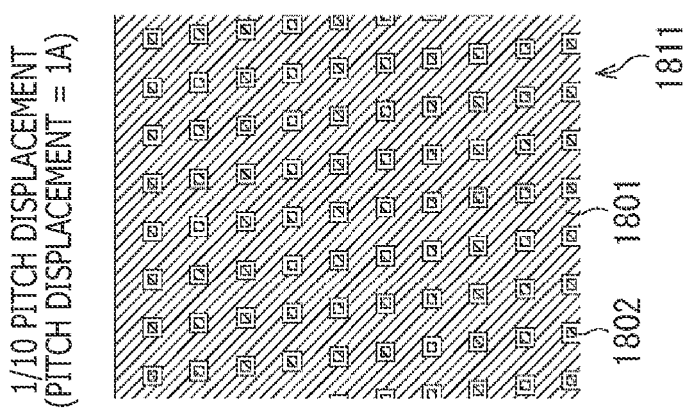
Figure 202A:
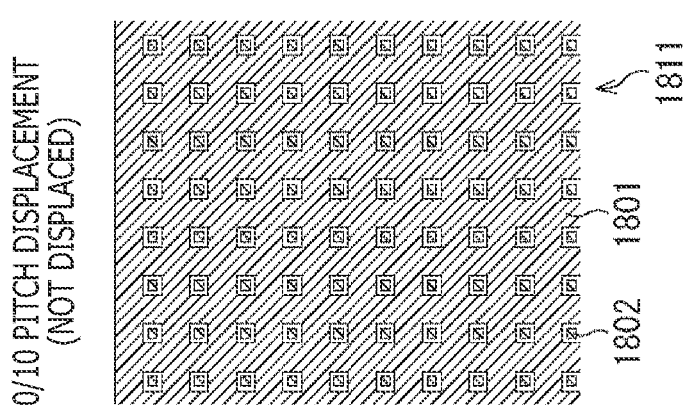
Figure 202A:
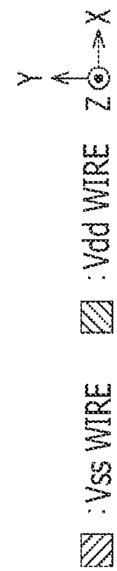

FIGS. 202A, 202B, and 202C are plan views of the sixth displacement configuration example of a mesh conductor.

Figure 203A:
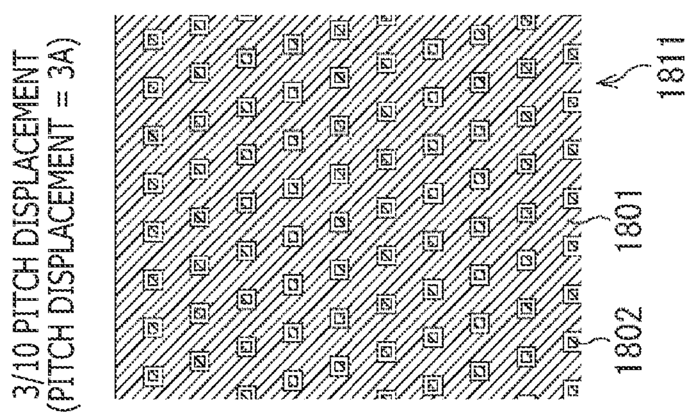
Figure 203B:
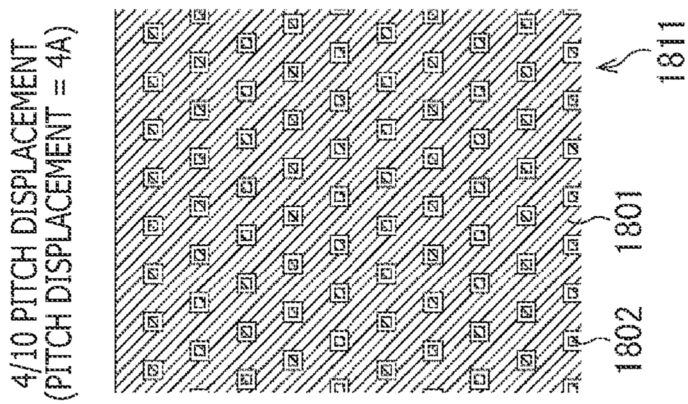
Figure 203C:
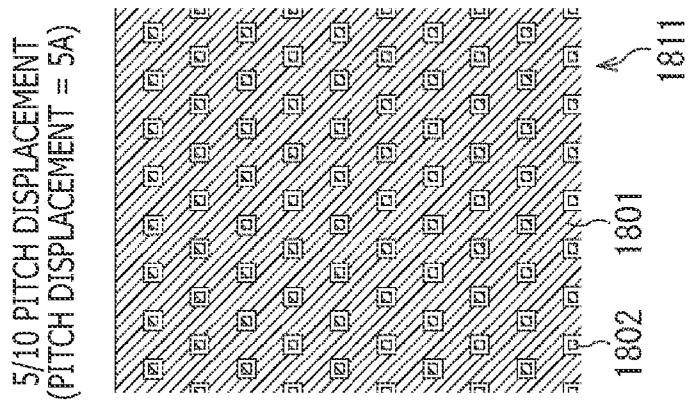
Figure 203C:
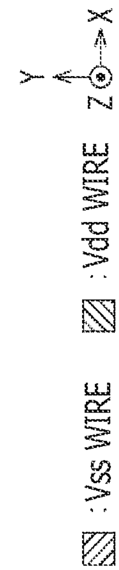

FIGS. 203A, 203B, and 203C are plan views of the sixth displacement configuration example of a mesh conductor.

Figure 204:
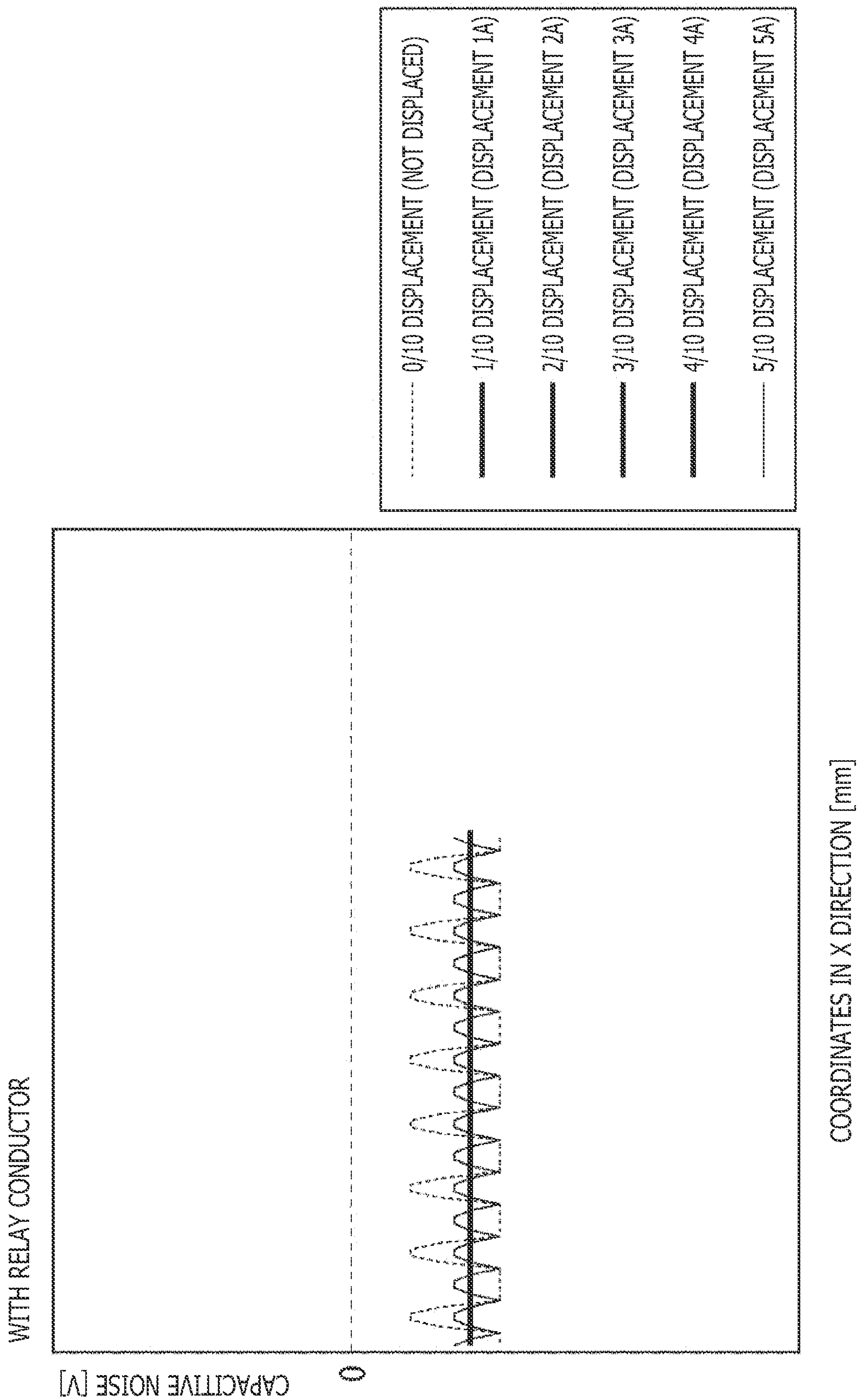

FIG. 204 is a figure depicting theoretical values of capacitive noise in the sixth displacement configuration example.

Figure 205:
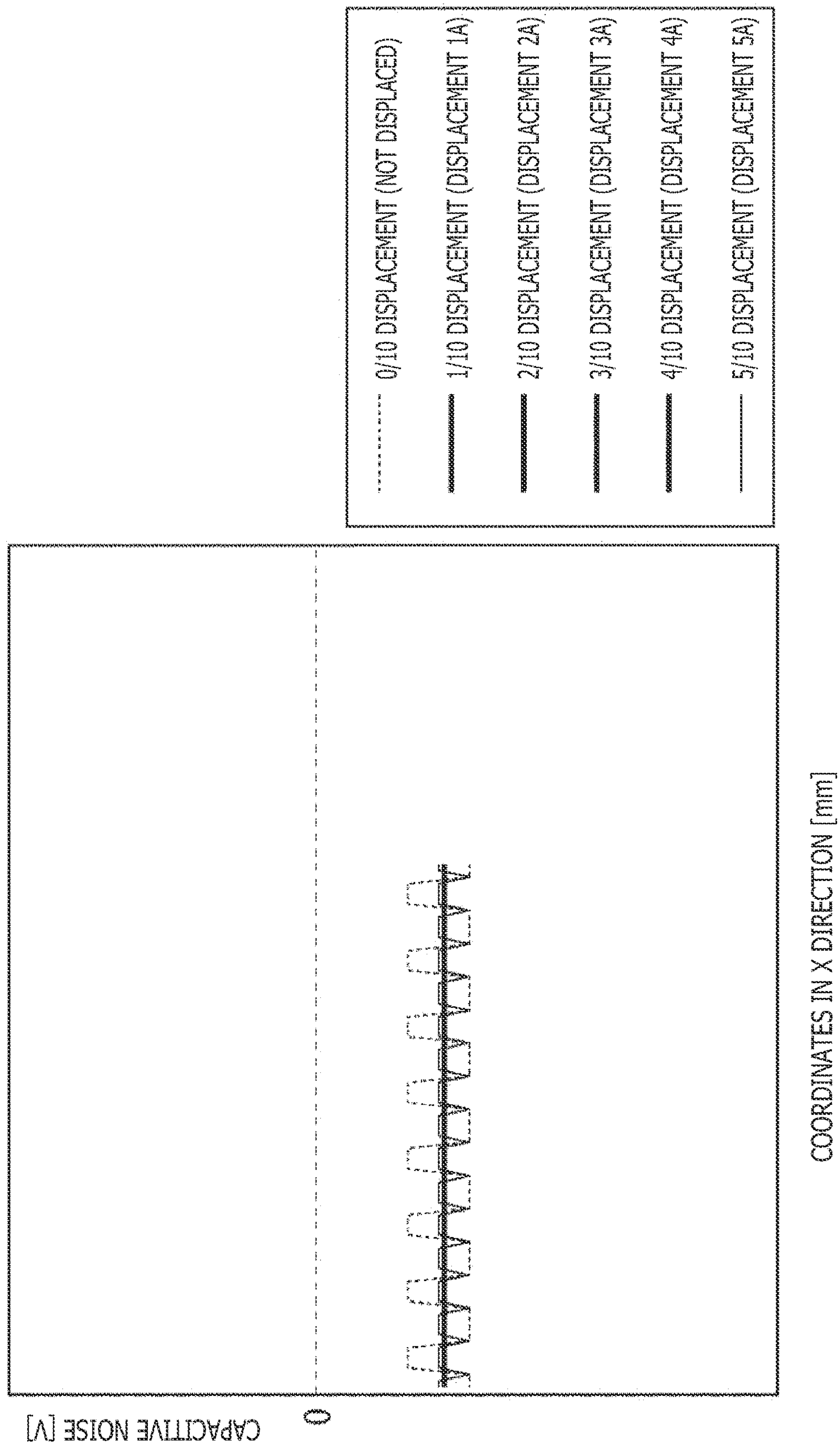

FIG. 205 is a figure depicting theoretical values of capacitive noise in the sixth displacement configuration example.

Figure 206:
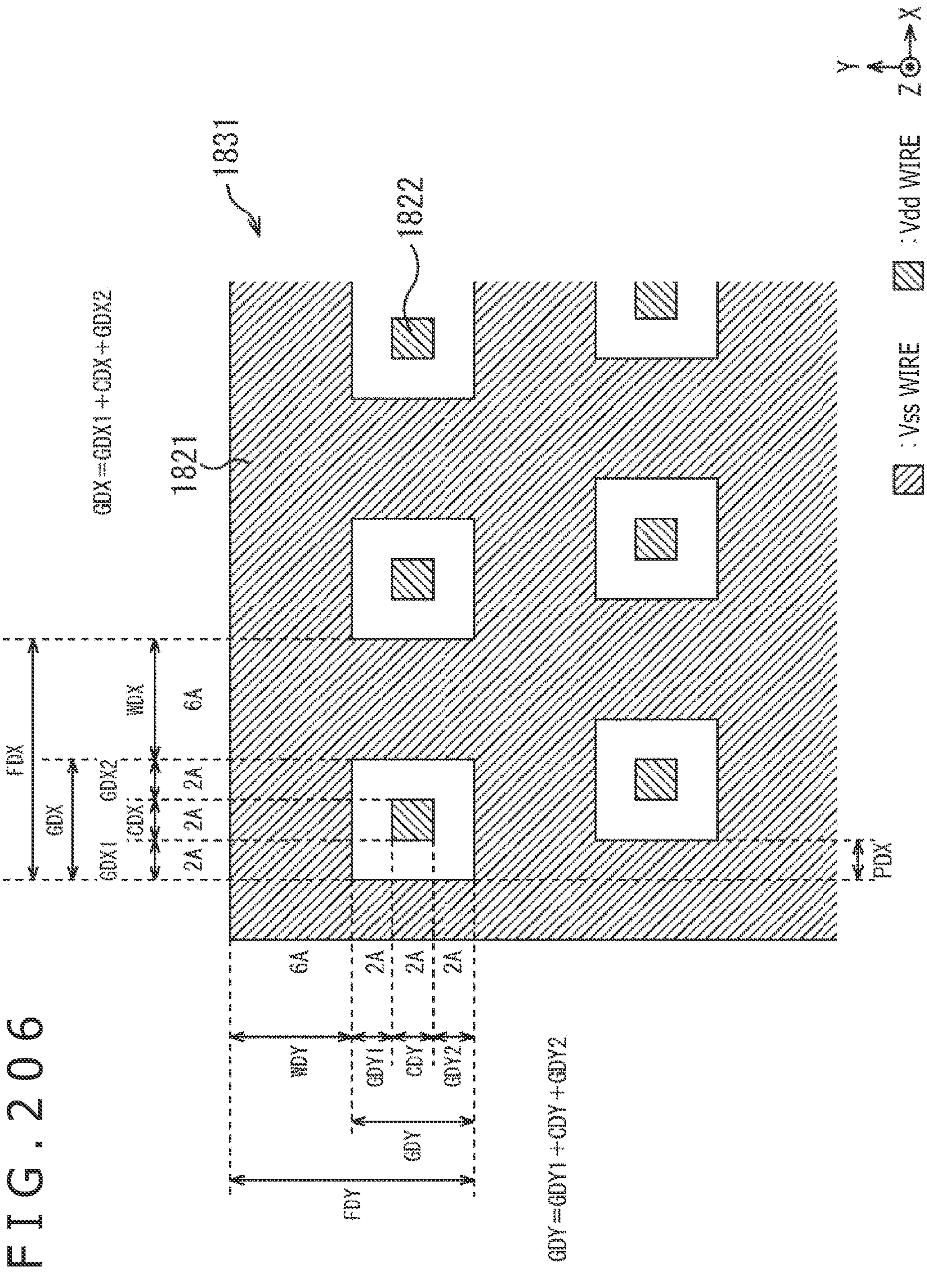

FIG. 206 is a figure for explaining conductor widths and gap widths in a seventh displacement configuration example of a mesh conductor.

FIGS. 207A, 207B, 207C, and 207D are plan views of the seventh displacement configuration example of a mesh conductor.

Figure 208A:
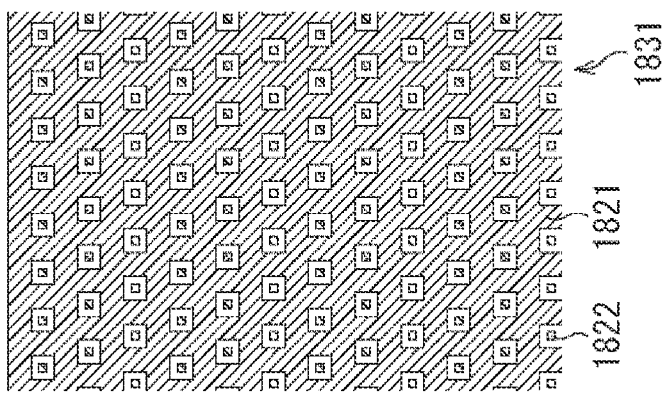
Figure 208B:
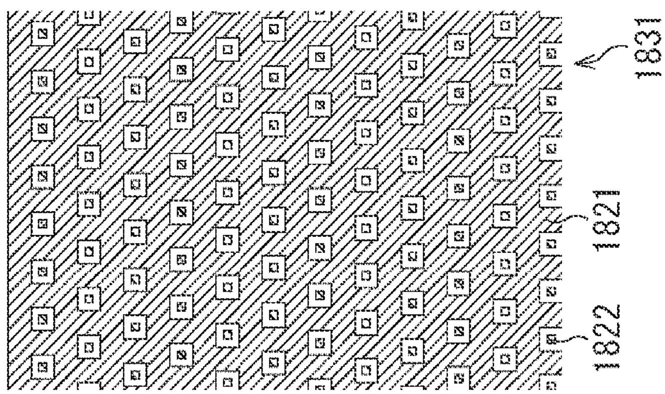
Figure 208C:
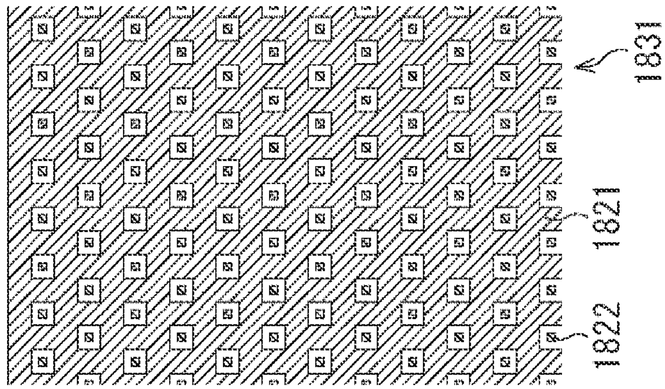
Figure 208C:
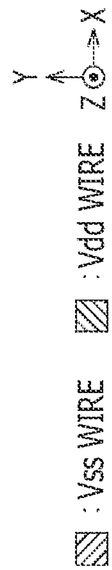

FIGS. 208A, 208B, and 208C are plan views of the seventh displacement configuration example of a mesh conductor.

Figure 209:
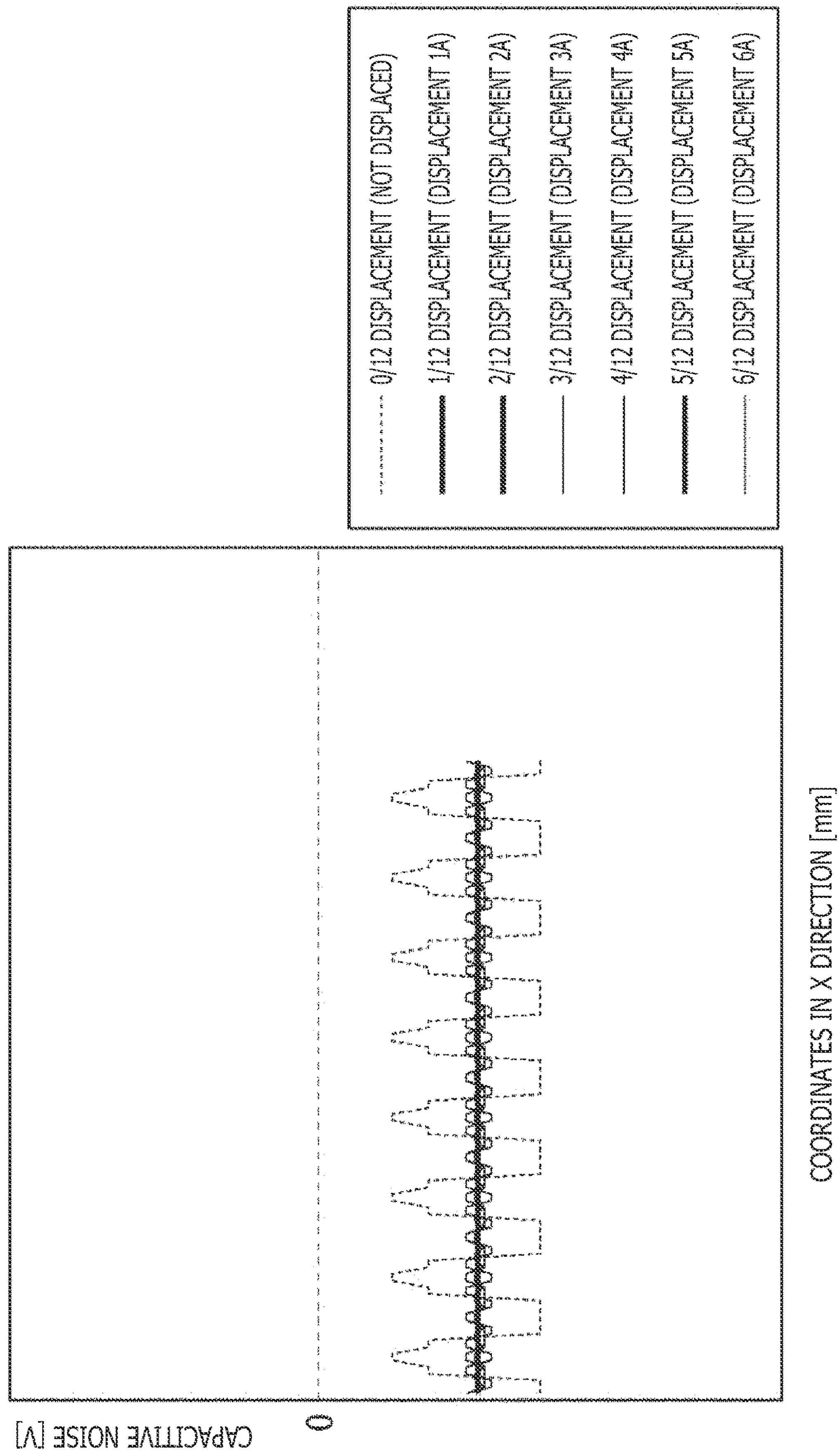

FIG. 209 is a figure depicting theoretical values of capacitive noise in the seventh displacement configuration example.

Figure 210:
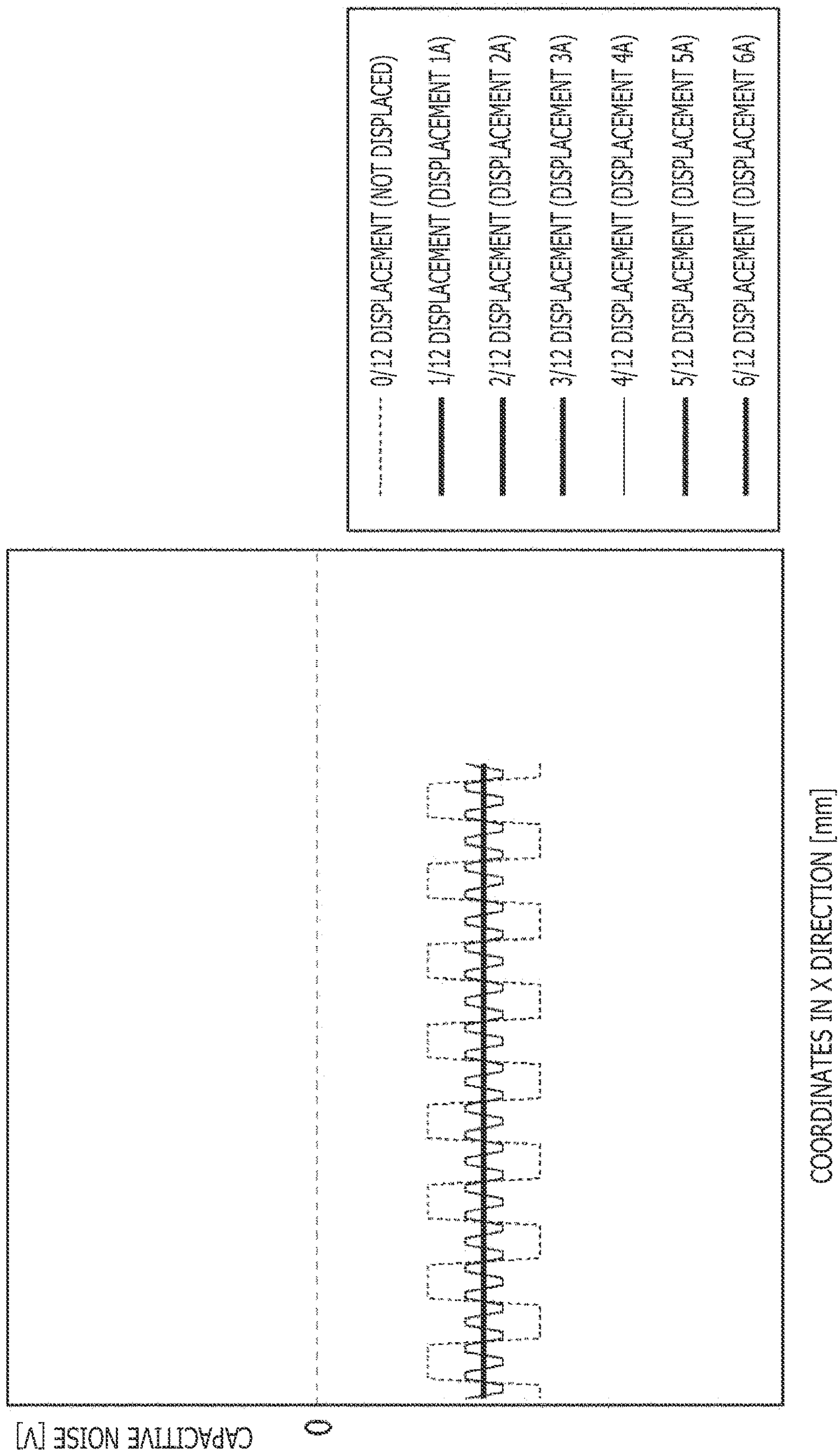

FIG. 210 is a figure depicting theoretical values of capacitive noise in the seventh displacement configuration example.

FIGS. 211A, 211B, 211C, and 211D include conceptual diagrams depicting cases in which the solid-state image pickup apparatus has two power supplies and three power supplies.

Figure 212B:
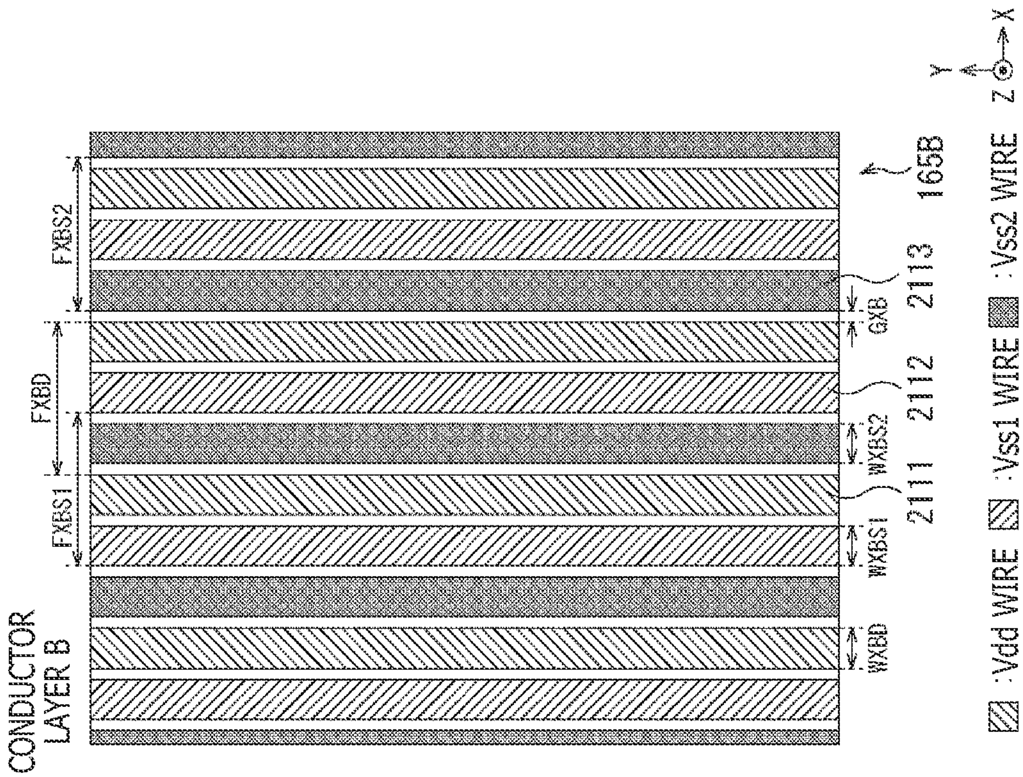
Figure 212A:
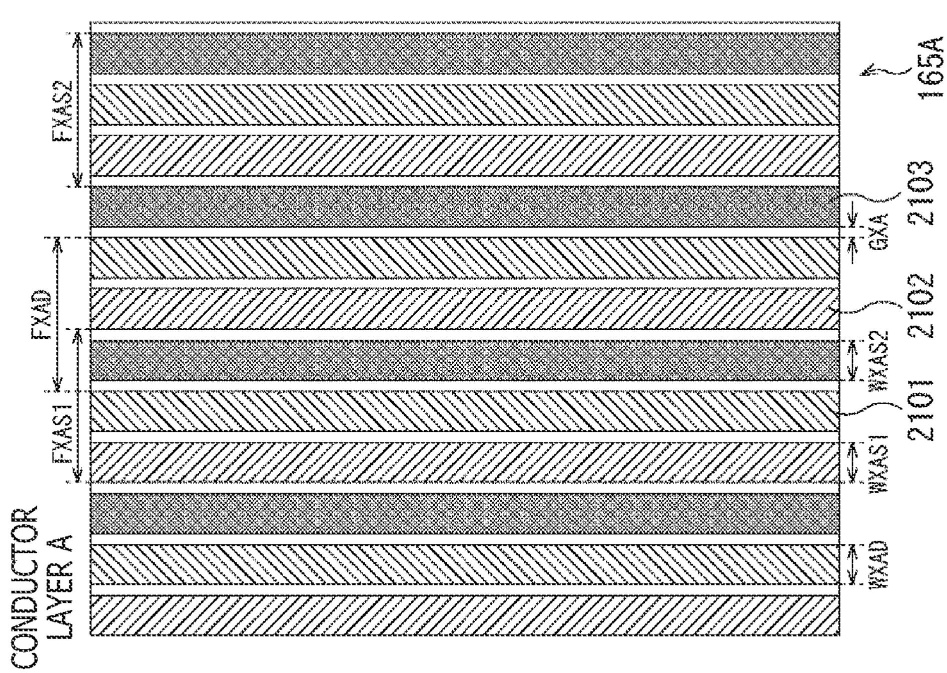

FIGS. 212A and 212B are plan views of a first configuration example of three power supplies.

Figure 213:
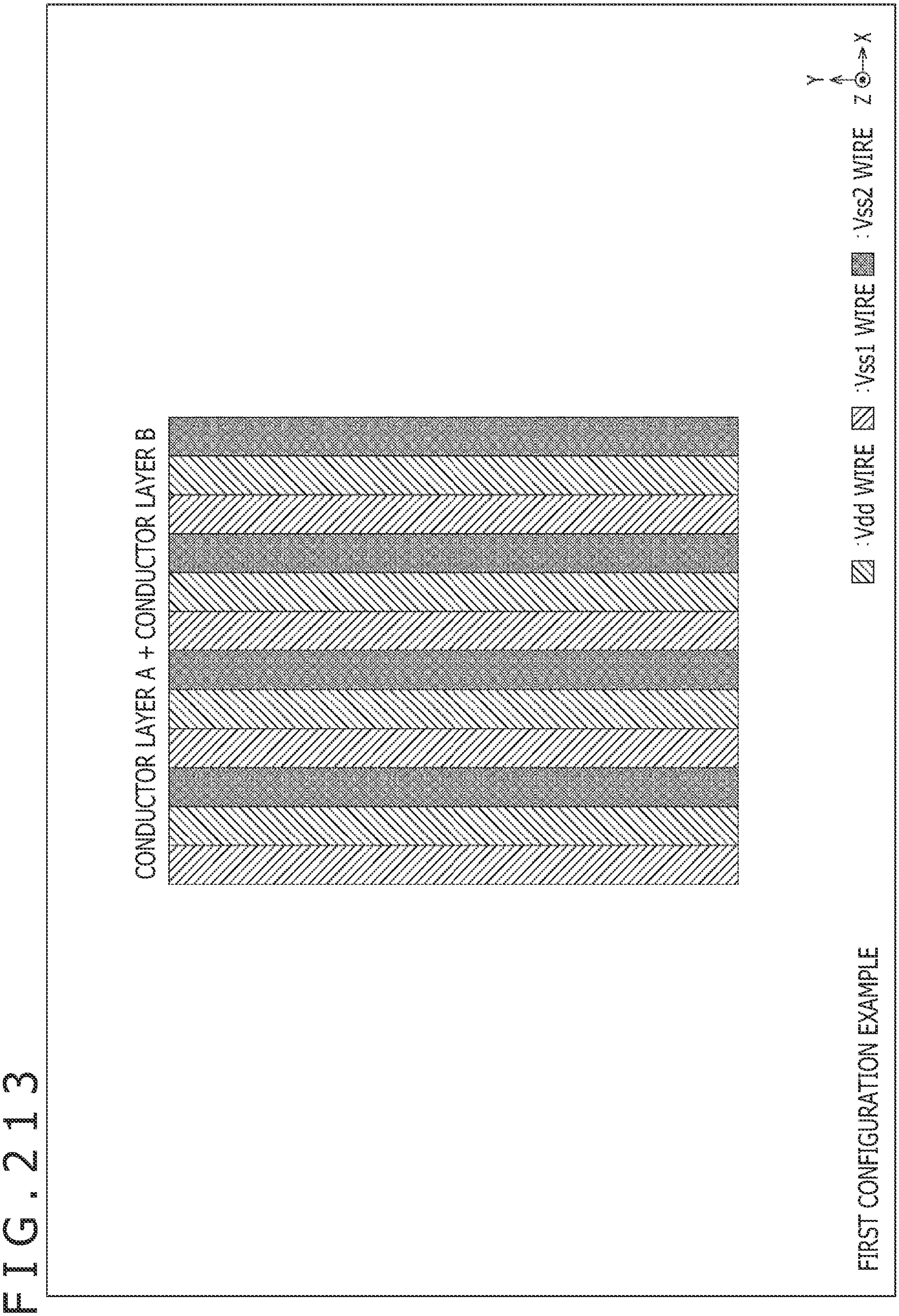

FIG. 213 is a plan view of the first configuration example of three power supplies.

Figures 214A, 214B:
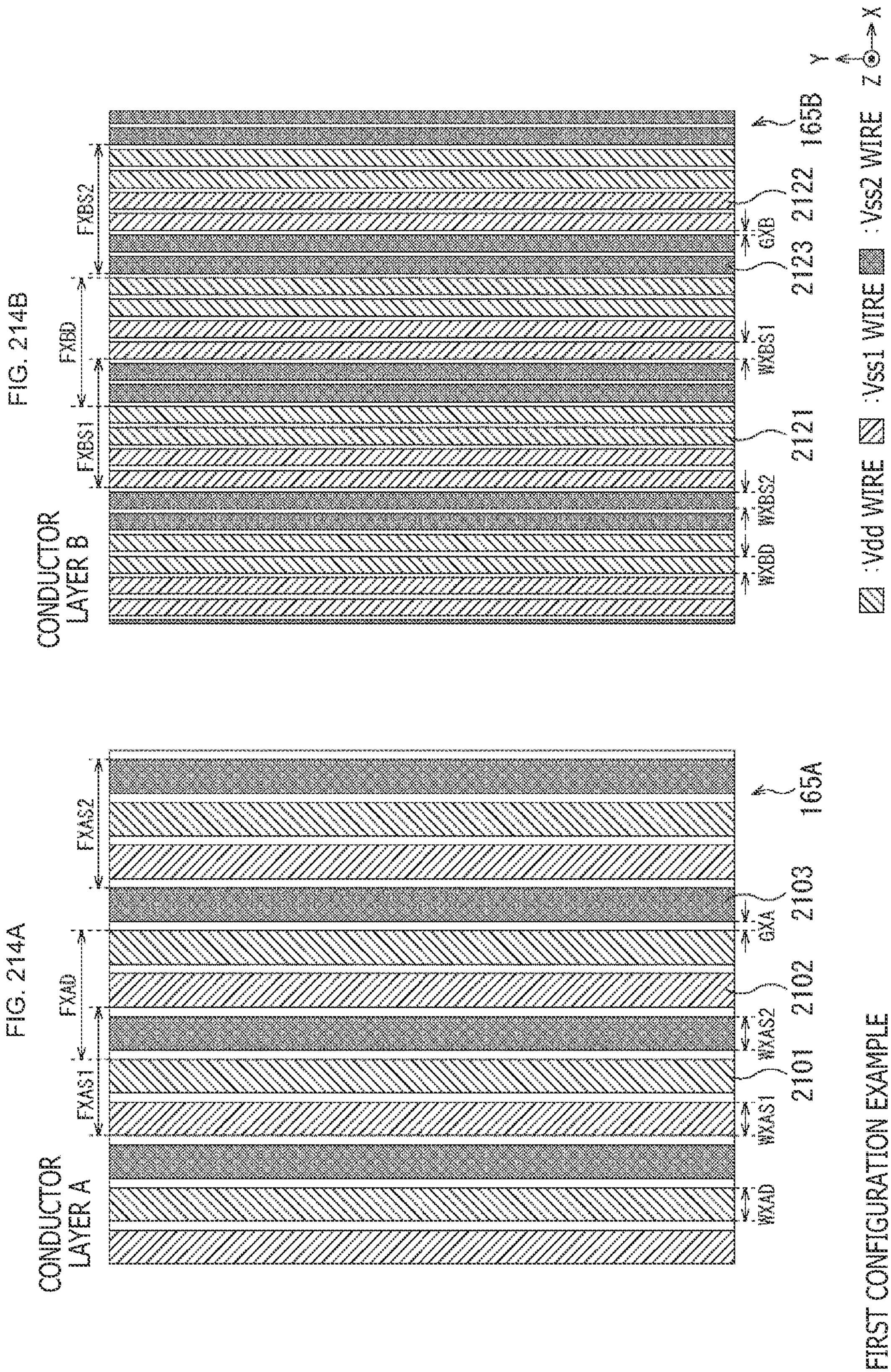

FIGS. 214A and 214B are plan views of a first modification example of the first configuration example of three power supplies.

Figure 215:
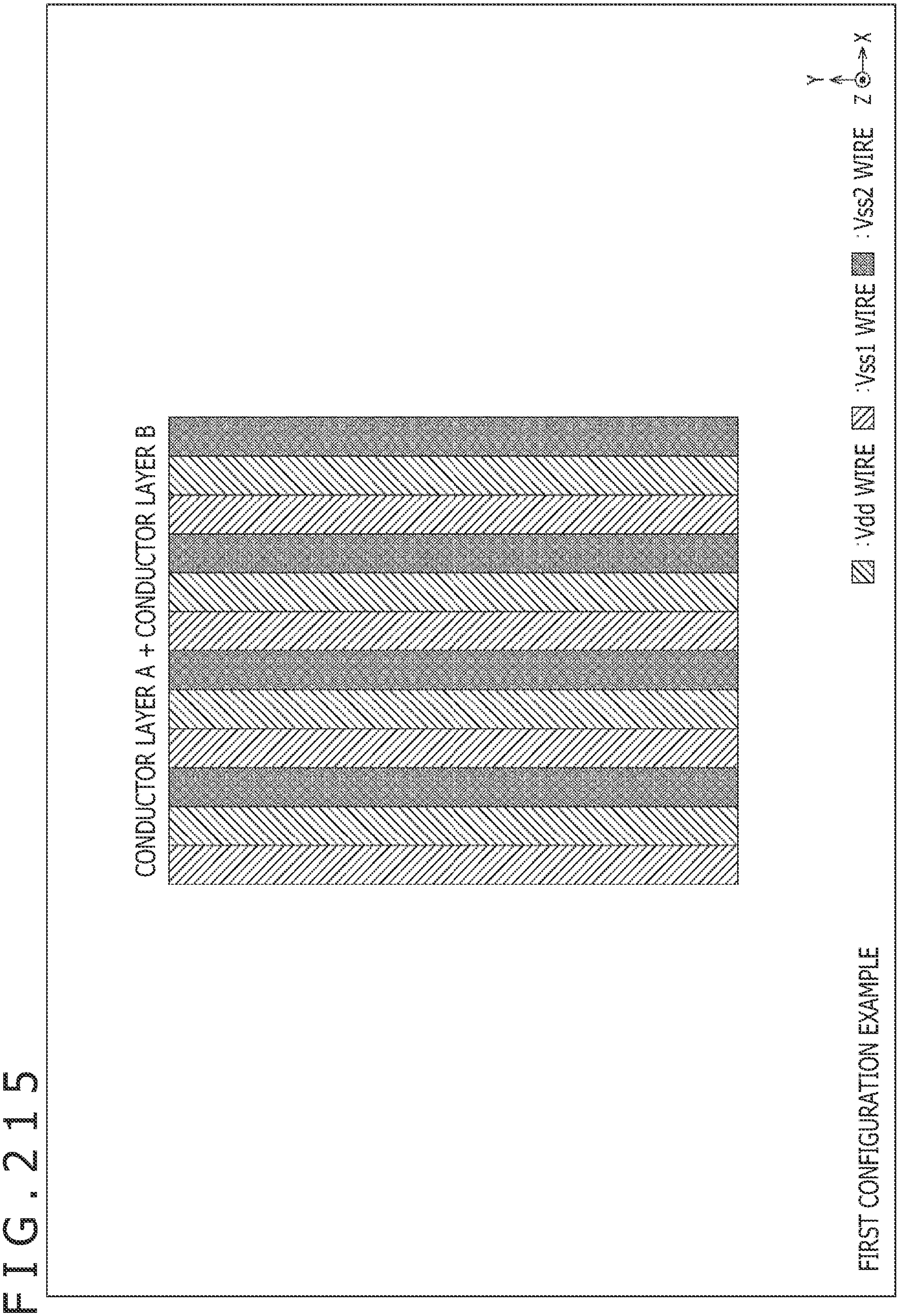

FIG. 215 is a plan view of the first modification example of the first configuration example of three power supplies.

Figure 216B:
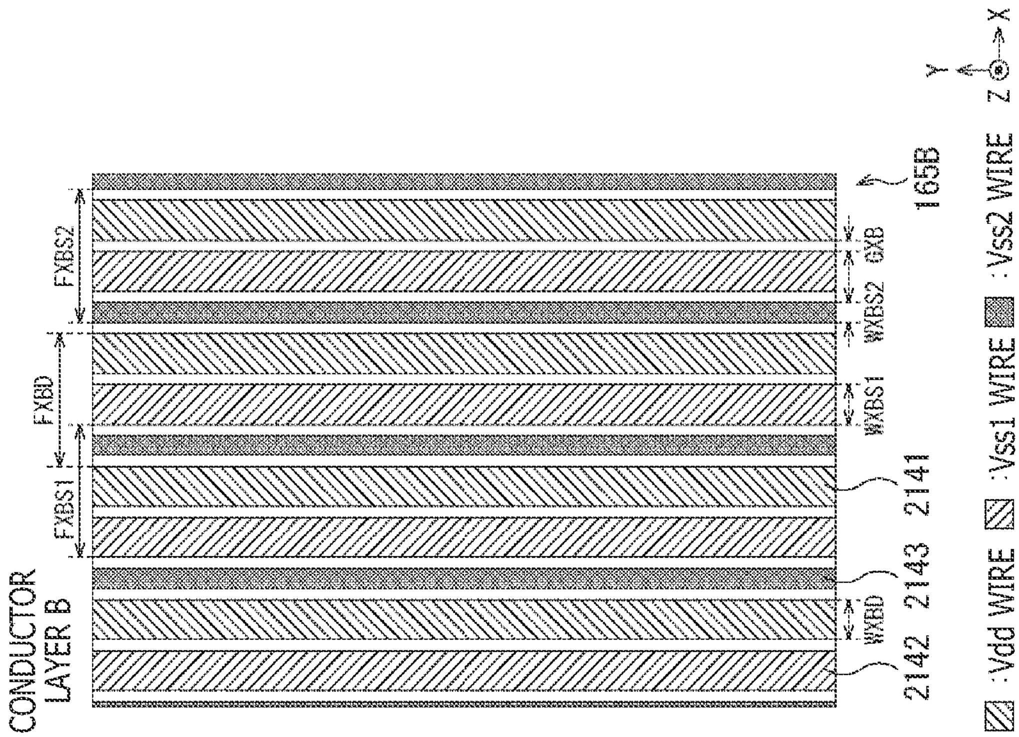
Figure 216A:
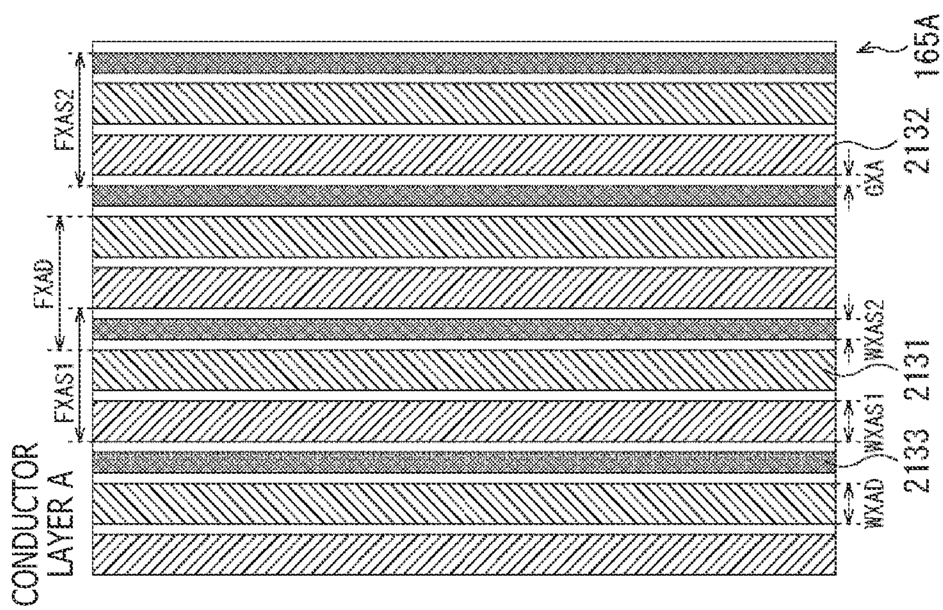

FIGS. 216A and 216B are plan views of a second modification example of the first configuration example of three power supplies.

Figure 217:
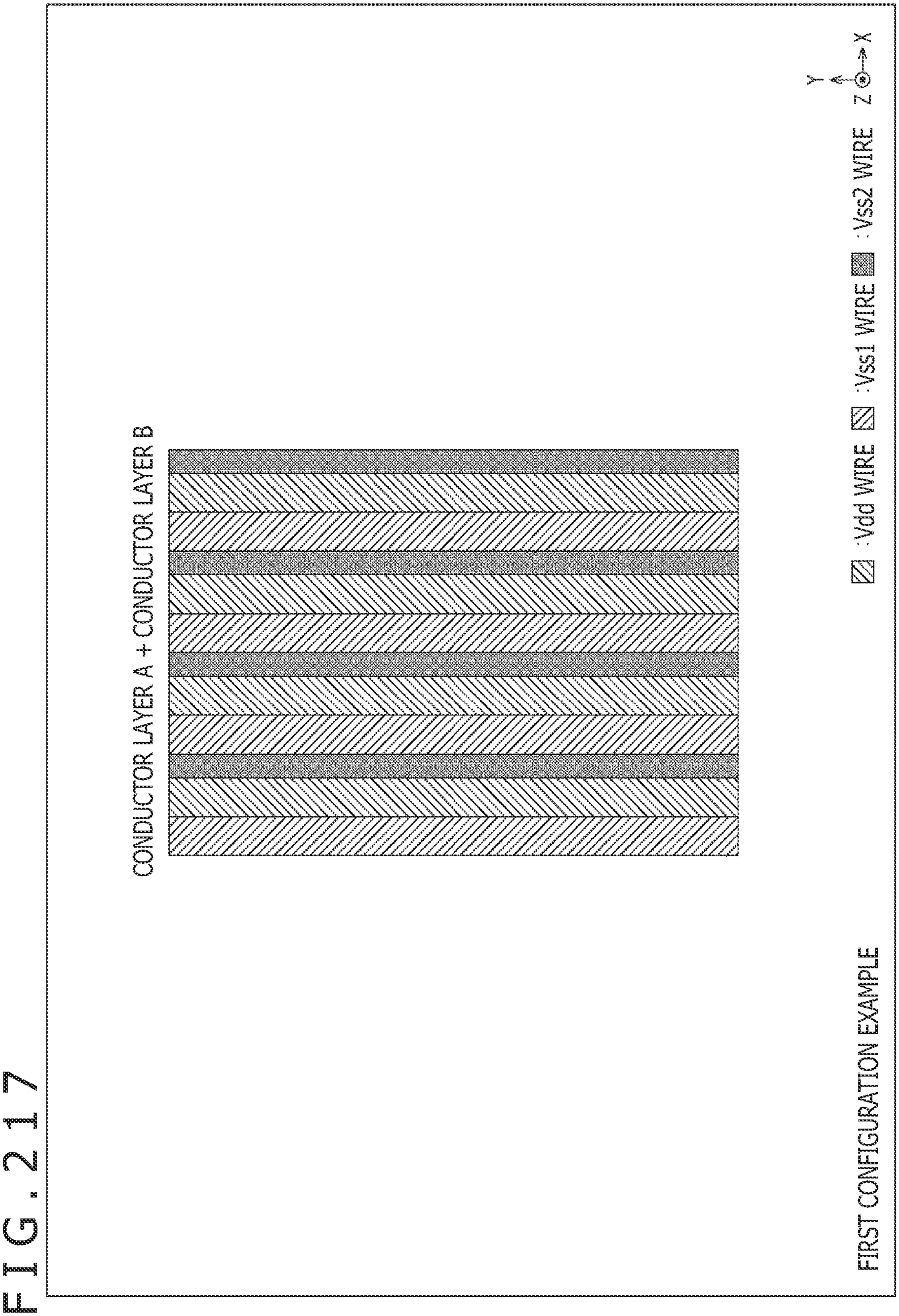

FIG. 217 is a plan view of the second modification example of the first configuration example of three power supplies.

Figure 218A:
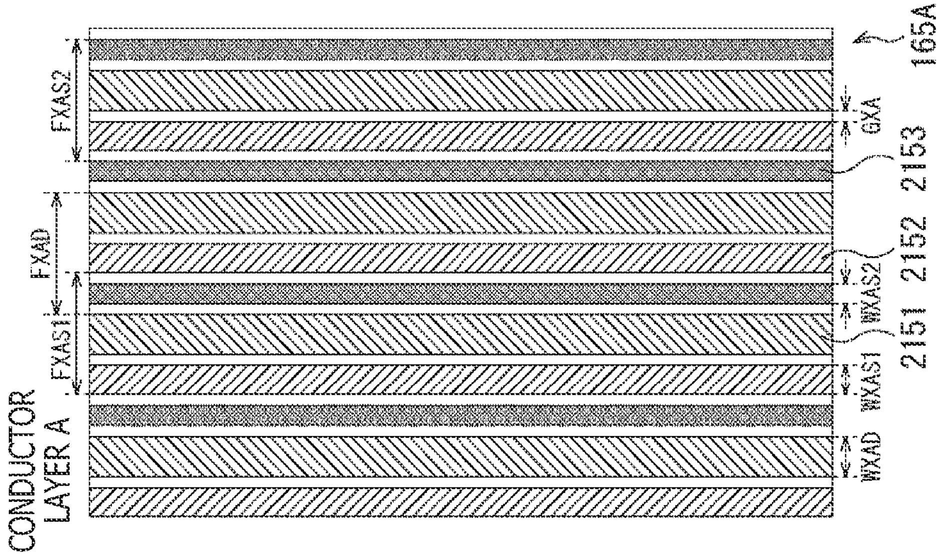
Figure 218B:
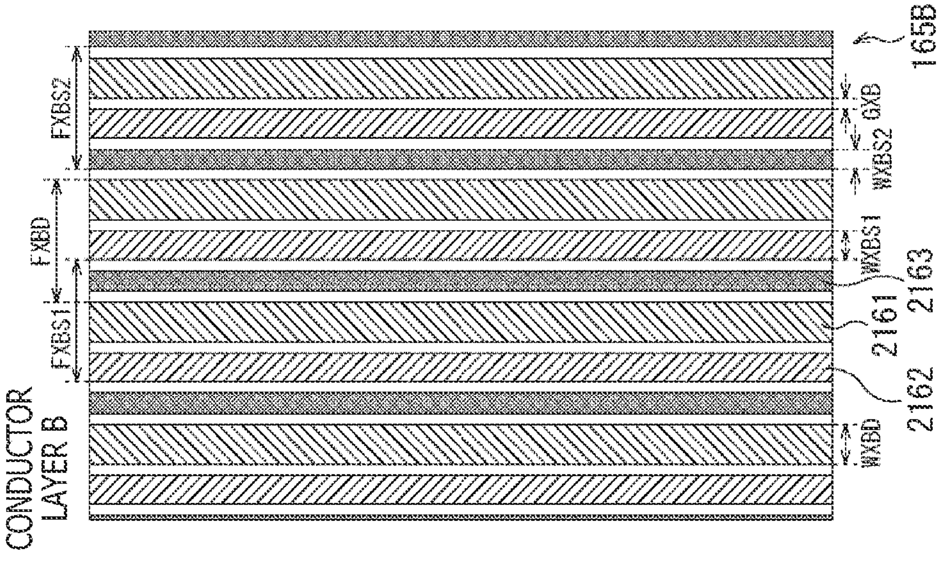

FIGS. 218A and 218B are plan views of a third modification example of the first configuration example of three power supplies.

Figure 219:
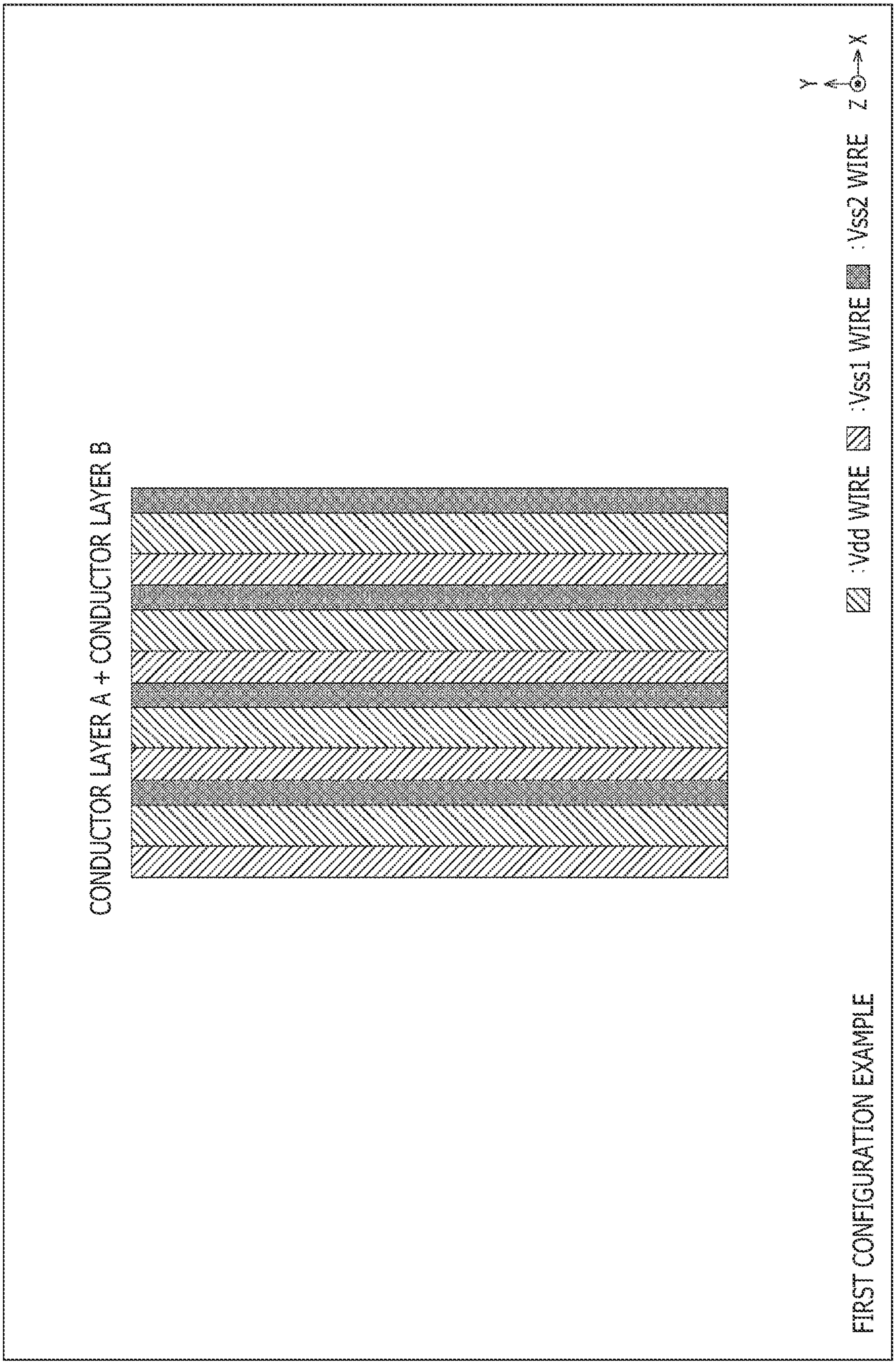

FIG. 219 is a plan view of the third modification example of the first configuration example of three power supplies.

Figure 220B:
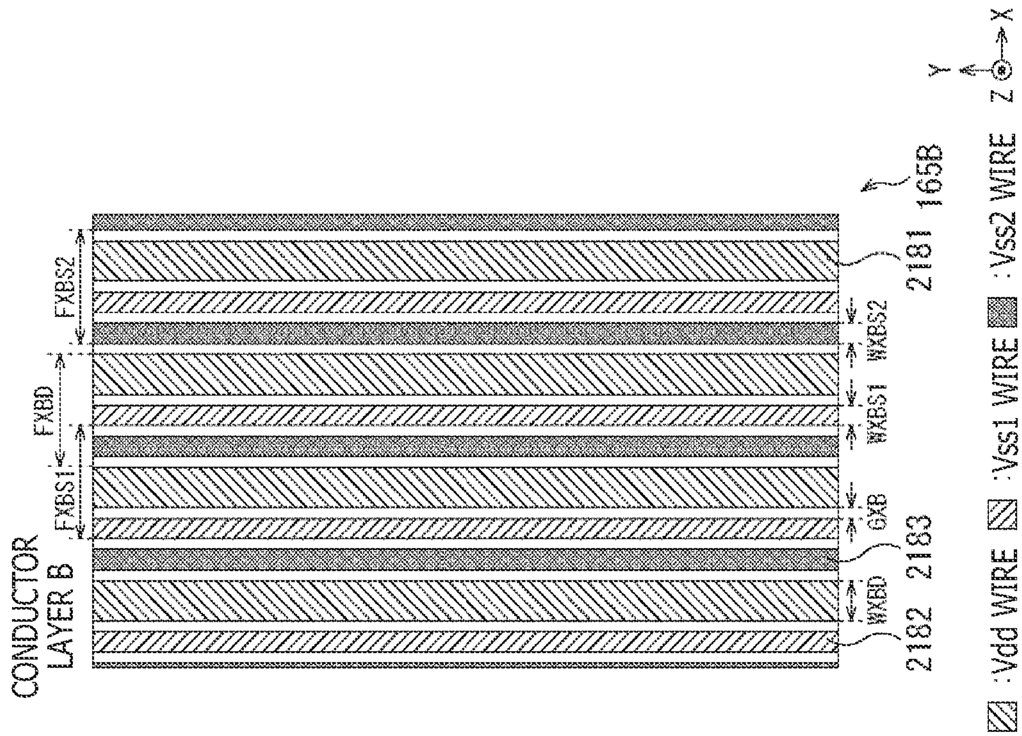
Figure 220A:
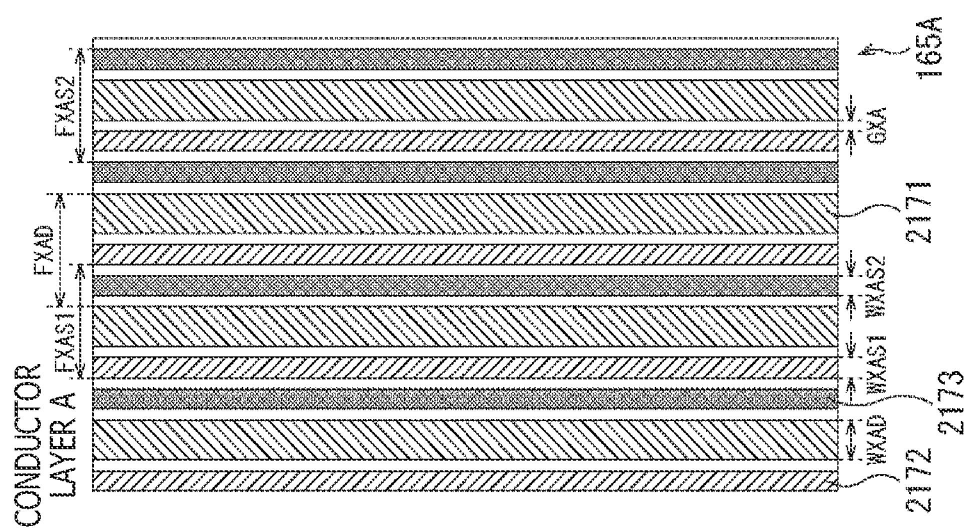

FIGS. 220A and 220B are plan views of a fourth modification example of the first configuration example of three power supplies.

Figure 221:
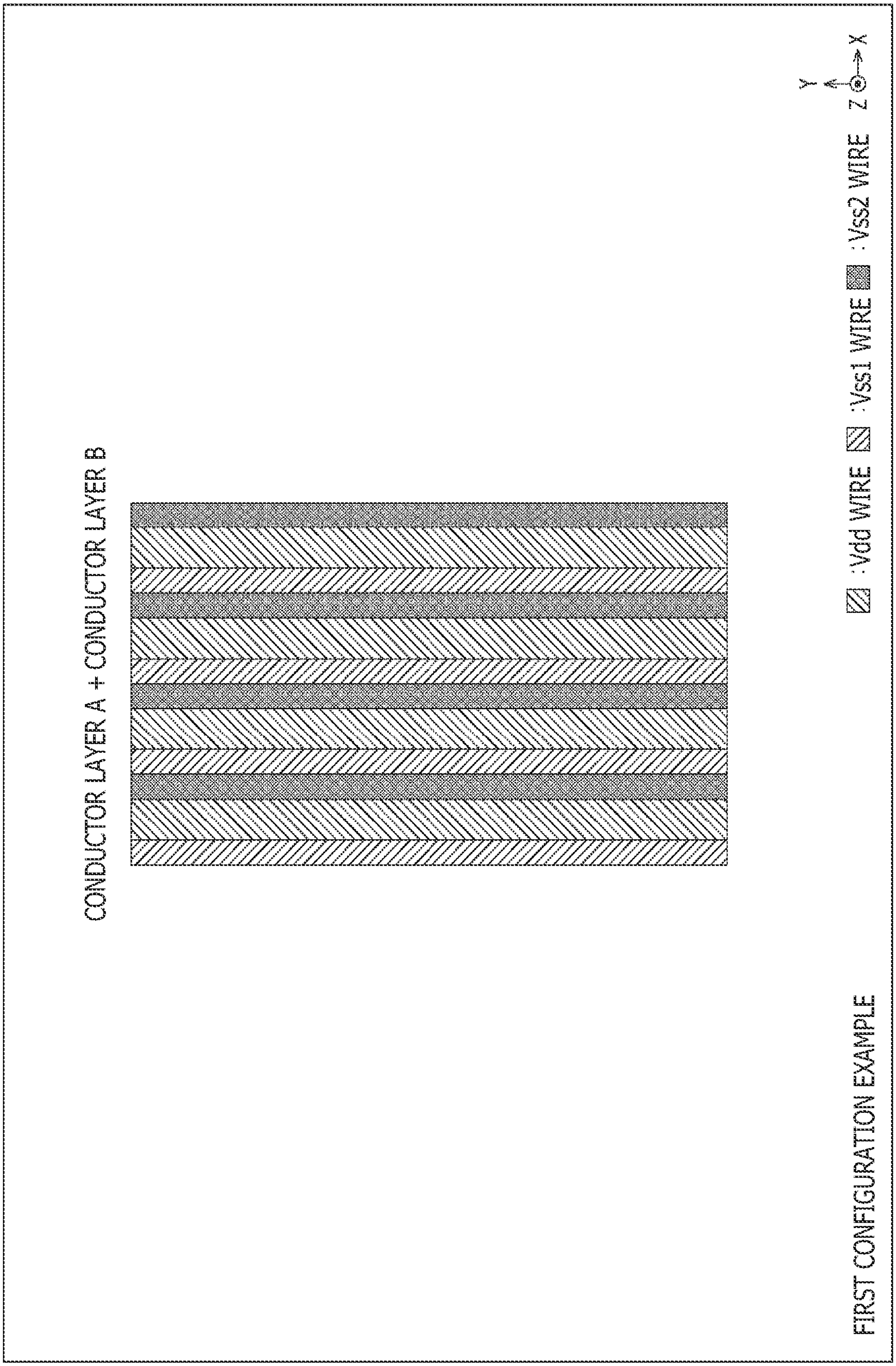

FIG. 221 is a plan view of the fourth modification example of the first configuration example of three power supplies.

Figure 222B:
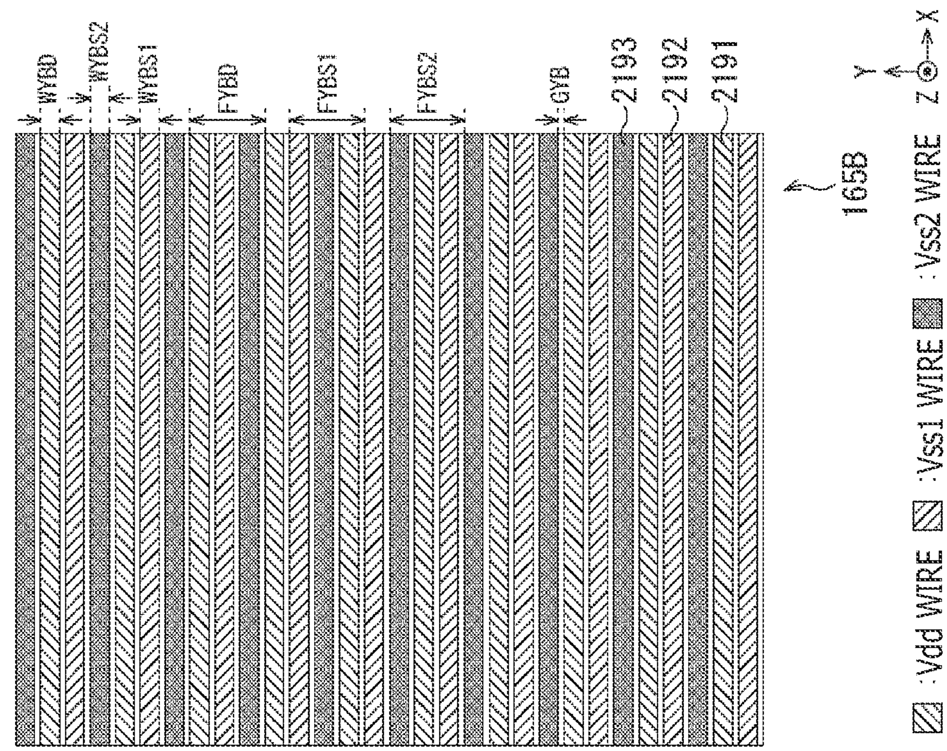
Figure 222A:
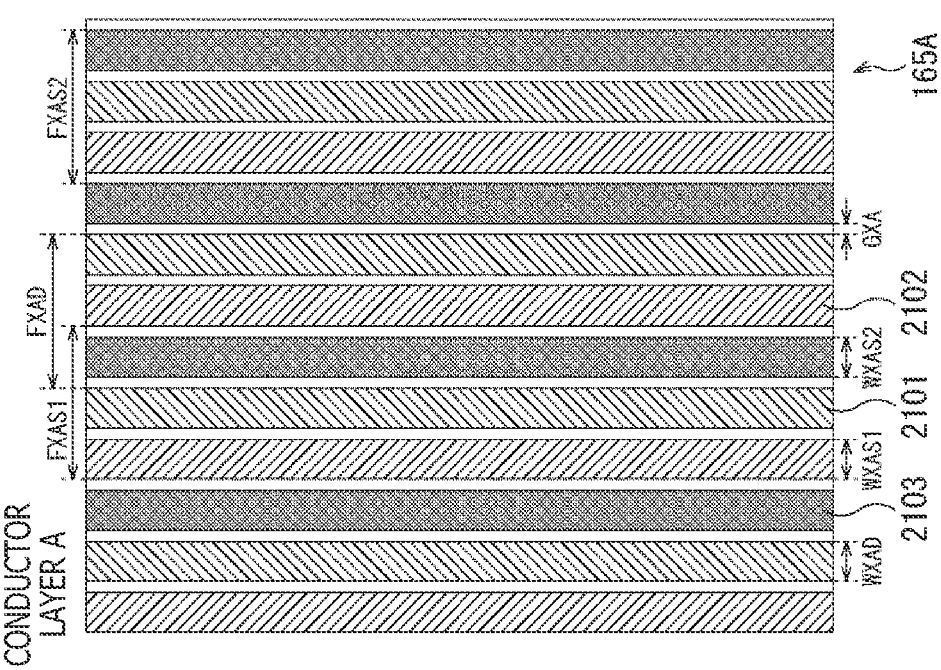

FIGS. 222A and 222B are plan views of a second configuration example of three power supplies.

Figure 223:
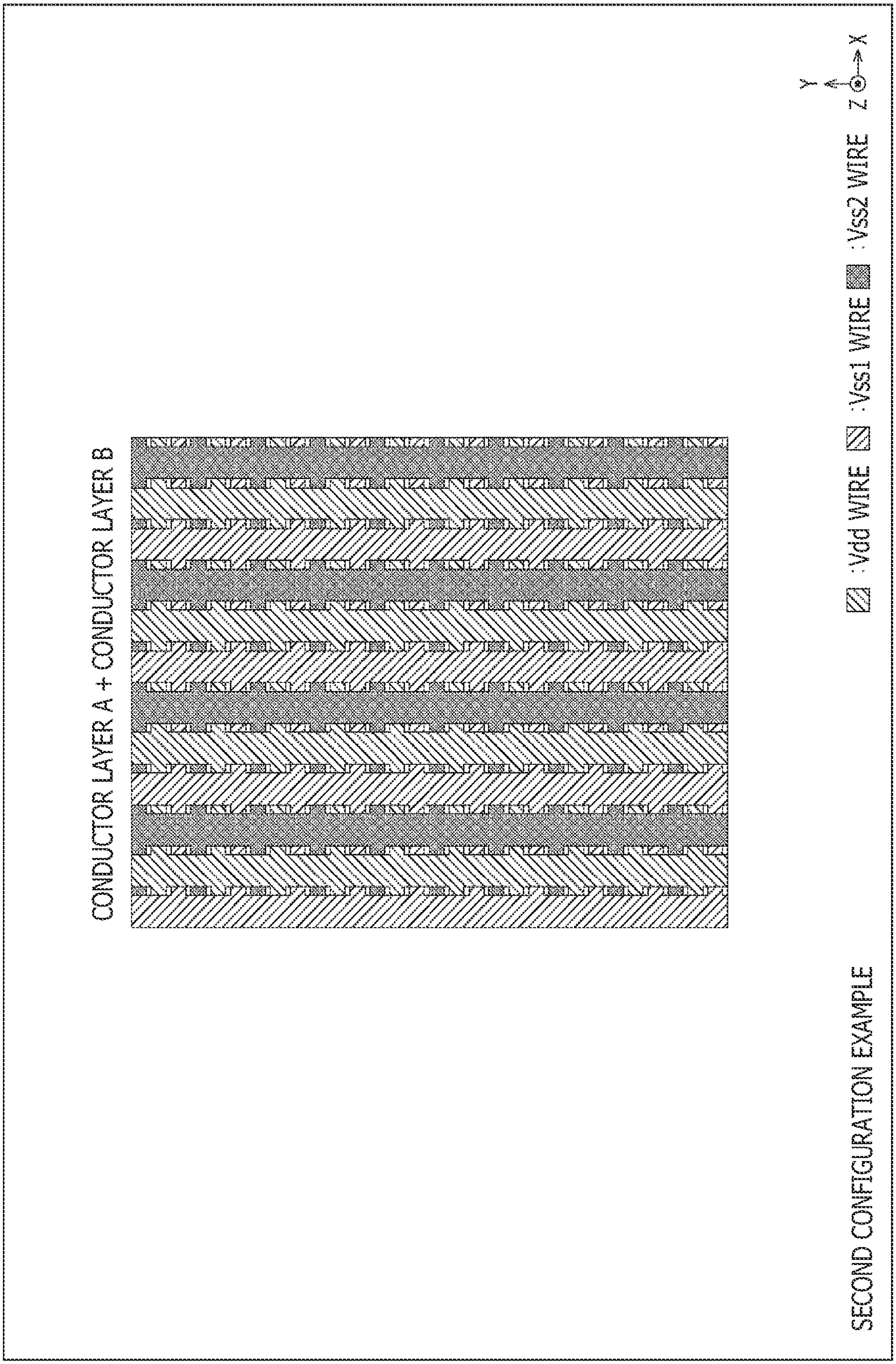

FIG. 223 is a plan view of the second configuration example of three power supplies.

Figure 224B:
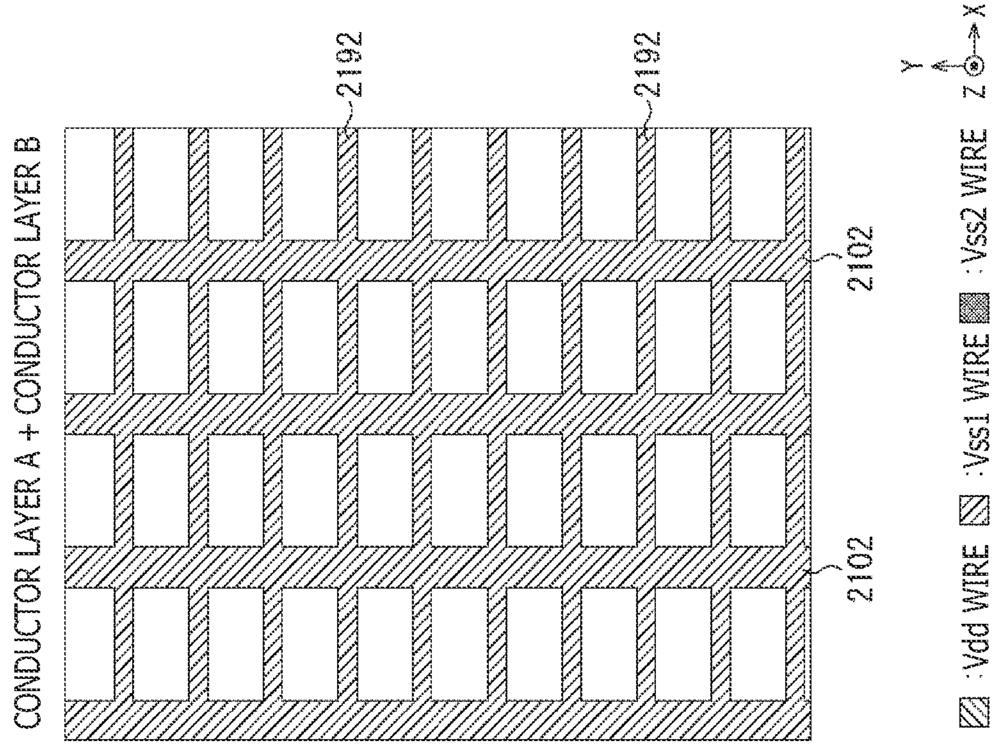
Figure 224A:
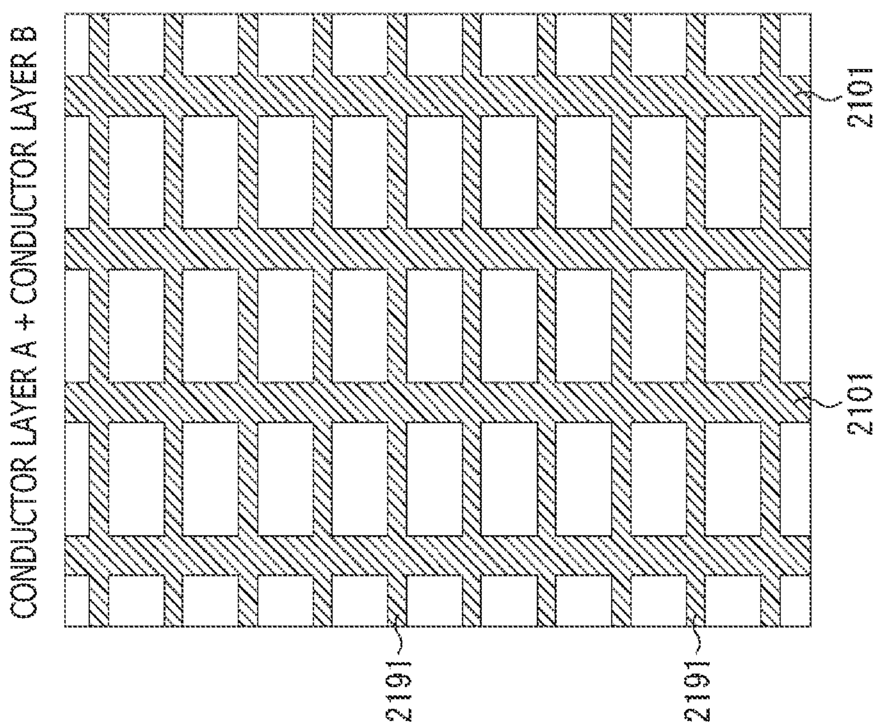

FIGS. 224A and 224B are plan views of the second configuration example of three power supplies.

Figure 225:
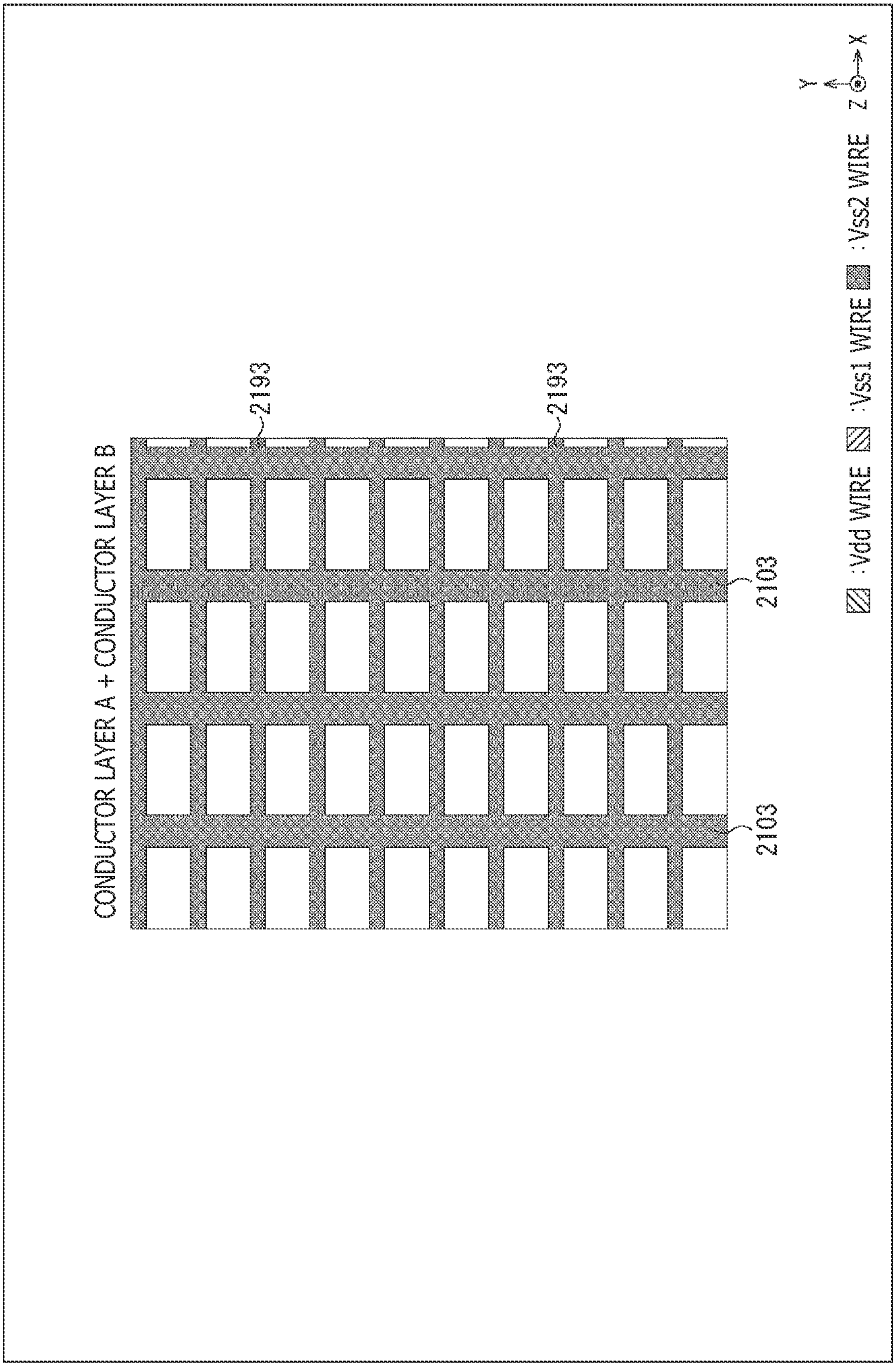

FIG. 225 is a plan view of the second configuration example of three power supplies.

Figure 226B:
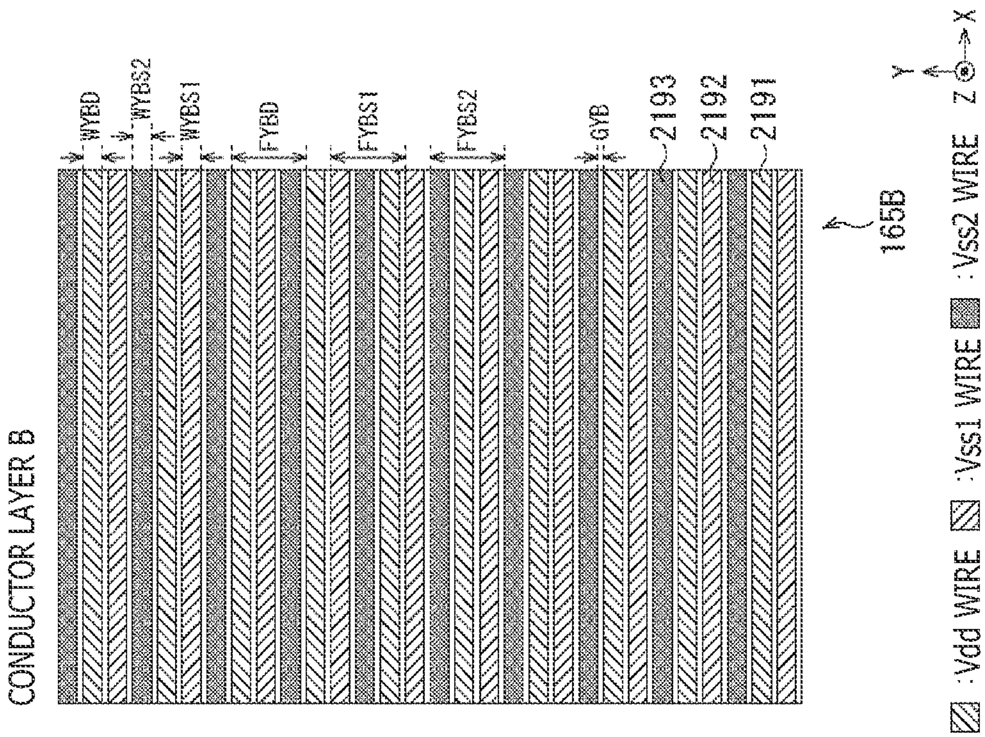
Figure 226A:
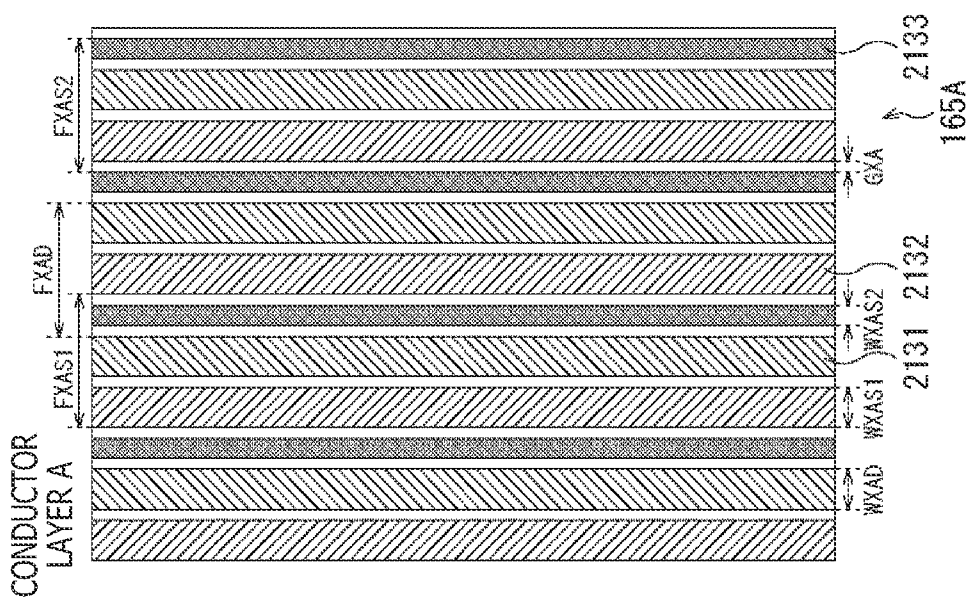

FIGS. 226A and 226B are plan views of a first modification example of the second configuration example of three power supplies.

Figure 227A:
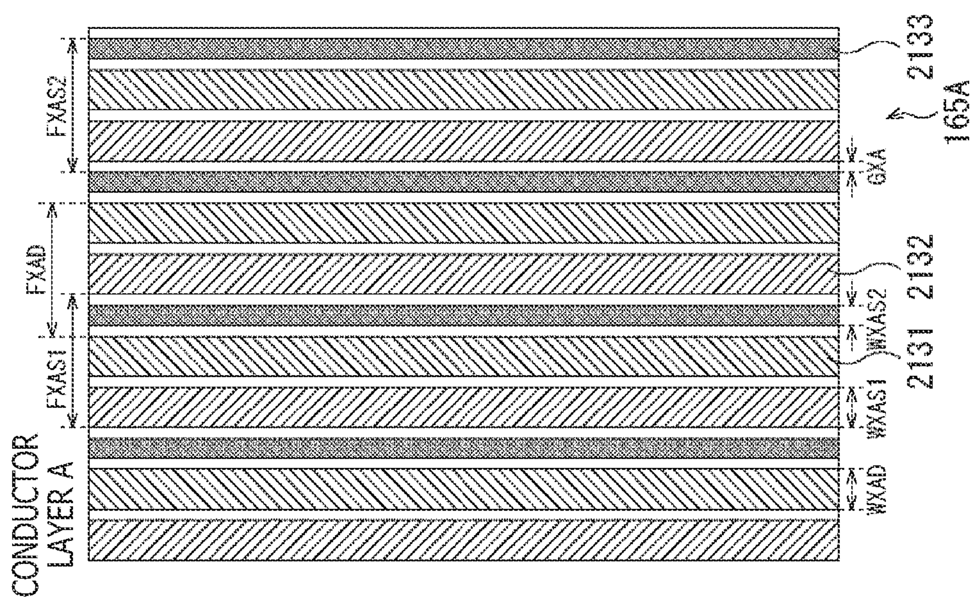
Figure 227B:
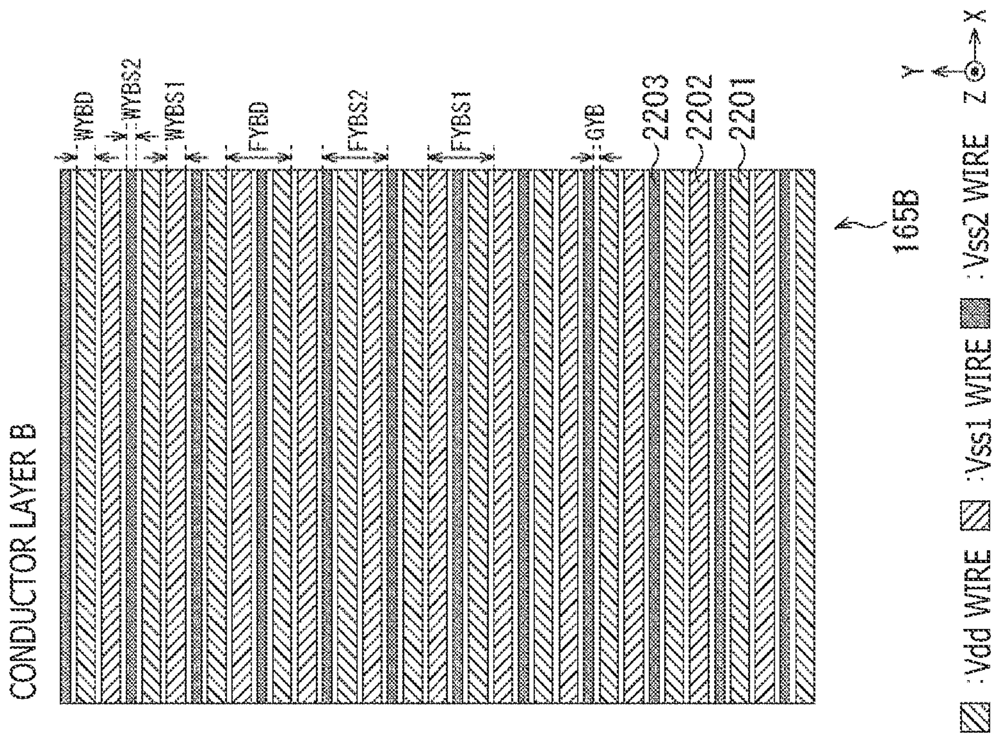

FIGS. 227A and 227B is are plan views of a second modification example of the second configuration example of three power supplies.

Figure 228B:
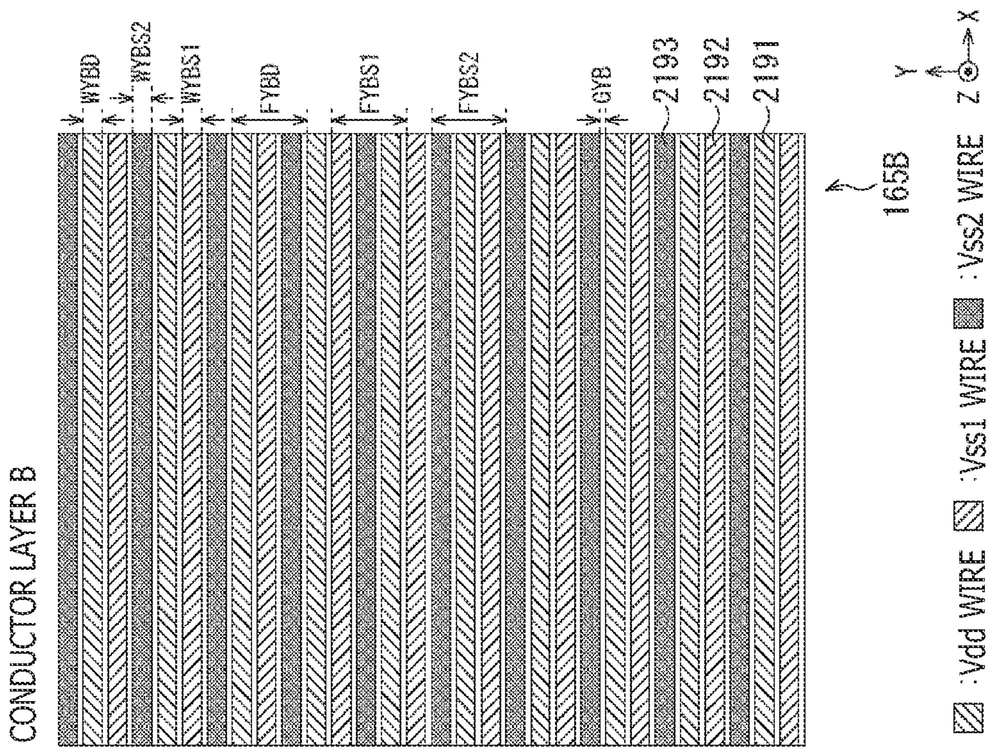
Figure 228A:
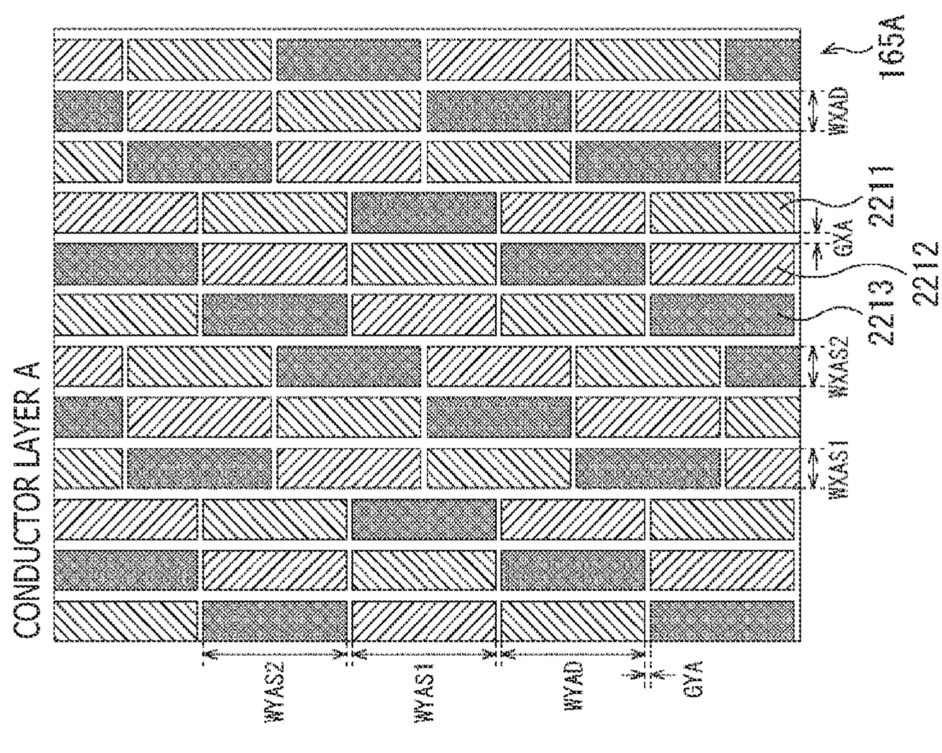

FIGS. 228A and 228B are plan views of a third configuration example of three power supplies.

Figure 229:
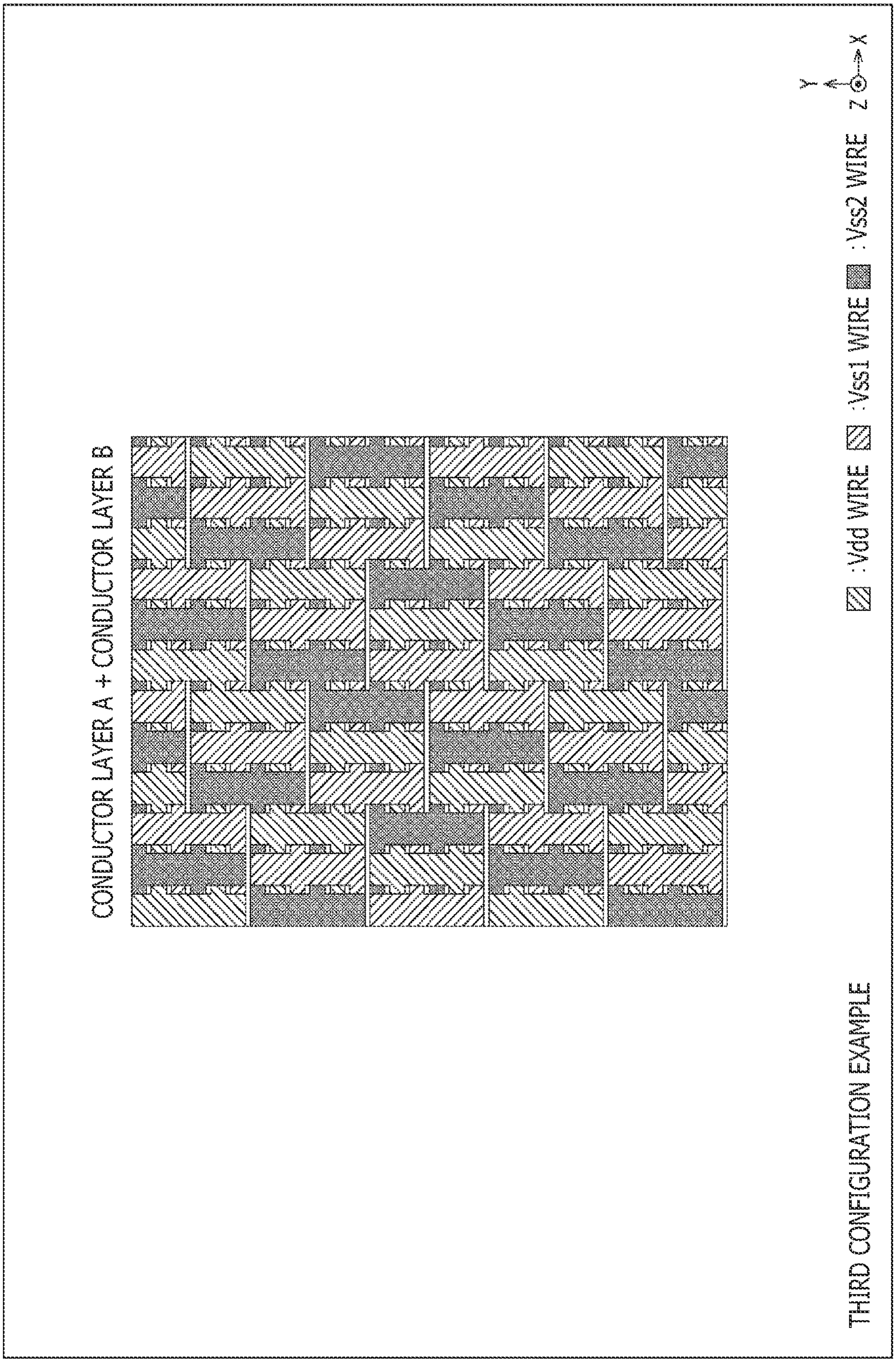

FIG. 229 is a plan view of the third configuration example of three power supplies.

Figure 230B:
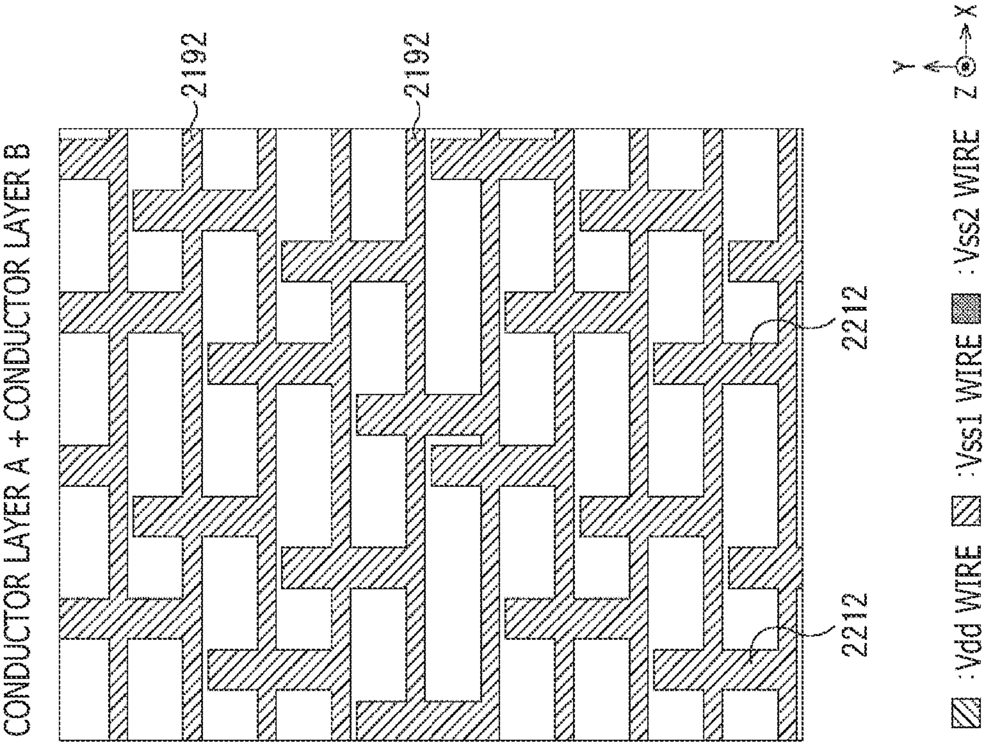
Figure 230A:
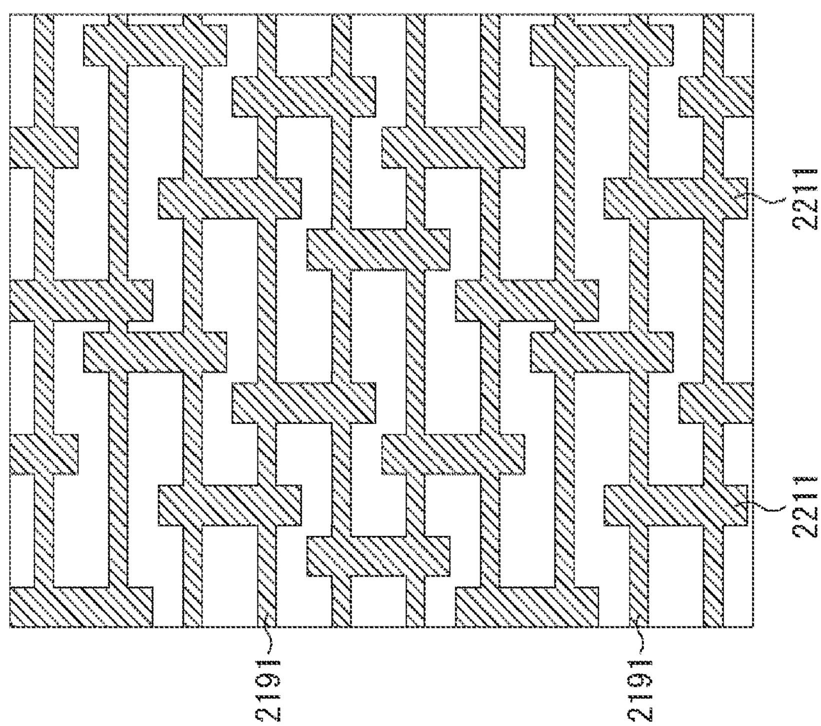

FIGS. 230A and 230B are plan views of the third configuration example of three power supplies.

Figure 231:
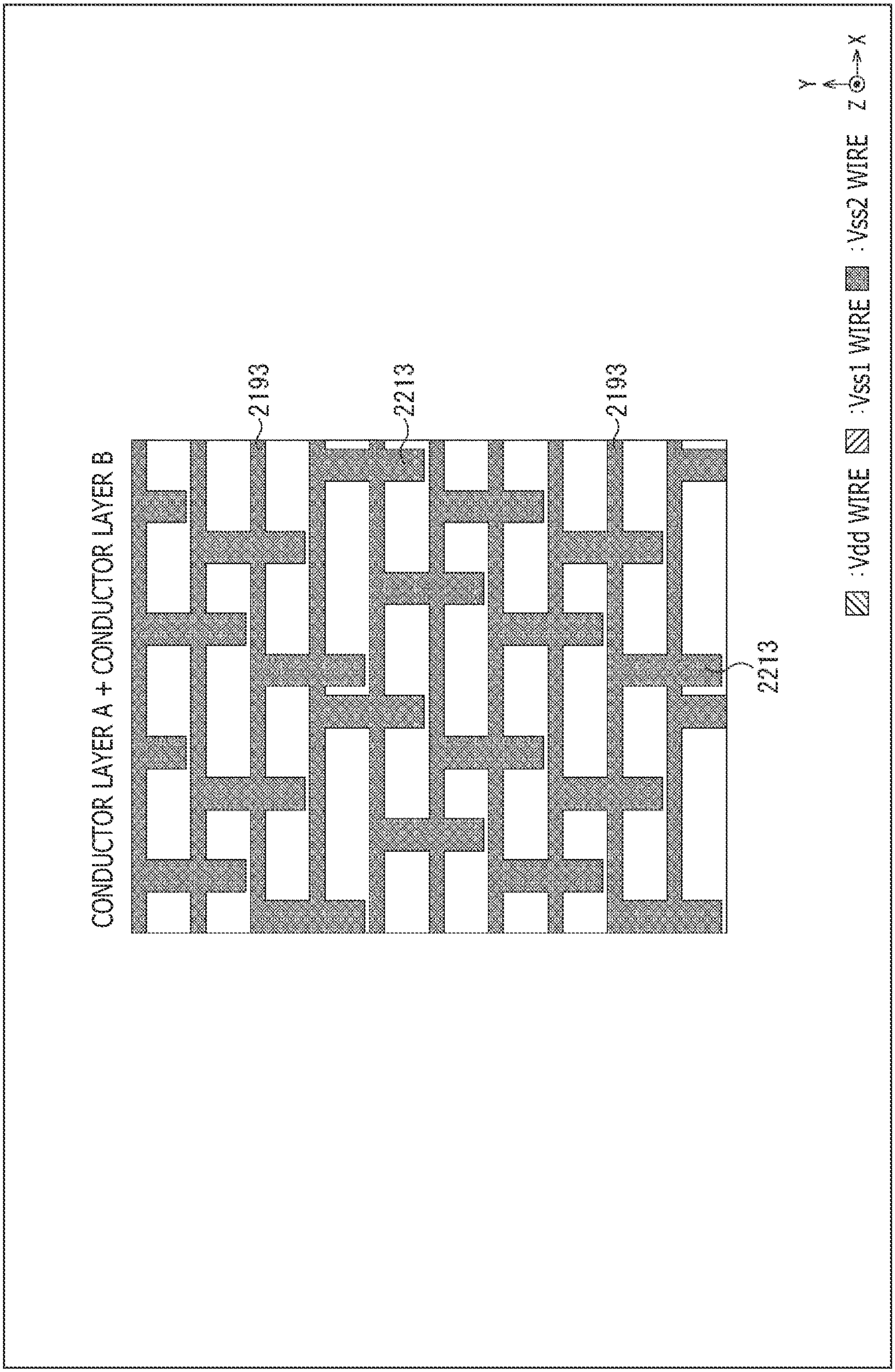

FIG. 231 is a plan view of the third configuration example of three power supplies.

Figure 232A:
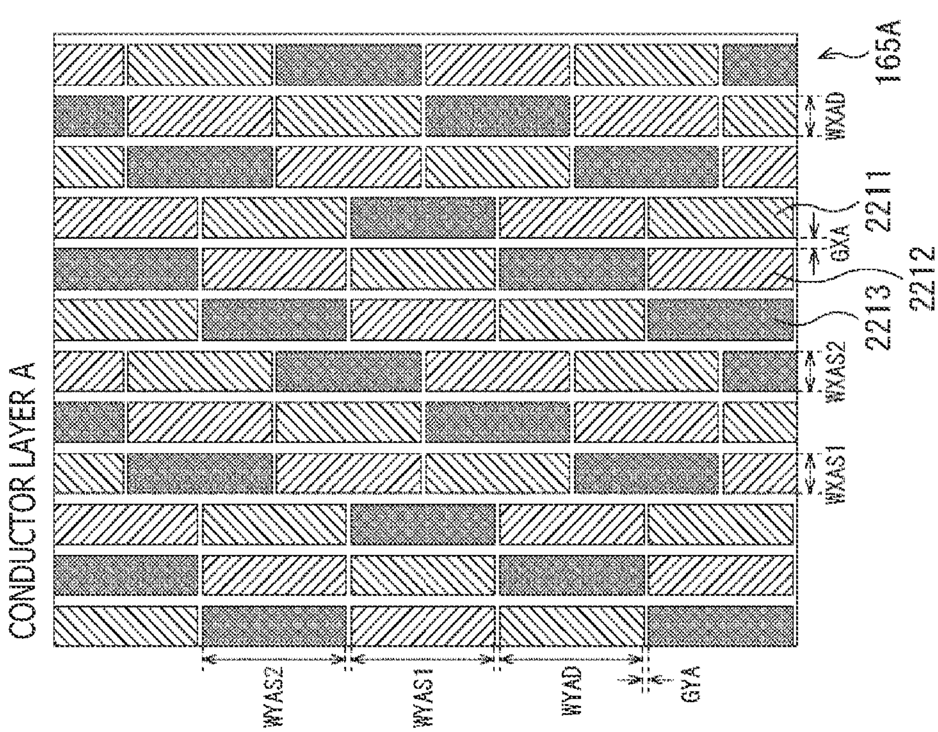
Figure 232B:
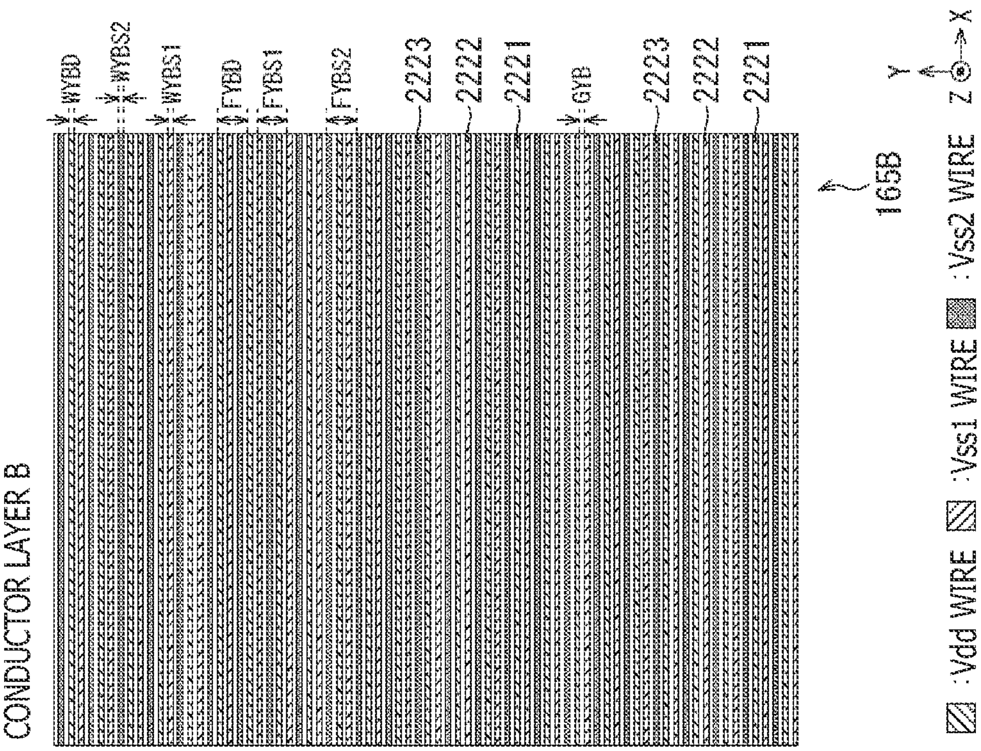

FIGS. 232A and 232B are plan views of a first modification example of the third configuration example of three power supplies.

Figure 233:
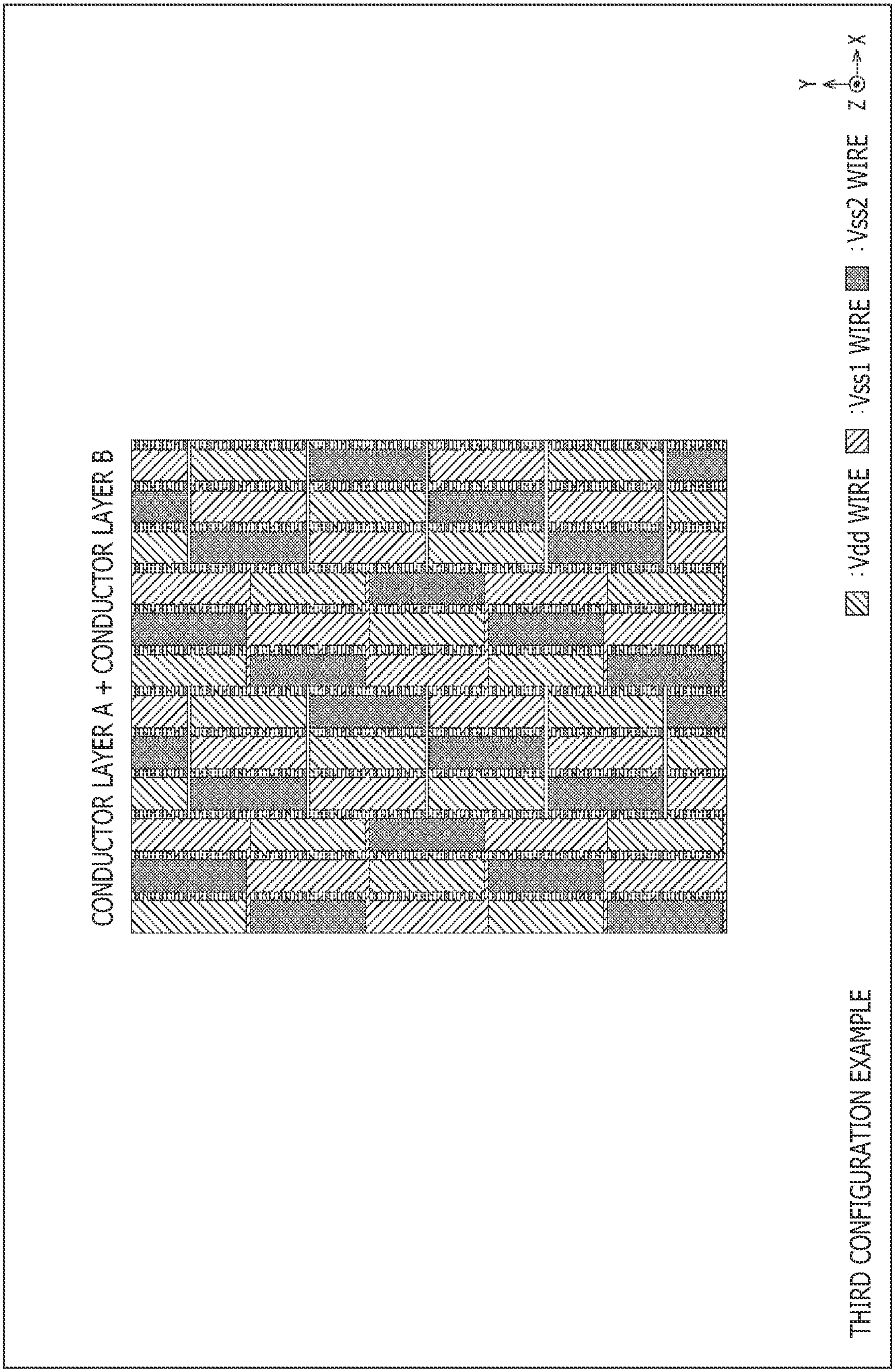

FIG. 233 is a plan view of the first modification example of the third configuration example of three power supplies.

Figure 234A:
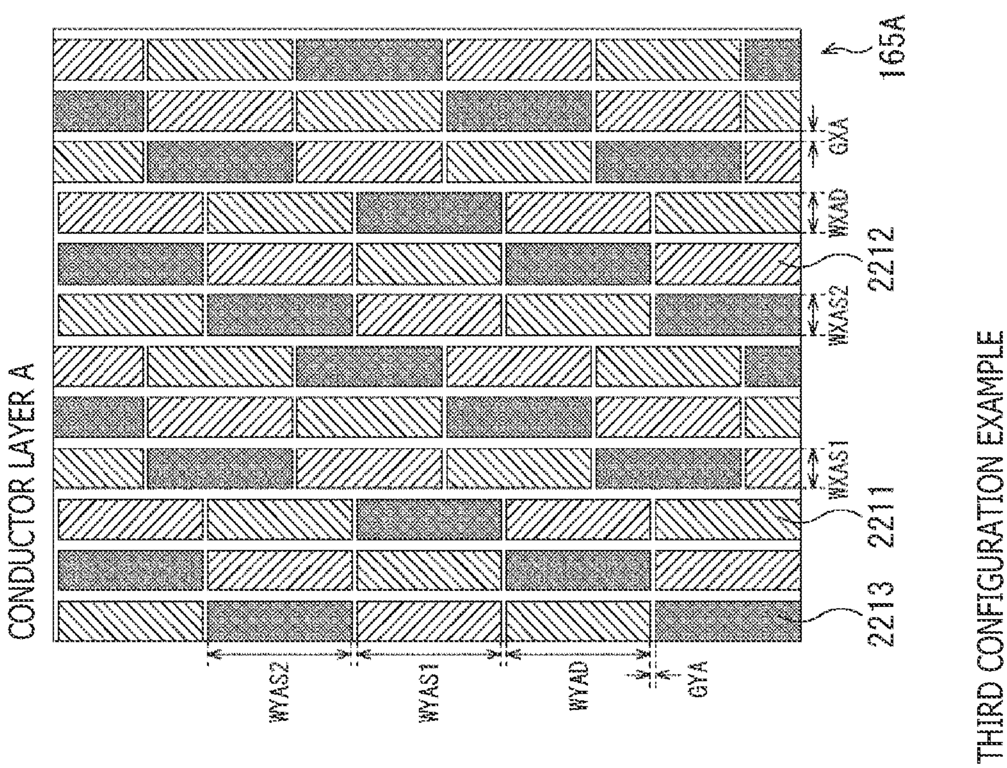
Figure 234B:
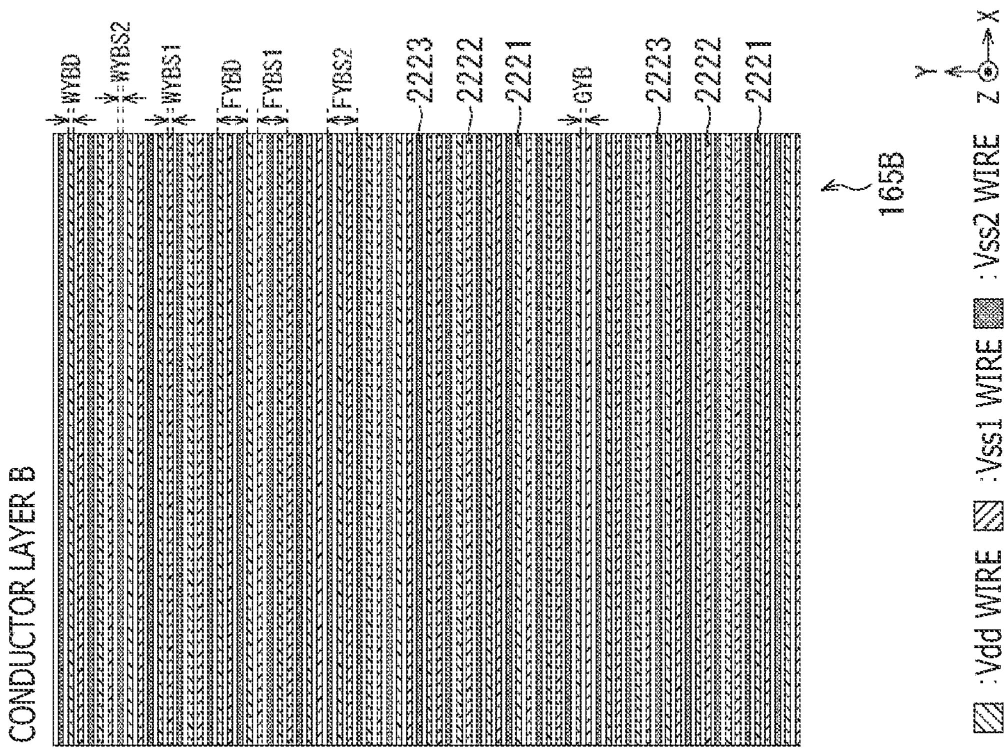

FIGS. 234A and 234B are plan views of a second modification example of the third configuration example of three power supplies.

Figure 235B:
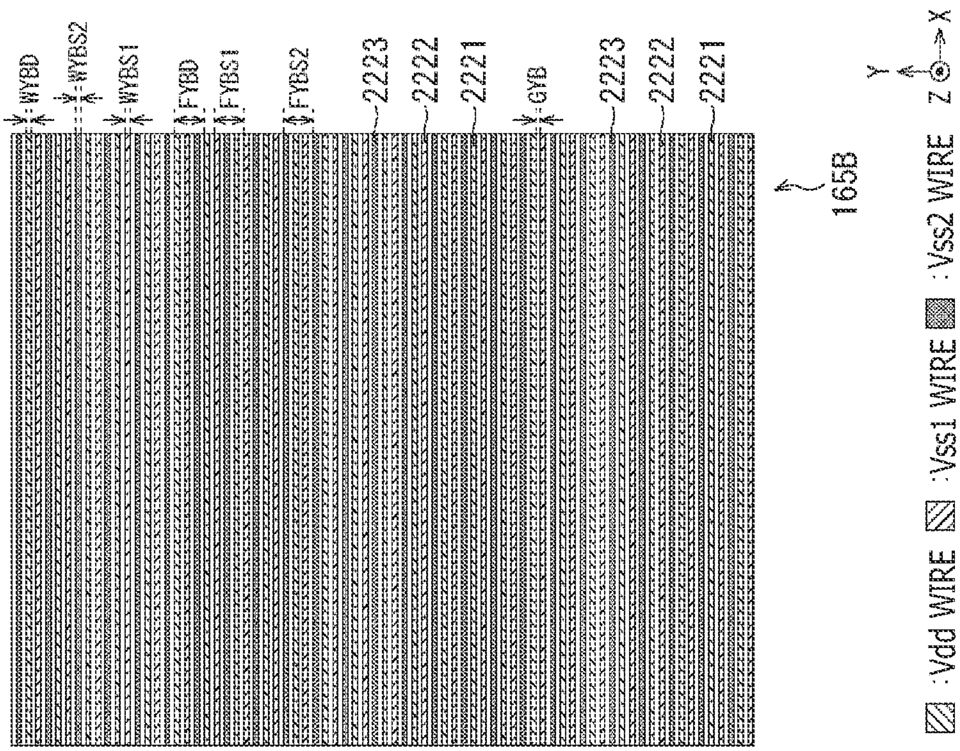
Figure 235A:
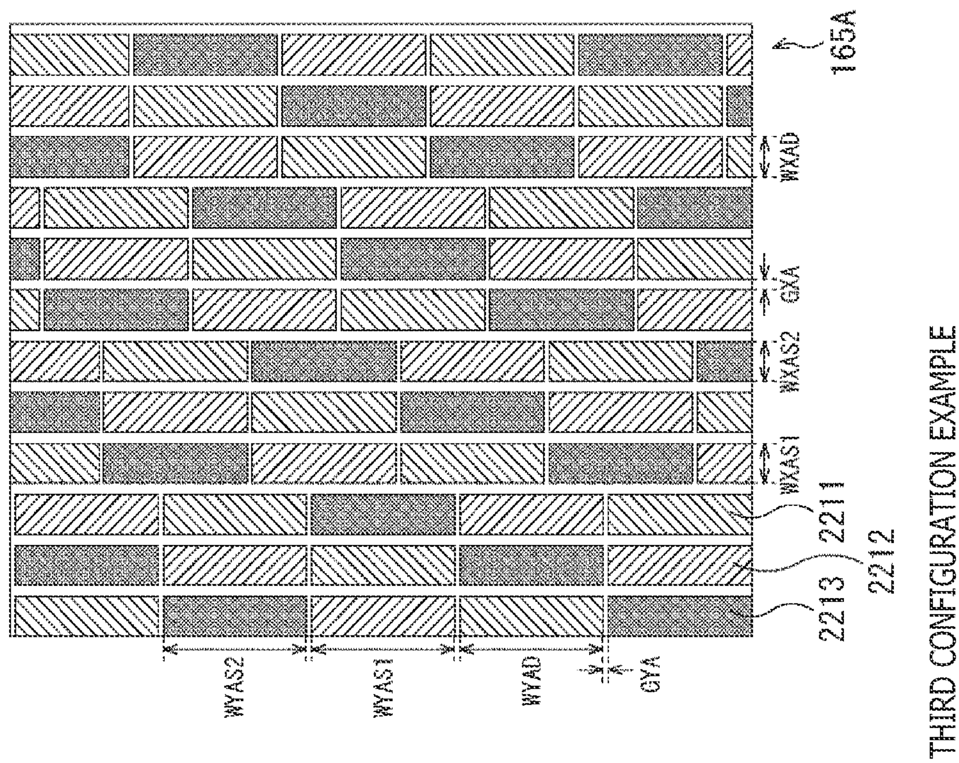

FIGS. 235A and 235B are plan views of a third modification example of the third configuration example of three power supplies.

Figure 236B:
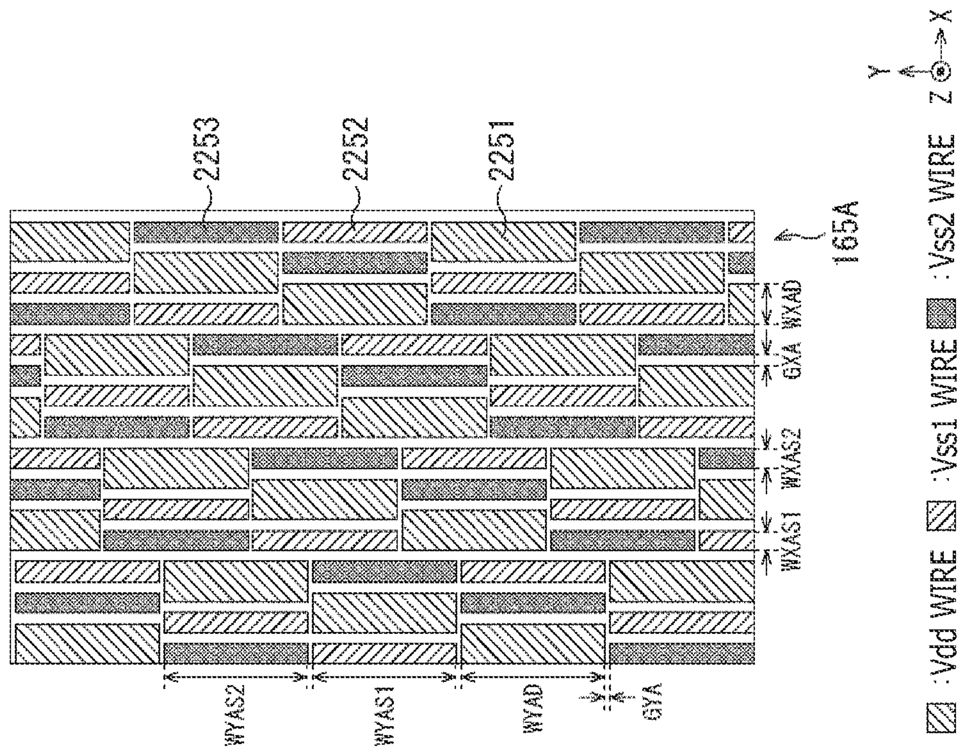
Figure 236A:
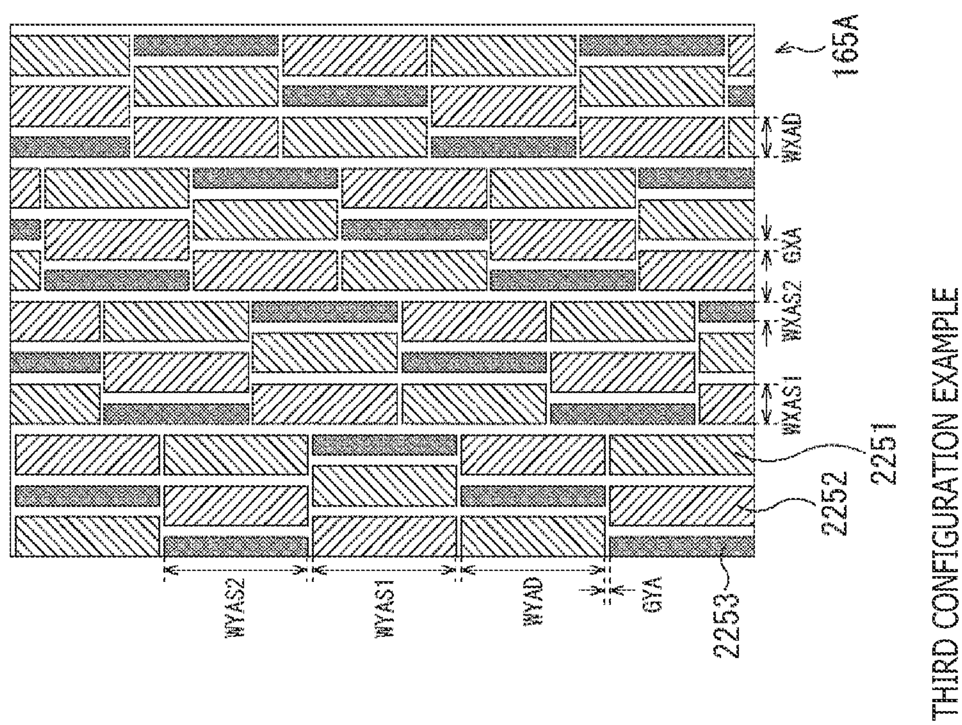

FIGS. 236A and 236B are plan views of a fourth modification example and a fifth modification example of the third configuration example of three power supplies.

Figure 237A:
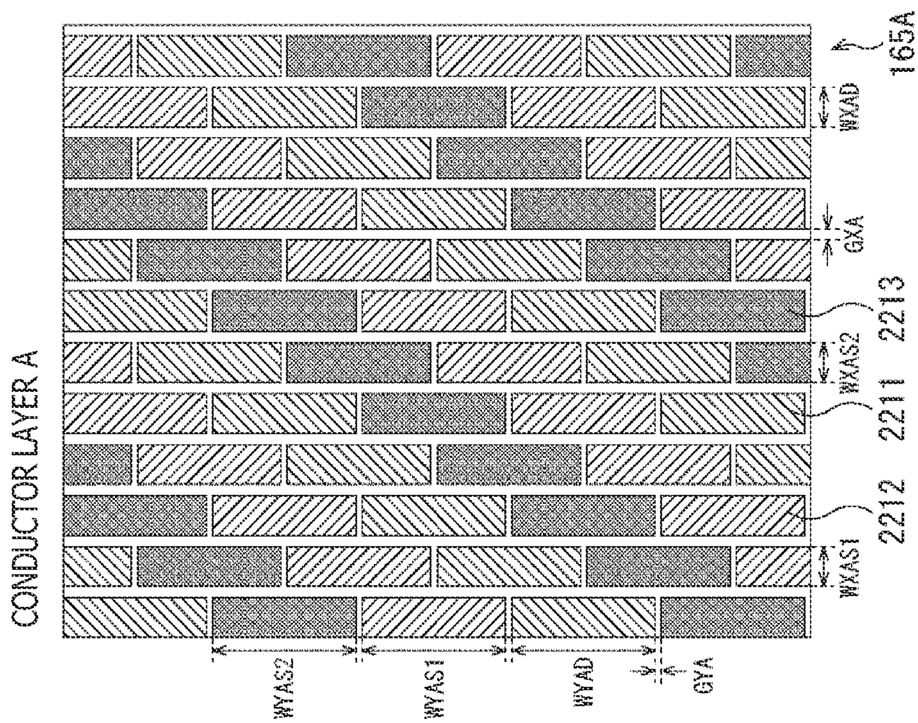
Figure 237B:
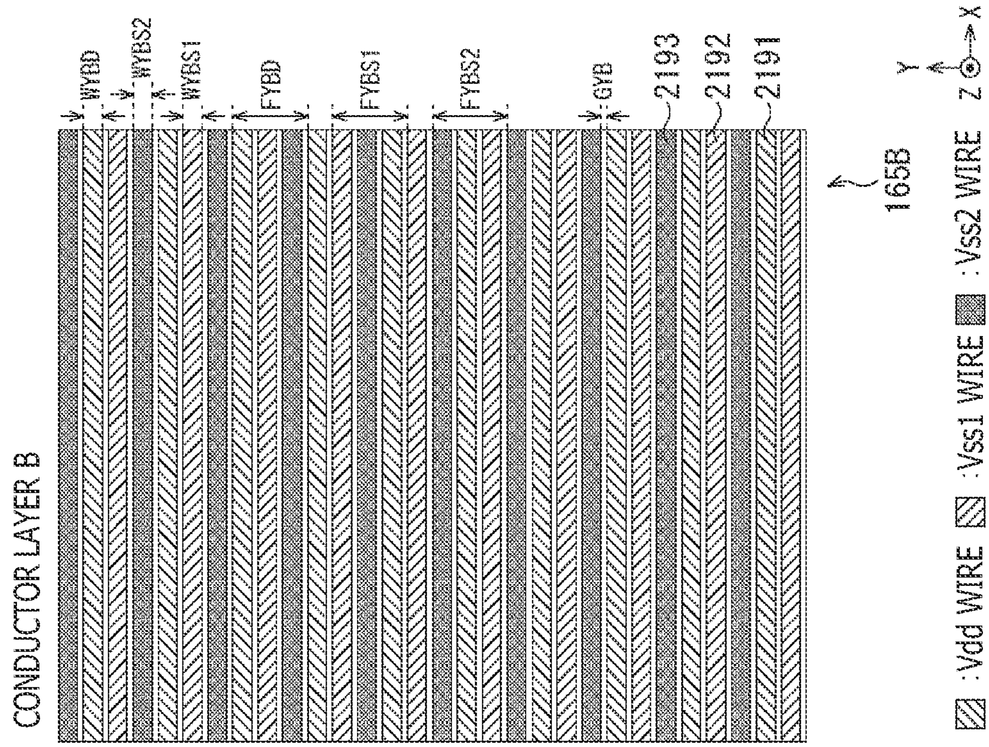

FIGS. 237A and 237B are plan views of a fourth configuration example of three power supplies.

Figure 238:
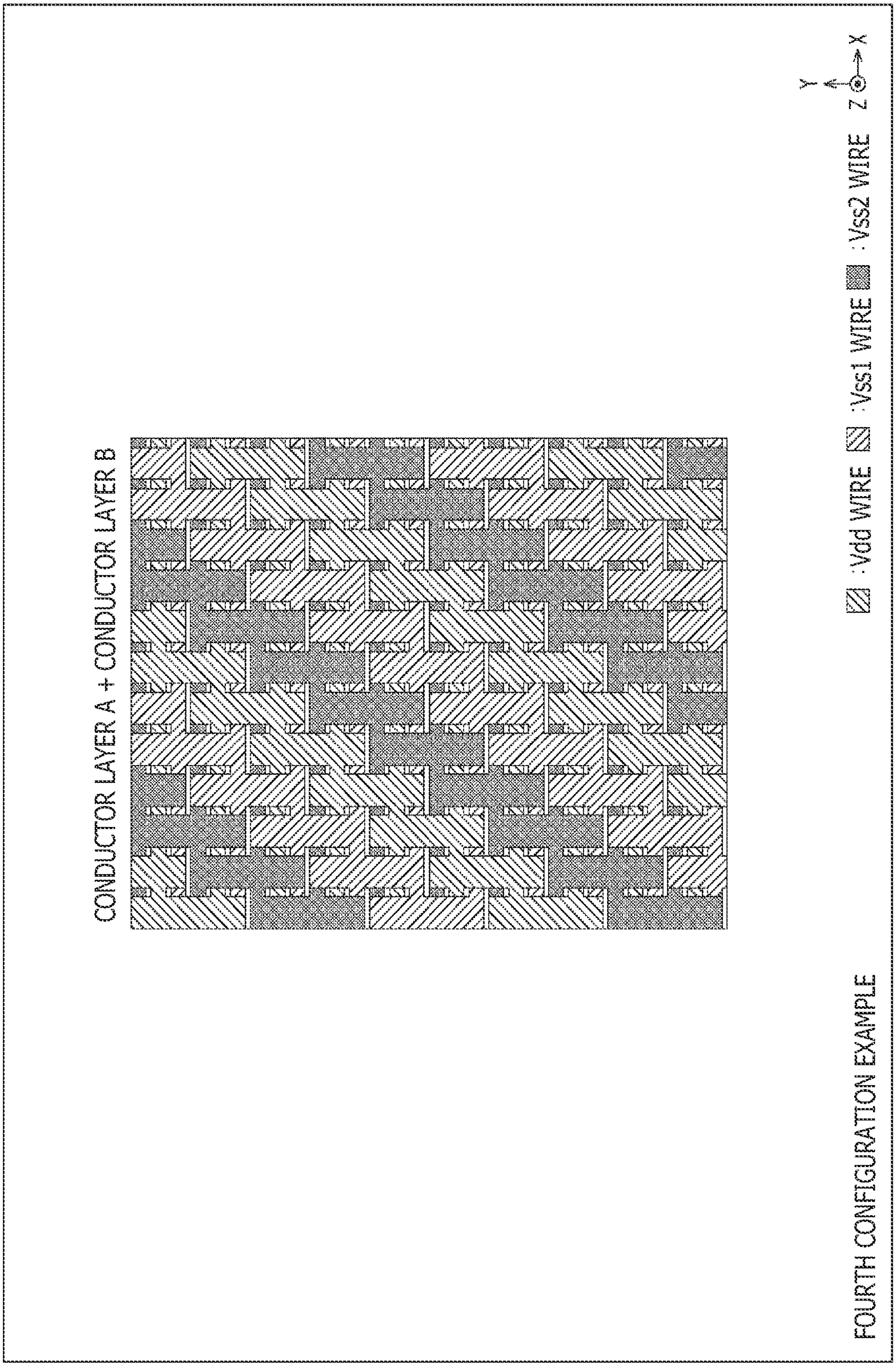

FIG. 238 is a plan view of the fourth configuration example of three power supplies.

Figure 239B:
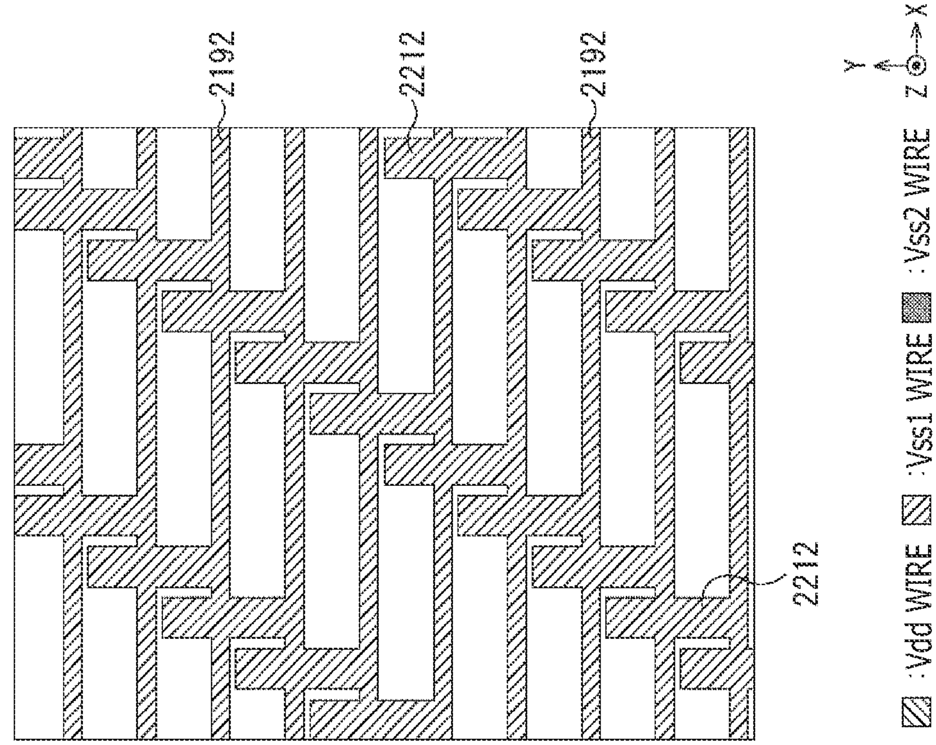
Figure 239A:
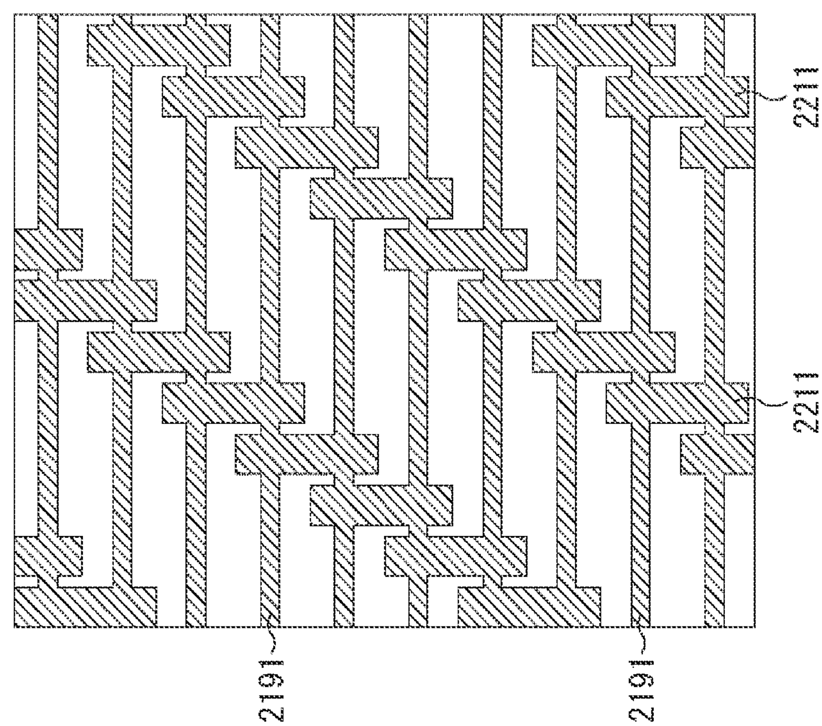

FIGS. 239A and 239B are plan views of the fourth configuration example of three power supplies.

Figure 240:
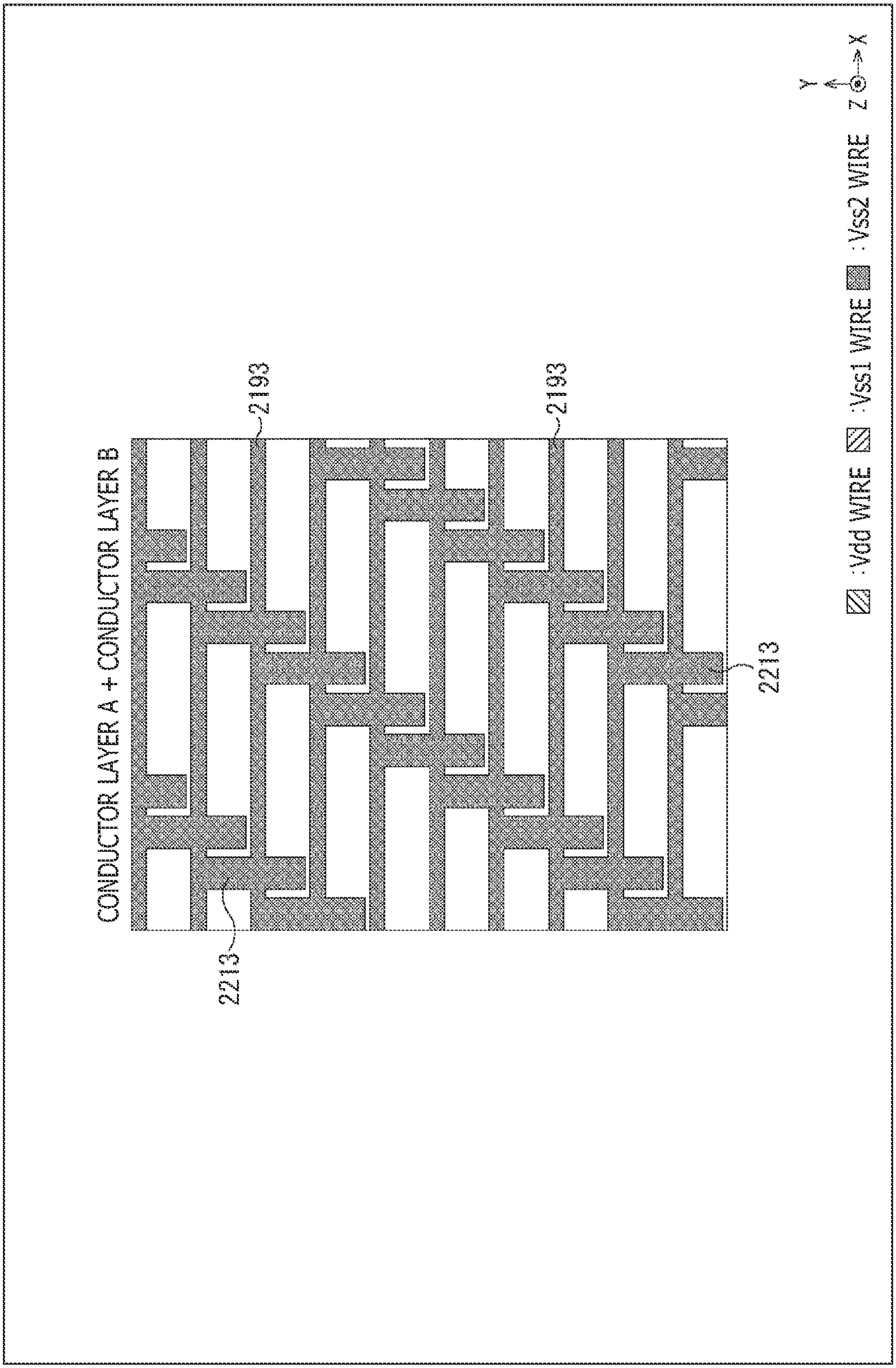

FIG. 240 is a plan view of the fourth configuration example of three power supplies.

Figure 241B:
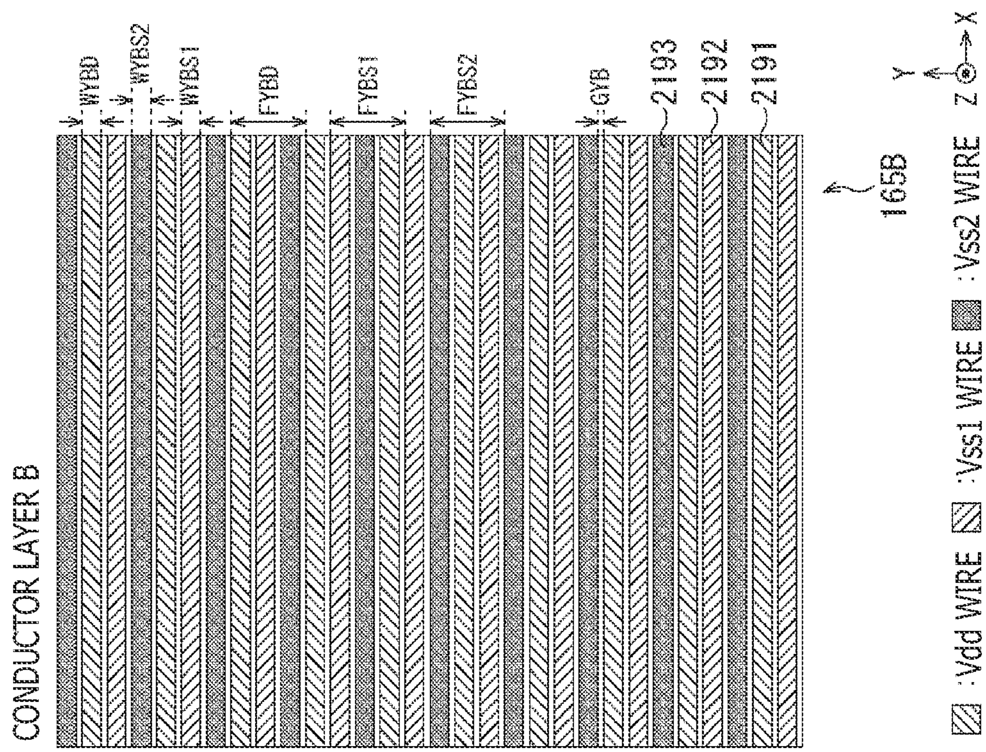
Figure 241A:
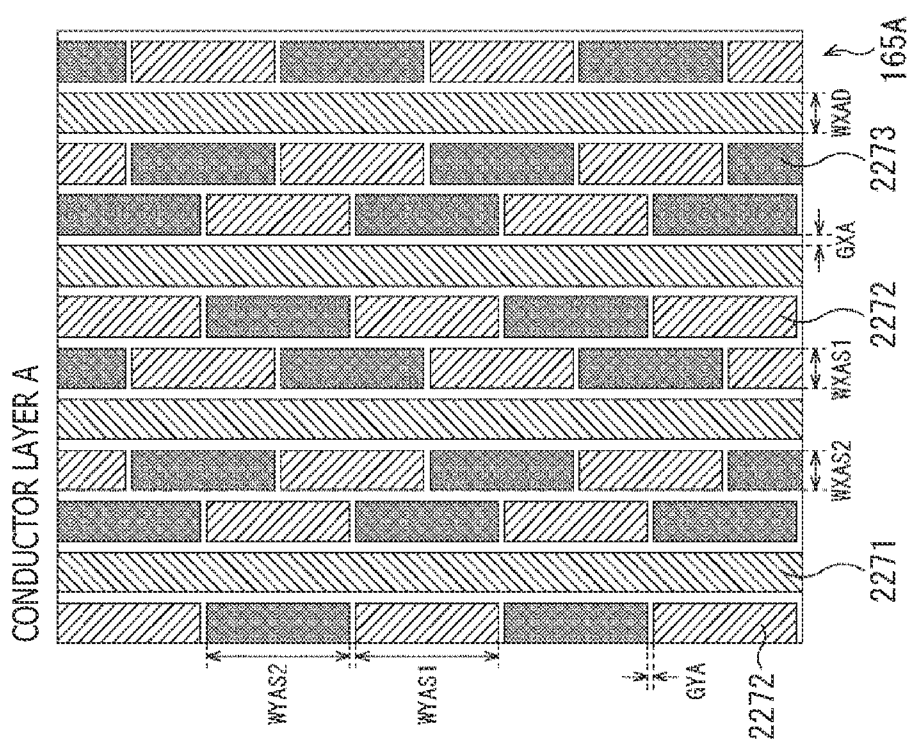

FIGS. 241A and 241B are plan views of a fifth configuration example of three power supplies.

Figure 242:
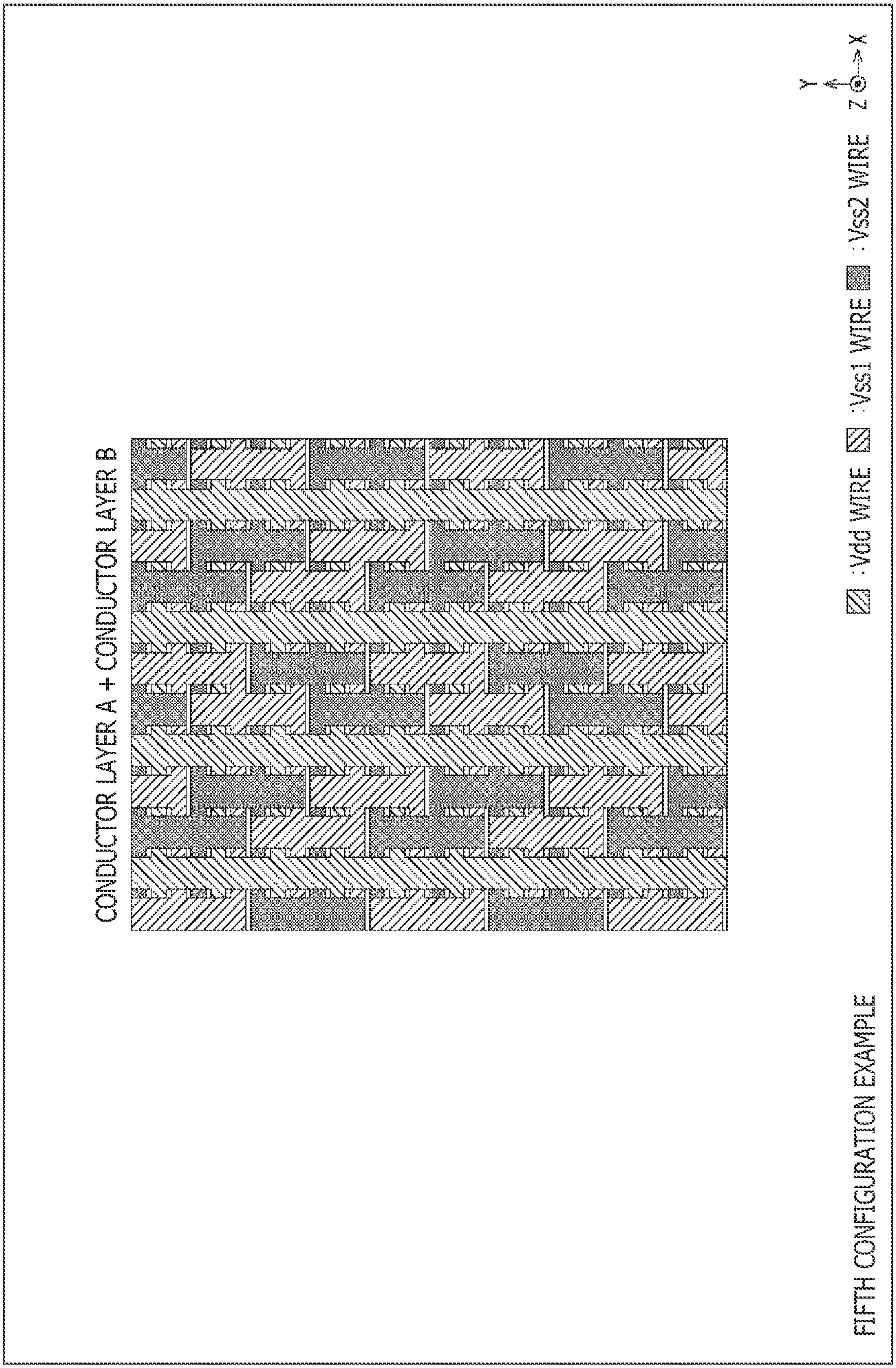

FIG. 242 is a plan view of the fifth configuration example of three power supplies.

Figure 243A:
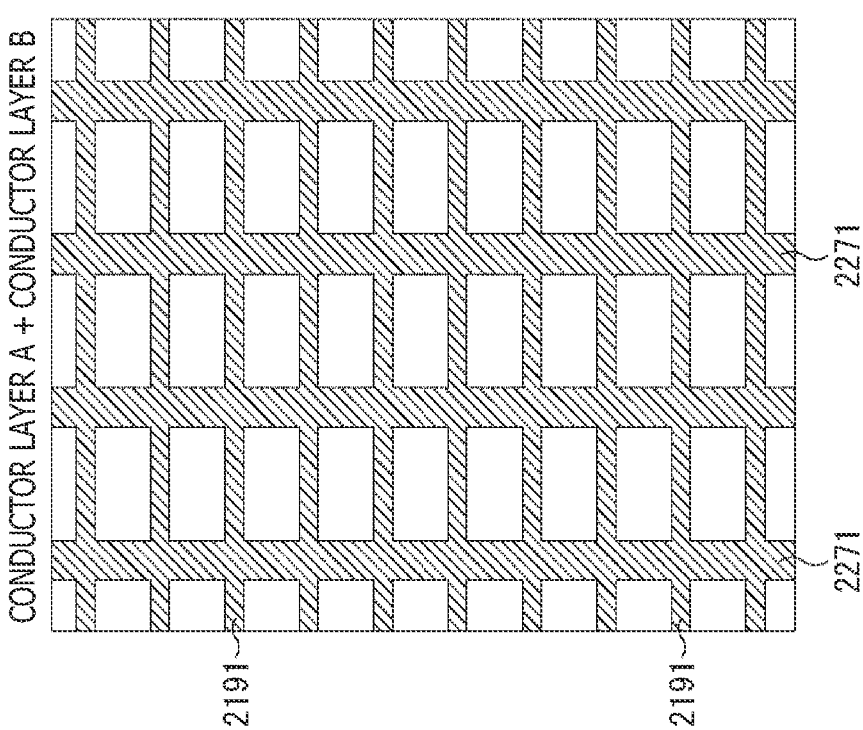
Figure 243B:
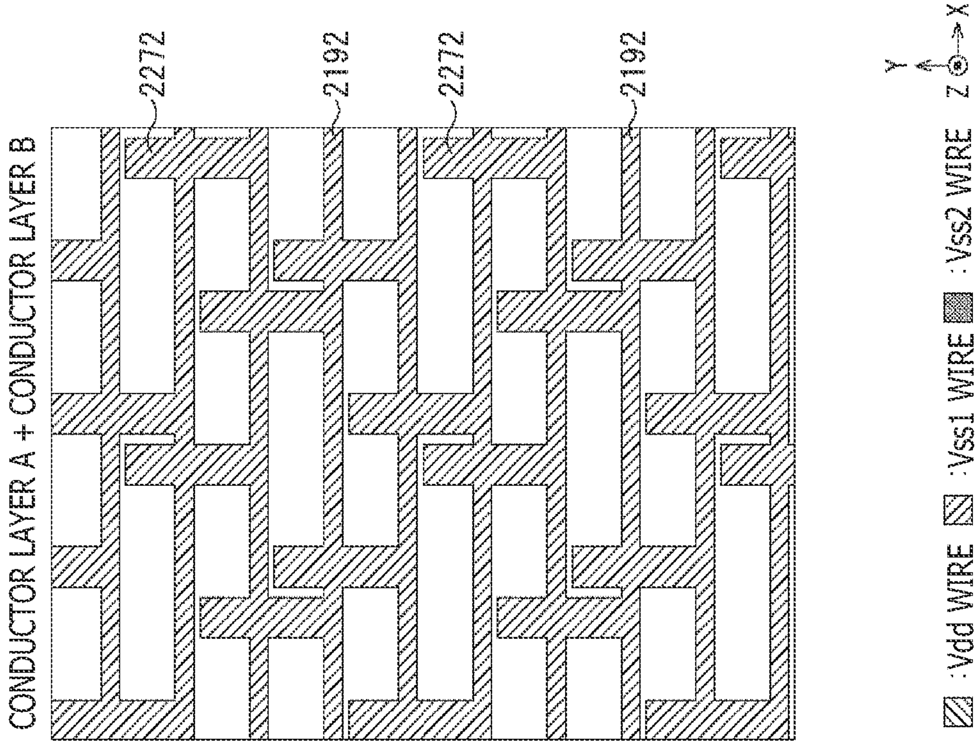

FIGS. 243A and 243B are plan views of the fifth configuration example of three power supplies.

Figure 244:
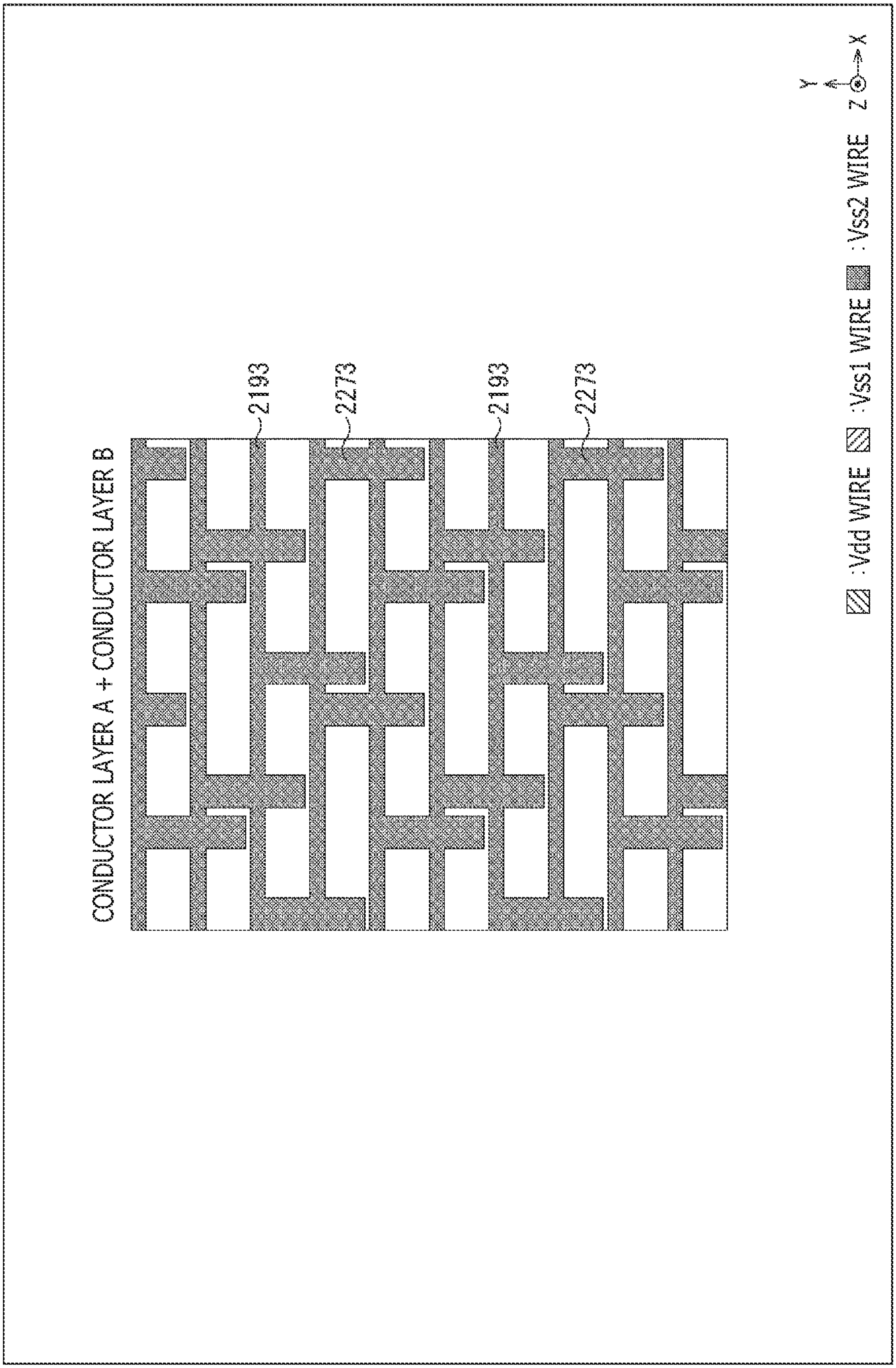

FIG. 244 is a plan view of the fifth configuration example of three power supplies.

Figure 245B:
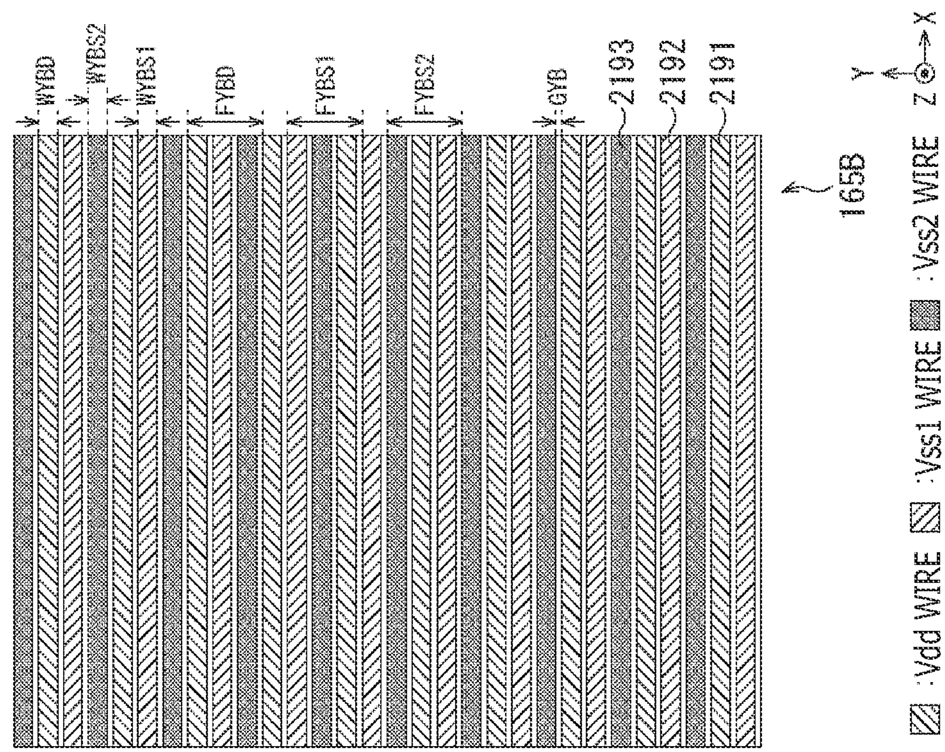
Figure 245A:
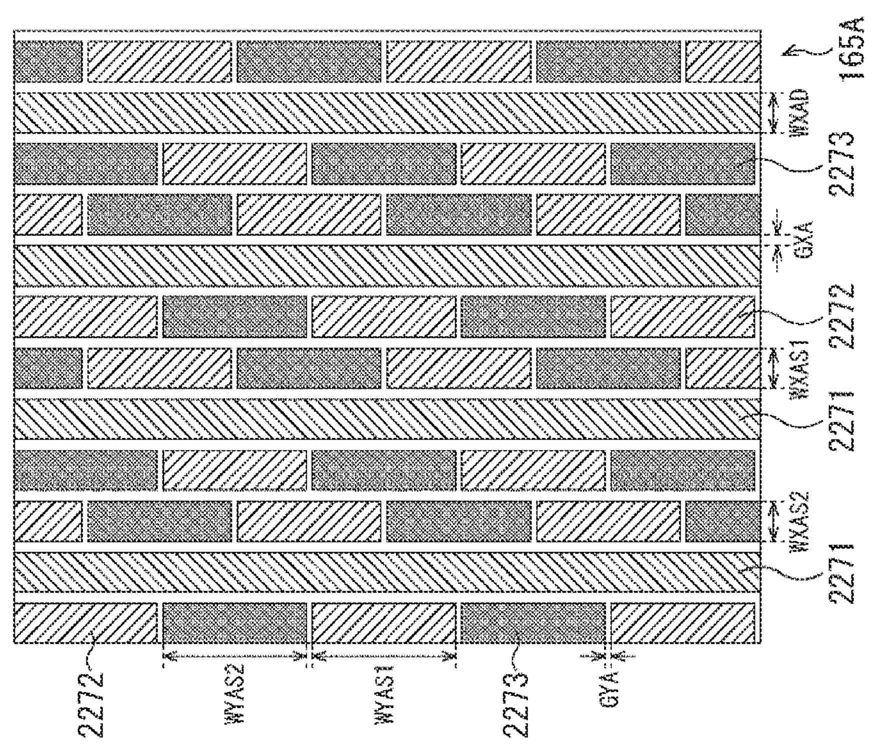

FIGS. 245A and 245B are plan views of a first modification example of the fifth configuration example of three power supplies.

Figure 246:
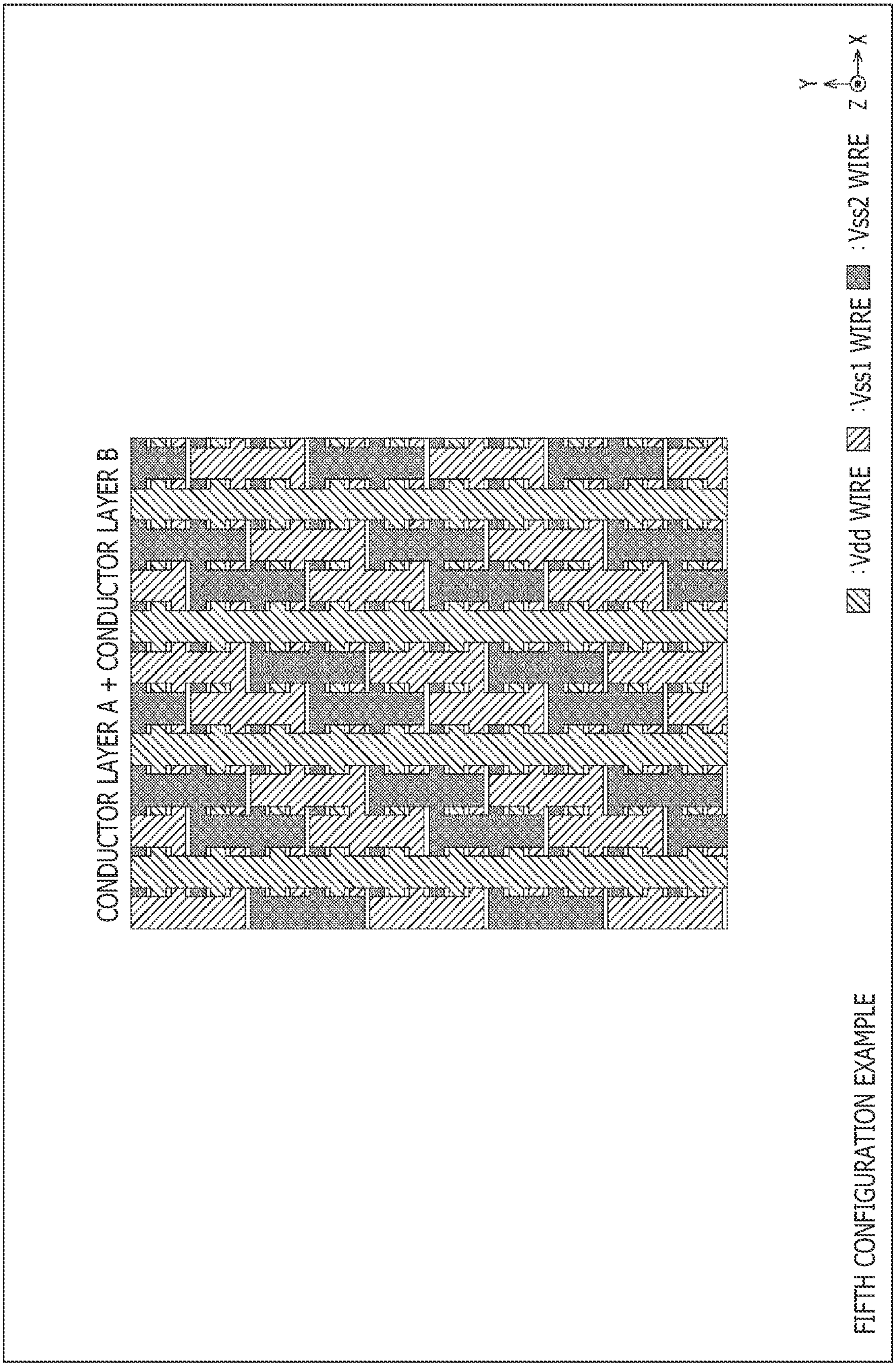

FIG. 246 is a plan view of the first modification example of the fifth configuration example of three power supplies.

Figure 247B:
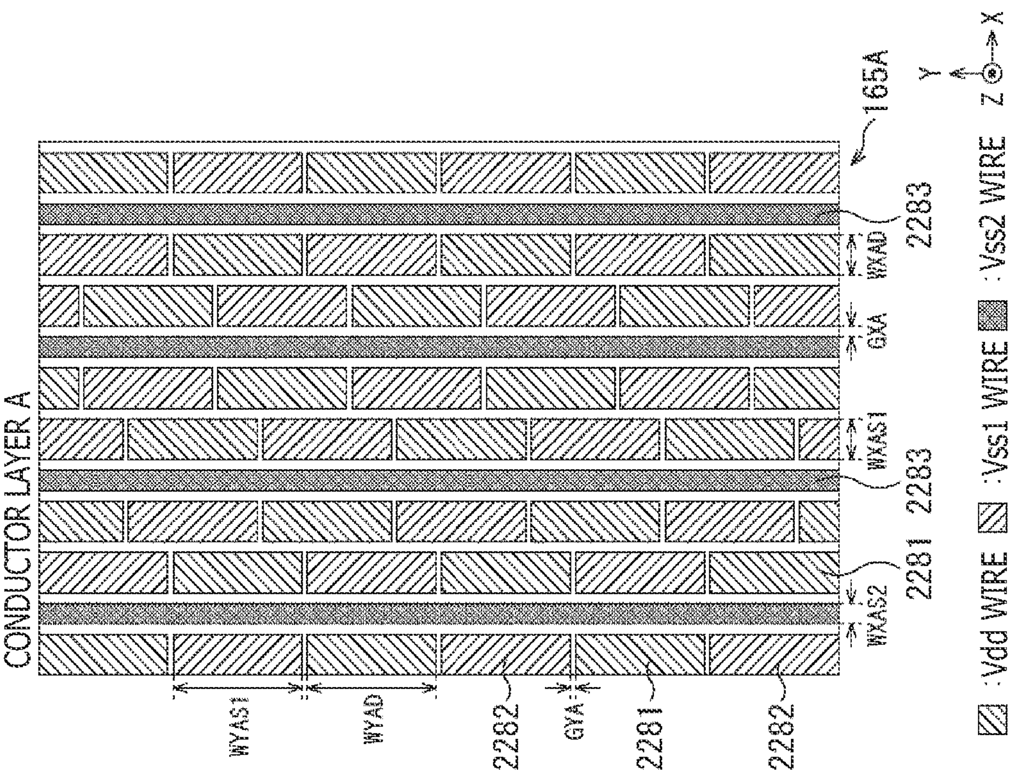
Figure 247A:
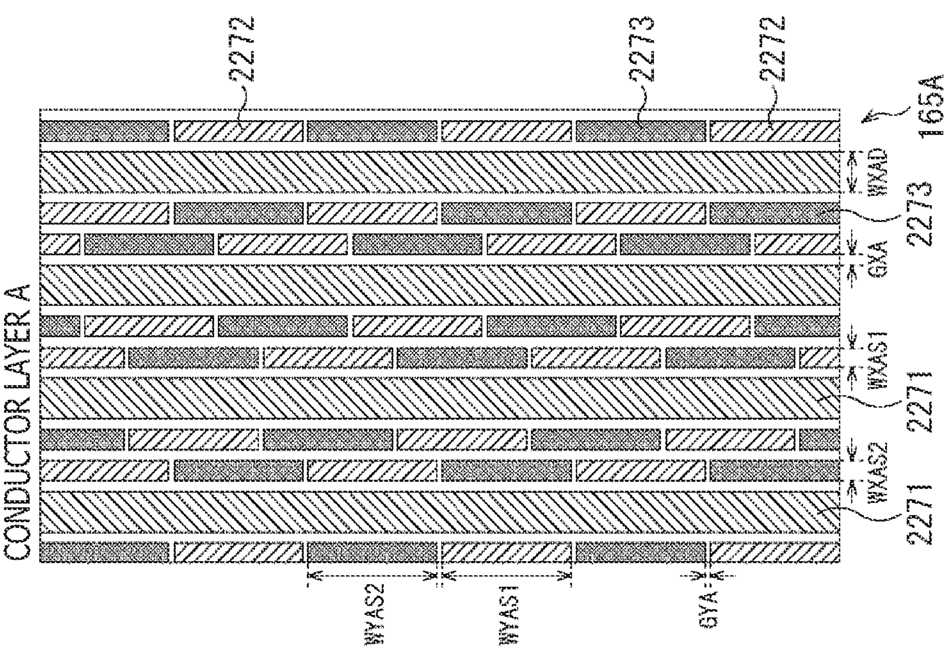

FIGS. 247A and 247B are plan views of a second modification example and a third modification example of the fifth configuration example of three power supplies.

FIGS. 248A, 248B, 248C, 248D, 248E, and 248F is are plan views of a sixth configuration example of three power supplies.

FIGS. 249A, 249B, 249C, 249D, 249E, and 249F are plan views of a first modification example of the sixth configuration example of three power supplies.

FIGS. 250A, 250B, 250C, 250D, 250E, and 250F are plan views of a second modification example of the sixth configuration example of three power supplies.

FIGS. 251A, 251B, 251C, 251D, 251E, and 251F is are plan views of a third modification example of the sixth configuration example of three power supplies.

FIGS. 252A, 252B, 252C, 252D, 252E, and 252F is are plan views of a fourth modification example of the sixth configuration example of three power supplies.

FIGS. 253A, 253B, 253C, 253D, 253E, and 253F are plan views of a fifth modification example of the sixth configuration example of three power supplies.

FIGS. 254A, 254B, 254C, 254D, 254E, and 254F are plan views of a seventh configuration example of three power supplies.

FIGS. 255A, 255B, 255C, 255D, 255E, and 255F are plan views of a modification example of the seventh configuration example of three power supplies.

FIGS. 256A, 256B, 256C, 256D, 256E, and 256F are plan views of an eighth configuration example of three power supplies.

FIGS. 257A, 257B, 257C, 257D, 257E, and 257F are plan views of a first modification example of the eighth configuration example of three power supplies.

FIGS. 258A, 258B, 258C, 258D, 258E, and 258F are plan views of a second modification example of the eighth configuration example of three power supplies.

FIGS. 259A, 259B, 259C, 259D, 259E, and 259F are plan views of a third modification example of the eighth configuration example of three power supplies.

FIGS. 260A, 260B, 260C, 260D, 260E, and 260F are plan views of a fourth modification example of the eighth configuration example of three power supplies.

FIGS. 261A, 261B, 261C, 261D, 261E, and 261F are plan views of a ninth configuration example of three power supplies.

Figure 262:
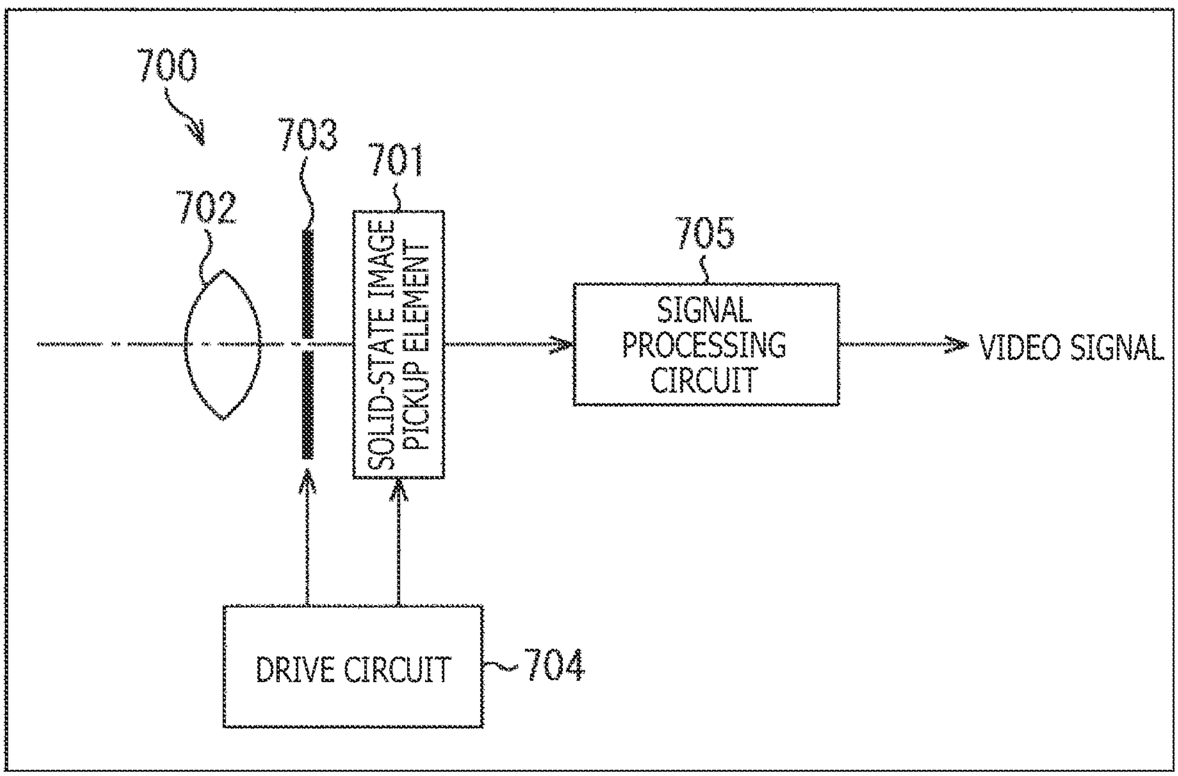

FIG. 262 is a block diagram depicting a configuration example of an image pickup apparatus.

Figure 263:
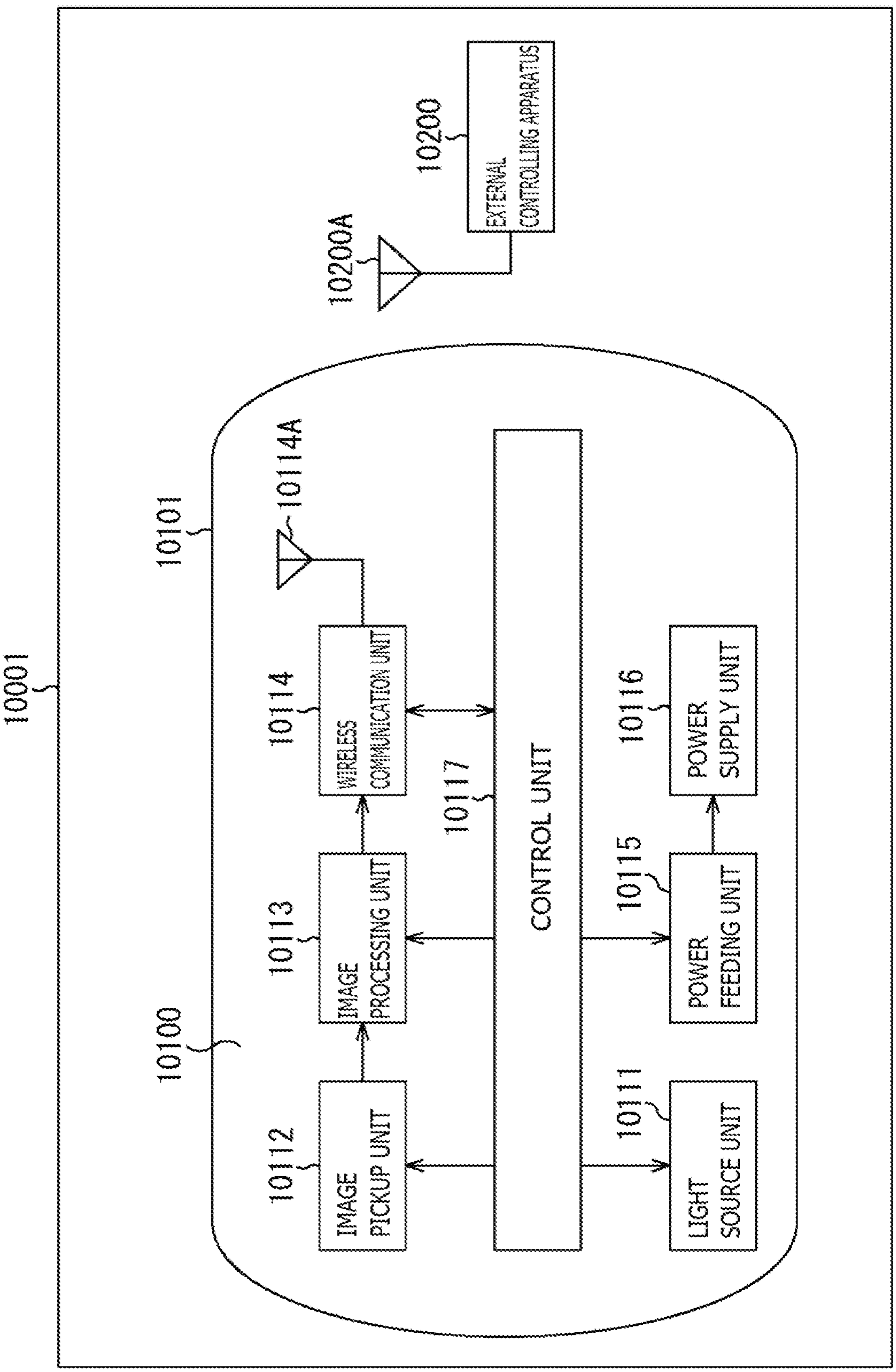

FIG. 263 is a block diagram depicting an example of a schematic configuration of an in-vivo information acquisition system.

Figure 264:
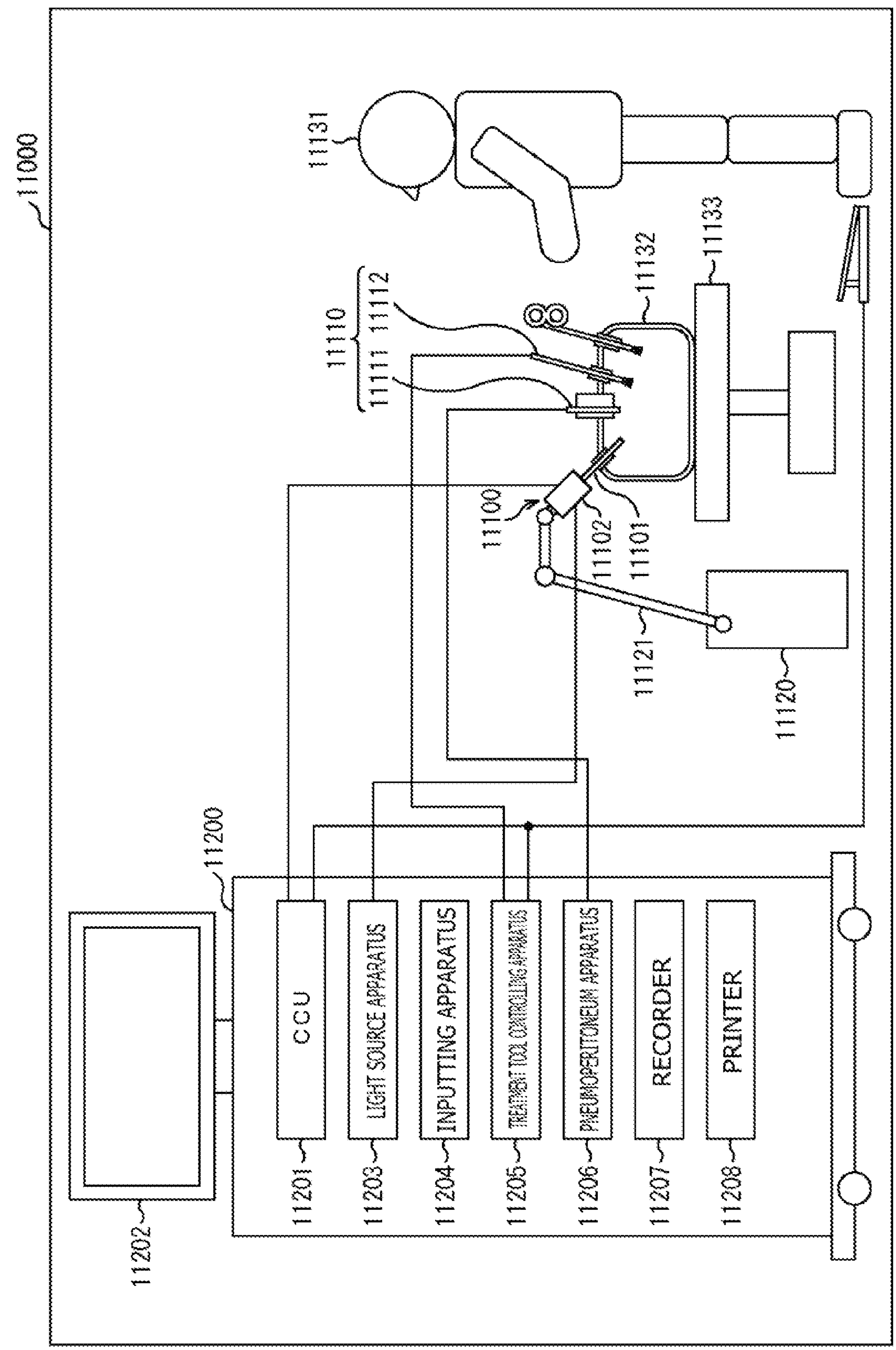

FIG. 264 is a view depicting an example of a schematic configuration of an endoscopic surgery system.

Figure 265:
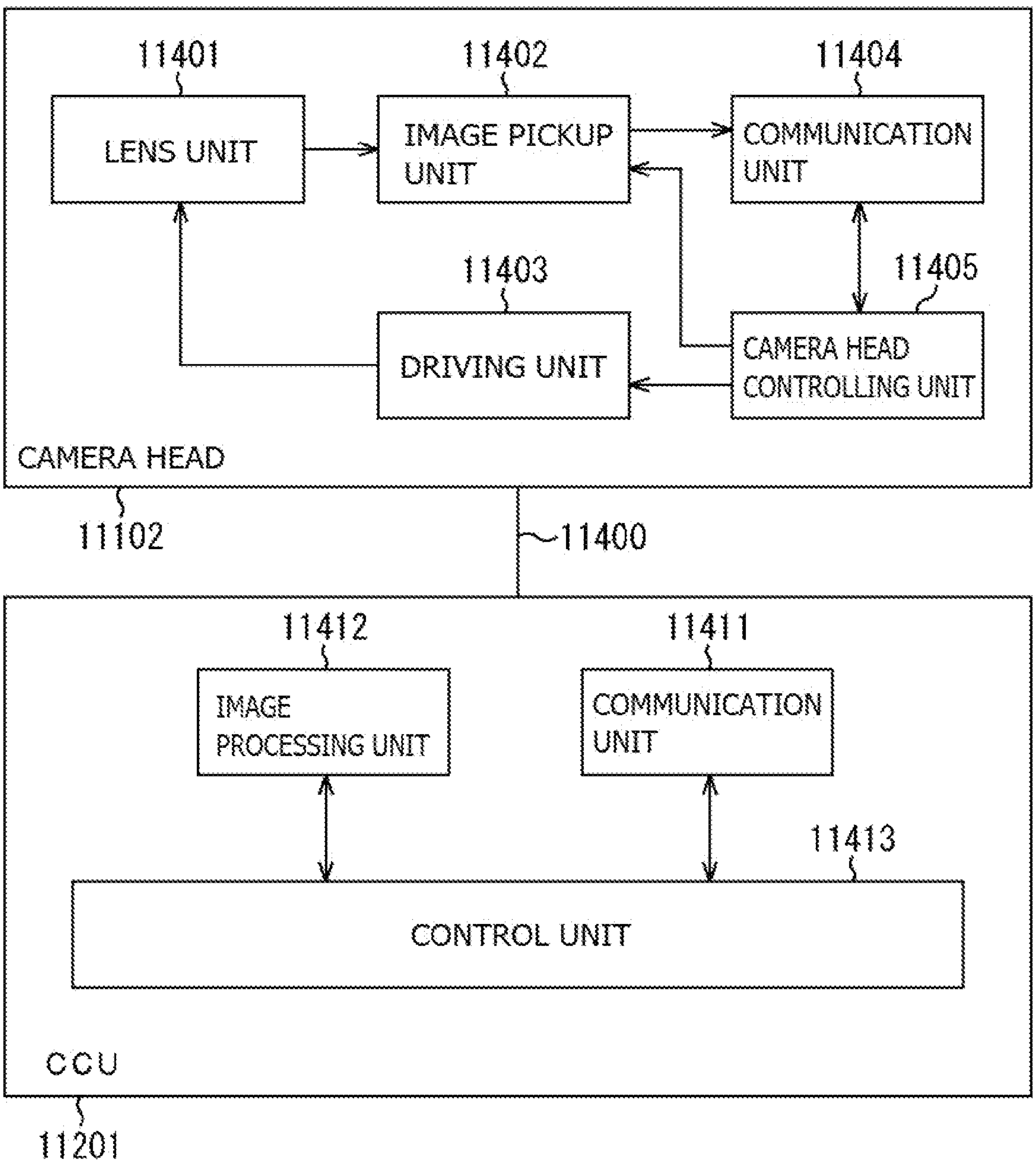

FIG. 265 is a block diagram depicting an example of a functional configuration of a camera head and a camera control unit (CCU).

Figure 266:
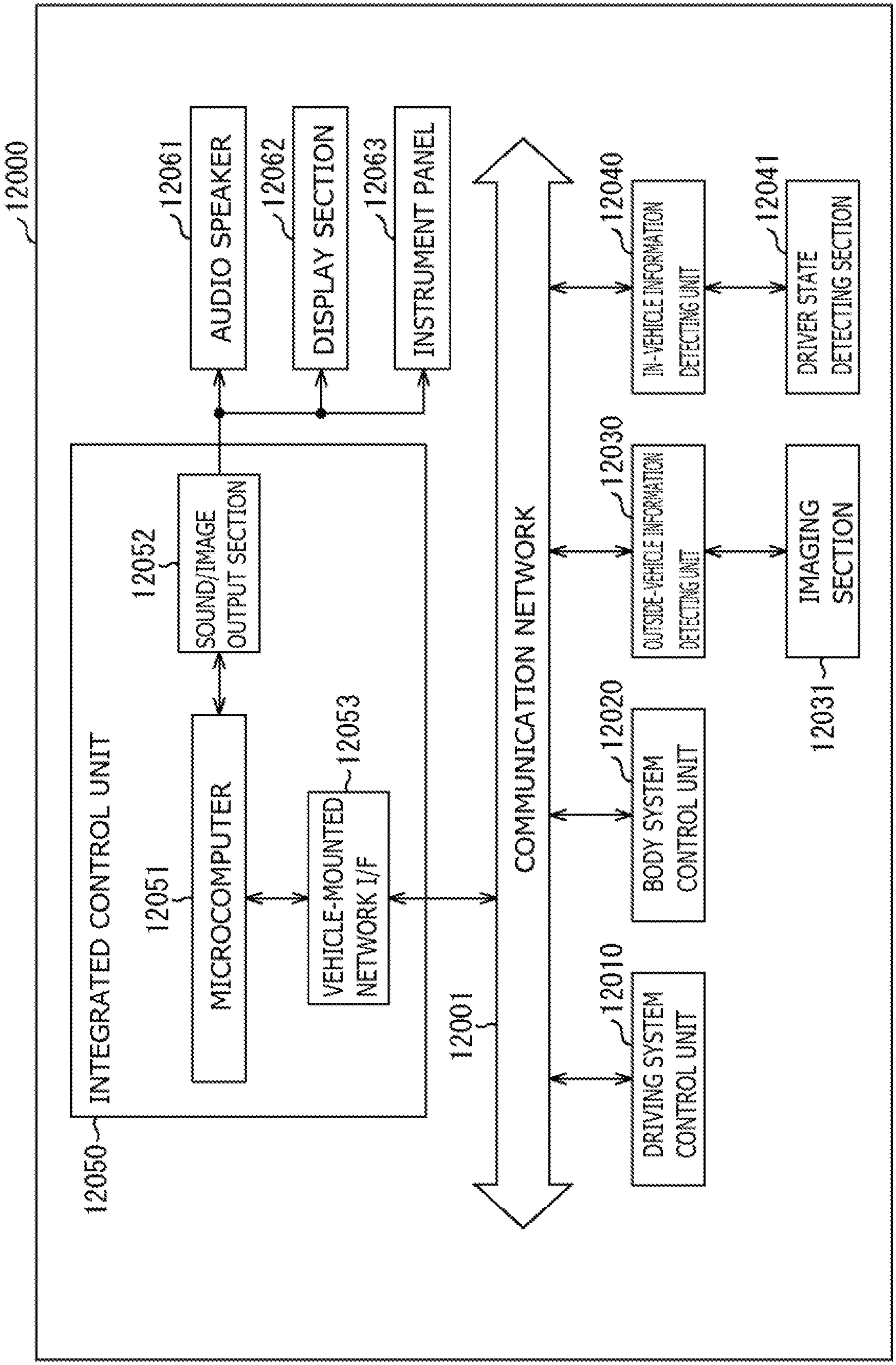

FIG. 266 is a block diagram depicting an example of schematic configuration of a vehicle control system.

Figure 267:
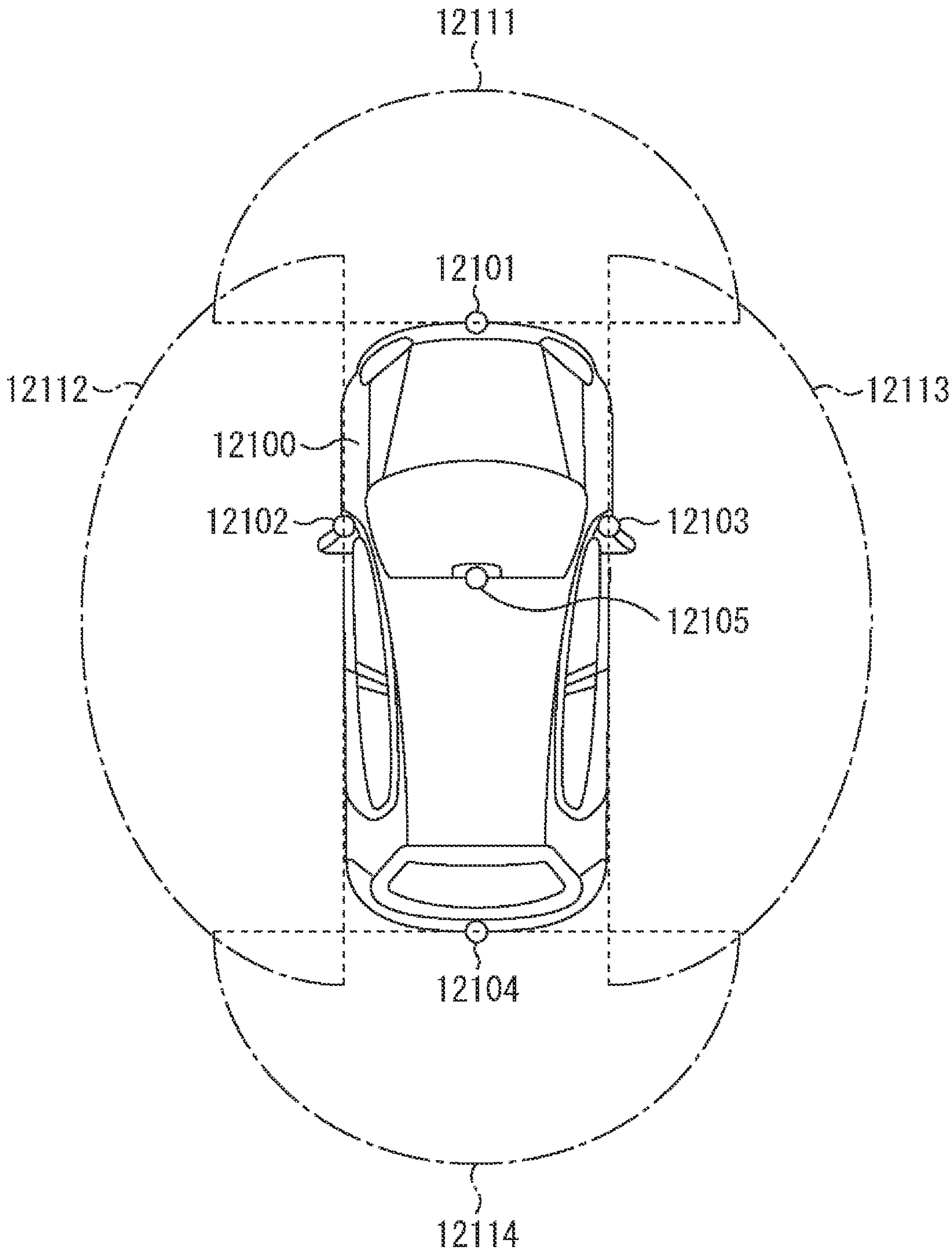

FIG. 267 is a diagram of assistance in explaining an example of installation positions of an outside-vehicle information detecting section and an imaging section.

DESCRIPTION OF EMBODIMENTS

Hereinafter, best modes for carrying out the present technology (hereinafter, referred to as embodiments) are explained in detail with reference to the drawings. Note that explanations are given in the following order.

1. Victim Conductor Loop and Magnetic Flux
2. Configuration Example of Solid-State Image Pickup Apparatus which is Embodiment of Present Technology
3. Structure to Block Hot Carrier Light Emissions
4. Configuration Examples of Conductor Layers A and B
5. Arrangement Examples of Electrodes in Semiconductor Board in which Conductor Layers A and B are Formed
6. Modification Examples of Configuration Examples of Conductor Layers A and B
7. Modification Examples of Mesh Conductors
8. Various Effects
9. Configuration Examples with Different Lead Sections
10. Configuration Examples of Connections with Pads
11. Arrangement Examples of Conductive Shields
12. Configuration Examples in Case in which There are Three Conductor Layers
13. Application Examples
14. Displacement Configuration Examples of Mesh Conductor
15. Configuration Examples of Three Power Supplies
16. Configuration Examples of Image Pickup Apparatus
17. Examples of Application to In-vivo Information Acquisition System
18. Examples of Application to Endoscopic Surgery System
19. Examples of Application to Mobile Body

1. Victim Conductor Loop and Magnetic Flux

For example, in a case in which there is a circuit in which a Victim conductor loop is formed near a power supply wire in a solid-state image pickup apparatus (semiconductor apparatus) such as a CMOS image sensor, a change in magnetic flux passing across the loop plane of the Victim conductor loop changes an induced electromotive force generated to the Victim conductor loop, and generates noise in pixel signals in some cases. Note that it is sufficient if the Victim conductor loop at least partially includes a conductor. In addition, the Victim conductor loop may be entirely formed with a conductor.

Here, the Victim conductor loop (first conductor loop) means a conductor loop that is on the side to be influenced by a change of a magnetic field strength that occurs nearby. On the other hand, a conductor loop that is near the Victim conductor loop, generates a change of a magnetic field strength as a result of a change of a current flowing through the conductor loop, and is on the side to influence the Victim conductor loop is referred to as an Aggressor conductor loop (second conductor loop).

Figure 1:
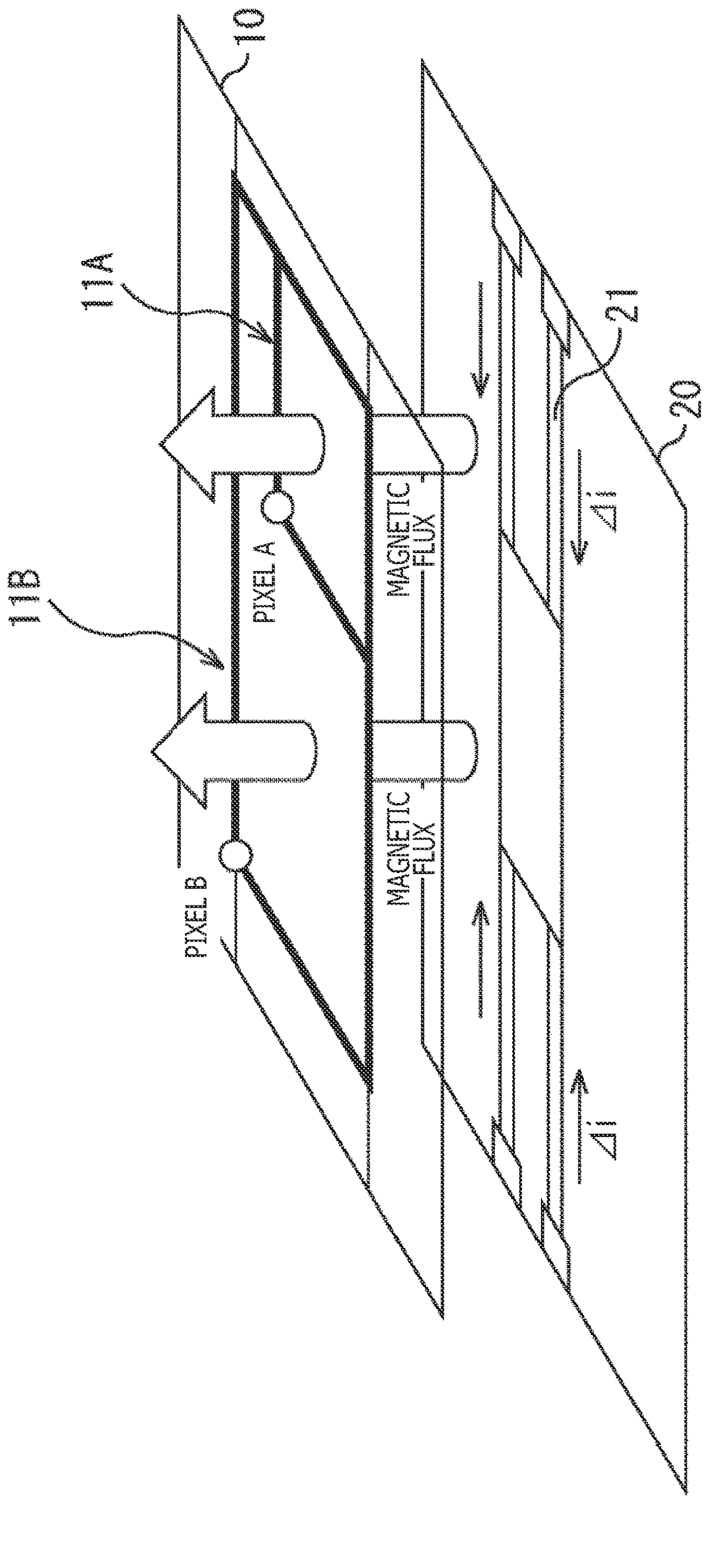
FIG. 1 is a figure for explaining a change of an induced electromotive force as a result of a change of a conductor loop.

FIG. 1 is a figure for explaining a change of an induced electromotive force as a result of a change of the Victim conductor loop. For example, the solid-state image pickup apparatus such as a CMOS image sensor depicted in FIG. 1 includes a pixel board 10 and a logic board 20 that are stacked in this order from above. In the solid-state image pickup apparatus in FIG. 1, at least part of a Victim conductor loop 11 (11A and 11B) is formed in a pixel region of the pixel board 10, and a power supply wire 21 for supplying a (digital) power supply is formed near the Victim conductor loop 11 and on the logic board 20 stacked with the pixel board 10.

Then, magnetic flux generated by the power supply wire 21 passes across the loop plane of the Victim conductor loop 11 on the pixel board 10, and an induced electromotive force is generated to the Victim conductor loop 11 thereby.

Note that an induced electromotive force Vemf generated to the Victim conductor loop 11 can be computed according to the following Formulae (1) and (2). Note that Φ represents magnetic flux, H represents a magnetic field strength, μ represents permeability, and S represents the area size of the Victim conductor loop 11.

[Math. 1]

$$\phi = \int_s \mu H \cdot dS \tag{1}$$

[Math. 2]

$$V_{emf} = -\frac{d\phi}{dt} \tag{2}$$

The loop path of the Victim conductor loop 11 formed in the pixel region of the pixel board 10 varies depending on the position of a pixel selected as a readout target pixel from which a pixel signal is to be read out. In the case of the example in FIG. 1, the loop path of the Victim conductor loop 11A formed when a pixel A is selected is different from the loop path of the Victim conductor loop 11B formed when a pixel B at a position different from the position of the pixel A is selected. In other words, the effective shape of the conductor loop changes depending on the position of a selected pixel.

If the loop path of the Victim conductor loop 11 changes in this manner, magnetic flux passing across the loop plane of the Victim conductor loop changes, and an induced electromotive force generated to the Victim conductor loop thereby changes significantly in some cases. In addition, as a result of the change of the induced electromotive force, noise (inductive noise) is generated to a pixel signal read out from a pixel in some cases. Then, the inductive noise generates stripe image noise to a captured image in some cases. That is, the image quality of the captured image lowers in some cases.

In view of this, the present disclosure proposes a technology of suppressing the occurrence of inductive noise as a result of an induced electromotive force in the Victim conductor loop.

2. Configuration Example of Solid-State Image Pickup Apparatus (Semiconductor Apparatus) which is Embodiment of Present Technology FIG. 2 is a block diagram depicting a main configuration example of the solid-state image pickup apparatus which is an embodiment of the present technology.

Figure 2:
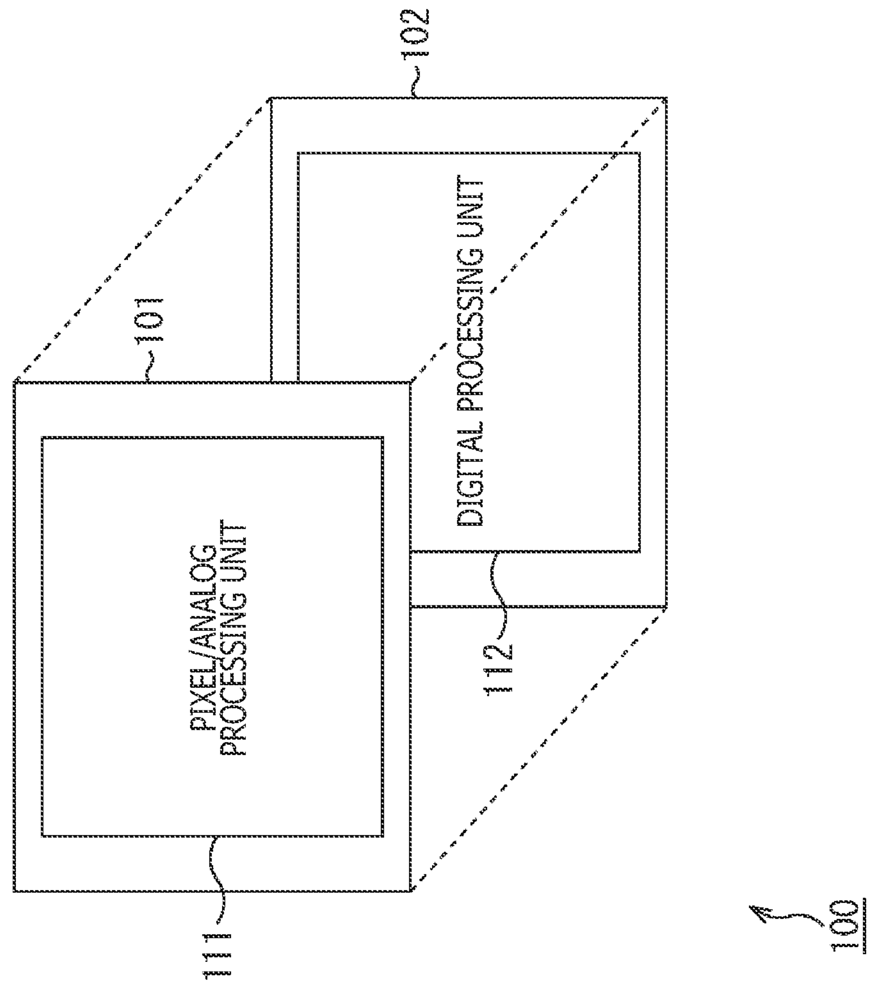
FIG. 2 is a block diagram depicting a configuration example of a solid-state image pickup apparatus to which the present technology is applied.

A solid-state image pickup apparatus 100 depicted in FIG. 2 is a device that photoelectrically converts light from a subject and outputs the photoelectrically converted light as image data. For example, the solid-state image pickup apparatus 100 is configured as a back-illuminated CMOS image sensor using a CMOS, or the like.

As depicted in FIG. 2, the solid-state image pickup apparatus 100 includes a first semiconductor board 101 and a second semiconductor board 102 that are stacked one on another.

A pixel/analog processing unit 111 having pixels, an analog circuit and the like is formed in the first semiconductor board 101. A digital processing unit 112 having a digital circuit and the like is formed in the second semiconductor board 102.

The first semiconductor board 101 and the second semiconductor board 102 are superimposed in a state in which the first semiconductor board 101 and the second semiconductor board 102 are insulated from each other. That is, configurations of the pixel/analog processing unit 111 and configurations of the second semiconductor board 102 are basically insulated from each other. Note that although an illustration is omitted, configurations formed in the pixel/analog processing unit 111 and configurations formed in the digital processing unit 112 are, as necessary (at sections that are necessary to be done so), electrically connected with each other via conductor vias, through silicon vias (TSV), junctions between the same type of metal such as Cu—Cu junctions, Au—Au junctions, or Al—Al junctions, junctions between different types of metal such as Cu—Au junctions, Cu—Al junctions, or Au—Al junctions, bonding wires, or the like, for example.

Note that while the solid-state image pickup apparatus 100 includes two stacked layers of boards in the example explained with reference to FIG. 2, the number of stacked layers of boards included in the solid-state image pickup apparatus 100 may be any number. For example, the number of stacked layers may be one, or three or larger. In the cases explained hereinafter, the solid-state image pickup apparatus 100 includes two layers of boards as in the example in FIG. 2.

Figure 3:
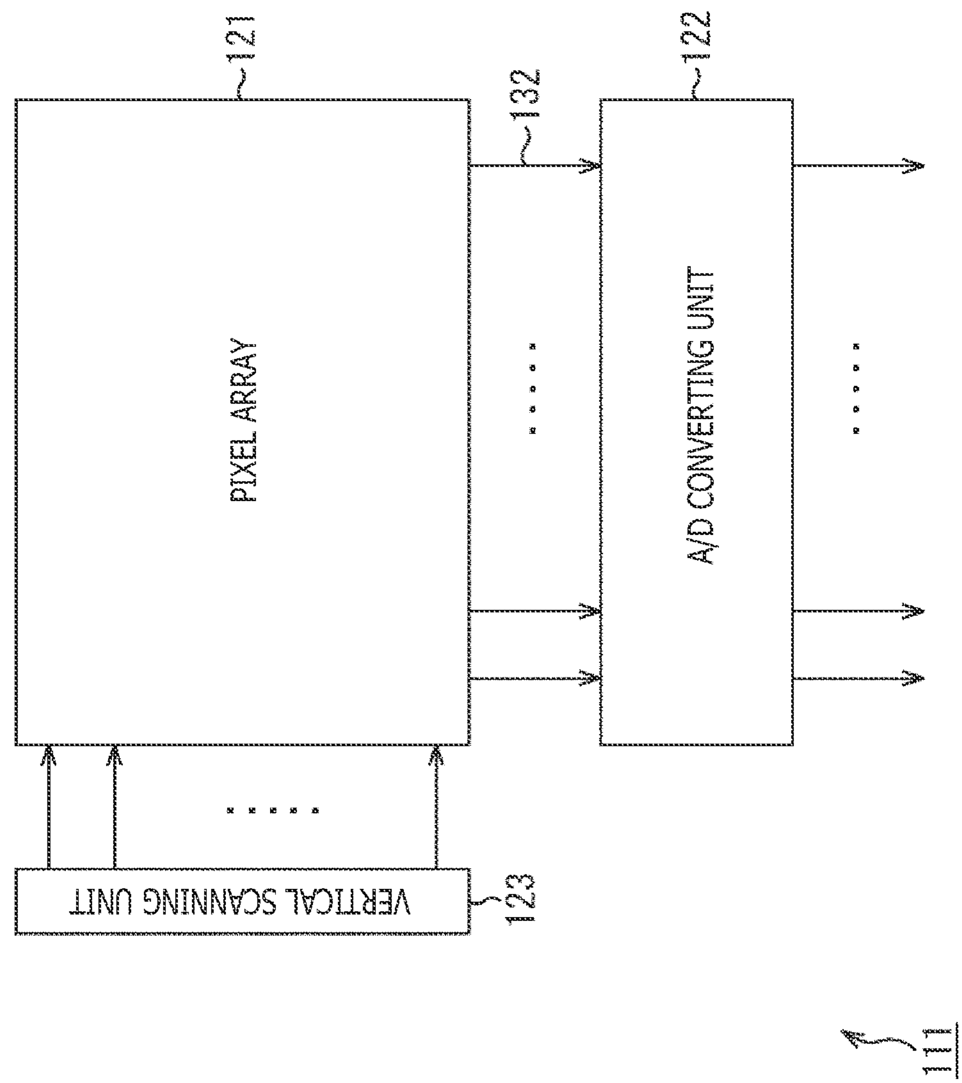
FIG. 3 is a block diagram depicting main constituent element examples of a pixel/analog processing unit.

FIG. 3 is a block diagram depicting main constituent element examples formed in the pixel/analog processing unit 111.

As depicted in FIG. 3, a pixel array 121, an A/D converting unit 122, a vertical scanning unit 123, and the like are formed in the pixel/analog processing unit 111.

The pixel array 121 includes multiple pixels 131 (FIG. 4) that are arranged lengthwise and breadthwise, and each of the multiple pixels 131 has a photoelectric converting element such as a photodiode.

The A/D converting unit 122 A/D-converts an analog signal or the like read out from each pixel 131 in the pixel array 121 and outputs a digital pixel signal obtained as a result of the A/D conversion.

The vertical scanning unit 123 controls operation of a transistor (a transfer transistor 142 illustrated in FIG. 5 etc.) of each pixel 131 in the pixel array 121. That is, an electric charge accumulated in each pixel 131 in the pixel array 121 is read out under the control of the vertical scanning unit 123, is supplied as a pixel signal to the A/D converting unit 122 via a signal line 132 (FIG. 4) for each column of unit pixels, and is A/D-converted.

For each column of pixels 131, the A/D converting unit 122 supplies results of the A/D conversion (digital pixel signals) to a logic circuit (not depicted) formed in the digital processing unit 112.

Figure 4:
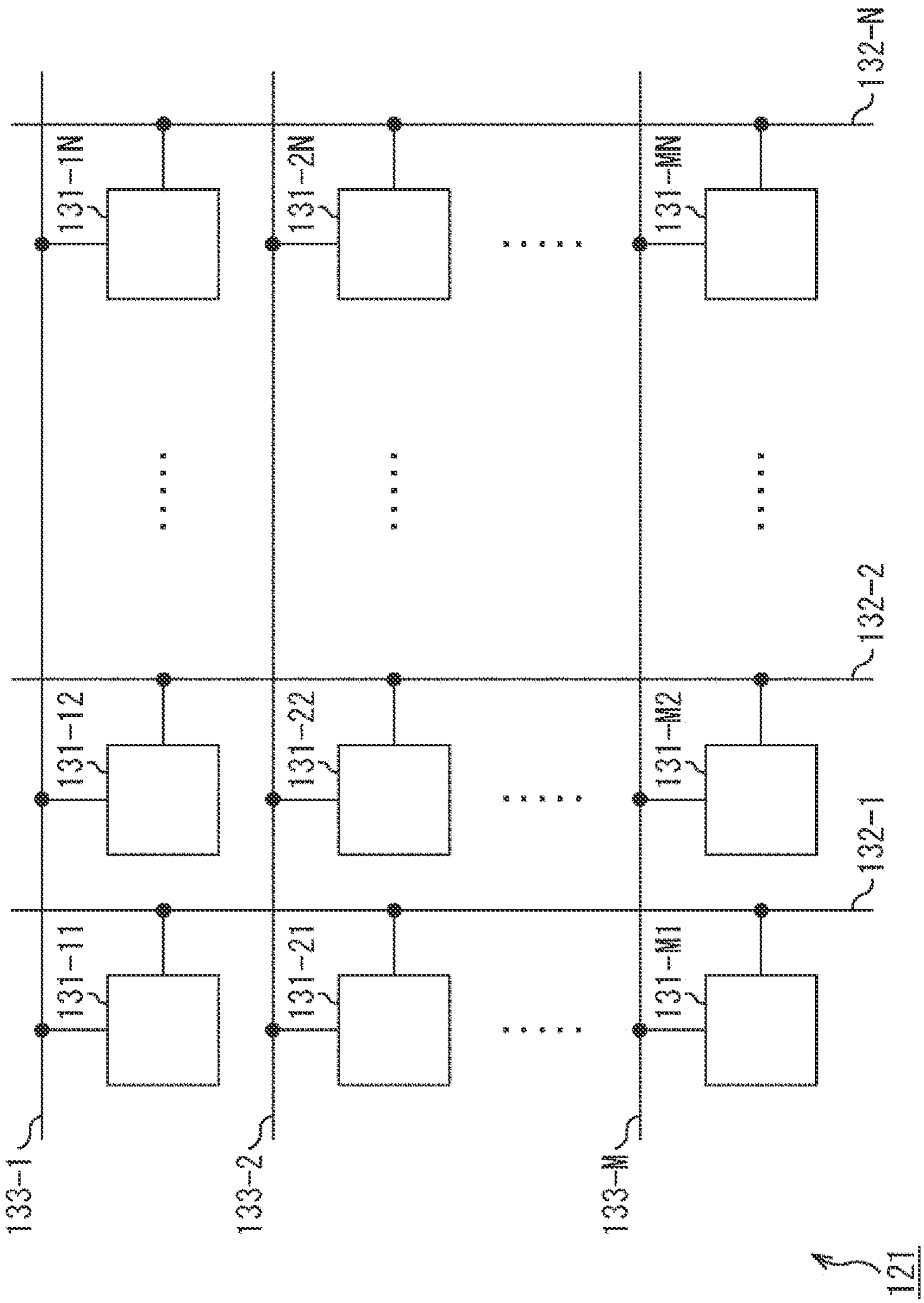
FIG. 4 is a figure depicting a detailed configuration example of a pixel array.

FIG. 4 is a figure depicting a detailed configuration example of the pixel array 121. Pixels 131-11 to 131-MN are formed in the pixel array 121 (M and N are natural numbers). That is, in the pixel array 121, M rows and N columns of pixels 131 are arranged in a matrix (in an array). Hereinafter, the pixels 131-11 to 131-MN are referred to as pixels 131 in a case in which it is not necessary to distinguish between individual ones of them.

Signal lines 132-1 to 132-N and control lines 133-1 to 133-M are formed in the pixel array 121. Hereinafter, the signal lines 132-1 to 132-N are referred to as signal lines 132 in a case in which it is not necessary to distinguish between individual ones of them, and the control lines 133-1 to 133-M are referred to as control lines 133 in a case in which it is not necessary to distinguish between individual ones of them.

Each column of pixels 131 is connected with a signal line 132 corresponding to the column. In addition, each row of pixels 131 is connected to a control line 133 corresponding to the row. Control signals from the vertical scanning unit 123 are transferred to the pixels 131 via the control lines 133.

Analog pixel signals are output from the pixels 131 to the A/D converting unit 122 via the signal lines 132.

Figure 5:
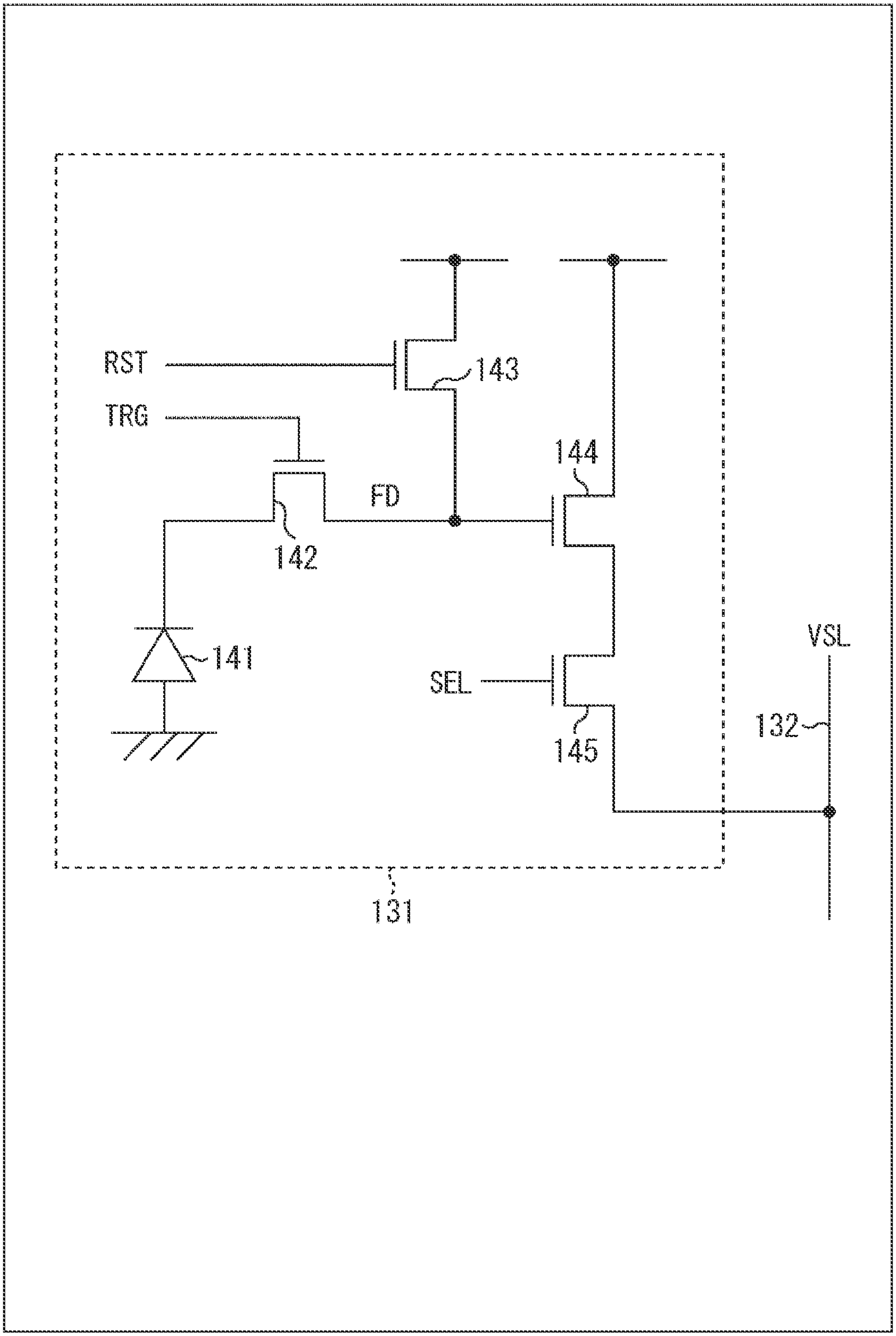
FIG. 5 is a circuit diagram depicting a configuration example of a pixel.

Next, FIG. 5 is a circuit diagram depicting a configuration example of a pixel 131. The pixel 131 has a photodiode 141 as a photoelectric converting element, a transfer transistor 142, a reset transistor 143, an amplification transistor 144, and a select transistor 145.

The photodiode 141 photoelectrically converts received light into an optical electric charge (here, photoelectrons) of an electric charge amount corresponding to the amount of the light and accumulates the optical electric charge. The anode electrode of the photodiode 141 is connected to GND, and the cathode electrode is connected to a floating diffusion (FD) via the transfer transistor 142. Needless to say, in one possible manner, the cathode electrode of the photodiode 141 may be connected to a power supply, the anode electrode may be connected to a floating diffusion via the transfer transistor 142, and an optical electric charge is read out as photoholes.

The transfer transistor 142 controls operation of reading out an optical electric charge from the photodiode 141. The drain electrode of the transfer transistor 142 is connected to the floating diffusion, and the source electrode is connected to the cathode electrode of the photodiode 141. In addition, the gate electrode of the transfer transistor 142 is connected with a transfer control line that transfers a transfer control signal TRG supplied from the vertical scanning unit 123 (FIG. 3). When the transfer control signal TRG (i.e., the gate potential of the transfer transistor 142) is in the OFF state, transfer of an optical electric charge from the photodiode 141 is not performed (an optical electric charge is accumulated in the photodiode 141). When the transfer control signal TRG (i.e., the gate potential of the transfer transistor 142) is in the ON state, an optical electric charge accumulated in the photodiode 141 is transferred to the floating diffusion.

The reset transistor 143 resets the potential of the floating diffusion. The drain electrode of the reset transistor 143 is connected to the power supply potential, and the source electrode is connected to the floating diffusion. In addition, the gate electrode of the reset transistor 143 is connected with a reset control line that transfers a reset control signal RST supplied from the vertical scanning unit 123. When the reset control signal RST (i.e., the gate potential of the reset transistor 143) is in the OFF state, the floating diffusion is disconnected from the power supply potential. When the reset control signal RST (i.e., the gate potential of the reset transistor 143) is in the ON state, an electric charge in the floating diffusion is discharged to the power supply potential, and the floating diffusion is reset.

The amplification transistor 144 outputs an electric signal (analog signal) (causes a current to flow) according to the voltage of the floating diffusion. The gate electrode of the amplification transistor 144 is connected to the floating diffusion, the drain electrode is connected to a (source follower) power supply voltage, and the source electrode is connected to the drain electrode of the select transistor 145. For example, the amplification transistor 144 outputs, to the select transistor 145 and as a pixel signal, a reset signal (reset level) as an electric signal according to the voltage of the floating diffusion reset by the reset transistor 143. In addition, the amplification transistor 144 outputs, to the select transistor 145 and as a pixel signal, an optical accumulation signal (signal level) as an electric signal according to the voltage of the floating diffusion to which an optical electric charge has been transferred by the transfer transistor 142.

The select transistor 145 controls output of the electric signal supplied from the amplification transistor 144 to a signal line (VSL) 132 (i.e., the A/D converting unit 122). The drain electrode of the select transistor 145 is connected to the source electrode of the amplification transistor 144, and the source electrode is connected to the signal line 132. In addition, the gate electrode of the select transistor 145 is connected with a select control line that transfers a select control signal SEL supplied from the vertical scanning unit 123. When the select control signal SEL (i.e., the gate potential of the select transistor 145) is in the OFF state, the amplification transistor 144 and the signal line 132 are electrically disconnected. Accordingly, in this state, a reset signal and an optical accumulation signal as pixel signals from the pixel 131 are not output. When the select control signal SEL (i.e., the gate potential of the select transistor 145) is in the ON state, the pixel 131 is in the selected state. That is, the amplification transistor 144 and the signal line 132 are electrically connected, and a reset signal and an optical accumulation signal as pixel signals output from the amplification transistor 144 are supplied to the A/D converting unit 122 via the signal line 132. That is, the reset signal and the optical accumulation signal as pixel signals are read out from the pixel 131.

Note that the pixel 131 may have any configuration, and the configuration is not limited to the one in the example in FIG. 5.

When pixels 131 are selected as targets of operation to read out analog signals as pixel signals in the thus-configured pixel/analog processing unit 111, various Victim conductor loops (loop-shaped (annular) conductors) are formed with control lines 133 to control the various types of transistor, signal lines 132, power supply wires (analog power supply wires, and digital power supply wires), and the like that are mentioned above. When magnetic flux generated from nearby wires or the like passes across the loop planes of the Victim conductor loops, induced electromotive forces occur.

It is sufficient if a Victim conductor loop includes a partial wire of at least one of a control line 133 or a signal line 132. In addition, there may be a Victim conductor loop including part of a control line 133, and a Victim conductor loop including part of a signal line 132, as independent Victim conductor loops. Moreover, the Victim conductor loops may be partially or entirely included in the second semiconductor board 102. Furthermore, the Victim conductor loops may have variable or fixed loop paths.

Although the wiring directions of a control line 133 and a signal line 132 forming a Victim conductor loop are desirably substantially orthogonal to each other, they may be substantially parallel to each other.

Note that conductor loops that are near another conductor loop can be Victim conductor loops. For example, even a conductor loop that is not influenced even if a change occurs in a magnetic field strength as a result of a change of a current flowing through a nearby Aggressor loop can be a Victim conductor loop.

If a high-frequency signal flows through a wire (Aggressor conductor loop) near a Victim conductor loop, and a magnetic field strength around the Aggressor conductor loop changes, an induced electromotive force is generated to the Victim conductor loop as a result of the influence of the change, and noise occurs in the Victim conductor loop, in some cases.

Particularly, in a case in which wires through which currents flow in mutually the same direction are densely arranged near a Victim conductor loop, a change of a magnetic field strength increases, and an induced electromotive force (i.e., noise) that occurs in the Victim conductor loop also increases.

In view of this, in the present disclosure, the direction of magnetic flux generated from the loop plane of an Aggressor conductor loop is adjusted, and the magnetic field formed with the magnetic flux is prevented from passing across the Aggressor conductor loop.

3. Structure to Block Hot Carrier Light Emissions

Figure 6:
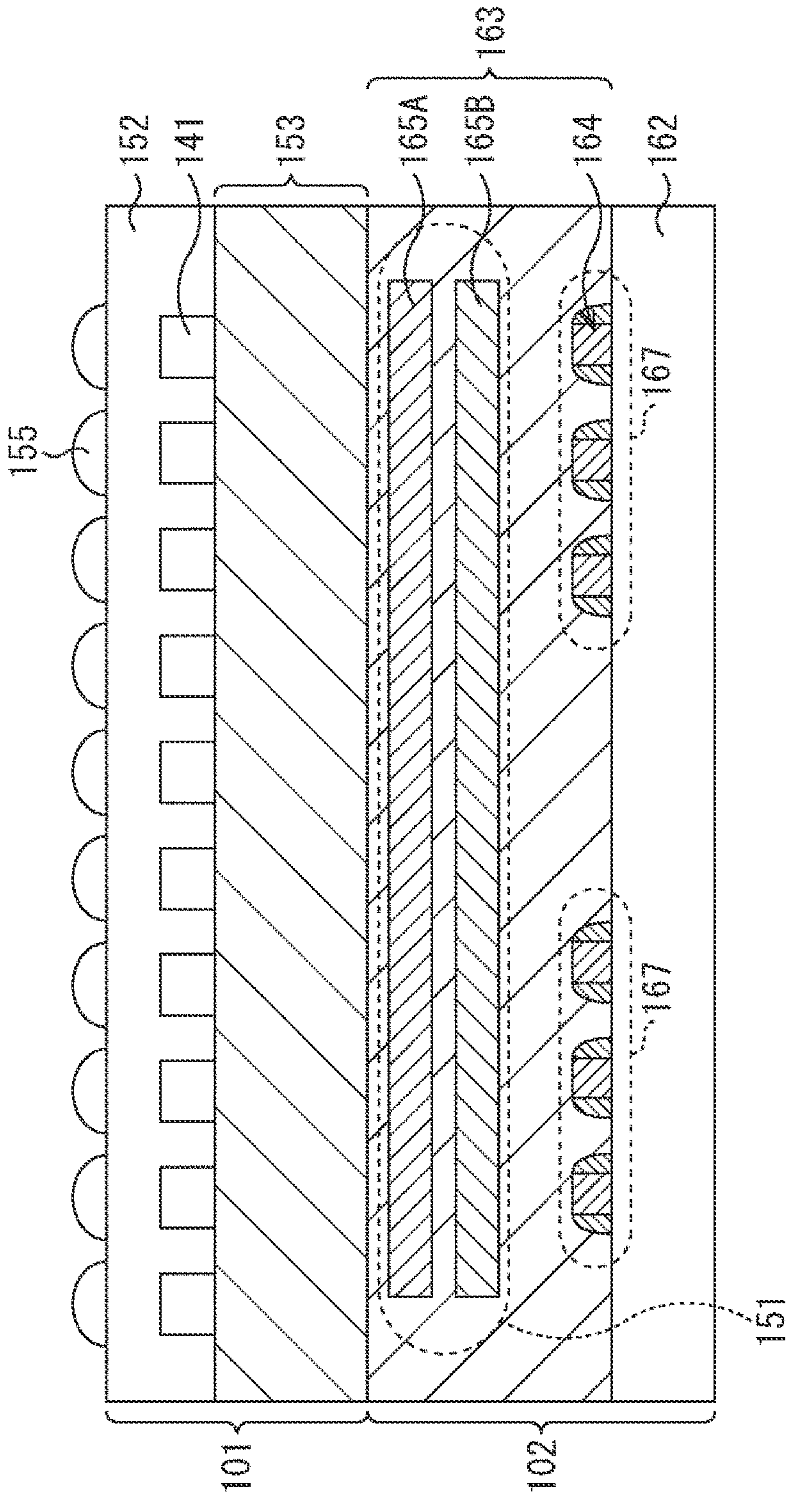
FIG. 6 is a block diagram depicting a cross-sectional structure example of the solid-state image pickup apparatus.

FIG. 6 is a figure depicting a cross-sectional structure example of the solid-state image pickup apparatus 100.

As mentioned above, the solid-state image pickup apparatus 100 includes the first semiconductor board 101 and the second semiconductor board 102 that are stacked one on another.

In the first semiconductor board 101, a pixel array including multiple two-dimensionally arrayed pixel units each including a photodiode 141 to serve as a photoelectric converting unit, and multiple pixel transistors (the transfer transistors 142 to the select transistor 145 in FIG. 5), for example, is formed.

In a well region formed in a semiconductor base 152, a photodiode 141 includes an n-type semiconductor region and a p-type semiconductor region on the base front surface side (the lower side in the figure), for example. Multiple pixel transistors (the transfer transistor 142 to the select transistor 145 in FIG. 5) are formed on the semiconductor base 152.

On the front surface side of the semiconductor base 152, a multi-layer wiring layer 153 in which multiple layers of wires are arranged via interlayer dielectric films is formed. The wires are formed with copper wires, for example. Wires in different wiring layers of the pixel transistors, the vertical scanning unit 123, and the like are connected, at portions that are necessary to be done so, by connection conductors that penetrate the wiring layers. On the back surface (the upper surface in the figure) of the semiconductor base 152, optical members 155 such as antireflection films, light-blocking films to block predetermined regions, and color filters or microlenses provided at positions corresponding to photodiodes 141 are formed, for example.

On the other hand, a logic circuit as the digital processing unit 112 (FIG. 2) is formed in the second semiconductor board 102. The logic circuit includes multiple MOS transistors 164 formed in p-type semiconductor well regions of a semiconductor base 162, for example.

Furthermore, a multi-layer wiring layer 163 including multiple wiring layers in which wires are arranged via interlayer dielectric films is formed on the semiconductor base 162. FIG. 6 depicts two wiring layers (wiring layers 165A and 165B) in the multiple wiring layers forming the multi-layer wiring layer 163.

In the solid-state image pickup apparatus 100, the wiring layer 165A and the wiring layer 165B form a light-blocking structure 151.

Here, a region that is in the second semiconductor board 102, and in which active elements such as MOS transistors 164 are formed is treated as an active element group 167. In the second semiconductor board 102, for example, a circuit for realizing one functionality includes a combination of multiple active elements such as nMOS transistors and pMOS transistors. Then, the region in which the active element group 167 is formed is treated as a circuit block (corresponding to circuit blocks 202 to 204 in FIGS. 7A and 7B). Note that, besides the MOS transistors 164, there can be diodes and the like as active elements formed in the second semiconductor board 102.

Then, the presence of the light-blocking structure 151 including the wiring layer 165A and the wiring layer 165B between the active element groups 167 and the photodiodes 141 in the multi-layer wiring layer 163 of the second semiconductor board 102 suppresses leakages of hot carrier light emissions generated from the active element groups 167 into the photodiodes 141 (details thereof are mentioned below).

Hereinafter, the wiring layer 165A that is one of the wiring layer 165A and the wiring layer 165B forming the light-blocking structure 151, and is closer to the first semiconductor board 101 in which the photodiodes 141 and the like are formed is referred to as a conductor layer A (first conductor layer). In addition, the wiring layer 165B closer to the active element groups 167 is referred to as a conductor layer B (second conductor layer).

It should be noted however that the wiring layer 165A which is closer to the first semiconductor board 101 in which the photodiodes 141 and the like are formed may be treated as the conductor layer B, and the wiring layer 165B closer to the active element group 167 may be treated as the conductor layer A. In addition, any of an insulation layer, a semiconductor layer, another conductor layer, and the like may be provided between the conductor layers A and B. Furthermore, any of an insulation layer, a semiconductor layer, another conductor layer, and the like may be provided not only between the conductor layers A and B.

The conductor layer A and the conductor layer B are desirably, but are not limited to be, conductor layers which are the easiest for currents to flow through in the circuit board, the semiconductor board, and the electronic equipment.

Desirably, one of the conductor layer A and the conductor layer B is, but is not limited to be, a conductor layer which is the easiest for currents to flow through in the circuit board, the semiconductor board, and the electronic equipment, and the other of the conductor layer A and the conductor layer B is, but is not limited to be, a conductor layer which is the second easiest for currents to flow through in the circuit board, the semiconductor board, and the electronic equipment.

One of the conductor layer A and the conductor layer B is desirably, but is not limited to be, not a conductor layer which is the hardest for currents to flow through in the circuit board, the semiconductor board, and the electronic equipment. None of the conductor layer A and the conductor layer B is desirably, but is not limited to be, a conductor layer which is the hardest for currents to flow through in the circuit board, the semiconductor board, and the electronic equipment.

For example, one of the conductor layer A and the conductor layer B may be a conductor layer which is the easiest for currents to flow through in the first semiconductor board 101, and the other of the conductor layer A and the conductor layer B may be a conductor layer which is the second easiest for currents to flow through in the first semiconductor board 101.

For example, one of the conductor layer A and the conductor layer B may be a conductor layer which is the easiest for currents to flow through in the second semiconductor board 102, and the other of the conductor layer A and the conductor layer B may be a conductor layer which is the second easiest for currents to flow through in the second semiconductor board 102.

For example, one of the conductor layer A and the conductor layer B may be a conductor layer which is the easiest for currents to flow through in the first semiconductor board 101, and the other of the conductor layer A and the conductor layer B may be a conductor layer which is the easiest for currents to flow through in the second semiconductor board 102.

For example, one of the conductor layer A and the conductor layer B may be a conductor layer which is the easiest for currents to flow through in the first semiconductor board 101, and the other of the conductor layer A and the conductor layer B may be a conductor layer which is the second easiest for currents to flow through in the second semiconductor board 102.

For example, one of the conductor layer A and the conductor layer B may be a conductor layer which is the second easiest for currents to flow through in the first semiconductor board 101, and the other of the conductor layer A and the conductor layer B may be a conductor layer which is the easiest for currents to flow through in the second semiconductor board 102.

For example, one of the conductor layer A and the conductor layer B may be a conductor layer which is the second easiest for currents to flow through in the first semiconductor board 101, and the other of the conductor layer A and the conductor layer B may be a conductor layer which is the second easiest for currents to flow through in the second semiconductor board 102.

For example, one of the conductor layer A and the conductor layer B does not have to be a conductor layer which is the hardest for currents to flow through in the first semiconductor board 101 or the second semiconductor board 102.

For example, none of the conductor layer A and the conductor layer B does not have to be a conductor layer which is the hardest for currents to flow through in the first semiconductor board 101 or the second semiconductor board 102.

Note that the "easiest" or "hardest" in the explanation mentioned above can be replaced with the "third easiest" or "third hardest," "fourth easiest" or "fourth hardest," or "N-th easiest" or "N-th hardest" (N is a positive number), and the "second easiest" or "second hardest" in the explanation mentioned above also can be replaced with the "third easiest" or "third hardest," "fourth easiest" or "fourth hardest," or "N-th easiest" or "N-th hardest" (N is a positive number).

Note that it may be considered that a conductor layer which is easier for currents to flow through in the circuit board, the semiconductor board, and the electronic equipment mentioned above is any one of a conductor layer which is easier for currents to flow through in the circuit board, a conductor layer which is easier for currents to flow through in the semiconductor board, and a conductor layer which is easier for currents to flow through in the electronic equipment. In addition, it may be considered that a conductor layer which is harder for currents to flow through in the circuit board, the semiconductor board, and the electronic equipment mentioned above is any one of a conductor layer which is harder for currents to flow through in the circuit board, a conductor layer which is harder for currents to flow through in the semiconductor board, and a conductor layer which is harder for currents to flow through in the electronic equipment. In addition, the conductor layer which is easier for currents to flow through mentioned above can instead be expressed as a conductor layer with a low sheet resistance, and the conductor layer which is harder for currents to flow through mentioned above can instead be expressed as a conductor layer with a high sheet resistance.

Note that as conductor materials to be used for the conductor layers A and B, metals such as copper, aluminum, tungsten, chromium, nickel, tantalum, molybdenum, titanium, gold, silver, or iron, and mixtures, compounds, or alloys at least containing any of the metals are used mainly. In addition, semiconductors such as silicon, germanium, compound semiconductors, or organic semiconductors may be contained. Furthermore, insulators such as cotton, paper, polyethylene, polyvinyl chloride, natural rubber, polyester, epoxy resin, melamine resin, phenolic resin, polyurethane, synthetic resin, mica, asbestos, glass fiber, or porcelain may be contained.

The conductor layers A and B forming the light-blocking structure 151 can be Aggressor conductor loops due to currents flowing therethrough.

Next, a region to be blocked off from light (light-blocking target region) by the light-blocking structure 151 is explained.

Figure 7A:
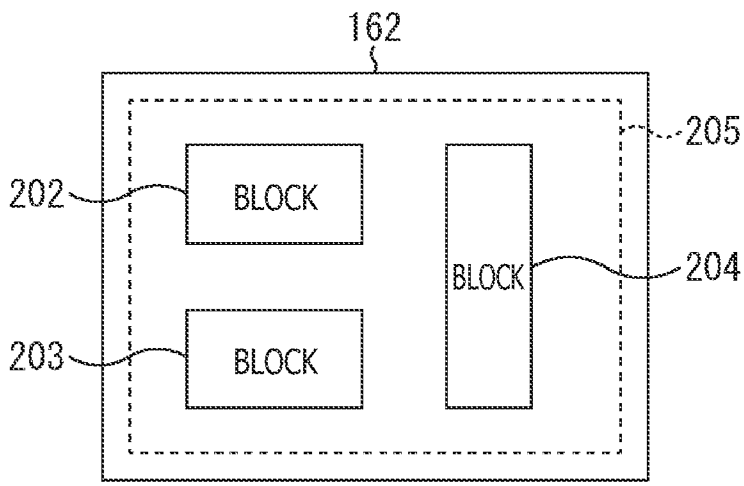
FIGS. 7A and 7B are schematic configuration diagrams depicting planar arrangement examples of circuit blocks including regions where active element groups are formed.
Figure 7B:
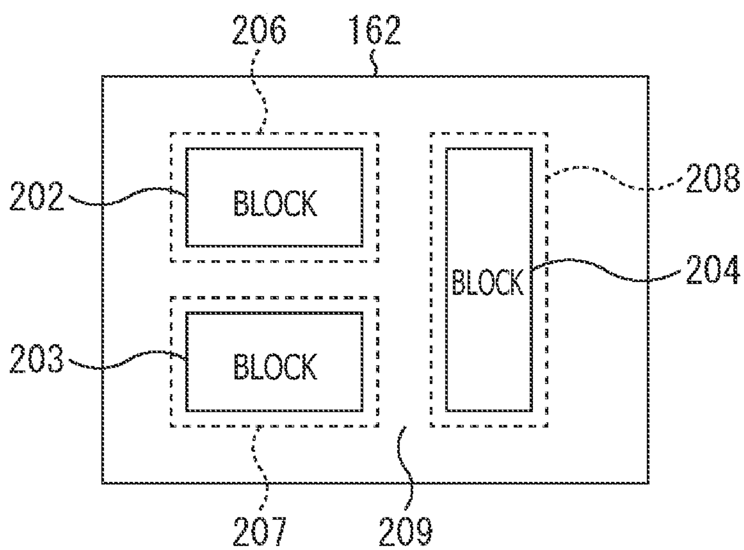

FIGS. 7A and 7B are schematic configuration diagrams depicting planar arrangement examples of circuit blocks that are in the semiconductor base 162 and include regions where active element groups 167 are formed.

FIG. 7A is an example of a case in which multiple circuit blocks 202 to 204 are treated collectively as a target region to be blocked off from light by the light-blocking structure 151, and a region 205 including all of the circuit blocks 202, 203, and 204 is treated as a light-blocking target region.

FIG. 7B is an example of a case in which the multiple circuit blocks 202 to 204 are treated separately as target regions to be blocked off from light by the light-blocking structure 151, regions 206, 207, and 208 including the circuit blocks 202, 203, and 204, respectively, are treated separately as light-blocking target regions, and a region 209 other than the regions 206 to 208 is not a light-blocking target region.

In the case of the example depicted in in FIG. 7B, it is possible to avoid restrictions on the degrees of freedom of the layouts of the conductor layers A and B forming the light-blocking structure 151. However, the layouts of the conductor layers A and B become complicated, and so it becomes necessary to make a considerable effort for designing the layouts of the conductor layers A and B.

In order to design the layouts of the conductor layers A and B forming the light-blocking structure 151 easily, desirably the example depicted in in FIG. 7A is adopted, and the multiple circuit blocks are treated collectively as a light-blocking target region.

In view of this, the present disclosure proposes a structure of the conductor layers A and B that allows easy designing of the layouts while restrictions on the degrees of freedom of the layouts of the conductor layers A and B are avoided.

Note that, in addition to circuit blocks representing regions of active element groups 167 to be light emission sources of hot carrier light emissions, a buffer region is provided around the circuit blocks in the light-blocking target region in the present embodiment such that the buffer region also becomes a light-blocking target region. By providing the buffer region around the circuit blocks, it is possible to hinder leakages, into photodiodes 141, of hot carrier light emissions emitted from the circuit blocks in diagonal directions.

Figure 8:
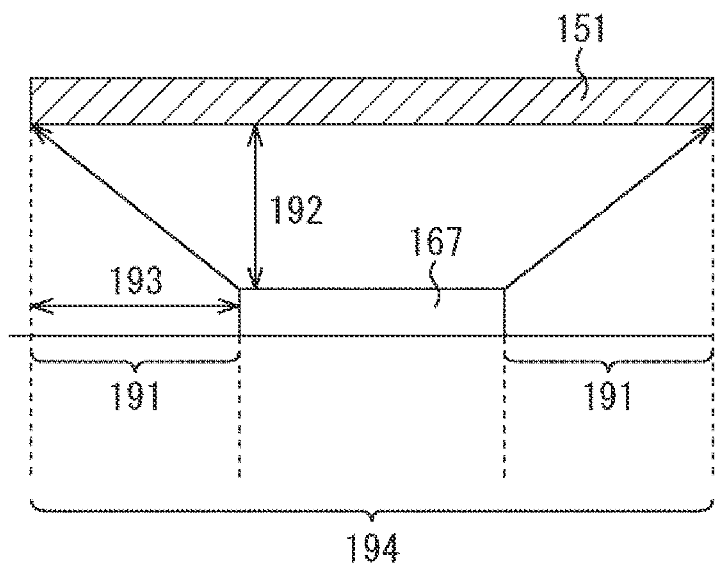
FIG. 8 is a figure depicting an example of a positional relation between a target region to be blocked off from light by a light-blocking structure, and an active element group region and a buffer region.

FIG. 8 is a figure depicting an example of a positional relation between a target region to be blocked off from light by the light-blocking structure 151, and an active element group region and a buffer region.

In the example depicted in FIG. 8, a region where an active element group 167 is formed, and a buffer region 191 surrounding the active element group 167 form a light-blocking target region 194, and the light-blocking structure 151 is formed to face the light-blocking target region 194.

Here, the length from the active element group 167 to the light-blocking structure 151 is referred to as an interlayer distance 192. In addition, the length from an end section of the active element group 167 to an end section of the light-blocking structure 151 including wires is referred to as a buffer region width 193.

The light-blocking structure 151 is formed such that the buffer region width 193 is larger than the interlayer distance 192. Thereby, it becomes possible to also block diagonal components of hot carrier light emissions that are generated from a point light source.

Note that the appropriate value of the buffer region width 193 varies depending on the interlayer distance 192 between the light-blocking structure 151 and the active element group 167. For example, in a case in which the interlayer distance 192 is long, it is necessary to provide a larger buffer region 191 such that diagonal components of hot carrier light emissions from the active element group 167 can be blocked sufficiently. On the other hand, in a case in which the interlayer distance 192 is short, hot carrier light emissions from the active element group 167 can be blocked sufficiently even if a large buffer region 191 is not provided. Accordingly, by forming the light-blocking structure 151 by using wiring layers that are included in multiple wiring layers included in the multi-layer wiring layer 163 and are close to the active element group 167, the degrees of freedom of the layouts of the conductor layers A and B can be enhanced. It should be noted however that it is difficult in many cases to form the light-blocking structure 151 by using wiring layers close to the active element group 167 for reasons such as layout constraints of the wiring layers close to the active element group 167. In the present technology, a high degree of freedom of layouts can be attained even in a case in which the light-blocking structure 151 is formed by using wiring layers far from the active element group 167.

4. Configuration Examples of Conductor Layers A and B

Hereinafter, configuration examples of the conductor layer A (wiring layer 165A) and the conductor layer B (wiring layer 165B) forming the light-blocking structure 151 which can be an Aggressor conductor loop in the solid-state image pickup apparatus 100 to which the present technology is applied are explained. Before the explanation, a comparative example as a comparison target of the configuration examples is explained.

First Comparative Example

Figure 9A:
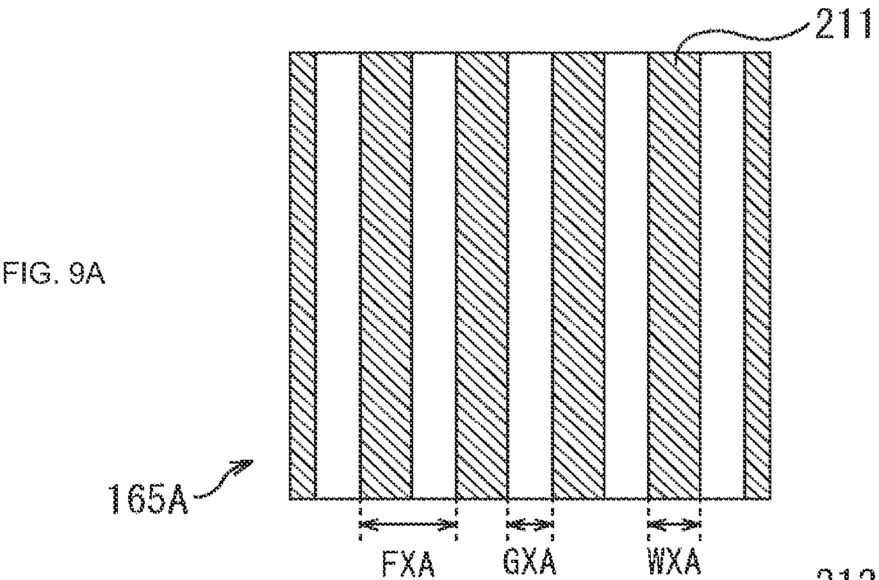
FIGS. 9A, 9B, and 9C are figures depicting a first comparative example of conductor layers A and B.
Figure 9B:
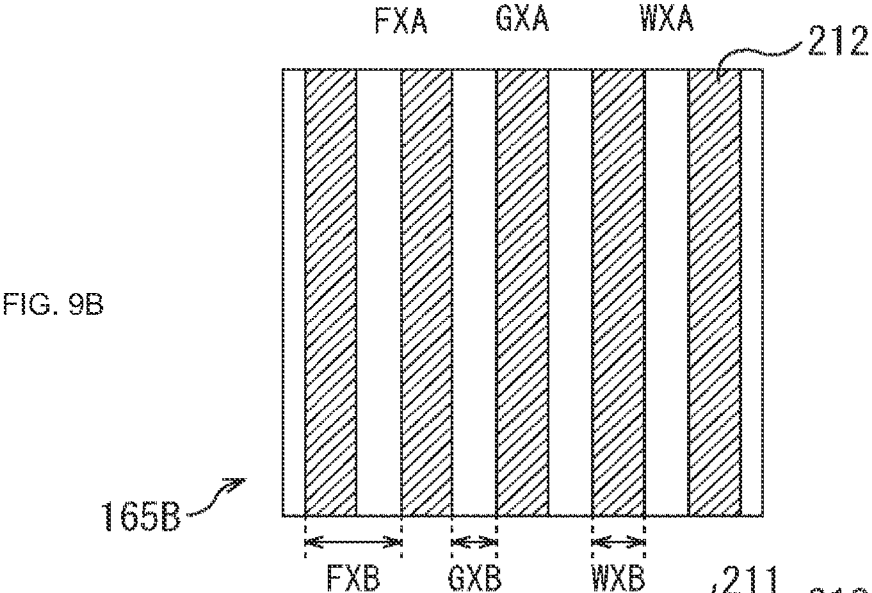
Figure 9C:
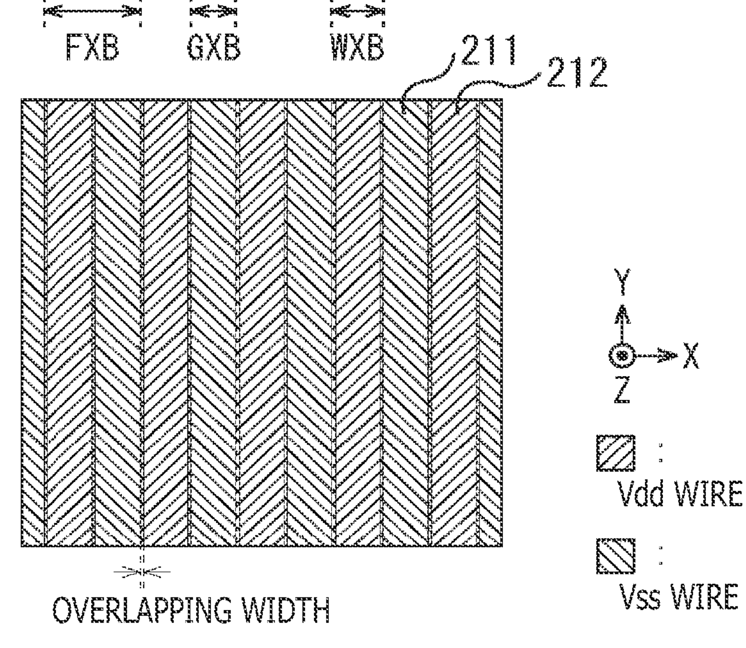

FIGS. 9A, 9B, and 9C are plan views depicting a first comparative example to be compared with multiple configuration examples of the conductor layers A and B forming the light-blocking structure 151 that are mentioned below. Note that in FIG. 9A depicts the conductor layer A, and in FIG. 9B depicts the conductor layer B. In the coordinate system in FIGS. 9A, 9B, and 9C, the X axis lies in the lateral direction, the Y axis lies in the longitudinal direction, and the Z axis lies in a direction perpendicular to the XY plane.

The conductor layer A in the first comparative example includes linear conductors 211 that are long in the Y direction and are arranged regularly at an X-direction conductor pitch FXA. Note that (conductor pitch FXA)=(X-direction conductor width WXA)+(X-direction gap width GXA) is satisfied. Each linear conductor 211 is a wire (Vss wire) connected to GND or a negative power supply, for example.

The conductor layer B in the first comparative example includes linear conductors 212 that are long in the Y direction and are arranged regularly at an X-direction conductor pitch FXB. Note that (conductor pitch FXB)=(X-direction conductor width WXB)+(X-direction gap width GXB) is satisfied. Each linear conductor 212 is a wire (Vdd wire) connected to a positive power supply, for example. Here, (conductor pitch FXB)=(conductor pitch FXA) is satisfied.

Note that points to which the conductor layers A and B are connected may be switched such that each linear conductor 211 is a Vdd wire and each linear conductor 212 is a Vss wire.

FIG. 9C depicts a state of the conductor layers A and B depicted in FIGS. 9A and 9B, respectively, as seen from the side where photodiodes 141 are located (the backside). In the case of the first comparative example, as depicted in in FIG. 9C, the linear conductors 211 and 212 are formed such that, in a case in which the linear conductors 211 included in the conductor layer A and the linear conductors 212 included in the conductor layer B are arranged to overlap each other, there are overlapping sections where conductor sections are superimposed. Accordingly, hot carrier light emissions from an active element group 167 can be blocked sufficiently. Note that the width of an overlapping section is also referred to as an overlapping width.

Figure 10:
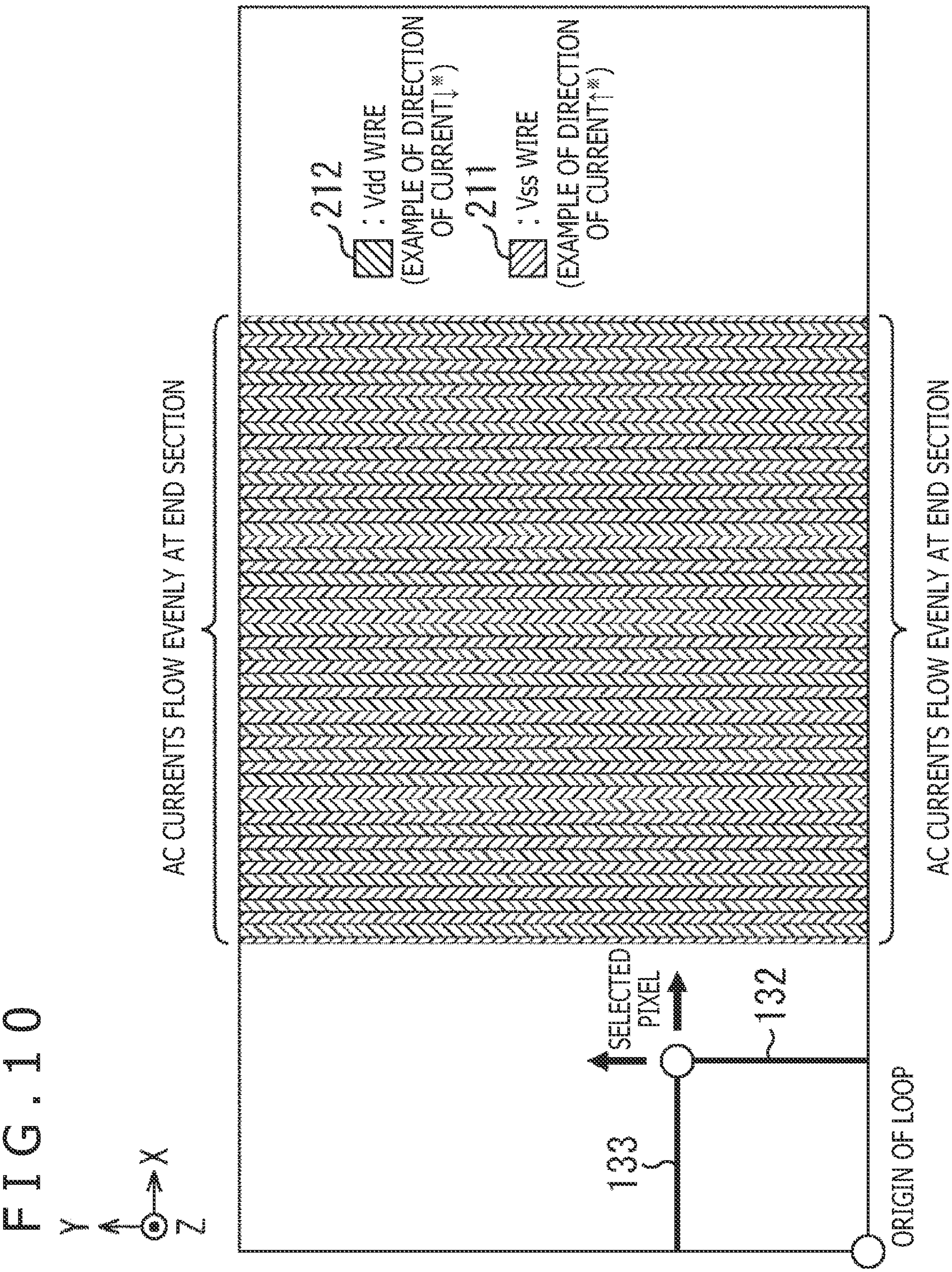
FIG. 10 is a figure depicting the condition of electric currents flowing in the first comparative example.

FIG. 10 is a figure depicting the condition of electric currents flowing in the first comparative example (FIGS. 9A, 9B, and 9C).

It is assumed that AC currents flow evenly at end sections of the linear conductors 211 included in the conductor layer A and of the linear conductors 212 included in the conductor layer B. It should be noted however that directions of electric currents change over time. For example, it is assumed that, when currents flow through the linear conductors 212, which are Vdd wires, from the upper side to the lower side in the figure, currents flow through the linear conductors 211, which are Vss wires, from the lower side to the upper side in the figure.

In a case in which currents flow as depicted in FIG. 10 in the first comparative example, magnetic flux substantially in the Z direction occurs more easily between the linear conductors 211, which are Vss wires, and the linear conductors 212, which are Vdd wires, due to conductor loops that include adjacent linear conductors 211 and 212 and have loop planes almost parallel to the XY plane in the plan view of FIG. 10.

On the other hand, in the pixel array 121 of the first semiconductor board 101 stacked on the second semiconductor board 102 in which the light-blocking structure 151 including the conductor layers A and B is formed, as depicted in FIG. 10, a Victim conductor loop including a signal line 132 and a control line 133 is formed on the XY plane. An induced electromotive force is generated in the Victim conductor loop formed on the XY plane more easily due to magnetic flux in the Z direction. The larger a change of the induced electromotive force is, the worse an image output from the solid-state image pickup apparatus 100 is (the larger the inductive noise is).

Furthermore, depending on the configuration of Aggressor conductor loops, if the effective dimensions of the Victim conductor loop including a signal line 132 and a control line 133 change as pixels at different positions are selected in the pixel array 121, changes of the induced electromotive force become noticeable because an induced electromotive force is proportional to the dimensions of a Victim conductor loop.

In the case of the first comparative example, the direction of magnetic flux (substantially in the Z direction) generated from the loop planes of the Aggressor conductor loops of the light-blocking structure 151 including the conductor layers A and B substantially coincides with the direction of magnetic flux (in the Z direction) that more easily generates an induced electromotive force to the Victim conductor loop, and so it is expected that an image output from the solid-state image pickup apparatus 100 worsens (inductive noise occurs).

Figures 11A, 11B, 11C:
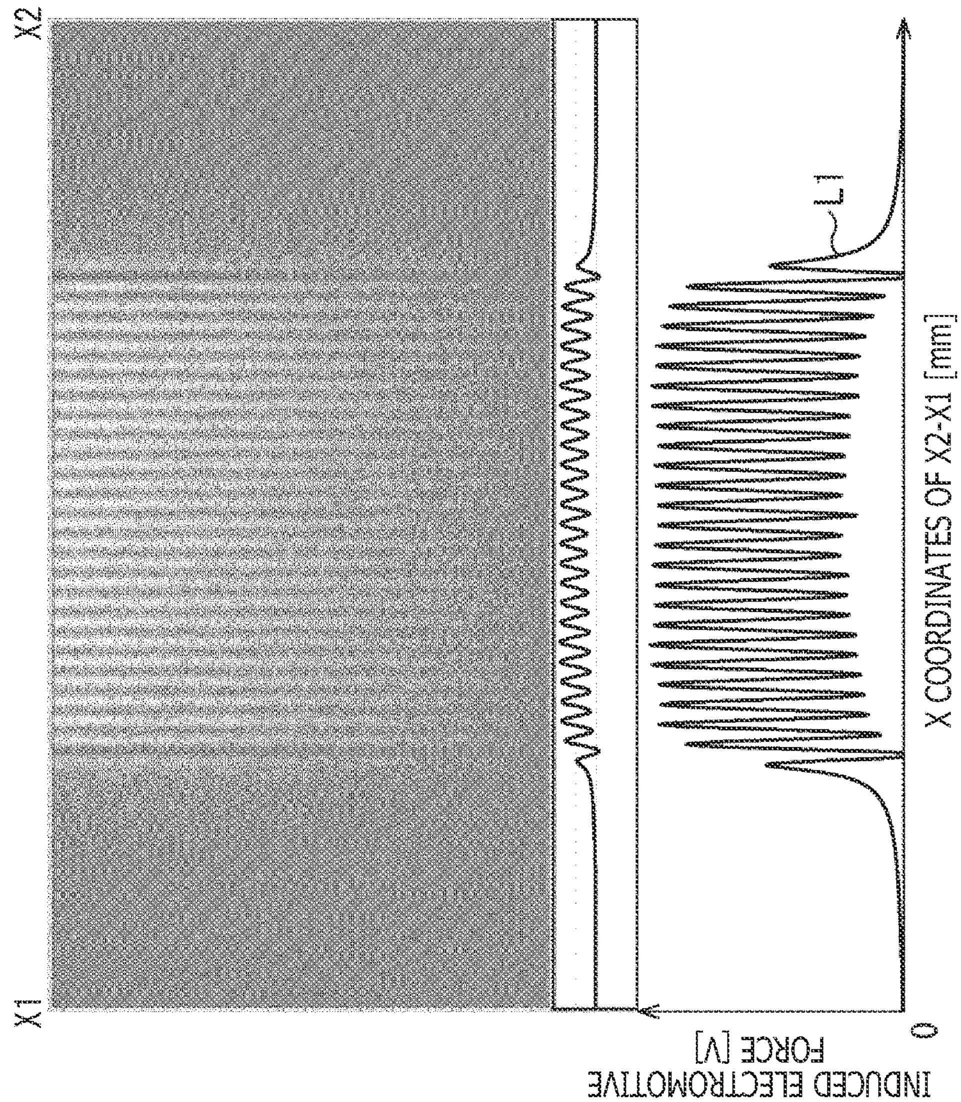
FIGS. 11A, 11B, and 11C are figures depicting a result of a simulation of inductive noise corresponding to the first comparative example.

FIGS. 11A, 11B, and 11C depict a result of a simulation of inductive noise that occurs in a case in which the first comparative example is applied to the solid-state image pickup apparatus 100.

FIG. 11A depicts an image that is output from the solid-state image pickup apparatus 100 and has inductive noise generated therein, in FIG. 11B depicts changes of pixel signals along a line segment X1-X2 in the image depicted in-A in FIG. 11A. FIG. 11C depicts a solid line L1 representing an induced electromotive force that has generated the inductive noise in the image. The horizontal axis in FIG. 11C represents the X-axis coordinate of an image, and the vertical axis represents the magnitude of an induced electromotive force.

Hereinafter, the solid line L1 depicted in FIG. 11C is used for comparisons with results of simulations of inductive noise generated in cases in which configuration examples of the conductor layers A and B forming the light-blocking structure 151 are applied to the solid-state image pickup apparatus 100.

First Configuration Example

Figures 12A, 12B, 12C:
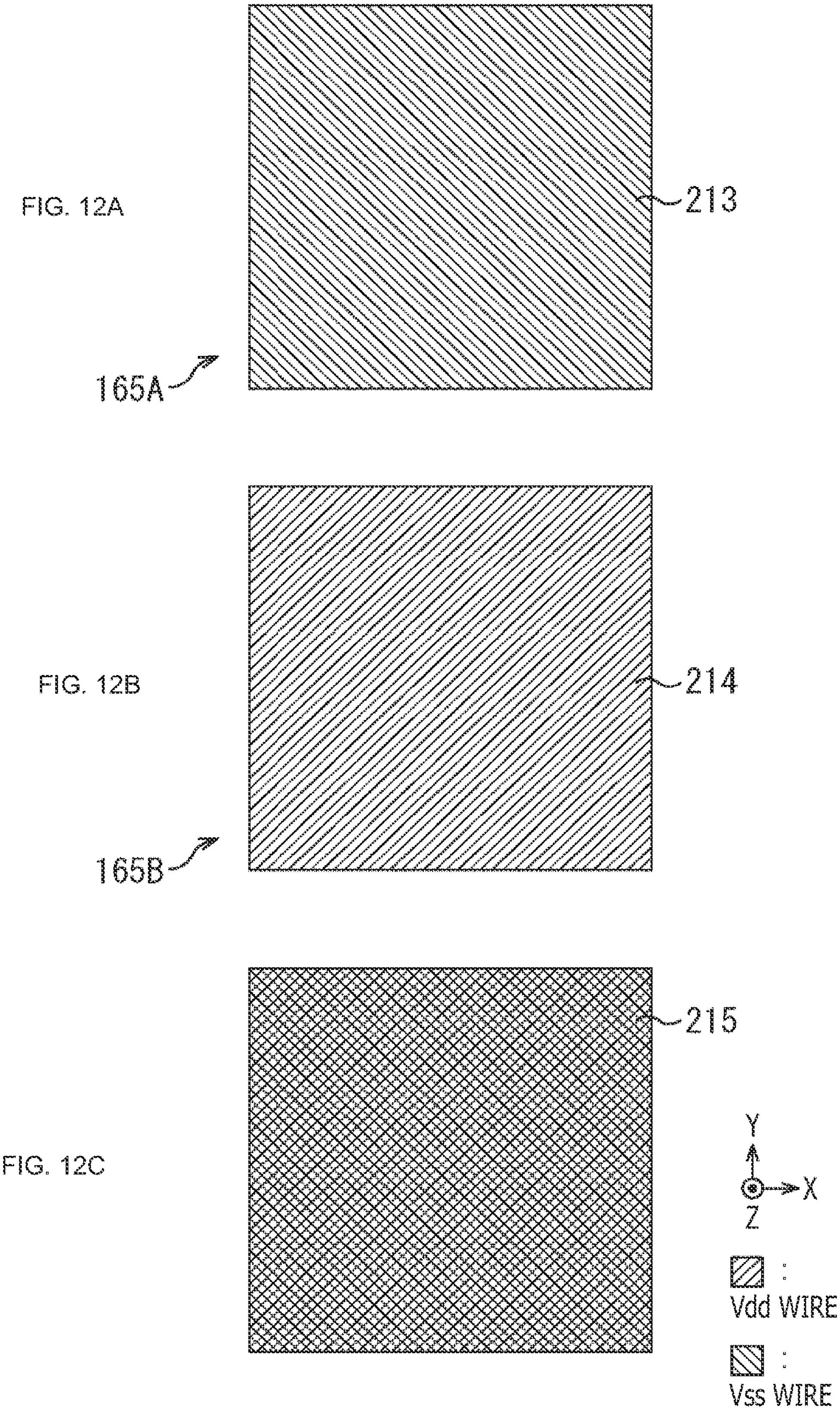
FIGS. 12A, 12B, and 12C are figures depicting a first configuration example of the conductor layers A and B.

FIGS. 12A, 12B, and 12C depict a first configuration example of the conductor layers A and B. Note that FIG. 12A depicts the conductor layer A, and FIG. 12B depicts the conductor layer B. In the coordinate system in FIGS. 12A, 12B, and 12C, the X axis lies in the lateral direction, the Y axis lies in the longitudinal direction, and the Z axis lies in a direction perpendicular to the XY plane.

The conductor layer A in the first configuration example includes a planar conductor 213. The planar conductor 213 is a wire (Vss wire) connected to GND or a negative power supply, for example.

The conductor layer B in the first comparative example includes a planar conductor 214. The planar conductor 214 is a wire (Vdd wire) connected to a positive power supply, for example.

Note that points to which the conductor layers A and B are connected may be switched such that the planar conductor 213 is a Vdd wire and the planar conductor 214 is a Vss wire. This similarly applies also to each configuration example explained later.

FIG. 12C depicts a state of the conductor layers A and B depicted in FIGS. 12A and 12B, respectively, as seen from the side where photodiodes 141 are located (the backside). It should be noted however that a hatched region 215 in which diagonal lines cross in FIG. 12C represents a region where the planar conductor 213 in the conductor layer A and the planar conductor 214 in the conductor layer B overlap. Accordingly, in the case of FIG. 12C, it is depicted that the planar conductor 213 in the conductor layer A and the planar conductor 214 in the conductor layer B overlap over the entire surfaces. Because the planar conductor 213 in the conductor layer A and the planar conductor 214 in the conductor layer B overlap over the entire surfaces in the case of the first configuration example, hot carrier light emissions from an active element group 167 can be blocked surely.

Figure 13:
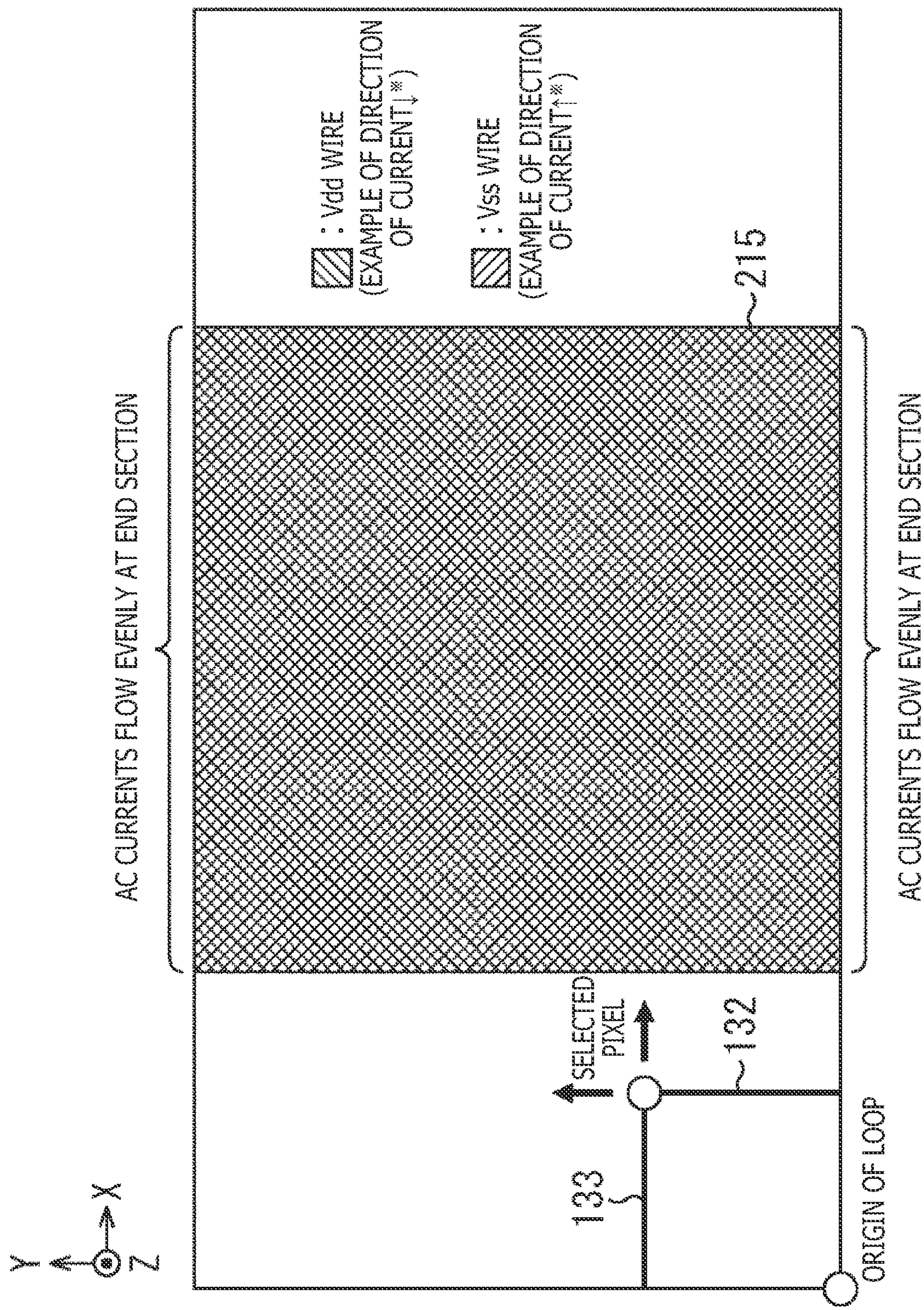
FIG. 13 is a figure depicting the condition of electric currents flowing in the first configuration example.

FIG. 13 is a figure depicting the condition of electric currents flowing in the first configuration example (FIGS. 12A, 12B, and 12C).

It is assumed that AC currents flow evenly at end sections of the planar conductor 213 included in the conductor layer A and of the planar conductor 214 included in the conductor layer B. It should be noted however that directions of electric currents change over time. For example, it is assumed that, when currents flow through the planar conductor 214, which is a Vdd wire, from the upper side to the lower side in the figure, currents flow through the planar conductor 213, which is a Vss wire, from the lower side to the upper side in the figure.

In a case in which currents flow as depicted in FIG. 13 in the first configuration example, magnetic flux substantially in the X direction and substantially in the Y direction occurs more easily between the planar conductor 213, which is a Vss wire, and the planar conductor 214, which is a Vdd wire, due to conductor loops that include (cross-sections of) the planar conductors 213 and 214 in cross-sections along which the planar conductors 213 and 214 are arranged and have loop planes that are almost perpendicular to the X axis, and conductor loops that include (cross-sections of) the planar conductors 213 and 214 in cross-sections along which the planar conductors 213 and 214 are arranged and have loop planes that are almost perpendicular to the Y axis.

On the other hand, in the pixel array 121 of the first semiconductor board 101 stacked on the second semiconductor board 102 in which the light-blocking structure 151 including the conductor layers A and B is formed, as depicted in FIG. 13, a Victim conductor loop including a signal line 132 and a control line 133 is formed on the XY plane. An induced electromotive force due to magnetic flux in the Z-axis direction is generated more easily in the Victim conductor loop formed on the XY plane. The larger a change of the induced electromotive force is, the worse an image output from the solid-state image pickup apparatus 100 is (the larger the inductive noise is).

Furthermore, if the effective dimensions of the Victim conductor loop including a signal line 132 and a control line 133 change as pixels at different positions are selected in the pixel array 121, changes of the induced electromotive force become noticeable.

In the case of the first configuration example, the directions of magnetic flux (substantially in the X direction and substantially in the Y direction) generated from the loop planes of the Aggressor conductor loops of the light-blocking structure 151 including the conductor layers A and B and the direction of magnetic flux (in the Z direction) that generates an induced electromotive force to the Victim conductor loop are substantially orthogonal and different by approximately 90 degrees. In other words, the direction of the loop planes that generate magnetic flux from the Aggressor conductor loops and the direction of the loop plane that generates an induced electromotive force to the Victim conductor loop are different by approximately 90 degrees. Accordingly, it is expected that a worsening (the occurrence of inductive noise) of an image output from the solid-state image pickup apparatus 100 is mitigated as compared with the case of the first comparative example.

Figures 14A, 14B, 14C:
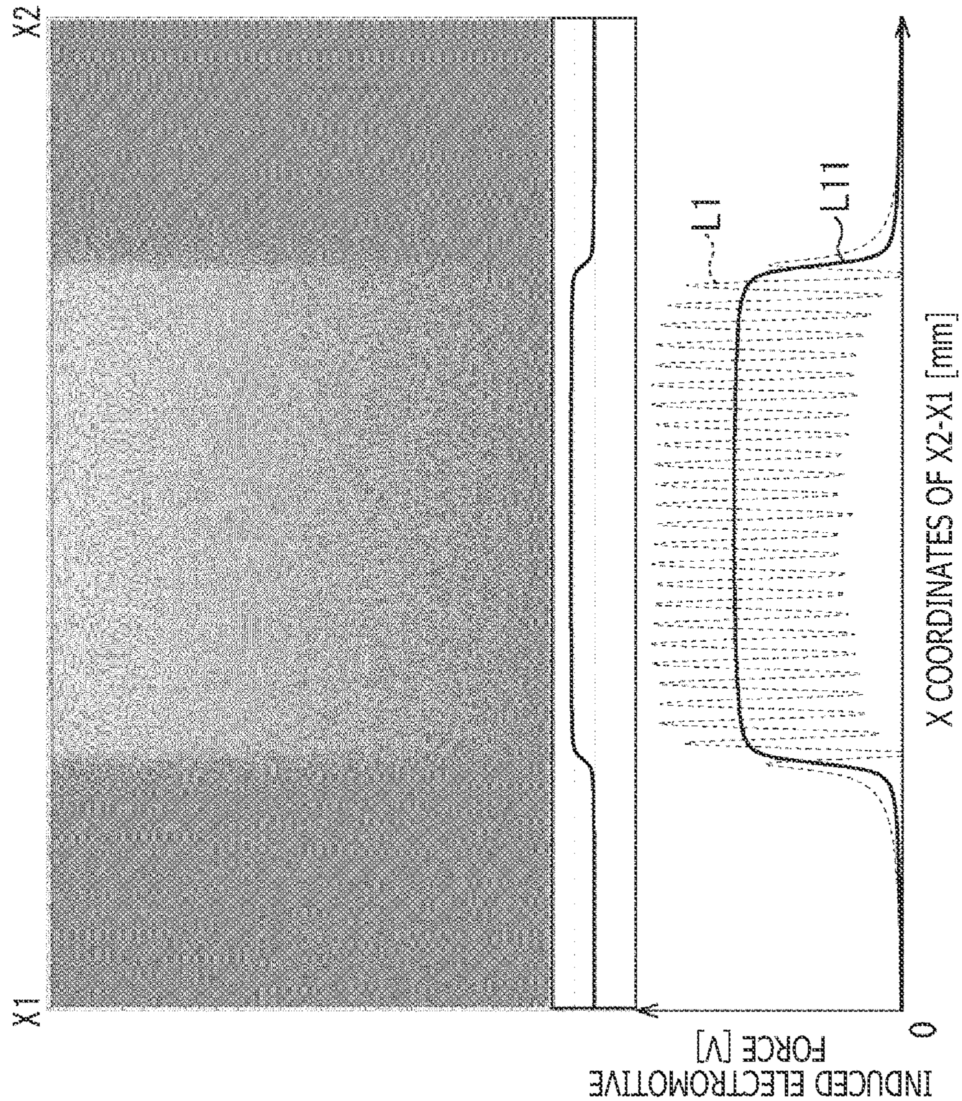
FIGS. 14A, 14B, and 14C are figures depicting a result of a simulation of inductive noise corresponding to the first configuration example.

FIGS. 14A, 14B, and 14C depict are a result of a simulation of inductive noise that occurs in a case in which the first configuration example (FIGS. 12A, 12B, and 12C) is applied to the solid-state image pickup apparatus 100.

FIG. 14A depicts an image that is output from the solid-state image pickup apparatus 100 and can have inductive noise generated therein. FIG. 14B depicts changes of pixel signals along a line segment X1-X2 in the image depicted in FIG. 14A. FIG. 14C depicts a solid line L11 representing an induced electromotive force that has generated the inductive noise in the image. The horizontal axis in FIG. 14C represents the X-axis coordinate of an image, and the vertical axis represents the magnitude of an induced electromotive force. Note that a dotted line L1 in FIG. 14C corresponds to the first comparative example (FIGS. 9A, 9B, and 9C).

As is apparent from a comparison between the solid line L11 and the dotted line L1 depicted in FIG. 14C, the first configuration example can suppress changes of the induced electromotive force generated to the Victim conductor loop as compared with the first comparative example. Therefore, the occurrence of the inductive noise in an image output from the solid-state image pickup apparatus 100 can be hindered.

Second Configuration Example

Figure 15A:
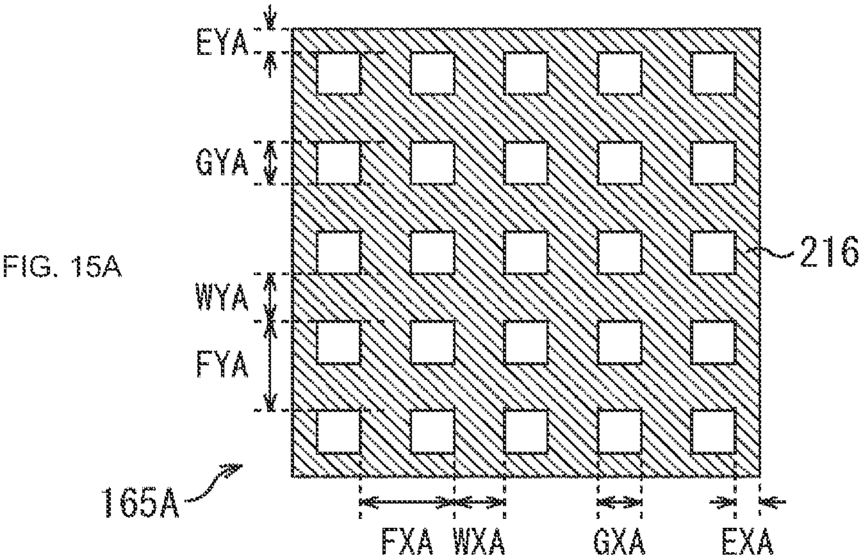
FIGS. 15A, 15B, and 15C are figures depicting a second configuration example of the conductor layers A and B.
Figure 15B:
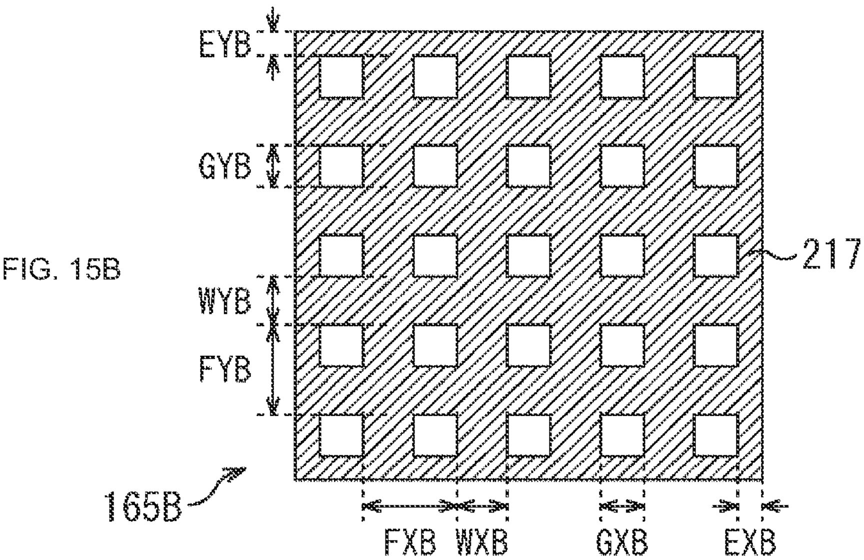
Figure 15C:
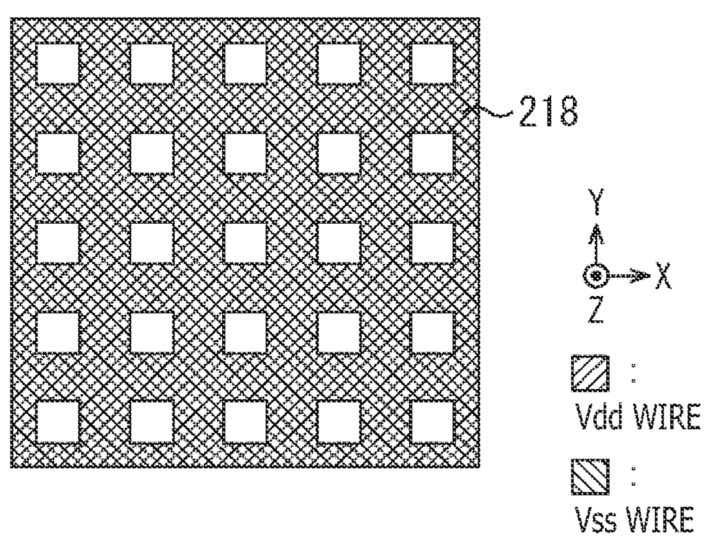

FIGS. 15A, 15B, and 15C depict a second configuration example of the conductor layers A and B. Note that FIG. 15A depicts the conductor layer A, and FIG. 15B depicts the conductor layer B. In the coordinate system in FIGS. 15A, 15B, and 15C, the X axis lies in the lateral direction, the Y axis lies in the longitudinal direction, and the Z axis lies in a direction perpendicular to the XY plane.

The conductor layer A in the second configuration example includes a mesh conductor 216. The X-direction conductor width of the mesh conductor 216 is designated as WXA, the X-direction gap width is designated as GXA, the X-direction conductor pitch is designated as FXA (=(conductor width WXA)+(gap width GXA)), and the X-direction end-section width is designated as EXA (=(conductor width WXA)/2). In addition, the Y-direction conductor width of the mesh conductor 216 is designated as WYA, the Y-direction gap width is designated as GYA, the Y-direction conductor pitch is designated as FYA (=(conductor width WYA)+(gap width GYA)), and the Y-direction end-section width is designated as EYA (=(conductor width WYA)/2). The mesh conductor 216 is a wire (Vss wire) connected to GND or a negative power supply, for example.

The conductor layer B in the second configuration example includes a mesh conductor 217. The X-direction conductor width of the mesh conductor 217 is designated as WXB, the X-direction gap width is designated as GXB, the X-direction conductor pitch is designated as FXB (=(conductor width WXB)+(gap width GXB)), and the X-direction end-section width is designated as EXB (=(conductor width WXB)/2). In addition, the Y-direction conductor width of the mesh conductor 217 is designated as WYB, the Y-direction gap width is designated as GYB, the Y-direction conductor pitch is designated as FYB (=(conductor width WYB)+(gap width GYB)), and the Y-direction end-section width is designated as EYB (=(conductor width WYB)/2). The mesh conductor 217 is a wire (Vdd wire) connected to a positive power supply, for example.

Note that the mesh conductor 216 and the mesh conductor 217 desirably satisfy the following relations.

(Conductor width $WXA$)=(conductor width $WYA$)=(conductor width $WXB$)=(conductor width $WYB$)

(Gap width $GXA$)=(gap width $GYA$)=(gap width $GXB$)=(gap width $GYB$)

(End-section width $EXA$)=(end-section width $EYA$)=(end-section width $EXB$)=(end-section width $EYB$)

(Conductor pitch $FXA$)=(conductor pitch $FYA$)=(conductor pitch $FXB$)=(conductor pitch $FYB$)

FIG. 15C depicts a state of the conductor layers A and B depicted in in FIGS. 15A and 15B, respectively, as seen from the side where photodiodes 141 are located (the backside). It should be noted however that a hatched region 218 in which diagonal lines cross in FIG. 15C represents a region where the mesh conductor 216 in the conductor layer A and the mesh conductor 217 in the conductor layer B overlap. Because gaps in the mesh conductor 216 forming the conductor layer A and gaps in the mesh conductor 217 forming the conductor layer B match in the case of the second configuration example, hot carrier light emissions from an active element group 167 cannot be blocked sufficiently. It should be noted however that, as mentioned below, the occurrence of inductive noise can be suppressed.

Figure 16:
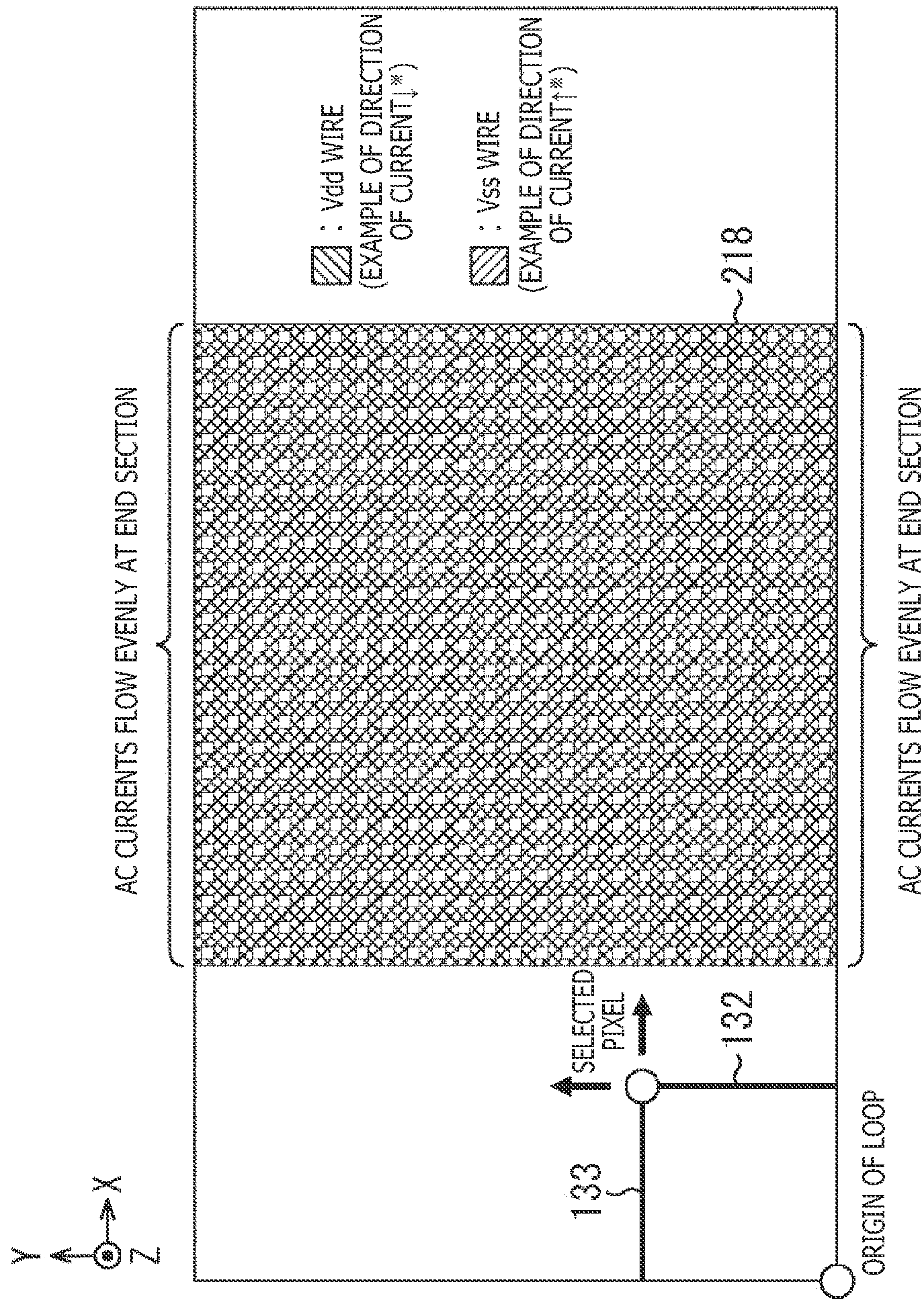
FIG. 16 is a figure depicting the condition of electric currents flowing in the second configuration example.

FIG. 16 is a figure depicting the condition of electric currents flowing in the second configuration example (FIGS. 15A, 15B, and 15C).

It is assumed that AC currents flow evenly at end sections of the mesh conductor 216 included in the conductor layer A and of the mesh conductor 217 included in the conductor layer B. It should be noted however that directions of electric currents change over time. For example, it is assumed that, when currents flow through the mesh conductor 217, which is a Vdd wire, from the upper side to the lower side in the figure, currents flow through the mesh conductor 216, which is a Vss wire, from the lower side to the upper side in the figure.

In a case in which currents flow as depicted in FIG. 16 in the second configuration example, magnetic flux substantially in the X direction and substantially in the Y direction occurs more easily between the mesh conductor 216, which is a Vss wire, and the mesh conductor 217, which is a Vdd wire, due to conductor loops that include (cross-sections of) the mesh conductors 216 and 217 in cross-sections along which the mesh conductors 216 and 217 are arranged and have loop planes that are almost perpendicular to the X axis, and conductor loops that include (cross-sections of) the mesh conductors 216 and 217 in cross-sections along which the mesh conductors 216 and 217 are arranged and have loop planes that are almost perpendicular to the Y axis.

On the other hand, in the pixel array 121 of the first semiconductor board 101 stacked on the second semiconductor board 102 in which the light-blocking structure 151 including the conductor layers A and B is formed, as depicted in FIG. 16, a Victim conductor loop including a signal line 132 and a control line 133 is formed on the XY plane. An induced electromotive force is generated in the Victim conductor loop formed on the XY plane more easily due to magnetic flux in the Z direction. The larger a change of the induced electromotive force is, the worse an image output from the solid-state image pickup apparatus 100 is (the larger the inductive noise is).

Furthermore, if the effective dimensions of the Victim conductor loop including a signal line 132 and a control line 133 change as pixels at different positions are selected in the pixel array 121, changes of the induced electromotive force become noticeable.

In the case of the second configuration example, the directions of magnetic flux (substantially in the X direction and substantially in the Y direction) generated from the loop planes of the Aggressor conductor loops of the light-blocking structure 151 including the conductor layers A and B and the direction of magnetic flux (in the Z direction) that generates an induced electromotive force to the Victim conductor loop are substantially orthogonal and different by approximately 90 degrees. In other words, the directions of the loop planes that generate magnetic flux from the Aggressor conductor loops and the direction of the loop plane that generates an induced electromotive force to the Victim conductor loop are different by approximately 90 degrees. Accordingly, it is expected that a worsening (the occurrence of inductive noise) of an image output from the solid-state image pickup apparatus 100 is mitigated as compared with the first comparative example.

Figures 17A, 17B, 17C:
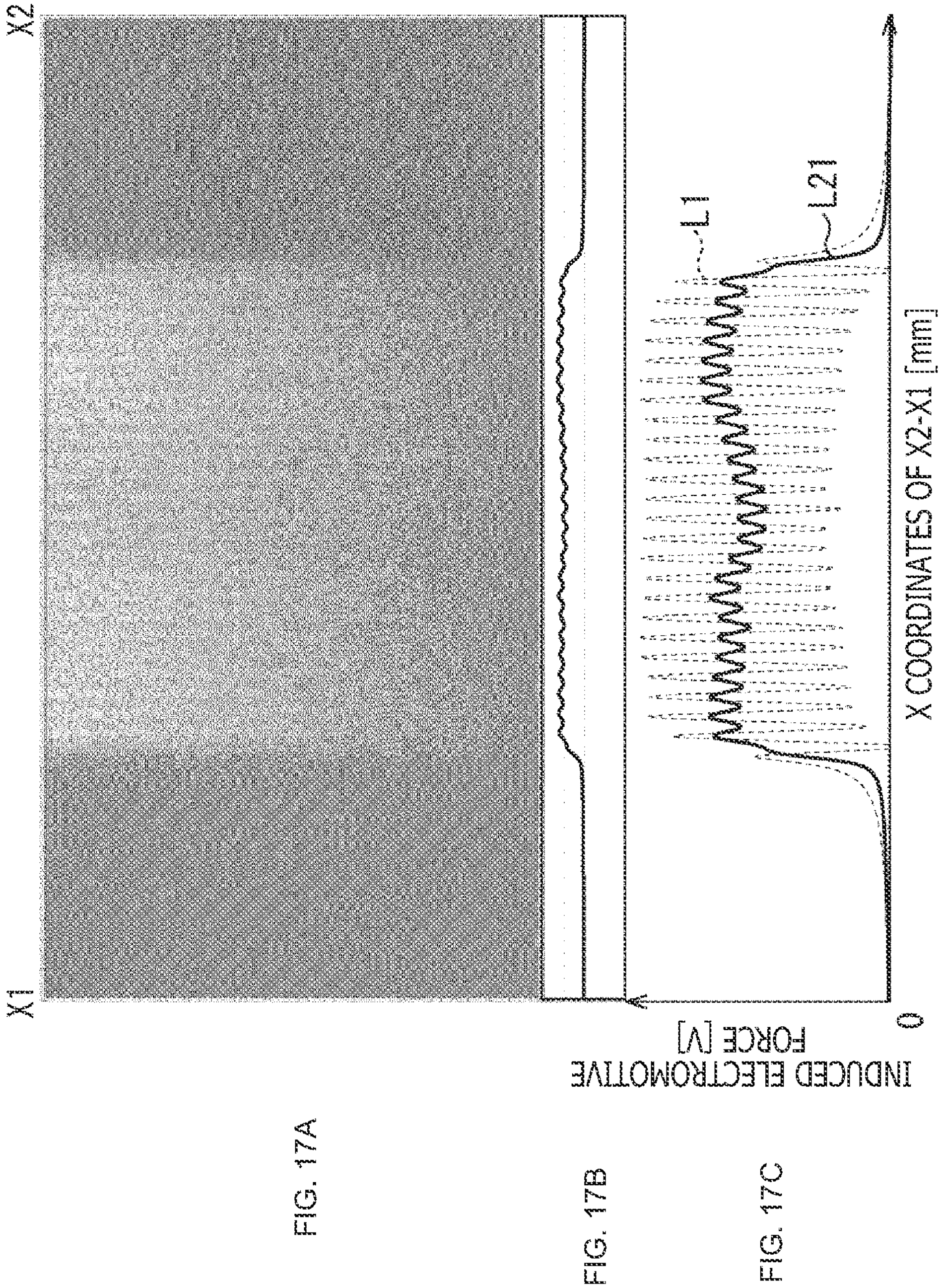
FIGS. 17A, 17B, and 17C are figures depicting a result of a simulation of inductive noise corresponding to the second configuration example.

FIGS. 17A, 17B, and 17C depict are a result of a simulation of inductive noise that occurs in a case in which the second configuration example (FIGS. 15A, 15B, and 15C) is applied to the solid-state image pickup apparatus 100.

FIG. 17A depicts an image that is output from the solid-state image pickup apparatus 100 and can have inductive noise generated therein. FIG. 17B depicts changes of pixel signals along a line segment X1-X2 in the image depicted in FIG. 17A. FIG. 17C depicts a solid line L21 representing an induced electromotive force that has generated the inductive noise in the image. The horizontal axis in FIG. 17C represents the X-axis coordinate of an image, and the vertical axis represents the magnitude of an induced electromotive force. Note that the dotted line L1 in FIG. 17C corresponds to the first comparative example (FIGS. 9A, 9B, and 9C).

As is apparent from a comparison between the solid line L21 and the dotted line L1 depicted in FIG. 17C, the second configuration example can suppress changes of the induced electromotive force generated to the Victim conductor loop as compared with the first comparative example. Therefore, the occurrence of the inductive noise in an image output from the solid-state image pickup apparatus 100 can be hindered.

SECOND COMPARATIVE EXAMPLE

In the second configuration example (FIGS. 15A, 15B, and 15C), the mesh conductor 216 forming the conductor layer A and the mesh conductor 217 forming the conductor layer B are configured to satisfy the relation, (conductor pitch FXA)=(conductor pitch FYA)-(conductor pitch FXB)=(conductor pitch FYB).

By making the X-direction conductor pitch FXA of the conductor layer A, the Y-direction conductor pitch FYA of the conductor layer A, the X-direction conductor pitch FXB of the conductor layer B, and the X-direction conductor pitch FYB of the conductor layer B equal to each other in this manner, the occurrence of inductive noise can be suppressed.

Figure 18A:
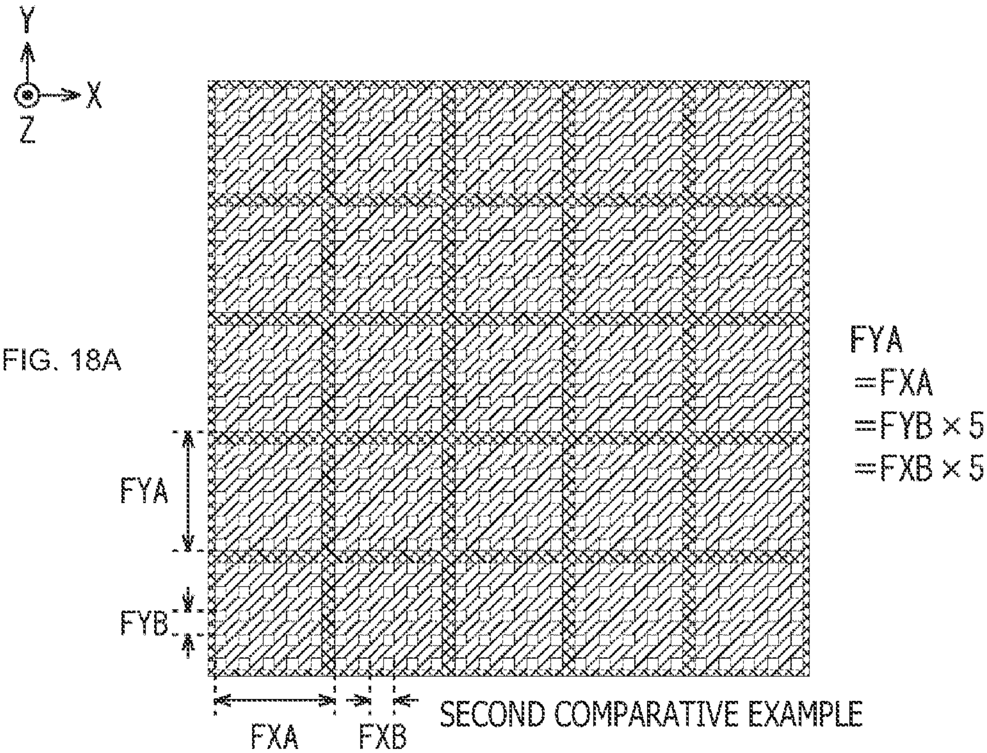
FIGS. 18A and 18B are figures depicting a second comparative example of the conductor layers A and B.
Figure 18B:
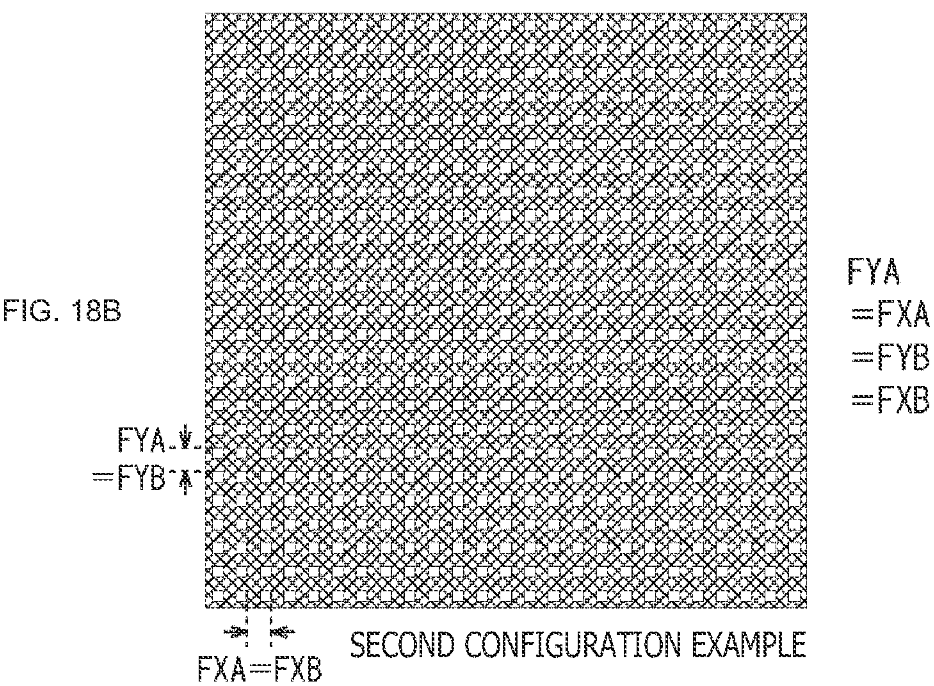
Figure 19:
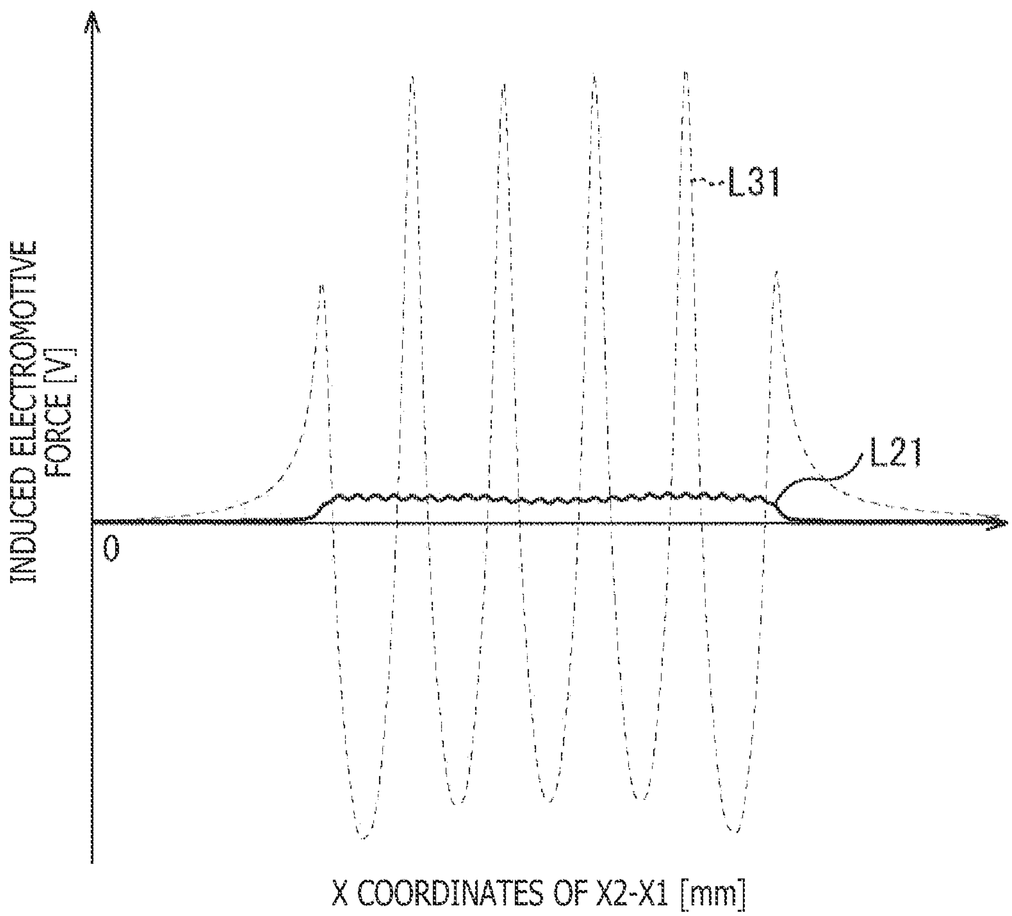
FIG. 19 is a figure depicting a result of a simulation of inductive noise corresponding to the second comparative example.

FIGS. 18A, 18B, and 19 are figures for explaining that the occurrence of inductive noise can be suppressed by making all the conductor pitches of the conductor layer A and the conductor layer B equal to each other.

FIG. 18A depicts a second comparative example obtained by modifying the second configuration example, for a comparison with the second configuration example depicted in FIGS. 15A, 15B, and 15C. In the second comparative example, the X-direction gap width GXA and the Y-direction gap width GYA of the mesh conductor 216 forming the conductor layer A in the second configuration example are widened, and the X-direction conductor pitch FXA and the Y-direction conductor pitch FYA are made 500% of those in the second configuration example. Note that it is assumed that the mesh conductor 217 forming the conductor layer B in the second comparative example is the same as that in the second configuration example.

FIG. 18B depicts the second configuration example depicted in FIG. 15C at the same magnification as that of FIG. 18A.

FIG. 19 depicts changes of induced electromotive forces that generate inductive noise in images, as results of simulations of the cases in which the second comparative example (FIG. 18A) and the second configuration example (FIG. 18B) are applied to the solid-state image pickup apparatus 100. Note that it is assumed that the condition of electric currents flowing in the second comparative example is similar to that in the case depicted in FIG. 16. The horizontal axis in FIG. 19 represents the X-axis coordinate of images, and the vertical axis represents the magnitudes of the induced electromotive forces.

The solid line L21 in FIG. 19 corresponds to the second configuration example, and a dotted line L31 corresponds to the second comparative example.

As is apparent from a comparison between the solid line L21 and the dotted line L31, it can be known that the second configuration example can suppress changes of the induced electromotive force generated to the Victim conductor loop and suppress inductive noise, as compared with the second comparative example.

Third Comparative Example

Meanwhile, the occurrence of inductive noise can be suppressed also in a case in which the conductor widths of the mesh conductor forming the conductor layer A in the second comparative example are widened.

Figure 20A:
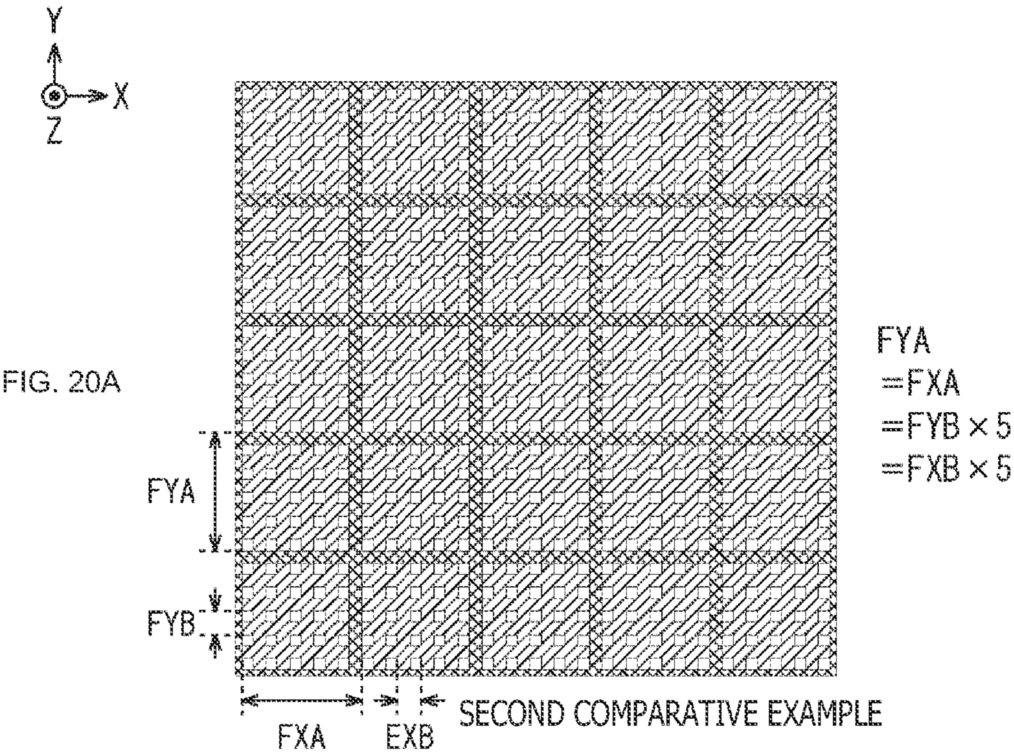
FIGS. 20A and 20B are figures depicting a third comparative example of the conductor layers A and B.
Figure 20B:
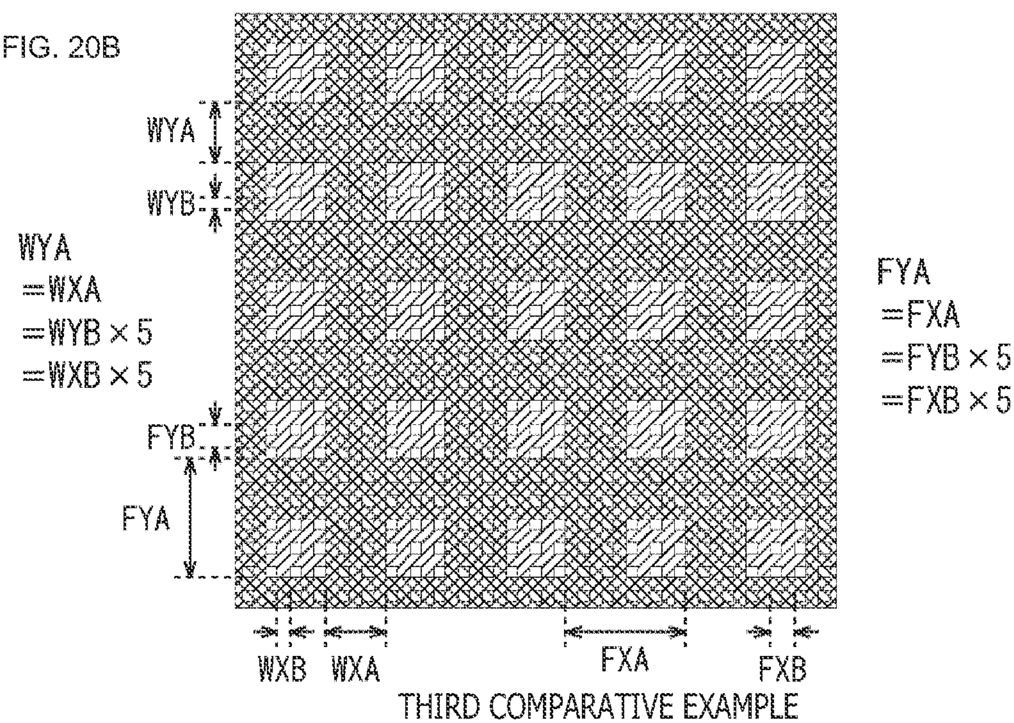
Figure 21:
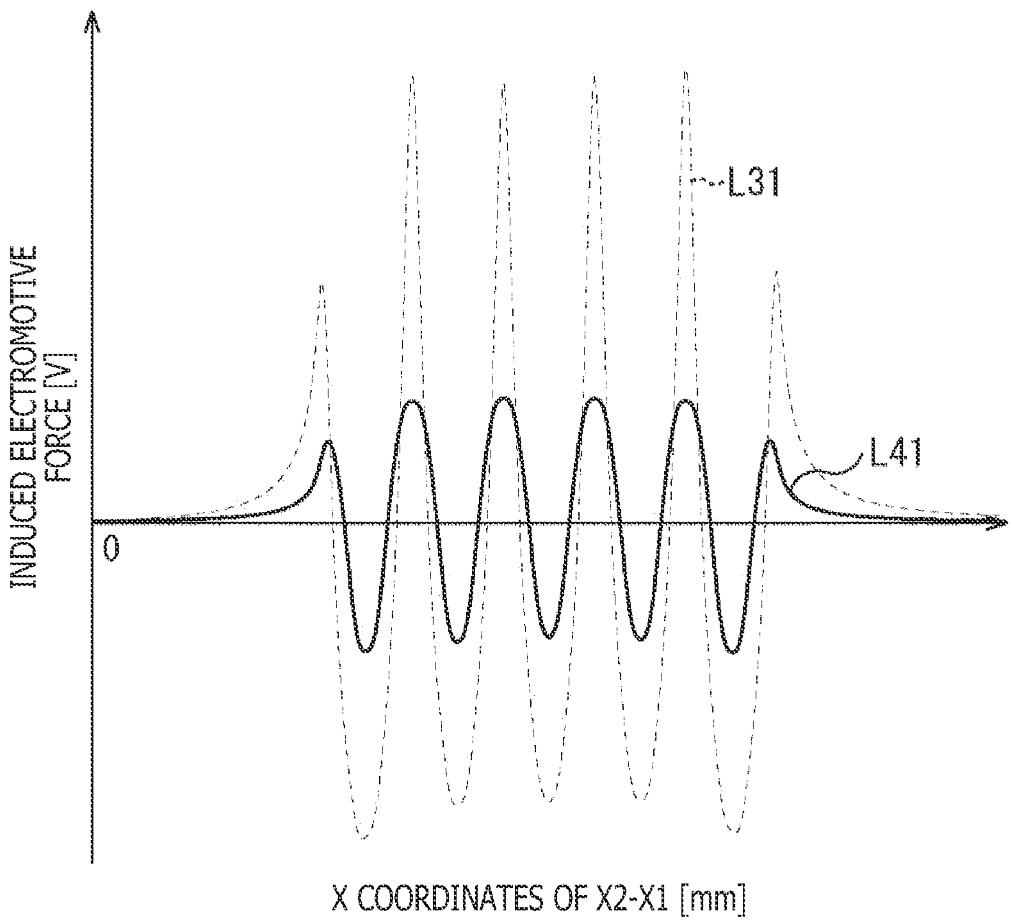
FIG. 21 is a figure depicting a result of a simulation of inductive noise corresponding to the third comparative example.

FIGS. 20A, 20B, and 21 are figures for explaining that the occurrence of inductive noise can be suppressed by widening the conductor widths of the mesh conductor forming the conductor layer A.

FIG. 20A is presented again to depict the second comparative example depicted in FIG. 18A.

FIG. 20B depicts a third comparative example obtained by modifying the second configuration example, for a comparison with the second comparative example. In the third comparative example, the X-direction and Y-direction conductor widths WXA and WYA of the mesh conductor 216 forming the conductor layer A in the second configuration example are widened and are 500% of those in the second configuration example. Note that it is assumed that the mesh conductor 217 forming the conductor layer B in the third comparative example is the same as that in the second configuration example.

FIG. 21 depicts changes of induced electromotive forces that generate inductive noise in images, as results of simulations of the cases in which the third comparative example and the second comparative example are applied to the solid-state image pickup apparatus 100. Note that it is assumed that the condition of electric currents flowing in the third comparative example is similar to that in the case depicted in FIG. 16. The horizontal axis in FIG. 21 represents the X-axis coordinate of images, and the vertical axis represents the magnitudes of the induced electromotive forces.

A solid line L41 in FIG. 21 corresponds to the third comparative example, and the dotted line L31 corresponds to the second comparative example.

As is apparent from a comparison between the solid line L41 and the dotted line L31, it can be known that the third comparative example can suppress changes of the induced electromotive force generated to the Victim conductor loop and suppress inductive noise, as compared with the second comparative example.

Third Configuration Example

Figure 22A:
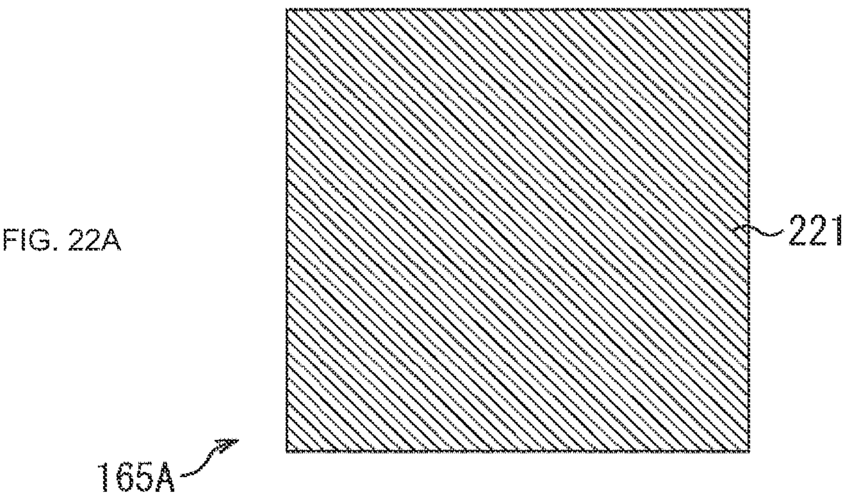
FIGS. 22A, 22B, and 22C are figures depicting a third configuration example of the conductor layers A and B.
Figure 22B:
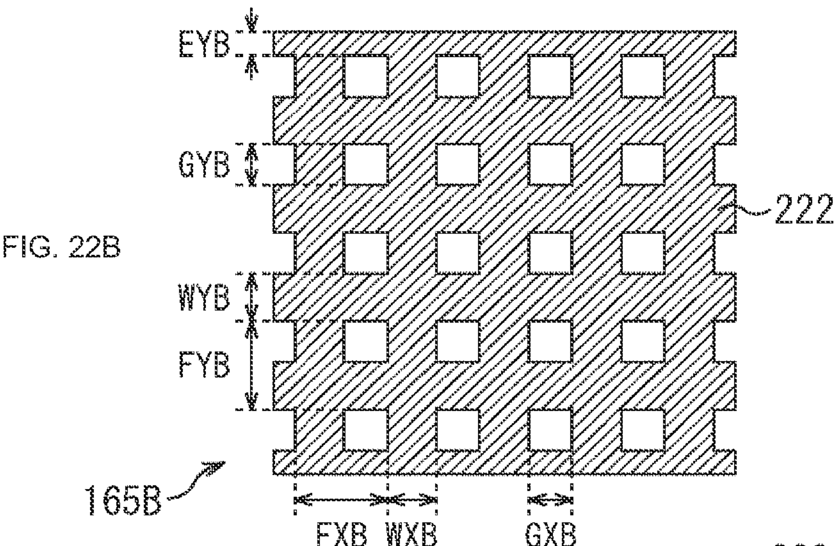
Figure 22C:
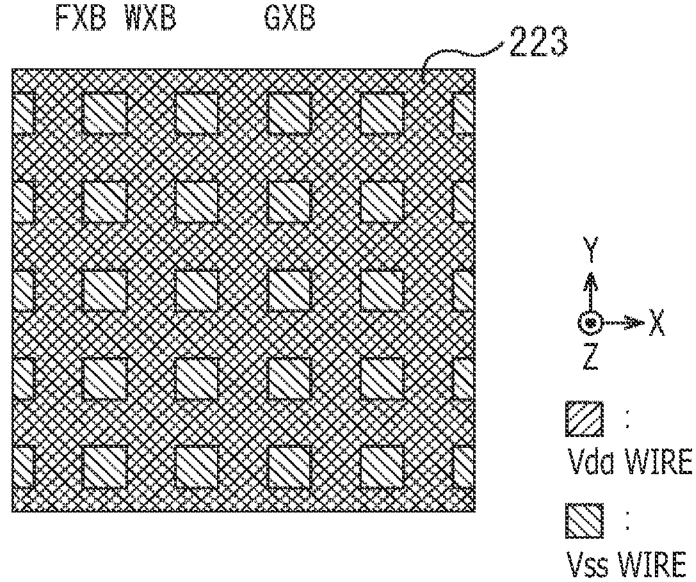

Next, FIGS. 22A, 22B, and 22C depict a third configuration example of the conductor layers A and B. Note that FIG. 22A depicts the conductor layer A, and FIG. 22B depicts the conductor layer B. In the coordinate system in FIGS. 22A, 22B, and 22C, the X axis lies in the lateral direction, the Y axis lies in the longitudinal direction, and the Z axis lies in a direction perpendicular to the XY plane.

The conductor layer A in the third configuration example includes a planar conductor 221. The planar conductor 221 is a wire (Vss wire) connected to GND or a negative power supply, for example.

The conductor layer B in the third configuration example includes a mesh conductor 222. The X-direction conductor width of the mesh conductor 222 is designated as WXB, the X-direction gap width is designated as GXB, the X-direction conductor pitch is designated as FXB (=(conductor width WXB)+(gap width GXB)). In addition, the Y-direction conductor width of the mesh conductor 222 is designated as WYB, the Y-direction gap width is designated as GYB, the Y-direction conductor pitch is designated as FYB (=(conductor width WYB)+(gap width GYB)), and the Y-direction end-section width is designated as EYB. The mesh conductor 222 is a wire (Vdd wire) connected to a positive power supply, for example.

Note that the mesh conductor 222 desirably satisfies the following relations.

$$(\text{Conductor width } WXB)=(\text{conductor width } WYB)$$

$$(\text{Gap width } GXB)=(\text{gap width } GYB)$$

$$(\text{End-section width } EYB)=(\text{conductor width } WYB)/2$$

$$(\text{Conductor pitch } FXB)=(\text{conductor pitch } FYB)$$

By making the conductor widths, the conductor pitches, and the gap widths equal to each other in the X direction and Y-direction as in the relations mentioned above, wire resistances and wire impedance of the mesh conductor 222 become uniform in the X direction and Y direction. Accordingly, the magnetic-field resistances and voltage drops can be made even magnetic-field resistances and even voltage drops in the X direction and Y-direction.

In addition, by making the end-section width EYB half of the conductor width WYB, it is possible to suppress an induced electromotive force generated to a Victim conductor loop as a result of a magnetic field occurring around end sections of the mesh conductor 222.

FIG. 22C depicts a state of the conductor layers A and B depicted in FIGS. 22A and 22B, respectively, as seen from the side where photodiodes 141 are located (the backside). It should be noted however that a hatched region 223 in which diagonal lines cross in FIG. 22C represents a region where the planar conductor 221 in the conductor layer A and the mesh conductor 222 in the conductor layer B overlap. Because an active element group 167 is covered with at least one of the conductor layer A or the conductor layer B in the case of the third configuration example, hot carrier light emissions from the active element group 167 can be blocked.

Figure 23:
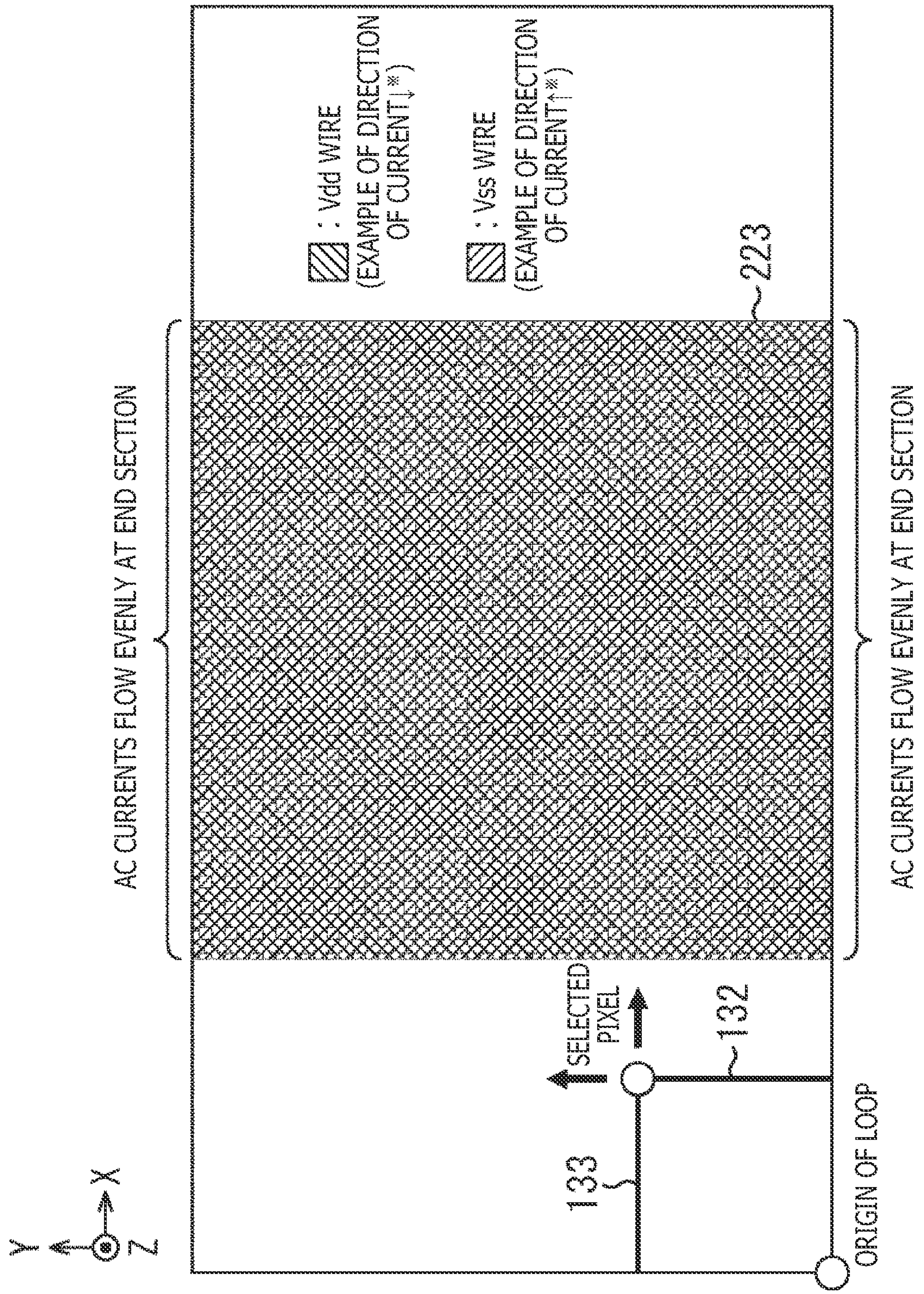
FIG. 23 is a figure depicting the condition of electric currents flowing in the third configuration example.

FIG. 23 is a figure depicting the condition of electric currents flowing in the third configuration example (FIGS. 22A, 22B, and 22C).

It is assumed that AC currents flow evenly at end sections of the planar conductor 221 included in the conductor layer A and of the mesh conductor 222 included in the conductor layer B. It should be noted however that directions of electric currents change over time. For example, it is assumed that, when currents flow through the mesh conductor 222, which is a Vdd wire, from the upper side to the lower side in the figure, currents flow through the planar conductor 221, which is a Vss wire, from the lower side to the upper side in the figure.

In a case in which currents flow as depicted in FIG. 23 in the third configuration example, magnetic flux substantially in the X direction and substantially in the Y direction occurs more easily between the planar conductor 221, which is a Vss wire, and the mesh conductor 222, which is a Vdd wire, due to conductor loops that include (cross-sections of) the planar conductor 221 and the mesh conductor 222 in cross-sections along which the planar conductors 221 and the mesh conductor 222 are arranged and have loop planes that are almost perpendicular to the X axis, and conductor loops that include (cross-sections of) the planar conductor 221 and the mesh conductor 222 in cross-sections along which the planar conductors 221 and the mesh conductor 222 are arranged and have loop planes that are almost perpendicular to the Y axis.

On the other hand, in the pixel array 121 of the first semiconductor board 101 stacked on the second semiconductor board 102 in which the light-blocking structure 151 including the conductor layers A and B is formed, a Victim conductor loop including a signal line 132 and a control line 133 is formed on the XY plane. An induced electromotive force is generated in the Victim conductor loop formed on the XY plane more easily due to magnetic flux in the Z direction. The larger a change of the induced electromotive force is, the worse an image output from the solid-state image pickup apparatus 100 is (the larger the inductive noise is).

Furthermore, if the effective dimensions of the Victim conductor loop including a signal line 132 and a control line 133 change as pixels at different positions are selected in the pixel array 121, changes of the induced electromotive force become noticeable.

In the case of the third configuration example, the directions of magnetic flux (substantially in the X direction and substantially in the Y direction) generated from the loop planes of the Aggressor conductor loops of the light-blocking structure 151 including the conductor layers A and B and the direction of magnetic flux (in the Z direction) that generates an induced electromotive force to the Victim conductor loop are substantially orthogonal and different by approximately 90 degrees. In other words, the directions of the loop planes that generate magnetic flux from the Aggressor conductor loops and the direction of the loop plane that generates an induced electromotive force to the Victim conductor loop are different by approximately 90 degrees. Accordingly, it is expected that a worsening (the occurrence of inductive noise) of an image output from the solid-state image pickup apparatus 100 is mitigated as compared with the first comparative example.

Figures 24A, 24B, 24C:
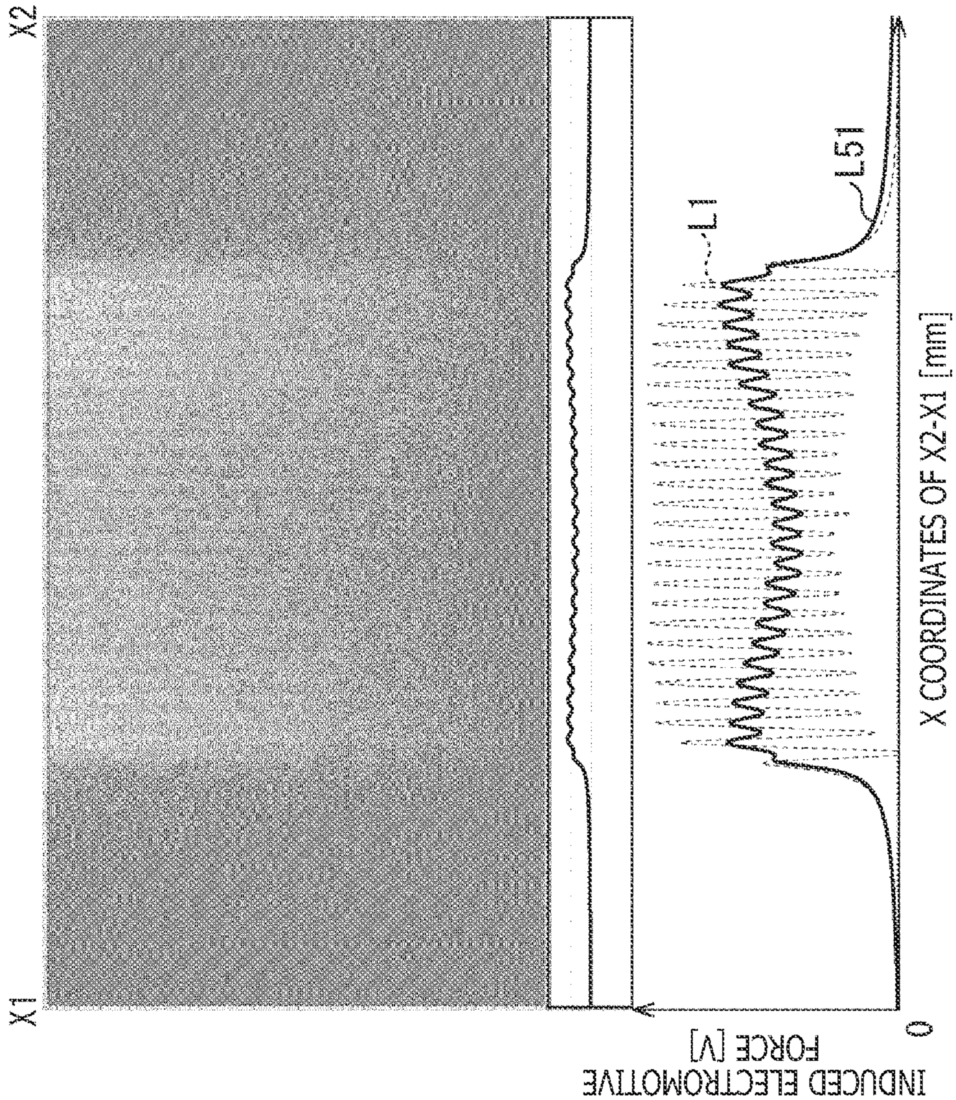
FIGS. 24A, 24B, and 24C are figures depicting a result of a simulation of inductive noise corresponding to the third configuration example.

FIGS. 24A, 24B, and 24C depict a result of a simulation of inductive noise that occurs in a case in which the third configuration example (FIGS. 22A, 22B, and 22C) is applied to the solid-state image pickup apparatus 100.

FIG. 24A depicts an image that is output from the solid-state image pickup apparatus 100 and can have inductive noise generated therein. FIG. 24B depicts changes of pixel signals along a line segment X1-X2 in the image depicted in FIG. 24A. FIG. 24C depicts a solid line L51 representing an induced electromotive force that has generated the inductive noise in the image. The horizontal axis in FIG. 24C represents the X-axis coordinate of an image, and the vertical axis represents the magnitude of an induced electromotive force. Note that the dotted line L1 in FIG. 24C corresponds to the first comparative example (FIGS. 9A, 9B, and 9C).

As is apparent from a comparison between the solid line L51 and the dotted line L1 depicted in FIG. 24C, the third configuration example can suppress changes of the induced electromotive force generated to the Victim conductor loop as compared with the first comparative example. Therefore, the occurrence of the inductive noise in an image output from the solid-state image pickup apparatus 100 can be hindered.

Fourth Configuration Example

Figure 25A:
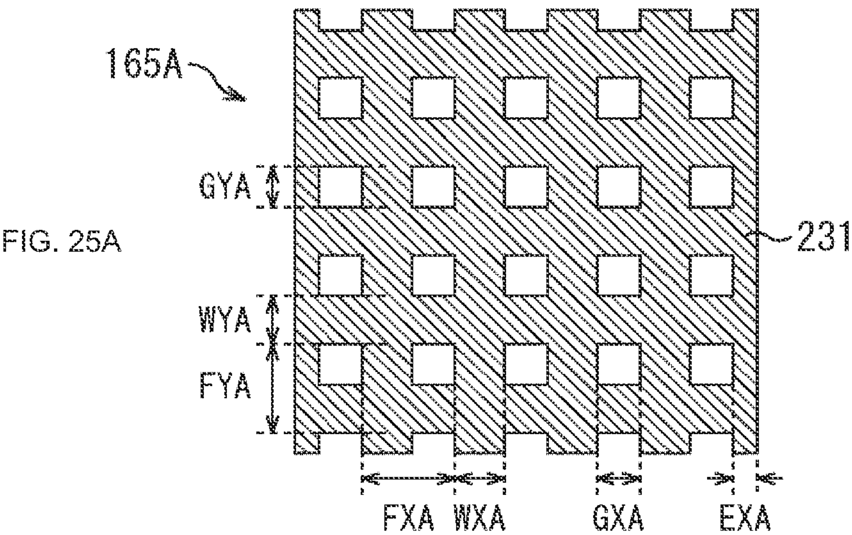
FIGS. 25A, 25B, and 25C are figures depicting a fourth configuration example of the conductor layers A and B.
Figure 25B:
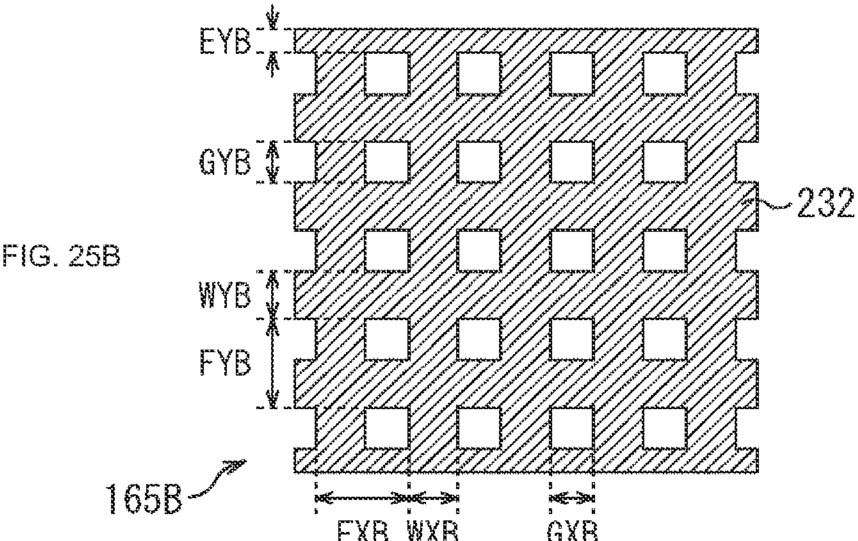
Figure 25C:
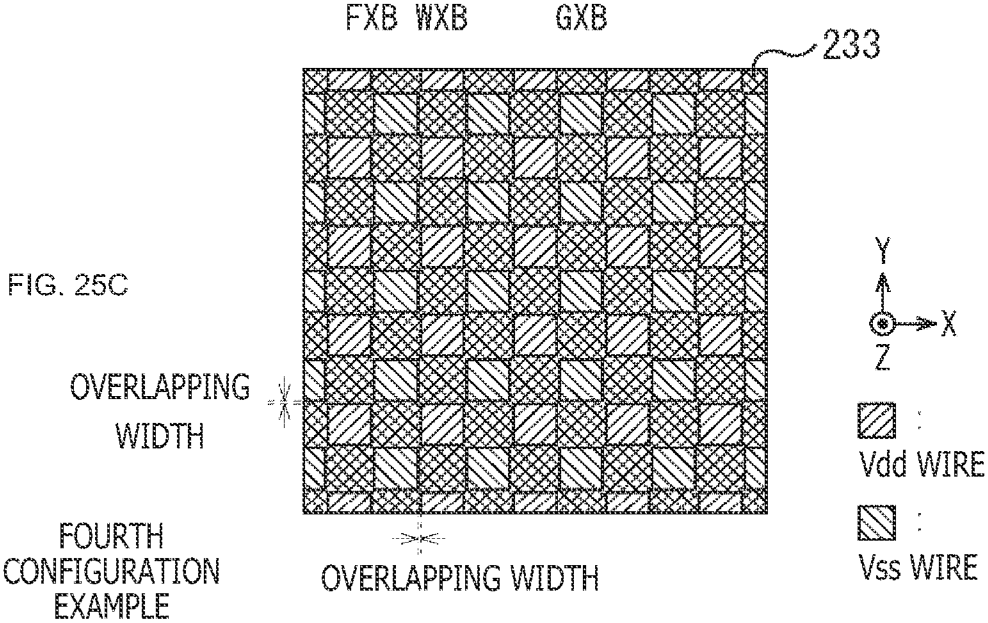

Next, FIGS. 25A, 25B, and 25C depict a fourth configuration example of the conductor layers A and B. Note that FIG. 25A depicts the conductor layer A, and FIG. 25B depicts the conductor layer B. In the coordinate system in FIGS. 25A, 25B, and 25C, the X axis lies in the lateral direction, the Y axis lies in the longitudinal direction, and the Z axis lies in a direction perpendicular to the XY plane.

The conductor layer A in the fourth configuration example includes a mesh conductor 231. The X-direction conductor width of the mesh conductor 231 is designated as WXA, the X-direction gap width is designated as GXA, the X-direction conductor pitch is designated as FXA (=(conductor width WXA)+(gap width GXA)), and the X-direction end-section width is designated as EXA (=(conductor width WXA)/2). In addition, the Y-direction conductor width of the mesh conductor 231 is designated as WYA, the Y-direction gap width is designated as GYA, and the Y-direction conductor pitch is designated as FYA (=(conductor width WYA)+(gap width GYA)). The mesh conductor 231 is a wire (Vss wire) connected to GND or a negative power supply, for example.

The conductor layer B in the fourth configuration example includes a mesh conductor 232. The X-direction conductor width of the mesh conductor 232 is designated as WXB, the X-direction gap width is designated as GXB, the X-direction conductor pitch is designated as FXB (=(conductor width WXB)+(gap width GXB)). In addition, the Y-direction conductor width of the mesh conductor 232 is designated as WYB, the Y-direction gap width is designated as GYB, the Y-direction conductor pitch is designated as FYB (=(conductor width WYB)+(gap width GYB)), and the Y-direction end-section width is designated as EYB (=(conductor width WYB)/2). The mesh conductor 232 is a wire (Vdd wire) connected to a positive power supply, for example.

Note that the mesh conductor 231 and the mesh conductor 232 desirably satisfy the following relations.

(Conductor width $WXA$)=(conductor width $WYA$)=(conductor width $WXB$)=(conductor width $WYB$)

(Gap width $GXA$)=(gap width $GYA$)=(gap width $GXB$)=(gap width $GYB$)

(End-section width $EXA$)=(end-section width $EYB$)

(Conductor pitch $FXA$)=(conductor pitch $FYA$)=(conductor pitch $FXB$)=(conductor pitch $FYB$)

(Conductor width $WYA$)=2×(overlapping width)+(gap width $GYA$), (conductor width $WXA$)=2×(overlapping width)+(gap width $GXA$)

(Conductor width $WYB$)=2×(overlapping width)+(gap width $GYB$), (conductor width $WXB$)=2×(overlapping width)+(gap width $GXB$)

Here, the overlapping width is the width of an overlapping section at which conductor sections overlap in a case in which the mesh conductor 231 in the conductor layer A and the mesh conductor 232 in the conductor layer B are arranged to overlap each other.

By making all the X-direction and Y-direction conductor pitches of the mesh conductor 231 and the mesh conductor 232 equal to each other as in the relations mentioned above, the current distribution in the mesh conductor 231 and the current distribution in the mesh conductor 232 can be made substantially even distributions and can be caused to have mutually reverse characteristics. Accordingly, the magnetic field generated by the current distribution in the mesh conductor 231 and the magnetic field generated by the current distribution in the mesh conductor 232 can be offset effectively.

In addition, by making all the X-direction and Y-direction conductor pitches, conductor widths, and gap widths of the mesh conductor 231 and the mesh conductor 232 equal to each other, wire resistances and wire impedance of the mesh conductor 231 and the mesh conductor 232 become uniform in the X direction and the Y direction. Accordingly, the magnetic-field resistances and voltage drops can be made even magnetic-field resistances and even voltage drops in the X direction and Y-direction.

In addition, by making the end-section width EXA of the mesh conductor 231 half of the conductor width WXA, it is possible to suppress an induced electromotive force generated to a Victim conductor loop as a result of a magnetic field occurring around end sections of the mesh conductor 231. In addition, by making the end-section width EYB of the mesh conductor 232 half of the conductor width WYB, it is possible to suppress an induced electromotive force generated to a Victim conductor loop as a result of a magnetic field occurring around end sections of the mesh conductor 231.

Note that, instead of providing end sections in the X direction of the mesh conductor 231 in the conductor layer A, end sections in the X direction of the mesh conductor 232 in the conductor layer B may be provided. In addition, instead of providing end sections in the Y direction of the mesh conductor 232 in the conductor layer B, end sections in the Y direction of the mesh conductor 231 in the conductor layer A may be provided.

FIG. 25C depicts a state of the conductor layers A and B depicted in FIGS. 25A and 25B, respectively, as seen from the side where photodiodes 141 are located (the backside). It should be noted however that hatched regions 233 in which diagonal lines cross in FIG. 25C represent regions where the mesh conductor 231 in the conductor layer A and the mesh conductor 232 in the conductor layer B overlap. Because an active element group 167 is covered with at least one of the conductor layer A or the conductor layer B in the case of the fourth configuration example, hot carrier light emissions from the active element group 167 can be blocked.

It should be noted however that, in order to block hot carrier light emissions completely by the mesh conductor 231 in the conductor layer A and the mesh conductor 232 in the conductor layer B, the following relations need to be satisfied.

(Conductor width *WYA*)≥(gap width *GYA*)

(Conductor width *WXA*)≥(gap width *GXA*)

(Conductor width *WYB*)≥(gap width *GYB*)

(Conductor width *WXB*)≥(gap width *GXB*)

In this case, the following relations are satisfied.

(Conductor width *WYA*)=2×(overlapping width)+(gap width *GYA*)

(Conductor width *WXA*)=2×(overlapping width)+(gap width *GXA*)

(Conductor width *WYB*)=2×(overlapping width)+(gap width *GYB*)

(Conductor width *WXB*)=2×(overlapping width)+(gap width *GXB*)

In a case in which currents flow similarly to the case depicted in FIG. 23 in the fourth configuration example, magnetic flux substantially in the X direction and substantially in the Y direction occurs more easily between the mesh conductor 231, which is a Vss wire, and the mesh conductor 232, which is a Vdd wire, due to conductor loops that include (cross-sections of) the mesh conductors 231 and 232 in cross-sections along which the mesh conductors 231 and 232 are arranged and have loop planes that are almost perpendicular to the X axis, and conductor loops that include (cross-sections of) the mesh conductors 231 and 232 in cross-sections along which the mesh conductors 231 and 232 are arranged and have loop planes that are almost perpendicular to the Y axis.

Fifth Configuration Example

Figure 26A:
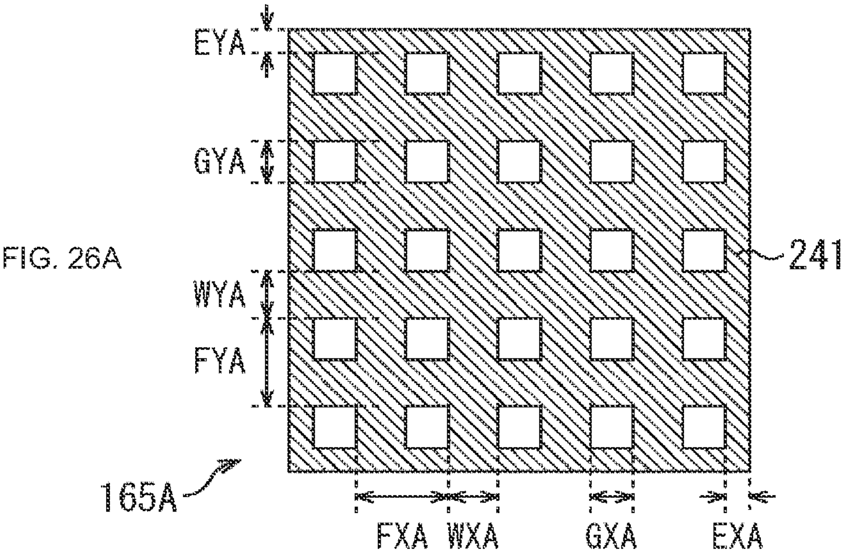
FIGS. 26A, 26B, and 26C are figures depicting a fifth configuration example of the conductor layers A and B.
Figure 26B:
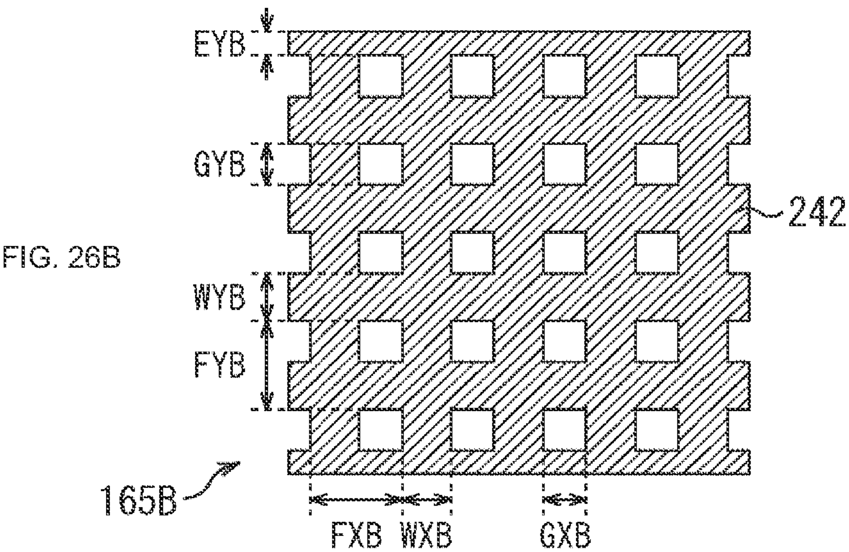
Figure 26C:
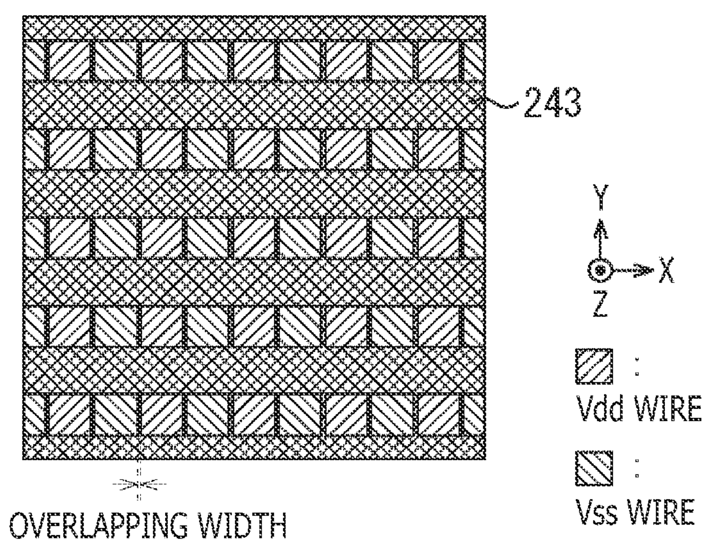

Next, FIGS. 26A, 26B, and 26C depict a fifth configuration example of the conductor layers A and B. Note that FIG. 26A depicts the conductor layer A, and FIG. 26B depicts the conductor layer B. In the coordinate system in FIGS. 26A, 26B, and 26C, the X axis lies in the lateral direction, the Y axis lies in the longitudinal direction, and the Z axis lies in a direction perpendicular to the XY plane.

The conductor layer A in the fifth configuration example includes a mesh conductor 241. The mesh conductor 241 is obtained by shifting the mesh conductor 231 forming the conductor layer A in the fourth configuration example (FIGS. 25A, 25B, and 25C) by (conductor pitch FYA)/2 in the Y direction. The mesh conductor 241 is a wire (Vss wire) connected to GND or a negative power supply, for example.

The conductor layer B in the fifth configuration example includes a mesh conductor 242. The mesh conductor 242 has a shape similar to that of the mesh conductor 232 forming the conductor layer B in the fourth configuration example (FIGS. 25A, 25B, and 25C), and so an explanation thereof is omitted. The mesh conductor 242 is a wire (Vdd wire) connected to a positive power supply, for example.

Note that the mesh conductor 241 and the mesh conductor 242 desirably satisfy the following relations.

(Conductor width *WXA*)=(conductor width *WYA*)=(conductor width *WXB*)=(conductor width *WYB*)

(Gap width *GXA*)=(gap width *GYA*)=(gap width *GXB*)=(gap width *GYB*)

(End-section width *EXA*)=(end-section width *EYB*)

(Conductor pitch *FXA*)=(conductor pitch *FYA*)=(conductor pitch *FXB*)=(conductor pitch *FYB*)

(Conductor width *WYA*)=2×(overlapping width)+(gap width *GYA*), (conductor width *WXA*)=2×(overlapping width)+(gap width *GXA*)

(Conductor width *WYB*)=2×(overlapping width)+(gap width *GYB*), (conductor width *WXB*)=2×(overlapping width)+(gap width *GXB*)

Here, the overlapping width is the width of an overlapping section at which conductor sections overlap in a case in which the mesh conductor 241 in the conductor layer A and the mesh conductor 242 in the conductor layer B are arranged to overlap each other.

FIG. 26C depicts a state of the conductor layers A and B depicted in FIGS. 26A and 26B, respectively, as seen from the side where photodiodes 141 are located (the backside). It should be noted however that hatched regions 243 in which diagonal lines cross in FIG. 26C represent regions where the mesh conductor 241 in the conductor layer A and the mesh conductor 242 in the conductor layer B overlap. Because an active element group 167 is covered with at least one of the conductor layer A or the conductor layer B in the case of the fifth configuration example, hot carrier light emissions from the active element group 167 can be blocked.

In addition, in the case of the fifth configuration example, the regions 243 where the mesh conductor 241 and the mesh conductor 242 overlap are continuous in the X direction. Because currents with mutually different polarities flow through the mesh conductor 241 and the mesh conductor 242 in the regions 243 where the mesh conductor 241 and the mesh conductor 242 overlap, magnetic fields generated from the regions 243 are cancelled out with each other. Therefore, the occurrence of inductive noise near the regions 243 can be suppressed.

In a case in which currents flow similarly to the case depicted in FIG. 23 in the fifth configuration example, magnetic flux substantially in the X direction and substantially in the Y direction occurs more easily between the mesh conductor 241, which is a Vss wire, and the mesh conductor 242, which is a Vdd wire, due to conductor loops that include (cross-sections of) the mesh conductors 241 and 242 in cross-sections along which the mesh conductors 241 and 242 are arranged and have loop planes that are almost perpendicular to the X axis, and conductor loops that include (cross-sections of) the mesh conductors 241 and 242 in cross-sections along which the mesh conductors 241 and 242 are arranged and have loop planes that are almost perpendicular to the Y axis.

Sixth Configuration Example

Figures 27A, 27B, 27C:
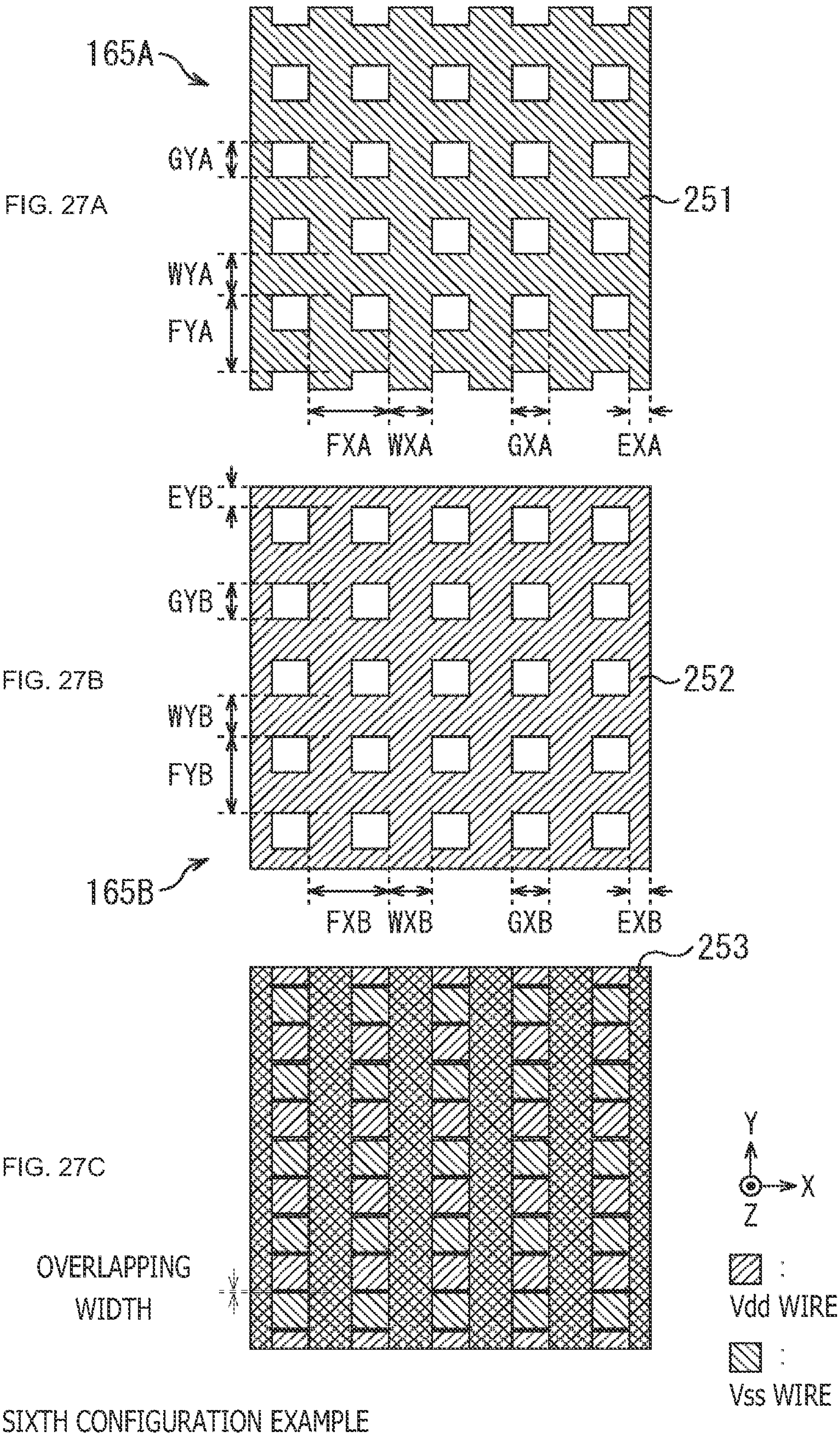
FIGS. 27A, 27B, and 27C are figures depicting a sixth configuration example of the conductor layers A and B.

Next, FIGS. 27A, 27B, and 27C depict a sixth configuration example of the conductor layers A and B. Note that FIG. 27A depicts the conductor layer A, and FIG. 27B depicts the conductor layer B. In the coordinate system in FIGS. 27A, 27B, and 27C, the X axis lies in the lateral direction, the Y axis lies in the longitudinal direction, and the Z axis lies in a direction perpendicular to the XY plane.

The conductor layer A in the sixth configuration example includes a mesh conductor 251. The mesh conductor 251 has a shape similar to that of the mesh conductor 231 forming the conductor layer A in the fourth configuration example (FIG. 25), and so an explanation thereof is omitted. The mesh conductor 251 is a wire (Vss wire) connected to GND or a negative power supply, for example.

The conductor layer B in the sixth configuration example includes a mesh conductor 252. The mesh conductor 252 is obtained by shifting the mesh conductor 232 forming the conductor layer B in the fourth configuration example (FIGS. 25A, 25B, and 25C) by (conductor pitch FXB)/2 in the X direction. The mesh conductor 252 is a wire (Vdd wire) connected to a positive power supply, for example.

Note that the mesh conductor 251 and the mesh conductor 252 desirably satisfy the following relations.

(Conductor width $WXA$)=(conductor width $WYA$)=(conductor width $WXB$)=(conductor width $WYB$)

(Gap width $GXA$)=(gap width $GYA$)=(gap width $GXB$)=(gap width $GYB$)

(End-section width $EXA$)=(end-section width $EYB$)

(Conductor pitch $FXA$)=(conductor pitch $FYA$)=(conductor pitch $FXB$)=(conductor pitch $FYB$)

(Conductor width $WYA$)=2×(overlapping width)+(gap width $GYA$), (conductor width $WXA$)=2×(overlapping width)+(gap width $GXA$)

(Conductor width $WYB$)=2×(overlapping width)+(gap width $GYB$), (conductor width $WXB$)=2×(overlapping width)+(gap width $GXB$)

Here, the overlapping width is the width of an overlapping section at which conductor sections overlap in a case in which the mesh conductor 251 in the conductor layer A and the mesh conductor 252 in the conductor layer B are arranged to overlap each other.

FIG. 27C depicts a state of the conductor layers A and B depicted in in FIGS. 27A and 27B, respectively, as seen from the side where photodiodes 141 are located (the backside). It should be noted however that hatched regions 253 in which diagonal lines cross in FIG. 27C represent regions where the mesh conductor 251 in the conductor layer A and the mesh conductor 252 in the conductor layer B overlap. Because an active element group 167 is covered with at least one of the conductor layer A or the conductor layer B in the case of the sixth configuration example, hot carrier light emissions from the active element group 167 can be blocked.

In a case in which currents flow similarly to the case depicted in FIG. 23 in the sixth configuration example, magnetic flux substantially in the X direction and substantially in the Y direction occurs more easily between the mesh conductor 251, which is a Vss wire, and the mesh conductor 252, which is a Vdd wire, due to conductor loops that include (cross-sections of) the mesh conductors 251 and 252 in cross-sections along which the mesh conductors 251 and 252 are arranged and have loop planes that are almost perpendicular to the X axis, and conductor loops that include (cross-sections of) the mesh conductors 251 and 252 in cross-sections along which the mesh conductors 251 and 252 are arranged and have loop planes that are almost perpendicular to the Y axis.

Furthermore, in the case of the sixth configuration example, the regions 253 where the mesh conductor 251 and the mesh conductor 252 overlap are continuous in the Y direction. Because currents with mutually different polarities flow through the mesh conductor 251 and the mesh conductor 252 in the regions 253 where the mesh conductor 251 and the mesh conductor 252 overlap, magnetic fields generated from the regions 253 are cancelled out with each other. Therefore, the occurrence of inductive noise near the regions 253 can be suppressed.

<Results of Simulations of Fourth to Sixth Configuration Examples>

Figure 28A:
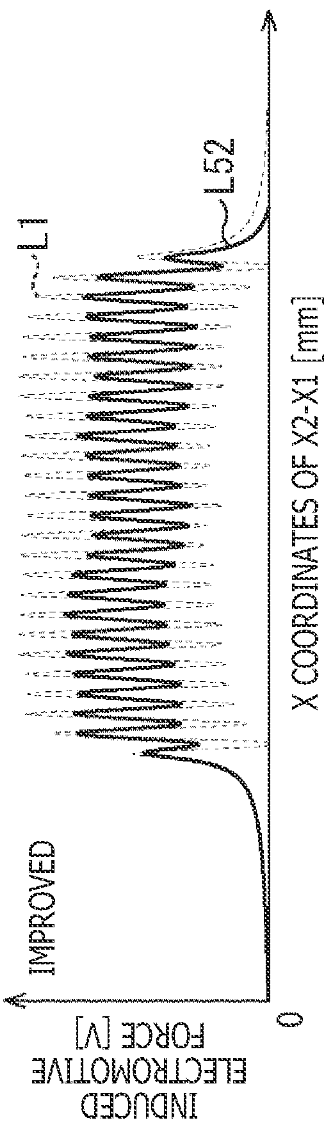
FIGS. 28A, 28B, and 28C are figures depicting results of simulations of inductive noise corresponding to the fourth to sixth configuration examples.
Figure 28B:
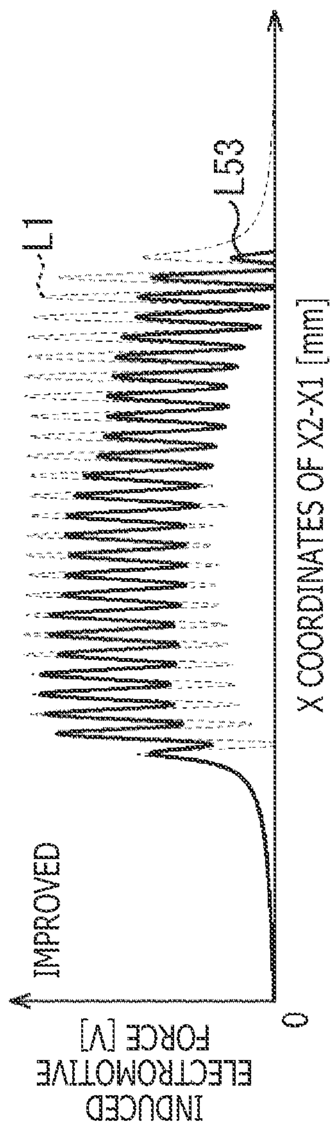
Figure 28C:
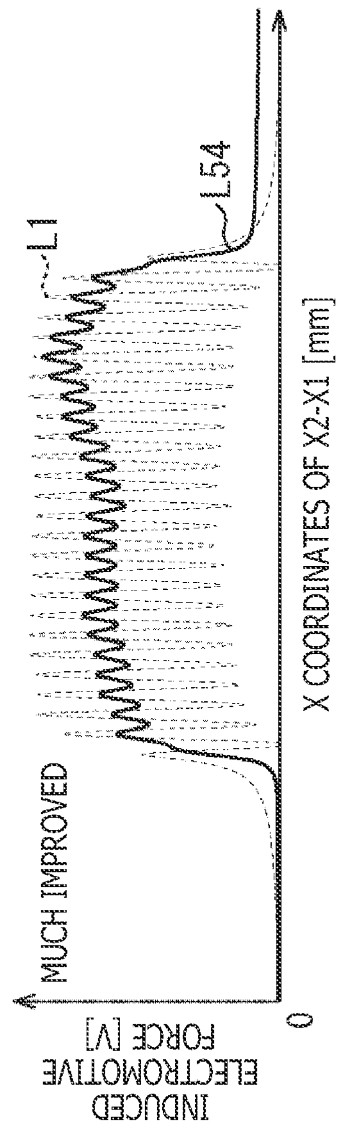

FIGS. 28A, 28B, and 28C depict changes of induced electromotive forces that generate inductive noise in images, as results of simulations of the cases in which the fourth to sixth configuration examples (FIGS. 25A, 25B, 25C, 26A, 26B, 26C, 27A, 27B, and 27C) are applied to the solid-state image pickup apparatus 100. Note that it is assumed that conditions of electric currents flowing in the fourth to sixth configuration examples are similar to those in the case depicted in FIG. 23. The horizontal axis in FIGS. 28A, 28B, and 28C represent the X-axis coordinate of images, and the vertical axis represents the magnitudes of the induced electromotive forces.

A solid line L52 in FIG. 28A corresponds to the fourth configuration example (FIGS. 25A, 25B, and 25C), and the dotted line L1 corresponds to the first comparative example (FIGS. 9A, 9B, and 9C). As is apparent from a comparison between the solid line L52 and the dotted line L1, it can be known that the fourth configuration example can suppress changes of the induced electromotive force generated to the Victim conductor loop and suppress inductive noise, as compared with the first comparative example.

A solid line L53 in FIG. 28B corresponds to the fifth configuration example (FIGS. 26A, 26B, and 26C), and the dotted line L1 corresponds to the first comparative example (FIGS. 9A, 9B, and 9C). As is apparent from a comparison between the solid line L53 and the dotted line L1, it can be known that the fifth configuration example can suppress changes of the induced electromotive force generated to the Victim conductor loop and suppress inductive noise, as compared with the first comparative example.

A solid line L54 in FIG. 280 corresponds to the sixth configuration example (FIGS. 27A, 27B, and 27C), and the dotted line L1 corresponds to the first comparative example (FIGS. 9A, 9B, and 9C). As is apparent from a comparison between the solid line L54 and the dotted line L1, it can be known that the sixth configuration example can suppress changes of the induced electromotive force generated to the Victim conductor loop and suppress inductive noise, as compared with the first comparative example.

In addition, as is apparent from a comparison among the solid lines L52 to L54, it can be known that the sixth configuration example can further suppress changes of the induced electromotive force generated to the Victim conductor loop and further suppress inductive noise, as compared with the fourth configuration example and the fifth configuration example.

Seventh Configuration Example

Figure 29A:
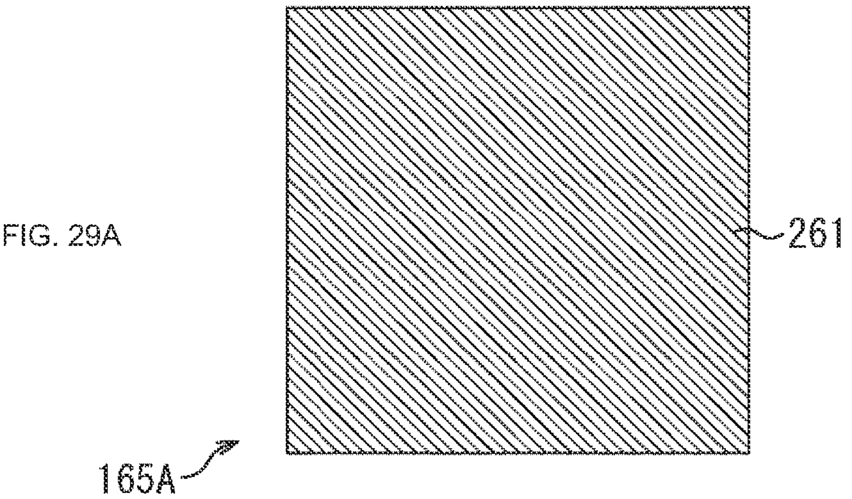
FIGS. 29A, 29B, and 29C are figures depicting a seventh configuration example of the conductor layers A and B.
Figure 29B:
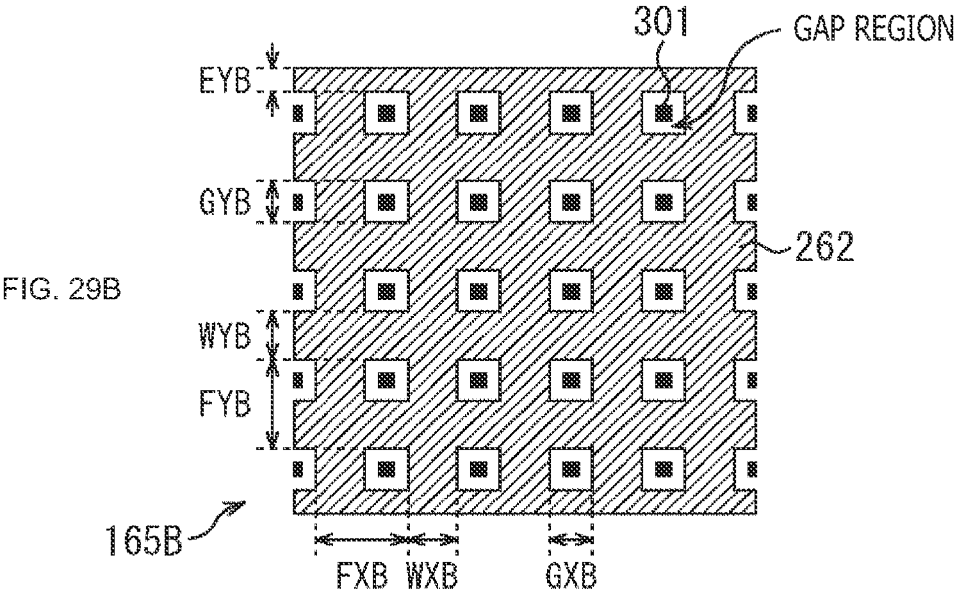
Figure 29C:
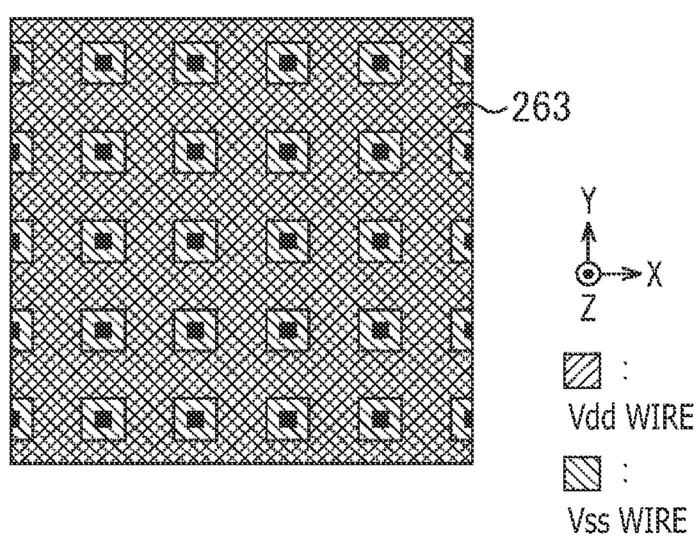

Next, FIGS. 29A, 29B, and 29C depict a seventh configuration example of the conductor layers A and B. Note that FIG. 29A depicts the conductor layer A, and FIG. 29B depicts the conductor layer B. In the coordinate system in FIGS. 29A, 29B, and 29C, the X axis lies in the lateral direction, the Y axis lies in the longitudinal direction, and the Z axis lies in a direction perpendicular to the XY plane.

The conductor layer A in the seventh configuration example includes a planar conductor 261. The planar conductor 261 is a wire (Vss wire) connected to GND or a negative power supply, for example.

The conductor layer B in the seventh configuration example includes a mesh conductor 262 and relay conductors 301. The mesh conductor 262 has a shape similar to that of the mesh conductor 222 in the conductor layer B in the third configuration example (FIGS. 22A, 22B, and 22C), and so an explanation thereof is omitted. The mesh conductor 262 is a wire (Vdd wire) connected to a positive power supply, for example.

The relay conductors (other conductors) 301 are arranged in non-conductor gap regions in the mesh conductor 262, are electrically insulated from the mesh conductor 262, and are connected to Vss connected with the planar conductor 261 in the conductor layer A.

The shapes of the relay conductors 301 can be any shapes and desirably are circular or polygonal shapes which have symmetry like rotational symmetry, mirror symmetry, or the like. The relay conductors 301 can be arranged at the middle positions or any other positions in gap regions of the mesh conductor 262. The relay conductors 301 may be connected to a conductor layer as a Vss wire other than the conductor layer A. The relay conductors 301 may be connected to a conductor layer as a Vss wire on a side closer to an active element group 167 than to the conductor layer B. The relay conductors 301 can be connected to a conductor layer other than the conductor layer A, or a conductor layer or the like on a side closer to an active element group 167 than to the conductor layer B, via conductor vias extending in the Z direction.

FIG. 29C depicts a state of the conductor layers A and B depicted in in FIGS. 29A and 29B, respectively, as seen from the side where photodiodes 141 are located (the backside). It should be noted however that a hatched region 263 in which diagonal lines cross in-Gin FIG. 29C represents a region where the planar conductor 261 in the conductor layer A and the mesh conductor 262 in the conductor layer B overlap. Because an active element group 167 is covered with at least one of the conductor layer A or the conductor layer B in the case of the seventh configuration example, hot carrier light emissions from the active element group 167 can be blocked.

In addition, in the case of the seventh configuration example, providing the relay conductors 301 makes it possible to connect the planar conductor 261, which is a Vss wire, with the active element group 167 with substantially the shortest distance or with a short distance. Connecting the planar conductor 261 and the active element group 167 with substantially the shortest distance or with a short distance makes it possible to reduce voltage drops, energy loss, or inductive noise between the planar conductor 261 and the active element group 167.

Figure 30:
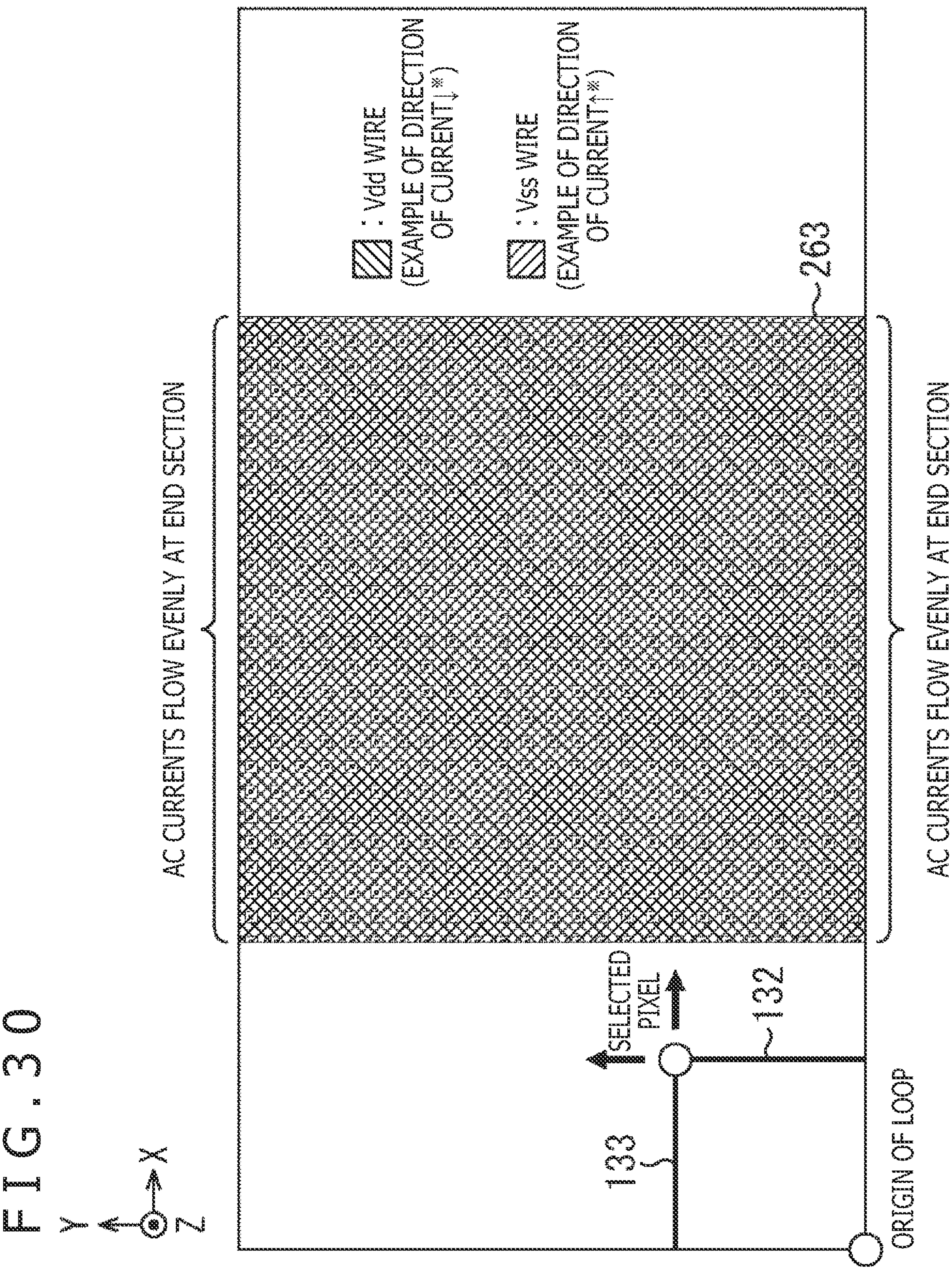
FIG. 30 is a figure depicting the condition of electric currents flowing in the seventh configuration example.

FIG. 30 is a figure depicting the condition of electric currents flowing in the seventh configuration example (FIGS. 29A, 29B, and 29C).

It is assumed that AC currents flow evenly at end sections of the planar conductor 261 included in the conductor layer A and of the mesh conductor 262 included in the conductor layer B. It should be noted however that directions of electric currents change over time. For example, it is assumed that, when currents flow through the mesh conductor 262, which is a Vdd wire, from the upper side to the lower side in the figure, currents flow through the planar conductor 261, which is a Vss wire, from the lower side to the upper side in the figure.

In a case in which currents flow as depicted in FIG. 30 in the seventh configuration example, magnetic flux substantially in the X direction and substantially in the Y direction occurs more easily between the planar conductor 261, which is a Vss wire, and the mesh conductor 262, which is a Vdd wire, due to conductor loops that include (cross-sections of) the planar conductor 261 and the mesh conductor 262 in cross-sections along which the planar conductors 261 and the mesh conductor 262 are arranged and have loop planes that are almost perpendicular to the X axis, and conductor loops that include (cross-sections of) the planar conductor 261 and the mesh conductor 262 in cross-sections along which the planar conductors 261 and the mesh conductor 262 are arranged and have loop planes that are almost perpendicular to the Y axis.

On the other hand, in the pixel array 121 of the first semiconductor board 101 stacked on the second semiconductor board 102 in which the light-blocking structure 151 including the conductor layers A and B is formed, a Victim conductor loop including a signal line 132 and a control line 133 is formed on the XY plane. An induced electromotive force is generated in the Victim conductor loop formed on the XY plane more easily due to magnetic flux in the Z direction. The larger a change of the induced electromotive force is, the worse an image output from the solid-state image pickup apparatus 100 is (the larger the inductive noise is).

Furthermore, if the effective dimensions of the Victim conductor loop including a signal line 132 and a control line 133 change as pixels at different positions are selected in the pixel array 121, changes of the induced electromotive force become noticeable.

In the case of the seventh configuration example, the directions of magnetic flux (substantially in the X direction and substantially in the Y direction) generated from the loop planes of the Aggressor conductor loops of the light-blocking structure 151 including the conductor layers A and B and the direction of magnetic flux (in the Z direction) that generates an induced electromotive force to the Victim conductor loop are substantially orthogonal and different by approximately 90 degrees. In other words, the directions of the loop planes that generate magnetic flux from the Aggressor conductor loops and the direction of the loop plane that generates an induced electromotive force to the Victim conductor loop are different by approximately 90 degrees. Accordingly, it is expected that a worsening (the occurrence of inductive noise) of an image output from the solid-state image pickup apparatus 100 is mitigated as compared with the first comparative example.

Figures 31A, 31B, 31C:
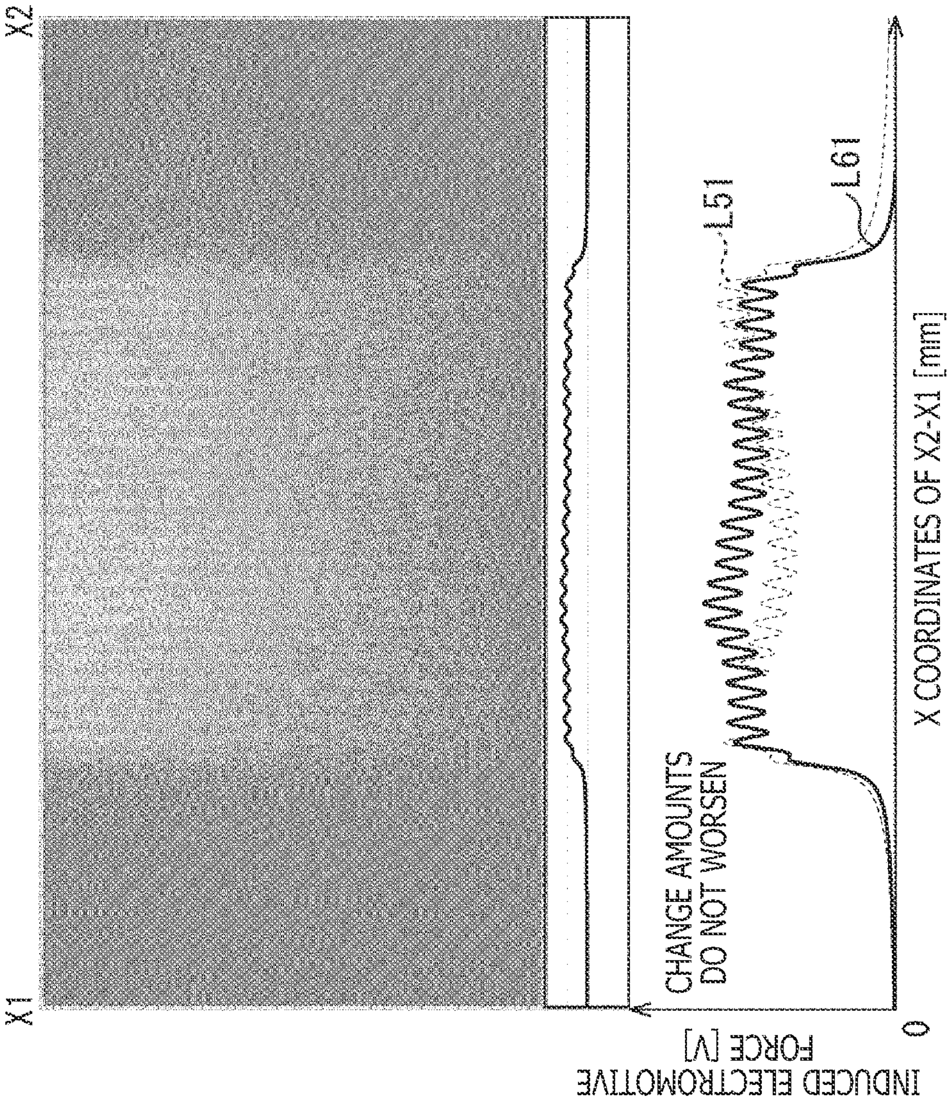
FIGS. 31A, 31B, and 31C are figures depicting a result of a simulation of inductive noise corresponding to the seventh configuration example.

FIGS. 31A, 31B, and 31C depict a result of a simulation of inductive noise that occurs in a case in which the seventh configuration example (FIGS. 29A, 29B, and 29C) is applied to the solid-state image pickup apparatus 100.

FIG. 31A depicts an image that is output from the solid-state image pickup apparatus 100 and can have inductive noise generated therein. FIG. 31B depicts changes of pixel signals along a line segment X1-X2 in the image depicted in FIG. 31A. FIG. 31C depicts a solid line L61 representing an induced electromotive force that has generated the inductive noise in the image. The horizontal axis in FIG. 31C represents the X-axis coordinate of an image, and the vertical axis represents the magnitude of an induced electromotive force. Note that a dotted line L51 in FIG. 31C corresponds to the third configuration example (FIGS. 22A, 22B, and 22C).

As is apparent from a comparison between the solid line L61 and the dotted line L51 depicted in FIG. 31C, it can be known that the seventh configuration example does not worsen changes of an induced electromotive force generated to the Victim conductor loop as compared with the third configuration example. That is, also in the seventh configuration example in which the relay conductors 301 are arranged in the gaps of the mesh conductor 262 in the conductor layer B, it is possible to suppress the occurrence of inductive noise in an image output from the solid-state image pickup apparatus 100 to the same degree as that in the third configuration example. It should be noted however that the simulation result represents a result of a simulation of a case in which the planar conductor 261 is not connected with an active element group 167 and the mesh conductor 262 is not connected with an active element group 167. For example, in a case in which the planar conductor 261 and at least part of an active element group 167 are connected with each other with substantially the shortest distance or with a short distance via conductor vias or the like, or in a case in which the mesh conductor 262 and at least part of an active element group 167 are connected with each other with substantially the shortest distance or with a short distance via conductor vias or the like, the amount of currents flowing through the planar conductor 261 or the mesh conductor 262 gradually decreases depending on positions. In such a case, there is also a condition under which voltage drops, energy loss, or inductive noise are/is ameliorated significantly to be half or smaller by providing the relay conductors 301.

Eighth Configuration Example

Figure 32A:
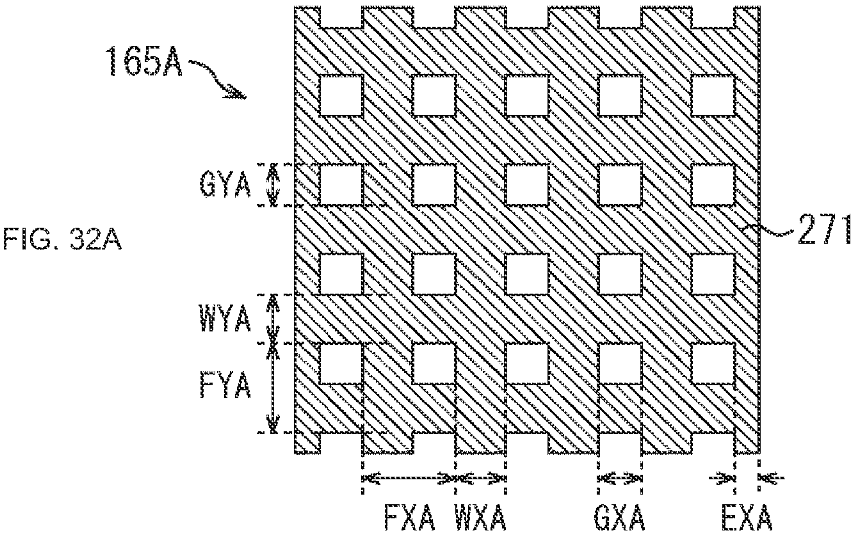
FIGS. 32A, 32B, and 32C are figures depicting an eighth configuration example of the conductor layers A and B.
Figure 32B:
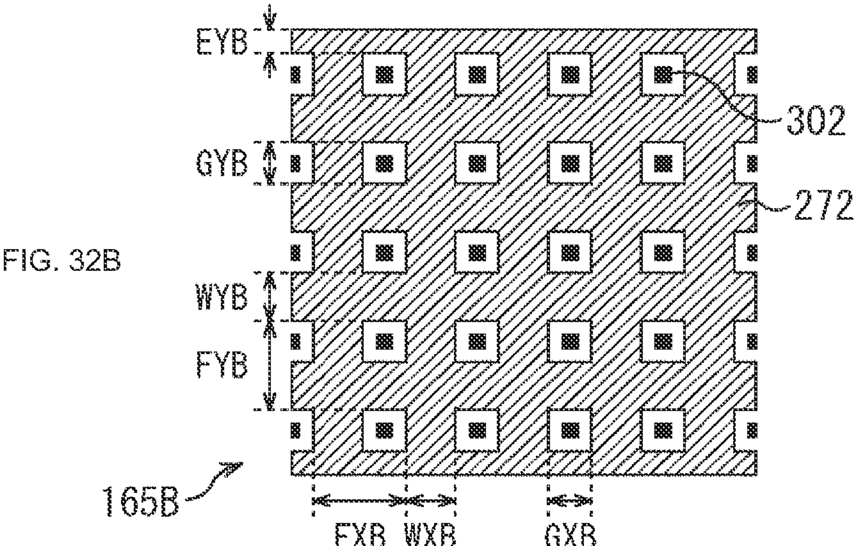
Figure 32C:
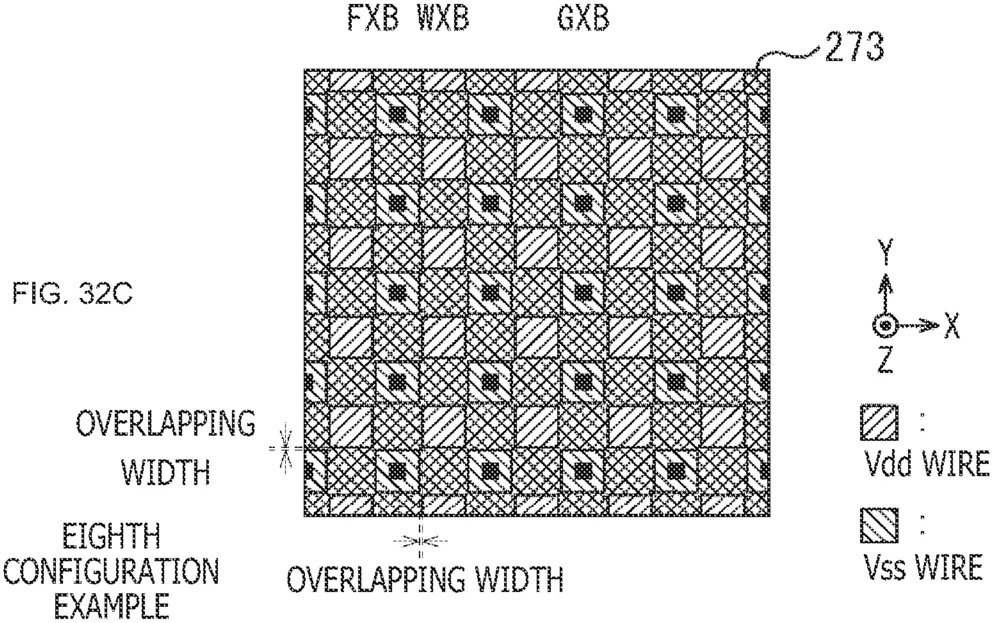

Next, FIGS. 32A, 32B, and 32C depict an eighth configuration example of the conductor layers A and B. Note that FIG. 32A depicts the conductor layer A, and FIG. 32B depicts the conductor layer B. In the coordinate system in FIGS. 32A, 32B, and 32C, the X axis lies in the lateral direction, the Y axis lies in the longitudinal direction, and the Z axis lies in a direction perpendicular to the XY plane.

The conductor layer A in the eighth configuration example includes a mesh conductor 271. The mesh conductor 271 has a shape similar to that of the mesh conductor 231 in the conductor layer A in the fourth configuration example (FIGS. 25A, 25B, and 25C), and so an explanation thereof is omitted. The mesh conductor 271 is a wire (Vss wire) connected to GND or a negative power supply, for example.

The conductor layer B in the eighth configuration example includes a mesh conductor 272 and relay conductors 302. The mesh conductor 272 has a shape similar to that of the mesh conductor 232 in the conductor layer B in the fourth configuration example (FIGS. 25A, 25B, and 25C), and so an explanation thereof is omitted. The mesh conductor 232 is a wire (Vdd wire) connected to a positive power supply, for example.

The relay conductors (other conductors) 302 are arranged in non-conductor gap regions in the mesh conductor 272, are electrically insulated from the mesh conductor 272, and are connected to Vss connected with the mesh conductor 271 in the conductor layer A.

Note that the shapes of the relay conductors 302 can be any shapes and desirably are circular or polygonal shapes which have symmetry like rotational symmetry, mirror symmetry, or the like. The relay conductors 302 can be arranged at the middle positions or any other positions in gap regions of the mesh conductor 272. The relay conductors 302 may be connected to a conductor layer as a Vss wire other than the conductor layer A. The relay conductors 302 may be connected to a conductor layer as a Vss wire on a side closer to an active element group 167 than to the conductor layer B. The relay conductors 302 can be connected to a conductor layer other than the conductor layer A, or a conductor layer or the like on a side closer to an active element group 167 than to the conductor layer B, via conductor vias extending in the Z direction.

FIG. 32C depicts a state of the conductor layers A and B depicted in in FIGS. 32A and 32B, respectively, as seen from the side where photodiodes 141 are located (the backside). It should be noted however that hatched regions 273 in which diagonal lines cross in FIG. 32C represent regions where the mesh conductor 271 in the conductor layer A and the mesh conductor 272 in the conductor layer B overlap. Because an active element group 167 is covered with at least one of the conductor layer A or the conductor layer B in the case of the eighth configuration example, hot carrier light emissions from the active element group 167 can be blocked.

In a case in which currents flow similarly to the case depicted in FIG. 30 in the eighth configuration example, magnetic flux substantially in the X direction and substantially in the Y direction occurs more easily between the mesh conductor 271, which is a Vss wire, and the mesh conductor 272, which is a Vdd wire, due to conductor loops that include (cross-sections of) the mesh conductors 271 and 272 in cross-sections along which the mesh conductors 271 and 272 are arranged and have loop planes that are almost perpendicular to the X axis, and conductor loops that include (cross-sections of) the mesh conductors 271 and 272 in cross-sections along which the mesh conductors 271 and 272 are arranged and have loop planes that are almost perpendicular to the Y axis.

In addition, in the case of the eighth configuration example, providing the relay conductors 302 makes it possible to connect the mesh conductor 271, which is a Vss wire, with the active element group 167 with substantially the shortest distance or with a short distance. Connecting the mesh conductor 271 and the active element group 167 with substantially the shortest distance or with a short distance makes it possible to reduce voltage drops, energy loss, or inductive noise between the mesh conductor 271 and the active element group 167.

Ninth Configuration Example

Figure 33A:
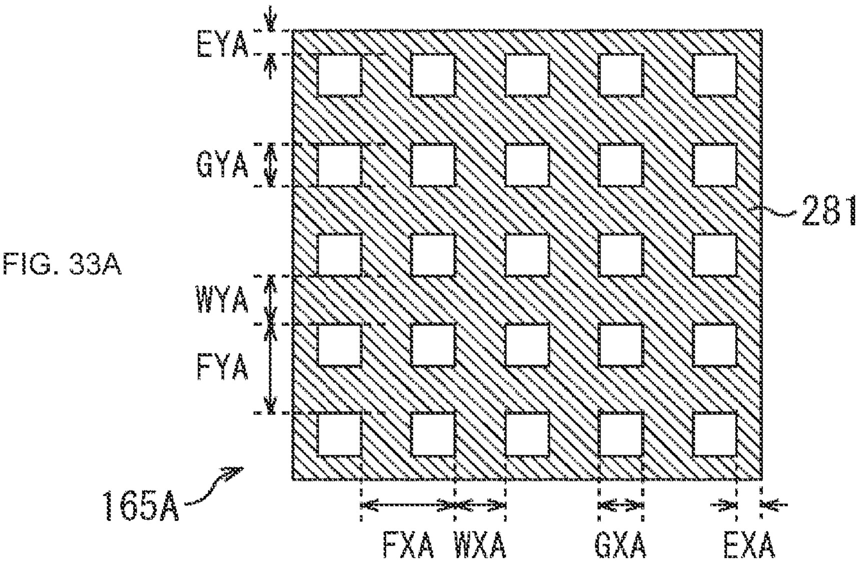
FIGS. 33A, 33B, and 33C are figures depicting a ninth configuration example of the conductor layers A and B.
Figure 33B:
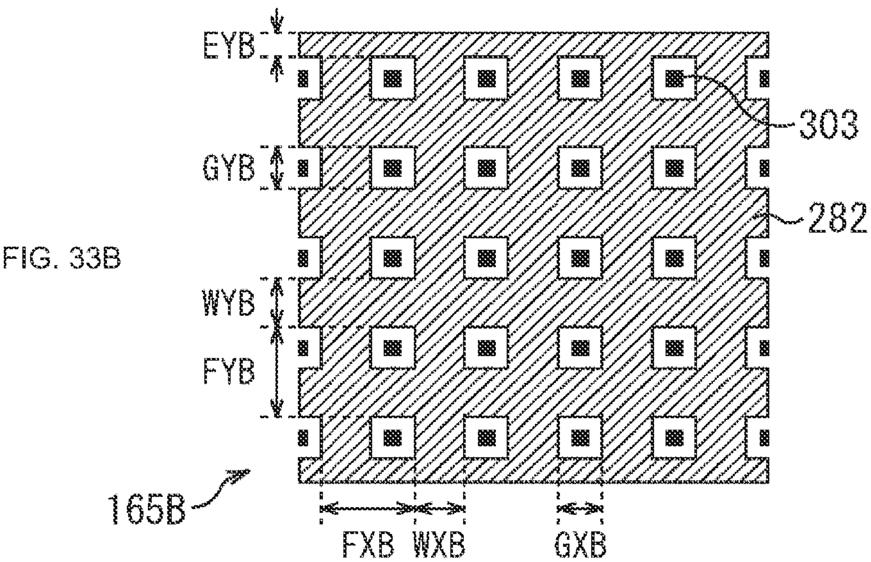
Figure 33C:
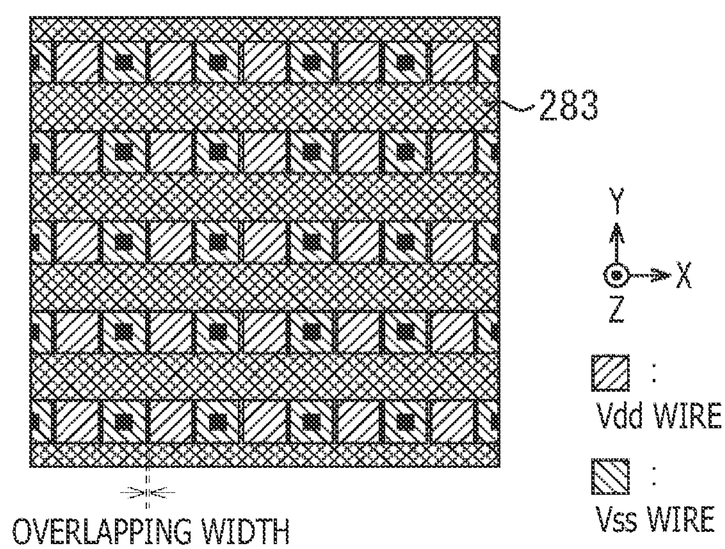

Next, FIGS. 33A, 33B, and 33C depict a ninth configuration example of the conductor layers A and B. Note that FIG. 33A depicts the conductor layer A, and B in FIG. 33B depicts the conductor layer B. In the coordinate system in FIGS. 33A, 33B, and 33C, the X axis lies in the lateral direction, the Y axis lies in the longitudinal direction, and the Z axis lies in a direction perpendicular to the XY plane.

The conductor layer A in the ninth configuration example includes a mesh conductor 281. The mesh conductor 281 has a shape similar to that of the mesh conductor 241 in the conductor layer A in the fifth configuration example (FIGS. 26A, 26B, and 26C), and so an explanation thereof is omitted. The mesh conductor 281 is a wire (Vss wire) connected to GND or a negative power supply, for example.

The conductor layer B in the ninth configuration example includes a mesh conductor 282 and relay conductors 303. The mesh conductor 282 has a shape similar to that of the mesh conductor 242 in the conductor layer B in the fifth configuration example (FIGS. 26A, 26B, and 26C), and so an explanation thereof is omitted. The mesh conductor 282 is a wire (Vdd wire) connected to a positive power supply, for example.

The relay conductors (other conductors) 303 are arranged in non-conductor gap regions in the mesh conductor 282, are electrically insulated from the mesh conductor 282, and are connected to Vss connected with the mesh conductor 281 in the conductor layer A.

Note that the shapes of the relay conductors 303 can be any shapes and desirably are circular or polygonal shapes which have symmetry like rotational symmetry, mirror symmetry, or the like. The relay conductors 303 can be arranged at the middle positions or any other positions in gap regions of the mesh conductor 282. The relay conductors 303 may be connected to a conductor layer as a Vss wire other than the conductor layer A. The relay conductors 303 may be connected to a conductor layer as a Vss wire on a side closer to an active element group 167 than to the conductor layer B. The relay conductors 303 can be connected to a conductor layer other than the conductor layer A, or a conductor layer or the like on a side closer to an active element group 167 than to the conductor layer B, via conductor vias extending in the Z direction.

FIG. 33C depicts a state of the conductor layers A and B depicted in in FIGS. 33A and 33B, respectively, as seen from the side where photodiodes 141 are located (the backside). It should be noted however that hatched regions 283 in which diagonal lines cross in FIG. 33C represent regions where the mesh conductor 281 in the conductor layer A and the mesh conductor 282 in the conductor layer B overlap. Because an active element group 167 is covered with at least one of the conductor layer A or the conductor layer B in the case of the ninth configuration example, hot carrier light emissions from the active element group 167 can be blocked.

In a case in which currents flow similarly to the case depicted in FIG. 30 in the ninth configuration example, magnetic flux substantially in the X direction and substantially in the Y direction occurs more easily between the mesh conductor 281, which is a Vss wire, and the mesh conductor 282, which is a Vdd wire, due to conductor loops that include (cross-sections of) the mesh conductors 281 and 282 in cross-sections along which the mesh conductors 281 and 282 are arranged and have loop planes that are almost perpendicular to the X axis, and conductor loops that include (cross-sections of) the mesh conductors 281 and 282 in cross-sections along which the mesh conductors 281 and 282 are arranged and have loop planes that are almost perpendicular to the Y axis.

In addition, in the case of the ninth configuration example, providing the relay conductors 303 makes it possible to connect the mesh conductor 281, which is a Vss wire, with the active element group 167 with substantially the shortest distance or with a short distance. Connecting the mesh conductor 281 and the active element group 167 with substantially the shortest distance or with a short distance makes it possible to reduce voltage drops, energy loss, or inductive noise between the mesh conductor 281 and the active element group 167.

Tenth Configuration Example

Figure 34A:
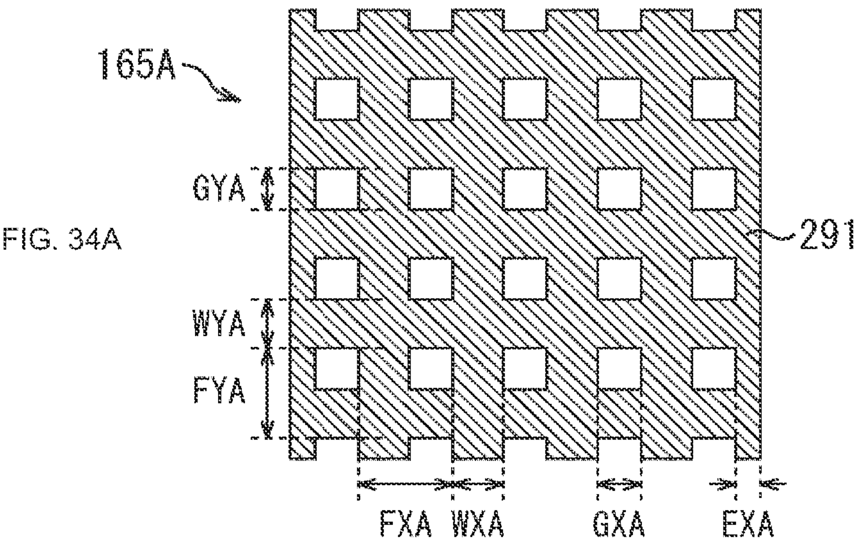
FIGS. 34A, 34B, and 34C are figures depicting a tenth configuration example of the conductor layers A and B.
Figure 34B:
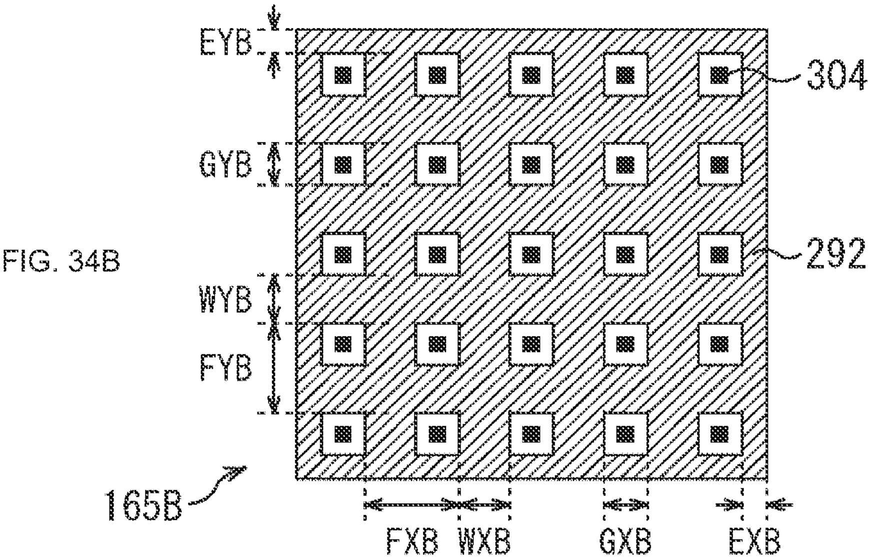
Figure 34C:
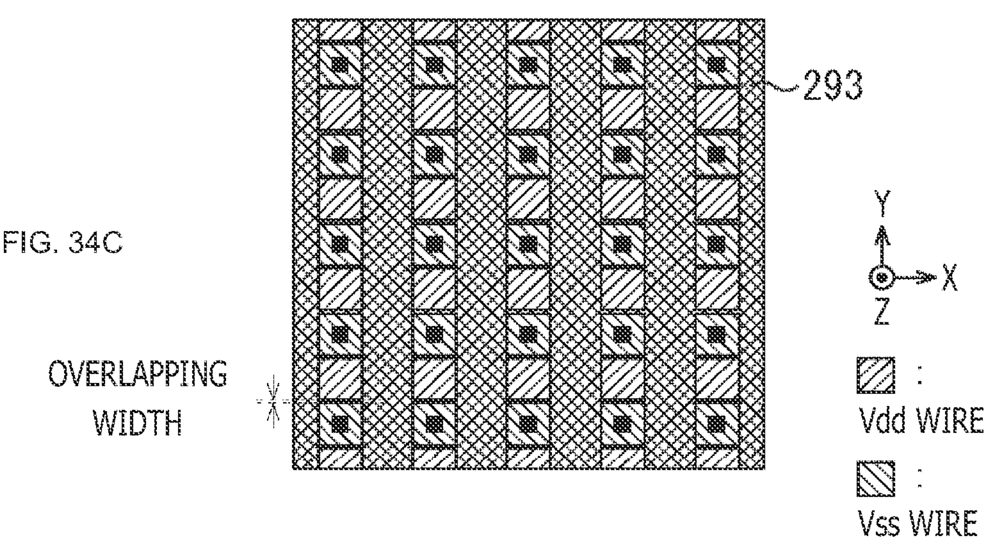

Next, FIGS. 34A, 34B, and 34C depict a tenth configuration example of the conductor layers A and B. Note that FIG. 34A depicts the conductor layer A, and FIG. 34B depicts the conductor layer B. In the coordinate system in FIGS. 34A, 34B, and 34C, the X axis lies in the lateral direction, the Y axis lies in the longitudinal direction, and the Z axis lies in a direction perpendicular to the XY plane.

The conductor layer A in the tenth configuration example includes a mesh conductor 291. The mesh conductor 291 has a shape similar to that of the mesh conductor 251 in the conductor layer A in the sixth configuration example (FIGS. 27A, 27B, and 27C), and so an explanation thereof is omitted. The mesh conductor 291 is a wire (Vss wire) connected to GND or a negative power supply, for example.

The conductor layer B in the tenth configuration example includes a mesh conductor 292 and relay conductors 304. The mesh conductor 292 has a shape similar to that of the mesh conductor 252 in the conductor layer B in the sixth configuration example (FIGS. 27A, 27B, and 27C), and so an explanation thereof is omitted. The mesh conductor 292 is a wire (Vdd wire) connected to a positive power supply, for example.

The relay conductors (other conductors) 304 are arranged in non-conductor gap regions in the mesh conductor 292, are electrically insulated from the mesh conductor 292, and are connected to Vss connected with the mesh conductor 291 in the conductor layer A.

Note that the shapes of the relay conductors 304 can be any shapes and desirably are circular or polygonal shapes which have symmetry like rotational symmetry, mirror symmetry, or the like. The relay conductors 304 can be arranged at the middle positions or any other positions in gap regions of the mesh conductor 292. The relay conductors 304 may be connected to a conductor layer as a Vss wire other than the conductor layer A. The relay conductors 304 may be connected to a conductor layer as a Vss wire on a side closer to an active element group 167 than to the conductor layer B. The relay conductors 304 can be connected to a conductor layer other than the conductor layer A, or a conductor layer or the like on a side closer to an active element group 167 than to the conductor layer B, via conductor vias extending in the Z direction.

FIG. 34C depicts a state of the conductor layers A and B depicted in in FIGS. 34A and 34B, respectively, as seen from the side where photodiodes 141 are located (the backside). It should be noted however that hatched regions 293 in which diagonal lines cross in FIG. 34C represent regions where the mesh conductor 291 in the conductor layer A and the mesh conductor 292 in the conductor layer B overlap. Because an active element group 167 is covered with at least one of the conductor layer A or the conductor layer B in the case of the tenth configuration example, hot carrier light emissions from the active element group 167 can be blocked.

In a case in which currents flow similarly to the case depicted in FIG. 30 in the tenth configuration example, magnetic flux substantially in the X direction and substantially in the Y direction occurs more easily between the mesh conductor 291, which is a Vss wire, and the mesh conductor 292, which is a Vdd wire, due to conductor loops that include (cross-sections of) the mesh conductors 291 and 292 in cross-sections along which the mesh conductors 291 and 292 are arranged and have loop planes that are almost perpendicular to the X axis, and conductor loops that include (cross-sections of) the mesh conductors 291 and 292 in cross-sections along which the mesh conductors 291 and 292 are arranged and have loop planes that are almost perpendicular to the Y axis.

In addition, in the case of the tenth configuration example, providing the relay conductors 304 makes it possible to connect the mesh conductor 291, which is a Vss wire, with the active element group 167 with substantially the shortest distance or with a short distance. Connecting the mesh conductor 291 and the active element group 167 with substantially the shortest distance or with a short distance makes it possible to reduce voltage drops, energy loss, or inductive noise between the mesh conductor 291 and the active element group 167.

<Results of Simulations of Eighth to Tenth Configuration Examples>

Figure 35A:
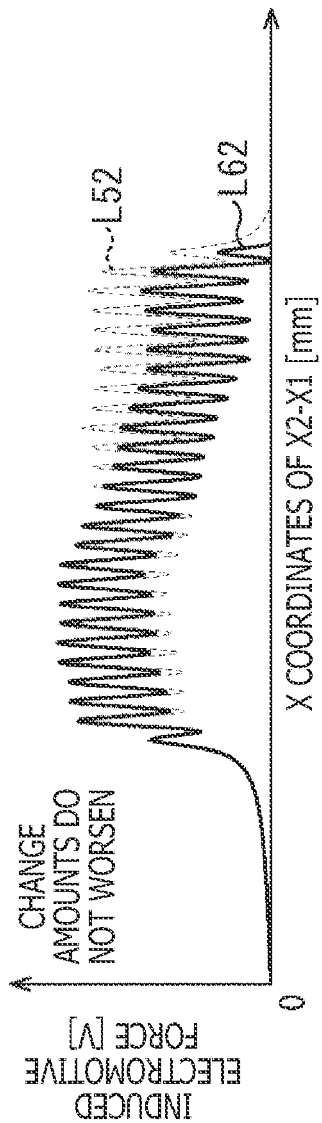
FIGS. 35A, 35B, and 35C are figures depicting results of simulations of inductive noise corresponding to the eighth to tenth configuration examples.
Figure 35B:
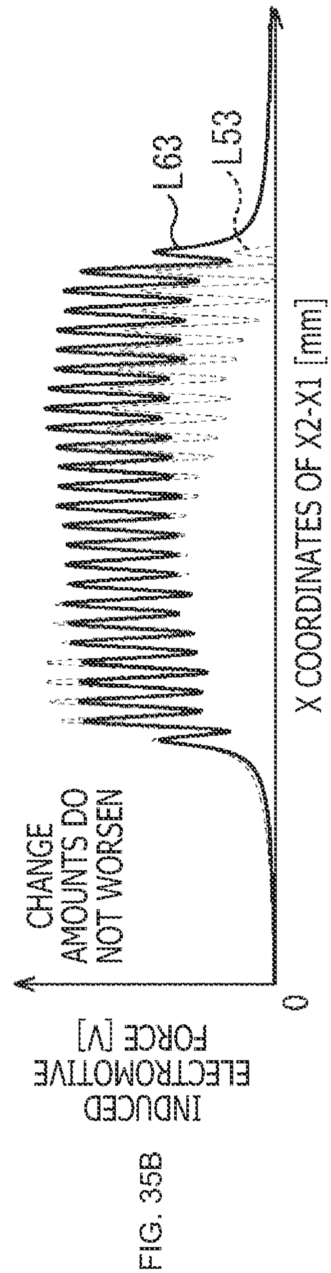
Figure 35C:
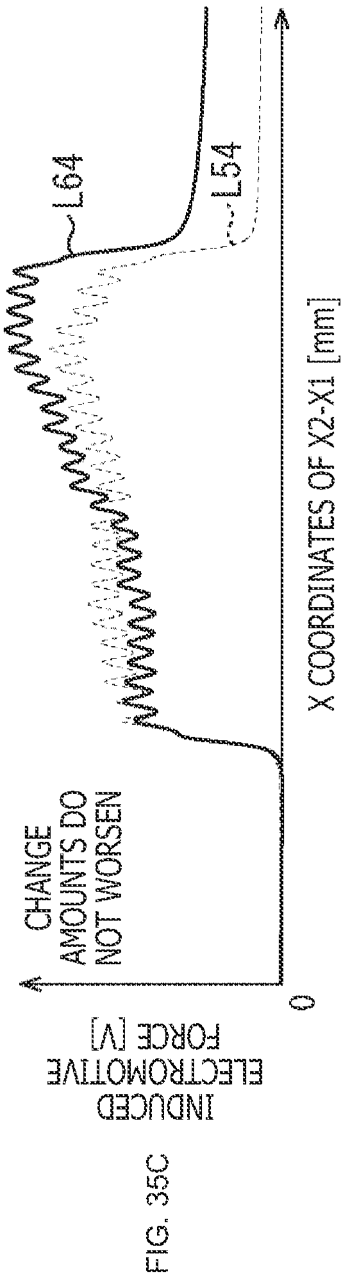

FIGS. 35A, 35B, and 35C depict changes of induced electromotive forces that generate inductive noise in images, as results of simulations of the cases in which the eighth to tenth configuration examples (FIGS. 32A, 32B, 32C, 33A, 33B, 33C, 34A, 34B, and 34C) are applied to the solid-state image pickup apparatus 100. Note that it is assumed that conditions of electric currents flowing in the eighth to tenth configuration examples are similar to those in the case depicted in FIG. 30. The horizontal axis in FIGS. 35A, 35B, and 35C represent the X-axis coordinate of images, and the vertical axis represents the magnitudes of the induced electromotive forces.

A solid line L62 in FIG. 35A corresponds to the eighth configuration example (FIGS. 32A, 32B, and 32C), and a dotted line L52 corresponds to the fourth configuration example (FIGS. 25A, 25B, and 25C). As is apparent from a comparison between the solid line L62 and the dotted line L52, it can be known that the eighth configuration example does not worsen changes of an induced electromotive force generated to the Victim conductor loop as compared with the fourth configuration example. That is, also in the eighth configuration example in which the relay conductors 302 are arranged in the gaps of the mesh conductor 272 in the conductor layer B, it is possible to suppress the occurrence of inductive noise in an image output from the solid-state image pickup apparatus 100 to the same degree as that in the fourth configuration example. It should be noted however that the simulation result represents a result of a simulation of a case in which the mesh conductor 271 is not connected with an active element group 167 and the mesh conductor 272 is not connected with an active element group 167. For example, in a case in which the mesh conductor 271 and at least part of an active element group 167 are connected with each other with substantially the shortest distance or with a short distance via conductor vias or the like, or in a case in which the mesh conductor 272 and at least part of an active element group 167 are connected with each other with substantially the shortest distance or with a short distance via conductor vias or the like, the amount of currents flowing through the mesh conductor 271 or the mesh conductor 272 gradually decreases depending on positions. In such a case, there is also a condition under which voltage drops, energy loss, or inductive noise are/is ameliorated significantly to be half or smaller by providing the relay conductors 302.

A solid line L63 in FIG. 35B corresponds to the ninth configuration example (FIGS. 33A, 33B, and 33C), and a dotted line L53 corresponds to the fifth configuration example (FIGS. 26A, 26B, and 26C). As is apparent from a comparison between the solid line L63 and the dotted line L53, it can be known that the ninth configuration example does not worsen changes of an induced electromotive force generated to the Victim conductor loop as compared with the fifth configuration example. That is, also in the ninth configuration example in which the relay conductors 303 are arranged in the gaps of the mesh conductor 282 in the conductor layer B, it is possible to suppress the occurrence of inductive noise in an image output from the solid-state image pickup apparatus 100 to the same degree as that in the fifth configuration example. It should be noted however that the simulation result represents a result of a simulation of a case in which the mesh conductor 281 is not connected with an active element group 167 and the mesh conductor 282 is not connected with an active element group 167. For example, in a case in which the mesh conductor 281 and at least part of an active element group 167 are connected with each other with substantially the shortest distance or with a short distance via conductor vias or the like, or in a case in which the mesh conductor 282 and at least part of an active element group 167 are connected with each other with substantially the shortest distance or with a short distance via conductor vias or the like, the amount of currents flowing through the mesh conductor 281 or the mesh conductor 282 gradually decreases depending on positions. In such a case, there is also a condition under which voltage drops, energy loss, or inductive noise are/is ameliorated significantly to be half or smaller by providing the relay conductors 303.

A solid line L64 in FIG. 35C corresponds to the tenth configuration example (FIGS. 34A, 34B, and 34C), and a dotted line L54 corresponds to the sixth configuration example (FIGS. 27A, 27B, and 27C). As is apparent from a comparison between the solid line L64 and the dotted line L54, it can be known that the tenth configuration example does not worsen changes of an induced electromotive force generated to the Victim conductor loop as compared with the sixth configuration example. That is, also in the tenth configuration example in which the relay conductors 304 are arranged in the gaps of the mesh conductor 292 in the conductor layer B, it is possible to suppress the occurrence of inductive noise in an image output from the solid-state image pickup apparatus 100 to the same degree as that in the sixth configuration example. It should be noted however that the simulation result represents a result of a simulation of a case in which the mesh conductor 291 is not connected with an active element group 167 and the mesh conductor 292 is not connected with an active element group 167. For example, in a case in which the mesh conductor 291 and at least part of an active element group 167 are connected with each other with substantially the shortest distance or with a short distance via conductor vias or the like, or in a case in which the mesh conductor 292 and at least part of an active element group 167 are connected with each other with substantially the shortest distance or with a short distance via conductor vias or the like, the amount of currents flowing through the mesh conductor 291 or the mesh conductor 292 gradually decreases depending on positions. In such a case, there is also a condition under which voltage drops, energy loss, or inductive noise are/is ameliorated significantly to be half or smaller by providing the relay conductors 304.

In addition, as is apparent from a comparison among the solid lines L62 to L64, it can be known that the tenth configuration example can further suppress changes of the induced electromotive force generated to the Victim conductor loop and further suppress inductive noise, as compared with the eighth configuration example and the ninth configuration example.

Eleventh Configuration Example

Figures 36A, 36B, 36C:
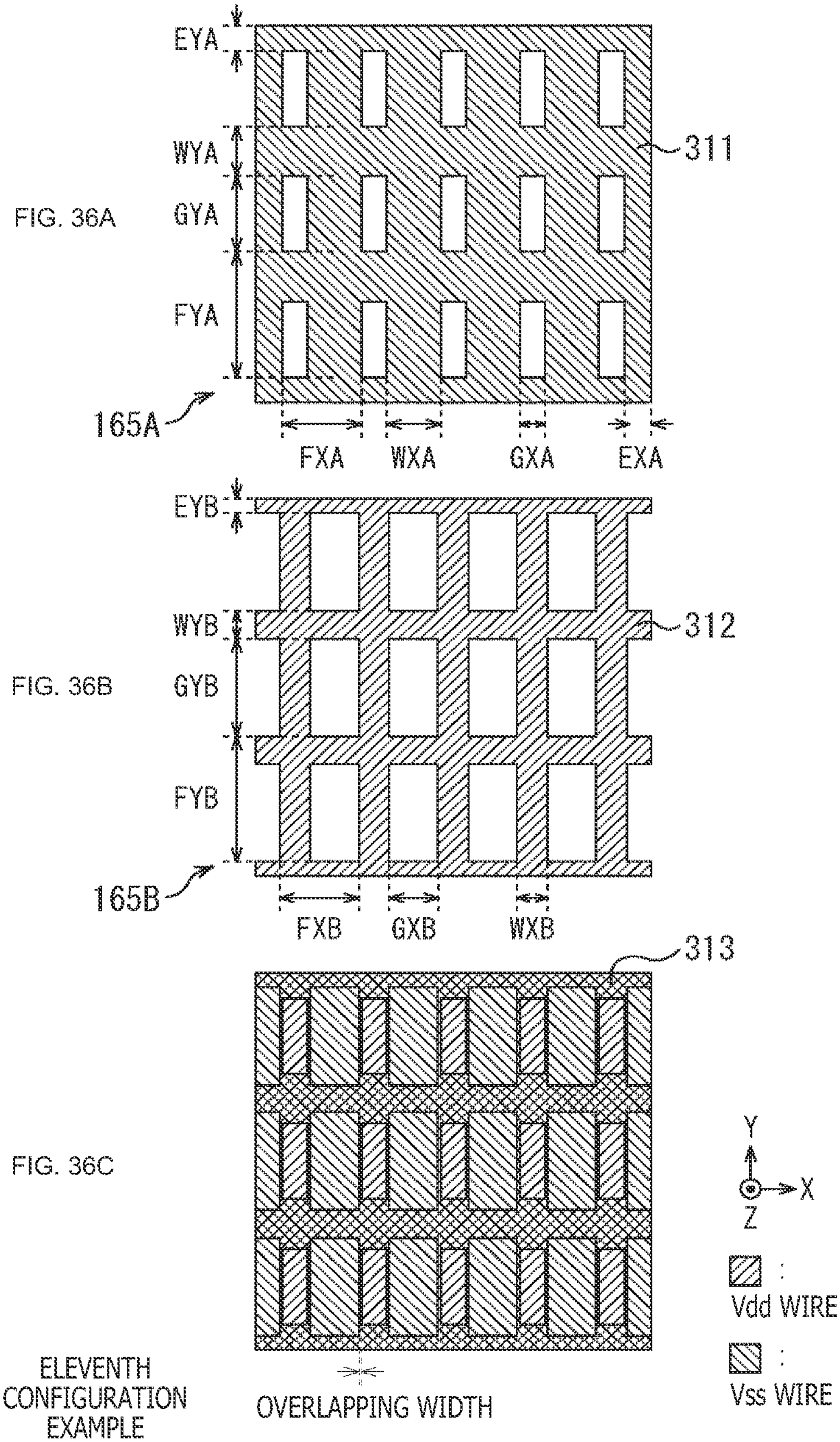
FIGS. 36A, 36B, and 36C are figures depicting an eleventh configuration example of the conductor layers A and B.

Next, FIGS. 36A, 36B, and 36C depict an eleventh configuration example of the conductor layers A and B. Note that FIG. 36A depicts the conductor layer A, and FIG. 36B depicts the conductor layer B. In the coordinate system in FIGS. 36A, 36B, and 36C, the X axis lies in the lateral direction, the Y axis lies in the longitudinal direction, and the Z axis lies in a direction perpendicular to the XY plane.

The conductor layer A in the eleventh configuration example includes a mesh conductor 311 with an X-direction (first-direction) resistance value and a Y-direction (second-direction) resistance value that are different from each other. The mesh conductor 311 is a wire (Vss wire) connected to GND or a negative power supply, for example.

The X-direction conductor width of the mesh conductor 311 is designated as WXA, the X-direction gap width is designated as GXA, the X-direction conductor pitch is designated as FXA (=(conductor width WXA)+(gap width GXA)), and the X-direction end-section width is designated as EXA (=(conductor width WXA)/2). In addition, the Y-direction conductor width of the mesh conductor 311 is designated as WYA, the Y-direction gap width is designated as GYA, the Y-direction conductor pitch is designated as FYA (=(conductor width WYA)+(gap width GYA)), and the Y-direction end-section width is designated as EYA (=(conductor width WYA)/2). The mesh conductor 311 satisfies (gap width GYA)>(gap width GXA). Accordingly, gap regions of the mesh conductor 311 have shapes which are longer in the Y direction than in the X direction. The mesh conductor 311 has mutually different X-direction and Y-direction resistance values, and the Y-direction resistance value is smaller than the X-direction resistance value.

The conductor layer B in the eleventh configuration example includes a mesh conductor 312 with an X-direction resistance value and a Y-direction resistance value that are different from each other. The mesh conductor 312 is a wire (Vdd wire) connected to a positive power supply, for example.

The X-direction conductor width of the mesh conductor 312 is designated as WXB, the X-direction gap width is designated as GXB, and the X-direction conductor pitch is designated as FXB (=(conductor width WXB)+(gap width GXB)). In addition, the Y-direction conductor width of the mesh conductor 312 is designated as WYB, the Y-direction gap width is designated as GYB, the Y-direction conductor pitch is designated as FYB (=(conductor width WYB)+(gap width GYB)), and the Y-direction end-section width is designated as EYB (=(conductor width WYB)/2). The mesh conductor 312 satisfies (gap width GYB)>(gap width GXB). Accordingly, gap regions of the mesh conductor 312 have shapes which are longer in the Y direction than in the X direction. The mesh conductor 312 has mutually different X-direction and Y-direction resistance values, and the Y-direction resistance value is smaller than the X-direction resistance value.

Note that in a case in which the sheet resistance value of the mesh conductor 311 is larger than the sheet resistance value of the mesh conductor 312, the mesh conductor 311 and the mesh conductor 312 desirably satisfy the following relations.

(Conductor width $WYA$)≥(conductor width $WYB$)

(Conductor width $WXA$)≥(conductor width $WXB$)

(Gap width $GXA$)≤(gap width $GXB$)

(Gap width $GYA$)≤(gap width $GYB$)

In contrast, in a case in which the sheet resistance value of the mesh conductor 311 is smaller than the sheet resistance value of the mesh conductor 312, the mesh conductor 311 and the mesh conductor 312 desirably satisfy the following relations.

(Conductor width $WYA$)≤(conductor width $WYB$)

(Conductor width $WXA$)≤(conductor width $WXB$)

(Gap width $GXA$)≥(gap width $GXB$)

(Gap width $GYA$)≥(gap width $GYB$)

Furthermore, the sheet resistance values and conductor widths of the mesh conductors 311 and 312 desirably satisfy the following relations.

(Sheet resistance value of mesh conductor 311)/(sheet resistance value of mesh conductor 312)≈(conductor width $WYA$)/(conductor width $WYB$)

(Sheet resistance value of mesh conductor 311)/(sheet resistance value of mesh conductor 312)≈(conductor width $WXA$)/(conductor width $WXB$)

Limitations related to dimensional relations disclosed in the present specification are not essential limitations, but desirably the mesh conductor 311 and the mesh conductor 312 are configured such that the current distribution in the mesh conductor 311 and the current distribution in the mesh conductor 312 are substantially even, substantially the same, or substantially similar current distributions and are current distributions with reverse characteristics.

For example, the mesh conductor 311 and the mesh conductor 312 are desirably configured such that the ratio between the X-direction wire resistance of the mesh conductor 311 and the Y-direction wire resistance of the mesh conductor 311, and the ratio between the X-direction wire resistance of the mesh conductor 312 and the Y-direction wire resistance of the mesh conductor 312 are substantially the same.

In addition, the mesh conductor 311 and the mesh conductor 312 are desirably configured such that the ratio between the X-direction wire inductance of the mesh conductor 311 and the Y-direction wire inductance of the mesh conductor 311, and the ratio between the X-direction wire inductance of the mesh conductor 312 and the Y-direction wire inductance of the mesh conductor 312 are substantially the same.

In addition, the mesh conductor 311 and the mesh conductor 312 are desirably configured such that the ratio between the X-direction wire capacitance of the mesh conductor 311 and the Y-direction wire capacitance of the mesh conductor 311, and the ratio between the X-direction wire capacitance of the mesh conductor 312 and the Y-direction wire capacitance of the mesh conductor 312 are substantially the same.

In addition, the mesh conductor 311 and the mesh conductor 312 are desirably configured such that the ratio between the X-direction wire impedance of the mesh conductor 311 and the Y-direction wire impedance of the mesh conductor 311, and the ratio between the X-direction wire impedance of the mesh conductor 312 and the Y-direction wire impedance of the mesh conductor 312 are substantially the same.

In other words, the mesh conductor 311 and the mesh conductor 312 desirably, but not essentially, satisfy any of the relations:

(($X$-direction wire resistance of mesh conductor 311)×($Y$-direction wire resistance of mesh conductor 312))≈(($X$-direction wire resistance of mesh conductor 312)×($Y$-direction wire resistance of mesh conductor 311));

(($X$-direction wire inductance of mesh conductor 311)×($Y$-direction wire inductance of mesh conductor 312))≈(($X$-direction wire inductance of mesh conductor 312)×($Y$-direction wire inductance of mesh conductor 311));

((X-direction wire capacitance of mesh conductor 311)×(Y-direction wire capacitance of mesh conductor 312))≈((X-direction wire capacitance of mesh conductor 312)×(Y-direction wire capacitance of mesh conductor 311)); and ((X-direction wire impedance of mesh conductor 311)×(Y-direction wire impedance of mesh conductor 312))≈((X-direction wire impedance of mesh conductor 312)×(Y-direction wire impedance of mesh conductor 311)).

Note that the wire resistances, wire inductances, wire capacitance, and wire impedances mentioned above can be replaced with conductor resistances, conductor inductance, conductor capacitance, and conductor impedances, respectively.

Note that the impedance Z, resistance R, inductance L, and capacitance C mentioned above have the relation, $Z=R+j\omega L+1/(j\omega C)$, in terms of an angular frequency ω and an imaginary unit j.

Note that it is sufficient if these relations in terms of the ratios are satisfied by the mesh conductor 311 and the mesh conductor 312 as a whole, are satisfied by partial areas of the mesh conductor 311 and the mesh conductor 312, or are satisfied in certain areas.

Furthermore, a circuit that performs adjustments such that the current distributions become substantially even, substantially the same, or substantially similar distributions and have mutually reverse characteristics may be provided.

By satisfying the relations mentioned above, the current distribution in the mesh conductor 311 and the current distribution in the mesh conductor 312 can be made substantially even distributions and can be caused to have mutually reverse characteristics. Accordingly, the magnetic field generated by the current distribution in the mesh conductor 311 and the magnetic field generated by the current distribution in the mesh conductor 312 can be offset effectively.

FIG. 36C depicts a state of the conductor layers A and B depicted in in FIGS. 36A and 36B, respectively, as seen from the side where photodiodes 141 are located (the backside). It should be noted however that hatched regions 313 in which diagonal lines cross in FIG. 36C represent regions where the mesh conductor 311 in the conductor layer A and the mesh conductor 312 in the conductor layer B overlap. Because an active element group 167 is covered with at least one of the conductor layer A or the conductor layer B in the case of the eleventh configuration example, hot carrier light emissions from the active element group 167 can be blocked.

In addition, in the case of the eleventh configuration example, the regions 313 where the mesh conductor 311 and the mesh conductor 312 overlap are continuous in the X direction. Because currents with mutually different polarities flow through the mesh conductor 311 and the mesh conductor 312 in the regions 313 where the mesh conductor 311 and the mesh conductor 312 overlap, magnetic fields generated from the regions 313 are cancelled out with each other. Therefore, the occurrence of inductive noise near the regions 313 can be suppressed.

In addition, in the case of the eleventh configuration example, the mesh conductor 311 is formed to have a different Y-direction gap width GYA and X-direction gap width GXA, and the mesh conductor 312 is formed to have a different Y-direction gap width GYB and X-direction gap width GXB.

By forming the mesh conductors 311 and 312 such that they have shapes with differences of the X-direction and Y-direction gap widths in this manner, it is possible to cope with constraints in terms of dimensions of wire regions, dimensions of gap regions, the occupancy of a wire region in each conductor layer, and the like, and to enhance the degrees of freedom of designing of the wiring layouts when conductor layers are actually designed and manufactured. In addition, as compared with a case in which gap widths are not made different, it is possible to design wires with layouts which are advantageous in terms of voltage drops (IR-Drop), inductive noise, and the like.

FIGS. 37A, 37B, and 37C are figure depicting the condition of electric currents flowing in the eleventh configuration example (FIGS. 36A, 36B, and 36C).

It is assumed that AC currents flow evenly at end sections of the mesh conductor 311 included in the conductor layer A and of the mesh conductor 312 included in the conductor layer B. It should be noted however that directions of electric currents change over time. For example, it is assumed that, when currents flow through the mesh conductor 312, which is a Vdd wire, from the upper side to the lower side in the figure, currents flow through the mesh conductor 311, which is a Vss wire, from the lower side to the upper side in the figure.

Figure 37:
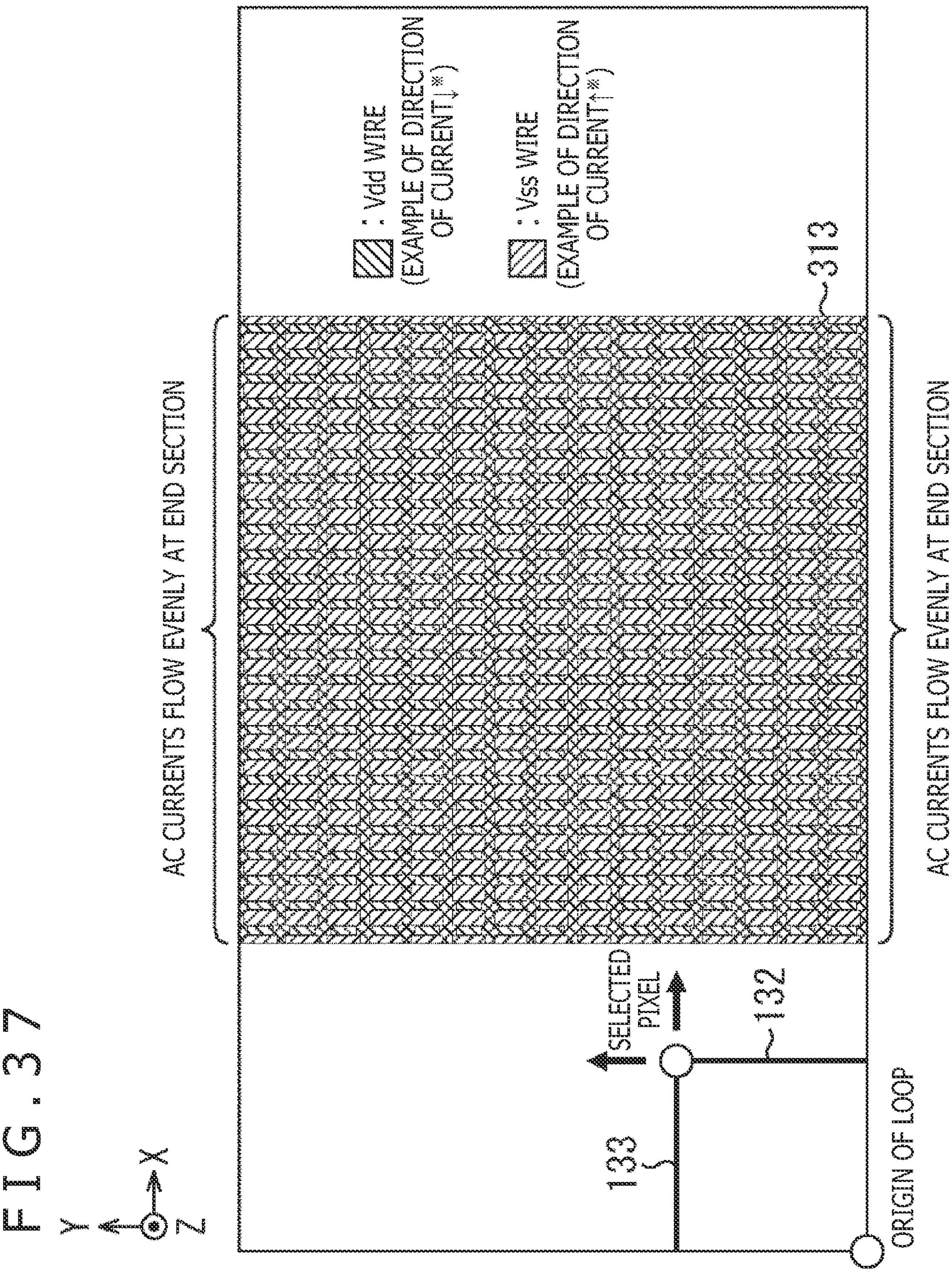
FIG. 37 is a figure depicting the condition of electric currents flowing in the eleventh configuration example.

In a case in which currents flow as depicted in FIG. 37 in the eleventh configuration example, magnetic flux substantially in the X direction and substantially in the Y direction occurs more easily between the mesh conductor 311, which is a Vss wire, and the mesh conductor 312, which is a Vdd wire, due to conductor loops that include (cross-sections of) the mesh conductors 311 and 312 in cross-sections along which the mesh conductors 311 and 312 are arranged and have loop planes that are almost perpendicular to the X axis, and conductor loops that include (cross-sections of) the mesh conductors 311 and 312 in cross-sections along which the mesh conductors 311 and 312 are arranged and have loop planes that are almost perpendicular to the Y axis.

On the other hand, in the pixel array 121 of the first semiconductor board 101 stacked on the second semiconductor board 102 in which the light-blocking structure 151 including the conductor layers A and B is formed, a Victim conductor loop including a signal line 132 and a control line 133 is formed on the XY plane. An induced electromotive force is generated in the Victim conductor loop formed on the XY plane more easily due to magnetic flux in the Z direction. The larger a change of the induced electromotive force is, the worse an image output from the solid-state image pickup apparatus 100 is (the larger the inductive noise is).

Furthermore, if the effective dimensions of the Victim conductor loop including a signal line 132 and a control line 133 change as pixels at different positions are selected in the pixel array 121, changes of the induced electromotive force become noticeable.

In the case of the eleventh configuration example, the directions of magnetic flux (substantially in the X direction and substantially in the Y direction) generated from the loop planes of the Aggressor conductor loops of the light-blocking structure 151 including the conductor layers A and B and the direction of magnetic flux (in the Z direction) that generates an induced electromotive force to the Victim conductor loop are substantially orthogonal and different by approximately 90 degrees. In other words, the directions of the loop planes that generate magnetic flux from the Aggressor conductor loops and the direction of the loop plane that generates an induced electromotive force to the Victim conductor loop are different by approximately 90 degrees. Accordingly, it is expected that a worsening (the occurrence of inductive noise) of an image output from the solid-state image pickup apparatus 100 is mitigated as compared with the first comparative example.

Figures 38A, 38B, 38C:
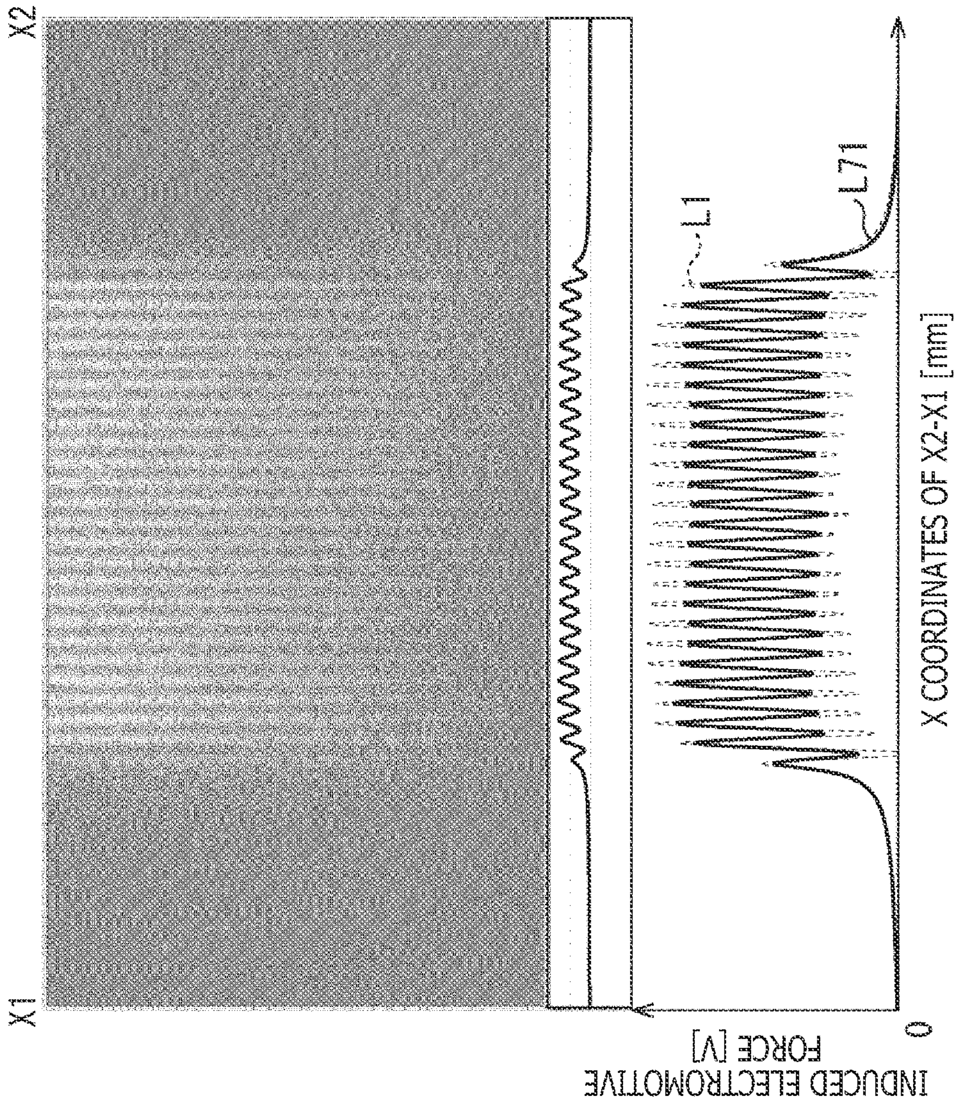
FIGS. 38A, 38B, and 38C are figures depicting a result of a simulation of inductive noise corresponding to the eleventh configuration example.

FIGS. 38A, 38B, and 38C depict a result of a simulation of inductive noise that occurs in a case in which the eleventh configuration example (FIGS. 36A, 36B, and 36C) is applied to the solid-state image pickup apparatus 100. FIG. 38A depicts an image that is output from the solid-state image pickup apparatus 100 and can have inductive noise generated therein. FIG. 38B depicts changes of pixel signals along a line segment X1-X2 in the image depicted in FIG. 38A. FIG. 38C depicts a solid line L71 representing an induced electromotive force that has generated the inductive noise in the image. The horizontal axis in FIG. 38C represents the X-axis coordinate of an image, and the vertical axis represents the magnitude of an induced electromotive force. Note that the dotted line L1 in FIG. 38C corresponds to the first comparative example (FIGS. 9A, 9B, and 9C).

As is apparent from a comparison between the solid line L71 and the dotted line L1 depicted in FIG. 38C, it can be known that the eleventh configuration example can suppress changes of the induced electromotive force generated to the Victim conductor loop and suppress inductive noise, as compared with the first comparative example.

Note that the eleventh configuration example may be used by being rotated by 90 degrees on the XY plane. In addition, the eleventh configuration example may be used by being rotated not only by 90 degrees, but by any angle. For example, the eleventh configuration example may be modified to be at an angle relative to the X axis and the Y axis.

Twelfth Configuration Example

Figure 39A:
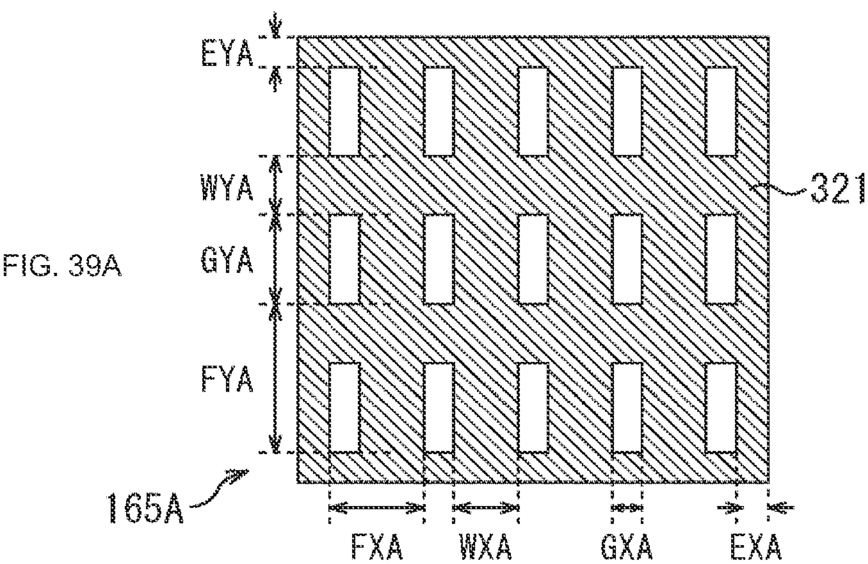
FIGS. 39A, 39B, and 39C are figures depicting a twelfth configuration example of the conductor layers A and B.
Figure 39B:
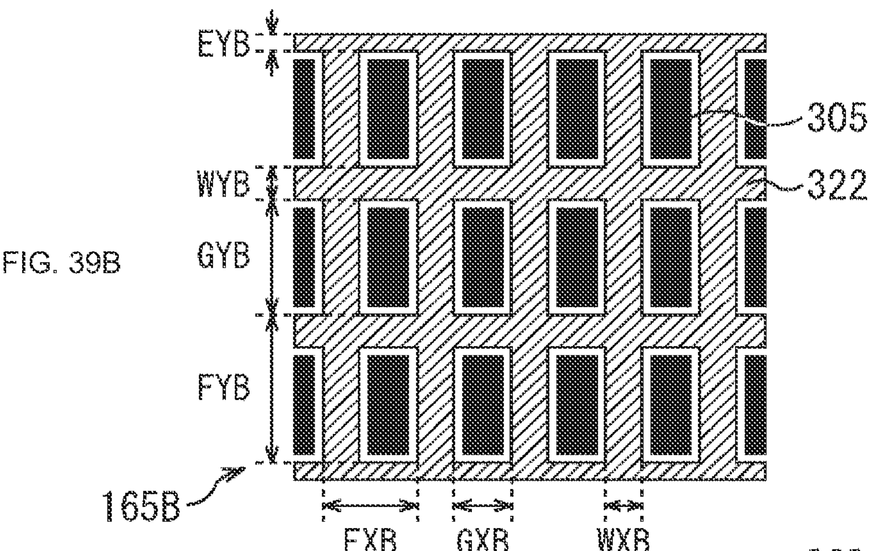
Figure 39C:
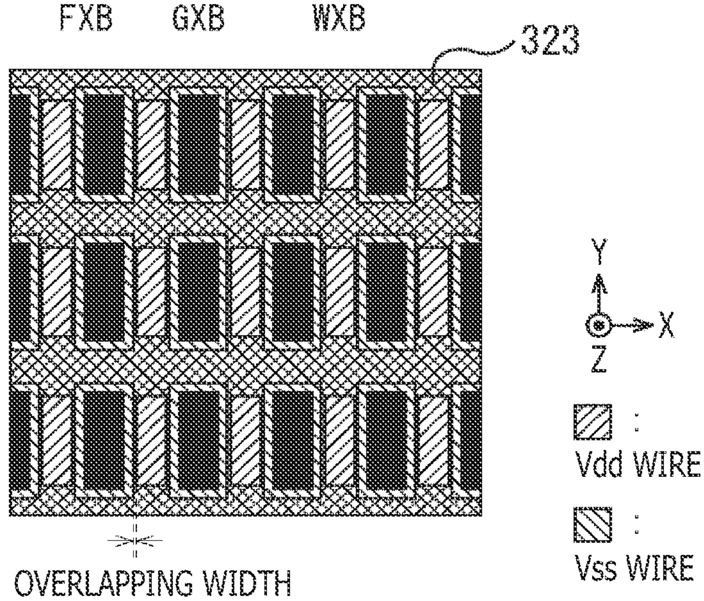

Next, FIGS. 39A, 39B, and 39C depict a twelfth configuration example of the conductor layers A and B. Note that FIG. 39A depicts the conductor layer A, and FIG. 39B depicts the conductor layer B. In the coordinate system in FIGS. 39A, 39B, and 39C, the X axis lies in the lateral direction, the Y axis lies in the longitudinal direction, and the Z axis lies in a direction perpendicular to the XY plane.

The conductor layer A in the twelfth configuration example includes a mesh conductor 321. The mesh conductor 321 has a shape similar to that of the mesh conductor 311 in the conductor layer A in the eleventh configuration example (FIGS. 36A, 36B, and 36C), and so an explanation thereof is omitted. The mesh conductor 321 is a wire (Vss wire) connected to GND or a negative power supply, for example.

The conductor layer B in the twelfth configuration example includes a mesh conductor 322 and relay conductors 305. The mesh conductor 322 has a shape similar to that of the mesh conductor 312 in the conductor layer B in the eleventh configuration example (FIGS. 36A, 36B, and 36C), and so an explanation thereof is omitted. The mesh conductor 322 is a wire (Vdd wire) connected to a positive power supply, for example.

The relay conductors (other conductors) 305 are arranged in non-conductor oblong rectangular gap regions in the mesh conductor 322 that are long in the Y direction. The relay conductors 305 are electrically insulated from the mesh conductor 322 and are connected to Vss connected with the mesh conductor 321 in the conductor layer A.

Note that the shapes of the relay conductors 305 can be any shapes and desirably are circular or polygonal shapes which have symmetry like rotational symmetry, mirror symmetry, or the like. The relay conductors 305 can be arranged at the middle positions or any other positions in gap regions of the mesh conductor 322. The relay conductors 305 may be connected to a conductor layer as a Vss wire other than the conductor layer A. The relay conductors 305 may be connected to a conductor layer as a Vss wire on a side closer to an active element group 167 than to the conductor layer B. The relay conductors 305 can be connected to a conductor layer other than the conductor layer A, or a conductor layer or the like on a side closer to an active element group 167 than to the conductor layer B, via conductor vias extending in the Z direction.

FIG. 39C depicts a state of the conductor layers A and B depicted in in FIGS. 39A and 39B, respectively, as seen from the side where photodiodes 141 are located (the backside). It should be noted however that hatched regions 323 in which diagonal lines cross in FIG. 39C represent regions where the mesh conductor 321 in the conductor layer A and the mesh conductor 322 in the conductor layer B overlap. Because an active element group 167 is covered with at least one of the conductor layer A or the conductor layer B in the case of the twelfth configuration example, hot carrier light emissions from the active element group 167 can be blocked.

In a case in which currents flow similarly to the case depicted in FIG. 37 in the twelfth configuration example, magnetic flux substantially in the X direction and substantially in the Y direction occurs more easily between the mesh conductor 321, which is a Vss wire, and the mesh conductor 322, which is a Vdd wire, due to conductor loops that include (cross-sections of) the mesh conductors 321 and 322 in cross-sections along which the mesh conductors 321 and 322 are arranged and have loop planes that are almost perpendicular to the X axis, and conductor loops that include (cross-sections of) the mesh conductors 321 and 322 in cross-sections along which the mesh conductors 321 and 322 are arranged and have loop planes that are almost perpendicular to the Y axis.

Furthermore, in the case of the twelfth configuration example, the regions 323 where the mesh conductor 321 and the mesh conductor 322 overlap are continuous in the X direction. Because currents with mutually different polarities flow through the mesh conductor 321 and the mesh conductor 322 in the regions 323 where the mesh conductor 321 and the mesh conductor 322 overlap, magnetic fields generated from the regions 323 are cancelled out with each other. Therefore, the occurrence of inductive noise near the regions 323 can be suppressed.

In addition, in the case of the twelfth configuration example, providing the relay conductors 305 makes it possible to connect the mesh conductor 321, which is a Vss wire, with the active element group 167 with substantially the shortest distance or with a short distance. Connecting the mesh conductor 321 and the active element group 167 with substantially the shortest distance or with a short distance makes it possible to reduce voltage drops, energy loss, or inductive noise between the mesh conductor 321 and the active element group 167.

Note that the twelfth configuration example may be used by being rotated by 90 degrees on the XY plane. In addition, the twelfth configuration example may be used by being rotated not only by 90 degrees, but by any angle. For example, the twelfth configuration example may be modified to be at an angle relative to the X axis and the Y axis.

Thirteenth Configuration Example

Figure 40A:
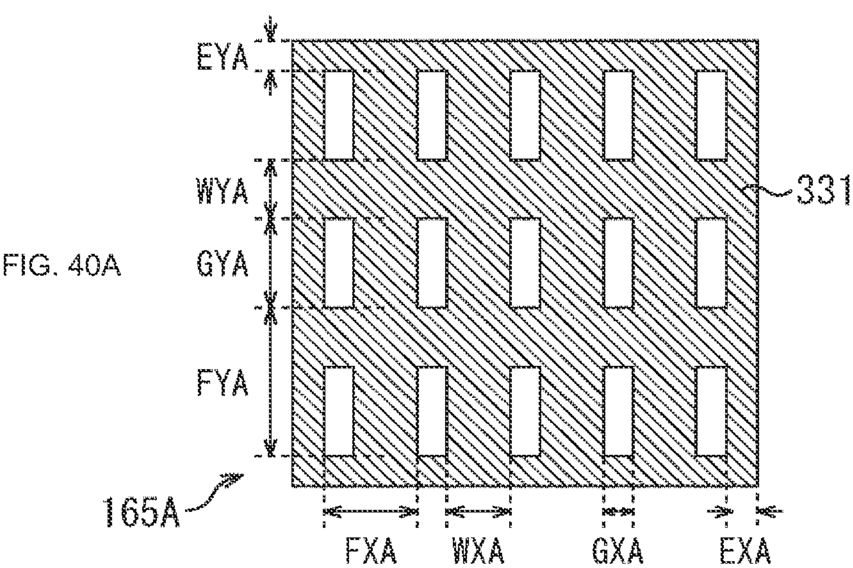
FIGS. 40A, 40B, and 40C are figures depicting a thirteenth configuration example of the conductor layers A and B.
Figure 40B:
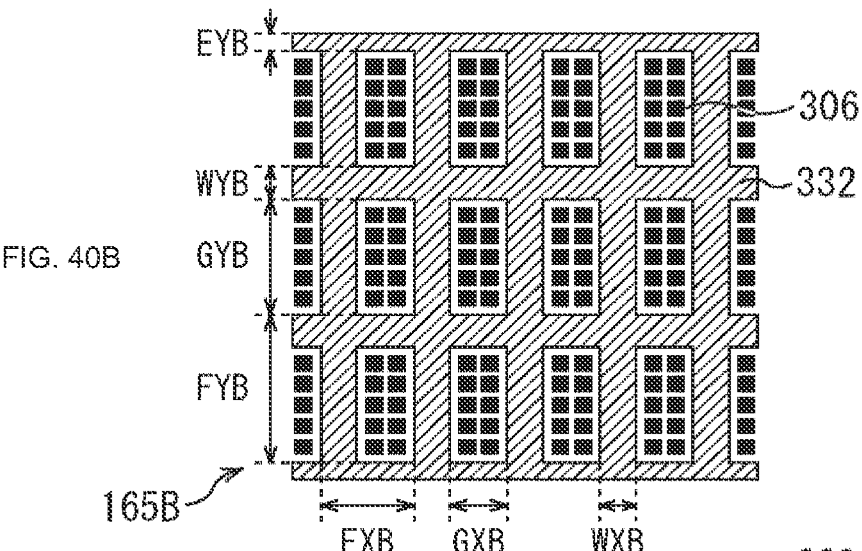
Figure 40C:
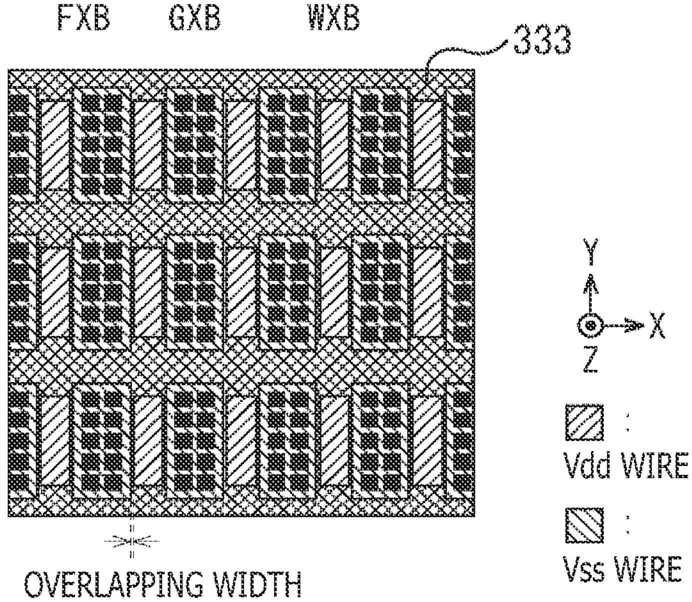

Next, FIGS. 40A, 40B, and 40C depict are a thirteenth configuration example of the conductor layers A and B. Note that FIG. 40A depicts the conductor layer A, and FIG. 40B depicts the conductor layer B. In the coordinate system in FIGS. 40A, 40B, and 40C, the X axis lies in the lateral direction, the Y axis lies in the longitudinal direction, and the Z axis lies in a direction perpendicular to the XY plane.

The conductor layer A in the thirteenth configuration example includes a mesh conductor 331. The mesh conductor 331 has a shape similar to that of the mesh conductor 311 in the conductor layer A in the eleventh configuration example (FIGS. 36A, 36B, and 36C), and so an explanation thereof is omitted. The mesh conductor 331 is a wire (Vss wire) connected to GND or a negative power supply, for example.

The conductor layer B in the thirteenth configuration example includes a mesh conductor 332 and relay conductors 306. The mesh conductor 332 has a shape similar to that of the mesh conductor 312 in the conductor layer B in the eleventh configuration example (FIGS. 36A, 36B, and 36C), and so an explanation thereof is omitted. The mesh conductor 332 is a wire (Vdd wire) connected to a positive power supply, for example.

The relay conductors (other conductors) 306 are obtained by dividing each of the relay conductors 305 in the twelfth configuration example (FIGS. 39A, 39B, and 39C) into multiple pieces (ten pieces in the case of FIGS. 40A, 40B, and 40C) with intervals being provided therebetween. The relay conductors 306 are arranged in oblong rectangular gap regions that are in the mesh conductor 332 and are long in the Y direction. The relay conductors 306 are electrically insulated from the mesh conductor 332 and are connected to Vss connected with the mesh conductor 331 in the conductor layer A. The number of division of each relay conductor and whether or not the relay conductors are connected to Vss may differ between different regions. Because the current distribution can be adjusted finely at the time of designing in this case, this can lead to inductive noise suppression and a reduction of voltage drops (IR-Drop).

Note that the shapes of the relay conductors 306 can be any shapes and desirably are circular or polygonal shapes which have symmetry like rotational symmetry, mirror symmetry, or the like. The number of division of each relay conductor 306 can be modified as desired. The relay conductors 306 can be arranged at the middle positions or any other positions in gap regions of the mesh conductor 332. The relay conductors 306 may be connected to a conductor layer as a Vss wire other than the conductor layer A. The relay conductors 306 may be connected to a conductor layer as a Vss wire on a side closer to an active element group 167 than to the conductor layer B. The relay conductors 306 can be connected to a conductor layer other than the conductor layer A, or a conductor layer or the like on a side closer to an active element group 167 than to the conductor layer B, via conductor vias extending in the Z direction.

FIG. 40C depicts a state of the conductor layers A and B depicted in in FIGS. 40A and 40B, respectively, as seen from the side where photodiodes 141 are located (the backside). It should be noted however that hatched regions 333 in which diagonal lines cross in FIG. 40C represent regions where the mesh conductor 331 in the conductor layer A and the mesh conductor 332 in the conductor layer B overlap. Because an active element group 167 is covered with at least one of the conductor layer A or the conductor layer B in the case of the thirteenth configuration example, hot carrier light emissions from the active element group 167 can be blocked.

In a case in which currents flow similarly to the case depicted in FIG. 37 in the thirteenth configuration example, magnetic flux substantially in the X direction and substantially in the Y direction occurs more easily between the mesh conductor 331, which is a Vss wire, and the mesh conductor 332, which is a Vdd wire, due to conductor loops that include (cross-sections of) the mesh conductors 331 and 332 in cross-sections along which the mesh conductors 331 and 332 are arranged and have loop planes that are almost perpendicular to the X axis, and conductor loops that include (cross-sections of) the mesh conductors 331 and 332 in cross-sections along which the mesh conductors 331 and 332 are arranged and have loop planes that are almost perpendicular to the Y axis.

Furthermore, in the case of the thirteenth configuration example, the regions 333 where the mesh conductor 331 and the mesh conductor 332 overlap are continuous in the X direction. Because currents with mutually different polarities flow through the mesh conductor 331 and the mesh conductor 332 in the regions 333, magnetic fields generated from the regions 333 are cancelled out with each other. Therefore, the occurrence of inductive noise near the regions 333 can be suppressed.

In addition, in the case of the thirteenth configuration example, providing the relay conductors 306 makes it possible to connect the mesh conductor 331, which is a Vss wire, with the active element group 167 with substantially the shortest distance or with a short distance. Connecting the mesh conductor 331 and the active element group 167 with substantially the shortest distance or with a short distance makes it possible to reduce voltage drops, energy loss, or inductive noise between the mesh conductor 331 and the active element group 167.

Furthermore, it is possible in the thirteenth configuration example to make the current distribution in the conductor layer A and the current distribution in the conductor layer B substantially uniform and have reverse polarities by dividing each relay conductor 306 into multiple pieces. Accordingly, it is possible to make a magnetic field generated from the conductor layer A and a magnetic field generated from the conductor layer B cancel each other. Accordingly, it is possible in the thirteenth configuration example to make it difficult for a difference to be generated between the current distributions in Vdd wires and Vss wires due to an external factor. Therefore, the sixteenth configuration example is suitable for a case in which current distributions on the XY plane are complicated, and a case in which the impedances of conductors connected to the mesh conductors 331 and 332 are different between the Vdd wires and the Vss wires.

Note that the thirteenth configuration example may be used by being rotated by 90 degrees on the XY plane. In addition, the thirteenth configuration example may be used by being rotated not only by 90 degrees, but by any angle. For example, the thirteenth configuration example may be modified to be at an angle relative to the X axis and the Y axis.

<Results of Simulations of Twelfth and Thirteenth Configuration Examples>

Figure 41A:
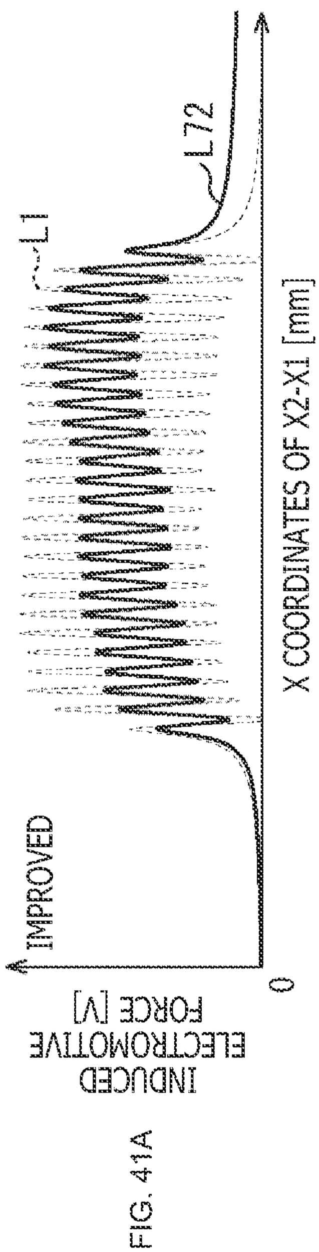
FIGS. 41A and 41B are figures depicting results of simulations of inductive noise corresponding to the twelfth and thirteenth configuration examples.
Figure 41B:
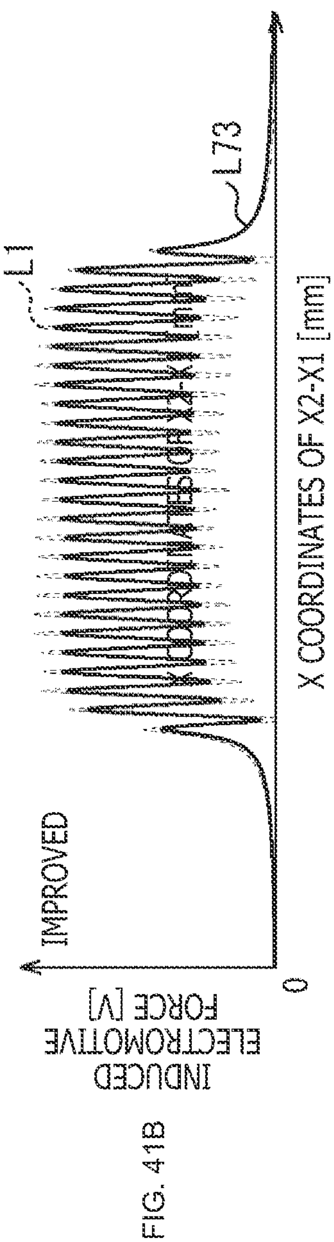

FIGS. 41A and 41B depict changes of induced electromotive forces that generate inductive noise in images, as results of simulations of the cases in which the twelfth configuration example (FIGS. 39A, 39B, and 39C) and the thirteenth configuration example (FIGS. 40A, 40B, and 40C) are applied to the solid-state image pickup apparatus 100. Note that it is assumed that conditions of electric currents flowing in the twelfth and thirteenth configuration examples are similar to those in the case depicted in FIGS. 37A, 37B, and 37C. The horizontal axis in FIGS. 41A and 41B represent the X-axis coordinate of images, and the vertical axis represents the magnitudes of the induced electromotive forces.

A solid line L72 in FIG. 41A corresponds to the twelfth configuration example (FIGS. 39A, 39B, and 39C), and the dotted line L1 corresponds to the first comparative example (FIGS. 9A, 9B, and 9C). As is apparent from a comparison between the solid line L72 and the dotted line L1, it can be known that the twelfth configuration example does not vary an induced electromotive force generated to the Victim conductor loop as compared with the first comparative example. Therefore, as compared with the first comparative example, the twelfth configuration example can suppress inductive noise in an image output from the solid-state image pickup apparatus 100. It should be noted however that the simulation result represents a result of a simulation of a case in which the mesh conductor 321 is not connected with an active element group 167 and the mesh conductor 322 is not connected with an active element group 167. For example, in a case in which the mesh conductor 321 and at least part of an active element group 167 are connected with each other with substantially the shortest distance or with a short distance via conductor vias or the like, or in a case in which the mesh conductor 322 and at least part of an active element group 167 are connected with each other with substantially the shortest distance or with a short distance via conductor vias or the like, the amount of currents flowing through the mesh conductor 321 or the mesh conductor 322 gradually decreases depending on positions. In such a case, there is also a condition under which voltage drops, energy loss, or inductive noise are/is ameliorated significantly to be half or smaller by providing the relay conductors 305.

A solid line L73 in FIG. 41B corresponds to the thirteenth configuration example (FIGS. 40A, 40B, and 40C), and the dotted line L1 corresponds to the first comparative example (FIGS. 9A, 9B, and 9C). As is apparent from a comparison between the solid line L73 and the dotted line L1, it can be known that the thirteenth configuration example does not vary an induced electromotive force generated to the Victim conductor loop as compared with the first comparative example. Therefore, as compared with the first comparative example, the thirteenth configuration example can suppress inductive noise in an image output from the solid-state image pickup apparatus 100. It should be noted however that the simulation result represents a result of a simulation of a case in which the mesh conductor 331 is not connected with an active element group 167 and the mesh conductor 332 is not connected with an active element group 167. For example, in a case in which the mesh conductor 331 and at least part of an active element group 167 are connected with each other with substantially the shortest distance or with a short distance via conductor vias or the like, or in a case in which the mesh conductor 332 and at least part of an active element group 167 are connected with each other with substantially the shortest distance or with a short distance via conductor vias or the like, the amount of currents flowing through the mesh conductor 331 or the mesh conductor 332 gradually decreases depending on positions. In such a case, there is also a condition under which voltage drops, energy loss, or inductive noise are/is ameliorated significantly to be half or smaller by providing the relay conductors 306.

5. Arrangement Examples of Electrodes in Semiconductor Board in which Conductor Layers A and B are Formed Next, arrangements of electrodes in a semiconductor board in which conductors with different Y-direction and X-direction resistance values are formed as in the eleventh to thirteenth configuration examples of the conductor layers A and B mentioned above are explained.

Note that, in examples explained in the following explanation, the thirteenth configuration example (FIGS. 40A, 40B, and 40C) including the conductor layers A and B including conductors (the mesh conductors 331 and 332) with Y-direction resistance values smaller than their X-direction resistance values is formed in a semiconductor board. It should be noted however that a similar explanation applies also to a case in which the eleventh and twelfth configuration examples of the conductor layers A and B including conductors with Y-direction resistance values smaller than their X-direction resistance values are formed on the semiconductor board.

In the thirteenth configuration example of the conductor layers A and B formed in the semiconductor board, the Y-direction resistance values of the conductors (mesh conductors 331 and 332) are smaller than their X-direction resistance values, and so currents flow more easily in the Y direction. Accordingly, in order to reduce voltage drops (IR-Drop) in the conductors in the thirteenth configuration example of the conductor layers A and B as much as possible, multiple pads (electrodes) to be arranged on the semiconductor board are desirably arranged more densely in the X direction, in which direction the conductors have larger resistance values, than in the Y direction, in which direction the conductors have smaller resistance values, but they may be arranged more densely in the Y direction than in the X direction.

<First Arrangement Example of Pads on Semiconductor Board>

FIGS. 42A, 42B, 42C, 42D, and 42E are plan views depicting a first arrangement example in which pads are arranged more densely in the X direction than in the Y direction on a semiconductor board. Note that, in the coordinate system in FIGS. 42A, 42B, 42C, 42D, and 42E, the X axis lies in the lateral direction, the Y axis lies in the longitudinal direction, and the Z axis lies in a direction perpendicular to the XY plane.

Figure 42A:
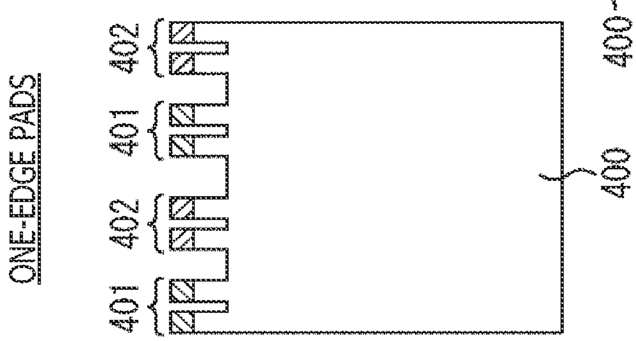
FIGS. 42A, 42B, 42C, 42D, and 42E are plan views depicting a first arrangement example of pads in a semiconductor board.
Figure 42B:
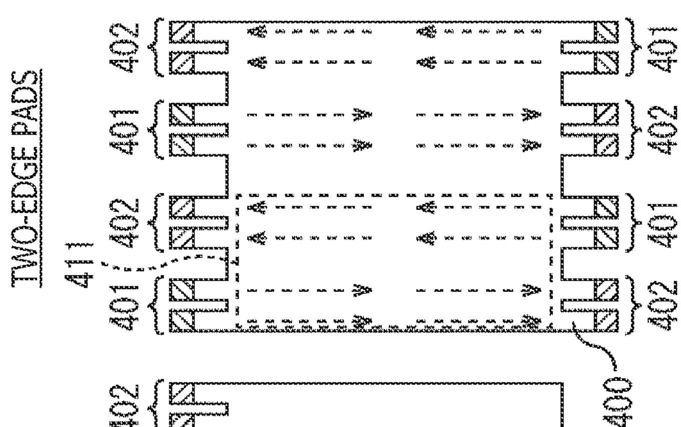

FIG. 42A depicts a case in which pads are arranged along one edge of a wire region 400 in which the multiple thirteenth configuration examples (FIGS. 40A, 40B, and 40C) including the conductor layers A and B are formed. B in FIG. 42B depicts a case in which pads are arranged along two edges that are opposite to each other in the Y direction of the wire region 400 in which the multiple thirteenth configuration examples (FIGS. 40A, 40B, and 40C) including the conductor layers A and B are formed. Note that dotted arrows in the figure represent examples of the directions of currents flowing therethrough, and a current loop 411 due to the currents represented by the dotted arrows is generated. The directions of currents represented by the dotted arrows change from moment to moment.

Figure 42C:
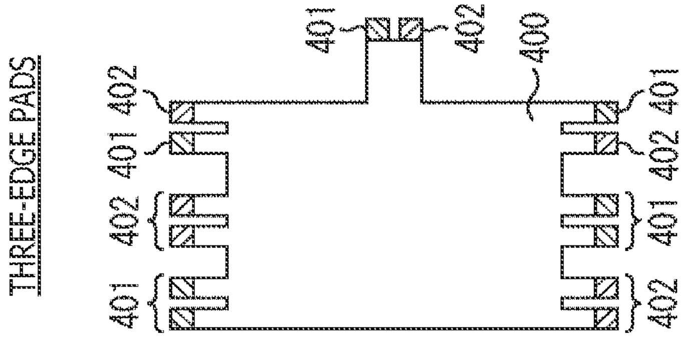
Figure 42D:
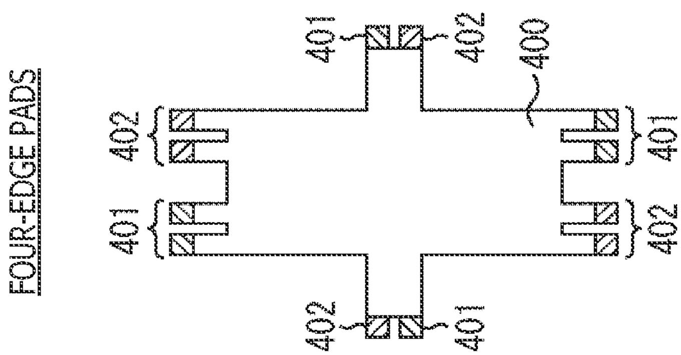
Figure 42E:
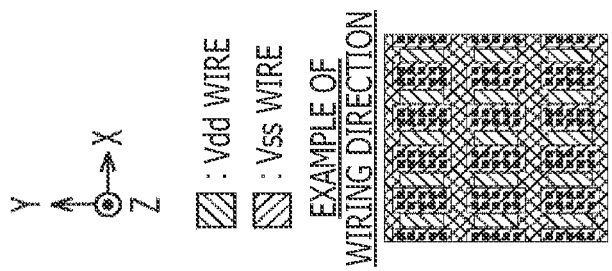

FIG. 42C depicts a case in which pads are arranged along three edges of the wire region 400 in which the multiple thirteenth configuration examples (FIGS. 40A, 40B, and 40C) including the conductor layers A and B are formed. D in FIG. 42D depicts a case in which pads are arranged along four edges of the wire region 400 in which the multiple thirteenth configuration examples (FIGS. 40A, 40B, and 40C) including the conductor layers A and B are formed. FIG. 42E depicts the directions of the multiple thirteenth configuration examples of the conductor layers A and B formed in the wire region 400.

Pads 401 arranged in the wire region 400 are connected to a Vdd wire, and pads 402 are wires (Vss wires) connected to GND or a negative power supply, for example.

Each of the pads 401 and 402 in the case of the first arrangement example depicted in FIGS. 42A, 42B, 420, 42D, and 42E include one pad or multiple pads (two pads in the case of FIGS. 42A, 42B, 42C, 42D, and 42E) arranged adjacent to each other. The pads 401 and 402 are arranged adjacent to each other. A pad 401 including one pad, and a pad 402 including one pad are arranged adjacent to each other, and a pad 401 including two pads and a pad 402 including two pads are arranged adjacent to each other. The polarities of the pads 401 and 402 (points to which the pads 401 and 402 are connected are one of and the other of a Vdd wire and a Vss wire) are reverse polarities. The number of pads 401 to be arranged in the wire region 400 and the number of the pads 402 to be arranged in the wire region 400 are substantially the same numbers.

Thereby, the distributions of currents to flow through the conductor layers A and B formed in the wire region 400 can be made substantially uniform and given reverse polarities, and so magnetic fields generated from the conductor layers A and B and induced electromotive forces based on the magnetic fields can be offset effectively.

In addition, in a case in which pads are formed along two or more edges of the wire region 400 as depicted in FIGS. 42B, 42C, and 42D, the polarities of pads that are arranged along opposite edges and are opposite to each other are set to reverse polarities. Thereby, as represented by the dotted arrows in FIG. 42B, currents in the same direction are distributed more easily at positions in the wire region 400 with the same X coordinate and different Y coordinates.

<Second Arrangement Example of Pads on Semiconductor Board>

Next, FIGS. 43A, 43B, 43C, and 43D are plan views depicting a second arrangement example in which pads are arranged more densely in the X direction than in the Y direction on a semiconductor board. Note that, in the coordinate system in FIGS. 43A, 43B, 43C, and 43D, the X axis lies in the lateral direction, the Y axis lies in the longitudinal direction, and the Z axis lies in a direction perpendicular to the XY plane.

Figure 43A:
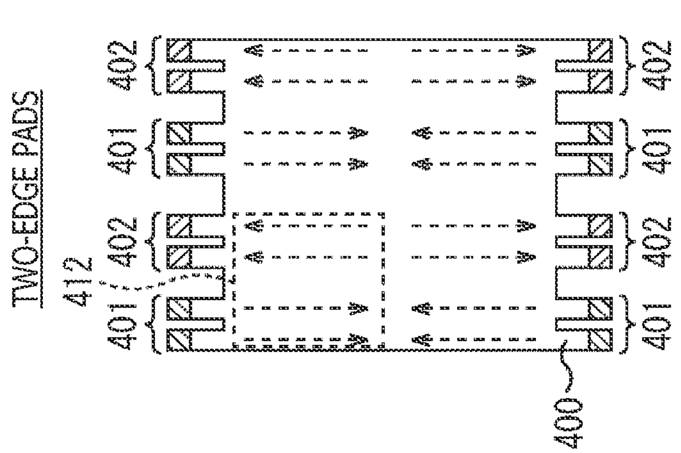
FIGS. 43A, 43B, 43C, and 43D are plan views depicting a second arrangement example of pads in the semiconductor board.

FIG. 43A depicts a case in which pads are arranged along two edges that are opposite to each other in the Y direction of the wire region 400 in which the multiple thirteenth configuration examples (FIGS. 40A, 40B, and 40C) including the conductor layers A and B are formed. Note that dotted arrows in the figure represent the directions of currents flowing therethrough, and a current loop 412 due to the currents represented by the dotted arrows is generated. The directions of currents represented by the dotted arrows change from moment to moment.

Figure 43B:
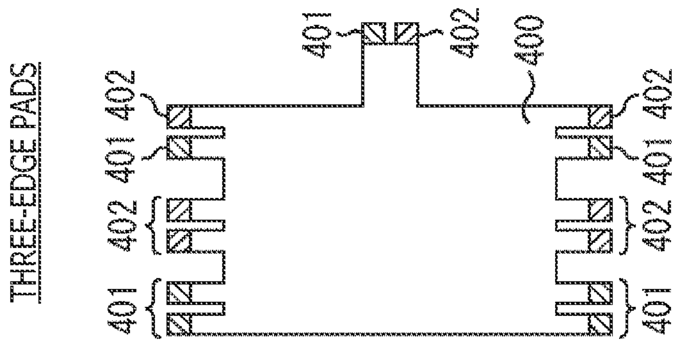
Figure 43C:
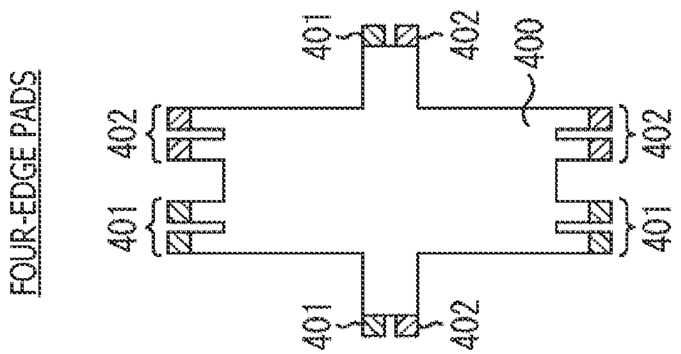
Figure 43D:
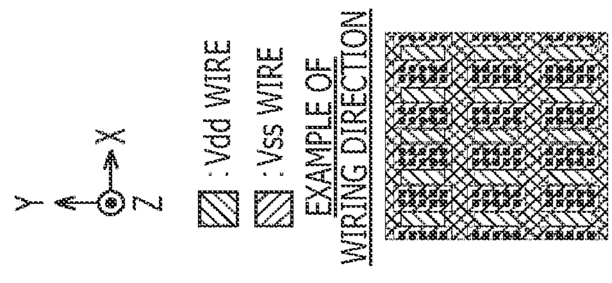

FIG. 43B depicts a case in which pads are arranged along three edges of the wire region 400 in which the multiple thirteenth configuration examples (FIGS. 40A, 40B, and 40C) including the conductor layers A and B are formed. C in FIG. 43C depicts a case in which pads are arranged along four edges of the wire region 400 in which the multiple thirteenth configuration examples (FIGS. 40A, 40B, and 40C) including the conductor layers A and B are formed. Din FIG. 43D depicts the directions of the multiple thirteenth configuration examples of the conductor layers A and B formed in the wire region 400.

Pads 401 arranged in the wire region 400 are connected to a Vdd wire, and pads 402 are wires (Vss wires) connected to GND or a negative power supply, for example.

The pads 401 and 402 in the case of the second arrangement example depicted in FIGS. 43A, 43B, 43C, and 43D include multiple pads (two pads in the case of FIGS. 43A, 43B, 43C, and 43D) arranged adjacent to each other. The pads 401 and 402 are arranged adjacent to each other. A pad 401 including one pad and a pad 402 including one pad are arranged adjacent to each other, and a pad 401 including two pads and a pad 402 including two pads are arranged adjacent to each other. The polarities of the pads 401 and 402 (points to which the pads 401 and 402 are connected are one of and the other of a Vdd wire and a Vss wire) are reverse polarities. The number of pads 401 to be arranged in the wire region 400 and the number of the pads 402 to be arranged in the wire region 400 are substantially the same numbers.

Thereby, the distributions of currents to flow through the conductor layers A and B formed in the wire region 400 can be made substantially uniform and given reverse polarities, and so magnetic fields generated from the conductor layers A and B and induced electromotive forces based on the magnetic fields can be offset effectively.

Furthermore, the polarities of pads that are arranged along opposite edges and are opposite to each other are the same polarities in the second arrangement example. It should be noted however that the polarities of some of pads that are arranged along opposite edges and are opposite to each other may be reverse polarities. Thereby, the current loop 412 which is smaller than the current loop 411 depicted in FIG. 42B is generated in the wire region 400. The size of a current loop influences the distribution range of a magnetic field. The smaller the electrical field loop is, the narrower the distribution range of the magnetic field is. Accordingly, the distribution range of the magnetic field is narrower in the second arrangement example as compared with the first arrangement example. Therefore, as compared with the first arrangement example, the second arrangement example can reduce induced electromotive forces to be generated and inductive noise based on the induced electromotive forces.

<Third Arrangement Example of Pads on Semiconductor Board>

Next, FIGS. 44A, 44B, 44C, and 44D are plan views depicting a third arrangement example in which pads are arranged more densely in the X direction than in the Y direction on a semiconductor board. Note that, in the coordinate system in FIGS. 44A, 44B, 44C, and 44D, the X axis lies in the lateral direction, the Y axis lies in the longitudinal direction, and the Z axis lies in a direction perpendicular to the XY plane.

Figures 44A, 44B, 44C, 44D, 44E:
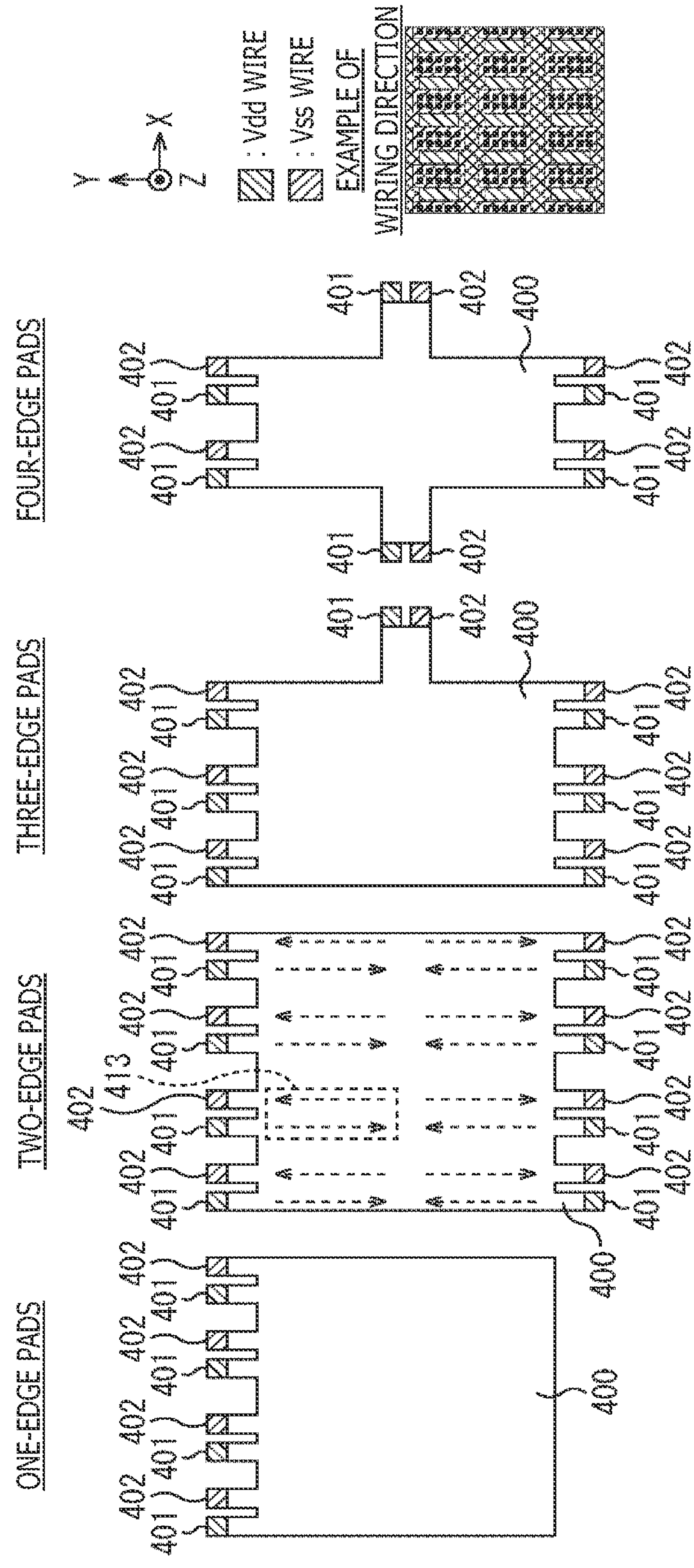
FIGS. 44A, 44B, 44C, 44D, and 44E are plan views depicting a third arrangement example of pads in the semiconductor board.

FIG. 44A depicts a case in which pads are arranged along one edge of the wire region 400 in which the multiple thirteenth configuration examples (FIGS. 40A, 40B, and 40C) including the conductor layers A and B are formed. FIG. 44B depicts a case in which pads are arranged along two edges that are opposite to each other in the Y direction of the wire region 400 in which the multiple thirteenth configuration examples (FIGS. 40A, 40B, and 40C) including the conductor layers A and B are formed. Note that dotted arrows in the figure represent the directions of currents flowing therethrough, and a current loop 413 due to the currents represented by the dotted arrows is generated.

FIG. 44C depicts a case in which pads are arranged along three edges of the wire region 400 in which the multiple thirteenth configuration examples (FIGS. 40A, 40B, and 40C) including the conductor layers A and B are formed. FIG. 44D depicts a case in which pads are arranged along four edges of the wire region 400 in which the multiple thirteenth configuration examples (FIGS. 40A, 40B, and 40C) including the conductor layers A and B are formed.

FIG. 44E depicts the directions of the multiple thirteenth configuration examples of the conductor layers A and B formed in the wire region 400.

Pads 401 arranged in the wire region 400 are connected to a Vdd wire, and pads 402 are wires (Vss wires) connected to GND or a negative power supply, for example.

In the case of the third arrangement example depicted in FIGS. 44A, 44B, 44C, and 44D, the polarities of pads (points to which the pads are connected are one of and the other of a Vdd wire and a Vss wire) forming a pad group including multiple pads (two pads in the case of FIGS. 44A, 44B, 44C, and 44D) arranged adjacent to each other are reverse polarities. The number of pads 401 to be arranged along one edge or all the edges of the wire region 400 and the number of the pads 402 to be arranged along one edge or all the edges of the wire region 400 are substantially the same numbers.

Furthermore, the polarities of pads that are arranged along opposite edges and are opposite to each other are the same polarities in the third arrangement example. It should be noted however that the polarities of some of pads that are arranged along opposite edges and are opposite to each other may be reverse polarities.

Thereby, the current loop 413 which is smaller than the current loop 412 depicted in FIG. 43A is generated in the wire region 400. Accordingly, the distribution range of the magnetic field is narrower in the third arrangement example as compared with the second arrangement example. Therefore, as compared with the second arrangement example, the third arrangement example can reduce induced electromotive forces to be generated and inductive noise based on the induced electromotive forces.

<Examples of Conductors with Different Y-Direction Resistance Values and X-Direction Resistance Values>

Figure 45A:
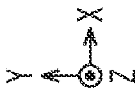
FIGS. 45A, 45B, 45C, 45D, 45E, and 45F are figures depicting examples of conductors with an X-direction resistance value and a Y-direction resistance value that are different from each other.
Figure 45A:
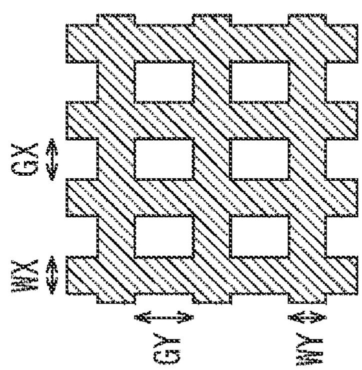
Figure 45B:
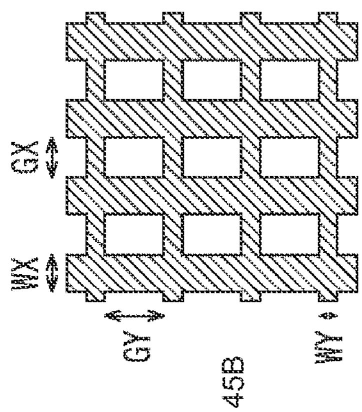
Figure 45C:
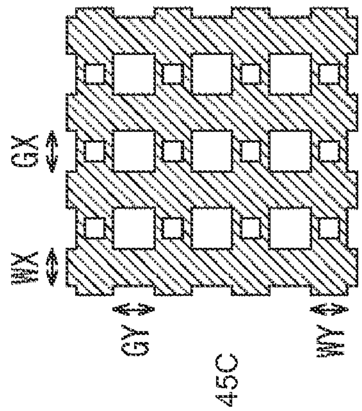
Figure 45D:
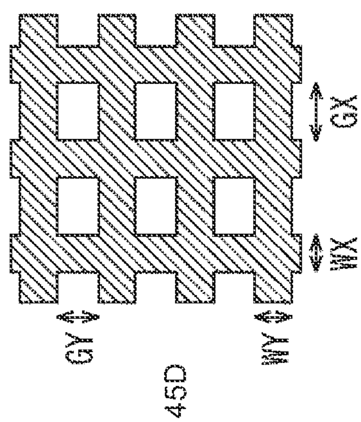
Figure 45E:
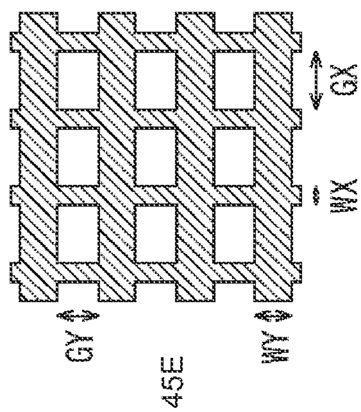
Figure 45F:
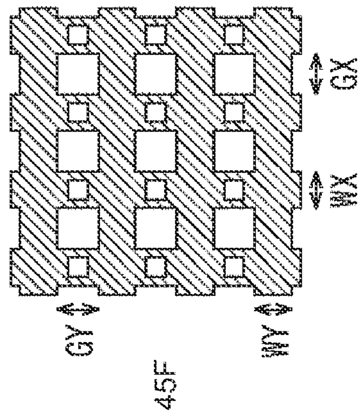

FIGS. 45A, 45B, 45C, 45D, 45E, and 45F are plan views depicting other examples of conductors included in the conductor layers A and B. That is, FIGS. 45A, 45B, 45C, 45D, 45E, and 45F are plan views depicting examples of conductors having a Y-direction resistance value and an X-direction resistance value that are different from each other. Note that FIGS. 45A, 45B, and 45C depict examples in which Y-direction resistance values are smaller than X-direction resistance values, and FIGS. 45D, 45E, and 45F depict examples in which X-direction resistance values are smaller than Y-direction resistance values.

FIG. 45A depicts a mesh conductor having an X-direction conductor width WX and a Y-direction conductor width WY which are equal to each other, and an X-direction gap width GX which is narrower than a Y-direction gap width GY. FIG. 45B depicts a mesh conductor having the X-direction conductor width WX wider than the Y-direction conductor width WY, and the X-direction gap width GX which is narrower than the Y-direction gap width GY. FIG. 45C depicts a mesh conductor having the X-direction conductor width WX and the Y-direction conductor width WY which are equal to each other, and the X-direction gap width GX and the Y-direction gap width GY which are equal to each other. The mesh conductor is provided with holes in regions which are in sections having the conductor width WY and longer in the X direction and do not cross sections having the conductor width WX and longer in the Y direction.

FIG. 45D depicts a mesh conductor having the X-direction conductor width WX and the Y-direction conductor width WY which are equal to each other, and the X-direction gap width GX which is wider than the Y-direction gap width GY. FIG. 45E depicts a mesh conductor having the X-direction conductor width WX narrower than the Y-direction conductor width WY, and the X-direction gap width GX which is wider than the Y-direction gap width GY. F in FIG. 45E depicts a mesh conductor having the X-direction conductor width WX and the Y-direction conductor width WY which are equal to each other, and the X-direction gap width GX and the Y-direction gap width GY which are equal to each other. The mesh conductor is provided with holes in regions which are in sections having the conductor width WX and longer in the Y direction and do not cross sections having the conductor width WY and longer in the X direction.

In a case in which conductors like the ones depicted in FIGS. 45A, 45B, and 45C whose Y-direction resistance values are smaller than their X-direction resistance values, and in which currents flow more easily in the Y direction are formed in the wire region 400, the first to third arrangement examples of pads in the wire region 400 depicted in FIGS. 42A, 42B, 42C, 42D, 42E, 43A, 43B, 43C, 43D, 44A, 44B, 44C, 44D, and 44E provide an effect of suppressing voltage drops (IR-Drop) in the conductors.

In addition, in a case in which conductors like the ones depicted in FIGS. 45D, 45E, and 45F whose X-direction resistance values are smaller than their Y-direction resistance values, and in which currents flow more easily in the X direction are formed in the wire region 400, it can be expected that the first to third arrangement examples of pads in the wire region 400 depicted in FIGS. 42A, 42B, 42C, 42D, 442E, 43A, 43B, 43C, 43D, 44A, 44B, 44C, 44D, and 44E provide an effect of being able to suppress the occurrence of inductive noise because the currents are diffused more easily in the X direction and it becomes difficult for magnetic fields near pads arranged along edges of the wire region 400 to be concentrated.

6. Modification Examples of Configuration Examples of Conductor Layers A and B Next, modification examples of several configuration examples in the first to thirteenth configuration examples of the conductor layers A and B mentioned above are explained.

Figure 46C:
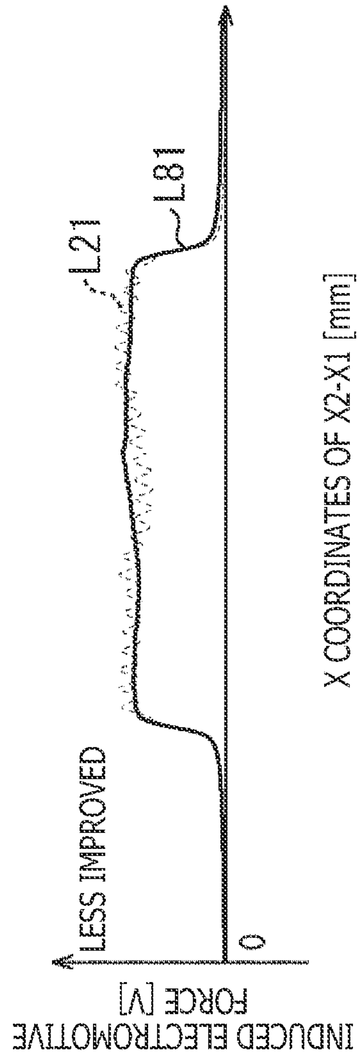
FIGS. 46A, 46B, and 46C are figures depicting a modification example in which X-direction conductor pitches in the second configuration example of the conductor layers A and B are halved, and depicting an effect attained thereby.
Figure 46B:
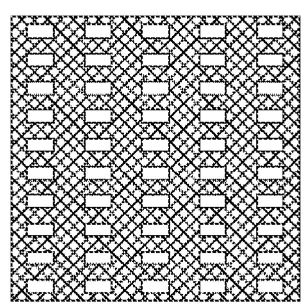
Figure 46A:
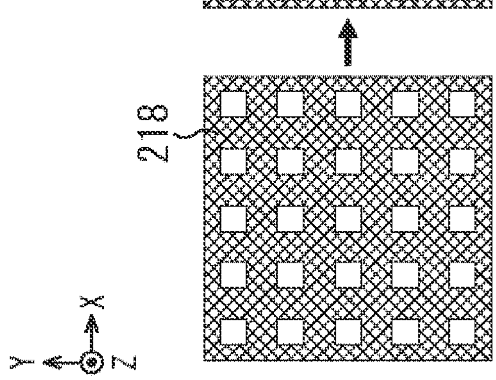

FIGS. 46A, 46B, and 46C are figures depicting a modification example in which the X-direction conductor pitches in the second configuration example (FIGS. 15A, 15B, and 15C) of the conductor layers A and B are halved, and depicting an effect attained thereby. Note that FIG. 46A depicts the second configuration example of the conductor layers A and B, and 46B depicts the modification example of the second configuration example of the conductor layers A and B.

FIG. 46C depicts changes of an induced electromotive force that generates inductive noise in an image, as a result of a simulation of the case in which the modification example depicted in FIG. 46B is applied to the solid-state image pickup apparatus 100. Note that it is assumed that the condition of electric currents flowing in this modification example is similar to that in the case depicted in FIG. 13. The horizontal axis in FIGS. 46A, 46B, and 46C represent the X-axis coordinate of an image, and the vertical axis represents the magnitude of an induced electromotive force.

A solid line L81 in FIG. 46C corresponds to the modification example depicted in FIG. 46B, and a dotted line L21 corresponds to the second configuration example (FIGS. 15A, 15B, and 15C). As is apparent from a comparison between the solid line L81 and the dotted line L21, this modification example generates slightly smaller changes of an induced electromotive force generated to the Victim conductor loop as compared with the second configuration example. Therefore, it can be known that this modification example can suppress inductive noise slightly more as compared with the second configuration example.

Figures 47A, 47B, 47C:
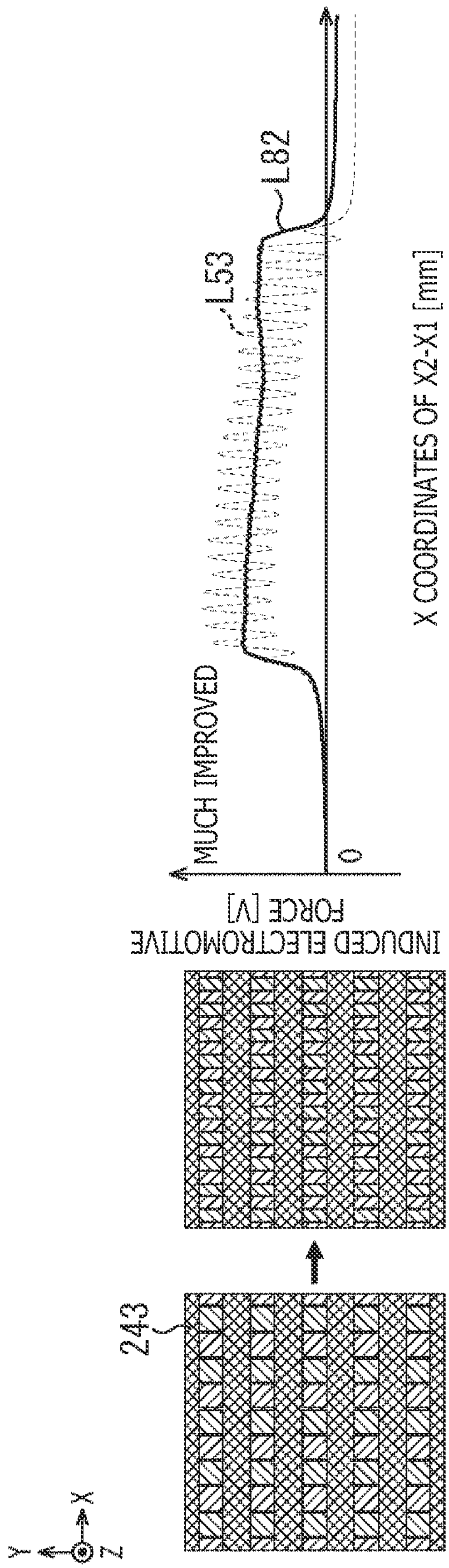
FIGS. 47A, 47B, and 47C are figures depicting a modification example in which the X-direction conductor pitches in the fifth configuration example of the conductor layers A and B are halved, and depicting an effect attained thereby.

FIGS. 47A, 47B, and 47C are figures depicting a modification example in which the X-direction conductor pitches in the fifth configuration example (FIGS. 26A, 26B, and 26C) of the conductor layers A and B are halved, and depicting an effect attained thereby. Note that FIG. 47A depicts the fifth configuration example of the conductor layers A and B, and 47B depicts the modification example of the fifth configuration example of the conductor layers A and B.

FIG. 47C depicts changes of an induced electromotive force that generates inductive noise in an image, as a result of a simulation of the case in which the modification example depicted in FIG. 47B is applied to the solid-state image pickup apparatus 100. Note that it is assumed that the condition of electric currents flowing in this modification example is similar to that in the case depicted in FIG. 23. The horizontal axis in FIGS. 47A, 47B, and 47C represent the X-axis coordinate of an image, and the vertical axis represents the magnitude of an induced electromotive force.

A solid line L82 in FIG. 47C corresponds to the modification example depicted in FIG. 47B, and the dotted line L53 corresponds to the fifth configuration example (FIGS. 26A, 26B, and 26C). As is apparent from a comparison between the solid line L82 and the dotted line L53, this modification example generates much smaller changes of an induced electromotive force generated to the Victim conductor loop as compared with the fifth configuration example. Therefore, it can be known that this modification example can further suppress inductive noise as compared with the fifth configuration example.

Figure 48C:
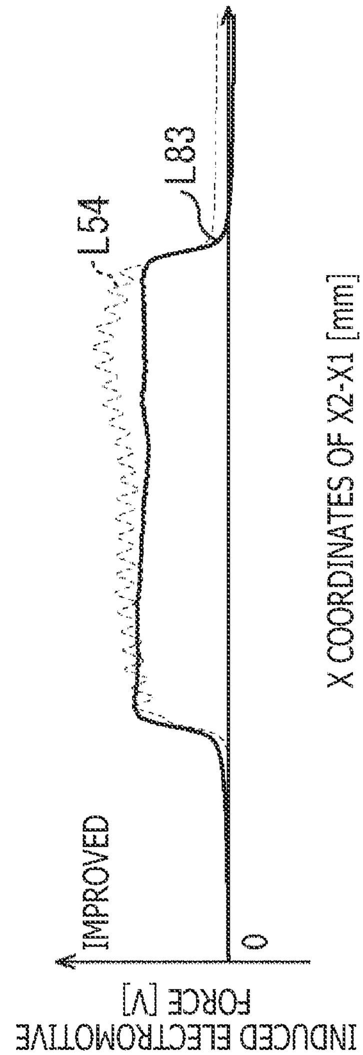
FIGS. 48A, 48B, and 48C are figures depicting a modification example in which the X-direction conductor pitches in the sixth configuration example of the conductor layers A and B are halved, and depicting an effect attained thereby.
Figure 48B:
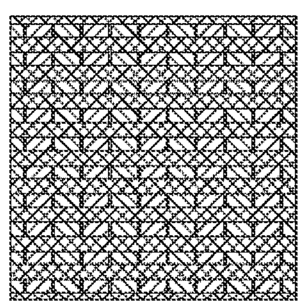
Figure 48A:
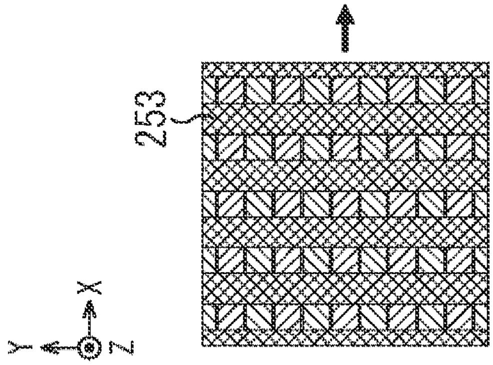

FIGS. 48A, 48B, and 48C are figures depicting a modification example in which the X-direction conductor pitches in the sixth configuration example (FIGS. 27A, 27B, and 27C) of the conductor layers A and B are halved, and depicting an effect attained thereby. Note that FIG. 48A depicts the sixth configuration example of the conductor layers A and B, and 48B depicts the modification example of the sixth configuration example of the conductor layers A and B.

FIG. 48C depicts changes of an induced electromotive force that generates inductive noise in an image, as a result of a simulation of the case in which the modification example depicted in FIG. 48B is applied to the solid-state image pickup apparatus 100. Note that it is assumed that the condition of electric currents flowing in this modification example is similar to that in the case depicted in FIG. 23. The horizontal axis in FIGS. 48A, 48B, and 48C represent the X-axis coordinate of an image, and the vertical axis represents the magnitude of an induced electromotive force.

A solid line L83 in FIG. 48C corresponds to the modification example depicted in FIG. 48B, and the dotted line L54 corresponds to the sixth configuration example (FIGS. 27A, 27B, and 27C). As is apparent from a comparison between the solid line L83 and the dotted line L54, this modification example generates smaller changes of an induced electromotive force generated to the Victim conductor loop as compared with the sixth configuration example. Therefore, it can be known that this modification example can suppress inductive noise more as compared with the sixth configuration example.

Figure 49A:
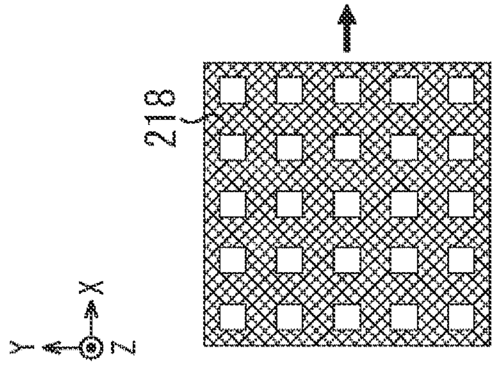
FIGS. 49A, 49B, and 49C are figures depicting a modification example in which Y-direction conductor pitches in the second configuration example of the conductor layers A and B are halved, and depicting an effect attained thereby.
Figure 49B:
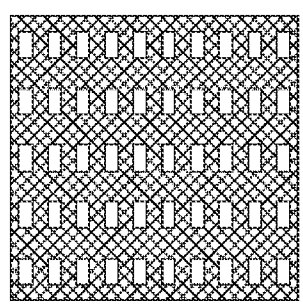
Figure 49C:
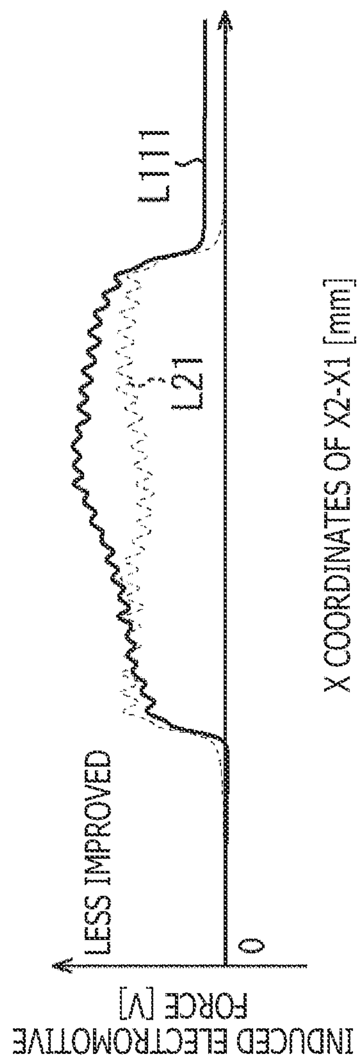

FIGS. 49A, 49B, and 49C are figures depicting a modification example in which the Y-direction conductor pitches in the second configuration example (FIGS. 15A, 15B, and 15C) of the conductor layers A and B are halved, and depicting an effect attained thereby. Note that FIG. 49A depicts the second configuration example of the conductor layers A and B, and 49B depicts the modification example of the second configuration example of the conductor layers A and B.

FIG. 49C depicts changes of an induced electromotive force that generates inductive noise in an image, as a result of a simulation of the case in which the modification example depicted in FIG. 49B is applied to the solid-state image pickup apparatus 100. Note that it is assumed that the condition of electric currents flowing in this modification example is similar to that in the case depicted in FIG. 13. The horizontal axis in FIGS. 49A, 49B, and 49C represent the X-axis coordinate of an image, and the vertical axis represents the magnitude of an induced electromotive force.

A solid line L111 in FIG. 49C corresponds to the modification example depicted in FIG. 49B, and the dotted line L21 corresponds to the second configuration example. As is apparent from a comparison between the solid line L111 and the dotted line L21, this modification example generates slightly smaller changes of an induced electromotive force generated to the Victim conductor loop as compared with the second configuration example. Therefore, it can be known that this modification example can suppress inductive noise slightly more as compared with the second configuration example.

Figure 50C:
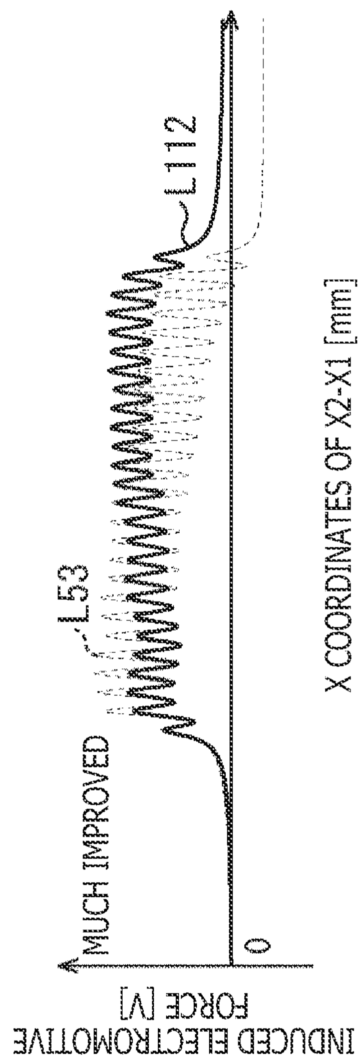
FIGS. 50A, 50B, and 50C are figures depicting a modification example in which the Y-direction conductor pitches in the fifth configuration example of the conductor layers A and B are halved, and depicting an effect attained thereby.
Figure 50B:
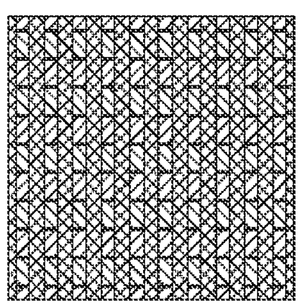
Figure 50A:
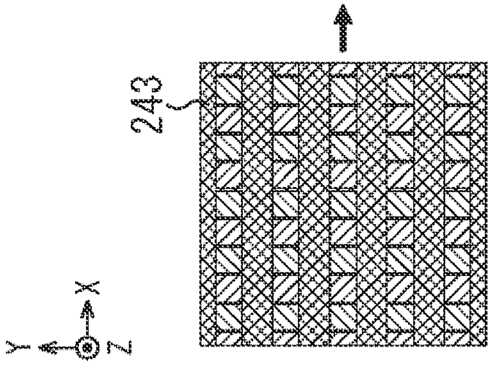

FIGS. 50A, 50B, and 50C are figures depicting a modification example in which the Y-direction conductor pitches in the fifth configuration example (FIGS. 26A, 26B, and 26C) of the conductor layers A and B are halved, and depicting an effect attained thereby. Note that FIG. 50A depicts the fifth configuration example of the conductor layers A and B, and 50B depicts the modification example of the fifth configuration example of the conductor layers A and B.

FIG. 50C depicts changes of an induced electromotive force that generates inductive noise in an image, as a result of a simulation of the case in which the modification example depicted in FIG. 50B is applied to the solid-state image pickup apparatus 100. Note that it is assumed that the condition of electric currents flowing in this modification example is similar to that in the case depicted in FIG. 23. The horizontal axis in FIGS. 50A, 50B, and 50C represent the X-axis coordinate of an image, and the vertical axis represents the magnitude of an induced electromotive force.

A solid line L112 in FIG. 50C corresponds to the modification example depicted in FIG. 50B, and the dotted line L53 corresponds to the fifth configuration example. As is apparent from a comparison between the solid line L112 and the dotted line L53, this modification example generates much smaller changes of an induced electromotive force generated to the Victim conductor loop as compared with the fifth configuration example. Therefore, it can be known that this modification example can further suppress inductive noise as compared with the fifth configuration example.

Figure 51C:
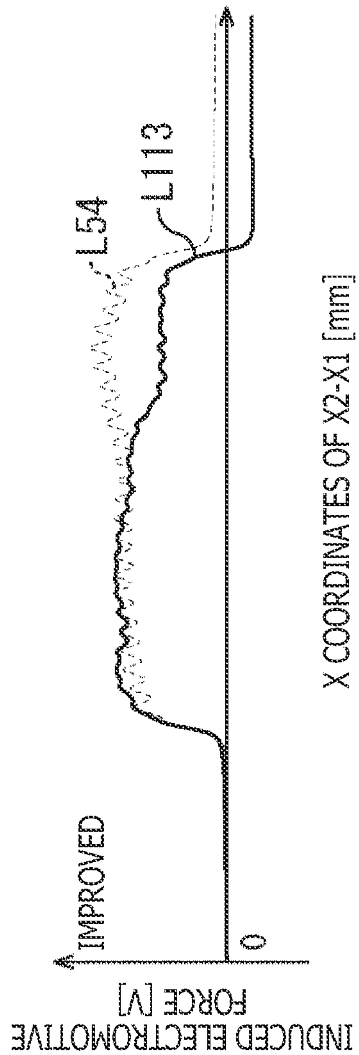
FIGS. 51A, 51B, and 51C are figures depicting a modification example in which the Y-direction conductor pitches in the sixth configuration example of the conductor layers A and B are halved, and depicting an effect attained thereby.
Figure 51B:
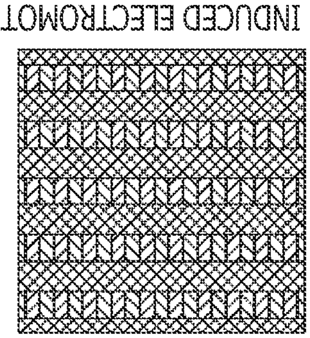
Figure 51A:
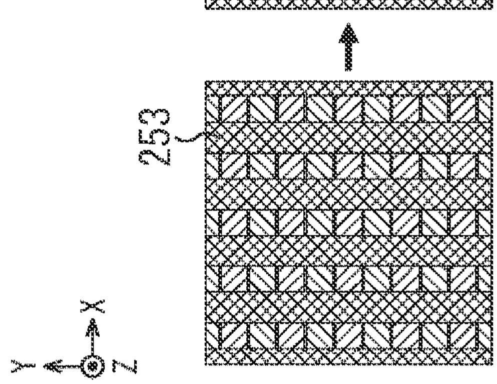

FIGS. 51A, 51B, and 51C are figures depicting a modification example in which the Y-direction conductor pitches in the sixth configuration example (FIGS. 27A, 27B, and 27C) of the conductor layers A and B are halved, and depicting an effect attained thereby. Note that FIG. 51A depicts the sixth configuration example of the conductor layers A and B, and 51B depicts the modification example of the sixth configuration example of the conductor layers A and B.

FIG. 51C depicts changes of an induced electromotive force that generates inductive noise in an image, as a result of a simulation of the case in which the modification example depicted in FIG. 51B is applied to the solid-state image pickup apparatus 100. Note that it is assumed that the condition of electric currents flowing in this modification example is similar to that in the case depicted in FIG. 23. The horizontal axis in FIGS. 51A, 51B, and 51C represent the X-axis coordinate of an image, and the vertical axis represents the magnitude of an induced electromotive force.

A solid line L113 in FIG. 51C corresponds to the modification example depicted in FIG. 51B, and the dotted line L54 corresponds to the sixth configuration example. As is apparent from a comparison between the solid line L113 and the dotted line L54, this modification example generates smaller changes of an induced electromotive force generated to the Victim conductor loop as compared with the sixth configuration example. Therefore, it can be known that this modification example can suppress inductive noise more as compared with the sixth configuration example.

Figures 52A, 52B, 52C:
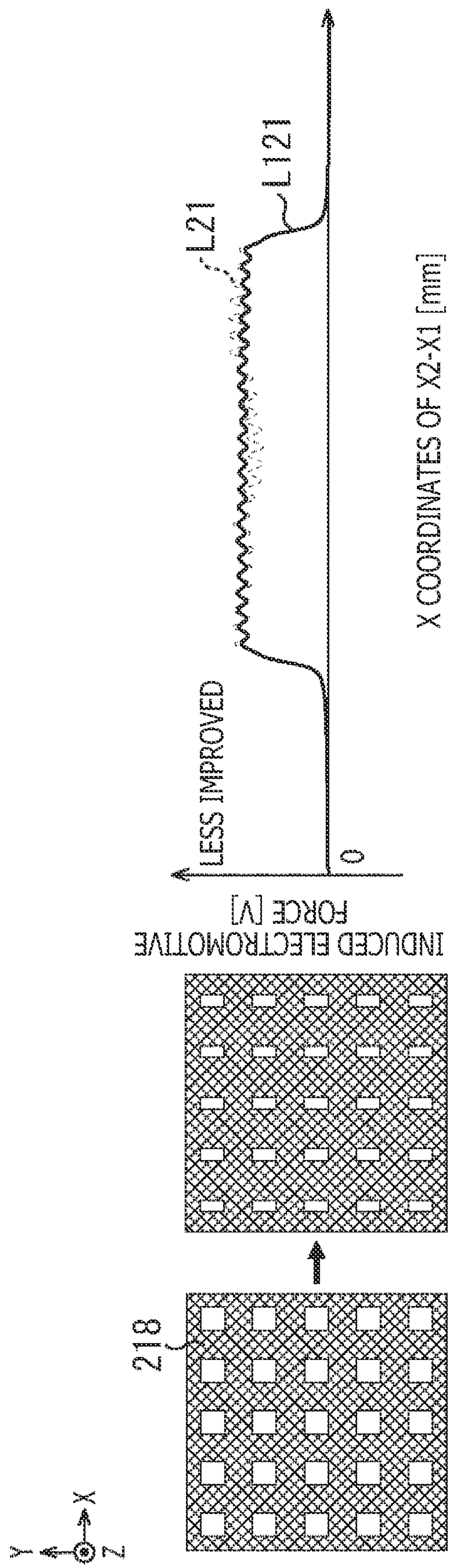
FIGS. 52A, 52B, and 52C are figures depicting a modification example in which X-direction conductor widths in the second configuration example of the conductor layers A and B are doubled, and depicting an effect attained thereby.

FIGS. 52A, 52B, and 52C are figures depicting a modification example in which the X-direction conductor widths in the second configuration example (FIGS. 15A, 15B, and 15C) of the conductor layers A and B are doubled, and depicting an effect attained thereby. Note that FIG. 52A depicts the second configuration example of the conductor layers A and B, and 52B depicts the modification example of the second configuration example of the conductor layers A and B.

FIG. 52C depicts changes of an induced electromotive force that generates inductive noise in an image, as a result of a simulation of the case in which the modification example depicted in FIG. 52B is applied to the solid-state image pickup apparatus 100. Note that it is assumed that the condition of electric currents flowing in this modification example is similar to that in the case depicted in FIG. 13. The horizontal axis in FIGS. 52A, 52B, and 52C represent the X-axis coordinate of an image, and the vertical axis represents the magnitude of an induced electromotive force.

A solid line L121 in FIG. 52C corresponds to the modification example depicted in FIG. 52B, and the dotted line L21 corresponds to the second configuration example. As is apparent from a comparison between the solid line L121 and the dotted line L21, this modification example generates slightly smaller changes of an induced electromotive force generated to the Victim conductor loop as compared with the second configuration example. Therefore, it can be known that this modification example can suppress inductive noise slightly more as compared with the second configuration example.

Figure 53C:
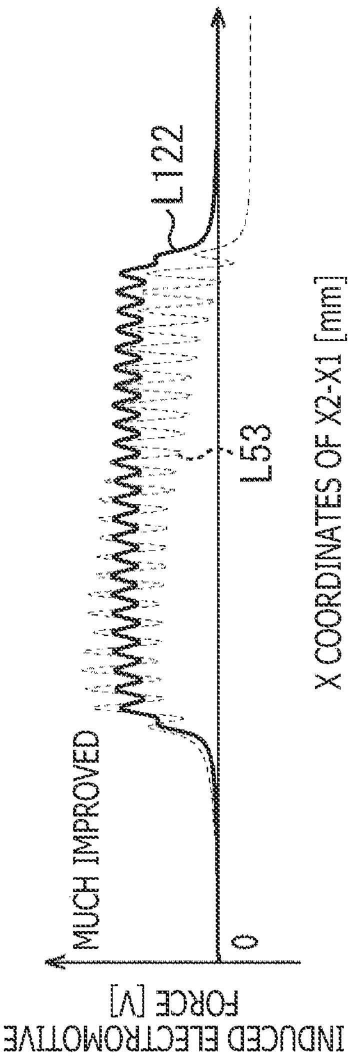
FIGS. 53A, 53B, and 53C are figures depicting a modification example in which the X-direction conductor widths in the fifth configuration example of the conductor layers A and B are doubled, and depicting an effect attained thereby.
Figure 53B:
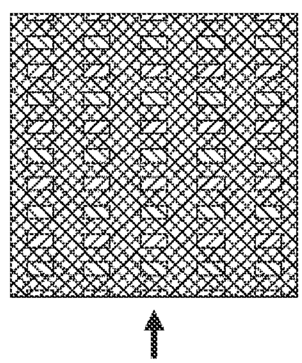
Figure 53A:
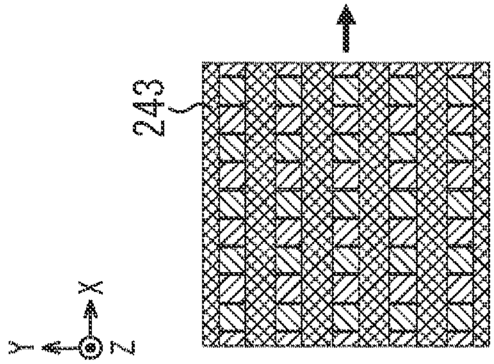

FIGS. 53A, 53B, and 53C are figures depicting a modification example in which the X-direction conductor widths in the fifth configuration example (FIGS. 26A, 26B, and 26C) of the conductor layers A and B are doubled, and depicting an effect attained thereby. Note that FIG. 53A depicts the fifth configuration example of the conductor layers A and B, and 53B depicts the modification example of the fifth configuration example of the conductor layers A and B.

FIG. 53C depicts changes of an induced electromotive force that generates inductive noise in an image, as a result of a simulation of the case in which the modification example depicted in FIG. 53B is applied to the solid-state image pickup apparatus 100. Note that it is assumed that the condition of electric currents flowing in this modification example is similar to that in the case depicted in FIG. 23. The horizontal axis in FIGS. 53A, 53B, and 53C represent the X-axis coordinate of an image, and the vertical axis represents the magnitude of an induced electromotive force.

A solid line L122 in FIG. 53C corresponds to the modification example depicted in FIG. 53B, and the dotted line L53 corresponds to the fifth configuration example. As is apparent from a comparison between the solid line L122 and the dotted line L53, this modification example generates much smaller changes of an induced electromotive force generated to the Victim conductor loop as compared with the fifth configuration example. Therefore, it can be known that this modification example can further suppress inductive noise as compared with the fifth configuration example.

Figure 54A:
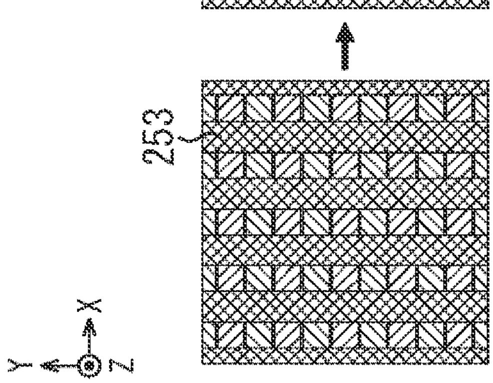
FIGS. 54A, 54B, and 54C are figures depicting a modification example in which the X-direction conductor widths in the sixth configuration example of the conductor layers A and B are doubled, and depicting an effect attained thereby.
Figure 54B:
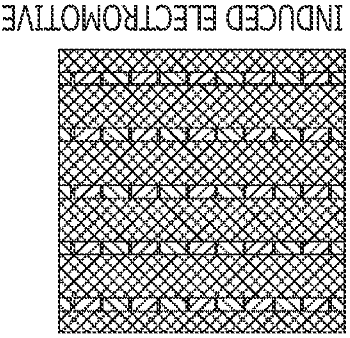
Figure 54C:
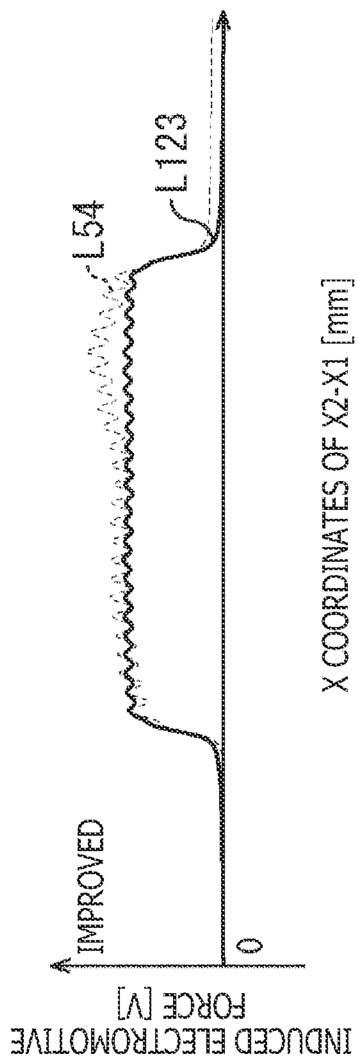

FIGS. 54A, 54B, and 54C are figures depicting a modification example in which the X-direction conductor widths in the sixth configuration example (FIGS. 27A, 27B, and 27C) of the conductor layers A and B are doubled, and depicting an effect attained thereby. Note that FIG. 54A depicts the sixth configuration example of the conductor layers A and B, and 54B depicts the modification example of the sixth configuration example of the conductor layers A and B.

FIG. 54C depicts changes of an induced electromotive force that generates inductive noise in an image, as a result of a simulation of the case in which the modification example depicted in FIG. 54B is applied to the solid-state image pickup apparatus 100. Note that it is assumed that the condition of electric currents flowing in this modification example is similar to that in the case depicted in FIG. 23. The horizontal axis in FIGS. 54A, 54B, and 54C represent the X-axis coordinate of an image, and the vertical axis represents the magnitude of an induced electromotive force.

A solid line L123 in FIG. 54C corresponds to the modification example depicted in FIG. 54B, and the dotted line L54 corresponds to the sixth configuration example. As is apparent from a comparison between the solid line L123 and the dotted line L54, this modification example generates smaller changes of an induced electromotive force generated to the Victim conductor loop as compared with the sixth configuration example. Therefore, it can be known that this modification example can suppress inductive noise more as compared with the sixth configuration example.

Figure 55C:
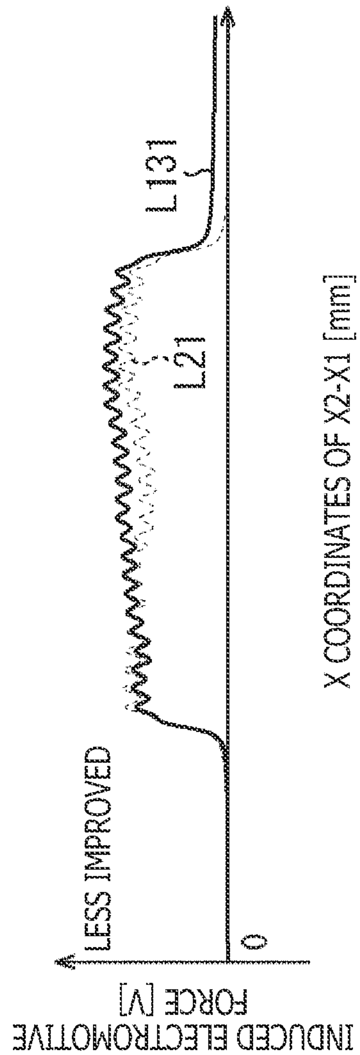
FIGS. 55A, 55B, and 55C are figures depicting a modification example in which Y-direction conductor widths in the second configuration example of the conductor layers A and B are doubled, and depicting an effect attained thereby.
Figure 55B:
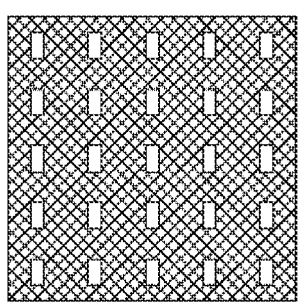
Figure 55A:
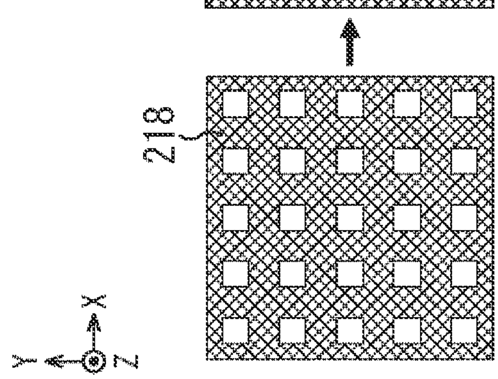

FIGS. 55A, 55B, and 55C are figures depicting a modification example in which the Y-direction conductor widths in the second configuration example (FIGS. 15A, 15B, and 15C) of the conductor layers A and B are doubled, and depicting an effect attained thereby. Note that FIG. 55A depicts the second configuration example of the conductor layers A and B, and 55B depicts the modification example of the second configuration example of the conductor layers A and B.

FIG. 55C depicts changes of an induced electromotive force that generates inductive noise in an image, as a result of a simulation of the case in which the modification example depicted in FIG. 55B is applied to the solid-state image pickup apparatus 100. Note that it is assumed that the condition of electric currents flowing in this modification example is similar to that in the case depicted in FIG. 13. The horizontal axis in FIGS. 55A, 55B, and 55C represent the X-axis coordinate of an image, and the vertical axis represents the magnitude of an induced electromotive force.

A solid line L131 in FIG. 55C corresponds to the modification example depicted in FIG. 55B, and the dotted line L21 corresponds to the second configuration example. As is apparent from a comparison between the solid line L131 and the dotted line L21, this modification example generates slightly smaller changes of an induced electromotive force generated to the Victim conductor loop as compared with the second configuration example. Therefore, it can be known that this modification example can suppress inductive noise slightly more as compared with the second configuration example.

Figure 56C:
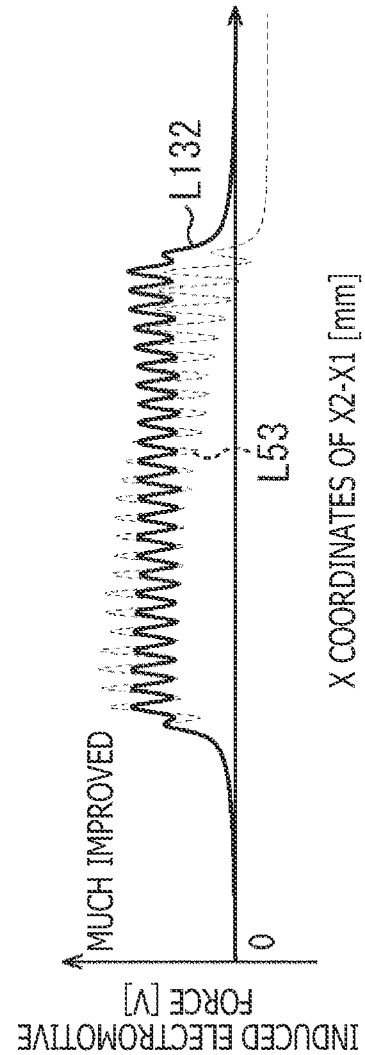
FIGS. 56A, 56B, and 56C are figures depicting a modification example in which the Y-direction conductor widths in the fifth configuration example of the conductor layers A and B are doubled, and depicting an effect attained thereby.
Figure 56B:
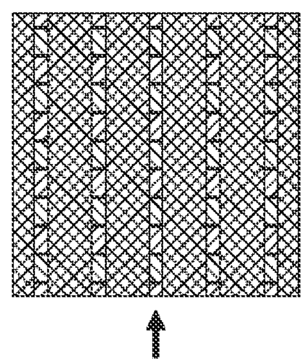
Figure 56A:
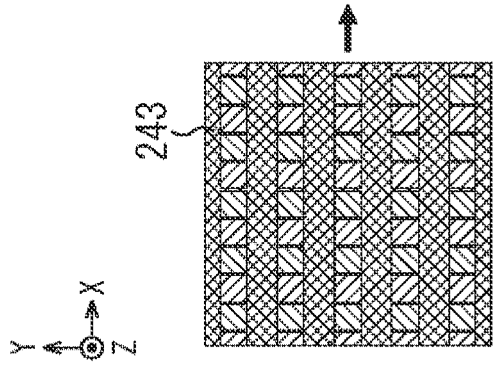

FIGS. 56A, 56B, and 56C are figures depicting a modification example in which the Y-direction conductor widths in the fifth configuration example (FIGS. 26A, 26B, and 26C) of the conductor layers A and B are doubled, and depicting an effect attained thereby. Note that FIG. 56A depicts the fifth configuration example of the conductor layers A and B, and 56B depicts the modification example of the fifth configuration example of the conductor layers A and B.

FIG. 56C depicts changes of an induced electromotive force that generates inductive noise in an image, as a result of a simulation of the case in which the modification example depicted in FIG. 56B is applied to the solid-state image pickup apparatus 100. Note that it is assumed that the condition of electric currents flowing in this modification example is similar to that in the case depicted in FIG. 23. The horizontal axis in FIGS. 56A, 56B, and 56C represent the X-axis coordinate of an image, and the vertical axis represents the magnitude of an induced electromotive force.

A solid line L132 in FIG. 56C corresponds to the modification example depicted in FIG. 56B, and the dotted line L53 corresponds to the fifth configuration example. As is apparent from a comparison between the solid line L132 and the dotted line L53, this modification example generates much smaller changes of an induced electromotive force generated to the Victim conductor loop as compared with the fifth configuration example. Therefore, it can be known that this modification example can further suppress inductive noise as compared with the fifth configuration example.

Figure 57C:
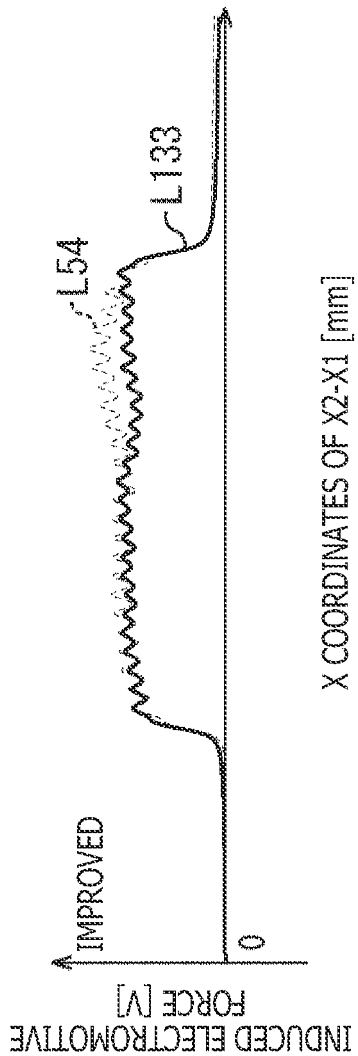
FIGS. 57A, 57B, and 57C are figures depicting a modification example in which the Y-direction conductor widths in the sixth configuration example of the conductor layers A and B are doubled, and depicting an effect attained thereby.
Figure 57B:
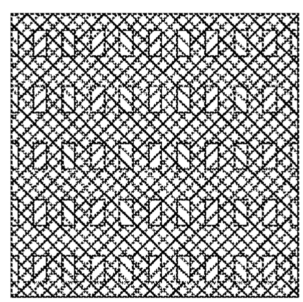
Figure 57A:
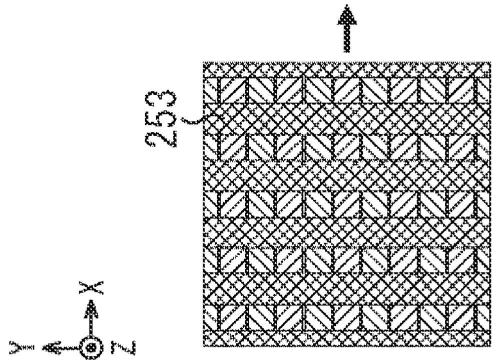

FIGS. 57A, 57B, and 57C are figures depicting a modification example in which the Y-direction conductor widths in the sixth configuration example (FIGS. 27A, 27B, and 27C) of the conductor layers A and B are doubled, and depicting an effect attained thereby. Note that FIG. 57A depicts the sixth configuration example of the conductor layers A and B, and 57B depicts the modification example of the sixth configuration example of the conductor layers A and B.

FIG. 57C depicts changes of an induced electromotive force that generates inductive noise in an image, as a result of a simulation of the case in which the modification example depicted in FIG. 57B is applied to the solid-state image pickup apparatus 100. Note that it is assumed that the condition of electric currents flowing in this modification example is similar to that in the case depicted in FIG. 23. The horizontal axis in FIGS. 57A, 57B, and 57C represent the X-axis coordinate of an image, and the vertical axis represents the magnitude of an induced electromotive force.

A solid line L133 in FIG. 57C corresponds to the modification example depicted in FIG. 57B, and the dotted line L54 corresponds to the sixth configuration example. As is apparent from a comparison between the solid line L133 and the dotted line L54, this modification example generates smaller changes of an induced electromotive force generated to the Victim conductor loop as compared with the sixth configuration example. Therefore, it can be known that this modification example can suppress inductive noise more as compared with the sixth configuration example.

7. Modification Examples of Mesh Conductors

Next, FIGS. 58A, 58B, 58C, 58D, 58E, and 58F are plan views depicting modification examples of mesh conductors that can be applied to each configuration example of the conductor layers A and B mentioned above.

Figure 58A:
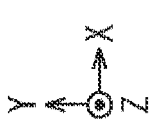
FIGS. 58A, 58B, 58C, 58D, 58E, and 58F are figures depicting modification examples of mesh conductors forming each configuration example of the conductor layers A and B.
Figure 58A:
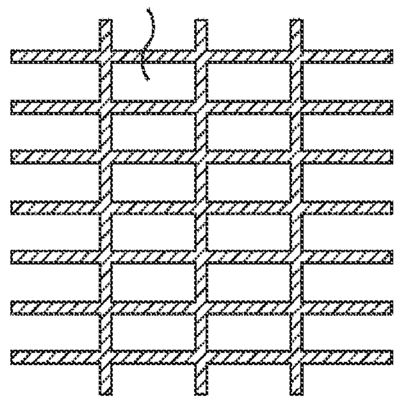

FIG. 58A depicts a simplified form of the shapes of the mesh conductors adopted for each configuration example of the conductor layers A and B mentioned above. The mesh conductors adopted for each configuration example of the conductor layers A and B mentioned above have rectangular gap regions which are arranged linearly in the X direction and the Y direction.

Figure 58B:
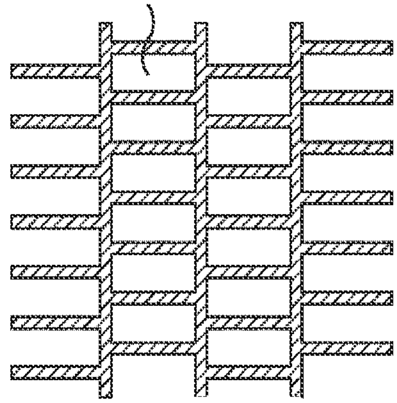

FIG. 58B depicts a simplified form of a first modification example of the mesh conductors. The first modification example of the mesh conductors has rectangular gap regions which are arranged linearly in the X direction and are arranged being displaced between stages in the Y direction.

Figure 58C:
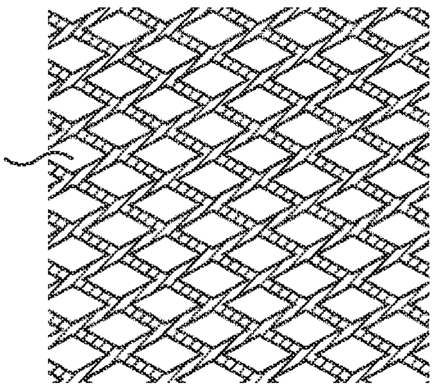

FIG. 58C depicts a simplified form of a second modification example of the mesh conductors. The second modification example of the mesh conductors has diamond-shaped gap regions which are arranged linearly in diagonal directions.

Figure 58D:
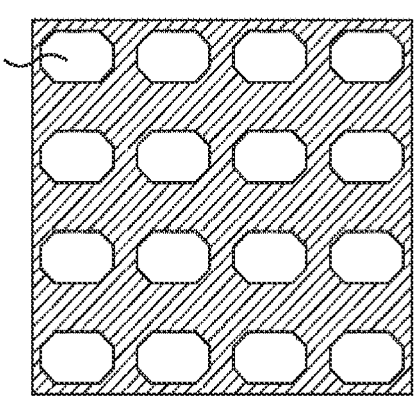

FIG. 58D depicts a simplified form of a third modification example of the mesh conductors. The third modification example of the mesh conductors has non-rectangular circular or polygonal gap regions (octagonal gap regions in the case of FIG. 58D) which are arranged linearly in the X direction and the Y direction.

Figure 58E:
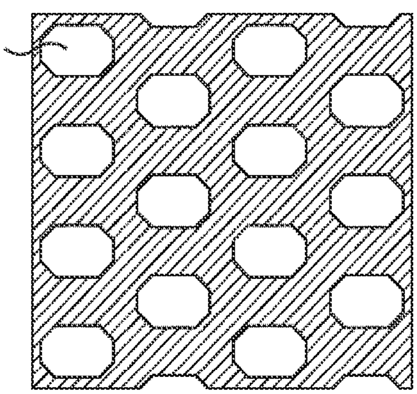

FIG. 58E depicts a simplified form of a fourth modification example of the mesh conductors. The fourth modification example of the mesh conductors has non-rectangular circular or polygonal gap regions (octagonal gap regions in the case of FIG. 58E) which are arranged linearly in the X direction and are arranged being displaced between stages in the Y direction.

Figure 58F:
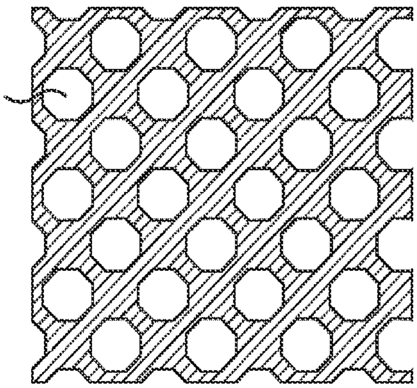

FIG. 58F depicts a simplified form of a fifth modification example of the mesh conductors. The fifth modification example of the mesh conductors has non-rectangular circular or polygonal gap regions (octagonal gap regions in the case of in FIG. 58F) which are arranged linearly in diagonal directions.

Note that the shapes of the mesh conductors that can be applied to each configuration example of the conductor layers A and B are not limited to the modification examples depicted in FIGS. 58A, 58B, 58C, 58D, 58E, and 58F, but it is sufficient if the shapes are mesh shapes.

8. Various Effects

<Enhancement of Degrees of Freedom of Layout Designing>

As mentioned above, in each configuration example of the conductor layers A and B, planar conductors or mesh conductors are adopted. Typically, mesh conductors (grid conductors) have regular wiring structures in the X direction and the Y direction. Therefore, only by designing a mesh conductor having a basic regular structure to be a regular structure unit (one pitch), a layout of wires can be designed simply, as compared with a case in which linear conductors are used, by arranging the basic regular structure repetitively in the X direction and the Y direction. In other words, in a case in which mesh conductors are used, the degree of freedom of layouts is enhanced as compared with a case in which linear conductors are used. Accordingly, man-hours, time, and costs required for layout designing can be reduced.

Figure 59:
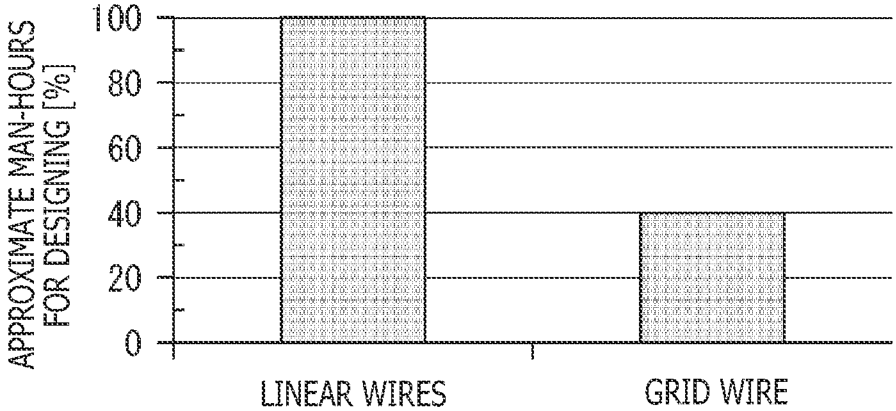
FIG. 59 is a figure for explaining an enhancement of the degree of freedom of layouts.

FIG. 59 is a figure depicting results of simulations of man-hours for designing in a case in which a layout of circuit wires that satisfies predetermined conditions is designed by using linear conductors, and man-hours for designing in a case in which a layout of circuit wires that satisfies the predetermined conditions is designed by using mesh conductors (grid conductors).

In the case of FIG. 59, if it is assumed that the man-hours for designing in a case in which linear conductors are used for the designing are 100%, the man-hours for designing when mesh conductors (grid conductors) are used for the designing are approximately 40%, and it can be known that man-hours for designing can be reduced significantly.

<Reduction of Voltage Drops (IR-drop)>

Figure 60C:
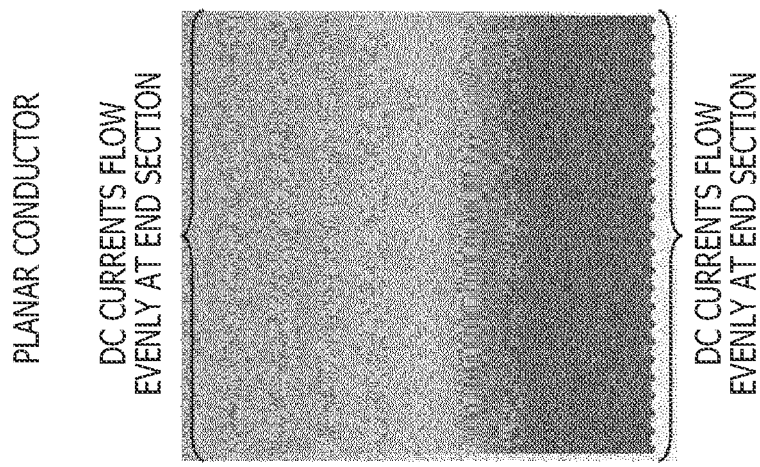
FIGS. 60A, 60B, and 60C are figures for explaining reductions of voltage drops (IR-Drop).
Figure 60B:
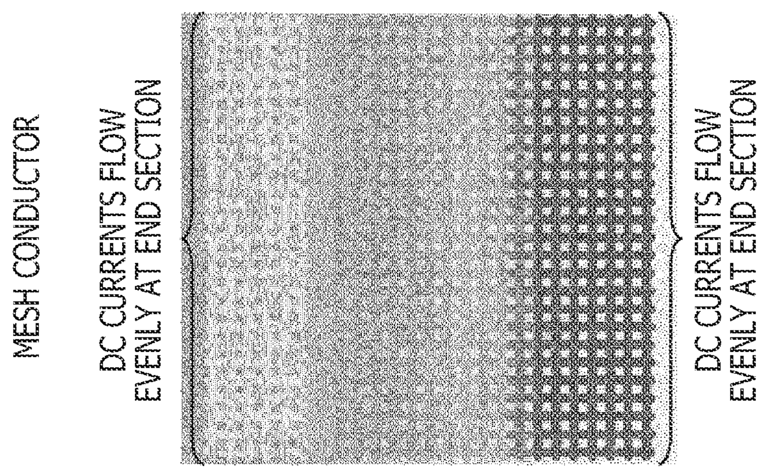
Figure 60A:
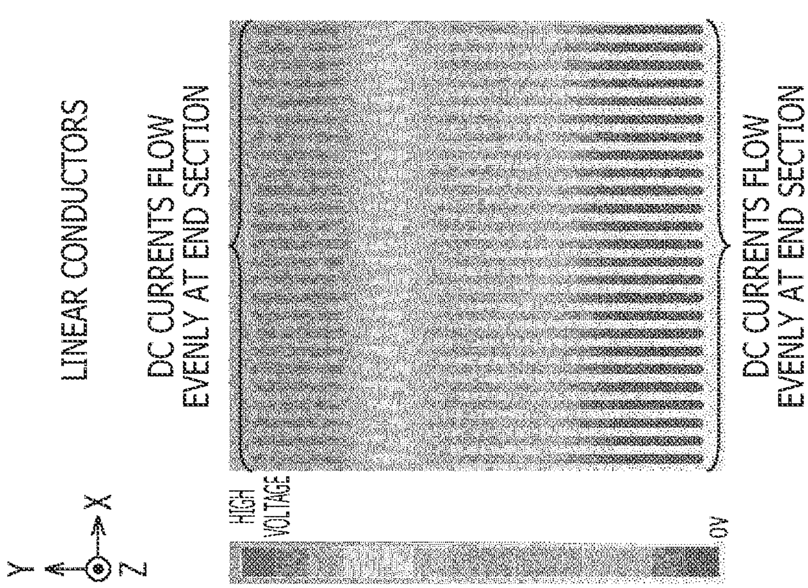

FIGS. 60A, 60B, and 60C are figures depicting voltage changes in cases in which DC currents are caused to flow, in the Y direction under the same condition, through conductors that are arranged on the XY plane and made with the same material but have different shapes.

FIGS. 60A, 60B, and 60C correspond to linear conductors, a mesh conductor, and a planar conductor, respectively, and gradations of colors represent voltages. It can be known from a comparison among FIGS. 60A, 60B, and 60C that the linear conductors exhibit the largest voltage changes, the mesh conductor exhibits the second largest voltage changes, and the planar conductor exhibits the third largest voltage changes.

Figure 61:
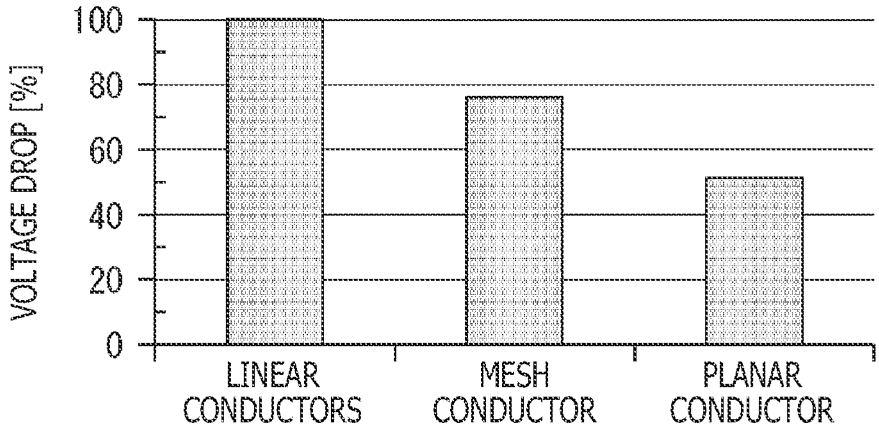
FIG. 61 is a figure for explaining reductions of voltage drops (IR-Drop).

FIG. 61 is a figure depicting, in a graph, relative voltage drops of the mesh conductor and the planar conductor assuming that a voltage drop of the linear conductors depicted in FIG. 60A is 100%.

As is apparent also from FIG. 61, it can be known that, as compared with the linear conductors, the planar conductor and the mesh conductor can reduce voltage drops (IR-Drop) which can be fatal faults for driving of a semiconductor apparatus.

It should be noted however that it is known that planar conductors cannot be manufactured with current semiconductor board processing processes in many cases. Therefore, it is realistic to adopt configuration examples that use mesh conductors for both of the conductor layers A and B. It should be noted however that this does not hold true if it becomes possible to manufacture planar conductors as a result of the progress of semiconductor board processing processes. In some cases, planar conductors can be manufactured for uppermost layer metals and lowermost layer metals among metal layers.

<Reduction of Capacitive Noise>

It is considered that conductors (planar conductors or mesh conductors) forming the conductor layers A and B generate not only inductive noise but also capacitive noise to a Victim conductor loop including a signal line 132 and a control line 133.

Here, capacitive noise means a phenomenon in which, in a case in which voltages are applied to conductors forming the conductor layers A and B, voltages are generated to a signal line 132 and a control line 133 due to capacitive coupling between the conductors and the signal line 132 and the control line 133, and furthermore the applied voltages change, thereby generating voltage noise to the signal line 132 and the control line 133. The voltage noise becomes pixel signal noise.

The magnitude of capacitive noise is considered to be almost proportional to electrostatic capacitance and a voltage between the conductors forming the conductor layers A and B and wires such as a signal line 132 or a control line 133. Regarding the electrostatic capacitance, in a case in which the area size over which two conductors (one of them may be a conductor and the other of them may be a wire) overlap is S, the two conductors are arranged in parallel at an interval of d, and the space between the conductors is uniformly filled with a dielectric with a dielectric constant ε, the electrostatic capacitance C between the two conductors is ε*S/d. Accordingly, it can be known that, as the area size S over which the two conductors overlap increases, the capacitive noise increases.

Figure 62C:
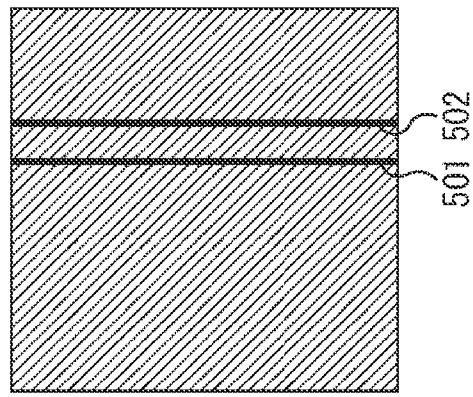
FIGS. 62A, 62B, and 62C are figures for explaining reductions of capacitive noise.
Figure 62B:
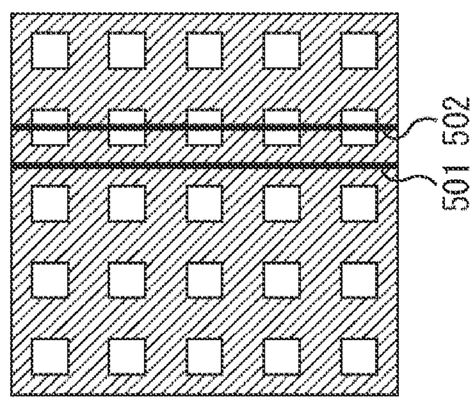
Figure 62A:
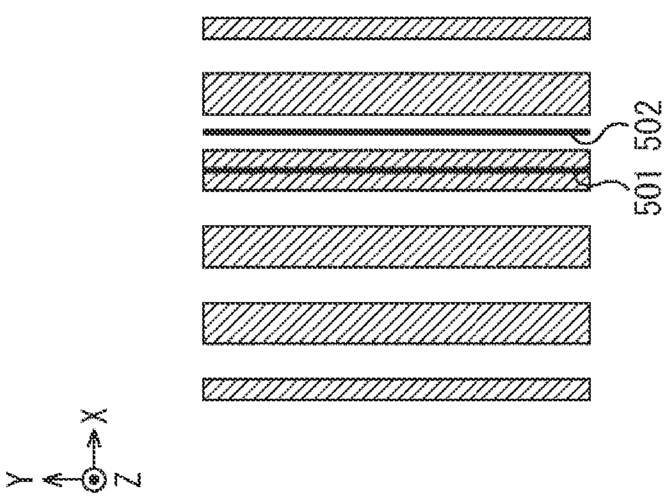

FIGS. 62A, 62B, and 62C are figures for explaining differences between electrostatic capacitance of conductors that are arranged on the XY plane and made with the same material but have different shapes, and other conductors (wires).

FIG. 62A depicts linear conductors that are long in the Y direction, and wires 501 and 502 (corresponding to the signal line 132 and the control line 133) that are formed linearly in the Y direction at an interval from the linear conductors in the Z direction. It should be noted however that while the wire 501 entirely overlaps a conductor region of a linear conductor, the wire 502 entirely overlaps a gap region of linear conductors and does not have an area size over which the wire 502 overlaps a conductor region.

FIG. 62B depicts a mesh conductor, and wires 501 and 502 that are formed linearly in the Y direction at an interval from the mesh conductor in the Z direction. It should be noted however that while the wire 501 entirely overlaps a conductor region of the mesh conductor, substantially half of the wire 502 overlaps the conductor region of the mesh conductor.

FIG. 62C depicts a planar conductor, and wires 501 and 502 that are formed linearly in the Y direction at an interval from the planar conductor in the Z direction. It should be noted however that the wires 501 and 502 entirely overlap a conductor region of the planar conductor.

If differences between the electrostatic capacitance of the conductors (the linear conductors, the mesh conductor, and the planar conductor) in FIGS. 62A, 62B, and 62C and the wire 501, and the electrostatic capacitance of the conductors (the linear conductors, the mesh conductor, and the planar conductor) and the wire 502 are compared with each other, the linear conductors produce the largest difference, the mesh conductor produces the second largest difference, and the planar conductor produces the third largest difference.

That is, the linear conductors produce a significant difference in electrostatic capacitance of the linear conductors and the wires due to a difference of the XY coordinates of the wires, and this means that the occurrence of capacitive noise also differs significantly. Therefore, there is a possibility that pixel signal noise which is highly visible in an image is generated.

In contrast, the differences between electrostatic capacitance of the conductors and the wires that are produced by the mesh conductor and the planar conductor due to differences of the XY coordinates of the wires are small as compared with the linear conductors, and so the occurrence of capacitive noise can be reduced more. Therefore, pixel signal noise due to capacitive noise can be suppressed.

<Reduction of Radioactive Noise>

As mentioned above, among the configuration examples of the conductor layers A and B, mesh conductors are used in configuration examples other than the first configuration example. The mesh conductors can be expected to provide an effect of reducing radioactive noise. It is assumed here that radioactive noise includes radioactive noise from the inside of the solid-state image pickup apparatus 100 to the outside (unnecessary radiation), and radioactive noise from the outside of the solid-state image pickup apparatus 100 to the inside (transferred noise).

The radioactive noise from the outside of the solid-state image pickup apparatus 100 to the inside can generate voltage noise and pixel signal noise in a signal line 132 and the like, and so in a case in which a configuration example using a mesh conductor for at least one of the conductor layers A and B is adopted, an effect of suppressing the voltage noise and pixel signal noise can be expected.

Because the conductor pitch of a mesh conductor influences the frequency band of radioactive noise that the mesh conductor is capable of reducing, in a case in which mesh conductors with different conductor pitches are used for the conductor layers A and B, it is possible to reduce radioactive noise of a wide frequency band as compared with the case in which mesh conductors with the same conductor frequency are used for the conductor layers A and B.

Note that the effects mentioned above are presented merely for illustrative purposes, effects are not limited to them, and there may be other effects.

<9. Configuration Examples with Different Lead Sections>

Meanwhile, for example, in a case in which the wiring layer 165A which is the conductor layer A or the wiring layer 165B which is the conductor layer B is connected to the pad 401 or 402, wire lead sections for connections with the pads 401 or 402 are provided as depicted in FIGS. 42A, 42B, 42C, 42D, 442E, 43A, 43B, 43C, 43D, 44A, 44B, 44C, 44D, and 44E. The wire lead sections are typically formed with narrow wire widths according to the sizes of the pads.

Figure 63A:
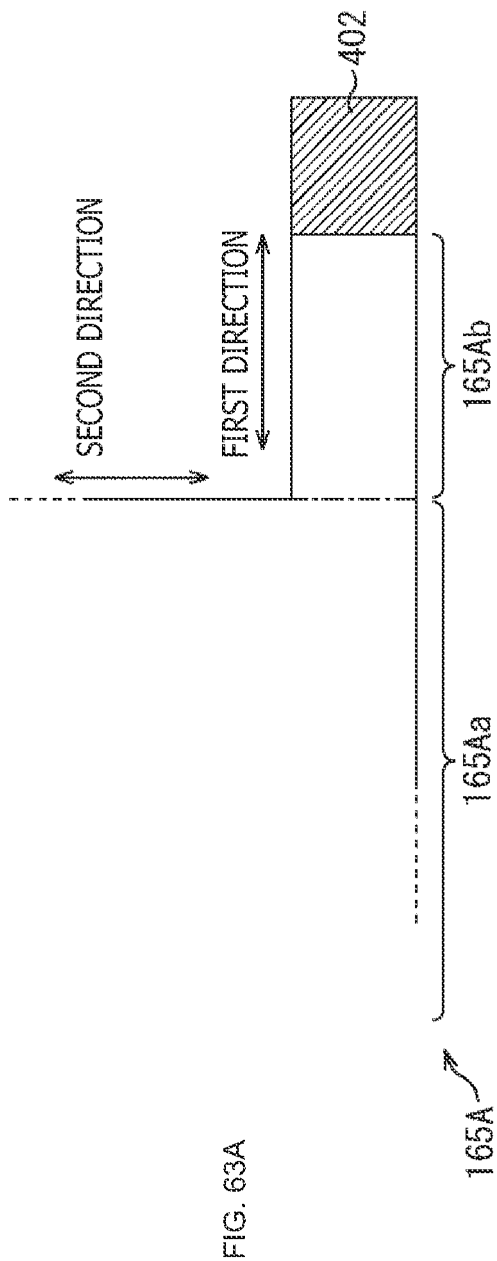
FIGS. 63A and 63B is are figures for explaining main conductor sections and lead conductor sections of conductor layers.

In view of this, for example, the wiring layer 165A (conductor layer A) is treated separately as a main conductor section 165Aa and a lead conductor section 165Ab for an explanation here as depicted in FIG. 63A. The main conductor section 165Aa is a section whose main purpose is to block hot carrier light emissions from an active element group 167 and to hinder the occurrence of inductive noise. The main conductor section 165Aa has an area size larger than the lead conductor section 165Ab. The lead conductor section 165Ab is a section whose main purpose is to connect the main conductor section 165Aa and a pad 402 and to supply the main conductor section 165Aa with a predetermined voltage of GND, a negative power supply (Vss), or the like. At least one of the X-direction (first-direction) length (width) or the Y-direction (second-direction) length (width) of the lead conductor section 165Ab is shorter than (narrower than) the length (width) of the main conductor section 165Aa. A connecting section between the main conductor section 165Aa and the lead conductor section 165Ab represented by a dash-dotted line in FIG. 63A is referred to as a junction section.

Figure 63B:
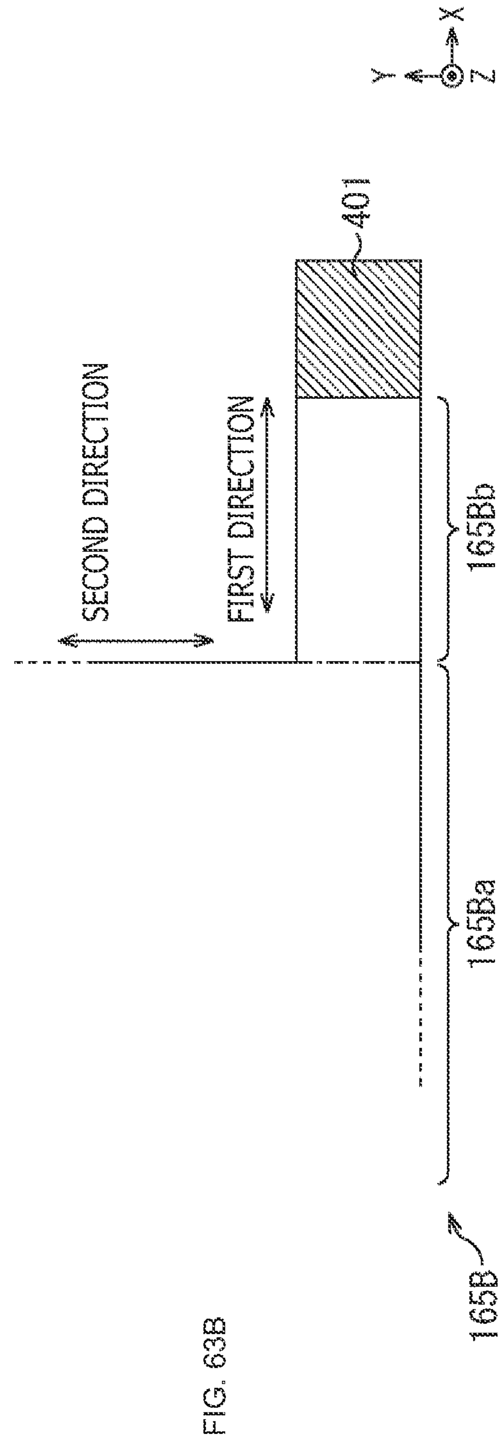

Similarly, the wiring layer 165B (conductor layer B) is treated separately as a main conductor section 165Ba and a lead conductor section 165Bb for an explanation here as depicted in FIG. 63B. The main conductor section 165Ba is a section whose main purpose is to block hot carrier light emissions from the active element group 167 and to hinder the occurrence of inductive noise. The main conductor section 165Ba has an area size larger than the lead conductor section 165Bb. The lead conductor section 165Bb is a section whose main purpose is to connect the main conductor section 165Ba and a pad 401 and to supply the main conductor section 165Ba with a predetermined voltage of a positive power supply (Vdd) or the like. At least one of the X-direction (first-direction) length (width) or the Y-direction (second-direction) length (width) of the lead conductor section 165Bb is shorter than (narrower than) the length (width) of the main conductor section 165Ba. A connecting section between the main conductor section 165Ba and the lead conductor section 165Bb represented by a dash-dotted line in FIG. 63B is referred to as a junction section.

Note that in a case in which the main conductor section 165Aa and the main conductor section 165Ba are referred to collectively, and in a case in which the lead conductor section 165Ab and the lead conductor section 165Bb are referred to collectively, without a distinction being made between the wiring layer 165A (conductor layer A) and the wiring layer 165B (conductor layer B), they are referred to as a main conductor section 165*a* and a lead conductor section 165*b*, respectively.

While it is presumed in the explanation given with reference to FIGS. 63A and 63B that the lead conductor section 165Ab and the lead conductor section 165Bb are connected to the pads 401 and 402 for facilitating understanding, the lead conductor section 165Ab and the lead conductor section 165Bb need not be connected to the pads 401 and 402 necessarily, and it is sufficient if the lead conductor section 165Ab and the lead conductor section 165Bb are connected with other wires or electrodes.

In addition, while the pad 401 and the pad 402 have substantially the same shapes and are arranged at substantially the same positions in the example depicted in FIGS. 63A and 63B, this is not essential. For example, the pad 401 and the pad 402 may have mutually different shapes and may be arranged at mutually different positions. In addition, the pad 401 and the pad 402 may be formed with dimensions smaller than those in the one example depicted in FIGS. 63A and 63B. The pad 401 and the pad 402 may be formed not to contact each other at the wiring layer 165A. The pad 401 and the pad 402 may be formed not to contact with each other at the wiring layer 165B. Multiple pads 401 and pads 402 may be provided.

Furthermore, while Y-direction end-section positions of the main conductor section 165Aa and the lead conductor section 165Ab substantially coincide with each other in the example depicted in FIGS. 63A and 63B, this is not essential. For example, the main conductor section 165Aa and the lead conductor section 165Ab may be configured such that their end-section positions do not coincide with each other. Similarly, while Y-direction end-section positions of the main conductor section 165Ba and the lead conductor section 165Bb substantially coincide with each other in the example depicted in FIGS. 63A and 63B, this is not essential. For example, the main conductor section 165Ba and the lead conductor section 165Bb may be configured such that their end-section positions do not coincide with each other. The shapes and positions of the main conductor section 165*a* and the lead conductor section 165*b*, and their relations with pads 401 and 402 apply similarly to each configuration example explained below.

In the first to thirteenth configuration examples mentioned above, regarding the wiring layer 165A, both the main conductor section 165Aa and the lead conductor section 165Ab are formed with the same wiring patterns of planar conductors, mesh conductors, or the like, without a particular distinction being made between the main conductor section 165Aa and the lead conductor section 165Ab.

Regarding the wiring layer 165B also, both the main conductor section 165Ba and the lead conductor section 165Bb are formed with the same wiring patterns of planar conductors, mesh conductors, or the like, without a particular distinction being made between the main conductor section 165Ba and the lead conductor section 165Bb.

As an example of the first to thirteenth configuration example mentioned above, FIGS. 64A, 64B, and 64C depict an example in which the eleventh configuration example depicted in FIGS. 36A, 36B, and 36C are applied to the wiring layer 165A and the wiring layer 165B by using different wiring patterns.

Figure 64A:
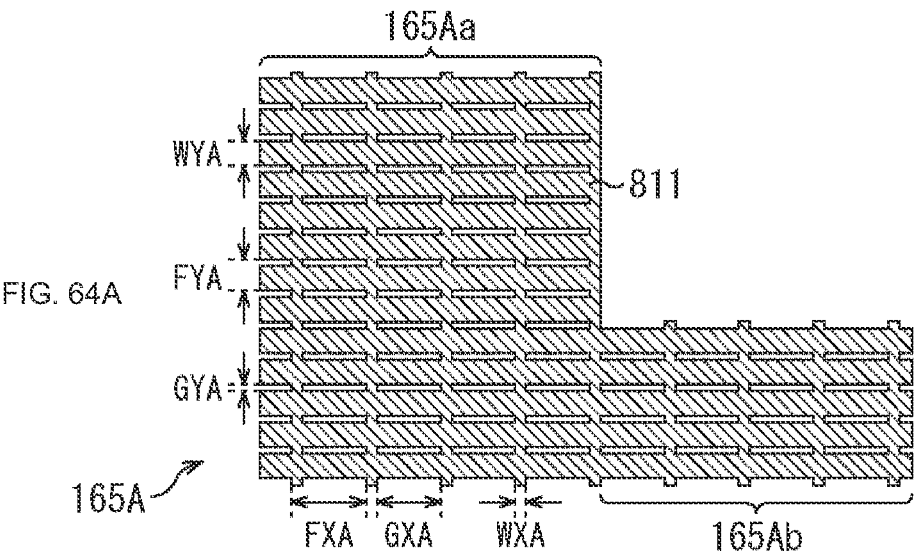
FIGS. 64A, 64B, and 64C are figures depicting the eleventh configuration example of the conductor layers A and B.
Figure 64B:
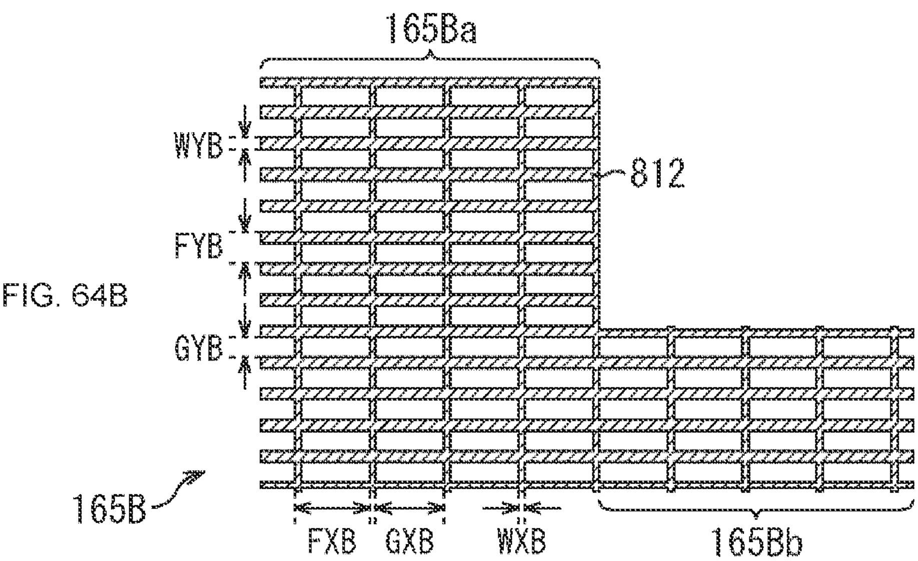

FIG. 64A depicts the conductor layer A (wiring layer 165A), and FIG. 64B depicts the conductor layer B (wiring layer 165B). In the coordinate system in FIGS. 64A, 64B, and 64C, the X axis lies in the lateral direction, the Y axis lies in the longitudinal direction, and the Z axis lies in a direction perpendicular to the XY plane.

While the mesh conductor 311 in the conductor layer A depicted in FIG. 36A has a shape in which the X-direction conductor width WXA is wider than the gap width GXA in the example in the eleventh configuration example depicted in FIGS. 36A, 36B, and 36C, a mesh conductor 811 in the conductor layer A in FIG. 64A has a shape in which the X-direction conductor width WXA is narrower than the gap width GXA. In addition, regarding the Y direction, while the mesh conductor 311 has a shape in which the conductor width WYA is narrower than the gap width GYA in the example depicted in FIG. 36A, the mesh conductor 811 in the conductor layer A in FIG. 64A has a shape in which the conductor width WYA is wider than the gap width GYA. While the mesh conductor 311 in the conductor layer A has a shape in which the conductor width WYA and the conductor width WXA are substantially the same in the example depicted in FIG. 36A, the mesh conductor 811 in the conductor layer A in FIG. 64A has a shape in which the conductor width WYA is wider than the conductor width WXA. Then, in both the main conductor section 165Aa and the lead conductor section 165Ab in the mesh conductor 811 in the conductor layer A in FIG. 64A, regarding the X direction, the same pattern is arranged regularly at the conductor pitch FXA, and regarding the Y direction, the same pattern is arranged regularly at the conductor pitch FYA.

The conductor layer B has a shape in which the ratio of the X-direction gap width GXB to the conductor width WXB ((gap width GXB)/(conductor width WXB)) of a mesh conductor 812 in the conductor layer B in FIG. 64B is higher than the ratio of the X-direction gap width GXB to the conductor width WXB ((gap width GXB)/(conductor width WXB)) of the mesh conductor 312 in the conductor layer B depicted in-FIG. 36B. In other words, in the mesh conductor 812 in the conductor layer B in FIG. 64B, the difference between the conductor width WXB and the gap width GXB is larger than that in the mesh conductor 312 in the conductor layer B depicted in FIG. 36B. Regarding the Y direction, the ratio of the gap width GYB to the conductor width WYB ((gap width GYB)/(conductor width WYB)) of the mesh conductor 812 in the conductor layer B in FIG. 64B is lower than the ratio of the gap width GYB to the conductor width WYB ((gap width GYB)/(conductor width WYB)) of the mesh conductor 312 in the conductor layer B depicted in FIG. 36B. While the mesh conductor 312 in the conductor layer B has a shape in which the conductor width WYB and the conductor width WXB are substantially the same in the example depicted in FIG. 36B, the mesh conductor 812 in the conductor layer B in FIG. 64B has a shape in which the conductor width WYB is wider than the conductor width WXB. Then, in both the main conductor section 165Ba and the lead conductor section 165Bb in the mesh conductor 812 in the conductor layer B in FIG. 64B, regarding the X direction, the same pattern is arranged regularly at the conductor pitch FXB, and regarding the Y direction, the same pattern is arranged regularly at the conductor pitch FYB.

Figure 64C:
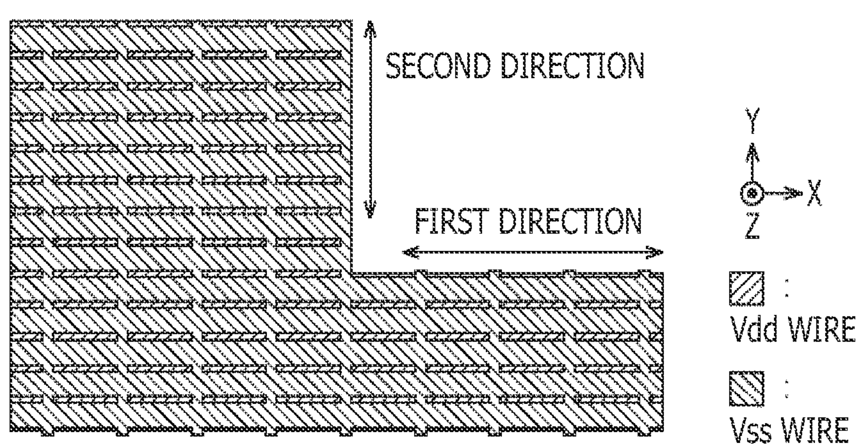

FIG. 64C depicts a state of the conductor layers A and B depicted in in FIGS. 64A and 64B, respectively, as seen from the side where the conductor layer A is located (the side where photodiodes 141 are located). FIG. 64C does not depict regions of the conductor layer B that overlap and are hidden by the conductor layer A.

As depicted in FIG. 64C, because an active element group 167 is to be covered with at least one of the conductor layer A or the conductor layer B in the case of the eleventh configuration example, hot carrier light emissions from the active element group 167 can be blocked, and the occurrence of inductive noise can be suppressed.

In this manner, the first to thirteenth configuration examples mentioned above are examples in which the wiring layer 165A (conductor layer A) is formed with the same wiring pattern without a particular distinction being made between the main conductor section 165Aa and the lead conductor section 165Ab, and the wiring layer 165B (conductor layer B) also is formed with the same wiring pattern without a particular distinction being made between the main conductor section 165Ba and the lead conductor section 165Bb.

However, the lead conductor section 165*b* is formed to have an area size smaller than the main conductor section 165*a*, and so is a section where currents are concentrated. Accordingly, the lead conductor section 165*b* is desirably configured such that its wire resistance becomes low and currents are more easily diffused at the main conductor section 165*a*.

In view of this, in configuration examples explained hereinbelow, wiring patterns of the lead conductor section 165Ab in the wiring layer 165A (conductor layer A) are made different from wiring patterns of the main conductor section 165Aa, and also wiring patterns of the lead conductor section 165Bb in the wiring layer 165B (conductor layer B) are made different from wiring patterns of the main conductor section 165Ba.

Fourteenth Configuration Example

Figure 65A:
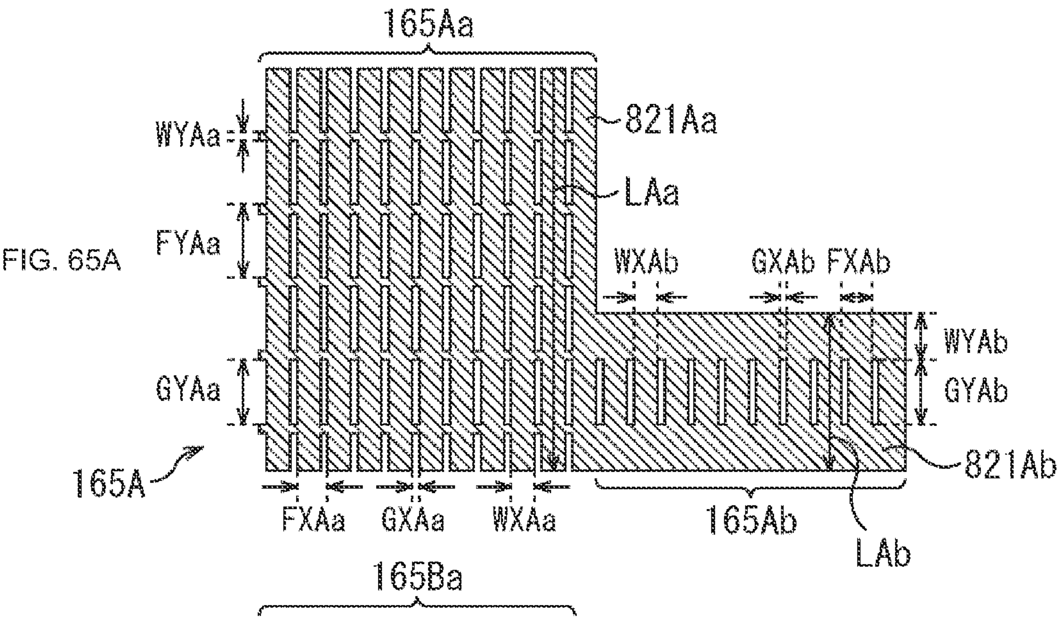
FIGS. 65A, 65B, and 65C are figures depicting a fourteenth configuration example of the conductor layers A and B.
Figure 65B:
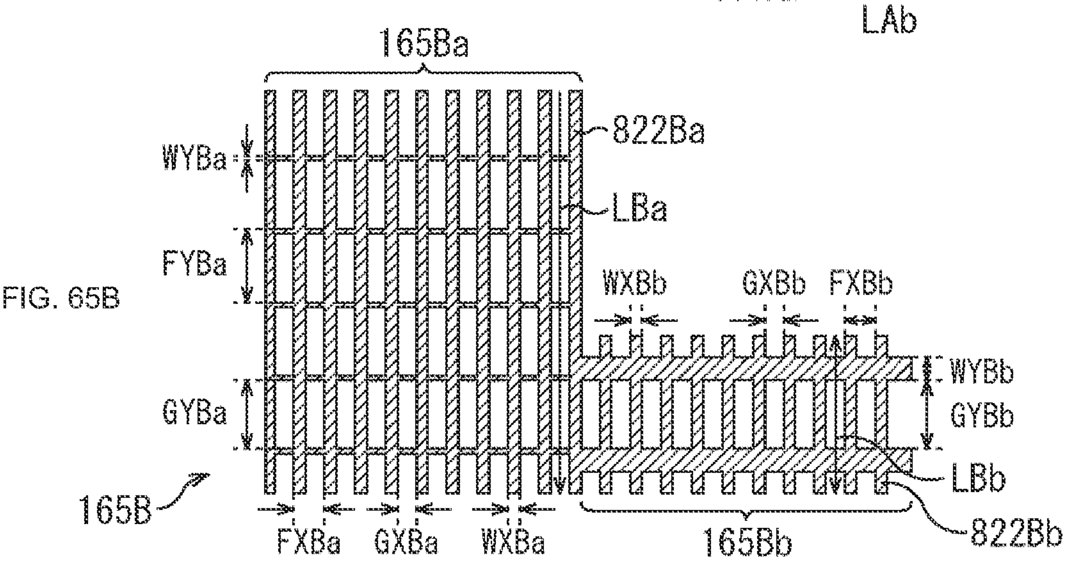
Figure 65C:
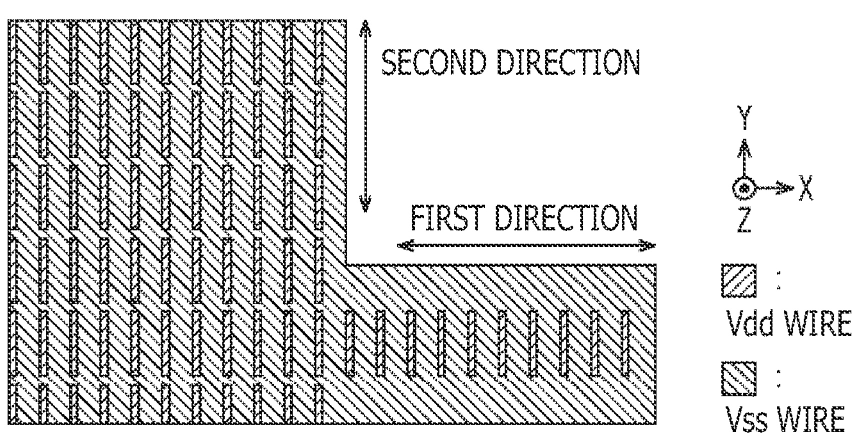

FIGS. 65A, 65B, and 65C depict a fourteenth configuration example of the conductor layers A and B. Note that FIG. 65A depicts the conductor layer A, and FIG. 65B depicts the conductor layer B. In the coordinate system in FIGS. 65A, 65B, and 65C, the X axis lies in the lateral direction, the Y axis lies in the longitudinal direction, and the Z axis lies in a direction perpendicular to the XY plane.

As depicted in FIG. 65A, the conductor layer A in the fourteenth configuration example includes a mesh conductor 821Aa of the main conductor section 165Aa and a mesh conductor 821Ab of the lead conductor section 165Ab. The mesh conductor 821Aa and the mesh conductor 821Ab are wires (Vss wires) connected to GND or a negative power supply, for example.

Regarding the X direction, the mesh conductor 821Aa of the main conductor section 165Aa has a conductor width WXAa and a gap width GXAa and includes the same pattern regularly arranged at a conductor pitch FXAa. Regarding the Y direction, the mesh conductor 821Aa of the main conductor section 165Aa has a conductor width WYAa and a gap width GYAa and includes the same pattern regularly arranged at a conductor pitch FYAa. Accordingly, the mesh conductor 821Aa has a shape including a repetition pattern in which a predetermined basic pattern is arrayed repetitively at a conductor pitch in at least one of the X direction or the Y direction.

Regarding the X direction, the mesh conductor 821Ab of the lead conductor section 165Ab has a conductor width WXAb and a gap width GXAb, and includes the same pattern regularly arranged at a conductor pitch FXAb. Regarding the Y direction, the mesh conductor 821Ab of the lead conductor section 165Ab has a conductor width WYAb and a gap width GYAb. Accordingly, the mesh conductor 821Ab has a shape including a repetition pattern in which a predetermined basic pattern is arrayed repetitively at a conductor pitch in at least one of the X direction or the Y direction.

In addition, at least one of the conductor width WXA, the gap width GXA, the conductor width WYA, and the gap width GYA of the mesh conductor 821Aa of the main conductor section 165Aa has a value that is different from the value of the corresponding one of the conductor width WXA, the gap width GXA, the conductor width WYA, and the gap width GYA of the mesh conductor 821Ab of the lead conductor section 165Ab if the values are compared with each other, and the repetition pattern of the mesh conductor 821Ab of the lead conductor section 165Ab is a pattern that is different from the repetition pattern of the mesh conductor 821Aa of the main conductor section 165Aa.

If an entire Y-direction length LAa of the mesh conductor 821Aa of the main conductor section 165Aa and an entire Y-direction length LAb of the mesh conductor 821Ab of the lead conductor section 165Ab are compared with each other, the entire length LAa of the mesh conductor 821Aa is longer than the entire length LAb of the mesh conductor 821Ab. Accordingly, currents are more concentrated locally in the mesh conductor 821Ab of the lead conductor section 165Ab than in the mesh conductor 821Aa of the main conductor section 165Aa, and so voltage drops (particularly, IR-Drop) are larger in the mesh conductor 821Ab of the lead conductor section 165Ab.

Here, if the X direction toward the main conductor section 165Aa is defined as a first direction, the repetition pattern of the mesh conductor 821Ab of the lead conductor section 165Ab has a shape in which currents flow at least in the first direction, and the conductor width (wire width) WYAb in a second direction (Y direction) orthogonal to the first direction is formed larger than the second-direction conductor width (wire width) WYAa of the mesh conductor 821Aa of the main conductor section 165Aa. Thereby, the wire resistance of the mesh conductor 821Ab of the lead conductor section 165Ab, which is a current-concentrated portion, can be lowered, and so voltage drops can be ameliorated further. Note that while the conductor width WYAb is larger than the conductor width WYAa in the example used for the explanation, this is not essential. For example, the conductor width WXAb may be formed larger than the conductor width WXAa. Thereby, the wire resistance of the mesh conductor 821Ab can be lowered, and so voltage drops can be ameliorated further.

In addition, at least part of the mesh conductor 821Aa of the main conductor section 165Aa has a pattern (shape) in which currents flow more easily in the Y direction (second direction) than in the X direction (first direction). Specifically, by making at least either the wire widths (the conductor width WXAa and the conductor width WYAa) or the wire intervals (the gap width GXAa and the gap width GYAa) different from each other, the Y-direction wire resistance is formed lower than the X-direction wire resistance. Thereby, currents are diffused more easily in the Y direction in the main conductor section 165Aa having the entire length LAa longer than the entire length LAb of the mesh conductor 821Ab. Accordingly, electrode concentration around the junction section between the main conductor section 165Aa and the lead conductor section 165Ab can be relaxed, and inductive noise can be ameliorated further.

As depicted in FIG. 65B, the conductor layer B in the fourteenth configuration example includes a mesh conductor 822Ba of the main conductor section 165Ba and a mesh conductor 822Bb of the lead conductor section 165Bb. The mesh conductor 822Ba and the mesh conductor 822Bb are wires (Vdd wires) connected to a positive power supply, for example.

Regarding the X direction, the mesh conductor 822Ba of the main conductor section 165Ba has a conductor width WXBa and a gap width GXBa and includes the same pattern regularly arranged at a conductor pitch FXBa. Regarding the Y direction, the mesh conductor 822Ba of the main conductor section 165Ba has a conductor width WYBa and a gap width GYBa and includes the same pattern regularly arranged at a conductor pitch FYBa. Accordingly, the mesh conductor 822Ba has a shape including a repetition pattern in which a predetermined basic pattern is arrayed repetitively at a conductor pitch in at least one of the X direction or the Y direction.

Regarding the X direction, the mesh conductor 822Bb of the lead conductor section 165Bb has a conductor width WXBb and a gap width GXBb, and includes the same pattern regularly arranged at a conductor pitch FXBb. Regarding the Y direction, the mesh conductor 822Bb of the lead conductor section 165Bb has a conductor width WYBb and a gap width GYBb. Accordingly, the mesh conductor 822Bb has a shape including a repetition pattern in which a predetermined basic pattern is arrayed repetitively at a conductor pitch in at least one of the X direction or the Y direction.

In addition, at least one of the conductor width WXB, the gap width GXB, the conductor width WYB, and the gap width GYB of the mesh conductor 822Ba of the main conductor section 165Ba has a value that is different from the value of the corresponding one of the conductor width WXB, the gap width GXB, the conductor width WYB, and the gap width GYB of the mesh conductor 822Bb of the lead conductor section 165Bb if the values are compared with each other, and the repetition pattern of the mesh conductor 822Bb of the lead conductor section 165Bb is a pattern that is different from the repetition pattern of the mesh conductor 822Ba of the main conductor section 165Ba.

If an entire Y-direction length LBa of the mesh conductor 822Ba of the main conductor section 165Ba and an entire Y-direction length LBb of the mesh conductor 822Bb of the lead conductor section 165Bb are compared with each other, the entire length LBa of the mesh conductor 822Ba is longer than the entire length LBb of the mesh conductor 822Bb. Accordingly, currents are more concentrated locally in the mesh conductor 822Bb of the lead conductor section 165Bb than in the mesh conductor 822Ba of the main conductor section 165Ba, and so voltage drops (particularly, IR-Drop) are larger in the mesh conductor 822Bb of the lead conductor section 165Bb.

Here, if the X direction toward the main conductor section 165Ba is defined as a first direction, the repetition pattern of the mesh conductor 822Bb of the lead conductor section 165Bb has a shape in which currents flow at least in the first direction, and the conductor width (wire width) WYBb in a second direction (Y direction) orthogonal to the first direction is formed larger than the second-direction conductor width (wire width) WYBa of the mesh conductor 822Ba of the main conductor section 165Ba. Thereby, the wire resistance of the mesh conductor 822Bb of the lead conductor section 165Bb, which is a current-concentrated portion, can be lowered, and so voltage drops can be ameliorated further. Note that while the conductor width WYBb is larger than the conductor width WYBa in the example used for the explanation, this is not essential. For example, the conductor width WXBb may be formed larger than the conductor width WXBa. Thereby, the wire resistance of the mesh conductor 822Bb can be lowered, and so voltage drops can be ameliorated further.

In addition, at least part of the mesh conductor 822Ba of the main conductor section 165Ba has a pattern (shape) in which currents flow more easily in the Y direction (second direction) than in the X direction (first direction). Specifically, by making at least either the wire widths (the conductor width WXBa and the conductor width WYBa) or the wire intervals (the gap width GXBa and the gap width GYBa) different from each other, the Y-direction wire resistance is formed lower than the X-direction wire resistance. Thereby, currents are diffused more easily in the Y direction in the main conductor section 165Ba having the entire length LBa longer than the entire length LBb of the mesh conductor 822Bb. Accordingly, electrode concentration around the junction section between the main conductor section 165Ba and the lead conductor section 165Bb can be relaxed, and inductive noise can be ameliorated further.

As mentioned above, according to the fourteenth configuration example, the repetition pattern of the mesh conductor 821Ab of the lead conductor section 165Ab in the wiring layer 165A (conductor layer A) is formed with a pattern that is different from the repetition pattern of the mesh conductor 821Aa of the main conductor section 165Aa, and the main conductor section 165Aa and the lead conductor section 165Ab are electrically connected. Thereby, the wire resistance of the lead conductor section 165Ab can be lowered, and voltage drops can be ameliorated further. Regarding the wiring layer 165B (conductor layer B) also, the repetition pattern of the mesh conductor 822Bb of the lead conductor section 165Bb is formed with a pattern that is different from the repetition pattern of the mesh conductor 822Ba of the main conductor section 165Ba, and the main conductor section 165Ba and the lead conductor section 165Bb are electrically connected. Thereby, the wire resistance of the lead conductor section 165Bb can be lowered, and voltage drops can be ameliorated further.

In addition, in the overlapping state of the conductor layer A and the conductor layer B as depicted in FIG. 65C, at least one of the conductor layer A and the conductor layer B covers an active element group 167. That is, the main conductor section 165Aa of the wiring layer 165A and the main conductor section 165Ba of the wiring layer 165B form a light-blocking structure, and the lead conductor section 165Ab of the wiring layer 165A and the lead conductor section 165Bb of the wiring layer 165B form a light-blocking structure. Thereby, similarly to the first to thirteenth configuration examples mentioned above, hot carrier light emissions from the active element group 167 can be blocked in the fourteenth configuration example also.

<Modification Examples of Fourteenth Configuration Example>

FIGS. 66A, 66B, 66C, 67A, 67B, 67C, 68A, 68B, and 68C depict first to third modification examples of the fourteenth configuration example. Note that FIGS. 66A, 66B, 66C, 67A, 67B, 67C, 68A, 68B, and 68C correspond to FIGS. 65A, 65B, and 65C, respectively, and the same reference signs are given. Accordingly, explanations of common sections are omitted as appropriate, and differences are explained.

While in the fourteenth configuration example depicted in FIGS. 65A, 65B, and 65C, the junction section between the main conductor section 165Aa and the lead conductor section 165Ab in the wiring layer 165A (conductor layer A) is arranged on an edge of a rectangle surrounding the outer circumference of the main conductor section 165Aa, this is not essential.

Figure 66A:
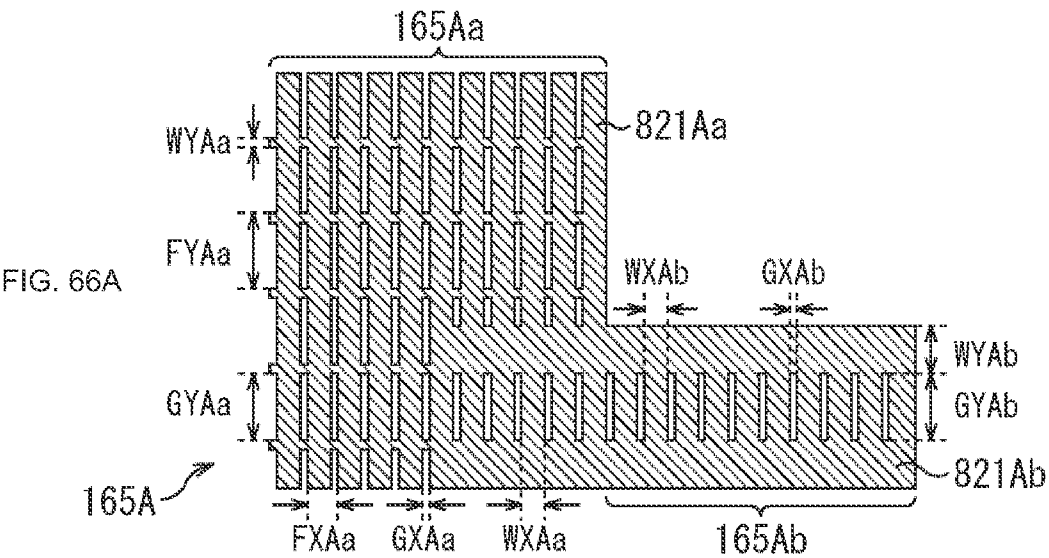
FIGS. 66A, 66B, and 66C are figures depicting a first modification example of the fourteenth configuration example of the conductor layers A and B.

For example, as depicted in FIG. 66A, the main conductor section 165Aa and the lead conductor section 165Ab may be connected such that the mesh conductor 821Ab of the lead conductor section 165Ab protrudes into the inside of the rectangle surrounding the outer circumference of the main conductor section 165Aa.

Figure 67A:
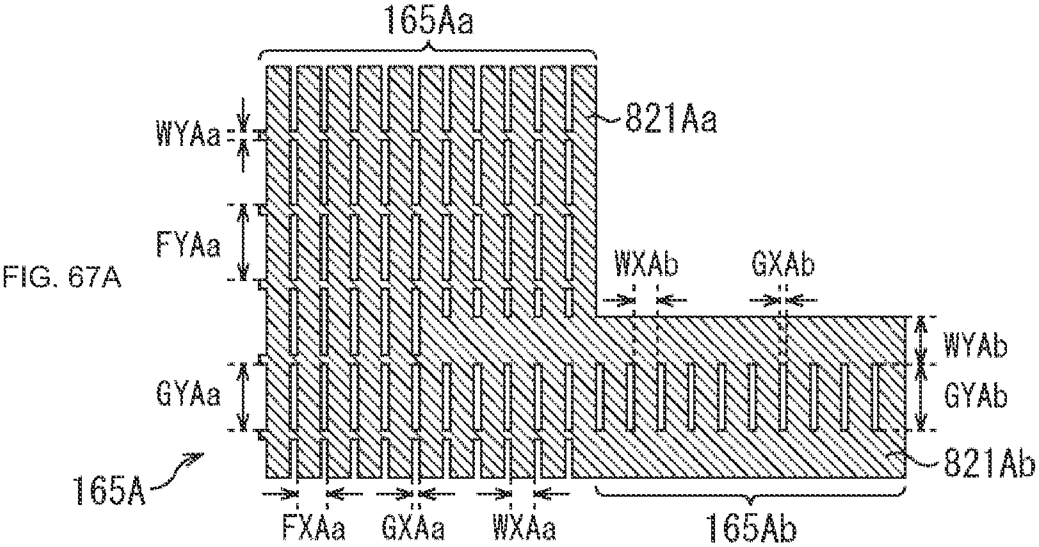
FIGS. 67A, 67B, and 67C are figures depicting a second modification example of the fourteenth configuration example of the conductor layers A and B.
Figure 68A:
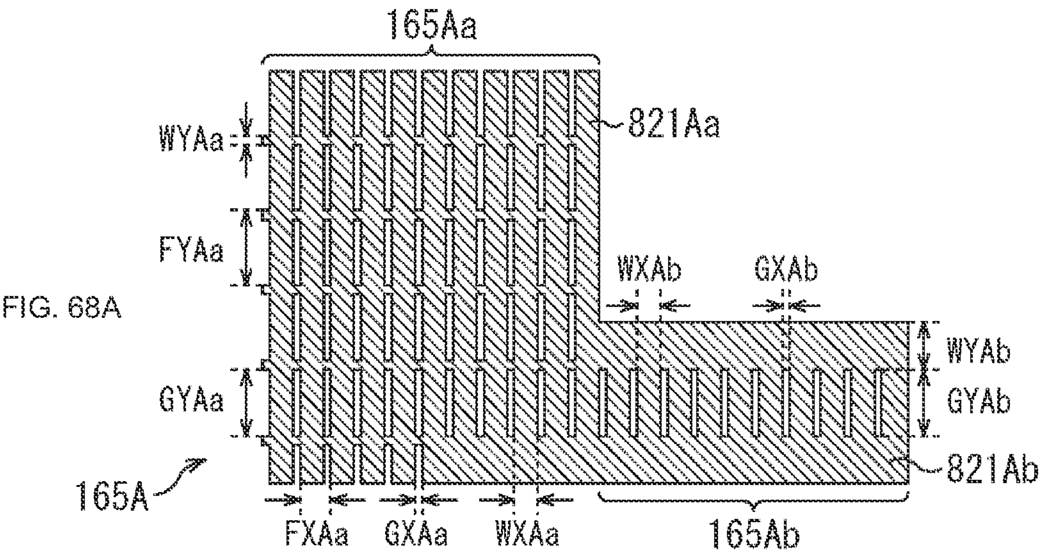
FIGS. 68A, 68B, and 68C are figures depicting a third modification example of the fourteenth configuration example of the conductor layers A and B.

In addition, for example, as depicted in FIGS. 67A and 68A, the main conductor section 165Aa and the lead conductor section 165Ab may be connected such that only some wires in multiple wires with the conductor width WYAb extending toward the main conductor section 165Aa of the mesh conductor 821Ab of the lead conductor section 165Ab protrude into the inside of the rectangle surrounding the outer circumference of the main conductor section 165Aa. In the mesh conductor 821Ab of the lead conductor section 165Ab in FIG. 67A, the upper wire in two wires with the conductor width WYAb extends to protrude into the inside of the rectangle surrounding the outer circumference of the main conductor section 165Aa, and in the mesh conductor 821Ab of the lead conductor section 165Ab in FIG. 68A, the lower wire extends to protrude into the inside of the rectangle surrounding the outer circumference of the main conductor section 165Aa.

This similarly applies also to the wiring layer 165B (conductor layer B). That is, while in the fourteenth configuration example depicted in FIGS. 65A, 65B, and 65C, the junction section between the main conductor section 165Ba and the lead conductor section 165Bb is arranged on an edge of a rectangle surrounding the outer circumference of the main conductor section 165Ba, this is not essential.

Figure 66B:
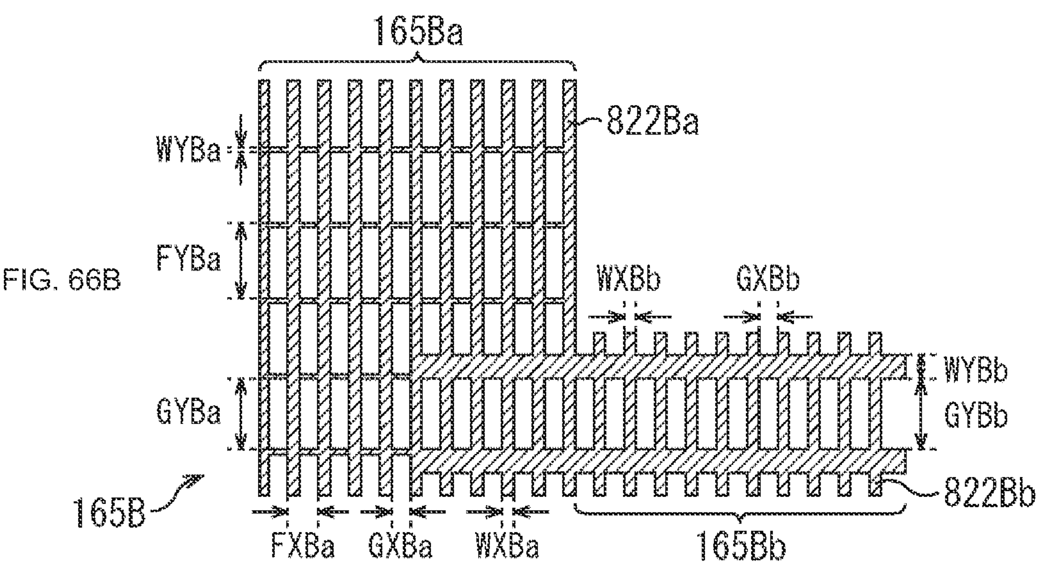
Figure 66C:
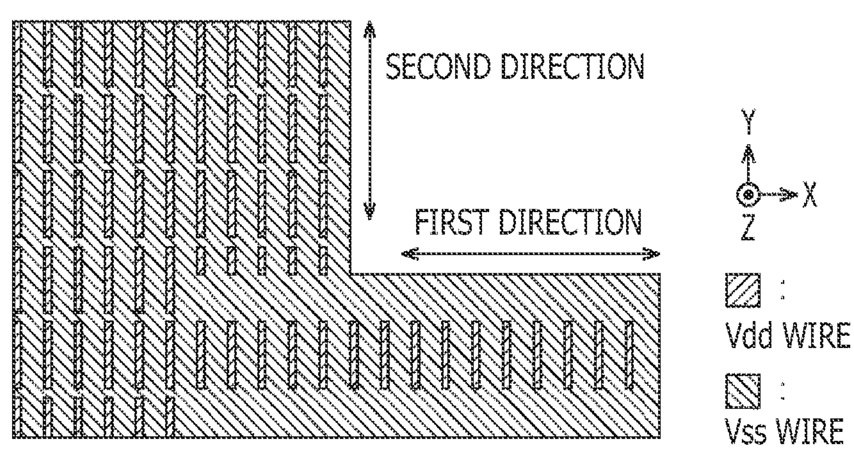

For example, as depicted in FIG. 66B, the main conductor section 165Ba and the lead conductor section 165Bb may be connected such that the mesh conductor 822Bb of the lead conductor section 165Bb protrudes into the inside of the rectangle surrounding the outer circumference of the main conductor section 165Ba.

Figure 67B:
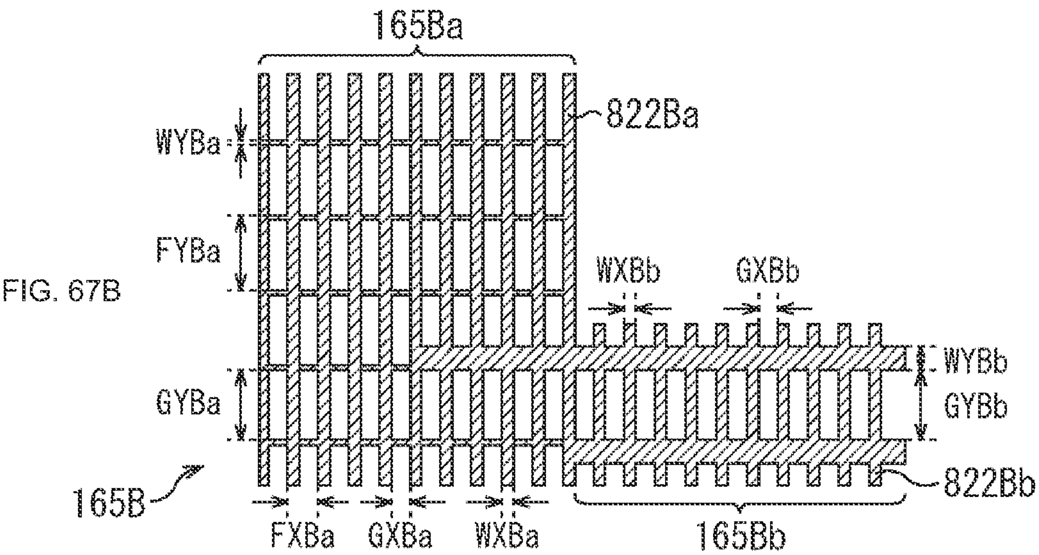
Figure 67C:
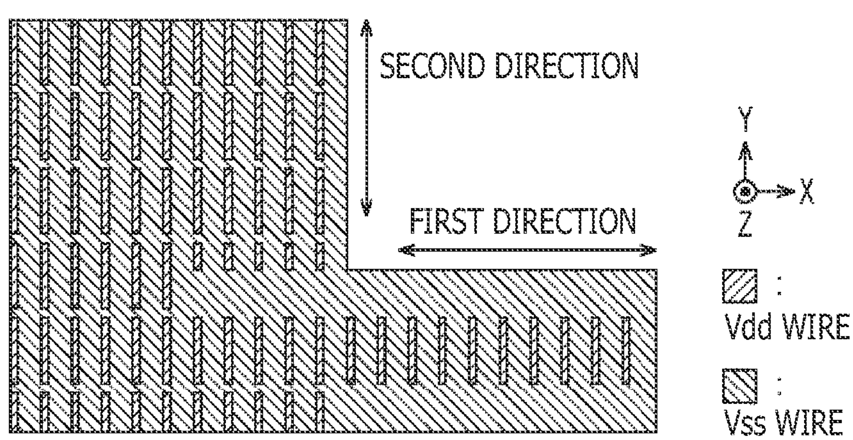
Figure 68B:
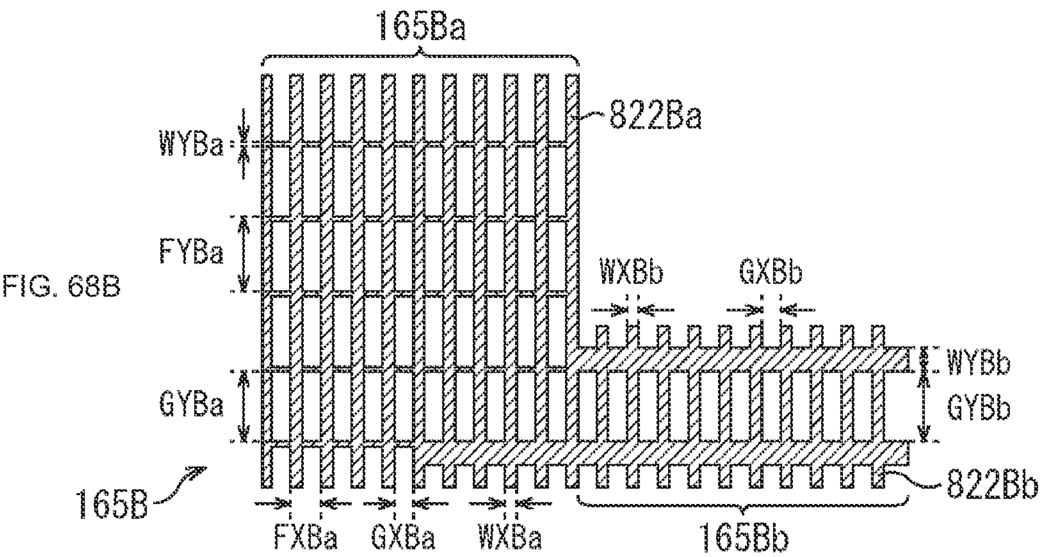
Figure 68C:
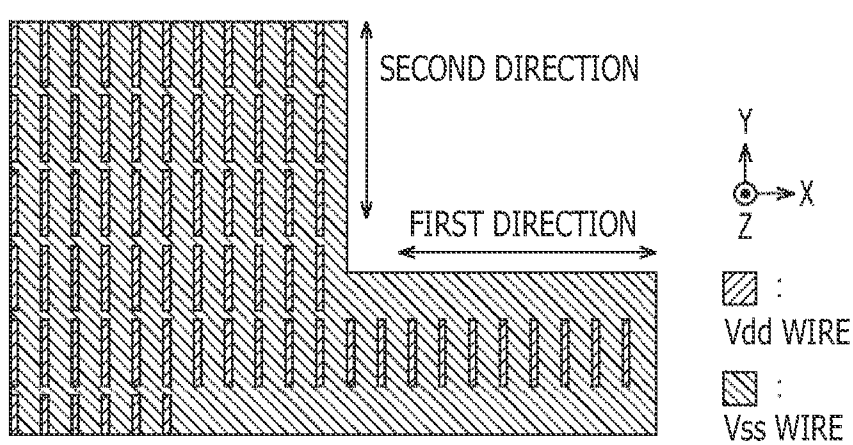

In addition, for example, as depicted in FIGS. 67B and FIG. 68B, the main conductor section 165Ba and the lead conductor section 165Bb may be connected such that only some wires in multiple wires with the conductor width WYBb extending toward the main conductor section 165Ba of the mesh conductor 822Bb of the lead conductor section 165Bb protrude into the inside of the rectangle surrounding the outer circumference of the main conductor section 165Ba. In the mesh conductor 822Bb of the lead conductor section 165Bb in FIG. 67B, the upper wire in two wires with the conductor width WYBb extends to protrude into the inside of the rectangle surrounding the outer circumference of the main conductor section 165Ba, and in the mesh conductor 822Bb of the lead conductor section 165Bb in FIG. 68B, the lower wire extends to protrude into the inside of the rectangle surrounding the outer circumference of the main conductor section 165Ba.

As in FIGS. 66A, 66B, 66C, 67A, 67B, 67C, 68A, 68B, and 68C, the shape of a section connecting the main conductor section 165*a* and the lead conductor section 165*b* may be formed in a complicated manner.

While the main conductor section 165Aa and the lead conductor section 165Ab are connected such that the mesh conductor 821Ab of the lead conductor section 165Ab protrudes into the inside of the rectangle surrounding the outer circumference of the main conductor section 165Aa in the first to third modification examples of the fourteenth configuration example depicted in FIGS. 66A, 66B, 66C, 67A, 67B, 67C, 68A, 68B, and 68C, the mesh conductor 821Aa of the main conductor section 165Aa may protrude out to the outside of the rectangle surrounding the outer circumference of the main conductor section 165Aa, and into the side where the lead conductor section 165Ab is located. In addition, the mesh conductor 822Ba of the main conductor section 165Ba may protrude out to the outside of the rectangle surrounding the outer circumference of the main conductor section 165Ba, and into the side where the lead conductor section 165Bb is located.

Fifteenth Configuration Example

Figure 69A:
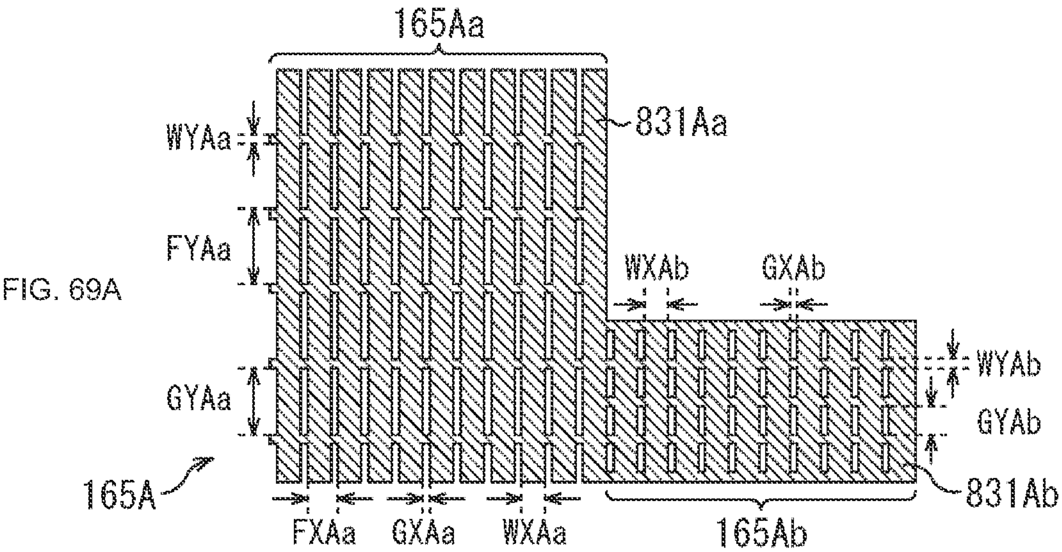
FIGS. 69A, 69B, and 69C are figures depicting a fifteenth configuration example of the conductor layers A and B.
Figure 69B:
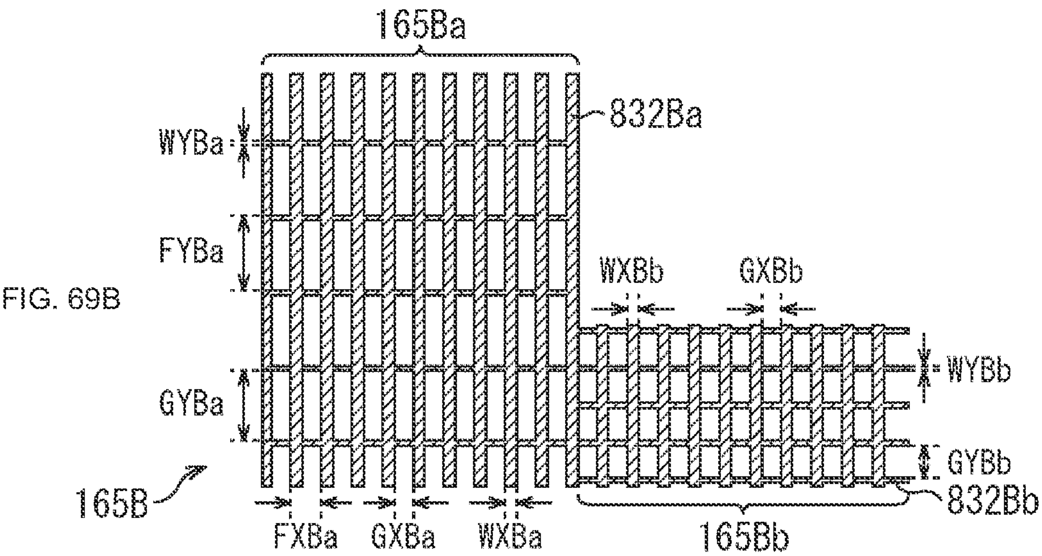
Figure 69C:
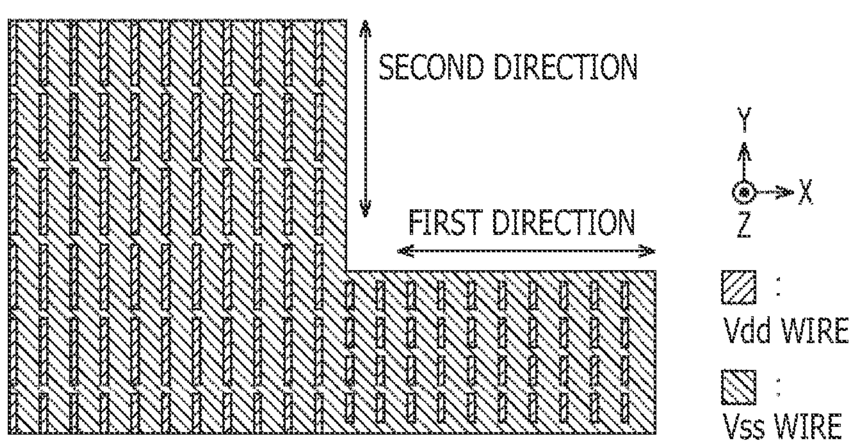

FIGS. 69A, 69B, and 69C depict a fifteenth configuration example of the conductor layers A and B. Note that FIG. 69A depicts the conductor layer A, and FIG. 69B depicts the conductor layer B. In the coordinate system in FIGS. 69A, 69B, and 69C, the X axis lies in the lateral direction, the Y axis lies in the longitudinal direction, and the Z axis lies in a direction perpendicular to the XY plane.

As depicted in FIG. 69A, the conductor layer A in the fifteenth configuration example includes a mesh conductor 831Aa of the main conductor section 165Aa and a mesh conductor 831Ab of the lead conductor section 165Ab. The mesh conductor 831Aa and the mesh conductor 831Ab are wires (Vss wires) connected to GND or a negative power supply, for example.

The mesh conductor 831Aa of the main conductor section 165Aa is similar to the mesh conductor 821Aa of the main conductor section 165Aa in the fourteenth configuration example depicted in FIGS. 65A, 65B, and 65C. On the other hand, the mesh conductor 831Ab of the lead conductor section 165Ab is different from the mesh conductor 821Ab of the lead conductor section 165Ab in the fourteenth configuration example depicted in FIGS. 69A, 69B, and 69C.

Specifically, the Y-direction gap width GYAb of the mesh conductor 831Ab of the lead conductor section 165Ab is formed smaller than the Y-direction gap width GYAa of the mesh conductor 831Aa of the main conductor section 165Aa. In the fourteenth configuration example depicted in FIGS. 65A, 65B, and 65C, the Y-direction gap width GYAb of the mesh conductor 821Ab of the lead conductor section 165Ab is the same as the Y-direction gap width GYAa of the mesh conductor 821Aa of the main conductor section 165Aa.

Specifically, the Y-direction gap width GYAb of the mesh conductor 831Ab of the lead conductor section 165Ab is formed smaller than the Y-direction gap width GYAa of the mesh conductor 831Aa of the main conductor section 165Aa. In the fourteenth configuration example depicted in FIG. 65, the Y-direction gap width GYAb of the mesh conductor 821Ab of the lead conductor section 165Ab is the same as the Y-direction gap width GYAa of the mesh conductor 821Aa of the main conductor section 165Aa.

By forming the Y-direction gap width GYAb of the mesh conductor 831Ab of the lead conductor section 165Ab smaller than the Y-direction gap width GYAa of the mesh conductor 831Aa of the main conductor section 165Aa in this manner, the wire resistance of the mesh conductor 831Ab of the lead conductor section 165Ab, which is a current-concentrated portion, can be lowered, and so voltage drops can be ameliorated further. Note that while the gap width GYAb is smaller than the gap width GYAa in the example used for the explanation, this is not essential. For example, the gap width GXAb may be formed smaller than the gap width GXAa. Thereby, the wire resistance of the mesh conductor 831Ab can be lowered, and so voltage drops can be ameliorated further.

As depicted in FIG. 69B, the conductor layer B in the fifteenth configuration example includes a mesh conductor 832Ba of the main conductor section 165Ba and a mesh conductor 832Bb of the lead conductor section 165Bb. The mesh conductor 832Ba and the mesh conductor 832Bb are wires (Vdd wires) connected to a positive power supply, for example.

The mesh conductor 832Ba of the main conductor section 165Ba is similar to the mesh conductor 822Ba of the main conductor section 165Ba in the fourteenth configuration example depicted in FIGS. 65A, 65B, and 65C. On the other hand, the mesh conductor 832Bb of the lead conductor section 165Bb is different from the mesh conductor 822Bb of the lead conductor section 165Bb in the fourteenth configuration example depicted in FIGS. 65A, 65B, and 65C.

Specifically, the Y-direction gap width GYBb of the mesh conductor 832Bb of the lead conductor section 165Bb is formed smaller than the Y-direction gap width GYBa of the mesh conductor 832Ba of the main conductor section 165Ba. In the fourteenth configuration example depicted in FIGS. 65A, 65B, and 65C, the Y-direction gap width GYBb of the mesh conductor 822Bb of the lead conductor section 165Bb is the same as the second-direction gap width GYBa of the mesh conductor 822Ba of the main conductor section 165Ba.

By forming the Y-direction gap width GYBb of the mesh conductor 832Bb of the lead conductor section 165Bb smaller than the Y-direction gap width GYBa of the mesh conductor 832Ba of the main conductor section 165Ba in this manner, the wire resistance of the mesh conductor 832Bb of the lead conductor section 165Bb, which is a current-concentrated portion, can be lowered, and so voltage drops can be ameliorated further. Note that while the gap width GYBb is smaller than the gap width GYBa in the example used for the explanation, this is not essential. For example, the gap width GXBb may be formed smaller than the gap width GXBa. Thereby, the wire resistance of the mesh conductor 832Bb can be lowered, and so voltage drops can be ameliorated further.

In addition, in the overlapping state of the conductor layer A and the conductor layer B as depicted in FIG. 69C, at least one of the conductor layer A and the conductor layer B covers an active element group 167. That is, the main conductor section 165Aa of the wiring layer 165A and the main conductor section 165Ba of the wiring layer 165B form a light-blocking structure, and the lead conductor section 165Ab of the wiring layer 165A and the lead conductor section 165Bb of the wiring layer 165B form a light-blocking structure. Thereby, hot carrier light emissions from the active element group 167 can be blocked in the fifteenth configuration example also.

<First Modification Example of Fifteenth Configuration Example>

Figure 70A:
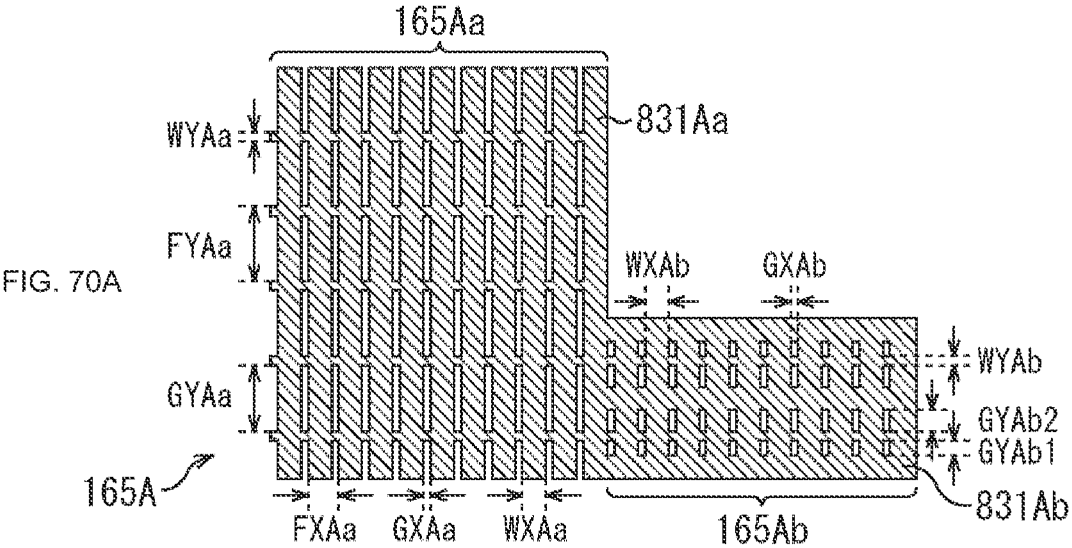
FIGS. 70A, 70B, and 70C are figures depicting a first modification example of the fifteenth configuration example of the conductor layers A and B.
Figure 70B:
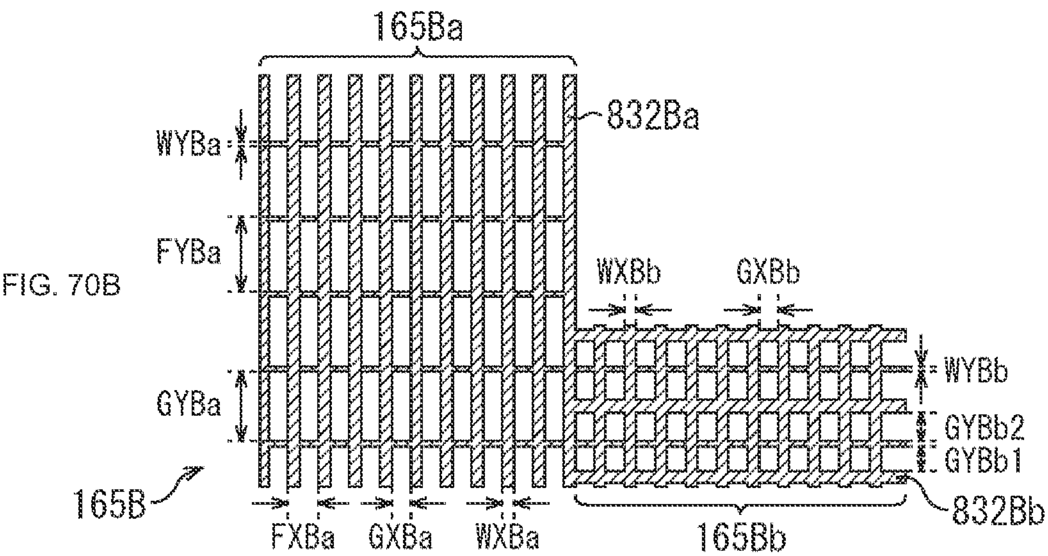
Figure 70C:
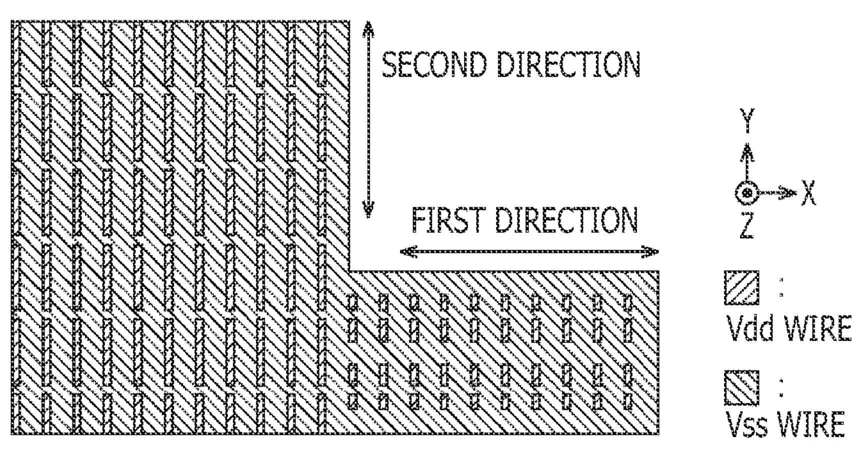

FIGS. 70A, 70B, and 70C depict a first modification example of the fifteenth configuration example. Note that FIG. 70A depicts the conductor layer A, and FIG. 70B depicts the conductor layer B. FIG. 70C depicts a state of the conductor layers A and B depicted in in FIGS. 70A and 70B, respectively, as seen from the side where the conductor layer A is located. In the coordinate system in FIGS. 70A, 70B, and 700, the X axis lies in the lateral direction, the Y axis lies in the longitudinal direction, and the Z axis lies in a direction perpendicular to the XY plane.

The first modification example of the fifteenth configuration example is different from the fifteenth configuration example depicted in FIGS. 69A, 69B, and 69C in that the Y-direction gap width GYAb of the lead conductor section 165Ab of the wiring layer 165A is not an entirely even width. Specifically, as depicted in FIG. 70A, the mesh conductor 831Ab of the lead conductor section 165Ab of the wiring layer 165A has two types of gap width GYAb, a smaller gap width GYAb1 and a larger gap width GYAb2.

In addition, the first modification example of the fifteenth configuration example is different from the fifteenth configuration example depicted in FIGS. 69A, 69B, and 69C in that the Y-direction gap width GYBb of the lead conductor section 165Bb of the wiring layer 165B is not an entirely even width. Specifically, as depicted in FIG. 70B, the mesh conductor 832Bb of the lead conductor section 165Bb of the wiring layer 165B has two types of gap width GYBb, a smaller gap width GYBb1 and a larger gap width GYBb2.

In the first modification example of the fifteenth configuration example also, in the overlapping state of the conductor layer A and the conductor layer B as depicted in FIG. 700, the lead conductor section 165Ab of the wiring layer 165A and the lead conductor section 165Bb of the wiring layer 165B form a light-blocking structure.

<Second Modification Example of Fifteenth Configuration Example>

Figure 71A:
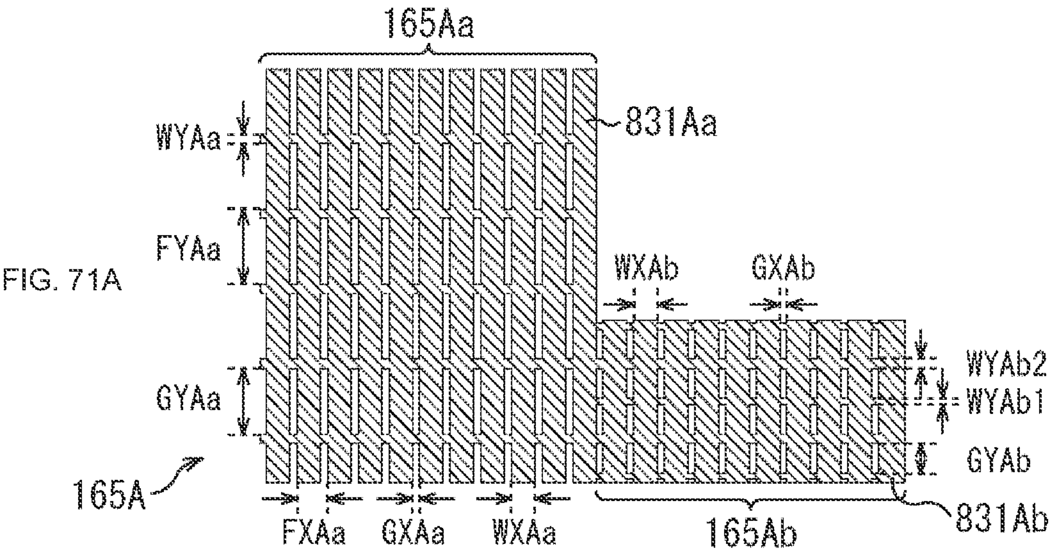
FIGS. 71A, 71B, and 71C are figures depicting a second modification example of the fifteenth configuration example of the conductor layers A and B.
Figure 71B:
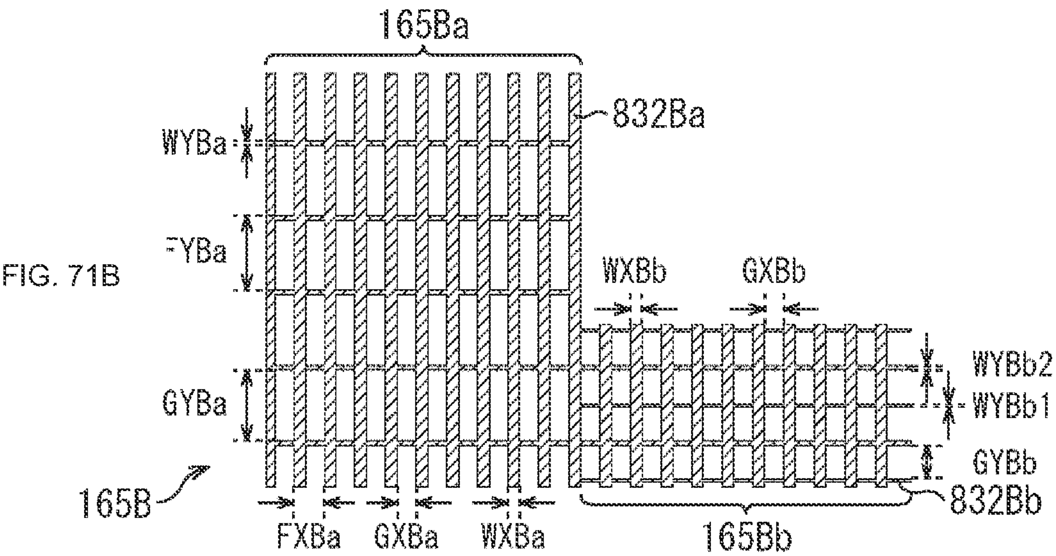
Figure 71C:
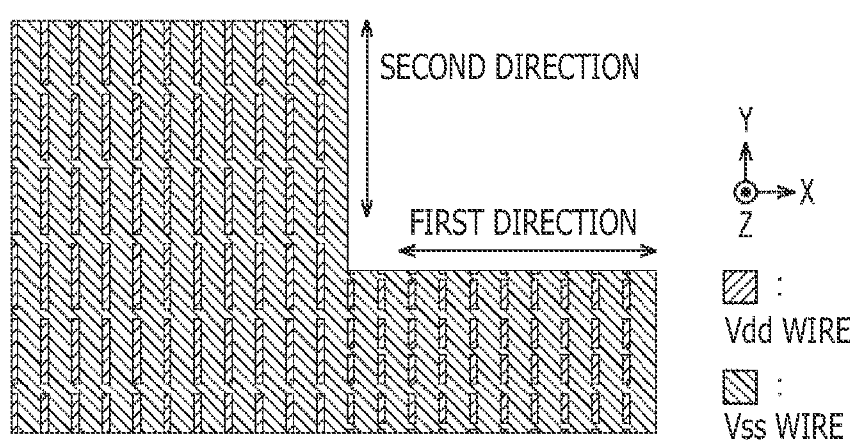

FIGS. 71A, 71B, and 71C depict a second modification example of the fifteenth configuration example. Note that FIG. 71A depicts the conductor layer A, and FIG. 71B depicts the conductor layer B. FIG. 71C depicts a state of the conductor layers A and B depicted in in FIGS. 71A and 71B, respectively, as seen from the side where the conductor layer A is located. In the coordinate system in FIGS. 71A, 71B, and 71C, the X axis lies in the lateral direction, the Y axis lies in the longitudinal direction, and the Z axis lies in a direction perpendicular to the XY plane.

The second modification example of the fifteenth configuration example is different from the fifteenth configuration example depicted in FIGS. 69A, 69B, and 69C in that the Y-direction conductor width WYAb of the lead conductor section 165Ab of the wiring layer 165A is not an entirely even width. Specifically, as depicted in FIG. 71A, the mesh conductor 831Ab of the lead conductor section 165Ab of the wiring layer 165A has two types of conductor width WYAb, a smaller conductor width WYAb1 and a larger conductor width WYAb2.

In addition, the second modification example of the fifteenth configuration example is different from the fifteenth configuration example depicted in FIGS. 69A, 69B, and 69C in that the Y-direction conductor width WYBb of the lead conductor section 165Bb of the wiring layer 165B is not an entirely even width. Specifically, as depicted in FIG. 71B, the mesh conductor 832Bb of the lead conductor section 165Bb of the wiring layer 165B has two types of conductor width WYBb, a smaller conductor width WYBb1 and a larger conductor width WYBb2.

In the second modification example of the fifteenth configuration example also, in the overlapping state of the conductor layer A and the conductor layer B as depicted in FIG. 71C, the lead conductor section 165Ab of the wiring layer 165A and the lead conductor section 165Bb of the wiring layer 165B form a light-blocking structure.

By making the gap width GYAb or conductor width WYAb of the lead conductor section 165Ab of the wiring layer 165A and the gap width GYBb or conductor width WYBb of the lead conductor section 165Bb of the wiring layer 165B non-uniform as in the first modification example and second modification example of the fifteenth configuration example, the degree of freedom of wiring can be increased. Although typically there are constraints related to the occupancy of conductor regions in each conductor layer, the wire resistances of the lead conductor sections 165Ab and 165Bb can be reduced as much as possible within the constraints of the occupancy by increasing the degree of freedom of wiring, and so voltage drops can be ameliorated further. Note that the gap width GYAb is not an entirely even width, the gap width GYBb is not an entirely even width, the conductor width WYAb is not entirely an even width, and the conductor width WYBb is not an entirely even width in the examples explained, but these are not essential. For example, in other possible configurations, the X-direction gap width GXAb, the X-direction gap width GXBb, the X-direction conductor width WXAb, or the X-direction conductor width WXBb may be made not an entirely even width. The degree of freedom of wiring can be increased in these cases also, and so voltage drops can be ameliorated further for a reason similar to that described above.

Sixteenth Configuration Example

Figure 72A:
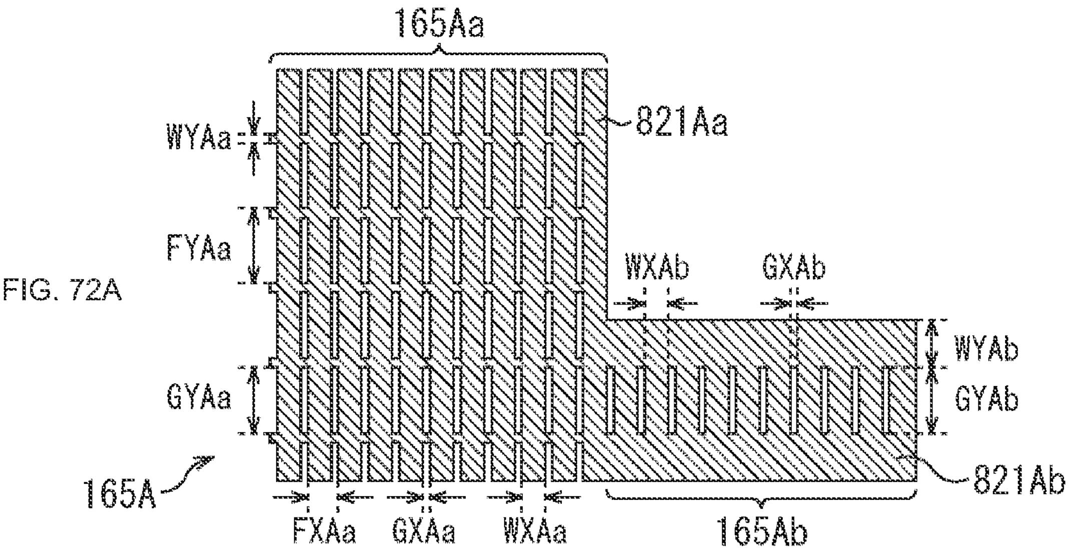
FIGS. 72A, 72B, and 72C are figures depicting a sixteenth configuration example of the conductor layers A and B.
Figure 72B:
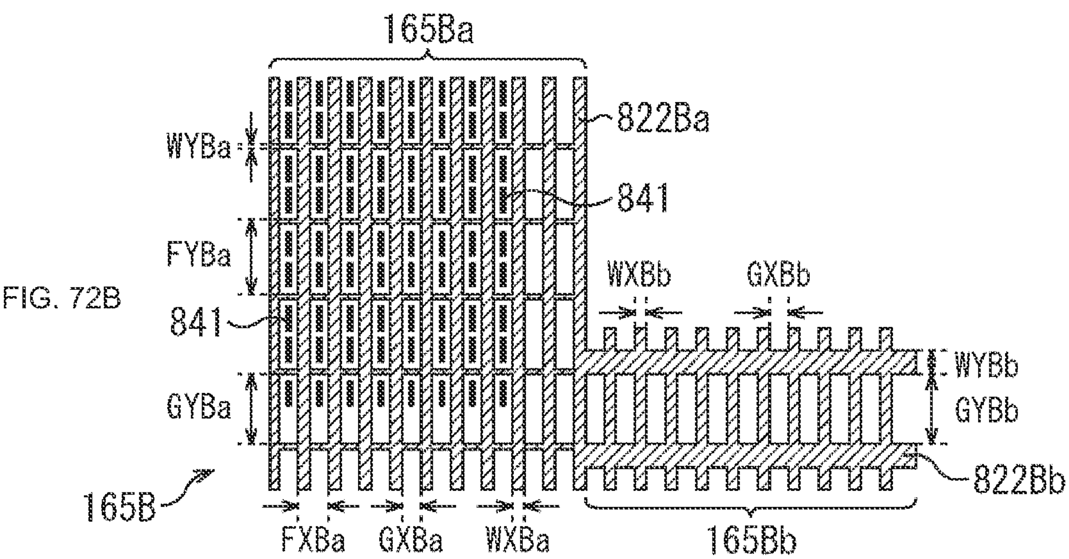
Figure 72C:
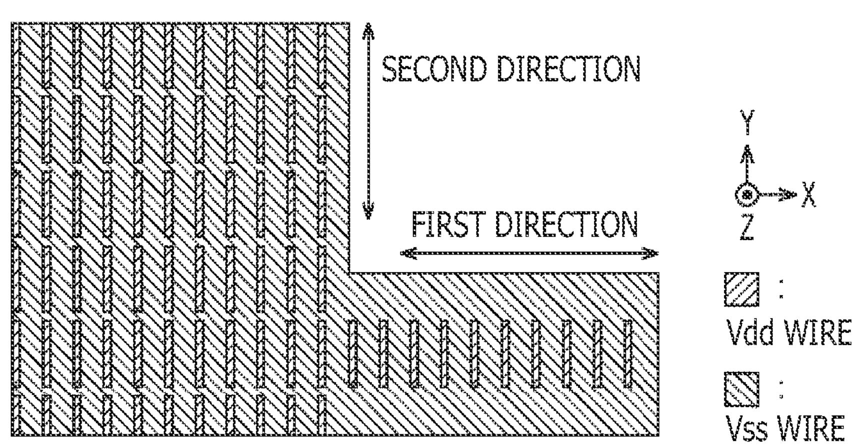

FIGS. 72A, 72B, and 72C depict a sixteenth configuration example of the conductor layers A and B. Note that FIG. 72A depicts the conductor layer A, and FIG. 72B depicts the conductor layer B. In the coordinate system in FIGS. 72A, 72B, and 72C, the X axis lies in the lateral direction, the Y axis lies in the longitudinal direction, and the Z axis lies in a direction perpendicular to the XY plane.

The conductor layer A in the sixteenth configuration example depicted in FIG. 72A is similar to the conductor layer A in the fourteenth configuration example depicted in FIGS. 65A, 65B, and 65C, and so an explanation thereof is omitted.

The conductor layer B in the sixteenth configuration example depicted in FIG. 72B has a configuration in which relay conductors 841 are further added to the conductor layer B in the fourteenth configuration example depicted in FIGS. 65A, 65B, and 65C. More specifically, the main conductor section 165Ba includes the mesh conductor 822Ba and multiple relay conductors 841, and the lead conductor section 165Bb includes the mesh conductor 822Bb similar to that in the fourteenth configuration example.

In the main conductor section 165Ba, the relay conductors 841 are arranged in non-conductor oblong rectangular gap regions in the mesh conductor 822Ba that are long in the Y direction. The relay conductors 841 are electrically insulated from the mesh conductor 822Ba and, for example, are connected to a Vss wire connected with the mesh conductor 821Aa in the conductor layer A. One or more relay conductors 841 are arranged in a gap region of the mesh conductor 822Ba. FIG. 72B depicts an example in which two relay conductor 841 in total are arranged in two rows x one column in a gap region of the mesh conductor 822Ba.

FIG. 72B, the relay conductors 841 are arranged only in some gap regions of the mesh conductor 822Ba in the entire region of the main conductor section 165Ba.

However, the relay conductors 841 may be arranged in gap regions in the entire region of the main conductor section 165Ba. In addition, while relay conductors 841 are not arranged in gap regions of the mesh conductor 822Bb of the lead conductor section 165Bb in the conductor layer B in the sixteenth configuration example, the relay conductors 841 may be arranged also in gap regions of the mesh conductor 822Bb.

<First Modification Example of Sixteenth Configuration Example>

Figure 73A:
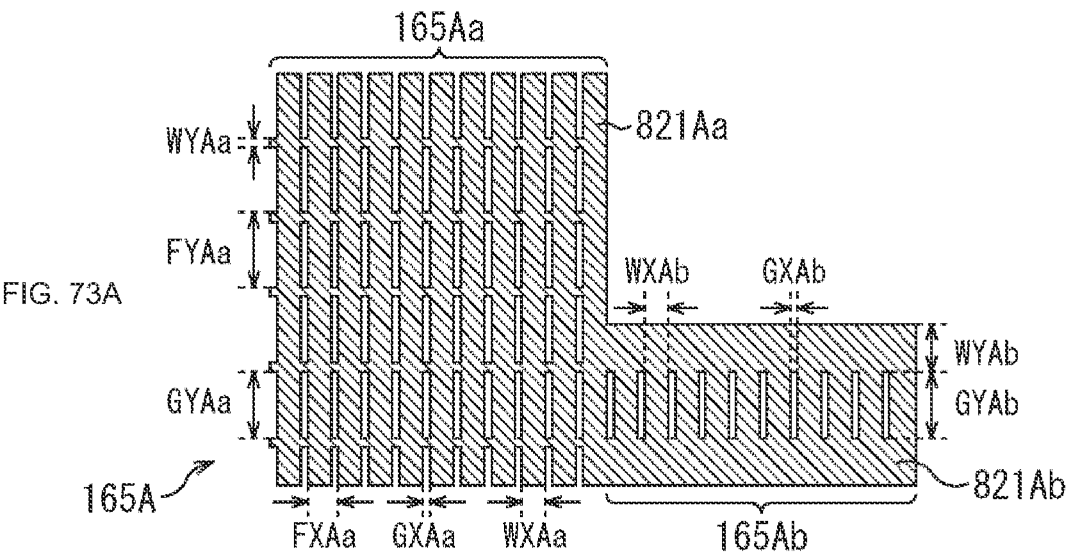
FIGS. 73A, 73B, and 73C are figures depicting a first modification example of the sixteenth configuration example of the conductor layers A and B.
Figure 73B:
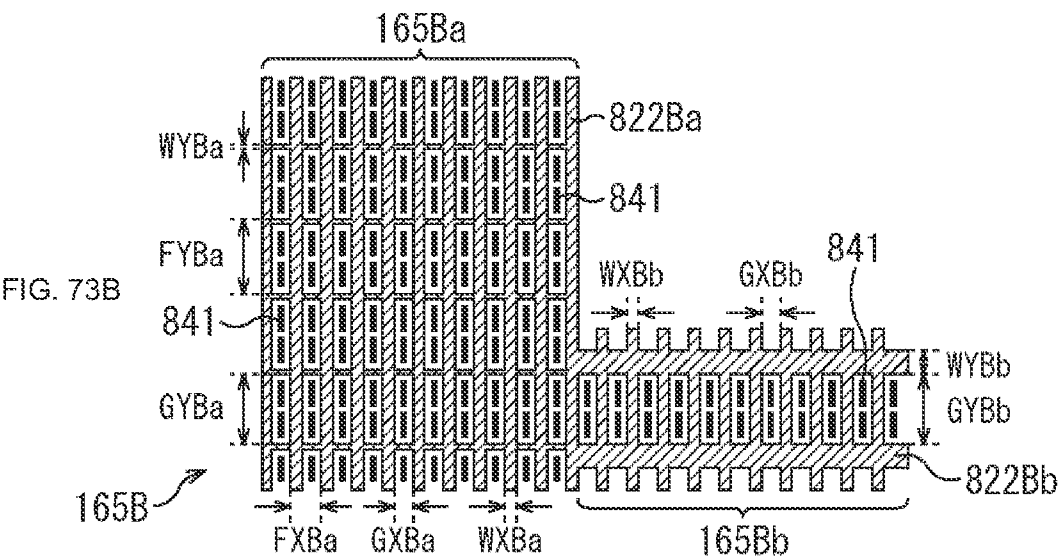
Figure 73C:
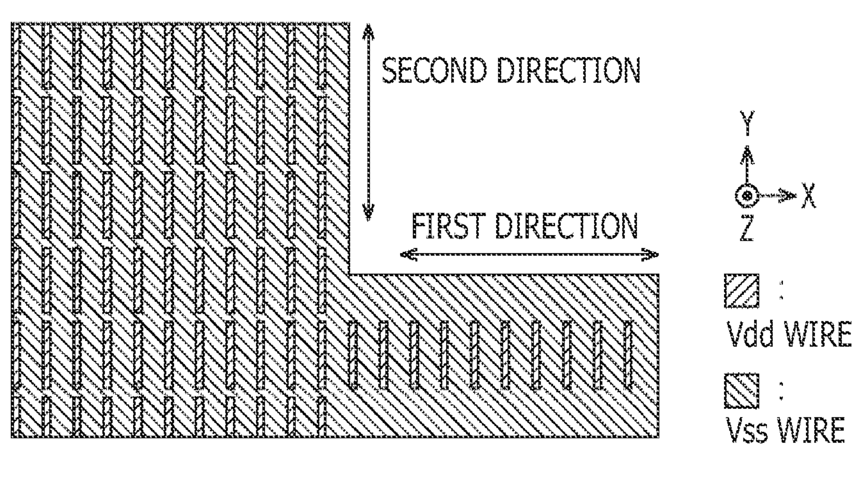

FIGS. 73A, 73B, and 73C depict a first modification example of the sixteenth configuration example.

In the first modification example of the sixteenth configuration example in FIGS. 73A, 73B, and 73C, the relay conductors 841 are arranged in gap regions in the entire region of the main conductor section 165Ba in the conductor layer B, and the relay conductors 841 are arranged also in gap regions of the mesh conductor 822Bb of the lead conductor section 165Bb. In other respects, the first modification example in FIGS. 73A, 73B, and 73C has a configuration similar to that in the sixteenth configuration example depicted in FIGS. 72A, 72B, and 72C.

<Second Modification Example of Sixteenth Configuration Example>

Figure 74A:
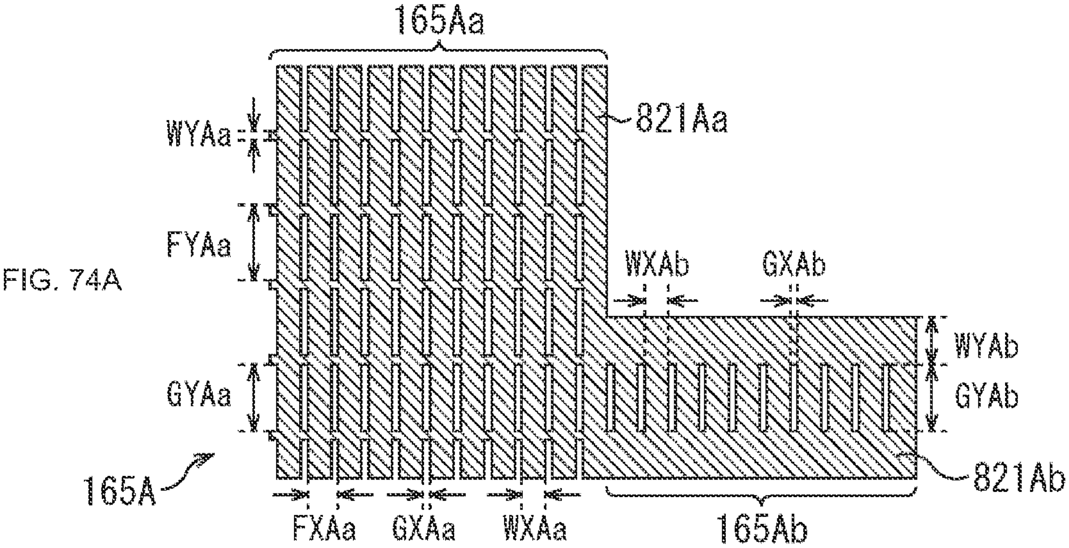
FIGS. 74A, 74B, and 74C are figures depicting a second modification example of the sixteenth configuration example of the conductor layers A and B.
Figure 74B:
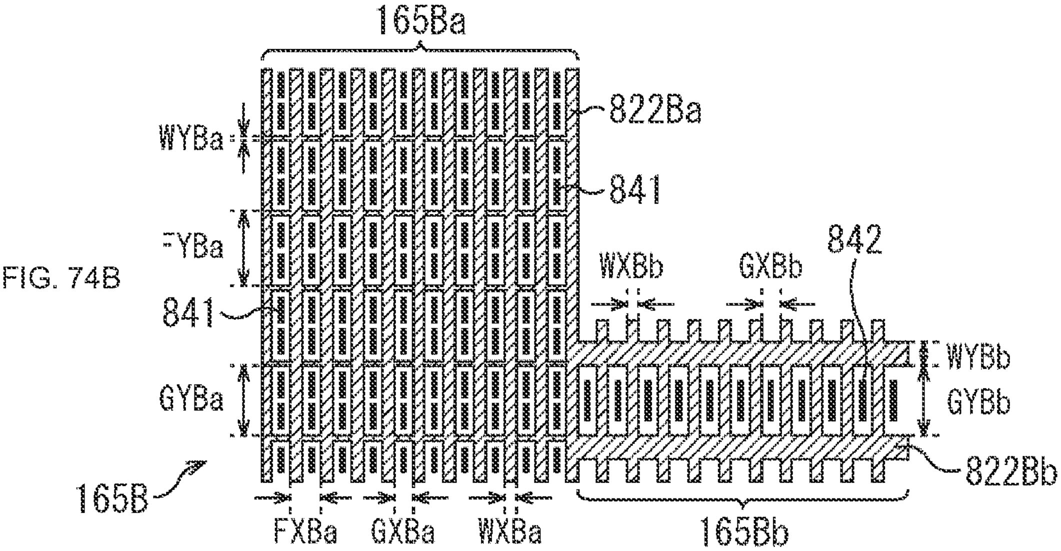
Figure 74C:
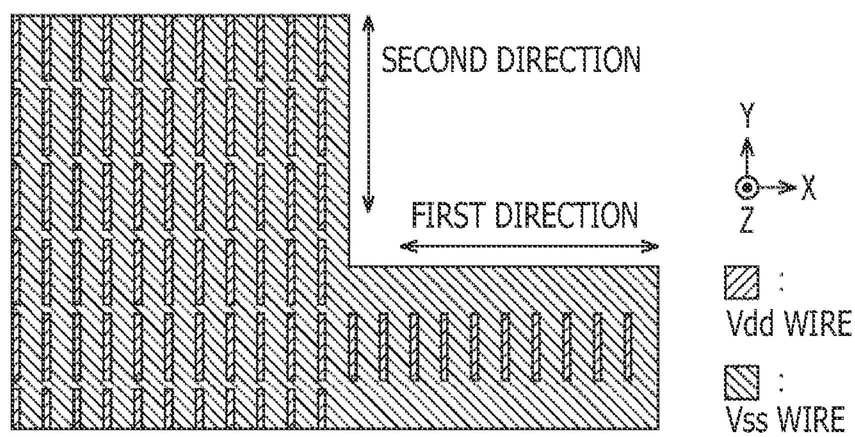

FIGS. 74A, 74B, and 74C depict a second modification example of the sixteenth configuration example.

The second modification example of the sixteenth configuration example in FIGS. 74A, 74B, and 74C are similar to the first modification example in that the relay conductors 841 are arranged in gap regions in the entire region of the main conductor section 165Ba in the conductor layer B. On the other hand, the second modification example of the sixteenth configuration example is different from the first modification example in that relay conductors 842 different from the relay conductors 841 are arranged in gap regions of the mesh conductor 822Bb of the lead conductor section 165Bb. In other respects, the second modification example in FIGS. 74A, 74B, and 74C has a configuration similar to that in the sixteenth configuration example depicted in FIGS. 72A, 72B, and 72C.

As in the second modification example, the numbers and shapes of the relay conductors 841 arranged in gap regions of the mesh conductor 822Ba of the main conductor section 165Ba in the conductor layer B and the relay conductors 842 arranged in gap regions of the mesh conductor 822Bb of the lead conductor section 165Bb may be different.

In a case in which the relay conductors 841 are not arranged in gap regions of the mesh conductor 822Bb of the lead conductor section 165Bb as in the conductor layer B in the sixteenth configuration example depicted in FIGS. 72A, 72B, and 72C, the degree of freedom of wiring (the mesh conductor 822Bb) can be increased. Although typically there are constraints related to the occupancy of conductor regions in each conductor layer, the wire resistances of the lead conductor section 165Bb can be reduced as much as possible within the constraints of the occupancy by increasing the degree of freedom of wiring, and so voltage drops can be ameliorated further.

On the other hand, in a case in which the relay conductors 841, the relay conductors 842, or the like are arranged in gap regions of the mesh conductor 822Bb of the lead conductor section 165Bb, voltage drops can be ameliorated further in a case in which active elements such as MOS transistors or diodes are arranged in regions of the lead conductor section 165Bb or in an overlying or underlying layer at the same plane position as the lead conductor section 165Bb.

In addition, by making the numbers and shapes of the relay conductors 841 arranged in gap regions of the mesh conductor 822Ba of the main conductor section 165Ba in the conductor layer B and the relay conductors 842 arranged in gap regions of the mesh conductor 822Bb of the lead conductor section 165Bb different, it is possible to make full use of the occupancy of conductor regions of each conductor layer in the main conductor section 165Ba and the lead conductor section 165Bb, and so voltage drops can be ameliorated further by reducing wire resistances.

Note that the shapes of the relay conductors 841 can be any shapes, but desirably are circular or polygonal shapes which have symmetry like rotational symmetry, mirror symmetry, or the like. The relay conductors 841 can be arranged at the middle positions or any other positions in gap regions of the mesh conductor 822Ba. The relay conductors 841 may be connected to a conductor layer as a Vss wire other than the conductor layer A. The relay conductors 841 may be connected to a conductor layer as a Vss wire on a side closer to an active element group 167 than to the conductor layer B. The relay conductors 841 can be connected to a conductor layer other than the conductor layer A, or a conductor layer or the like on a side closer to an active element group 167 than to the conductor layer B, via conductor vias extending in the Z direction. This similarly applies also to the relay conductors 842.

While relay conductors 841 or 842 are arranged in gap regions of the mesh conductors 822Ba and 822Bb in the conductor layer B in the examples depicted in the sixteenth configuration example in FIGS. 72A, 72B, 72C, 73A, 73B, 73C, 74A, 74B, and 74C, the same or different relay conductors may be arranged in gap regions of the mesh conductors 821Aa and 821Ab in the conductor layer A.

Seventeenth Configuration Example

Figure 75A:
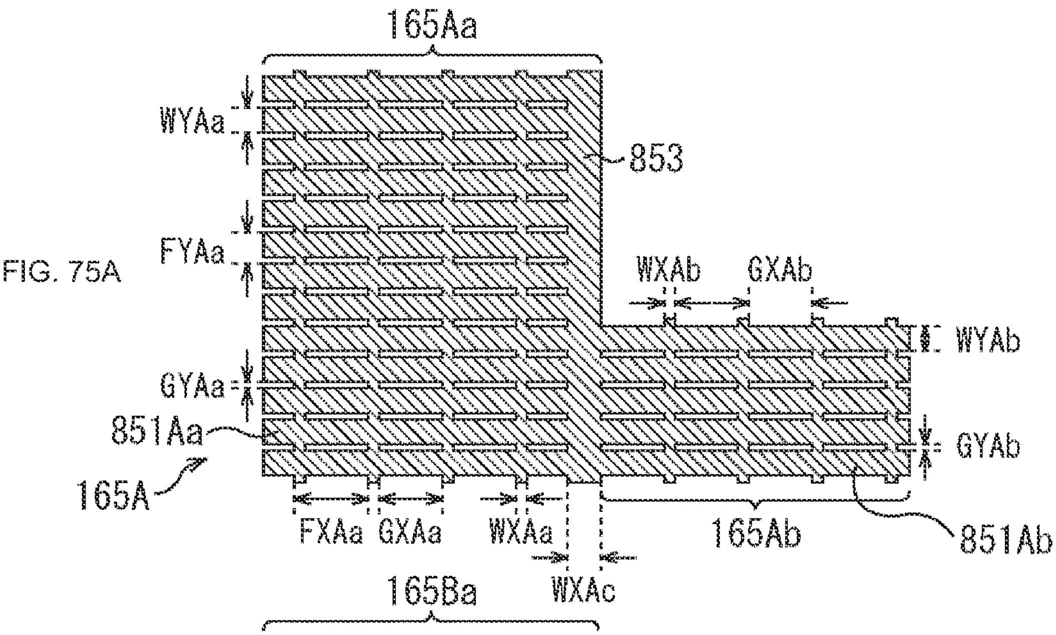
FIGS. 75A, 75B, and 75C are figures depicting a seventeenth configuration example of the conductor layers A and B.
Figure 75B:
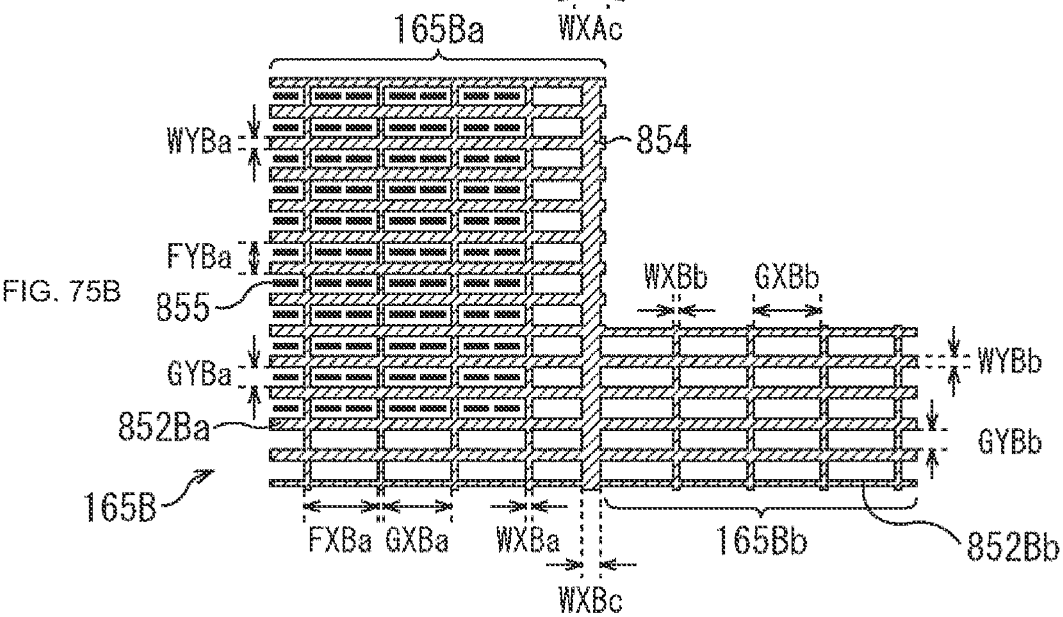
Figure 75C:
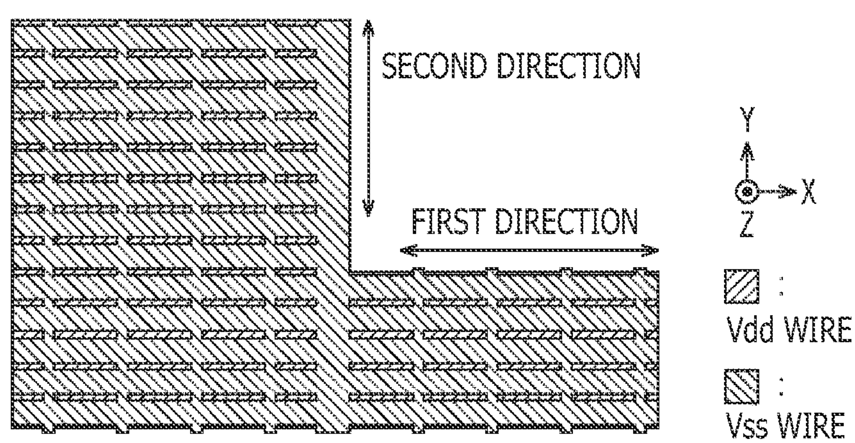

FIGS. 75A, 75B, and 75C depict a seventeenth configuration example of the conductor layers A and B. Note that FIG. 75A depicts the conductor layer A, and FIG. 75B depicts the conductor layer B. In the coordinate system in FIGS. 75A, 75B, and 75C, the X axis lies in the lateral direction, the Y axis lies in the longitudinal direction, and the Z axis lies in a direction perpendicular to the XY plane.

If the conductor layer A in the seventeenth configuration example depicted in FIG. 75A is compared with the conductor layer A in the fourteenth configuration example depicted in FIG. 65A, the shape of a mesh conductor 851Aa of the main conductor section 165Aa and the shape of a mesh conductor 851Ab of the lead conductor section 165Ab are different.

In other words, while gap regions of the mesh conductor 821Aa in the fourteenth configuration example depicted in FIG. 65A have a longitudinally long oblong rectangular shape, gap regions of the mesh conductor 851Aa in the seventeenth configuration example depicted in FIG. 75A have a laterally long oblong rectangular shape. In addition, while gap regions of the mesh conductor 821Ab in FIG. 65A have a longitudinally long oblong rectangular shape, gap regions of the mesh conductor 851Ab in FIG. 75A have a laterally long oblong rectangular shape.

The mesh conductor 851Ab of the lead conductor section 165Ab in FIG. 75A and the mesh conductor 821Ab in the fourteenth configuration example in FIG. 65A have a commonality in that currents flow more easily in the X direction (first direction) toward the main conductor section 165Aa than in the Y direction (second direction) orthogonal to the X direction.

On the other hand, while the mesh conductor 851Aa of the main conductor section 165Aa in FIG. 75A has a shape in which currents flow more easily in the X direction than in the Y direction, the mesh conductor 821Aa of the main conductor section 165Aa in the fourteenth configuration example in FIG. 65A has a shape in which currents flow more easily in the Y direction.

That is, the conductor layer A in the seventeenth configuration example depicted in FIG. 75A is different from the conductor layer A in the fourteenth configuration example in FIG. 65A in terms of the direction in which currents flow more easily in the main conductor section 165Aa.

In addition, the main conductor section 165Aa in the conductor layer A in the seventeenth configuration example includes a reinforcement conductor 853 that reinforces the tendency of allowing currents to flow more easily in the Y direction than in the X direction. A conductor width WXAc of the reinforcement conductor 853 is desirably formed larger than one of or both the X-direction conductor width WXAa and Y-direction conductor width WYAa of the mesh conductor 851Aa. The conductor width WXAc of the reinforcement conductor 853 is formed larger than the smaller one of the X-direction conductor width WXAa and Y-direction conductor width WYAa of the mesh conductor 851Aa. Note that while the X-direction position where the reinforcement conductor 853 is formed is the position that is in the region of the main conductor section 165Aa and is closest to the lead conductor section 165Ab in the example in FIGS. 75A, 75B, and 75C, it is sufficient if the position where the reinforcement conductor 853 is formed is a position near the junction section.

Because the mesh conductor 851Aa of the main conductor section 165Aa can be formed in a shape in which currents flow more easily in the X direction, the layout can be created with repetitions of a minimum basic pattern, and accordingly the degree of freedom of designing of the wiring layouts increases. In addition, voltage drops can be ameliorated further, depending on the arrangement of active elements such as MOS transistors or diodes.

Then, because the reinforcement conductor 853 that reinforces the tendency of allowing currents to flow more easily in the Y direction is provided, the currents are more easily diffused in the Y direction in the main conductor section 165Aa. Accordingly, the current concentration around the junction section between the main conductor section 165Aa and the lead conductor section 165Ab can be relaxed. In a case in which currents are concentrated locally, inductive noise worsens due to the concentrated portions, but because the current concentration can be relaxed, inductive noise can be ameliorated further.

If the conductor layer B in the seventeenth configuration example depicted in FIG. 75A is compared with the conductor layer B in the fourteenth configuration example depicted in FIG. 65B, the shape of a mesh conductor 852Ba of the main conductor section 165Ba and the shape of a mesh conductor 852Bb of the lead conductor section 165Bb are different.

In other words, while gap regions of the mesh conductor 822Ba in the fourteenth configuration example depicted in FIG. 65B have a longitudinally long oblong rectangular shape, gap regions of the mesh conductor 852Ba in the seventeenth configuration example depicted in FIG. 75B have a laterally long oblong rectangular shape. In addition, while gap regions of the mesh conductor 822Bb in FIG. 65B have a longitudinally long oblong rectangular shape, gap regions of the mesh conductor 852Bb in FIG. 75B have a laterally long oblong rectangular shape.

The mesh conductor 852Bb of the lead conductor section 165Bb in FIG. 75B and the mesh conductor 822Bb in the fourteenth configuration example in FIG. 65B have a commonality in that currents flow more easily in the X direction (first direction) toward the main conductor section 165Ba than in the Y direction (second direction) orthogonal to the X direction.

On the other hand, while the mesh conductor 852Ba of the main conductor section 165Ba in FIG. 75B has a shape in which currents flow more easily in the X direction than in the Y direction, the mesh conductor 822Ba of the main conductor section 165Ba in the fourteenth configuration example in FIG. 65B has a shape in which currents flow more easily in the Y direction.

That is, the conductor layer B in the seventeenth configuration example depicted in FIG. 75B is different from the conductor layer B in the fourteenth configuration example in FIG. 65B in terms of the direction in which currents flow more easily in the main conductor section 165Ba.

In addition, the main conductor section 165Ba in the conductor layer B in the seventeenth configuration example includes a reinforcement conductor 854 that reinforces the tendency of allowing currents to flow more easily in the Y direction than in the X direction. A conductor width WXBc of the reinforcement conductor 854 is desirably formed larger than one of or both the X-direction conductor width WXBa and Y-direction conductor width WYBa of the mesh conductor 852Ba. The conductor width WXBc of the reinforcement conductor 854 is formed larger than the smaller one of the X-direction conductor width WXBa and Y-direction conductor width WYBa of the mesh conductor 852Ba. While the X-direction position where the reinforcement conductor 854 is formed is the position that is in the region of the main conductor section 165Ba and is closest to the lead conductor section 165Bb in the example in FIGS. 75A, 75B, and 75C, it is sufficient if the position where the reinforcement conductor 854 is formed is a position near the junction section.

As depicted in FIG. 75C, the reinforcement conductor 853 in the conductor layer A and the reinforcement conductor 854 in the conductor layer B are formed at overlapping positions. Because an active element group 167 is covered with at least one of the conductor layer A and the conductor layer B in the overlapping state of the conductor layer A and the conductor layer B, hot carrier light emissions from the active element group 167 can be blocked in the seventeenth configuration example also. Note that in a case in which it is not necessary to block hot carrier light emissions near the reinforcement conductor 853 or the reinforcement conductor 854, for example, the reinforcement conductor 853 and the reinforcement conductor 854 do not have to be formed at overlapping positions. In addition, depending on the current distribution in the main conductor section 165*a*, for example, at least one of the reinforcement conductor 853 and the reinforcement conductor 854 may not be provided.

Because the mesh conductor 852Ba of the main conductor section 165Ba can be formed in a shape in which currents flow more easily in the X direction, the layout can be created with repetitions of a minimum basic pattern, and accordingly the degree of freedom of designing of the wiring layouts increases. In addition, voltage drops can be ameliorated further, depending on the arrangement of active elements such as MOS transistors or diodes.

Then, because the reinforcement conductor 854 that reinforces the tendency of allowing currents to flow more easily in the Y direction is provided, the currents are more easily diffused in the second direction in the main conductor section 165Ba. Accordingly, the current concentration around the junction section between the main conductor section 165Ba and the lead conductor section 165Bb can be relaxed. In a case in which currents are concentrated locally, inductive noise worsens due to the concentrated portions, but because the current concentration can be relaxed, inductive noise can be ameliorated further.

Furthermore, the conductor layer B in the seventeenth configuration example depicted in FIG. 75B is different from the conductor layer B in the fourteenth configuration example in FIG. 65B in that relay conductors 855 are arranged in at least some gap regions of the mesh conductor 852Ba of the main conductor section 165Ba. The relay conductors 855 may or may not be arranged.

<First Modification Example of Seventeenth Configuration Example>

Figure 76A:
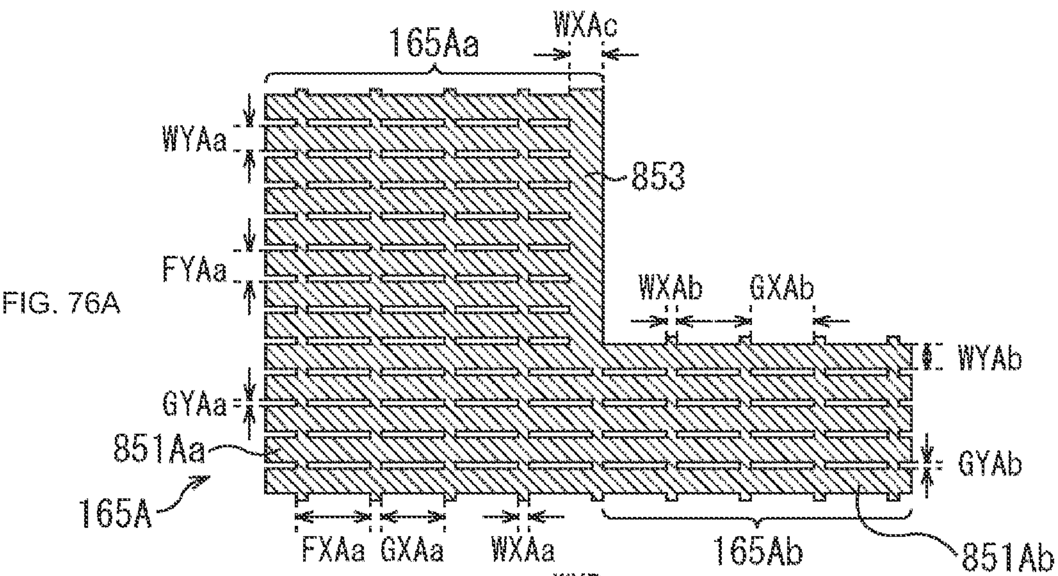
FIGS. 76A, 76B, and 76C are figures depicting a first modification example of the seventeenth configuration example of the conductor layers A and B.
Figure 76B:
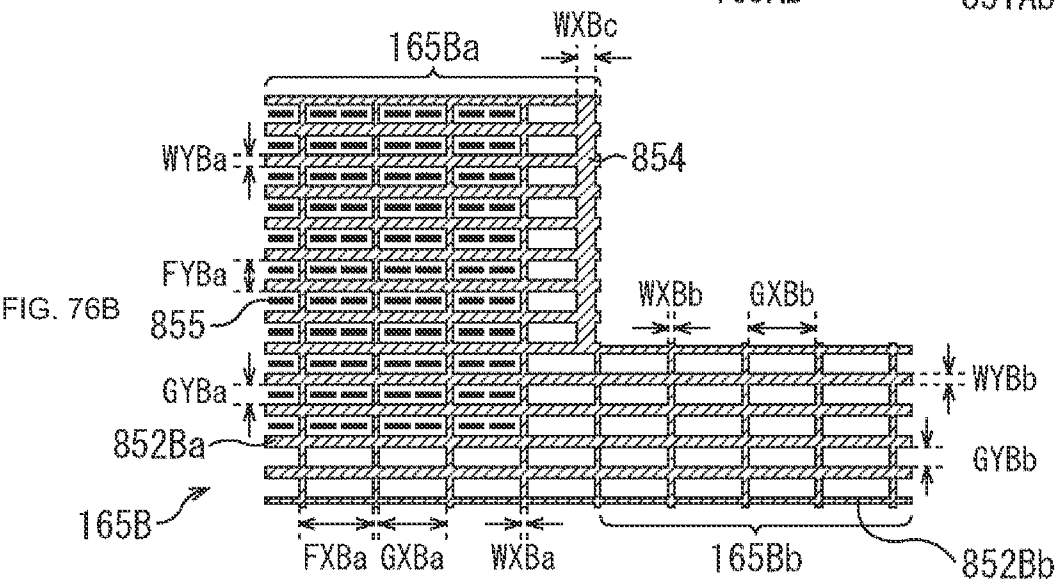
Figure 76C:
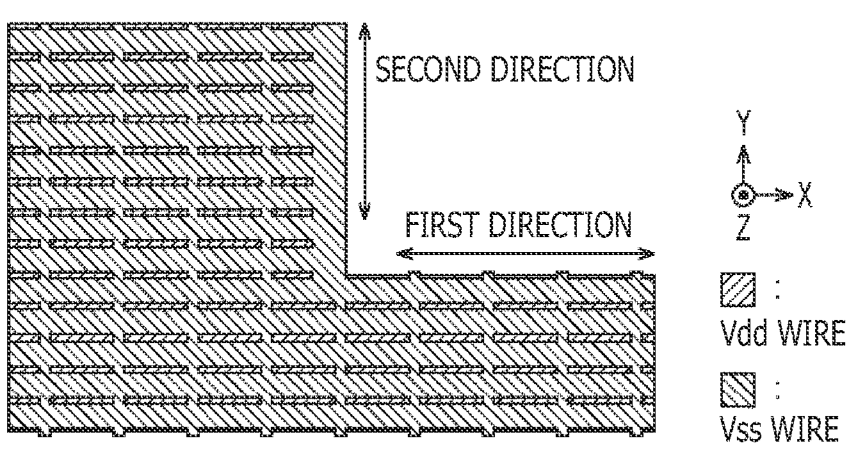

FIGS. 76A, 76B, and 76C depict a first modification example of the seventeenth configuration example.

The conductor layer A depicted in FIG. 76A in the first modification example of the seventeenth configuration example is different from the conductor layer A in the seventeenth configuration example depicted in FIG. 75A in that the reinforcement conductor 853 is formed not over the entire Y-direction length but a partial Y-direction region of the main conductor section 165Aa. More specifically, in the first modification example in FIGS. 76A, 76B, and 76C, the reinforcement conductor 853 in the conductor layer A is formed at Y-direction positions excluding the Y-direction position of the junction section. In other respects, the configuration of the conductor layer A in the first modification example is similar to that of the conductor layer A in the seventeenth configuration example depicted in FIG. 75A.

Regarding the conductor layer B, similarly, the conductor layer B depicted in FIG. 76B is different from the conductor layer B in the seventeenth configuration example depicted in FIG. 75B in that the reinforcement conductor 854 is formed not over the entire Y-direction length but a partial Y-direction region of the main conductor section 165Ba. More specifically, in the first modification example in FIGS. 76A, 76B, and 76C, the reinforcement conductor 854 in the conductor layer B is formed at Y-direction positions excluding the Y-direction position of the junction section. In other respects, the configuration of the conductor layer B in the first modification example is similar to that of the conductor layer B in the seventeenth configuration example depicted in FIG. 75A.

<Second Modification Example of Seventeenth Configuration

EXAMPLE

Figure 77A:
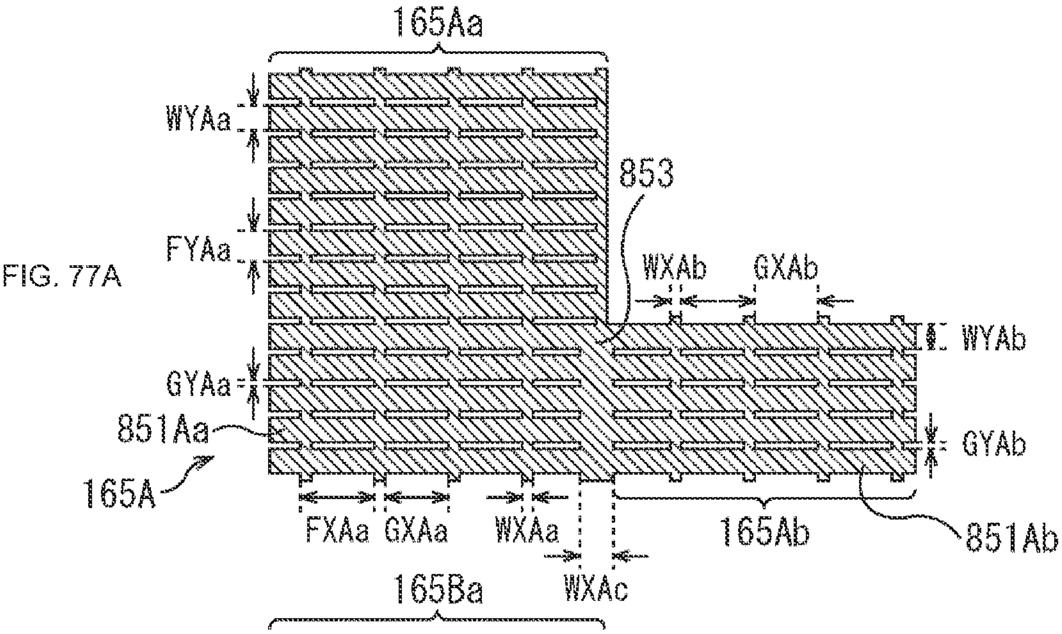
FIGS. 77A, 77B, and 77C are figures depicting a second modification example of the seventeenth configuration example of the conductor layers A and B.
Figure 77B:
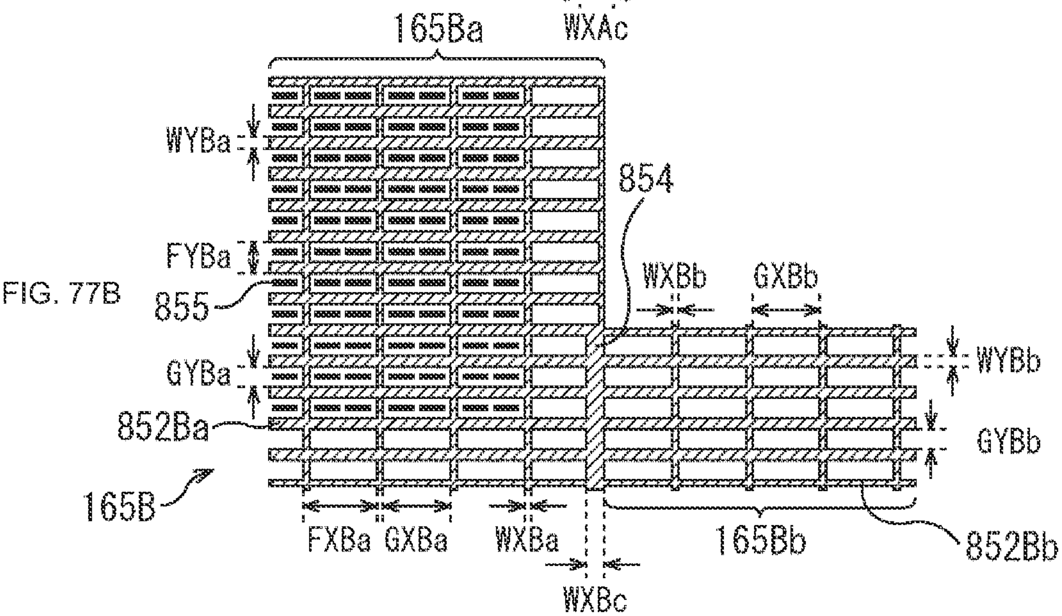
Figure 77C:
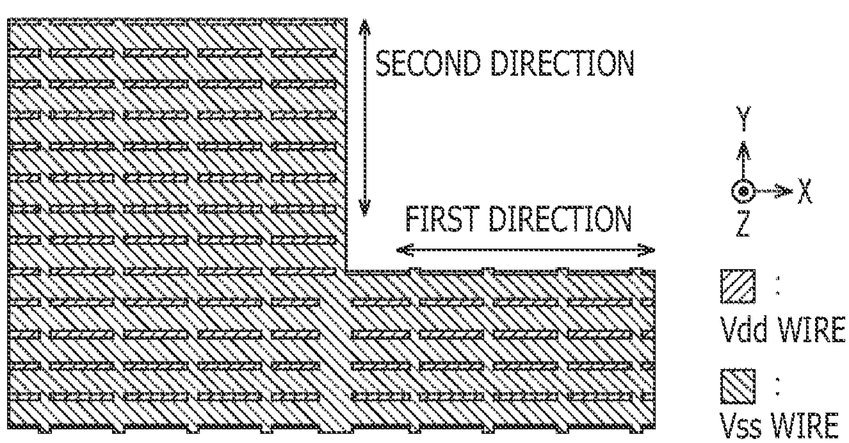

FIGS. 77A, 77B, and 77C depict a second modification example of the seventeenth configuration example.

The conductor layer A depicted in FIG. 77A in the second modification example of the seventeenth configuration example is different from the conductor layer A in the seventeenth configuration example depicted in FIG. 75A in that the reinforcement conductor 853 is formed not over the entire Y-direction length but a partial Y-direction region of the main conductor section 165Aa. More specifically, in the second modification example in FIGS. 77A, 77B, and 77C, the reinforcement conductor 853 in the conductor layer A is formed only at the Y-direction position of the junction section. In other respects, the configuration of the conductor layer A in the second modification example is similar to that of the conductor layer A in the seventeenth configuration example depicted in FIG. 75A.

Regarding the conductor layer B, similarly, the conductor layer B depicted in FIG. 77B is different from the conductor layer B in the seventeenth configuration example depicted in FIG. 75B in that the reinforcement conductor 854 is formed not over the entire Y-direction length but a partial Y-direction region of the main conductor section 165Ba. More specifically, in the second modification example in FIGS. 77A, 77B, and 77C, the reinforcement conductor 854 in the conductor layer B is formed only at the Y-direction position of the junction section. In other respects, the configuration of the conductor layer B in the second modification example is similar to that of the conductor layer B in the seventeenth configuration example depicted in FIG. 75A.

As in the first modification example and second modification example of the seventeenth configuration example, the reinforcement conductor 853 in the conductor layer A and the reinforcement conductor 854 in the conductor layer B need not be formed over the entire Y-direction length of the main conductor section 165Aa necessarily but may be formed in a predetermined partial Y-direction region.

Eighteenth Configuration Example

Figure 78A:
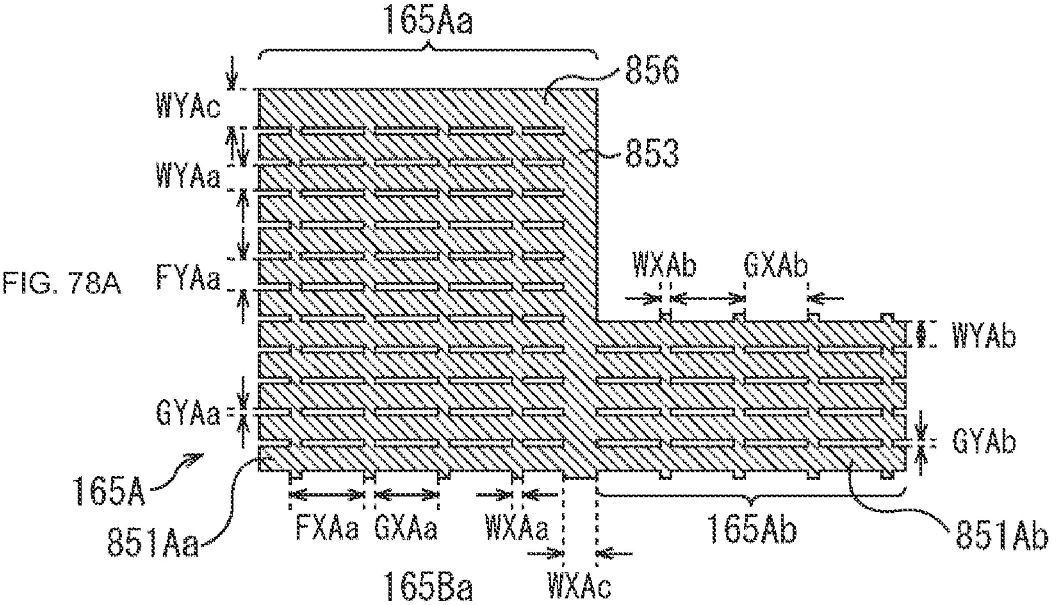
FIGS. 78A, 78B, and 78C are figures depicting an eighteenth configuration example of the conductor layers A and B.
Figure 78B:
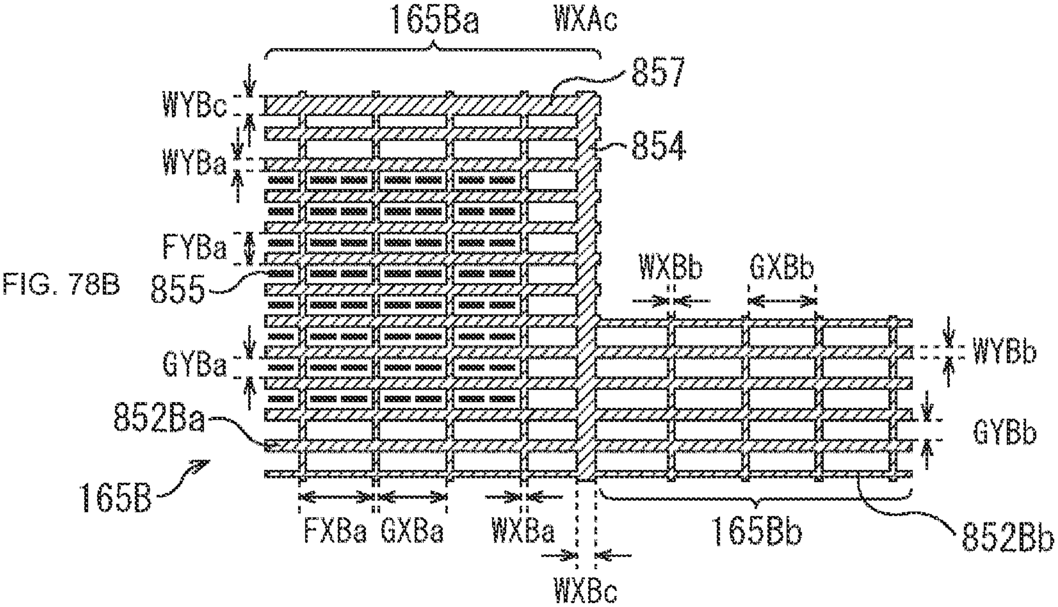
Figure 78C:
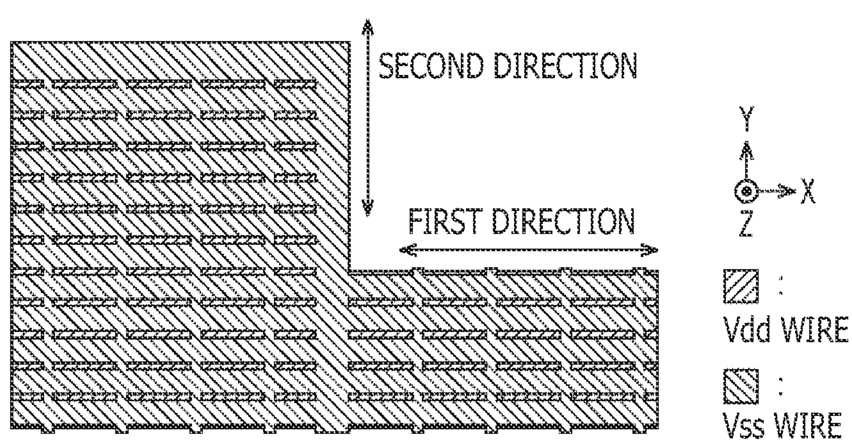

FIGS. 78A, 78B, and 78C depict an eighteenth configuration example of the conductor layers A and B. Note that FIG. 78A depicts the conductor layer A, and FIG. 78B depicts the conductor layer B. FIG. 78C depicts a state of the conductor layers A and B depicted in in FIGS. 78A and 78B, respectively, as seen from the side where the conductor layer A is located. In the coordinate system in FIGS. 78A, 78B, and 78C, the X axis lies in the lateral direction, the Y axis lies in the longitudinal direction, and the Z axis lies in a direction perpendicular to the XY plane.

The eighteenth configuration example depicted in FIGS. 78A, 78B, and 78C has a configuration in which part of the seventeenth configuration example depicted in FIGS. 75A, 75B, and 75C are modified. Sections in FIGS. 78A, 78B, and 78C that have counterparts in FIGS. 75A, 75B, and 75C are given the same reference signs, and explanations of those sections are omitted as appropriate.

The conductor layer A in the eighteenth configuration example depicted in FIG. 78A and the seventeenth configuration example depicted in FIGS. 75A, 75B, and 75C have a commonality in that the conductor layer A includes the mesh conductor 851Aa with a shape in which currents flow more easily in the X direction and the reinforcement conductor 853 that reinforces the tendency of allowing currents to flow more easily in the Y direction.

On the other hand, the eighteenth configuration example is different from the seventeenth configuration example depicted in FIGS. 75A, 75B, and 75C in that the conductor layer A in the eighteenth configuration example further includes a reinforcement conductor 856 that reinforces the tendency of allowing currents to flow more easily in the X direction than in the Y direction. A conductor width WYAc of the reinforcement conductor 856 is desirably formed larger than one of or both the X-direction conductor width WXAa and Y-direction conductor width WYAa of the mesh conductor 851Aa. The conductor width WYAc of the reinforcement conductor 856 is formed larger than the smaller one of the X-direction conductor width WXAa and Y-direction conductor width WYAa of the mesh conductor 851Aa. In the region of the main conductor section 165Aa, multiple reinforcement conductors 856 may be arranged at predetermined Y-direction intervals, or one reinforcement conductor 856 may be arranged at a predetermined Y-direction position.

Because the reinforcement conductor 856 that reinforces the tendency of allowing currents to flow more easily in the X direction is provided, it becomes possible not only to allow currents to flow more easily in the Y direction due to the reinforcement conductor 853, but also to allow currents to flow more easily in the X direction, and the current concentration around the junction section between the main conductor section 165Aa and the lead conductor section 165Ab can be relaxed. In a case in which currents are concentrated locally, inductive noise worsens due to the concentrated portions, but because the current concentration can be relaxed, inductive noise can be ameliorated further.

The conductor layer B in the eighteenth configuration example depicted in FIG. 78B and the seventeenth configuration example depicted in FIGS. 75A, 75B, and 75C have a commonality in that the conductor layer B includes the mesh conductor 852Ba with a shape in which currents flow more easily in the X direction and the reinforcement conductor 854 that reinforces the tendency of allowing currents to flow more easily in the Y direction.

On the other hand, the eighteenth configuration example is different from the seventeenth configuration example depicted in FIGS. 75A, 75B, and 75C in that the conductor layer B in the eighteenth configuration example further includes a reinforcement conductor 857 that reinforces the tendency of allowing currents to flow more easily in the X direction than in the Y direction. A conductor width WYBc of the reinforcement conductor 857 is desirably formed larger than one of or both the X-direction conductor width WXBa and Y-direction conductor width WYBa of the mesh conductor 852Ba. The conductor width WYBc of the reinforcement conductor 857 is formed larger than the smaller one of the X-direction conductor width WXBa and Y-direction conductor width WYBa of the mesh conductor 852Ba. In the region of the main conductor section 165Ba, multiple reinforcement conductors 857 may be arranged at predetermined Y-direction intervals, or one reinforcement conductor 857 may be arranged at a predetermined Y-direction position.

As depicted in FIG. 78C, the reinforcement conductor 856 in the conductor layer A and the reinforcement conductor 857 in the conductor layer B are formed at overlapping positions. Because an active element group 167 is covered with at least one of the conductor layer A and the conductor layer B in the overlapping state of the conductor layer A and the conductor layer B, hot carrier light emissions from the active element group 167 can be blocked in the eighteenth configuration example also. Note that in a case in which it is not necessary to block hot carrier light emissions near the reinforcement conductor 856 or the reinforcement conductor 857, for example, the reinforcement conductor 856 and the reinforcement conductor 857 do not have to be formed at overlapping positions. In addition, depending on the current distribution in the main conductor section 165*a*, for example, at least one of the reinforcement conductor 856 and the reinforcement conductor 857 may not be provided.

Because the reinforcement conductor 857 that reinforces the tendency of allowing currents to flow more easily in the X direction is provided, it becomes possible not only to allow currents to flow more easily in the Y direction due to the reinforcement conductor 854, but also to allow currents to flow more easily in the X direction, and the current concentration around the junction section between the main conductor section 165Ba and the lead conductor section 165Bb can be relaxed. In a case in which currents are concentrated locally, inductive noise worsens due to the concentrated portions, but because the current concentration can be relaxed, inductive noise can be ameliorated further.

The configuration depicted in the seventeenth configuration example in FIGS. 75A, 75B, and 75C include the reinforcement conductors 853 and 854 that reinforce the tendency of allowing currents to flow more easily in the Y direction, and the configuration depicted in the eighteenth configuration example in FIGS. 78A, 78B, and 78C include the reinforcement conductors 856 and 857 that reinforce the tendency of allowing currents to flow more easily in the X direction, in addition to the reinforcement conductors 853 and 854.

Although an illustration is omitted, in one possible configuration of a modification example of the seventeenth configuration example or eighteenth configuration example, the conductor layer A may not include the reinforcement conductor 853 but include the reinforcement conductor 856, and the conductor layer B may not include the reinforcement conductor 854 but include the reinforcement conductor 857. In other words, in one possible configuration, only the reinforcement conductors 856 and 857 may be included as reinforcement conductors.

Because the reinforcement conductor 856 that reinforces the tendency of allowing currents to flow more easily in the X direction is provided, even in a case in which the reinforcement conductor 853 is not included, it becomes possible to allow currents to diffuse more easily in the Y direction depending on the relation in terms of wire resistance, and the current concentration around the junction section between the main conductor section 165Aa and the lead conductor section 165Ab can be relaxed. In a case in which currents are concentrated locally, inductive noise worsens due to the concentrated portions, but because the current concentration can be relaxed, inductive noise can be ameliorated further.

Because the reinforcement conductor 857 that reinforces the tendency of allowing currents to flow more easily in the X direction is provided, even in a case in which the reinforcement conductor 854 is not included, it becomes possible to allow currents to diffuse more easily in the Y direction depending on the relation in terms of wire resistance, and the current concentration around the junction section between the main conductor section 165Ba and the lead conductor section 165Bb can be relaxed. In a case in which currents are concentrated locally, inductive noise worsens due to the concentrated portions, but because the current concentration can be relaxed, inductive noise can be ameliorated further.

Nineteenth Configuration Example

Figure 79A:
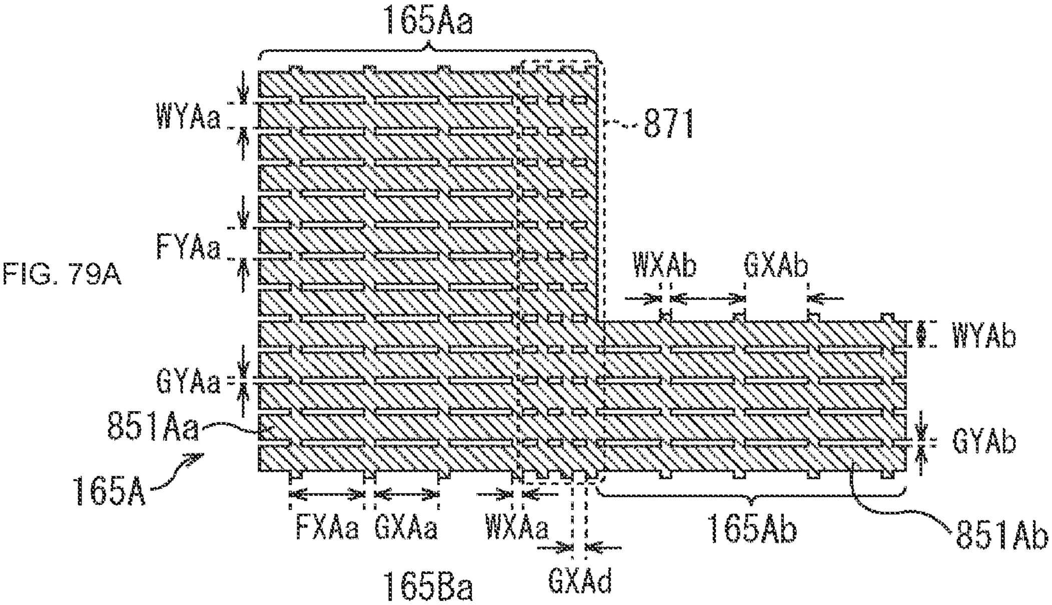
FIGS. 79A, 79B, and 79C are figures depicting a nineteenth configuration example of the conductor layers A and B.
Figure 79B:
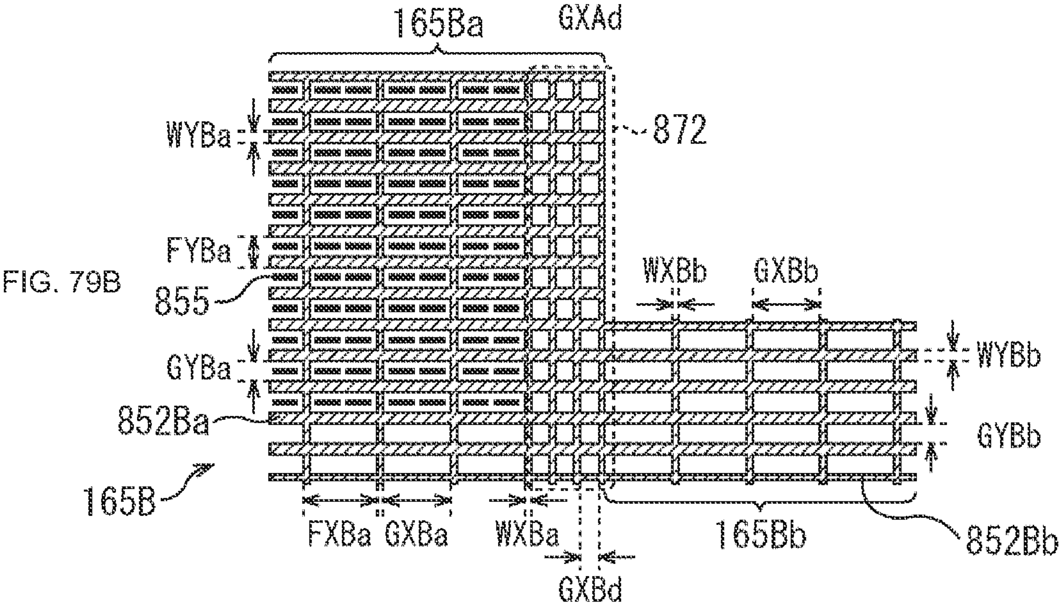
Figure 79C:
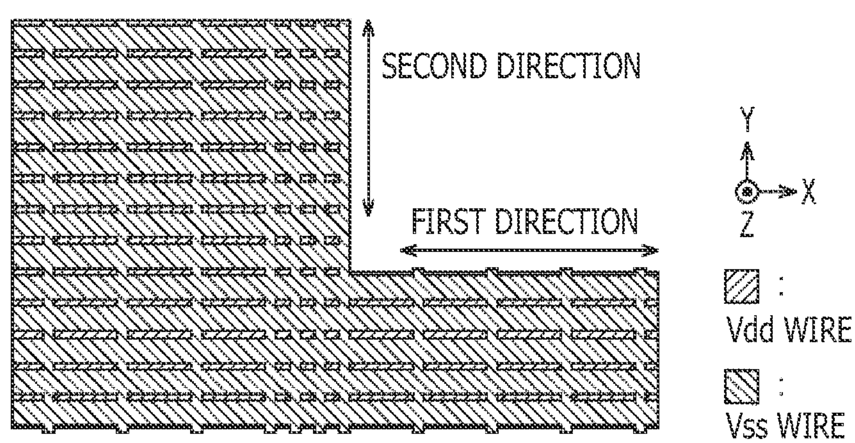

FIGS. 79A, 79B, and 79C depict a nineteenth configuration example of the conductor layers A and B. Note that FIG. 79A depicts the conductor layer A, and FIG. 79B depicts the conductor layer B. FIG. 79C depicts a state of the conductor layers A and B depicted in in FIGS. 79A and 79B, respectively, as seen from the side where the conductor layer A is located. In the coordinate system in FIGS. 79A, 79B, and 79C, the X axis lies in the lateral direction, the Y axis lies in the longitudinal direction, and the Z axis lies in a direction perpendicular to the XY plane.

The nineteenth configuration example depicted in FIGS. 79A, 79B, and 79C has a configuration in which part of the seventeenth configuration example depicted in FIGS. 75A, 75B, and 75C are modified. Sections in FIGS. 79A, 79B, and 79C that have counterparts in FIGS. 75A, 75B, and 75C are given the same reference signs, and explanations of those sections are omitted as appropriate.

The conductor layer A in the nineteenth configuration example depicted in FIG. 79A is different in that the reinforcement conductor 853 in the seventeenth configuration example depicted in FIGS. 75A, 75B, and 75C are replaced with a reinforcement conductor 871, but has commonalities in other respects. The reinforcement conductor 871 includes multiple wires extending in the Y direction. The wires included in the reinforcement conductor 871 are arranged being separated from each other evenly by an X-direction gap width GXAd. The gap width GXAd is made smaller than the gap width GXAa of the mesh conductor 851Aa of the main conductor section 165Aa.

The conductor layer B in the nineteenth configuration example depicted in FIG. 79B is different in that the reinforcement conductor 854 in the seventeenth configuration example depicted in FIGS. 75A, 75B, and 75C are replaced with a reinforcement conductor 872, but has commonalities in other respects. The reinforcement conductor 872 includes multiple wires extending in the Y direction. The wires included in the reinforcement conductor 872 are arranged being separated from each other evenly by an X-direction gap width GXBd. The gap width GXBd is made smaller than the gap width GXBa of the mesh conductor 852Ba of the main conductor section 165Ba.

As depicted in FIG. 79C, the reinforcement conductor 871 in the conductor layer A and the reinforcement conductor 872 in the conductor layer B are formed at overlapping positions. Because an active element group 167 is covered with at least one of the conductor layer A and the conductor layer B in the overlapping state of the conductor layer A and the conductor layer B, hot carrier light emissions from the active element group 167 can be blocked in the nineteenth configuration example also. Note that in a case in which it is not necessary to block hot carrier light emissions near the reinforcement conductor 871 or the reinforcement conductor 872, for example, the reinforcement conductor 871 and the reinforcement conductor 872 do not have to be formed at overlapping positions. In addition, depending on the current distribution in the main conductor section 165*a*, for example, at least one of the reinforcement conductor 871 and the reinforcement conductor 872 may not be provided.

<Modification Example of Nineteenth Configuration Example>

Figure 80A:
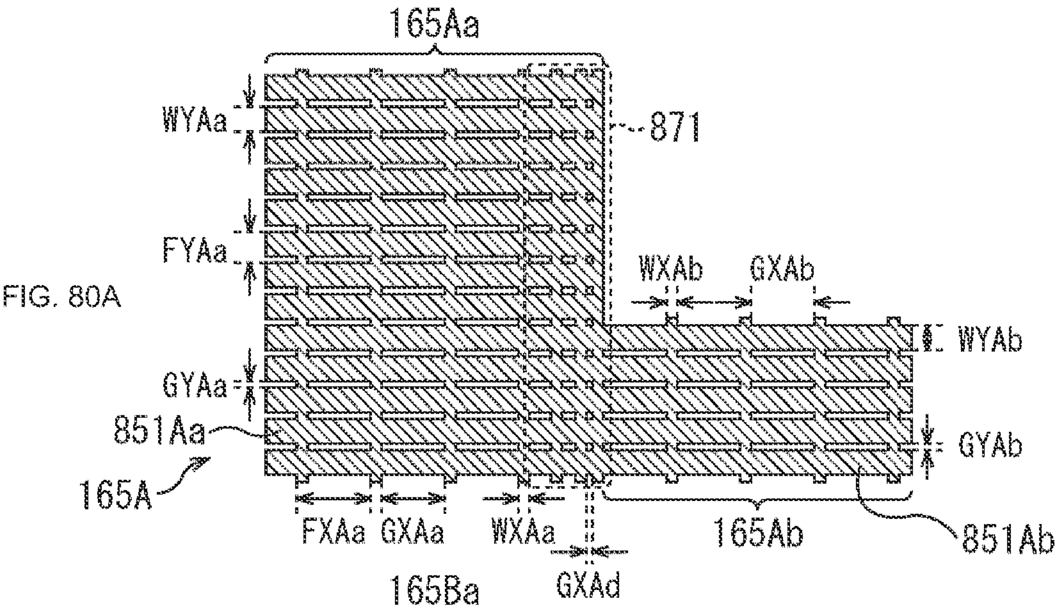
FIGS. 80A, 80B, and 80C are figures depicting a modification example of the nineteenth configuration example of the conductor layers A and B.
Figure 80B:
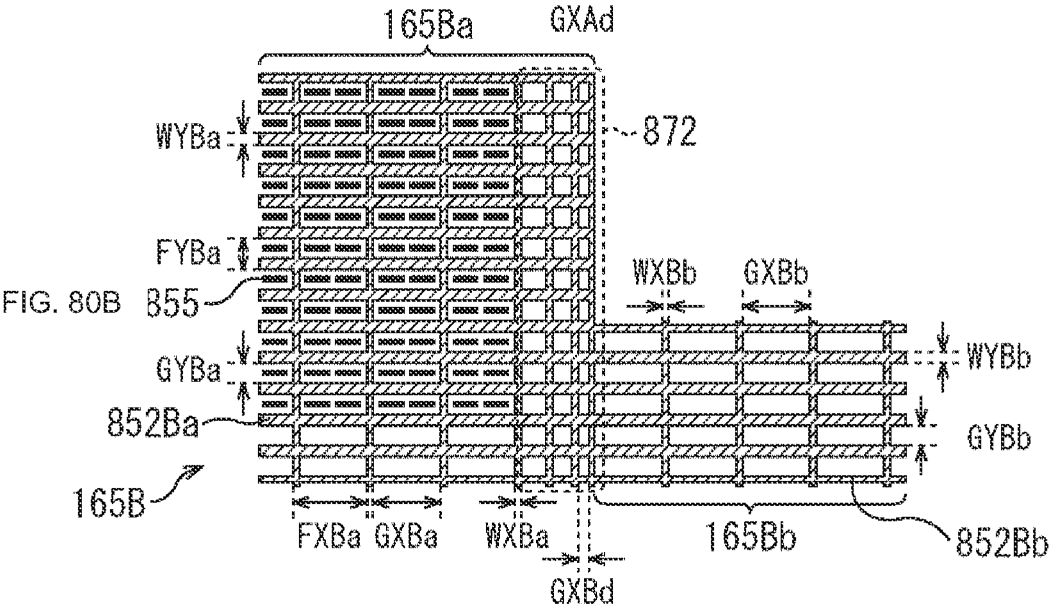
Figure 80C:
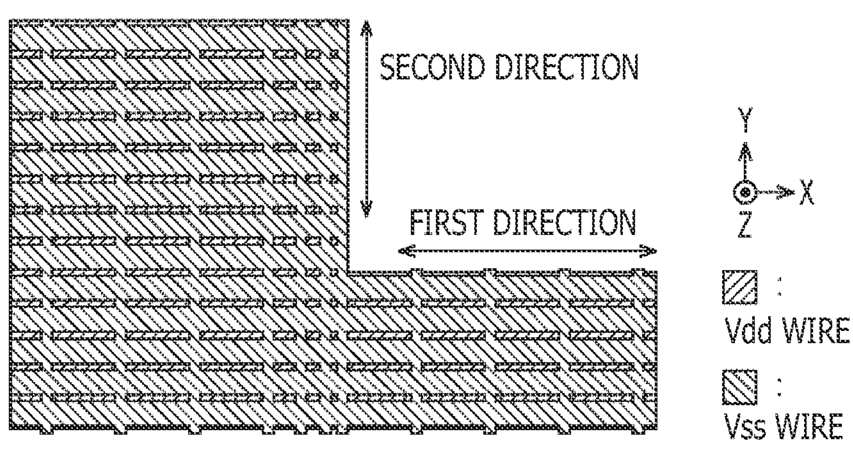

FIGS. 80A, 80B, and 80C depict a modification example of the nineteenth configuration example.

In the nineteenth configuration example depicted in FIGS. 79A, 79B, and 79C, the multiple wires included in the reinforcement conductor 871 in the conductor layer A are arranged being separated from each other evenly by the X-direction gap width GXAd. The multiple wires included in the reinforcement conductor 872 in the conductor layer B also are arranged being separated from each other evenly by the X-direction gap width GXAd.

In contrast, in FIGS. 80A, 80B, and 80C depicting the modification example of the nineteenth configuration example, each pair of adjacent wires in the multiple wires included in the reinforcement conductor 871 in the conductor layer A are arranged being separated from each other by a different gap width GXAd. At least one of the gap widths GXAd is made smaller than the gap width GXAa of the mesh conductor 851Aa of the main conductor section 165Aa. Each pair of adjacent wires in the multiple wires included in the reinforcement conductor 872 in the conductor layer B are arranged being separated from each other by a different gap width GXBd. At least one of the gap widths GXBd is made smaller than the gap width GXBa of the mesh conductor 852Ba of the main conductor section 165Ba.

Note that while the multiple gap widths GXAd and gap widths GXBd are formed to become gradually shorter from the left side in the example in FIGS. 80A, 80B, and 80C, this is not essential. The multiple gap widths GXAd and gap widths GXBd may be formed to become gradually shorter from the right side or may be random widths.

Except for that the gap widths GXAd and GXBd are not even widths but are modulated as mentioned above, the modification example of the nineteenth configuration example in FIGS. 80A, 80B, and 80C are similar to the nineteenth configuration example depicted in FIGS. 79A, 79B, and 79C.

As in the nineteenth configuration example and the modification example thereof depicted in FIGS. 79A, 79B, 79C, 80A, 80B, and 80C, the reinforcement conductor 871 in the conductor layer A and the reinforcement conductor 872 in the conductor layer B can include multiple wires that are arranged with the predetermined gap width GXAd or GXBd.

Because the reinforcement conductors 871 and 872 that reinforce the tendency of allowing currents to flow more easily in the Y direction are provided, currents are diffused more easily in the Y direction, and so the current concentration around the junction section can be relaxed. In a case in which currents are concentrated locally, inductive noise worsens due to the concentrated portions, but because the current concentration can be relaxed, inductive noise can be ameliorated further. While the configurations depicted in the nineteenth configuration example and the modification example thereof depicted in FIGS. 79A, 79B, 79C, 80A, 80B, and FIG. 80C include the reinforcement conductors 871 and 872 that at least include gap widths smaller than the X-direction gap width GXAa or gap width GXBa and reinforce the tendency of allowing currents to flow more easily in the Y direction, these are not essential. For example, although an illustration is omitted, a reinforcement conductor that at least includes a gap width smaller than the Y-direction gap width GYAa or gap width GYBa and reinforces the tendency of allowing currents to flow more easily in the X direction similarly to the eighteenth configuration example in FIGS. 78A, 78B, and 78C may be included in one possible configuration. In addition, in one possible configuration, a reinforcement conductor that reinforces the tendency of allowing currents to flow more easily in the X direction may be included, a reinforcement conductor that reinforces the tendency of allowing currents to flow more easily in the Y direction may be included, or both a reinforcement conductor that reinforces the tendency of allowing currents to flow more easily in the X direction and a reinforcement conductor that reinforces the tendency of allowing currents to flow more easily in the Y direction may be included. In these cases also, the current concentration can be relaxed depending on the relation in terms of wire resistance, and so inductive noise can be ameliorated further.

Twentieth Configuration Example

Figure 81A:
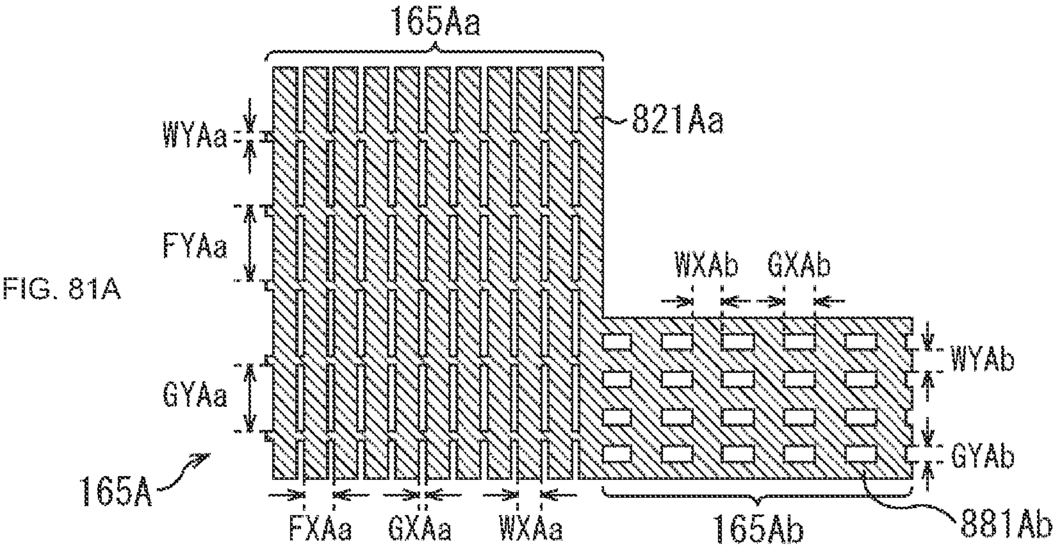
FIGS. 81A, 81B, and 81C are figures depicting a twentieth configuration example of the conductor layers A and B.
Figure 81B:
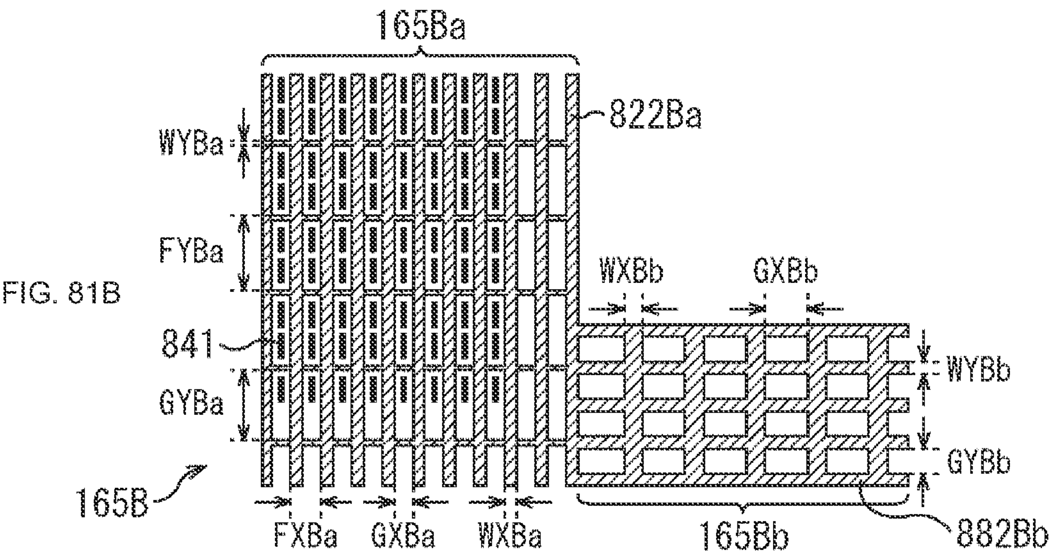
Figure 81C:
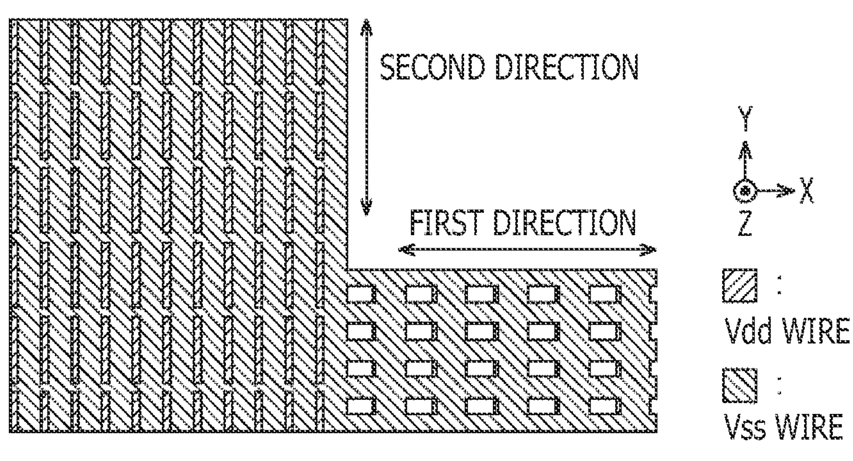

FIGS. 81A, 81B, and 81C depict a twentieth configuration example of the conductor layers A and B. Note that FIG. 81A depicts the conductor layer A, and FIG. 81B depicts the conductor layer B. FIG. 81C depicts a state of the conductor layers A and B depicted in FIGS. 81A and 81B, respectively, as seen from the side where the conductor layer A is located. In the coordinate system in FIGS. 81A, 81B, and 81C, the X axis lies in the lateral direction, the Y axis lies in the longitudinal direction, and the Z axis lies in a direction perpendicular to the XY plane.

The twentieth configuration example depicted in FIGS. 81A, 81B, and 81C has a configuration in which part of the sixteenth configuration example depicted in FIGS. 72A, 72B, and 72C are modified. Sections in FIGS. 81A, 81B, and 81C that have counterparts in FIGS. 72A, 72B, and 72C are given the same reference signs, and explanations of those sections are omitted as appropriate.

The conductor layer A in the twentieth configuration example depicted in FIG. 81A and the conductor layer A in the sixteenth configuration example depicted in FIGS. 72A, 72B, and 72C have a commonality in that the main conductor section 165Aa includes the mesh conductor 821Aa. On the other hand, the conductor layer A in the twentieth configuration example is different from the conductor layer A in the sixteenth configuration example depicted in FIGS. 72A, 72B, and 72C in that the lead conductor section 165Ab includes a mesh conductor 881Ab different from the mesh conductor 821Ab.

The conductor layer B in the twentieth configuration example depicted in FIG. 81B and the conductor layer B in the sixteenth configuration example depicted in FIGS. 72A, 72B, and 72C have a commonality in that the main conductor section 165Ba has the mesh conductor 822Ba, and the relay conductors 841 arranged in gap regions. The conductor layer B in the twentieth configuration example is different from the conductor layer B in the sixteenth configuration example depicted in FIGS. 72A, 72B, and 72C in that the lead conductor section 165Bb includes a mesh conductor 882Bb different from the mesh conductor 822Bb.

That is, the twentieth configuration example is different from the sixteenth configuration example depicted in FIGS. 72A, 72B, and 72C in terms of the shape of the repetition pattern of the lead conductor section 165*b*.

As depicted in FIG. 81C, partial regions of the lead conductor section 165*b* are open regions in the overlapping state of the conductor layer A and the conductor layer B.

In this manner, it is not necessary to adopt a light-blocking structure in the entire regions of the conductor layer A and the conductor layer B, and light does not have to be blocked in regions where active elements such as MOS transistors or diodes are not arranged, for example.

While, in the configuration of the twentieth configuration example in FIGS. 81A, 81B, and 81C, partial regions of the lead conductor section 165*b* in the conductor layer A and the conductor layer B are regions that do not block light, partial regions of the main conductor section 165*a* in the conductor layer A and the conductor layer B may be regions that do not block light, in one possible configuration. By not adopting a light-blocking structure for regions where it is not necessary to block light, the degree of freedom of designing of the wiring layouts increases further. Accordingly, wiring patterns that ameliorate inductive noise further and also ameliorate voltage drops further can be adopted.

Twenty-First Configuration Example

In the examples in the fourteenth to twentieth configuration examples mentioned above, both of the conductor layers of the main conductor section 165*a* and the lead conductor section 165*b* connected therewith include mesh conductors.

However, the conductor layers of the lead conductor section 165*b* are not limited to mesh conductor, but may include planar conductors or linear conductors similarly to the main conductor section 165*a*.

In the following twenty-first to twenty-fourth configuration examples to be explained, the conductor layer of the lead conductor section 165*b* is formed with a planar conductor or linear conductors.

Figure 82A:
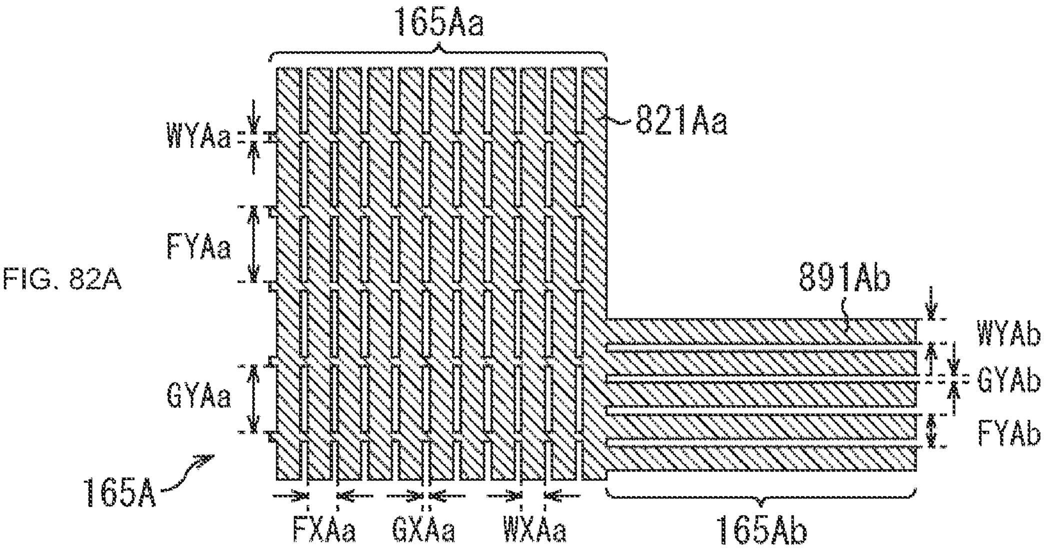
FIGS. 82A, 82B, and 82C are figures depicting a twenty-first configuration example of the conductor layers A and B.
Figure 82B:
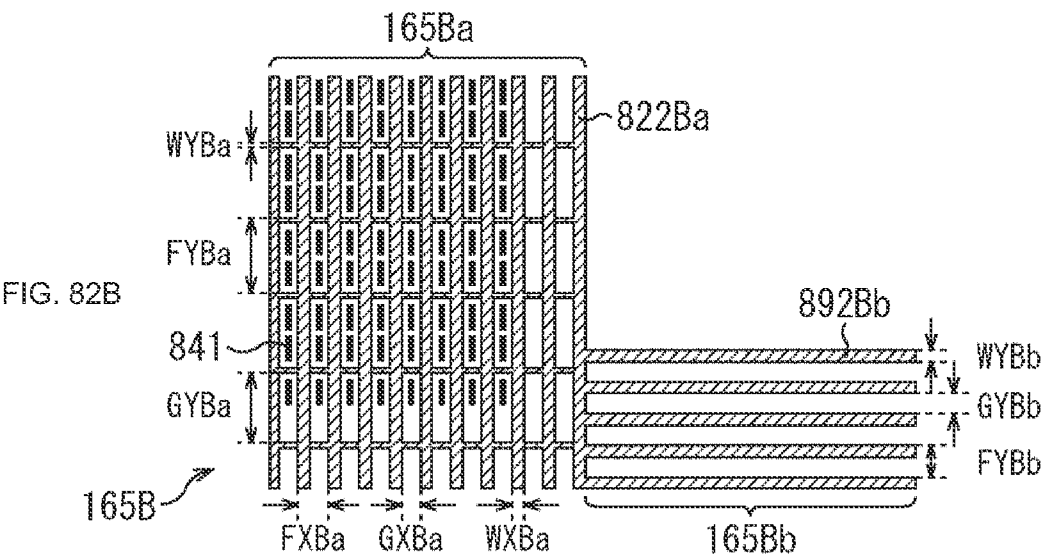
Figure 82C:
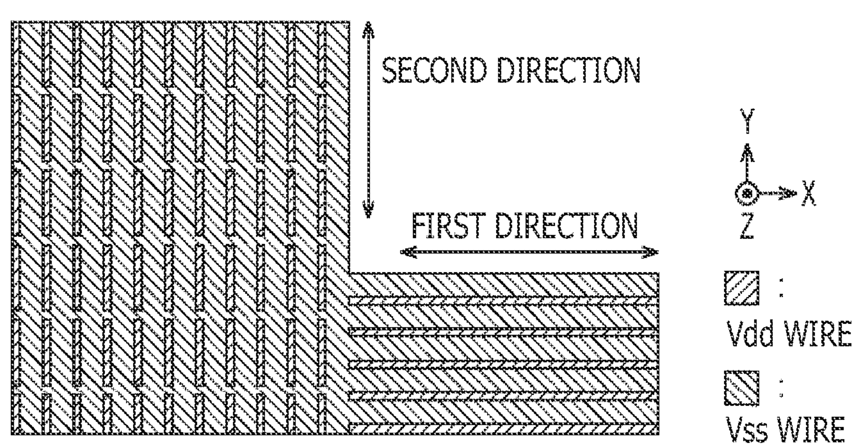

FIGS. 82A, 82B, and 82C depict a twenty-first configuration example of the conductor layers A and B. Note that FIG. 82A depicts the conductor layer A, and 81B depicts the conductor layer B. FIG. 82C depicts a state of the conductor layers A and B depicted in in FIGS. 82A and 82B, respectively, as seen from the side where the conductor layer A is located. In the coordinate system in FIGS. 82A, 82B, and 82C, the X axis lies in the lateral direction, the Y axis lies in the longitudinal direction, and the Z axis lies in a direction perpendicular to the XY plane.

The twenty-first configuration example depicted in FIGS. 82A, 82B, and 82C has a configuration in which the conductor layer of the lead conductor section 165*b* in the sixteenth configuration example depicted in FIGS. 72A, 72B, and 72C are modified. Sections in FIGS. 82A, 82B, and 82C that have counterparts in FIGS. 72A, 72B, and 72C are given the same reference signs, and explanations of those sections are omitted as appropriate.

In the lead conductor section 165Ab in the conductor layer A in the twenty-first configuration example depicted in FIG. 82A, instead of the mesh conductor 821Ab in the sixteenth configuration example, linear conductors 891Ab that are long in the X direction are arranged regularly at a Y-direction conductor pitch FYAb. The conductor pitch FYAb is equal to the sum of the Y-direction conductor width WYAb and the Y-direction gap width GYAb ((conductor pitch FYAb)=(Y-direction conductor width WYAb)+(Y-direction gap width GYAb)).

In the lead conductor section 165Bb in the conductor layer B in the twenty-first configuration example depicted in FIG. 82B, instead of the mesh conductor 822Bb in the sixteenth configuration example, linear conductors 892Bb that are long in the X direction are arranged regularly at a Y-direction conductor pitch FYBb. The conductor pitch FYBb is equal to the sum of the Y-direction conductor width WYBb and the Y-direction gap width GYBb ((conductor pitch FYBb)=(Y-direction conductor width WYBb)+(Y-direction gap width GYBb)).

As depicted in FIG. 82C, because an active element group 167 is covered with at least one of the conductor layer A and the conductor layer B in the overlapping state of the conductor layer A and the conductor layer B, hot carrier light emissions from the active element group 167 can be blocked in the twenty-first configuration example also.

Twenty-Second Configuration Example

Figure 83A:
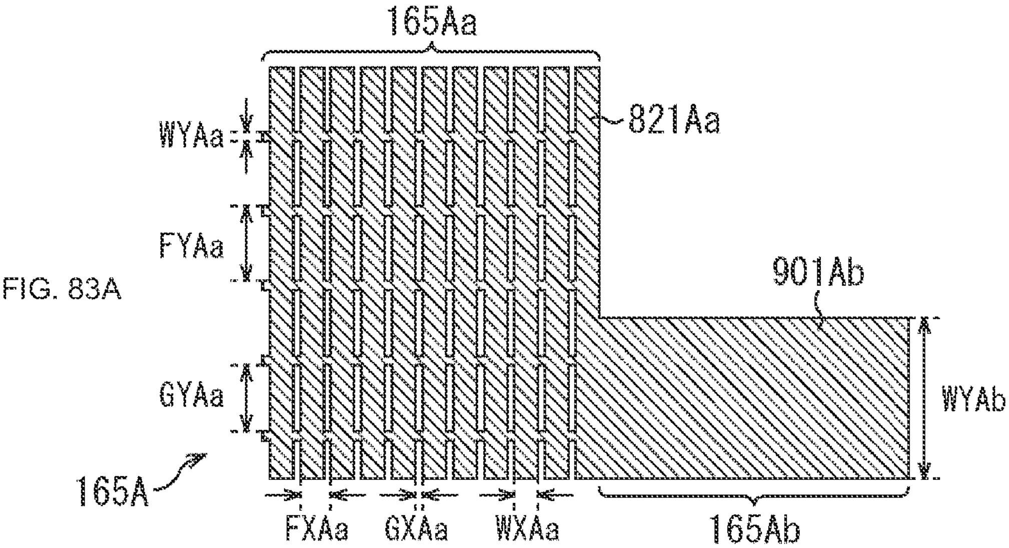
FIGS. 83A, 83B, and 83C are figures depicting a twenty-second configuration example of the conductor layers A and B.
Figure 83B:
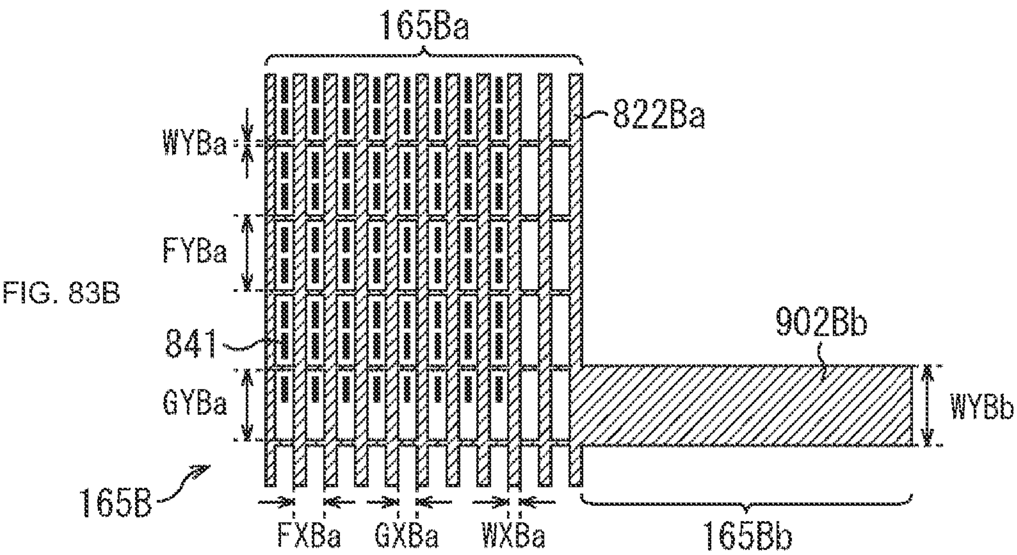
Figure 83C:
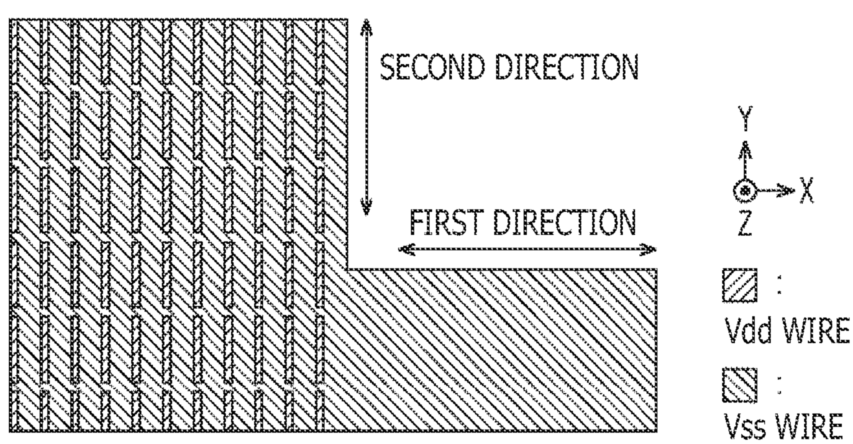

FIGS. 83A, 83B, and 83C depict a twenty-second configuration example of the conductor layers A and B. Note that FIG. 83A depicts the conductor layer A, and FIG. 83B depicts the conductor layer B. G in FIG. 83C depicts a state of the conductor layers A and B depicted in in FIGS. 83A and 83B, respectively, as seen from the side where the conductor layer A is located. In the coordinate system in FIGS. 83A, 83B, and 83C, the X axis lies in the lateral direction, the Y axis lies in the longitudinal direction, and the Z axis lies in a direction perpendicular to the XY plane.

The twenty-second configuration example depicted in FIGS. 83A, 83B, and 83C has a configuration in which the conductor layer of the lead conductor section 165*b* in the sixteenth configuration example depicted in FIGS. 72A, 72B, and 72C are modified. Sections in FIGS. 83A, 83B, and 83C that have counterparts in FIGS. 72A, 72B, and 72C are given the same reference signs, and explanations of those sections are omitted as appropriate.

In the lead conductor section 165Ab in the conductor layer A in the twenty-second configuration example depicted in FIG. 83A, a planar conductor 901Ab is arranged instead of the mesh conductor 821Ab in the sixteenth configuration example. The planar conductor 901Ab has the Y-direction conductor width WYAb.

In the lead conductor section 165Bb in the conductor layer B in the twenty-second configuration example depicted in FIG. 83B, a planar conductor 902Bb is arranged instead of the mesh conductor 822Bb in the sixteenth configuration example. The planar conductor 902Bb has the Y-direction conductor width WYBb.

As depicted in FIG. 83C, because an active element group 167 is covered with at least one of the conductor layer A and the conductor layer B in the overlapping state of the conductor layer A and the conductor layer B, hot carrier light emissions from the active element group 167 can be blocked in the twenty-second configuration example also.

Figure 84A:
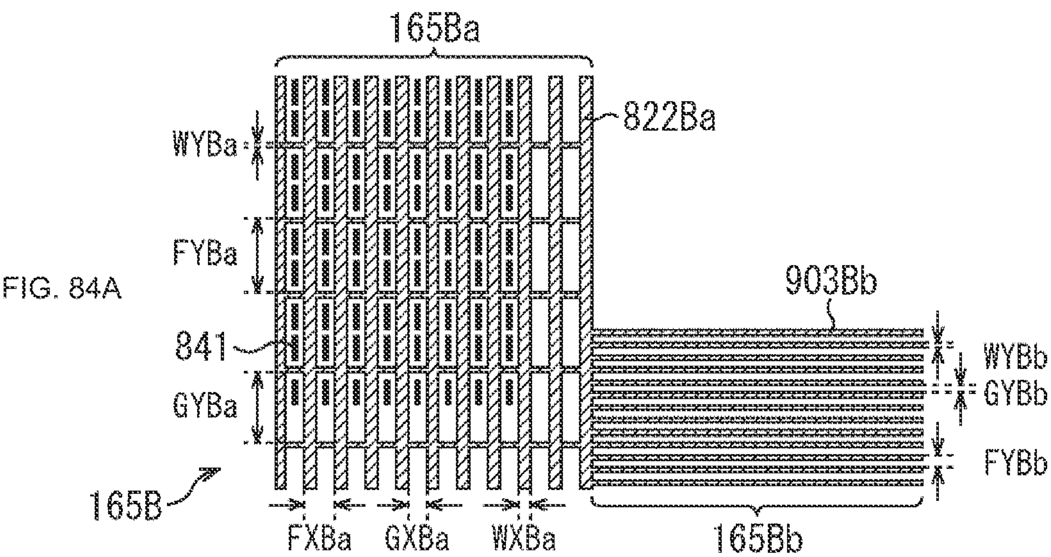
FIGS. 84A and 84B are figures depicting another configuration example of the conductor layer B in the twenty-second configuration example.
Figure 84B:
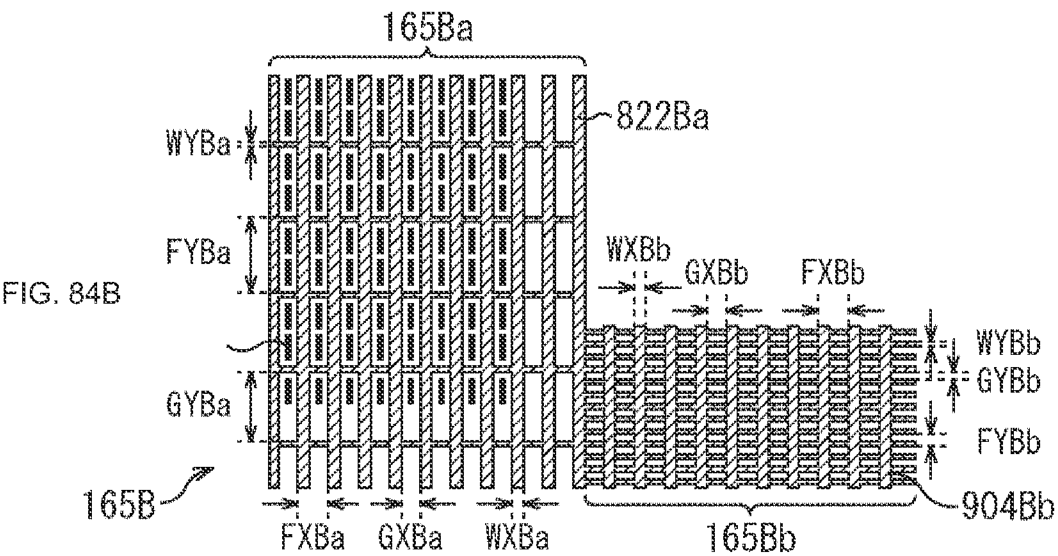
Figure 84B:
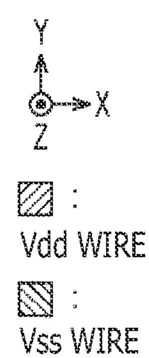

Note that, in the twenty-second configuration example, the conductor layer B in FIG. 84A or 84B may be adopted instead of the conductor layer B depicted in FIG. 83B.

The conductor layer B depicted in in FIGS. 84A and 84B are different from the conductor layer B depicted in FIG. 83B only in terms of the lead conductor section 165*b*.

In the lead conductor section 165Bb in the conductor layer B in FIG. 84A, instead of the planar conductor 901Ab depicted in FIG. 83B, linear conductors 903Bb that are long in the X direction are arranged regularly at the Y-direction conductor pitch FYBb. Note that (conductor pitch FYBb)=(Y-direction conductor width WYBb)+(Y-direction gap width GYBb) is satisfied.

In the lead conductor section 165Bb in the conductor layer B in FIG. 84B, a mesh conductor 904Bb is provided instead of the planar conductor 901Ab depicted in B in FIGS. 83A, 83B, and 83C. Regarding the X direction, the mesh conductor 904Bb has the conductor width WXBb and the gap width GXBb and includes the same pattern regularly arranged at the conductor pitch FXBb. Regarding the Y direction, the mesh conductor 904Bb has the conductor width WYBb and the gap width GYBb and includes the same pattern regularly arranged at the conductor pitch FYBb. Accordingly, the mesh conductor 904Bb has a shape including a repetition pattern in which a predetermined basic pattern is arrayed repetitively at a conductor pitch in at least one of the X direction or the Y direction.

The plan view of the conductor layer B in-A or B in FIG. 84A or 84B and the conductor layer A depicted in FIG. 83A in the overlapping state becomes similar to FIG. 83C.

Twenty-Third Configuration Example

Figure 85A:
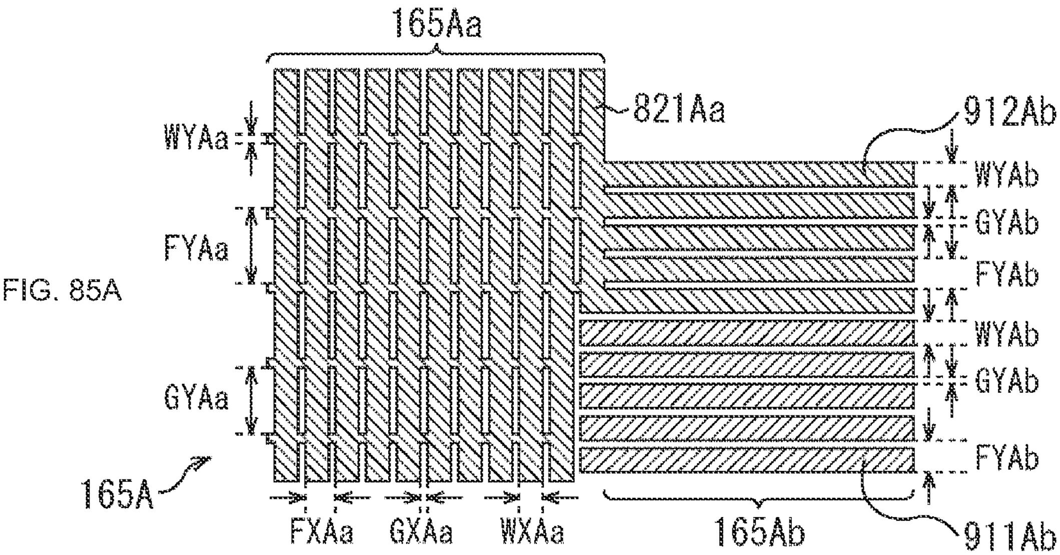
FIGS. 85A, 85B, and 85C are figures depicting a twenty-third configuration example of the conductor layers A and B.
Figure 85B:
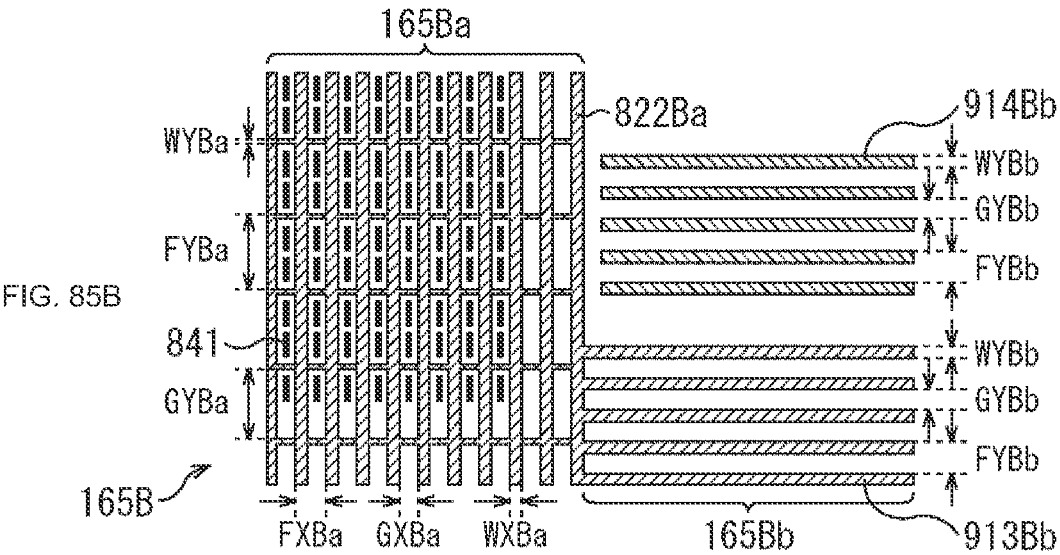
Figure 85C:
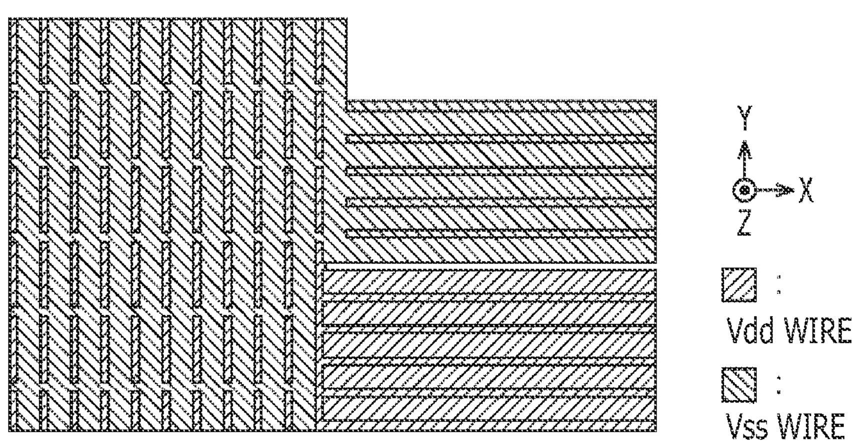

FIGS. 85A, 85B, and 85C depict a twenty-third configuration example of the conductor layers A and B. Note that FIG. 85A depicts the conductor layer A, and FIG. 85B depicts the conductor layer B. FIG. 85C depicts a state of the conductor layers A and B depicted in in FIGS. 85A and 85B, respectively, as seen from the side where the conductor layer A is located. In the coordinate system in FIGS. 85A, 85B, and 85C, the X axis lies in the lateral direction, the Y axis lies in the longitudinal direction, and the Z axis lies in a direction perpendicular to the XY plane.

The twenty-third configuration example depicted in FIGS. 85A, 85B, and 85C has a configuration in which the conductor layer of the lead conductor section 165*b* in the sixteenth configuration example depicted in FIGS. 72A, 72B, and 72C are modified. Sections in FIGS. 85A, 85B, and 85C that have counterparts in FIGS. 72A, 72B, and 72C are given the same reference signs, and explanations of those sections are omitted as appropriate.

In the lead conductor section 165Ab in the conductor layer A in the twenty-third configuration example depicted in FIG. 85A, instead of the mesh conductor 821Ab in the sixteenth configuration example, linear conductors 911Ab that are long in the X direction are arranged regularly at the Y-direction conductor pitch FYAb, and linear conductors 912Ab that are long in the X direction are arranged regularly at the Y-direction conductor pitch FYAb. The linear conductors 911Ab are wires (Vdd wires) connected to a positive power supply, for example. The linear conductors 912Ab are wires (Vss wires) connected to GND or a negative power supply, for example. The conductor pitch FYAb is equal to the sum of the Y-direction conductor width WYAb and the Y-direction gap width GYAb ((conductor pitch FYAb)=(conductor width WYAb)+(gap width GYAb)).

In the lead conductor section 165Bb in the conductor layer B in the twenty-third configuration example depicted in FIG. 85B, instead of the mesh conductor 822Bb in the sixteenth configuration example, linear conductors 913Bb that are long in the X direction are arranged regularly at the Y-direction conductor pitch FYBb, and linear conductors 914Bb that are long in the X direction are arranged regularly at the Y-direction conductor pitch FYBb. The linear conductors 913Bb are wires (Vdd wires) connected to a positive power supply, for example. The linear conductors 914Bb are wires (Vss wires) connected to GND or a negative power supply, for example. The conductor pitch FYBb is equal to the sum of the Y-direction conductor width WYBb and the Y-direction gap width GYBb ((conductor pitch FYBb)=(conductor width WYBb)+(gap width GYBb)).

The linear conductors 912Ab of the lead conductor section 165Ab in the conductor layer A are electrically connected with the mesh conductor 821Aa of the main conductor section 165Aa and are electrically connected with the linear conductors 914Bb of the lead conductor section 165Bb in the conductor layer B via conductor vias extending in the Z direction, or the like, for example.

The linear conductors 913Bb of the lead conductor section 165Bb in the conductor layer B are electrically connected with the mesh conductor 822Ba of the main conductor section 165Ba and are electrically connected with the linear conductors 911Ab of the lead conductor section 165Ab in the conductor layer A via conductor vias extending in the Z direction, or the like, for example.

As depicted in FIG. 85C, because an active element group 167 is covered with at least one of the conductor layer A and the conductor layer B in the overlapping state of the conductor layer A and the conductor layer B, hot carrier light emissions from the active element group 167 can be blocked in the twenty-first configuration example also.

While Vdd wires and Vss wires with different polarities are arranged such that they overlap in the same planar regions in the lead conductor section 165*b* in the fourteenth to twenty-second configuration examples mentioned above, Vdd wires and Vss wires with different polarities may be arranged being displaced from each other such that they are in different planar regions as in the twenty-third configuration example in FIGS. 85A, 85B, and 85C, and both the conductor layer A and the conductor layer B may be used to transfer GND, a negative power supply, or a positive power supply.

Note that the linear conductors 911Ab of the lead conductor section 165Ab in the conductor layer A may not be electrically connected with the linear conductors 913Bb of the lead conductor section 165Bb in the conductor layer B, but may be dummy wires. The linear conductors 914Bb of the lead conductor section 165Bb in the conductor layer B may not be electrically connected with the linear conductors 912Ab of the lead conductor section 165Ab in the conductor layer A, but may be dummy wires.

Note that while one group of linear conductors 911Ab and one group of linear conductors 912Ab are arranged adjacent to each other in the one example depicted in FIGS. 85A, 85B, and 85C, this is not essential. For example, multiple groups of linear conductors 911Ab and multiple groups of linear conductors 912Ab may be provided, and each group of linear conductors 911Ab and each group of linear conductors 912Ab may be arranged alternately.

In addition, while the linear conductors 911Ab including multiple linear conductors and the linear conductors 912Ab including multiple linear conductors are arranged adjacent to each other in the one example depicted in FIGS. 85A, 85B, and 85C, this is not essential. For example, each linear conductor 911Ab and each linear conductor 912Ab may be arranged alternately.

In addition, while one group of linear conductors 913Bb and one group of linear conductors 914Bb are arranged adjacent to each other in the one example depicted in FIGS. 85A, 85B, and 85C, this is not essential. For example, multiple groups of linear conductors 913Bb and multiple groups of linear conductors 914Bb may be provided, and each group of linear conductors 913Bb and each group of linear conductors 914Bb may be arranged alternately.

In addition, while the linear conductors 913Bb including multiple linear conductors and the linear conductors 914Bb including multiple linear conductors are arranged adjacent to each other in the one example depicted in FIGS. 85A, 85B, and 85C, this is not essential. For example, each linear conductor 913Bb and each linear conductor 914Bb may be arranged alternately.

Twenty-Fourth Configuration Example

Figure 86A:
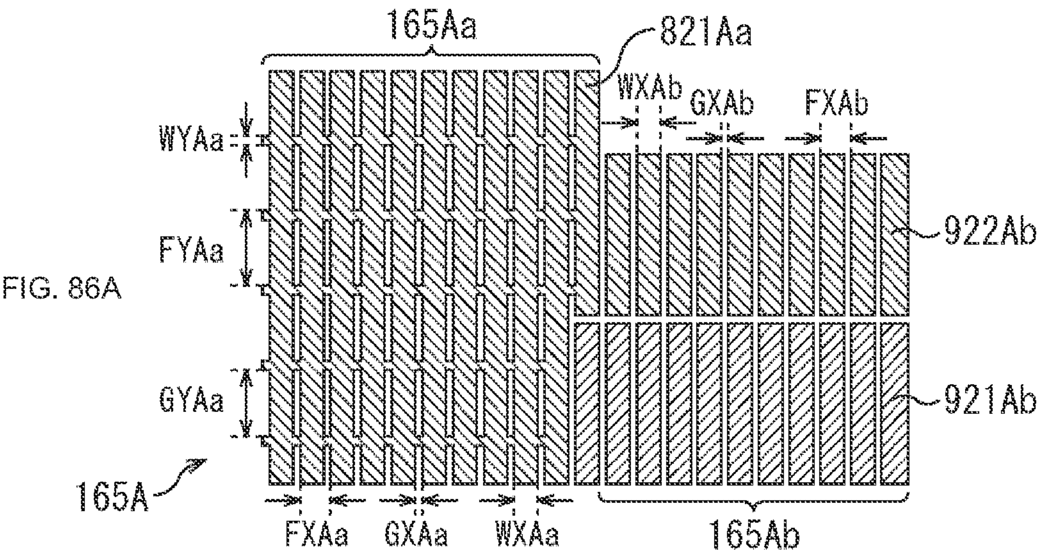
FIGS. 86A, 86B, and 86C are figures depicting a twenty-fourth configuration example of the conductor layers A and B.
Figure 86B:
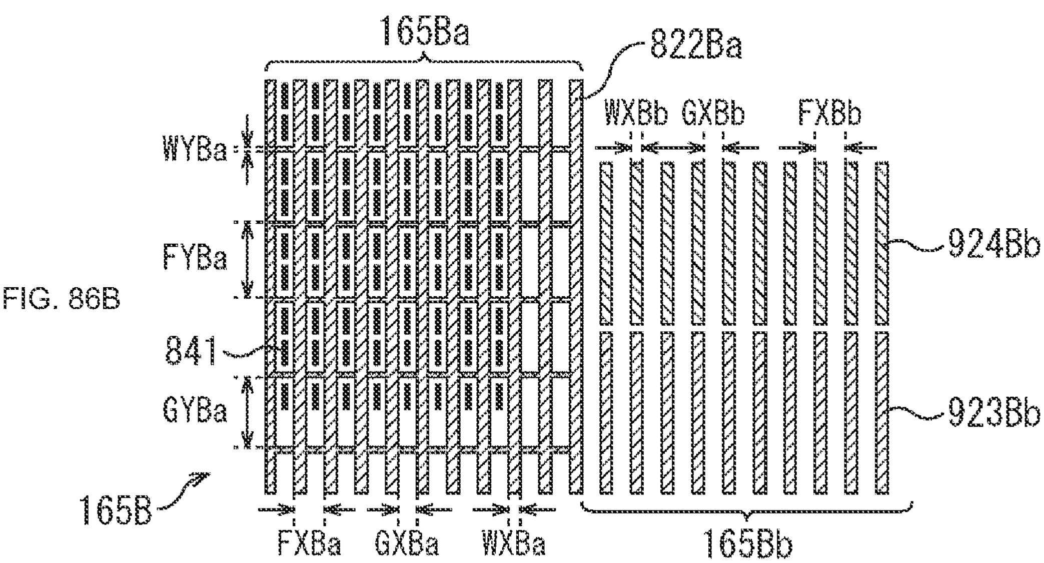
Figure 86C:
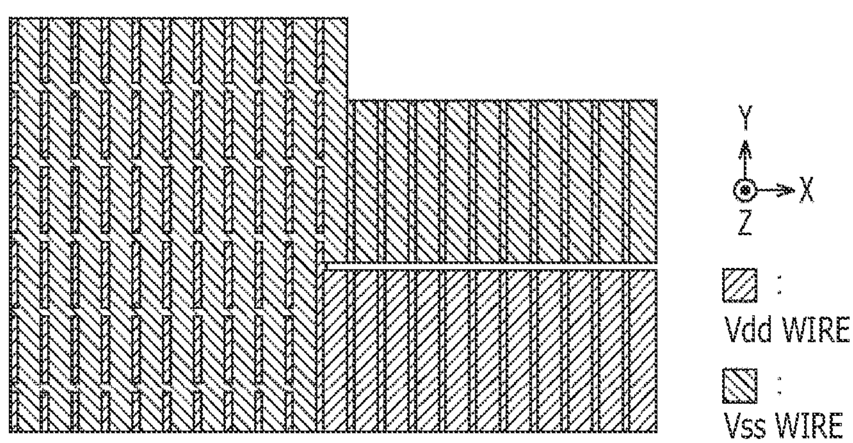

FIGS. 86A, 86B, and 86C depict a twenty-fourth configuration example of the conductor layers A and B. Note that FIG. 86A depicts the conductor layer A, and FIG. 86B depicts the conductor layer B. FIG. 86C depicts a state of the conductor layers A and B depicted in in FIGS. 86A and 86B, respectively, as seen from the side where the conductor layer A is located. In the coordinate system in FIGS. 86A, 86B, and 86C, the X axis lies in the lateral direction, the Y axis lies in the longitudinal direction, and the Z axis lies in a direction perpendicular to the XY plane.

The twenty-fourth configuration example depicted in FIGS. 86A, 86B, and 86C has a configuration in which the conductor layer of the lead conductor section 165*b* in the sixteenth configuration example depicted in FIGS. 72A, 72B, and 72C are modified. Sections in FIGS. 86A, 86B, and 86C that have counterparts in FIGS. 72A, 72B, and 72C are given the same reference signs, and explanations of those sections are omitted as appropriate.

In the lead conductor section 165Ab in the conductor layer A in the twenty-fourth configuration example depicted in FIG. 86A, instead of the mesh conductor 821Ab in the sixteenth configuration example, linear conductors 921Ab that are long in the Y direction are arranged regularly at the X-direction conductor pitch FXAb, and linear conductors 922Ab that are long in the Y direction are arranged regularly at the X-direction conductor pitch FXAb. The linear conductors 921Ab are wires (Vdd wires) connected to a positive power supply, for example. The linear conductors 922Ab are wires (Vss wires) connected to GND or a negative power supply, for example. The conductor pitch FXAb is equal to the sum of the X-direction conductor width WXAb and the X-direction gap width GXAb ((conductor pitch FXAb)=(conductor width WXAb)+(gap width GXAb)).

In the lead conductor section 165Bb in the conductor layer B in the twenty-fourth configuration example depicted in FIG. 86B, instead of the mesh conductor 822Bb in the sixteenth configuration example, linear conductors 923Bb that are long in the Y direction are arranged regularly at the X-direction conductor pitch FXBb, and linear conductors 924Bb that are long in the Y direction are arranged regularly at the X-direction conductor pitch FXBb. The linear conductors 923Bb are wires (Vdd wires) connected to a positive power supply, for example. The linear conductors 924Bb are wires (Vss wires) connected to GND or a negative power supply, for example. The conductor pitch FXBb is equal to the sum of the X-direction conductor width WXBb and the X-direction gap width GXBb ((conductor pitch FXBb)=(conductor width WXBb)+(gap width GXBb)).

The linear conductors 922Ab of the lead conductor section 165Ab in the conductor layer A are electrically connected with the linear conductors 924Bb of the lead conductor section 165Bb in the conductor layer B via conductor vias extending in the Z direction, or the like, for example, and electrically connected with the mesh conductor 821Aa of the main conductor section 165Aa via the linear conductors 924Bb.

That is, for example, GND or a negative power supply is transferred in the lead conductor section 165*b* alternately through the linear conductors 922Ab in the conductor layer A and the linear conductors 924Bb in the conductor layer B, and reaches the mesh conductor 821Aa of the main conductor section 165Aa.

The linear conductors 923Bb of the lead conductor section 165Bb in the conductor layer B are electrically connected with the linear conductors 921Ab of the lead conductor section 165Ab in the conductor layer A via conductor vias extending in the Z direction, or the like, for example, and are electrically connected with the mesh conductor 822Ba of the main conductor section 165Ba via the linear conductors 921Ab.

That is, for example, a positive power supply is transferred in the lead conductor section 165*b* alternately through the linear conductors 921Ab in the conductor layer A and the linear conductors 923Bb in the conductor layer B, and reaches the mesh conductor 822Ba of the main conductor section 165Ba.

As depicted in FIG. 86C, because an active element group 167 is covered with at least one of the conductor layer A and the conductor layer B in the overlapping state of the conductor layer A and the conductor layer B, hot carrier light emissions from the active element group 167 can be blocked in the twenty-first configuration example also.

While Vdd wires and Vss wires with different polarities are arranged such that they overlap in the same planar regions in the lead conductor section 165*b* in the fourteenth to twenty-second configuration examples mentioned above, Vdd wires and Vss wires with different polarities may be arranged being displaced from each other such that they are in different planar regions as in the twenty-fourth configuration example in FIGS. 86A, 86B, and 86C, and both the conductor layer A and the conductor layer B may be used to transfer GND, a negative power supply, or a positive power supply.

As in the twenty-first to twenty-fourth configuration examples depicted in FIG. 82 A, 82B, 82C, 83A, 83B, 83C, 84A, 84B, 85A, 85B, 85C, 86A, 86B, and 86C above, the conductor layer of the lead conductor section 165*b* is not limited to a mesh conductor, but may include a planar conductor or linear conductors. In addition, not only one layer of the conductor layers A and B, but the two layers, the conductor layers A and B, may be used.

With such a configuration, it is possible to achieve any of effects such as satisfying layout constraints of wires, further improving the degree of freedom of designing of the wiring layouts, further ameliorating inductive noise, further ameliorating voltage drops, and the like.

Twenty-Fifth Configuration Example

Figure 87A:
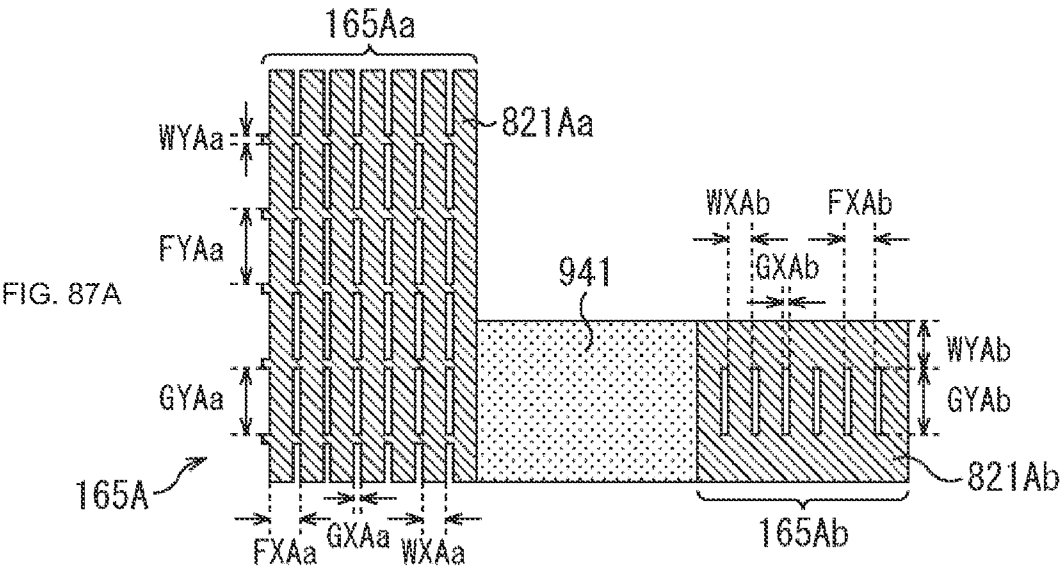
FIGS. 87A, 87B, and 87C are figures depicting a twenty-fifth configuration example of the conductor layers A and B.
Figure 87B:
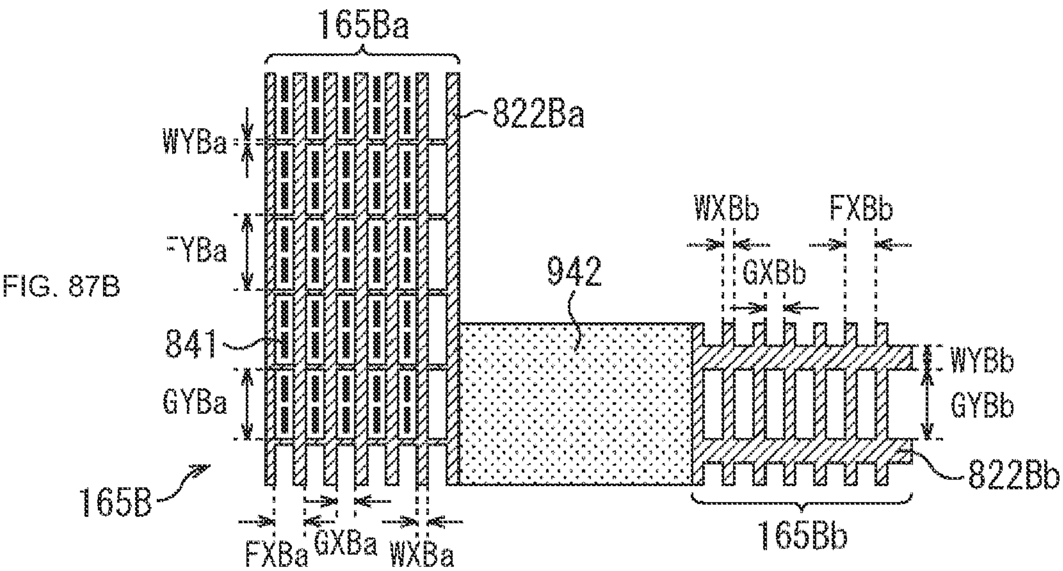
Figure 87C:
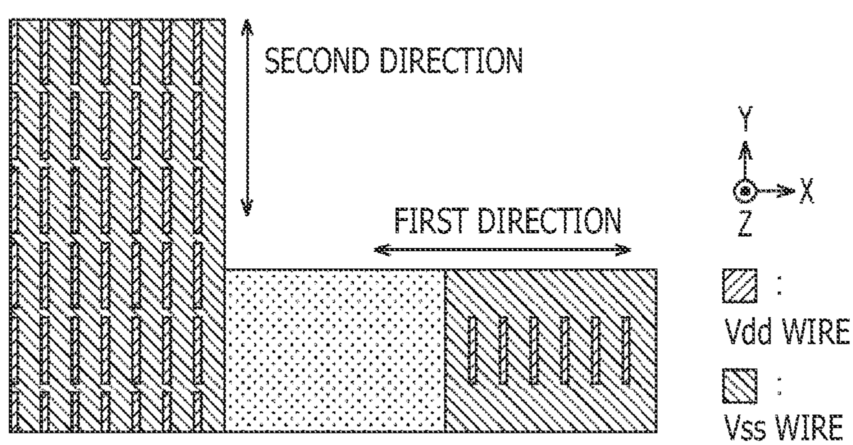

FIGS. 87A, 87B, and 87C depict a twenty-fifth configuration example of the conductor layers A and B. Note that FIG. 87A depicts the conductor layer A, and FIG. 87B depicts the conductor layer B. FIG. 87C depicts a state of the conductor layers A and B depicted in in FIGS. 87A and 87B, respectively, as seen from the side where the conductor layer A is located. In the coordinate system in FIGS. 87A, 87B, and 87C, the X axis lies in the lateral direction, the Y axis lies in the longitudinal direction, and the Z axis lies in a direction perpendicular to the XY plane.

The twenty-fifth configuration example depicted in FIGS. 87A, 87B, and 87C has a configuration in which the sixteenth configuration example depicted in FIGS. 72A, 72B, and 72C has some additional elements. Sections in FIGS. 86A, 86B, and 86C that have counterparts in FIGS. 72A, 72B, and 72C are given the same reference signs, and explanations of those sections are omitted as appropriate.

In the conductor layer A in the twenty-fifth configuration example depicted in FIG. 87A, a conductor 941 with a shape including, if desired, a repetition pattern that is different from the repetition pattern of the mesh conductor 821Aa of the main conductor section 165Aa and the repetition pattern of the mesh conductor 821Ab of the lead conductor section 165Ab in the sixteenth configuration example depicted in FIGS. 72A, 72B, and 72C are added between the mesh conductor 821Aa of the main conductor section 165Aa and the mesh conductor 821Ab of the lead conductor section 165Ab. Note that, in order to design the wiring layout efficiently, the conductor 941 desirably has a shape including a repetition pattern, but may have a shape not including a repetition pattern. Because the pattern of the conductor 941 can be of any shape, the conductor 941 is not specified particularly in A in FIG. 87A, but the conductor 941 is represented by a plane. The conductor 941 is electrically connected with both the mesh conductor 821Aa and the mesh conductor 821Ab. In other words, the mesh conductor 821Aa of the main conductor section 165Aa and the mesh conductor 821Ab of the lead conductor section 165Ab are electrically connected via the conductor 941.

In the conductor layer B in the twenty-fifth configuration example depicted in FIG. 87B, a conductor 942 with a shape including, if desired, a repetition pattern that is different from the repetition pattern of the mesh conductor 822Ba of the main conductor section 165Ba and the repetition pattern of the mesh conductor 822Bb of the lead conductor section 165Bb in the sixteenth configuration example depicted in FIGS. 72A, 72B, and 72C are added between the mesh conductor 822Ba of the main conductor section 165Ba and the mesh conductor 822Bb of the lead conductor section 165Bb. Note that, in order to design the wiring layout efficiently, the conductor 942 desirably has a shape including a repetition pattern, but may have a shape not including a repetition pattern. Because the pattern of the conductor 942 can be of any shape, the conductor 942 is not specified particularly in FIG. 87B, but the conductor 942 is represented by a plane. The conductor 942 is electrically connected with both the mesh conductor 822Ba and the mesh conductor 822Bb. In other words, the mesh conductor 822Ba of the main conductor section 165Ba and the mesh conductor 822Bb of the lead conductor section 165Bb are electrically connected via the conductor 942.

According to the twenty-fifth configuration example, because the mesh conductor 821Aa of the main conductor section 165Aa and the mesh conductor 821Ab of the lead conductor section 165Ab are connected via the predetermined conductor 941 in the conductor layer A, the freedom of designing of the wiring layout can be improved further, and the degree of freedom near pads can be improved particularly.

In the conductor layer B also, because the mesh conductor 822Ba of the main conductor section 165Ba and the mesh conductor 822Bb of the lead conductor section 165Bb are connected via the predetermined conductor 942, the freedom of designing of the wiring layout can be improved further, and the degree of freedom near pads can be improved particularly.

Twenty-Sixth Configuration Example

Figure 88A:
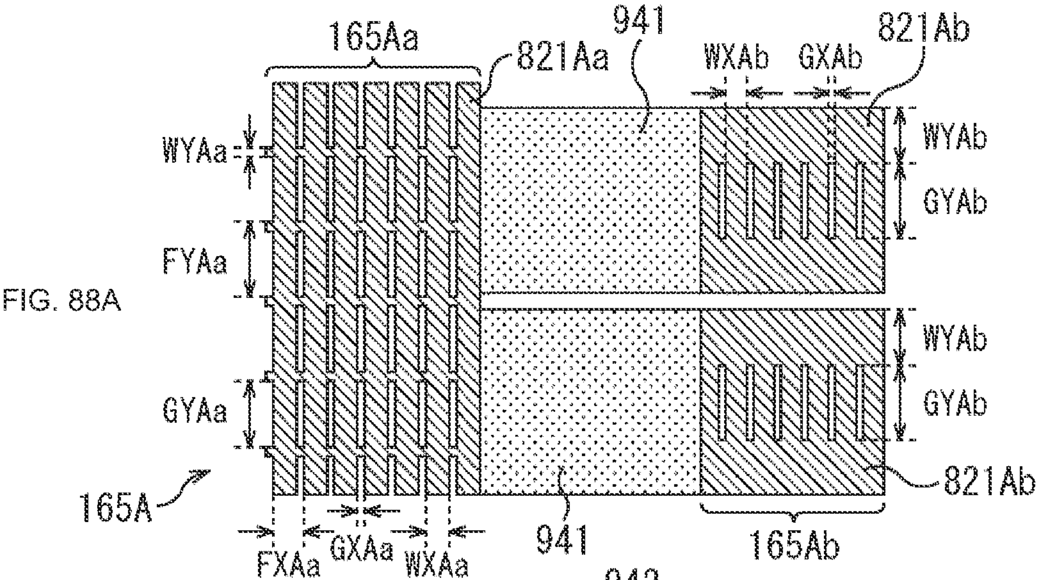
FIGS. 88A, 88B, and 88C are figures depicting a twenty-sixth configuration example of the conductor layers A and B.
Figure 88B:
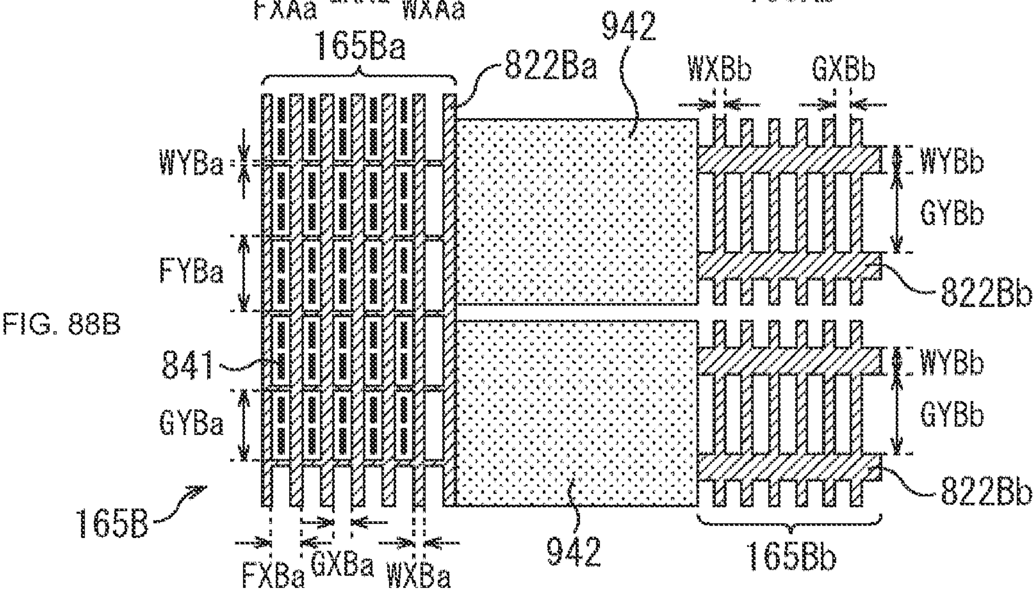
Figure 88C:
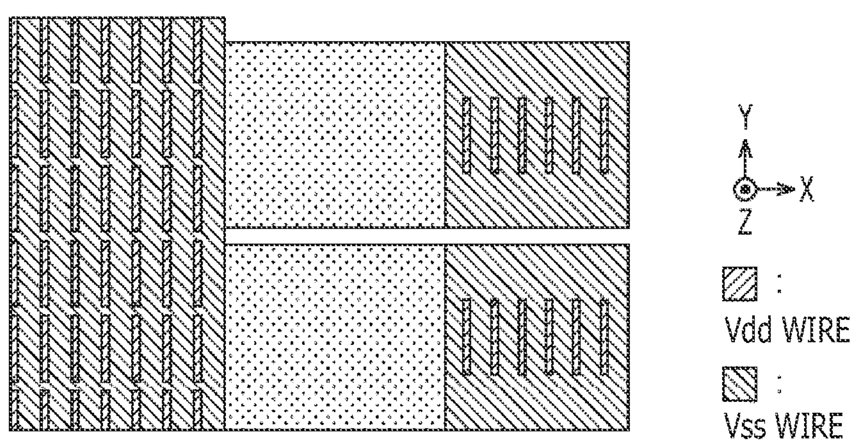

FIGS. 88A, 88B, and 88C depict a twenty-sixth configuration example of the conductor layers A and B. Note that FIG. 88A depicts the conductor layer A, and FIG. 88B depicts the conductor layer B. FIG. 88C depicts a state of the conductor layers A and B depicted in in FIGS. 88A and 88B, respectively, as seen from the side where the conductor layer A is located. In the coordinate system in FIGS. 88A, 88B, and 88C, the X axis lies in the lateral direction, the Y axis lies in the longitudinal direction, and the Z axis lies in a direction perpendicular to the XY plane.

The twenty-sixth configuration example depicted in FIGS. 88A, 88B, and 88 has a configuration in which part of the twenty-fifth configuration example depicted in FIGS. 87A, 87B, and 87C are modified. Sections in FIGS. 86A, 86B, and 86C that have counterparts in FIGS. 87A, 87B, and 87C are given the same reference signs, and explanations of those sections are omitted as appropriate.

Regarding the main conductor section 165Aa, the conductor layer A in the twenty-sixth configuration example depicted in FIG. 88A includes the mesh conductor 821Aa similar to that in the twenty-fifth configuration example depicted in FIGS. 87A, 87B, and 87C. In addition, regarding the lead conductor section 165Ab, the conductor layer A in the twenty-sixth configuration example includes multiple mesh conductors 821Ab and multiple conductors 941 similar to those in the twenty-fifth configuration example at a predetermined Y-direction interval. In other words, the conductor layer A in the twenty-sixth configuration example in FIG. 88A has a modified configuration in which multiple mesh conductors 821Ab and multiple conductors 941 of the lead conductor section 165Ab in the twenty-fifth configuration example depicted in FIGS. 87A, 87B, and 87C are provided at a predetermined Y-direction interval. Note that all of the multiple conductors 941 may be the same or may not be the same.

Regarding the main conductor section 165Ba, the conductor layer B in the twenty-sixth configuration example depicted in FIG. 88B includes the mesh conductor 822Ba similar to that in the twenty-fifth configuration example depicted in FIGS. 87A, 87B, and 87C. In addition, regarding the lead conductor section 165Bb, the conductor layer B in the twenty-sixth configuration example includes multiple mesh conductors 822Bb and multiple conductors 942 similar to those in the twenty-fifth configuration example at a predetermined Y-direction interval. In other words, the conductor layer B in the twenty-sixth configuration example in FIG. 88B has a modified configuration in which multiple mesh conductors 822Bb and multiple conductors 942 of the lead conductor section 165Bb in the twenty-fifth configuration example depicted in FIGS. 87A, 87B, and 87C are provided at a predetermined Y-direction interval. Note that all of the multiple conductors 942 may be the same or may not be the same.

With such a configuration, it is possible to achieve any of effects such as satisfying layout constraints of wires, further improving the degree of freedom of designing of the wiring layouts, further ameliorating inductive noise, further ameliorating voltage drops, and the like.

Twenty-Seventh Configuration Example

Figure 89A:
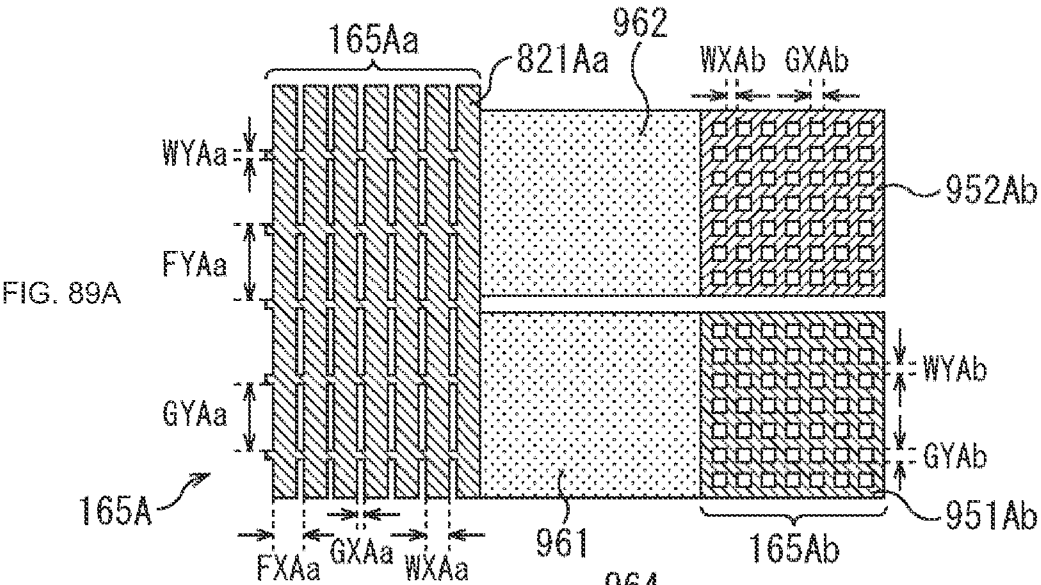
FIGS. 89A, 89B, and 89C are figures depicting a twenty-seventh configuration example of the conductor layers A and B.
Figure 89B:
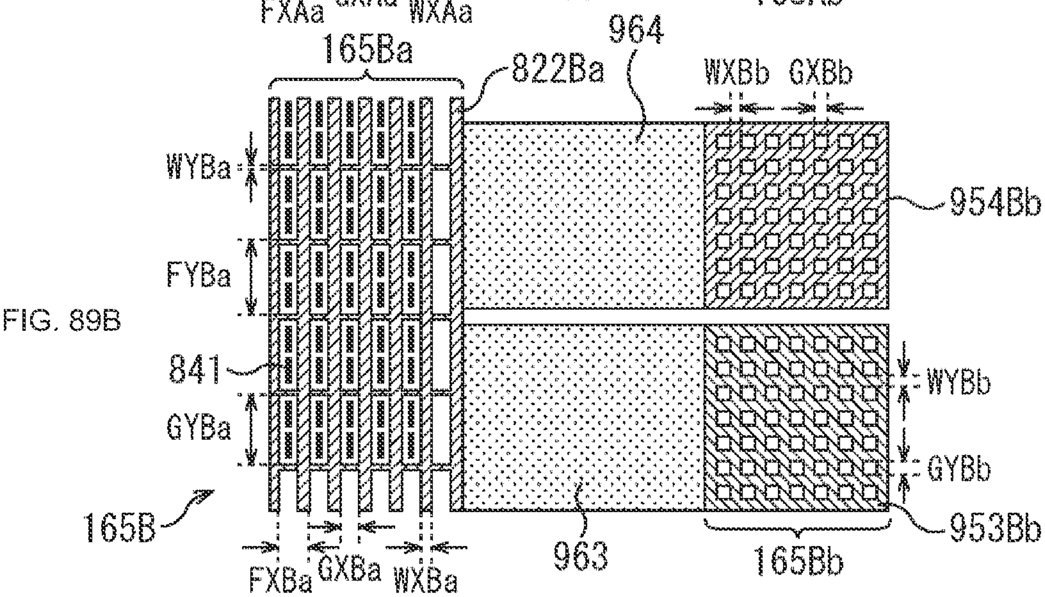
Figure 89C:
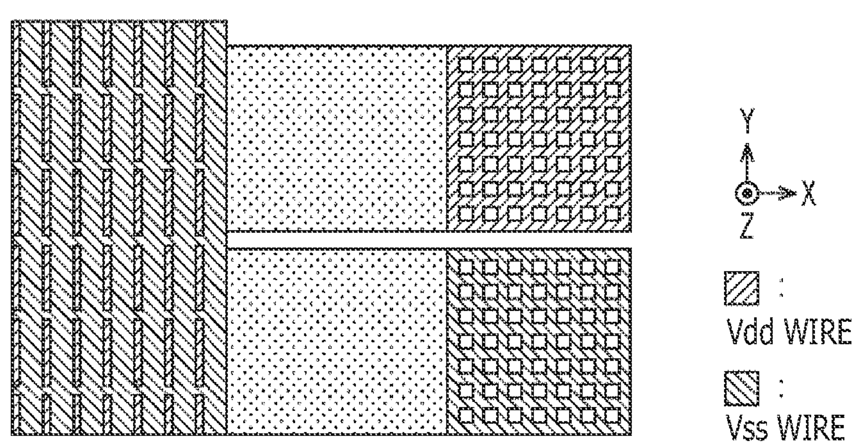

FIGS. 89A, 89B, and 89C depict a twenty-seventh configuration example of the conductor layers A and B. Note that FIG. 89A depicts the conductor layer A, and FIG. 89B depicts the conductor layer B. FIG. 89C depicts a state of the conductor layers A and B depicted in in FIGS. 89A and 89B, respectively, as seen from the side where the conductor layer A is located. In the coordinate system in FIGS. 89A, 89B, and 89C, the X axis lies in the lateral direction, the Y axis lies in the longitudinal direction, and the Z axis lies in a direction perpendicular to the XY plane.

The twenty-seventh configuration example depicted in FIGS. 89A, 89B, and 89C has a configuration in which part of the twenty-sixth configuration example depicted in FIGS. 88A, 88B, and 88C are modified. Sections in FIGS. 89A, 89B, and 89C that have counterparts in FIGS. 88A, 88B, and 88C are given the same reference signs, and explanations of those sections are omitted as appropriate.

The main conductor section 165Aa in the conductor layer A in the twenty-seventh configuration example depicted in FIG. 89A includes the mesh conductor 821Aa similar to that in the twenty-sixth configuration example depicted in FIGS. 88A, 88B, and 88C. The lead conductor section 165Ab in the conductor layer A in the twenty-seventh configuration example includes a mesh conductor 951Ab and a mesh conductor 952Ab. Both of the shapes of the mesh conductor 951Ab and the mesh conductor 952Ab include the X-direction conductor width WXAb and gap width GXAb, and the Y-direction conductor width WYAb and gap width GYAb. It should be noted however that the mesh conductor 952Ab is a wire (Vdd wire) connected to a positive power supply, for example, and the mesh conductor 951Ab is a wire (Vss wire) connected to GND or a negative power supply, for example.

A conductor 961 with a shape including, if desired, a repetition pattern that is different from the repetition pattern of the mesh conductor 821Aa of the main conductor section 165Aa and the repetition pattern of the mesh conductor 951Ab of the lead conductor section 165Ab is arranged between the mesh conductor 821Aa of the main conductor section 165Aa and the mesh conductor 951Ab of the lead conductor section 165Ab. A conductor 962 with a shape including, if desired, a repetition pattern that is different from the repetition pattern of the mesh conductor 821Aa of the main conductor section 165Aa and the repetition pattern of the mesh conductor 952Ab of the lead conductor section 165Ab is arranged between the mesh conductor 821Aa of the main conductor section 165Aa and the mesh conductor 952Ab of the lead conductor section 165Ab. Note that, in order to design the wiring layout efficiently, the conductor 961 or 962 desirably has a shape including a repetition pattern, but may have a shape not including a repetition pattern. Because the patterns of the conductors 961 and 962 can be of any shapes, the conductors 961 and 962 are not specified particularly in FIG. 89A, but the conductors 961 and 962 are represented by planes.

The main conductor section 165Ba in the conductor layer B in the twenty-seventh configuration example depicted in FIG. 89B includes the mesh conductor 822Ba similar to that in the twenty-sixth configuration example depicted in FIGS. 88A, 88B, and 88C. The lead conductor section 165Bb in the conductor layer B in the twenty-seventh configuration example includes a mesh conductor 953Bb and a mesh conductor 954Bb. Both of the shapes of the mesh conductor 953Bb and the mesh conductor 954Bb include the X-direction conductor width WXBb and gap width GXBb, and the Y-direction conductor width WYBb and gap width GYBb. It should be noted however that the mesh conductor 954Bb is a wire (Vdd wire) connected to a positive power supply, for example, and the mesh conductor 953Bb is a wire (Vss wire) connected to GND or a negative power supply, for example.

A conductor 963 with a shape including, if desired, a repetition pattern that is different from the repetition pattern of the mesh conductor 822Ba of the main conductor section 165Ba and the repetition pattern of the mesh conductor 953Bb of the lead conductor section 165Bb is arranged between the mesh conductor 822Ba of the main conductor section 165Ba and the mesh conductor 953Bb of the lead conductor section 165Bb. A conductor 964 with a shape including, if desired, a repetition pattern that is different from the repetition pattern of the mesh conductor 822Ba of the main conductor section 165Ba and the repetition pattern of the mesh conductor 954Bb of the lead conductor section 165Bb is arranged between the mesh conductor 822Ba of the main conductor section 165Ba and the mesh conductor 954Bb of the lead conductor section 165Bb. Note that, in order to design the wiring layout efficiently, the conductor 963 or 964 desirably has a shape including a repetition pattern, but may have a shape not including a repetition pattern. Because the patterns of the conductors 963 and 964 can be of any shapes, the conductors 963 and 964 are not specified particularly in FIG. 89B, but the conductors 963 and 964 are represented by planes.

The conductor 961 in the conductor layer A is electrically connected with the mesh conductor 821Aa of the main conductor section 165Aa, and at least one of the mesh conductor 951Ab or the mesh conductor 953Bb of the lead conductor section 165*b* directly or indirectly via a conductor like at least part of the conductor 963, for example. In other words, the mesh conductor 821Aa of the main conductor section 165Aa, and at least one of the mesh conductor 951Ab or the mesh conductor 953Bb of the lead conductor section 165*b* are electrically connected via the conductor 961. In addition, the mesh conductor 951Ab of the lead conductor section 165Ab may be electrically connected with the mesh conductor 953Bb of the lead conductor section 165Bb in the conductor layer B via a conductor via extending in the Z direction, or the like, for example. The conductor 961 and the conductor 963 may also be electrically connected via a conductor via extending in the Z direction, or the like, for example.

The conductor 964 in the conductor layer B is electrically connected with the mesh conductor 822Ba of the main conductor section 165Ba, and at least one of the mesh conductor 952Ab or the mesh conductor 954Bb of the lead conductor section 165*b* directly or indirectly via a conductor like at least part of the conductor 962, for example. In other words, the mesh conductor 822Ba of the main conductor section 165Ba, and at least one of the mesh conductor

952Ab or the mesh conductor 954Bb of the lead conductor section 165*b* are electrically connected via the conductor 964. In addition, the mesh conductor 952Ab of the lead conductor section 165Ab may be electrically connected with the mesh conductor 954Bb of the lead conductor section 165Bb in the conductor layer B via a conductor via extending in the Z direction, or the like, for example. The conductor 962 and the conductor 964 may also be electrically connected via a conductor via extending in the Z direction, or the like, for example.

For example, in the twenty-sixth configuration example in FIGS. 88A, 88B, and 88C mentioned above, regarding the polarities of the conductor layer A and the conductor layer B at the same plane position in each of the main conductor section 165*a* and the lead conductor section 165*b*, the main conductor section 165Aa in the conductor layer A and the main conductor section 165Ba in the conductor layer B have different polarities between Vss wires and Vdd wires, and the lead conductor section 165Ab in the conductor layer A and the lead conductor section 165Bb in the conductor layer B also have different polarities.

In contrast, in the twenty-seventh configuration example in FIGS. 89A, 89B, and 89C, regarding the polarities of the conductor layer A and the conductor layer B at the same plane position in each of the main conductor section 165*a* and the lead conductor section 165*b*, the main conductor section 165Aa in the conductor layer A and the main conductor section 165Ba in the conductor layer B have different polarities between Vss wires and Vdd wires, but the lead conductor section 165Ab in the conductor layer A and the lead conductor section 165Bb in the conductor layer B have the same polarity. In a case in which the upper and lower conductor layer A and conductor layer B are configured in such a polarity arrangement, the lead conductor section 165*b* including the electrically connected upper and lower conductor layer A and conductor layer B can be formed as a pad (electrode).

According to the twenty-seventh configuration example, it is possible to achieve any of effects such as satisfying layout constraints of wires, further improving the degree of freedom of designing of the wiring layouts, further ameliorating inductive noise, further ameliorating voltage drops, and the like.

Twenty-Eighth Configuration Example

Figures 90A, 90B, 90C:
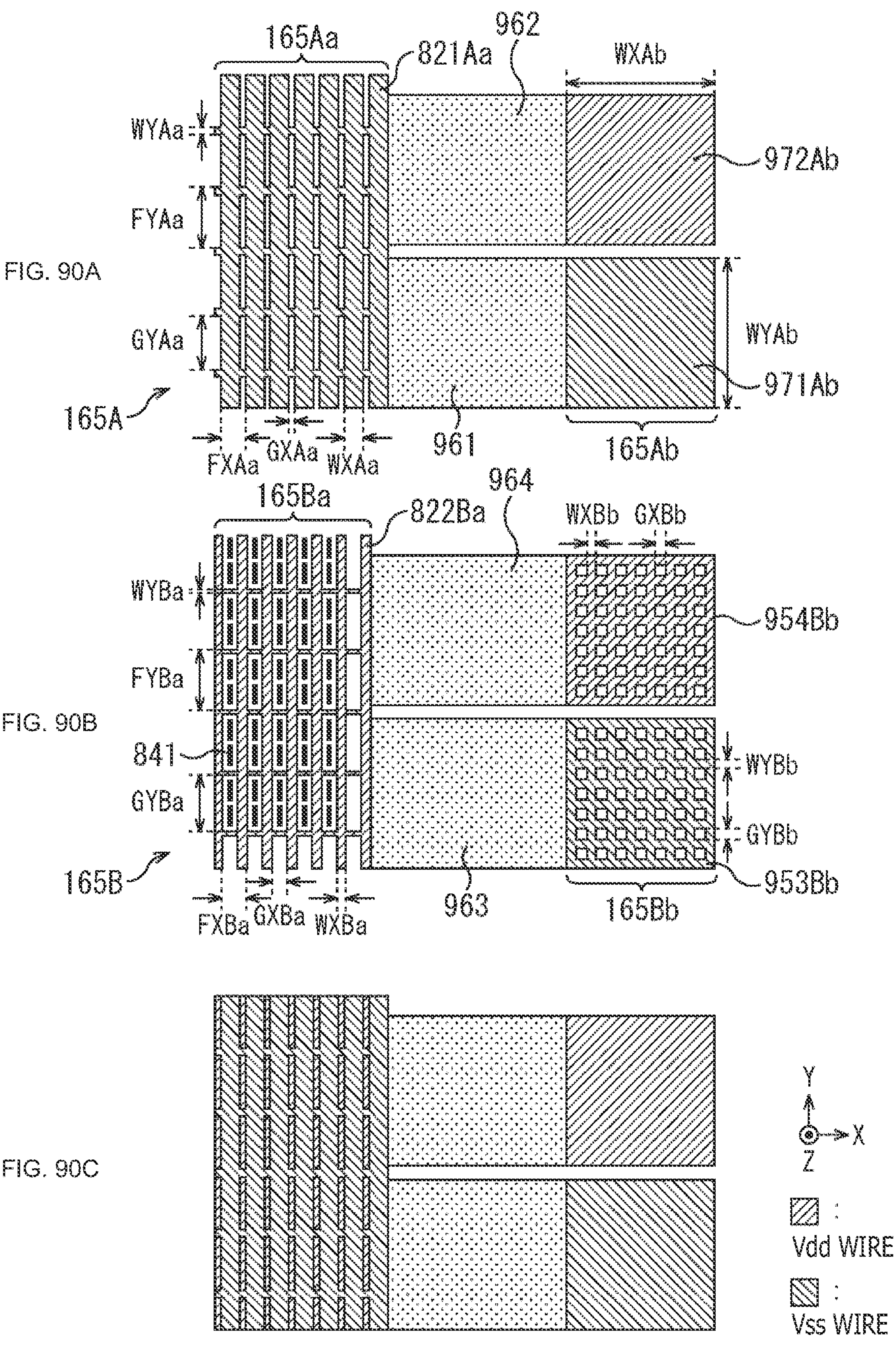
FIGS. 90A, 90B, and 90C are figures depicting a twenty-eighth configuration example of the conductor layers A and B.

FIGS. 90A, 90B, and 90C depict a twenty-eighth configuration example of the conductor layers A and B. Note that FIG. 90A depicts the conductor layer A, and FIG. 90B depicts the conductor layer B. FIG. 90C depicts a state of the conductor layers A and B depicted in in FIGS. 90A and 90B, respectively, as seen from the side where the conductor layer A is located. In the coordinate system in FIGS. 90A, 90B, and 90C, the X axis lies in the lateral direction, the Y axis lies in the longitudinal direction, and the Z axis lies in a direction perpendicular to the XY plane.

The twenty-eighth configuration example depicted in FIGS. 90A, 90B, and 90C has a configuration in which part of the twenty-seventh configuration example depicted in FIGS. 89A, 89B, and 89C are modified. Sections in FIGS. 90A, 90B, and 90C that have counterparts in FIGS. 89A, 89B, and 89C are given the same reference signs, and explanations of those sections are omitted as appropriate.

The twenty-eighth configuration example depicted in FIGS. 90A, 90B, and 90C and the twenty-seventh configuration example in FIGS. 89A, 89B, and 89C are different only in terms of the shape of the lead conductor section 165Ab in the conductor layer A and have commonalities in other respects.

Specifically, in the lead conductor section 165Ab in the conductor layer A in the twenty-seventh configuration example in FIGS. 89A, 89B, and 89C, the mesh conductor 951Ab and the mesh conductor 952Ab having shapes with the X-direction conductor width WXAb and gap width GXAb, and the Y-direction conductor width WYAb and gap width GYAb are formed.

In contrast, in the lead conductor section 165Ab in the conductor layer A in the twenty-eighth configuration example in FIGS. 90A, 90B, and 90C, a planar conductor 971Ab and a planar conductor 972Ab having shapes with the X-direction conductor width WXAb and the Y-direction conductor width WYAb are formed.

In other words, in the twenty-eighth configuration example in FIGS. 90A, 90B, and 90C, in the lead conductor section 165Ab in the conductor layer A, the planar conductor 971Ab is provided instead of the mesh conductor 951Ab in the twenty-seventh configuration example in FIGS. 89A, 89B, and 89C, and the planar conductor 972Ab is provided instead of the mesh conductor 952Ab in the twenty-seventh configuration example in FIGS. 89A, 89B, and 89C.

Although the twenty-seventh configuration example depicted in FIGS. 89A, 89B, and 89C are examples in which the upper and lower conductor layer A and conductor layer B have the same shape of the lead conductor section 165*b*, they may have different shapes as in the twenty-eighth configuration example in FIGS. 90A, 90B, and 90C.

Figure 91A:
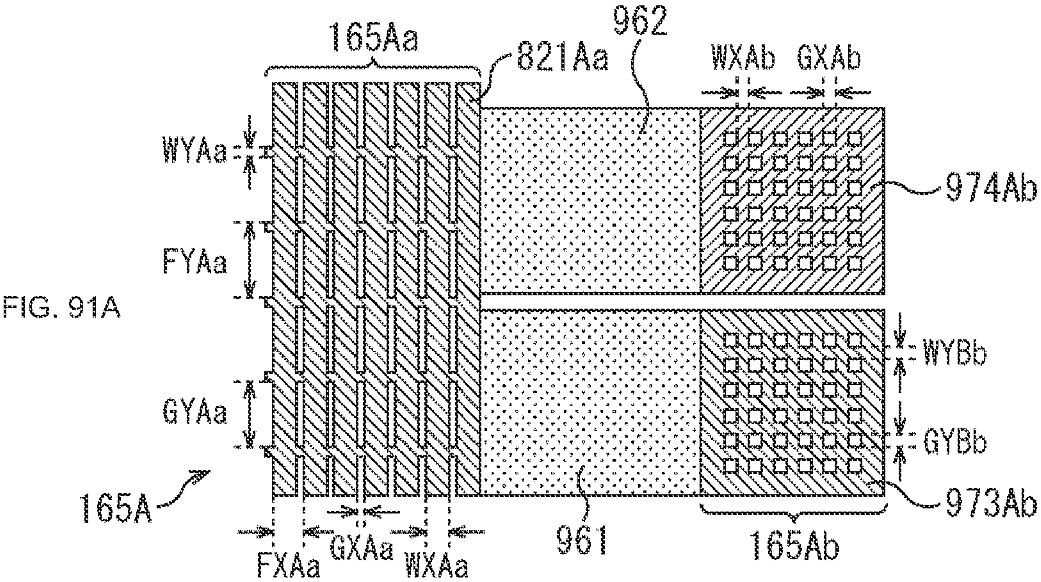
FIGS. 91A and 91B are figures depicting other configuration examples of the conductor layer A in the twenty-eighth configuration example.

Moreover, while the shape of the lead conductor section 165Ab in the conductor layer A in the twenty-eighth configuration example in FIGS. 90A, 90B, and 90C are planar, in one possible configuration, even if mesh conductors are used in common like a mesh conductor 973Ab and a mesh conductor 974Ab of the lead conductor section 165Ab in the conductor layer A depicted in FIG. 91A, a light-blocking structure may be formed with the mesh conductor 973Ab in the conductor layer A in FIG. 91A and the mesh conductor 953Bb in the conductor layer B in FIG. 90B, and a light-blocking structure may be formed with the mesh conductor 974Ab in the conductor layer A in FIG. 91A and the mesh conductor 954Bb in the conductor layer B in FIG. 90B. Furthermore, in one possible shape, the X-direction conductor width WXAb or gap width GXAb, and the Y-direction conductor width WYAb or gap width GYAb may be made substantially the same sizes as those of the mesh conductor 953Bb or mesh conductor 954Bb of the lead conductor section 165Bb in the conductor layer B.

Figure 91B:
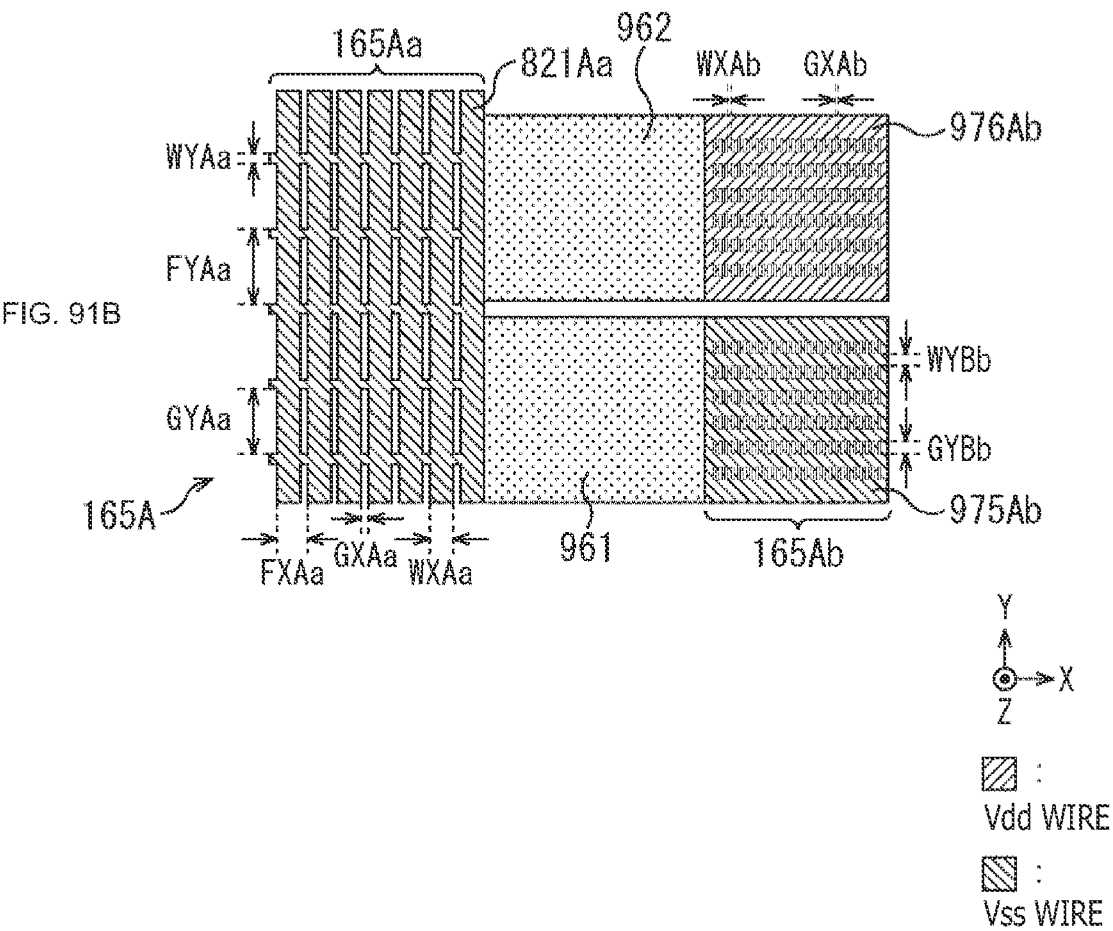

Alternatively, in one possible shape, like a mesh conductor 975Ab and a mesh conductor 976Ab of the lead conductor section 165Ab in the conductor layer A depicted in FIG. 91B, the X-direction conductor width WXAb or gap width GXAb may be made smaller than those of the mesh conductor 953Bb or mesh conductor 954Bb of the lead conductor section 165Bb in the conductor layer B in FIG. 90B. Additionally, in one possible configuration, a light-blocking structure may be formed with the mesh conductor 975Ab in the conductor layer A in FIG. 91B and the mesh conductor 953Bb in the conductor layer B in FIG. 90B, and a light-blocking structure may be formed with the mesh conductor 976Ab in the conductor layer A in FIG. 91B and the mesh conductor 954Bb in the conductor layer B in FIG. 90B. Furthermore, although an illustration is omitted, in one possible shape, the Y-direction conductor width WYAb or gap width GYAb of the lead conductor section 165Ab in the conductor layer A may be made smaller than those of the mesh conductor 953Bb or mesh conductor 954Bb of the lead conductor section 165Bb in the conductor layer B, and, in one possible shape, the X-direction conductor width WXAb or gap width GXAb, and Y-direction conductor width WYAb or gap width GYAb of the lead conductor section 165Ab in the conductor layer A may be made larger than those of the mesh conductor 953Bb or mesh conductor 954Bb of the lead conductor section 165Bb in the conductor layer B.

FIGS. 91A and 91B depict other configuration examples of the conductor layer A in the twenty-eighth configuration example in FIGS. 90A, 90B, and 90C.

Summary of Fourteenth to Twenty-Eighth Configuration Examples

In the fourteenth to twenty-eighth configuration examples depicted in FIGS. 65A, 65B, 65C, 66A, 66B, 66C, 67A, 67B, 67C, 68A, 68B, 68C, 69A, 69B, 69C, 70A, 70B, 700, 71A, 71B, 71C, 72A, 72B, 72C, 73A, 73B, 73C, 74A, 74B, 74C, 75A, 75B, 75C, 76A, 76B, 76C, 77A, 77B, 77C, 78A, 78B, 78C, 79A, 79B, 79C, 80A, 80B, 80C, 81A, 81B, 81C, 82A, 82B, 82C, 83A, 83B, 83C, 84A, 84B, 85A, 85B, 85C, 86A, 86B, 86C 87A, 87B, 87C, 88A, 88B, 88C, 90A, 90B, and 90C, in both the conductor layer A and the conductor layer B, repetition patterns of the main conductor section 165*a* and the lead conductor section 165*b* include different patterns (shapes).

The conductor layer A (first conductor layer) includes the main conductor section 165Aa (first conductor section) including a conductor with a shape in which a planar, linear, or mesh repetition pattern (first basic pattern) is repeatedly arrayed on the same plane in the X direction or Y direction, and the lead conductor section 165Ab (fourth conductor section) including a conductor with a shape in which a planar, linear, or mesh repetition pattern (fourth basic pattern) is repeatedly arrayed on the same plane in the X direction or Y direction. Here, the repetition pattern of the conductor of the main conductor section 165Aa and the repetition pattern of the conductor of the lead conductor section 165Ab may have different shapes, and conductors with patterns different from the patterns of the conductor of the main conductor section 165Aa and the conductor of the lead conductor section 165Ab may be arranged between the conductor of the main conductor section 165Aa and the conductor of the lead conductor section 165Ab.

The conductor layer B (second conductor layer) includes the main conductor section 165Ba (second conductor section) including a conductor with a shape in which a planar, linear, or mesh repetition pattern (second basic pattern) is repeatedly arrayed on the same plane in the X direction or Y direction, and the lead conductor section 165Bb (third conductor section) including a conductor with a shape in which a planar, linear, or mesh repetition pattern (third basic pattern) is repeatedly arrayed on the same plane in the X direction or Y direction. Here, the repetition pattern of the conductor of the main conductor section 165Ba and the repetition pattern of the conductor of the lead conductor section 165Bb may have different shapes, and conductors with patterns different from the patterns of the conductor of the main conductor section 165Ba and the conductor of the lead conductor section 165Bb may be arranged between the conductor of the main conductor section 165Ba and the conductor of the lead conductor section 165Bb.

In each configuration example mentioned above, a conductor explained as being a wire (Vss wire) connected to GND or a negative power supply, for example, may be a wire (Vdd wire) connected to a positive power supply, for example, and a conductor explained as being a wire (Vdd wire) connected to a positive power supply, for example, may be a wire (Vss wire) connected to GND or a negative power supply, for example.

While the entire Y-direction length LAa of the conductor of the main conductor section 165Aa is longer than the entire Y-direction length LAb of the conductor of the lead conductor section 165Ab in the configuration in each configuration example mentioned above, the entire length LAa and the entire length LAb may be the same or substantially the same, or the entire length LAa may be shorter than the entire length LAb in one possible configuration.

Similarly, while the entire Y-direction length LBa of the main conductor section 165Ba is longer than the entire Y-direction length LBb of the lead conductor section 165Bb in the configurations, the entire length LBa and the entire length LBb may be the same or substantially the same, or the entire length LBa may be shorter than the entire length LBb in one possible configuration.

In configuration examples that are included in the configuration examples mentioned above, and in which repetition patterns that allow currents to flow more easily in the Y direction than in the X direction are used as examples of repetition patterns of the main conductor section 165Aa and the main conductor section 165Ba, repetition pattern examples that allow currents to flow more easily in the X direction may be used, and conversely in configuration examples in which repetition patterns that allow currents to flow more easily in the X direction than in the Y direction are used, repetition pattern examples that allow currents to flow more easily in the Y direction may be used. In addition, repetition pattern examples that allow currents to flow more easily in the X direction and the Y direction to the substantially same degrees may be used.

In each configuration example mentioned above, patterns of the conductors of the main conductor section 165Aa in the conductor layer A (wiring layer 165A) and the main conductor section 165Ba in the conductor layer B (wiring layer 165B) may have any configurations of the patterns explained in the first to thirteenth configuration examples. Note that while the conductor pitches, the conductor widths, and the gap widths are entirely even pitches and widths in the examples used for the explanations of some of the configuration examples mentioned above, these are not essential. For example, the conductor pitches, the conductor widths, and the gap widths may be uneven pitches and widths, and the conductor pitches, the conductor widths, and the gap widths may be modulated depending on positions, in other possible shapes. In addition, while the conductor pitches, the conductor widths, the gap widths, the wire shapes, the wire positions, the numbers of wires, and the like are substantially the same between Vdd wires and Vss wires in the examples used for the explanations of some of the configuration examples mentioned above, these are not essential. For example, Vdd wires and Vss wires may have different conductor pitches, may have different conductor widths, may have different gap widths, may have different wire shapes, may have different wire positions, may have wire positions that deviate from each other or are displaced from each other, or may have different numbers of wires.

<10. Configuration Examples of Connections with Pads>

Next, relations between the conductor layers A and B, and pads are explained with reference to FIGS. 92A, 92B, 93A, 93B, 93C, 94A, 94B, 94C, 95A, 95B, 95C, 96A, 96B, 96C, 97A, 97B, 97C, 98A, 98B, 97C, 99A, 99B, 99C, 100A, 100B, 100C, 101A, 101B, 101C, 102A, 102B, 102C, 103A, 103B, 103C, 104A, 104B, 104C, 105A, 105B, 105C, 106A, 106B, 106C, 107A, 107B, 107C, 108A, 108B, and 108C.

Figure 92A:
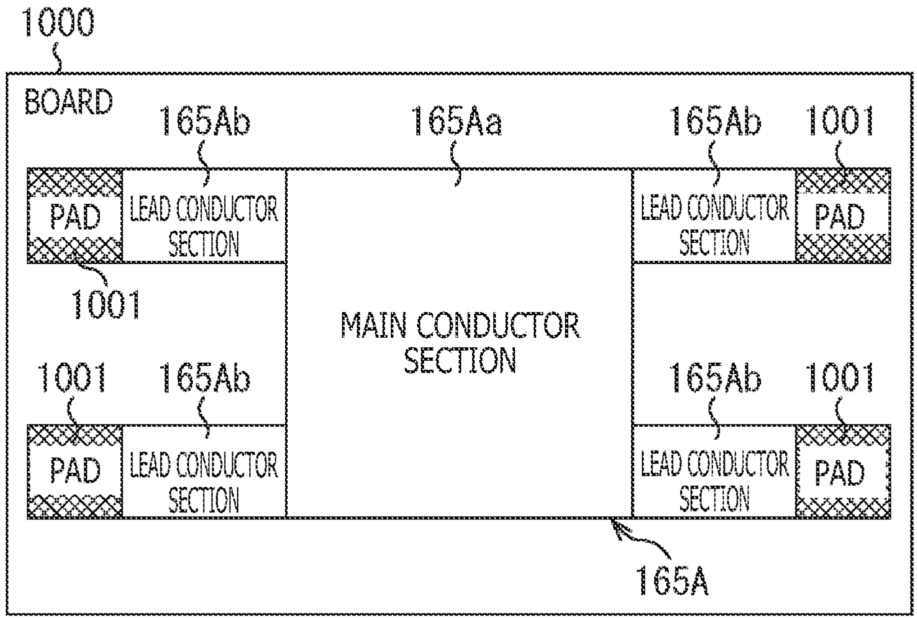
FIGS. 92A and 92B are plan views depicting the whole of the conductor layer A formed on a board.
Figure 92B:
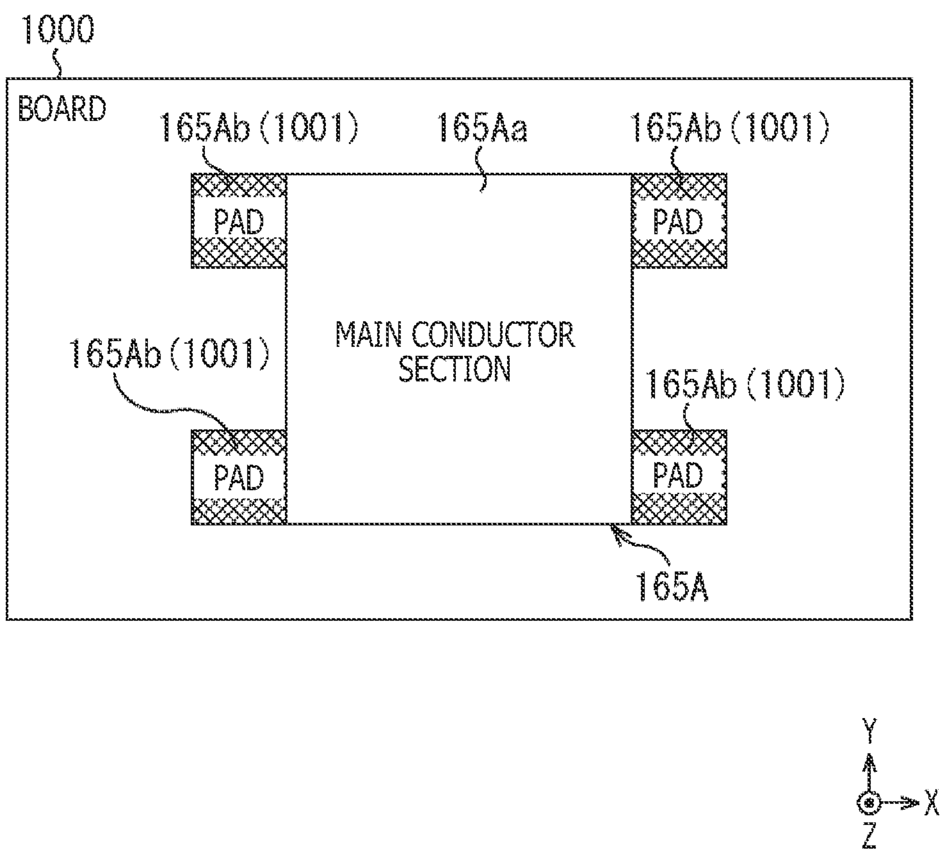

FIGS. 92A and 92B, is are plan views depicting the whole of the conductor layer A formed on a board.

As mentioned above, the conductor layer A (wiring layer 165A) includes the main conductor section 165Aa and the lead conductor sections 165Ab.

In a case in which pads are provided separately from the conductor layer A, as depicted in FIG. 92A, the lead conductor sections 165Ab are provided at positions close to pads 1001, and connect the main conductor section 165Aa and the pads 1001. On the other hand, as depicted in FIG. 92B, the pads 1001 include the lead conductor sections 165Ab in some cases.

In the main region of a board 1000, for example, in the middle region of the board, the main conductor section 165Aa is formed to have an area size larger than the lead conductor sections 165Ab, and blocks, off from light, active elements such as MOMS transistors or diodes formed in the region of the main conductor section 165Aa or on other layers that are located in the Z direction perpendicular to the plane of the region of the main conductor section 165Aa.

Note that FIGS. 92A and 92B depict one example of the arrangement and shape of the conductor layer A and the arrangement and shape of the conductor layer A are not limited to this example. Accordingly, the positions and area sizes of the main conductor section 165Aa, the lead conductor sections 165Ab, and the pads 1001 formed in the board 1000 can be any positions and area sizes, and an active element does not have to be formed in the regions of the main conductor section 165Aa and the lead conductor sections 165Ab or on other layers that are located in the Z direction perpendicular to the plane of the regions of the main conductor section 165Aa and the lead conductor sections 165Ab. The lead conductor sections 165Ab do not have to be provided at positions close to the pads 1001. In addition, the lead conductor sections 165Ab and the pads 1001 may be arranged, relative to the main conductor section 165Aa, not on edges on the X-direction sides in the four edges of the main conductor section 165Aa as in FIGS. 92A and 92B, but on edges on the Y-direction sides, or on edges on both the X-direction sides and the Y-direction sides. Furthermore, the number of the pads 1001 on each edge as in FIGS. 92A and 92B may not be two, but one, or three or larger.

Although an example of the conductor layer A (wiring layer 165A) is depicted in FIGS. 92A and 92B, this similarly applies also to the conductor layer B (wiring layer 165B).

With such a configuration, it is possible to achieve any of effects such as satisfying layout constraints of wires, further improving the degree of freedom of designing of the wiring layouts, further ameliorating inductive noise, further ameliorating voltage drops, and the like.

Although a particular distinction between whether the pads 1001 are electrodes (Vdd electrodes) connected to a positive power supply or electrodes (Vss electrodes) connected to GND or a negative power supply, for example, is not made in FIGS. 92A and 92B, the arrangement of the pads 1001 in a case in which such a distinction is made is explained hereinbelow.

<Fourth Arrangement Example of Pads>

Figure 93A:
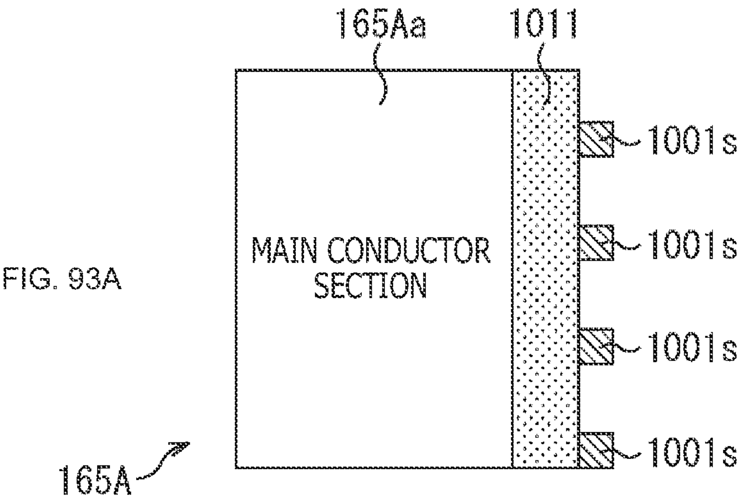
FIGS. 93A, 93B, and 93C are plan views depicting a fourth arrangement example of pads.
Figure 93B:
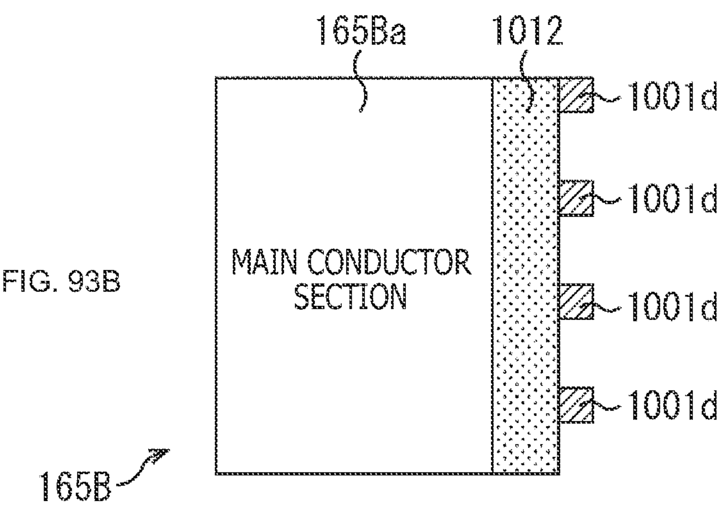
Figure 93C:
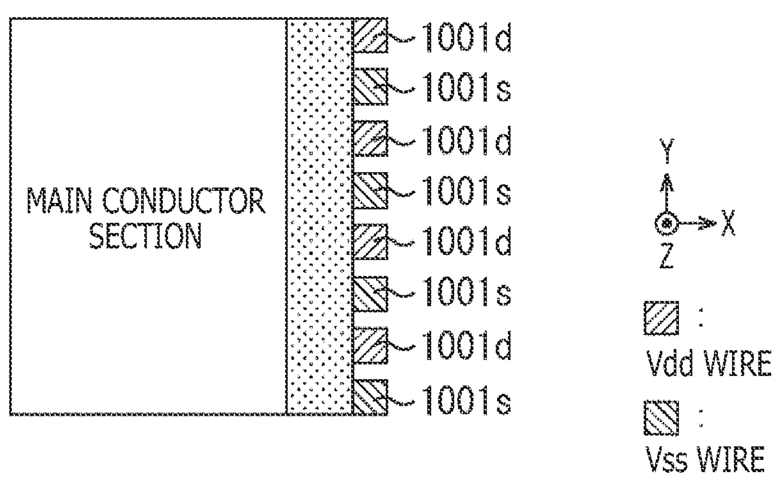

FIGS. 93A, 93B, and 93C depict a fourth arrangement example of pads.

FIG. 93A is a plan view depicting an arrangement example of the conductor layer A (wiring layer 165A) and pads 1001*s* connected to the conductor layer A.

FIG. 93B is a plan view depicting an arrangement example of the conductor layer B (wiring layer 165B) and pads 1001*d* connected to the conductor layer B.

FIG. 93C is a plan view of the stacked state of the conductor layers A and B depicted in in FIGS. 93A and 93B, respectively, and the pads 1001*s* and pads 1001*d* depicted in in FIGS. 93A and 93B, respectively.

In FIGS. 93A, 93B, and 93C, the pads 1001*s* represent pads 1001 to be supplied with GND or a negative power supply (Vss), for example, and the pads 1001*d* represent pads 1001 to be supplied with a positive power supply (Vdd), for example.

As depicted in FIG. 93A, one predetermined edge of the rectangular main conductor section 165Aa is connected with multiple pads 1001*s* at predetermined intervals via a conductor 1011 with a shape including, if desired, a predetermined repetition pattern. For example, each pad 1001*s* may include the lead conductor section 165Ab as in the twenty-seventh configuration example depicted in FIG. 89A, 89B, and 89C, or the conductor 1011 may include the lead conductor section 165Ab. In addition, in a case in which the pads 1001*s* are the lead conductor sections 165Ab, the conductor 1011 may be omitted or may not be omitted.

As depicted in FIG. 93B, one predetermined edge that belongs to the rectangular main conductor section 165Ba and is the counterpart of the edge along which the pads 1001*s* are arranged on the conductor layer A is connected with multiple pads 1001*d* at predetermined intervals via a conductor 1012 with a shape including, if desired, a predetermined repetition pattern. For example, each pad 1001*d* may include the lead conductor section 165Bb as in the twenty-seventh configuration example depicted in FIG. 89A, 89B, and 89C, or the conductor 1012 may include the lead conductor section 165Bb. In addition, in a case in which the pads 1001*d* are the lead conductor sections 165Bb, the conductor 1012 may be omitted or may not be omitted.

As depicted in FIG. 93C, in the stacked state of the conductor layers A and B, the pads 1001*s* and the pads 1001*d* are arranged alternately in the Y direction. In this case, it is possible to effectively offset magnetic fields generated from the conductor layers A and B and induced electromotive forces based on the magnetic fields as has been explained with reference to FIGS. 42A, 42B, 42C, 42D, 442E, 43A, 43B, 43C, 43D, 44A, 44B, 44C, 44D, and 44E, and so inductive noise can be ameliorated further. It should be noted however that because this arrangement is not symmetric in the Y direction, in a case in which pads 1001 are arranged over a wide range, that is, in a case in which the main conductor section 165Aa or 165Ba, the lead conductor section 165Ab or 165Bb, or the conductor 1011 or 1012 is long in the array direction of the pads 1001 (longer in the Y direction than in the X direction in FIGS. 93A, 93B, and 93C), magnetic fields that cannot be offset fully remain and are accumulated as Victim conductor loops become large; as a result, induced electromotive forces increase, and inductive noise worsens in some possible cases.

<Fifth Arrangement Example of Pads>

Figure 94A:
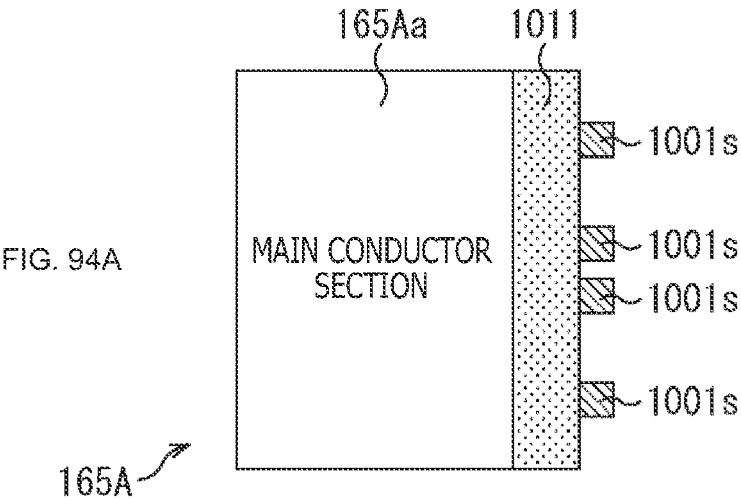
FIGS. 94A, 94B, and 94C are plan views depicting a fifth arrangement example of pads.
Figure 94B:
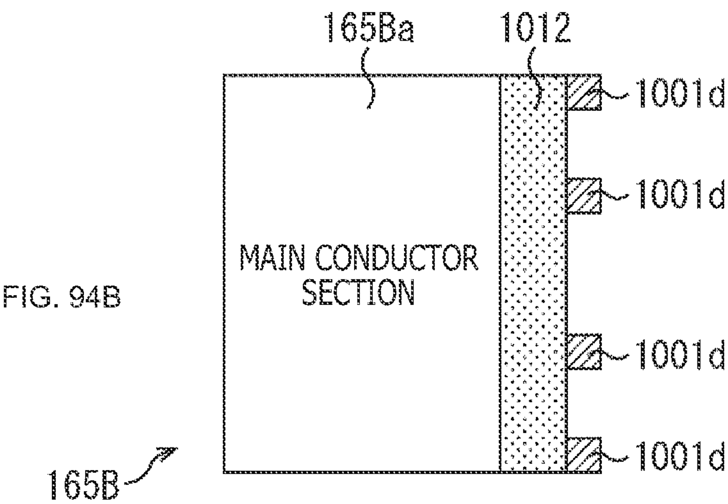
Figure 94C:
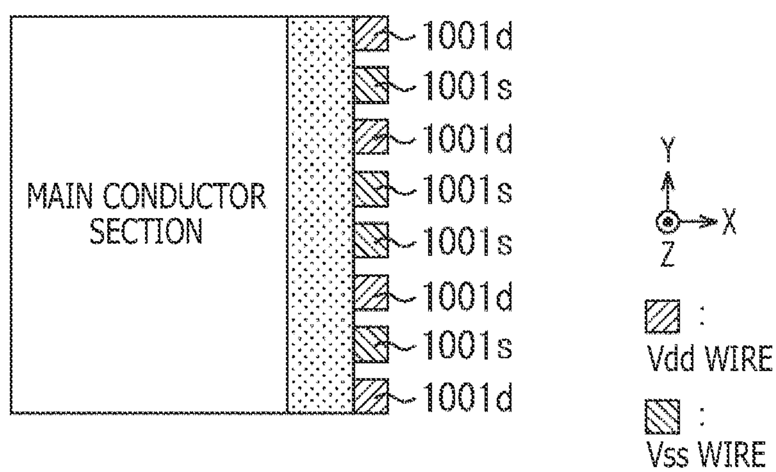

FIGS. 94A, 94B, and 94C depict a fifth arrangement example of pads.

FIG. 94A is a plan view depicting an arrangement example of the conductor layer A (wiring layer 165A), and pads 1001*s* connected to the conductor layer A.

FIG. 94B is a plan view depicting an arrangement example of the conductor layer B (wiring layer 165B), and pads 1001*d* connected to the conductor layer B.

FIG. 94C is a plan view of the stacked state of the conductor layers A and B depicted in in FIGS. 94A and 94B, respectively, and the pads 1001*s* and pads 1001*d* depicted in in FIGS. 94A and 94B, respectively.

In FIGS. 94A, 94B, and 94C, the pads 1001*s* represent pads 1001 to be supplied with GND or a negative power supply, for example, and the pads 1001*d* represent pads 1001 to be supplied with a positive power supply, for example.

As depicted in FIG. 94A, one predetermined edge of the rectangular main conductor section 165Aa is connected with multiple pads 1001*s* at predetermined intervals via the conductor 1011 with a shape including, if desired, a predetermined repetition pattern. Each pad 1001*s* may include the lead conductor section 165Ab, or the conductor 1011 may include the lead conductor section 165Ab. In addition, in a case in which the pads 1001*s* are the lead conductor sections 165Ab, the conductor 1011 may be omitted or may not be omitted.

As depicted in FIG. 94B, one predetermined edge that belongs to the rectangular main conductor section 165Ba and is the counterpart of the edge along which the pads 1001*s* are arranged on the conductor layer A is connected with multiple pads 1001*d* at predetermined intervals via the conductor 1012 with a shape including, if desired, a predetermined repetition pattern. Each pad 1001*d* may include the lead conductor section 165Bb, or the conductor 1012 may include the lead conductor section 165Bb. In addition, in a case in which the pads 1001*d* are the lead conductor sections 165Bb, the conductor 1012 may be omitted or may not be omitted.

As depicted in FIG. 94C, in the stacked state of the conductor layers A and B, the arrangement of the pads 1001*s* and the pads 1001*d* is a mirror-symmetric arrangement in which two sets of pads 1001, each set of which includes four pads 1001*s* and pads 1001*d* that are next to each other in the Y direction, are arranged sequentially in the Y direction, with one set of the pads 1001 being arranged in an order, and the other set of the pads 1001 being arranged in the reversed order. In this case, as compared with the alternating arrangement depicted in FIGS. 94A, 94B, and 94C, it is possible to more effectively offset magnetic fields generated from the conductor layers A and B, and induced electromotive forces based on the magnetic fields, and so inductive noise can be ameliorated further, depending on the layouts of elements other than the pads.

<Sixth Arrangement Example of Pads>

Figure 95A:
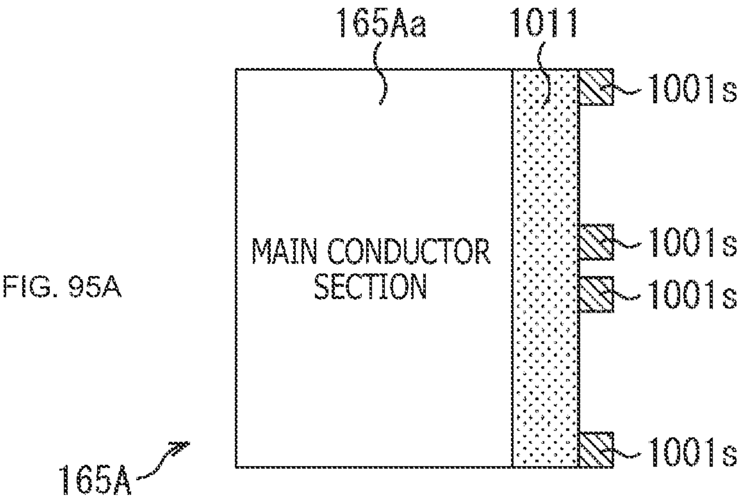
FIGS. 95A, 95B, and 95C are plan views depicting a sixth arrangement example of pads.
Figure 95B:
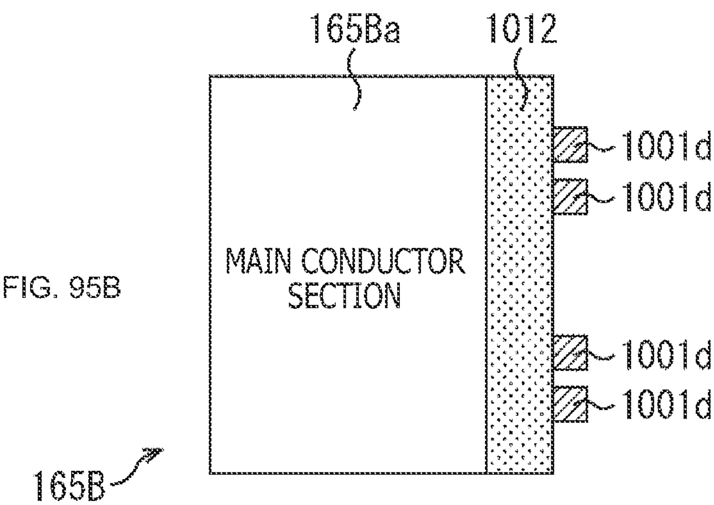
Figure 95C:
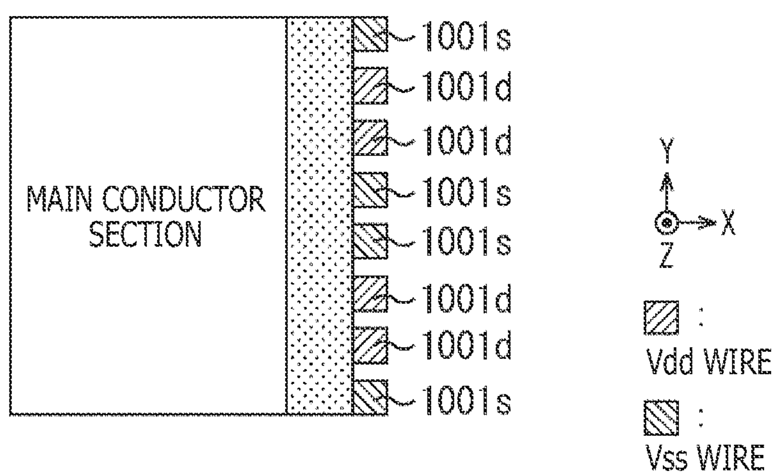

FIGS. 95A, 95B, and 95C depict a sixth arrangement example of pads.

FIG. 95A is a plan view depicting an arrangement example of the conductor layer A (wiring layer 165A), and pads 1001*s* connected to the conductor layer A.

FIG. 95B is a plan view depicting an arrangement example of the conductor layer B (wiring layer 165B), and pads 1001*d* connected to the conductor layer B.

FIG. 95C is a plan view of the stacked state of the conductor layers A and B depicted in in FIGS. 95A and 95B, respectively, and the pads 1001*s* and pads 1001*d* depicted in in FIGS. 95A and 95B, respectively.

In FIGS. 95A, 95B, and 95C, the pads 1001*s* represent pads 1001 to be supplied with GND or a negative power supply, for example, and the pads 1001*d* represent pads 1001 to be supplied with a positive power supply, for example.

As depicted in FIG. 95A, one predetermined edge of the rectangular main conductor section 165Aa is connected with multiple pads 1001*s* at predetermined intervals via the conductor 1011 with a shape including, if desired, a predetermined repetition pattern. Each pad 1001*s* may include the lead conductor section 165Ab, or the conductor 1011 may include the lead conductor section 165Ab. In addition, in a case in which the pads 1001*s* are the lead conductor sections 165Ab, the conductor 1011 may be omitted or may not be omitted.

As depicted in FIG. 95B, one predetermined edge that belongs to the rectangular main conductor section 165Ba and is the counterpart of the edge along which the pads 1001*s* are arranged on the conductor layer A is connected with multiple pads 1001*d* at predetermined intervals via the conductor 1012 with a shape including, if desired, a predetermined repetition pattern. Each pad 1001*d* may include the lead conductor section 165Bb, or the conductor 1012 may include the lead conductor section 165Bb. In addition, in a case in which the pads 1001*d* are the lead conductor sections 165Bb, the conductor 1012 may be omitted or may not be omitted.

As depicted in FIG. 95C, in the stacked state of the conductor layers A and B, the arrangement of the pads 1001*s* and the pads 1001*d* is a mirror-symmetric arrangement in which two sets of pads 1001, each set of which includes four pads 1001*s* and pads 1001*d* that are next to each other in the Y direction, are arranged sequentially in the Y direction, with one set of the pads 1001 being arranged in an order, and the other set of the pads 1001 being arranged in the reversed order. Furthermore, four pads 1001*s* and pads 1001*d* included in each set also are arranged in a mirror-symmetric arrangement in which one set of two pads 1001 is arranged on one side of the center line of the four pads 1001*s* and pads 1001*d* in the Y direction in a reversed order in the Y direction as compared to the other set of two pads 1001 arranged on the other side of the center line of the four pads 1001*s* and pads 1001*d* in the Y direction. In the case of the configuration with the twofold mirror-symmetric arrangement in such a manner, as compared with the configuration with the onefold mirror-symmetric arrangement depicted in FIGS. 94A, 94B, and 94C, the range within which residual magnetic fields are accumulated is narrow. Accordingly, induced electromotive forces are offset more effectively, and inductive noise can be ameliorated further, depending on the layouts of elements other than the pads.

<Seventh Arrangement Example of Pads>

Figure 96A:
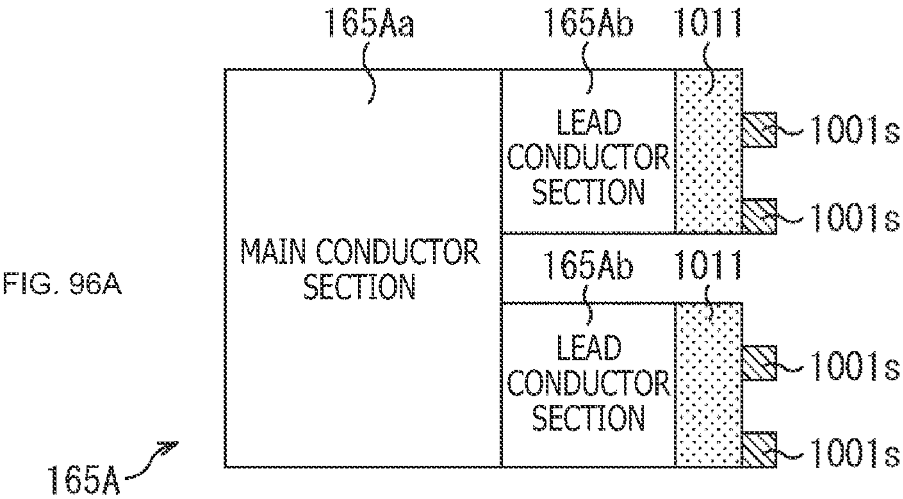
FIGS. 96A, 96B, and 96C are plan views depicting a seventh arrangement example of pads.
Figure 96B:
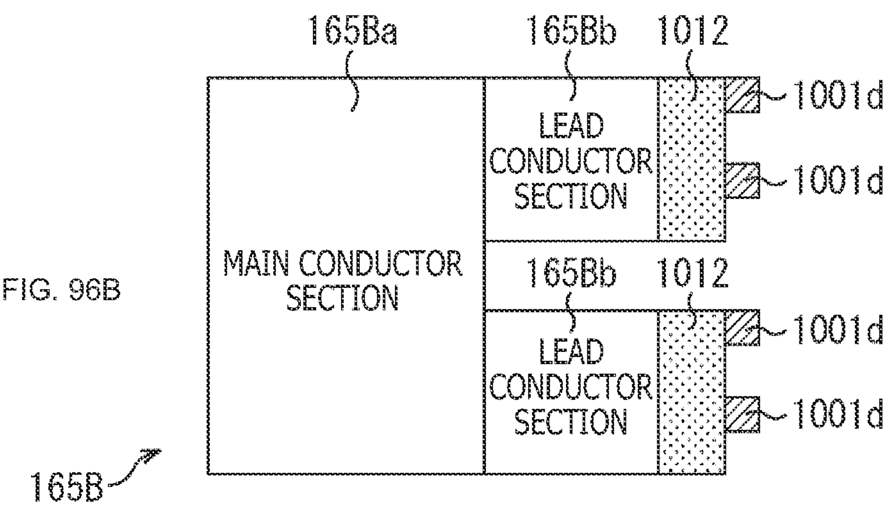
Figure 96C:
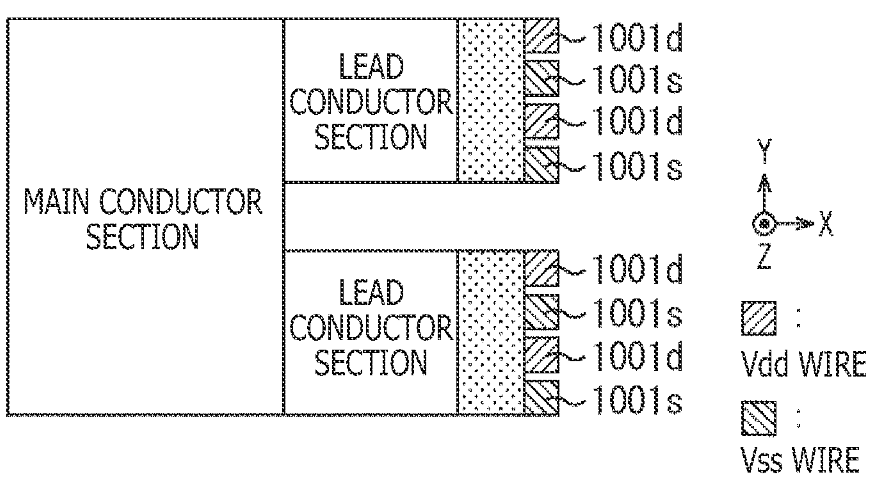

FIGS. 96A, 96B, and 96C depict a seventh arrangement example of pads.

FIG. 96A is a plan view depicting an arrangement example of the conductor layer A (wiring layer 165A), and pads 1001*s* connected to the conductor layer A.

FIG. 96B is a plan view depicting an arrangement example of the conductor layer B (wiring layer 165B), and pads 1001*d* connected to the conductor layer B.

FIG. 96C is a plan view of the stacked state of the conductor layers A and B depicted in in FIGS. 96A and 96B, respectively, and the pads 1001*s* and pads 1001*d* depicted in in FIGS. 96A and 96B, respectively.

In FIGS. 96A, 96B, and 96C, the pads 1001*s* represent pads 1001 to be supplied with GND or a negative power supply, for example, and the pads 1001*d* represent pads 1001 to be supplied with a positive power supply, for example.

As depicted in FIG. 96A, one predetermined edge of the rectangular main conductor section 165Aa is connected with multiple lead conductor sections 165Ab, and an outer circumferential section of each lead conductor section 165Ab is connected with multiple pads 1001*s* at predetermined intervals via a conductor 1011 with a shape including, if desired, a predetermined repetition pattern. Each conductor 1011 may be omitted or may not be omitted. In addition, each conductor 1011 may be located between the main conductor section 165Aa and a lead conductor section 165Ab.

As depicted in FIG. 96B, one predetermined edge of the rectangular main conductor section 165Ba is connected with multiple lead conductor sections 165Bb, and an outer circumferential section of each lead conductor section 165Bb is connected with multiple pads 1001*d* at predetermined intervals via a conductor 1012 with a shape including, if desired, a predetermined repetition pattern. Each conductor 1012 may be omitted or may not be omitted. In addition, each conductor 1012 may be located between the main conductor section 165Ba and a lead conductor section 165Bb.

As depicted in FIG. 96C, in the stacked state of the conductor layers A and B, the pads 1001*s* and the pads 1001*d* are arranged alternately in the Y direction. In this case, it is possible to effectively offset magnetic fields generated from the conductor layers A and B, and induced electromotive forces based on the magnetic fields, and so inductive noise can be ameliorated further. It should be noted however that because this arrangement is not symmetric in the Y direction, in a case in which pads 1001 are arranged over a wide range, that is, in a case in which the main conductor section 165Aa or 165Ba, the lead conductor sections 165Ab or 165Bb, or the conductors 1011 or 1012 is/are long in the array direction of the pads 1001 (longer in the Y direction than in the X direction in FIGS. 96A, 96B, and 96C), magnetic fields that cannot be offset fully remain and are accumulated as Victim conductor loops become large; as a result, induced electromotive forces increase, and inductive noise worsens, in some possible cases.

<Eighth Arrangement Example of Pads>

Figure 97A:
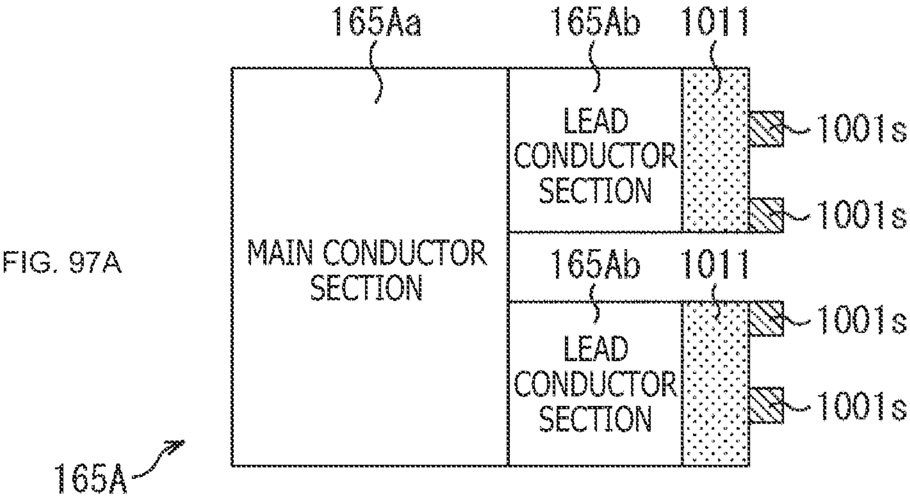
FIGS. 97A, 97B, and 97C are plan views depicting an eighth arrangement example of pads.
Figure 97B:
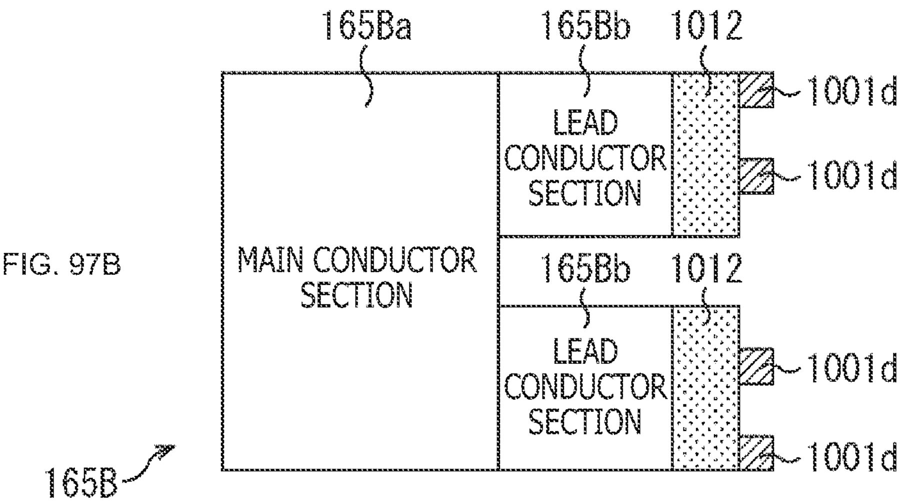
Figure 97C:
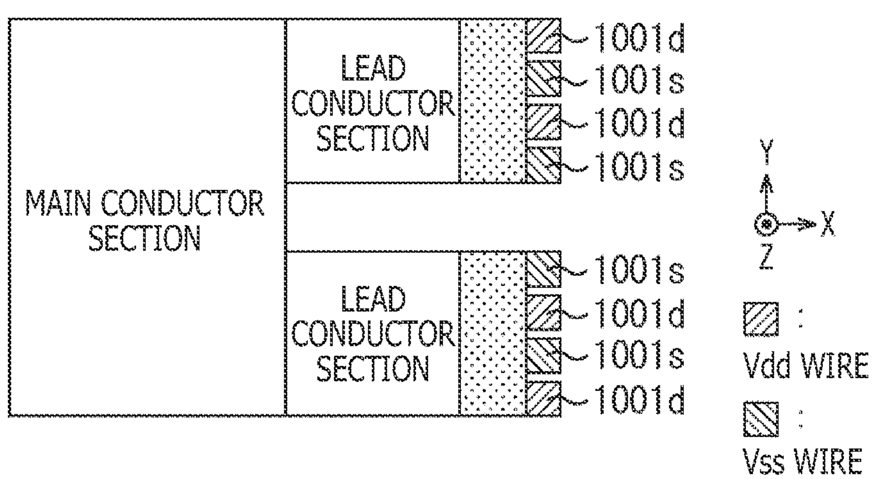

FIGS. 97A, 97B, and 97C depict an eighth arrangement example of pads.

FIG. 97A is a plan view depicting an arrangement example of the conductor layer A (wiring layer 165A), and pads 1001*s* connected to the conductor layer A.

FIG. 97B is a plan view depicting an arrangement example of the conductor layer B (wiring layer 165B), and pads 1001*d* connected to the conductor layer B.

FIG. 97C is a plan view of the stacked state of the conductor layers A and B depicted in in FIGS. 97A and 97B, respectively, and the pads 1001*s* and pads 1001*d* depicted in in FIGS. 97A and 97B, respectively.

In FIGS. 97A, 97B, and 97C, the pads 1001*s* represent pads 1001 to be supplied with GND or a negative power supply, for example, and the pads 1001*d* represent pads 1001 to be supplied with a positive power supply, for example.

As depicted in FIG. 97A, one predetermined edge of the rectangular main conductor section 165Aa is connected with multiple lead conductor sections 165Ab, and an outer circumferential section of each lead conductor section 165Ab is connected with multiple pads 1001*s* at predetermined intervals via a conductor 1011 with a shape including, if desired, a predetermined repetition pattern. Each conductor 1011 may be omitted or may not be omitted. In addition, each conductor 1011 may be located between the main conductor section 165Aa and a lead conductor section 165Ab.

As depicted in FIG. 97B, one predetermined edge of the rectangular main conductor section 165Ba is connected with multiple lead conductor sections 165Bb, and an outer circumferential section of each lead conductor section 165Bb is connected with multiple pads 1001*d* at predetermined intervals via a conductor 1012 with a shape including, if desired, a predetermined repetition pattern. Each conductor 1012 may be omitted or may not be omitted. In addition, each conductor 1012 may be located between the main conductor section 165Ba and a lead conductor section 165Bb.

As depicted in FIG. 97C, in the stacked state of the conductor layers A and B, the arrangement of the pads 1001*s* and the pads 1001*d* is a mirror-symmetric arrangement in which two sets of pads 1001, each set of which includes four pads 1001*s* and pads 1001*d* that are next to each other in the Y direction, are arranged sequentially in the Y direction, with one set of the pads 1001 being arranged in an order, and the other set of the pads 1001 being arranged in the reversed order. In this case, as compared with the alternating arrangement depicted in FIGS. 96A, 96B, and 96C, it is possible to more effectively offset magnetic fields generated from the conductor layers A and B, and induced electromotive forces based on the magnetic fields, and so inductive noise can be ameliorated further, depending on the layouts of elements other than the pads.

<Ninth Arrangement Example of Pads>

Figure 98A:
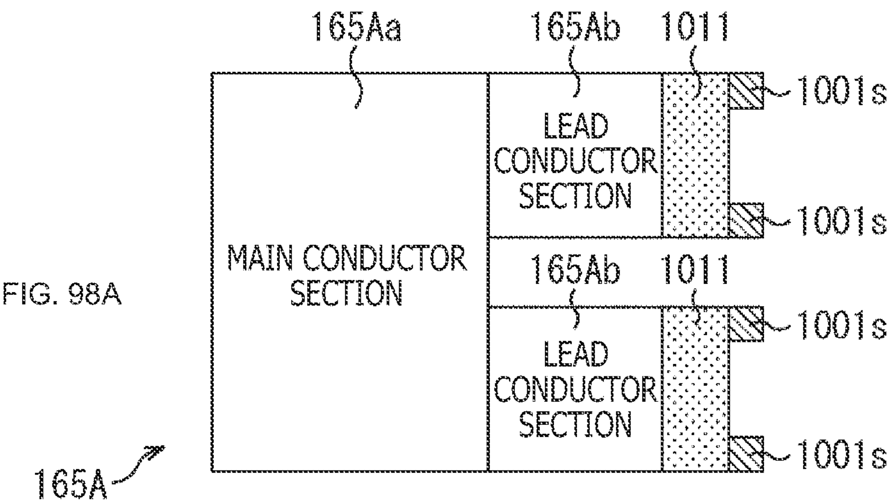
FIGS. 98A, 98B, and 98C are plan views depicting a ninth arrangement example of pads.
Figure 98B:
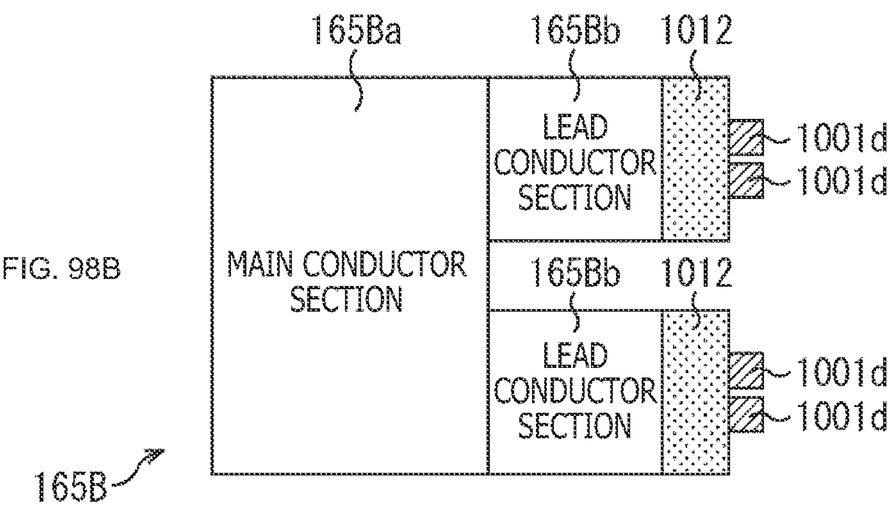
Figure 98C:
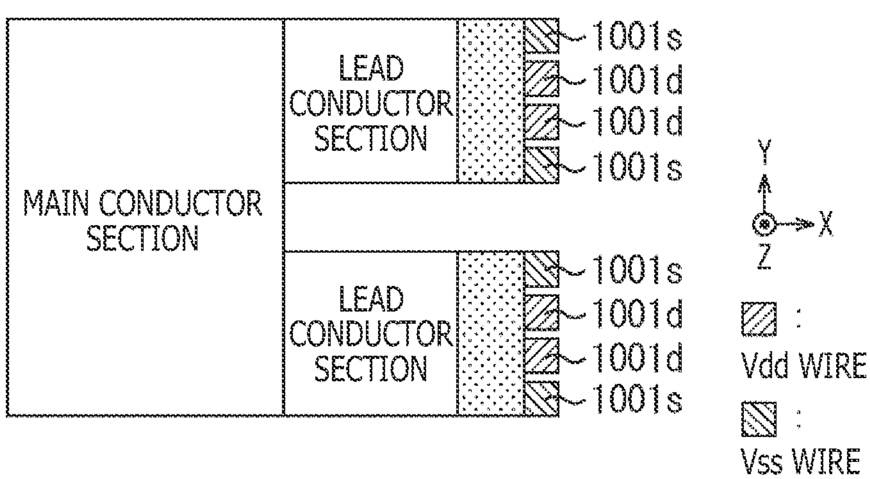

FIGS. 98A, 98B, and 98C depict a ninth arrangement example of pads.

FIG. 98A is a plan view depicting an arrangement example of the conductor layer A (wiring layer 165A), and pads 1001*s* connected to the conductor layer A.

FIG. 98B is a plan view depicting an arrangement example of the conductor layer B (wiring layer 165B), and pads 1001*d* connected to the conductor layer B.

FIG. 98C is a plan view of the stacked state of the conductor layers A and B depicted in in FIGS. 98A and 98B, respectively, and the pads 1001*s* and pads 1001*d* depicted in FIGS. 98A and 98B, respectively.

In FIGS. 98A, 98B, and 98C, the pads 1001*s* represent pads 1001 to be supplied with GND or a negative power supply, for example, and the pads 1001*d* represent pads 1001 to be supplied with a positive power supply, for example.

As depicted in FIG. 98A, one predetermined edge of the rectangular main conductor section 165Aa is connected with multiple lead conductor sections 165Ab, and an outer circumferential section of each lead conductor section 165Ab is connected with multiple pads 1001*s* at predetermined intervals via a conductor 1011 with a shape including, if desired, a predetermined repetition pattern. Each conductor 1011 may be omitted or may not be omitted. In addition, each conductor 1011 may be located between the main conductor section 165Aa and a lead conductor section 165Ab.

As depicted in FIG. 98B, one predetermined edge of the rectangular main conductor section 165Ba is connected with multiple lead conductor sections 165Bb, and an outer circumferential section of each lead conductor section 165Bb is connected with multiple pads 1001*d* at predetermined intervals via a conductor 1012 with a shape including, if desired, a predetermined repetition pattern. Each conductor 1012 may be omitted or may not be omitted. In addition, each conductor 1012 may be located between the main conductor section 165Ba and a lead conductor section 165Bb.

As depicted in FIG. 98C, in the stacked state of the conductor layers A and B, the arrangement of the pads 1001*s* and the pads 1001*d* is a mirror-symmetric arrangement in which two sets of pads 1001, each set of which includes four pads 1001*s* and pads 1001*d* that are next to each other in the Y direction, are arranged sequentially in the Y direction, with one set of the pads 1001 being arranged in an order, and the other set of the pads 1001 being arranged in the reversed order. Furthermore, four pads 1001*s* and pads 1001*d* included in each set also are arranged in a mirror-symmetric arrangement in which one set of two pads 1001 is arranged on one side of the center line of the four pads 1001*s* and pads 1001*d* in the Y direction in the reversed order in the Y direction as compared to the other set of two pads 1001 arranged on the other side of the center line of the four pads 1001*s* and pads 1001*d* in the Y direction. In the case of the configuration with the twofold mirror-symmetric arrangement in such a manner, as compared with the configuration with the onefold mirror-symmetric arrangement depicted in FIGS. 97A, 97B, and 97C, the range within which residual magnetic fields are accumulated is narrow. Accordingly, induced electromotive forces are offset more effectively, and inductive noise can be ameliorated further, depending on the layouts of elements other than the pads.

<Tenth Arrangement Example of Pads>

Figure 99A:
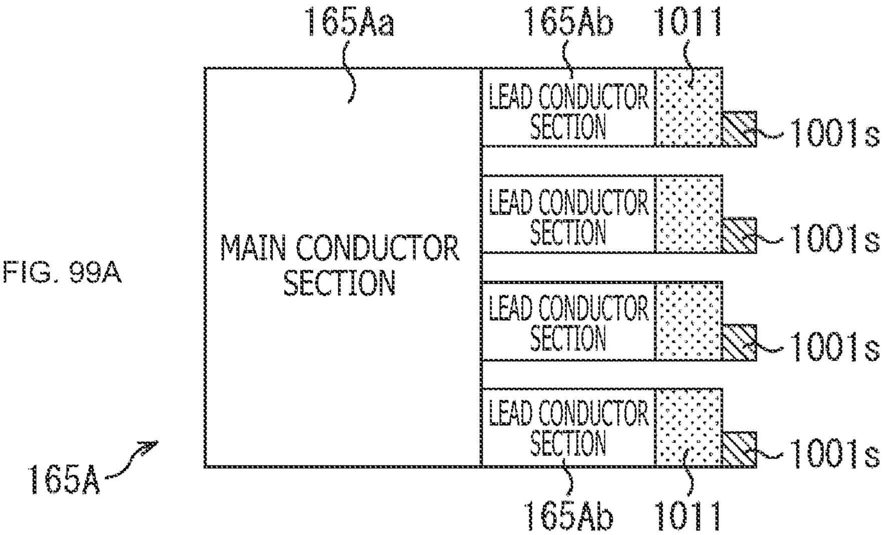
FIGS. 99A, 99B, and 99C are plan views depicting a tenth arrangement example of pads.
Figure 99B:
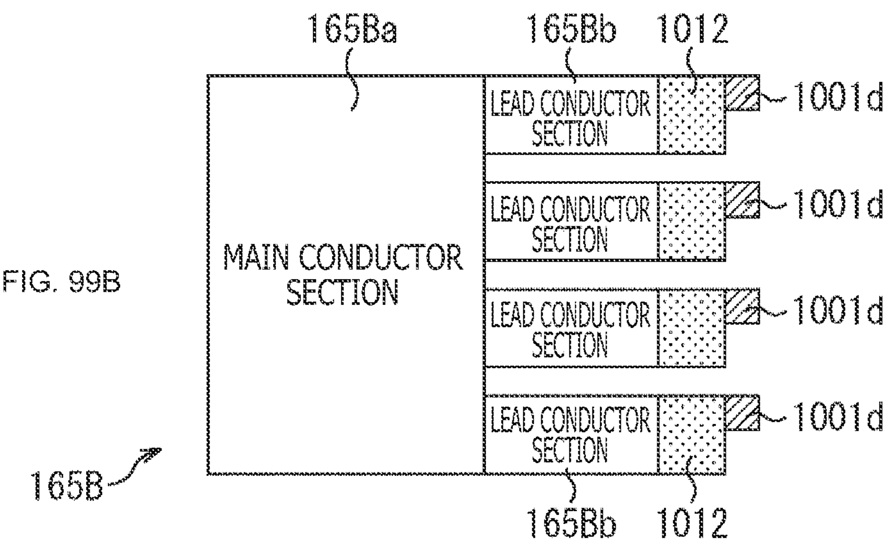
Figure 99C:
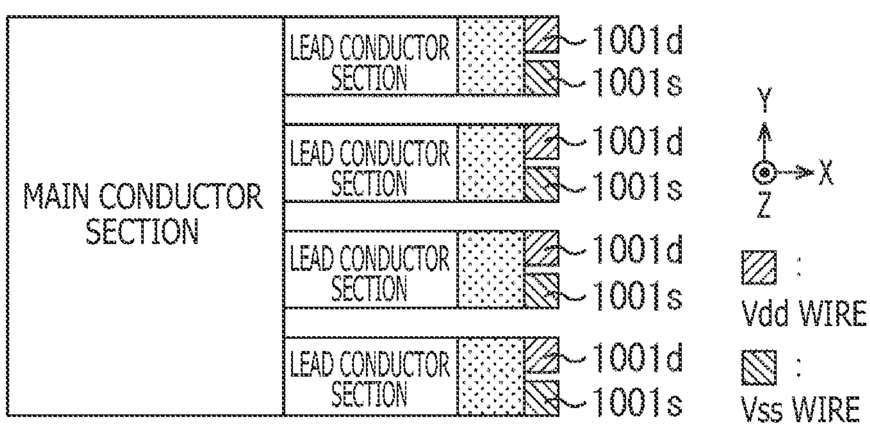

FIGS. 99A, 99B, and 99C depict a tenth arrangement example of pads.

FIG. 99A is a plan view depicting an arrangement example of the conductor layer A (wiring layer 165A), and pads 1001*s* connected to the conductor layer A.

FIG. 99B is a plan view depicting an arrangement example of the conductor layer B (wiring layer 165B), and pads 1001*d* connected to the conductor layer B.

FIG. 99C is a plan view of the stacked state of the conductor layers A and B depicted in in FIGS. 99A and 99B, respectively, and the pads 1001*s* and pads 1001*d* depicted in in FIGS. 99A and 99B, respectively.

In FIGS. 99A, 99B, and 99C, the pads 1001*s* represent pads 1001 to be supplied with GND or a negative power supply, for example, and the pads 1001*d* represent pads 1001 to be supplied with a positive power supply, for example.

As depicted in FIG. 99A, one predetermined edge of the rectangular main conductor section 165Aa is connected with multiple lead conductor sections 165Ab, and an outer circumferential section of each lead conductor section 165Ab is connected with one pad 1001*s* via a conductor 1011 with a shape including, if desired, a predetermined repetition pattern. Each conductor 1011 may be omitted or may not be omitted. In addition, each conductor 1011 may be located between the main conductor section 165Aa and a lead conductor section 165Ab.

As depicted in FIG. 99B, one predetermined edge of the rectangular main conductor section 165Ba is connected with multiple lead conductor sections 165Bb, and an outer circumferential section of each lead conductor section 165Bb is connected with one pad 1001*d* via a conductor 1012 with a shape including, if desired, a predetermined repetition pattern. Each conductor 1012 may be omitted or may not be omitted. In addition, each conductor 1012 may be located between the main conductor section 165Ba and a lead conductor section 165Bb.

As depicted in FIG. 99C, in the stacked state of the conductor layers A and B, the pads 1001*s* and the pads 1001*d* are arranged alternately in the Y direction. In this case, it is possible to effectively offset magnetic fields generated from the conductor layers A and B, and induced electromotive forces based on the magnetic fields, and so inductive noise can be ameliorated further. It should be noted however that because this arrangement is not symmetric in the Y direction, in a case in which pads 1001 are arranged over a wide range, that is, in a case in which the main conductor section 165Aa or 165Ba, the lead conductor sections 165Ab or 165Bb, or the conductors 1011 or 1012 is/are long in the array direction of the pads 1001 (longer in the Y direction than in the X direction in FIGS. 99A, 99B, and 99C), magnetic fields that cannot be offset fully remain and are accumulated as Victim conductor loops become large; as a result, induced electromotive forces increase, and inductive noise worsens, in some possible cases.

<Eleventh Arrangement Example of Pads

Figure 100A:
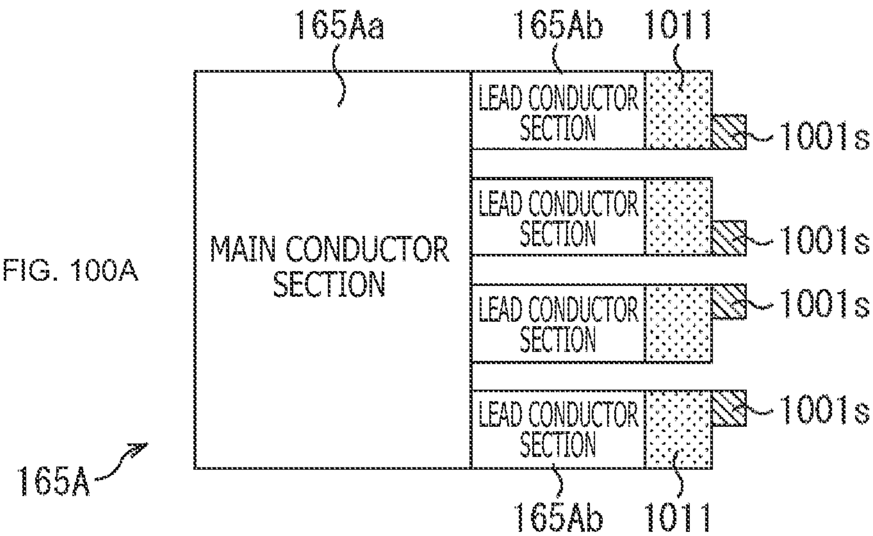
FIGS. 100A, 100B, and 100C are plan views depicting an eleventh arrangement example of pads.
Figure 100B:
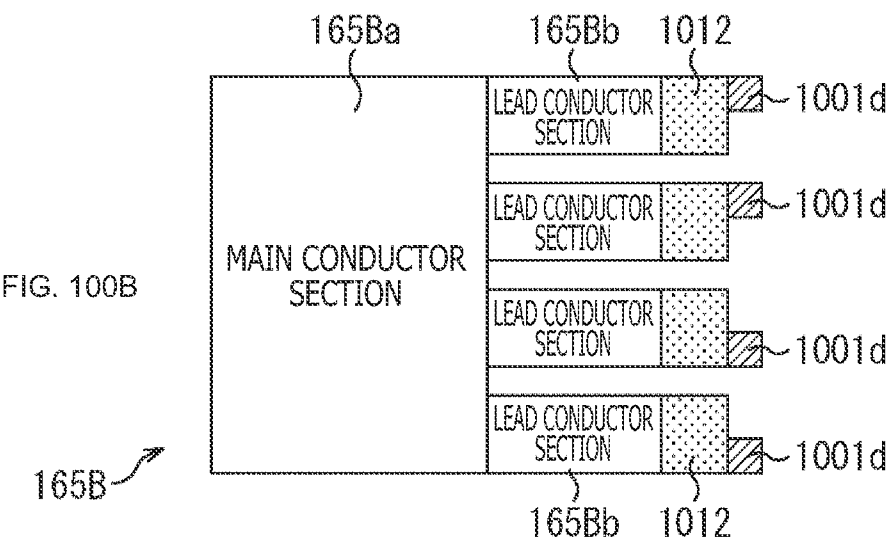
Figure 100C:
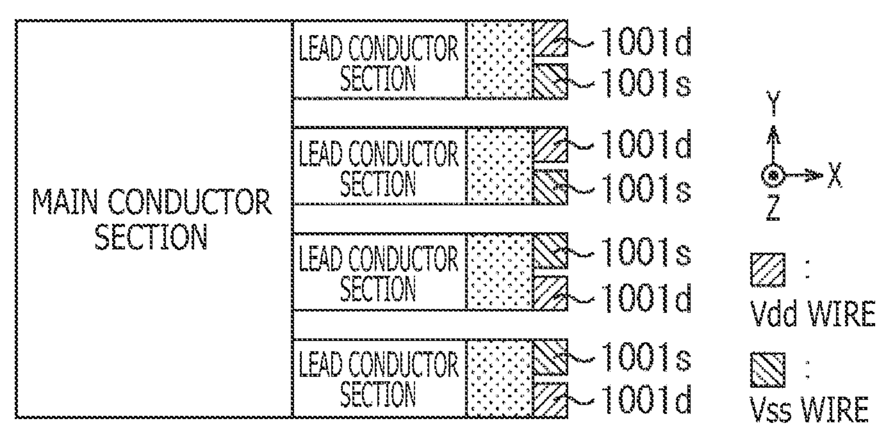

FIGS. 100A, 100B, and 100C depict an eleventh arrangement example of pads.

FIG. 100A is a plan view depicting an arrangement example of the conductor layer A (wiring layer 165A), and pads 1001*s* connected to the conductor layer A.

FIG. 100B is a plan view depicting an arrangement example of the conductor layer B (wiring layer 165B), and pads 1001*d* connected to the conductor layer B.

FIG. 100C is a plan view of the stacked state of the conductor layers A and B depicted in in FIGS. 100A and 100B, respectively, and the pads 1001*s* and pads 1001*d* depicted in in FIGS. 100A and 100B, respectively.

In FIGS. 100A, 100B, and 100C, the pads 1001*s* represent pads 1001 to be supplied with GND or a negative power supply, for example, and the pads 1001*d* represent pads 1001 to be supplied with a positive power supply, for example.

As depicted in FIG. 100A, one predetermined edge of the rectangular main conductor section 165Aa is connected with multiple lead conductor sections 165Ab, and an outer circumferential section of each lead conductor section 165Ab is connected with one pad 1001*s* via a conductor 1011 with a shape including, if desired, a predetermined repetition pattern. Each conductor 1011 may be omitted or may not be omitted. In addition, each conductor 1011 may be located between the main conductor section 165Aa and a lead conductor section 165Ab.

As depicted in FIG. 100B, one predetermined edge of the rectangular main conductor section 165Ba is connected with multiple lead conductor sections 165Bb, and an outer circumferential section of each lead conductor section 165Bb is connected with one pad 1001*d* via a conductor 1012 with a shape including, if desired, a predetermined repetition pattern. Each conductor 1012 may be omitted or may not be omitted. In addition, each conductor 1012 may be located between the main conductor section 165Ba and a lead conductor section 165Bb.

As depicted in FIG. 100C, in the stacked state of the conductor layers A and B, the arrangement of the pads 1001*s* and the pads 1001*d* is a mirror-symmetric arrangement in which two sets of pads 1001, each set of which includes four pads 1001*s* and pads 1001*d* that are next to each other in the Y direction, are arranged sequentially in the Y direction, with one set of the pads 1001 being arranged in an order, and the other set of the pads 1001 being arranged in the reversed order. In this case, as compared with the alternating arrangement depicted in FIGS. 99A, 99B, and 99C, it is possible to more effectively offset magnetic fields generated from the conductor layers A and B, and induced electromotive forces based on the magnetic fields, and so inductive noise can be ameliorated further, depending on the layouts of elements other than the pads.

<Twelfth Arrangement Example of Pads>

Figure 101A:
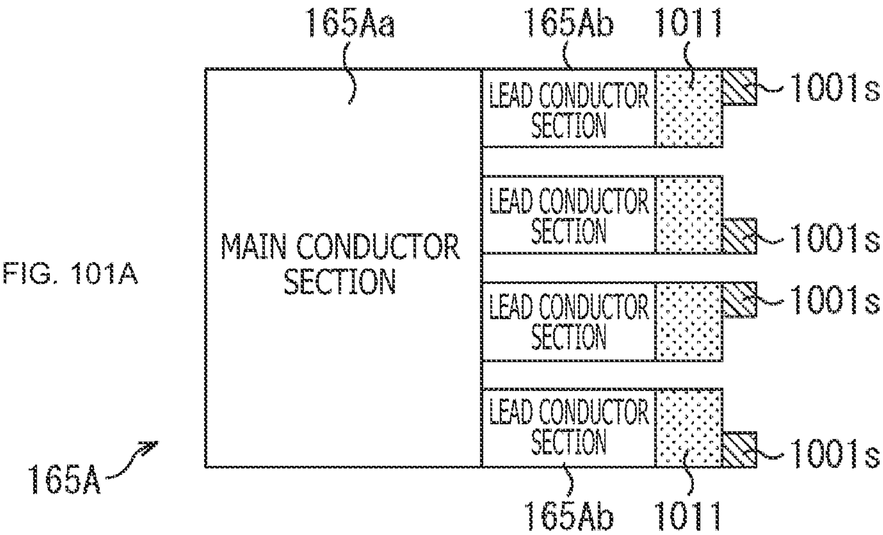
FIGS. 101A, 101B, and 101C are plan views depicting a twelfth arrangement example of pads.
Figure 101B:
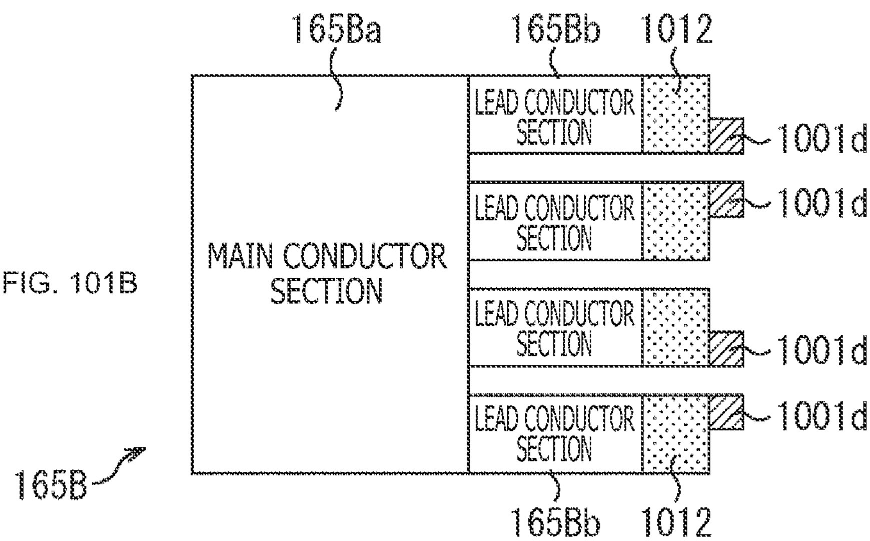
Figure 101C:
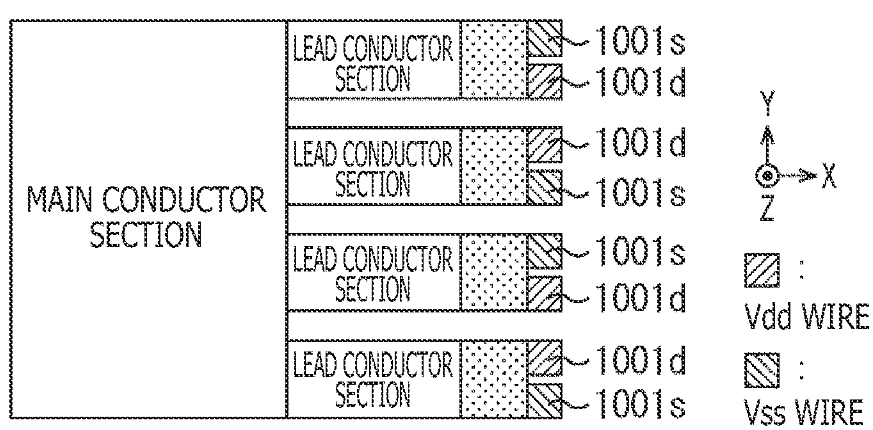

FIGS. 101A, 101B, and 101C depict a twelfth arrangement example of pads.

FIG. 101A is a plan view depicting an arrangement example of the conductor layer A (wiring layer 165A), and pads 1001*s* connected to the conductor layer A.

FIG. 101B is a plan view depicting an arrangement example of the conductor layer B (wiring layer 165B), and pads 1001*d* connected to the conductor layer B.

FIG. 101C is a plan view of the stacked state of the conductor layers A and B depicted in in FIGS. 101A and 101B, respectively, and the pads 1001*s* and pads 1001*d* depicted in in FIGS. 101A and 101B, respectively.

In FIGS. 101A, 101B, and 101C, the pads 1001*s* represent pads 1001 to be supplied with GND or a negative power supply, for example, and the pads 1001*d* represent pads 1001 to be supplied with a positive power supply, for example.

As depicted in FIG. 101A, one predetermined edge of the rectangular main conductor section 165Aa is connected with multiple lead conductor sections 165Ab, and an outer circumferential section of each lead conductor section 165Ab is connected with one pad 1001*s* via a conductor 1011 with a shape including, if desired, a predetermined repetition pattern. Each conductor 1011 may be omitted or may not be omitted. In addition, each conductor 1011 may be located between the main conductor section 165Aa and a lead conductor section 165Ab.

As depicted in FIG. 101B, one predetermined edge of the rectangular main conductor section 165Ba is connected with multiple lead conductor sections 165Bb, and an outer circumferential section of each lead conductor section 165Bb is connected with one pad 1001*d* via a conductor 1012 with a shape including, if desired, a predetermined repetition pattern. Each conductor 1012 may be omitted or may not be omitted. In addition, each conductor 1012 may be located between the main conductor section 165Ba and a lead conductor section 165Bb.

As depicted in FIG. 101C, in the stacked state of the conductor layers A and B, the arrangement of the pads 1001*s* and the pads 1001*d* is a mirror-symmetric arrangement in which two sets of pads 1001, each set of which includes four pads 1001*s* and pads 1001*d* that are next to each other in the Y direction, are arranged sequentially in the Y direction, with one set of the pads 1001 being arranged in an order, and the other set of the pads 1001 being arranged in the reversed order. Furthermore, four pads 1001*s* and pads 1001*d* included in each set also are arranged in a mirror-symmetric arrangement in which one set of two pads 1001 is arranged on one side of the center line of the four pads 1001*s* and pads 1001*d* in the Y direction in the reversed order in the Y direction as compared to the other set of two pads 1001 arranged on the other side of the center line of the four pads 1001*s* and pads 1001*d* in the Y direction. In the case of the configuration with the twofold mirror-symmetric arrangement in such a manner, as compared with the configuration with the onefold mirror-symmetric arrangement depicted in FIGS. 100A, 100B, and 100C, the range within which residual magnetic fields are accumulated is narrow. Accordingly, induced electromotive forces are offset more effectively, and inductive noise can be ameliorated further, depending on the layouts of elements other than the pads.

<Thirteenth Arrangement Example of Pads>

Figure 102A:
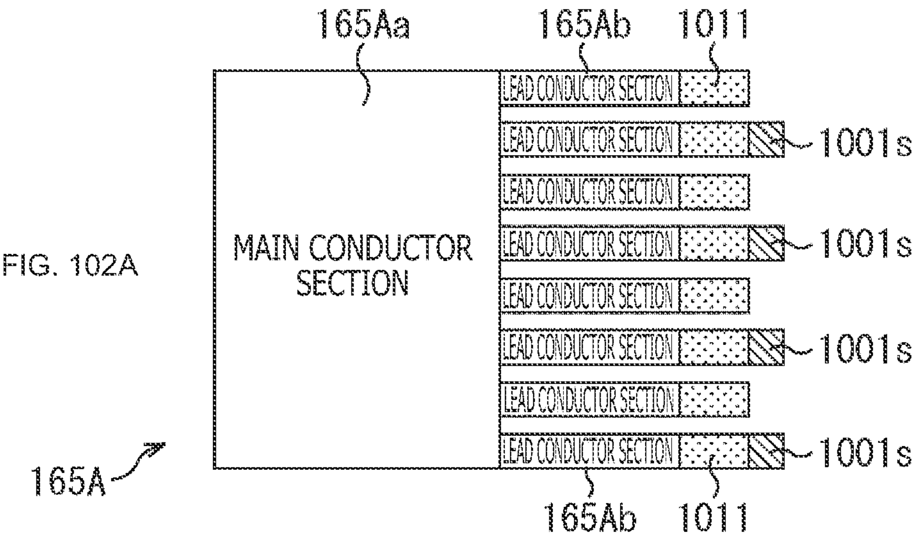
FIGS. 102A, 102B, and 102C are plan views depicting a thirteenth arrangement example of pads.
Figure 102B:
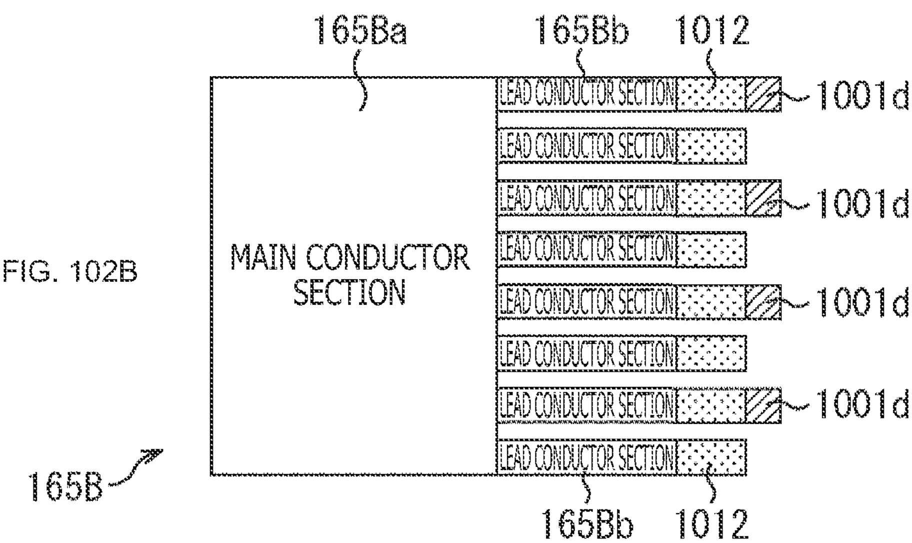
Figure 102C:
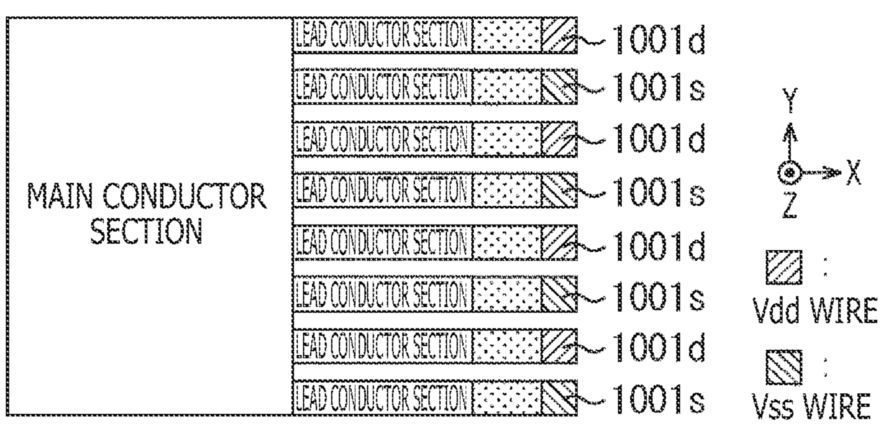

FIGS. 102A, 102B, and 102C depict a thirteenth arrangement example of pads.

FIG. 102A is a plan view depicting an arrangement example of the conductor layer A (wiring layer 165A), and pads 1001*s* connected to the conductor layer A.

FIG. 102B is a plan view depicting an arrangement example of the conductor layer B (wiring layer 165B), and pads 1001*d* connected to the conductor layer B.

FIG. 102C is a plan view of the stacked state of the conductor layers A and B depicted in in FIGS. 102A and 102B, respectively, and the pads 1001*s* and pads 1001*d* depicted in in FIGS. 102A and 102B, respectively.

In FIGS. 102A, 102B, and 102C, the pads 1001*s* represent pads 1001 to be supplied with GND or a negative power supply, for example, and the pads 1001*d* represent pads 1001 to be supplied with a positive power supply, for example.

As depicted in FIG. 102A, one predetermined edge of the rectangular main conductor section 165Aa is connected with multiple lead conductor sections 165Ab, and an outer circumferential section of each lead conductor section 165Ab is connected with a conductor 1011 with a shape including, if desired, a predetermined repetition pattern. In addition, each of some of the multiple lead conductor sections 165Ab is connected with one pad 1001*s* via a conductor 1011. Each conductor 1011 may be omitted or may not be omitted. In addition, each conductor 1011 may be located between the main conductor section 165Aa and a lead conductor section 165Ab.

As depicted in FIG. 102B, one predetermined edge of the rectangular main conductor section 165Ba is connected with multiple lead conductor sections 165Bb, and an outer circumferential section of each lead conductor section 165Bb is connected with a conductor 1012 with a shape including, if desired, a predetermined repetition pattern. In addition, one pad 1001*d* is arranged in each of some of the multiple lead conductor sections 165Bb via a conductor 1012. Each conductor 1012 may be omitted or may not be omitted. In addition, each conductor 1012 may be located between the main conductor section 165Ba and a lead conductor section 165Bb.

As depicted in FIG. 102C, in the stacked state of the conductor layers A and B, the pads 1001*s* and the pads 1001*d* are arranged alternately in the Y direction. In this case, it is possible to effectively offset magnetic fields generated from the conductor layers A and B, and induced electromotive forces based on the magnetic fields, and so inductive noise can be ameliorated further. It should be noted however that because this arrangement is not symmetric in the Y direction, in a case in which pads 1001 are arranged over a wide range, that is, in a case in which the main conductor section 165Aa or 165Ba, the lead conductor sections 165Ab or 165Bb, or the conductors 1011 or 1012 is/are long in the array direction of the pads 1001 (longer in the Y direction than in the X direction in FIGS. 102A, 102B, and 102C), magnetic fields that cannot be offset fully remain and are accumulated as Victim conductor loops become large; as a result, induced electromotive forces increase, and inductive noise worsens, in some possible cases.

<Fourteenth Arrangement Example of Pads>

Figure 103A:
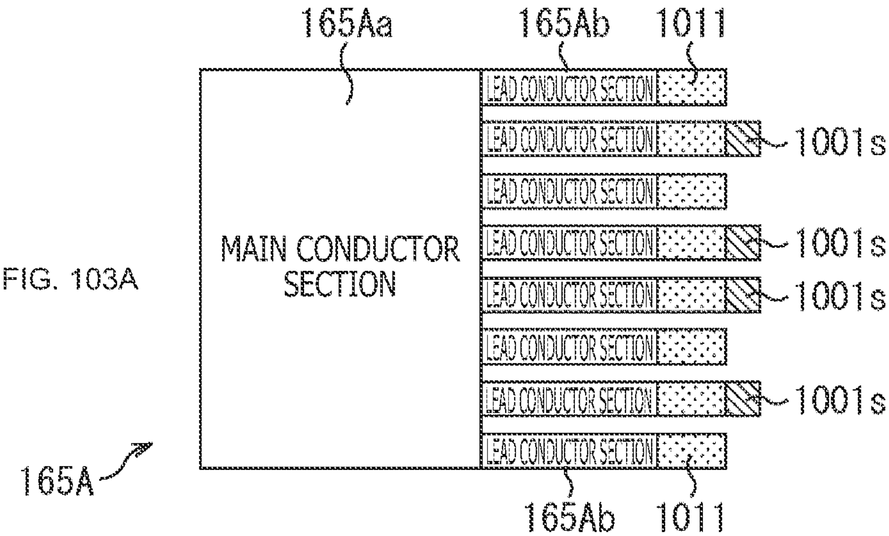
FIGS. 103A, 103B, and 103C are plan views depicting a fourteenth arrangement example of pads.
Figure 103B:
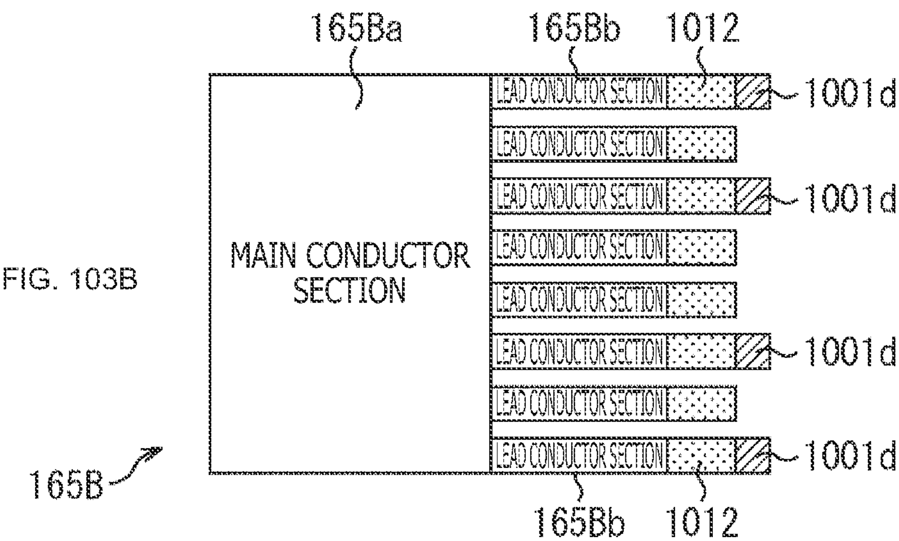
Figure 103C:
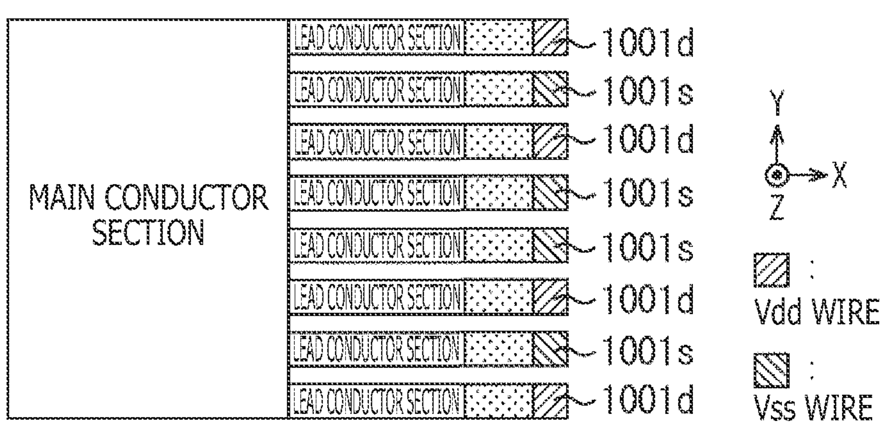

FIGS. 103A, 103B, and 103C depict a fourteenth arrangement example of pads.

FIG. 103A is a plan view depicting an arrangement example of the conductor layer A (wiring layer 165A), and pads 1001*s* connected to the conductor layer A.

FIG. 103B is a plan view depicting an arrangement example of the conductor layer B (wiring layer 165B), and pads 1001*d* connected to the conductor layer B.

FIG. 103C is a plan view of the stacked state of the conductor layers A and B depicted in in FIGS. 103A and 103B, respectively, and the pads 1001*s* and pads 1001*d* depicted in in FIGS. 103A and 103B, respectively.

In FIGS. 103A, 103B, and 103C, the pads 1001*s* represent pads 1001 to be supplied with GND or a negative power supply, for example, and the pads 1001*d* represent pads 1001 to be supplied with a positive power supply, for example.

As depicted in FIG. 103A, one predetermined edge of the rectangular main conductor section 165Aa is connected with multiple lead conductor sections 165Ab, and an outer circumferential section of each lead conductor section 165Ab is connected with a conductor 1011 with a shape including, if desired, a predetermined repetition pattern. In addition, each of some of the multiple lead conductor sections 165Ab is connected with one pad 1001*s* via a conductor 1011. Each conductor 1011 may be omitted or may not be omitted. In addition, each conductor 1011 may be located between the main conductor section 165Aa and a lead conductor section 165Ab.

As depicted in FIG. 103B, one predetermined edge of the rectangular main conductor section 165Ba is connected with multiple lead conductor sections 165Bb, and an outer circumferential section of each lead conductor section 165Bb is connected with a conductor 1012 with a shape including, if desired, a predetermined repetition pattern. In addition, one pad 1001*d* is arranged in each of some of the multiple lead conductor sections 165Bb via a conductor 1012. Each conductor 1012 may be omitted or may not be omitted. In addition, each conductor 1012 may be located between the main conductor section 165Ba and a lead conductor section 165Bb.

As depicted in FIG. 103C, in the stacked state of the conductor layers A and B, the arrangement of the pads 1001*s* and the pads 1001*d* is a mirror-symmetric arrangement in which two sets of pads 1001, each set of which includes four pads 1001*s* and pads 1001*d* that are next to each other in the Y direction, are arranged sequentially in the Y direction, with one set of the pads 1001 being arranged in an order, and the other set of the pads 1001 being arranged in the reversed order. In this case, as compared with the alternating arrangement depicted in FIGS. 102A, 102B, and 102C, it is possible to more effectively offset magnetic fields generated from the conductor layers A and B, and induced electromotive forces based on the magnetic fields, and so inductive noise can be ameliorated further, depending on the layouts of elements other than the pads.

<Fifteenth Arrangement Example of Pads>

Figure 104A:
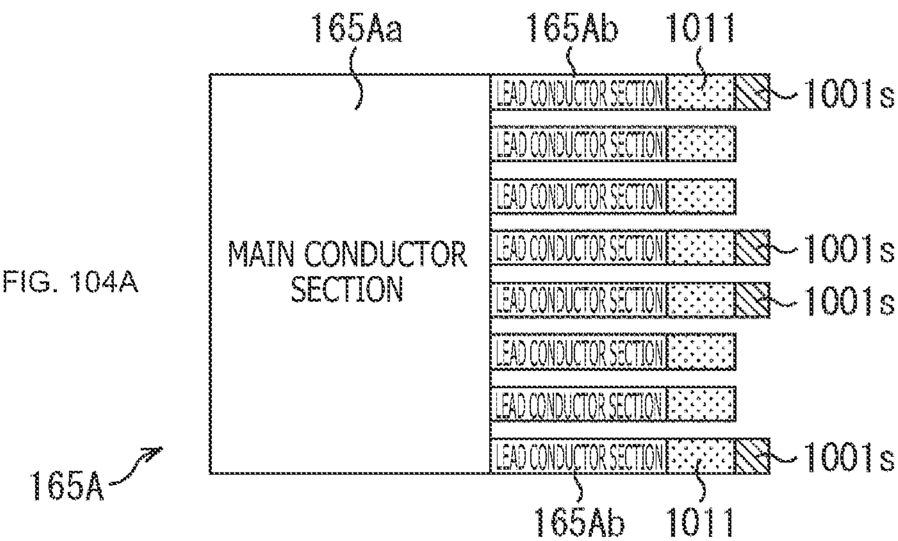
FIGS. 104A, 104B, and 104C are plan views depicting a fifteenth arrangement example of pads.
Figure 104B:
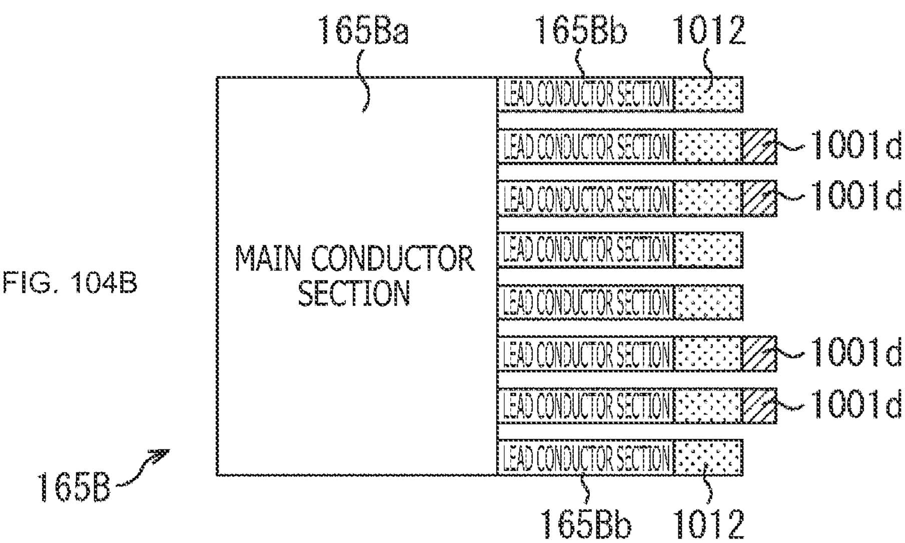
Figure 104C:
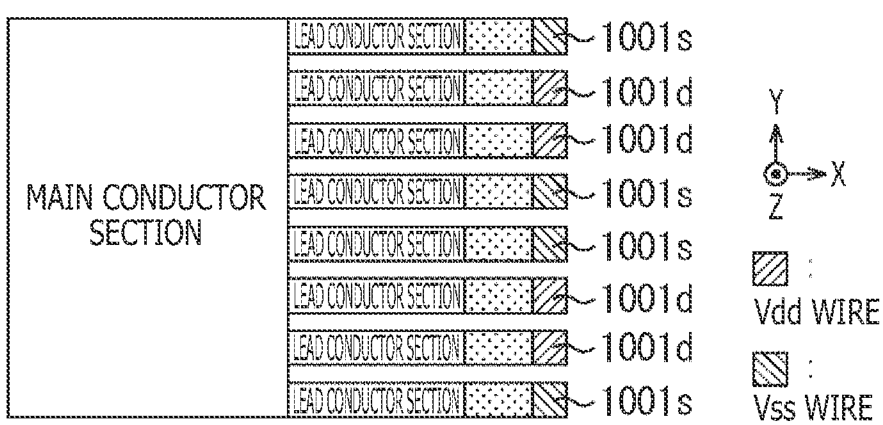

FIGS. 104A, 104B, and 104C depict a fifteenth arrangement example of pads.

FIG. 104A is a plan view depicting an arrangement example of the conductor layer A (wiring layer 165A), and pads 1001*s* connected to the conductor layer A.

FIG. 104B is a plan view depicting an arrangement example of the conductor layer B (wiring layer 165B), and pads 1001*d* connected to the conductor layer B.

FIG. 104C is a plan view of the stacked state of the conductor layers A and B depicted in in FIGS. 104A and 104B, respectively, and the pads 1001*s* and pads 1001*d* depicted in in FIGS. 104A and 104B, respectively.

In FIGS. 104A, 104B, and 104C, the pads 1001*s* represent pads 1001 to be supplied with GND or a negative power supply, for example, and the pads 1001*d* represent pads 1001 to be supplied with a positive power supply, for example.

As depicted in FIG. 104A, one predetermined edge of the rectangular main conductor section 165Aa is connected with multiple lead conductor sections 165Ab, and an outer circumferential section of each lead conductor section 165Ab is connected with a conductor 1011 with a shape including, if desired, a predetermined repetition pattern. In addition, each of some of the multiple lead conductor sections 165Ab is connected with one pad 1001*s* via a conductor 1011. Each conductor 1011 may be omitted or may not be omitted. In addition, each conductor 1011 may be located between the main conductor section 165Aa and a lead conductor section 165Ab.

As depicted in FIG. 104B, one predetermined edge of the rectangular main conductor section 165Ba is connected with multiple lead conductor sections 165Bb, and an outer circumferential section of each lead conductor section 165Bb is connected with a conductor 1012 with a shape including, if desired, a predetermined repetition pattern. In addition, one pad 1001*d* is arranged in each of some of the multiple lead conductor sections 165Bb via a conductor 1012. Each conductor 1012 may be omitted or may not be omitted. In addition, each conductor 1012 may be located between the main conductor section 165Ba and a lead conductor section 165Bb.

As depicted in FIG. 104C, in the stacked state of the conductor layers A and B, the arrangement of the pads 1001*s* and the pads 1001*d* is a mirror-symmetric arrangement in which two sets of pads 1001, each set of which includes four pads 1001*s* and pads 1001*d* that are next to each other in the Y direction, are arranged sequentially in the Y direction, with one set of the pads 1001 being arranged in an order, and the other set of the pads 1001 being arranged in the reversed order. Furthermore, four pads 1001*s* and pads 1001*d* included in each set also are arranged in a mirror-symmetric arrangement in which one set of two pads 1001 is arranged on one side of the center line of the four pads 1001*s* and pads 1001*d* in the Y direction in the reversed order in the Y direction as compared to the other set of two pads 1001 arranged on the other side of the center line of the four pads 1001*s* and pads 1001*d* in the Y direction. In the case of the configuration with the twofold mirror-symmetric arrangement in such a manner, as compared with the configuration with the onefold mirror-symmetric arrangement depicted in FIGS. 103A, 103B, and 103C, the range within which residual magnetic fields are accumulated is narrow. Accordingly, induced electromotive forces are offset more effectively, and inductive noise can be ameliorated further, depending on the layouts of elements other than the pads.

While, in the examples of the arrangement of pads explained with reference to FIGS. 93A, 93B, 93C, 94A, 94B, 94C, 95A, 95B, 95C, 96A, 96B, 96C 97A, 97B, 97C, 98A, 98B, 98C, 99A, 99B, 99C, 100A, 100B, 100C, 101A, 101B, 101C, 102A, 102B, 102C, 103A, 103B, 103C, 104A, 104B, and 104C, the total number of pads connected to one predetermined edge of the main conductor section 165*a* of the conductor layers A and B is eight, and the array of the eight pads 1001 that are next to each other in the Y direction is an alternating arrangement, a configuration with the onefold mirror-symmetric arrangement or a configuration with the twofold mirror-symmetric arrangement, the total number of pads may be any number other than eight, and the pads may be arrayed in an alternating arrangement, a configuration with the onefold mirror-symmetric arrangement or a configuration with the twofold mirror-symmetric arrangement. The number of pads to form one set in an alternating arrangement or a mirror-symmetric arrangement also is not limited to two or four as in the examples mentioned above, but may be any number.

In addition, the number of pads connected to one lead conductor section 165*b* also is not limited to one or two as in the examples depicted in FIGS. 93A, 93B, 93C, 94A, 94B, 94C, 95A, 95B, 95C, 96A, 96B, 96C, 97A, 97B 97C, 98A, 98B, 98C, 99A, 99B, 99C, 100A, 100B, 100C, 101A, 101B, 101C, 102A, 102B, 102C, 103A, 103B, 103C, 104A, 104B, and 104C, but may be three or larger.

Furthermore, while, in the examples depicted in FIGS. 93 [to] A, 93B, 93C, 94A, 94B, 94C, 95A, 95B, 95C, 96A, 96B, 96C, 97A, 97B, 97C, 98A, 98B, 98C. 99A, 99B, 99C, 100A, 100B, 100C, 101A, 101B, 101C, 102A, 102B, 102C, 103A, 103B, 103C, 104A, 104B, and 104C, multiple pads 1001 are connected with only one predetermined edge of the main conductor section 165*a* of the rectangular conductor layers A and B for simplification of the explanation, the multiple pads 1001 may be connected to one edge other than the edge depicted in FIGS. 93A, 93B, 93C, 94A, 94B, 94C, 95A, 95B, 95C, 96A, 96B, 96C, 97A, 97B, 97C, 98A, 98B, 98C, 99A, 99B. 99C, 100A, 100B, 100C, 101A, 101B, 101C, 102A, 102B, 102C, 103A, 103B, 103C 104A, 104B, and 104C or any two edges, three edges, or four edges.

While the total number of pads is eight in the examples explained, this is not essential. The number of pads may be increased, or the number of pads may be reduced.

Constituent elements depicted in pad arrangement examples may be omitted partially or entirely, may be changed partially or entirely, may be modified partially or entirely, may be replaced with other constituent elements partially or entirely, or may have other additional constituent elements partially or entirely. In addition, constituent elements depicted in pad arrangement examples may be divided into multiple constituent elements partially or entirely, may be separated into multiple constituent elements partially or entirely, or may achieve mutually different functionality or features with at least some of the multiple divided or separated constituent elements. Also, at least some of constituent elements depicted in pad arrangement examples may be combined as desired to form different pad arrangements. Further, at least some of constituent elements depicted in pad arrangement examples may be shifted as desired to form different pad arrangements. In addition, combinations of at least some of constituent elements depicted in pad arrangement examples may have additional coupling elements or relay elements to form different pad arrangements. Furthermore, combinations of at least some of constituent elements depicted in pad arrangement examples may have additional switching elements or switching functionality to form different pad arrangements.

<Sixteenth Arrangement Example of Pads>

Next, orthogonal pad arrangement examples in a case in which multiple pads 1001 are arranged along two adjacent edges of the rectangular main conductor section 165*a* of the conductor layers A and B are explained with reference to FIGS. 105A, 105B, 105C, 106A, 106B, 106C, 107A, 107B, 107C, 108A, 108B, and 108C.

Figure 105A:
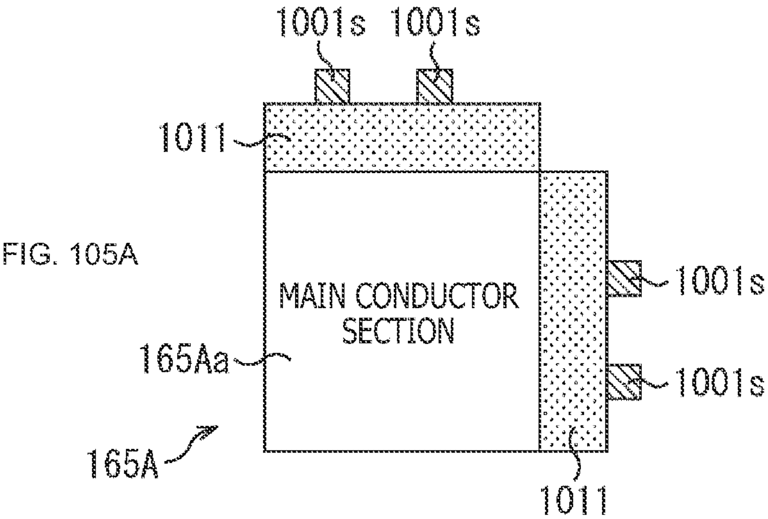
FIGS. 105A, 105B, and 105C are plan views depicting a sixteenth arrangement example of pads.
Figure 105B:
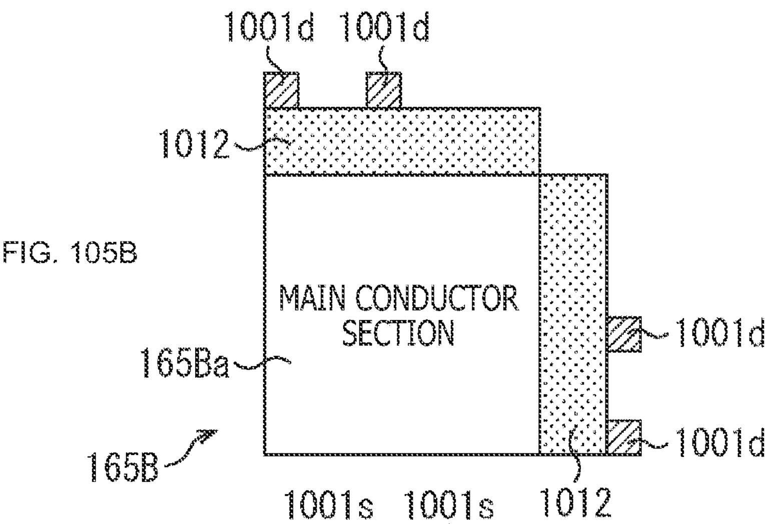
Figure 105C:
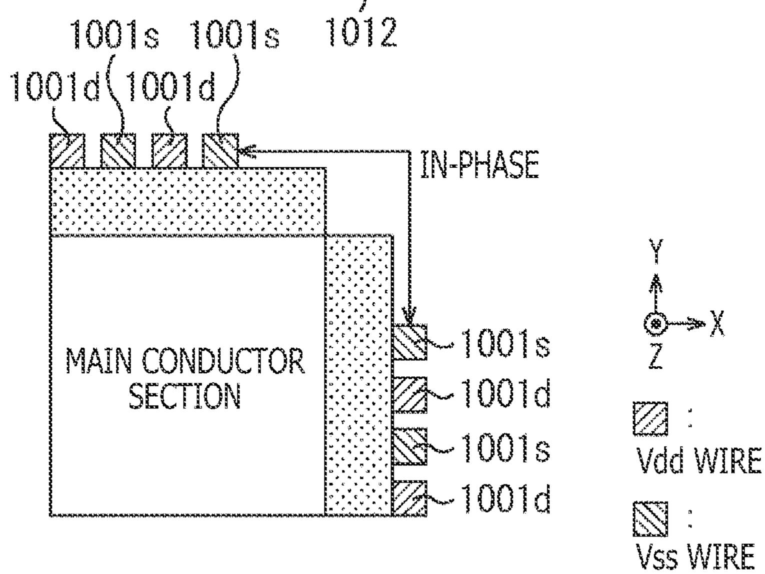

FIGS. 105A, 105B, and 105C depict a sixteenth arrangement example of pads.

FIG. 105A is a plan view depicting an arrangement example of the conductor layer A (wiring layer 165A), and pads 1001*s* connected to the conductor layer A.

FIG. 105B is a plan view depicting an arrangement example of the conductor layer B (wiring layer 165B), and pads 1001*d* connected to the conductor layer B.

FIG. 105C is a plan view of the stacked state of the conductor layers A and B depicted in in FIGS. 105A and 105B, respectively, and the pads 1001*s* and pads 1001*d* depicted in FIGS. 105A and 105B, respectively.

In FIGS. 105A, 105B, and 105C, the pads 1001*s* represent pads 1001 to be supplied with GND or a negative power supply, for example, and the pads 1001*d* represent pads 1001 to be supplied with a positive power supply, for example.

As depicted in FIG. 105A, two adjacent edges of the rectangular main conductor section 165Aa are connected with multiple pads 1001*s* at predetermined intervals via the conductors 1011 each with a shape including, if desired, a predetermined repetition pattern. Each pad 1001*s* may include the lead conductor section 165Ab, or each conductor 1011 may include the lead conductor section 165Ab. In addition, in a case in which the pads 1001*s* are the lead conductor sections 165Ab, each conductor 1011 may be omitted or may not be omitted.

As depicted in FIG. 105B, two adjacent edges of the rectangular main conductor section 165Ba are connected with multiple pads 1001*d* at predetermined intervals via the conductors 1012 each with a shape including, if desired, a predetermined repetition pattern. Each pad 1001*d* may include the lead conductor section 165Bb, or each conductor 1012 may include the lead conductor section 165Bb. In addition, in a case in which the pads 1001*d* are the lead conductor sections 165Bb, each conductor 1012 may be omitted or may not be omitted.

As depicted in FIG. 105C, in the stacked state of the conductor layers A and B, the arrangement of the pads 1001*s* and the pads 1001*d* is an alternating arrangement in which the pad 1001*s* and the pad 1001*d* are arranged alternately along two adjacent edges of the rectangular main conductor section 165*a*. In addition, regarding polarities, both pads 1001 at end sections of the edges in the pads 1001*s* and pads 1001*d* that are arranged alternately along the two edges are pads 1001*s* connected to GND or a negative power supply. Because the polarities of the pads 1001 at the end sections closest to a corner section of the board 1000 in the multiple pads 1001 along the two edges including the alternately arranged pads 1001*s* and pads 1001*d* in this manner have the same phase, and are pads 1001*s* with a polarity that provides higher ESD (electrostatic discharge) resistance, the ESD resistance can be increased.

Note that if the ESD resistance is taken into consideration, regarding polarity, the pads 1001 at the end sections of the two edges including the alternately arranged pads 1001*s* and pads 1001*d* are preferably pads 1001*s* connected to GND or a negative power supply, for example, but may be pads 1001*d* connected to a positive power supply, for example.

<Seventeenth Arrangement Example of Pads>

Figure 106A:
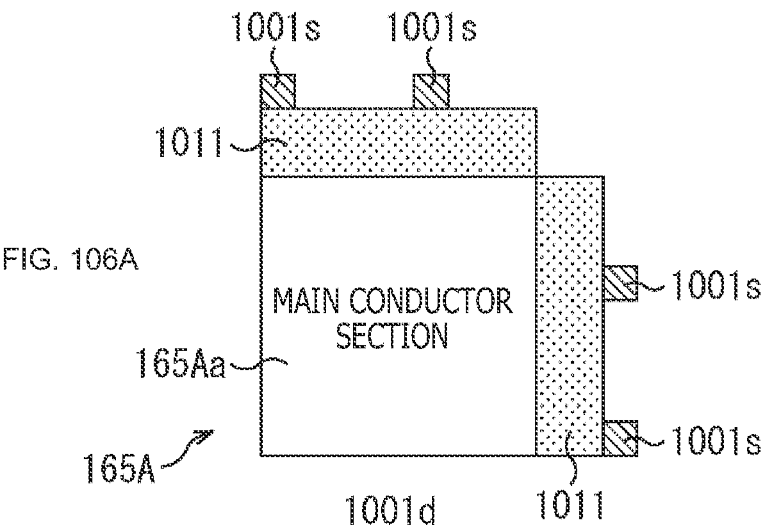
FIGS. 106A, 106B, and 106C are plan views depicting a seventeenth arrangement example of pads.
Figure 106B:
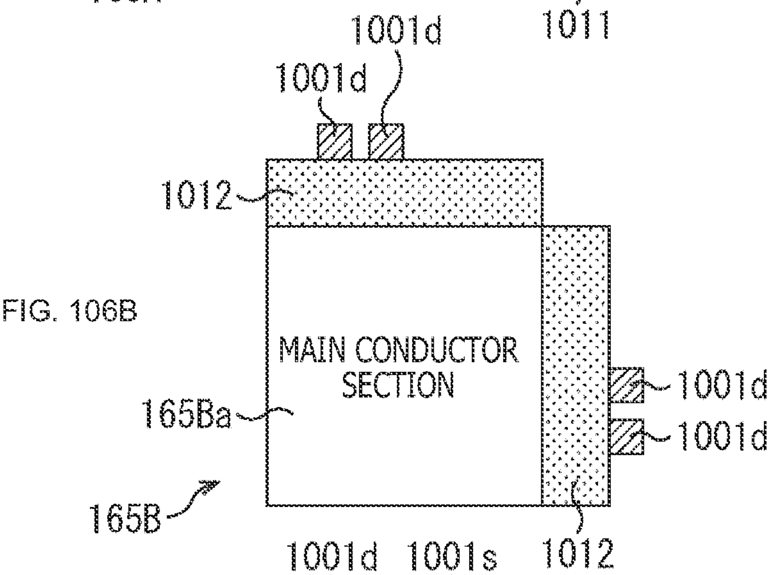
Figure 106C:
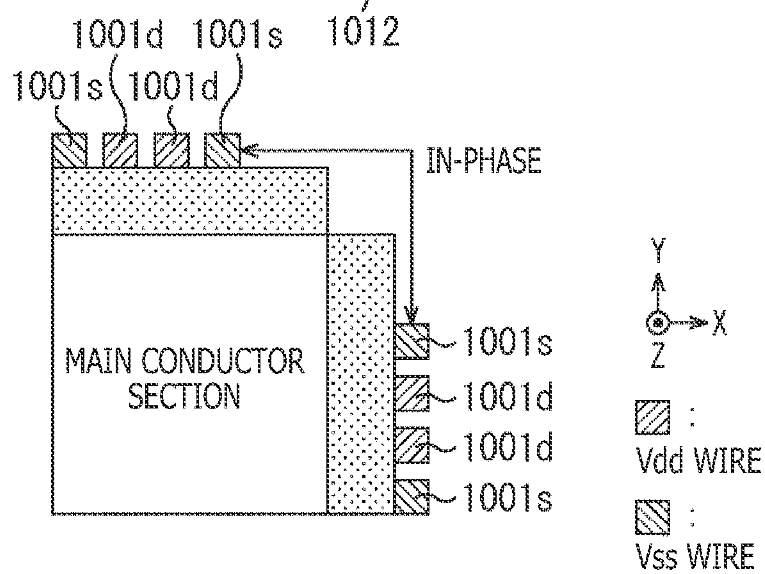

FIGS. 106A, 106B, and 106C depict a seventeenth arrangement example of pads.

FIG. 106A is a plan view depicting an arrangement example of the conductor layer A (wiring layer 165A), and pads 1001*s* connected to the conductor layer A.

FIG. 106B is a plan view depicting an arrangement example of the conductor layer B (wiring layer 165B), and pads 1001*d* connected to the conductor layer B.

FIG. 106C is a plan view of the stacked state of the conductor layers A and B depicted in in FIGS. 106A and 106B, respectively, and the pads 1001*s* and pads 1001*d* depicted in in FIGS. 106A and 106B, respectively.

In FIGS. 106A, 106B, and 106C, the pads 1001*s* represent pads 1001 to be supplied with GND or a negative power supply, for example, and the pads 1001*d* represent pads 1001 to be supplied with a positive power supply, for example.

As depicted in FIG. 106A, two adjacent edges of the rectangular main conductor section 165Aa are connected with multiple pads 1001*s* at predetermined intervals via the conductors 1011 each with a shape including, if desired, a predetermined repetition pattern. Each pad 1001*s* may include the lead conductor section 165Ab, or each conductor 1011 may include the lead conductor section 165Ab. In addition, in a case in which the pads 1001*s* are the lead conductor sections 165Ab, each conductor 1011 may be omitted or may not be omitted.

As depicted in FIG. 106B, two adjacent edges of the rectangular main conductor section 165Ba are connected with multiple pads 1001*d* at predetermined intervals via the conductors 1012 each with a shape including, if desired, a predetermined repetition pattern. Each pad 1001*d* may include the lead conductor section 165Bb, or each conductor 1012 may include the lead conductor section 165Bb. In addition, in a case in which the pads 1001*d* are the lead conductor sections 165Bb, each conductor 1012 may be omitted or may not be omitted.

As depicted in FIG. 106C, in the stacked state of the conductor layers A and B, similarly to the pad arrangement example depicted in FIG. 95C, the pad arrangement is a mirror-symmetric arrangement in which two sets of pads 1001, each set of which includes four pads 1001*s* and pads 1001*d* that are next to each other, are arranged sequentially in the Y direction, with one set of the pads 1001 being arranged in an order, and the other set of the pads 1001 being arranged in the reversed order. In addition, regarding polarities, both pads 1001 at end sections of the edges in the pads 1001*s* and pads 1001*d* that are arranged mirror-symmetrically along the two edges are pads 1001*s* connected to GND or a negative power supply. Because the polarities of the pads 1001 at the end sections closest to a corner section of the board 1000 in the multiple pads 1001 along the two edges including the mirror-symmetrically arranged pads 1001*s* and pads 1001*d* in this manner have the same phase, and are pads 1001*s* with a polarity that provides higher ESD resistance, the ESD resistance can be increased. In addition, by adopting the mirror-symmetric arrangement, the impedance difference and electric current difference between Vss wires and Vdd wires decrease, and so inductive noise can be ameliorated more than in the sixteenth arrangement example in FIGS. 105A, 105B, and 105C.

Note that if the ESD resistance is taken into consideration, regarding polarity, the pads 1001 at the end sections of the two edges including the mirror-symmetrically arranged pads 1001*s* and pads 1001*d* are preferably pads 1001*s* connected to GND or a negative power supply, for example, but may be pads 1001*d* connected to a positive power supply, for example.

<Eighteenth Arrangement Example of Pads>

Figure 107A:
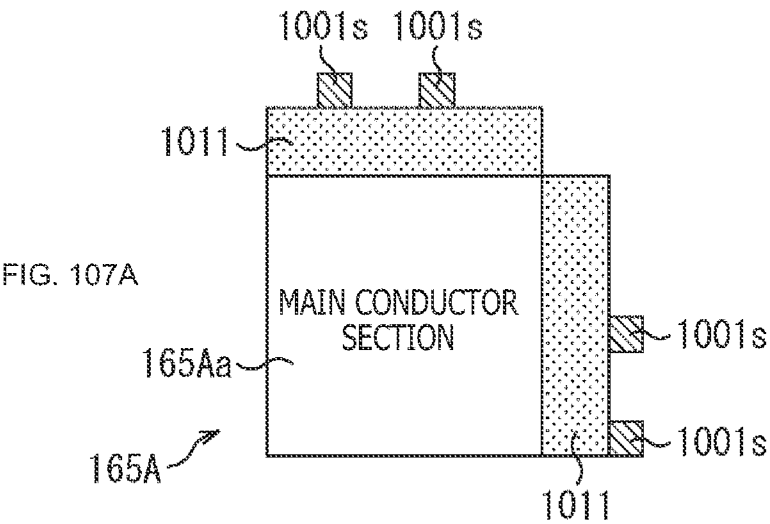
FIGS. 107A, 107B, and 107C are plan views depicting an eighteenth arrangement example of pads.
Figure 107B:
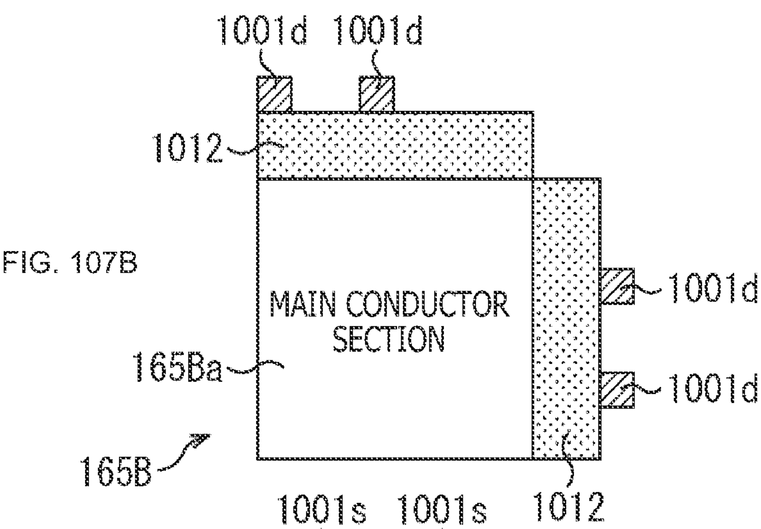
Figure 107C:
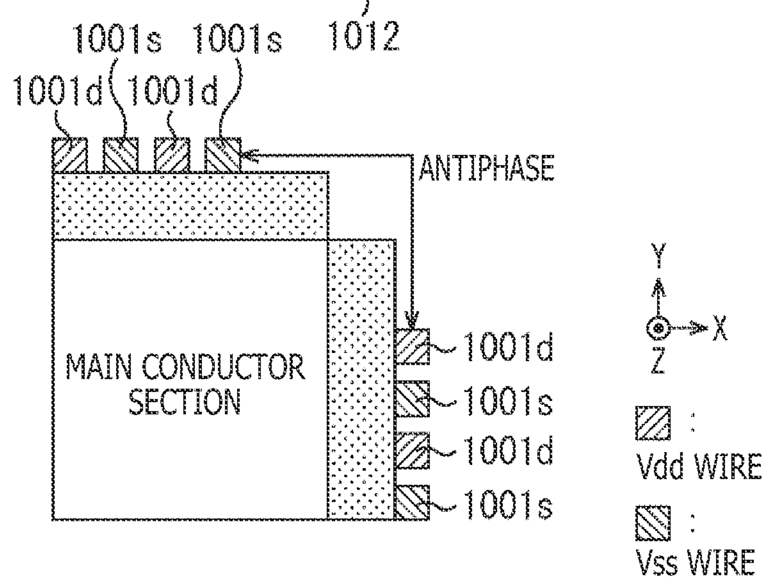

FIGS. 107A, 107B, and 107C depict an eighteenth arrangement example of pads.

FIG. 107A is a plan view depicting an arrangement example of the conductor layer A (wiring layer 165A), and pads 1001*s* connected to the conductor layer A.

FIG. 107B is a plan view depicting an arrangement example of the conductor layer B (wiring layer 165B), and pads 1001*d* connected to the conductor layer B.

FIG. 107C is a plan view of the stacked state of the conductor layers A and B depicted in in FIGS. 107A and 107B, respectively, and the pads 1001*s* and pads 1001*d* depicted in in FIGS. 107A and 107B, respectively.

In FIGS. 107A, 107B, and 107C, the pads 1001*s* represent pads 1001 to be supplied with GND or a negative power supply, for example, and the pads 1001*d* represent pads 1001 to be supplied with a positive power supply, for example.

As depicted in FIG. 107A, two adjacent edges of the rectangular main conductor section 165Aa are connected with multiple pads 1001*s* at predetermined intervals via the conductors 1011 each with a shape including, if desired, a predetermined repetition pattern. Each pad 1001*s* may include the lead conductor section 165Ab, or each conductor 1011 may include the lead conductor section 165Ab. In addition, in a case in which the pads 1001*s* are the lead conductor sections 165Ab, each conductor 1011 may be omitted or may not be omitted.

As depicted in FIG. 107B, two adjacent edges of the rectangular main conductor section 165Ba are connected with multiple pads 1001*d* at predetermined intervals via the conductors 1012 each with a shape including, if desired, a predetermined repetition pattern. Each pad 1001*d* may include the lead conductor section 165Bb, or each conductor 1012 may include the lead conductor section 165Bb. In addition, in a case in which the pads 1001*d* are the lead conductor sections 165Bb, each conductor 1012 may be omitted or may not be omitted.

As depicted in FIG. 107C, in the stacked state of the conductor layers A and B, similarly to the pad arrangement example depicted in FIGS. 105A, 105B, and 105C, the arrangement of the pads 1001*s* and the pads 1001*d* is an alternating arrangement in which the pad 1001*s* and the pad 1001*d* are arranged alternately. It should be noted however that this arrangement is different from the pad arrangement example depicted in FIGS. 105A, 105B, and 105C in that pads 1001 at end sections of two edges in the pads 1001*s* and the pads 1001*d* that are arranged along the edges are a pad 1001*s* and a pad 1001*d* which have mutually reverse phases. In this manner, because the polarities of the pads 1001 at the end sections closest to a corner section of the board 1000 in the multiple pads 1001 along two edges including alternately arranged pads 1001*s* and pads 1001*d* are reverse phases, the impedance difference and electric current difference between Vss wires and Vdd wires can be reduced further, and so inductive noise can be ameliorated more than in the seventeenth arrangement example in FIGS. 106A, 106B, and 106C.

<Nineteenth Arrangement Example of Pads>

Figure 108A:
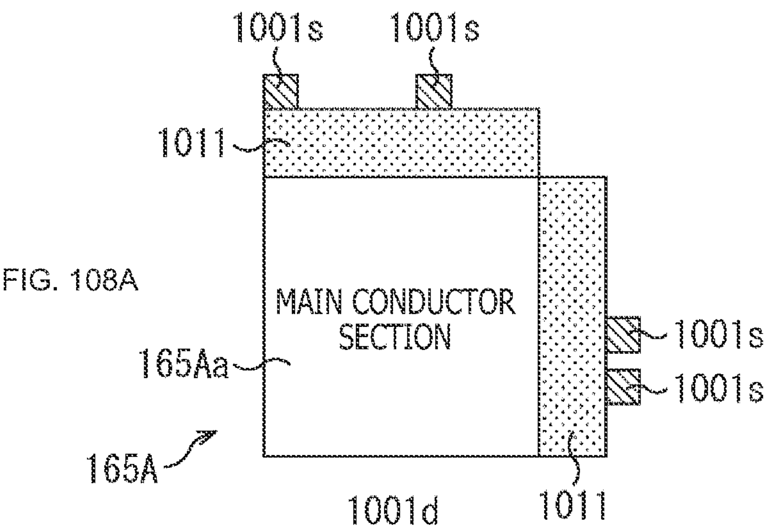
FIGS. 108A, 108B, and 108C are plan views depicting a nineteenth arrangement example of pads.
Figure 108B:
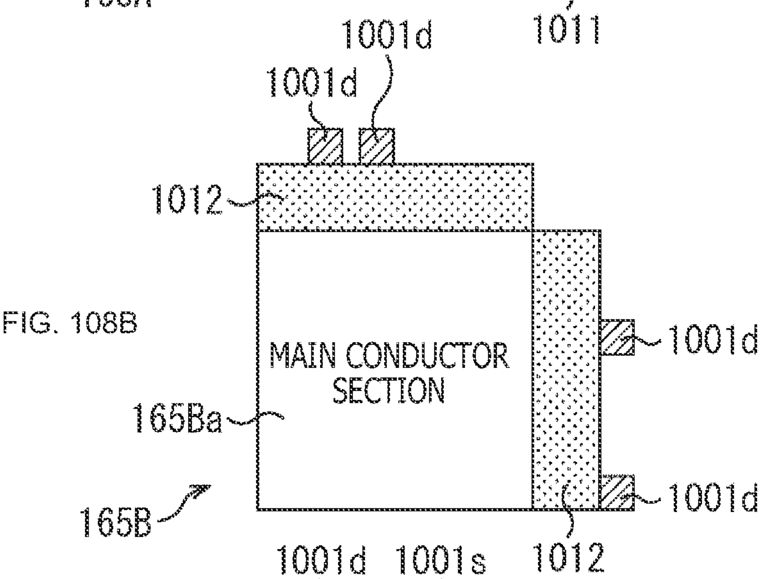
Figure 108C:
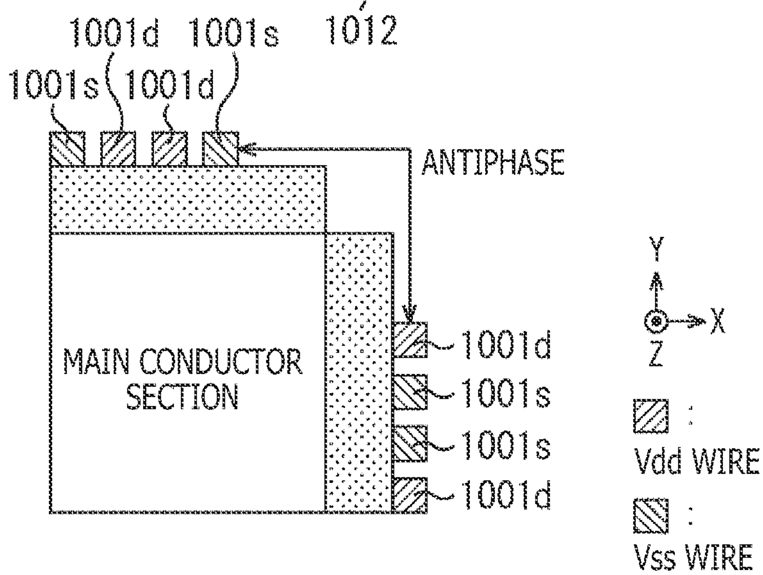

FIGS. 108A, 108B, and 108C depict a nineteenth arrangement example of pads.

FIG. 108A is a plan view depicting an arrangement example of the conductor layer A (wiring layer 165A), and pads 1001*s* connected to the conductor layer A.

FIG. 108B is a plan view depicting an arrangement example of the conductor layer B (wiring layer 165B), and pads 1001*d* connected to the conductor layer B.

FIG. 108C is a plan view of the stacked state of the conductor layers A and B depicted in in FIGS. 108A and 108B, respectively, and the pads 1001*s* and pads 1001*d* depicted in in FIGS. 108A and 108B, respectively.

In FIGS. 108A, 108B, and 108C, the pads 1001*s* represent pads 1001 to be supplied with GND or a negative power supply, for example, and the pads 1001*d* represent pads 1001 to be supplied with a positive power supply, for example.

As depicted in FIG. 108A, two adjacent edges of the rectangular main conductor section 165Aa are connected with multiple pads 1001*s* at predetermined intervals via the conductors 1011 each with a shape including, if desired, a predetermined repetition pattern. Each pad 1001*s* may include the lead conductor section 165Ab, or each conductor 1011 may include the lead conductor section 165Ab. In addition, in a case in which the pads 1001*s* are the lead conductor sections 165Ab, each conductor 1011 may be omitted or may not be omitted.

As depicted in FIG. 108B, two adjacent edges of the rectangular main conductor section 165Ba are connected with multiple pads 1001*d* at predetermined intervals via the conductors 1012 each with a shape including, if desired, a predetermined repetition pattern. Each pad 1001*d* may include the lead conductor section 165Bb, or each conductor 1012 may include the lead conductor section 165Bb. In addition, in a case in which the pads 1001*d* are the lead conductor sections 165Bb, each conductor 1012 may be omitted or may not be omitted.

As depicted in FIG. 108C, in the stacked state of the conductor layers A and B, similarly to the pad arrangement example depicted in FIGS. 106A, 106B, and 106C, the arrangement of the pads 1001*s* and the pads 1001*d* is an arrangement in which the pad 1001*s* and the pad 1001*d* are arranged mirror-symmetrically. It should be noted however that this arrangement is different from the pad arrangement example depicted in FIGS. 106A, 106B, and 106C in that pads 1001 at end sections of two edges in the pads 1001*s* and the pads 1001*d* that are arranged along the edges are a pad 1001*s* and a pad 1001*d* which have mutually reverse phases. In this manner, because the polarities of the pads 1001 at the end sections closest to a corner section of the board 1000 in the multiple pads 1001 along two edges including mirror-symmetrically arranged pads 1001*s* and pads 1001*d* are reverse phases, the impedance difference and electric current difference between Vss wires and Vdd wires can be reduced further, and so inductive noise can be ameliorated more than in the seventeenth arrangement example in FIGS. 106A, 106B, and 106C.

While, in the examples explained in the sixteenth to nineteenth arrangement examples of pads explained with reference to FIGS. 105A, 105B, 105C, 106A, 106B, 106C, 107A, 107B, 107C, 108A, 108B, and 108C, multiple pads 1001 are arranged along two adjacent edges of the rectangular main conductor section 165*a* via the conductors 1011 or 1012 at predetermined intervals, the number of edges along which pads 1001 are arranged is not limited to two, but may be three or four.

In addition, while, in the examples depicted in the sixteenth to nineteenth arrangement examples of pads explained with reference to FIGS. 105A, 105B, 105C, 106A, 106B, 106C, 107A, 107B, 107C, 108A, 108B, and 108C, the alternating arrangement in FIGS. 93A, 93B, and 93C, and the configuration with the twofold mirror-symmetric arrangement in FIGS. 95A, 95B, and 95C are adopted as modes of pads 1001 arranged along one edge, the configuration with the onefold mirror-symmetric arrangement in FIGS. 94A, 94B, and 94C may be adopted, and the polarities of pads 1001 at end sections closest to a corner section may be made the same phase or reverse phases, in one possible mode.

Furthermore, while the lead conductor section 165*b* is omitted in the modes in the sixteenth to nineteenth arrangement examples of pads explained with reference to FIGS. 105A, 105B, 105C, 106A, 106B, 106C, 107A, 107B, 107C, 108A, 108B, and 108C, the alternating arrangement in FIGS. 93A, 93B, and 93C, the configuration with the onefold mirror-symmetric arrangement in FIG. 94A, 94B, and 94C or the configuration with the twofold mirror-symmetric arrangement in FIGS. 95A, 95B, and 95C may be adopted in a configuration including the lead conductor section 165*b* along an edge of the rectangular main conductor section 165Aa as in FIGS. 96A, 96B, 96C, 97A, 97B, 97C, 98A, 98B, 98C, 99A, 99B, 99C, 100A, 100B, 100C, 101A, 101B, 101C, 102A, 102B, 102C, 103A, 103B, 103C, 104A, 104B, and 104C, and the polarities of pads 1001 at end sections closest to a corner section may be made the same phase or reverse phases, in one possible mode.

Note that the lead conductor sections 165Ab and 165Bb and the conductors 1011 and 1012 are desirably configured such that, for example, GND or a negative power supply is supplied from pads 1001*s* to the main conductor section 165Aa, and a positive power supply with the reverse polarity is supplied from pads 1001*d* to the main conductor section 165Ba, but this is not essential. In other words, the lead conductor sections 165Ab and 165Bb, and the conductors 1011 and 1012 are desirably configured such that GND or a negative power supply, for example, supplied from pads 1001, and a positive power supply with the reverse polarity are prevented from being completely short-circuited, but this is not essential. Note that while examples depicted in at least some of FIGS. 92A, 92B, 93A, 93B, 93C, 94A, 94B, 94C, 95A, 95B, 95C, 96A, 96B, 96C, 97A, 97B, 97C, 98A, 98B, 97C, 99A, 99B, 99C. 100A, 100B, 100C, 101A, 101B, 101C, 102A, 102B, 102C, 103A, 103B, 103C, 104A, 104B, 104C, 105A, 105B, 105C, 106A, 106B, 106C, 107A, 107B, 107C, 108A, 108B, and 108C include an example in which multiple pads 1001*s* are arranged, an example in which multiple pads 1001*d* are arranged, an example in which multiple conductors 1011 are arranged, an example in which multiple conductors 1012 are arranged, an example in which multiple lead conductor sections 165Ab are arranged, an example in which multiple lead conductor sections 165Bb are arranged, and the like, in each of the figures, all the pads 1001*s* may be the same, all the pads 1001*s* do not have to be the same, all the pads 1001*d* may be the same, all the pads 1001*d* do not have to be the same, all the conductors 1011 may be the same, all the conductors 1011 do not have to be the same, all the conductors 1012 may be the same, all the conductors 1012 do not have to be the same, all the lead conductor sections 165Ab may be the same, all the lead conductor sections 165Ab do not have to be the same, all the lead conductor sections 165Bb may be the same, and all the lead conductor sections 165Bb do not have to be the same. Note that desirably at least one of the following conditions is, but is not necessarily, satisfied: the total numbers of pads 1001*s* and pads 1001*d* that are directly or indirectly connected to the main conductor section 165*a* in the board 1000 are the same number or substantially the same numbers; the total numbers of pads 1001*s* and pads 1001*d* connected directly or indirectly to the main conductor section 165*a* along two predetermined adjacent edges of the board 1000 are the same number or substantially the same numbers; the total numbers of pads 1001*s* and pads 1001*d* that are connected directly or indirectly to the main conductor section 165*a* along two predetermined opposite edges of the board 1000 are the same number or substantially the same numbers; the total numbers of pads 1001*s* and pads 1001*d* that are connected directly or indirectly to the main conductor section 165*a* along one predetermined edge of the board 1000 are the same number or substantially the same numbers; the total numbers of pads 1001*s* and pads 1001*d* that are connected directly or indirectly to at least two lead conductor sections 165*b* along two predetermined adjacent edges of the board 1000 are the same number or substantially the same numbers; the total numbers of pads 1001*s* and pads 1001*d* that are connected directly or indirectly to at least two lead conductor sections 165*b* along two predetermined opposite edges of the board 1000 are the same number or substantially the same numbers; the total numbers of pads 1001*s* and pads 1001*d* that are connected directly or indirectly to at least one lead conductor section 165*b* along one predetermined edge of the board 1000 are the same number or substantially the same numbers; the total numbers of pads 1001*s* and pads 1001*d* connected directly or indirectly to at least two sets of conductors 1011 and 1012 along two predetermined adjacent edges of the board 1000 are the same number or substantially the same numbers; the total numbers of pads 1001*s* and pads 1001*d* that are connected directly or indirectly to at least two sets of conductors 1011 and 1012 along two predetermined opposite edges of the board 1000 are the same number or substantially the same numbers; and the total numbers of pads 1001*s* and pads 1001*d* that are connected directly or indirectly to at least one set of conductors 1011 and 1012 along one predetermined edge of the board 1000 are the same number or substantially the same numbers. For example, the total numbers of pads 1001*s* and pads 1001*d* described above do not have to be the same number, and the total numbers of pads 1001*s* and pads 1001*d* described above do not have to be substantially the same numbers.

<Board Arrangement Examples of Victim Conductor Loop and Aggressor Conductor Loops>

Figure 109A:
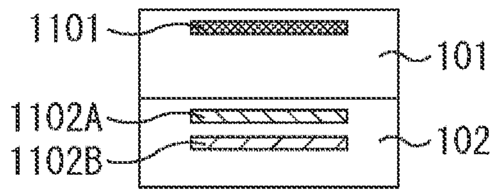
FIGS. 109A, 109B, and 109C are cross-sectional views depicting board arrangement examples of a Victim conductor loop and Aggressor conductor loops.
Figure 109B:
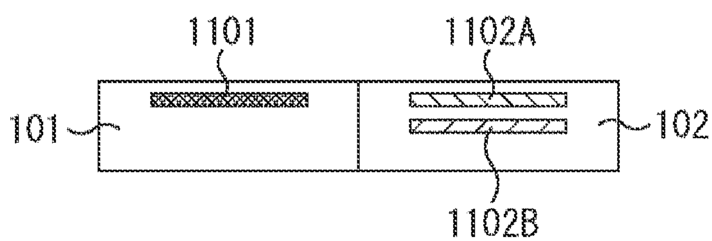
Figure 109C:
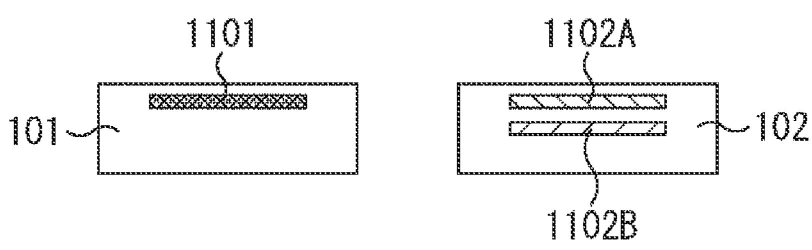

FIGS. 109A, 109B, and 109C depict board arrangement examples of a Victim conductor loop and Aggressor conductor loops.

FIG. 109A is a cross-sectional view schematically depicting a board arrangement example of the Victim conductor loop and the Aggressor conductor loops mentioned thus far.

In the structure explained in each configuration example mentioned above, as depicted in FIG. 109A, a Victim conductor loop 1101 is included in the first semiconductor board 101, Aggressor conductor loops 1102A and 1102B are included in the second semiconductor board 102, and the first semiconductor board 101 and the second semiconductor board 102 are stacked one on another.

However, in one possible structure, the first semiconductor board 101 and the second semiconductor board 102 may not be stacked one on another, and, as in FIG. 109B, the first semiconductor board 101 and the second semiconductor board 102 may be arranged adjacent to each other, or, as in FIG. 109C, the first semiconductor board 101 and the second semiconductor board 102 may be arranged on the same plane with a predetermined interval therebetween.

Furthermore, various types of arrangement configuration like the ones depicted in FIGS. 110A, 110B, 110C, 110D, 110E, 110F, 110G, 110H, and 110I can be adopted as the board arrangement of the Victim conductor loop and the Aggressor conductor loops.

Figures 110A, 110B, 110C, 110D, 110E, 110F, 110G, 110H, 110I:
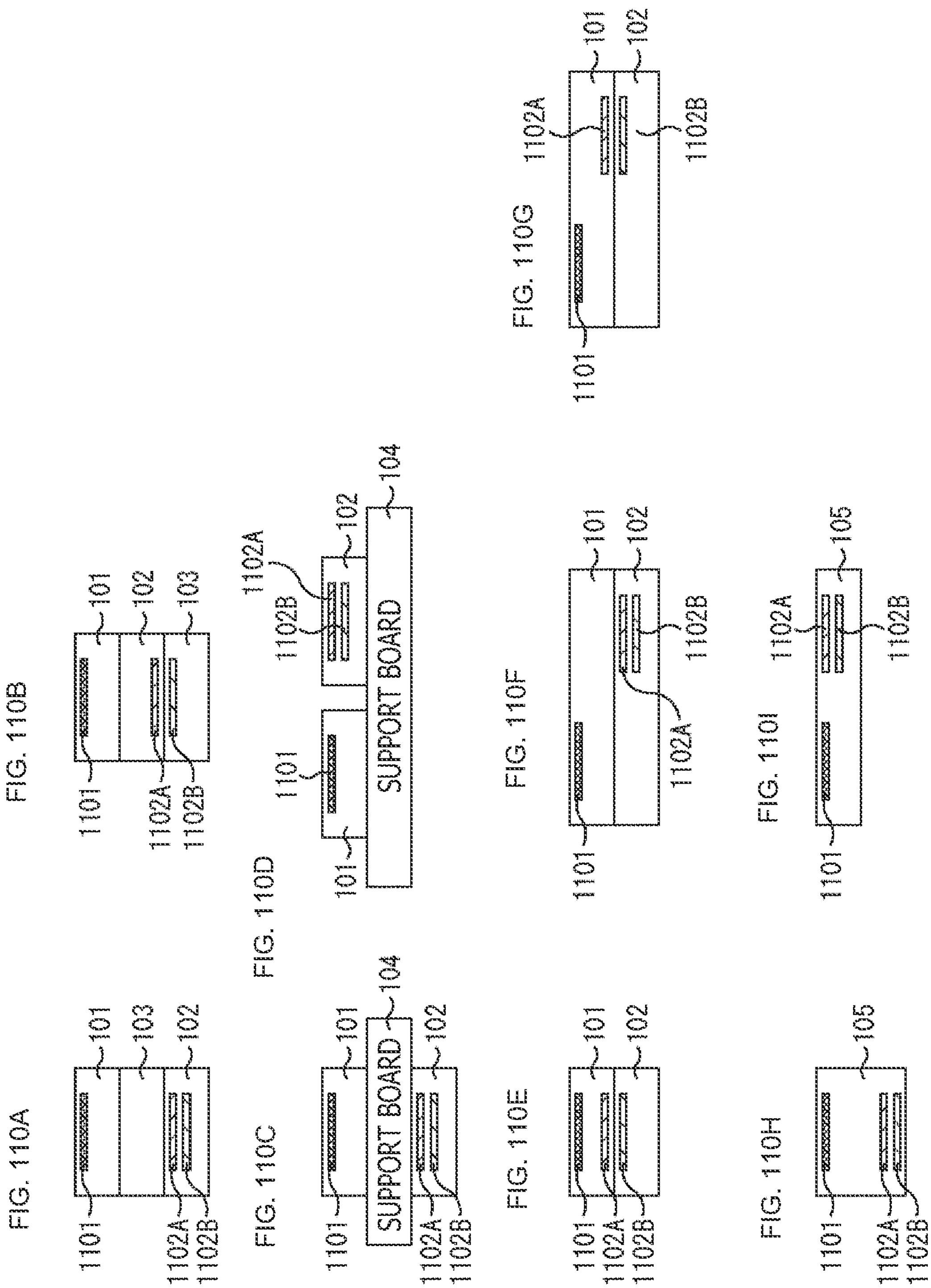
FIGS. 110A, 110B, 110C, 110D, 110E, 110F, 110G, 110H, and 110I are cross-sectional views depicting board arrangement examples of the Victim conductor loop and the Aggressor conductor loops.

FIG. 110A depicts a structure in which the Victim conductor loop 1101 is included in the first semiconductor board 101, the Aggressor conductor loops 1102A and 1102B are included in the second semiconductor board 102, a third semiconductor board 103 is inserted between the first semiconductor board 101 and the second semiconductor board 102, and the first semiconductor board 101 to the third semiconductor board 103 are stacked one on another.

FIG. 110B depicts a structure in which the Victim conductor loop 1101 is included in the first semiconductor board 101, the Aggressor conductor loop 1102A is included in the second semiconductor board 102, the Aggressor conductor loop 1102B is included in the third semiconductor board 103, and the first semiconductor board 101 to the third semiconductor board 103 are stacked one on another in this order.

FIG. 110C depicts a structure in which the Victim conductor loop 1101 is included in the first semiconductor board 101, the Aggressor conductor loops 1102A and 1102B are included in the second semiconductor board 102, a support board 104 is inserted between the first semiconductor board 101 and the second semiconductor board 102, and the first semiconductor board 101, the support board 104 and the second semiconductor board 102 are stacked one on another in this order. The support board 104 may be omitted, and the first semiconductor board 101 and the second semiconductor board 102 may be arranged with a predetermined gap therebetween.

FIG. 110D depicts a structure in which the Victim conductor loop 1101 is included in the first semiconductor board 101, the Aggressor conductor loops 1102A and 1102B are included in the second semiconductor board 102, and the first semiconductor board 101 and the second semiconductor board 102 are placed on the support board 104 and are arranged on the same plane with a predetermined interval therebetween. The support board 104 may be omitted, and the first semiconductor board 101 and the second semiconductor board 102 may be supported at another portion such that the first semiconductor board 101 and the second semiconductor board 102 are arranged on the same plane.

FIG. 110E depicts a structure in which the Victim conductor loop 1101 and the Aggressor conductor loop 1102A are included in the first semiconductor board 101, the Aggressor conductor loop 1102B is included in the second semiconductor board 102, and the first semiconductor board 101 and the second semiconductor board 102 are stacked one on another. Here, an XY-plane region that is in the first semiconductor board 101, and where the Victim conductor loop 1101 is formed at least partially overlaps an XY-plane region that is in the second semiconductor board 102, and where the Aggressor conductor loops 1102A and 1102B are formed.

FIG. 110E depicts a structure in which the Victim conductor loop 1101 is included in the first semiconductor board 101, the Aggressor conductor loops 1102A and 1102B are included in the second semiconductor board 102, and the first semiconductor board 101 and the second semiconductor board 102 are stacked one on another. Here, an XY-plane region that is in the first semiconductor board 101, and where the Victim conductor loop 1101 is formed may be a region that is completely different from or partially overlaps an XY-plane region that is in the second semiconductor board 102, and where the Aggressor conductor loops 1102A and 1102B are formed.

FIG. 110G depicts a structure in which the Victim conductor loop 1101 and the Aggressor conductor loop 1102A are included in the first semiconductor board 101, the Aggressor conductor loop 1102B is included in the second semiconductor board 102, and the first semiconductor board 101 and the second semiconductor board 102 are stacked one on another. Here, an XY-plane region that is in the first semiconductor board 101, and where the Victim conductor loop 1101 is formed is a region that is different from an XY-plane region where the Aggressor conductor loops 1102A and 1102B are formed.

FIG. 110H depicts a structure in which the Victim conductor loop 1101, and the Aggressor conductor loops 1102A and 1102B are included in one semiconductor board 105. It should be noted however that, in the one semiconductor board 105, an XY-plane region where the Victim conductor loop 1101 is formed at least partially overlaps an XY-plane region where the Aggressor conductor loops 1102A and 1102B are formed.

FIG. 110I depicts a structure in which the Victim conductor loop 1101, and the Aggressor conductor loops 1102A and 1102B are included in the one semiconductor board 105. It should be noted however that, in the one semiconductor board 105, an XY-plane region where the Victim conductor loop 1101 is formed is a region that is different from an XY-plane region where the Aggressor conductor loops 1102A and 1102B are formed.

The stacking orders of boards depicted in-A to Lin FIGS. 110A, 110B, 110C, 110D, 110E, 110F, 110G, 110H, and 110I may be reversed, and the positions of the Victim conductor loop 1101, and the Aggressor conductor loops 1102A and 1102B may be reversed vertically.

As mentioned above, there can be various types of structure in terms of the number and arrangement of semiconductor boards including the Victim conductor loop 1101, and the Aggressor conductor loops 1102A and 1102B, and whether or not of there is a support board.

The Aggressor conductor loops that generate magnetic flux to pass across the loop plane of the Victim conductor loop may be or may not be superimposed on the Victim conductor loop. Further, the Aggressor conductor loops may be formed in multiple semiconductor boards that are stacked on a semiconductor board in which the Victim conductor loop is formed, or may be formed in the semiconductor board in which the Victim conductor loop is formed.

Further, the Aggressor conductor loops may not be formed in a semiconductor board. Possible examples of boards in which the Aggressor conductor loops may be formed include various boards such as a printed board, a flexible printed board, an interposer board, a package board, an inorganic board, or an organic board, for example, and any board that includes a conductor or can form a conductor is sufficient. The Aggressor conductor loops may be present in a circuit other than a semiconductor board such as a package in which a semiconductor board is sealed in. Typically, the distances of the Aggressor conductor loops from the Victim conductor loop are the longest in a case in which the Aggressor conductor loops are formed in a semiconductor board, and are the second longest in a case in which the Aggressor conductor loops are formed in a package, and are the shortest in a case in which the Aggressor conductor loops are formed in a printed board, if these three cases are compared with each other. Because inductive noise and capacitive noise that can be generated to the Victim conductor loop increase more easily as the distances of the Aggressor conductor loops from the Victim conductor loop decrease, the present technology can provide a more significant effect as the distances of the Aggressor conductor loops from the Victim conductor loop decrease. Furthermore, the present technology can be applied not only to boards, but also to conductors themselves represented by conductive wires and conductive boards like bonding wires, leads, antenna lines, electric power lines, GND lines, coaxial lines, dummy lines, metal boards and the like.

Figure 111:
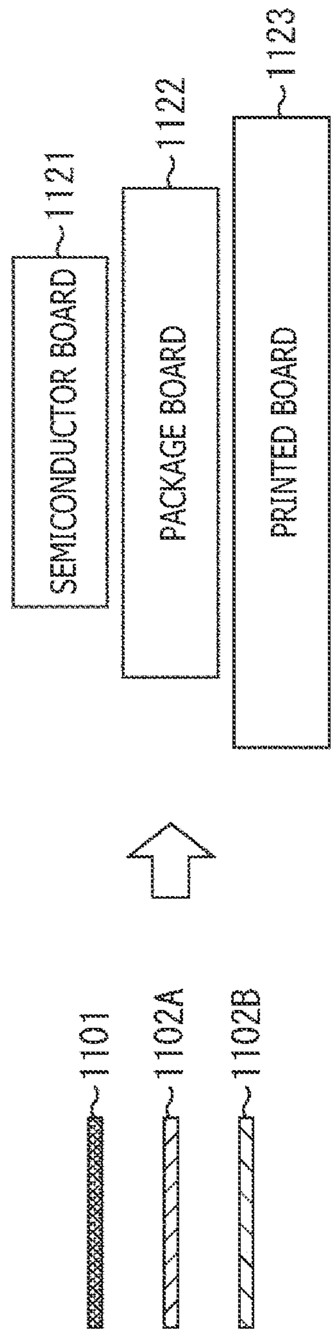
FIG. 111 is a figure for explaining arrangement examples of the Victim conductor loop and the Aggressor conductor loops in a structure in which three types of board are stacked.

In an arrangement example explained next, as depicted in FIG. 111, a conductor 1101 (hereinafter, referred to as the Victim conductor loop 1101) which is at least part of the Victim conductor loop, and conductors 1102A and 1102B (hereinafter, referred to as the Aggressor conductor loops 1102A and 1102B) which are at least part of the Aggressor conductor loops are arranged in a structure in which three types of board which are a semiconductor board 1121, a package board 1122 and a printed board 1123 are stacked one on another. Note that, although an illustration is omitted, the Victim conductor loop or Aggressor conductor loops mentioned above at least include(s) conductors arranged in two or more boards in the semiconductor board 1121, the package board 1122 and the printed board 1123, in some cases. The semiconductor board 1121 can be replaced with any of a package board, an interposer board, a printed board, a flexible printed board, an inorganic board, an organic board, a board including a conductor and a board that can form a conductor. In addition, the package board 1122 can be replaced with any of a semiconductor board, an interposer board, a printed board, a flexible printed board, an inorganic board, an organic board, a board including a conductor and a board that can form a conductor. Furthermore, the printed board 1123 can be replaced with any of a semiconductor board, a package board, an interposer board, a flexible printed board, an inorganic board, an organic board, a board including a conductor and a board that can form a conductor.

FIGS. 112A, 112B, 112C, 112D, 112E, 112F, 112G, 112H, 112I, 112J, 112K, 112L, 112M, 112N, 112O, 112P, 112Q, and 112R depict arrangement examples of the Victim conductor loop and the Aggressor conductor loops in stacked structures in which the three types of board depicted in FIG. 111 are stacked one on another.

Figures 112A, 112B, 112C, 112D, 112E, 112F, 112G, 112H, 112I, 112J, 112K, 112L, 112M, 112N, 112O, 112P, 112Q, 112R:
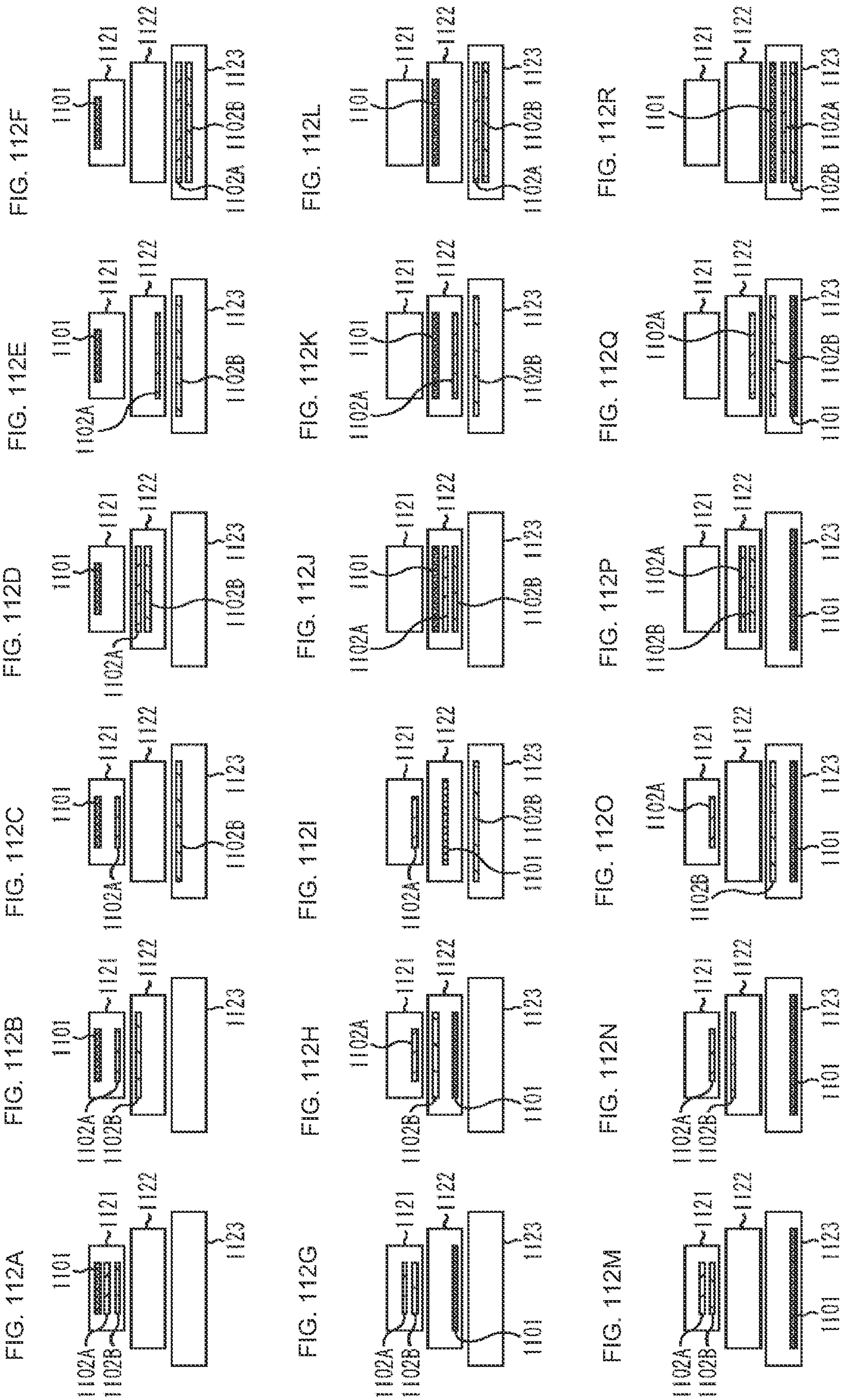
FIGS. 112A, 112B, 112C, 112D, 112E, 112F, 112G, 112H, 112I, 112J, 112K, 112L, 112M, 112N, 112O, 112P, 112Q, and 112R are figures for explaining arrangement examples of the Victim conductor loop and the Aggressor conductor loops in structures in which the three types of board are stacked.

FIG. 112A depicts a schematic diagram of a stacked structure in which all of the Victim conductor loop 1101, and the Aggressor conductor loops 1102A and 1102B are included in the semiconductor board 1121. The package board 1122 and the printed board 1123 in which none of the Victim conductor loop 1101, and the Aggressor conductor loops 1102A and 1102B is formed may be omitted.

FIG. 112B depicts a schematic diagram of a stacked structure in which the Victim conductor loop 1101 and the Aggressor conductor loop 1102A are included in the semiconductor board 1121, and the Aggressor conductor loop 1102B is included in the package board 1122. The printed board 1123 in which none of the Victim conductor loop 1101, and the Aggressor conductor loops 1102A and 1102B is formed may be omitted.

FIG. 112C depicts a schematic diagram of a stacked structure in which the Victim conductor loop 1101 and the Aggressor conductor loop 1102A are included in the semiconductor board 1121, and the Aggressor conductor loop 1102B is included in the printed board 1123. The package board 1122 in which none of the Victim conductor loop 1101, and the Aggressor conductor loops 1102A and 1102B is formed may be omitted.

FIG. 112D depicts a schematic diagram of a stacked structure in which the Victim conductor loop 1101 is included in the semiconductor board 1121, and the Aggressor conductor loops 1102A and 1102B are included in the package board 1122. The printed board 1123 in which none of the Victim conductor loop 1101, and the Aggressor conductor loops 1102A and 1102B is formed may be omitted.

FIG. 112E depicts a schematic diagram of a stacked structure in which the Victim conductor loop 1101 is included in the semiconductor board 1121, the Aggressor conductor loop 1102A is included in the package board 1122, and the Aggressor conductor loop 1102B is included in the printed board 1123.

FIG. 112E depicts a schematic diagram of a stacked structure in which the Victim conductor loop 1101 is included in the semiconductor board 1121, and the Aggressor conductor loops 1102A and 1102B are included in the printed board 1123. The package board 1122 in which none of the Victim conductor loop 1101, and the Aggressor conductor loops 1102A and 1102B is formed may be omitted.

FIG. 112G depicts a schematic diagram of a stacked structure in which the Aggressor conductor loops 1102A and 1102B are included in the semiconductor board 1121, and the Victim conductor loop 1101 is included in the package board 1122. The printed board 1123 in which none of the Victim conductor loop 1101, and the Aggressor conductor loops 1102A and 1102B is formed may be omitted.

FIG. 112H depicts a schematic diagram of a stacked structure in which the Aggressor conductor loop 1102A is included in the semiconductor board 1121, and the Aggressor conductor loop 1102B and the Victim conductor loop 1101 are included in the package board 1122. The printed board 1123 in which none of the Victim conductor loop 1101, and the Aggressor conductor loops 1102A and 1102B is formed may be omitted.

FIG. 112I depicts a schematic diagram of a stacked structure in which the Aggressor conductor loop 1102A is included in the semiconductor board 1121, the Victim conductor loop 1101 is included in the package board 1122, and the Aggressor conductor loop 1102B is included in the printed board 1123.

FIG. 112J depicts a schematic diagram of a stacked structure in which all of the Victim conductor loop 1101, and the Aggressor conductor loops 1102A and 1102B are included in the package board 1122. The semiconductor board 1121 and the printed board 1123 in which none of the Victim conductor loop 1101, and the Aggressor conductor loops 1102A and 1102B is formed may be omitted.

FIG. 112K depicts a schematic diagram of a stacked structure in which the Victim conductor loop 1101 and the Aggressor conductor loop 1102A are included in the package board 1122, and the Aggressor conductor loop 1102B is included in the printed board 1123. The semiconductor board 1121 in which none of the Victim conductor loop 1101, and the Aggressor conductor loops 1102A and 1102B is formed may be omitted.

FIG. 112L depicts a schematic diagram of a stacked structure in which the Victim conductor loop 1101 is included in the package board 1122, and the Aggressor conductor loops 1102A and 1102B are included in the printed board 1123. The semiconductor board 1121 in which none of the Victim conductor loop 1101, and the Aggressor conductor loops 1102A and 1102B is formed may be omitted.

FIG. 112M depicts a schematic diagram of a stacked structure in which the Aggressor conductor loops 1102A and 1102B are included in the semiconductor board 1121, and the Victim conductor loop 1101 is included in the printed board 1123. The package board 1122 in which none of the Victim conductor loop 1101, and the Aggressor conductor loops 1102A and 1102B is formed may be omitted.

FIG. 112N depicts a schematic diagram of a stacked structure in which the Aggressor conductor loop 1102A is included in the semiconductor board 1121, the Aggressor conductor loop 1102B is included in the package board 1122, and the Victim conductor loop 1101 is included in the printed board 1123.

FIG. 112O depicts a schematic diagram of a stacked structure in which the Aggressor conductor loop 1102A is included in the semiconductor board 1121, and the Aggressor conductor loop 1102B and the Victim conductor loop 1101 are included in the printed board 1123. The package board 1122 in which none of the Victim conductor loop 1101, and the Aggressor conductor loops 1102A and 1102B is formed may be omitted.

FIG. 112P depicts a schematic diagram of a stacked structure in which the Aggressor conductor loops 1102A and 1102B are included in the package board 1122, and the Victim conductor loop 1101 is included in the printed board 1123. The semiconductor board 1121 in which none of the Victim conductor loop 1101, and the Aggressor conductor loops 1102A and 1102B is formed may be omitted.

FIG. 112Q depicts a schematic diagram of a stacked structure in which the Aggressor conductor loop 1102A is included in the package board 1122, and the Aggressor conductor loop 1102B and the Victim conductor loop 1101 are included in the printed board 1123. The semiconductor board 1121 in which none of the Victim conductor loop 1101, and the Aggressor conductor loops 1102A and 1102B is formed may be omitted.

FIG. 112R depicts a schematic diagram of a stacked structure in which all of the Victim conductor loop 1101, and the Aggressor conductor loops 1102A and 1102B are included in the printed board 1123. The semiconductor board 1121 and the package board 1122 in which none of the Victim conductor loop 1101, and the Aggressor conductor loops 1102A and 1102B is formed may be omitted.

The stacking orders of boards depicted in-A to R in FIGS. 112A, 112B, 112C, 112D, 112E, 112F, 112G, 112H, 112I, 112J, 112K, 112L, 112M, 112N, 112O, 112P, 112Q, and 112R may be reversed, and the positions of the Victim conductor loop 1101, the Aggressor conductor loops 1102A and the Aggressor conductor loop 1102B may be reversed vertically.

As mentioned above, the Victim conductor loop 1101, and the Aggressor conductor loops 1102A and 1102B can be formed in any regions of the semiconductor board 1121, the package board 1122 and the printed board 1123.

<Package Stacking Examples of First Semiconductor Board 101 and Second Semiconductor Board 102 Included in Solid-State Image Pickup Apparatus 100>

Figure 113A:
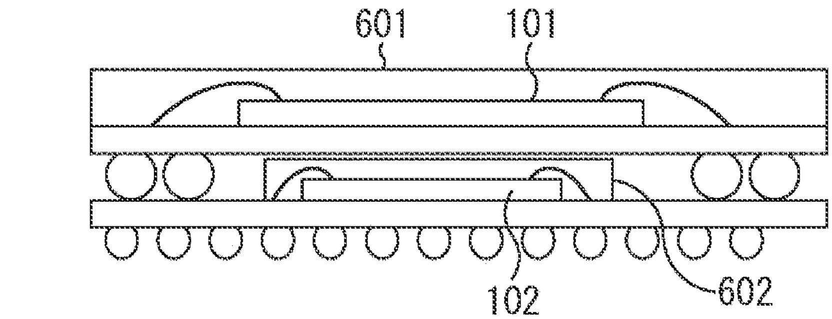
FIGS. 113A, 113B, and 113C are figures depicting package stacking examples of a first semiconductor board and a second semiconductor board forming the solid-state image pickup apparatus.
Figure 113B:
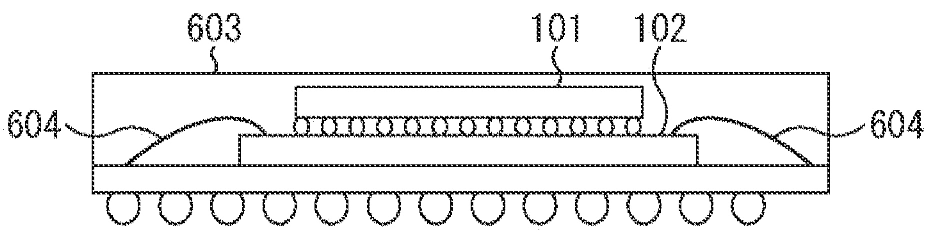
Figure 113C:
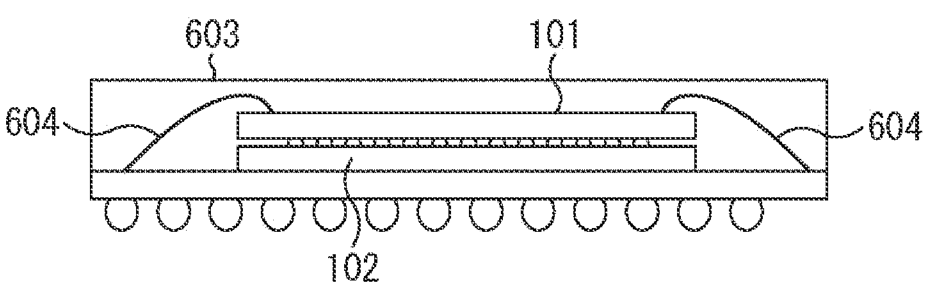

FIGS. 113A, 113B, and 113C is are figures depicting package stacking examples of the first semiconductor board 101 and the second semiconductor board 102 included in the solid-state image pickup apparatus 100.

The first semiconductor board 101 and the second semiconductor board 102 may be stacked one on another as a package in any manner.

For example, as depicted in FIG. 113A, the first semiconductor board 101 and the second semiconductor board 102 are separately sealed in by using sealing materials, and a package 601 and a package 602 that are obtained as a result may be stacked one on another.

In addition, as depicted in FIG. 113B or 113C, the first semiconductor board 101 and the second semiconductor board 102 may be sealed in by a sealing material in a state in which the first semiconductor board 101 and the second semiconductor board 102 are stacked one on another, to generate a package 603. In this case, bonding wires 604 may be connected to the second semiconductor board 102 as depicted in FIG. 113B, or may be connected to the first semiconductor board 101 as depicted in FIG. 113C.

In addition, the package may be of any mode. For example, the package may be a CSP (Chip Size Package) or a WL-CSP (Wafer Level Chip Size Package), or an interposer board or a rewiring layer may be used in the package. In addition, any form without packages may be adopted. For example, the semiconductor board may be implemented as a COB (Chip On Board). For example, the mode may be any of BGA (Ball Grid Array), COB (Chip On Board), COT (Chip On Tape), CSP (Chip Size Package/Chip Scale Package), DIMM (Dual In-line Memory Module), DIP (Dual In-line Package), FBGA (Fine-pitch Ball Grid Array), FLGA (Fine-pitch Land Grid Array), FQFP (Fine-pitch Quad Flat Package), HSIP (Single In-line Package with Heatsink), LCC (Leadless Chip Carrier), LFLGA (Low profile Fine pitch Land Grid Array), LGA (Land Grid Array), LQFP (Low-profile Quad Flat Package), MC-FBGA (Multi-Chip Fine-pitch Ball Grid Array), MCM (Multi-Chip Module), MCP (Multi-Chip Package), M-CSP (Molded Chip Size Package), MFP (Mini Flat Package), MQFP (Metric Quad Flat Package), MQUAD (Metal Quad), MSOP (Micro Small Outline Package), PGA (Pin Grid Array), PLCC (Plastic Leaded Chip Carrie), PLCC (Plastic Leadless Chip Carrie), QFI (Quad Flat I-leaded Package), QFJ (Quad Flat J-leaded Package), QFN (Quad Flat non-leaded Package), QFP (Quad Flat Package), QTCP (Quad Tape Carrier Package), QUIP (Quad In-line Package), SDIP (Shrink Dual In-line Package), SIMM (Single In-line Memory Module), SIP (Single In-line Package), S-MCP (Stacked Multi Chip Package), SNB (Small Outline Non-leaded Board), SOI (Small Outline I-leaded Package), SOJ (Small Outline J-leaded Package), SON (Small Outline Non-leaded Package), SOP (Small Outline Package), SSIP (Shrink Single In-line Package), SSOP (Shrink Small Outline Package), SZIP (Shrink Zigzag In-line Package), TAB (Tape-Automated Bonding), TCP (Tape Carrier Package), TQFP (Thin Quad Flat Package), TSOP (Thin Small Outline Package), TSSOP (Thin Shrink Small Outline Package), UCSP (Ultra Chip Scale Package), UTSOP (Ultra Thin Small Outline Package), VSO (Very Short Pitch Small Outline Package), VSOP (Very Small Outline Packag), WL-CSP (Wafer Level Chip Size Package), ZIP (Zigzag In-line Package), and pMCP (Micro Multi-Chip Package).

For example, the present technology can be applied to any sensor like a CCD (Charge-Coupled Device) image sensor, a CCD sensor, a CMOS sensor, a MOS sensor, an IR (Infrared) sensor, a UV (Ultraviolet) sensor, a ToF (Time of Flight) sensor, and a distance-measurement sensor, a circuit board, an apparatus, electronic equipment, and the like.

In addition, the present technology is suitable for a sensor, a circuit board, an apparatus, and electronic equipment in which some devices like transistors, diodes, and antennas are arrayed, and is particularly suitable for a sensor, a circuit board, an apparatus, and electronic equipment in which some devices are arrayed on substantially the same planes, but these are not essential.

For example, the present technology can also be applied to various types of memory sensor, memory circuit board, memory apparatus or electronic equipment including memories to which memory devices are related, various types of CCD sensor, CCD circuit board, CCD apparatus, and electronic equipment including CCD to which CCD is related, various types of CMOS sensor, CMOS circuit board, CMOS apparatus, and electronic equipment including CMOS to which CMOS is related, various types of MOS sensor, MOS circuit board, MOS apparatus, and electronic equipment including MOS to which MOS is related, various types of display sensor, display circuit board, display apparatus, and electronic equipment including displays to which luminescent devices are related, various types of laser sensor, laser circuit board, laser apparatus, and electronic equipment including lasers to which luminescent devices are related, various types of antenna sensor, antenna circuit board, antenna apparatus, and electronic equipment including antennas to which antenna devices are related, and the like. Among them, the present technology is suitable for a sensor, a circuit board, an apparatus, and electronic equipment including a Victim conductor loop with a variable loop path, a sensor, a circuit board, an apparatus, and electronic equipment including control lines or signal lines, a sensor, a circuit board, an apparatus, and electronic equipment including horizontal control lines or vertical signal lines, and the like, but these are not the sole examples.

11. Arrangement Examples of Conductive Shields

While it is explained in the configuration examples mentioned above that, by contriving configurations of the conductor layer A (wiring layer 165A) and the conductor layer B (wiring layer 165B), inductive noise can be reduced, inductive noise is ameliorated further by further providing conductive shields in configurations to be explained.

FIGS. 114A, 114B, 114C, 115A, 115B, and 115C are cross-sectional views depicting configuration examples in which conductive shields are provided to the solid-state image pickup apparatus 100 depicted in FIG. 6 in which the first semiconductor board 101 and the second semiconductor board 102 are stacked one on another.

Note that configurations other than the conductive shields in FIGS. 114A, 114B, 114C, 115A, 115B, and 115C are similar to those in the structure depicted in FIG. 6, and so explanations thereof are omitted as appropriate.

Figure 114A:
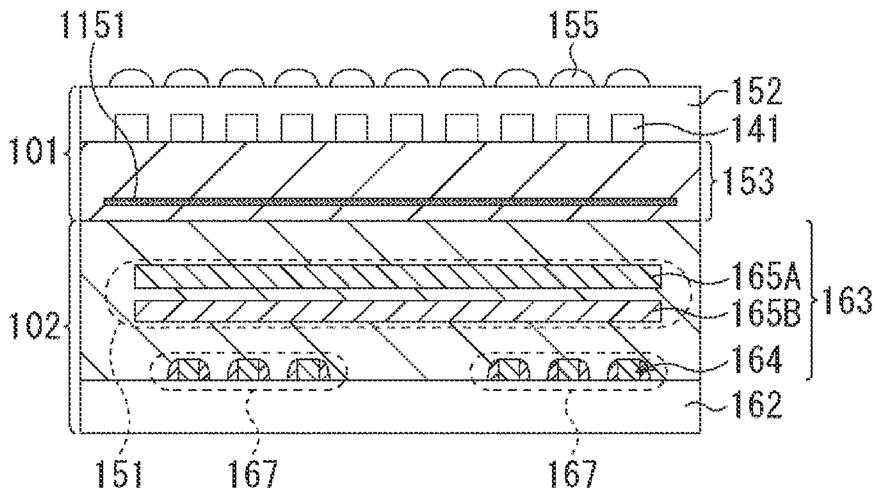
FIGS. 114A, 114B, and 114C is are cross-sectional views depicting configuration examples provided with conductive shields.

FIG. 114A is a cross-sectional view depicting a first configuration example in which a conductive shield is provided to the solid-state image pickup apparatus 100 depicted in FIG. 6.

FIG. 114A, a conductive shield 1151 is formed in the multi-layer wiring layer 153 of the first semiconductor board 101.

Figure 114B:
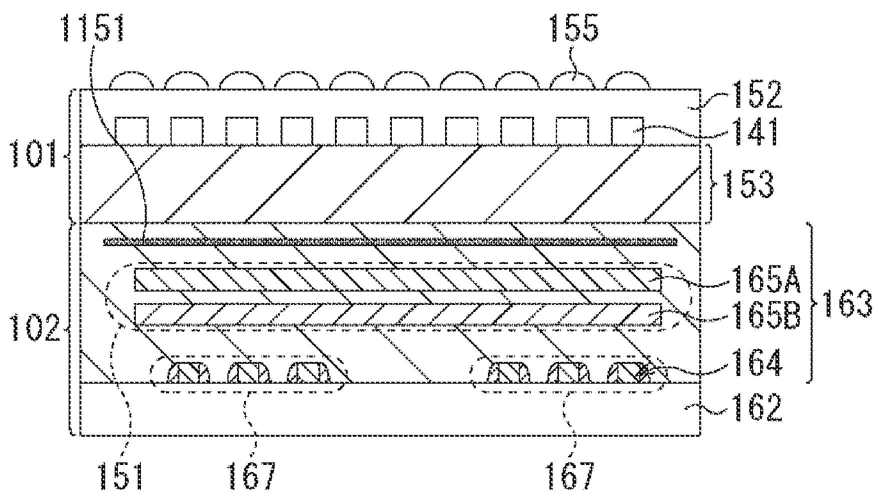

FIG. 114B is a cross-sectional view depicting a second configuration example in which a conductive shield is provided to the solid-state image pickup apparatus 100 depicted in FIG. 6.

FIG. 114B, the conductive shield 1151 is formed in the multi-layer wiring layer 163 of the second semiconductor board 102.

Figure 114C:
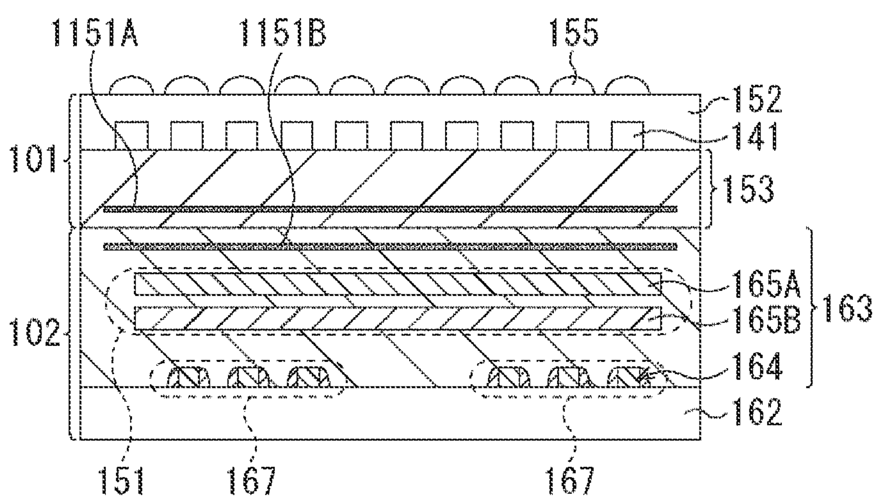

FIG. 114C is a cross-sectional view depicting a third configuration example in which conductive shields are provided to the solid-state image pickup apparatus 100 depicted in FIG. 6.

FIG. 114C, a conductive shield 1151 is formed in a multi-layer wiring layer of each of the first semiconductor board 101 and the second semiconductor board 102. More specifically, a conductive shield 1151A is formed in the multi-layer wiring layer 153 of the first semiconductor board 101, and a conductive shield 1151B is formed in the multi-layer wiring layer 163 of the second semiconductor board 102.

Figure 115A:
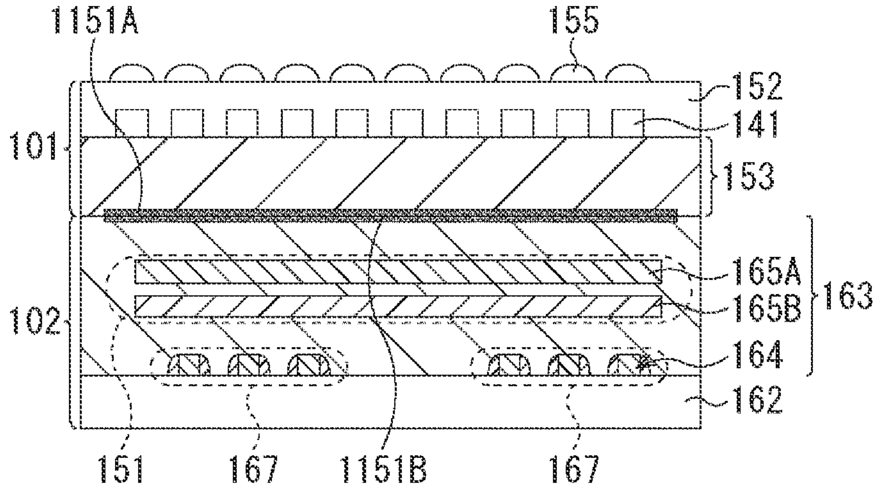
FIGS. 115A, 115B, and 115C are cross-sectional views depicting configuration examples provided with conductive shields.

FIG. 115A is a cross-sectional view depicting a fourth configuration example in which conductive shields are provided to the solid-state image pickup apparatus 100 depicted in FIG. 6.

FIG. 115A, the conductive shield 1151 is formed in a multi-layer wiring layer of each of the first semiconductor board 101 and the second semiconductor board 102, and the conductive shields 1151 are joined. More specifically, the conductive shield 1151A is formed on a surface of the multi-layer wiring layer 153 of the first semiconductor board 101 at which the multi-layer wiring layer 153 is joined with the multi-layer wiring layer 163 of the second semiconductor board 102, the conductive shield 1151B is formed on a surface of the multi-layer wiring layer 163 of the second semiconductor board 102 at which the multi-layer wiring layer 163 is joined with the multi-layer wiring layer 153 of the first semiconductor board 101, and the conductive shields 1151A and 1151B are joined, for example, by a junction between the same type of metal such as a Cu—Cu junction, an Au—Au junction or an Al—Al junction, or by a junction between different types of metal such as a Cu—Au junction, a Cu—Al junction or an Au—Al junction.

Note that while FIGS. 114C, and FIG. 115A depict examples in which the planar regions of the conductive shields 1151A and 1151B coincide with each other, it is sufficient if the regions are at least partially superimposed one on another, and joined.

Figure 115B:
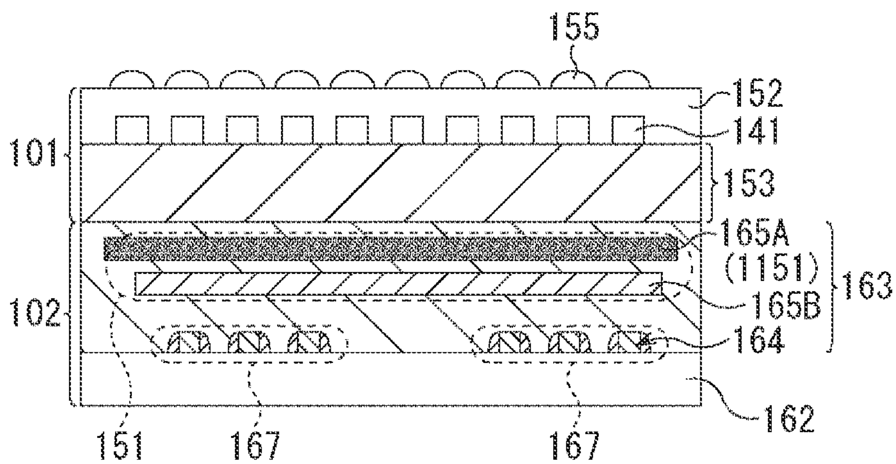

FIG. 115B is a cross-sectional view depicting a fifth configuration example in which a conductive shield is provided to the solid-state image pickup apparatus 100 depicted in FIG. 6.

In the configuration in FIG. 115B, the wiring layer 165A, which is the conductor layer A, also has the functionality as the conductive shield 1151. Part of the wiring layer 165A may be the conductive shield 1151.

Figure 115C:
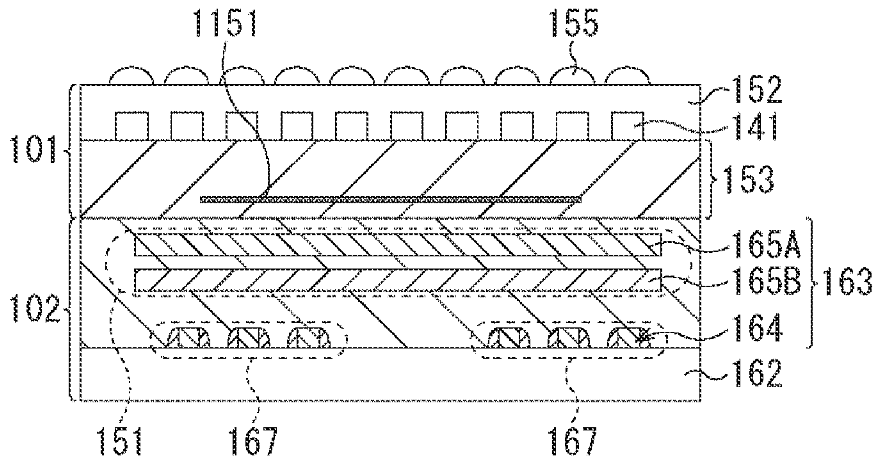

FIG. 115C is a cross-sectional view depicting a sixth configuration example in which a conductive shield is provided to the solid-state image pickup apparatus 100 depicted in FIG. 6.

In the sixth configuration example in FIG. 115C, the conductive shield 1151 is formed in the multi-layer wiring layer 153 similarly to the first configuration example depicted in FIG. 114A, but the planar region in which the conductive shield 1151 is formed is made smaller than the planar regions of the wiring layer 165A, which is the conductor layer A, and the wiring layer 165B, which is the conductor layer B.

As in the first configuration example in FIG. 114A, the area size of the planar region where the conductive shield 1151 is formed is preferably equal to or larger than the area sizes of the planar regions of the wiring layer 165A, which is the conductor layer A, and the wiring layer 165B, which is the conductor layer B, but may be made smaller than them as in FIG. 115B.

As in the first to sixth configuration examples in FIGS. 114A, 114B, 114C, 115A, 115B, and 115C, inductive noise can be ameliorated further by providing the conductive shields 1151.

While wiring layers to be blocked off by the conductive shields 1151 are two layers, which are the wiring layers 165A and 165B, in the first to sixth configuration examples in FIGS. 114A, 114B, 114C, 115A, 115B, and 115C, the number of wiring layers to be blocked off may be one.

Magnetic shields may be used instead of the conductive shields 1151 in the first to sixth configuration examples in FIGS. 114A, 114B, 114C, 115A, 115B, and 115C. The magnetic shields may be electrically conductive or may not be electrically conductive. In a case in which the magnetic shields are electrically conductive, inductive noise and capacitive noise can be ameliorated further.

Next, the arrangement and planar shape of a conductive shield 1151 relative to signal lines 132 formed in the first semiconductor board 101 are explained with reference to FIGS. 116A, 116B, 117A, 117B, 118A, 118B, 119A, and 119B.

FIGS. 116A, 116B, 117A, 117B, 118A, 118B, 119A, and 119B depict first to fourth configuration examples of the arrangement and planar shape of the conductive shield 1151 relative to the signal lines 132. The first to fourth configuration examples in FIGS. 116A, 116B, 117A, 117B, 118A, 118B, 119A, and 119B are the same in other respects than the planar shape of the conductive shield 1151.

Figure 116A:
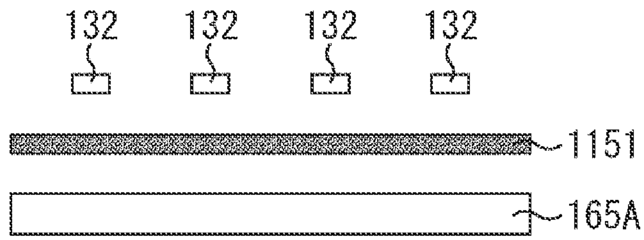
FIGS. 116A and 116B are figures depicting a first configuration example of the arrangement of a conductive shield relative to signal lines, and a planar shape.
Figure 116B:
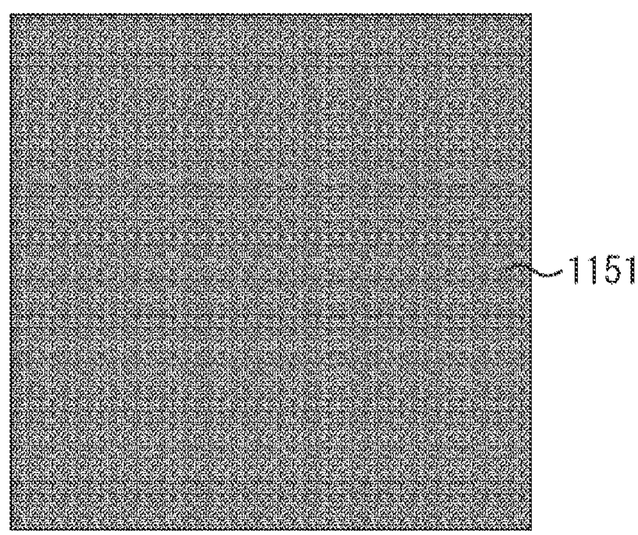

FIG. 116A is a cross-sectional view depicting a positional relation in the Z direction among signal lines 132 through which analog pixel signals are transferred in the first semiconductor board 101, the conductive shield 1151 and the wiring layer 165A. FIG. 116B is a plan view depicting the planar shape of the conductive shield 1151.

As depicted in FIG. 116A, the conductive shield 1151 is arranged between the signal lines 132 and the wiring layer 165A. As depicted in FIG. 116B, the planar shape of the conductive shield 1151 can be formed like a sheet.

Figure 117A:
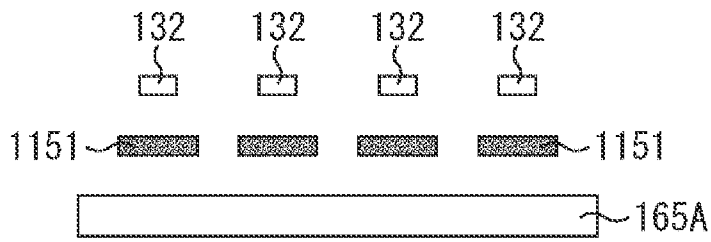
FIGS. 117A and 117B is are figures depicting a second configuration example of the arrangement of a conductive shield relative to signal lines, and a planar shape.
Figure 117B:
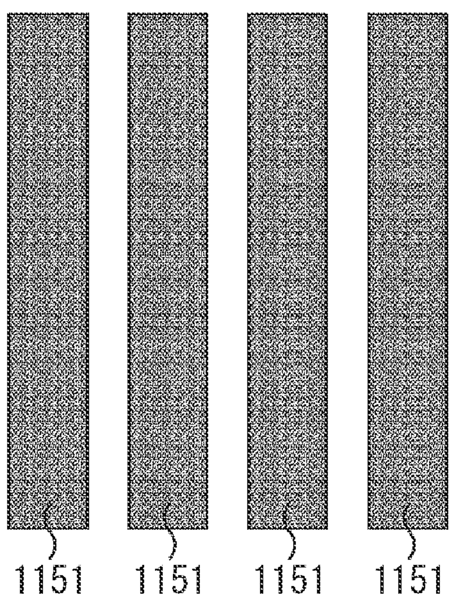

Alternatively, as in the second configuration example in FIGS. 117A and 117B, the planar shape of the conductive shield 1151 can be formed like straight lines, and each straight-line-like region can be superimposed on one of the signal lines 132 in a one-to-one correspondence.

Figure 118A:
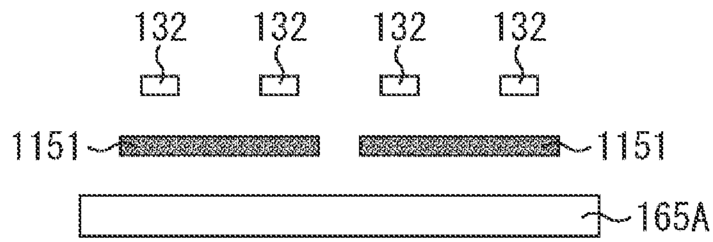
FIGS. 118A and 118B are figures depicting a third configuration example of the arrangement of a conductive shield relative to signal lines, and a planar shape.
Figure 118B:
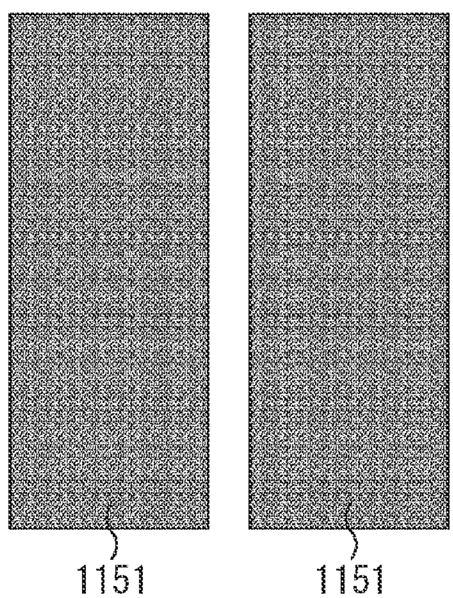

Alternatively, as in the second configuration example in FIGS. 117A and 117B, each straight-line-like region of the conductive shield 1151 needs not correspond to one of the signal lines 132 in a one-to-one correspondence, and as in the third configuration example in FIGS. 118A and 118B, for example, the straight-line-like regions may be formed such that each straight-line-like region is superimposed on multiple signal lines 132. While each straight-line-like region of the conductive shield 1151 corresponds to two signal lines 132 in the planar shape in FIGS. 118A and 118B, each straight-line-like region may correspond to three or more signal lines 132 in the planar shape.

Figure 119A:
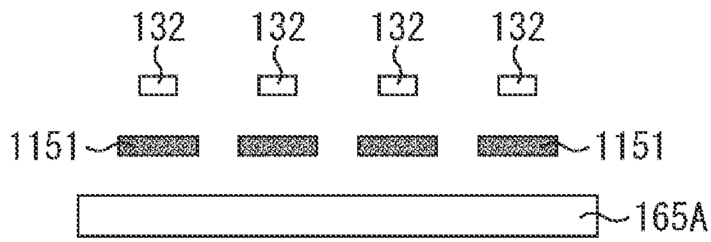
FIGS. 119A and 119B are figures depicting a fourth configuration example of the arrangement of a conductive shield relative to signal lines, and a planar shape.
Figure 119B:
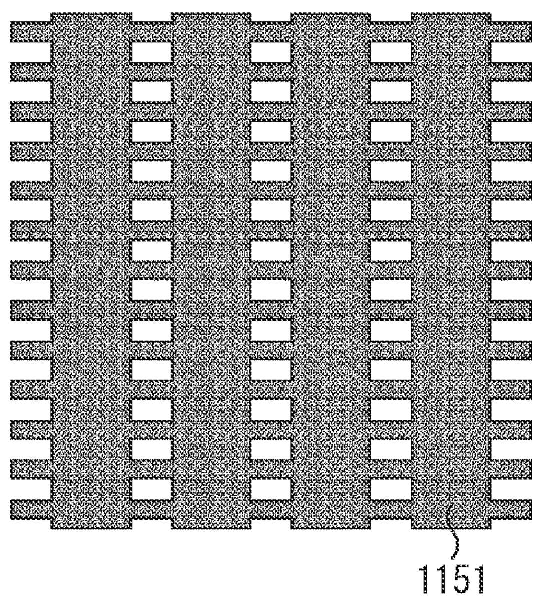

Alternatively, the planar shape of the conductive shield 1151 may not be formed like straight lines, but may be formed like a mesh as in the fourth configuration example in-A and B in FIGS. 119A and 119B. The conductor widths, gap widths and conductor pitches of vertical conductors extending in the longitudinal direction (Y direction) of the mesh conductive shield 1151, and horizontal conductors extending in the lateral direction (X direction) of the mesh conductive shield 1151 may be mutually different or the same with each other.

While the conductive shield 1151 has one layer in the first to fourth configuration examples in FIGS. 116A, 116B, 117A, 117B, 118A, 118B, 119A, and 119B, the conductive shield 1151 can also have two layers as depicted in FIGS. 114C and FIG. 115A. In addition, this similarly applies to cases in which the wiring layer 165A depicted in FIGS. 116A, 116B, 117A, 117B, 118A, 118B, 119A, and FIG. 119B is the wiring layer 165B.

While the conductive shield 1151 is formed at a position that is superimposed on all regions of the signal lines 132, the conductive shield 1151 may be formed at a position that is or is not superimposed on partial regions. It should be noted however that because noise is often propagated through signal lines, the conductive shield 1151 is preferably at a position that is superimposed on the signal lines 132.

While the formation position of the conductive shield 1151 relative to the signal lines 132 through which analog pixel signals are transferred in the first semiconductor board 101 is explained, the conductive shield 1151 may be formed relative not to the signal lines 132 for transferring pixel signals, but to signal lines for transferring other signals, or control lines, wires, conductors or GND. The conductive shield 1151 is preferably connected to GND or a negative power supply in order to allow noise to dissipate efficiently, but may be connected to another control line, another signal line, another conductor or another wire. Alternatively, the conductive shield 1151 does not have to be connected to another control line, another signal line, another conductor, another wire or the like.

By providing the conductive shield 1151, inductive noise and capacitive noise can be ameliorated further.

12. Configuration Examples in Case in which There are Three Conductor Layers

<Arrangement Example in Case in which there are Three Conductor Layers>

The wiring patterns of the two conductor layers, the conductor layer A, which is the wiring layer 165A, and the conductor layer B, which is the wiring layer 165B, are explained in each configuration example mentioned above.

However, in some cases, a third conductor layer is arranged further near the two conductor layers, the wiring layer 165A (conductor layer A) and the wiring layer 165B (conductor layer B).

The third conductor layer is used, for example, as a wire for relaying GND or a negative power supply to a Vss wire of the conductor layer A, which is the wiring layer 165A, a wire for relaying a positive power supply to a Vdd wire of the conductor layer B, which is the wiring layer 165B, a reinforcement wire for reducing, as much as possible, voltage drops (IR-Drop) of the conductor layer A or the conductor layer B, or the like.

If the third conductor layer is referred to as a wiring layer 165C or a conductor layer C corresponding to the names of the wiring layers 165A and 165B, the conductor layer A and the conductor layer B in each configuration example mentioned above, the wiring layer 165C, which is a third conductor layer, is arranged relative to the wiring layers 165A and 165B in the positional relation in any of FIGS. 120A, 120B, and 120C.

A to C in FIGS. 120A, 120B, and 120C are cross-sectional schematic diagrams depicting arrangement examples of the wiring layer 165C relative to the wiring layers 165A and 165B.

In the first semiconductor board 101, a wiring layer 170 (fourth conductor layer) including at least some of control lines 133 to control transistors of pixels 131, or at least some of signal lines 132 to transfer pixel signals is formed, and in the second semiconductor board 102, an active element layer 171 including active elements such as MOS transistors 164 is formed. The at least some of the control lines 133, or the at least some of the signal lines 132 may be included as at least part of a Victim conductor loop (the Victim conductor loop 11 or the Victim conductor loop 1101) mentioned before, but this is not essential.

As has been explained with reference to FIG. 6 and the like, the wiring layer 165A is arranged on the side of the wiring layer 170 of the first semiconductor board 101, and the wiring layer 165B is arranged on the side of the active element layer 171.

Relative to this arrangement of the wiring layers 165A and 165B, the wiring layer 165C (conductor layer C) is arranged between the wiring layer 165B and the active element layer 171 as depicted in FIG. 120A, in some cases. In this case, the wiring layers are stacked in the order of the wiring layer 170, the wiring layer 165A, the wiring layer 165B, the wiring layer 165C and the active element layer 171 from the side of the first semiconductor board 101.

Alternatively, the wiring layer 165C (conductor layer C) is arranged between the wiring layer 165A and the wiring layer 165B as depicted in FIG. 120B, in some cases. In this case, the wiring layers are stacked in the order of the wiring layer 170, the wiring layer 165A, the wiring layer 165C, the wiring layer 165B and the active element layer 171 from the side of the first semiconductor board 101.

Furthermore, the wiring layer 165C (conductor layer C) is arranged between the wiring layer 170 and the wiring layer 165A as depicted in FIG. 120C, in some cases. In this case, the wiring layers are stacked in the order of the wiring layer 170, the wiring layer 165C, the wiring layer 165A, the wiring layer 165B and the active element layer 171 from the side of the first semiconductor board 101.

Note that FIGS. 120A, 120B, and 120C are figures for explaining the positional relations of the three conductor layers, which are the wiring layers 165A to 165C, and the arrangement of the wiring layer 170 of the first semiconductor board 101 and the active element layer 171 of the second semiconductor board 102 may be reversed. In addition, the first semiconductor board 101 does not have to include either signal lines 132 or control lines 133. Even in a case in which the first semiconductor board 101 includes both signal lines 132 and control lines 133, it is sufficient if at least some of either signal lines 132 or control lines 133 are formed in the wiring layer 170.

In addition, signal lines 132 or control lines 133 may not be included in the first semiconductor board 101 but in the second semiconductor board 102. In addition, at least some of signal lines 132 or control lines 133 may be included in the first semiconductor board 101 and the second semiconductor board 102 and, for example, may be included in at least part of both the first semiconductor board 101 and the second semiconductor board 102. In addition, at least any one wiring layer of the wiring layer 165A, the wiring layer 165B and the wiring layer 165C may be included not in the first semiconductor board 101, but in the second semiconductor board 102. In addition, the arrangement of the wiring layer 170 of the first semiconductor board 101, and the active element layer 171 of the second semiconductor board 102 may be omitted. In addition, the first semiconductor board 101 and the second semiconductor board 102 may be configured not as separate bodies, but integrally as one semiconductor board. In addition, the wiring layer 170 may be interpreted as the Victim conductor loop 1101, the wiring layer 165A may be interpreted as the Aggressor conductor loop 1102A, the wiring layer 165B may be interpreted as the Aggressor conductor loop 1102B, and the wiring layer 165C may be arranged at any position in the board arrangement examples depicted in FIGS. 109A, 109B, 109C, 110A, 110B, 110C, 110D, 110E, 110F 110G, 110H, 110I, 111, 112A, 112B, 112C, 112D, 112E, 112F, 112G, 112H, 112I, 112J, 112K, 112L, 112M, 112N, 112O, 112P, 112Q, and 112R. The positional relation among the three conductor layers, which are the wiring layers 165A to 165C, is desirably, but is not necessarily, the positional relation depicted in FIGS. 120A, 120B, and 120C.

<Problem in Case in which There are Three Conductor Layers>

While, in the wiring layout proposed in each configuration example mentioned above, hot carrier light emissions from an active element group 167 are blocked, and inductive noise, capacitive noise or voltage drops is/are at least ameliorated in the two conductor layers, which are the conductor layer A (wiring layer 165A) and the conductor layer B (wiring layer 165B), inductive noise undesirably can worsen in some cases depending on the wiring layout of the third conductor layer.

FIGS. 121A, 121B, 121C, 121D, 121E, and 121F are figures depicting one example of the wiring pattern of the wiring layer 165C.

Figures 121A, 121B, 121C, 121D, 121E, 121F:
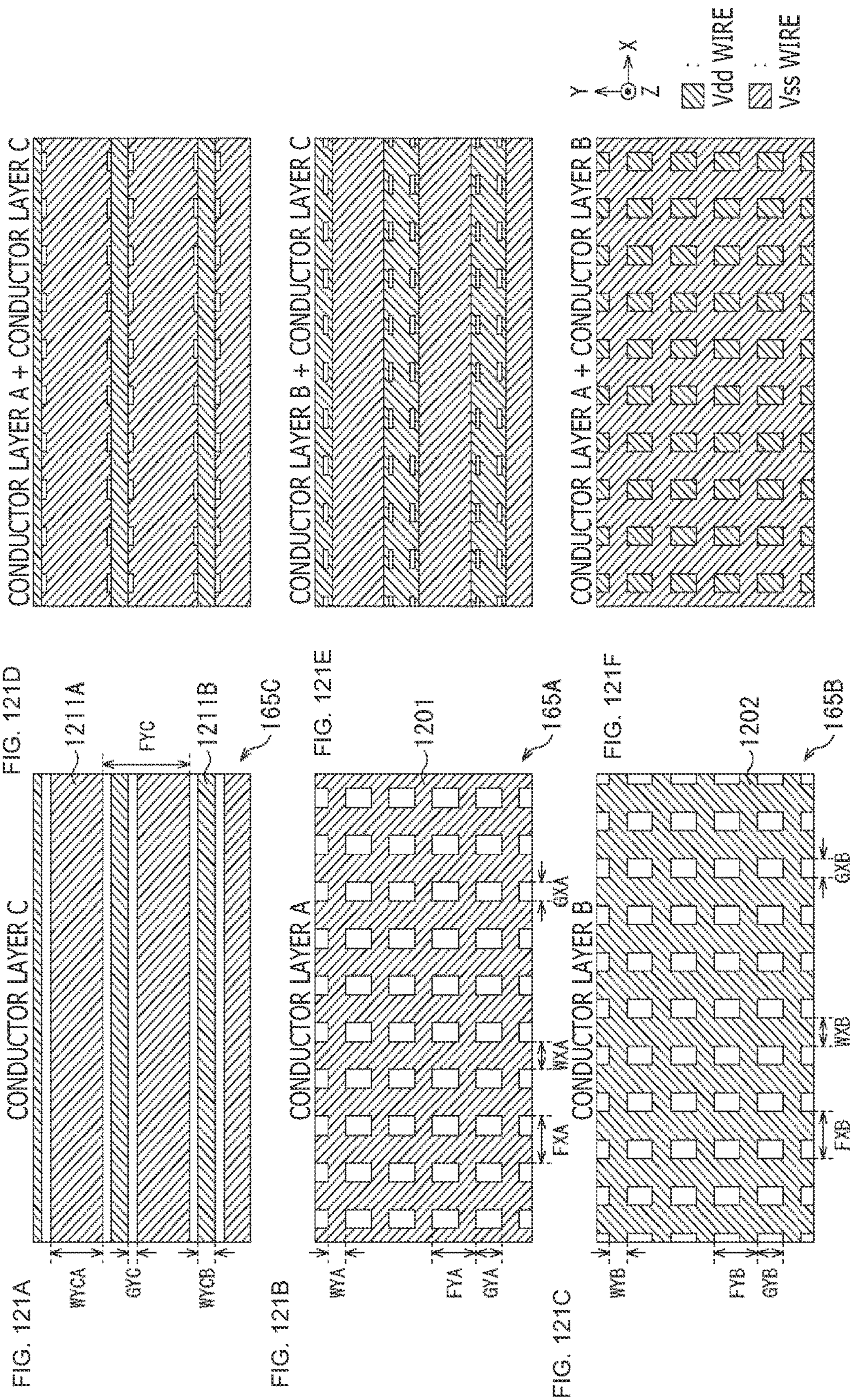

FIG. 121A depicts the conductor layer C (wiring layer 165C), FIG. 121B depicts the conductor layer A (wiring layer 165A), and FIG. 121C depicts the conductor layer B (wiring layer 165B).

In addition, FIG. 121D is a plan view of the stacked state of the conductor layer A and the conductor layer C, FIG. 121E is a plan view of the stacked state of the conductor layer B and the conductor layer C, and FIG. 121F is a plan view of the stacked state of the conductor layer A and the conductor layer B.

In the coordinate system in FIGS. 121A, 121B, 121C, 121D, 121E, and 121F, the X axis lies in the lateral direction, the Y axis lies in the longitudinal direction, and the Z axis lies in a direction perpendicular to the XY plane.

The eleventh configuration example using a mesh conductor with mutually different X-direction (first-direction) and Y-direction (second-direction) resistance values explained with reference to FIGS. 36A, 36B, and 36C are adopted for the conductor layer A (wiring layer 165A) and the conductor layer B (wiring layer 165B) in FIGS. 121A, 121B, 121C, 121D, 121E, and 121F The conductor layer A in FIG. 121B includes a mesh conductor 1201. The mesh conductor 1201 has the X-direction conductor width WXA, gap width GXA, and conductor pitch FXA and has the Y-direction conductor width WYA, gap width GYA, and conductor pitch FYA. The mesh conductor 1201 is a conductor with a shape in which the basic pattern (first basic pattern) with the conductor pitch FXA and the conductor pitch FYA is arranged repetitively on the same plane. The mesh conductor 1201 is a wire (Vss wire) connected to GND or a negative power supply, for example.

The mesh conductor 1201 satisfies (conductor width WXA)>(conductor width WYA), and (gap width GYA)>(gap width GXA). Gap regions of the mesh conductor 1201 have shapes which are longer in the Y direction than in the X direction. The mesh conductor 1201 has mutually different X-direction and Y-direction resistance values, and the Y-direction resistance value is smaller than the X-direction resistance value. Accordingly, in the mesh conductor 1201, currents flow more easily in the Y direction than in the X direction.

The conductor layer B in FIG. 121C includes a mesh conductor 1202. The mesh conductor 1202 has the X-direction conductor width WXB, gap width GXB, and conductor pitch FXB and has the Y-direction conductor width WYB, gap width GYB, and conductor pitch FYB. The mesh conductor 1202 is a conductor with a shape in which the basic pattern (second basic pattern) with the conductor pitch FXB and the conductor pitch FYB is arranged repetitively on the same plane. The mesh conductor 1202 is a wire (Vdd wire) connected to a positive power supply, for example.

The mesh conductor 1202 satisfies (conductor width WXB)>(conductor width WYB), and (gap width GYB)>(gap width GXB). Gap regions of the mesh conductor 1202 have shapes which are longer in the Y direction than in the X direction. The mesh conductor 1202 has mutually different X-direction and Y-direction resistance values, and the Y-direction resistance value is smaller than the X-direction resistance value. Accordingly, in the mesh conductor 1202, currents flow more easily in the Y direction than in the X direction.

The mesh conductor 1201 in the conductor layer A and the mesh conductor 1202 in the conductor layer B form a differential structure. That is, as explained in the eleventh configuration example and the like, the current distribution in the mesh conductor 1201 in the conductor layer A and the current distribution in the mesh conductor 1202 in the conductor layer B are substantially even distributions and have mutually reverse characteristics. Here, being substantially even means that the differences are so small that they can be deemed to be even, and it is sufficient if at least the differences are 200%-differences or smaller, for example. More specifically, AC currents flow substantially evenly at end sections of the mesh conductor 1201 in the conductor layer A and the mesh conductor 1202 in the conductor layer B, and the directions of the electric currents in the mesh conductor 1201 and the mesh conductor 1202 are mutually opposite directions. As a result, a magnetic field generated by the current distribution in the mesh conductor 1201, and a magnetic field generated by the current distribution in the mesh conductor 1202 are offset effectively. Thereby, inductive noise can be suppressed.

In addition, as depicted in FIG. 121E, there are no open regions due to the stacking of the conductor layer A and the conductor layer B, and so hot carrier light emissions from an active element group 167 can be blocked.

On the other hand, the conductor layer C in FIG. 121A is a conductor layer with a low sheet resistance that allows currents to flow more easily, and linear conductors 1211A that are long in the X direction, and linear conductors 1211B that are long in the X direction are arranged alternately regularly in the Y direction. The linear conductors 1211A are wires (Vss wires) connected to GND or a negative power supply, for example. The linear conductors 1211B are wires (Vdd wires) connected to a positive power supply, for example. For example, the linear conductors 1211A are connected to pads (not depicted) at an outer circumferential section of the semiconductor board and are electrically connected with the mesh conductor 1201 in the conductor layer A. The mesh conductor 1201 in the conductor layer A and the linear conductors 1211A in the conductor layer C may be electrically connected via conductor vias extending in the Z direction, or the like, for example. For example, the linear conductors 1211B are connected to pads (not depicted) at an outer circumferential section of the semiconductor board and are electrically connected with the mesh conductor 1202 in the conductor layer B. The mesh conductor 1202 in the conductor layer B, and the linear conductors 1211B in the conductor layer C may be electrically connected via conductor vias extending in the Z direction, or the like, for example.

The linear conductors 1211A have a Y-direction conductor width WYCA, the linear conductors 1211B have a Y-direction conductor width WYCB, and the conductor width WYCA of the linear conductors 1211A is larger than the conductor width WYCB of the linear conductors 1211B ((conductor width WYCA)>(conductor width WYCB)). There is a gap with a gap width GYC between each linear conductor 1211A and each linear conductor 1211B in the Y direction. Then, one linear conductor 1211A and linear conductor 1211B are arranged regularly in the Y direction at a conductor pitch FYC (=(conductor width WYCA)+(conductor width WYCB)+2×(gap width GYC)).

If a predetermined planar range (planar region) of the conductor layer C in which linear conductors 1211A and linear conductors 1211B are arranged regularly in the Y direction at the conductor pitch FYC is looked at, the sum total of the conductor widths WYCA of multiple linear conductors 1211A in the predetermined planar range, and the sum total of the conductor widths WYCB of multiple linear conductors 1211B in the predetermined planar range differ significantly because the conductor width WYCA of a linear conductor 1211A and the conductor width WYCB of a linear conductor 1211B are different. In this case, because the current distribution in the linear conductors 1211A and the current distribution in the linear conductors 1211B differ significantly, the occurrence of inductive noise cannot be suppressed, and inductive noise worsens. Specifically, because the X-direction resistance values of the linear conductors 1211A and the linear conductors 1211B differ significantly, the current distributions in the linear conductors 1211A and the linear conductors 1211B differ significantly, and the total amount of currents to flow through the linear conductors 1211A becomes larger than the total amount of currents to flow through the linear conductors 1211B. In addition, in accordance with the current preservation law (Kirchhoff's first law), the total amount of currents to flow through the mesh conductor 1202 becomes larger than the total amount of currents to flow through the mesh conductor 1201. Thereby, the current distributions in the mesh conductors 1201 and the mesh conductors 1202 differ significantly. Accordingly, the occurrence of inductive noise cannot be suppressed, and inductive noise worsens.

Accordingly, the effect of suppressing inductive noise in the two conductor layers, which are the conductor layer A and the conductor layer B, is undesirably reduced depending on the wiring layout of the conductor layer C.

In view of this, in the configurations explained hereinbelow, inductive noise is effectively reduced in a case in which there is a stacked structure of the three conductor layers, which are the wiring layers 165A to 165C. Note that the configuration example in FIGS. 121A, 121B, 121C, 121D, 121E, and 121F can be applied depending on the magnitude of inductive noise in some cases, and so the configuration example in FIGS. 121A, 121B, 121C, 121D, 121E, and 121F are not excluded.

<First Configuration Example of Three Conductor Layers>

FIGS. 122A, 122B, 122C, 122D, 122E, and 122F depict a first configuration example of three conductor layers.

Figures 122A, 122B, 122C, 122D, 122E, 122F:
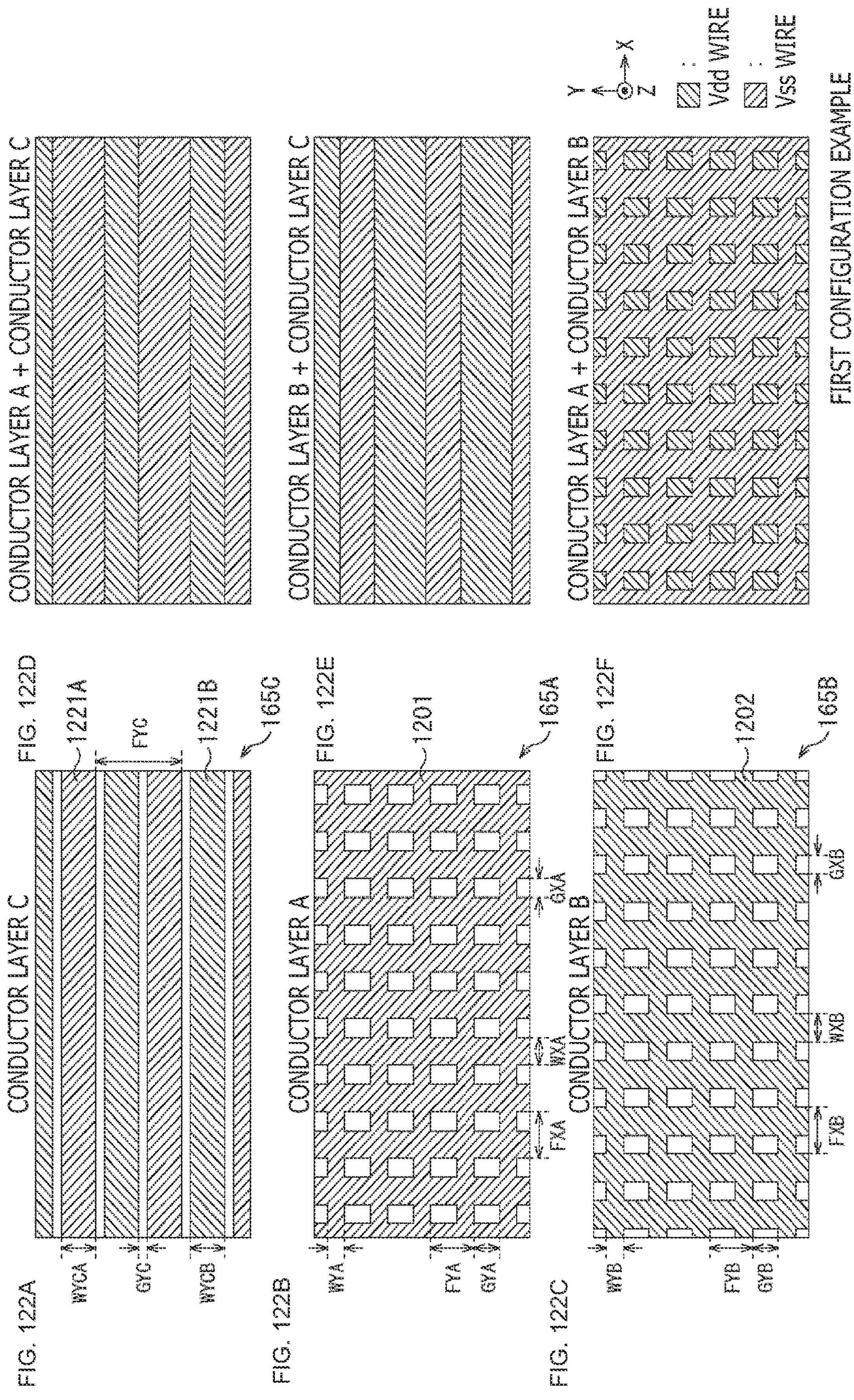

FIG. 122A depicts the conductor layer C (wiring layer 165C), FIG. 122B depicts the conductor layer A (wiring layer 165A), and FIG. 122C depicts the conductor layer B (wiring layer 165B).

In addition, FIG. 122D is a plan view of the stacked state of the conductor layer A and the conductor layer C, FIG. 122E is a plan view of the stacked state of the conductor layer B and the conductor layer C, and FIG. 122F is a plan view of the stacked state of the conductor layer A and the conductor layer B.

The conductor layer A in FIG. 122B includes the mesh conductor 1201 which is the same as the one in FIGS. 121A, 121B, 121C, 121D, 121E, and 121F. That is, the mesh conductor 1201 has the X-direction conductor width WXA, gap width GXA, and conductor pitch FXA and has the Y-direction conductor width WYA, gap width GYA, and conductor pitch FYA. The mesh conductor 1201 is a conductor with a shape in which the basic pattern (first basic pattern) with the conductor pitch FXA and the conductor pitch FYA is arranged repetitively on the same plane. The mesh conductor 1201 is a wire (Vss wire) connected to GND or a negative power supply, for example.

The conductor layer B in FIG. 122C includes the mesh conductor 1202 which is the same as the one in FIGS. 121A, 121B, 121C, 121D, 121E, and 121F. That is, the mesh conductor 1202 has the X-direction conductor width WXB, gap width GXB, and conductor pitch FXB and has the Y-direction conductor width WYB, gap width GYB, and conductor pitch FYB. The mesh conductor 1202 is a conductor with a shape in which the basic pattern (second basic pattern) with the conductor pitch FXB and the conductor pitch FYB is arranged repetitively on the same plane. The mesh conductor 1202 is a wire (Vdd wire) connected to a positive power supply, for example. The conductor pitches of the mesh conductor 1201 and the mesh conductor 1202 are the same. That is, (conductor pitch FXA)=(conductor pitch FXB) and (conductor pitch FYA)=(conductor pitch FYB) are satisfied. Note that they may be substantially the same. Here, being substantially the same means that the differences are so small that they can be deemed to be the same, and it is sufficient if at least the differences are 200%-differences or smaller, for example.

The conductor layer C in FIG. 122A is a conductor layer with a low sheet resistance that allows currents to flow more easily, and linear conductors 1221A (third basic pattern) that are long in the X direction, and linear conductors 1221B (fourth basic pattern) that are long in the X direction are arranged alternately regularly in the Y direction.

The linear conductors 1221A are wires (Vss wires) connected to GND or a negative power supply, for example. The linear conductors 1221B are wires (Vdd wires) connected to a positive power supply, for example. The linear conductors 1221A and the linear conductors 1221B are differential conductors (differential structures) in which currents flow in mutually opposite directions. For example, the linear conductors 1221A are connected to pads (not depicted) at an outer circumferential section of the semiconductor board and are electrically connected with the mesh conductor 1201 in the conductor layer A. The mesh conductor 1201 in the conductor layer A and the linear conductors 1221A in the conductor layer C may be electrically connected via conductor vias extending in the Z direction, or the like, for example. For example, the linear conductors 1221B are connected to pads (not depicted) at an outer circumferential section of the semiconductor board and are electrically connected with the mesh conductor 1202 in the conductor layer B. The mesh conductor 1202 in the conductor layer B, and the linear conductors 1221B in the conductor layer C may be electrically connected via conductor vias extending in the Z direction, or the like, for example.

The linear conductors 1221A have the Y-direction conductor width WYCA, the linear conductors 1221B have the Y-direction conductor width WYCB, and the conductor width WYCA of the linear conductors 1221A and the conductor width WYCB of the linear conductors 1221B are the same ((conductor width WYCA)=(conductor width WYCB)). Note that the conductor width WYCA and the conductor width WYCB do not have to be the same, but may be substantially the same ((conductor width WYCA)≈(conductor width WYCB)). There is a gap with the gap width GYC between each linear conductor 1221A and each linear conductor 1221B in the Y direction.

Then, one linear conductor 1221A and linear conductor 1221B are arranged regularly in the Y direction at the conductor pitch FYC (=(conductor width WYCA)+(conductor width WYCB)+2×(gap width GYC)). The conductor pitch FYC of the linear conductors 1221A and the conductor pitch FYC of the linear conductors 1221B are the same or substantially the same.

In addition, the conductor pitch FYC, which is the repetition pitch of the linear conductors 1221A in the conductor layer C, is an integer multiple of the conductor pitch FYA, which is the Y-direction repetition pitch of the mesh conductors 1201 in the conductor layer A. FIGS. 122A, 122B, 122C, 122D, 122E, and 122F depict an example in which the conductor pitch FYC is 200% of the conductor pitch FYA.

The conductor pitch FYC, which is the repetition pitch of the linear conductors 1221B in the conductor layer C, is an integer multiple of the conductor pitch FYB, which is the Y-direction repetition pitch of the mesh conductor 1202 in the conductor layer B. FIGS. 122A, 122B, 122C, 122D, 122E, and 122F depict an example in which the conductor pitch FYC is 200% of the conductor pitch FYB.

Note that the conductor width WYCA, the conductor width WYCB and the gap width GYC can be designed to have any values.

If a predetermined planar range (planar region) of the conductor layer C in which linear conductors 1221A and linear conductors 1221B are arranged regularly in the Y direction at the conductor pitch FYC is looked at, the sum total of the conductor widths WYCA of multiple linear conductors 1221A in the predetermined planar range, and the sum total of the conductor widths WYCB of multiple linear conductors 1221B in the predetermined planar range become the same or substantially the same because the conductor width WYCA of a linear conductor 1221A and the conductor width WYCB of a linear conductor 1221B are the same or substantially the same. Thereby, the current distribution in the linear conductors 1221A and the current distribution in the linear conductors 1221B become the same or substantially the same, and so the occurrence of inductive noise can be suppressed.

In addition, for example, in a case in which the conductor layer C is arranged near the wiring layer 170 as depicted in FIG. 120C, capacitive noise can occur due to capacitive coupling between the linear conductors 1221A and linear conductors 1221B in the conductor layer C, and signal lines 132 or control lines 133 in the wiring layer 170, but because the linear conductors 1221A and the linear conductors 1221B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 122F, the stacking of the conductor layers A and B forms a light-blocking structure, and needless to say, hot carrier light emissions from an active element group 167 can be blocked. In addition, as depicted in FIGS. 122D and 122E, the stacking of the conductor layers A and C, and the stacking of the conductor layers B and C also form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

Furthermore, in a case in which the mesh conductor 1201 in the conductor layer A, and the linear conductors 1221A in the conductor layer C are electrically connected, and the mesh conductor 1202 in the conductor layer B, and the linear conductors 1221B in the conductor layer C are electrically connected, the current amounts of the conductor layers A and B can be reduced, and so inductive noise from the conductor layers A and B, and voltage drops can be ameliorated further.

<Second Configuration Example of Three Conductor Layers>

FIGS. 123A, 123B, 123C, 123D, 123E, and 123F depict a second configuration example of three conductor layers.

Figures 123A, 123B, 123C, 123D, 123E, 123F:
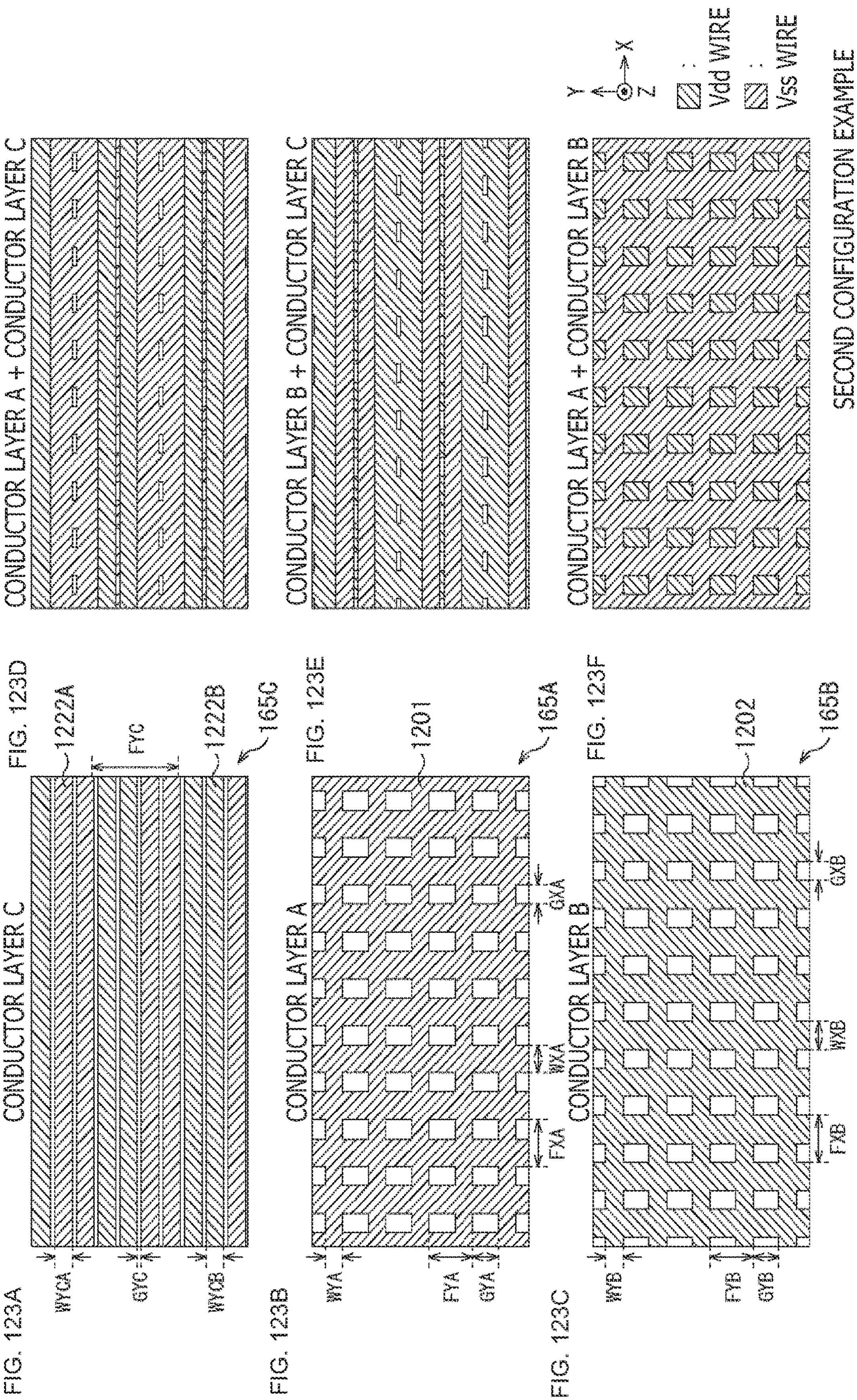
Figures 124A, 124B, 124C, 124D, 124E, 124F:
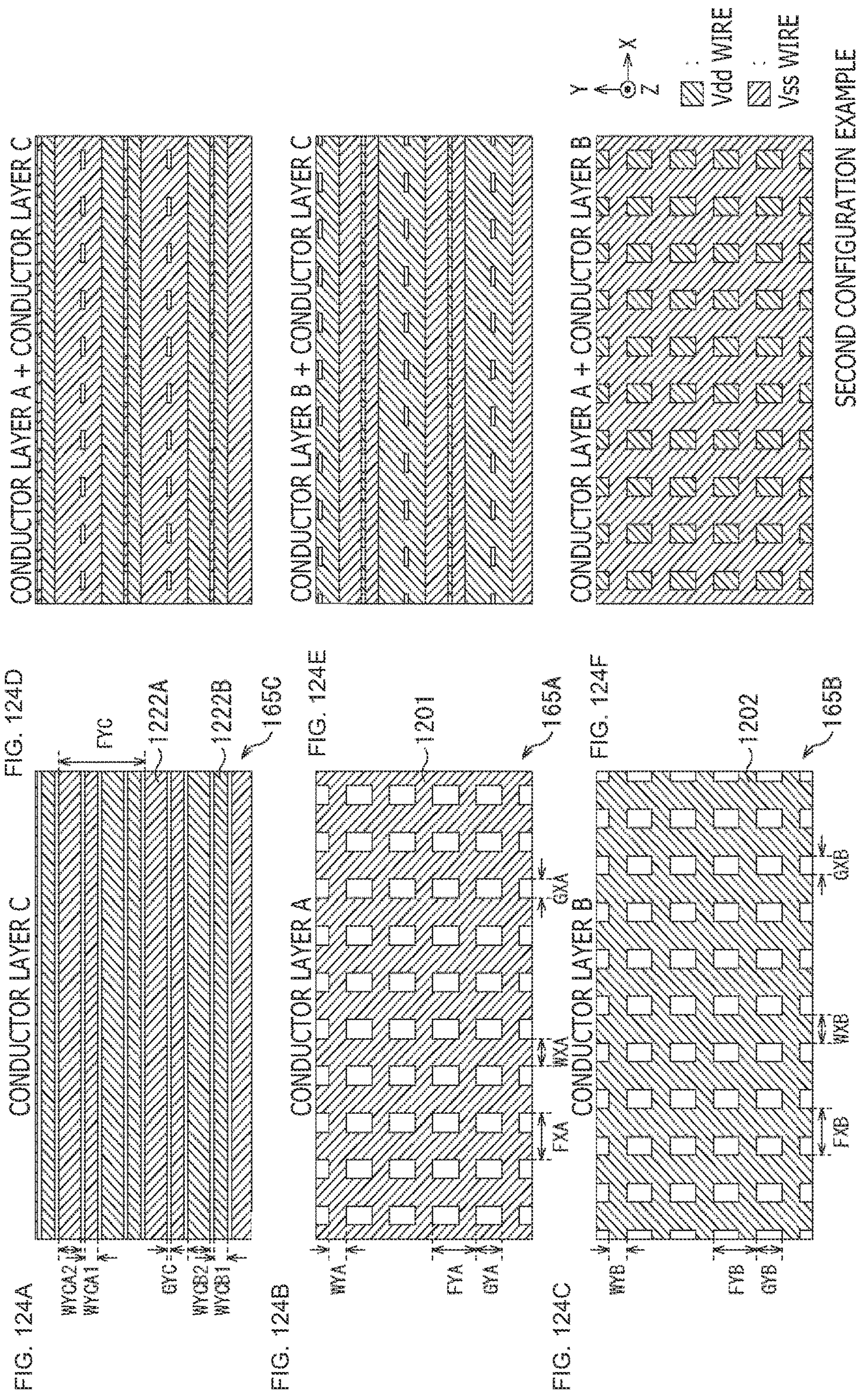
Figures 125A, 125B, 125C, 125D, 125E, 125F:
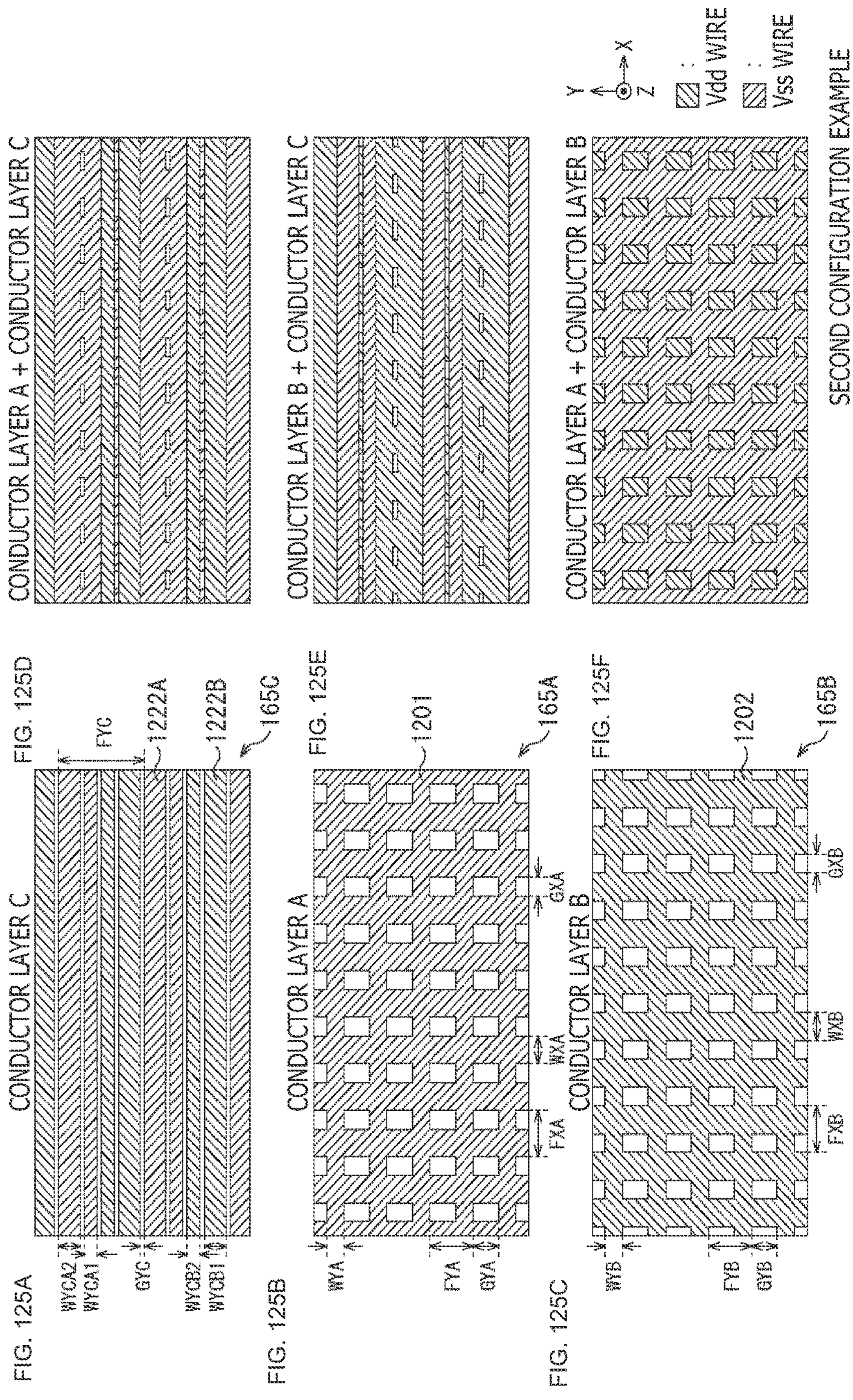

FIG. 123A depicts the conductor layer C (wiring layer 165C), FIG. 123B depicts the conductor layer A (wiring layer 165A), and FIG. 123C depicts the conductor layer B (wiring layer 165B).

In addition, FIG. 123D is a plan view of the stacked state of the conductor layer A and the conductor layer C, FIG. 123E is a plan view of the stacked state of the conductor layer B and the conductor layer C, and FIG. 123F is a plan view of the stacked state of the conductor layer A and the conductor layer B.

The conductor layer A in FIG. 123B is the mesh conductor 1201 which is the same as the one in the first configuration example in FIGS. 122A, 122B, 122C, 122D, 122E, and 122F, the conductor layer B in FIG. 123C is the mesh conductor 1202 which is the same as the one in the first configuration example in FIGS. 122A, 122B, 122C, 122D, 122E, and 122F, and so explanations thereof are omitted.

In the conductor layer C in FIG. 123A, pairs of linear conductors 1222A that are long in the X direction, and pairs of linear conductors 1222B that are long in the X direction are arranged regularly alternately in the Y direction.

The linear conductors 1222A are wires (Vss wires) connected to GND or a negative power supply, for example. The linear conductors 1222B are wires (Vdd wires) connected to a positive power supply, for example. The linear conductors 1222A and the linear conductors 1222B are differential conductors in which currents flow in mutually opposite directions. For example, the linear conductors 1222A are connected to pads (not depicted) at an outer circumferential section of the semiconductor board and are electrically connected with the mesh conductor 1201 in the conductor layer A. The mesh conductor 1201 in the conductor layer A and the linear conductors 1222A in the conductor layer C may be electrically connected via conductor vias extending in the Z direction, or the like, for example. For example, the linear conductors 1222B are connected to pads (not depicted) at an outer circumferential section of the semiconductor board and are electrically connected with the mesh conductor 1202 in the conductor layer B. The mesh conductor 1202 in the conductor layer B and the linear conductors 1222B in the conductor layer C may be electrically connected via conductor vias extending in the Z direction, or the like, for example.

The linear conductors 1222A have the Y-direction conductor width WYCA, the linear conductors 1222B have the Y-direction conductor width WYCB, and the conductor width WYCA of the linear conductors 1222A and the conductor width WYCB of the linear conductors 1222B are the same ((conductor width WYCA)=(conductor width WYCB)). Note that the conductor width WYCA and the conductor width WYCB do not have to be the same, but may be substantially the same ((conductor width WYCA)≈(conductor width WYCB)). Linear conductors 1222A, linear conductors 1222B or a linear conductor 1222A and a linear conductor 1222B that are adjacent to each other in the Y direction are separated by a gap with the gap width GYC.

Then, two linear conductors 1222A and two linear conductors 1222B are arranged regularly in the Y direction at the conductor pitch FYC (=2×(conductor width WYCA)+2×(conductor width WYCB)+4×(gap width GYC)). In other words, the conductor pitch FYC of two linear conductors 1222A and the conductor pitch FYC of two linear conductors 1222B are the same or substantially the same.

Note that the conductor width WYCA, the conductor width WYCB and the gap width GYC can be designed to have any values. In addition, while pairs of linear conductors 1222A and 1222B are arranged regularly in the example depicted in FIGS. 123A, 123B, 123C, 123D, 123E, and 123F, this is not essential. Sets of linear conductors, each set of which includes three or more linear conductors, may be arranged regularly, for example. In addition, while the numbers of linear conductors 1222A and linear conductors 1222B that are arranged regularly in the example depicted in FIGS. 123A, 123B, 123C, 123D, 123E, and 123F are the same, this is not essential. The numbers of linear conductors 1222A and linear conductors 1222B that are arranged regularly may be different.

If a predetermined planar range (planar region) of the conductor layer C in which linear conductors 1222A and linear conductors 1222B are arranged regularly in the Y direction at the conductor pitch FYC is looked at, the sum total of the conductor widths WYCA of multiple linear conductors 1222A in the predetermined planar range, and the sum total of the conductor widths WYCB of multiple linear conductors 1222B in the predetermined planar range become the same or substantially the same because the conductor width WYCA of a linear conductor 1222A and the conductor width WYCB of a linear conductor 1222B are the same or substantially the same. Thereby, the current distribution in the linear conductors 1222A and the current distribution in the linear conductors 1222B become the same or substantially the same, and so the occurrence of inductive noise can be suppressed.

In addition, for example, in a case in which the conductor layer C is arranged near the wiring layer 170 as depicted in FIG. 120C, capacitive noise can occur due to capacitive coupling between the linear conductors 1222A and linear conductors 1222B in the conductor layer C, and signal lines 132 or control lines 133 in the wiring layer 170, but because the linear conductors 1222A and the linear conductors 1222B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 123E, the stacking of the conductor layers A and B forms a light-blocking structure, and hot carrier light emissions from an active element group 167 can be blocked. As depicted in FIGS. 123D and 123E, the stacking of the conductor layers A and C, and the stacking of the conductor layers B and C also maintain the light-blocking property of a certain range. Thereby, the light-blocking constraints of the conductor layers A and B can be relaxed. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

Furthermore, in a case in which the mesh conductor 1201 in the conductor layer A and the linear conductors 1222A in the conductor layer C are electrically connected, and the mesh conductor 1202 in the conductor layer B, and the linear conductors 1222B in the conductor layer C are electrically connected, the current amounts of the conductor layers A and B can be reduced, and so inductive noise from the conductor layers A and B, and voltage drops can be ameliorated further.

<Modification Examples of Second Configuration Example of Three Conductor Layers>

FIGS. 124A, 124B, 124C, 124D, 124E, and 124F depict a first modification example of the second configuration example of three conductor layers.

FIGS. 124A, 124B, 124C, 124D, 124E, and 124F correspond to FIGS. 123A, 123B, 123C, 123D, 123E, and 123F, respectively, explanations of common sections that are given the same reference signs are omitted as appropriate, and differences are explained.

In the second configuration example in FIGS. 123A, 123B, 123C 123D, 123E, and 123F, the Y-direction conductor widths WYCA of two linear conductors 1222A that are adjacent to each other in the Y direction in the conductor layer C are the same. In contrast, in the first modification example in FIGS. 124A, 124B, 124C, 124D, 124E, and 124F, the conductor widths of two linear conductors 1222A adjacent to each other in the Y direction are a conductor width WYCA1 and a conductor width WYCA2 which are different from each other ((conductor width WYCA1)<(conductor width WYCA2)). Note that the conductor width WYCA1 and the conductor width WYCA2 can be designed to have any values.

Similarly, in the second configuration example in FIGS. 123A, 123B. 123C, 123D, 123E, and 123F, the Y-direction conductor widths WYCB of two linear conductors 1222B that are adjacent to each other in the Y direction in the conductor layer C are the same. In contrast, in the first modification example in FIGS. 124A, 124B, 124C, 124D, 124E, and 124F, the conductor widths of two linear conductors 1222B adjacent to each other in the Y direction are a conductor width WYCB1 and a conductor width WYCB2 which are different from each other ((conductor width WYCB1)<(conductor width WYCB2)). Note that the conductor width WYCB1 and the conductor width WYCB2 can be designed to have any values.

The first modification example in FIGS. 124A, 124B, 124C, 124D, 124E, and 124F are similar to the second configuration example in FIGS. 123A, 123B, 123C, 123D, 123E, and 123F in other respects than the differences in the conductor widths of the linear conductors 1222A and 1222B.

FIGS. 125A, 125B, 125C, 125D, 125E, and 125F depicts a second modification example of the second configuration example of three conductor layers.

FIGS. 125A, 125B, 1250, 125D, 125E, and 125F correspond to FIGS. 123A, 123B, 123C, 123D, 123E, and 123F, respectively, explanations of common sections that are given the same reference signs are omitted as appropriate, and differences are explained.

The second modification example in FIGS. 125A, 125B, 125C, 125D, 125E, and 125F are different from the second configuration example in FIGS. 123A, 123B, 123C, 123D, 123E, and 123F, but has a commonality with the first modification example in FIGS. 124A, 124B, 124C, 124D, 124E, and 124F in that the conductor widths of two linear conductors 1222A that are adjacent to each other in the Y direction in the conductor layer C are different from each other. In addition, the second modification example is different from the second configuration example in FIGS. 123A, 123B, 123C, 123D, 123E, and 123F, but has a commonality with the first modification example in FIGS. 124A, 124B, 124C, 124D, 124E, and 124F in that the conductor widths of two linear conductors 1222B that are adjacent to each other in the Y direction are different from each other.

On the other hand, in the first modification example depicted in FIGS. 124A, 124B, 124C, 124D, 124E, and 124F, the array of two linear conductors 1222A with different conductor widths is the same as the array of two linear conductors 1222B. Specifically, in a case in which two linear conductors 1222A are arrayed in the Y direction in the order of a linear conductor 1222A with a thinner conductor width (with the conductor width WYCA1), and a linear conductor 1222A with a thicker conductor width (with the conductor width WYCA2), two linear conductors 1222B also are arrayed in the Y direction in the order of a linear conductor 1222B with a thinner conductor width (with the conductor width WYCB1), and a linear conductor 1222B with a thicker conductor width (with the conductor width WYCB2).

In contrast, in the second modification example in FIGS. 125A, 125B, 125C, 125D, 125E, and 125F, the array of two linear conductors 1222A with different conductor widths is different from the array of two linear conductors 1222B. Specifically, in a case in which two linear conductors 1222A are arrayed in the Y direction in the order of a linear conductor 1222A with a thinner conductor width (with the conductor width WYCA1), and a linear conductor 1222A with a thicker conductor width (with the conductor width WYCA2), two linear conductors 1222B are arrayed in the Y direction in the order of a linear conductor 1222B with a thicker conductor width (with the conductor width WYCB1), and a linear conductor 1222B with a thinner conductor width (with the conductor width WYCB2). In other words, a pair of two linear conductors 1222A with different conductor widths, and a pair of two linear conductors 1222B with different conductor widths are arranged mirror-symmetrically in the Y direction.

The second modification example in FIGS. 125A, 125B, 125C, 125D, 125E, and 125F are similar to the second configuration example in FIGS. 123A, 123B, 123C, 123D, 123E, and 123F in other respects than the differences in the conductor widths of the linear conductors 1222A and 1222B.

In the first modification example and the second modification example in FIGS. 124A, 124B, 124C, 124D, 124E, 124F,125A, 125B, 125C, 125D, 125E, and 125E also, if a predetermined planar range (planar region) of the conductor layer C is looked at, the sum total of the conductor widths WYCA1 and WYCA2 of multiple linear conductors 1222A in the predetermined planar range, and the sum total of the conductor widths WYCB1 and WYCB2 of multiple linear conductors 1222B in the predetermined planar range become the same or substantially the same. Thereby, the current distribution in the linear conductors 1222A and the current distribution in the linear conductors 1222B become the same or substantially the same, and so the occurrence of inductive noise can be suppressed.

In the first modification example and the second modification example in FIGS. 124A, 124B, 124C, 124D, 124E, 124F, 125A, 125B, 125C, 125D, 125E, and 125E also, capacitive noise is ameliorated significantly, and the light-blocking constraints of the conductor layers A and B can be relaxed. In addition, the wire resistances can be lowered to ameliorate voltage drops. Furthermore, the degree of freedom of the layouts of the conductor layers A and B can be enhanced.

<Third Configuration Example of Three Conductor Layers>

FIGS. 126A, 126B, 126C, 126D, 126E, and 126F depict a third configuration example of three conductor layers.

Figures 126A, 126B, 126C, 126D, 126E, 126F:
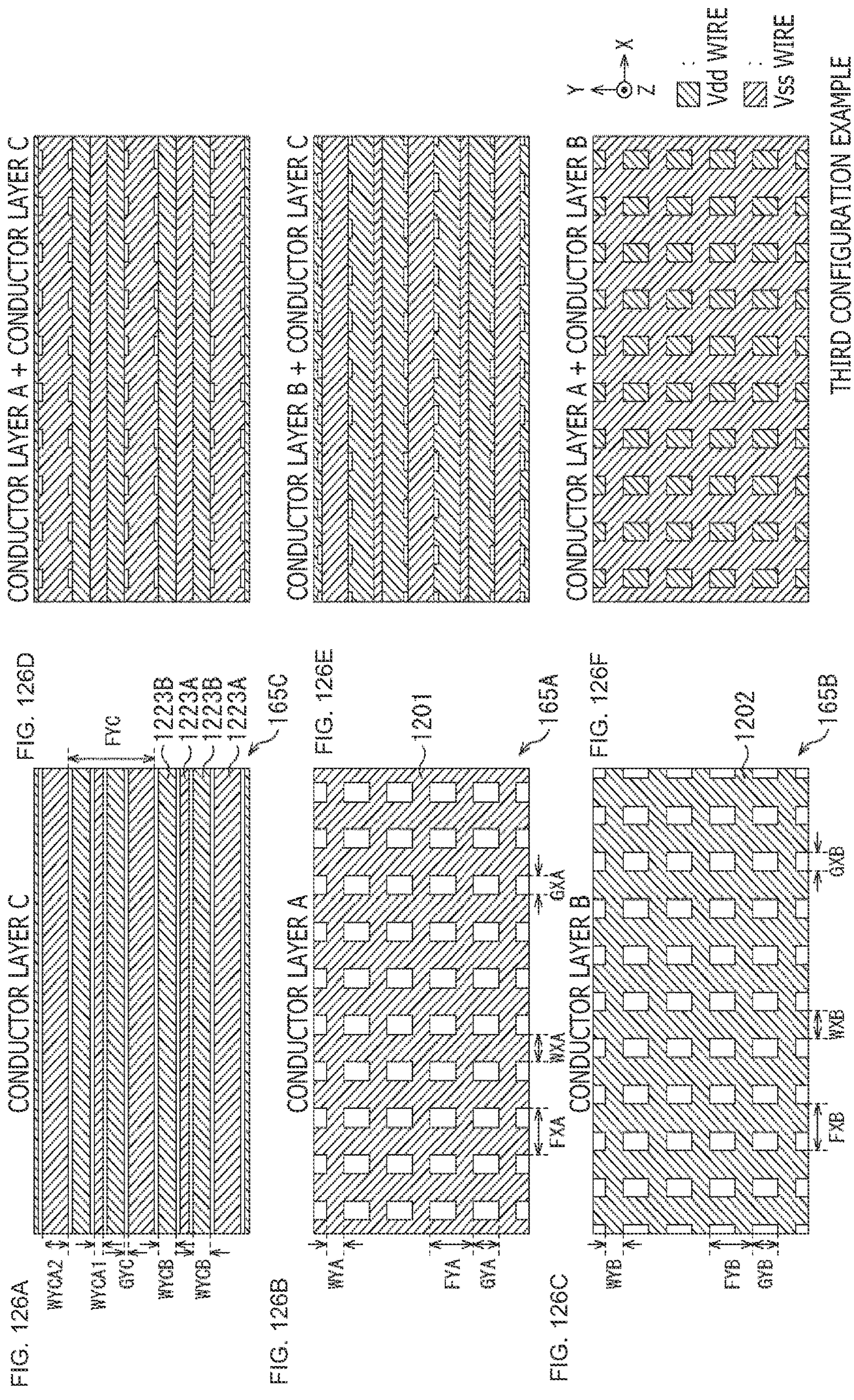
Figures 127A, 127B, 127C, 127D, 127E, 127F:
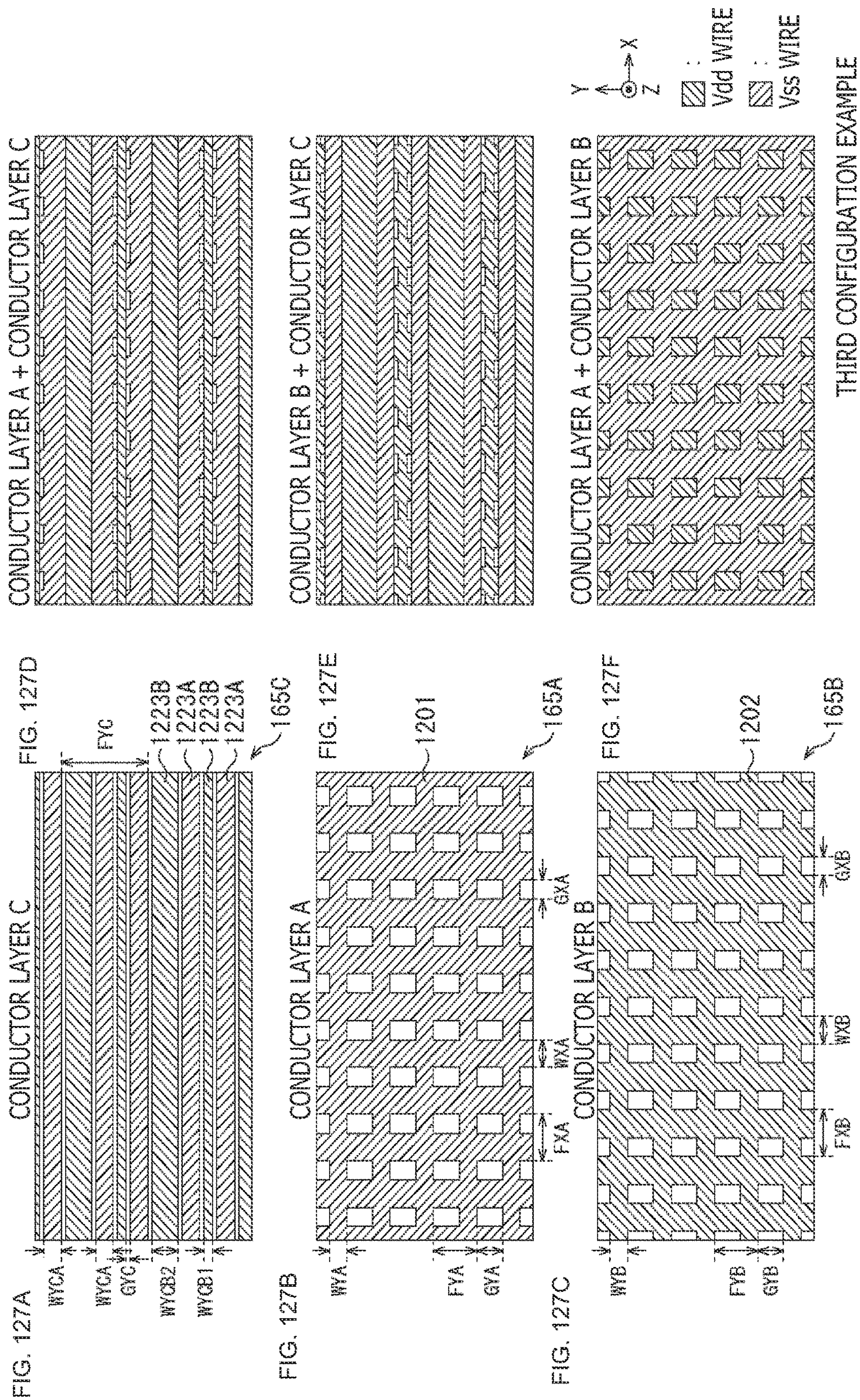

FIG. 126A depicts the conductor layer C (wiring layer 165C), FIG. 126B depicts the conductor layer A (wiring layer 165A), and FIG. 126C depicts the conductor layer B (wiring layer 165B).

In addition, FIG. 126D is a plan view of the stacked state of the conductor layer A and the conductor layer C, FIG. 126E is a plan view of the stacked state of the conductor layer B and the conductor layer C, FIG. 126F is a plan view of the stacked state of the conductor layer A and the conductor layer B.

The conductor layer A in FIG. 126B is the mesh conductor 1201 which is the same as the one in the first configuration example in FIGS. 122A, 122B, 122C, 122D, 122E, and 122F, the conductor layer B in FIG. 126C is the mesh conductor 1202 which is the same as the one in the first configuration example in FIGS. 122A, 122B, 122C, 122D, 122E, and 122F, and so explanations thereof are omitted.

The conductor layer C in FIG. 126A is similar to the first configuration example in FIGS. 122A, 122B, 122C, 122D, 122E, and 122F in that linear conductors 1223A that are long in the X direction, and linear conductors 1223B that are long in the X direction are arranged alternately regularly in the Y direction. It should be noted however that the conductor widths of the linear conductors 1221A that are arrayed sequentially in the Y direction are all the same conductor width WYCA in the first configuration example in FIGS. 122A, 122B, 122C, 122D, 122E, and 122F In contrast, in the third configuration example in FIGS. 126A, 126B, 126C, 126D, 126E, and 126F, while the linear conductors 1223A in the linear conductors 1223A and the linear conductors 1223B that are arranged alternately regularly in the Y direction include linear conductors 1223A with a different conductor width WYCA1 and conductor width WYCA2 that are arrayed alternately in the Y direction, the linear conductors 1223B include arrayed linear conductors 1223A with the same conductor width WYCB.

The third configuration example in FIGS. 126A, 126B, 126C, 126D, 126E, and 126F are similar to the first configuration example in FIGS. 122A, 122B, 122C, 122D, 122E, and 122F in other respects than the differences in the conductor widths of the linear conductors 1223A and 1223B.

That is, the linear conductors 1223A are wires (Vss wires) connected to GND or a negative power supply, for example. The linear conductors 1223B are wires (Vdd wires) connected to a positive power supply, for example. The linear conductors 1223A and the linear conductors 1223B are differential conductors in which currents flow in mutually opposite directions. For example, the linear conductors 1223A are connected to pads (not depicted) at an outer circumferential section of the semiconductor board and are electrically connected with the mesh conductor 1201 in the conductor layer A. The mesh conductor 1201 in the conductor layer A and the linear conductors 1223A in the conductor layer C may be electrically connected via conductor vias extending in the Z direction, or the like, for example. For example, the linear conductors 1223B are connected to pads (not depicted) at an outer circumferential section of the semiconductor board and are electrically connected with the mesh conductor 1202 in the conductor layer B. The mesh conductor 1202 in the conductor layer B and the linear conductors 1223B in the conductor layer C may be electrically connected via conductor vias extending in the Z direction, or the like, for example.

There is a gap with the gap width GYC between each linear conductor 1223A and each linear conductor 1223B that are adjacent to each other in the Y direction. Then, two linear conductors 1223A and two linear conductors 1223B are arranged regularly in the Y direction at the conductor pitch FYC(=(conductor width WYCA1)+(conductor width WYCA2)+2×(conductor width WYCB)+4×(gap width GYC)). Note that the conductor width WYCA1, the conductor width WYCA2, the conductor width WYCB and the gap width GYC can be designed to have any values. In addition, while pairs of linear conductors 1223A and 1223B are arranged regularly in the example depicted in FIGS. 126A, 126B, 126C, 126D, 126E, and 126F, this is not essential. Sets of linear conductors, each set of which includes three or more linear conductors, may be arranged regularly, for example. In addition, while the numbers of linear conductors 1223A and linear conductors 1223B that are arranged regularly in the example depicted in FIGS. 126A, 126B, 126C, 126D, 126E, and 126F are the same, this is not essential. The numbers of linear conductors 1223A and linear conductors 1223B that are arranged regularly may be different.

If a predetermined planar range (planar region) of the conductor layer C in which linear conductors 1223A and linear conductors 1223B are arranged regularly in the Y direction at the conductor pitch FYC is looked at, the sum total of the conductor widths WYCA1 and WYCA2 of multiple linear conductors 1223A in the predetermined planar range, and the sum total of the conductor widths WYCB of multiple linear conductors 1223B in the predetermined planar range become the same or substantially the same. Thereby, the current distribution in the linear conductors 1223A and the current distribution in the linear conductors 1223B become the same or substantially the same, and so the occurrence of inductive noise can be suppressed.

In the third configuration example in FIGS. 126A, 126B, 126C, 126D, 126E, and 126F also, capacitive noise is ameliorated significantly, and the light-blocking constraints of the conductor layers A and B can be relaxed. In addition, the wire resistances can be lowered to ameliorate voltage drops. Furthermore, the degree of freedom of the layouts of the conductor layers A and B can be enhanced.

<Modification Example of Third Configuration Example of Three Conductor Layers>

FIGS. 127A, 127B, 127C, 127D, 127E, and 127F depict a modification example of the third configuration example of three conductor layers.

FIGS. 127A, 127B, 127C, 127D, 127E, and 127F correspond to FIGS. 126A, 126B, 126C, 126D, 126E, and 126F, respectively, explanations of common sections that are given the same reference signs are omitted as appropriate, and differences are explained.

In the third configuration example in FIGS. 126A, 126B, 126C, 126D, 126E, and 126F, there are two types of conductor width, the conductor width WYCA1 and the conductor width WYCA2, of the linear conductors 1223A in the linear conductors 1223A and the linear conductors 1223B that are arranged alternately regularly in the Y direction in the conductor layer C, and the linear conductors 1223B have the same conductor width WYCB.

In contrast, in the modification example of the third configuration example in FIGS. 127A, 127B, 127C, 127D, 127E, and 127F, the linear conductors 1223A in the linear conductors 1223A and the linear conductors 1223B that are arranged alternately regularly in the Y direction in the conductor layer C have the same conductor width WYCA, and there are two types of conductor width, the conductor width WYCB1 and the conductor width WYCB2, of the linear conductors 1223B. In the modification example of the third configuration example in FIGS. 127A, 127B, 127C, 127D, 127E, and 127F, regarding the linear conductors 1223B, the linear conductors 1223B with the different conductor width WYCB1 and conductor width WYCB2 are arrayed alternately in the Y direction.

The modification example of the third configuration example in FIGS. 127A, 127B, 127C, 127D, 127E, and 127F are similar to the third configuration example in FIGS. 126A, 126B, 126C, 126D, 126E, and 126F in other respects than the differences in the conductor widths of the linear conductors 1223A and 1223B.

If a predetermined planar range (planar region) of the conductor layer C in which linear conductors 1223A and linear conductors 1223B are arranged regularly in the Y direction at the conductor pitch FYC is looked at, the sum total of the conductor widths WYCA of multiple linear conductors 1223A in the predetermined planar range, and the sum total of the conductor widths WYCB1 and WYCB2 of multiple linear conductors 1223B in the predetermined planar range become the same or substantially the same. Thereby, the current distribution in the linear conductors 1223A and the current distribution in the linear conductors 1223B become the same or substantially the same, and so the occurrence of inductive noise can be suppressed.

In the modification example of the third configuration example in FIGS. 127A, 127B, 127C, 127D, 127E, and 127F also, capacitive noise is ameliorated significantly, and the light-blocking constraints of the conductor layers A and B can be relaxed. In addition, the wire resistances can be lowered to ameliorate voltage drops. Furthermore, the degree of freedom of the layouts of the conductor layers A and B can be enhanced.

<Fourth Configuration Example of Three Conductor Layers>

FIGS. 128A, 128B, 128C, 128D, 128E, and 128F depict a fourth configuration example of three conductor layers.

Figures 128A, 128B, 128C, 128D, 128E, 128F:
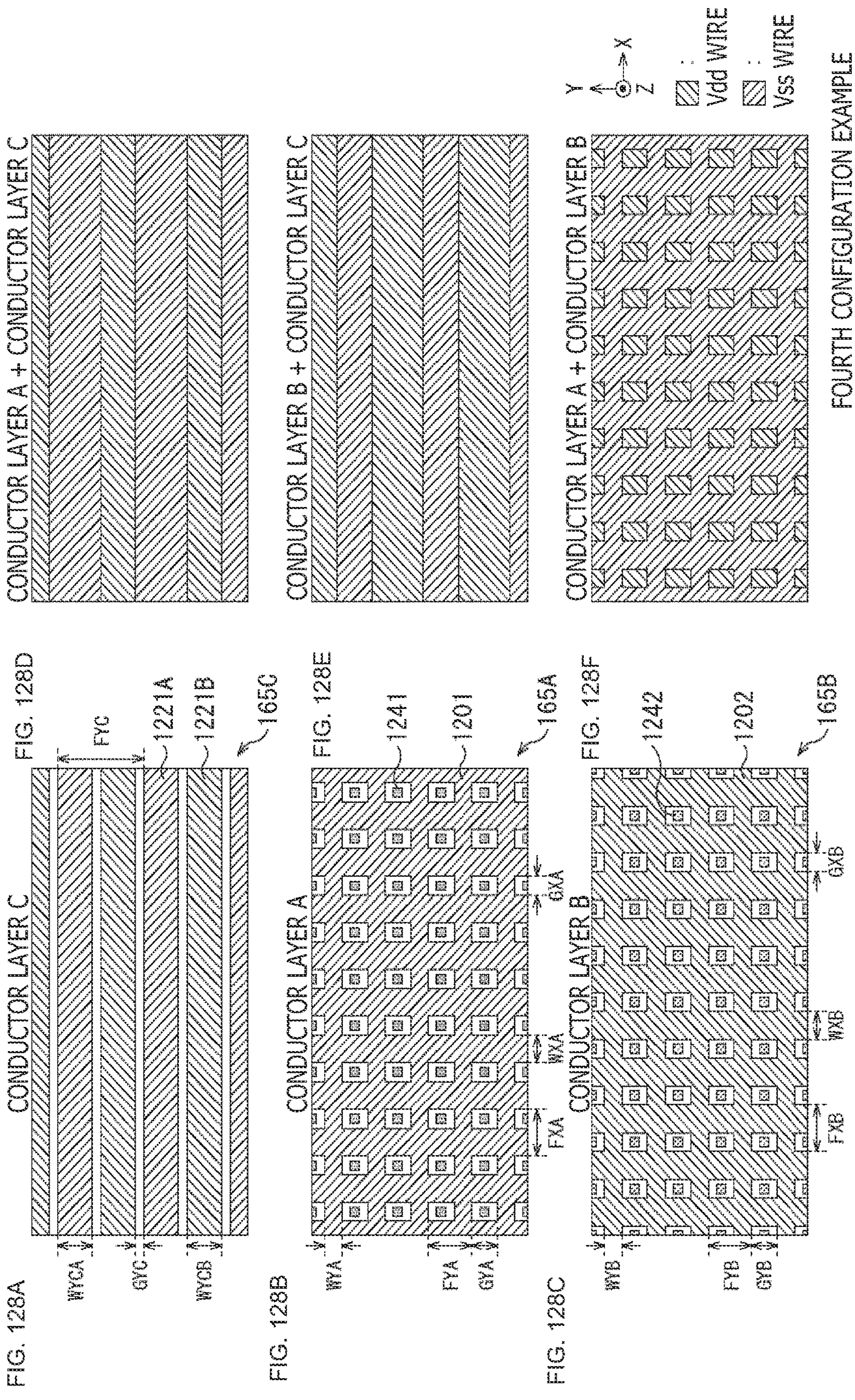

FIG. 128A depicts the conductor layer C (wiring layer 165C), FIG. 128B depicts the conductor layer A (wiring layer 165A), and FIG. 128C depicts the conductor layer B (wiring layer 165B).

In addition, FIG. 128D is a plan view of the stacked state of the conductor layer A and the conductor layer C, FIG. 128E is a plan view of the stacked state of the conductor layer B and the conductor layer C, and FIG. 128F is a plan view of the stacked state of the conductor layer A and the conductor layer B.

Sections in the fourth configuration example in FIGS. 128A, 128B, 128C, 128D, 128E, and 128F that have counterparts in the first configuration example depicted in FIGS. 122A, 122B, 122C, 122D, 122E, and 122F are given the same reference signs, explanations of those sections are omitted as appropriate, and explanations are given with a focus on differences.

The conductor layer C in FIG. 128A is similar to the conductor layer C in the first configuration example depicted in FIGS. 122A, 122B, 122C, 122D, 122E, and 122F. That is, in the conductor layer C, linear conductors 1221A that are long in the X direction, and linear conductors 1221B that are long in the X direction are arranged regularly alternately in the Y direction at the conductor pitch FYC.

The conductor layer A in FIG. 128B has the mesh conductor 1201 which is the same as the one in FIGS. 121A, 121B, 121C, 121D, 121E, and 121F. In addition, the conductor layer A has relay conductors 1241 (first relay conductors) inside gaps of the mesh conductor 1201 that have the X-direction gap width GXA and the Y-direction gap width GYA. Each relay conductor 1241 is arranged in one of all the gaps of the mesh conductor 1201 in a one-to-one correspondence. The intervals between the relay conductors 1241, in other words, the pitches of the relay conductors 1241, also are the conductor pitches FXA and FYA.

The relay conductors 1241 are wires (Vdd wires) connected to a positive power supply, for example, and in the case of the stacking order depicted in FIG. 120C, the relay conductors 1241 electrically connect the mesh conductor 1202 in the conductor layer B, and the linear conductors 1221B in the conductor layer C via conductor vias extending in the Z direction, or the like, for example. In other words, the mesh conductor 1202 in the conductor layer B, and the linear conductors 1221B in the conductor layer C are electrically connected via the relay conductors 1241 in the conductor layer A. In addition, in the case of the stacking order depicted in FIG. 120A, for example, the relay conductors 1241 may electrically connect the mesh conductor 1202 in the conductor layer B, and a conductor in a conductor layer other than the conductor layers A to C via conductor vias extending in the Z direction, or the like, for example. In addition, in the case of the stacking order depicted in FIG. 120B, for example, the relay conductors 1241 may electrically connect the linear conductors 1221B in the conductor layer C, and a conductor in a conductor layer other than the conductor layers A to C via conductor vias extending in the Z direction, or the like, for example. In addition, not all of the relay conductors 1241 have to be used for electrical connection, all of the relay conductors 1241 may be used for electrical connection, or some of the relay conductors 1241 may be used for electrical connection.

By providing the relay conductors 1241, it becomes possible to connect the mesh conductor 1202 and the linear conductors 1221B with substantially the shortest distance or with a short distance, to lead in a power supply, and voltage drops, energy loss, or inductive noise can be reduced.

The conductor layer B in FIG. 128C has the mesh conductor 1202 which is the same as the one in FIGS. 121A, 121B, 121C, 121D, 121E, and 121F. In addition, the conductor layer B has relay conductors 1242 (second relay conductors) inside gaps of the mesh conductor 1202 that have the X-direction gap width GXB, and the Y-direction gap width GYB. Each relay conductor 1242 is arranged in one of all the gaps of the mesh conductor 1202 in a one-to-one correspondence. The intervals between the relay conductors 1242, in other words, the pitches of the relay conductors 1242, also are the conductor pitches FXB and FYB.

The relay conductors 1242 are wires (Vss wires) connected to GND or a negative power supply, for example, and in the case of the stacking order depicted in FIG. 120A, the relay conductors 1242 electrically connect the mesh conductor 1201 in the conductor layer A and the linear conductors 1221A in the conductor layer C via conductor vias extending in the Z direction, or the like, for example. In other words, the mesh conductor 1201 in the conductor layer B, and the linear conductors 1221A in the conductor layer C are electrically connected via the relay conductors 1242 in the conductor layer B. In addition, in the case of the stacking order depicted in FIG. 120C, for example, the relay conductors 1242 may electrically connect the mesh conductor 1201 in the conductor layer A and a conductor in a conductor layer other than the conductor layers A to C via conductor vias extending in the Z direction, or the like, for example. In addition, in the case of the stacking order depicted in FIG. 120B, for example, the relay conductors 1242 may electrically connect the linear conductors 1221A in the conductor layer C and a conductor in a conductor layer other than the conductor layers A to C via conductor vias extending in the Z direction, or the like, for example. In addition, not all of the relay conductors 1242 have to be used for electrical connection, all of the relay conductors 1242 may be used for electrical connection, or some of the relay conductors 1242 may be used for electrical connection.

By providing the relay conductors 1242, it becomes possible to connect the mesh conductor 1201 and the linear conductors 1221A with substantially the shortest distance or with a short distance, and voltage drops, energy loss, or inductive noise can be reduced.

In addition, because the linear conductors 1221A and the linear conductors 1221B in FIG. 128A are conductors that are long in the X direction, the direction in which currents flow more easily is the X direction. In addition, the direction in which currents flow more easily in the mesh conductors 1201 and 1202 in FIGS. 128B and 128C are the Y direction. Accordingly, the direction in which currents flow more easily in the conductor layer C and the direction in which currents flow more easily in the conductor layers A and B are substantially orthogonal and are different by approximately 90 degrees. Thereby, currents are diffused more easily (currents are less likely to be concentrated), and so inductive noise can be ameliorated further.

As depicted in FIG. 128E, the stacking of the conductor layers A and B forms a light-blocking structure. In addition, as depicted in E in FIGS. 128D and 128E, the stacking of the conductor layers A and C, and the stacking of the conductor layers B and C also form light-blocking structures, and the light-blocking property is maintained. Thereby, hot carrier light emissions from an active element group 167 can be blocked. In addition, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. The degree of freedom of the layouts of the conductor layers A and B can be enhanced.

<Modification Examples of Fourth Configuration Example of Three Conductor Layers>

FIGS. 129A, 129B, 129C, 129D, 129E, and 129F depict a first modification example of the fourth configuration example of three conductor layers.

Figures 129A, 129B, 129C, 129D, 129E, 129F:
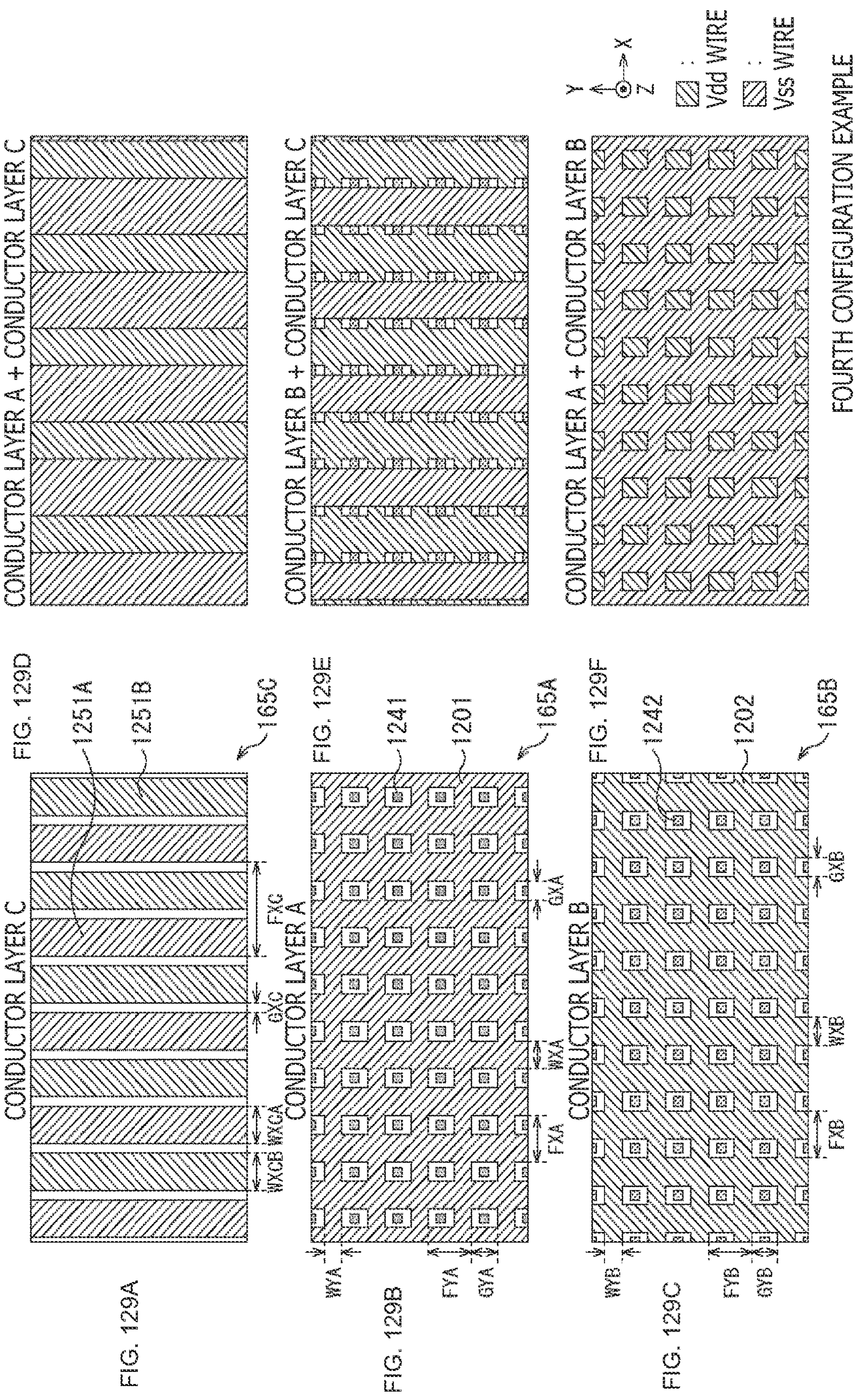
Figures 130, 130A, 130B, 130C, 130D, 130E, 130F:
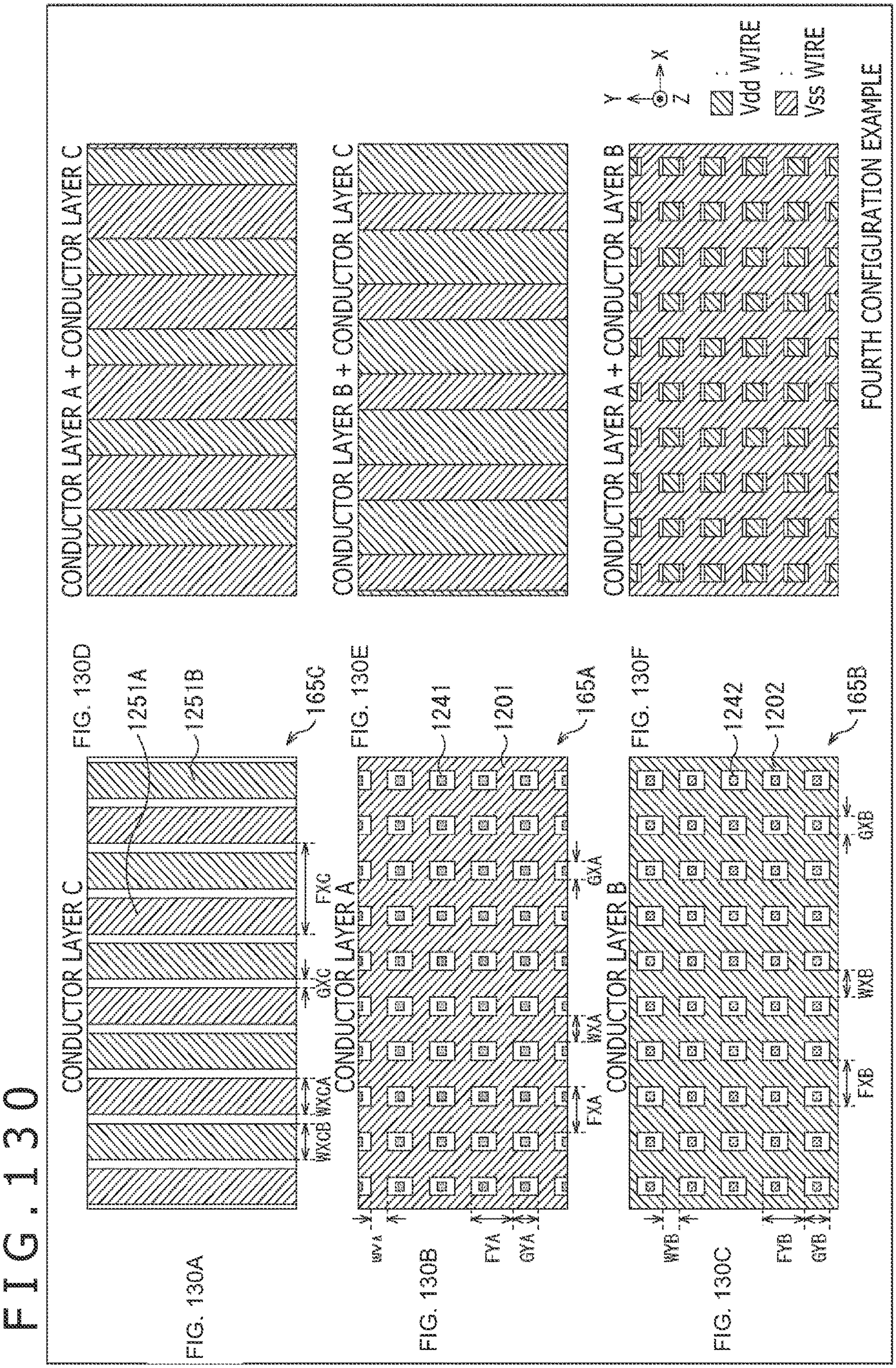

FIG. 129A depicts the conductor layer C (wiring layer 165C), FIG. 129B depicts the conductor layer A (wiring layer 165A), and FIG. 1290 depicts the conductor layer B (wiring layer 165B).

In addition, FIG. 129D is a plan view of the stacked state of the conductor layer A and the conductor layer C, FIG. 129E is a plan view of the stacked state of the conductor layer B and the conductor layer C, FIG. 129F is a plan view of the stacked state of the conductor layer A and the conductor layer B.

Sections in FIGS. 129A, 129B, 129C, 129D, 129E, and 129F that have counterparts in the fourth configuration example depicted in FIGS. 128A, 128B, 128C, 128D, 128E, and 128F are given the same reference signs, explanations of those sections are omitted as appropriate, and explanations are given with a focus on differences.

In the first modification example of the fourth configuration example, only the configuration of the conductor layer C in FIG. 129A is different from that in FIGS. 128A, 128B, 128C, 128D, 128E, and 128F.

In the conductor layer C in FIG. 128A, linear conductors 1221A that are long in the X direction, and linear conductors 1221B that are long in the X direction are arranged regularly alternately in the Y direction at the conductor pitch FYC. In addition, the direction in which currents flow more easily in the conductor layer C and the direction in which currents flow more easily in the conductor layers A and B are substantially orthogonal and are different by approximately 90 degrees.

In contrast, in the conductor layer C in FIG. 129A, linear conductors 1251A that are long in the Y direction, and linear conductors 1251B that are long in the Y direction are arranged regularly alternately in the X direction.

In addition, because the linear conductors 1251A and the linear conductors 1251B in FIG. 129A are conductors that are long in the Y direction, the direction in which currents flow more easily is the Y direction. In addition, the direction in which currents flow more easily in the mesh conductors 1201 and 1202 in FIGS. 128B and 128C is the Y direction. Thereby, the direction in which currents flow more easily in the conductor layer C, and the direction in which currents flow more easily in the conductor layers A and B are the same or substantially the same. In this case, voltage drops can be ameliorated further, depending on the wiring layout. For two directions to be at approximately 90 degrees or to be substantially the same, it is sufficient if the difference between the directions is within such a range that the directions can be regarded as being at 90 degrees or the same angle, and it is defined here that two directions that are at approximately 90 degrees or substantially the same angle are at an angle that is within the range of 45 degrees below and above 90 degrees or zero degrees.

The linear conductors 1251A are wires (Vss wires) connected to GND or a negative power supply, for example. The linear conductors 1251B are wires (Vdd wires) connected to a positive power supply, for example. The linear conductors 1251A and the linear conductors 1251B are differential conductors in which currents flow in mutually opposite directions. For example, the linear conductors 1251A are connected to pads (not depicted) at an outer circumferential section of the semiconductor board and are electrically connected with the mesh conductor 1201 in the conductor layer A. The mesh conductor 1201 in the conductor layer A and the linear conductors 1251A in the conductor layer C may be electrically connected via conductor vias extending in the Z direction, or the like, for example. For example, the linear conductors 1251B are connected to pads (not depicted) at an outer circumferential section of the semiconductor board and are electrically connected with the mesh conductor 1202 in the conductor layer B. The mesh conductor 1202 in the conductor layer B and the linear conductors 1251B in the conductor layer C may be electrically connected via conductor vias extending in the Z direction, or the like, for example.

The linear conductors 1251A have an X-direction conductor width WXCA, the linear conductors 1251B have an X-direction conductor width WXCB, and the conductor width WXCA of the linear conductors 1251A and the conductor width WXCB of the linear conductors 1251B are the same or substantially the same ((conductor width WXCA)=(conductor width WXCB) or (conductor width WXCA)≈(conductor width WXCB)). There is a gap with a gap width GXC between each linear conductor 1251A and each linear conductor 1251B in the Y direction.

Then, one linear conductor 1251A and linear conductor 1251B are arranged regularly in the X direction at a conductor pitch FXC (=(conductor width WXCA)+(conductor width WXCB)+2×(gap width GXC)). In other words, the conductor pitch FXC of the linear conductors 1251A and the conductor pitch FXC of the linear conductors 1251B are the same or substantially the same.

In addition, the conductor pitch FXC, which is the repetition pitch of the linear conductors 1251A in the conductor layer C, is an integer multiple of the conductor pitch FXA, which is the X-direction repetition pitch of the mesh conductor 1201 in the conductor layer A. FIGS. 129A, 129B, 129C, 129D, 129E, and 129F depict an example in which the conductor pitch FXC is 200% of the conductor pitch FYA.

The conductor pitch FXC, which is the repetition pitch of the linear conductors 1251B in the conductor layer C, is an integer multiple of the conductor pitch FXB, which is the X-direction repetition pitch of the mesh conductor 1202 in the conductor layer B. FIGS. 129A, 129B, 129C, 129D, 129E, and 129F depict an example in which the conductor pitch FXC is 200% of the conductor pitch FXB.

Note that the conductor width WXCA, the conductor width WXCB and the gap width GXC can be designed to have any values.

If a predetermined planar range (planar region) of the conductor layer C in which linear conductors 1251A and the linear conductors 1251B are arranged regularly in the X direction at the conductor pitch FXC is looked at, the sum total of the conductor widths WXCA of multiple linear conductors 1251A in the predetermined planar range, and the sum total of the conductor widths WXCB of multiple linear conductors 1251B in the predetermined planar range become the same or substantially the same because the conductor width WXCA of a linear conductor 1251A and the conductor width WXCB of a linear conductor 1251B are the same or substantially the same. Thereby, the current distribution in the linear conductors 1251A and the current distribution in the linear conductors 1251B become the same or substantially the same, and so the occurrence of inductive noise can be suppressed.

In addition, for example, in a case in which the conductor layer C is arranged near the wiring layer 170 as depicted in FIG. 120C, capacitive noise can occur due to capacitive coupling between the linear conductors 1251A and linear conductors 1251B in the conductor layer C, and signal lines 132 or control lines 133 in the wiring layer 170, but because the linear conductors 1251A and the linear conductors 1251B include repetitions of the same wiring patterns in the X direction, capacitive noise can be offset completely in the X direction. Capacitive noise can be ameliorated more significantly if the conductor layer C is closer to the wiring layer 170.

As depicted in FIG. 129E, the stacking of the conductor layers A and B forms a light-blocking structure, and needless to say, hot carrier light emissions from an active element group 167 can be blocked. In addition, as depicted in FIG. 129D, the stacking of the conductor layers A and C also forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

Furthermore, in a case in which the mesh conductor 1201 in the conductor layer A and the linear conductors 1251A in the conductor layer C are electrically connected, and the mesh conductor 1202 in the conductor layer B, and the linear conductors 1251B in the conductor layer C are electrically connected, the current amounts of the conductor layers A and B can be reduced, and so inductive noise from the conductor layers A and B, and voltage drops can be ameliorated further.

FIGS. 130A, 130B, 130C, 130D, 130E, and 130F depict a second modification example of the fourth configuration example of three conductor layers.

FIGS. 130A, 130B, 130C, 130D, 130E, and 130F correspond to FIGS. 129A, 129B, 129C, 129D, 129E, and 129F, respectively, explanations of common sections that are given the same reference signs are omitted as appropriate, and differences are explained.

In the first modification example in FIGS. 129A, 129B, 129C, 129D, 129E, and 129F, regarding gap positions of the mesh conductor 1201 in the conductor layer A and the mesh conductor 1202 in the conductor layer B, the X-direction positions are different, and the Y-direction positions match.

On the other hand, in the second modification example in FIGS. 130A, 130B, 130C, 130D, 130E, and 130F, regarding gap positions of the mesh conductor 1201 in the conductor layer A and the mesh conductor 1202 in the conductor layer B, the X-direction positions match, and the Y-direction positions are different.

In other words, if conductors that are in the mesh conductor 1201 in the conductor layer A and the mesh conductor 1202 in the conductor layer B, and lie in the direction which is the same or substantially the same as the direction (Y direction) in which signal lines 132 of the wiring layer 170 extend are compared between the mesh conductor 1201 in the conductor layer A and the mesh conductor 1202 in the conductor layer B, all the conductors overlap when seen in the stacking direction. The thus-formed conductor layer A and conductor layer B correspond to the sixth configuration example of the conductor layers A and B depicted in FIGS. 27A, 27B, and 27C and can significantly ameliorate inductive noise as depicted in the result of a simulation in FIG. 28C.

If the positions of the relay conductors 1241 in the conductor layer A and the relay conductors 1242 in the conductor layer B are compared with each other, the X-direction positions are different, and the Y-direction positions match in the first modification example in FIGS. 129A, 129B, 129C, 129D, 129E, and 129F. On the other hand, in the second modification example in FIGS. 130A, 130B, 130C, 130D, 130E, and 130F, the X-direction positions match, and the Y-direction positions are different.

In the first modification example in FIGS. 129A, 129B, 129C, 129D, 129E, and 129F, the stacking of the conductor layers A and B, and the stacking of the conductor layers A and C form light-blocking structures, and the light-blocking property is maintained. On the other hand, in the second modification example in FIGS. 130A, 130B, 130C, 130D, 130E, and 130F, the stacking of the conductor layers A and C, and the stacking of the conductor layers B and C form light-blocking structures, and the light-blocking property is maintained.

The second modification example in FIGS. 130A, 130B, 130C, 130D, 130E, and 130F are similar to the first modification example in FIGS. 129A, 129B, 129C, 129D, 129E, and 129F in other respects than those mentioned above.

In the second modification example in FIGS. 130A, 130B, 130C 130D, 130E, and 130F also, if a predetermined planar range (planar region) of the conductor layer C is looked at, the current distribution in the linear conductors 1251A and the current distribution in the linear conductors 1251B become the same or substantially the same, and so the occurrence of inductive noise can be suppressed.

In addition, because it is possible to completely offset capacitive noise in the X direction, capacitive noise can be ameliorated significantly. Because the stacking of the conductor layers A and C, and the stacking of the conductor layers B and C form light-blocking structures, the light-blocking constraints of the conductor layers A and B can be relaxed significantly. In addition, the wire resistances can be lowered to ameliorate voltage drops. Furthermore, the degree of freedom of the layouts of the conductor layers A and B can be enhanced.

<Fifth Configuration Example of Three Conductor Layers>

FIGS. 131A, 131B, 131C, 131D, 131E, and 131F depict a fifth configuration example of three conductor layers.

Figure 131:
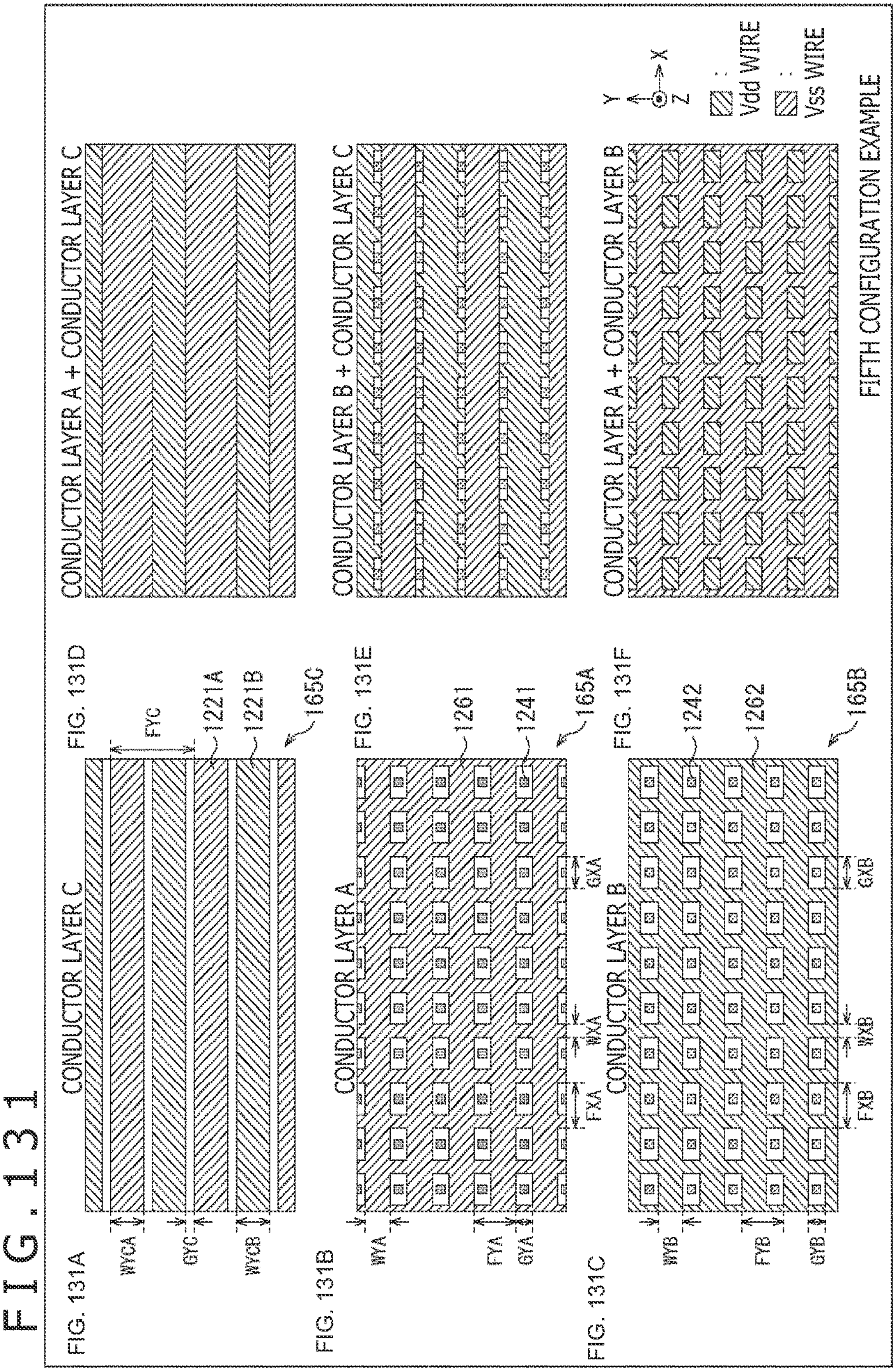

FIG. 131A depicts the conductor layer C (wiring layer 165C), FIG. 131B depicts the conductor layer A (wiring layer 165A), and FIG. 131C depicts the conductor layer B (wiring layer 165B).

In addition, FIG. 131D is a plan view of the stacked state of the conductor layer A and the conductor layer C, FIG. 131E is a plan view of the stacked state of the conductor layer B and the conductor layer C, and FIG. 131F is a plan view of the stacked state of the conductor layer A and the conductor layer B.

Sections in the fifth configuration example in FIGS. 131A, 131B, 131C, 131D, 131E, and 131F that have counterparts in the fourth configuration example depicted in FIGS. 128A, 128B, 128C, 128D, 128E, and 128F are given the same reference signs, explanations of those sections are omitted as appropriate, and explanations are given with a focus on differences.

The conductor layer A in FIG. 131B includes a mesh conductor 1261. The mesh conductor 1261 is different from the mesh conductor 1201 in the fourth configuration example depicted in FIGS. 128A, 128B, 128C, 128D, 128E, and 128F in terms of the ratio between the X-direction gap width GXA and the Y-direction gap width GYA. Specifically, while the mesh conductor 1201 in the conductor layer A in the fourth configuration example depicted in FIGS. 128A, 128B, 128C, 128D, 128E, and 128F satisfies ((gap width GYA)/(gap width GXA))>1, the mesh conductor 1261 in the conductor layer A in the fifth configuration example in FIG. 131B satisfies ((gap width GYA)/(gap width GXA))<1.

In other words, while the mesh conductor 1201 in the conductor layer A in the fourth configuration example depicted in FIGS. 128A, 128B, 128C, 128D, 128E, and 128F are conductors that satisfies (conductor width WXA)>(conductor width WYA), and (gap width GYA)>(gap width GXA), and allows currents to flow more easily in the Y direction, the mesh conductor 1261 in the conductor layer A in the fifth configuration example in FIG. 131B is a conductor that satisfies (conductor width WXA)<(conductor width WYA), and (gap width GYA)<(gap width GXA), and allows currents to flow more easily in the X direction.

Furthermore, in other words, while the direction in which currents flow more easily in the conductor layer C and the direction in which currents flow more easily in the conductor layers A and B are substantially orthogonal to each other and are different by approximately 90 degrees in the fourth configuration example depicted in FIGS. 128A, 128B, 128C, 128D, 128E, and 128F, the direction in which currents flow more easily in the conductor layer C and the direction in which currents flow more easily in the conductor layers A and B are the same or substantially the same in the fifth configuration example in FIG. 131B. In the case of the fifth configuration example in FIGS. 131A, 131B, 131C, 131D, 131E, and 131F, voltage drops can be ameliorated further, depending on the wiring layout.

In the fourth configuration example depicted in FIGS. 128A, 128B, 128C, 128D, 128E, and 128F, if gap positions of the mesh conductor 1201 in the conductor layer A and the mesh conductor 1202 in the conductor layer B are compared with each other, the X-direction positions are different, and the Y-direction positions match.

On the other hand, in the fifth configuration example in FIG. 131B, the positions of gaps in the mesh conductor 1261 in the conductor layer A and the mesh conductor 1262 in the conductor layer B match in the X direction and are different in the Y direction.

In other words, if conductors that are in the mesh conductor 1261 in the conductor layer A and the mesh conductor 1262 in the conductor layer B, and lie in the direction which is the same or substantially the same as the direction (Y direction) in which signal lines 132 of the wiring layer 170 extend are compared between the mesh conductor 1261 in the conductor layer A and the mesh conductor 1262 in the conductor layer B, all the conductors overlap when seen in the stacking direction. The thus-formed conductor layer A and conductor layer B correspond to the sixth configuration example of the conductor layers A and B depicted in FIGS. 27A, 27B, and 27C and can significantly ameliorate inductive noise as depicted in the result of a simulation in-C in FIG. 28C.

The second modification example in FIGS. 130A, 130B, 130C, 130D, 130E, and 130F are similar to the fourth configuration example depicted in FIGS. 128A, 128B, 128C, 128D, 128E, and 128F in other respects than those mentioned above.

The conductor layer C in FIG. 131A is the same as the conductor layer C in the fourth configuration example depicted in FIGS. 128A, 128B, 128C, 128D. 128E, and 128F. Accordingly, if a predetermined planar range (planar region) of the conductor layer C is looked at, the current distribution in the linear conductors 1221A and the current distribution in the linear conductors 1221B become the same or substantially the same, and so the occurrence of inductive noise can be suppressed.

Because the linear conductors 1221A and the linear conductors 1221B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 131E, the stacking of the conductor layers A and B forms a light-blocking structure, and needless to say, hot carrier light emissions from an active element group 167 can be blocked. In addition, as depicted in FIG. 131D, the stacking of the conductor layers A and C also forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

Furthermore, in a case in which the mesh conductor 1261 in the conductor layer A and the linear conductors 1221A in the conductor layer C are electrically connected, and the mesh conductor 1262 in the conductor layer B, and the linear conductors 1221B in the conductor layer C are electrically connected, the current amounts of the conductor layers A and B can be reduced, and so inductive noise from the conductor layers A and B, and voltage drops can be ameliorated further.

<Sixth Configuration Example of Three Conductor Layers>

FIGS. 132A, 132B, 132C, 132D, 132E, and 132F depict a sixth configuration example of three conductor layers.

Figures 132A, 132B, 132C, 132D, 132E, 132F:
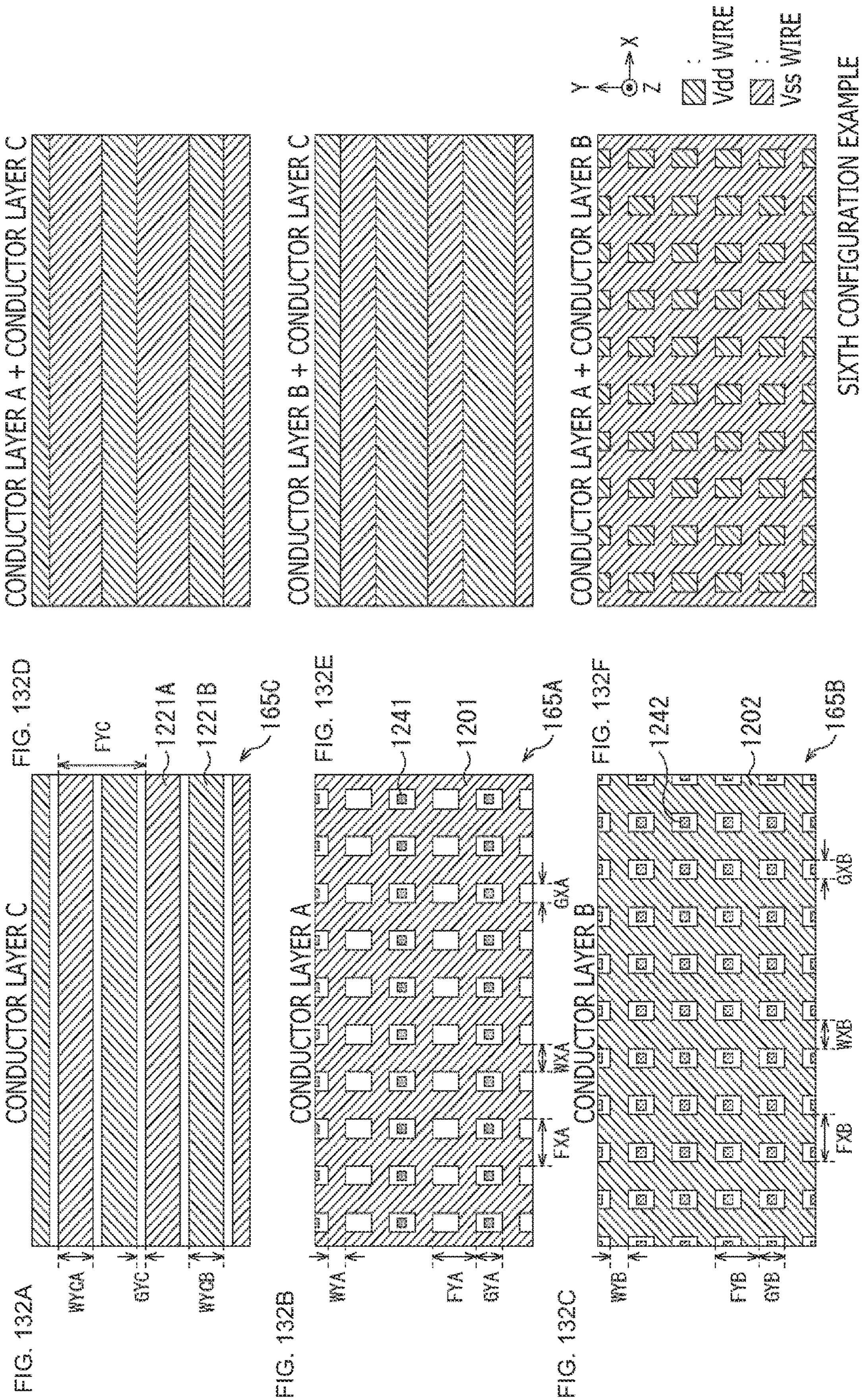

FIG. 132A depicts the conductor layer C (wiring layer 165C), FIG. 132B depicts the conductor layer A (wiring layer 165A), and FIG. 132C depicts the conductor layer B (wiring layer 165B).

In addition, FIG. 132D is a plan view of the stacked state of the conductor layer A and the conductor layer C, FIG. 132E is a plan view of the stacked state of the conductor layer B and the conductor layer C, and FIG. 132F is a plan view of the stacked state of the conductor layer A and the conductor layer B.

Sections in the sixth configuration example in FIGS. 132A, 132B, 132C, 132D, 132E, and 132F that have counterparts in the fourth configuration example depicted in FIGS. 128A, 128B, 128C, 128D, 128E, and 128F are given the same reference signs, explanations of those sections are omitted as appropriate, and explanations are given with a focus on differences.

The sixth configuration example in FIGS. 132A, 132B, 132C, 132D, 132E, and 132F are configuration which is obtained by omitting some of relay conductors 1241 in the conductor layer A in the fourth configuration example depicted in FIGS. 128A, 128B, 128C, 128D, 128E, and 128F. Specifically, while the relay conductors 1241 are formed in all the gaps in a matrix of the mesh conductor 1201 in the fourth configuration example in FIGS. 128A, 128B, 128C, 128D, 128E, and 128F, rows where relay conductors 1241 are formed, and rows where relay conductors 1241 are not formed are arranged alternately every other row in the Y direction in the sixth configuration example in FIGS. 132A, 132B, 132C, 132D, 132E, and 132F. The relay conductors 1241 in the conductor layer A are positioned in the XY plane regions of the linear conductors 1221B in the conductor layer C.

In this manner, the relay conductors 1241 formed in gaps of the mesh conductor 1201 may be arranged in some of the gaps by arranging relay conductors 1241 in not all the gaps, but thinning out relay conductors 1241. Constraints such as the occupancy of wire regions in the conductor layer A can be followed, and the degree of freedom of designing of the wiring layout can be increased.

The sixth configuration example in FIGS. 132A, 132B, 132C, 132D, 132E, and 132F is similar to the fourth configuration example depicted in FIGS. 128A, 128B, 128C, 128D, 128E, and 128F in other respects than those mentioned above.

The conductor layer C in FIG. 132A is the same as the conductor layer C in the fourth configuration example depicted in FIGS. 128A, 128B, 128C, 128D, 128E, and 128F. Accordingly, if a predetermined planar range (planar region) of the conductor layer C is looked at, the current distribution in the linear conductors 1221A and the current distribution in the linear conductors 1221B become the same or substantially the same, and so the occurrence of inductive noise can be suppressed.

Because the linear conductors 1221A and the linear conductors 1221B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 132E, the stacking of the conductor layers A and B forms a light-blocking structure, and needless to say, hot carrier light emissions from an active element group 167 can be blocked. In addition, as depicted in FIGS. 132D and 132E, the stacking of the conductor layers A and C, and the stacking of the conductor layers B and C also form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

By providing the relay conductors 1241 in the conductor layer A, it becomes possible to connect the mesh conductor 1202 and the linear conductors 1221B with substantially the shortest distance or with a short distance, to lead in a power supply, and voltage drops, energy loss, or inductive noise can be reduced.

By providing the relay conductors 1242 in the conductor layer B, it becomes possible to connect the mesh conductor 1201 and the linear conductors 1221A with substantially the shortest distance or with a short distance, and voltage drops, energy loss, or inductive noise can be reduced.

In the sixth configuration example in FIGS. 132A, 132B, 132C, 132D, 132E, and 132F, the direction in which currents flow more easily in the conductor layer C and the direction in which currents flow more easily in the conductor layers A and B are substantially orthogonal and are different by approximately 90 degrees. Thereby, currents are diffused more easily (currents are less likely to be concentrated), and so inductive noise can be ameliorated further.

<Modification Example of Sixth Configuration Example of Three Conductor Layers>

FIGS. 133A, 133B, 133C, 133D, 133E, and 133F depict a modification example of the sixth configuration example of three conductor layers.

Figures 133A, 133B, 133C, 133D, 133E, 133F:
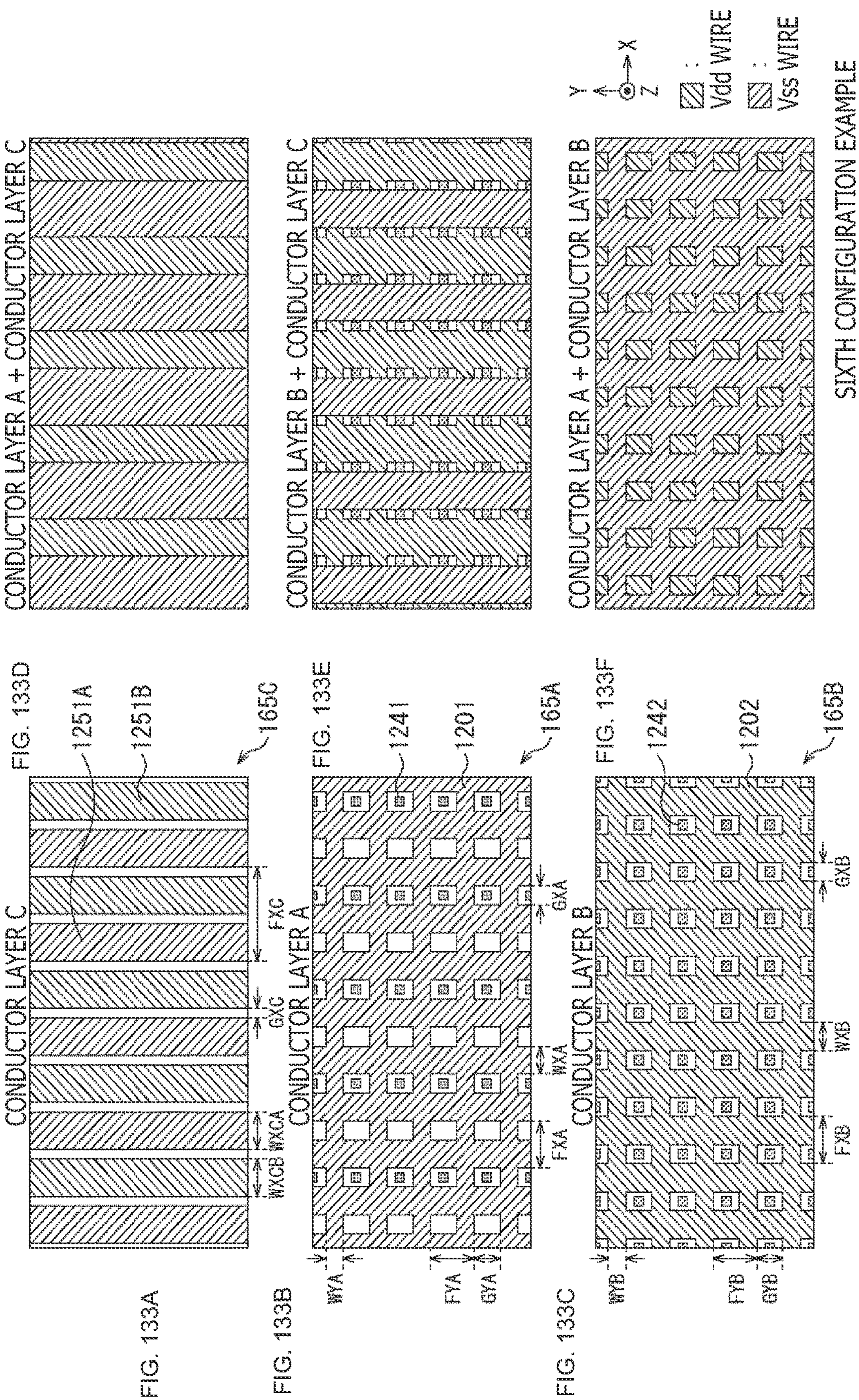

FIG. 133A depicts the conductor layer C (wiring layer 165C), FIG. 133B depicts the conductor layer A (wiring layer 165A), and FIG. 133C depicts the conductor layer B (wiring layer 165B).

In addition, FIG. 133D is a plan view of the stacked state of the conductor layer A and the conductor layer C, FIG. 133E is a plan view of the stacked state of the conductor layer B and the conductor layer C, FIG. 133F is a plan view of the stacked state of the conductor layer A and the conductor layer B.

Sections in FIGS. 133A, 133B, 133C, 133D, 133E, and 133F that have counterparts in the sixth configuration example depicted in FIGS. 132A, 132B. 132C, 132D, 132E, and 132F are given the same reference signs, explanations of those sections are omitted as appropriate, and explanations are given with a focus on differences.

The modification example of the sixth configuration example is different from the sixth configuration example in FIGS. 132A, 132B, 132C, 132D, 132E, and 132F in terms of the configurations of the conductor layer A and the conductor layer C.

In the conductor layer C in FIG. 132A, linear conductors 1221A that are long in the X direction, and linear conductors 1221B that are long in the X direction are arranged regularly alternately in the Y direction. Thereby, the direction in which currents flow more easily in the conductor layer C and the direction in which currents flow more easily in the conductor layers A and B are substantially orthogonal and are different by approximately 90 degrees.

In contrast, in the conductor layer C in FIG. 133A, linear conductors 1251A that are long in the Y direction, and linear conductors 1251B that are long in the Y direction are arranged regularly alternately in the X direction. Thereby, the direction in which currents flow more easily in the conductor layer C, and the direction in which currents flow more easily in the conductor layers A and B are the same or substantially the same. In this case, voltage drops can be ameliorated further, depending on the wiring layout.

Next, in the conductor layer A in FIG. 132B, rows where relay conductors 1241 are formed, and rows where relay conductors 1241 are not formed in gaps in a matrix of the mesh conductor 1201 are arranged alternately every other row in the Y direction.

In contrast, in the conductor layer A in FIG. 133B, columns where relay conductors 1241 are formed, and columns where relay conductors 1241 are not formed in gaps in a matrix of the mesh conductor 1201 are arranged alternately every other column in the X direction. The relay conductors 1241 in the conductor layer A are positioned in the XY plane regions of the linear conductors 1251B in the conductor layer C.

The modification example of the sixth configuration example in FIGS. 133A, 133B, 133C, 133D, 133E, and 133F is similar to the sixth configuration example depicted in FIGS. 132A, 132B, 132C, 132D, 132E, and 132F in other respects than those mentioned above.

The conductor layer C in FIG. 133A is the same as the conductor layer C in the first modification example of the fourth configuration example depicted in FIGS. 129A, 129B, 129C, 129D, 129E, and 129F. Accordingly, the current distribution in the linear conductors 1251A and the current distribution in the linear conductors 1251B become the same or substantially the same, and so the occurrence of inductive noise can be suppressed.

Because the linear conductors 1251A and the linear conductors 1251B include repetitions of the same wiring patterns in the X direction, capacitive noise can be offset completely in the X direction. Capacitive noise can be ameliorated more significantly if the conductor layer C is closer to the wiring layer 170.

As depicted in FIG. 133E, the stacking of the conductor layers A and B forms a light-blocking structure, and needless to say, hot carrier light emissions from an active element group 167 can be blocked. In addition, as depicted in FIG. 133D, the stacking of the conductor layers A and C also forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

Furthermore, in a case in which the mesh conductor 1201 in the conductor layer A and the linear conductors 1251A in the conductor layer C are electrically connected, and the mesh conductor 1202 in the conductor layer B, and the linear conductors 1251B in the conductor layer C are electrically connected, the current amounts of the conductor layers A and B can be reduced, and so inductive noise from the conductor layers A and B, and voltage drops can be ameliorated further.

Note that, while relay conductors 1241 in the conductor layer A are thinned out, and relay conductors 1242 in the conductor layer B are not thinned out in the configuration in the modification example of the sixth configuration example in FIGS. 133A, 133B, 133C, 133D, 133E, and 133F, relay conductors 1241 in the conductor layer A may not be thinned out, and relay conductors 1242 in the conductor layer B may be thinned out in another possible configuration.

<Seventh Configuration Example of Three Conductor Layers>

FIGS. 134A, 134B, 134C, 134D, 134E, and 134F depicts a seventh configuration example of three conductor layers.

Figures 134A, 134B, 134C, 134D, 134E, 134F:
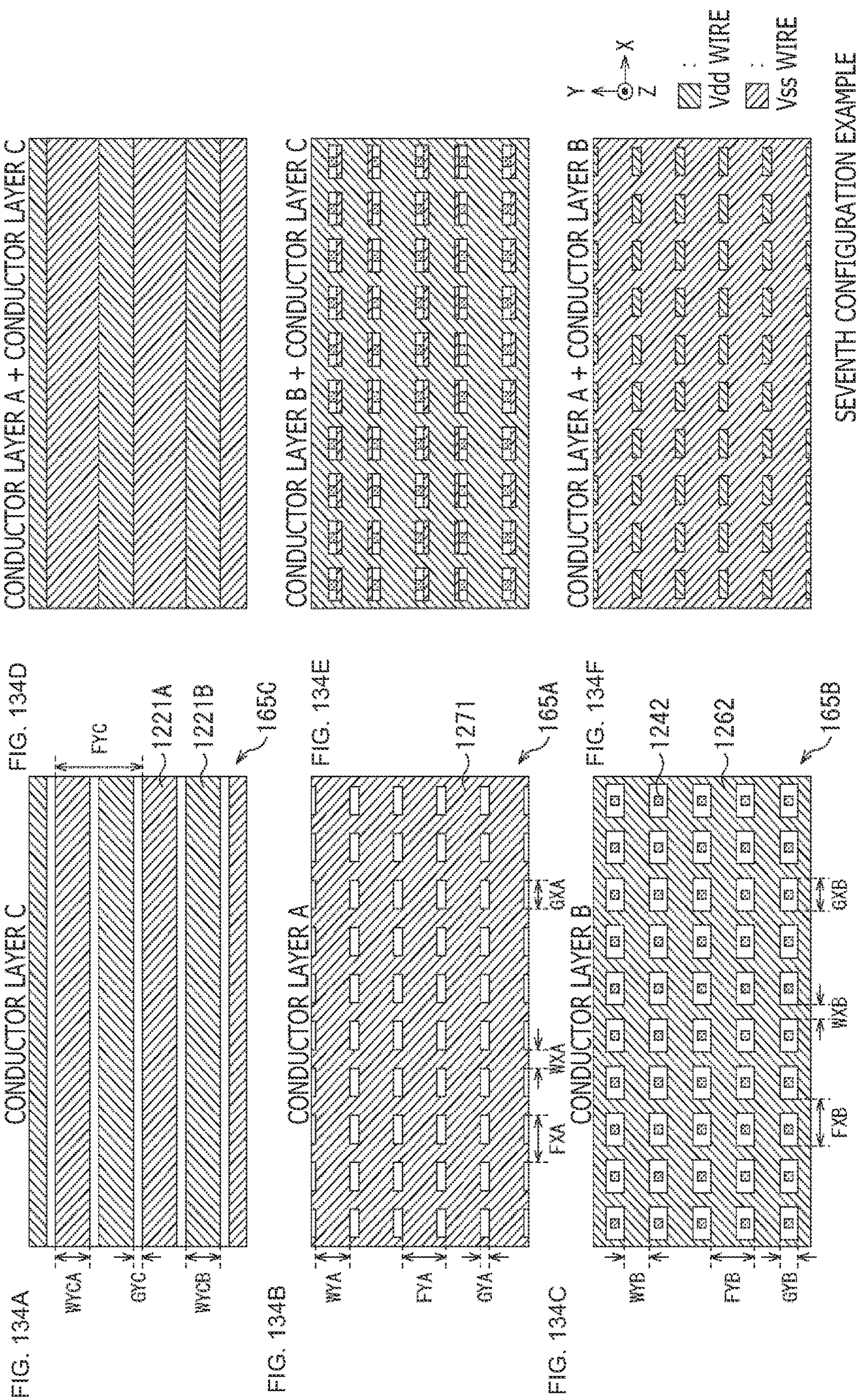

FIG. 134A depicts the conductor layer C (wiring layer 165C), FIG. 134B depicts the conductor layer A (wiring layer 165A), and FIG. 134C depicts the conductor layer B (wiring layer 165B).

In addition, FIG. 134D is a plan view of the stacked state of the conductor layer A and the conductor layer C, FIG. 134E is a plan view of the stacked state of the conductor layer B and the conductor layer C, FIG. 134F is a plan view of the stacked state of the conductor layer A and the conductor layer B.

Sections in the seventh configuration example in FIGS. 134A, 134B, 134C, 134D, 134E, and 134F that have counterparts in the fifth configuration example depicted in FIGS. 131A, 131B, 131C, 131D, 131E, and 131F are given the same reference signs, explanations of those sections are omitted as appropriate, and explanations are given with a focus on differences.

The seventh configuration example is different from the fifth configuration example in FIGS. 131A, 131B, 131C, 131D, 131E, and 131F only in terms of the configuration of the conductor layer A in FIG. 134B. The conductor layers B and C in the seventh configuration example are similar to the conductor layers B and C in the fifth configuration example in FIGS. 131A, 131B, 131C, 131D, 131E, and 131F.

The conductor layer A in FIG. 134B in the seventh configuration example has a mesh conductor 1271. In addition, the conductor layer A does not have relay conductors 1241 formed inside gaps of the mesh conductor 1271 that have the X-direction gap width GXA and the Y-direction gap width GYA.

In other words, the gap width GXA and gap width GYA of the mesh conductor 1271 in FIG. 134B are smaller than the gap width GXA and gap width GYA of the mesh conductor 1261 in FIG. 131B, and the gaps are not sufficient for forming relay conductors 1241 therein.

The seventh configuration example in FIGS. 134A, 134B, 134C. 134D, 134E, and 134F is similar to the fifth configuration example depicted in FIGS. 131A, 131B, 131C, 131D, 131E, and 131F in other respects than those mentioned above.

The conductor layer C in FIG. 134A is the same as the conductor layer C in the fifth configuration example depicted in FIGS. 131A, 131B, 131C, 131D, 131E, and 131F. Accordingly, if a predetermined planar range (planar region) of the conductor layer C is looked at, the current distribution in the linear conductors 1221A and the current distribution in the linear conductors 1221B become the same or substantially the same, and so the occurrence of inductive noise can be suppressed.

Because the linear conductors 1221A and the linear conductors 1221B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 134F, the stacking of the conductor layers A and B forms a light-blocking structure, and needless to say, hot carrier light emissions from an active element group 167 can be blocked. In addition, as depicted in FIG. 134D, the stacking of the conductor layers A and C also forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

The seventh configuration example in FIGS. 134A, 134B, 134C, 134D, 134E, and 134F is particularly suitable for stacking orders that allow electrical connection between the three layers, the conductor layers A to C, specifically, the stacking order depicted in FIG. 120B. In the case of the stacking order of the conductor layers A, C and B depicted in FIG. 120B, the mesh conductor 1271 in the conductor layer A and the linear conductors 1221A in the conductor layer C can be connected by conductor vias in the Z direction in part of regions over which their planar regions overlap, and the mesh conductor 1262 and relay conductors 1242 in the conductor layer B can be connected with the linear conductors 1221B and 1221A in the conductor layer C by conductor vias in the Z direction between conductors with common current characteristics, and in part of regions over which their planar regions overlap.

<Eighth Configuration Example of Three Conductor Layers>

Figures 135A, 135B, 135C, 135D, 135E:
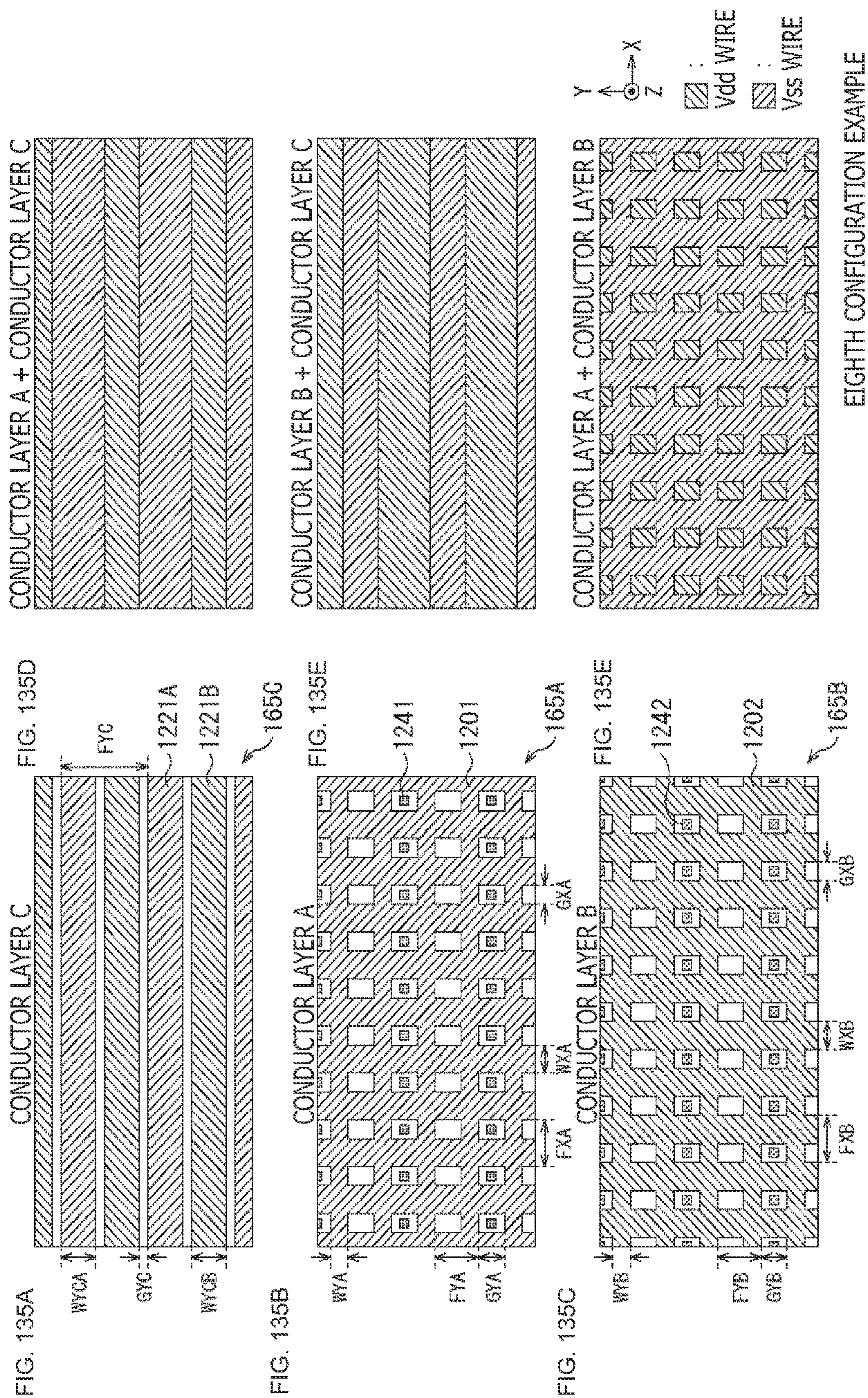

FIGS. 135A, 135B, 135C, 135D, 135E, and 135F depicts an eighth configuration example of three conductor layers. FIG. 135A depicts the conductor layer C (wiring layer 165C), FIG. 135B depicts the conductor layer A (wiring layer 165A), and FIG. 135C depicts the conductor layer B (wiring layer 165B).

In addition, FIG. 135D is a plan view of the stacked state of the conductor layer A and the conductor layer C, FIG. 135E is a plan view of the stacked state of the conductor layer B and the conductor layer C, and FIG. 135F is a plan view of the stacked state of the conductor layer A and the conductor layer B.

The eighth configuration example in FIGS. 135A, 135B, 135C, 135D, 135E, and 135F has a configuration which is obtained by partially modifying the fourth configuration example depicted in FIGS. 128A, 128B, 128C, 128D, 128E, and 128F and the eighth configuration example in FIGS. 135A, 135B, 135C, 135D, 135E, and 135F is explained by comparing it with the fourth configuration example. Note that sections in FIGS. 135A, 135B, 135C, 135D, 135E, and 135F that have counterparts in FIGS. 128A, 128B, 128C, 128D, 128E, and 128F are given the same reference signs.

The conductor layer C in FIG. 135A is similar to the conductor layer C in the fourth configuration example depicted in FIG. 128A. That is, in the conductor layer C, linear conductors 1221A that are long in the X direction, and linear conductors 1221B that are long in the X direction are arranged regularly alternately in the Y direction.

The conductor layer A in FIG. 128B has a configuration which is obtained by omitting some of relay conductors 1241 in the conductor layer A in the fourth configuration example depicted in FIGS. 128A, 128B, 128C, 128D, 128E, and 128F. Specifically, while relay conductors 1241 are formed in all the gaps in a matrix of the mesh conductor 1201 in the fourth configuration example in FIGS. 128A, 128B, 128C, 128D, 128E, and 128F, rows where relay conductors 1241 are formed, and rows where relay conductors 1241 are not formed are arranged alternately every other row in the Y direction in the eighth configuration example in FIGS. 135A, 135B, 135C, 135D, 135E, and 135F.

Similarly, the conductor layer B in FIG. 128C also has a configuration which is obtained by omitting some of relay conductors 1242 in the conductor layer B in the fourth configuration example depicted in FIGS. 128A, 128B, 128C, 128D, 128E, and 128F. Specifically, while relay conductors 1242 are formed in all the gaps in a matrix of the mesh conductor 1201 in the fourth configuration example in FIGS. 128A, 128B, 128C, 128D, 128E, and 128F, rows where relay conductors 1242 are formed, and rows where relay conductors 1242 are not formed are arranged alternately every other row in the Y direction in the eighth configuration example in FIGS. 135A, 135B, 135C, 135D, 135E, and 135F.

Accordingly, the eighth configuration example in FIGS. 135A, 135B, 135C, 135D, 135E, and 135F has a configuration in which, regarding the conductor layer A, relay conductors 1241 arranged in gaps in a matrix of the mesh conductor 1201 are thinned out every other row in the fourth configuration example depicted in FIGS. 128A, 128B, 128C, 128D, 128E, and 128F, and, regarding the conductor layer B, relay conductors 1242 arranged in gaps in a matrix of the mesh conductor 1202 are thinned out every other row in the fourth configuration example depicted in FIGS. 128A, 128B, 128C, 128D, 128E, and 128F.

The eighth configuration example in FIGS. 135A, 135B, 135C, 135D, 135E, and 135F is similar to the fourth configuration example depicted in FIGS. 128A, 128B, 128C, 128D, 128E, and 128F in other respects than those mentioned above.

If a predetermined planar range (planar region) of the conductor layer

FIG. 135A is looked at, the current distribution in the linear conductors 1221A and the current distribution in the linear conductors 1221B become the same or substantially the same, and so the occurrence of inductive noise can be suppressed.

Because the linear conductors 1221A and the linear conductors 1221B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 135E, the stacking of the conductor layers A and B forms a light-blocking structure, and needless to say, hot carrier light emissions from an active element group 167 can be blocked. In addition, as depicted in FIGS. 135D and 135E, the stacking of the conductor layers A and C, and the stacking of the conductor layers B and C also form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

By providing the relay conductors 1241 in the conductor layer A, it becomes possible to connect the mesh conductor 1202 and the linear conductors 1221B with substantially the shortest distance or with a short distance, to lead in a power supply, and voltage drops, energy loss, or inductive noise can be reduced.

By providing the relay conductors 1242 in the conductor layer B, it becomes possible to connect the mesh conductor 1201 and the linear conductors 1221A with substantially the shortest distance or with a short distance, and voltage drops, energy loss, or inductive noise can be reduced.

In the eighth configuration example in FIGS. 135A, 135B, 135C 135D, 135E, and 135F, the direction in which currents flow more easily in the conductor layer C, and the direction in which currents flow more easily in the conductor layers A and B are substantially orthogonal, and are different by approximately 90 degrees. Thereby, currents are diffused more easily (currents are less likely to be concentrated), and so inductive noise can be ameliorated further.

<First Modification Example of Eighth Configuration Example of Three Conductor Layers>

FIGS. 136A, 136B, 136C, 136D, 136E, and 136F depict a first modification example of the eighth configuration example of three conductor layers.

Figures 136A, 136B, 136C, 136D, 136E, 136F:
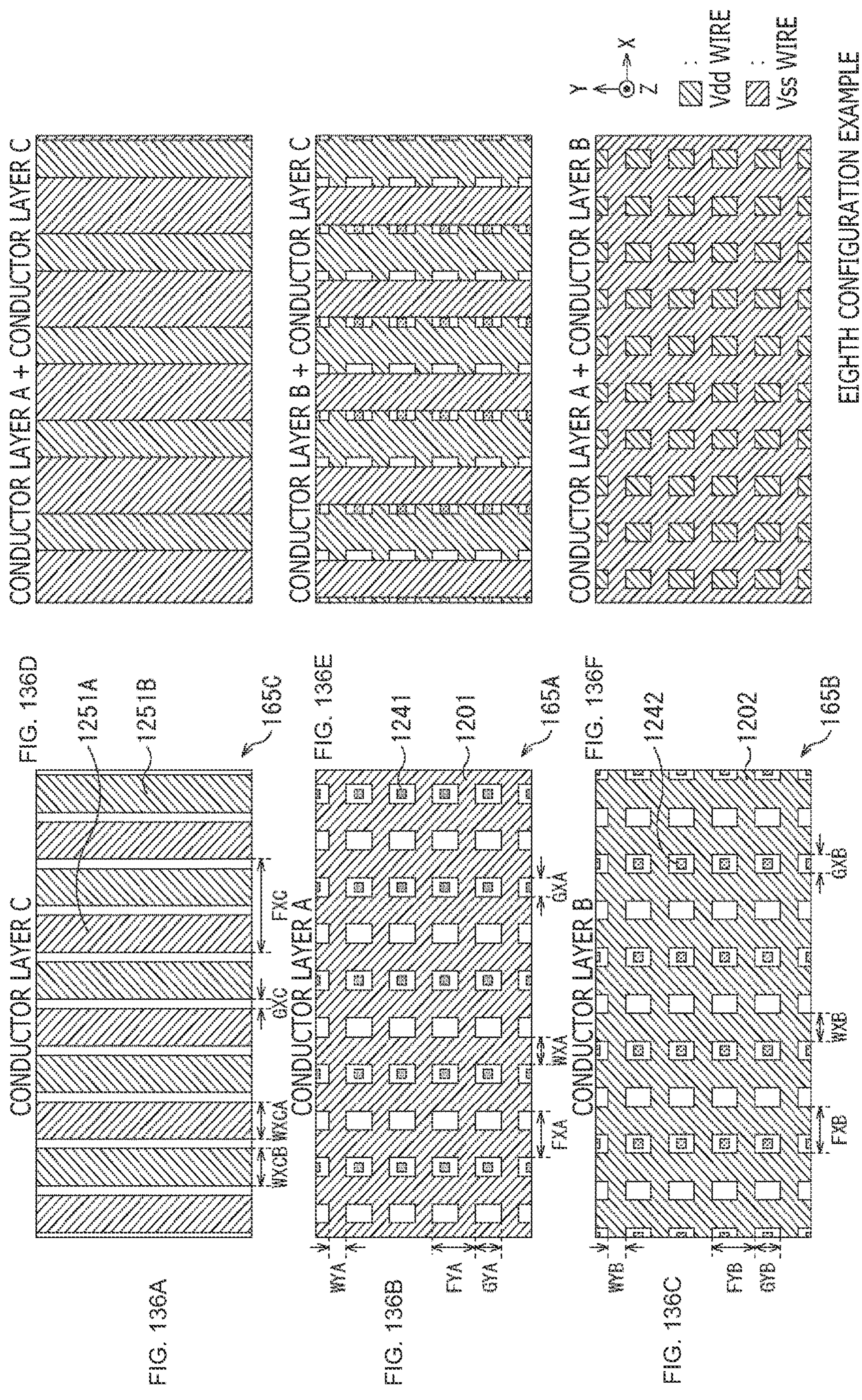

FIG. 136A depicts the conductor layer C (wiring layer 165C), FIG. 136B depicts the conductor layer A (wiring layer 165A), and FIG. 136C depicts the conductor layer B (wiring layer 165B).

In addition, FIG. 136D is a plan view of the stacked state of the conductor layer A and the conductor layer C, FIG. 136E is a plan view of the stacked state of the conductor layer B and the conductor layer C, FIG. 136F is a plan view of the stacked state of the conductor layer A and the conductor layer B.

Sections in FIGS. 136A, 136B, 136C, 136D, 136E, and 136F that have counterparts in the eighth configuration example depicted in FIGS. 135A, 135B, 135C, 135D, 135E, and 135F are given the same reference signs, explanations of those sections are omitted as appropriate, and explanations are given with a focus on differences.

The first modification example of the eighth configuration example is different from the eighth configuration example in FIGS. 135A, 135B, 135C, 135D, 135E, and 135F in terms of the configurations of the conductor layers A to C.

In the conductor layer C depicted in FIG. 135A, linear conductors 1221A that are long in the X direction, and linear conductors 1221B that are long in the X direction are arranged regularly alternately in the Y direction. Thereby, the direction in which currents flow more easily in the conductor layer C and the direction in which currents flow more easily in the conductor layers A and B are substantially orthogonal and are different by approximately 90 degrees.

In contrast, in the conductor layer C in FIG. 136A, linear conductors 1251A that are long in the Y direction, and linear conductors 1251B that are long in the Y direction are arranged regularly alternately in the X direction. Thereby, the direction in which currents flow more easily in the conductor layer C, and the direction in which currents flow more easily in the conductor layers A and B are the same or substantially the same. In this case, voltage drops can be ameliorated further, depending on the wiring layout.

Next, in the conductor layer A depicted in FIG. 135B, rows where relay conductors 1241 are formed, and rows where relay conductors 1241 are not formed in gaps in a matrix of the mesh conductor 1201 are arranged alternately every other row in the Y direction.

In contrast, in the conductor layer A in FIG. 136B, columns where relay conductors 1241 are formed, and columns where relay conductors 1241 are not formed in gaps in a matrix of the mesh conductor 1201 are arranged alternately every other column in the X direction. The relay conductors 1241 in the conductor layer A are positioned in the XY plane regions of the linear conductors 1251B in the conductor layer C.

In addition, in the conductor layer B depicted in FIG. 135C, rows where relay conductors 1242 are formed, and rows where relay conductors 1242 are not formed in gaps in a matrix of the mesh conductor 1202 are arranged alternately every other row in the Y direction.

In contrast, in the conductor layer B in FIG. 136C, columns where relay conductors 1242 are formed, and columns where relay conductors 1242 are not formed in gaps in a matrix of the mesh conductor 1202 are arranged alternately every other column in the X direction.

The first modification example of the eighth configuration example in FIGS. 136A, 136B, 136C, 136D, 136E, and 136F is similar to the eighth configuration example depicted in FIGS. 135A, 135B, 135C, 135D, 135E, and 135F in other respects than those mentioned above.

If a predetermined planar range (planar region) of the conductor layer FIG. 136A is looked at, the current distribution in the linear conductors 1251A and the current distribution in the linear conductors 1251B become the same or substantially the same, and so the occurrence of inductive noise can be suppressed.

Because the linear conductors 1251A and the linear conductors 1251B include repetitions of the same wiring patterns in the X direction, capacitive noise can be offset completely in the X direction. Capacitive noise can be ameliorated more significantly if the conductor layer C is closer to the wiring layer 170.

As depicted in FIG. 136E, the stacking of the conductor layers A and B forms a light-blocking structure, and needless to say, hot carrier light emissions from an active element group 167 can be blocked. In addition, as depicted in FIG. 136D, the stacking of the conductor layers A and C also forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

Furthermore, in a case in which the mesh conductor 1201 in the conductor layer A and the linear conductors 1251A in the conductor layer C are electrically connected, and the mesh conductor 1202 in the conductor layer B, and the linear conductors 1251B in the conductor layer C are electrically connected, the current amounts of the conductor layers A and B can be reduced, and so inductive noise from the conductor layers A and B, and voltage drops can be ameliorated further.

By providing the relay conductors 1241 in the conductor layer A, it becomes possible to connect the mesh conductor 1202 and the linear conductors 1251B with substantially the shortest distance or with a short distance, to lead in a power supply, and voltage drops, energy loss, or inductive noise can be reduced.

By providing the relay conductors 1242 in the conductor layer B, it becomes possible to connect the mesh conductor 1201 and the linear conductors 1251A with substantially the shortest distance or with a short distance, and voltage drops, energy loss, or inductive noise can be reduced.

<Second Modification Example of Eighth Configuration Example of Three Conductor Layers>

FIGS. 137A, 137B, 137C, 137D, 137E, and 137F depict a second modification example of the eighth configuration example of three conductor layers.

Figures 137A, 137B, 137C, 137D, 137E, 137F:
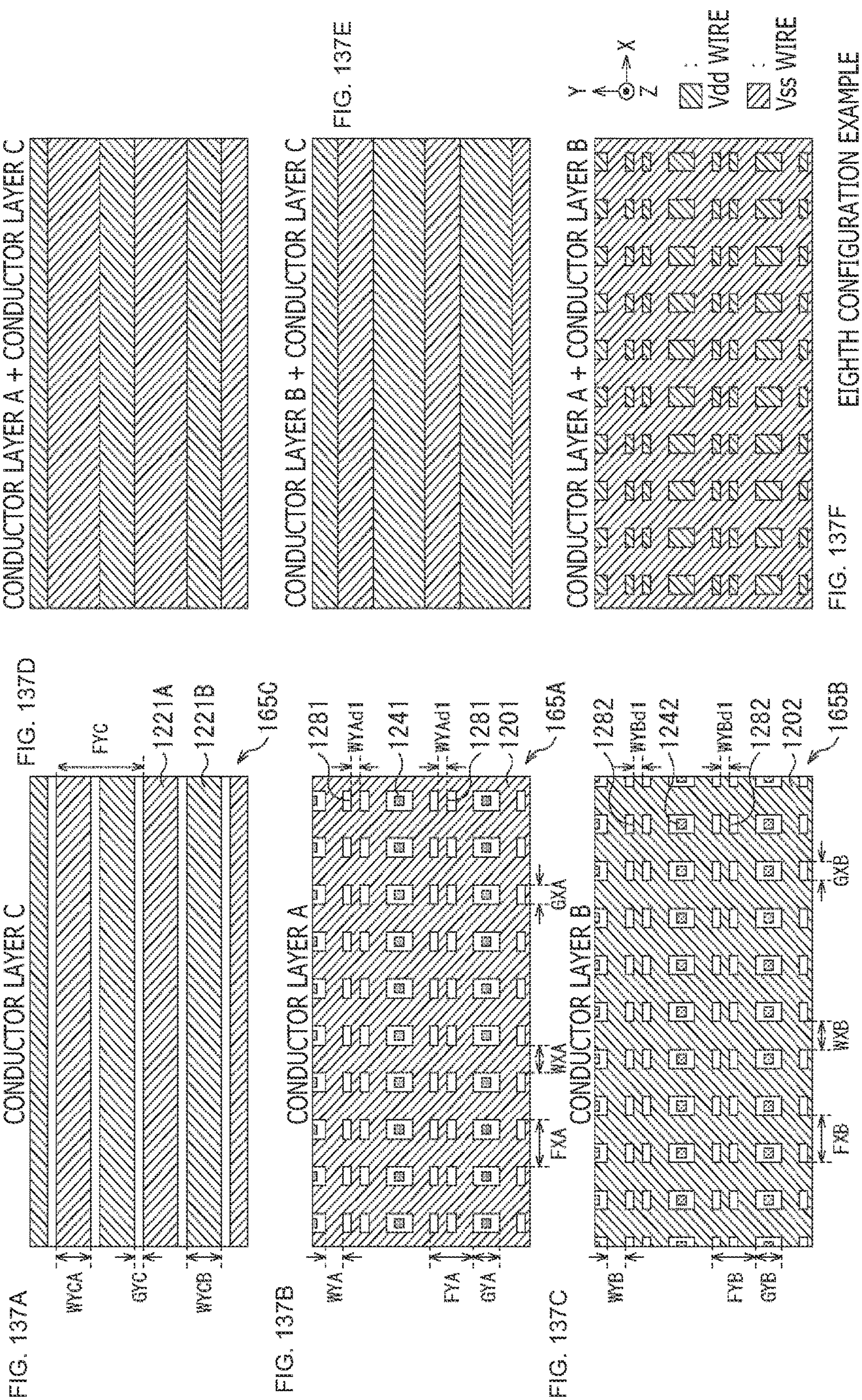

FIG. 137A depicts the conductor layer C (wiring layer 165C), FIG. 137B depicts the conductor layer A (wiring layer 165A), and FIG. 137C depicts the conductor layer B (wiring layer 165B).

In addition, FIG. 137D is a plan view of the stacked state of the conductor layer A and the conductor layer C, FIG. 137E is a plan view of the stacked state of the conductor layer B and the conductor layer C, FIG. 137F is a plan view of the stacked state of the conductor layer A and the conductor layer B.

Sections in FIGS. 137A, 137B, 137C, 137D, 137E, and 137F that have counterparts in the eighth configuration example depicted in FIGS. 135A, 135B, 135C, 135D, 135E, and 135F are given the same reference signs, explanations of those sections are omitted as appropriate, and explanations are given with a focus on differences.

The second modification example of the eighth configuration example is different from the eighth configuration example in FIGS. 135A, 135B, 135C, 135D 135E, and 135F in terms of the configurations of the conductor layer A and the conductor layer B.

As compared with the eighth configuration example depicted in FIGS. 135A, 135B, 135C, 135D, 135E, and 135F, the conductor layer A in FIG. 137B additionally has reinforcement conductors 1281 with a Y-direction conductor width WYAd1 in gaps that are in the mesh conductor 1201 and do not have relay conductors 1241 formed therein. The reinforcement conductors 1281 are linear conductors that have the X-direction conductor width which is equal to the gap width GXA and are long in the X direction.

As compared with the eighth configuration example depicted in FIGS. 135A, 135B, 135C, 135D, 135E, and 135F, the conductor layer B in-C in FIG. 137C additionally has reinforcement conductors 1282 with a Y-direction conductor width WYBd1 in gaps that are in the mesh conductor 1202 and do not have relay conductors 1242 formed therein. The reinforcement conductors 1282 are linear conductors that have the X-direction conductor width which is equal to the gap width GXB and are long in the X direction.

The second modification example of the eighth configuration example in FIGS. 137A, 137B, 137C, 137D, 137E, and 137F is similar to the eighth configuration example depicted in FIGS. 135A, 135B, 135C, 135D, 135E, and 135F in other respects than those mentioned above.

If a predetermined planar range (planar region) of the conductor layer C in FIG. 137A is looked at, the current distribution in the linear conductors 1221A and the current distribution in the linear conductors 1221B become the same or substantially the same, and so the occurrence of inductive noise can be suppressed.

Because the linear conductors 1221A and the linear conductors 1221B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 137E, the stacking of the conductor layers A and B forms a light-blocking structure, and needless to say, hot carrier light emissions from an active element group 167 can be blocked. In addition, as depicted in FIGS. 137D and 137E, the stacking of the conductor layers A and C, and the stacking of the conductor layers B and C also form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

By providing the relay conductors 1241 in the conductor layer A, it becomes possible to connect the mesh conductor 1202 and the linear conductors 1221B with substantially the shortest distance or with a short distance, to lead in a power supply, and voltage drops, energy loss, or inductive noise can be reduced.

By providing the relay conductors 1242 in the conductor layer B, it becomes possible to connect the mesh conductor 1201 and the linear conductors 1221A with substantially the shortest distance or with a short distance, and voltage drops, energy loss, or inductive noise can be reduced.

In the second modification example of the eighth configuration example in FIGS. 137A, 137B, 137C, 137D, 137E, and 137F, the direction in which currents flow more easily in the conductor layer C and the direction in which currents flow more easily in the conductor layers A and B are substantially orthogonal and are different by approximately 90 degrees. Thereby, currents are diffused more easily (currents are less likely to be concentrated), and so inductive noise can be ameliorated further.

Because the reinforcement conductors 1281 that are long in the X direction are arranged at positions that are in the conductor layer A and are where the relay conductors 1241 are thinned out, the wire resistance can be lowered, and so voltage drops can be ameliorated further. Because voltage drops are ameliorated, inductive noise can be ameliorated also.

Because the reinforcement conductors 1282 that are long in the X direction are arranged at positions that are in the conductor layer B and are where the relay conductors 1242 are thinned out, the wire resistance can be lowered, and so voltage drops can be ameliorated further. Because voltage drops are ameliorated, inductive noise can be ameliorated also.

<Third Modification Example of Eighth Configuration Example of Three Conductor Layers>

FIGS. 138A, 138B, 138C, 138D, 138E, and 138F depicts a third modification example of the eighth configuration example of three conductor layers.

Figures 138A, 138B, 138C, 138D, 138E, 138F:
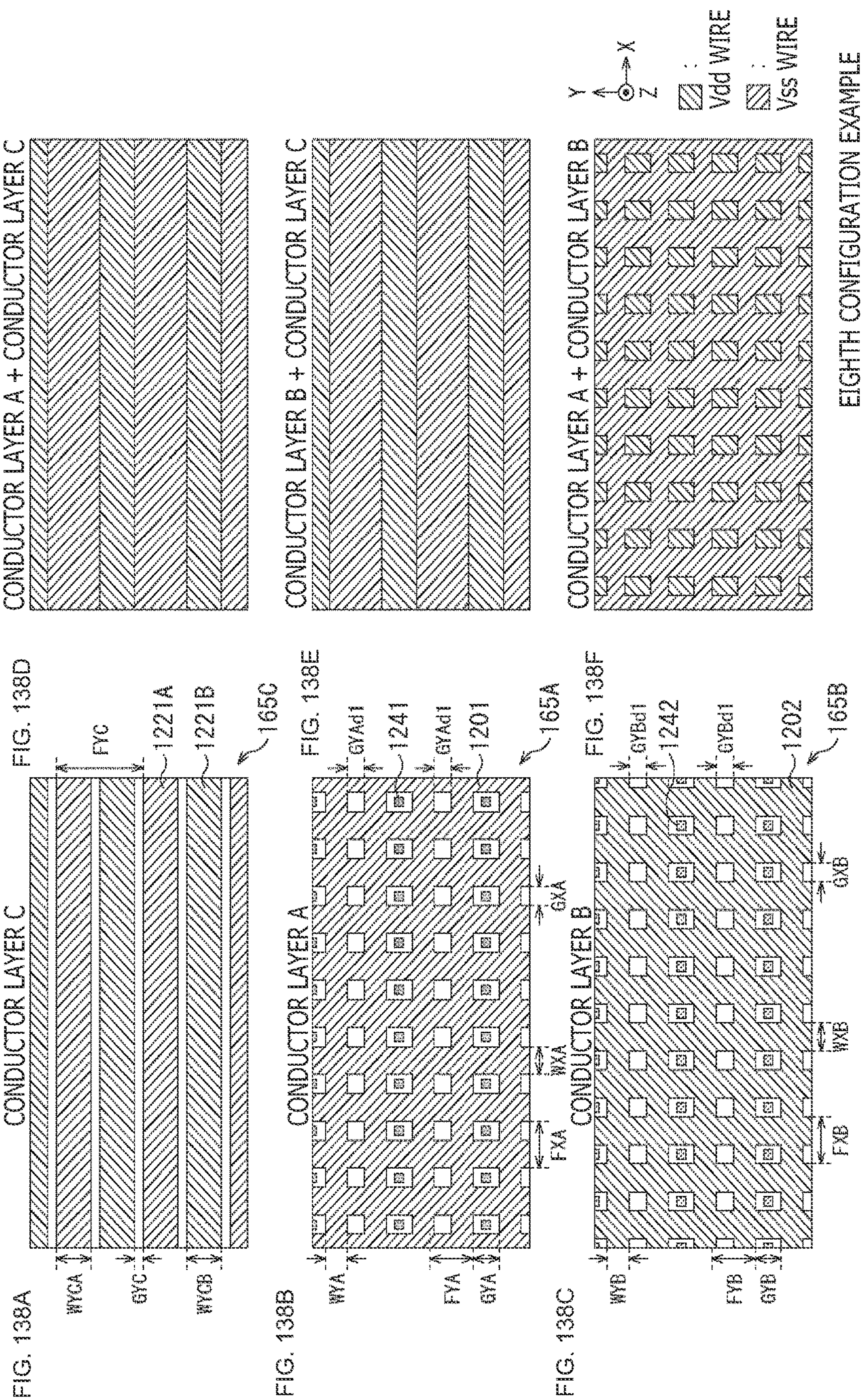

FIG. 138A depicts the conductor layer C (wiring layer 165C), FIG. 138B depicts the conductor layer A (wiring layer 165A), and FIG. 138C depicts the conductor layer B (wiring layer 165B).

In addition, FIG. 138D is a plan view of the stacked state of the conductor layer A and the conductor layer C, FIG. 138E is a plan view of the stacked state of the conductor layer B and the conductor layer C, and FIG. 138F is a plan view of the stacked state of the conductor layer A and the conductor layer B.

Sections in FIGS. 138A, 138B, 138C, 138D, 138E, and 138F that have counterparts in the eighth configuration example depicted in FIGS. 135A, 135B, 135C, 135D, 135E, and 135F are given the same reference signs, explanations of those sections are omitted as appropriate, and explanations are given with a focus on differences.

The third modification example of the eighth configuration example is different from the eighth configuration example in FIGS. 135A, 135B, 135C, 135D, 135E, and 135F in terms of the configurations of the conductor layer A and the conductor layer B.

First, if the conductor layer A is looked at, gaps in a matrix of the mesh conductor 1201 in the eighth configuration example depicted in FIGS. 135A, 135B, 135C, 135D, 135E, and 135F have the common Y-direction gap width GYA. In other words, the Y-direction gap width GYA is the same for all the gaps in the matrix of the mesh conductor 1201.

In contrast, in the conductor layer A in FIG. 138B, gaps in which relay conductors 1241 are formed have the Y-direction gap width GYA, and gaps in which relay conductors 1241 are not formed have a Y-direction gap width GYAd1 smaller than the gap width GYA ((gap width GYA)>(gap width GYAd1)).

Next, if the conductor layer B is looked at, gaps in a matrix of the mesh conductor 1202 in the eighth configuration example depicted in FIGS. 135A, 135B, 135C, 135D, 135E, and 135F have the common Y-direction gap width GYB. In other words, the Y-direction gap width GYB is the same for all the gaps in the matrix of the mesh conductor 1202.

In contrast, in the conductor layer A in FIG. 138B, gaps in which relay conductors 1242 are formed have the Y-direction gap width GYB, and gaps in which relay conductors 1242 are not formed have a Y-direction gap width GYBd1 smaller than the gap width GYB ((gap width GYB)>(gap width GYBd1)).

The third modification example of the eighth configuration example in FIGS. 138A, 138B, 138C, 138D, 138E, and 138F is similar to the eighth configuration example depicted in FIGS. 135A, 135B, 135C, 135D, 135E, and 135F in other respects than those mentioned above.

If a predetermined planar range (planar region) of the conductor layer

FIG. 138A is looked at, the current distribution in the linear conductors 1221A and the current distribution in the linear conductors 1221B become the same or substantially the same, and so the occurrence of inductive noise can be suppressed.

Because the linear conductors 1221A and the linear conductors 1221B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 138E, the stacking of the conductor layers A and B forms a light-blocking structure, and needless to say, hot carrier light emissions from an active element group 167 can be blocked. In addition, as depicted in FIGS. 138D and 138E, the stacking of the conductor layers A and C, and the stacking of the conductor layers B and C also form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

By providing the relay conductors 1241 in the conductor layer A, it becomes possible to connect the mesh conductor 1202 and the linear conductors 1221B with substantially the shortest distance or with a short distance, to lead in a power supply, and voltage drops, energy loss, or inductive noise can be reduced.

By providing the relay conductors 1242 in the conductor layer B, it becomes possible to connect the mesh conductor 1201 and the linear conductors 1221A with substantially the shortest distance or with a short distance, and voltage drops, energy loss, or inductive noise can be reduced.

In the third modification example of the eighth configuration example in FIGS. 138A, 138B, 138C, 138D, 138E, and 138F, the direction in which currents flow more easily in the conductor layer C and the direction in which currents flow more easily in the conductor layers A and B are substantially orthogonal and are different by approximately 90 degrees. Thereby, currents are diffused more easily (currents are less likely to be concentrated), and so inductive noise can be ameliorated further.

Because the gap width GYAd1 of positions where relay conductors 1241 are thinned out in the conductor layer A is made smaller than the gap width GYA of positions where relay conductors 1241 are formed, the wire resistance can be lowered, and so voltage drops can be ameliorated further. Because voltage drops are ameliorated, inductive noise can be ameliorated also.

Because the gap width GYBd1 of positions where relay conductors 1242 are thinned out in the conductor layer B is made smaller than the gap width GYB of positions where relay conductors 1242 are formed, the wire resistance can be lowered, and so voltage drops can be ameliorated further. Because voltage drops are ameliorated, inductive noise can be ameliorated also.

Note that, in the third modification example of the eighth configuration example in FIGS. 138A, 138B, 138C, 138D, 138E, and 138F, the gap width GYAd1 of positions where relay conductors 1241 are thinned out may be made smaller than the gap width GYA of positions where relay conductors 1241 are formed by making the Y-direction conductor width WYA of the mesh conductor 1201 in the conductor layer A thick, or the Y-direction conductor width WYA may be the same as that in the eighth configuration example in FIGS. 135A, 135B, 135C, 135D, 135E, and 135F. This similarly applies also to the mesh conductor 1202 in the conductor layer B.

<Fourth Modification Example of Eighth Configuration Example of

Three Conductor Layers>FIGS. 139A, 139B, 139C, 139D, 139E, and 139F depicts a fourth modification example of the eighth configuration example of three conductor layers.

Figures 139A, 139B, 139C, 139D, 139E, 139F:
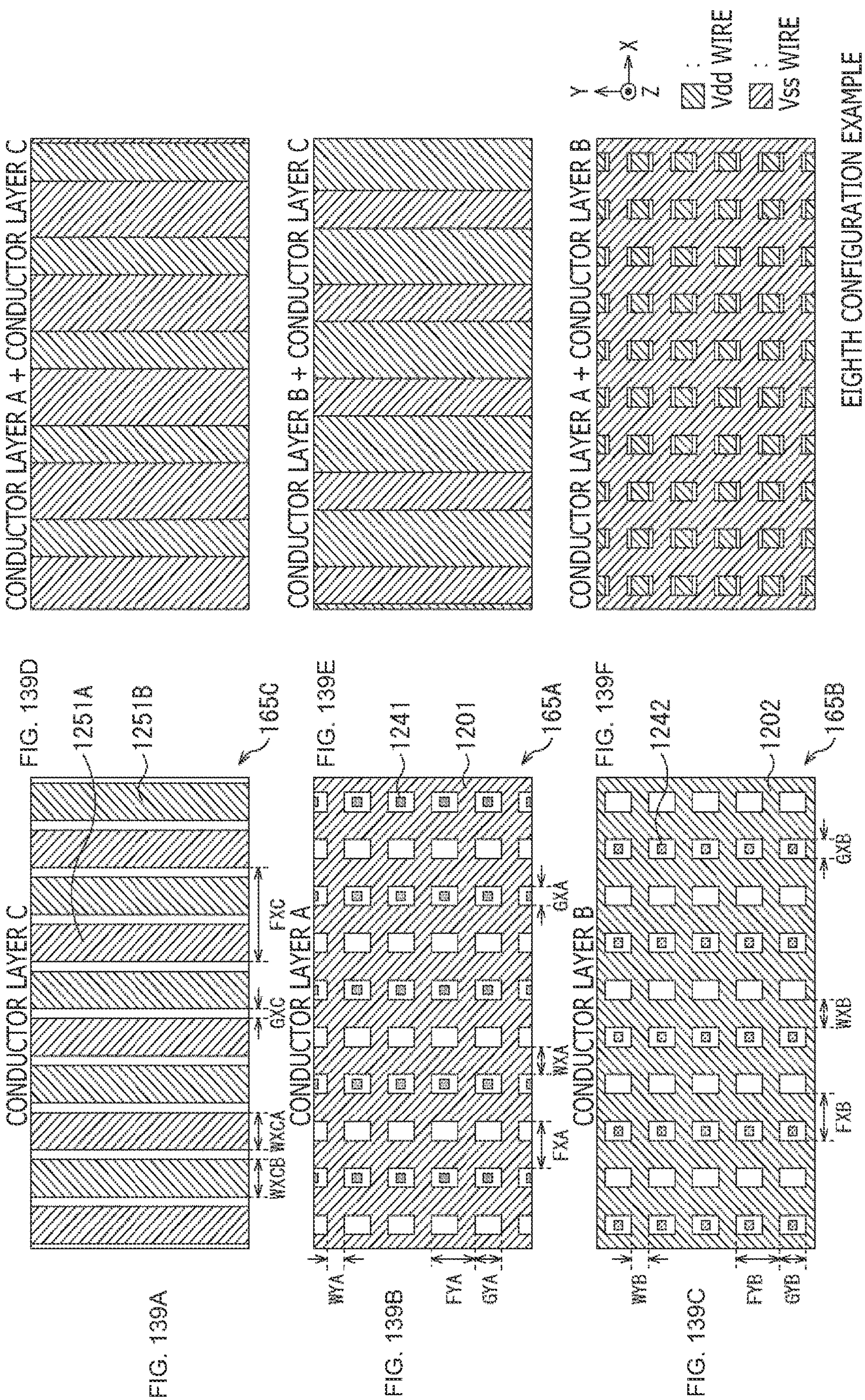

FIG. 139A depicts the conductor layer C (wiring layer 165C), FIG. 139B depicts the conductor layer A (wiring layer 165A), and FIG. 1390 depicts the conductor layer B (wiring layer 165B).

In addition, FIG. 139D is a plan view of the stacked state of the conductor layer A and the conductor layer C, FIG. 139E is a plan view of the stacked state of the conductor layer B and the conductor layer C, and FIG. 139F is a plan view of the stacked state of the conductor layer A and the conductor layer B.

The fourth modification example of the eighth configuration example in FIGS. 139A, 139B, 139C, 139D, 139E, and 139F has a configuration obtained by partially modifying the first modification example of the eighth configuration example in FIGS. 136A, 136B, 136C, 136D, 136E, and 136F. Sections in FIGS. 139A, 139B, 139C, 139D, 139E, and 139F that have counterparts in FIGS. 136A, 136B, 136C, 136D, 136E, and 136F are given the same reference signs, explanations of those sections are omitted as appropriate, and explanations are given about differences.

In the first modification example in FIGS. 136A, 136B, 136C, 136D, 136E, and 136F, if gap positions of the mesh conductor 1201 in the conductor layer A and the mesh conductor 1202 in the conductor layer B are compared with each other, the X-direction positions are different, and the Y-direction positions match.

On the other hand, in the fourth modification example in FIGS. 139A, 139B, 139C, 139D, 139E, and 139F, if gap positions of the mesh conductor 1201 in the conductor layer A and the mesh conductor 1202 in the conductor layer B are compared with each other, the X-direction positions match, and the Y-direction positions are different.

The fourth modification example of the eighth configuration example in FIGS. 139A, 139B, 139C, 139D, 139E, and 139F is similar to the first modification example in FIGS. 136A, 136B, 136C, 136D, 136E, and 136F in other respects than those mentioned above. For example, they are also similar in that columns where relay conductors 1241 are formed, and columns where relay conductors 1241 are not formed in gaps in a matrix of the mesh conductor 1201 in the conductor layer A are arranged alternately every other column in the X direction, and columns where relay conductors 1242 are formed, and columns where relay conductors 1242 are not formed in gaps in a matrix of the mesh conductor 1202 in the conductor layer B are arranged alternately every other column in the X direction.

In addition, the fourth modification example of the eighth configuration example in FIGS. 139A, 139B, 139C, 139D, 139E, and 139F corresponds to a configuration obtained by thinning out relay conductors 1241 in every other column in the conductor layer A and thinning out relay conductors 1242 in every other column in the conductor layer B in the second modification example of the fourth configuration example depicted in FIGS. 130A, 130B, 130C, 130D, 130E, and 130F.

If a predetermined planar range (planar region) of the conductor layer

FIG. 139A is looked at, the current distribution in the linear conductors 1251A and the current distribution in the linear conductors 1251B become the same or substantially the same, and so the occurrence of inductive noise can be suppressed.

Because the linear conductors 1251A and the linear conductors 1251B include repetitions of the same wiring patterns in the X direction, capacitive noise can be offset completely in the X direction. Capacitive noise can be ameliorated more significantly if the conductor layer C is closer to the wiring layer 170.

As depicted in FIGS. 139D and 139E, the stacking of the conductor layers A and C, and the stacking of the conductor layers B and C form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

Furthermore, in a case in which the mesh conductor 1201 in the conductor layer A and the linear conductors 1251A in the conductor layer C are electrically connected, and the mesh conductor 1202 in the conductor layer B, and the linear conductors 1251B in the conductor layer C are electrically connected, the current amounts of the conductor layers A and B can be reduced, and so inductive noise from the conductor layers A and B, and voltage drops can be ameliorated further.

In the conductor layer C in FIG. 139A, the direction in which currents flow more easily in the conductor layer C, and the direction in which currents flow more easily in the conductor layers A and B are the same or substantially the same. In this case, voltage drops can be ameliorated further, depending on the wiring layout.

By providing the relay conductors 1241 in the conductor layer A, it becomes possible to connect the mesh conductor 1202 and the linear conductors 1251B with substantially the shortest distance or with a short distance, to lead in a power supply, and voltage drops, energy loss, or inductive noise can be reduced.

By providing the relay conductors 1242 in the conductor layer B, it becomes possible to connect the mesh conductor 1201 and the linear conductors 1251A with substantially the shortest distance or with a short distance, and voltage drops, energy loss, or inductive noise can be reduced.

<Fifth Modification Example of Eighth Configuration Example of Three Conductor Layers>

FIGS. 140A, 140B, 140C, 140D, 140E, and 140E depict a fifth modification example of the eighth configuration example of three conductor layers.

Figures 140A, 140B, 140C, 140D, 140E, 140F:
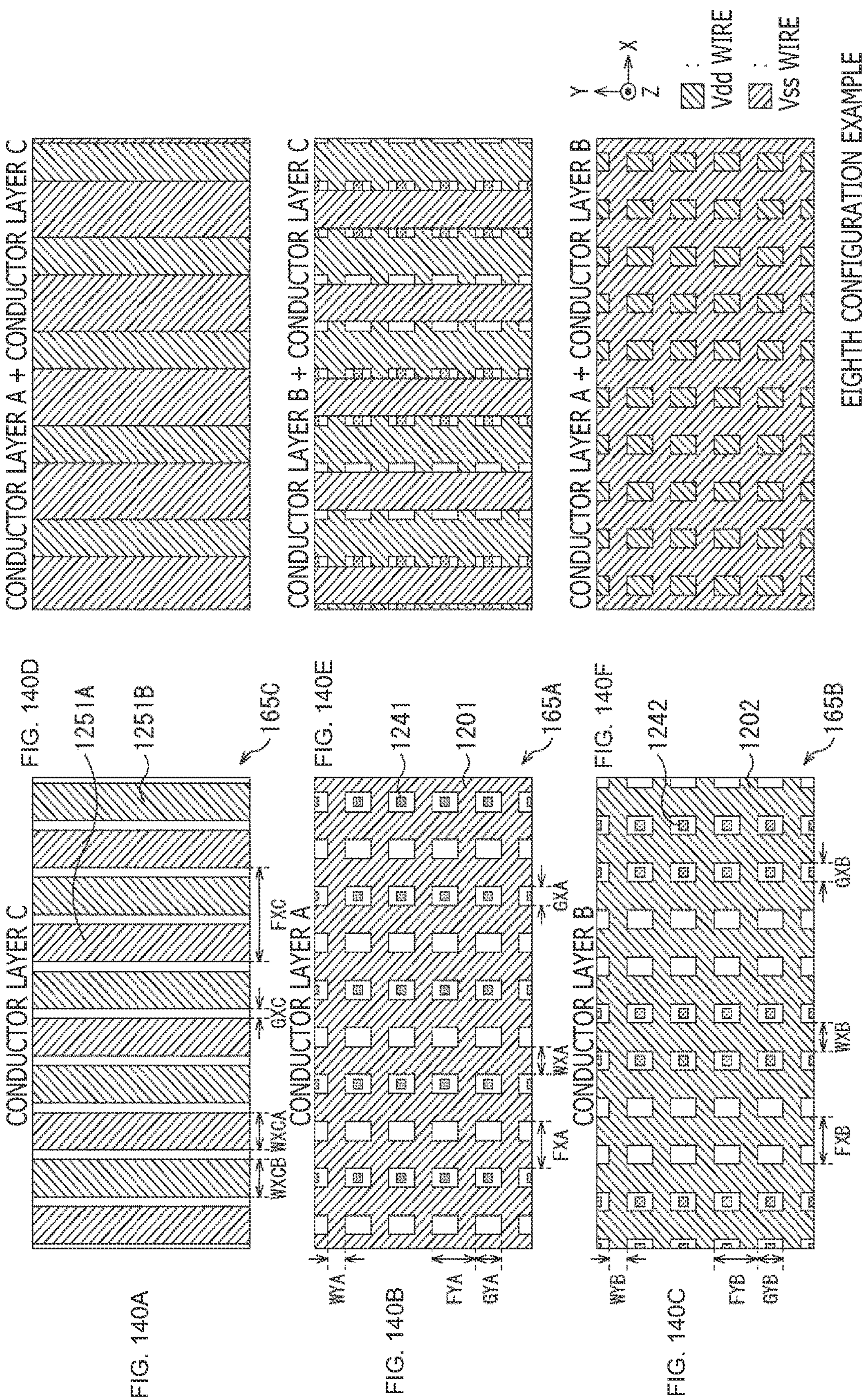

FIG. 140A depicts the conductor layer C (wiring layer 165C), FIG. 140B depicts the conductor layer A (wiring layer 165A), and FIG. 140C depicts the conductor layer B (wiring layer 165B).

In addition, FIG. 140D is a plan view of the stacked state of the conductor layer A and the conductor layer C, FIG. 140E is a plan view of the stacked state of the conductor layer B and the conductor layer C, FIG. 140E is a plan view of the stacked state of the conductor layer A and the conductor layer B.

The fifth modification example of the eighth configuration example in FIGS. 140A, 140B, 140C, 140D, 140E, and 140F has a configuration obtained by partially modifying the first modification example of the eighth configuration example depicted in FIGS. 136A, 136B, 136C, 136D, 136E, and 136F. Sections in FIGS. 140A, 140B, 140C, 140D, 140E, and 140F that have counterparts in FIGS. 136A, 136B, 136C 136D, 136E, and 136F are given the same reference signs, explanations of those sections are omitted as appropriate, and explanations are given about differences.

The fifth modification example of the eighth configuration example is different from the first modification example of the eighth configuration example in FIGS. 136A, 136B, 136C, 136D, 136E, and 136F only in terms of the configuration of the conductor layer B.

In the conductor layer B in the first modification example in FIGS. 136A, 136B, 136C, 136D, 136E, and 136F, columns where relay conductors 1242 are formed, and columns where relay conductors 1242 are not formed in gaps in a matrix of the mesh conductor 1202 are arranged alternately every other column in the X direction. In other words, relay conductors 1241 are thinned out every other column.

In contrast, in the conductor layer FIG. 140B, pairs of columns where relay conductors 1242 are formed, and pairs of columns where relay conductors 1242 are not formed in gaps in a matrix of the mesh conductor 1202 are arranged alternately in the X direction. In other words, pairs of columns of relay conductors 1241 are thinned out every other two columns.

The fifth modification example of the eighth configuration example in FIGS. 140A, 140B, 140C, 140D, 140E, and 140F is similar to the first modification example of the eighth configuration example in FIGS. 136A, 136B, 136C, 136D, 136E, and 136F in other respects than those mentioned above.

If a predetermined planar range (planar region) of the conductor layer C in A in FIGS. 140A, 140B, 140C, 140D, 140E, and 140F is looked at, the current distribution in the linear conductors 1251A and the current distribution in the linear conductors 1251B become the same or substantially the same, and so the occurrence of inductive noise can be suppressed.

Because the linear conductors 1251A and the linear conductors 1251B include repetitions of the same wiring patterns in the X direction, capacitive noise can be offset completely in the X direction. Capacitive noise can be ameliorated more significantly if the conductor layer C is closer to the wiring layer 170.

As depicted in FIG. 140E, the stacking of the conductor layers A and B forms a light-blocking structure, and needless to say, hot carrier light emissions from an active element group 167 can be blocked. In addition, as depicted in FIG. 140D, the stacking of the conductor layers A and C also forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

Furthermore, in a case in which the mesh conductor 1201 in the conductor layer A and the linear conductors 1251A in the conductor layer C are electrically connected, and the mesh conductor 1202 in the conductor layer B, and the linear conductors 1251B in the conductor layer C are electrically connected, the current amounts of the conductor layers A and B can be reduced, and so inductive noise from the conductor layers A and B, and voltage drops can be ameliorated further.

In the conductor layer C in FIG. 140A, the direction in which currents flow more easily in the conductor layer C, and the direction in which currents flow more easily in the conductor layers A and B are the same or substantially the same. In this case, voltage drops can be ameliorated further, depending on the wiring layout.

By providing the relay conductors 1241 in the conductor layer A, it becomes possible to connect the mesh conductor 1202 and the linear conductors 1251B with substantially the shortest distance or with a short distance, to lead in a power supply, and voltage drops, energy loss, or inductive noise can be reduced.

By providing the relay conductors 1242 in the conductor layer B, it becomes possible to connect the mesh conductor 1201 and the linear conductors 1251A with substantially the shortest distance or with a short distance, and voltage drops, energy loss, or inductive noise can be reduced.

<Ninth Configuration Example of Three Conductor Layers>

FIGS. 141A, 141B, 141C, 141D, 141E, and 141F depict a ninth configuration example of three conductor layers.

Figures 141A, 141B, 141C, 141D, 141E, 141F:
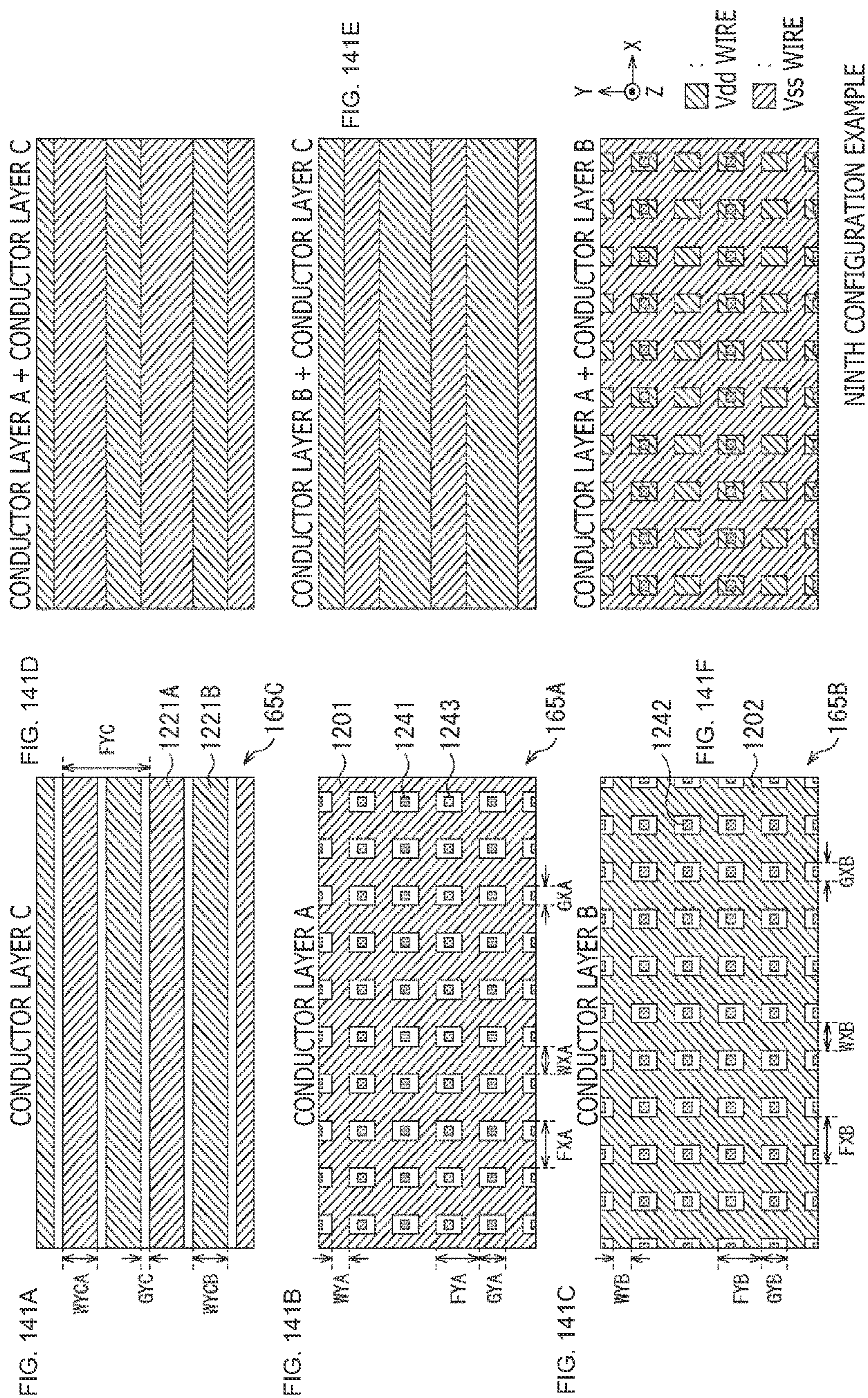

FIG. 141A depicts the conductor layer C (wiring layer 165C), FIG. 141B depicts the conductor layer A (wiring layer 165A), and FIG. 141C depicts the conductor layer B (wiring layer 165B).

In addition, FIG. 141D is a plan view of the stacked state of the conductor layer A and the conductor layer C, FIG. 141E is a plan view of the stacked state of the conductor layer B and the conductor layer C, FIG. 141F is a plan view of the stacked state of the conductor layer A and the conductor layer B.

The ninth configuration example in FIGS. 141A, 141B, 141C, 141D, 141E, and 141F has a configuration obtained by partially modifying the sixth configuration example in FIGS. 132A, 132B, 132C, 132D, 132E, and 132F. Sections in FIGS. 141A, 141B, 141C, 141D, 141E, and 141F that have counterparts in FIGS. 132A, 132B, 132C, 132D, 132E, and 132F are given the same reference signs, explanations of those sections are omitted as appropriate, and explanations are given about differences.

The ninth configuration example is different from the sixth configuration example in FIGS. 132A, 132B, 132C, 132D, 132E, and 132F only in terms of the configuration of the conductor layer A.

In the conductor layer A in the sixth configuration example in FIGS. 132A, 132B, 132C, 132D, 132E, and 132F, rows where relay conductors 1241 are formed, and rows where relay conductors 1241 are not formed in gaps in a matrix of the mesh conductor 1201 are arranged alternately every other row in the Y direction.

The conductor layer A in the ninth configuration example in FIGS. 141A, 141B, 141C, 141D, 141E, and 141F has a configuration in which relay conductors 1243 (third relay conductors) are additionally provided in gaps that are in rows in the conductor layer A and do not have relay conductors 1241 formed therein in the sixth configuration example in FIGS. 132A, 132B, 132C, 132D, 132E, and 132F. The relay conductors 1243 are wires (Vss wires) connected to GND or a negative power supply, for example.

That is, the conductor layer A in the ninth configuration example in FIGS. 141A, 141B, 141C, 141D, 141E, and 141F has a configuration provided with the mesh conductor 1201 in which rows where relay conductors 1241 are formed, and columns where relay conductors 1243 are formed in gaps in a matrix of the mesh conductor 1201 are arranged alternately every other row in the Y direction.

For example, in the case of the stacking order of the conductor layers A to C in the ninth configuration example in FIGS. 141A, 141B, 141C, 141D, 141E, and 141F in which the conductor layer B, the conductor layer C and the conductor layer A are arranged in this order, and the conductor layer C is arranged at the middle, the relay conductors 1242 in the conductor layer B can be connected with the linear conductors 1221A in the conductor layer C by conductor vias in the Z direction, and the mesh conductor 1202 in the conductor layer B can be connected with the linear conductors 1221B in the conductor layer C by conductor vias in the Z direction. Also, the relay conductors 1241 in the conductor layer A can be connected with the linear conductors 1221B in the conductor layer C by conductor vias in the Z direction, and the relay conductors 1243 can be connected with the linear conductors 1221A in the conductor layer C by conductor vias in the Z direction. Further, the mesh conductor 1201 in the conductor layer A and the linear conductors 1221A in the conductor layer C can be connected by conductor vias in the Z direction. In addition, the relay conductors 1243 may be connected with conductors in a conductor layer other than the conductor layers A to C by conductor vias in the Z direction. Furthermore, not all of the relay conductors 1243 have to be used for electrical connection, all of the relay conductors 1243 may be used for electrical connection, or some of the relay conductors 1243 may be used for electrical connection.

By providing the relay conductors 1241 in the conductor layer A, it becomes possible to connect with the linear conductors 1221B with substantially the shortest distance or with a short distance, and voltage drops, energy loss, or inductive noise can be reduced.

By providing the relay conductors 1243 in the conductor layer A, it becomes possible to connect with the linear conductors 1221A with substantially the shortest distance or with a short distance, and voltage drops, energy loss, or inductive noise can be reduced.

By providing the relay conductors 1242 in the conductor layer B, it becomes possible to connect with the linear conductors 1221A with substantially the shortest distance or with a short distance, and voltage drops, energy loss, or inductive noise can be reduced.

The ninth configuration example in FIGS. 141A, 141B, 141C, 141D, 141E, and 141F is similar to the sixth configuration example in FIGS. 132A, 132B. 132C, 132D, 132E, and 132F in other respects than those mentioned above.

The conductor layer C in FIG. 141A is the same as the conductor layer C in the sixth configuration example in FIGS. 132A, 132B, 132C, 132D, 132E, and 132F. Accordingly, if a predetermined planar range (planar region) of the conductor layer C is looked at, the current distribution in the linear conductors 1221A and the current distribution in the linear conductors 1221B become the same or substantially the same, and so the occurrence of inductive noise can be suppressed.

Because the linear conductors 1221A and the linear conductors 1221B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 141F, the stacking of the conductor layers A and B forms a light-blocking structure, and needless to say, hot carrier light emissions from an active element group 167 can be blocked. In addition, as depicted in FIGS. 141D and 141E, the stacking of the conductor layers A and C, and the stacking of the conductor layers B and C also form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

In the ninth configuration example in FIGS. 141A, 141B, 141C, 141D, 141E, and 141F, the direction in which currents flow more easily in the conductor layer C and the direction in which currents flow more easily in the conductor layers A and B are substantially orthogonal and are different by approximately 90 degrees. Thereby, currents are diffused more easily (currents are less likely to be concentrated), and so inductive noise can be ameliorated further.

<First Modification Example of Ninth Configuration Example of Three Conductor Layers>

Figures 142A, 142B, 142C, 142D, 142E, 142F:
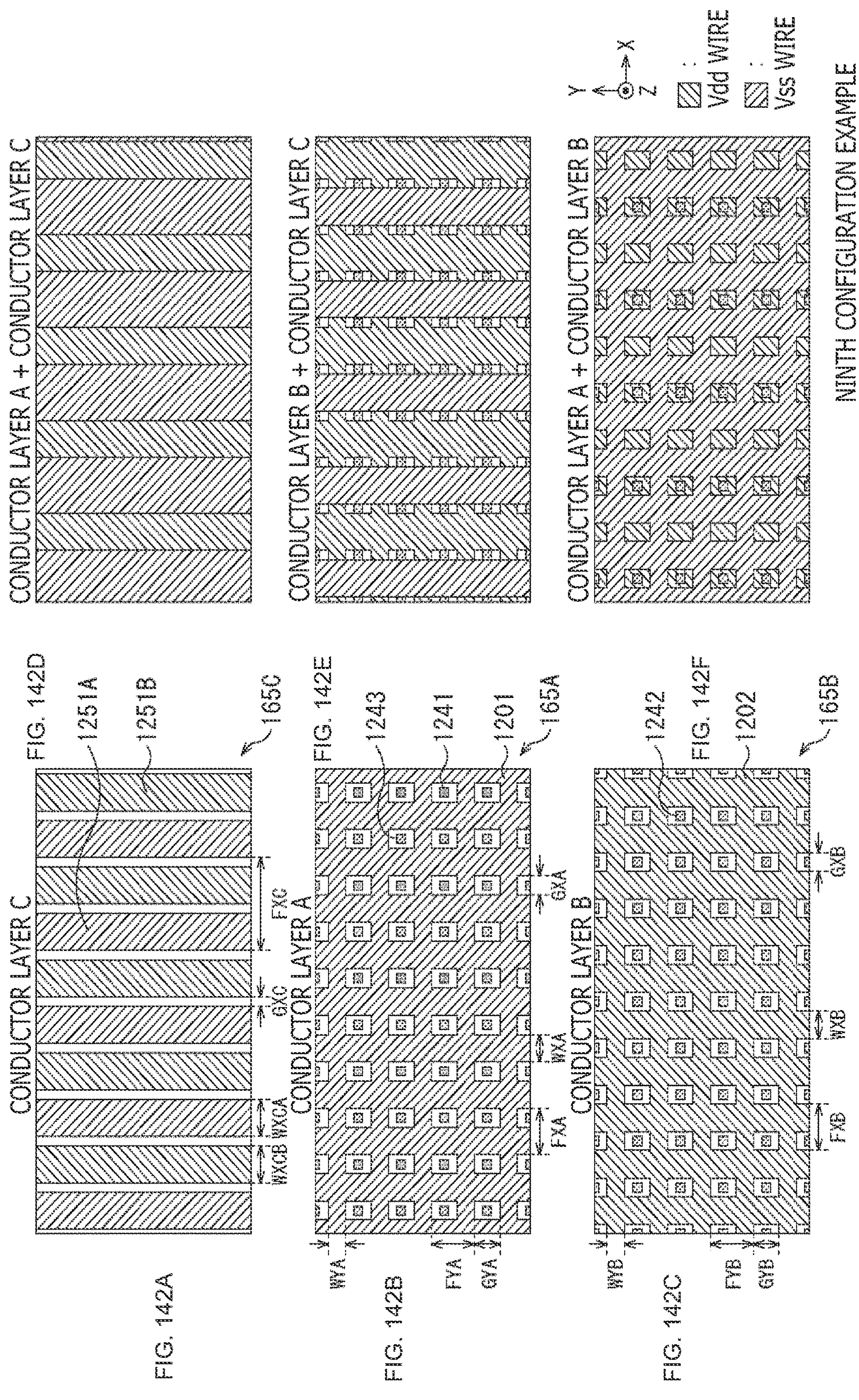

FIGS. 142A, 142B, 142C, 142D, 142E, and 142F depicts a first modification example of the ninth configuration example of three conductor layers. FIG. 142A depicts the conductor layer C (wiring layer 165C), FIG. 142B depicts the conductor layer A (wiring layer 165A), and FIG. 142C depicts the conductor layer B (wiring layer 165B).

In addition, FIG. 142D is a plan view of the stacked state of the conductor layer A and the conductor layer C, FIG. 142E is a plan view of the stacked state of the conductor layer B and the conductor layer C, and FIG. 142F is a plan view of the stacked state of the conductor layer A and the conductor layer B.

The first modification example of the ninth configuration example has a configuration obtained by partially modifying the first modification example of the sixth configuration example in FIGS. 133A, 133B, 133C, 133D, 133E, and 133F. Sections in FIGS. 142A, 142B, 142C, 142D, 142E, and 142F that have counterparts in FIGS. 133A, 133B, 133C, 133D, 133E, and 133F are given the same reference signs, explanations of those sections are omitted as appropriate, and explanations are given about differences.

The first modification example of the ninth configuration example is different from the first modification example of the sixth configuration example in FIGS. 133A, 133B, 133C, 133D, 133E, and 133F only in terms of the configuration of the conductor layer A.

In the conductor layer A in the first modification example of the sixth configuration example in FIGS. 133A, 133B, 133C, 133D, 133E, and 133F, columns where relay conductors 1241 are formed, and columns where relay conductors 1241 are not formed in gaps in a matrix of the mesh conductor 1201 are arranged alternately every other column in the Y direction.

The conductor layer A in the first modification example of the ninth configuration example in FIGS. 142A, 142B, 142C, 142D, 142E, and 142F has a configuration in which relay conductors 1243 are additionally provided in gaps that are in columns in the conductor layer A and do not have relay conductors 1241 formed therein in the first modification example of the sixth configuration example in FIGS. 133A, 133B, 133C, 133D, 133E, and 133F.

That is, the conductor layer A in the first modification example of the ninth configuration example in FIGS. 142A, 142B, 142C, 142D, 142E, and 142F has a configuration provided with the mesh conductor 1201 in which columns where relay conductors 1241 are formed, and columns where relay conductors 1243 are formed in gaps in a matrix of the mesh conductor 1201 are arranged alternately every other column in the X direction.

For example, in the case of the stacking order of the conductor layers A to C in the ninth configuration example in FIGS. 142A, 142B, 142C, 142D, 142E, and 142F in which the conductor layer B, the conductor layer C and the conductor layer A are arranged in this order, and the conductor layer C is arranged at the middle, the relay conductors 1242 in the conductor layer B can be connected with the linear conductors 1251A in the conductor layer C, and the mesh conductor 1202 in the conductor layer B can be connected with the linear conductors 1251B in the conductor layer C by conductor vias in the Z direction. In addition, the relay conductors 1241 in the conductor layer A can be connected with the linear conductors 1251B in the conductor layer C, and the relay conductors 1243 can be connected with the linear conductors 1251A in the conductor layer C. Furthermore, the mesh conductor 1201 in the conductor layer A and the linear conductors 1251A in the conductor layer C can be connected by conductor vias in the Z direction.

By providing the relay conductors 1241 in the conductor layer A, it becomes possible to connect with the linear conductors 1251B with substantially the shortest distance or with a short distance, and voltage drops, energy loss, or inductive noise can be reduced.

By providing the relay conductors 1243 in the conductor layer A, it becomes possible to connect with the linear conductors 1251A with substantially the shortest distance or with a short distance, and voltage drops, energy loss, or inductive noise can be reduced.

By providing the relay conductors 1242 in the conductor layer B, it becomes possible to connect with the linear conductors 1251A with substantially the shortest distance or with a short distance, and voltage drops, energy loss, or inductive noise can be reduced.

The first modification example of the ninth configuration example in FIGS. 142A, 142B, 142C, 142D, 142E, and 142F is similar to the first modification example of the sixth configuration example in FIGS. 133A, 133B, 133C, 133D, 133E, and 133F in other respects than those mentioned above.

The conductor layer C in FIG. 142A is the same as the conductor layer C in the sixth configuration example in FIGS. 132A, 132B, 132C, 132D, 132E, and 132F. Accordingly, if a predetermined planar range (planar region) of the conductor layer C is looked at, the current distribution in the linear conductors 1251A and the current distribution in the linear conductors 1251B become the same or substantially the same, and so the occurrence of inductive noise can be suppressed.

Because the linear conductors 1251A and the linear conductors 1251B include repetitions of the same wiring patterns in the X direction, capacitive noise can be offset completely in the X direction. Capacitive noise can be ameliorated more significantly if the conductor layer C is closer to the wiring layer 170.

As depicted in FIG. 142, the stacking of the conductor layers A and B forms a light-blocking structure, and needless to say, hot carrier light emissions from an active element group 167 can be blocked. In addition, as depicted in D in FIG. 142, the stacking of the conductor layers A and C also forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

As depicted in FIG. 142E, the stacking of the conductor layers A and B forms a light-blocking structure, and needless to say, hot carrier light emissions from an active element group 167 can be blocked. In addition, as depicted in FIG. 142D, the stacking of the conductor layers A and C also forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

In the first modification example of the ninth configuration example in FIGS. 142A, 142B, 142C, 142D, 142E, and 142F, the direction in which currents flow more easily in the conductor layer C, and the direction in which currents flow more easily in the conductor layers A and B are the same or substantially the same. In this case, voltage drops can be ameliorated further, depending on the wiring layout.

<Second Modification Example of Ninth Configuration Example of Three Conductor Layers>

FIGS. 143A, 143B, 143C, 143D, 143E, and 143F depict a second modification example of the ninth configuration example of three conductor layers.

Figures 143A, 143B, 143C, 143D, 143E, 143F:
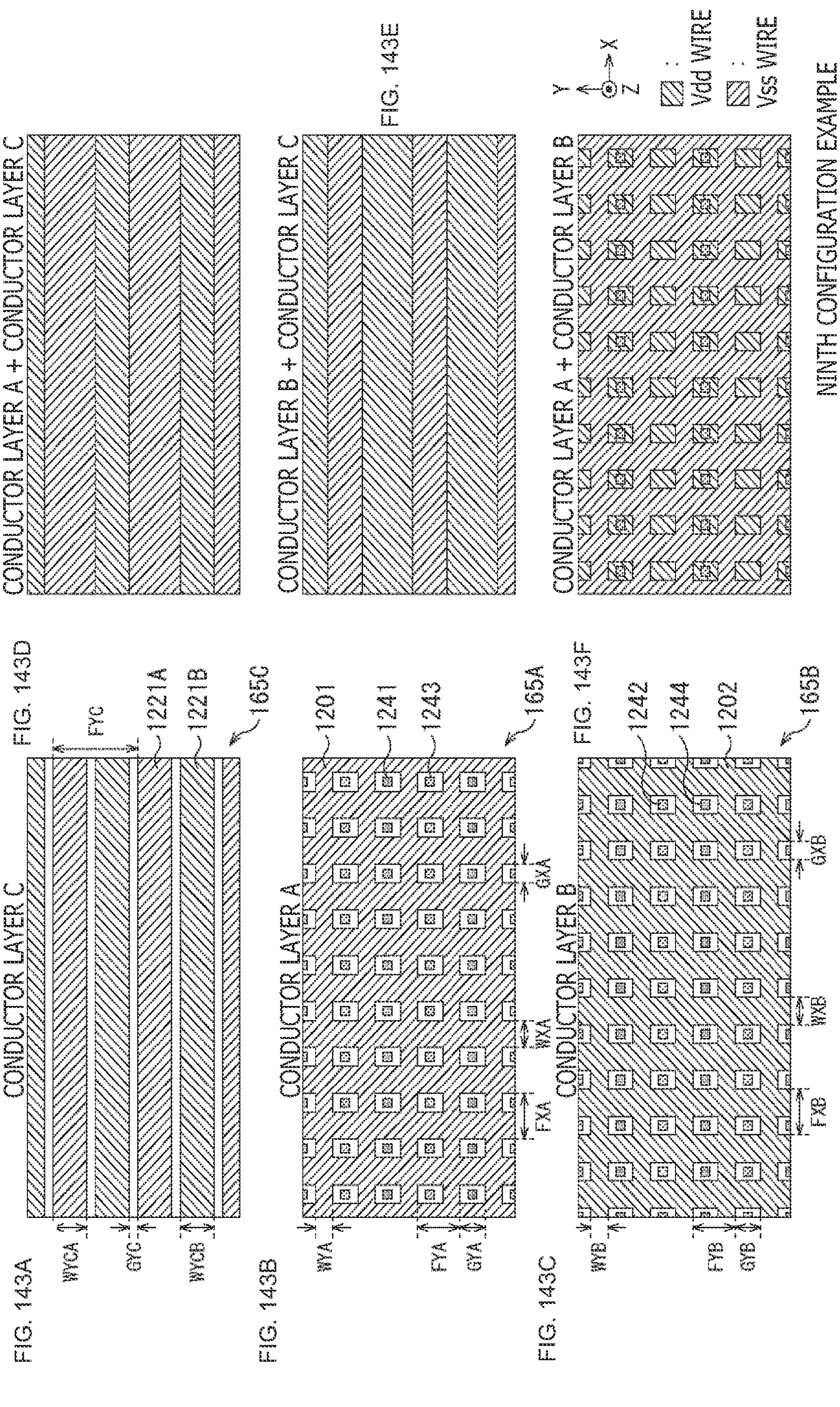

FIG. 143A depicts the conductor layer C (wiring layer 165C), FIG. 143B depicts the conductor layer A (wiring layer 165A), and FIG. 143C depicts the conductor layer B (wiring layer 165B).

In addition, FIG. 143D is a plan view of the stacked state of the conductor layer A and the conductor layer C, FIG. 143E is a plan view of the stacked state of the conductor layer B and the conductor layer C, and FIG. 143F is a plan view of the stacked state of the conductor layer A and the conductor layer B.

The second modification example of the ninth configuration example has a configuration obtained by partially modifying the ninth configuration example in FIGS. 141A, 141B, 141C, 141D, 141E, and 141F. Sections in FIGS. 143A, 143B, 143C, 143D, 143E, and 143F that have counterparts in FIGS. 141A, 141B, 141C, 141D, 141E, and 141E are given the same reference signs, explanations of those sections are omitted as appropriate, and explanations are given about differences.

The second modification example of the ninth configuration example is different from the ninth configuration example in FIGS. 141A, 141B, 141C, 141D, 141E, and 141F only in terms of the configuration of the conductor layer B.

The conductor layer B in the ninth configuration example in FIGS. 141A, 141B, 141C, 141D, 141E, and 141F has a configuration provided with the mesh conductor 1202 in which relay conductors 1242 are formed in all the gaps in a matrix of the mesh conductor 1202.

In contrast, in the second modification example of the ninth configuration example in FIGS. 143A, 143B, 143C, 143D, 143E, and 143F, rows where relay conductors 1242 are formed, and rows where relay conductors 1244 (fourth relay conductors) are formed in gaps in the mesh conductor 1201 are arranged alternately every other row in the Y direction. The relay conductors 1244 are wires (Vdd wire) connected to a positive power supply, for example.

For example, in the case of the stacking order of the conductor layers A to C in the second modification example of the ninth configuration example in FIGS. 143A, 143B, 143C, 143D, 143E, and 143F in which the conductor layer B, the conductor layer A and the conductor layer C are arranged in this order, and the conductor layer A is arranged at the middle, the relay conductors 1242 in the conductor layer B are connected with the mesh conductor 1201 in the conductor layer A by conductor vias in the Z direction, and the relay conductors 1244 in the conductor layer B are connected with the mesh conductor 1202 in the conductor layer B via conductors in a conductor layer other than the conductor layers A to C. In addition, the mesh conductor 1202 in the conductor layer B can be connected with the relay conductors 1241 in the conductor layer A by conductor vias in the Z direction. The relay conductors 1241 in the conductor layer A can be connected with the linear conductors 1221B in the conductor layer C by conductor vias in the Z direction, and the relay conductors 1243 can be connected with the linear conductors 1221A in the conductor layer C by conductor vias in the Z direction. Furthermore, the mesh conductor 1201 in the conductor layer A can be connected with the linear conductors 1221A in the conductor layer C by conductor vias in the Z direction. Note that not all of the relay conductors 1244 have to be used for electrical connection, all of the relay conductors 1244 may be used for electrical connection, or some of the relay conductors 1244 may be used for electrical connection. In the second modification example of the ninth configuration example in FIGS. 143A, 143B, 143C, 143D, 143E, and 143F, the shape of Vdd wires and the shape of Vss wires in the conductor layers A and B are the same or substantially the same although there is positional displacement. Accordingly, the layouts of the conductor layers A to C can be designed easily in some cases, and the Vdd wires and the Vss wires can be easily given a suitable current relation or voltage relation in some cases.

By providing the relay conductors 1241 in the conductor layer A, it becomes possible to connect with the linear conductors 1221B with substantially the shortest distance or with a short distance, and voltage drops, energy loss, or inductive noise can be reduced.

By providing the relay conductors 1243 in the conductor layer A, it becomes possible to connect with the linear conductors 1221A with substantially the shortest distance or with a short distance, and voltage drops, energy loss, or inductive noise can be reduced.

By providing the relay conductors 1242 in the conductor layer B, it becomes possible to connect with the linear conductors 1221A with substantially the shortest distance or with a short distance, and voltage drops, energy loss, or inductive noise can be reduced.

By providing the relay conductors 1244 in the conductor layer B, it becomes possible to connect with the linear conductors 1221B with substantially the shortest distance or with a short distance, and voltage drops, energy loss, or inductive noise can be reduced.

The second modification example of the ninth configuration example in FIGS. 143A, 143B, 143C, 143D, 143E, and 143F is similar to the ninth configuration example in FIGS. 141A, 141B, 141C, 141D, 141E, and 141F in other respects than those mentioned above.

The conductor layer C in FIG. 143A is the same as the conductor layer C in the ninth configuration example in FIGS. 141A, 141B, 141C, 141D, 141E, and 141F. Accordingly, if a predetermined planar range (planar region) of the conductor layer C is looked at, the current distribution in the linear conductors 1221A and the current distribution in the linear conductors 1221B become the same or substantially the same, and so the occurrence of inductive noise can be suppressed.

Because the linear conductors 1221A and the linear conductors 1221B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 143E, the stacking of the conductor layers A and B forms a light-blocking structure, and needless to say, hot carrier light emissions from an active element group 167 can be blocked. In addition, as depicted in FIGS. 143D and 143E, the stacking of the conductor layers A and C, and the stacking of the conductor layers B and C also form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

In the ninth configuration example in FIGS. 143A, 143B, 143C, 143D, 143E, and 143F, the direction in which currents flow more easily in the conductor layer C and the direction in which currents flow more easily in the conductor layers A and B are substantially orthogonal and are different by approximately 90 degrees. Thereby, currents are diffused more easily (currents are less likely to be concentrated), and so inductive noise can be ameliorated further.

<Third Modification Example of Ninth Configuration Example of Three Conductor Layers>

FIGS. 144A, 144B, 144C, 144D, 144E, and 144F depicts a third modification example of the ninth configuration example of three conductor layers.

Figures 144A, 144B, 144C, 144D, 144E, 144F:
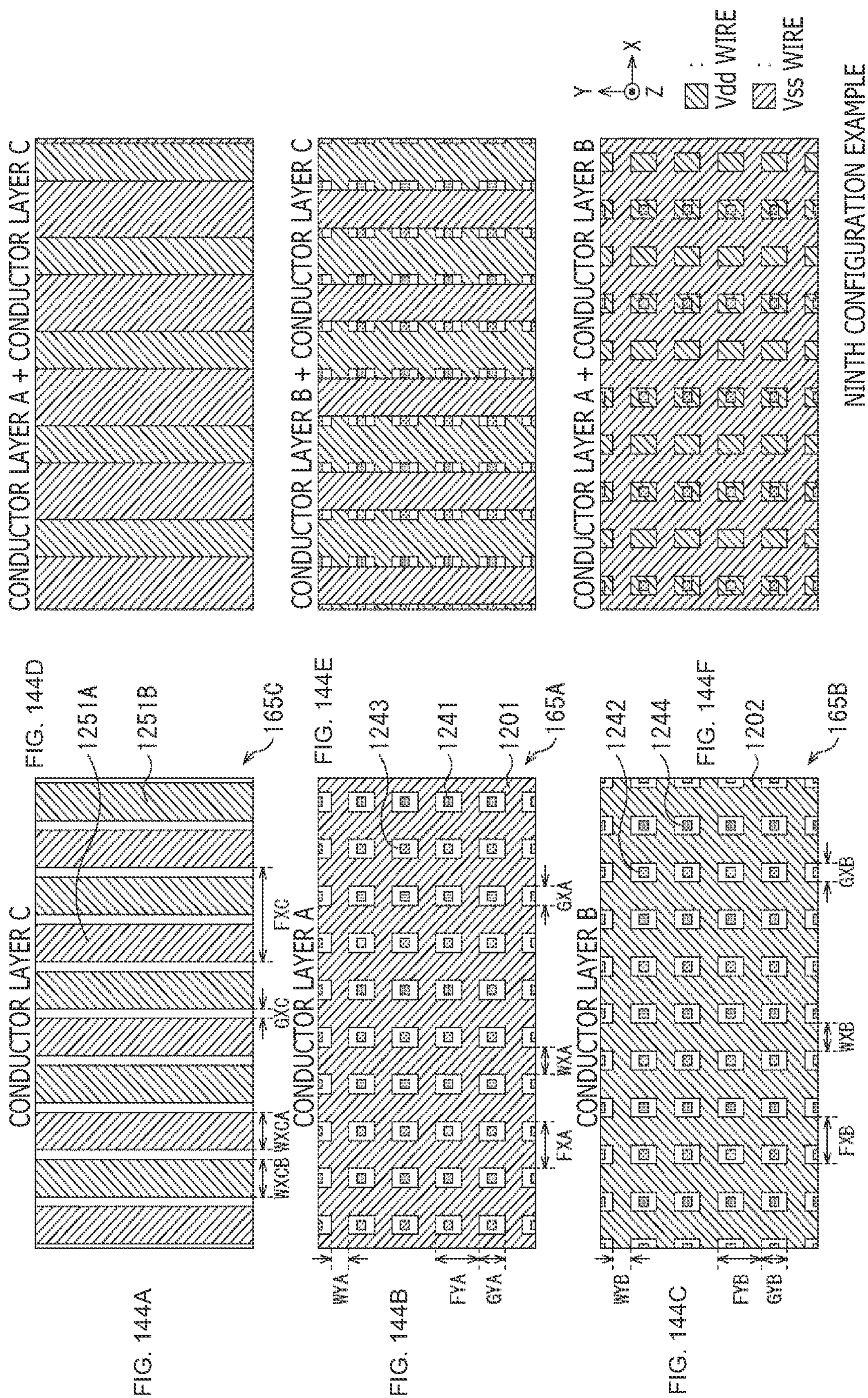

FIG. 144A depicts the conductor layer C (wiring layer 165C), FIG. 144B depicts the conductor layer A (wiring layer 165A), and FIG. 144C depicts the conductor layer B (wiring layer 165B).

In addition, FIG. 144D is a plan view of the stacked state of the conductor layer A and the conductor layer C, FIG. 144E is a plan view of the stacked state of the conductor layer B and the conductor layer C, and FIG. 144F is a plan view of the stacked state of the conductor layer A and the conductor layer B.

The third modification example of the ninth configuration example has a configuration obtained by partially modifying the first modification example of the ninth configuration example in FIGS. 142A, 142B, 142C, 142D, 142E, and 142F. Sections in FIGS. 144A, 144B, 144C, 144D, 144E, and 144F that have counterparts in FIGS. 142A, 142B, 142C, 142D, 142E, and 142F are given the same reference signs, explanations of those sections are omitted as appropriate, and explanations are given about differences.

The third modification example of the ninth configuration example is different from the first modification example of the ninth configuration example in FIGS. 142A, 142B, 142C, 142D, 142E, and 142F only in terms of the configuration of the conductor layer B.

The conductor layer B in the first modification example of the ninth configuration example in FIGS. 142A, 142B, 142C, 142D, 142E, and 142F has a configuration provided with the mesh conductor 1202 in which relay conductors 1242 are formed in all the gaps in a matrix of the mesh conductor 1202.

In contrast, the conductor layer B in the third modification example of the ninth configuration example in FIGS. 144A, 144B, 144C, 144D, 144E, and 144F has a configuration provided with the mesh conductor 1202 in which columns where relay conductors 1242 are formed, and columns where relay conductors 1244 are formed in gaps in a matrix of the mesh conductor 1202 are arranged alternately every other column in the X direction.

For example, in the case of the stacking order of the conductor layers A to C in the third modification example of the ninth configuration example in FIGS. 144A, 144B, 144C, 144D, 144E, and 144F in which the conductor layer B, the conductor layer A and the conductor layer C are arranged in this order, and the conductor layer A is arranged at the middle, the relay conductors 1242 in the conductor layer B are connected with the mesh conductor 1201 in the conductor layer A by conductor vias in the Z direction, and the relay conductors 1244 in the conductor layer B are connected with the mesh conductor 1202 in the conductor layer B via conductors in a conductor layer other than the conductor layers A to C. In addition, the mesh conductor 1202 in the conductor layer B can be connected with the relay conductors 1241 in the conductor layer A by conductor vias in the Z direction. The relay conductors 1241 in the conductor layer A can be connected with the linear conductors 1251B in the conductor layer C by conductor vias in the Z direction, and the relay conductors 1243 can be connected with the linear conductors 1251A in the conductor layer C by conductor vias in the Z direction. Furthermore, the mesh conductor 1201 in the conductor layer A can be connected with the linear conductors 1251A in the conductor layer C by conductor vias in the Z direction. In the third modification example of the ninth configuration example in FIGS. 144A, 144B, 144C, 144D, 144E, and 144F, the shape of Vdd wires and the shape of Vss wires in the conductor layers A and B are the same or substantially the same although there is positional displacement. Accordingly, the layouts of the conductor layers A to C can be designed easily in some cases, and the Vdd wires and the Vss wires can be easily given a suitable current relation or voltage relation in some cases.

By providing the relay conductors 1241 in the conductor layer A, it becomes possible to connect with the linear conductors 1251B with substantially the shortest distance or with a short distance, and voltage drops, energy loss, or inductive noise can be reduced.

By providing the relay conductors 1243 in the conductor layer A, it becomes possible to connect with the linear conductors 1251A with substantially the shortest distance or with a short distance, and voltage drops, energy loss, or inductive noise can be reduced.

By providing the relay conductors 1242 in the conductor layer B, it becomes possible to connect with the linear conductors 1251A with substantially the shortest distance or with a short distance, and voltage drops, energy loss, or inductive noise can be reduced.

By providing the relay conductors 1244 in the conductor layer B, it becomes possible to connect with the linear conductors 1251B with substantially the shortest distance or with a short distance, and voltage drops, energy loss, or inductive noise can be reduced.

The third modification example of the ninth configuration example in FIGS. 144A, 144B, 144C, 144D, 144E, and 144F is similar to the first modification example of the ninth configuration example in FIGS. 142A, 142B, 142C, 142D, 142E, and 142F in other respects than those mentioned above.

The conductor layer C in FIG. 144A is the same as the conductor layer C in the first modification example of the ninth configuration example in FIGS. 142A, 142B, 142C, 142D, 142E, and 142F. Accordingly, if a predetermined planar range (planar region) of the conductor layer C is looked at, the current distribution in the linear conductors 1251A and the current distribution in the linear conductors 1251B become the same or substantially the same, and so the occurrence of inductive noise can be suppressed.

Because the linear conductors 1251A and the linear conductors 1251B include repetitions of the same wiring patterns in the X direction, capacitive noise can be offset completely in the X direction. Capacitive noise can be ameliorated more significantly if the conductor layer C is closer to the wiring layer 170.

As depicted in FIG. 144E, the stacking of the conductor layers A and B forms a light-blocking structure, and needless to say, hot carrier light emissions from an active element group 167 can be blocked. In addition, as depicted in FIG. 144D, the stacking of the conductor layers A and C also forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

In the third modification example of the ninth configuration example in FIGS. 144A, 144B, 144C, 144D, 144E, and 144F, the direction in which currents flow more easily in the conductor layer C, and the direction in which currents flow more easily in the conductor layers A and B are the same or substantially the same. In this case, voltage drops can be ameliorated further, depending on the wiring layout.

<Fourth Modification Example of Ninth Configuration Example of Three Conductor Layers>

FIGS. 145A, 145B, 145C, 145D, 145E, and 145F depict a fourth modification example of the ninth configuration example of three conductor layers.

Figures 145A, 145B, 145C, 145D, 145E, 145F:
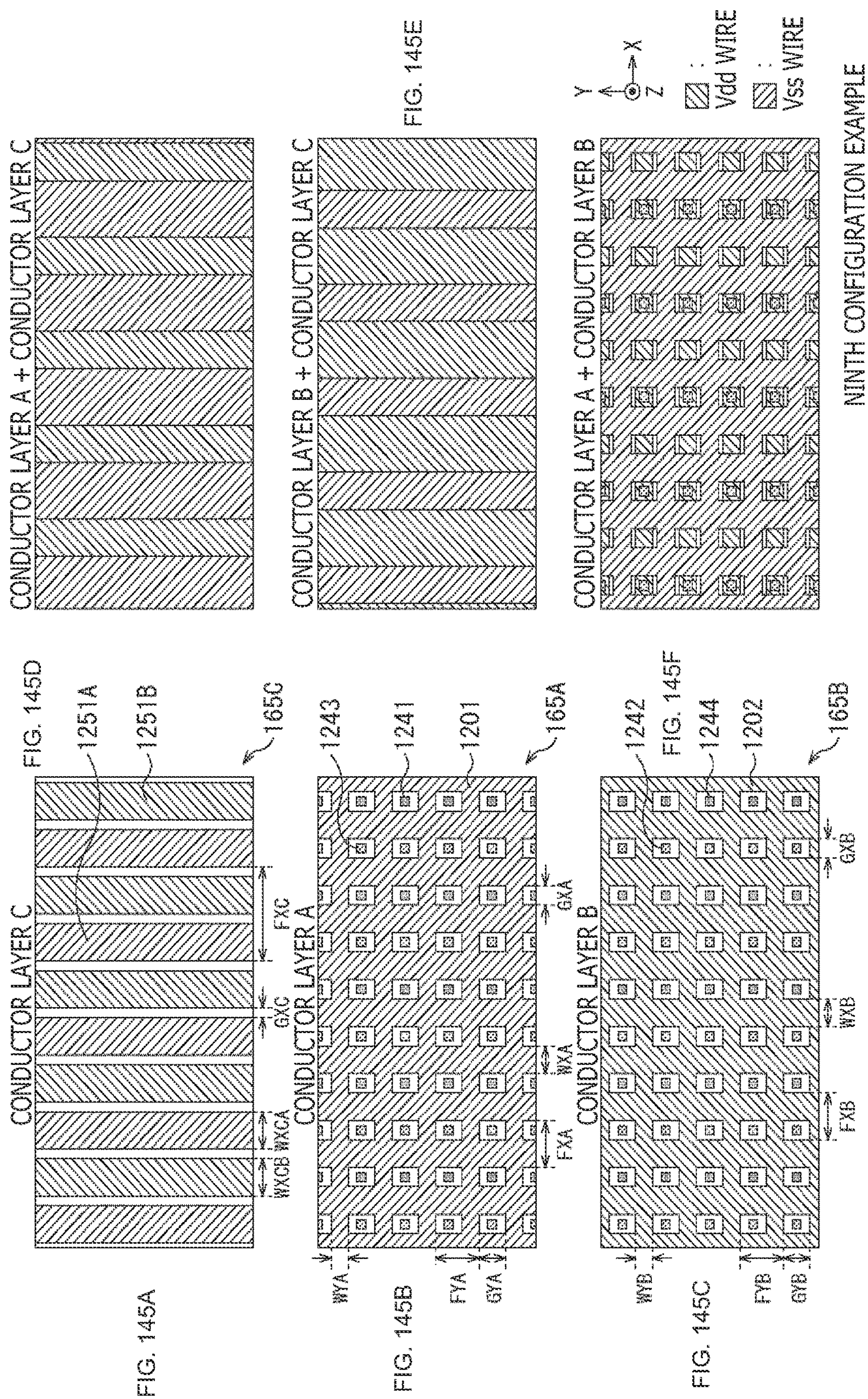

FIG. 145A depicts the conductor layer C (wiring layer 165C), FIG. 145B depicts the conductor layer A (wiring layer 165A), and FIG. 145C depicts the conductor layer B (wiring layer 165B).

In addition, FIG. 145D is a plan view of the stacked state of the conductor layer A and the conductor layer C, FIG. 145E is a plan view of the stacked state of the conductor layer B and the conductor layer C, and Fin FIG. 145E is a plan view of the stacked state of the conductor layer A and the conductor layer B.

The fourth modification example of the ninth configuration example has a configuration obtained by partially modifying the third modification example of the ninth configuration example in FIGS. 144A, 144B, 144C, 144D, 144E, and 144F. Sections in FIGS. 145A, 145B, 145C, 145D, 145E, and 145F that have counterparts in FIGS. 144A, 144B, 144C, 144D, 144E, and 144F are given the same reference signs, explanations of those sections are omitted as appropriate, and explanations are given about differences.

In the third modification example in FIGS. 144A, 144B, 144C, 144D, 144E, and 144F, if gap positions of the mesh conductor 1201 in the conductor layer A and the mesh conductor 1202 in the conductor layer B are compared with each other, the X-direction positions are different, and the Y-direction positions match.

On the other hand, in the fourth modification example in FIGS. 145A, 145B, 145C, 145D, 145E, and 145F, if gap positions of the mesh conductor 1201 in the conductor layer A and the mesh conductor 1202 in the conductor layer B are compared with each other, the X-direction positions match, and the Y-direction positions are different.

In addition, for example, if the positions of the relay conductors 1241 in the conductor layer A and the relay conductors 1244 in the conductor layer B are compared with each other, the X-direction positions are different, and the Y-direction positions match in the third modification example in FIGS. 144A, 144B, 144C, 144D, 144E, and 144F. On the other hand, in the fourth modification example in FIGS. 145A, 145B, 145C, 145D, 145E, and 145F, the X-direction positions match, and the Y-direction positions are different.

In addition, for example, if the positions of the relay conductors 1243 in the conductor layer A, and the relay conductors 1242 in the conductor layer B are compared with each other, the X-direction positions are different, and the Y-direction positions match in the third modification example in FIGS. 144A, 144B, 144C, 144D, 144E, and 144F. On the other hand, in the fourth modification example in FIGS. 145A, 145B, 145C, 145D, 145E, and 145F, the X-direction positions match, and the Y-direction positions are different.

In the third modification example in FIGS. 144A, 144B, 144C, 144D 144E, and 144F, the stacking of the conductor layers A and B, and the stacking of the conductor layers A and C form light-blocking structures, and the light-blocking property is maintained. On the other hand, in the fourth modification example in FIGS. 145A, 145B, 145C, 145D, 145E, and 145F, the stacking of the conductor layers A and C, and the stacking of the conductor layers B and C form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

In addition, for example, in the case of the stacking order of the conductor layers A to C in the fourth modification example of the ninth configuration example in FIGS. 145A, 145B, 145C, 145D, 145E, and 145F in which the conductor layer B, the conductor layer C and the conductor layer A are arranged in this order, and the conductor layer C is arranged at the middle, the relay conductors 1242 in the conductor layer B are connected with the linear conductors 1251A in the conductor layer C by conductor vias in the Z direction, and the relay conductors 1244 in the conductor layer B are connected with the linear conductors 1251B in the conductor layer C by conductor vias in the Z direction. In addition, the mesh conductor 1202 in the conductor layer B can be connected with the linear conductors 1251B in the conductor layer C by conductor vias in the Z direction. The relay conductors 1241 in the conductor layer A can be connected with the linear conductors 1251B in the conductor layer C by conductor vias in the Z direction, and the relay conductors 1243 can be connected with the linear conductors 1251A in the conductor layer C by conductor vias in the Z direction. In addition, the mesh conductor 1201 in the conductor layer A can be connected with the linear conductors 1251A in the conductor layer C by conductor vias in the Z direction. Furthermore, the relay conductors 1244 may be connected with conductors in a conductor layer other than the conductor layers A to C by conductor vias in the Z direction.

The fourth modification example in FIGS. 145A, 145B, 145C, 145D, 145E, and 145F is similar to the third modification example in FIGS. 144A, 144B, 144C. 144D, 144E, and 144F in other respects than those mentioned above.

If a predetermined planar range (planar region) of the conductor layer C in FIG. 145A is looked at, the current distribution in the linear conductors 1251A and the current distribution in the linear conductors 1251B become the same or substantially the same, and so the occurrence of inductive noise can be suppressed.

Because the linear conductors 1251A and the linear conductors 1251B include repetitions of the same wiring patterns in the X direction, capacitive noise can be offset completely in the X direction. Capacitive noise can be ameliorated more significantly if the conductor layer C is closer to the wiring layer 170.

In the fourth modification example of the ninth configuration example in FIGS. 145A, 145B, 145C, 145D, 145E, and 145F, the direction in which currents flow more easily in the conductor layer C, and the direction in which currents flow more easily in the conductor layers A and B are the same or substantially the same. In this case, voltage drops can be ameliorated further, depending on the wiring layout.

By providing the relay conductors 1241 in the conductor layer A, it becomes possible to connect with the linear conductors 1251B with substantially the shortest distance or with a short distance, and voltage drops, energy loss, or inductive noise can be reduced.

By providing the relay conductors 1243 in the conductor layer A, it becomes possible to connect with the linear conductors 1251A with substantially the shortest distance or with a short distance, and voltage drops, energy loss, or inductive noise can be reduced.

By providing the relay conductors 1242 in the conductor layer B, it becomes possible to connect with the linear conductors 1251A with substantially the shortest distance or with a short distance, and voltage drops, energy loss, or inductive noise can be reduced.

By providing the relay conductors 1244 in the conductor layer B, it becomes possible to connect with the linear conductors 1251B with substantially the shortest distance or with a short distance, and voltage drops, energy loss, or inductive noise can be reduced.

<Tenth Configuration Example of Three Conductor Layers>

FIGS. 146A, 146B, 146C, 146D, 146E, and 146F depicts a tenth configuration example of three conductor layers.

Figures 146A, 146B, 146C, 146D, 146E, 146F:
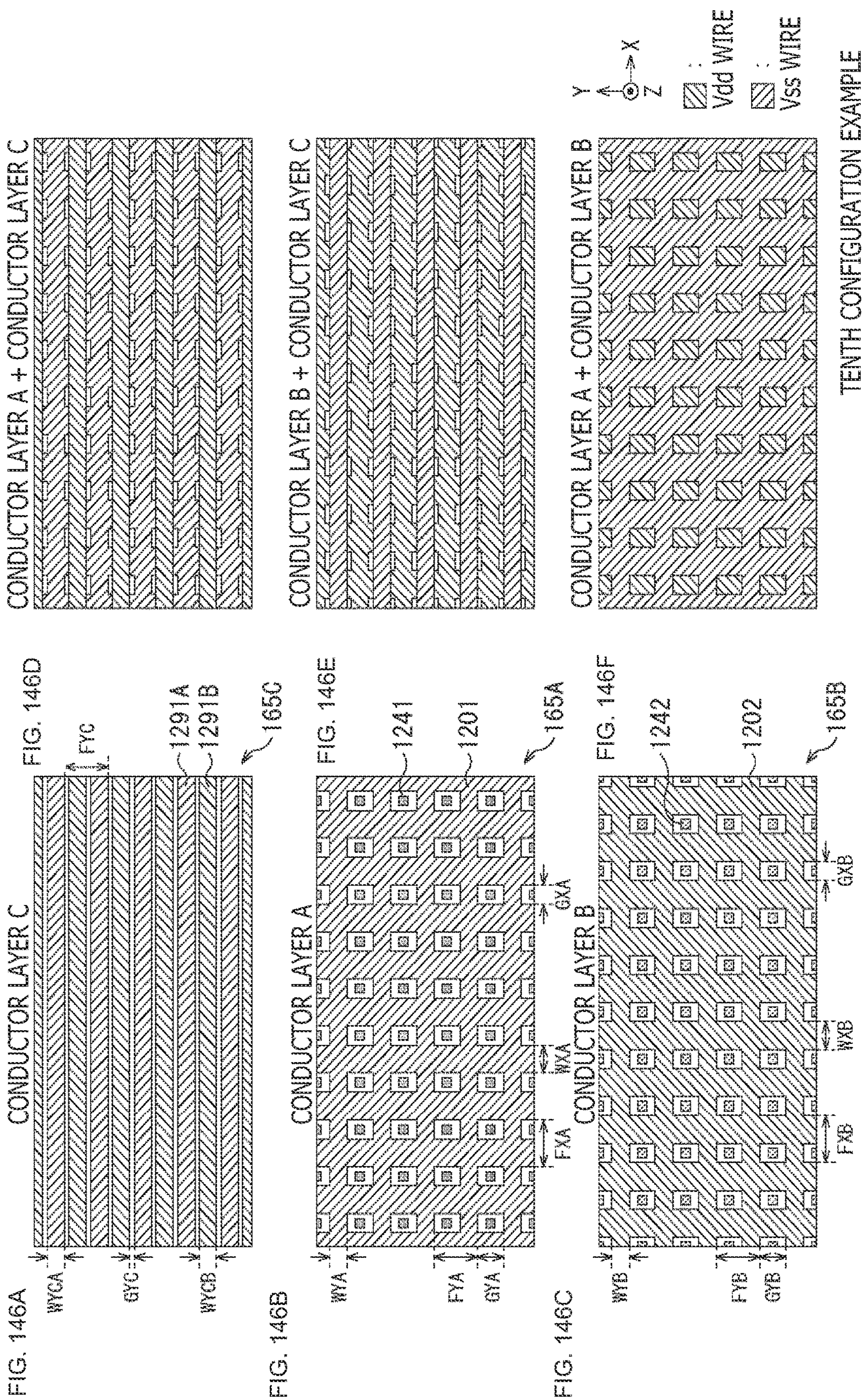

FIG. 146A depicts the conductor layer C (wiring layer 165C), FIG. 146B depicts the conductor layer A (wiring layer 165A), and FIG. 146C depicts the conductor layer B (wiring layer 165B).

In addition, FIG. 146D is a plan view of the stacked state of the conductor layer A and the conductor layer C, FIG. 146E is a plan view of the stacked state of the conductor layer B and the conductor layer C, and FIG. 146E is a plan view of the stacked state of the conductor layer A and the conductor layer B.

The tenth configuration example has a configuration obtained by partially modifying the fourth configuration example in FIGS. 128A, 128B, 128C, 128D, 128E, and 128F. Sections in FIGS. 146A, 146B, 146C, 146D, 146E, and 146F that have counterparts in FIGS. 128A, 128B, 128C, 128D, 128E, and 128F are given the same reference signs, explanations of those sections are omitted as appropriate, and explanations are given about differences.

The tenth configuration example is different from the fourth configuration example in FIGS. 128A, 128B, 128C, 128D, 128E, and 128F only in terms of the configuration of the conductor layer C.

In the conductor layer C in FIG. 146A, linear conductors 1291A that are long in the X direction, and linear conductors 1291B that are long in the X direction are arranged regularly alternately in the Y direction. The linear conductors 1219A are wires (Vss wires) connected to GND or a negative power supply, for example. The linear conductors 1291B are wires (Vdd wires) connected to a positive power supply, for example.

In the fourth configuration example in FIGS. 128A, 128B, 128C, 128D, 128E, and 128F, the conductor pitch FYC, which is the repetition pitch of the linear conductors 1221A in the conductor layer C in FIG. 128A, is 200% of the conductor pitch FYA, which is the Y-direction repetition pitch of the mesh conductor 1201 in the conductor layer A in FIG. 128B.

In contrast, the conductor pitch FYC, which is the repetition pitch of the linear conductors 1291A in the conductor layer C in FIG. 146A, is 100% of the conductor pitch FYA, which is the Y-direction repetition pitch of the mesh conductor 1201 in the conductor layer A in FIG. 146B.

Similarly, while, in the fourth configuration example in FIGS. 128A, 128B, 128C, 128D, 128E, and 128F, the conductor pitch FYC of the linear conductors 1221B in the conductor layer C in FIG. 128A is 200% of the conductor pitch FYB of the mesh conductor 1202 in the conductor layer B in FIG. 128C, the conductor pitch FYC of the linear conductors 1291B in the conductor layer C in FIG. 146A is 100% of the conductor pitch FYB of the mesh conductor 1202 in the conductor layer B in FIG. 146C.

The tenth configuration example in FIGS. 146A, 146B, 146C, 146D, 146E, and 146F is similar to the fourth configuration example in FIGS. 128A, 128B, 128C, 128D, 128E, and 128F in other respects than those mentioned above.

If a predetermined planar range (planar region) of the conductor layer C in A in FIGS. 146A, 146B, 146C, 146D, 146E, and 146F is looked at, the current distribution in the linear conductors 1291A and the current distribution in the linear conductors 1291B become the same or substantially the same, and so the occurrence of inductive noise can be suppressed.

Because the linear conductors 1291A and the linear conductors 1291B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 146F, the stacking of the conductor layers A and B forms a light-blocking structure, and needless to say, hot carrier light emissions from an active element group 167 can be blocked. In addition, as depicted in E in FIGS. 132D and 132E, the light-blocking property is maintained within a certain range also by the stacking of the conductor layers A and C, and the stacking of the conductor layers B and C. Thereby, the light-blocking constraints of the conductor layers A and B can be relaxed. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

In the tenth configuration example in FIGS. 146A, 146B, 146C, 146D, 146E, and 146F, the direction in which currents flow more easily in the conductor layer C and the direction in which currents flow more easily in the conductor layers A and B are substantially orthogonal and are different by approximately 90 degrees. Thereby, currents are diffused more easily (currents are less likely to be concentrated), and so inductive noise can be ameliorated further.

By providing the relay conductors 1241 in the conductor layer A, it becomes possible to connect with the linear conductors 1291B with substantially the shortest distance or with a short distance, and voltage drops, energy loss, or inductive noise can be reduced.

By providing the relay conductors 1242 in the conductor layer B, it becomes possible to connect with the linear conductors 1291A with substantially the shortest distance or with a short distance, and voltage drops, energy loss, or inductive noise can be reduced.

<Modification Example of Tenth Configuration Example of Three Conductor Layers>

FIGS. 147A, 147B, 147C, 147D, 147E, and 147F depicts a modification example of the tenth configuration example of three conductor layers.

Figures 147A, 147B, 147C, 147D, 147E, 147F:
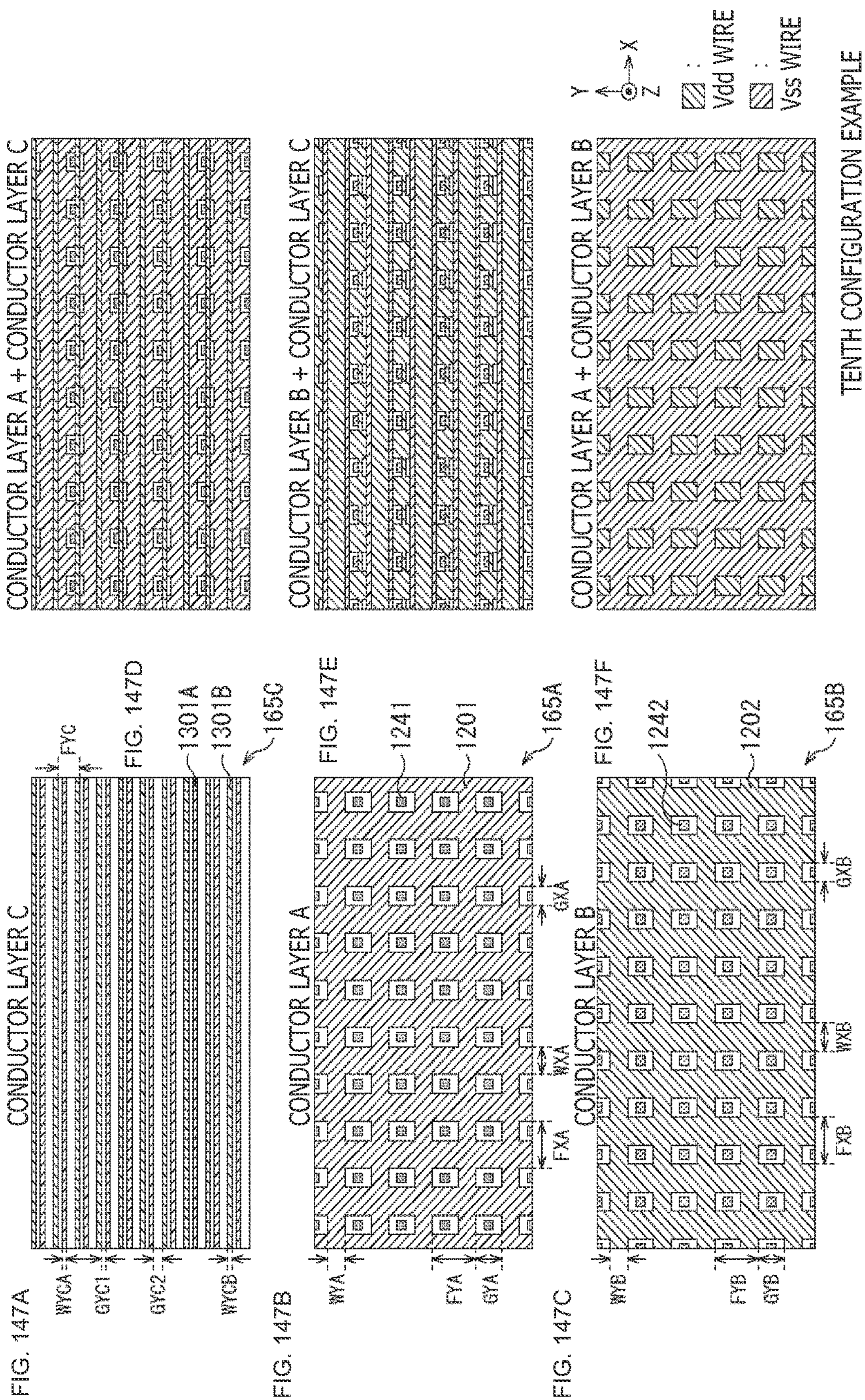

FIG. 147A depicts the conductor layer C (wiring layer 165C), FIG. 147B depicts the conductor layer A (wiring layer 165A), and FIG. 147C depicts the conductor layer B (wiring layer 165B).

In addition, FIG. 147D is a plan view of the stacked state of the conductor layer A and the conductor layer C, FIG. 147E is a plan view of the stacked state of the conductor layer B and the conductor layer C, FIG. 147F is a plan view of the stacked state of the conductor layer A and the conductor layer B.

The modification example of the tenth configuration example has a configuration obtained by partially modifying the fourth configuration example in FIGS. 128A, 128B, 128C, 128D, 128E, and 128F. Sections in FIGS. 147A, 147B, 147C, 147D, 147E, and 147F that have counterparts in FIGS. 128A, 128B, 128C, 128D, 128E, and 128F are given the same reference signs, explanations of those sections are omitted as appropriate, and explanations are given about differences.

The modification example of the tenth configuration example is different from the fourth configuration example in FIGS. 128A, 128B, 128C, 128D, 128E, and 128F only in terms of the configuration of the conductor layer C.

In the conductor layer C in FIG. 147A, linear conductors 1301A that are long in the X direction, and linear conductors 1301B that are long in the X direction are arranged regularly alternately in the Y direction. The linear conductors 1301A are wires (Vss wires) connected to GND or a negative power supply, for example. The linear conductors 1301B are wires (Vdd wires) connected to a positive power supply, for example. The linear conductors 1301A and the linear conductors 1301B are arranged at intervals with alternating gap widths of a gap width GYC1 and a gap width GYC2.

In the fourth configuration example in FIGS. 128A, 128B, 128C 128D, 128E, and 128F, the conductor pitch FYC, which is the repetition pitch of the linear conductors 1221A in the conductor layer C in FIG. 128A, is 200% of the conductor pitch FYA, which is the Y-direction repetition pitch of the mesh conductor 1201 in the conductor layer A in FIG. 128B.

In contrast, the conductor pitch FYC, which is the repetition pitch of the linear conductors 1301A in the conductor layer C in FIG. 147A, is (1/integer)-times the conductor pitch FYA, which is the Y-direction repetition pitch of the mesh conductor 1201 in the conductor layer A in FIG. 147B. FIGS. 147A, 147B, 147C, 147D, 147E, and 147F depicts an example in which the conductor pitch FYC is ½ times the conductor pitch FYA.

Similarly, while, in the fourth configuration example in FIGS. 128A, 128B, 128C, 128D, 128E, and 128F, the conductor pitch FYC of the linear conductors 1221B in the conductor layer C in FIG. 128A is 200% of the conductor pitch FYB of the mesh conductor 1202 in the conductor layer A in FIG. 128C, the conductor pitch FYC of the linear conductors 1301B in the conductor layer C in FIG. 147A is (1/integer)-times the conductor pitch FYB of the mesh conductor 1202 in the conductor layer B in C in FIGS. 147A, 147B, 147C, 147D, 147E, and 147F. FIGS. 147A, 147B, 147C, 147D, 147E, and 147F depicts an example in which the conductor pitch FYC is ½ times the conductor pitch FYB.

The modification example of the tenth configuration example in FIGS. 147A, 147B, 147C, 147D, 147E, and 147F is similar to the fourth configuration example in FIGS. 128A, 128B, 128C, 128D, 128E, and 128F in other respects than those mentioned above.

If a predetermined planar range (planar region) of the conductor layer FIG. 147A is looked at, the current distribution in the linear conductors 1301A and the current distribution in the linear conductors 1301B become the same or substantially the same, and so the occurrence of inductive noise can be suppressed.

As depicted in FIG. 147F, needless to say, due to the stacking of the conductor layers A and B, hot carrier light emissions from an active element group 167 can be blocked. In addition, as depicted in FIGS. 132D and 132E, the light-blocking property is maintained within a certain range also by the stacking of the conductor layers A and C, and the stacking of the conductor layers B and C. Thereby, the light-blocking constraints of the conductor layers A and B can be relaxed. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

In the modification example of the tenth configuration example in FIGS. 147A, 147B, 147C, 147D, 147E, and 147F, the direction in which currents flow more easily in the conductor layer C and the direction in which currents flow more easily in the conductor layers A and B are substantially orthogonal and are different by approximately 90 degrees. Thereby, currents are diffused more easily (currents are less likely to be concentrated), and so inductive noise can be ameliorated further.

By providing the relay conductors 1241 in the conductor layer A, it becomes possible to connect with the linear conductors 1301B with substantially the shortest distance or with a short distance, and voltage drops, energy loss, or inductive noise can be reduced.

By providing the relay conductors 1242 in the conductor layer B, it becomes possible to connect with the linear conductors 1301A with substantially the shortest distance or with a short distance, and voltage drops, energy loss, or inductive noise can be reduced.

<Eleventh Configuration Example of Three Conductor Layers>

The first to tenth configuration examples of three conductor layers mentioned above are explained by adopting the eleventh configuration example that uses mesh conductors with different X-direction and Y-direction resistance values as the configurations of the conductor layer A and the conductor layer B. In other words, the conductor layer A and the conductor layer B are explained by adopting configurations with the X-direction gap width GXA and the Y-direction gap width GYA which are different from each other, and the X-direction gap width GXB and the Y-direction gap width GYB which are different from each other, like the mesh conductors 1201 and 1202 in the fourth configuration example in FIGS. 128A, 128B, 128C, 128D, 128E, and 128F, and the mesh conductors 1261 and 1602 in the fifth configuration example in FIGS. 131A, 131B, 131C, 131D, 131E, and 131F However, the conductor layer A and the conductor layer B can adopt any of the first to thirteenth configuration examples of the conductor layers A and B explained with reference to FIG. 12 A, 12B, 12C, 13, 14A, 14B, 14C, 15A, 15B, 15C, 16, 17A, 17B, 17C, 18A, 18B, 19, 20A, 20B, 21, 22A, 22B, 22C, 23, 24A, 24B, 24C, 25A, 25B, 25C, 26A, 26B, 26C, 27A, 27B, 27C, 28A, 28B, 28C, 29A, 29B, 29C 30, 31A, 31B, 31C, 32A, 32B, 32C, 33A, 33B, 33C, 34A, 34B, 34C, 35A, 35B, 35C, 36A, 36B, 36C, 37, 38A, 38B, 38C, 39A, 39B, 39C, 40A, 40B, 40C, 41A, 41B, and 41C. Next, configurations explained with reference to FIG. 148A, 148B, 148C, 148D, 148E, 148F, 149A, 149B, 149C, 149D, 149E, 149F, 150A, 150B, 150C, 150D, 150E, 150F, 151A, 151B, 151C, 151D, 151E, 151F, 152A, 152B, 152C, 152D, 152E, and 152E adopt the configuration adopted in FIGS. 122A, 122B, 122C, 122D, 122E, and 122F and the like consistently for the conductor layer C (wiring layer 165C), and adopt mesh conductors with the same X-direction and Y-direction resistance values for the conductor layer A and the conductor layer B.

FIGS. 148A, 148B, 148C, 148D, 148E, and 148F depict an eleventh configuration example of three conductor layers.

Figures 148A, 148B, 148C, 148D, 148F, 149E:
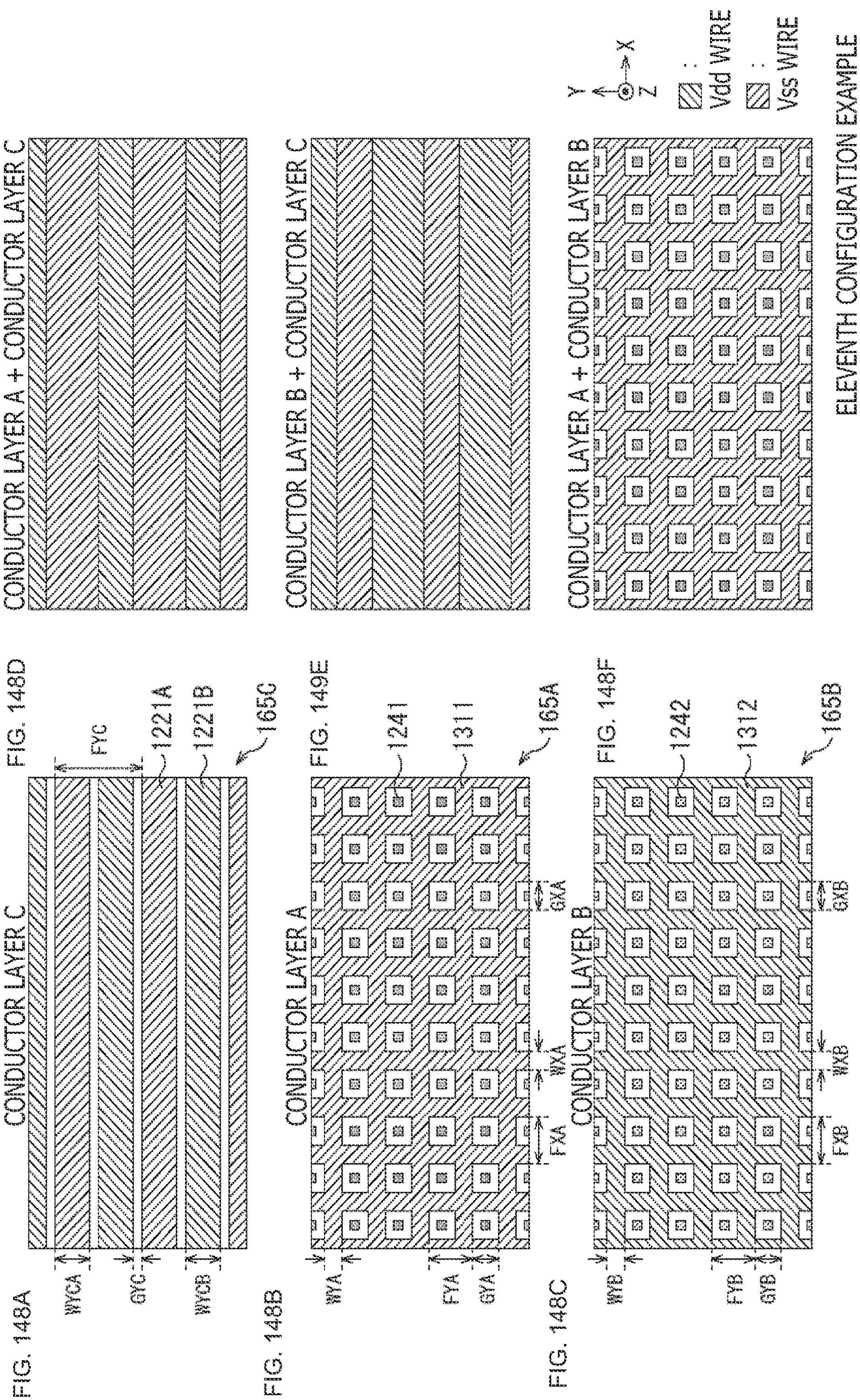

FIG. 148A depicts the conductor layer C (wiring layer 165C), FIG. 148B depicts the conductor layer A (wiring layer 165A), and FIG. 148C depicts the conductor layer B (wiring layer 165B).

In addition, FIG. 148D is a plan view of the stacked state of the conductor layer A and the conductor layer C, FIG. 148E is a plan view of the stacked state of the conductor layer B and the conductor layer C, FIG. 148F is a plan view of the stacked state of the conductor layer A and the conductor layer B.

Sections in the eleventh configuration example in FIGS. 148A, 148B, 148C, 148D, 148E, and 148F that have counterparts in the fourth configuration example depicted in FIGS. 128A, 128B, 128C, 128D, 128E, and 128F are given the same reference signs, explanations of those sections are omitted as appropriate, and explanations are given with a focus on differences.

In the conductor layer C in FIG. 148A, linear conductors 1221A that are long in the X direction, and linear conductors 1221B that are long in the X direction are arranged regularly alternately in the Y direction at the conductor pitch FYC.

The conductor layer A in FIG. 148B includes a mesh conductor 1311. The mesh conductor 1311 has the X-direction conductor width WXA, gap width GXA, and conductor pitch FXA and has the Y-direction conductor width WYA, gap width GYA, and conductor pitch FYA. Here, (conductor width WXA)=(conductor width WYA), (gap width GXA)=(gap width GYA), and (conductor pitch FXA)=(conductor pitch FYA) are satisfied. In addition, a relay conductor 1241 is arranged in each gap of the mesh conductor 1201. The intervals between the relay conductors 1241, in other words, the pitches of the relay conductors 1241, also are the conductor pitches FXA and FYA. The mesh conductor 1311 is a wire (Vss wire) connected to GND or a negative power supply, for example.

The conductor layer B in FIG. 1280 includes a mesh conductor 1312. The mesh conductor 1312 has the X-direction conductor width WXB, gap width GXB, and conductor pitch FXB and has the Y-direction conductor width WYB, gap width GYB, and conductor pitch FYB. Here, (conductor width WXB)=(conductor width WYB), (gap width GXB)=(gap width GYB), and (conductor pitch FXB)=(conductor pitch FYB) are satisfied. In addition, a relay conductor 1242 is arranged in each gap of the mesh conductor 1312. The intervals between the relay conductors 1242, in other words, the pitches of the relay conductors 1242, also are the conductor pitches FXB and FYB. The mesh conductor 1312 is a wire (Vdd wire) connected to a positive power supply, for example.

As depicted in FIGS. 148B and 148C, the plane positions of the relay conductors 1241 formed in the conductor layer A and the plane positions of the relay conductors 1242 formed in the conductor layer B are the same. In other words, the mesh conductor 1311 in the conductor layer A and the mesh conductor 1312 in the conductor layer B entirely overlap each other as seen in the stacking direction. The thus-formed conductor layer A and conductor layer B correspond to the second configuration example of the conductor layers A and B depicted in FIGS. 15A and 15B and can significantly ameliorate inductive noise as depicted in the result of a simulation in FIGS. 17A, 17B, and 17C.

Accordingly, this is suitable for the stacking order in which, as depicted in FIG. 120B, the conductor layer C (wiring layer 165C) is arranged between the conductor layer A (wiring layer 165A) and the conductor layer B (wiring layer 165B), the mesh conductor 1311 in the conductor layer A and the linear conductors 1221A in the conductor layer C are connected by conductor vias in the Z direction, and the mesh conductor 1312 in the conductor layer B and the linear conductors 1221B in the conductor layer C are connected by conductor vias in the Z direction.

If a predetermined planar range (planar region) of the conductor layer C is looked at, the current distribution in the linear conductors 1221A and the current distribution in the linear conductors 1221B become the same or substantially the same, and so the occurrence of inductive noise can be suppressed.

Because the linear conductors 1221A and the linear conductors 1221B in the conductor layer C include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 148E, while the stacking of the conductor layer A and the conductor layer B does not form a light-blocking structure, as depicted in FIGS. 148D and 148E, the stacking of the conductor layers A and C, and the stacking of the conductor layers B and C form light-blocking structures, and the light-blocking property is maintained. Thereby, hot carrier light emissions from an active element group 167 can be blocked. In addition, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. The degree of freedom of the layouts of the conductor layers A and B can be enhanced.

<Twelfth Configuration Example of Three Conductor Layers>

FIGS. 149A, 149B, 149C, 149D, 149E, and 149F depict a twelfth configuration example of three conductor layers.

Figures 149A, 149B, 149C, 149D, 149E, 149F:
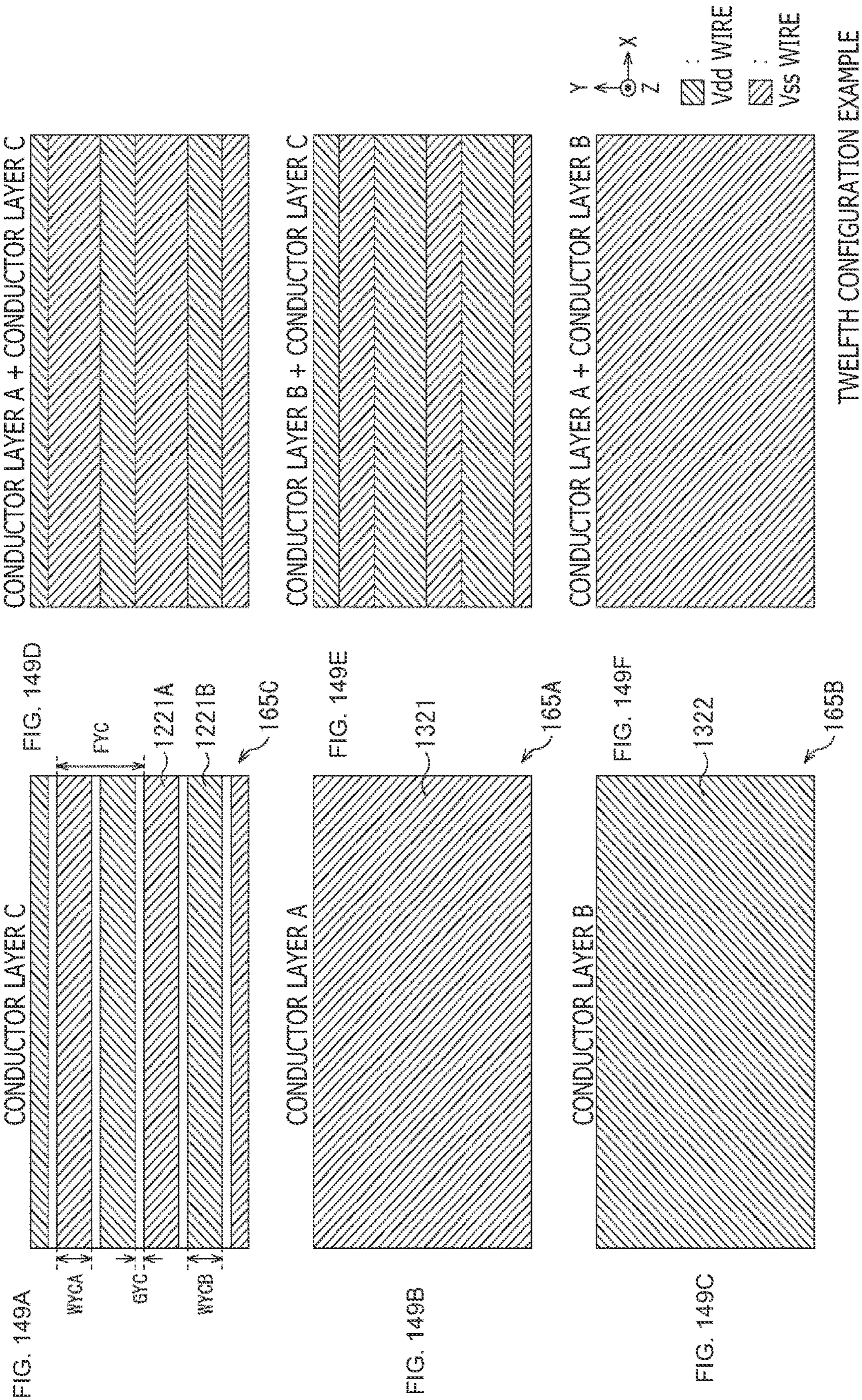

FIG. 149A depicts the conductor layer C (wiring layer 165C), FIG. 149B depicts the conductor layer A (wiring layer 165A), and FIG. 149C depicts the conductor layer B (wiring layer 165B).

In addition, FIG. 149D is a plan view of the stacked state of the conductor layer A and the conductor layer C, FIG. 149E is a plan view of the stacked state of the conductor layer B and the conductor layer C, FIG. 149F is a plan view of the stacked state of the conductor layer A and the conductor layer B.

Sections in the twelfth configuration example in FIGS. 149A, 149B, 149C, 149D, 149E, and 149F that have counterparts in the fourth configuration example depicted in FIGS. 128A, 128B, 128C, 128D, 128E, and 128F are given the same reference signs, explanations of those sections are omitted as appropriate, and explanations are given with a focus on differences.

In the conductor layer C in FIG. 149A, linear conductors 1221A that are long in the X direction, and linear conductors 1221B that are long in the X direction are arranged regularly alternately in the Y direction at the conductor pitch FYC.

The conductor layer A in FIG. 149B includes a planar conductor 1321. The planar conductor 1321 is a wire (Vss wire) connected to GND or a negative power supply, for example.

The conductor layer B in FIG. 149C includes a planar conductor 1322. The planar conductor 1322 is a wire (Vdd wire) connected to a positive power supply, for example.

If a predetermined planar range (planar region) of the conductor layer C is looked at, the current distribution in the linear conductors 1221A and the current distribution in the linear conductors 1221B become the same or substantially the same, and so the occurrence of inductive noise can be suppressed.

Because the linear conductors 1222A and the linear conductors 1222B include repetitions of the same wiring patterns in the Y direction, capacitive noise can be offset completely in the Y direction. Capacitive noise can be ameliorated more significantly if the conductor layer C is closer to the wiring layer 170.

As depicted in FIG. 149F, the stacking of the conductor layers A and B forms a light-blocking structure, and hot carrier light emissions from an active element group 167 can be blocked. As depicted in FIGS. 149D and 149E, the stacking of the conductor layers A and C, and the stacking of the conductor layers B and C also form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

The twelfth configuration example of three conductor layers is suitable for the stacking order as depicted in FIG. 120B in which the conductor layer C (wiring layer 165C) is arranged between the conductor layer A (wiring layer 165A) and the conductor layer B (wiring layer 165B), the planar conductor 1321 in the conductor layer A and the linear conductors 1221A in the conductor layer C are connected by conductor vias in the Z direction, and the planar conductor 1322 in the conductor layer B and the linear conductors 1221B in the conductor layer C are connected by conductor vias in the Z direction.

<Modification Examples of Twelfth Configuration Example of Three Conductor Layers>

FIGS. 150A, 150B, 150C, 150D, 150E, and 150F depict a first modification example of the twelfth configuration example of three conductor layers.

Figures 150A, 150B, 150C, 150D, 150E, 150F:
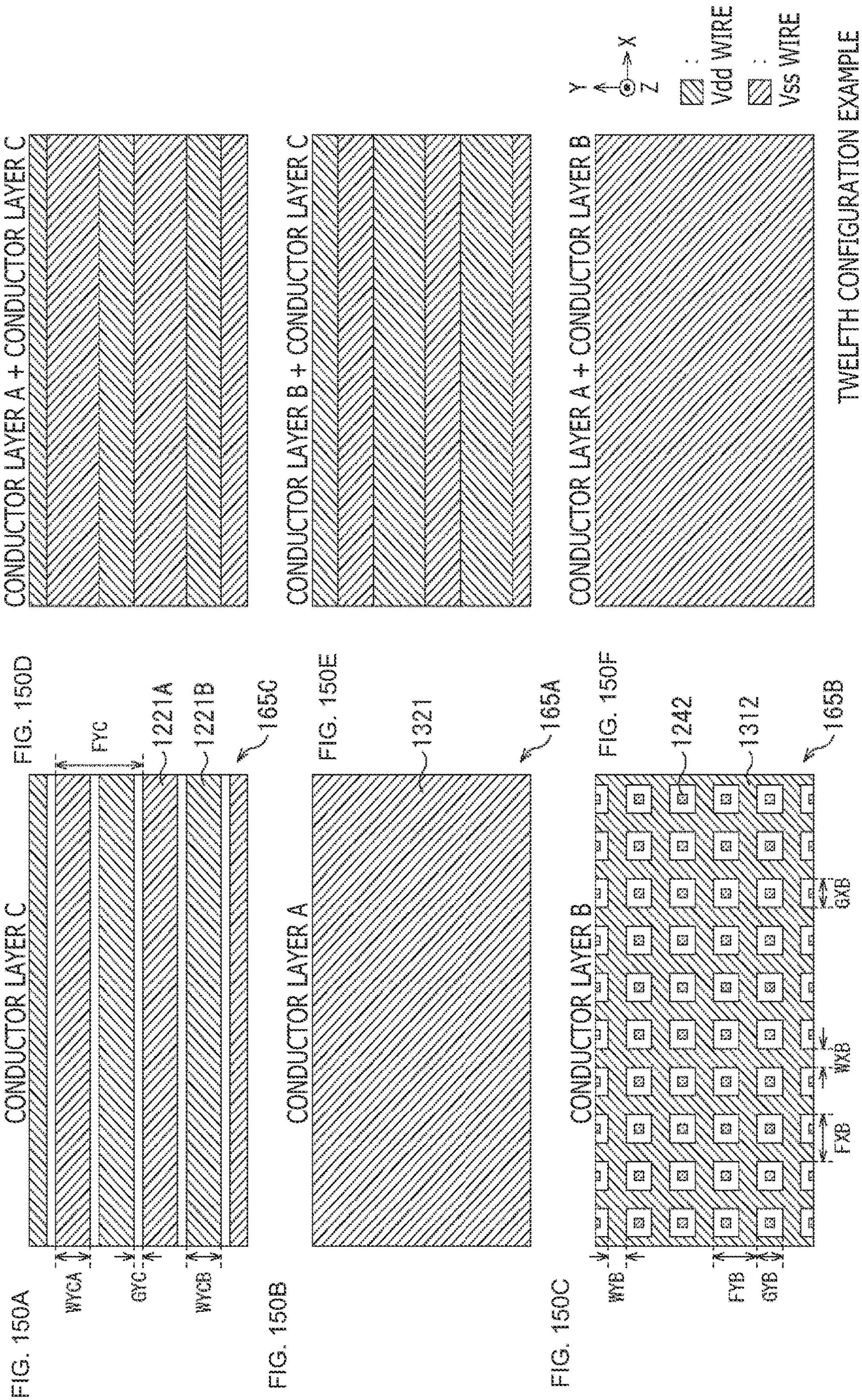

FIG. 150A depicts the conductor layer C (wiring layer 165C), FIG. 150B depicts the conductor layer A (wiring layer 165A), and FIG. 150C depicts the conductor layer B (wiring layer 165B).

In addition, FIG. 150D is a plan view of the stacked state of the conductor layer A and the conductor layer C, FIG. 150E is a plan view of the stacked state of the conductor layer B and the conductor layer C, and FIG. 150F is a plan view of the stacked state of the conductor layer A and the conductor layer B.

Sections in FIGS. 150A, 150B, 150C, 150D, 150E, and 150F that have counterparts in the eleventh and twelfth configuration examples depicted in FIGS. 148A, 148B, 148C, 148D, 148E, 148F, 149A, 149B, 149C, 149D, 149E and FIG. 149E are given the same reference signs, explanations of those sections are omitted as appropriate, and explanations are given with a focus on differences.

In the first modification example of the twelfth configuration example, only the configuration of the conductor layer B in FIG. 150C is different from that in FIGS. 149A, 149B, 149C, 149D, 149E, and 149F.

The conductor layer B in FIG. 150C includes the mesh conductor 1312, and relay conductors 1242 formed in gaps of the mesh conductors 1312.

In the configuration in the twelfth configuration example depicted in FIGS. 149A, 149B, 149C, 149D, 149E, and 149F, the conductor layer A has the planar conductor 1321 instead of the mesh conductor 1311 and the relay conductors 1241 in the eleventh configuration example of three conductor layers depicted in FIGS. 148A, 148B, 148C, 148D, 148E, and 148F, and the conductor layer B has the planar conductor 1322 instead of the mesh conductor 1312 and the relay conductors 1242 in the eleventh configuration example of three conductor layers depicted in FIGS. 148A, 148B, 148C, 148D, 148E, and 148F.

In contrast, in the configuration in the first modification example of the twelfth configuration example depicted in FIGS. 150A, 150B, 150C, 150D, 150E, and 150F, the conductor layer A has the planar conductor 1321 instead of the mesh conductor 1311 and the relay conductors 1241 in the eleventh configuration example of three conductor layers depicted in FIGS. 148A, 148B, 148C, 148D, 148E, and 148F, and the conductor layer B includes the mesh conductor 1312 and the relay conductors 1242 which are the same as the ones in the eleventh configuration example of three conductor layers depicted in FIGS. 148A, 148B, 148C, 148D, 148E, and 148F.

FIGS. 151A, 151B, 151C, 151D, 151E, and 151F depict a second modification example of the twelfth configuration example of three conductor layers.

Figures 151A, 151B, 151C, 151D, 151E, 151F:
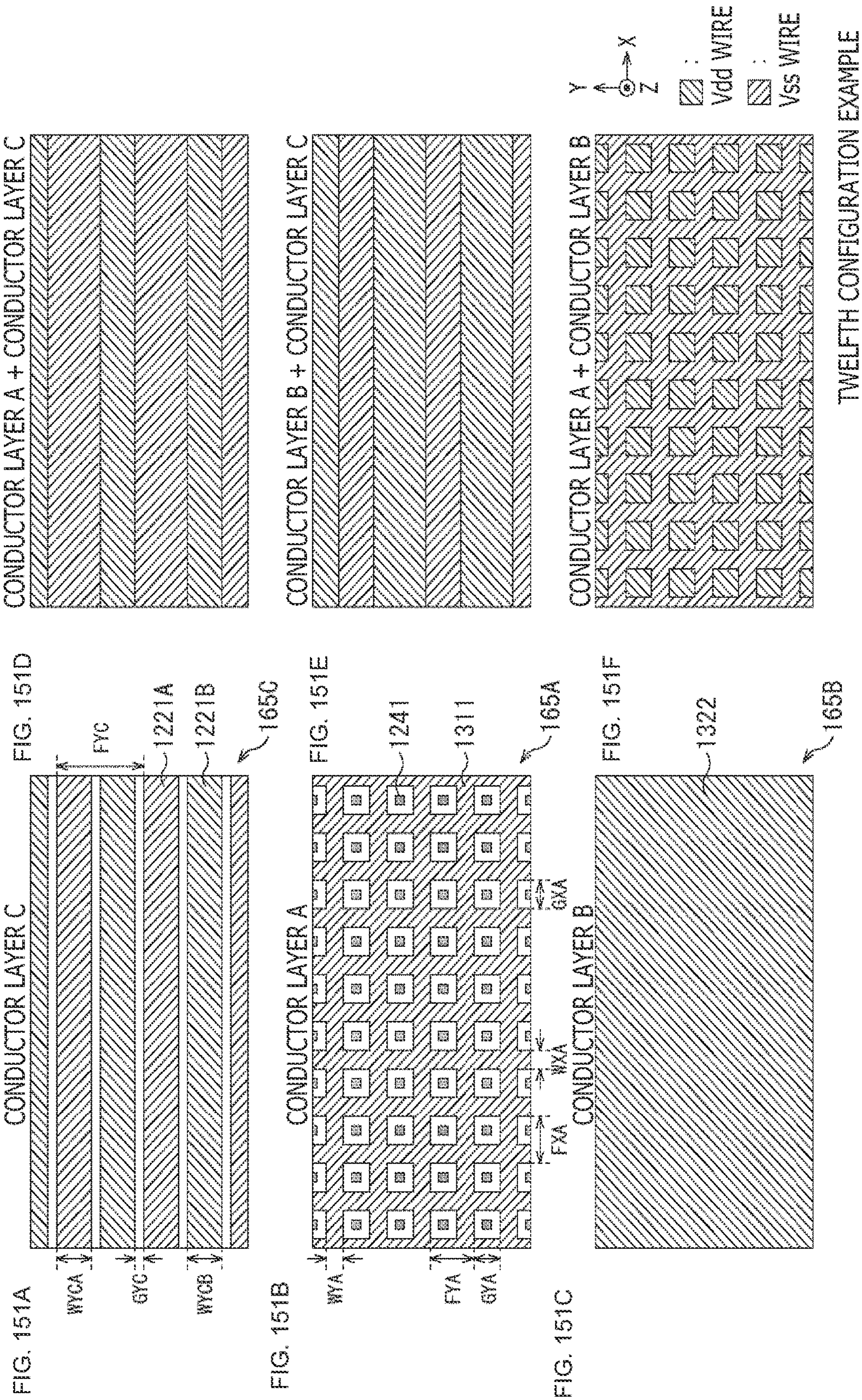

FIG. 151A depicts the conductor layer C (wiring layer 165C), FIG. 151B depicts the conductor layer A (wiring layer 165A), and FIG. 151C depicts the conductor layer B (wiring layer 165B).

In addition, FIG. 151D is a plan view of the stacked state of the conductor layer A and the conductor layer C, FIG. 151E is a plan view of the stacked state of the conductor layer B and the conductor layer C, and FIG. 151F is a plan view of the stacked state of the conductor layer A and the conductor layer B.

Sections in FIGS. 151A, 151B, 151C, 151D, 151E, and 151F that have counterparts in the eleventh and twelfth configuration examples depicted in FIGS. 148A, 148B, 148C, 148D, 148E, 148F, 149A, 149B, 149C, 149D, 149E and FIG. 149E are given the same reference signs, explanations of those sections are omitted as appropriate, and explanations are given with a focus on differences.

In the second modification example of the twelfth configuration example, only the configuration of the conductor layer A in FIG. 151B is different from that in FIGS. 149A, 149B, 149C, 149D, 149E, and 149F.

In the configuration in the twelfth configuration example depicted in FIGS. 149A, 149B, 149C, 149D, 149E, and 149F, the conductor layer A has the planar conductor 1321 instead of the mesh conductor 1311 and the relay conductors 1241 in the eleventh configuration example of three conductor layers depicted in FIGS. 148A, 148B, 148C, 148D, 148E, and 148F, and the conductor layer B has the planar conductor 1322 instead of the mesh conductor 1312 and the relay conductors 1242 in the eleventh configuration example of three conductor layers depicted in FIGS. 148A, 148B, 148C, 148D, 148E, and 148F.

In contrast, in the configuration in the second modification example of the twelfth configuration example depicted in FIGS. 151A, 151B, 151C, 151D, 151E, and 151F, the conductor layer A has the mesh conductor 1311 and the relay conductors 1241 which are the same as the ones in the eleventh configuration example of three conductor layers depicted in FIGS. 148A, 148B, 148C, 148D, 148E, and 148F, and the conductor layer B has the planar conductor 1322 instead of the mesh conductor 1312 and the relay conductors 1242 in the eleventh configuration example of three conductor layers depicted in FIGS. 148A, 148B, 148C, 148D, 148E, and 148F.

In the first modification example and the second modification example also, action and effects similar to those in the twelfth configuration example depicted in FIGS. 149A, 149B, 149C, 149D, 149E, and 149F are attained.

That is, if a predetermined planar range (planar region) of the conductor layer C is looked at, the current distribution in the linear conductors 1221A and the current distribution in the linear conductors 1221B become the same or substantially the same, and so the occurrence of inductive noise can be suppressed.

Because the linear conductors 1222A and the linear conductors 1222B include repetitions of the same wiring patterns in the Y direction, capacitive noise can be offset completely in the Y direction. Capacitive noise can be ameliorated more significantly if the conductor layer C is closer to the wiring layer 170.

The stacking of the conductor layers A and B forms a light-blocking structure, and needless to say, hot carrier light emissions from an active element group 167 can be blocked. In addition, the stacking of the conductor layers A and C, and the stacking of the conductor layers B and C also form light-blocking structures, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

The first modification example in FIGS. 150A, 150B, 150C, 150D, 150E, and 150F is particularly suitable for stacking orders that allow electrical connection between the three layers, the conductor layers A to C, specifically, the stacking orders depicted in FIGS. 120A and 120B. For example, in the case of the stacking order of the conductor layers A, B, and C depicted in FIG. 120A, the planar conductor 1321 in the conductor layer A and the relay conductor 1242 in the conductor layer B can be connected, and the mesh conductor 1312 and relay conductors 1242 in the conductor layer B can be connected with the linear conductors 1221B and 1221A in the conductor layer C by conductor vias in the Z direction between conductors with common current characteristics, and in part of regions over which their planar regions overlap.

The second modification example in FIGS. 151A, 151B, 151C, 151D, 151E, and 151F is particularly suitable for stacking orders that allow electrical connection between the three layers, the conductor layers A to C, specifically, the stacking orders depicted in FIGS. 120B and 120C. For example, in the case of the stacking order of the conductor layers A, C and B depicted in FIG. 120B, the mesh conductor 1311 and relay conductors 1241 in the conductor layer A can be connected with the linear conductors 1221A and 1221B in the conductor layer C by conductor vias in the Z direction between conductors with common current characteristics, and in part of regions over which their planar regions overlap, and the planar conductor 1322 in the conductor layer B and the linear conductors 1221B in the conductor layer C can be connected.

<Thirteenth Configuration Example of Three Conductor Layers>

FIGS. 152A, 152B, 152C, 152D, 152E, and 152F depicts a thirteenth configuration example of three conductor layers.

Figures 152A, 152B, 152C, 152D, 152E, 152F:
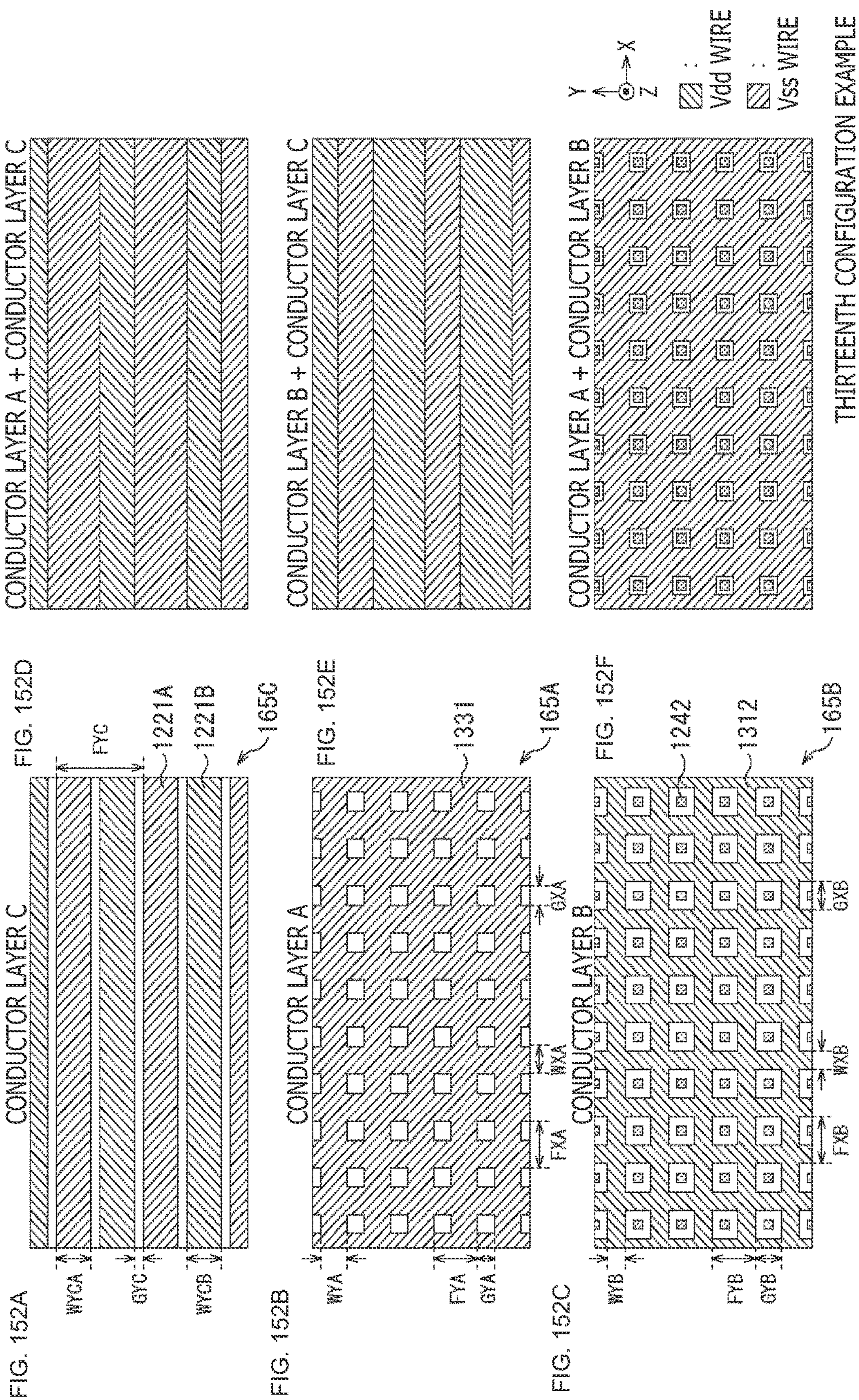

FIG. 152A depicts the conductor layer C (wiring layer 165C), FIG. 152B depicts the conductor layer A (wiring layer 165A), and FIG. 152C depicts the conductor layer B (wiring layer 165B).

In addition, FIG. 152D is a plan view of the stacked state of the conductor layer A and the conductor layer C, FIG. 152E is a plan view of the stacked state of the conductor layer B and the conductor layer C, FIG. 152F is a plan view of the stacked state of the conductor layer A and the conductor layer B.

Sections in the twelfth configuration example in FIGS. 152A, 152B, 152C, 152D, 152E, and 152F that have counterparts in the eleventh configuration example depicted in FIGS. 148A, 148B, 148C, 148D, 148E, and 148F are given the same reference signs, explanations of those sections are omitted as appropriate, and explanations are given with a focus on differences.

In the thirteenth configuration example, only the configuration of the conductor layer A in FIG. 152B is different from that in FIGS. 148A, 148B, 148C, 148D, 148E, and 148F.

The conductor layer A in FIG. 152B includes a mesh conductor 1331. The mesh conductor 1331 is a wire (Vss wire) connected to GND or a negative power supply, for example. The mesh conductor 1331 has the X-direction conductor width WXA, gap width GXA, and conductor pitch FXA and has the Y-direction conductor width WYA, gap width GYA, and conductor pitch FYA. Here, (conductor width WXA)=(conductor width WYA), (gap width GXA)=(gap width GYA), and (conductor pitch FXA)=(conductor pitch FYA) are satisfied. It should be noted however that the gap width GXA and gap width GYA of gaps of the mesh conductor 1331 are smaller than the gap width GXB and gap width GYB of gaps of the mesh conductor 1312 in the conductor layer B ((gap width GXA)=(gap width GYA)<(gap width GXB)=(gap width GYB)). In addition, relay conductors are not formed in the gaps of the mesh conductor 1331.

The thirteenth configuration example in FIGS. 152A, 152B, 152C 152D, 152E, and 152F is similar to the eleventh configuration example in FIGS. 148A, 148B, 148C, 148D, 148E, and 148F in other respects than those mentioned above.

If a predetermined planar range (planar region) of the conductor layer C in-FIG. 152A is looked at, the current distribution in the linear conductors 1221A and the current distribution in the linear conductors 1221B become the same or substantially the same, and so the occurrence of inductive noise can be suppressed.

Because the linear conductors 1221A and the linear conductors 1221B include repetitions of the same wiring patterns in the Y direction, capacitive noise can be offset completely in the Y direction. Capacitive noise can be ameliorated more significantly if the conductor layer C is closer to the wiring layer 170.

As depicted in FIGS. 152D and 152E, each of the stacking of the conductor layers A and C, and the stacking of the conductor layers B and C forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

By providing the relay conductors 1242 in the conductor layer B, it becomes possible to connect with the linear conductors 1221A with substantially the shortest distance or with a short distance, and voltage drops, energy loss, or inductive noise can be reduced.

The thirteenth configuration example in FIGS. 152A, 152B, 152C 152D, 152E, and 152F is particularly suitable for stacking orders that allow electrical connection between the three layers, the conductor layers A to C, specifically, the stacking order depicted in FIG. 120B. For example, in the case of the stacking order of the conductor layers A, C, and B depicted in FIG. 120B, the mesh conductor 1331 in the conductor layer A and the linear conductors 1221A in the conductor layer C can be connected by conductor vias in the Z direction, and the mesh conductor 1312 and relay conductors 1242 in the conductor layer B can be connected with the linear conductors 1221B and 1221A in the conductor layer C by conductor vias in the Z direction between conductors with common current characteristics, and in part of regions over which their planar regions overlap.

<Fourteenth Configuration Example of Three Conductor Layers>

The first to thirteenth configuration examples of three conductor layers mentioned above are explained by adopting, as the configuration of the conductor layer C, a configuration that uses linear conductors that are long in the X direction or linear conductors that are long in the Y direction, which form so-called vertical stripe or horizontal stripe wiring patterns.

However, the patterns of the conductor layer C are not limited to vertical stripe or horizontal stripe wiring patterns.

In the following cases explained with FIGS. 153A, 153B, 153C, 153D, 153E, 153F, 154A, 154B, 154C, 154D, 154E, 154F, 155A, 155B, 155C, 155D, 155E, 155F, 156A, 156B, 156C, 157A, 157B, 157C, 158A, 158B, 158C, 159A, 159B, 159C, 160A, 160B, 160C, 161A, 161B, 161C, 162A, 162B, 162C, 163A, 163B and 163C, the conductor layer C has configurations other than vertical stripe or horizontal stripe wiring patterns.

FIGS. 153A, 153B, 153C, 153D, 153E, and 153F depict a fourteenth configuration example of three conductor layers.

Figures 153A, 153B, 153C, 153D, 153E, 153F:
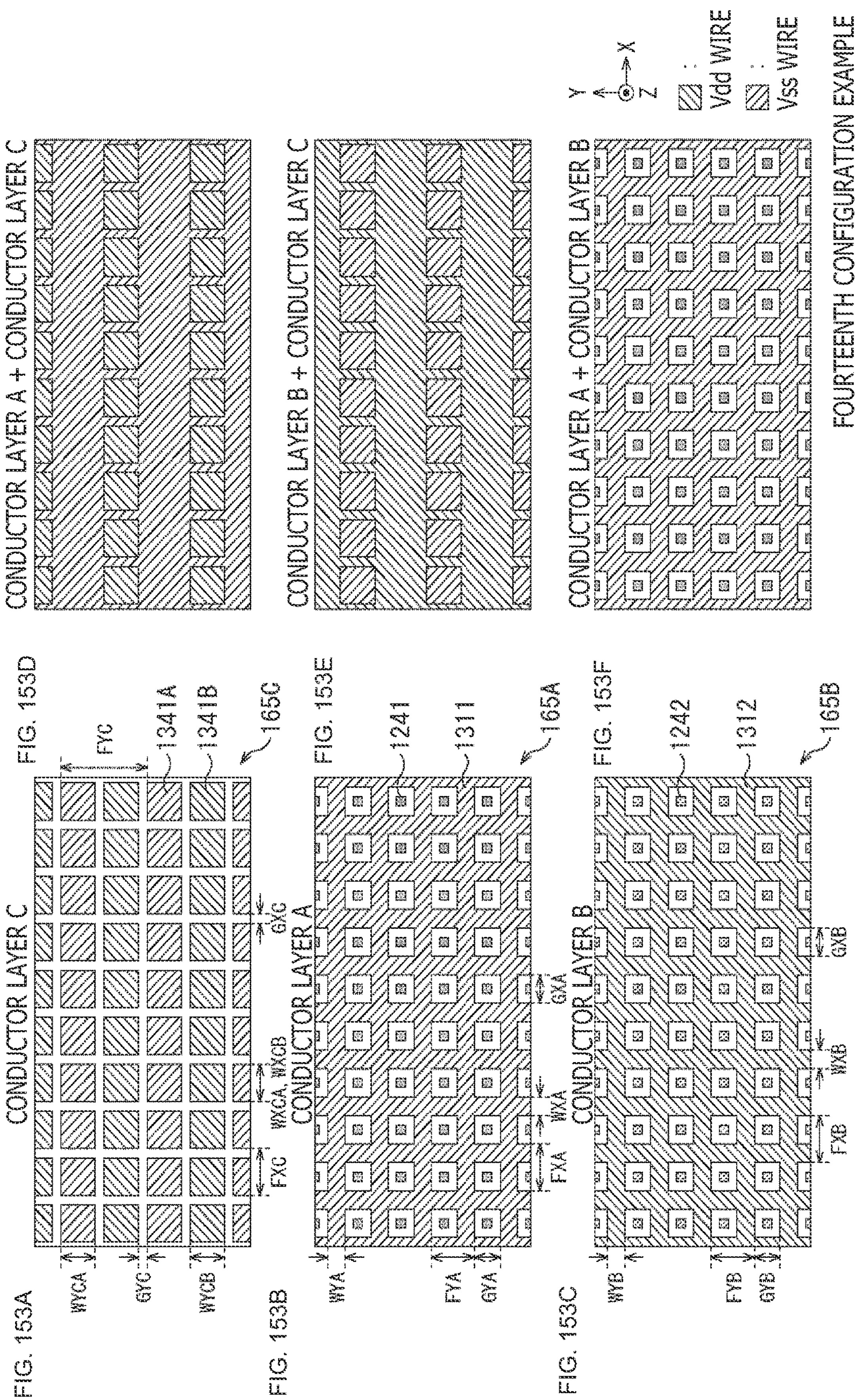

FIG. 153A depicts the conductor layer C (wiring layer 165C), FIG. 153B depicts the conductor layer A (wiring layer 165A), and FIG. 153C depicts the conductor layer B (wiring layer 165B).

In addition, FIG. 153D is a plan view of the stacked state of the conductor layer A and the conductor layer C, FIG. 153E is a plan view of the stacked state of the conductor layer B and the conductor layer C, and FIG. 153F is a plan view of the stacked state of the conductor layer A and the conductor layer B.

Sections in the fourteenth configuration example in FIGS. 153A, 153B, 153C, 153D, 153E, and 153F that have counterparts in the eleventh configuration example depicted in FIGS. 148A, 148B, 148C, 148D, 148E, and 148F are given the same reference signs, explanations of those sections are omitted as appropriate, and explanations are given with a focus on differences.

In the fourteenth configuration example, only the configuration of the conductor layer C in FIG. 153A is different from that in FIGS. 148A, 148B, 148C. 148D, 148E, and 148F The conductor layer C in FIG. 153A includes multiple rectangular conductors 1341A and 1341B that are arranged repetitively on the same plane at predetermined repetition pitches. The rectangular conductors 1341A are wires (Vss wires) connected to GND or a negative power supply, for example. The rectangular conductors 1341B are wires (Vdd wires) connected to a positive power supply, for example.

Specifically, rows where rectangular conductors 1341A are arranged repetitively at the gap width GXC in the X direction, and rows where rectangular conductors 1341B are arranged repetitively at the gap width GXC in the X direction are arranged alternately regularly in the Y direction. The rectangular conductors 1341A and 1341B are arranged repetitively at the conductor pitch FXC in the X direction and are arranged repetitively at the conductor pitch FYC in the Y direction. There is a gap with the gap width GYC between a rectangular conductor 1341A and a rectangular conductor 1341B in the Y direction. The rectangular conductors 1341A have the X-direction conductor width WXCA and the Y-direction conductor width WYCA, and the rectangular conductors 1341B have the X-direction conductor width WXCB, and the Y-direction conductor width WYCB. Here, the conductor widths WXCA, WYCA, WXCB and WYCB are the same ((conductor width WXCA)=(conductor width WYCA)=(conductor width WXCB)=(conductor width WYCB)).

The fourteenth configuration example in FIGS. 153A, 153B, 153C 153D, 153E, and 153F is similar to the eleventh configuration example in FIGS. 148A, 148B, 148C, 148D, 148E, and 148F in other respects than those mentioned above.

If a predetermined planar range (planar region) of the conductor layer C in FIG. 153A is looked at, the current distribution in the rectangular conductors 1341A and the current distribution in the rectangular conductors 1341B become the same or substantially the same, and so the occurrence of inductive noise can be suppressed.

Because the rectangular conductors 1341A and the rectangular conductors 1341B include repetitions of the same wiring patterns in the Y direction, capacitive noise can be offset completely in the Y direction. Capacitive noise can be ameliorated more significantly if the conductor layer C is closer to the wiring layer 170.

As depicted in FIGS. 153D and 153E, each of the stacking of the conductor layers A and C, and the stacking of the conductor layers B and C forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

By providing the relay conductors 1241 in the conductor layer A, it becomes possible to connect with the rectangular conductors 1341B with substantially the shortest distance or with a short distance, and voltage drops, energy loss, or inductive noise can be reduced.

By providing the relay conductors 1242 in the conductor layer B, it becomes possible to connect with the rectangular conductors 1341A with substantially the shortest distance or with a short distance, and voltage drops, energy loss, or inductive noise can be reduced.

<Modification Examples of Fourteenth Configuration Example of Three Conductor Layers>

FIGS. 154A, 154B, 154C, 154D, 154E, and 154F depict a first modification example of the fourteenth configuration example of three conductor layers.

Figures 154A, 154B, 154C, 154D, 154E, 154F:
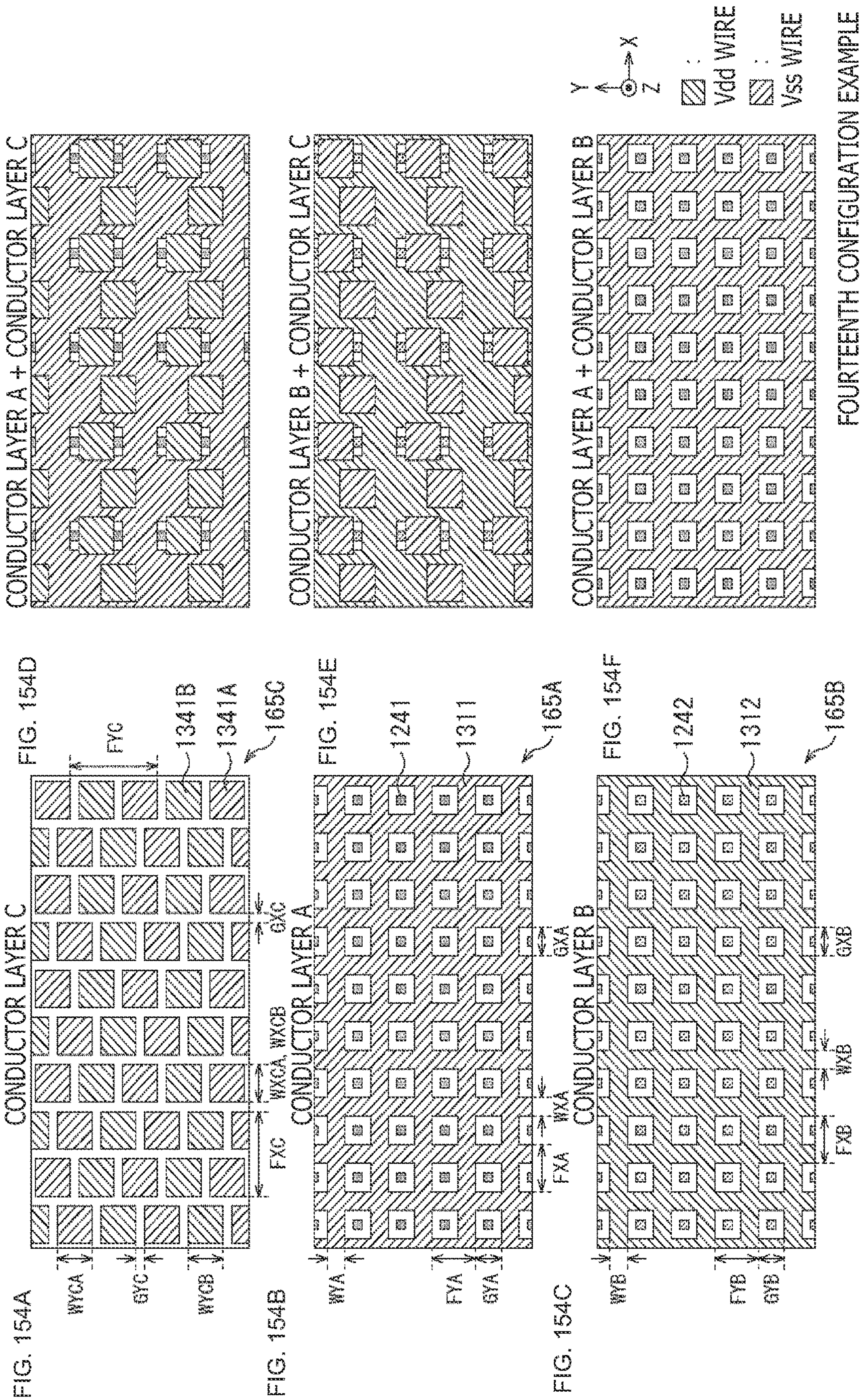

FIG. 154A depicts the conductor layer C (wiring layer 165C), FIG. 154B depicts the conductor layer A (wiring layer 165A), and FIG. 154C depicts the conductor layer B (wiring layer 165B).

In addition, FIG. 154D is a plan view of the stacked state of the conductor layer A and the conductor layer C, FIG. 154E is a plan view of the stacked state of the conductor layer B and the conductor layer C, and FIG. 154F is a plan view of the stacked state of the conductor layer A and the conductor layer B.

Sections in FIGS. 154A, 154B, 154C, 154D, 154E, and 154F that have counterparts in the fourteenth configuration example depicted in FIGS. 153A, 153B, 153C, 153D, 153E, and 153F are given the same reference signs, explanations of those sections are omitted as appropriate, and explanations are given with a focus on differences.

The first modification example of the fourteenth configuration example is different from the configuration example in FIGS. 153A, 153B, 153C, 153D, 153E, and 153F only in terms of the configuration of the conductor layer C in FIG. 154A, and is similar to the configuration example in FIGS. 153A, 153B, 153C, 153D, 153E, and 153F in terms of the configurations of the conductor layers A and B.

The conductor layer C in FIG. 154A has a commonality with the conductor layer FIG. 153C in that they both include multiple rectangular conductors 1341A and 1341B that are arranged repetitively on the same plane at predetermined repetition pitches, but is different in that adjacent columns are arranged being displaced relative to each other by ¼ of the Y-direction conductor pitch FYC. The conductor pitch FXC, which is the X-direction repetition pitch, includes a pair of columns.

FIGS. 155A, 155B, 155C, 155D, 155E, and 155F depict a second modification example of the fourteenth configuration example of three conductor layers.

Figure 155A:
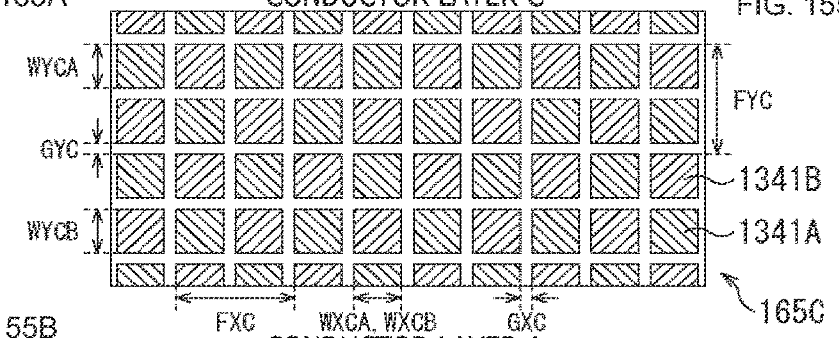
Figure 155B:
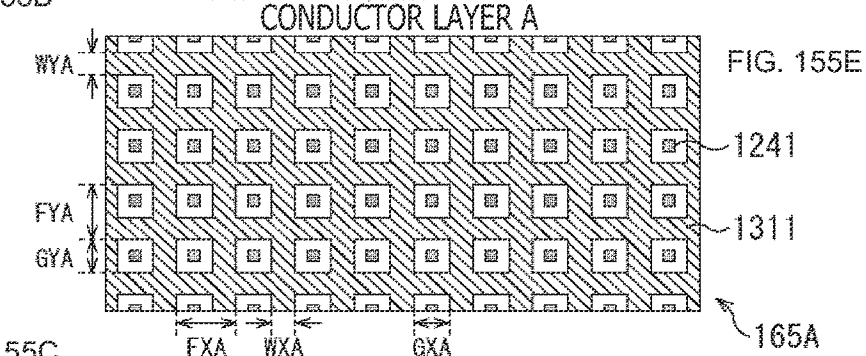
Figure 155C:
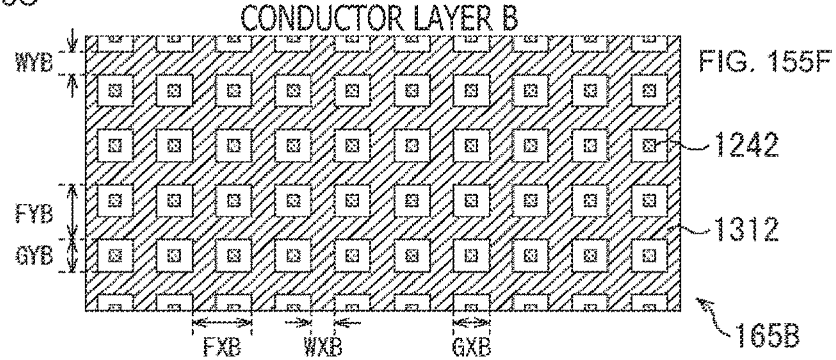

FIG. 155A depicts the conductor layer C (wiring layer 165C), FIG. 155B depicts the conductor layer A (wiring layer 165A), and FIG. 155C depicts the conductor layer B (wiring layer 165B).

Figure 155D:
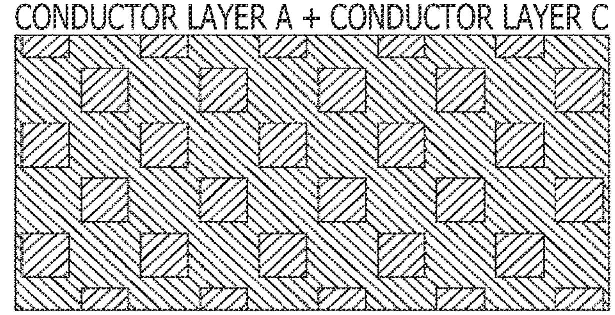
Figure 155E:
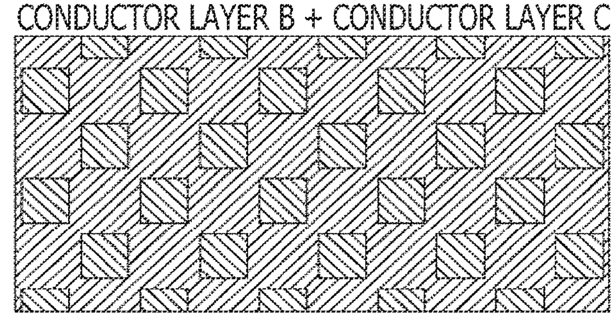
Figure 155F:
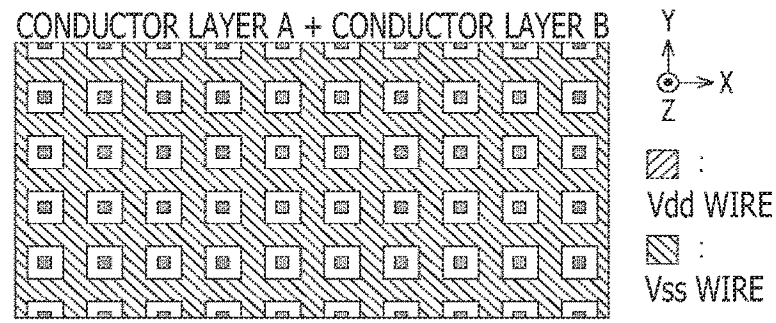

In addition, FIG. 155D is a plan view of the stacked state of the conductor layer A and the conductor layer C, FIG. 155E is a plan view of the stacked state of the conductor layer B and the conductor layer C, and FIG. 155F is a plan view of the stacked state of the conductor layer A and the conductor layer B.

Sections in FIGS. 155A, 155B, 155C, 155D, 155E, and 155F that have counterparts in the fourteenth configuration example depicted in FIGS. 153A, 153B, 153C, 153D, 153E, and 153F are given the same reference signs, explanations of those sections are omitted as appropriate, and explanations are given with a focus on differences.

The second modification example of the fourteenth configuration example is different from the configuration example in FIGS. 149A, 149B, 149C, 149D, 149E, and 149F only in terms of the configuration of the conductor layer C in FIG. 155A, and is similar to the configuration example in FIGS. 149A, 149B, 149C, 149D, 149E, and 149F in terms of the configurations of the conductor layers A and B.

The conductor layer C in FIG. 155A has a commonality with the conductor layer FIG. 149C in that they both include multiple rectangular conductors 1341A and 1341B that are arranged repetitively on the same plane at predetermined repetition pitches, but is different in that adjacent columns are arranged being displaced relative to each other by ½ of the Y-direction conductor pitch FYC. The conductor pitch FXC, which is the X-direction repetition pitch, includes a pair of columns. Note that the amount of Y-direction displacement between adjacent columns of the rectangular conductors 1341A and 1341B can be designed to have any values.

In the first modification example and second modification example of the fourteenth configuration example in FIG. 154A, 154B, 154C, 154D, 154E, 154F, 155A, 155B, 155C, 155D, 155E, and 155F, if a predetermined planar range (planar region) of the conductor layer C is looked at, the current distribution in the rectangular conductors 1341A and the current distribution in the rectangular conductors 1341B become the same or substantially the same, and so the occurrence of inductive noise can be suppressed.

In addition, in the first modification example and second modification example of the fourteenth configuration example, because the rectangular conductors 1341A and the rectangular conductors 1341B include repetitions of the same wiring patterns in the Y direction, capacitive noise can be offset completely in the Y direction. Capacitive noise can be ameliorated more significantly if the conductor layer C is closer to the wiring layer 170.

In the second modification example of the fourteenth configuration example in FIGS. 155A, 155B, 155C, 155D, 155E, and 155F, furthermore, because the rectangular conductors 1341A and the rectangular conductors 1341B include repetitions of the same wiring patterns in the X direction, capacitive noise can be offset completely in the X direction. Capacitive noise can be ameliorated more significantly if the conductor layer C is closer to the wiring layer 170.

In the first modification example of the fourteenth configuration example in FIGS. 154A, 154B, 154C, 154D, 154E, and 154F, due to the stacking of the conductor layers A and B, the stacking of the conductor layers A and C, and the stacking of the conductor layers B and C, the light-blocking property is maintained in a certain range. Thereby, the light-blocking constraints of the conductor layers A and B can be relaxed slightly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

In the second modification example of the fourteenth configuration example in FIGS. 155A, 155B, 155C, 155D, 155E, and 155F, each of the stacking of the conductor layers A and C, and the stacking of the conductor layers B and C forms a light-blocking structure, and the light-blocking property is maintained. Thereby, the light-blocking constraints of the conductor layers A and B can be relaxed significantly. Accordingly, it is possible to make full use of the conductor area sizes of the conductor layers A and B, and it is possible to lower the wire resistances to further ameliorate voltage drops. In addition, the degree of freedom of the layouts of the conductor layers A and B can be enhanced.

By providing the relay conductors 1241 in the conductor layer A, it becomes possible to connect with the rectangular conductors 1341B with substantially the shortest distance or with a short distance, and voltage drops, energy loss, or inductive noise can be reduced.

By providing the relay conductors 1242 in the conductor layer B, it becomes possible to connect with the rectangular conductors 1341A with substantially the shortest distance or with a short distance, and voltage drops, energy loss, or inductive noise can be reduced.

<Other Modification Examples of Fourteenth Configuration Example of Three Conductor Layers>

Hereinbelow, other modification examples of the fourteenth configuration example of three conductor layers depicted in FIGS. 153A, 153B, 153C, 153D, 153E, and 153F are explained with reference to FIG. 156A, 156B, 156C, 157A, 157B, 157C, 158A, 158B, 158C, 159A, 159B, 159C, 160A, 160B, 160C, 161A, 161B, 161C, 162A, 162B, 162C, 163A, 163B, and 163C.

Note that, similarly to the first and second modification examples in FIG. 154 and FIGS. 155A, 155B, 155C, 155D, 155E, and 155F, modification examples of the fourteenth configuration example have modified configurations of only the conductor layer C, and so only the configurations of the conductor layer C are depicted in FIGS. 156A, 156B, 156C, 157A, 157B, 157C, 158Am 158B, 158C, 159A, 159B, 159C, 160A, 160B, 160C, 161A, 161B, 161C, 162A, 162B, 162C, 163A, 163B, and 163C. In addition, the configurations of the conductor layer C are explained with reference to FIGS. 156A, 156B, 156C, 157A, 157B, 157C, 158A, 158B, 158C, 159A, 159B, 159C, 160A, 160B, 160C, 161A, 161B, 161C, 162A, 162B, 162C, 163A, 163B, and 163C in comparison with the conductor layer C in the fourteenth configuration example depicted in FIG. 153A.

FIG. 156A depicts the conductor layer C in a third modification example of the fourteenth configuration example of three conductor layers.

The conductor layer C in FIG. 156A includes multiple rectangular conductors 1342A and 1342B that are arranged repetitively on the same plane at predetermined repetition pitches. The rectangular conductors 1342A are wires (Vss wires) connected to GND or a negative power supply, for example. The rectangular conductors 1342B are wires (Vdd wires) connected to a positive power supply, for example.

A difference of the conductor layer C in FIG. 156A from the conductor layer C in FIG. 153A lies in the conductor sizes of the rectangular conductors 1342A and 1342B, that is, the conductor widths WXCA, WYCA, WXCB and WYCB. Note that the conductor widths WXCA, WYCA, WXCB and WYCB are the same ((conductor width WXCA) =(conductor width WYCA)=(conductor width WXCB)= (conductor width WYCB)).

The conductor layer C in FIG. 156A can completely offset capacitive noise in the Y direction. Capacitive noise can be ameliorated more significantly if the conductor layer C is closer to the wiring layer 170.

In addition, by making the conductor sizes of the rectangular conductors 1342A and 1342B larger than those in the fourteenth configuration example depicted in FIG. 153A, the wire resistances can be lowered further.

FIG. 156B depicts the conductor layer C in a fourth modification example of the fourteenth configuration example of three conductor layers.

The conductor layer C in FIG. 156B has a commonality with the conductor layer C in FIG. 156A in that they both include multiple rectangular conductors 1342A and 1342B that are arranged repetitively on the same plane at predetermined repetition pitches, but is different in that adjacent columns are arranged being displaced relative to each other by ¼ of the Y-direction conductor pitch FYC. The conductor pitch FXC, which is the X-direction repetition pitch, includes a pair of columns.

The conductor layer C in FIG. 156B can completely offset capacitive noise in the Y direction. Capacitive noise can be ameliorated more significantly if the conductor layer C is closer to the wiring layer 170.

FIG. 156C depicts the conductor layer C in a fifth modification example of the fourteenth configuration example of three conductor layers.

The conductor layer C in FIG. 156C has a commonality with the conductor layer C in FIG. 156A in that they both include multiple rectangular conductors 1342A and 1342B that are arranged repetitively on the same plane at predetermined repetition pitches, but is different in that adjacent columns are arranged being displaced relative to each other by ½ of the Y-direction conductor pitch FYC. It can also be said that adjacent rows are arranged being displaced relative to each other by ½ of the X-direction conductor pitch FXC. The X-direction conductor pitch FXC includes a pair of columns, and the Y-direction conductor pitch FYC includes a pair of rows. Note that the amount of Y-direction displacement between adjacent columns of the rectangular conductors 1342A and 1342B can be designed to have any values.

The conductor layer C in FIG. 156C can completely offset capacitive noise in the Y direction. Capacitive noise can be ameliorated more significantly if the conductor layer C is closer to the wiring layer 170.

Furthermore, the conductor layer C in FIG. 156C can completely offset capacitive noise in the X direction. Capacitive noise can be ameliorated more significantly if the conductor layer C is closer to the wiring layer 170.

FIG. 157A depicts the conductor layer C in a sixth modification example of the fourteenth configuration example of three conductor layers.

The conductor layer C in FIG. 157A includes multiple rectangular conductors 1343A and 1343B that are arranged repetitively on the same plane at predetermined repetition pitches. The rectangular conductors 1343A are wires (Vss wires) connected to GND or a negative power supply, for example. The rectangular conductors 1343B are wires (Vdd wires) connected to a positive power supply, for example.

A difference of the conductor layer C in FIG. 157A from the conductor layer C in FIG. 153A lies in the conductor sizes of the rectangular conductors 1343A and 1343B, specifically, the conductor widths WXCA and WXCB. Note that the rectangular conductors 1343A and 1343B are oblong rectangles, (conductor width WXCA)>(conductor width (conductor width WYCA), and WXCB)>(conductor width WYCB). In addition, the conductor width WXCA and the conductor width WXCB are equal to each other, and the conductor width WYCA and the conductor width WYCB are equal to each other ((conductor width WXCA)=(conductor width WXCB), and (conductor width WYCA)=(conductor width WYCB)).

The conductor layer C in FIG. 157A can completely offset capacitive noise in the Y direction. Capacitive noise can be ameliorated more significantly if the conductor layer C is closer to the wiring layer 170.

FIG. 157B depicts the conductor layer C in a seventh modification example of the fourteenth configuration example of three conductor layers.

The conductor layer C in FIG. 157B has a commonality with the conductor layer C in FIG. 157A in that they both include multiple rectangular conductors 1343A and 1343B that are arranged repetitively on the same plane at predetermined repetition pitches, but is different in that adjacent rows are arranged being displaced relative to each other by ½ of the X-direction conductor pitch FXC. The conductor pitch FYC, which is the Y-direction repetition pitch, includes two rows. Note that the amount of X-direction displacement between adjacent rows of the rectangular conductors 1343A and 1343B can be designed to have any values.

Because the rectangular conductors 1343A and the rectangular conductors 1343B in the conductor layer C in FIG. 157B do not include repetitions of the same wiring patterns in the Y direction, there are X positions where capacitive noise cannot be offset completely in the Y direction.

In view of this, in the case of the displacement by ½ of the X-direction conductor pitch FXC, the conductor layer C can be configured like the conductor layer C in FIG. 157C.

FIG. 157C depicts the conductor layer C in an eighth modification example of the fourteenth configuration example of three conductor layers.

The conductor layer C in FIG. 157C includes pairs of rows of rectangular conductors 1343A and 1343B, each pair of which includes a row of rectangular conductors 1343A and a row of rectangular conductors 1343B that are adjacent to each other in the Y direction, and the pairs of rows of rectangular conductors 1343A and 1343B are arranged being displaced relative to each other by ½ of the X-direction conductor pitch FXC and are arranged repetitively on the same plane at predetermined repetition pitches.

The conductor layer C in FIG. 157C can completely offset capacitive noise in the Y direction. Capacitive noise can be ameliorated more significantly if the conductor layer C is closer to the wiring layer 170.

FIG. 158A depicts the conductor layer C in a ninth modification example of the fourteenth configuration example of three conductor layers.

The conductor layer C in FIG. 158A includes multiple rectangular conductors 1344A and 1344B that are arranged repetitively on the same plane at predetermined repetition pitches. The rectangular conductors 1344A are wires (Vss wires) connected to GND or a negative power supply, for example. The rectangular conductors 1344B are wires (Vdd wires) connected to a positive power supply, for example.

A difference of the conductor layer C in FIG. 158A from the conductor layer C in FIG. 157 lies in the conductor sizes of the rectangular conductors 1344A and 1344B, specifically, the conductor widths WXCA and WXCB. The conductor widths WXCA and WXCB of the rectangular conductors 1344A and 1344B in FIG. 158 are larger than the conductor widths WXCA and WXCB of the rectangular conductors 1343A and 1343B in FIG. 157A.

Note that the rectangular conductors 1344A and 1344B are oblong rectangles, (conductor width WXCA)>(conductor width WYCA), and (conductor width WXCB)>(conductor width WYCB). In addition, the conductor width WXCA and the conductor width WXCB are equal to each other, and the conductor width WYCA and the conductor width WYCB are equal to each other ((conductor width WXCA)=(conductor width WXCB), and (conductor width WYCA)=(conductor width WYCB)).

The conductor layer C in FIG. 158A can completely offset capacitive noise in the Y direction. Capacitive noise can be ameliorated more significantly if the conductor layer C is closer to the wiring layer 170.

FIG. 158B depicts the conductor layer C in a tenth modification example of the fourteenth configuration example of three conductor layers.

The conductor layer C in FIG. 158B has a commonality with the conductor layer C in FIG. 158A in that they both include multiple rectangular conductors 1344A and 1344B that are arranged repetitively on the same plane at predetermined repetition pitches, but is different in that adjacent rows are arranged being displaced relative to each other by ⅓ of the X-direction conductor pitch FXC. The conductor pitch FYC, which is the Y-direction repetition pitch, includes a set of six rows.

The conductor layer C in FIG. 158B can completely offset capacitive noise in the Y direction. Capacitive noise can be ameliorated more significantly if the conductor layer C is closer to the wiring layer 170.

FIG. 158C depicts the conductor layer C in an eleventh modification example of the fourteenth configuration example of three conductor layers.

The conductor layer C in FIG. 158C includes pairs of rows of rectangular conductors 1344A and 1344B, each pair of which includes a row of rectangular conductors 1344A and a row of rectangular conductors 1344B that are adjacent to each other in the Y direction, and the pairs of rows of rectangular conductors 1344A and 1344B are arranged being displaced relative to each other by ⅓ of the X-direction conductor pitch FXC and are arranged repetitively on the same plane at predetermined repetition pitches.

The conductor layer C in FIG. 158C can completely offset capacitive noise in the Y direction. Capacitive noise can be ameliorated more significantly if the conductor layer C is closer to the wiring layer 170.

FIG. 159A depicts the conductor layer C in a twelfth modification example of the fourteenth configuration example of three conductor layers.

The conductor layer C in FIG. 159A includes multiple rectangular conductors 1341A and 1341B that are arranged repetitively on the same plane at predetermined repetition pitches.

A difference of the conductor layer C in FIG. 159A from the conductor layer C in FIG. 153A lies in the array directions of the rectangular conductors 1341A and 1341B. Specifically, the conductor layer C in FIG. 153A includes rectangular conductors 1341A and 1341B each of which is arranged repetitively in the X direction at the conductor pitch FXC, and the rectangular conductors 1341A and 1341B are arranged alternately regularly in the Y direction. In contrast, the conductor layer C in FIG. 159A includes rectangular conductors 1341A and 1341B each of which is arranged repetitively in the Y direction at the conductor pitch FYC, and the rectangular conductors 1341A and 1341B are arranged alternately regularly in the X direction.

The conductor layer C in FIG. 159A can completely offset capacitive noise in the X direction. Capacitive noise can be ameliorated more significantly if the conductor layer C is closer to the wiring layer 170.

FIG. 159B depicts the conductor layer C in a thirteenth modification example of the fourteenth configuration example of three conductor layers.

The conductor layer C in FIG. 159B includes multiple rectangular conductors 1361A and 1361B that are arranged repetitively on the same plane at predetermined repetition pitches. The rectangular conductors 1361A are wires (Vss wires) connected to GND or a negative power supply, for example. The rectangular conductors 1361B are wires (Vdd wires) connected to a positive power supply, for example.

A difference of the conductor layer C in FIG. 159B from the conductor layer C in FIG. 159A lies in the conductor sizes of the rectangular conductors 1361A and 1361B, specifically, the conductor widths WYCA and WYCB. Note that the rectangular conductors 1361A and 1361B are oblong rectangles, (conductor width WXCA)<(conductor width WYCA), and (conductor width WXCB)<(conductor width WYCB). In addition, the conductor width WXCA and the conductor width WXCB are equal to each other, and the conductor width WYCA and the conductor width WYCB are equal to each other ((conductor width WXCA)=(conductor width WXCB), and (conductor width WYCA)=(conductor width WYCB)).

The conductor layer C in FIG. 159B can completely offset capacitive noise in the X direction. Capacitive noise can be ameliorated more significantly if the conductor layer C is closer to the wiring layer 170.

Note that, although an illustration is omitted, adjacent columns of rectangular conductors 1361A and 1361B are displaced relative to each other by ½ of the Y-direction conductor pitch FYC and are arranged repetitively on the same plane at predetermined repetition pitches in one possible configuration, and adjacent columns of rectangular conductors 1361A and 1361B are displaced relative to each other by ⅓ of the Y-direction conductor pitch FYC in another possible configuration. In addition, the amount of Y-direction displacement between adjacent columns of the rectangular conductors 1361A and 1361B can be designed to have any values. In addition, sets of columns of rectangular conductors 1361A and 1361B, each set of which includes two or more columns of rectangular conductors 1361A and 1361B that are adjacent to or not adjacent to each other, may be displaced in the Y direction by a displacement amount designed to have a value, and it is suitable if the sum total of the X-direction conductor widths of rectangular conductors 1361A and the sum total of the X-direction conductor widths of rectangular conductors 1361B are the same or substantially the same in a case in which a predetermined planar range (planar region) is looked at, but this is not essential.

FIG. 159C depicts the conductor layer C in a fourteenth modification example of the fourteenth configuration example of three conductor layers.

The conductor layer C in FIG. 159C includes pairs of columns of rectangular conductors 1361A and 1361B, each pair of which includes a column of rectangular conductors 1361A and a column of rectangular conductors 1361B that are adjacent to each other in the X direction, and the pairs of columns of rectangular conductors 1361A and 1361B are arranged being displaced relative to each other by ½ of the Y-direction conductor pitch FYC and are arranged repetitively on the same plane at predetermined repetition pitches.

The conductor layer C in FIG. 159C can completely offset capacitive noise in the X direction. Capacitive noise can be ameliorated more significantly if the conductor layer C is closer to the wiring layer 170.

FIG. 160A depicts the conductor layer C in a fifteenth modification example of the fourteenth configuration example of three conductor layers.

The conductor layer C in FIG. 160A includes pairs of rectangular conductors 1341A and pairs of rectangular conductors 1341B that are arranged on the same plane at predetermined repetition pitches in the X direction and the Y direction. The gap between adjacent rectangular conductors 1341A, the gap between adjacent rectangular conductors 1341B, and the gap between adjacent rectangular conductors 1341A and 1341B have the X-direction gap width GXC and the Y-direction gap width GYC. The pairs of rectangular conductors 1341A and the pairs of rectangular conductors 1341B are arranged repetitively at the conductor pitch FXC in the X direction and are arranged repetitively at the conductor pitch FYC in the Y direction.

FIG. 160B depicts the conductor layer C in a sixteenth modification example of the fourteenth configuration example of three conductor layers.

The conductor layer C in FIG. 160B has a commonality with the conductor layer C in FIG. 157A in that they both include multiple rectangular conductors 1343A and 1343B that are arranged repetitively on the same plane at predetermined repetition pitches, but is different in that adjacent columns are arranged being displaced relative to each other by ½ of the Y-direction conductor pitch FYC. It can also be said that adjacent rows are arranged being displaced relative to each other by ½ of the X-direction conductor pitch FXC. The X-direction conductor pitch FXC includes a pair of columns, and the Y-direction conductor pitch FYC includes a pair of rows.

FIG. 160C depicts the conductor layer C in a seventeenth modification example of the fourteenth configuration example of three conductor layers.

The conductor layer C in C in FIG. 160C has a commonality with the conductor layer C in FIG. 158A in that they both include multiple rectangular conductors 1344A and 1344B that are arranged repetitively on the same plane at predetermined repetition pitches, but is different in that adjacent columns are arranged being displaced relative to each other by ½ of the Y-direction conductor pitch FYC. It can also be said that adjacent rows are arranged being displaced relative to each other by ½ of the X-direction conductor pitch FXC. The X-direction conductor pitch FXC includes a pair of columns, and the Y-direction conductor pitch FYC includes a pair of rows. The conductor layer C in FIG. 160B, and the conductor layer C in-C in FIG. 160C are different only in terms of the X-direction conductor widths WXCA and WXCB.

The conductor layer C in FIGS. 160A, 160B, and 1600 can completely offset capacitive noise in both the X direction and the Y direction. Capacitive noise can be ameliorated more significantly if the conductor layer C is closer to the wiring layer 170.

FIG. 161A depicts the conductor layer C in an eighteenth modification example of the fourteenth configuration example of three conductor layers.

The conductor layer C in FIG. 161A has a commonality with the conductor layer C in FIG. 156A in that they both include pairs of rectangular conductors 1341A and pairs of rectangular conductors 1341B that are arranged on the same plane at predetermined repetition pitches in the X direction and the Y direction, but is different in that pairs of columns are arranged being displaced relative to each other by ¼ of the Y-direction conductor pitch FYC.

FIG. 161B depicts the conductor layer C in a nineteenth modification example of the fourteenth configuration example of three conductor layers.

The conductor layer C in FIG. 161B has a commonality with the conductor layer C in FIG. 157A in that they both include multiple rectangular conductors 1343A and 1343B that are arranged repetitively on the same plane at predetermined repetition pitches, but is different in that adjacent columns are arranged being displaced relative to each other by ¼ of the Y-direction conductor pitch FYC.

FIG. 161C depicts the conductor layer C in a twentieth modification example of the fourteenth configuration example of three conductor layers.

The conductor layer C in FIG. 161C includes conductors 1381A and 1381B that are arranged on the same plane at a predetermined repetition pitch in the Y direction. The conductors 1381A are wires (Vss wires) connected to GND or a negative power supply, for example. The conductors 1381B are wires (Vdd wires) connected to a positive power supply, for example.

Each conductor 1381A has a shape obtained by connecting all the rectangular conductors 1343A arrayed in the X direction in FIG. 161B along the shortest path. Each conductor 1381B has a shape obtained by connecting all the rectangular conductors 1343B arrayed in the X direction in FIG. 161B along the shortest path. The gap width GXC and the gap width GYC in FIG. 161C correspond to the X-direction and Y-direction minimum widths between adjacent conductors. Note that each conductor 1381A or conductor 1381B does not have to have a shape obtained by connecting all the rectangular conductors arrayed in the X direction in FIG. 161B along the shortest path, but may have a meandered shape or a winding shape, for example.

The conductor layer C in FIGS. 161A, 161B, and 161C can completely offset capacitive noise in the Y direction and can partially offset capacitive noise in the X direction. Capacitive noise can be ameliorated more significantly if the conductor layer C is closer to the wiring layer 170.

FIG. 162A depicts the conductor layer C in a twenty-first modification example of the fourteenth configuration example of three conductor layers.

The conductor layer C in FIG. 162A has a commonality with the conductor layer C in FIG. 153A in that they both include multiple rectangular conductors 1341A and 1341B that are arranged repetitively on the same plane at predetermined repetition pitches, but is different in that adjacent columns are arranged being displaced relative to each other by ¼ of the Y-direction conductor pitch FYC.

FIG. 162B depicts the conductor layer C in a twenty-second modification example of the fourteenth configuration example of three conductor layers.

The conductor layer C in FIG. 162B includes conductors 1382A and 1382B that are arranged regularly on the same plane at the X-direction conductor pitch FXC, and the Y-direction conductor pitch FYC. The conductors 1382A are wires (Vss wires) connected to GND or a negative power supply, for example. The conductors 1382B are wires (Vdd wires) connected to a positive power supply, for example. The conductors 1382A have the X-direction conductor width WXCA and the Y-direction conductor width WYCA, and the conductors 1382B have the X-direction conductor width WXCB, and the Y-direction conductor width WYCB. The gap width GXC and the gap width GYC in B in FIG. 162 correspond to the X-direction and Y-direction minimum widths between adjacent conductors.

Each conductor 1382A has a shape obtained by connecting two rectangular conductors 1341A that are arrayed in the X direction in FIG. 162 along the shortest path. Each conductor 1382B has a shape obtained by connecting two rectangular conductors 1341B that are arrayed in the X direction in FIG. 162A along the shortest path. Note that each conductor 1382A or conductor 1382B does not have to have a shape obtained by connecting rectangular conductors along the shortest path, but it is sufficient if each conductor 1382A or conductor 1382B has a shape obtained by electrically connecting two or more rectangular conductors that are arrayed in the X direction in FIG. 162A.

FIG. 162C depicts the conductor layer C in a twenty-third modification example of the fourteenth configuration example of three conductor layers.

The conductor layer C in FIG. 162C includes conductors 1383A and 1383B that are arranged on the same plane at a predetermined repetition pitch in the Y direction. The conductors 1383A are wires (Vss wires) connected to GND or a negative power supply, for example. The conductors 1383B are wires (Vdd wires) connected to a positive power supply, for example. The conductors 1383A have the Y-direction conductor width WYCA, and the conductors 1382B have the Y-direction conductor width WYCB. The gap width GXC and the gap width GYC in FIG. 162C correspond to the X-direction and Y-direction minimum widths between adjacent conductors.

Each conductor 1383A has a shape obtained by connecting all the rectangular conductors 1341A arrayed in the X direction in FIG. 162A along the shortest path. Each conductor 1383B has a shape obtained by connecting all the rectangular conductors 1341B arrayed in the X direction in FIG. 162A along the shortest path. Note that each conductor 1383A or conductor 1383B does not have to have a shape obtained by connecting all the rectangular conductors arrayed in the X direction in FIG. 162A along the shortest path, but may have a meandered shape or a winding shape, for example.

The conductor layer C in FIGS. 162A, 162B, and 162C can completely offset capacitive noise in the Y direction and can partially offset capacitive noise in the X direction. Capacitive noise can be ameliorated more significantly if the conductor layer C is closer to the wiring layer 170.

FIG. 163A depicts the conductor layer C in a twenty-fourth modification example of the fourteenth configuration example of three conductor layers.

The conductor layer C in FIG. 163A has a commonality with the conductor layer C in FIG. 153A in that they both include rectangular conductors 1341A and 1341B that are arranged repetitively on the same plane at predetermined repetition pitches, but is different in that regions where adjacent columns are arranged being displaced relative to each other by ¼ of the Y-direction conductor pitch FYC, and regions where adjacent columns are arranged not being displaced relative to each other are mixedly present. The conductor layer C in FIG. 163A has a configuration in which, with the X-direction center of two rectangular conductors 1341A and 1341B whose positions are not displaced relative to each other in the Y direction as the reference point, rectangular conductors 1341A and 1341B are arranged repetitively at the conductor pitch FXC in an order until the reference point, and then in the reversed order after the reference point in the X direction.

FIG. 163B depicts the conductor layer C in a twenty-fifth modification example of the fourteenth configuration example of three conductor layers.

The conductor layer C in FIG. 163B includes rectangular conductors 1371A and 1371B that are arranged therein, and conductors 1382A and 1382B that are arranged repetitively on the same plane at a predetermined repetition pitch.

The conductor layer C in FIG. 163B has a configuration in which the conductors 1382A and 1382B are arranged in an order until the X-direction center of the rectangular conductors 1371A and 1371B, and then in the reversed order after the X-direction center, and the conductors 1382A and 1382B are arranged repetitively in the X direction at the conductor pitch FXC.

FIG. 163C depicts the conductor layer C in a twenty-sixth modification example of the fourteenth configuration example of three conductor layers.

The conductor layer C in FIG. 163C includes conductors 1391A and 1391B that are arranged on the same plane at a predetermined repetition pitch in the Y direction. The conductors 1391A are wires (Vss wires) connected to GND or a negative power supply, for example. The conductors 1391B are wires (Vdd wires) connected to a positive power supply, for example. The conductors 1391A have the Y-direction conductor width WYCA, and the conductors 1391B have the Y-direction conductor width WYCB. The gap width GXC and the gap width GYC in FIG. 163C correspond to the X-direction and Y-direction minimum widths between adjacent conductors.

Each conductor 1391A has a shape obtained by connecting all the rectangular conductors 1371A and conductors 1382A arrayed in the X direction in FIG. 163B along the shortest path. Each conductor 1391B has a shape obtained by connecting all the rectangular conductors 1371B and conductors 1382B arrayed in the X direction in FIG. 163B along the shortest path. Note that each conductor 1391A or conductor 1391B does not have to have a shape obtained by connecting all the rectangular conductors arrayed in the X direction in FIG. 163B along the shortest path, but may have a meandered shape or a winding shape, for example.

The conductor layer C in FIG. 163C has a configuration in which the same region unit as that of the conductor layer C in FIG. 163B is arranged repetitively at the conductor pitch FXC, one region unit being arranged in an order, and then the next region unit being arranged in the reversed order in the X direction.

The conductor layer C in FIGS. 163A, 163B and 163C has a conductor arrangement which is mirror-symmetric in the X direction.

The conductor layer C in FIGS. 163A, 163B and 163C can completely offset capacitive noise in the Y direction and can partially offset capacitive noise in the X direction. Capacitive noise can be ameliorated more significantly if the conductor layer C is closer to the wiring layer 170. While some specific examples are mentioned above, the first to fourteenth configuration examples and modification examples thereof (FIGS. 122A, 122B, 122C, 122D, 122E, 122F, 123A, 123B, 123C, 123D, 123E, 123F, 124A, 124B, 124C, 124D, 124E, 124F, 125A, 125B, 125C, 125D, 125E, 125F. 126A, 126B, 126C, 126D, 126E, 126F, 127A, 127B, 127C, 127D, 127E, 127F, 128A, 128B, 128C, 128D, 128E, 128F, 128A, 128B, 128C, 128D, 128E, 128F, 129A, 129B, 129C, 129D, 129E, 129F, 130A, 130B, 130C, 130D, 130E, 130F, 131A, 131B, 131C, 131D, 131E, 131F, 132A, 132B, 132C, 132D, 132E, 132F, 133A, 133B, 133C, 133D, 133E, 133F, 134A, 134B, 134C, 134D, 134E, 134F, 135A, 135B, 135C, 135D, 135E, 135F, 136A, 136B, 136C, 136D, 136E, 136F, 137A, 137B, 137C, 137D, 137E, 137F, 138A, 138B, 138C, 138D, 138E, 138F, 139A, 139B, 139C, 139D. 139E, 139F, 140A, 140B, 140C, 140D, 140E, 140F, 141A, 141B, 141C, 141D, 141E, 141F, 142A, 142B, 142C, 142D, 142E, 142F, 143A, 143B, 143C, 143D, 143E, 143F. 144A, 144B, 144C, 144D, 144E, 144F, 145A, 145B, 145C, 145D, 145E, 145F, 146A. 146B, 146C, 146D, 146E, 146F, 147A, 147B, 147C, 147D, 147E, 147F, 148A, 148B, 148C, 148D, 148E, 148F, 149A, 149B, 149C, 149D, 149E, 149F, 150A, 150B, 150C. 150D, 150E, 150F, 151A, 151B, 151C, 151D, 151E, 151F, 152A, 152B, 152C, 152D, 152E, 152F, 153A, 153B, 153C, 153D, 153E, 153F, 154A, 154B, 154C, 154D, 154E, 154F, 155A, 155B, 155C, 155D, 155E, 155F, 156A, 156B, 156C, 157A, 157B, 157C. 158A, 158B, 158C, 159A, 159B, 159C, 160A, 160B, 160C, 161A, 161B, 161C, 162A, 162B, 162C, 163A, 163B, and 163C) are particularly suitable for a stacking order in which the three layers, the conductor layers A to C, can be electrically connected via conductor vias extending in the Z direction, or the like. Specifically, the configuration examples and modification examples thereof that are depicted in FIGS. 122A, 122B, 122C, 122D, 122E, 122F, 123A, 123B, 123C, 123D, 123E, 123F, 124A, 124B, 124C, 124D, 124E, 124F, 125A, 125B, 125C, 125D, 125E, 125F, 126A, 126B, 126C, 126D, 126E, 126F, 127A, 127B, 127C, 127D, 127E, 127F, FIG. 134A, 134B, 134C 134D, 134E, 134F, FIG. 148A, 148B, 148C, 148D, 148E, 148F,

149A, 149B, 149C, 149D, 149E, 149F, and 152A, 152B, 152C, 152D, 152E, 152F, 153A, 153B, 153C, 153D, 153E, 153F, 154A, 154B, 154C, 154D, 154E, 154F, 155A, 155B, 155C, 155D, 155E, 155F, 156A, 156B, 156C, 157A, 157B, 157C, 158A, 158B, 158C, 159A, 159B, 159C, 160A, 160B, 160C, 161A, 161B, 161C, 162A, 162B, 162C, 163A, 163B, and 163C are suitable for the stacking order depicted in FIG. 120B. In addition, the configuration example and modification examples thereof depicted in FIGS. 150A, 150B, 150C, 150D, 150E, and 150F are suitable for the stacking orders depicted in in FIGS. 120A and 120B. In addition, the configuration examples and modification examples thereof depicted in FIGS. 129A, 129B, 129C, 129D, 129E, 129F, 131A, 131B, 131C, 131D, 131E, 131F, 133A, 133B, 133C, 133D, 133E, 133F, 135A, 135B, 135C, 135D, 135E, 135F, 136A, 136B, 136C, 136D, 136E, 136F, 137A, 137B, 137C, 137D, 137E, 137F, 138A, 138B, 138C, 138D, 138E, 138F, 140A, 140B, 140C, 140D, 140E, 140F, 142A, 142B, 142C, 142D, 142E, 142F, 143A, 143B, 143C, 143D, 143E, 143F, 144A, 144B, 144C, 144D. 144E, 144F, 146A, 146B, 146C, 146D, 146E, 146F, 147A, 147B, 147C, 147D, 147E, 147F, and 151A, 151B, 151C, 151D, 151E, and 151F are suitable for the stacking orders depicted in FIGS. 120B and 120C. In addition, the configuration examples and modification examples thereof depicted in FIGS. 128A, 128B, 128C, 128D, 128E, 128F, 130A, 130B, 130C, 130D, 130E, 130F, 132A, 132B, 132C, 132D, 132E, 132F, 139A, 139B, 139C, 139D, 139E, 139F, 141A, 141B, 141C, 141D, 141E, 141F, 145A, 145B, 145C, 145D, 145E, and 145F are suitable for the stacking orders depicted in FIGS. 120A, 120B, and 120C.

<Other Modification Examples of Three Conductor Layers>

In each configuration example mentioned above, a conductor explained as being a wire (Vss wire) connected to GND or a negative power supply, for example, may be a wire (Vdd wire) connected to a positive power supply, for example, and a conductor explained as being a wire (Vdd wire) connected to a positive power supply, for example, may be a wire (Vss wire) connected to GND or a negative power supply, for example. The voltage to be used as Vdd or Vss may be GND and a power supply, and may be two types of power supply with different voltages. The voltage to be used as Vdd or Vss desirably has two different polarities, but this is not essential. The numbers and total area sizes of conductor vias extending in the Z direction between the conductor layers A, B and C, and connecting the conductor layers A, B and C are desirably the same between the conductor vias for Vdd and the conductor vias for Vss in a predetermined planar range (planar region), but this is not essential. In a case in which relay conductors that are arranged in gaps are thinned out, they may be thinned out in manners other than those in the examples mentioned above, and may be thinned out randomly, for example.

While it is assumed that the conductor layer C is a conductor layer with a low sheet resistance that allows currents to flow more easily, the conductor layer C may be a conductor layer with a high sheet resistance that allows currents to flow less easily. The conductor layer C is desirably, but is not limited to be, not a conductor layer which is the hardest for currents to flow through in the circuit board, the semiconductor board and the electronic equipment. The conductor layer C is desirably, but is not limited to be, a conductor layer which is the easiest for currents to flow through in the circuit board, the semiconductor board and the electronic equipment. The conductor layer C is desirably, but not limited to be, a conductor layer that allows currents to flow more easily than at least one of the conductor layer A and the conductor layer B does. The conductor layer C is desirably, but is not limited to be, a conductor layer which is the second easiest, next to the conductor layer A, for currents to flow through in the circuit board, the semiconductor board and the electronic equipment. The conductor layer C is desirably, but is not limited to be, a conductor layer which is the second easiest, next to the conductor layer B, for currents to flow through in the circuit board, the semiconductor board and the electronic equipment. For example, the conductor layer C may be a conductor layer which is the hardest for currents to flow through in the first semiconductor board 101 or the second semiconductor board 102. For example, the conductor layer C may be a conductor layer which is the easiest for currents to flow through in the first semiconductor board 101 or the second semiconductor board 102. For example, the conductor layer C may be a conductor layer which is the second easiest for currents to flow through in the first semiconductor board 101 or the second semiconductor board 102. For example, the conductor layer C may be a conductor layer which is the third easiest for currents to flow through in the first semiconductor board 101 or the second semiconductor board 102. For example, the conductor layer C may be a conductor layer which is the second easiest, next to the conductor layer A, for currents to flow through in the first semiconductor board 101 or the second semiconductor board 102. For example, the conductor layer C may be a conductor layer which is the second easiest, next to the conductor layer B, for currents to flow through in the first semiconductor board 101 or the second semiconductor board 102.

Note that it may be considered that a conductor layer which is easier for currents to flow through in the circuit board, the semiconductor board and the electronic equipment mentioned above is any one of a conductor layer which is easier for currents to flow through in the circuit board, a conductor layer which is easier for currents to flow through in the semiconductor board, and a conductor layer which is easier for currents to flow through in the electronic equipment. In addition, it may be considered that a conductor layer which is harder for currents to flow through in the circuit board, the semiconductor board and the electronic equipment mentioned above is any one of a conductor layer which is harder for currents to flow through in the circuit board, a conductor layer which is harder for currents to flow through in the semiconductor board, and a conductor layer which is harder for currents to flow through in the electronic equipment. In addition, the conductor layer which is easier for currents to flow through mentioned above can instead be expressed as a conductor layer with a low sheet resistance, and the conductor layer which is harder for currents to flow through mentioned above can instead be expressed as a conductor layer with a high sheet resistance.

As conductor materials to be used for the conductor layer C, metals such as copper, aluminum, tungsten, chromium, nickel, tantalum, molybdenum, titanium, gold, silver or iron, or mixtures, compounds or alloys at least containing any of the metals are used mainly. In addition, semiconductors such as silicon, germanium, compound semiconductors or organic semiconductors may be contained. Further, insulators such as cotton, paper, polyethylene, polyvinyl chloride, natural rubber, polyester, epoxy resin, melamine resin, phenolic resin, polyurethane, synthetic resin, mica, asbestos, glass fiber or porcelain may be contained. Furthermore, the conductor layer C may be an uppermost layer metal or a lowermost layer metal, that is, an uppermost or lowermost conductor layer, or a conductor layer that is used for a junction between the same type of metal such as a Cu—Cu junction, an Au—Au junction or an Al—Al junction, or a junction between different types of metal such as a Cu—Au junction, a Cu—Al junction or an Au—Al junction.

The planar arrangement of each conductor layer of the conductor layers A to C may be reversed in the X direction or may be reversed in the Y direction. In addition, the planar arrangement may be rotated by a predetermined angle clockwise (e.g., 90 degrees) or may be rotated by a predetermined angle counterclockwise (e.g., −90 degrees). In addition, while the conductor pitches, the conductor widths and the gap widths are entirely even pitches and widths in the examples used for the explanations of some of the configuration examples mentioned above, these are not essential. For example, the conductor pitches, the conductor widths and the gap widths may be uneven pitches and widths, and the conductor pitches, the conductor widths and the gap widths may be modulated depending on positions, in other possible shapes. In addition, while the conductor pitches, the conductor widths, the gap widths, the wire shapes, the wire positions, the numbers of wires and the like are substantially the same between Vdd wires and Vss wires in the examples used for the explanations of some of the configuration examples mentioned above, these are not essential. For example, Vdd wires and Vss wires may have different conductor pitches, may have different conductor widths, may have different gap widths, may have different wire shapes, may have different wire positions, may have wire positions that deviate from each other or are displaced from each other, or may have different numbers of wires.

13. Application Examples

The technology according to the present disclosure is not limited by the explanations of the embodiments, and modification examples or application examples thereof that are described above, but can be implemented in various modified manners. Constituent elements in the embodiments, and modification examples or application examples thereof that are described above may be omitted partially, may be changed partially or entirely, may be modified partially or entirely, may be replaced with other constituent elements partially, or may have other additional constituent elements partially or entirely. In addition, constituent elements in the embodiments, and modification examples or application examples thereof that are described above may be divided into multiple constituent elements partially or entirely, may be separated into multiple constituent elements partially or entirely, or may achieve different functionality or features with at least some of the multiple divided or separated constituent elements. Also, at least some of constituent elements in the embodiments, and modification examples or application examples thereof that are described above may be combined to form different embodiments. Further, at least some of constituent elements in the embodiments, and modification examples or application examples thereof that are described above may be shifted to form different embodiments. Moreover, combinations of at least some of constituent elements in the embodiments, and modification examples or application examples thereof that are described above may have additional coupling elements or relay elements to form different embodiments. Furthermore, combinations of at least some of constituent elements in the embodiments, and modification examples or application examples thereof that are described above may have additional switching elements or switching functionality to form different embodiments.

It is assumed that each conductor that forms the conductor layer A or B that can be an Aggressor conductor loop in the solid-state image pickup apparatus 100, which is the present embodiment, is a Vdd wire or a Vss wire. That is, currents flow in the mutually opposite directions in at least some regions in the conductor layers A and B. When a current flows from the upper side to the lower side in figures in the conductor layer A at a certain time, a current flows from the lower side to the upper side in the figures in the conductor layer B. Note that the magnitudes of currents are desirably the same with each other. Note that conductors that form the conductor layers A and B are included in the second semiconductor board in the examples used for the explanations, but this is not essential. For example, they may be included in the first semiconductor board, and may be partially or entirely included in a constituent element other than the second semiconductor board.

Signals to flow through the conductor layers A and B may be any signals other than Vdd or Vss as long as the signals are differential signals whose directions of electric currents change over time. That is, it is sufficient if signals that flow through the conductor layers A and B are any signals whose currents I change over time t (a minute current change that occurs in infinitesimal time dt is dI). Note that even if DC currents basically flow through the conductor layers A and B, the currents I are changing over time t in a case in which there are rising of the currents, time transients of the currents, falling of the currents or the like.

For example, the magnitude of a current flowing through the conductor layer A and the magnitude of a current flowing through the conductor layer B may not be the same with each other. Conversely, the magnitude of a current flowing through the conductor layer A and the magnitude of a current flowing through the conductor layer B may be made the same with each other (currents that change over time are caused to flow through the conductor layers A and B at substantially the same timing). Typically, the magnitude of an induced electromotive force that occurs to a Victim conductor loop can be reduced more in a case in which currents that change over time flow through the conductor layers A and B at substantially the same timing, than in a case in which the magnitude of a current flowing through the conductor layer A and the magnitude of a current flowing through the conductor layer B are not the same with each other. On the other hand, signals to flow through the conductor layers A and B may not be differential signals. For example, conductors that form the conductor layers A and B may both be Vdd wires, may both be Vss wires, may both be GND wires, may both be the same type of signal line, may be different types of signal line or may be another combination. In addition, conductors that form the conductor layers A and B may be conductors not connected to power supplies or signal sources. Although the effect of allowing suppression of inductive noise deteriorates in these cases, other effects of the invention can be attained.

In addition, frequency signals with predetermined frequencies like clock signals, for example, may be caused to flow through the conductor layers A and B. In addition, AC power supply currents, for example, may be caused to flow through the conductor layers A and B. In addition, the same frequency signals, for example, may be caused to flow through the conductor layers A and B. In addition, signals including multiple frequency components may be caused to flow through the conductor layers A and B. On the other hand, DC signals whose currents I do not change at all over time t may be caused to flow. Although the effect of allowing suppression of inductive noise cannot be attained in this case, other effects of the invention can be attained. On the other hand, signals may be made not caused to flow. Although the effect of inductive noise suppression, capacitive noise suppression and voltage drop (IR-Drop) reduction cannot be attained in this case, other effects of the invention are attained.

14. Displacement Configuration Examples of Mesh Conductor

<First Displacement Configuration Example of Mesh Conductor>

Meanwhile, several configuration examples adopting mesh conductors for the conductor layer A and the conductor layer B mentioned above have been proposed.

For example, the second configuration example depicted in FIGS. 15A, 15B, and 15C depict the conductor layer A including the mesh conductor 216, and the conductor layer B including the mesh conductor 217. The fourth configuration example depicted in FIGS. 25A, 25B, and 25C depict the conductor layer A including the mesh conductor 231, and the conductor layer B including the mesh conductor 232.

In addition, relay conductors are arranged in gap regions of mesh conductors in proposed configuration examples.

For example, the eighth configuration example depicted in FIGS. 32A, 32B, and 32C depict the conductor layer A including the mesh conductor 271, and the conductor layer B including the mesh conductor 272, and the relay conductors 302. The relay conductors 302 are non-mesh conductors arranged in non-conductor gap regions of the mesh conductor 272. The number of the relay conductors arranged in gap regions of the mesh conductor is not limited to one. For example, the number of relay conductors arranged in a conductor layer is larger than one like the relay conductors 306 in the conductor layer FIG. 40B, in some cases.

Furthermore, for example, as in the fourth configuration example of three conductor layers depicted in FIGS. 128A, 128B, 128C, 128D, 128E, and 128F, each of the conductor layer A and the conductor layer B has relay conductors in some cases.

Wiring patterns of mesh conductors including repetitions at the same positions in the X and Y directions like the ones mentioned above are disadvantageous in one aspect in terms of capacitive noise.

Specifically, for example, the left side in FIG. 164 depicts a conductor layer 1511 including a mesh conductor 1501, and relay conductors 1502 arranged in gap regions of the mesh conductor 1501. The mesh conductor 1501 is a wire (Vss wire) connected to GND or a negative power supply, for example. The relay conductors 1502 are wires (Vdd wire) connected to a positive power supply, for example.

A wire 1512 that is included as part of a Victim conductor loop is arranged on a layer above or below the conductor layer 1511 including the mesh conductor 1501 and the relay conductors 1502. The wire 1512 corresponds to a signal line 132 or a control line 133 of the solid-state image pickup apparatus 100 for example.

Signal lines 132 are placed such that the signal lines 132 become longer in the Y direction than in the X direction, and the multiple signal lines 132 are arranged regularly at a predetermined pitch width (e.g., one for each pixel) in the pixel array 121. Each signal line 132 transfers a signal when selected by a select transistor 145 of a corresponding pixel 131. Control lines 133 are placed such that the control lines 133 become longer in the X direction than in the Y direction, and the multiple control lines 133 are arranged regularly at a predetermined pitch width (e.g., one for each pixel) in the pixel array 121. Each control line 133 transfers a signal when selected by the vertical scanning unit 123.

If Vdd wires and Vss wires are separately integrated along sections that correspond to linear conductors like the wire 1512 long in the Y direction, and are influenced by the mesh conductor 1501 and the relay conductors 1502 of the conductor layer 1511, that is, if the Vdd wires and Vss wires are separately integrated along straight lines in the Y direction that overlap the wire 1512, the total electric charge amount due to Vdd, and the total electric charge amount due to Vss mutually differ significantly as depicted on the right side in FIG. 164. The difference between the capacitance on the positive side due to the Vdd wires, and the capacitance on the negative side due to the Vss wires generates capacitive noise.

As explained with reference to FIGS. 62A, 62B, and 62C and the like, capacitive noise means a phenomenon in which, in a case in which voltages are applied to conductors forming the conductor layers, voltages are generated to wires due to capacitive coupling between the conductors and the wires, and furthermore the applied voltages change, thereby generating voltage noise to the wires. The voltage noise becomes pixel signal noise.

In contrast, the present inventors contrived conductor layers for which a predetermined displacement amount is set in a direction orthogonal to the longitudinal direction of the wire 1512 included as part of a Victim conductor loop, as in a conductor layer 1611 on the left side in FIG. 165.

The conductor layer 1611 includes a mesh conductor 1601, and relay conductors 1602 that are arranged in gap regions of the mesh conductor 1601. The mesh conductor 1601 is a wire (Vss wire) connected to GND or a negative power supply, for example. The relay conductors 1602 are wires (Vdd wire) connected to a positive power supply, for example.

In a case in which a predetermined displacement amount is provided in a direction orthogonal to the longitudinal direction of the wire 1512 in this manner, if Vdd wires and Vss wires are separately integrated along straight lines extending in the Y direction, the total electric charge amount due to Vdd, and the total electric charge amount due to Vss can be made substantially the same as depicted on the right side in FIG. 165. In addition, the polarities of voltages of the mesh conductor 1601 and the relay conductors 1602 are opposite (reverse polarities) between Vdd and Vss. Accordingly, the conductor layer 1611 can offset capacitive noise in the wire 1512, which is a Victim conductor. In a case in which Vdd wires and Vss wires integrated in the Y direction match, capacitive noise can be offset completely.

In configuration examples explained hereinbelow, capacitive noise is reduced, preferably offset completely, in a conductor layer of a mesh conductor by providing a predetermined displacement amount in a direction orthogonal to the longitudinal direction of a Victim conductor.

First, with reference to FIG. 166, the conductor widths and gap widths of the mesh conductor 1601 and the relay conductors 1602 included in the conductor layer 1611 as a first configuration example (a first displacement configuration example of a mesh conductor) of a mesh conductor provided with a displacement amount are explained.

Regarding the X direction, the mesh conductor 1601 has a conductor width WDX and a gap width GDX, and includes a repetition pattern with the conductor width WDX and the gap width GDX arranged at a pitch width FDX (=(conductor width WDX)+(gap width GDX)). In addition, regarding the Y direction, the mesh conductor 1601 has a conductor width WDY and a gap width GDY, and includes a repetition pattern with the conductor width WDY and the gap width GDY arranged at a pitch width FDY (=(conductor width WDY)+(gap width GDY)). It should be noted however that in the mesh conductor 1601, after every repetition of the Y-direction pitch width FDY, the conductor arrangement of the X-direction conductor width WDX and gap width GDX is displaced in the X direction by a predetermined displacement amount PDX. This X-direction displacement amount PDX for each pitch width FDY is also referred to as a pitch displacement PDX hereinafter.

The relay conductors 1602 are arranged in gap regions of the mesh conductor 1601 that have the X-direction gap width GDX, and the Y-direction gap width GDY. Each relay conductor 1602 is a rectangle with an X-direction conductor width CDX and a Y-direction conductor width CDY. The rectangle is a longitudinally long oblong rectangle with the Y-direction conductor width CDY larger than the X-direction conductor width CDX (CDY>CDX).

One X-direction end surface of each relay conductor 1602 is separated from the mesh conductor 1601 by a first gap width GDX1, and the other X-direction end surface is separated from the mesh conductor 1601 by a second gap width GDX2. The X-direction gap width GDX of the mesh conductor 1601 is equal to the total of the X-direction conductor width CDX, first gap width GDX1 and second gap width GDX2 of the relay conductor 1602. That is, GDX=CDX+GDX1+GDX2 is satisfied.

One Y-direction end surface of each relay conductor 1602 is separated from the mesh conductor 1601 by a first gap width GDY1, and the other Y-direction end surface is separated from the mesh conductor 1601 by a second gap width GDY2. The Y-direction gap width GDY of the mesh conductor 1601 is equal to the total of the Y-direction conductor width CDY, first gap width GDY1 and second gap width GDY2 of the relay conductor 1602. That is, GDY=CDY+GDY1+GDY2 is satisfied.

Here, the size relations between the conductor widths and gaps of the mesh conductor 1601 and the relay conductors 1602 are defined as follows.

As depicted in FIG. 166, assuming that A is a real number, the X-direction conductor width WDX and Y-direction conductor width WDY of the mesh conductor 1601 are widths which are equal to 2A. In other words, it is assumed that ½ of the X-direction conductor width WDX and Y-direction conductor width WDY of the mesh conductor 1601 is the real number A. In addition, it is assumed that the X-direction first gap width GDX1 and second gap width GDX2 also are 2A.

The X-direction conductor width CDX of each relay conductor 1602 is set to 6A, and the Y-direction conductor width CDY of each relay conductor 1602 is set to 7A. The Y-direction first gap width GDY1 and second gap width GDY2 are set to 1A.

Accordingly, if represented by using the real number A, the pitch width FDX (=(conductor width WDX)+(gap width GDX)) corresponds to 12A, and the pitch width FDY (=(conductor width WDY)+(gap width GDY)) corresponds to 11A.

FIGS. 167A, 167B, 167C, 167D, 168A, 168B, and 168C are plan views of the conductor layer 1611 with the pitch displacement PDX set to various values.

Figure 167A:
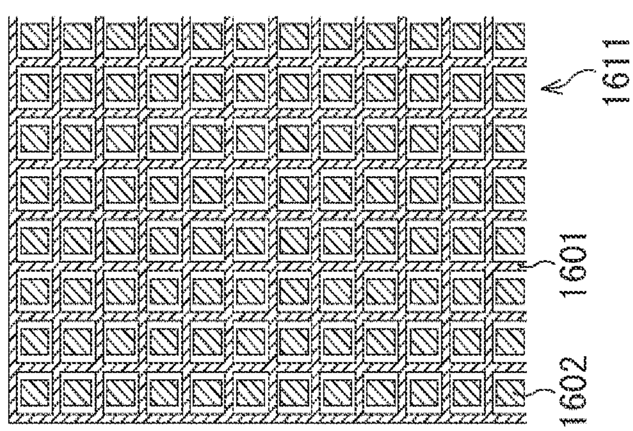

FIG. 167A is a plan view of the conductor layer 1611 with the pitch displacement PDX set to zero. Note that the conductor layer 1611 with the pitch displacement PDX set to zero corresponds to the mesh conductor 1501 in FIG. 164.

Figure 167B:
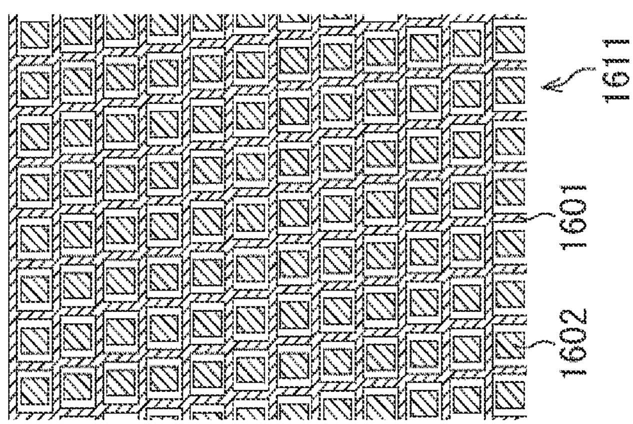

FIG. 167B is a plan view of the conductor layer 1611 with the X-direction pitch displacement PDX set to 1A, that is, 1/12 of the X-direction repetition pitch (pitch width FDX).

Figure 167C:
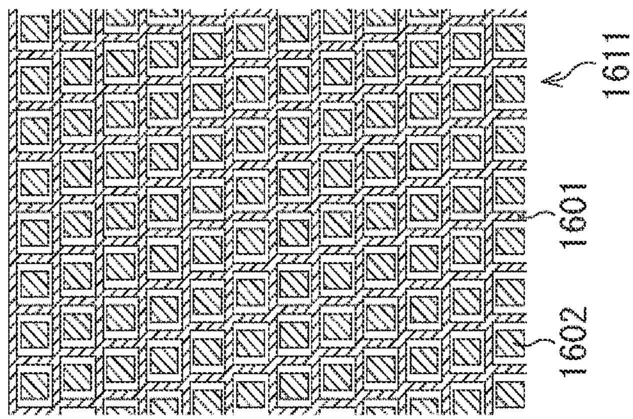

FIG. 167C is a plan view of the conductor layer 1611 with the pitch displacement PDX set to 2A, that is, 2/12 of the X-direction repetition pitch (pitch width FDX).

Figure 167D:
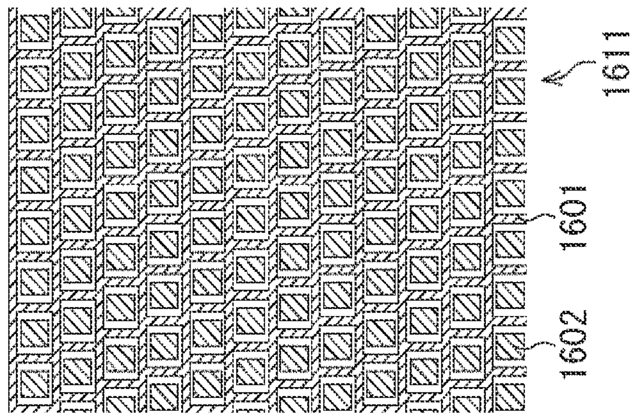

FIG. 167D is a plan view of the conductor layer 1611 with the pitch displacement PDX set to 3A, that is, 3/12 of the X-direction repetition pitch (pitch width FDX).

FIG. 168A is a plan view of the conductor layer 1611 with the pitch displacement PDX set to 4A, that is, 4/12 of the X-direction repetition pitch (pitch width FDX).

FIG. 168B is a plan view of the conductor layer 1611 with the pitch displacement PDX set to 5A, that is, 5/12 of the X-direction repetition pitch (pitch width FDX).

FIG. 168C is a plan view of the conductor layer 1611 with the pitch displacement PDX set to 6A, that is, 6/12 of the X-direction repetition pitch (pitch width FDX).

FIG. 169 is a graph depicting theoretical values of capacitive noise of the conductor layer 1611 with the pitch displacement PDX set to various values as in FIGS. 167A, 167B, 167C, 167D, 168A, 168B, and 168C.

The horizontal axis in FIG. 169 represents a coordinate depicting X-direction positions of the conductor layer 1611, and the vertical axis in FIG. 169 represents capacitive noise of Vdd wires and Vss wires at each X position. Note that it is assumed that the absolute values of an applied voltage of the Vdd wires (Vdd applied voltage), and an applied voltage of the Vss wires (Vss applied voltage) are the same. For example, in one possible case, the Vdd applied voltage is +1 V, and the Vss applied voltage is −1 V.

As depicted in FIG. 169, in a case in which the pitch displacement PDX is set to predetermined values, the change amount of capacitive noise becomes zero, and the absolute value of capacitive noise becomes zero. More specifically, in a case in which the pitch displacement PDX is set to 1/12, 2/12 or 5/12 of the X-direction repetition pitch, the change amount of capacitive noise becomes zero, and the absolute value of capacitive noise becomes zero.

In the case of the other values of the pitch displacement PDX, specifically, in a case in which the pitch displacement PDX is set to 3/12, 4/12 or 6/12 of the X-direction repetition pitch, the change amount and absolute value of capacitive noise do not become zero, but the change amount of capacitive noise can be made smaller than in a case in which the pitch displacement PDX is set to zero, that is, there is no pitch displacement.

FIG. 170 is a graph depicting theoretical values of capacitive noise in a case in which the pitch displacement PDX is set to various values in the conductor layer 1611 from which relay conductors 1602 are omitted. Although an illustration of the conductor layer 1611 from which relay conductors 1602 are omitted is omitted, the conductor layer 1611 corresponds to one from which relay conductors 1602 are removed from each conductor layer 1611 in FIGS. 167A, 167B, 167C, 167D, 168A, 168B, and 168C.

While the absolute value of capacitive noise does not become zero in a case in which there are no relay conductors 1602 as depicted in FIG. 170, the change amount of capacitive noise becomes zero in a case in which the pitch displacement PDX is set to predetermined values. The displacement amounts that make the change amount of capacitive noise zero are the same as those in a case in which there are relay conductors 1602. That is, in a case in which the pitch displacement PDX is set to 1/12, 2/12 or 5/12 of the X-direction repetition pitch, the change amount of capacitive noise becomes zero. In the case of the other values of the pitch displacement PDX, specifically, in a case in which the pitch displacement PDX is set to 3/12, 4/12 or 6/12 of the X-direction repetition pitch, the change amount of capacitive noise does not become zero, but the change amount of capacitive noise can be made smaller than in a case in which the pitch displacement PDX is set to zero, that is, there is no pitch displacement.

According to the graphs in FIG. 169 and FIG. 170, the change amount of capacitive noise becomes zero when the following conditions are satisfied.

First, as a premise, the pitch displacement PDX is set to a value that is different from the X-direction pitch width FDX (=12A) of the mesh conductor 1601.

In a case in which the pitch displacement PDX is 2A, that is, in a case in which the pitch displacement PDX is the same as the X-direction conductor width WDX of the mesh conductor 1601, the change amount of capacitive noise becomes zero. In addition, in a case in which the pitch displacement PDX is 1A, and in a case in which the pitch displacement PDX is 5A also, the change amount of capacitive noise becomes zero.

In a case in which the pitch displacement PDX is 1A or 5A, the change amount of capacitive noise becomes zero in a set of twelve rows. In contrast, in a case in which the pitch displacement PDX is 2A, the change amount of capacitive noise becomes zero in a set of six rows. In a case in which the pitch displacement PDX is equal to the conductor width WDX of the mesh conductor 1601, the change amount of capacitive noise can be made zero with a smaller number of rows, and so the degree of freedom of wiring layout can be increased.

In a case in which the pitch displacement PDX is different from 3/12 (=3A) of the X-direction repetition pitch of the mesh conductor 1601, in other words, in a case in which the pitch displacement PDX is not (pitch width FDX (=12A))/4, the change amount of capacitive noise becomes zero.

In a case in which the pitch displacement PDX is different from 4/12 (=4A) of the X-direction repetition pitch of the mesh conductor 1601, in other words, in a case in which the pitch displacement PDX is not (pitch width FDX (=12A))/3, the change amount of capacitive noise becomes zero.

In a case in which the pitch displacement PDX is different from 6/12 (=6A) of the X-direction repetition pitch of the mesh conductor 1601, in other words, in a case in which the pitch displacement PDX is not (pitch width FDX (=12A))/2, the change amount of capacitive noise becomes zero.

In a case in which there are relay conductors 1602, not only the change amount of capacitive noise becomes zero, but also the absolute value of capacitive noise can be made zero. In a case in which there are no relay conductors 1602, the change amount of capacitive noise becomes zero, but the absolute value of capacitive noise does not become zero.

In addition, a more significant capacitive-noise amelioration effect can be attained in a case in which there are relay conductors 1602 than in a case in which there are no relay conductors 1602.

While the pitch displacement PDX is changed in the positive direction along the X axis until the pitch displacement PDX becomes 6A, which is half of the pitch width FDX (=12A), in the examples explained with reference to FIGS. 167A, 167B, 167C, 167D, 168A, 168B, 168C, 169, and 170 this similarly applies also to the case in which the pitch displacement PDX is changed in the negative direction along the X axis. More specifically, capacitive noise in cases in which the pitch displacement PDX is changed to 1A, 2A, 3A, 4A, 5A, and 6A in the negative direction along the X axis is similar to the theoretical values of the capacitive noise in cases in which the pitch displacement PDX is changed to 1A, 2A, 3A, 4A, 5A, and 6A in the positive direction along the X axis in FIG. 169 and FIG. 170, respectively.

In addition, capacitive noise in cases in which the pitch displacement PDX is changed to 7A, 8A, 9A, 10A, and 11A in the positive direction along the X axis is similar to the theoretical values of the capacitive noise in cases in which the pitch displacement PDX is changed to 5A, 4A, 3A, 2A, and 1A in the negative direction along the X axis in FIG. 169 and FIG. 170, respectively. In other words, capacitive noise in cases in which the pitch displacement PDX is changed to 7A, 8A, 9A, 10A, and 11A in the positive direction along the X axis is similar to the theoretical values of the capacitive noise in cases in which the pitch displacement PDX is changed to 5A, 4A, 3A, 2A, and 1A in the positive direction along the X axis, respectively.

Moreover, capacitive noise in cases in which the pitch displacement PDX is changed to 13A, 14A, 15A, 16A, 17A, and 18A in the positive direction along the X axis is similar to the theoretical values of the capacitive noise in cases in which the pitch displacement PDX is changed to 1A, 2A, 3A, 4A, 5A, and 6A in the positive direction along the X axis in FIG. 169 and FIG. 170. This similarly applies also to the cases of displacement by 13A, 14A, 15A, 16A, 17A, and 18A in the negative direction along the X axis.

According to the conductor layer 1611 above which is the first displacement configuration example of a mesh conductor, by providing the X-direction pitch displacement PDX, the change amount of capacitive noise can be made smaller than in a case in which the pitch displacement PDX is set to zero, that is, in a case in which there is no pitch displacement. Then, in addition, for example, in a case in which the pitch displacement PDX satisfies a predetermined condition such as a case in which the pitch displacement PDX is set to the same value as the X-direction conductor width WDX of the mesh conductor 1601, the change amount of capacitive noise can be made zero.

Furthermore, in a case in which relay conductors 1602 are provided in gap regions of the mesh conductor 1601, the absolute value of capacitive noise can also be made zero in a case in which the change amount of capacitive noise is zero.

In a case in which the following three conditions are satisfied, both the change amount and absolute value of capacitive noise can be made zero, that is, the capacitive noise can be offset completely. Hereinafter, these conditions are referred to as the first to third conditions of complete offsetting.

1. (area size of Vdd conductor in predetermined range)=(area size of Vss conductor in predetermined range)

$$(\text{conductor width } CDX)\times(\text{conductor width } CDY)=\{(\text{conductor width } CDY)+(\text{first gap width } GDY1)+(\text{second gap width } GDY2)\}\times(\text{conductor width } WDX)+\{(\text{conductor width } CDX)+(\text{first gap width } GDX1)+(\text{second gap width } GDX2)\}\times(\text{conductor width } WDY)+(\text{conductor width } WDX)\times(\text{conductor width } WDY)$$

2. (conductor width CDY)×{(minimum number of rows)−{(conductor width WDX)+(first gap width GDX1)+(second gap width GDX2)}/(conductor width WDX)}=(conductor width WDY)×(minimum number of rows)+(conductor width CDY)+(first gap width GDY1)+(second gap width GDY2)

3. (pitch displacement PDX)×(number of offset rows)=(integer N)×{(conductor width WDX)+(first gap width GDX1)+(conductor width CDX)+(second gap width GDX2)}

The first condition of complete offsetting means that the conductor area size of mesh conductor 1601 in a predetermined range, and the conductor area size of relay conductors 1602 in the predetermined range match, but they do not have match in a strict sense, and may be substantially the same. Being substantially the same means that the conductor area sizes are within such a predetermined range (errors) that they can be regarded as being the same. The minimum number of rows in the second condition represents the minimum number of rows of the mesh conductor 1601 that can completely offset capacitive noise in a case in which the pitch displacement PDX equals the conductor width WDX. Although there are some exceptions, there is a condition under which capacitive noise can be offset completely in a case in which the number of rows of the mesh conductor 1601 is an integer multiple of the minimum number of rows. Because the second condition can be modified to "(minimum number of rows)={(first gap width GDY1)+(second gap width GDY2)+(conductor width CDY)+(conductor width CDY)×{(conductor width WDX)+(first gap width GDX1)+(second gap width GDX2)}/(conductor width WDX)}/{(conductor width CDY)−(conductor width WDY)}," the minimum number of rows can be computed, and because the left side of the mathematical formula (minimum number of rows) is an integer value, the right side of the mathematical formula also becomes an integer value. Note that the second condition is a mathematical formula derived on the basis of the fact that capacitive noise can be offset completely in a case in which the sum total of the Y-direction conductor lengths of the mesh conductor 1601 in a predetermined range, and the sum total of the Y-direction conductor lengths of the relay conductors 1602 in the predetermined range match. That is, irrespective of the minimum number of rows, the sum total of the Y-direction conductor lengths of the mesh conductor 1601 in the predetermined range, and the sum total of the Y-direction conductor lengths of the relay conductors 1602 in the predetermined range are desirably the same or substantially the same. The number of offset rows in the third condition represents the number of rows of the mesh conductor 1601 that can completely offset the capacitive noise. The integer N in the third condition represents a condition under which capacitive noise can be offset completely. Although there are some exceptions, the number of offset rows is an integer, and there is a condition under which capacitive noise can be offset completely in a case in which "(pitch displacement PDX)×(number of offset rows)" equals an integer multiple (N times) of "(conductor width WDX)+(first gap width GDX1)+(conductor width CDX)+(second gap width GDX2)," that is, an integer multiple (N times) of the pitch width FDX. In other words, the sum total of the pitch displacement PDX of the number of offset rows ((pitch displacement PDX)×(number of offset rows)), and an integer multiple (N times) of the pitch width FDX are desirably the same or substantially the same. In addition, while there can be some exceptions, there is a condition under which capacitive noise can be offset completely in a case in which the number of offset rows is an integer multiple of the minimum number of rows. In addition, if the number of rows of the mesh conductor 1601 is a number of rows that further equals an integer multiple of the number of offset rows, capacitive noise can be offset completely. Note that while it is considered that at least the first condition needs to be satisfied in order to completely offset capacitive noise, at least part of capacitive noise can be offset also in some cases in a case in which at least one of the second condition or the third condition in the first to third conditions is satisfied, and so only at least some of the first to third conditions may be satisfied. In addition, in that case, the minimum number of rows or the number of offset rows may be interpreted as the number of rows of the mesh conductor 1601.

By providing at least some amount of the pitch displacement PDX, the capacitive-noise amelioration effect can be increased even in a case in which the change amount of capacitive noise is not zero.

Note that while it is assumed that the absolute values of a Vdd applied voltage and a Vss applied voltage are the same in the first displacement configuration example mentioned above, they do not have to be the same necessarily. For example, the Vdd applied voltage may be a positive power supply (+1 V), and the Vss applied voltage may be GND (0 V). Even in a case in which the absolute values of the Vdd applied voltage and the Vss applied voltage are not the same, at least part of capacitive noise is offset by providing the X-direction pitch displacement PDX, and so the capacitive-noise amelioration effect is obtained. In addition, even in a case in which the Vdd applied voltage and the Vss applied voltage are not the same, capacitive noise is offset completely in some cases if, for example, Vdd conductors and Vss conductors have different directions of electric currents (particularly, substantially opposite directions), and capacitive noise generated by a voltage change of a voltage drop (IR-Drop) has reverse polarities between the Vdd conductors and the Vss conductors.

The mesh conductor 1601 having the X-direction pitch displacement PDX is defined with reference to FIG. 171.

The mesh conductor 1601 can be divided into multiple conductors 1651 that are placed in the X direction, and multiple conductors 1652 that are placed in the Y direction between pairs of adjacent conductors 1651.

The mesh conductor 1601 includes a first conductor group 1661 including two or more conductors 1651 that are arranged at the pitch width FDY (first pitch width) in the Y direction (first direction) and have the conductor width WDY (first conductor width), and a second conductor group 1662 including two or more conductors 1652 that are arranged at the pitch width FDX (second pitch width) in the X direction (second direction) orthogonal to the Y direction and have the conductor width WDX (second conductor width).

In addition, the mesh conductor 1601 includes a first shifted body group 1663 including conductors 1652 that are arranged at positions that are shifted in the Y direction by an amount which is 100% of the pitch width FDY, and are shifted in the X direction by an amount which is 100% of the pitch displacement PDX (third pitch width), from the positions of at least some (e.g., all) of two or more conductors 1652 included in the second conductor group 1662. Here, the pitch displacement PDX and the pitch width FDX are different from each other.

Furthermore, in a case in which the mesh conductor 1601 further includes an M-th shifted body group 1663 (M=2, 3, 4, 5, . . . , L (L is an integer which is equal to or larger than two)) including conductors 1652 that are arranged at positions that are shifted in the Y direction by an amount which is M*100% of the pitch width FDY, and are shifted in the X direction by an amount which is M*100% of the pitch displacement PDX (third pitch width), from the positions of at least some (e.g., all) of two or more conductors 1652 included in the second conductor group 1662, the mesh conductor 1601 becomes like the one depicted in FIG. 172.

By giving the mesh conductor 1601 a configuration provided with the pitch displacement PDX different from the pitch width FDX as in FIG. 171 and FIG. 172, the capacitive noise generated to wires (conductors) arranged at positions that are superimposed on at least part of the mesh conductor 1601 as seen in the Z direction orthogonal to the X direction and the Y direction can be reduced, and preferably can be offset completely.

Examples of the wires include signal lines 132, control lines 133 and the like of the solid-state image pickup apparatus 100 as explained with reference to FIG. 164 and FIG. 165, for example.

<Modification Examples of First Displacement Configuration Example of Mesh Conductor>

FIG. 173 to FIG. 181 depict various types of modification example of the first displacement configuration example of a mesh conductor.

Note that it is assumed in FIGS. 173A, 173B, 174A, 174B, 175A, 175B, 176A, 176B, 177A, 177B, 178A, 178B, 179A, 179B, 180A, 180B, 181A and 181B that the pitch displacement PDX is set to 2A, that is, set equal to the conductor width WDX of the mesh conductor 1601. In addition, for simplification, in the explanations of the various types of modification example in FIGS. 173A, 173B, 174A, 174B, 175A, 175B, 176A, 176B, 177A, 177B, 178A, 178B, 179A, 179B, 180A, 180B, 181A and 181B, the first displacement configuration example of a mesh conductor depicted in FIGS. 167A, 167B, 167C, 167D, 168A, 168B, and 168C is referred to as a pitch-displacement basic configuration example, and only differences from the pitch-displacement basic configuration example are explained.

FIG. 173A is a plan view depicting a first modification example of the first displacement configuration example of a mesh conductor.

As compared with the pitch-displacement basic configuration example, the first modification example in FIG. 173A is different in that the arrangement of relay conductors 1602 is shifted leftward in gap regions. While (first gap width GDX1)=(second gap width GDX2) is satisfied in the pitch-displacement basic configuration example, (first gap width GDX1)<(second gap width GDX2) is satisfied in the first modification example.

FIG. 173B is a plan view depicting a second modification example of the first displacement configuration example of a mesh conductor.

As compared with the pitch-displacement basic configuration example, the second modification example in FIG. 173B is different in that the arrangement of relay conductors 1602 is shifted rightward in gap regions. While (first gap width GDX1)=(second gap width GDX2) is satisfied in the pitch-displacement basic configuration example, (first gap width GDX1)>(second gap width GDX2) is satisfied in the second modification example.

FIG. 174A is a plan view depicting a third modification example of the first displacement configuration example of a mesh conductor.

As compared with the pitch-displacement basic configuration example, the third modification example in FIG. 174A is different in that the arrangement of relay conductors 1602 is shifted upward in gap regions. While (first gap width GDY1)=(second gap width GDY2) is satisfied in the pitch-displacement basic configuration example, (first gap width GDY1)<(second gap width GDY2) is satisfied in the third modification example.

FIG. 174B is a plan view depicting a fourth modification example of the first displacement configuration example of a mesh conductor.

As compared with the pitch-displacement basic configuration example, the fourth modification example in FIG. 174B is different in that the arrangement of relay conductors 1602 is shifted downward in gap regions. While (first gap width GDY1)=(second gap width GDY2) is satisfied in the pitch-displacement basic configuration example, (first gap width GDY1)>(second gap width GDY2) is satisfied in the fourth modification example.

FIG. 175A is a plan view depicting a fifth modification example of the first displacement configuration example of a mesh conductor.

As compared with the pitch-displacement basic configuration example, the fifth modification example in FIG. 175A is different in that the arrangement of relay conductors 1602 is modified to an arrangement in which the relay conductors 1602 are shifted upward and downward alternately every other column. The size relations between (first gap width GDY1) and (second gap width GDY2) in the upwardly and downwardly shifted arrangement are similar to those in the third modification example and the fourth modification example.

FIG. 175B is a plan view depicting a sixth modification example of the first displacement configuration example of a mesh conductor.

As compared with the pitch-displacement basic configuration example, the sixth modification example in FIG. 175B is different in that the arrangement of relay conductors 1602 is modified to an arrangement in which the relay conductors 1602 are shifted upward and downward alternately every other row and every other column. The size relations between (first gap width GDY1) and (second gap width GDY2) in the upwardly and downwardly shifted arrangement are similar to those in the third modification example and the fourth modification example.

Note that, although an illustration is omitted, similarly, an arrangement in which relay conductors 1602 are shifted rightward and leftward alternately every other column, and an arrangement in which the relay conductors 1602 are shifted rightward and leftward alternately every other row and every other column also are possible.

FIG. 176A is a plan view depicting a seventh modification example of the first displacement configuration example of a mesh conductor.

As compared with the pitch-displacement basic configuration example, the seventh modification example in FIG. 176A is different in that pairs of rows, each pair of which includes the relay conductors 1602 that are shifted inward, are arranged repetitively in the Y direction. The size relations between (first gap width GDY1) and (second gap width GDY2) in the upwardly and downwardly shifted arrangement are similar to those in the third modification example and the fourth modification example.

FIG. 176B is a plan view depicting an eighth modification example of the first displacement configuration example of a mesh conductor.

As compared with the pitch-displacement basic configuration example, the eighth modification example in FIG. 176B is different in that pairs of rows, each pair of which includes the relay conductors 1602 that are shifted inward and outward every other two columns and every other two rows, are arranged repetitively in the Y direction. The size relations between (first gap width GDY1) and (second gap width GDY2) in the upwardly and downwardly shifted arrangement are similar to those in the third modification example and the fourth modification example.

FIG. 177A is a plan view depicting a ninth modification example of the first displacement configuration example of a mesh conductor.

As compared with the pitch-displacement basic configuration example, the ninth modification example in FIG. 177A is different in that it has a configuration in which each relay conductor 1602 is separated into two evenly in the leftward/rightward direction. The two separated relay conductors 1602 are arranged mirror-symmetrically in the separation direction (X direction).

FIG. 177B is a plan view depicting a tenth modification example of the first displacement configuration example of a mesh conductor.

As compared with the pitch-displacement basic configuration example, the tenth modification example in FIG. 177B is different in that it has a configuration in which each relay conductor 1602 is separated into two in the leftward/rightward direction, and the two separated relay conductors 1602 are arranged mutually differently in the upward/downward direction (Y direction).

FIG. 178A is a plan view depicting an eleventh modification example of the first displacement configuration example of a mesh conductor.

As compared with the pitch-displacement basic configuration example, the eleventh modification example in FIG. 178A is different in that it has a configuration in which each relay conductor 1602 is separated into two unevenly in the leftward/rightward direction. While the left one of the two separated relay conductors 1602 is larger than the right one in the configuration in the eleventh modification example in FIG. 178A, the right one may be larger than the left one in another possible configuration. In addition, each relay conductor may be separated into two unevenly in the upward/downward direction in another possible configuration.

FIG. 178B is a plan view depicting a twelfth modification example of the first displacement configuration example of a mesh conductor.

As compared with the pitch-displacement basic configuration example, the twelfth modification example in FIG. 178B is different in that it has a configuration in which each relay conductor 1602 is divided into two, but are not separated, in the leftward/rightward direction, and the two divided relay conductors 1602 are displaced in the upward/downward direction. While the left one in the two divided left relay conductor and right relay conductor that are displaced in the upward/downward direction is displaced in the upward direction, and the right one is displaced in the downward direction in the configuration in the twelfth modification example in FIG. 178B, the right one may be displaced in the upward direction, and the left one may be displaced in the downward direction in another possible configuration. In addition, relay conductors 1602 may be displaced in the leftward/rightward direction from the center in the upward/downward direction in another possible configuration.

FIG. 179A is a plan view depicting a thirteenth modification example of the first displacement configuration example of a mesh conductor.

As compared with the pitch-displacement basic configuration example, the thirteenth modification example in FIG. 179A is different in that it has a configuration in which each relay conductor 1602 is separated into three evenly in the leftward/rightward direction.

Note that, although an illustration is omitted, besides such a configuration in which each relay conductor 1602 is separated evenly into three in the leftward/rightward direction, configurations similar to those in FIGS. 177A, 177B, 178A, and 178B related to configurations in which each relay conductor 1602 is separated into two also are possible. For example, other possible configurations include a configuration in which each relay conductor 1602 is separated into three evenly in the upward/downward direction; a configuration in which each relay conductor 1602 is separated into three unevenly in the leftward/rightward direction; a configuration in which each relay conductor 1602 is separated into three unevenly in the upward/downward direction; a configuration in which each relay conductor 1602 is separated into three evenly in the leftward/rightward direction, and the separated relay conductors 1602 are displaced in the upward/downward direction; a configuration in which each relay conductor 1602 is separated into three evenly in the upward/downward direction, and the separated relay conductors 1602 are displaced in the leftward/rightward direction; a configuration in which each relay conductor is not separated, but divided into three, and the divided relay conductors 1602 are displaced in the upward/downward direction; a configuration in which each relay conductor is not separated, but divided into three, and the divided relay conductors 1602 are displaced in the leftward/rightward direction; and the like.

FIG. 179B is a plan view depicting a fourteenth modification example of the first displacement configuration example of a mesh conductor.

As compared with the pitch-displacement basic configuration example, the fourteenth modification example in FIG. 179B is different in that it has a configuration in which each relay conductor 1602 is separated into four evenly in the upward/downward and leftward/rightward directions.

Possible configurations of the configuration in which each relay conductor 1602 is separated into four also include a configuration in which each relay conductor 1602 is separated unevenly; a configuration in which four separated relay conductors 1602 are displaced in at least one of the upward/downward direction or the leftward/rightward direction; a configuration in which each relay conductor is not separated, but divided, and the divided relay conductors 1602 are displaced; and the like.

While each relay conductor 1602 is separated into two, three or four in the configuration examples explained with reference to FIGS. 177A, 177B, 178A, 178B, 179A, and 179B, each relay conductor 1602 can be separated into any number of relay conductors such as five or more separated relay conductors. Each relay conductor 1602 is separated into five and nine in examples explained with reference to FIGS. 180A and 180B.

FIG. 180A is a plan view depicting a fifteenth modification example of the first displacement configuration example of a mesh conductor.

As compared with the pitch-displacement basic configuration example, the fifteenth modification example in FIG. 180A is different in that it has a configuration in which each relay conductor 1602 is separated into five. While the one middle region in the five separated regions is large in the example in FIG. 180A, such a size relation and arrangement relation among the five regions are examples, and these are not the sole examples.

FIG. 180B is a plan view depicting a sixteenth modification example of the first displacement configuration example of a mesh conductor.

As compared with the pitch-displacement basic configuration example, the sixteenth modification example in FIG. 180B is different in that it has a configuration in which each relay conductor 1602 is separated into nine. While the one middle region in the nine separated regions is large in the example in FIG. 180B, such a size relation and arrangement relation among the nine regions also are examples, and these are not the sole examples.

FIG. 181A is a plan view depicting a seventeenth modification example of the first displacement configuration example of a mesh conductor.

As compared with the pitch-displacement basic configuration example, the seventeenth modification example in FIG. 181A is different in that it has a configuration in which each relay conductor 1602 has one or more gaps (holes) therein. The number, positions and shapes of the gaps are not limited to those in this example.

FIG. 181B is a plan view depicting an eighteenth modification example of the first displacement configuration example of a mesh conductor.

As compared with the pitch-displacement basic configuration example, the eighteenth modification example in FIG. 181B is different in that it has a configuration in which each relay conductor 1602 includes an outer conductor surrounding an inner conductor. The number, positions and shapes of the conductors are not limited to those in this example.

As explained with reference to FIGS. 173A, 173B, 174A, 174B, 175A, 175B, 176A, 176B, 177A, 177B, 178A, 178B, 179A, 179B, 180A, 180B, 181A and 181B, relay conductors 1602 need not be arranged at the middles of gap regions of the mesh conductor 1601. Relay conductors 1602 may be arranged in an imbalanced manner in the X direction or the Y direction, for example, and multiple relay conductors 1602 may be arranged. In addition, relay conductors 1602 may be asymmetric in the X direction or the Y direction, may be symmetric in the X direction or the Y direction, and may be rotation-symmetric. Note that, regarding theoretical values of capacitive noise in each of the modification examples in FIGS. 173A, 173B, 174A, 174B, 175A, 175B, 176A, 176B, 177A, 177B, 178A, 178B, 179A, 179B, 180A, 180B, 181A and 181B, the change amount of capacitive noise is zero, and the absolute value of capacitive noise is zero, similarly to the case in which the pitch displacement PDX is 2A in the first displacement configuration example.

Note that no matter what type of shape relay conductors 1602 have or no matter how the relay conductors 1602 are arranged, the relay conductors 1602 are formed such that at least the first condition of complete offsetting mentioned above is satisfied.

In the first modification example to the eighteenth modification example depicted in FIGS. 173A, 173B, 174A, 174B, 175A, 175B, 176A, 176B, 177A, 177B, 178A, 178B, 179A, 179B, 180A, 180B, 181A and 181B, for example, the degree of freedom of designing, the degree of freedom of arrangement of other conductors, or some elements or objects inside gap regions are enhanced.

In addition, relay conductors 1602 may not be conductors to electrically connect another conductor layer and still another conductor layer, but may be non-mesh conductors which are conductors to not electrically connect another conductor layer and still another conductor layer. It should be noted however that relay conductors 1602 are desirably not non-mesh bodies to not electrically connect other conductor layers, but conductors to electrically relay other conductor layers. In a case in which they are relay conductors 1602, the degree of freedom of wiring layout for leading in a power supply is enhanced. In addition, voltage drops can be ameliorated further, depending on the arrangement of active elements such as MOS transistors or diodes. Furthermore, the presence of relay conductors 1602 ameliorates inductive noise, and the arrangement of the multiple relay conductors 1602 (separated arrangement, divided arrangement) further ameliorates the inductive noise, in some cases.

<Second Displacement Configuration Example of Mesh Conductor>

FIG. 182 is a plan view depicting a second displacement configuration example of a mesh conductor.

The second displacement configuration example of a mesh conductor depicts that the change amount of capacitive noise can be made zero even in a case in which some of the dimensions of the mesh conductor or relay conductors are modified.

A conductor layer 1711 in FIG. 182 includes a mesh conductor 1701 and relay conductors 1702.

The conductor layer 1711 in FIG. 182 has the dimensions of the Y-direction conductor width CDY, first gap width GDY1 and second gap width GDY2 of the relay conductors 1702 which are modified to have different values from those in the first displacement configuration example mentioned above.

Specifically, as depicted in FIG. 166, assuming that ½ of the X-direction conductor width WDX, and Y-direction conductor width WDY of the mesh conductor 1601 is the real number A, in the first displacement configuration example mentioned above, the Y-direction conductor width CDY of the relay conductors 1702 is set to 7A, and the first gap width GDY1 and the second gap width GDY2 are set to 1A.

In contrast, in the second displacement configuration example in FIG. 182, the Y-direction conductor width CDY of the relay conductors 1702 is set to 8A, and the first gap width GDY1 and the second gap width GDY2 are set to 2A.

In other words, while the Y-direction gap width GDY of the mesh conductor 1601 is 9A in the first displacement configuration example mentioned above, the gap width GDY is increased to 12A in the second displacement configuration example.

In the second displacement configuration example, the dimensions of other conductor widths and gap widths are similar to those in the first displacement configuration example. In the second displacement configuration example also, at least the first condition of complete offsetting mentioned above is satisfied.

FIG. 183 is a graph depicting theoretical values of capacitive noise of the conductor layer 1711 with the pitch displacement PDX set to various values in the second displacement configuration example, similarly to the first displacement configuration example.

Because the horizontal axis and vertical axis in the graph in FIG. 183 are similar to those in FIG. 169, explanations thereof are omitted. Note that the graph in FIG. 183 also is depicted at the same scale as that of the graph in FIG. 169.

As depicted in FIG. 183, in the second displacement configuration example also, in a case in which the pitch displacement PDX is set to predetermined values, the change amount of capacitive noise becomes zero, and the absolute value of capacitive noise becomes zero. More specifically, in a case in which the pitch displacement PDX is set to 1/12, 2/12 or 5/12 of the X-direction repetition pitch, the change amount of capacitive noise becomes zero, and the absolute value of capacitive noise becomes zero.

In the case of the other values of the pitch displacement PDX, specifically, in a case in which the pitch displacement PDX is set to 3/12, 4/12 or 6/12 of the X-direction repetition pitch, the change amount and absolute value of capacitive noise do not become zero, but the change amount of capacitive noise can be made smaller than in a case in which the pitch displacement PDX is set to zero, that is, there is no pitch displacement.

In the second displacement configuration example in which the Y-direction dimension is increased, the capacitive noise in the case in which is represented by a broken line FIG. 183, and in which the pitch displacement PDX is set to zero, that is, there is no pitch displacement, worsens as compared with capacitive noise in a case in which there is no pitch displacement in the first displacement configuration example. It can be known from this that setting the pitch displacement PDX increases the amelioration effect.

FIG. 184 is a graph depicting theoretical values of capacitive noise in a case in which there are no relay conductors 1702 in the second displacement configuration example.

Because the horizontal axis and vertical axis in the graph in FIG. 184 are similar to those in FIG. 169, explanations thereof are omitted. Note that the graph in FIG. 184 also is depicted at the same scale as that of the graph in FIG. 169.

While the absolute value of capacitive noise does not become zero in a case in which there are no relay conductors 1602 as depicted in FIG. 184, the change amount of capacitive noise becomes zero in a case in which the pitch displacement PDX is set to predetermined values. The displacement amounts that make the change amount of capacitive noise zero are the same as those in a case in which there are relay conductors 1602. That is, in a case in which the pitch displacement PDX is set to 1/12, 2/12 or 5/12 of the X-direction repetition pitch, the change amount of capacitive noise becomes zero.

According to the graphs in FIG. 183 and FIG. 184, a condition under which the change amount of capacitive noise becomes zero in the second displacement configuration example is similar to that in the first displacement configuration example.

That is, the pitch displacement PDX is set to a value that is different from the X-direction pitch width FDX (=12A) of the mesh conductor 1701.

In a case in which the pitch displacement PDX is 2A, that is, in a case in which the pitch displacement PDX is the same as the X-direction conductor width WDX of the mesh conductor 1701, the change amount of capacitive noise becomes zero. In addition, in a case in which the pitch displacement PDX is 1A, and in a case in which the pitch displacement PDX is 5A also, the change amount of capacitive noise becomes zero.

In a case in which the pitch displacement PDX is 1A or 5A, the change amount of capacitive noise becomes zero in a set of twelve rows. In contrast, in a case in which the pitch displacement PDX is 2A, the change amount of capacitive noise becomes zero in a set of six rows. In a case in which the pitch displacement PDX is equal to the conductor width WDX of the mesh conductor 1701, the change amount of capacitive noise can be made zero with a smaller number of rows, and so the degree of freedom of wiring layout can be increased.

In a case in which the pitch displacement PDX is different from 3/12 (=3A) of the X-direction repetition pitch of the mesh conductor 1701, in other words, in a case in which the pitch displacement PDX is not (pitch width FDX (=12A))/4, the change amount of capacitive noise becomes zero.

In a case in which the pitch displacement PDX is different from 4/12 (=4A) of the X-direction repetition pitch of the mesh conductor 1701, in other words, in a case in which the pitch displacement PDX is not (pitch width FDX (=12A))/3, the change amount of capacitive noise becomes zero.

In a case in which the pitch displacement PDX is different from 6/12 (=6A) of the X-direction repetition pitch of the mesh conductor 1701, in other words, in a case in which the pitch displacement PDX is not (pitch width FDX (=12A))/2, the change amount of capacitive noise becomes zero.

In a case in which there are relay conductors 1702, not only the change amount of capacitive noise becomes zero, but also the absolute value of capacitive noise can be made zero. In a case in which there are no relay conductors 1702, the change amount of capacitive noise becomes zero, but the absolute value of capacitive noise does not become zero.

In addition, a more significant capacitive-noise amelioration effect can be attained in a case in which there are relay conductors 1702 than in a case in which there are no relay conductors 1702.

<Third Displacement Configuration Example of Mesh Conductor>

In the first and second displacement configuration examples mentioned above, the condition of the pitch displacement PDX under which the change amount of capacitive noise becomes zero is the same for a case in which there are relay conductors, and for a case in which there are no relay conductors.

Next, an example in which the condition of the pitch displacement PDX under which the change amount of capacitive noise becomes zero is different between a case in which there are relay conductors and a case in which there are no relay conductors is depicted as a third displacement configuration example.

FIG. 185 is a plan view for explaining conductor widths and gap widths of a conductor layer as the third displacement configuration example of a mesh conductor.

A conductor layer 1731 in FIG. 185 includes a mesh conductor 1721 and relay conductors 1722.

Assuming that A is a real number, the mesh conductor 1721 has the conductor width WDX set to 3A and the conductor width WDY set to 1A. Gap regions of the mesh conductor 1721 are formed to have the gap width GDX set to 6A and the gap width GDY set to 17A.

Each relay conductor 1722 arranged in a gap region of the mesh conductor 1721 is a rectangle with the conductor width CDX set to 4A and the conductor width CDY set to 15A. The rectangle is a longitudinally long oblong rectangle with the Y-direction conductor width CDY larger than the X-direction conductor width CDX (CDY>CDX). Both the X-direction first gap width GDX1 and second gap width GDX2 between the mesh conductor 1721 and each relay conductor 1722 are set to 1A. In addition, both the Y-direction first gap width GDY1 and second gap width GDY2 are set to 1A.

Accordingly, if represented by using the real number A, the pitch width FDX (=(conductor width WDX)+(gap width GDX)) corresponds to 9A, and the pitch width FDY (=(conductor width WDY)+(gap width GDY)) corresponds to 18A. In the third displacement configuration example, the real number A is equal to 1/3 of the X-direction conductor width WDX of the mesh conductor 1721.

In the third displacement configuration example also, at least the first condition of complete offsetting mentioned above is satisfied.

FIGS. 186A, 186B, 186C, 187A and, 187B are plan views in which the pitch displacement PDX is set to various values in the conductor layer 1731 as the third displacement configuration example of a mesh conductor.

FIG. 186A is a plan view of the conductor layer 1731 with the pitch displacement PDX set to zero.

FIG. 186B is a plan view of the conductor layer 1731 with the X-direction pitch displacement PDX set to 1A, that is, 1/9 of the X-direction repetition pitch (pitch width FDX).

FIG. 186C is a plan view of the conductor layer 1731 with the pitch displacement PDX set to 2A, that is, 2/9 of the X-direction repetition pitch (pitch width FDX).

FIG. 187A is a plan view of the conductor layer 1731 with the pitch displacement PDX set to 3A, that is, 3/9 of the X-direction repetition pitch (pitch width FDX).

FIG. 187B is a plan view of the conductor layer 1731 with the pitch displacement PDX set to 4A, that is, 4/9 of the X-direction repetition pitch (pitch width FDX).

FIG. 188 is a graph depicting theoretical values of capacitive noise of the conductor layer 1731 with the pitch displacement PDX set to various values as in FIGS. 186A, 186B, 186C, 187A and, 187B.

Because the horizontal axis and vertical axis in the graph in FIG. 188 are similar to those in FIG. 169, explanations thereof are omitted. Note that the graph in FIG. 188 also is depicted at the same scale as that of the graph in FIG. 169. It is assumed that conditions of a Vdd applied voltage and a Vss applied voltage also are similar.

As depicted in FIG. 188, in a case in which the pitch displacement PDX is set to predetermined values, the change amount of capacitive noise becomes zero, and the absolute value of capacitive noise becomes zero. More specifically, in a case in which the pitch displacement PDX is set to 1/9, 2/9 or 4/9 of the X-direction repetition pitch, the change amount of capacitive noise becomes zero, and the absolute value of capacitive noise becomes zero. In a case in which the pitch displacement PDX is set to 1/9 (=1A), 2/9 (=2A) or 4/9 (=4A) of the X-direction repetition pitch, the change amount of capacitive noise becomes zero in a set of nine rows.

In the case of the other value of the pitch displacement PDX, specifically, in a case in which the pitch displacement PDX is set to 3/9 of the X-direction repetition pitch, the change amount and absolute value of capacitive noise do not become zero, but the change amount of capacitive noise can be made smaller than in a case in which the pitch displacement PDX is set to zero, that is, there is no pitch displacement.

According to what is mentioned above, in the third displacement configuration example including relay conductors 1722, the change amount of capacitive noise can be made zero in the case of the following condition.

First, as a premise, the pitch displacement PDX is set to a value that is different from the X-direction pitch width FDX (=9A) of the mesh conductor 1721.

In a case in which the pitch displacement PDX is 1A, 2A or 4A, the change amount of capacitive noise becomes zero in a set of nine rows. In addition, in a case in which the pitch displacement PDX is different from 3/9 (=3A) of the X-direction repetition pitch of the mesh conductor 1721, in other words, in a case in which the pitch displacement PDX is not (pitch width FDX (=9A))/3, the change amount of capacitive noise becomes zero.

FIG. 189 is a graph depicting theoretical values of capacitive noise in a case in which the pitch displacement PDX is set to various values in the conductor layer 1731 from which relay conductors 1722 are omitted. Although an illustration of the conductor layer 1731 from which relay conductors 1722 are omitted is omitted, the conductor layer 1731 corresponds to one from which relay conductors 1722 are removed from each conductor layer 1731 in FIGS. 186A, 186B, 186C, 187A and, 187B.

While the absolute value of capacitive noise does not become zero in a case in which there are no relay conductors 1722 as depicted in FIG. 189, the change amount of capacitive noise becomes zero in a case in which the pitch displacement PDX is set to predetermined values. The displacement amounts that make the change amount of capacitive noise zero are different from those in a case in which there are relay conductors 1722. Specifically, in a case in which the pitch displacement PDX is set to 1/9, 2/9, 3/9, or 4/9 of the X-direction repetition pitch, the change amount of capacitive noise becomes zero. In a case in which the pitch displacement PDX is set to 1/9 (=1A), 2/9 (=2A), or 4/9 (=4A) of the X-direction repetition pitch, the change amount of capacitive noise becomes zero in a set of nine rows. In a case in which the pitch displacement PDX is set to 3/9 (=3A) of the X-direction repetition pitch, the change amount of capacitive noise becomes zero in a set of three rows.

According to what is mentioned above, in the third displacement configuration example not including relay conductors 1722, the change amount of capacitive noise can be made zero in the case of the following condition.

First, as a premise, the pitch displacement PDX is set to a value that is different from the X-direction pitch width FDX (=9A) of the mesh conductor 1721.

In a case in which the pitch displacement PDX is 1A, 2A or 4A, the change amount of capacitive noise becomes zero in a set of nine rows. In addition, in a case in which the pitch displacement PDX is the same as 3/9 (=3A) of the X-direction repetition pitch of the mesh conductor 1721, the change amount of capacitive noise becomes zero in a set of three rows.

Accordingly, in a case in which the pitch displacement PDX is set to be the same as (conductor width WDX)=3A of the mesh conductor 1721 in the third displacement configuration example, the change amount of capacitive noise does not become zero in a case in which there are relay conductors 1722, but the change amount of capacitive noise becomes zero in a case in which there are no relay conductors 1722. That is, in the third displacement configuration example, the condition of the pitch displacement PDX under which the change amount of capacitive noise becomes zero is different between a case in which there are relay conductors 1722 and a case in which there are no relay conductors 1722.

In a case in which, regarding the mesh conductor 1721, an integer multiple of the conductor width WDX, and the pitch width FDX match, and the pitch displacement PDX, and the conductor width WDX match due to the shape relation between the conductor section and gap regions of the mesh conductor 1721, capacitive noise is dispersed evenly, and so the change amount of capacitive noise can be made zero when there are no relay conductors 1722.

<Fourth Displacement Configuration Example of Mesh Conductor>

Relay conductors have longitudinally long shapes which are longer in the Y direction than in the X direction in the examples explained in the first to third displacement configuration examples mentioned above.

Relay conductors have laterally long shapes which are shorter in the Y direction than in the X direction in an example depicted next as a fourth displacement configuration example.

FIG. 190 is a plan view for explaining conductor widths and gap widths of a conductor layer as the fourth displacement configuration example of a mesh conductor.

A conductor layer 1771 in FIG. 190 includes a mesh conductor 1761 and relay conductors 1762.

Assuming that A is a real number, the mesh conductor 1761 has the conductor width WDX set to 2A and the conductor width WDY set to 2A. Gap regions of the mesh conductor 1761 are formed to have the gap width GDX set to 12A and the gap width GDY set to 10A.

Each relay conductor 1762 arranged in a gap region of the mesh conductor 1761 is a rectangle with the conductor width CDX set to 8A and the conductor width CDY set to 6A. The rectangle is a laterally long oblong rectangle with the X-direction conductor width CDX larger than the Y-direction conductor width CDY (CDX>CDY). Both the X-direction first gap width GDX1 and second gap width GDX2 between the mesh conductor 1761 and each relay conductor 1762 are set to 2A. In addition, both the Y-direction first gap width GDY1 and second gap width GDY2 are set to 2A.

Accordingly, if represented by using the real number A, the pitch width FDX (=(conductor width WDX)+(gap width GDX)) corresponds to 14A, and the pitch width FDY (=(conductor width WDY)+(gap width GDY)) corresponds to 12A. In the fourth displacement configuration example, the real number A is equal to ½ of the X-direction conductor width WDX of the mesh conductor 1761.

In the fourth displacement configuration example also, at least the first condition of complete offsetting mentioned above is satisfied.

FIGS. 191A, 191B, 191C, 191D, 192A, 192B, 192C, and 192D are plan views in which the pitch displacement PDX is set to various values in the conductor layer 1771 as the fourth displacement configuration example of a mesh conductor.

Figure 191A:
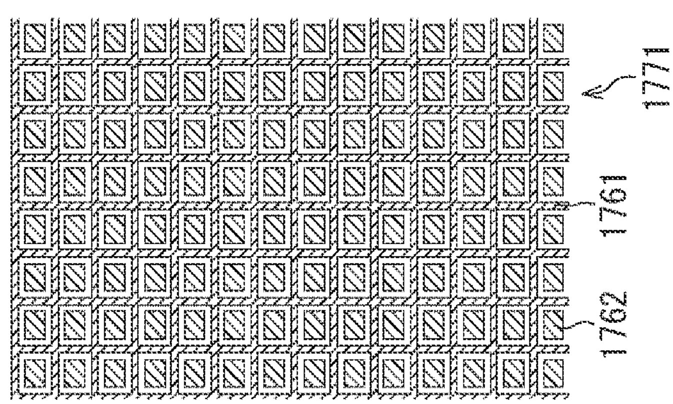

FIG. 191A is a plan view of the conductor layer 1771 with the pitch displacement PDX set to zero.

Figure 191B:
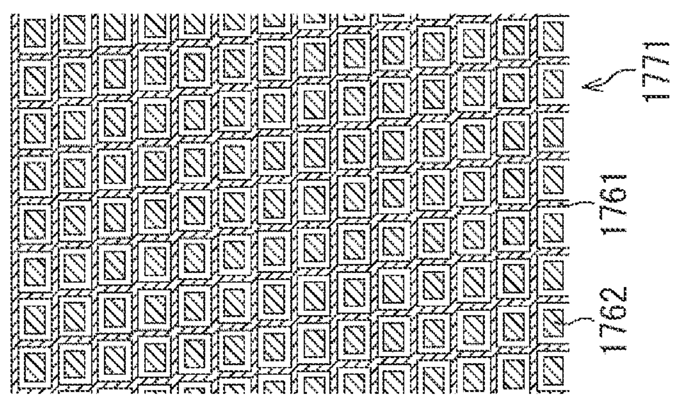

FIG. 191B is a plan view of the conductor layer 1771 with the X-direction pitch displacement PDX set to 1A, that is, 1/14 of the X-direction repetition pitch (pitch width FDX).

Figure 191C:
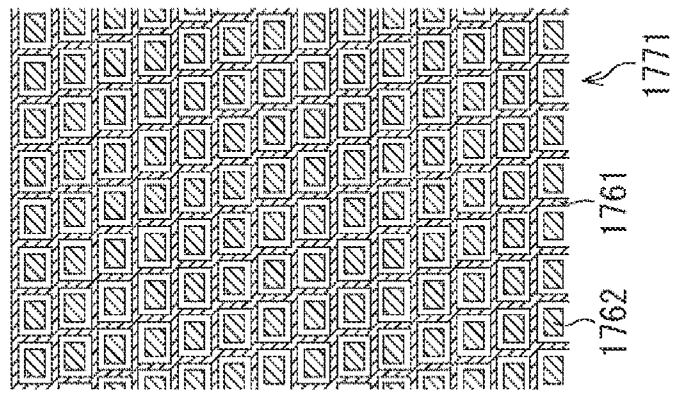

FIG. 191C is a plan view of the conductor layer 1771 with the pitch displacement PDX set to 2A, that is, 2/14 of the X-direction repetition pitch (pitch width FDX).

Figure 191D:
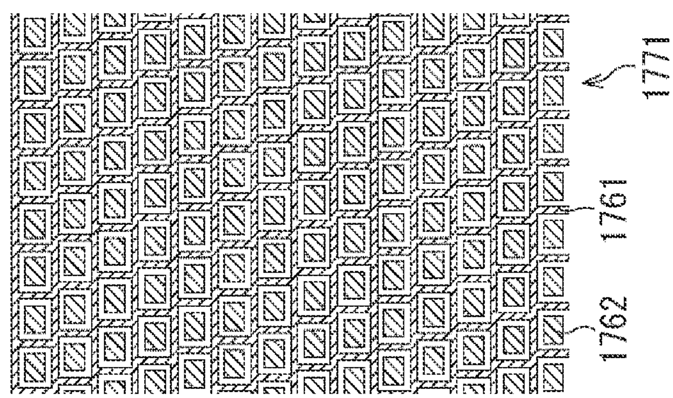
Figure 191D:
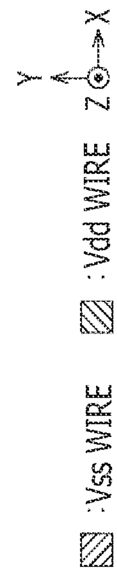

FIG. 191D is a plan view of the conductor layer 1771 with the pitch displacement PDX set to 3A, that is, 3/14 of the X-direction repetition pitch (pitch width FDX).

Figure 192A:
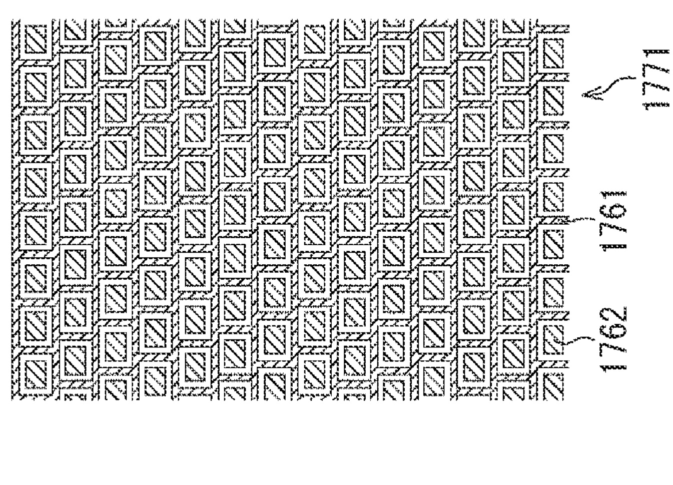

FIG. 192A is a plan view of the conductor layer 1771 with the pitch displacement PDX set to 4A, that is, 4/14 of the X-direction repetition pitch (pitch width FDX).

Figure 192B:
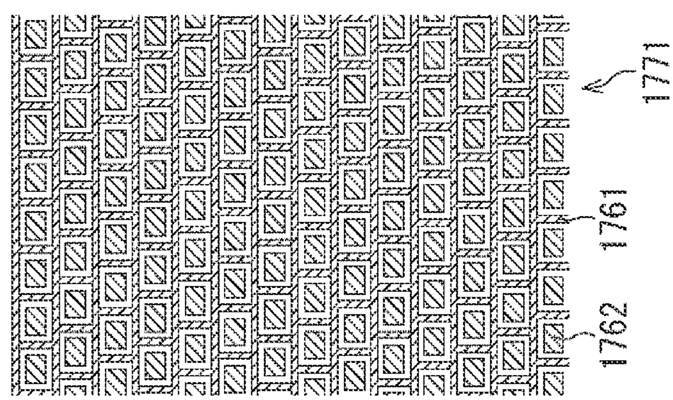

FIG. 192B is a plan view of the conductor layer 1771 with the pitch displacement PDX set to 5A, that is, 5/14 of the X-direction repetition pitch (pitch width FDX).

Figure 192C:
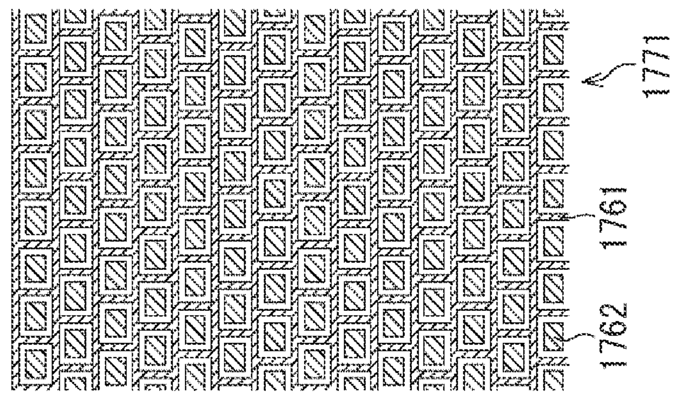

FIG. 192C is a plan view of the conductor layer 1771 with the pitch displacement PDX set to 6A, that is, 6/14 of the X-direction repetition pitch (pitch width FDX).

Figure 192D:
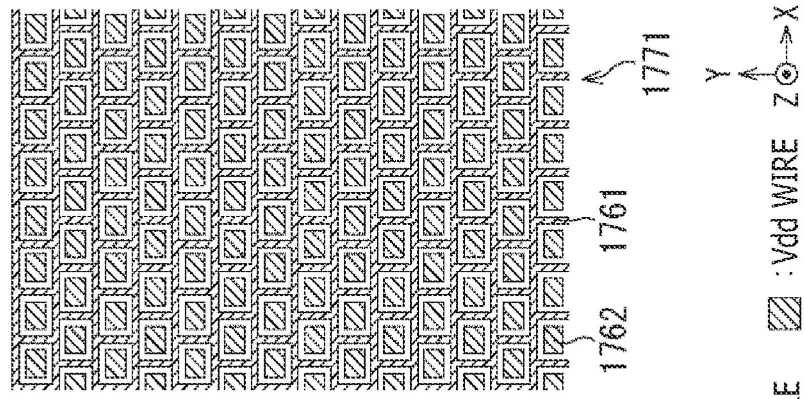

FIG. 192D is a plan view of the conductor layer 1771 with the pitch displacement PDX set to 7A, that is, 7/14 of the X-direction repetition pitch (pitch width FDX).

FIG. 193 is a graph depicting theoretical values of capacitive noise of the conductor layer 1771 with the pitch displacement PDX set to various values as in FIGS. 191A, 191B, 191C, 191D, 192A, 192B, 192C, and 192D.

Because the horizontal axis and vertical axis in the graph in FIG. 193 are similar to those in FIG. 169, explanations thereof are omitted. Note that the graph in FIG. 169 also is depicted at the same scale as that of the graph in FIG. 193. It is assumed that conditions of a Vdd applied voltage and a Vss applied voltage also are similar.

As depicted in FIG. 193, in a case in which the pitch displacement PDX is set to predetermined values, the change amount of capacitive noise becomes zero, and the absolute value of capacitive noise becomes zero. More specifically, in a case in which the pitch displacement PDX is set to 1/14, 2/14, 3/14, 4/14, 5/14, or 6/14 of the X-direction repetition pitch, the change amount of capacitive noise becomes zero, and the absolute value of capacitive noise becomes zero.

In a case in which the pitch displacement PDX is set to 1/14 (=1A), 3/14 (=3A), or 5/14 (=5A) of the X-direction repetition pitch, the change amount of capacitive noise becomes zero and becomes the absolute value of capacitive noise in a set of fourteen rows.

In a case in which the pitch displacement PDX is set to 2/14 (=2A), 4/14 (=4A), or 6/14 (=6A) of the X-direction repetition pitch, the change amount of capacitive noise becomes zero and becomes the absolute value of capacitive noise in a set of seven rows. This means that, in addition to a case in which the pitch displacement PDX is equal to the conductor width WDX of the mesh conductor 1721, in a case in which the pitch displacement PDX is equal to an integer multiple of the conductor width WDX also, the change amount of capacitive noise becomes zero and becomes the absolute value of capacitive noise with a small number of rows. In a case in which an integer multiple of the conductor width WDX does not match (pitch width FDX (=14A))/3, and (pitch width FDX (=14A))/4, in a case in which the pitch displacement PDX is equal to an integer multiple of the conductor width WDX also, the change amount of capacitive noise becomes zero and becomes the absolute value of capacitive noise with a small number of rows.

In the case of the other value of the pitch displacement PDX, specifically, in a case in which the pitch displacement PDX is set to 7/14 of the X-direction repetition pitch, the change amount and absolute value of capacitive noise do not become zero, but the change amount of capacitive noise can be made smaller than in a case in which the pitch displacement PDX is set to zero, that is, there is no pitch displacement.

According to what is mentioned above, in the fourth displacement configuration example including relay conductors 1762, the change amount of capacitive noise can be made zero in the case of the following condition.

First, as a premise, the pitch displacement PDX is set to a value that is different from the X-direction pitch width FDX (=14A) of the mesh conductor 1761.

In a case in which the pitch displacement PDX is 2A, that is, in a case in which the pitch displacement PDX is the same as the X-direction conductor width WDX of the mesh conductor 1761, the change amount and absolute value of capacitive noise become zero. In addition, in a case in which the pitch displacement PDX is 1A, 3A, 4A, 5A, or 6A also, the change amount and absolute value of capacitive noise become zero.

Putting it in the other way around, in a case in which the pitch displacement PDX is different from 7/14 (=7A) of the X-direction repetition pitch of the mesh conductor 1761, in other words, in a case in which the pitch displacement PDX is not (pitch width FDX (=14A))/2, the change amount and absolute value of capacitive noise become zero.

FIG. 194 is a graph depicting theoretical values of capacitive noise in a case in which the pitch displacement PDX is set to various values in the conductor layer 1771 from which relay conductors 1762 are omitted. Although an illustration of the conductor layer 1771 from which relay conductors 1762 are omitted is omitted, the conductor layer 1771 corresponds to one from which relay conductors 1762 are removed from each conductor layer 1771 in FIGS. 191A, 191B, 191C, 191D, 192A, 192B, 192C, and 192D.

As depicted in FIG. 194, in a case in which there are no relay conductors 1762 also, the displacement amounts that make the change amount of capacitive noise zero are the same as those in a case in which there are relay conductors 1762. It should be noted however that the absolute value of capacitive noise does not become zero.

According to what is mentioned above, in the fourth displacement configuration example not including relay conductors 1762, the change amount of capacitive noise can be made zero in the case of the following condition.

First, as a premise, the pitch displacement PDX is set to a value that is different from the X-direction pitch width FDX (=14A) of the mesh conductor 1761.

In a case in which the pitch displacement PDX is 2A, that is, in a case in which the pitch displacement PDX is the same as the X-direction conductor width WDX of the mesh conductor 1761, the change amount of capacitive noise becomes zero. In addition, in a case in which the pitch displacement PDX is 1A, 3A, 4A, 5A, or 6A also, the change amount of capacitive noise becomes zero.

Putting it in the other way around, in a case in which the pitch displacement PDX is different from 7⁄14 (=7A) of the X-direction repetition pitch of the mesh conductor 1761, in other words, in a case in which the pitch displacement PDX is not (pitch width FDX (=14A))/2, the change amount of capacitive noise becomes zero.

<Fifth Displacement Configuration Example of Mesh Conductor>

The X-direction conductor width WDX of the mesh conductor is large in an example depicted next as a fifth displacement configuration example.

FIG. 195 is a plan view for explaining conductor widths and gap widths of a conductor layer as the fifth displacement configuration example of a mesh conductor.

A conductor layer 1791 in FIG. 195 includes a mesh conductor 1781 and relay conductors 1782.

Assuming that A is a real number, the mesh conductor 1781 has the conductor width WDX set to 4A and the conductor width WDY set to 2A. Gap regions of the mesh conductor 1781 are formed to have the gap width GDX set to 12A and the gap width GDY set to 16A.

Each relay conductor 1782 arranged in a gap region of the mesh conductor 1781 is a rectangle with the conductor width CDX set to 8A and the conductor width CDY set to 12A. The rectangle is a longitudinally long oblong rectangle with the Y-direction conductor width CDY larger than the X-direction conductor width CDX (CDY>CDX). Both the X-direction first gap width GDX1 and second gap width GDX2 between the mesh conductor 1781 and each relay conductor 1782 are set to 2A. In addition, both the Y-direction first gap width GDY1 and second gap width GDY2 are set to 2A.

Accordingly, if represented by using the real number A, the pitch width FDX (=(conductor width WDX)+(gap width GDX)) corresponds to 16A, and the pitch width FDY (=(conductor width WDY)+(gap width GDY)) corresponds to 18A. In the fifth displacement configuration example, the real number A is equal to ¼ of the X-direction conductor width WDX of the mesh conductor 1781.

In the fifth displacement configuration example also, at least the first condition of complete offsetting mentioned above is satisfied.

FIGS. 196A, 196B, 196C, 197A, 197B, 197C, 198A, 198B, and 198C are plan views in which the pitch displacement PDX is set to various values in the conductor layer 1791 as the fifth displacement configuration example of a mesh conductor.

FIG. 196C is a plan view of the conductor layer 1791 with the pitch displacement PDX set to zero.

FIG. 196B is a plan view of the conductor layer 1791 with the X-direction pitch displacement PDX set to 1A, that is, 1⁄16 of the X-direction repetition pitch (pitch width FDX).

FIG. 196C is a plan view of the conductor layer 1791 with the pitch displacement PDX set to 2A, that is, 2⁄16 of the X-direction repetition pitch (pitch width FDX).

FIG. 197A is a plan view of the conductor layer 1791 with the pitch displacement PDX set to 3A, that is, 3⁄16 of the X-direction repetition pitch (pitch width FDX).

FIG. 197B is a plan view of the conductor layer 1791 with the pitch displacement PDX set to 4A, that is, 4⁄16 of the X-direction repetition pitch (pitch width FDX).

FIG. 197C is a plan view of the conductor layer 1791 with the pitch displacement PDX set to 5A, that is, 5⁄16 of the X-direction repetition pitch (pitch width FDX).

FIG. 198A is a plan view of the conductor layer 1791 with the pitch displacement PDX set to 6A, that is, 6⁄16 of the X-direction repetition pitch (pitch width FDX).

FIG. 198B is a plan view of the conductor layer 1791 with the pitch displacement PDX set to 7A, that is, 7⁄16 of the X-direction repetition pitch (pitch width FDX).

FIG. 198C is a plan view of the conductor layer 1791 with the pitch displacement PDX set to 8A, that is, 8⁄16 of the X-direction repetition pitch (pitch width FDX).

FIG. 199 is a graph depicting theoretical values of capacitive noise of the conductor layer 1771 with the pitch displacement PDX set to various values as in FIGS. 196A, 196B, 196C, 197A, 197B, 197C, 198A, 198B, and 198C.

Because the horizontal axis and vertical axis in the graph in FIG. 199 are similar to those in FIG. 169, explanations thereof are omitted. Note that the graph in FIG. 199 also is depicted at the same scale as that of the graph in FIG. 169. It is assumed that conditions of a Vdd applied voltage and a Vss applied voltage also are similar.

As depicted in FIG. 199, in a case in which the pitch displacement PDX is set to predetermined values, the change amount of capacitive noise becomes zero, and the absolute value of capacitive noise becomes zero. More specifically, in a case in which the pitch displacement PDX is set to 1⁄16 (=1A), 2⁄16 (=2A), 3⁄16 (=3A), 4⁄16 (=4A), 5⁄16 (=5A), 6⁄16 (=6A), or 7⁄16 (=7A) of the X-direction repetition pitch, the change amount of capacitive noise becomes zero, and the absolute value of capacitive noise becomes zero.

Putting it in the other way around, in a case in which the pitch displacement PDX is different from 8⁄16 (=8A) of the X-direction repetition pitch of the mesh conductor 1781, in other words, in a case in which the pitch displacement PDX is not (pitch width FDX (=16A))/2, the change amount and absolute value of capacitive noise become zero.

In a case in which the pitch displacement PDX is set to 1⁄16 (=1A), 3⁄16 (=3A), 5⁄16 (=5A), or 7⁄16 (=7A) of the X-direction repetition pitch, the change amount of capacitive noise becomes zero and becomes the absolute value of capacitive noise in a set of sixteen rows.

In a case in which the pitch displacement PDX is set to 2⁄16 (=2A) or 6⁄16 (=6A) of the X-direction repetition pitch, the change amount of capacitive noise becomes zero and becomes the absolute value of capacitive noise in a set of eight rows.

In a case in which the pitch displacement PDX is set to 4⁄16 (=4A) of the X-direction repetition pitch, the change amount of capacitive noise becomes zero and becomes the absolute value of capacitive noise in a set of four rows.

In the case of the other value of the pitch displacement PDX, specifically, in a case in which the pitch displacement PDX is set to 8/16 of the X-direction repetition pitch, the change amount and absolute value of capacitive noise do not become zero, but the change amount of capacitive noise can be made smaller than in a case in which the pitch displacement PDX is set to zero, that is, there is no pitch displacement.

According to what is mentioned above, in the fifth displacement configuration example including relay conductors 1762, the change amount of capacitive noise can be made zero in the case of the following condition.

First, as a premise, the pitch displacement PDX is set to a value that is different from the X-direction pitch width FDX (=16A) of the mesh conductor 1781.

In a case in which the pitch displacement PDX is 4A, that is, in a case in which the pitch displacement PDX is the same as the X-direction conductor width WDX of the mesh conductor 1781, the change amount and absolute value of capacitive noise become zero.

In addition, in a case in which the pitch displacement PDX is 2A or 6A also, the change amount and absolute value of capacitive noise become zero. In a case in which the pitch displacement PDX is set to 2A, the pitch displacement PDX is equal to 100% of half of the conductor width WDX. In a case in which the pitch displacement PDX is set to 6A, the pitch displacement PDX is equal to 300% of half of the conductor width WDX. Moreover, in a case in which the pitch displacement PDX is set to 4A, the pitch displacement PDX is equal to 200% of half of the conductor width WDX.

In a case in which the X-direction conductor width WDX of the mesh conductor is set narrow as in the fourth displacement configuration example mentioned above, the change amount of capacitive noise becomes zero, and the absolute value of capacitive noise in a case in which the pitch displacement PDX is equal to an integer multiple of the conductor width WDX of the mesh conductor 1721.

In contrast, in a case in which the X-direction conductor width WDX of the mesh conductor is set wide, the change amount of capacitive noise becomes zero, and the absolute value of capacitive noise in a case in which the pitch displacement PDX is equal to an integer multiple of half of the conductor width WDX of the mesh conductor 1721.

In this manner, in a case in which the pitch displacement PDX is equal not only to an integer multiple of the conductor width WDX, but also to an integer multiple of half of the conductor width WDX, the change amount and absolute value of capacitive noise become zero, in some cases.

FIG. 200 is a graph depicting theoretical values of capacitive noise in a case in which the pitch displacement PDX is set to various values in the conductor layer 1791 from which relay conductors 1782 are omitted. Although an illustration of the conductor layer 1791 from which relay conductors 1782 are omitted is omitted, the conductor layer 1791 corresponds to one from which relay conductors 1782 are removed from each conductor layer 1791 in FIGS. 196A, 196B, 196C, 197A, 197B, 197C, 198A, 198B, and 198C.

As depicted in FIG. 200, in a case in which there are no relay conductors 1782 also, the displacement amounts that make the change amount of capacitive noise zero are the same as those in a case in which there are relay conductors 1782. It should be noted however that the absolute value of capacitive noise does not become zero.

<Sixth Displacement Configuration Example of Mesh Conductor>

In the examples explained in the first to fifth displacement configuration example mentioned above, if attention is paid to the relation between the X-direction conductor width WDX and gap width GDX of the mesh conductor, the gap width GDX is larger than the conductor width WDX ((gap width GDX)>(conductor width WDX)).

In the example explained in the next sixth displacement configuration example, the gap width GDX is smaller than the conductor width WDX ((gap width GDX)<(conductor width WDX)).

FIG. 201 is a plan view for explaining conductor widths and gap widths of a conductor layer as the sixth displacement configuration example of a mesh conductor.

A conductor layer 1811 in FIG. 201 includes a mesh conductor 1801 and relay conductors 1802.

Assuming that A is a real number, the mesh conductor 1801 has the conductor width WDX set to 6A and the conductor width WDY set to 6A. Gap regions of the mesh conductor 1801 are formed to have the gap width GDX set to 4A and the gap width GDY set to 4A. Accordingly, the conductor width WDX (=6A) is set larger than the gap width GDX (=4A).

Each relay conductor 1802 arranged in a gap region of the mesh conductor 1801 is a rectangle with the conductor width CDX set to 2A and the conductor width CDY set to 2A. The rectangle is a square having the same X-direction conductor width CDX and Y-direction conductor width CDY (CDY=CDX). Both the X-direction first gap width GDX1 and second gap width GDX2 between the mesh conductor 1801 and each relay conductor 1802 are set to 1A. In addition, both the Y-direction first gap width GDY1 and second gap width GDY2 are set to 1A.

Accordingly, if represented by using the real number A, the pitch width FDX (=(conductor width WDX)+(gap width GDX)) corresponds to 10A, and the pitch width FDY (=(conductor width WDY)+(gap width GDY)) corresponds to 10A.

In the sixth displacement configuration example, if the conductor area size of mesh conductor 1801, and the conductor area size of relay conductors 1802 in a predetermined range are compared with each other, the conductor area size of mesh conductor 1801 is larger, and the first condition of complete offsetting mentioned above is not satisfied.

FIGS. 202A, 202B, 202C, 203A, 203B, and 203C are plan views in which the pitch displacement PDX is set to various values in the conductor layer 1811 as the sixth displacement configuration example of a mesh conductor.

FIG. 202A is a plan view of the conductor layer 1811 with the pitch displacement PDX set to zero.

FIG. 202B is a plan view of the conductor layer 1811 with the X-direction pitch displacement PDX set to 1A, that is, 1/10 of the X-direction repetition pitch (pitch width FDX).

FIG. 202C is a plan view of the conductor layer 1811 with the pitch displacement PDX set to 2A, that is, 2/10 of the X-direction repetition pitch (pitch width FDX).

FIG. 203A is a plan view of the conductor layer 1811 with the pitch displacement PDX set to 3A, that is, 3/10 of the X-direction repetition pitch (pitch width FDX).

FIG. 203B is a plan view of the conductor layer 1811 with the pitch displacement PDX set to 4A, that is, 4/10 of the X-direction repetition pitch (pitch width FDX).

FIG. 203C is a plan view of the conductor layer 1811 with the pitch displacement PDX set to 5A, that is, 5/10 of the X-direction repetition pitch (pitch width FDX).

FIG. 204 is a graph depicting theoretical values of capacitive noise of the conductor layer 1811 with the pitch displacement PDX set to various values as in FIGS. 202A, 202B, 202C, 203A, 203B, and 203C.

Because the horizontal axis and vertical axis in the graph in FIG. 204 are similar to those in FIG. 169, explanations thereof are omitted. Note that the graph in FIG. 204 also is depicted at the same scale as that of the graph in FIG. 169. It is assumed that conditions of a Vdd applied voltage and a Vss applied voltage also are similar.

As depicted in FIG. 204, in a case in which the pitch displacement PDX is set to predetermined values, the change amount of capacitive noise becomes zero. More specifically, in a case in which the pitch displacement PDX is set to 1/10 (=1A), 2/10 (=2A), 3/10 (=3A) or 4/10 (=4A) of the X-direction repetition pitch, the change amount of capacitive noise becomes zero. Note that the absolute value of capacitive noise does not become zero.

Putting it in the other way around, in a case in which the pitch displacement PDX is different from 5/10 (=5A) of the X-direction repetition pitch of the mesh conductor 1801, in other words, in a case in which the pitch displacement PDX is not (pitch width FDX (=10A))/2, the change amount of capacitive noise becomes zero.

In a case in which the pitch displacement PDX is set to 1/10 (=1A) or 3/10 (=3A) of the X-direction repetition pitch, the change amount of capacitive noise becomes zero in a set of ten rows.

In a case in which the pitch displacement PDX is set to 2/10 (=2A) or 4/10 (=4A) of the X-direction repetition pitch, the change amount of capacitive noise becomes zero in a set of five rows.

In the case of the other value of the pitch displacement PDX, specifically, in a case in which the pitch displacement PDX is set to 5/10 of the X-direction repetition pitch, the change amount of capacitive noise does not become zero, but the change amount of capacitive noise can be made smaller than in a case in which the pitch displacement PDX is set to zero, that is, there is no pitch displacement.

According to what is mentioned above, in the sixth displacement configuration example including relay conductors 1802, the change amount of capacitive noise can be made zero in the case of the following condition.

First, as a premise, the pitch displacement PDX is set to a value that is different from the X-direction pitch width FDX (=10A) of the mesh conductor 1801.

In a case in which the pitch displacement PDX is 4A, that is, in a case in which the pitch displacement PDX is the same as the X-direction gap width GDX of the mesh conductor 1801, the change amount of capacitive noise becomes zero. In addition, in a case in which the pitch displacement PDX is 1A, 2A or 3A also, the change amount of capacitive noise becomes zero.

Although not included in the graph in FIG. 204, in a case in which the pitch displacement PDX is 8A, which is 200% of the gap width GDX (=4A), the pitch width FDX is 10A, and 8/10=(10−2)/10 is satisfied. Accordingly, this is equivalent to the case in which the pitch displacement PDX is 2A, and so the change amount of capacitive noise becomes zero. In addition, in a case in which the pitch displacement PDX is 12A, which is 300% of the gap width GDX (=4A), the pitch width FDX is 10A, and 12/10=(10+2)/10 is satisfied. Accordingly, this is equivalent to the case in which the pitch displacement PDX is 2A, and so the change amount of capacitive noise becomes zero.

Accordingly, the conductor layer 1811 having the mesh conductor 1801 with the gap width GDX larger than the conductor width WDX can make the change amount of capacitive noise zero when the pitch displacement PDX is an integer multiple of the gap width GDX. It should be noted however that in a case in which the pitch displacement PDX is 1A or 3A also, the change amount of capacitive noise becomes zero, and so the pitch displacement PDX is not limited to an integer multiple of the gap width GDX.

FIG. 205 is a graph depicting theoretical values of capacitive noise in a case in which the pitch displacement PDX is set to various values in the conductor layer 1811 from which relay conductors 1802 are omitted. Although an illustration of the conductor layer 1811 from which relay conductors 1802 are omitted is omitted, the conductor layer 1811 corresponds to one from which relay conductors 1802 are removed from each conductor layer 1811 in FIGS. 202A, 202B, 202C, 203A, 203B, and 203C.

As depicted in FIG. 205, in a case in which there are no relay conductors 1802 also, the displacement amounts that make the change amount of capacitive noise zero are the same as those in a case in which there are relay conductors 1802. It should be noted however that the absolute value of capacitive noise does not become zero.

<Seventh Displacement Configuration Example of Mesh Conductor>

The X-direction conductor width WDX and gap width GDX of the mesh conductor are equal to each other ((conductor width WDX)=(gap width GDX)) in an example depicted next as a seventh displacement configuration example.

FIG. 206 is a plan view for explaining conductor widths and gap widths of a conductor layer as the seventh displacement configuration example of a mesh conductor.

A conductor layer 1831 in FIG. 206 includes a mesh conductor 1821 and relay conductors 1822.

Assuming that A is a real number, the mesh conductor 1821 has the conductor width WDX set to 6A and the conductor width WDY set to 6A. Gap regions of the mesh conductor 1821 are formed to have the gap width GDX set to 6A and the gap width GDY set to 6A. Accordingly, the conductor width WDX (=6A) and the gap width GDX (=6A) are set equal to each other.

Each relay conductor 1822 arranged in a gap region of the mesh conductor 1821 is a rectangle with the conductor width CDX set to 2A and the conductor width CDY set to 2A. The rectangle is a square having the same X-direction conductor width CDX and Y-direction conductor width CDY (CDY=CDX). Both the X-direction first gap width GDX1 and second gap width GDX2 between the mesh conductor 1821 and each relay conductor 1822 are set to 2A. In addition, both the Y-direction first gap width GDY1 and second gap width GDY2 are set to 2A.

Accordingly, if represented by using the real number A, the pitch width FDX (=(conductor width WDX)+(gap width GDX)) corresponds to 12A, and the pitch width FDY (=(conductor width WDY)+(gap width GDY)) corresponds to 12A.

In the seventh displacement configuration example, if the conductor area size of mesh conductor 1801, and the conductor area size of relay conductors 1802 in a predetermined range are compared with each other, the conductor area size of mesh conductor 1801 is larger, and the first condition of complete offsetting mentioned above is not satisfied.

FIGS. 207A, 207B, 207C, 207D, 208A, 208B, and 208C are plan views in which the pitch displacement PDX is set to various values in the conductor layer 1831 as the seventh displacement configuration example of a mesh conductor.

Figures 207A, 207B, 207C, 207D:
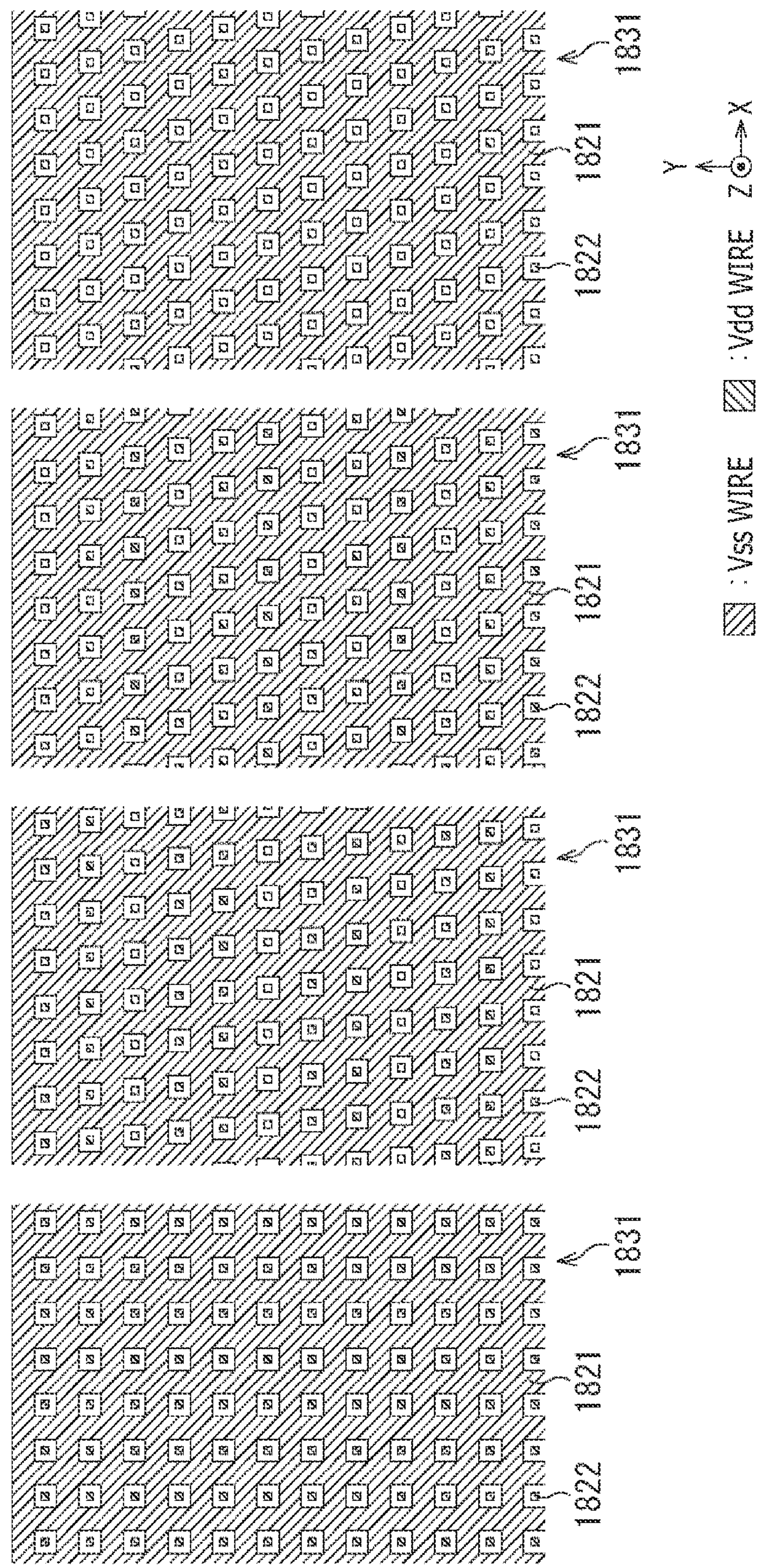

FIG. 207A is a plan view of the conductor layer 1831 with the pitch displacement PDX set to zero.

FIG. 207B is a plan view of the conductor layer 1831 with the X-direction pitch displacement PDX set to 1A, that is, 1/12 of the X-direction repetition pitch (pitch width FDX).

FIG. 207C is a plan view of the conductor layer 1831 with the pitch displacement PDX set to 2A, that is, 2/12 of the X-direction repetition pitch (pitch width FDX).

FIG. 207D is a plan view of the conductor layer 1831 with the pitch displacement PDX set to 3A, that is, 3/12 of the X-direction repetition pitch (pitch width FDX).

FIG. 208A is a plan view of the conductor layer 1831 with the pitch displacement PDX set to 4A, that is, 4/12 of the X-direction repetition pitch (pitch width FDX).

FIG. 208B is a plan view of the conductor layer 1831 with the pitch displacement PDX set to 5A, that is, 5/12 of the X-direction repetition pitch (pitch width FDX).

FIG. 208C is a plan view of the conductor layer 1831 with the pitch displacement PDX set to 6A, that is, 6/12 of the X-direction repetition pitch (pitch width FDX).

FIG. 209 is a graph depicting theoretical values of capacitive noise of the conductor layer 1831 with the pitch displacement PDX set to various values as in FIGS. 207A, 207B, 207C, 207D, 208A, 208B, and 208C.

Because the horizontal axis and vertical axis in the graph in FIG. 209 are similar to those in FIG. 169, explanations thereof are omitted. Note that the graph in FIG. 209 also is depicted at the same scale as that of the graph in FIG. 169. It is assumed that conditions of a Vdd applied voltage and a Vss applied voltage also are similar.

As depicted in FIG. 209, in a case in which the pitch displacement PDX is set to predetermined values, the change amount of capacitive noise becomes zero. More specifically, in a case in which the pitch displacement PDX is set to 1/12 (=1A), 2/12 (=2A) or 5/12 (=5A) of the X-direction repetition pitch, the change amount of capacitive noise becomes zero. Note that the absolute value of capacitive noise does not become zero.

Putting it in the other way around, in a case in which the pitch displacement PDX is different from 3/12 (=3A), 4/12 (=4A) and 6/12 (=6A) of the X-direction repetition pitch of the mesh conductor 1821, in other words, in a case in which the pitch displacement PDX is neither (pitch width FDX (=12A))/4, (pitch width FDX (=12A))/3 nor (pitch width FDX (=12A))/2, the change amount of capacitive noise becomes zero.

In a case in which the pitch displacement PDX is set to 1/12 (=1A) or 5/12 (=5A) of the X-direction repetition pitch, the change amount of capacitive noise becomes zero in a set of twelve rows.

In a case in which the pitch displacement PDX is set to 2/12 (=2A) of the X-direction repetition pitch, the change amount of capacitive noise becomes zero in a set of six rows. The mesh conductor 1821 with the equal X-direction conductor width WDX and gap width GDX can make the change amount of capacitive noise zero with a smaller number of rows in a case in which the pitch displacement PDX is the same as the X-direction conductor width CDX (=2A) of the relay conductors 1822. In a case in which the pitch displacement PDX is the same as the X-direction conductor width WDX (=6A) of the mesh conductor 1821, the change amount of capacitive noise does not become zero.

In a case in which the pitch displacement PDX is set to 3/12 (=3A), 4/12 (=4A) or 6/12 (=6A) of the X-direction repetition pitch of the mesh conductor 1821, the change amount of capacitive noise does not become zero, but the change amount of capacitive noise can be made smaller than in a case in which the pitch displacement PDX is set to zero, that is, there is no pitch displacement.

According to what is mentioned above, in the seventh displacement configuration example including relay conductors 1822, the change amount of capacitive noise can be made zero in the case of the following condition.

First, as a premise, the pitch displacement PDX is set to a value that is different from the X-direction pitch width FDX (=12A) of the mesh conductor 1821.

In a case in which the pitch displacement PDX is 2A, that is, in a case in which the pitch displacement PDX is the same as the X-direction conductor width CDX of the relay conductors 1822, the change amount of capacitive noise becomes zero. In addition, in a case in which the pitch displacement PDX is 1A or 5A also, the change amount of capacitive noise becomes zero.

In a case in which the pitch displacement PDX is different from 3/12 (=3A) of the X-direction repetition pitch of the mesh conductor 1821, in other words, in a case in which the pitch displacement PDX is not (pitch width FDX (=12A))/4, the change amount of capacitive noise becomes zero.

In a case in which the pitch displacement PDX is different from 4/12 (=4A) of the X-direction repetition pitch of the mesh conductor 1821, in other words, in a case in which the pitch displacement PDX is not (pitch width FDX (=12A))/3, the change amount of capacitive noise becomes zero.

In a case in which the pitch displacement PDX is different from 6/12 (=6A) of the X-direction repetition pitch of the mesh conductor 1821, in other words, in a case in which the pitch displacement PDX is not (pitch width FDX (=12A))/2, the change amount of capacitive noise becomes zero.

FIG. 210 is a graph depicting theoretical values of capacitive noise in a case in which the pitch displacement PDX is set to various values in the conductor layer 1831 from which relay conductors 1822 are omitted. Although an illustration of the conductor layer 1831 from which relay conductors 1822 are omitted is omitted, the conductor layer 1831 corresponds to one from which relay conductors 1822 are removed from each conductor layer 1831 in FIGS. 207A, 207B, 207C, 207D, 208A, 208B, and 208C.

In a case in which there are no relay conductors 1822 also, as depicted in FIG. 210, in a case in which the pitch displacement PDX is set to predetermined values, the change amount of capacitive noise becomes zero. It should be noted however that the displacement amounts that make the change amount of capacitive noise zero are different from those in a case in which there are relay conductors 1822. Specifically, in a case in which the pitch displacement PDX is set to 1/12, 2/12, 3/12, 5/12 or 6/12 of the X-direction repetition pitch, the change amount of capacitive noise becomes zero.

In a case in which the pitch displacement PDX is set to 3/12 (=3A) of the X-direction repetition pitch, the change amount of capacitive noise becomes zero in a set of four rows. In a case in which the pitch displacement PDX is set to 2/12 (=2A) of the X-direction repetition pitch, the change amount of capacitive noise becomes zero in a set of six rows.

In a case in which the pitch displacement PDX is set to 6/12 (=6A) of the X-direction repetition pitch, the change amount of capacitive noise becomes zero in a set of two rows.

According to what is mentioned above, in the seventh displacement configuration example not including relay conductors 1822, the change amount of capacitive noise can be made zero in the case of the following condition.

First, as a premise, the pitch displacement PDX is set to a value that is different from the X-direction pitch width FDX (=12A) of the mesh conductor 1821.

In a case in which the pitch displacement PDX is 1/12 (=1A), 2/12 (=2A), 3/12 (=3A), 5/12 (=5A), or 6/12 (=6A) of the X-direction repetition pitch of the mesh conductor 1821, the change amount of capacitive noise becomes zero. It can be said in another way that 1/12 (=1A), 2/12 (=2A), 3/12 (=3A), and 6/12 (=6A) of the X-direction repetition pitch of the mesh conductor 1821 are equivalent to the pitch displacement PDX which is equal to (pitch width FDX (=12A))/12, (pitch width FDX (=12A))/6, (pitch width FDX (=12A))/4, and (pitch width FDX (=12A))/2, respectively. Accordingly, in a case in which the pitch displacement PDX is (pitch width FDX)/(even integer), the change amount of capacitive noise becomes zero. It is suitable if the pitch displacement PDX is (pitch width FDX (=12A))/2, in which case the pitch displacement PDX is set to 6/12 (=6A) of the X-direction repetition pitch, because the change amount of capacitive noise becomes zero with the smallest number of rows, but this is not essential.

In addition, in a case in which the pitch displacement PDX is different from 4/12 (=4A) of the X-direction repetition pitch of the mesh conductor 1821, in other words, in a case in which the pitch displacement PDX is not (pitch width FDX (=12A))/3, the change amount of capacitive noise becomes zero.

Accordingly, in the seventh displacement configuration example, the condition of the pitch displacement PDX under which the change amount of capacitive noise becomes zero is different between a case in which there are relay conductors 1822 and a case in which there are no relay conductors 1822.

In a case in which an integer multiple of an even number of the pitch displacement PDX matches the pitch width FDX due to the shape relation between the conductor section and gap regions of the mesh conductor 1821, capacitive noise is dispersed evenly, and so the change amount of capacitive noise can be made zero when there are no relay conductors 1822.

<Modification Example of Displacement Configuration Example of Mesh Conductor>

In other possible configurations, at least one of the first to seventh displacement configuration examples of the mesh conductor mentioned above may be modified as mentioned below.

For example, the Y-direction conductor width WDY of the mesh conductor may be made larger than the gap width GDY ((conductor width WDY)>(gap width GDY)), or the X-direction conductor width WDX may be made larger than the gap width GDX ((conductor width WDX)>(gap width GDX)). This case is advantageous in terms of the light-blocking property and conductor occupancy.

In contrast, for example, the Y-direction conductor width WDY of the mesh conductor may be made the same as or smaller than the gap width GDY ((conductor width WDY) ≤(gap width GDY)), or the X-direction conductor width WDX may be made the same as or smaller than the gap width GDX ((conductor width WDX)≤(gap width GDX)). This case is advantageous in terms of the capability to offset capacitive noise.

While the displacement is in the positive direction along the X axis in the examples used for the explanations of the displacement configuration examples of the mesh conductor mentioned above, the displacement may be in the negative direction along the X axis. In addition, the displacement in the positive direction along the X axis, and the displacement in the negative direction along the X axis may be combined in other possible configurations, for example by alternately repeating the displacement of one row or multiple rows in the positive direction along the X axis, and the displacement of one row or multiple rows in the negative direction along the X axis.

A conductor layer having any of the displacement configurations of a mesh conductor mentioned above is particularly suitable in a case in which the conductor layer is a conductor layer close to a Victim conductor, but this is not essential. While, in the examples explained, a conductor layer having any of the displacement configurations of a mesh conductor is applied to the mesh conductor in the conductor layer A (wiring layer 165A) or the conductor layer B (wiring layer 165B) mentioned above, the conductor layer can be applied also to conductor layers other than the conductor layer A or B. For example, the conductor layer may be applied to the conductor layer C (wiring layer 165C), or may be applied to any conductor layer of a circuit board, a semiconductor board or electronic equipment. In addition, two or more conductor layers having any of the displacement configurations of a mesh conductor may be included. In that case, the pitch displacement amounts of the two conductor layers are desirably mutually the same or substantially the same in terms of inductive noise, but the pitch displacement amounts may be made mutually different. In addition, two or more conductor layers having mesh conductors may be included, mesh conductors of some conductor layers may be provided with pitch displacement, and mesh conductors of the other conductor layers may not be provided with pitch displacement. In addition, one conductor layer may include multiple mesh conductors having mutually different pitch displacement amounts, and both mesh conductors provided with pitch displacement, and mesh conductors not provided with pitch displacement may be included.

The pitches (wire pitches), widths (wire widths), gap widths, and pitch displacement of wires as mesh conductors or relay conductors may be modulated depending on positions, in one possible structure. For example, the wire pitches, wire widths, gap widths and pitch displacement may gradually increase according to X-direction or Y-direction distances in one possible structure, and may gradually decrease according to X-direction or Y-direction distances, in another possible structure. Furthermore, structures in which the wire pitches, wire widths, gap widths and pitch displacement gradually increase according to X-direction or Y-direction distances, and structures in which the wire pitches, wire widths, gap widths and pitch displacement gradually decrease according to X-direction or Y-direction distances may be combined or alternately arranged, in another possible structure.

At least some conductors of mesh conductors or relay conductors may be separated into multiple conductors, or, as FIG. 178B, may have shapes that are obtained by coupling multiple unseparated, but divided shapes. In addition, at least some of the mesh conductors may have cut and separated shapes.

A mesh conductor is explained as a wire (Vss wire) connected to GND or a negative power supply, and relay conductors are explained as wires (Vdd wires) connected to a positive power supply in the displacement configuration examples of a mesh conductor mentioned above. In addition, the absolute values of a Vdd applied voltage and a Vss applied voltage are the same in the examples explained.

However, the Vdd applied voltage and the Vss applied voltage may be replaced with each other. That is, a mesh conductor may be a wire (Vdd wire) connected to a positive power supply, and relay conductors may be wires (Vss wires) connected to GND or a negative power supply. In addition, the absolute values of the Vdd applied voltage and the Vss applied voltage may not be the same. For example, for example, the Vdd applied voltage may be a positive power supply (e.g., +1 V), and the Vss applied voltage may be GND (0 V).

The voltage applied to a mesh conductor, and the voltage applied to relay conductors are not limited to those in the example described above, but may be other power supplies, and it is sufficient if the voltage applied to the mesh conductor, and the voltage applied to the relay conductors are some two types of power supply. In this case, the polarities of the two types of power supply are desirably mutually different, but this is not essential.

The planar arrangement of conductor layers having a displacement configuration of a mesh conductor may be reversed in the X direction or may be reversed in the Y direction. In addition, the planar arrangement may be rotated by a predetermined angle clockwise (e.g., 90 degrees) or may be rotated by a predetermined angle counterclockwise (e.g., −90 degrees).

While the effect of ameliorating capacitive noise due to pitch displacement of a mesh conductor is depicted in the present disclosure, mesh conductors and relay conductors without pitch displacement are not excluded. As mentioned above, for conductor layers without pitch displacement also, both the presence and absence of relay conductors can be applied to the mesh conductor in the conductor layer A (wiring layer 165A) or the conductor layer B (wiring layer 165B).

For example, relay conductors may have any type of shape such as circular shapes, polygonal shapes, symmetric shapes, asymmetric shapes, star-like shapes or radial shapes, and may have complicated shapes. In addition, conductors that are used as relay conductors in the displacement configurations of a mesh conductor mentioned above may be conductors that do not electrically relay between other conductor layers, and it is sufficient if the relay conductors are non-mesh conductors (non-mesh conductors) arranged in gap regions of a mesh conductor. The non-mesh conductors including relay conductors may be arranged in all of the gap regions of the mesh conductor or may be arranged only in some predetermined gap regions.

15. Configuration Examples of Three Power Supplies

Next, configuration examples of a conductor layer (wiring layer 165) in a case in which the solid-state image pickup apparatus 100 has three power supplies are explained.

In various types of configuration examples mentioned above, in both the cases of the two layers including the conductor layers A and B (wiring layers 165A and 165B), and the three layers including the conductor layers A to C (wiring layers 165A to 165C), it is explained that there are two power supplies to be supplied to the wiring layers, which are Vdd to be used as a positive power supply, for example, and Vss to be used as GND or a negative power supply, for example.

However, the solid-state image pickup apparatus 100 is controlled by three power supplies which are a first power supply Vdd, a second power supply Vss1 and a third power supply Vss2, for example, in some cases.

FIGS. 211A, 211B, 211C, and 211D depict conceptual diagrams depicting cases in which the solid-state image pickup apparatus 100 has two power supplies and three power supplies.

Figure 211A:
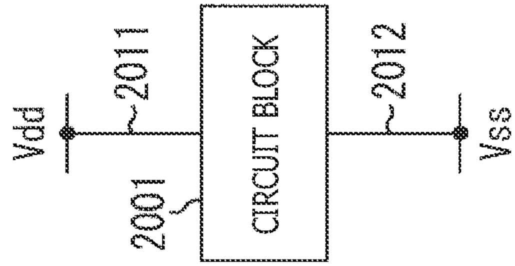

FIG. 211A is a conceptual diagram of a case in which the solid-state image pickup apparatus 100 explained thus far is controlled by two power supplies.

A circuit block 2001 included in the solid-state image pickup apparatus 100 is supplied with a power supply Vdd via a wire 2011, and is supplied with a power supply Vss via a wire 2012. The circuit block 2001 is a circuit block in which an active element group 167 is formed, and corresponds to the circuit blocks 202 to 204 in FIGS. 7A and 7B, or the like, for example. The wires 2011 and 2012 correspond to wires (conductors) included in the conductor layers A and B in the case of two layers or the conductor layers A to C in the case of three layers in various types of configuration example mentioned above. It should be noted however that the wires 2011 and 2012 may include conductors of other conductor layers, and may include conductors of a configuration different from wires (conductors) explained in various types of configuration example mentioned above.

Figure 211B:
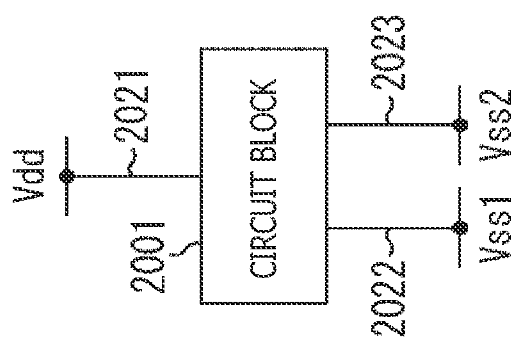

FIG. 211B is a conceptual diagram of a first configuration example of a case in which the solid-state image pickup apparatus 100 is controlled by three power supplies.

In the first configuration example of the case in which the solid-state image pickup apparatus 100 is controlled by three power supplies, the first power supply Vdd is supplied to the circuit block 2001 via a wire 2021, the second power supply Vss1 is supplied to the circuit block 2001 via a wire 2022, and the third power supply Vss2 is supplied to the circuit block 2001 via a wire 2023. The second power supply Vss1 and the third power supply Vss2 may be always supplied to the circuit block 2001 via the wires 2022 and 2023 in one possible configuration, and the circuit block 2001 may internally control connection with the wires 2022 and 2023, and select any one of the second power supply Vss1 or the third power supply Vss2 according to an operation mode or the like.

Figure 211C:
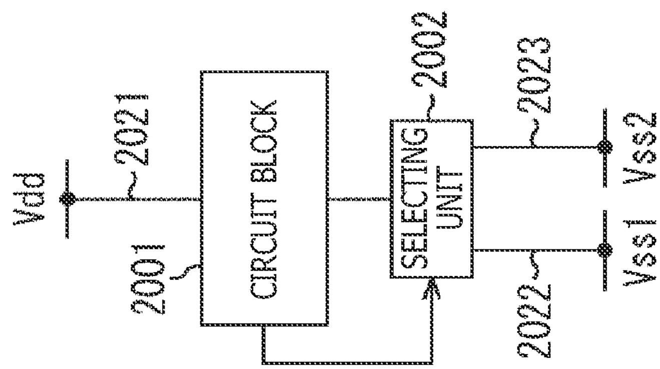

FIG. 211C is a conceptual diagram of a second configuration example of a case in which the solid-state image pickup apparatus 100 is controlled by three power supplies.

In the second configuration example of the case in which the solid-state image pickup apparatus 100 is controlled by three power supplies, a selecting unit 2002 is provided separately from the circuit block 2001. The selecting unit 2002 selects at least one of the second power supply Vss1 or the third power supply Vss2 according to an operation mode or the like, under the control of the circuit block 2001. In other words, the selecting unit 2002 selects at least one of a first path including the first power supply Vdd, the wire 2021, the circuit block 2001, the wire 2022, and the second power supply Vss1, or a second path including the first power supply Vdd, the wire 2021, the circuit block 2001, the wire 2023, and the third power supply Vss2.

Figure 211D:
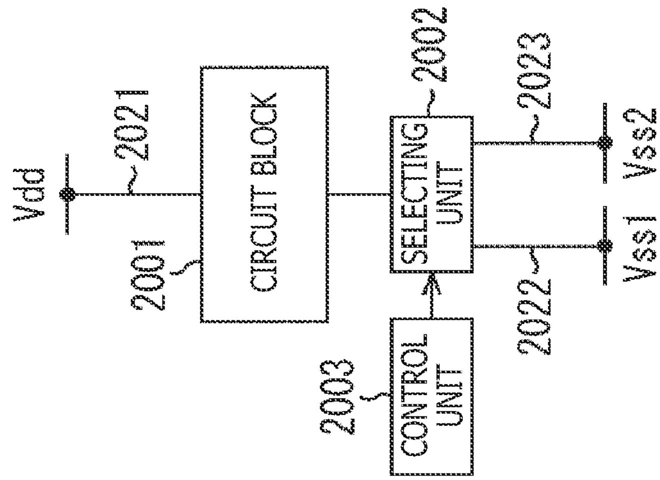

FIG. 211D is a conceptual diagram of a third configuration example of a case in which the solid-state image pickup apparatus 100 is controlled by three power supplies.

In the third configuration example of the case in which the solid-state image pickup apparatus 100 is controlled by three power supplies, a control unit 2003 that controls selection of the second power supply Vss1 and the third power supply Vss2 also is provided separately from the circuit block 2001. The control unit 2003 determines to select the second power supply Vss1 and the third power supply Vss2, and commands the selecting unit 2002, and the selecting unit 2002 selects at least one of the second power supply Vss1 or the third power supply Vss2 on the basis of the command of the control unit 2003.

In all the configurations of three power supplies in FIGS. 211B, 211C, and 211D, the circuit block 2001 is electrically connected to the first power supply Vdd via the wire 2021, is electrically connected to the second power supply Vss1 via the wire 2022, and is electrically connected to the third power supply Vss2 via the wire 2023.

Note that, in a case in which the second power supply Vss1 and the third power supply Vss2 are selected for operation in the configurations of three power supplies in FIGS. 211B, 211C, and 211D, any one of the second power supply Vss1 or the third power supply Vss2 may be selected one at a time in one possible configuration, or the second power supply Vss1 and the third power supply Vss2 may be selected simultaneously in another possible configuration.

Regarding the magnitude relation between power supply voltages of the three power supplies, the first power supply Vdd is higher than the second power supply Vss1, and the first power supply Vdd is higher than the third power supply Vss2. The second power supply Vss1 and the third power supply Vss2 may be the same, or the second power supply Vss1 is higher than the third power supply Vss2. That is, (first power supply Vdd)>(second power supply Vss1), (first power supply Vdd)>(third power supply Vss2), and (second power supply Vss1)≥(third power supply Vss2). The total power consumption when the solid-state image pickup apparatus 100 selected the second power supply Vss1 is the same as or higher than the total power consumption when the third power supply Vss2 is selected. In addition, the total current amount when the solid-state image pickup apparatus 100 selected the second power supply Vss1 is the same as or higher than the total current amount when the third power supply Vss2 is selected. In these cases, "(total number of pads (Vdd pads) electrically connected with first power supply Vdd)≥(total number of pads (Vss2 pads) electrically connected with third power supply Vss2)," and "(total number of pads (Vss1 pads) electrically connected with second power supply Vss1)≥(total number of pads (Vss2 pads) electrically connected with third power supply Vss2)" can be satisfied. That is, because there are less constraints due to total power consumption and total current amounts, the total number of pads electrically connected with the third power supply Vss2 can be made smaller than the total number of pads electrically connected with the first power supply Vdd or the second power supply Vss1. Furthermore, "(total number of pads electrically connected with first power supply Vdd)≈(total number of pads electrically connected with second power supply Vss1)" may be satisfied. Note that details of the pad arrangement in the case of three power supplies are not explained because it is sufficient if the pad arrangement examples in the case of two power supplies mentioned above are applied. For example, it is sufficient if Vdd pads, Vss1 pads and Vss2 pads are placed in the alternating arrangement or mirror-symmetric arrangement mentioned above along one edge, two edges, three edges or four edges.

For example, the first power supply Vdd may be a power supply with 0 V or higher, and may be a fixed voltage or a variable voltage. For example, the second power supply Vss1 and the third power supply Vss2 are GND or negative power supplies. More specifically, for example, the second power supply Vss1 is GND (ground), and the third power supply Vss2 is a negative power supply in one possible configuration that can be adopted, and the second power supply Vss1 is a first negative power supply voltage, and the third power supply Vss2 is a second negative power supply voltage different from the first negative power supply voltage in another possible configuration that can be adopted. In the present embodiment, it is assumed that the first power supply Vdd, the second power supply Vss1 and the third power supply Vss2 are for distinguishing between power supply voltage levels supplied to the circuit block 2001, and also include GND (ground). In addition, both the second power supply Vss1 and the third power supply Vss2 may be GND, and may be negative power supplies with the same voltage. In other words, the first power supply Vdd, the second power supply Vss1 and the third power supply Vss2 may be three power supplies including two systems with the second power supply Vss1 and the third power supply Vss2 being the same power supply voltage, or three power supplies including three systems with the second power supply Vss1 and the third power supply Vss2 being different power supply voltages.

Note that, hereinbelow, a conductor connected to the first power supply Vdd is also referred to as a Vdd conductor, a conductor connected to the second power supply Vss1 is also referred to as a Vss1 conductor, and a conductor connected to the third power supply Vss2 is also referred to as a Vss2 conductor.

In addition, in another possible configuration that can be adopted, the combination of three power supplies includes two power supply voltages which are equal to or higher than 0. For example, the combination of three power supplies may be a first power supply Vdd1, a second power supply Vdd2 and a third power supply Vss. The configuration of the first power supply Vdd, the second power supply Vss1 and the third power supply Vss2 explained below can be applied to the configuration of the first power supply Vdd1, the second power supply Vdd2 and the third power supply Vss with appropriate replacement, and so an explanation of the latter configuration is omitted. In the case of the configuration of the first power supply Vdd1, the second power supply Vdd2 and the third power supply Vss, any one of the first power supply Vdd1 or the second power supply Vdd2 is selected one at a time, or the first power supply Vdd1 and the second power supply Vdd2 are selected simultaneously, and the third power supply Vss serves as an element to be used in common.

<First Configuration Example of Three Power Supplies>

A configuration example of a wiring layer in a case in which the solid-state image pickup apparatus 100 is controlled by three power supplies is explained hereinafter. In a configuration example explained first, wires of three power supplies are arranged in two wiring layers (wiring layers 165A and 165B) in multiple wiring layers forming the multi-layer wiring layer 163, and in a configuration example explained next, wires of three power supplies are arranged in three wiring layers (wiring layers 165A to 165C). Similarly to the examples mentioned above, the wiring layer 165A is referred to as the conductor layer A, the wiring layer 165B is referred to as the conductor layer B, and the wiring layer 165C is referred to as the conductor layer C in the following explanation.

FIGS. 212A, 212B, and 213 depict a first configuration example of three power supplies.

In the coordinate systems in both FIGS. 212A, 212B, and 213, the X axis lies in the lateral direction, the Y axis lies in the longitudinal direction, and the Z axis lies in a direction perpendicular to the XY plane.

FIG. 212A depicts a plan view of the conductor layer A (wiring layer 165A), and FIG. 212B depicts a plan view of the conductor layer B (wiring layer 165B). Note that FIGS. 212A and 212B may be regarded as depicting the entire region of each conductor layer or may be regarded as depicting a partial region of each conductor layer.

The conductor layer A in FIG. 212A includes three linear conductors 2101 to 2103 that are long in the Y direction, and arranged in the X direction in a predetermined order, and sets of the three linear conductors 2101 to 2103 are arranged regularly in the X direction.

The linear conductors 2101 are wires (Vdd wires) connected to the first power supply Vdd. The linear conductors 2102 are wires (Vss1 wires) connected to the second power supply Vss1. The linear conductors 2103 are wires (Vss2 wires) connected to the third power supply Vss2.

Accordingly, while the three linear conductors 2101 to 2103 are arranged in the positive direction along the X axis in the order of a Vdd wire, a Vss2 wire and a Vss1 wire in FIG. 212A, the order of arrangement of the three linear conductors 2101 to 2103 is not limited to this example, but can be any order.

The linear conductors 2101 have the X-direction conductor width WXAD, the linear conductors 2102 have the X-direction conductor width WXAS1, and the linear conductors 2103 have the X-direction conductor width WXAS2. For example, the conductor width WXAD of the linear conductors 2101, the conductor width WXAS1 of the linear conductors 2102, and the conductor width WXAS2 of the linear conductors 2103 are the same ((conductor width WXAD)=(conductor width WXAS1)=(conductor width WXAS2)). In addition, there is a gap with the gap width GXA between two adjacent ones of the linear conductors 2101 to 2103.

The linear conductors 2101 are arranged regularly in the X direction at a conductor pitch FXAD, and the linear conductors 2102 are arranged regularly in the X direction at a conductor pitch FXAS1. Similarly, the linear conductors 2103 are arranged regularly in the X direction at a conductor pitch FXAS2. For example, the conductor pitch FXAD, the conductor pitch FXAS1 and the conductor pitch FXAS2 are the same ((conductor pitch FXAD)=(conductor pitch FXAS1)=(conductor pitch FXAS2)).

Accordingly, in a rectangular region in a predetermined range of the conductor layer A, the sum total of the X-direction conductor widths WXAD of linear conductors 2101 connected to the first power supply Vdd, the sum total of the X-direction conductor widths WXAS1 of linear conductors 2102 connected to the second power supply Vss1, and the sum total of the X-direction conductor widths WXAS2 of linear conductors 2103 connected to the third power supply Vss2 become the same. In addition, in a rectangular region in a predetermined range of the conductor layer A, the conductor area size of linear conductors 2101 connected to the first power supply Vdd, the conductor area size of linear conductors 2102 connected to the second power supply Vss1, and the conductor area size of linear conductors 2103 connected to the third power supply Vss2 become the same.

The conductor layer B in FIG. 212B includes three linear conductors 2111 to 2113 that are long in the Y direction, and arranged in the X direction in a predetermined order, and sets of the three linear conductors 2111 to 2113 are arranged regularly in the X direction.

The linear conductors 2111 are wires (Vdd wires) connected to the first power supply Vdd. The linear conductors 2112 are wires (Vss1 wires) connected to the second power supply Vss1. The linear conductors 2113 are wires (Vss2 wires) connected to the third power supply Vss2.

Accordingly, while the three linear conductors 2111 to 2113 are arranged in the positive direction along the X axis in the order of a Vdd wire, a Vss2 wire and a Vss1 wire in FIG. 212B, the order of arrangement of the three linear conductors 2101 to 2103 is not limited to this example, but can be any order.

The linear conductors 2111 have an X-direction conductor width WXBD, the linear conductors 2112 have an X-direction conductor width WXBS1, and the linear conductors 2113 have an X-direction conductor width WXBS2. For example, the conductor width WXBD of the linear conductors 2111, the conductor width WXBS1 of the linear conductors 2112, and the conductor width WXBS2 of the linear conductors 2113 are the same ((conductor width WXBD)=(conductor width WXBS1)=(conductor width WXBS2)). There is a gap with the gap width GXB between two adjacent ones of the linear conductors 2111 to 2113.

Then, the linear conductors 2111 are arranged regularly in the X direction at a conductor pitch FXBD. The linear conductors 2112 are arranged regularly in the X direction at a conductor pitch FXBS1, and the linear conductors 2113 are arranged regularly in the X direction at a conductor pitch FXBS2. For example, the conductor pitch FXBD, the conductor pitch FXBS1 and the conductor pitch FXBS2 are the same ((conductor pitch FXBD)=(conductor pitch FXBS1)=(conductor pitch FXBS2)).

Accordingly, in a rectangular region in a predetermined range of the conductor layer B, the sum total of the X-direction conductor widths WXBD of linear conductors 2111 connected to the first power supply Vdd, the sum total of the X-direction conductor widths WXBS1 of linear conductors 2112 connected to the second power supply Vss1, and the sum total of the X-direction conductor widths WXBS2 of linear conductors 2113 connected to the third power supply Vss2 are the same. In addition, in a rectangular region in a predetermined range of the conductor layer B, the conductor area size of linear conductors 2111 connected to the first power supply Vdd, the conductor area size of linear conductors 2112 connected to the second power supply Vss1, and the conductor area size of linear conductors 2113 connected to the third power supply Vss2 are the same.

Next, if the linear conductors 2101 and the linear conductors 2111 connected to the same first power supply Vdd in the conductor layer A and the conductor layer B are compared with each other, the conductor width WXAD and the conductor width WXBD are the same, and the conductor pitch FXAD and the conductor pitch FXBD are the same. It should be noted however that the X-direction positions of the linear conductors 2101 and the linear conductors 2111 are different. The amount of displacement between the X-direction positions of the linear conductors 2101 and the linear conductors 2111 is equal to or larger than the X-direction gap widths GXA and GXB, and is equal to or smaller than the X-direction conductor widths WXAD and WXBD, and it is more suitable if it is larger than the X-direction gap widths GXA and GXB, and is smaller than the X-direction conductor widths WXAD and WXBD.

In addition, if the linear conductors 2102 and the linear conductors 2112 connected to the second power supply Vss1 are compared with each other, the conductor width WXAS1 and the conductor width WXBS1 are the same, and the conductor pitch FXAS1 and the conductor pitch FXBS1 also are the same. It should be noted however that the X-direction positions of the linear conductors 2102 and the linear conductors 2112 are different. The amount of displacement between the X-direction positions of the linear conductors 2102 and the linear conductors 2112 also is equal to or larger than the X-direction gap widths GXA and GXB, and is equal to or smaller than the X-direction conductor widths WXAS1 and WXBS1, and it is more suitable if it is larger than the X-direction gap widths GXA and GXB, and is smaller than the X-direction conductor widths WXAS1 and WXBS1.

Furthermore, if the linear conductors 2103 and the linear conductors 2113 connected to the third power supply Vss2 are compared with each other, the conductor width WXAS2 and the conductor width WXBS2 are the same, and the conductor pitch FXAS2 and the conductor pitch FXBS2 also are the same. It should be noted however that the X-direction positions of the linear conductors 2103 and the linear conductors 2113 are different. The amount of displacement between the X-direction positions of the linear conductors 2103 and the linear conductors 2113 also is equal to or larger than the X-direction gap widths GXA and GXB, and is equal to or smaller than the X-direction conductor widths WXAS2 and WXBS2, and it is more suitable if it is larger than the X-direction gap widths GXA and GXB, and is smaller than the X-direction conductor widths WXAS2 and WXBS2.

FIG. 213 is a plan view depicting the stacked state of the conductor layer A in FIG. 212A, and the conductor layer B in FIG. 212B.

In a case in which there are the suitable relations mentioned above between the amount of displacement between the X-direction positions of the linear conductors in the conductor layer A and the conductor layer B, and the X-direction conductor widths and gap widths, a light-blocking structure can be formed by the stacking of the conductor layer A and the conductor layer B as depicted in FIG. 213, and hot carrier light emissions can be blocked.

In addition, in a case in which there are the suitable relations mentioned above between the amount of displacement between the X-direction positions of the linear conductors in the conductor layer A and the conductor layer B, and the X-direction gap widths and conductor widths, linear conductors that are in the conductor layers A and B, and connected to the same power supplies may be electrically connected via conductor vias extending in the Z direction, or the like in predetermined partial regions where the positions of the linear conductors overlap. While it is desirable in terms of voltage drops (IR-Drop) if linear conductors connected to the same power supplies are electrically connected, this is not essential, and they do not have to be connected.

In addition, in a case in which any one of the second power supply Vss1 or the third power supply Vss2 is selected by the selecting unit 2002 in FIG. 211A, 211B, 211C, and 211D or the like, for example, both of the conductor layers A and B form differential structures. Specifically, in a case in which the second power supply Vss1 is selected, the current distribution in the linear conductors 2101 connected to the first power supply Vdd and the current distribution in the linear conductors 2102 connected to the second power supply Vss1 become substantially even distributions and have mutually reverse characteristics in the conductor layer A, and in a case in which the third power supply Vss2 is selected, the current distribution in the linear conductors 2101 connected to the first power supply Vdd and the current distribution in the linear conductors 2103 connected to the third power supply Vss2 become substantially even distributions and have mutually reverse characteristics. In addition, in the conductor layer B, in a case in which the second power supply Vss1 is selected, the current distribution in the linear conductors 2111 connected to the first power supply Vdd and the current distribution in the linear conductors 2112 connected to the second power supply Vss1 become substantially even distributions and have mutually reverse characteristics, and in a case in which the third power supply Vss2 is selected, the current distribution in the linear conductors 2111 connected to the first power supply Vdd and the current distribution in the linear conductors 2113 connected to the third power supply Vss2 become substantially even distributions and have mutually reverse characteristics. Here, being substantially even means that the differences are so small that they can be deemed to be even, and it is sufficient if at least the differences are 200%-differences or smaller, for example. Thereby, inductive noise can be suppressed more than in non-differential structures. In addition, symmetric structures allow easy noise designing.

<First Modification Example of First Configuration Example of Three Power Supplies>

FIGS. 214A, 214B, and 215 depict a first modification example of the first configuration example of three power supplies.

In the coordinate systems in both FIGS. 214A, 214B, and 215, the X axis lies in the lateral direction, the Y axis lies in the longitudinal direction, and the Z axis lies in a direction perpendicular to the XY plane.

FIG. 214A depicts a plan view of the conductor layer A, and FIG. 214B depicts a plan view of the conductor layer B. Note that FIGS. 214A and 214B may be regarded as depicting the entire region of each conductor layer or may be regarded as depicting a partial region of each conductor layer.

The conductor layer A in FIG. 214A is the same as the conductor layer A in the first configuration example depicted in FIG. 212A, and so an explanation thereof is omitted.

The conductor layer B in FIG. 214B includes linear conductors 2121 to 2123 that are long in the Y direction, and pairs of linear conductors 2121, pairs of linear conductors 2122, and pairs of linear conductors 2123 are arranged next to each other in the X direction in a predetermined order. In addition, the pairs of the linear conductors 2121 to 2123 are arranged regularly in the X direction.

In other words, the conductor layer B in the second configuration example has a configuration in which the linear conductors 2111 to 2113, which are Vdd wires, Vss2 wires and Vss1 wires, in the conductor layer B in the first configuration example are replaced with the pairs of the linear conductors 2121 to 2123 which are arranged regularly in the X direction.

The linear conductors 2121 are wires (Vdd wires) connected to the first power supply Vdd. The linear conductors 2122 are wires (Vss1 wires) connected to the second power supply Vss1. The linear conductors 2123 are wires (Vss2 wires) connected to the third power supply Vss2.

Accordingly, while pairs of linear conductors 2121 to 2123 are arranged in the positive direction along the X axis in the order of a Vdd wire, a Vss2 wire and a Vss1 wire in FIG. 214B, the order of arrangement of the pairs of linear conductors 2121 to 2123 is not limited to this example, but can be any order.

The linear conductors 2121 have the X-direction conductor width WXBD, the linear conductors 2122 have the X-direction conductor width WXBS1, and the linear conductors 2123 have the X-direction conductor width WXBS2. For example, the conductor width WXBD of the linear conductors 2121, the conductor width WXBS1 of the linear conductors 2122, and the conductor width WXBS2 of the linear conductors 2123 are the same ((conductor width WXBD)=(conductor width WXBS1)=(conductor width WXBS2)). There is a gap with the gap width GXB between two adjacent ones of the linear conductors 2121 to 2123.

Then, the pairs of the linear conductors 2121 are arranged regularly in the X direction at the conductor pitch FXBD. The pairs of the linear conductors 2122 are arranged regularly in the X direction at the conductor pitch FXBS1, and the pairs of the linear conductors 2123 are arranged regularly in the X direction at the conductor pitch FXBS2. For example, the conductor pitch FXBD, the conductor pitch FXBS1 and the conductor pitch FXBS2 are the same ((conductor pitch FXBD)=(conductor pitch FXBS1)=(conductor pitch FXBS2)).

Accordingly, in a rectangular region in a predetermined range of the conductor layer B, the sum total of the X-direction conductor widths WXBD of linear conductors 2121 connected to the first power supply Vdd, the sum total of the X-direction conductor widths WXBS1 of linear conductors 2122 connected to the second power supply Vss1, and the sum total of the X-direction conductor widths WXBS2 of linear conductors 2123 connected to the third power supply Vss2 are the same. In addition, in a rectangular region in a predetermined range of the conductor layer B, the conductor area size of linear conductors 2121 connected to the first power supply Vdd, the conductor area size of linear conductors 2122 connected to the second power supply Vss1, and the conductor area size of linear conductors 2123 connected to the third power supply Vss2 are the same.

In a case in which any one of the second power supply Vss1 or the third power supply Vss2 is selected in the conductor layer B, the conductor layer B forms a differential structure. Accordingly, inductive noise can be suppressed more than in non-differential structures, and this allows easier noise designing.

FIG. 215 is a plan view depicting the stacked state of the conductor layer A in FIG. 214A, and the conductor layer B in FIG. 214B.

By setting the amount of displacement between the X-direction positions of the linear conductors in the conductor layer A and the conductor layer B, and the X-direction conductor widths and gap widths such that they satisfy a predetermined condition, a light-blocking structure can be formed with the conductor layer A and the conductor layer B in the stacked state as depicted in FIG. 215, and hot carrier light emissions can be blocked.

Linear conductors that are in the conductor layers A and B, and connected to the same power supplies may be electrically connected via conductor vias extending in the Z direction, or the like in predetermined partial regions where the positions of the linear conductors overlap. While it is desirable in terms of voltage drops if linear conductors connected to the same power supplies are electrically connected, this is not essential, and they do not have to be connected.

In the configuration in the first modification example of the first configuration example depicted in FIGS. 214A and 214B, the linear conductors 2111 to 2113, which are Vdd wires, Vss2 wires and Vss1 wires, in the conductor layer B in the conductor layers A and B in the first configuration example of three power supplies depicted in FIGS. 212A and 212B are replaced with the pairs of the linear conductors 2121 to 2123 which are arranged regularly in the X direction.

However, instead of the regular arrangement of the pairs of linear conductors 2121 to 2123, there may be a regular arrangement of sets each including a predetermined number of, three or more, linear conductors 2121 to 2123.

In addition, for example, in another possible configuration, the linear conductors 2101 to 2103, which are Vdd wires, Vss2 wires and Vss1 wires, in the conductor layer A in the conductor layers A and B in the first configuration example of three power supplies depicted in FIGS. 214A and 214B are replaced with the pairs of the linear conductors 2121 to 2123 which are arranged regularly in the X direction.

Alternatively, it is also possible to adopt a configuration in which Vdd wires, Vss2 wires and Vss1 wires in both of the conductor layers A and B are replaced with a predetermined number of, two or more, linear conductors 2121 to 2123 which are arranged regularly in the X direction. In this case, the conductor widths, conductor pitches and gap widths of the linear conductors 2121 to 2123 in the conductor layer A may be the same as or different from the conductor widths, conductor pitches and gap widths of the linear conductors 2121 to 2123 in the conductor layer B. The conductor layer A and the conductor layer B may be the same in terms of any one or two of the conductor widths, conductor pitches and gap widths, and may be different in terms of the other one(s).

<Second Modification Example of First Configuration Example of Three Power Supplies>

FIGS. 216A, 216B, and 217 depict a second modification example of the first configuration example of three power supplies.

In the coordinate systems in both FIGS. 216A, 216B, and 217, the X axis lies in the lateral direction, the Y axis lies in the longitudinal direction, and the Z axis lies in a direction perpendicular to the XY plane.

FIG. 216A depicts a plan view of the conductor layer A, and FIG. 216B depicts a plan view of the conductor layer B. Note that FIGS. 216A and 216B may be regarded as depicting the entire region of each conductor layer or may be regarded as depicting a partial region of each conductor layer.

While the conductor layer A in the first configuration example depicted in FIG. 212A has a configuration in which three conductors, a Vdd conductor, a Vss1 conductor and a Vss2 conductor, that are arranged regularly in the X direction have the same conductor width, the conductor layer A in the second modification example in FIG. 216A has a configuration in which, while a Vdd conductor and a Vss1 conductor have the same conductor width, the conductor width of a Vss2 conductor is made smaller than the conductor width of the Vdd conductor and the Vss1 conductor ((conductor width WXAD)=(conductor width WXAS1)>(conductor width WXAS2)).

Specifically, the conductor layer A in FIG. 216A includes three linear conductors 2131 to 2133 that are long in the Y direction, and arranged in the X direction in a predetermined order, and sets of the three linear conductors 2131 to 2133 are arranged regularly in the X direction.

The linear conductors 2131 are wires (Vdd wires) connected to the first power supply Vdd. The linear conductors 2132 are wires (Vss1 wires) connected to the second power supply Vss1. The linear conductors 2133 are wires (Vss2 wires) connected to the third power supply Vss2.

The linear conductors 2131 have the X-direction conductor width WXAD, the linear conductors 2132 have the X-direction conductor width WXAS1, and the linear conductors 2133 have the X-direction conductor width WXAS2. For example, the conductor width WXAD of the linear conductors 2131, and the conductor width WXAS1 of the linear conductors 2132 are the same ((conductor width WXAD)=(conductor width WXAS1)), and the conductor width WXAS2 of the linear conductors 2133 is made smaller than the conductor width WXAD of the linear conductors 2131, and the conductor width WXAS1 of the linear conductors 2132 ((conductor width WXAD)=(conductor width WXAS1)>(conductor width WXAS2)). In addition, there is a gap with the gap width GXA between two adjacent ones of the linear conductors 2131 to 2133.

The linear conductors 2131 are arranged regularly in the X direction at the conductor pitch FXAD, and the linear conductors 2132 are arranged regularly in the X direction at the conductor pitch FXAS1. Similarly, the linear conductors 2133 are arranged regularly in the X direction at the conductor pitch FXAS2. For example, the conductor pitch FXAD, the conductor pitch FXAS1 and the conductor pitch FXAS2 are the same ((conductor pitch FXAD)=(conductor pitch FXAS1)=(conductor pitch FXAS2)).

Accordingly, in a rectangular region in a predetermined range of the conductor layer A, the sum total of the X-direction conductor widths WXAD of linear conductors 2131 connected to the first power supply Vdd, and the sum total of the X-direction conductor widths WXAS1 of linear conductors 2132 connected to the second power supply Vss1 are the same. Then, the sum total of the X-direction conductor widths WXAS2 of linear conductors 2133 connected to the third power supply Vss2 is smaller than the sum total of the X-direction conductor widths WXAS1 of linear conductors 2132 connected to the second power supply Vss1.

In addition, in a rectangular region in a predetermined range of the conductor layer A, the conductor area size of linear conductors 2131 connected to the first power supply Vdd, and the conductor area size of linear conductors 2132 connected to the second power supply Vss1 are the same. Then, the conductor area size of linear conductors 2133 connected to the third power supply Vss2 is smaller than the conductor area size of linear conductors 2132 connected to the second power supply Vss1.

Similarly to the conductor layer A in the second modification example, the conductor layer B in the second modification example in FIG. 216B also has a configuration in which Vdd conductors and Vss1 conductors have the same conductor width, and the conductor width of Vss2 conductors is made smaller than the conductor width of the Vdd conductors and the Vss1 conductors.

Specifically, the conductor layer B in FIG. 216B includes three linear conductors 2141 to 2143 that are long in the Y direction, and arranged in the X direction in a predetermined order, and sets of the three linear conductors 2141 to 2143 are arranged regularly in the X direction.

The linear conductors 2141 are wires (Vdd wires) connected to the first power supply Vdd. The linear conductors 2142 are wires (Vss1 wires) connected to the second power supply Vss1. The linear conductors 2143 are wires (Vss2 wires) connected to the third power supply Vss2.

The linear conductors 2141 have the X-direction conductor width WXBD, the linear conductors 2142 have the X-direction conductor width WXBS1, and the linear conductors 2143 have the X-direction conductor width WXBS2. For example, the conductor width WXBD of the linear conductors 2141, and the conductor width WXBS1 of the linear conductors 2142 are the same ((conductor width WXBD)=(conductor width WXBS1)), and the conductor width WXBS2 of the linear conductors 2143 is made smaller than the conductor width WXBD of the linear conductors 2141, and the conductor width WXBS1 of the linear conductors 2142 ((conductor width WXBD)=(conductor width WXBS1)>(conductor width WXBS2)). In addition, there is a gap with the gap width GXB between two adjacent ones of the linear conductors 2141 to 2143.

The linear conductors 2141 are arranged regularly in the X direction at the conductor pitch FXBD, and the linear conductors 2142 are arranged regularly in the X direction at the conductor pitch FXBS1. Similarly, the linear conductors 2143 are arranged regularly in the X direction at the conductor pitch FXBS2. For example, the conductor pitch FXBD, the conductor pitch FXBS1 and the conductor pitch FXBS2 are the same ((conductor pitch FXBD)=(conductor pitch FXBS1)=(conductor pitch FXBS2)).

Accordingly, in a rectangular region in a predetermined range of the conductor layer B, the sum total of the X-direction conductor widths WXBD of linear conductors 2141 connected to the first power supply Vdd, and the sum total of the X-direction conductor widths WXBS1 of linear conductors 2142 connected to the second power supply Vss1 are the same. Then, the sum total of the X-direction conductor widths WXBS2 of linear conductors 2143 connected to the third power supply Vss2 is smaller than the sum total of the X-direction conductor widths WXBS1 of linear conductors 2142 connected to the second power supply Vss1.

In addition, in a rectangular region in a predetermined range of the conductor layer B, the conductor area size of linear conductors 2141 connected to the first power supply Vdd, and the conductor area size of linear conductors 2142 connected to the second power supply Vss1 are the same. Then, the conductor area size of linear conductors 2143 connected to the third power supply Vss2 is smaller than the conductor area size of linear conductors 2142 connected to the second power supply Vss1.

FIG. 217 is a plan view depicting the stacked state of the conductor layer A in FIG. 216A, and the conductor layer B in FIG. 216B.

By setting the amount of displacement between the X-direction positions of the linear conductors in the conductor layer A and the conductor layer B, and the X-direction conductor widths and gap widths such that they satisfy a predetermined condition, a light-blocking structure can be formed with the conductor layer A and the conductor layer B in the stacked state as depicted in FIG. 217, and hot carrier light emissions can be blocked.

Linear conductors that are in the conductor layers A and B, and connected to the same power supplies may be electrically connected via conductor vias extending in the Z direction, or the like in predetermined partial regions where the positions of the linear conductors overlap. While it is desirable in terms of voltage drops if linear conductors connected to the same power supplies are electrically connected, this is not essential, and they do not have to be connected.

In the thus-configured conductor layer A and conductor layer B in the second modification example of the first configuration example of three power supplies, because the sum total of the X-direction conductor widths of Vss2 conductors is smaller than the sum total of the X-direction conductor widths of Vss1 conductors, in a case in which the total current amount when the third power supply Vss2 is selected is smaller than the total current amount when the second power supply Vss1 is selected, the total amount of currents to flow through the Vss2 conductors is smaller than the total amount of currents to flow through the Vss1 conductors, and voltage drops are less likely to occur in the Vss2 conductors than in the Vss1 conductors. Thereby, the conductor resistance of the Vss2 conductors can be made higher than the conductor resistance of the Vss1 conductors if voltage drops are within a range that satisfies the tolerated level. Because if the conductor width WXAS2 of Vss2 conductors is made smaller, Vdd conductors and Vss1 conductors can be arranged densely, this leads to amelioration of voltage drops of the Vdd conductors and the Vss1 conductors, if voltage drops are compared on the premise that the wire region has the same area size. In addition, because the area size of an Aggressor loop that generates a magnetic field becomes smaller as conductor pitches become smaller, the inductive noise also can be ameliorated as explained with reference to FIGS. 46, 46B, 46C, 47A, 47B, 47C, 48A, 48B, 48C, 49A, 49B, 49C, 50A, 50B, 50C, 51A, 51B, 51C, 52A, 52B, 52C. 53A, 53B, 53C, 54A, 54B, 54C, 55A, 55B, 55C, 56A, 56B, 56C, 57A, 57B, and 57C.

<Third Modification Example of First Configuration Example of Three Power Supplies>

FIGS. 218A, 218B, and 219 depict a third modification example of the first configuration example of three power supplies.

In the coordinate systems in both FIGS. 218A, 218B, and 219, the X axis lies in the lateral direction, the Y axis lies in the longitudinal direction, and the Z axis lies in a direction perpendicular to the XY plane.

FIG. 218A depicts a plan view of the conductor layer A, and FIG. 218B depicts a plan view of the conductor layer B. Note that FIGS. 218A and 218B may be regarded as depicting the entire region of each conductor layer or may be regarded as depicting a partial region of each conductor layer.

While the conductor layer A in the first configuration example depicted in FIG. 212A has a configuration in which three conductors, a Vdd conductor, a Vss1 conductor and a Vss2 conductor, that are arranged regularly in the X direction have the same conductor width, the conductor layer A in the third modification example in FIG. 218A has a configuration in which the conductor width of the Vss1 conductor is made smaller than the conductor width of the Vdd conductor, and furthermore the conductor width of the Vss2 conductor is made smaller than the conductor width of the Vss1 conductor ((conductor width WXAD)>(conductor width WXAS1)>(conductor width WXAS2)).

Specifically, the conductor layer A in FIG. 218A includes three linear conductors 2151 to 2153 that are long in the Y direction, and arranged in the X direction in a predetermined order, and sets of the three linear conductors 2151 to 2153 are arranged regularly in the X direction.

The linear conductors 2151 are wires (Vdd wires) connected to the first power supply Vdd. The linear conductors 2152 are wires (Vss1 wires) connected to the second power supply Vss1. The linear conductors 2153 are wires (Vss2 wires) connected to the third power supply Vss2.

The linear conductors 2151 have the X-direction conductor width WXAD, the linear conductors 2152 have the X-direction conductor width WXAS1, and the linear conductors 2153 have the X-direction conductor width WXAS2. The conductor width WXAD of the linear conductors 2151 is made larger than the conductor width WXAS1 of the linear conductors 2152 ((conductor width WXAD)>(conductor width WXAS1)), and the conductor width WXAS2 of the linear conductors 2153 is made smaller than the conductor width WXAS1 of the linear conductors 2152 ((conductor width WXAS1)>(conductor width WXAS2)). In addition, there is a gap with the gap width GXA between two adjacent ones of the linear conductors 2151 to 2153.

The linear conductors 2151 are arranged regularly in the X direction at the conductor pitch FXAD, and the linear conductors 2152 are arranged regularly in the X direction at the conductor pitch FXAS1. Similarly, the linear conductors 2153 are arranged regularly in the X direction at the conductor pitch FXAS2. For example, the conductor pitch FXAD, the conductor pitch FXAS1 and the conductor pitch FXAS2 are the same ((conductor pitch FXAD)=(conductor pitch FXAS1)=(conductor pitch FXAS2)).

Accordingly, in a rectangular region in a predetermined range of the conductor layer A, the sum total of the X-direction conductor widths WXAS1 of linear conductors 2152 connected to the second power supply Vss1 is smaller than the sum total of the X-direction conductor widths WXAD of linear conductors 2151 connected to the first power supply Vdd. Then, the sum total of the X-direction conductor widths WXAS2 of linear conductors 2153 connected to the third power supply Vss2 is smaller than the sum total of the X-direction conductor widths WXAS1 of linear conductors 2152 connected to the second power supply Vss1.

In a rectangular region in a predetermined range of the conductor layer A, the conductor area size of linear conductors 2152 connected to the second power supply Vss1 is smaller than the conductor area size of linear conductors 2151 connected to the first power supply Vdd. Then, the conductor area size of linear conductors 2153 connected to the third power supply Vss2 is smaller than the conductor area size of linear conductors 2152 connected to the second power supply Vss1. That is, the Vdd conductors, the Vss1 conductors and the Vss2 conductors in the conductor layer A have mutually different conductor area sizes.

Similarly to the conductor layer A in the third modification example, the conductor layer B in the third modification example in FIG. 218B also has a configuration in which the conductor width of the Vss1 conductors is made smaller than the conductor width of the Vdd conductors, and the conductor width of the Vss2 conductors is made smaller than the conductor width of the Vss1 conductors ((conductor width WXBD)>(conductor width WXBS1)>(conductor width WXBS2)).

Specifically, the conductor layer B in FIG. 218B includes three linear conductors 2161 to 2163 that are long in the Y direction, and arranged in the X direction in a predetermined order, and sets of the three linear conductors 2161 to 2163 are arranged regularly in the X direction.

The linear conductors 2161 are wires (Vdd wires) connected to the first power supply Vdd. The linear conductors 2162 are wires (Vss1 wires) connected to the second power supply Vss1. The linear conductors 2163 are wires (Vss2 wires) connected to the third power supply Vss2.

The linear conductors 2161 have the X-direction conductor width WXBD, the linear conductors 2162 have the X-direction conductor width WXBS1, and the linear conductors 2163 have the X-direction conductor width WXAB2. The conductor width WXBD of the linear conductors 2161 is made larger than the conductor width WXBS1 of the linear conductors 2162 ((conductor width WXBD)>(conductor width WXBS1)), and the conductor width WXBS2 of the linear conductors 2163 is made smaller than the conductor width WXBS1 of the linear conductors 2162 ((conductor width WXBS1)>(conductor width WXBS2)). In addition, there is a gap with the gap width GXB between two adjacent ones of the linear conductors 2161 to 2163.

The linear conductors 2161 are arranged regularly in the X direction at the conductor pitch FXBD, and the linear conductors 2162 are arranged regularly in the X direction at the conductor pitch FXBS1. Similarly, the linear conductors 2163 are arranged regularly in the X direction at the conductor pitch FXBS2. For example, the conductor pitch FXBD, the conductor pitch FXBS1 and the conductor pitch FXBS2 are the same ((conductor pitch FXBD)=(conductor pitch FXBS1)=(conductor pitch FXBS2)).

Accordingly, in a rectangular region in a predetermined range of the conductor layer B, the sum total of the X-direction conductor widths WXBS1 of linear conductors 2162 connected to the second power supply Vss1 is smaller than the sum total of the X-direction conductor widths WXBD of linear conductors 2161 connected to the first power supply Vdd. Then, the sum total of the X-direction conductor widths WXBS2 of linear conductors 2163 connected to the third power supply Vss2 is smaller than the sum total of the X-direction conductor widths WXBS1 of linear conductors 2162 connected to the second power supply Vss1.

In addition, in a rectangular region in a predetermined range of the conductor layer B, the conductor area size of linear conductors 2162 connected to the second power supply Vss1 is smaller than the conductor area size of linear conductors 2161 connected to the first power supply Vdd. Then, the conductor area size of linear conductors 2163 connected to the third power supply Vss2 is smaller than the conductor area size of linear conductors 2162 connected to the second power supply Vss1. That is, the Vdd conductors, the Vss1 conductors, and the Vss2 conductors of the conductor layer B have mutually different conductor area sizes.

FIG. 219 is a plan view depicting the stacked state of the conductor layer A in FIG. 218A, and the conductor layer B in FIG. 218B.

By setting the amount of displacement between the X-direction positions of the linear conductors in the conductor layer A and the conductor layer B, and the X-direction conductor widths and gap widths such that they satisfy a predetermined condition, a light-blocking structure can be formed with the conductor layer A and the conductor layer B in the stacked state as depicted in FIG. 219, and hot carrier light emissions can be blocked.

Linear conductors that are in the conductor layers A and B, and connected to the same power supplies may be electrically connected via conductor vias extending in the Z direction, or the like in predetermined partial regions where the positions of the linear conductors overlap. While it is desirable in terms of voltage drops if linear conductors connected to the same power supplies are electrically connected, this is not essential, and they do not have to be connected.

In the thus-configured conductor layer A and conductor layer B in the third modification example of the first configuration example of three power supplies, because the sum total of the X-direction conductor widths of Vss2 conductors is smaller than the sum total of the X-direction conductor widths of Vss1 conductors, in a case in which the total current amount when the third power supply Vss2 is selected is smaller than the total current amount when the second power supply Vss1 is selected, the total amount of currents to flow through the Vss2 conductors is smaller than the total amount of currents to flow through the Vss1 conductors, and voltage drops are less likely to occur in the Vss2 conductors than in the Vss1 conductors. Thereby, the conductor resistance of the Vss2 conductors can be made higher than the conductor resistance of the Vss1 conductors if voltage drops are within a range that satisfies the tolerated level.

In a configuration in which the second power supply Vss1 and the third power supply Vss2 are switched selectively, the Vdd conductors are elements to be used in common. By making voltage drops less likely to occur in the Vdd conductors to be used in common than in the Vss1 conductors and the Vss2 conductors, voltage drops can be ameliorated for both the combination of the Vdd conductors and the Vss1 conductors, and the combination of the Vdd conductors and the Vss2 conductors in some cases. In addition, because conductors are arranged more densely in the third modification example than in the second modification example, voltage drops and inductive noise can be ameliorated further in some cases.

<Fourth Modification Example of First Configuration Example of Three Power Supplies>

FIGS. 220A, 220B, and 221 depict a fourth modification example of the first configuration example of three power supplies.

In the coordinate systems in both FIGS. 220A, 220B, and 221, the X axis lies in the lateral direction, the Y axis lies in the longitudinal direction, and the Z axis lies in a direction perpendicular to the XY plane.

FIG. 220A depicts a plan view of the conductor layer A, and FIG. 220B depicts a plan view of the conductor layer B. Note that FIGS. 220A and 220B may be regarded as depicting the entire region of each conductor layer or may be regarded as depicting a partial region of each conductor layer.

While the conductor layer A in the first configuration example depicted in FIG. 220A has a configuration in which three conductors, a Vdd conductor, a Vss1 conductor and a Vss2 conductor, that are arranged regularly in the X direction have the same conductor width, the conductor layer A in the fourth modification example in FIG. 220A has a configuration in which the conductor widths of the Vss1 conductor and the Vss2 conductor are made smaller than the conductor width of the Vdd conductor, and the conductor widths of the Vss1 conductor and the Vss2 conductor are made the same ((conductor width WXAD)>(conductor width WXAS1)=(conductor width WXAS2)).

Specifically, the conductor layer A in FIG. 220A includes three linear conductors 2171 to 2173 that are long in the Y direction, and arranged in the X direction in a predetermined order, and sets of the three linear conductors 2171 to 2173 are arranged regularly in the X direction.

The linear conductors 2171 are wires (Vdd wires) connected to the first power supply Vdd. The linear conductors 2172 are wires (Vss1 wires) connected to the second power supply Vss1. The linear conductors 2173 are wires (Vss2 wires) connected to the third power supply Vss2.

The linear conductors 2171 have the X-direction conductor width WXAD, the linear conductors 2172 have the X-direction conductor width WXAS1, and the linear conductors 2173 have the X-direction conductor width WXAS2. The conductor width WXAD of the linear conductors 2171 is larger than both the conductor width WXAS1 of the linear conductors 2172, and the conductor width WXAS2 of the linear conductors 2173, and, for example, the conductor width WXAS1 of the linear conductors 2172, and the conductor width WXAS2 of the linear conductors 2173 are the same ((conductor width WXAD)>(conductor width WXAS1)=(conductor width WXAS2)). In addition, there is a gap with the gap width GXA between two adjacent ones of the linear conductors 2171 to 2173.

The linear conductors 2171 are arranged regularly in the X direction at the conductor pitch FXAD, and the linear conductors 2172 are arranged regularly in the X direction at the conductor pitch FXAS1. Similarly, the linear conductors 2173 are arranged regularly in the X direction at the conductor pitch FXAS2. For example, the conductor pitch FXAD, the conductor pitch FXAS1 and the conductor pitch FXAS2 are the same ((conductor pitch FXAD)=(conductor pitch FXAS1)=(conductor pitch FXAS2)).

Accordingly, in a rectangular region in a predetermined range of the conductor layer A, each of the sum total of the X-direction conductor widths WXAS1 of linear conductors 2172 connected to the second power supply Vss1, and the sum total of the X-direction conductor widths WXAS2 of linear conductors 2173 connected to the third power supply Vss2 is smaller than the sum total of the X-direction conductor widths WXAD of linear conductors 2171 connected to the first power supply Vdd. Then, the sum total of the X-direction conductor widths WXAS1 of linear conductors 2172 connected to the second power supply Vss1, and the sum total of the X-direction conductor widths WXAS2 of linear conductors 2173 connected to the third power supply Vss2 are equal to each other.

In addition, in a rectangular region in a predetermined range of the conductor layer A, each of the conductor area size of linear conductors 2172 connected to the second power supply Vss1, and the conductor area size of linear conductors 2173 connected to the third power supply Vss2 is smaller than the conductor area size of linear conductors 2171 connected to the first power supply Vdd. Then, the conductor area size of linear conductors 2172 connected to the second power supply Vss1, and the conductor area size of linear conductors 2173 connected to the third power supply Vss2 are equal to each other.

Similarly to the conductor layer A in the fourth modification example, the conductor layer B in the fourth modification example in FIG. 220B also has a configuration in which the conductor widths of the Vss1 conductors and the Vss2 conductors are made smaller than the conductor width of the Vdd conductors, and the conductor widths of the Vss1 conductors and the Vss2 conductors are made the same ((conductor width WXBD)>(conductor width WXBS1)=(conductor width WXBS2)).

Specifically, the conductor layer B in FIG. 220B includes three linear conductors 2181 to 2183 that are long in the Y direction, and arranged in the X direction in a predetermined order, and sets of the three linear conductors 2181 to 2183 are arranged regularly in the X direction.

The linear conductors 2181 are wires (Vdd wires) connected to the first power supply Vdd. The linear conductors 2182 are wires (Vss1 wires) connected to the second power supply Vss1. The linear conductors 2183 are wires (Vss2 wires) connected to the third power supply Vss2.

The linear conductors 2181 have the X-direction conductor width WXBD, the linear conductors 2182 have the X-direction conductor width WXBS1, and the linear conductors 2183 have the X-direction conductor width WXAB2. The conductor width WXBD of the linear conductors 2181 is larger than both the conductor width WXBS1 of the linear conductors 2182, and the conductor width WXBS2 of the linear conductors 2183, and, for example, the conductor width WXBS1 of the linear conductors 2182, and the conductor width WXBS2 of the linear conductors 2183 are the same ((conductor width WXBD)>(conductor width WXBS1)=(conductor width WXBS2)). In addition, there is a gap with the gap width GXB between two adjacent ones of the linear conductors 2181 to 2183.

The linear conductors 2181 are arranged regularly in the X direction at the conductor pitch FXBD, and the linear conductors 2182 are arranged regularly in the X direction at the conductor pitch FXBS1. Similarly, the linear conductors 2183 are arranged regularly in the X direction at the conductor pitch FXBS2. The conductor pitch FXBD, the conductor pitch FXBS1 and the conductor pitch FXBS2 are the same ((conductor pitch FXBD)=(conductor pitch FXBS1)=(conductor pitch FXBS2)).

Accordingly, in a rectangular region in a predetermined range of the conductor layer B, each of the sum total of the X-direction conductor widths WXBS1 of linear conductors 2182 connected to the second power supply Vss1, and the sum total of the X-direction conductor widths WXBS2 of linear conductors 2183 connected to the third power supply Vss2 is smaller than the sum total of the X-direction conductor widths WXBD of linear conductors 2181 connected to the first power supply Vdd. Then, the sum total of the X-direction conductor widths WXBS1 of linear conductors 2182 connected to the second power supply Vss1, and the sum total of the X-direction conductor widths WXBS2 of linear conductors 2183 connected to the third power supply Vss2 are equal to each other.

In addition, in a rectangular region in a predetermined range of the conductor layer B, each of the conductor area size of linear conductors 2182 connected to the second power supply Vss1, and the conductor area size of linear conductors 2183 connected to the third power supply Vss2 is smaller than the conductor area size of linear conductors 2181 connected to the first power supply Vdd. Then, the conductor area size of linear conductors 2182 connected to the second power supply Vss1, and the conductor area size of linear conductors 2183 connected to the third power supply Vss2 are equal to each other.

FIG. 221 is a plan view depicting the stacked state of the conductor layer A in FIG. 220A, and the conductor layer B in FIG. 220B.

By setting the amount of displacement between the X-direction positions of the linear conductors in the conductor layer A and the conductor layer B, and the X-direction conductor widths and gap widths such that they satisfy a predetermined condition, a light-blocking structure can be formed with the conductor layer A and the conductor layer B in the stacked state as depicted in FIG. 221, and hot carrier light emissions can be blocked.

Linear conductors that are in the conductor layers A and B, and connected to the same power supplies may be electrically connected via conductor vias extending in the Z direction, or the like in predetermined partial regions where the positions of the linear conductors overlap. While it is desirable in terms of voltage drops if linear conductors connected to the same power supplies are electrically connected, this is not essential, and they do not have to be connected.

In the thus-configured conductor layer A and conductor layer B in the fourth modification example of the first configuration example of three power supplies, the structural difference between the combination of the Vdd conductors and the Vss1 conductors, and the combination of the Vdd conductors and the Vss2 conductors can be made small in a configuration in which the second power supply Vss1 and the third power supply Vss2 are switched selectively. Thereby, for example, in a case in which the second power supply Vss1 and the third power supply Vss2 have the same power supply voltage, differences in voltage drops, and differences in inductive noise can be made small. In addition, because conductors are arranged more densely in the fourth modification example than in the third modification example, voltage drops and inductive noise can be ameliorated further in some cases.

While the conductor layer A and the conductor layer B form a light-blocking structure in the examples explained in the first configuration example of three power supplies mentioned above, and the first modification example to fourth modification example thereof, the conductor layer A and the conductor layer B in the stacked state need not necessarily form a light-blocking structure. For example, the X-direction gap width may be larger than the X-direction positional displacement in one possible configuration, the X-direction positional displacement may be larger than X-direction conductor widths in another possible configuration, and the X-direction positional displacement may be zero or a value close to zero. Note that depending on the configurations of linear conductors in the conductor layer A and the conductor layer B, the conductor layer A and the conductor layer B in the stacked state form a light-blocking structure even if the X-direction positional displacement is made larger than X-direction conductor widths, in some cases. In addition, either one of the conductor layer A and the conductor layer B may not be provided in one possible configuration, and either the conductor layer A or the conductor layer B may have a conductor arrangement other than the configurations mentioned above. Even in a case in which the conductor layer A and the conductor layer B in the stacked state do not form a light-blocking structure, voltage drops and inductive noise can be ameliorated.

<Second Configuration Example of Three Power Supplies>

FIGS. 222A, 222B, and 223 depict a second configuration example of three power supplies.

In the coordinate systems in both FIGS. 222A, 222B, and 223, the X axis lies in the lateral direction, the Y axis lies in the longitudinal direction, and the Z axis lies in a direction perpendicular to the XY plane.

FIG. 222A depicts a plan view of the conductor layer A, and FIG. 222B depicts a plan view of the conductor layer B. Note that FIGS. 222A and 222B may be regarded as depicting the entire region of each conductor layer or may be regarded as depicting a partial region of each conductor layer.

While the repetition directions of linear conductors in the conductor layer A and the conductor layer B are the same and are the X direction in the first configuration example and modification examples thereof mentioned above, the repetition direction of linear conductor in the conductor layer A and the repetition direction of linear conductor in the conductor layer B are orthogonal directions and are the X direction and the Y direction in the configuration in the second configuration example.

The conductor layer A in FIG. 222A is the same as the conductor layer A in the first configuration example depicted in FIG. 212A, and so an explanation thereof is omitted. The repetition direction of the linear conductors 2101 to 2103 in the conductor layer A that are long in the Y direction is the X direction.

In contrast, the repetition direction of linear conductors in the conductor layer B in B in FIG. 222B is the Y direction orthogonal to the X direction, which is the repetition direction of the conductor layer A.

Specifically, the conductor layer B includes three linear conductors 2191 to 2193 that are long in the X direction, and arranged in the Y direction in a predetermined order, and sets of the three linear conductors 2191 to 2193 are arranged regularly in the Y direction.

The linear conductors 2191 are wires (Vdd wires) connected to the first power supply Vdd. The linear conductors 2192 are wires (Vss1 wires) connected to the second power supply Vss1. The linear conductors 2193 are wires (Vss2 wires) connected to the third power supply Vss2.

Accordingly, while the three linear conductors 2191 to 2193 are arranged in the positive direction along the Y axis in the order of a Vdd wire, a Vss2 wire and a Vss1 wire in FIG. 222B, the order of arrangement of the three linear conductors 2191 to 2193 is not limited to this example, but can be any order.

The linear conductors 2191 have a Y-direction conductor width WYBD, the linear conductors 2192 have a Y-direction conductor width WYBS1, and the linear conductors 2193 have a Y-direction conductor width WYBS2. For example, the conductor width WYBD of the linear conductors 2191, the conductor width WYBS1 of the linear conductors 2192, and the conductor width WYBS2 of the linear conductors 2193 are the same ((conductor width WYBD)=(conductor width WYBS1)=(conductor width WYBS2)). There is a gap with the gap width GYB between two adjacent ones of the linear conductors 2191 to 2193.

Then, the linear conductors 2191 are arranged regularly in the Y direction at a conductor pitch FYBD. The linear conductors 2192 are arranged regularly in the Y direction at a conductor pitch FYBS1, and the linear conductors 2193 are arranged regularly in the Y direction at a conductor pitch FYBS2. For example, the conductor pitch FYBD, the conductor pitch FYBS1 and the conductor pitch FYBS2 are the same ((conductor pitch FYBD)=(conductor pitch FYBS1)=(conductor pitch FYBS2)).

Accordingly, in a rectangular region in a predetermined range of the conductor layer B, the sum total of the Y-direction conductor widths WYBD of linear conductors 2191 connected to the first power supply Vdd, the sum total of the Y-direction conductor widths WYBS1 of linear conductors 2192 connected to the second power supply Vss1, and the sum total of the Y-direction conductor widths WYBS2 of linear conductors 2193 connected to the third power supply Vss2 are the same.

In addition, in a rectangular region in a predetermined range of the conductor layer B, the conductor area size of linear conductors 2191 connected to the first power supply Vdd, the conductor area size of linear conductors 2192 connected to the second power supply Vss1, and the conductor area size of linear conductors 2193 connected to the third power supply Vss2 are the same.

FIG. 223 is a plan view depicting the stacked state of the conductor layer A in FIG. 222A, and the conductor layer B in FIG. 222A.

As depicted in FIG. 223, the stacking of the conductor layer A and the conductor layer B in the second configuration example, that is, the stacking of the conductor layer A having a regular arrangement of the linear conductors 2101 to 2103 that are long in the Y direction, and the conductor layer B having a regular arrangement of the linear conductors 2191 to 2193 that are long in the X direction cannot realize a full light-blocking structure, but can provide a certain degree of light-blocking property.

Linear conductors that are in the conductor layers A and B, and connected to the same power supplies may be electrically connected via conductor vias extending in the Z direction, or the like in predetermined partial regions where the positions of the linear conductors overlap. While it is desirable in terms of voltage drops if linear conductors connected to the same power supplies are electrically connected, this is not essential, and they do not have to be connected.

FIG. 224A is a plan view depicting the stacked state of only the linear conductors 2101 and the linear conductors 2191, which are Vdd conductors in the conductor layer A and the conductor layer B.

FIG. 224B is a plan view depicting the stacked state of only the linear conductors 2102 and the linear conductors 2192, which are Vss1 conductors in the conductor layer A and the conductor layer B.

FIG. 225 is a plan view depicting the stacked state of only the linear conductors 2103 and the linear conductors 2193, which are Vss2 conductors in the conductor layer A and the conductor layer B.

In a case in which linear conductors that are in the conductor layers A and B and are connected to the same power supplies are electrically connected by conductor vias in the Z direction, or the like, a mesh structure of three power supplies of the Vdd conductors, the Vss1 conductors and the Vss2 conductors can be realized by the two layers, the conductor layer A and the conductor layer B, as depicted in FIGS. 224A, 224B, and 225. For example, in a case in which three power supplies are realized by using conductor layers of mesh conductors as in the fourth configuration example of the conductor layers A and B depicted in FIGS. 25A and 25B, three conductor layers are necessary. Accordingly, the second configuration example of three power supplies makes it possible to enhance the degree of freedom of layouts of wires with a small number of stacked layers.

By realizing a mesh structure of three power supplies with the two layers, the conductor layer A and the conductor layer B, currents are more easily diffused in the X direction, and so inductive noise can be ameliorated. In addition, depending on the pad arrangement, the conductor resistances as seen from pad ends can be reduced, and so voltage drops can be ameliorated.

According to the second configuration example of three power supplies mentioned above, if the linear conductors 2101 and the linear conductors 2191 that are connected to the same first power supply Vdd in the conductor layer A and the conductor layer B are compared with each other, the conductor width WXAD and the conductor width WYBD are different, but the conductor width WXAD and the conductor width WYBD may be made the same in one possible configuration. Similarly, the conductor pitch FXAD and the conductor pitch FYBD also are different, but the conductor pitch FXAD and the conductor pitch FYBD may be made the same in one possible configuration.

<First Modification Example of Second Configuration Example of Three Power Supplies>

FIGS. 226A and 226B depict a first modification example of the second configuration example of three power supplies.

In the coordinate system in FIGS. 226A and 226B, the X axis lies in the lateral direction, the Y axis lies in the longitudinal direction, and the Z axis lies in a direction perpendicular to the XY plane.

FIG. 226A depicts a plan view of the conductor layer A, and FIG. 226B depicts a plan view of the conductor layer B. Note that FIGS. 226A and 226B may be regarded as depicting the entire region of each conductor layer or may be regarded as depicting a partial region of each conductor layer. Regarding the first modification example of the second configuration example, a plan view depicting the stacked state of the conductor layer A and the conductor layer B is omitted.

The conductor layer A in FIG. 226A is the same as the conductor layer A in the second modification example of the first configuration example depicted in A in FIG. 216A. In other words, while the conductor layer A in the second configuration example depicted in FIG. 222A has a configuration in which the Vdd conductor, the Vss1 conductor and the Vss2 conductor have the same conductor width, the conductor layer A in the first modification example in FIGS. 226A and 226B has a configuration in which a Vdd conductor and a Vss1 conductor have the same conductor width, the conductor width of a Vss2 conductor is set smaller than the conductor width of the Vdd conductor and the Vss1 conductor ((conductor width WXAD)=(conductor width WXAS1)>(conductor width WXAS2)). Thereby, in the first modification example, the X-direction conductor pitch FXAD, conductor pitch FXAS1 and conductor pitch FXAS2 are made smaller than those in the second configuration example.

The conductor layer B in FIG. 226B is the same as the conductor layer B in the second configuration example depicted in FIG. 222B, and so an explanation thereof is omitted.

<Second Modification Example of Second Configuration Example of Three Power Supplies>

FIGS. 227A and 227B depict a second modification example of the second configuration example of three power supplies.

In the coordinate system in FIGS. 227A and 227B, the X axis lies in the lateral direction, the Y axis lies in the longitudinal direction, and the Z axis lies in a direction perpendicular to the XY plane.

FIG. 227A depicts a plan view of the conductor layer A, and FIG. 227B depicts a plan view of the conductor layer B. Note that FIGS. 227A and 227B may be regarded as depicting the entire region of each conductor layer or may be regarded as depicting a partial region of each conductor layer. Regarding the second modification example of the second configuration example, a plan view depicting the stacked state of the conductor layer A and the conductor layer B is omitted.

The conductor layer A in FIG. 227A is the same as the conductor layer A in the first modification example of the second configuration example depicted in FIG. 226A. That is, the conductor layer A has a configuration in which the conductor width of the Vss2 conductors is set smaller than the conductor widths of the Vdd conductors and the Vss1 conductors formed with the same conductor width ((conductor width WXAD)=(conductor width WXAS1)>(conductor width WXAS2)).

The conductor layer B in FIG. 227B has a configuration in which the conductor width of the Vss2 conductors connected to the third power supply Vss2 is made smaller as compared with that in the conductor layer B in the first modification example of the second configuration example depicted in FIG. 226B.

Specifically, the conductor layer B includes three linear conductors 2201 to 2203 that are long in the X direction, and arranged in the Y direction in a predetermined order, and sets of the three linear conductors 2201 to 2203 are arranged regularly in the Y direction.

The linear conductors 2201 are wires (Vdd wires) connected to the first power supply Vdd. The linear conductors 2202 are wires (Vss1 wires) connected to the second power supply Vss1. The linear conductors 2203 are wires (Vss2 wires) connected to the third power supply Vss2.

The linear conductors 2201 have the Y-direction conductor width WYBD, the linear conductors 2202 have the Y-direction conductor width WYBS1, and the linear conductors 2203 have the Y-direction conductor width WYBS2. For example, the conductor width WYBD of the linear conductors 2201, and the conductor width WYBS1 of the linear conductors 2202 are the same, and the conductor width WYBS2 of the linear conductors 2203 is made smaller than the conductor width WYBD of the linear conductors 2201, and the conductor width WYBS1 of the linear conductors 2202 ((conductor width WYBD)=(conductor width WYBS1)>(conductor width WYBS2)). There is a gap with the gap width GYB between two adjacent ones of the linear conductors 2201 to 2203.

Then, the linear conductors 2201 are arranged regularly in the Y direction at the conductor pitch FYBD. The linear conductors 2202 are arranged regularly in the Y direction at the conductor pitch FYBS1, and the linear conductors 2203 are arranged regularly in the Y direction at the conductor pitch FYBS2. For example, the conductor pitch FYBD, the conductor pitch FYBS1, and the conductor pitch FYBS2 are pitch the same ((conductor pitch FYBD)=(conductor FYBS1)=(conductor pitch FYBS2)). In the second modification example, the Y-direction conductor pitch FYBD, conductor pitch FYBS1, and conductor pitch FYBS2 are made smaller than those in the second configuration example depicted in FIGS. 222A and 222B.

The conductor width WXBS2 of the Vss2 conductors in the conductor layer A may be made smaller, and the X-direction conductor pitches (the conductor pitch FXAD, the conductor pitch FXAS1 and the conductor pitch FXAS2) may be made smaller as compared with those of the second configuration example in one possible configuration as in the first modification example depicted in FIGS. 226A and 226B. Not only that in the conductor layer A, but also the conductor width WYBS2 of the Vss2 conductors in the conductor layer B may be made smaller, and both the X-direction conductor pitches of the conductor layer A and the Y-direction conductor pitches (the conductor pitch FYBD, the conductor pitch FYBS1 and the conductor pitch FYBS2) of the conductor layer B may be made smaller in one possible configuration as in the second modification example depicted in FIGS. 227A and 227B. By making the conductor pitches smaller, inductive noise can be ameliorated, and voltage drops also can be ameliorated in some cases.

While the conductor width of only the Vss2 conductors is made smaller than the conductor width of the Vdd conductors in both the conductor layer A and the conductor layer B in the first modification example and the second modification example, the conductor widths of both the Vss1 conductors and the Vss2 conductors may be made smaller than the conductor width of the Vdd conductors in one possible configuration. The conductor widths of the Vss1 conductors and the Vss2 conductors in that case may be the same with each other or may be mutually different.

In order to make the current distributions in the Vdd conductors, the Vss1 conductors and the Vss2 conductors the same between the conductor layer A and the conductor layer B, the ratios among the conductor widths of the Vdd conductors, the Vss1 conductors and the Vss2 conductors are desirably made the same between the conductor layer A and the conductor layer B, but may be made different therebetween. For example, as the sheet resistance of the conductor layer B increases to be higher than, like equal to or higher than 200%, equal to or higher than 300%, equal to or higher than 400% . . . of, the sheet resistance of the conductor layer A, a larger difference between the ratios of the conductor widths of the conductor layer A and the conductor layer B can be tolerated.

<Third Configuration Example of Three Power Supplies>

FIGS. 228A, 228B, and 229 depict a third configuration example of three power supplies.

In the coordinate systems in both FIGS. 228A, 228B, and 229, the X axis lies in the lateral direction, the Y axis lies in the longitudinal direction, and the Z axis lies in a direction perpendicular to the XY plane.

FIG. 228A depicts a plan view of the conductor layer A, and FIG. 228B depicts a plan view of the conductor layer B. Note that FIGS. 228A and 228B may be regarded as depicting the entire region of each conductor layer or may be regarded as depicting a partial region of each conductor layer.

While the conductor layer A in the first configuration example and second configuration example mentioned above includes linear conductors that are long in the Y direction and are connected to the same power supplies even at different Y positions if the linear conductors are at the same X positions, the conductor layer A in FIG. 228A is different in that rectangular Vdd conductors, rectangular Vss1 conductors and rectangular Vss2 conductors are arranged repetitively at predetermined Y-direction pitches.

More specifically, at predetermined X positions of the conductor layer A, rectangular conductors 2211 (hereinafter, referred to as rectangular Vdd conductors 2211) connected to the first power supply Vdd, rectangular conductors 2212 (hereinafter, referred to as rectangular Vss1 conductors 2212) connected to the second power supply Vss1, and rectangular conductors 2213 (hereinafter, referred to as rectangular Vss2 conductors 2213) connected to the third power supply Vss2 are arranged regularly in this order in the positive direction along the Y axis. It should be noted however that the order of arrangement of the three rectangular conductors 2211 to 2213 is not limited to this example, but can be any order. The rectangular Vdd conductors 2211 have the X-direction conductor width WXAD, and a Y-direction conductor width WYAD. The rectangular Vss1 conductors 2212 have the X-direction conductor width WXAS1, and a Y-direction conductor width WYAS1. The rectangular Vss2 conductors 2213 have the X-direction conductor width WXAS2, and a Y-direction conductor width WYAS2. There are gaps with the X-direction gap width GXA and the Y-direction gap width GYB between adjacent rectangular conductors.

The X-direction pitches (rectangular-conductor pitches) at which rectangular conductors, the rectangular Vdd conductors, the rectangular Vss1 conductors or the rectangular Vss2 conductors, are arranged are (X-direction conductor width)+(X-direction gap width), and the Y-direction pitches (rectangular-conductor pitches) are (Y-direction conductor width)+(Y-direction gap width).

In addition, in the conductor layer A, three adjacent columns, each column of which includes sets of a rectangular Vdd conductor 2211, a rectangular Vss1 conductor 2212, and a rectangular Vss2 conductor 2213 that are arranged regularly in the Y direction, form one group, and the Y-direction positions of the rectangular conductors are displaced between the groups such that gap positions of groups that are adjacent to each other in the X direction are positioned at the middles, in the Y direction, of gap positions of adjacent groups.

Further, if attention is paid to the arrangement of a rectangular Vdd conductor 2211, a rectangular Vss1 conductor 2212, and a rectangular Vss2 conductor 2213 in each column in three columns included in one group, the Y-direction positions of the rectangular Vdd conductor, the rectangular Vss1 conductor and the rectangular Vss2 conductor are displaced between the columns such that rectangular conductors connected to the same power supplies are not arranged at the same Y-direction positions of the columns. On the other hand, when the arrangement of rectangular conductors in three columns is looked at separately for each power supply to which the rectangular conductors are connected, for example, the rectangular Vdd conductors 2211 are arranged at positions of . . . , the left column, the middle column, the right column, the left column, the middle column, the right column, . . . as the rectangular Vdd conductors 2211 are displaced at the rectangular-conductor pitch in the positive direction along the Y axis. This similarly applies also to the arrangement of the rectangular Vss1 conductors 2212 and the rectangular Vss2 conductors 2213.

By adopting the arrangement in which the positions of the rectangular Vdd conductors, the rectangular Vss1 conductors, and the rectangular Vss2 conductors are displaced between columns, the distribution of magnetic fields is dispersed, and so inductive noise can be reduced. In addition, by arranging Vdd conductors (rectangular Vdd conductors), and Vss conductors (rectangular Vss1 conductors and rectangular Vss2 conductors) alternately in one column, capacitive noise can be reduced. Furthermore, by forming one group with three columns, and displacing the Y-direction positions of rectangular conductors between the groups, the distribution of magnetic fields is dispersed further, and inductive noise can be reduced further.

On the other hand, the conductor layer B in FIG. 228B is the same as the conductor layer B in the second configuration example depicted in FIG. 222B, and so an explanation thereof is omitted.

FIG. 229 is a plan view depicting the stacked state of the conductor layer A in FIG. 228A, and the conductor layer B in FIG. 228B.

As depicted in FIG. 229, the stacking of the conductor layer A in which three columns, each column of which includes rectangular Vdd conductors, rectangular Vss1 conductors and rectangular Vss2 conductors whose Y-direction positions are displaced between columns, form one group, and the Y-direction positions of the rectangular conductors are displaced between the groups, and the conductor layer B having a regular arrangement of the linear conductors 2191 to 2193 that are long in the X direction cannot realize a full light-blocking structure, but can provide a certain degree of light-blocking property.

Linear conductors that are in the conductor layers A and B, and connected to the same power supplies may be electrically connected via conductor vias extending in the Z direction, or the like in predetermined partial regions where the positions of the linear conductors overlap. While it is desirable in terms of voltage drops if linear conductors connected to the same power supplies are electrically connected, this is not essential, and they do not have to be connected.

FIG. 230A is a plan view depicting the stacked state of only the rectangular Vdd conductors 2211 and the linear conductors 2191, which are Vdd conductors in the conductor layer A and the conductor layer B.

FIG. 230B is a plan view depicting the stacked state of only the rectangular Vss1 conductors 2212 and the linear conductors 2192, which are Vss1 conductors in the conductor layer A and the conductor layer B.

FIG. 231 is a plan view depicting the stacked state of only the rectangular Vss2 conductors 2213 and the linear conductors 2193, which are Vss2 conductors in the conductor layer A and the conductor layer B.

According to the third configuration example of three power supplies, by adopting a configuration in which the Y-direction positions of rectangular conductors are displaced between groups, it becomes possible to form a spurious mesh structure with the two layers, the conductor layer A and the conductor layer B, as depicted in FIGS. 230A, 230B, and 231 in a case in which conductors that are in the conductor layers A and B and are connected to the same power supplies are electrically connected. Accordingly, currents can be caused to flow in both the X direction and the Y direction, and the degree of freedom of layouts of wires can be enhanced. In a case in which the conductor layer B has a regular arrangement of linear conductors in the X direction or the Y direction, if the Y-direction pitch displacement between groups in the conductor layer A is eliminated, it becomes difficult to cause currents to flow in both the X direction and the Y direction with the two layers, the conductor layer A and the conductor layer B; however, by providing the Y-direction pitch displacement between groups in the conductor layer A, a spurious mesh structure can be realized, and so the degree of freedom of layouts of wires can be enhanced. For example, in a case in which the conductor layer B has diagonal-line-like conductors or stepwise conductors that extend in diagonal directions relative to the X direction or the Y direction, the Y-direction pitch displacement between groups of the conductor layer A does not have to be provided. Needless to say, the Y-direction pitch displacement between groups in the conductor layer A may be provided.

By realizing a spurious mesh structure of three power supplies with the two layers, the conductor layer A and the conductor layer B, currents are more easily diffused in the X direction, and so inductive noise can be ameliorated. In addition, depending on the pad arrangement, the conductor resistances as seen from pad ends can be reduced, and so voltage drops can be ameliorated.

<First Modification Example of Third Configuration Example of Three Power Supplies>

FIGS. 232A, 232B, and 233 depict a first modification example of the third configuration example of three power supplies.

In the coordinate systems in both FIGS. 232A, 232B, and 233, the X axis lies in the lateral direction, the Y axis lies in the longitudinal direction, and the Z axis lies in a direction perpendicular to the XY plane.

FIG. 232A depicts a plan view of the conductor layer A, and FIG. 232B depicts a plan view of the conductor layer B. Note that FIGS. 232A and 232B may be regarded as depicting the entire region of each conductor layer or may be regarded as depicting a partial region of each conductor layer.

The conductor layer A in FIG. 232A is the same as the conductor layer A in the third configuration example depicted in FIG. 228A, and so an explanation thereof is omitted.

The conductor layer B in FIG. 232B is different from the conductor layer B in the third configuration example depicted in FIG. 228B in that the conductor widths of Vdd conductors, Vss1 conductors and Vss2 conductors are made smaller.

Specifically, the conductor layer B includes three linear conductors 2221 to 2223 that are long in the X direction, and arranged in the Y direction in a predetermined order, and sets of the three linear conductors 2221 to 2223 are arranged regularly in the Y direction.

The linear conductors 2221 are wires (Vdd wires) connected to the first power supply Vdd. The linear conductors 2222 are wires (Vss1 wires) connected to the second power supply Vss1. The linear conductors 2223 are wires (Vss2 wires) connected to the third power supply Vss2.

Accordingly, while the three linear conductors 2221 to 2223 are arranged in the positive direction along the Y axis in the order of a Vdd wire, a Vss2 wire and a Vss1 wire in FIG. 232B, the order of arrangement of the three linear conductors 2221 to 2223 is not limited to this example, but can be any order.

The linear conductors 2221 have the Y-direction conductor width WYBD, the linear conductors 2222 have the Y-direction conductor width WYBS1, and the linear conductors 2223 have the Y-direction conductor width WYBS2. For example, the conductor width WYBD of the linear conductors 2221, the conductor width WYBS1 of the linear conductors 2222, and the conductor width WYBS2 of the linear conductors 2223 are the same ((conductor width WYBD)=(conductor width WYBS1)=(conductor width WYBS2)). There is a gap with the gap width GYB between two adjacent ones of the linear conductors 2221 to 2223.

Then, the conductor width WYBD of the linear conductors 2221, the conductor width WYBS1 of the linear conductors 2222, and the conductor width WYBS2 of the linear conductors 2223 are smaller than the conductor width WYBD of the linear conductors 2191, the conductor width WYBS1 of the linear conductors 2192, and the conductor width WYBS2 of the linear conductors 2193 in the third configuration example depicted in FIG. 228B. For example, in FIG. 232B, the conductor width WYBD, the conductor width WYBS1 and the conductor width WYBS2 are the same width as the gap width GYB.

The linear conductors 2221 are arranged regularly in the Y direction at the conductor pitch FYBD. The linear conductors 2222 are arranged regularly in the Y direction at the conductor pitch FYBS1, and the linear conductors 2223 are arranged regularly in the Y direction at the conductor pitch FYBS2. For example, the conductor pitch FYBD, the conductor pitch FYBS1 and the conductor pitch FYBS2 are the same ((conductor pitch FYBD)=(conductor pitch FYBS1)=(conductor pitch FYBS2)).

Accordingly, in a rectangular region in a predetermined range of the conductor layer B, the sum total of the Y-direction conductor widths WYBD of linear conductors 2221 connected to the first power supply Vdd, the sum total of the Y-direction conductor widths WYBS1 of linear conductors 2222 connected to the second power supply Vss1, and the sum total of the Y-direction conductor widths WYBS2 of linear conductors 2223 connected to the third power supply Vss2 are the same.

In addition, in a rectangular region in a predetermined range of the conductor layer B, the conductor area size of linear conductors 2221 connected to the first power supply Vdd, the conductor area size of linear conductors 2222 connected to the second power supply Vss1, and the conductor area size of linear conductors 2223 connected to the third power supply Vss2 are the same.

FIG. 233 is a plan view depicting the stacked state of the conductor layer A in FIG. 232A, and the conductor layer B in FIG. 232B.

As depicted in FIG. 233, the stacking of the conductor layer A in which three columns, each columns of which includes rectangular Vdd conductors, rectangular Vss1 conductors and rectangular Vss2 conductors whose Y-direction positions are displaced between columns, form one group, and the Y-direction positions of the rectangular conductors are displaced between the groups, and the conductor layer B having a regular arrangement of the linear conductors 2221 to 2223 that are long in the X direction cannot realize a full light-blocking structure, but a certain degree of light-blocking property can be provided.

Linear conductors that are in the conductor layers A and B, and connected to the same power supplies may be electrically connected via conductor vias extending in the Z direction, or the like in predetermined partial regions where the positions of the linear conductors overlap. While it is desirable in terms of voltage drops if linear conductors connected to the same power supplies are electrically connected, this is not essential, and they do not have to be connected.

As in the first modification example of the third configuration example, the conductor width of linear conductors in the conductor layer B may be made extremely small, and conductor widths may be different between the conductor layer A and the conductor layer B, in one possible configuration. In this case, the conductor pitches of the conductor layer B also become smaller than the conductor pitches of the conductor layer A. Because the area size of an Aggressor loop that generates a magnetic field becomes smaller as the conductor pitches become smaller, inductive noise can be ameliorated.

<Second Modification Example of Third Configuration Example of Three Power Supplies>

FIGS. 234A and 234B depict a second modification example of the third configuration example of three power supplies.

In the coordinate system in FIGS. 234A and 234B, the X axis lies in the lateral direction, the Y axis lies in the longitudinal direction, and the Z axis lies in a direction perpendicular to the XY plane.

FIG. 234A depicts a plan view of the conductor layer A, and FIG. 234B depicts a plan view of the conductor layer B. Note that FIGS. 234A and 234B may be regarded as depicting the entire region of each conductor layer or may be regarded as depicting a partial region of each conductor layer. Regarding the second modification example of the third configuration example, a plan view depicting the stacked state of the conductor layer A and the conductor layer B is omitted.

The conductor layer A in FIG. 234A is the same as the conductor layer A in the third configuration example depicted in FIG. 228A in that they both satisfy the relation, "((conductor width WYAD)+(gap width GYA))=((conductor width WYAS1)+(gap width GYA))=((conductor width WYAS2)+(gap width GYA))=(5×(conductor pitch FYBD))=(5×(conductor pitch FYBS1))=(5×(conductor pitch FYBS2))," but is different from the conductor layer A in the third configuration example depicted in FIG. 228A in terms of the Y-direction pitch displacement between groups.

That is, in the conductor layer A in the third configuration example depicted in FIG. 228A, a group including three adjacent columns is displaced relative to another group adjacent on the positive side along the X axis by ½ of the Y-direction rectangular-conductor pitch such that gap positions of the former group are positioned at the middles, in the Y direction, of gap positions of the latter group.

In contrast, in the conductor layer A depicted in FIG. 234A, relative to a predetermined group including three adjacent columns, gap positions of another group that is adjacent on the positive side along the X axis are displaced in the positive direction along the Y axis by 200% of the conductor pitch FYBD (#½ of the Y-direction rectangular-conductor pitch). Relative to the predetermined group as the reference group, the other group that is adjacent on the positive side along the X axis is displaced in the positive direction along the Y axis in accordance with a rule by 200% of the conductor pitch FYBD (#½ of the Y-direction rectangular-conductor pitch). In this manner, in a case in which the relation, "((conductor width WYAD)+(gap width GYA))=((conductor width WYAS1)+(gap width GYA))=((conductor width WYAS2)+(gap width GYA))=((integer N1)×(conductor pitch FYBD))=((integer N1)×(conductor pitch FYBS1))=((integer N1)×(conductor pitch FYBS2))," is satisfied, and the displacement amount in the positive direction along the Y axis equals "(integer N2)×(conductor pitch FYBD)," the number of linear conductors 2221 connected to rectangular conductors 2211, the number of linear conductors 2222 connected to rectangular conductors 2212, and the number of linear conductors 2223 connected to rectangular conductors 2213 in a rectangular region in a predetermined range can be made the same with each other. In other words, in the rectangular region in the predetermined range, the sum total of the conductor area sizes of the linear conductors 2221 connected to the rectangular conductors 2211, the sum total of the conductor area sizes of the linear conductors 2222 connected to the rectangular conductors 2212, and the sum total of the conductor area sizes of the linear conductors 2223 connected to the rectangular conductors 2213 can be made the same with each other. In such a case, the current distributions in Vdd conductors, Vss1 conductors and Vss2 conductors can be made close to the same current distribution, and so inductive noise can be ameliorated. Note that in order to cause currents to flow in both the X direction and the Y direction without using diagonal-line-like conductors or stepwise conductors, the condition, "((conductor width WYAD)+(gap width GYA))=((conductor width WYAS1)+(gap width GYA))=((conductor width WYAS2)+(gap width GYA))>((conductor pitch FYBD)=(conductor pitch FYBS1)=(conductor pitch FYBS2))," needs to be satisfied. That is, "(integer N1)>1" is satisfied desirably, but in order to cause currents to flow in both the X direction and the Y direction, the condition, "(integer N1)>(integer N2)≥1" needs to be further satisfied. It should be noted however that these relations may not be satisfied if inductive noise is within a range that satisfies the tolerated level range.

The conductor layer B in FIG. 234B is the same as the conductor layer B in the first modification example of the third configuration example depicted in FIG. 232B, and so an explanation thereof is omitted.

<Third Modification Example of Third Configuration Example of Three Power Supplies>

FIGS. 235A and 235B depict a third modification example of the third configuration example of three power supplies.

In the coordinate system in FIGS. 235A and 235B, the X axis lies in the lateral direction, the Y axis lies in the longitudinal direction, and the Z axis lies in a direction perpendicular to the XY plane.

FIG. 235A depicts a plan view of the conductor layer A, and FIG. 235B depicts a plan view of the conductor layer B. Note that FIGS. 235A and 235B may be regarded as depicting the entire region of each conductor layer or may be regarded as depicting a partial region of each conductor layer. Regarding the third modification example of the third configuration example, a plan view depicting the stacked state of the conductor layer A and the conductor layer B is omitted.

The conductor layer A in FIG. 235A is different from the conductor layer A in the third configuration example depicted in FIG. 228A in terms of the Y-direction pitch displacement between groups.

That is, in the conductor layer A in the third configuration example depicted in FIG. 228A, a group including three adjacent columns is displaced relative to another group adjacent on the positive side along the X axis by ½ of the Y-direction rectangular-conductor pitch such that gap positions of the former group are positioned at the middles, in the Y direction, of gap positions of the latter group.

In contrast, in the conductor layer A depicted in FIG. 235A, relative to a predetermined group including three adjacent columns, gap positions of another group that is adjacent on the positive side along the X axis are displaced by 200% of the conductor pitch FYBD (#½ of the Y-direction rectangular-conductor pitch).

It should be noted however that while, in the second modification example depicted in FIGS. 234A and 234B, the arrangement in which, relative to a predetermined group as the reference group, another group that is adjacent on the positive side along the X axis is displaced in the positive direction along the Y axis by 200% of the conductor pitch FYBD, and the arrangement in which, relative to a predetermined group as the reference group, another group that is adjacent on the positive side along the X axis is displaced in the negative direction along the Y axis by 200% of the conductor pitch FYBD are arranged alternately, another group that is adjacent on the positive side along the X axis is always displaced in the positive direction along the Y axis by 200% of the conductor pitch FYBD in the third modification example in FIGS. 235A and 235B.

The conductor layer B in FIG. 235B is the same as the conductor layer B in the first modification example of the third configuration example depicted in FIG. 232B, and so an explanation thereof is omitted.

As in the third modification example and the fourth modification example, the Y-direction pitch displacement between groups may be displacement in the positive direction, may be displacement in the negative direction, and also may be any combination of displacement in the positive direction and displacement in the negative direction. Although a plan view depicting the stacked state of the conductor layer A and the conductor layer B is omitted, as in FIGS. 230A, 230B, and 231, a spurious mesh structure of three power supplies can be realized with the two layers, the conductor layer A and the conductor layer B, currents are more easily diffused in the X direction, and so inductive noise can be ameliorated. In addition, the degree of freedom of layouts of wires can be enhanced. Furthermore, depending on the pad arrangement, the conductor resistances as seen from pad ends can be reduced, and so voltage drops can be ameliorated.

<Fourth Modification Example and Fifth Modification Example of Third Configuration Example of Three Power Supplies>

FIGS. 236A and 236B depict a fourth modification example and a fifth modification example of the third configuration example of three power supplies.

In the coordinate system in FIGS. 236A and 236B, the X axis lies in the lateral direction, the Y axis lies in the longitudinal direction, and the Z axis lies in a direction perpendicular to the XY plane.

Both FIGS. 236A and 236B depict plan views of the conductor layer A. A in FIG. 236A is a plan view of the conductor layer A in the fourth modification example of the third configuration example, and B in FIG. 236B is a plan view of the conductor layer A in the fifth modification example of the third configuration example.

Although a plan view of the conductor layer B is omitted, the conductor layer B is the conductor layer B in the third configuration example depicted in FIG. 228B, or the conductor layer B in the first modification example of the third configuration example depicted in FIG. 232B, for example. A plan view depicting the stacked state of the conductor layer A and the conductor layer B also is omitted.

The conductor layer A in the fourth modification example depicted in FIG. 236A, and the conductor layer A in the fifth modification example depicted in FIG. 236B have a commonality with the conductor layer A in the third modification example of the third configuration example depicted in FIG. 235A in that three columns, each column of which includes rectangular Vdd conductors, rectangular Vss1 conductors and rectangular Vss2 conductors whose Y-direction positions are displaced between columns, form one group, and the Y-direction positions of rectangular conductors are displaced between groups.

On one hand, in the conductor layer A in the third modification example of the third configuration example depicted in FIG. 235A, the X-direction conductor widths of rectangular conductors are the same among rectangular Vdd conductors, rectangular Vss1 conductors and rectangular Vss2 conductors. In contrast, in the conductor layer A in the fourth modification example in FIG. 236A, the X-direction conductor width of rectangular Vss2 conductors is made smaller than the X-direction conductor widths of rectangular Vdd conductors and rectangular Vss1 conductors.

More specifically, rectangular conductors 2251 (hereinafter, referred to as rectangular Vdd conductors 2251) connected to the first power supply Vdd have the X-direction conductor width WXAD, and the Y-direction conductor width WYAD. Rectangular conductors 2252 (hereinafter, referred to as rectangular Vss1 conductors 2252) connected to the second power supply Vss1 have the X-direction conductor width WXAS1, and the Y-direction conductor width WYAS1. Rectangular conductors 2253 (hereinafter, referred to as rectangular Vss2 conductors 2253) connected to the third power supply Vss2 have the X-direction conductor width WXAS2, and the Y-direction conductor width WYAS2. Then, the X-direction conductor width WXAD of the rectangular Vdd conductors 2251, and the X-direction conductor width WXAS1 of the rectangular Vss1 conductors 2252 are equal to each other, and the X-direction conductor width WXAS2 of the rectangular Vss2 conductors 2253 is smaller than the conductor width WXAD and the conductor width WXAS1.

On the other hand, in the conductor layer A in the fifth modification example in FIG. 236B, the X-direction conductor widths of both rectangular Vss1 conductors and rectangular Vss2 conductors are made smaller than the X-direction conductor width of rectangular Vdd conductors.

More specifically, the X-direction conductor width WXAS1 of the rectangular Vss1 conductors 2252, and the X-direction conductor width WXAS2 of the rectangular Vss2 conductors 2253 are equal to each other, and the conductor width WXAS1 and the conductor width WXAS2 are smaller than the X-direction conductor width WXAD of the rectangular Vdd conductors 2251 ((conductor width WXAD)>(conductor width WXAS1)=(conductor width WXAS2)).

In this manner, the X-direction conductor widths of rectangular Vdd conductors, rectangular Vss1 conductors and rectangular Vss2 conductors may be the same or may be different. Although an illustration is omitted, the X-direction conductor width WXAS1 of the rectangular Vss1 conductors 2252 may be smaller than the X-direction conductor width WXAD of the rectangular Vdd conductors 2251, and the X-direction conductor width WXAS2 of the rectangular Vss2 conductors 2253 may be smaller than the X-direction conductor width WXAS1 of the rectangular Vss1 conductors 2252 ((conductor width WXAD)>(conductor width WXAS1)>(conductor width WXAS2)).

Because if the conductor width of Vss2 conductors is made smaller, Vdd conductors and Vss1 conductors can be arranged densely, this leads to amelioration of voltage drops of the Vdd conductors and the Vss1 conductors, if voltage drops are compared on the premise that the wire region has the same area size. Making the X-direction conductor widths of both the Vss1 conductors and the Vss2 conductors smaller leads to amelioration of voltage drops of the Vdd conductors, if voltage drops are compared on the premise that the wire region has the same area size. In addition, because the area size of an Aggressor loop that generates a magnetic field becomes smaller as the conductor pitches become smaller, inductive noise also can be ameliorated.

<Fourth Configuration Example of Three Power Supplies>

FIGS. 237A, 237B, and 238 depict a fourth configuration example of three power supplies.

In the coordinate systems in both FIGS. 237A, 237B, and 238, the X axis lies in the lateral direction, the Y axis lies in the longitudinal direction, and the Z axis lies in a direction perpendicular to the XY plane.

FIG. 237A depicts a plan view of the conductor layer A, and FIG. 237B depicts a plan view of the conductor layer B. Note that FIGS. 237A and 237B may be regarded as depicting the entire region of each conductor layer or may be regarded as depicting a partial region of each conductor layer.

The conductor layer A has a commonality with the conductor layer A in the third configuration example depicted in FIG. 228A in that the conductor layer A includes sets of rectangular Vdd conductors 2211, rectangular Vss1 conductors 2212 and rectangular Vss2 conductors 2213 that are arrayed in the X direction and the Y direction, but is different from the conductor layer A in the third configuration example in terms of the rules of the array.

Specifically, the conductor layer A in the fourth configuration example includes columns each including a set of rectangular Vdd conductors 2211, rectangular Vss1 conductors 2212 and rectangular Vss2 conductors 2213 that are arranged regularly in the Y direction, the columns being arranged regularly in the X direction at an X-direction rectangular-conductor pitch. If a predetermined column in the conductor layer A and another column adjacent to the predetermined column on the positive side along the X axis are compared in terms of gap positions of rectangular conductors, gap positions of the former column are displaced by ½ of the Y-direction rectangular-conductor pitch such that the gap positions of the former column are positioned at the middles, in the Y direction, of gap positions of the latter column. Thereby, the conductor layer A has a spurious stepwise structure in which the Y-direction positions of rectangular Vdd conductors 2211, rectangular Vss1 conductors 2212 and rectangular Vss2 conductors 2213 in each column are displaced toward the positive side along the Y axis by ½ of the Y-direction rectangular-conductor pitch, as the position of a column of interest moves toward the positive side along the X axis. It should be noted however that the displacement amount in relation to the Y-direction rectangular-conductor pitch needs not be ½ of the Y-direction rectangular-conductor pitch. The displacement amount is desirably an integer multiple of the conductor pitch FYBD, but can be designed to have any value.

On the other hand, the conductor layer B in FIG. 237B is the same as the conductor layer B in the third configuration example depicted in FIG. 228B, and so an explanation thereof is omitted.

FIG. 238 is a plan view depicting the stacked state of the conductor layer A in FIG. 237A, and the conductor layer B in FIG. 237B.

As depicted in FIG. 238, the stacking of the conductor layer A in which columns each including a set of rectangular Vdd conductors 2211, rectangular Vss1 conductors 2212 and rectangular Vss2 conductors 2213 that are arranged regularly in the Y direction are arranged regularly in the positive direction along the X axis while being displaced spuriously stepwise, and the conductor layer B having a regular arrangement of the linear conductors 2191 to 2193 that are long in the X direction cannot realize a full light-blocking structure, but can provide a certain degree of light-blocking property.

Linear conductors that are in the conductor layers A and B, and connected to the same power supplies may be electrically connected via conductor vias extending in the Z direction, or the like in predetermined partial regions where the positions of the linear conductors overlap. While it is desirable in terms of voltage drops if linear conductors connected to the same power supplies are electrically connected, this is not essential, and they do not have to be connected.

FIG. 239A is a plan view depicting the stacked state of only the rectangular Vdd conductors 2211 and the linear conductors 2191, which are Vdd conductors in the conductor layer A and the conductor layer B.

FIG. 239B is a plan view depicting the stacked state of only the rectangular Vss1 conductors 2212 and the linear conductors 2192, which are Vss1 conductors in the conductor layer A and the conductor layer B.

FIG. 240 is a plan view depicting the stacked state of only the rectangular Vss2 conductors 2213 and the linear conductors 2193, which are Vss2 conductors in the conductor layer A and the conductor layer B.

According to the fourth configuration example of three power supplies, by adopting a configuration in which the Y-direction positions of rectangular conductors are displaced between columns such that the Y-direction positions of rectangular conductors connected to power supplies become stepwise, it becomes possible to form a spurious mesh structure with the two layers, the conductor layer A and the conductor layer B, as depicted in FIGS. 239A, 239B, and 240 in a case in which conductors that are in the conductor layers A and B and are connected to the same power supplies are electrically connected via conductor vias in the Z direction, or the like. Accordingly, currents can be caused to flow in both the X direction and the Y direction, and the degree of freedom of layouts of wires can be enhanced.

By realizing a spurious mesh structure of three power supplies with the two layers, the conductor layer A and the conductor layer B, currents are more easily diffused in the X direction, and so inductive noise can be ameliorated. In addition, depending on the pad arrangement, the conductor resistances as seen from pad ends can be reduced, and so voltage drops can be ameliorated.

<Fifth Configuration Example of Three Power Supplies>

FIGS. 241A, 241B, and 242 depict a fifth configuration example of three power supplies.

In the coordinate systems in both FIGS. 241A, 241B, and 242, the X axis lies in the lateral direction, the Y axis lies in the longitudinal direction, and the Z axis lies in a direction perpendicular to the XY plane.

FIG. 241A depicts a plan view of the conductor layer A, and FIG. 241B depicts a plan view of the conductor layer B. Note that FIGS. 241A and 241B may be regarded as depicting the entire region of each conductor layer or may be regarded as depicting a partial region of each conductor layer.

The conductor layer A in FIG. 241A includes groups that are arranged regularly in the X direction. Each group includes three columns which include one column of one linear conductor 2271 connected to the first power supply Vdd and two columns that are adjacent to the one column on both sides. In the two columns, rectangular conductors 2272 (hereinafter, referred to as rectangular Vss1 conductors 2272) connected to the second power supply Vss1, and rectangular conductors 2273 (hereinafter, referred to as rectangular Vss2 conductors 2273) connected to the third power supply Vss2 are arranged alternately in the Y direction.

The linear conductors 2171 have the X-direction conductor width WXAD and are arranged extending in the Y direction. The rectangular Vss1 conductors 2272 have the X-direction conductor width WXAS1 and the Y-direction conductor width WYAS1. The rectangular Vss2 conductors 2273 have the X-direction conductor width WXAS2 and the Y-direction conductor width WYAS2. For example, the X-direction conductor width WXAD, conductor width WXAS1, and conductor width WXAS2 are the same ((conductor width WXAD)=(conductor width WYAS1)=(conductor width WYAS2)). There are gaps with the X-direction gap width GXA and the Y-direction gap width GYB between adjacent conductors.

If attention is paid to the arrangement of rectangular Vss1 conductors 2272 and rectangular Vss2 conductors 2273 arranged in each column on both sides in three columns included in one group, a rectangular Vss1 conductor 2272 in one column, and a rectangular Vss2 conductor 2273 in the other column are arranged on both sides of a linear conductor 2271 at the same Y position such that the rectangular Vss2 conductor 2273 is arranged corresponding to a portion where the rectangular Vss1 conductor 2272 is arranged. In addition, Y-direction gap positions between rectangular Vss1 conductor 2272 and rectangular Vss2 conductor 2273 in the two columns on both sides are the same.

Furthermore, if attention is paid to the arrangement of rectangular Vss1 conductors 2272 and rectangular Vss2 conductors 2273 in two groups that are adjacent to each other in the X direction, the Y-direction positions of the rectangular Vss1 conductors 2272 and the rectangular Vss2 conductors 2273 in the two adjacent groups are arranged being displaced relative to each other by ½ of the Y-direction rectangular-conductor pitch.

The conductor layer B in FIG. 241B is the same as the conductor layer B in the third configuration example depicted in FIG. 228B, and so an explanation thereof is omitted.

FIG. 242 is a plan view depicting the stacked state of the conductor layer A in FIG. 241A, and the conductor layer B in FIG. 241B.

As depicted in FIG. 242, the stacking of the conductor layer A in which groups each including three columns which include one column of a linear conductors 2271 that is long in the Y direction and two columns that are on both sides of the one column, and include alternately arranged rectangular Vss1 conductors 2272 and rectangular Vss2 conductors 2273 are arranged regularly in the X direction, and the conductor layer B having a regular arrangement, in the Y direction, of the linear conductors 2191 to 2193 that are long in the X direction cannot realize a full light-blocking structure, but can provide a certain degree of light-blocking property.

Conductors that are in the conductor layers A and B and are connected to the same power supplies may be electrically connected via conductor vias in the Z direction, or the like in predetermined partial regions where the positions of the conductors overlap. While it is desirable in terms of voltage drops if conductors that are in the conductor layers A and B and are connected to the same power supplies are electrically connected, this is not essential, and they do not have to be connected.

FIG. 243A is a plan view depicting the stacked state of only the linear conductors 2271 and the linear conductors 2191, which are Vdd conductors in the conductor layer A and the conductor layer B.

FIG. 243B is a plan view depicting the stacked state of only the rectangular Vss1 conductors 2272 and the linear conductors 2192, which are Vss1 conductors in the conductor layer A and the conductor layer B.

FIG. 244 is a plan view depicting the stacked state of only the rectangular Vss2 conductors 2273 and the linear conductors 2193, which are Vss2 conductors in the conductor layer A and the conductor layer B.

According to the fifth configuration example of three power supplies, in a case in which conductors that are in the conductor layers A and B and are connected to the same power supplies are electrically connected, as depicted in FIGS. 243A, 243B, and 244, Vdd conductors in the two layers, the conductor layer A and the conductor layer B, can form a mesh structure, and Vss1 conductors and Vss2 conductors in the two layers, the conductor layer A and the conductor layer B, can form a spurious mesh structure. Accordingly, currents can be caused to flow in both the X direction and the Y direction, and the degree of freedom of layouts of wires can be enhanced. By adopting a mesh structure for the Vdd conductors that are used in common in a configuration in which the second power supply Vss1 and the third power supply Vss2 are switched selectively, and a spurious mesh structure for the Vss1 conductors and the Vss2 conductors, voltage drops of the Vdd conductors that are used in common can be made smaller than voltage drops of the Vss1 conductors and the Vss2 conductors. By ameliorating voltage drops of the Vdd conductors, which are elements to be used in common, voltage drops of the stacked conductor layers as a whole can be ameliorated.

By realizing a spurious mesh structure of three power supplies with the two layers, the conductor layer A and the conductor layer B, currents are more easily diffused in the X direction, and so inductive noise can be ameliorated. In addition, depending on the pad arrangement, the conductor resistances as seen from pad ends can be reduced, and so voltage drops can be ameliorated.

<First Modification Example of Fifth Configuration Example of Three Power Supplies>

FIGS. 245A, 245B, and 246 depict a first modification example of the fifth configuration example of three power supplies.

In the coordinate systems in both FIGS. 245A, 245B, and 246, the X axis lies in the lateral direction, the Y axis lies in the longitudinal direction, and the Z axis lies in a direction perpendicular to the XY plane.

FIG. 245A depicts a plan view of the conductor layer A, and FIG. 245B depicts a plan view of the conductor layer B. Note that FIGS. 245A and 245B may be regarded as depicting the entire region of each conductor layer or may be regarded as depicting a partial region of each conductor layer.

If the conductor layer A in FIG. 245A, and the conductor layer A in the fifth configuration example depicted in FIG. 241A are compared with each other, they have a commonality in that groups each including three columns which include one column of a linear conductor 2271 that is long in the Y direction and two columns that are on both sides of the one column, and include alternately arranged rectangular Vss1 conductors 2272 and rectangular Vss2 conductors 2273 are arranged regularly in the X direction.

However, the conductor layer A in FIG. 245A is different from the conductor layer A in the fifth configuration example depicted in FIG. 241A in terms of the arrangement of the rectangular Vss1 conductors 2272 and the rectangular Vss2 conductors 2273 in the two columns on both sides of the linear conductor 2271 that is long in the Y direction.

That is, in the conductor layer A in the fifth configuration example depicted in FIG. 241A, Y-direction gap positions of the rectangular Vss1 conductors 2272 and the rectangular Vss2 conductors 2273 that are arranged on both sides of the linear conductor 2271 that is long in the Y direction are the same.

In contrast, in the conductor layer A in FIG. 245A, Y-direction gap positions of the rectangular Vss1 conductors 2272 and the rectangular Vss2 conductors 2273 that are arranged on both sides of the linear conductor 2271 that is long in the Y direction are different. Specifically, Y-direction gap positions in the right column, and Y-direction gap positions in the left column are displaced relative to each other by ½ of the Y-direction rectangular-conductor pitch. It should be noted however that the displacement amount in relation to the Y-direction rectangular-conductor pitch needs not be ½ of the Y-direction rectangular-conductor pitch. The displacement amount is desirably an integer multiple of the conductor pitch FYBD, but can be designed to have any value.

In addition, if attention is paid to the arrangements of rectangular Vss1 conductor 2272 and rectangular Vss2 conductors 2273 in two groups that are adjacent to each other in the X direction, and each group of which includes a linear conductor 2271 that is long in the Y direction, and two columns on both sides of the linear conductor 2271, the arrangements of the rectangular Vss1 conductors 2272 and the rectangular Vss2 conductors 2273 in the two adjacent groups are opposite arrangements.

The conductor layer B in FIG. 245B is the same as the conductor layer B in the fifth configuration example depicted in FIG. 241B, and so an explanation thereof is omitted.

FIG. 246 is a plan view depicting the stacked state of the conductor layer A in FIG. 245A, and the conductor layer B in FIG. 245B.

As depicted in FIG. 246, the stacking of the conductor layer A in which groups each including three columns which include one column of a linear conductor 2271 that is long in the Y direction and two columns that are on both sides of the one column, and include alternately arranged rectangular Vss1 conductors 2272 and rectangular Vss2 conductors 2273 are arranged regularly in the X direction, and the conductor layer B having a regular arrangement of the linear conductors 2191 to 2193 that are long in the X direction cannot realize a full light-blocking structure, but can provide a certain degree of light-blocking property.

Conductors that are in the conductor layers A and B and are connected to the same power supplies may be electrically connected via conductor vias in the Z direction, or the like in predetermined partial regions where the positions of the conductors overlap. While it is desirable in terms of voltage drops if conductors that are in the conductor layers A and B and are connected to the same power supplies are electrically connected, this is not essential, and they do not have to be connected.

In the first modification example of the fifth configuration example also, in a case in which conductors that are in the conductor layers A and B and are connected to the same power supplies are electrically connected, Vdd conductors in the two layers, the conductor layer A and the conductor layer B, can form a mesh structure, and Vss1 conductors and Vss2 conductors in the two layers, the conductor layer A and the conductor layer B, can form a spurious mesh structure. Accordingly, currents can be caused to flow in both the X direction and the Y direction, and the degree of freedom of layouts of wires can be enhanced. By adopting a mesh structure for the Vdd conductors that are used in common in a configuration in which the second power supply Vss1 and the third power supply Vss2 are switched selectively, and a spurious mesh structure for the Vss1 conductors and the Vss2 conductors, voltage drops of the Vdd conductors that are used in common can be made smaller than voltage drops of the Vss1 conductors and the Vss2 conductors. By ameliorating voltage drops of the Vdd conductors, which are elements to be used in common, voltage drops of the stacked conductor layers as a whole can be ameliorated.

By realizing a spurious mesh structure of three power supplies with the two layers, the conductor layer A and the conductor layer B, currents are more easily diffused in the X direction, and so inductive noise can be ameliorated. In addition, depending on the pad arrangement, the conductor resistances as seen from pad ends can be reduced, and so voltage drops can be ameliorated.

<Second Modification Example and Third Modification Example of Fifth Configuration Example of Three Power Supplies>

FIGS. 247A and 247B depict a second modification example and a third modification example of the fifth configuration example of three power supplies.

In the coordinate system in FIGS. 247A and 247B, the X axis lies in the lateral direction, the Y axis lies in the longitudinal direction, and the Z axis lies in a direction perpendicular to the XY plane.

Both FIGS. 247A and 247B depict plan views of the conductor layer A. A in FIG. 247A is a plan view of the conductor layer A in the second modification example of the fifth configuration example, and B in FIG. 247B is a plan view of the conductor layer A in the third modification example of the fifth configuration example.

Although a plan view of the conductor layer B is omitted, for example, the conductor layer B is the same as the conductor layer B in the fifth configuration example depicted in FIG. 241B. A plan view depicting the stacked state of the conductor layer A and the conductor layer B also is omitted.

In the conductor layer A in the second modification example in FIG. 247A, the X-direction conductor widths of both rectangular Vss1 conductors and rectangular Vss2 conductors are made smaller than the X-direction conductor width of rectangular Vdd conductors.

That is, in the conductor layer A in the fifth configuration example depicted in FIG. 241A, the X-direction conductor width WXAD of linear conductors 2171, the X-direction conductor width WXAS1 of rectangular Vss1 conductors 2272, and the X-direction conductor width WXAS2 of rectangular Vss2 conductors 2273 are made the same ((conductor width WXAD)=(conductor width WYAS1)=(conductor width WYAS2)).

In contrast, in the conductor layer A in the second modification example in FIG. 247A, the X-direction conductor width WXAS1 of rectangular Vss1 conductors 2272, and the X-direction conductor width WXAS2 of rectangular Vss2 conductors 2273 are made equal to each other, and the conductor width WXAS1 and the conductor width WXAS2 are made smaller than the X-direction conductor width WXAD of the linear conductors 2171 ((conductor width WXAD)>(conductor width WXAS1)=(conductor width WXAS2)). In other respects, the configuration is similar to that of the conductor layer A in the fifth configuration example depicted in FIG. 241A.

Note that the X-direction conductor width WXAS1 of the rectangular Vss1 conductors 2272, and the X-direction conductor width WXAS2 of the rectangular Vss2 conductors 2273 are the same width in the conductor layer A in FIG. 247A, but may be different in another possible configuration. That is, the X-direction conductor width WXAS1 of the rectangular Vss1 conductors 2272 may be made smaller than the X-direction conductor width WXAD of the linear conductors 2171, and the X-direction conductor width WXAS2 of the rectangular Vss2 conductors 2273 may be made smaller than the X-direction conductor width WXAS1 of the rectangular Vss1 conductors 2272 ((conductor width WXAD)>(conductor width WXAS1)>(conductor width WXAS2)).

According to the second modification example in FIG. 247A, Vss1 conductors and Vss2 conductors can be arranged densely by making their X-direction conductor widths small. Accordingly, by making the X-direction conductor pitches small, inductive noise can be ameliorated, and voltage drops also can be ameliorated, in some cases. By making voltage drops less likely to occur in the Vdd conductors to be used in common, voltage drops can be ameliorated for both the combination of the Vdd conductors and the Vss1 conductors, and the combination of the Vdd conductors and the Vss2 conductors in some cases.

Vdd conductors in the two layers, the conductor layer A and the conductor layer B, can form a mesh structure, and Vss1 conductors and Vss2 conductors in the two layers, the conductor layer A and the conductor layer B, can form a spurious mesh structure. Accordingly, currents can be caused to flow in both the X direction and the Y direction, and the degree of freedom of layouts of wires can be enhanced.

On the other hand, the conductor layer A in the third modification example in FIG. 247B includes groups that are arranged regularly in the X direction. Each group includes three columns which include one linear conductor 2283 connected to the third power supply Vss2 and two columns that are adjacent to the one column on both sides. In the two columns, rectangular conductors 2281 (hereinafter, referred to as rectangular Vdd conductors 2281) connected to the first power supply Vdd connected to the first power supply Vdd, and rectangular conductors 2282 (hereinafter, referred to as rectangular Vss1 conductors 2282) connected to the second power supply Vss1 are arranged alternately in the Y direction.

Accordingly, the conductor layer A in the third modification example in FIG. 247B has a configuration in which the arrangements of Vdd conductors, Vss1 conductors, and Vss2 conductors in the conductor layer A in the fifth configuration example depicted in FIG. 241B are replaced, the middle column in three columns included in one group is not a Vdd conductor, but a Vss2 conductor, and conductors on both sides of the Vss2 conductor are Vdd conductors and Vss1 conductors. Because Vdd conductors and Vss1 conductors are arranged alternately in the Y direction, capacitive noise can be cancelled.

In addition, according to the third modification example in FIG. 247B, by realizing a spurious mesh structure of three power supplies with the two layers, the conductor layer A and the conductor layer B, currents are more easily diffused in the X direction, and so inductive noise can be ameliorated. In addition, depending on the pad arrangement, the conductor resistances as seen from pad ends can be reduced, and so voltage drops can be ameliorated.

<Sixth Configuration Example of Three Power Supplies>

Next, a configuration example that realizes three power supplies by three wiring layers (the wiring layers 165A to 165C) is explained.

FIGS. 248A, 248B, 248C, 248D, 248E, and 248F depicts a sixth configuration example of three power supplies.

In the coordinate system in FIGS. 248A, 248B, 248C, 248D, 248E, and 248F, the X axis lies in the lateral direction, the Y axis lies in the longitudinal direction, and the Z axis lies in a direction perpendicular to the XY plane.

Figures 248A, 248B, 248C, 248D, 248E, 248F:
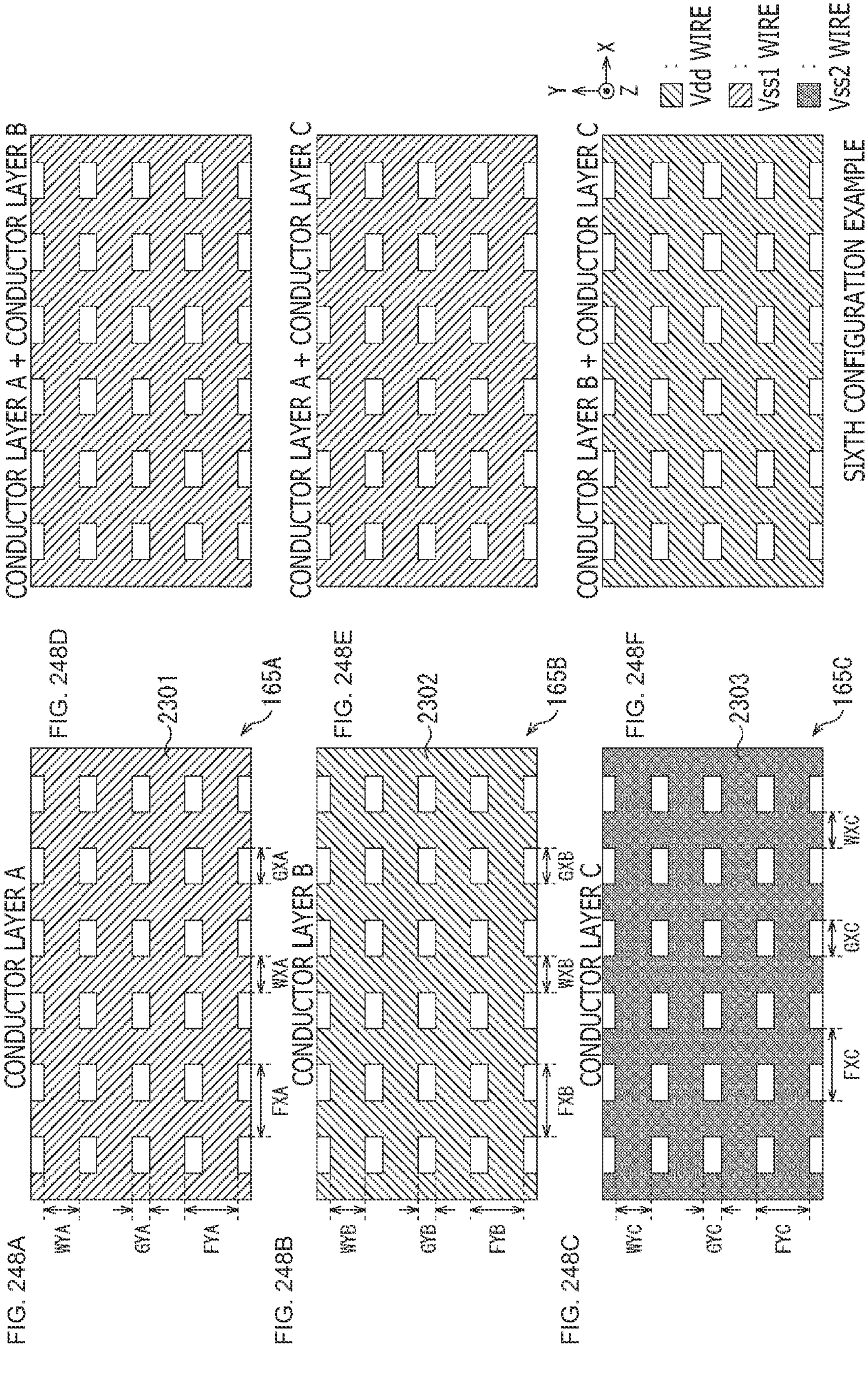

FIG. 248A depicts the conductor layer A (wiring layer 165A), B in FIG. 248B depicts the conductor layer B (wiring layer 165B), and FIG. 248C depicts the conductor layer C (wiring layer 165C).

In addition, FIG. 248D is a plan view of the stacked state of the conductor layer A and the conductor layer B, FIG. 248E is a plan view of the stacked state of the conductor layer A and the conductor layer C, and FIG. 248E is a plan view of the stacked state of the conductor layer B and the conductor layer C. Note that FIGS. 248A, 248B, 248C, 248D, 248E, and 248F may be regarded as depicting the entire region of each conductor layer or may be regarded as depicting a partial region of each conductor layer.

The conductor layer A in FIG. 248A includes a mesh conductor 2301. That is, the mesh conductor 2301 has the X-direction conductor width WXA, gap width GXA, and conductor pitch FXA and has the Y-direction conductor width WYA, gap width GYA, and conductor pitch FYA. The mesh conductor 2301 is a conductor with a shape in which the basic pattern with the conductor pitch FXA and the conductor pitch FYA is arranged repetitively on the same plane. For example, the mesh conductor 2301 is a wire (Vss1 wire) connected to the second power supply Vss1.

The conductor layer B in FIG. 248B includes a mesh conductor 2302. That is, the mesh conductor 2302 has the X-direction conductor width WXB, gap width GXB, and conductor pitch FXB and has the Y-direction conductor width WYB, gap width GYB, and conductor pitch FYB. The mesh conductor 2302 is a conductor with a shape in which the basic pattern with the conductor pitch FXB and the conductor pitch FYB is arranged repetitively on the same plane. The mesh conductor 2302 is a wire (Vdd wire) connected to the first power supply Vdd, for example. For example, the conductor pitches of the mesh conductor 2301 and the mesh conductor 2302 are the same, and (conductor pitch FXA)=(conductor pitch FXB) and (conductor pitch FYA)=(conductor pitch FYB) are satisfied.

The conductor layer C in FIG. 248C includes a mesh conductor 2303. That is, the mesh conductor 2303 has an X-direction conductor width WXC and the X-direction gap width GXC and conductor pitch FXC, and has a y-direction conductor width WYC and the Y-direction gap width GYC and conductor pitch FYC. The mesh conductor 2303 is a conductor with a shape in which the basic pattern with the conductor pitch FXC and the conductor pitch FYC is arranged repetitively on the same plane. For example, the mesh conductor 2303 is a wire (Vss2 wire) connected to the third power supply Vss2. For example, the conductor pitches of the mesh conductor 2301 and the mesh conductor 2303 are the same, and (conductor pitch FXB)=(conductor pitch FXC) and (conductor pitch FYB)=(conductor pitch FYC) are satisfied.

The conductor layers A to C in FIGS. 248A, 248B, 248C, 248D, 248E, and 248F are stacked in the order of the conductor layers A, B and C such that the conductor layer B is positioned at the middle, for example. In this case, both the distance between the Vdd conductor and the Vss1 conductor, and the distance between the Vdd conductor and the Vss2 conductor can be made small, and inductive noise can be ameliorated. However, the conductor layer B needs not necessarily be positioned at the middle.

While the mesh conductor 2301, which is the Vss1 conductor, the mesh conductor 2302, which is the Vdd conductor, and the mesh conductor 2303, which is the Vss2 conductor, have completely matching shapes in the example depicted, there may be regions with different shapes in other regions.

<First Modification Example of Sixth Configuration Example of Three Power Supplies>

FIGS. 249A, 249B, 249C, 249D, 249E, 249F, 250B, 250C 250D, 250E, 250F, 251B, 251C, 251D, 251E, 251F, 252B, 252C, 252D, 252E, 252F 253A, 253B, 253C, 253D, 253E, and 253E depict a first modification example to a fifth modification example of the sixth configuration example depicted in FIGS. 248A, 248B, 248C, 248D, 248E, and 248F In FIGS. 249A, 249B, 249C, 249D, 249E, 249F, 250B, 250C 250D, 250E, 250F, 251B, 251C, 251D, 251E, 251F, 252B, 252C, 252D, 252E, 252F, 253A, 253B, 253C, 253D, 253E, and 253F, the conductor layer A (wiring layer 165A), the conductor layer B (wiring layer 165B), the conductor layer C (wiring layer 165C), and the arrays in a plan view of the stacked state of the conductor layer A and the conductor layer B, a plan view of the stacked state of the conductor layer A and the conductor layer C, and a plan view of the stacked state of the conductor layer B and the conductor layer C are similar to those in FIGS. 248A, 248B, 248C, 248D, 248E, and 248F. The coordinate systems also are similar.

FIGS. 249A, 249B, 2490, 249D, 249E, and 249F depict a first modification example of the sixth configuration example of three power supplies.

While the conductor layer A is a Vss1 conductor connected to the second power supply Vss1, and the conductor layer C is a Vss2 conductor connected to the third power supply Vss2 in the sixth configuration example depicted in FIGS. 248A, 248B, 248C, 248D, 248E, and 248F, both of the conductor layers A and C are Vss conductors connected to the same power supply Vss (the second power supply Vss1 or the third power supply Vss2) in the configuration in the first modification example in FIGS. 249A, 249B, 249C, 249D, 249E, and 249F.

In the example in FIGS. 249A, 249B, 249C, 249D, 249E, and 249F the conductor layer A includes a mesh conductor 2301*a*, the conductor layer C includes a mesh conductor 2301*c*, and both of the mesh conductors 2301*a* and 2301*c* are the same as the mesh conductor 2301 connected to the second power supply Vss1.

Figures 249A, 249B, 249C, 249D, 249E, 249F:
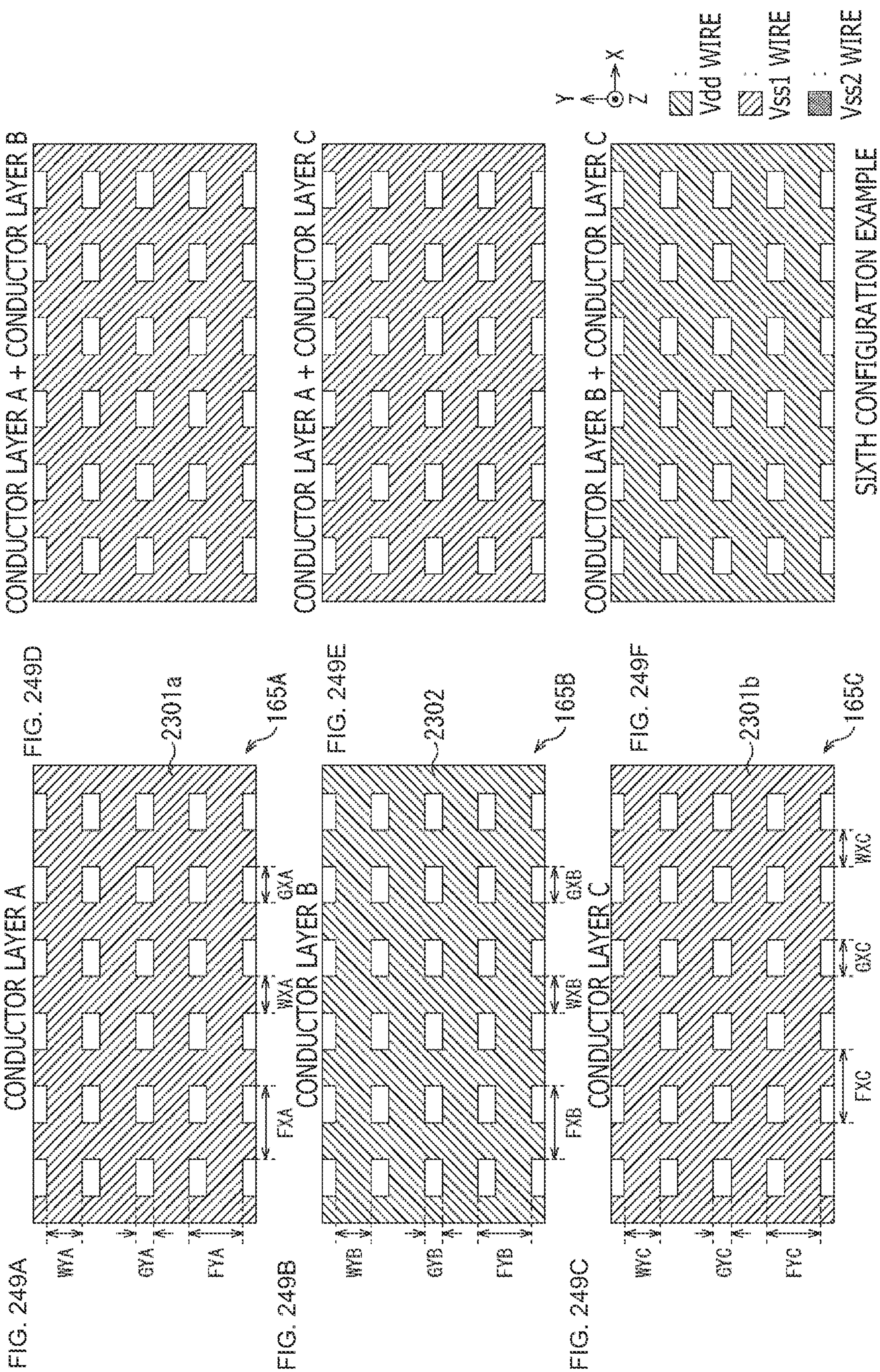

The conductor layer B in FIG. 249B includes the mesh conductor 2302, similarly to the sixth configuration example depicted in FIGS. 248A, 248B, 248C 248D, 248E, and 248F.

By adopting a structure in which the Vdd conductor in the conductor layer B is sandwiched by the two layers of the Vss conductors in the first modification example of the sixth configuration example, further amelioration of inductive noise can be expected, and by adopting a three-layer stacked structure instead of a two-layer stacked structure, further amelioration of voltage drops also can be expected. Note that the sheet resistance of the conductor layer B, and the sheet resistance of the combination of the conductor layer A and the conductor layer B are substantially the same preferably, but this is not essential.

<Second Modification Example of Sixth Configuration Example of Three Power Supplies>

FIGS. 250A, 250B, 250C, 250D, 250E, and 250F depicts a second modification example of the sixth configuration example of three power supplies.

Figures 250A, 250B, 250C, 250D, 250E, 250F:
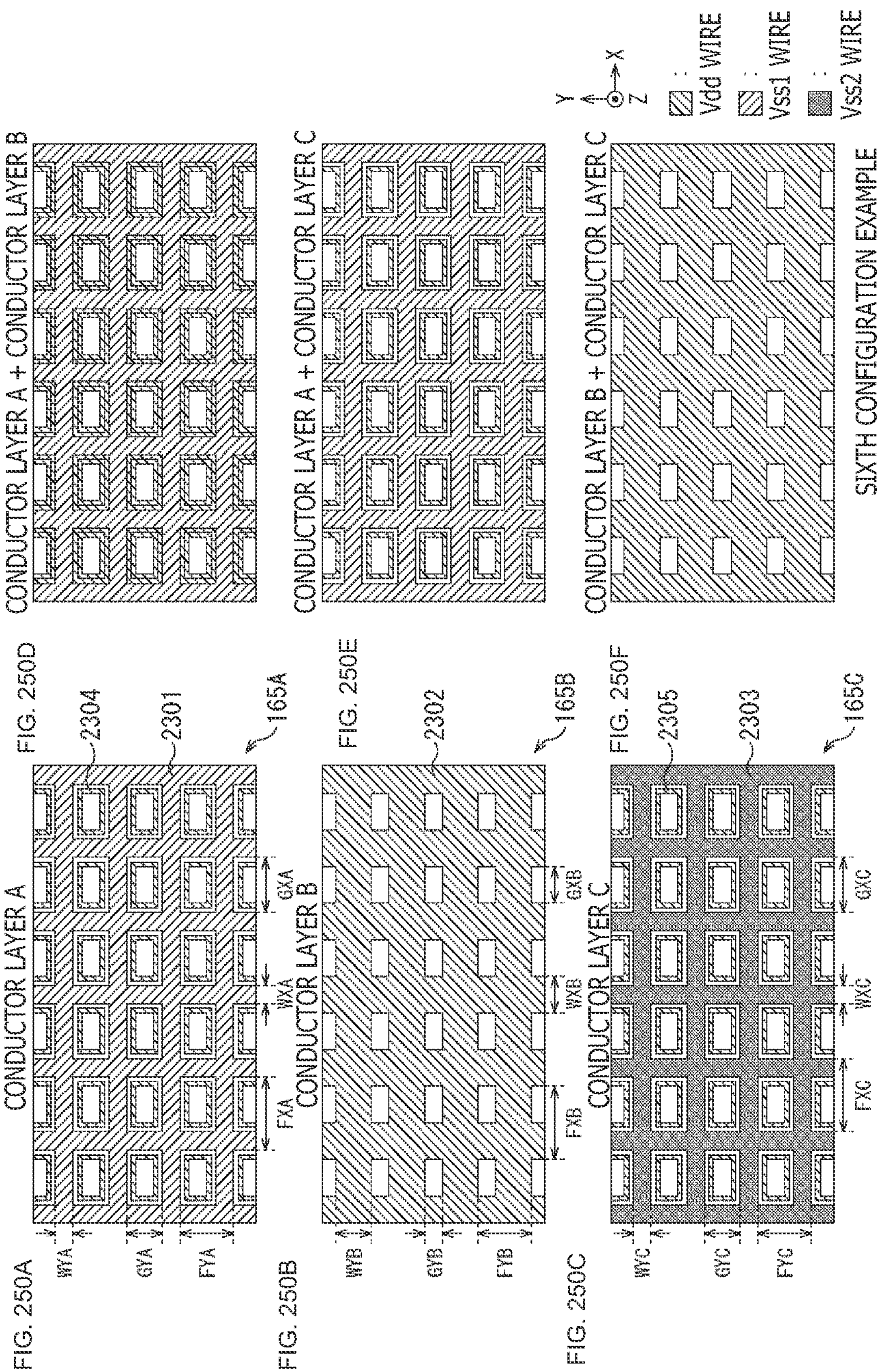

The conductor layer A in FIG. 250A includes relay conductors 2304, and the mesh conductor 2301 connected to the second power supply Vss1. The relay conductors 2304 are arranged in non-conductor gap regions in the mesh conductor 2301, are electrically insulated from the mesh conductor 2301, and, for example, are electrically connected to the mesh conductor 2302 in the conductor layer B, and another conductor layer.

The conductor layer B in FIG. 250B includes the mesh conductor 2302 connected to the first power supply Vdd, similarly to the sixth configuration example depicted in FIGS. 248A, 248B, 248C, 248D, 248E, and 248F.

The conductor layer C in FIG. 250C includes relay conductors 2305, and the mesh conductor 2303 connected to the third power supply Vss2. The relay conductors 2305 are arranged in non-conductor gap regions in the mesh conductor 2303, are electrically insulated from the mesh conductor 2303, and, for example, are electrically connected to the mesh conductor 2302 in the conductor layer B, and another conductor layer.

While the planar shapes of the relay conductors 2304 and the relay conductors 2305 are rectangular shapes that have gaps therein and have predetermined conductor widths in the example in FIGS. 250A, 250B, 250C, 250D, 250E, and 250F, this is not essential, and it is sufficient if the relay conductors 2304 and the relay conductors 2305 have shapes that can be formed in the gap regions.

<Third Modification Example of Sixth Configuration Example of Three Power Supplies>

FIGS. 251A, 251B, 251C, 251D, 251E, and 251F depict a third modification example of the sixth configuration example of three power supplies.

In the third modification example of the sixth configuration example depicted in FIGS. 251A, 251B, 251C, 251D, 251E, and 251F, the conductor layer A and the conductor layer C are configured similarly to those in the second modification example of the sixth configuration example, and only the conductor layer B has a configuration different from that in the second modification example of the sixth configuration example.

Figures 251A, 251B, 251C, 251D, 251E, 251F:
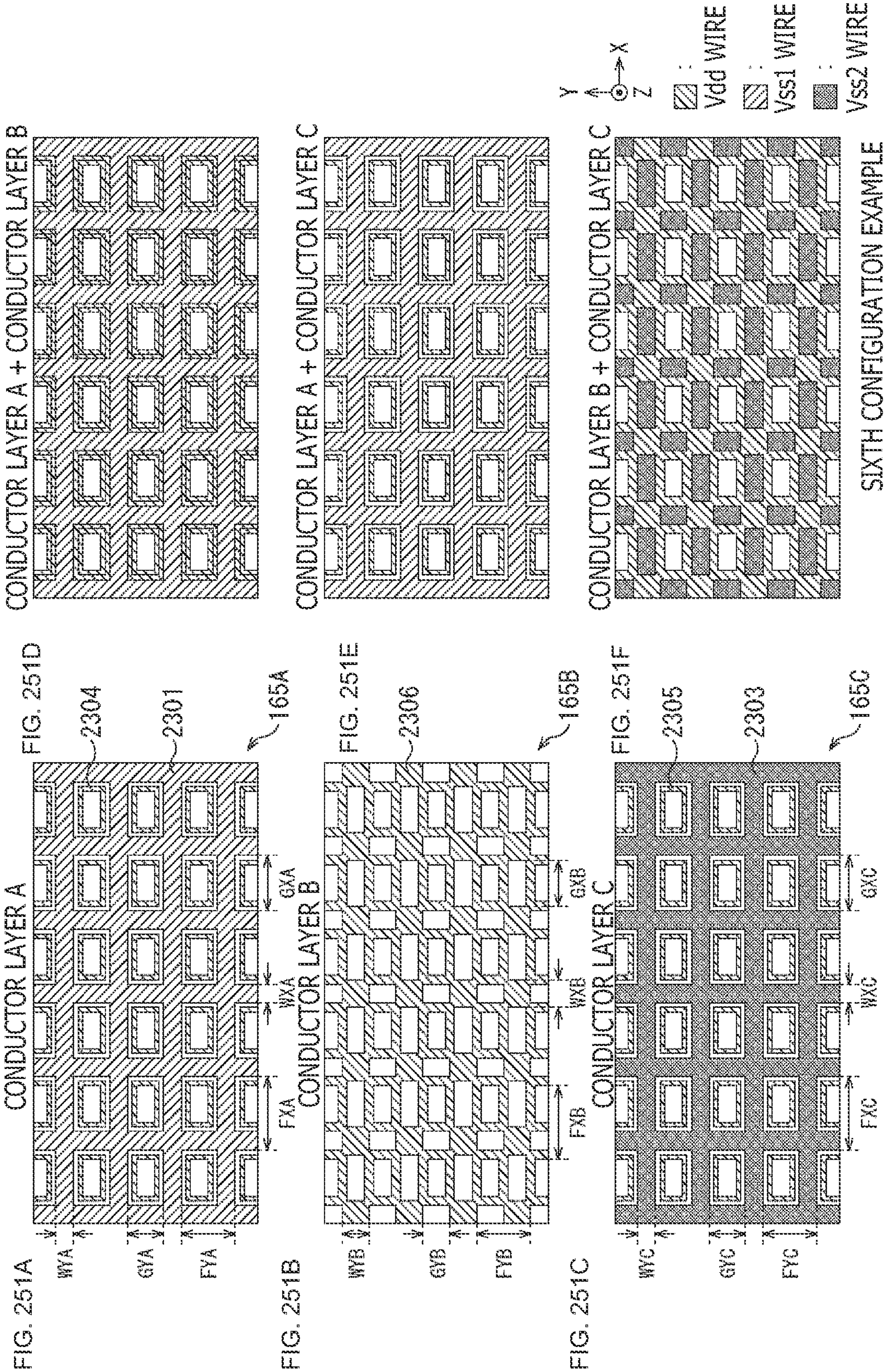

Specifically, the conductor layer A in FIG. 251A includes the relay conductors 2304, and the mesh conductor 2301 connected to the second power supply Vss1.

The conductor layer B in FIG. 251B includes a mesh conductor 2306. The mesh conductor 2306 has a shape in which columns including rectangular conductors that are arranged in the Y direction with gaps therebetween and at a predetermined pitch, and columns including rectangular conductors with a predetermined conductor width that have gaps therein, and are arranged in the Y direction with gaps therebetween and at a predetermined pitch are arranged alternately in the X direction. The mesh conductor 2306 is a wire (Vdd wire) connected to the first power supply Vdd, for example.

The conductor layer C in FIG. 251C includes the relay conductors 2305, and the mesh conductor 2303 connected to the third power supply Vss2.

<Fourth Modification Example of Sixth Configuration Example of Three Power Supplies>

FIGS. 252A, 252B, 252C, 252D, 252E, and 252F depicts a fourth modification example of the sixth configuration example of three power supplies.

The fourth modification example of the sixth configuration example depicted in FIGS. 252A, 252B, 252C, 252D, 252E, and 252F are configurations in which relay conductors in the conductor layer A and the conductor layer C in the second modification example of the sixth configuration example depicted in FIGS. 250A, 250B, 250C, 250D, 250E, and 250F are replaced.

Figures 252A, 252B, 252C, 252D, 252E, 252F:
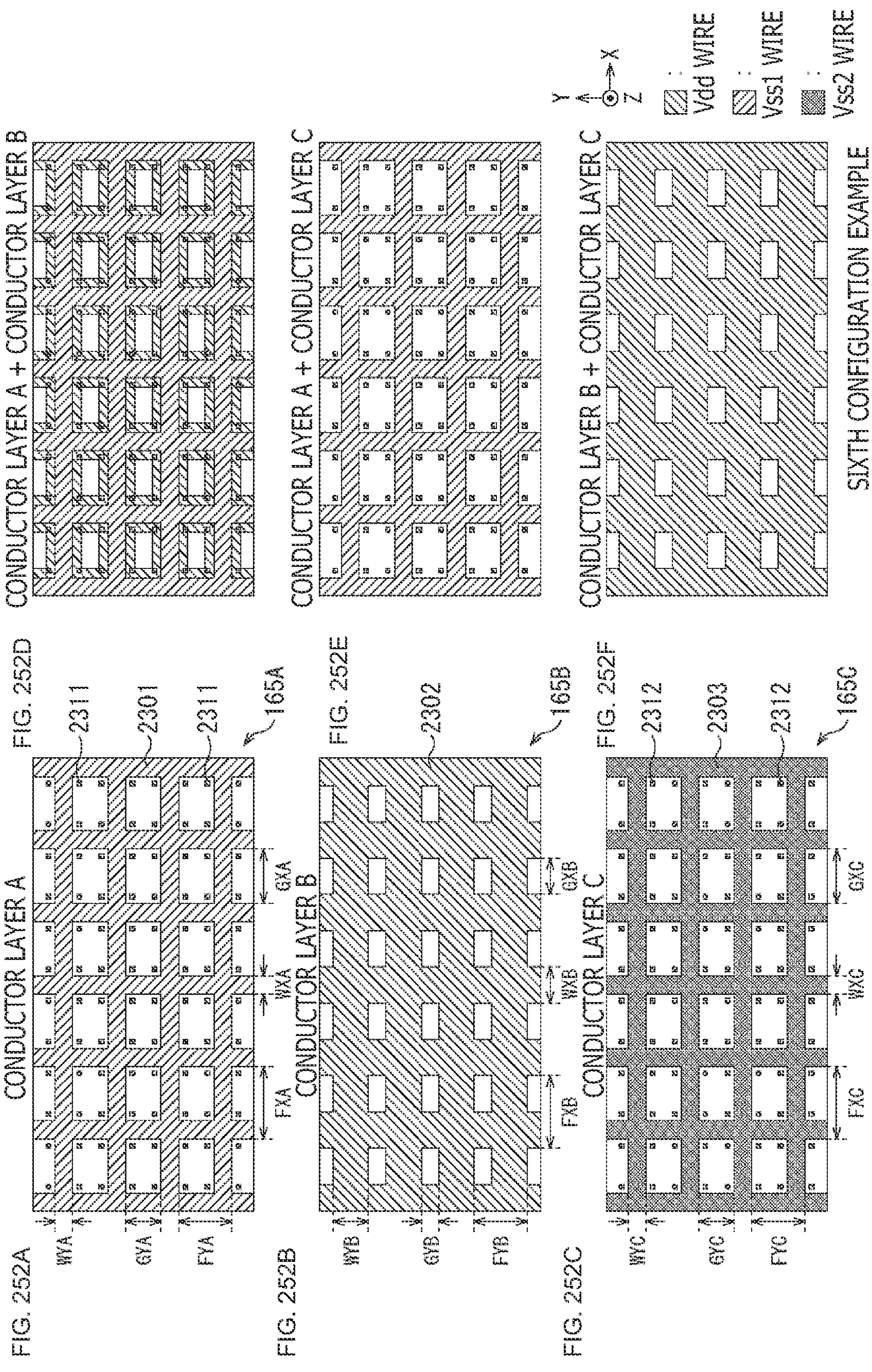

Specifically, the conductor layer A in FIG. 252A includes relay conductors 2311, and the mesh conductor 2301 connected to the second power supply Vss1. The relay conductors 2304 in the conductor layer A in the second modification example depicted in FIGS. 250A, 250B, 250C, 250D, 250E, and 250F are rectangular conductors that have gaps therein and have a predetermined conductor width. In contrast, the relay conductors 2311 in the fourth modification example are rectangular conductors each of which is arranged being dispersed to one of four positions in a gap region of the mesh conductor 2301.

The conductor layer B in FIG. 252B includes the mesh conductor 2302 connected to the first power supply Vdd, similarly to the sixth configuration example depicted in FIGS. 248A, 248B, 248C, 248D, 248E, and 248F.

The conductor layer C in FIG. 252C includes relay conductors 2312, and the mesh conductor 2303 connected to the third power supply Vss2. The relay conductors 2305 in the conductor layer C in the second modification example depicted in FIG. 250 are rectangular conductors that have gaps therein and have a predetermined conductor width. In contrast, the relay conductors 2312 in the fourth modification example are rectangular conductors each of which is arranged being dispersed to one of four positions in a gap region of the mesh conductor 2303.

<Fifth Modification Example of Sixth Configuration Example of Three Power Supplies>

FIGS. 253A, 253B, 253C, 253D, 253E, and 253F depict a fifth modification example of the sixth configuration example of three power supplies.

The fifth modification example of the sixth configuration example depicted in FIGS. 253A, 253B, 253C, 253D, 253E, and 253F has a configuration in which common relay conductors are provided, and mesh conductors are replaced in the fourth modification example of the sixth configuration example depicted in FIGS. 252A, 252B, 252C, 252D, 252E, and 252F.

Figures 253A, 253B, 253C, 253D, 253E, 253F:
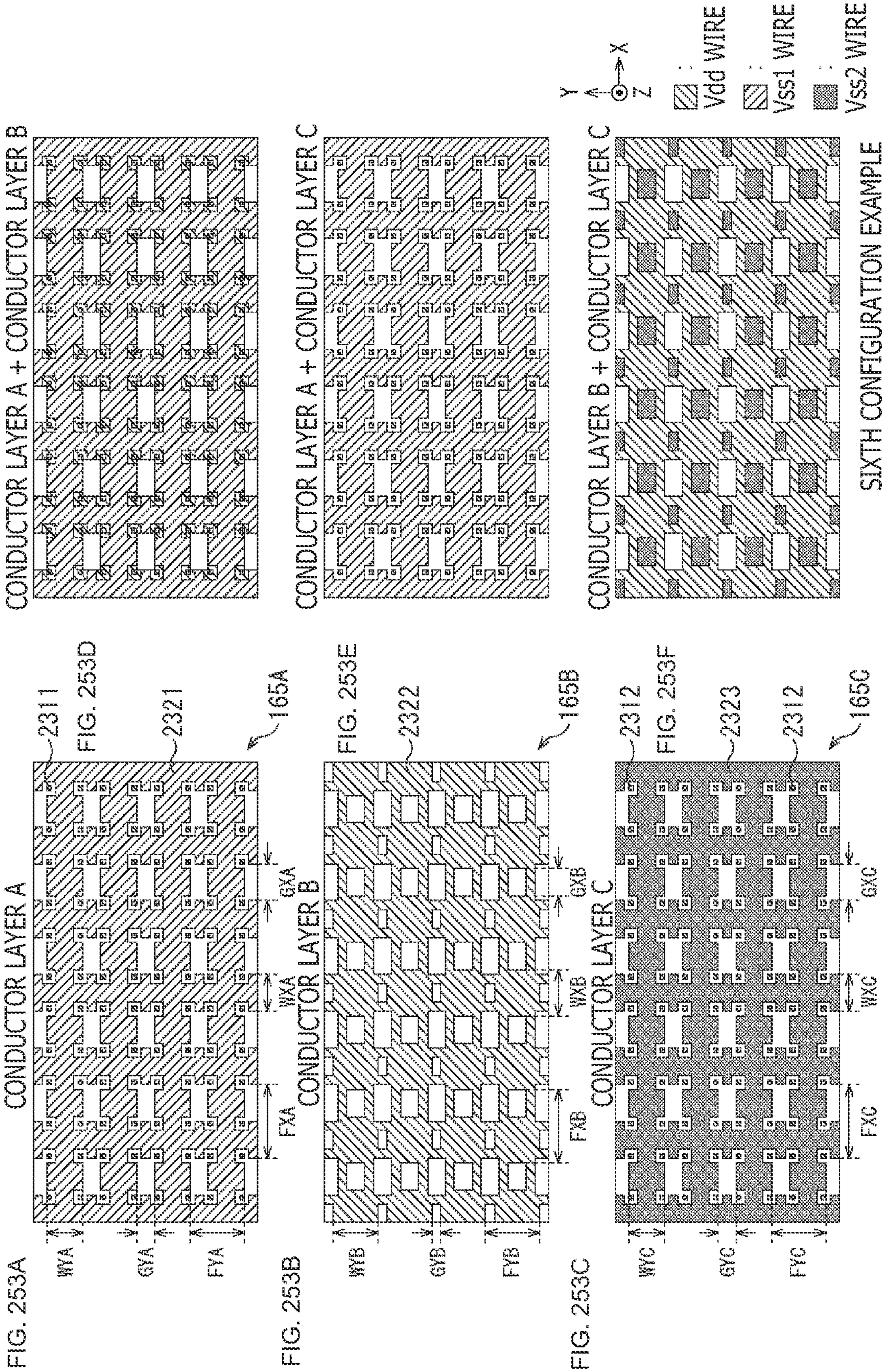

Specifically, the conductor layer A in FIG. 253A includes the relay conductors 2311, and a mesh conductor 2321 connected to the second power supply Vss1. In the mesh conductor 2321, the X-direction conductor width WXA and the Y-direction conductor width WYA are formed wider than those of the mesh conductor 2301 in the fourth modification example depicted in FIGS. 252A, 252B, 252C, 252D, 252E, and 252F, and the X-direction gap width GXA and the Y-direction gap width GYA are formed narrower than those of the mesh conductor 2301 in the fourth modification example depicted in FIGS. 252A, 252B, 252C, 252D, 252E, and 252F. The four corners of each gap region are non-conductor sections, and relay conductors 2311 are arranged there.

The conductor layer B in FIG. 253B includes a mesh conductor 2322. The mesh conductor 2322 has a shape in which columns including rectangular conductors that are arranged in the Y direction with gaps therebetween and at a predetermined pitch, and columns including rectangular shapes with a predetermined conductor width that have gaps therein, and are arranged in the Y direction with gaps therebetween and at a predetermined pitch are arranged alternately in the X direction. The mesh conductor 2322 is a wire (Vdd wire) connected to the first power supply Vdd, for example.

The conductor layer C in FIG. 253C includes the relay conductors 2312, and a mesh conductor 2323 connected to the third power supply Vss2. In the mesh conductor 2323, the X-direction conductor width WXC, and the Y-direction conductor width WYC are formed wider than those of the mesh conductor 2303 in the fourth modification example depicted in FIGS. 252A, 252B, 252C, 252D, 252E, and 252F, and the X-direction gap width GXC, and the Y-direction gap width GYC are formed narrower than those of the mesh conductor 2303 in the fourth modification example depicted in FIGS. 252A, 252B, 252C, 252D, 252E, and 252F. The four corners of each gap region are non-conductor sections, and relay conductors 2312 are arranged there.

In the configurations of all of the second modification example to the fifth modification example in FIGS. 250B, 250C, 250D, 250E, 250F, 251B, 251C, 251D, 251E, 251F, 252B, 252C, 252D, 252E, 252F, 253A, 253B, 253C, 253D, 253E, and 253F, the conductor layer A and the conductor layer C have completely matching shapes, the conductor layer A and the conductor layer B do not have matching shapes, and the conductor layer B and the conductor layer C do not have matching shapes. However, designs regarding which two conductor layers have or do not have matching shapes can be determined as desired. In addition, conductor layers may have partial regions with matching shapes, and the other regions with unmatching shapes, in one possible configuration.

<Seventh Configuration Example of Three Power Supplies>

FIGS. 254A, 254B, 254C, 254D, 254E, and 254F depict a seventh configuration example of three power supplies.

In the coordinate system in FIGS. 254A, 254B, 254C, 254D, 254E, and 254F, the X axis lies in the lateral direction, the Y axis lies in the longitudinal direction, and the Z axis lies in a direction perpendicular to the XY plane.

Figures 254A, 254B, 254C, 254D, 254E, 254F:
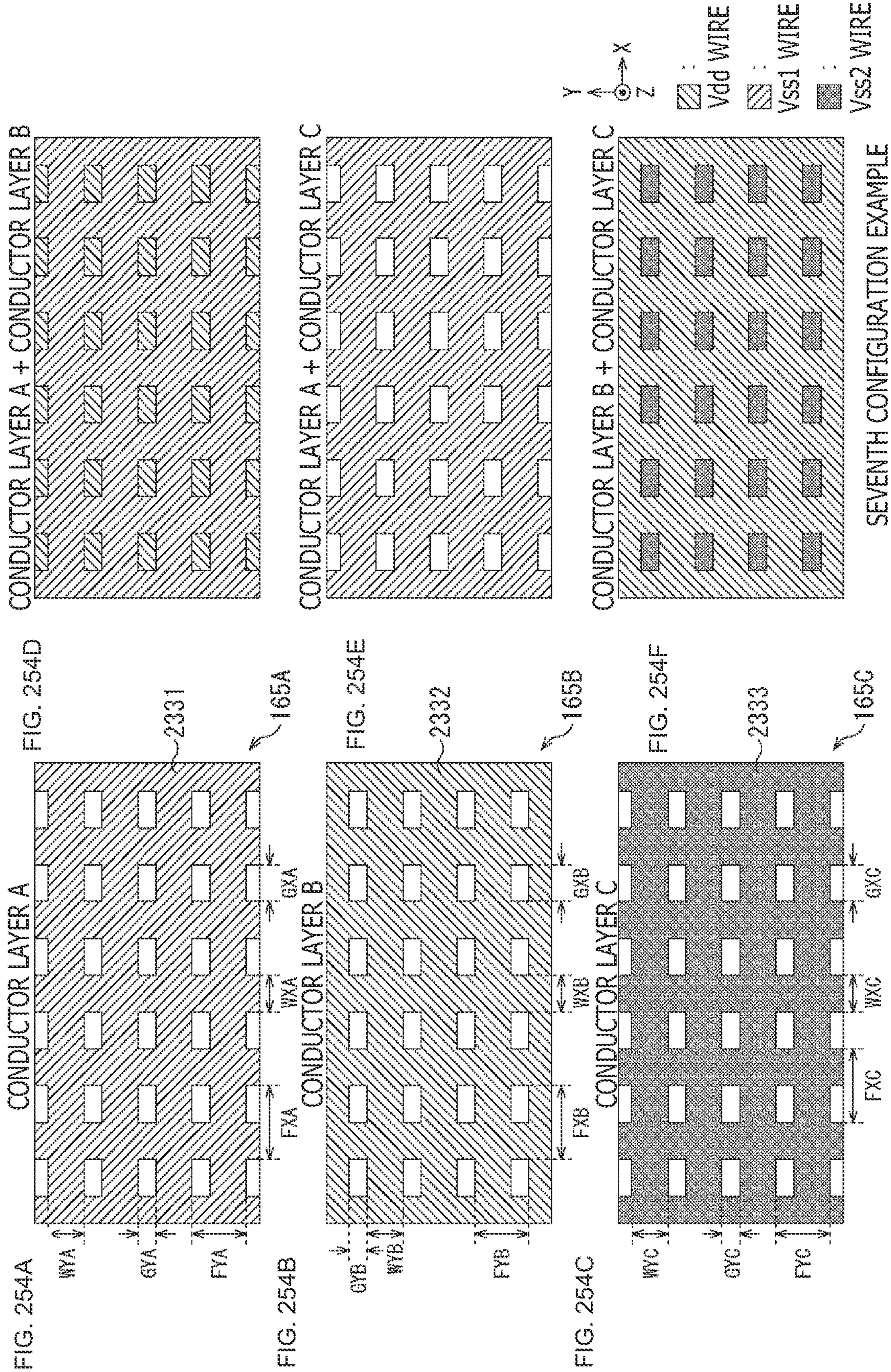

FIG. 254A depicts the conductor layer A (wiring layer 165A), B in FIG. 254B depicts the conductor layer B (wiring layer 165B), and FIG. 254C depicts the conductor layer C (wiring layer 165C).

In addition, FIG. 254D is a plan view of the stacked state of the conductor layer A and the conductor layer B, E in FIG. 254E is a plan view of the stacked state of the conductor layer A and the conductor layer C, and FIG. 254F is a plan view of the stacked state of the conductor layer B and the conductor layer C. Note that FIGS. 254A, 254B, 254C, 254D, 254E, and 254F may be regarded as depicting the entire region of each conductor layer or may be regarded as depicting a partial region of each conductor layer.

The conductor layer A in FIG. 254A includes a mesh conductor 2331. That is, the mesh conductor 2331 has the X-direction conductor width WXA, gap width GXA, and conductor pitch FXA and has the Y-direction conductor width WYA, gap width GYA, and conductor pitch FYA. The mesh conductor 2331 is a conductor with a shape in which the basic pattern with the conductor pitch FXA and the conductor pitch FYA is arranged repetitively on the same plane. For example, the mesh conductor 2331 is a wire (Vss1 wire) connected to the second power supply Vss1.

The conductor layer B in FIG. 254B includes a mesh conductor 2332. That is, the mesh conductor 2332 has the X-direction conductor width WXB, gap width GXB, and conductor pitch FXB and has the Y-direction conductor width WYB, gap width GYB, and conductor pitch FYB. The mesh conductor 2332 is a conductor with a shape in which the basic pattern with the conductor pitch FXB and the conductor pitch FYB is arranged repetitively on the same plane. The mesh conductor 2332 is a wire (Vdd wire) connected to the first power supply Vdd, for example. For example, the conductor pitches of the mesh conductor 2331 and the mesh conductor 2332 are the same, and (conductor pitch FXA)=(conductor pitch FXB) and (conductor pitch FYA)=(conductor pitch FYB) are satisfied.

The conductor layer C in FIG. 254C includes a mesh conductor 2333. That is, the mesh conductor 2333 has the X-direction conductor width WXC, gap width GXC, and conductor pitch FXC and has the Y-direction conductor width WYC, gap width GYC, and conductor pitch FYC. The mesh conductor 2333 is a conductor with a shape in which the basic pattern with the conductor pitch FXC and the conductor pitch FYC is arranged repetitively on the same plane. For example, the mesh conductor 2333 is a wire (Vss2 wire) connected to the third power supply Vss2. The conductor pitches of the mesh conductor 2331 and the mesh conductor 2333 are the same, and (conductor pitch FXB)=(conductor pitch FXC) and (conductor pitch FYB)=(conductor pitch FYC) are satisfied.

While the positions of conductor sections of the mesh conductor 2331 in the conductor layer A and the mesh conductor 2333 in the conductor layer C overlap in both the X direction and the Y direction, the X-direction positions of conductor sections of the mesh conductor 2331 in the conductor layer A and the mesh conductor 2332 in the conductor layer B overlap, but the Y-direction positions of conductor sections of the mesh conductor 2331 in the conductor layer A and the mesh conductor 2332 in the conductor layer B are displaced. In other words, gap regions of the mesh conductor 2331 in the conductor layer A are positioned at the conductor sections of the mesh conductor 2332 in the conductor layer B, and gap regions of the mesh conductor 2333 in the conductor layer C are positioned at the conductor sections of the mesh conductor 2332 in the conductor layer B. Thereby, as depicted in F in FIGS. 254D and 254F, the stacking of the conductor layer A and the conductor layer B forms a light-blocking structure, and the stacking of the conductor layer B and the conductor layer C forms a light-blocking structure. Thereby, hot carrier light emissions can be blocked.

<Modification Example of Seventh Configuration Example of Three Power Supplies>

FIGS. 255A, 255B, 255C, 255D, 255E, and 255F depict a modification example of the seventh configuration example of three power supplies.

In the coordinate system in FIGS. 255A, 255B, 255C, 255D, 255E, and 255F, the X axis lies in the lateral direction, the Y axis lies in the longitudinal direction, and the Z axis lies in a direction perpendicular to the XY plane.

Figures 255A, 255B, 255C, 255D, 255E, 255F:
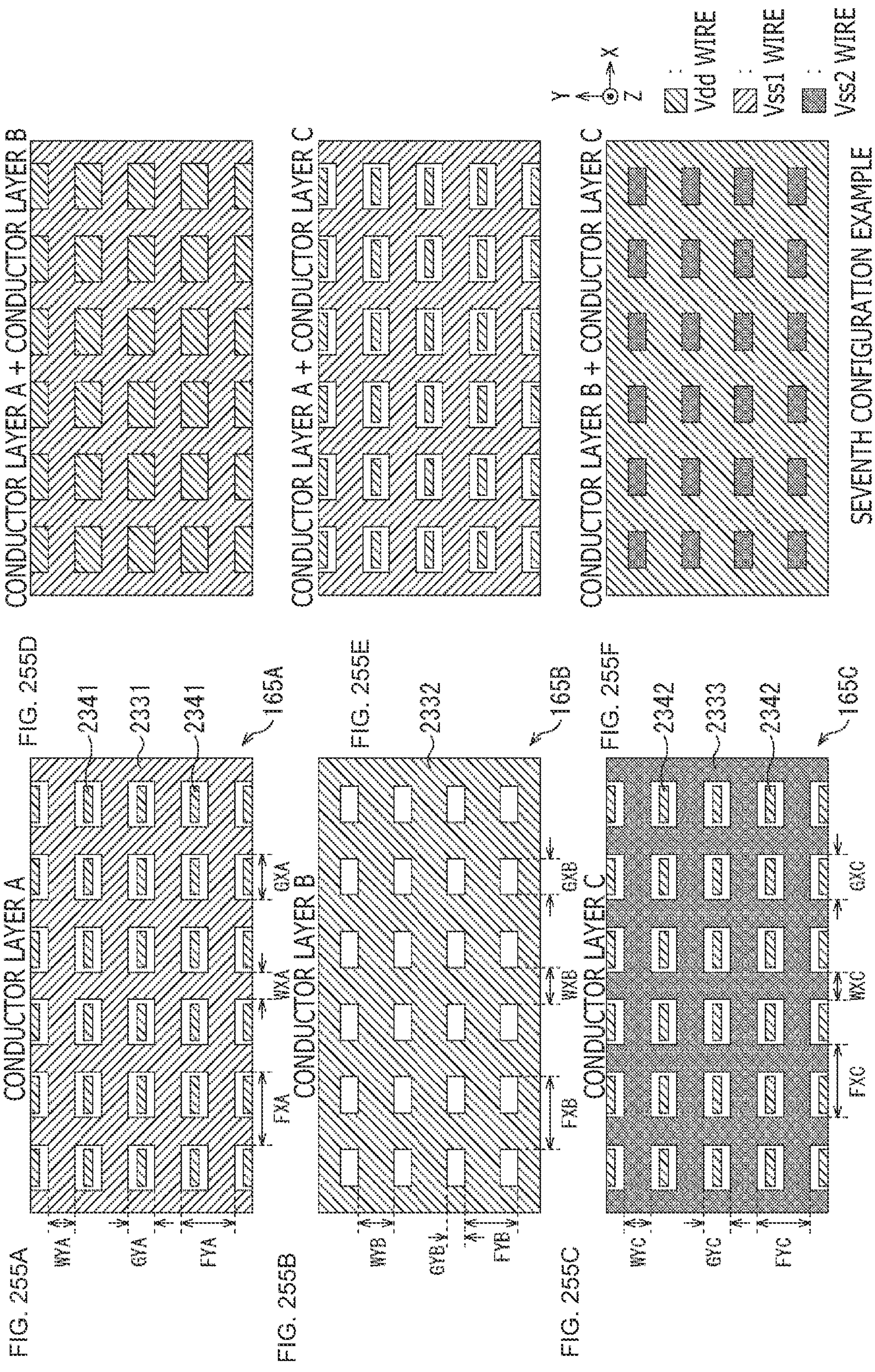

FIG. 255A depicts the conductor layer A (wiring layer 165A), B in FIG. 255B depicts the conductor layer B (wiring layer 165B), and FIG. 255C depicts the conductor layer C (wiring layer 165C).

In addition, FIG. 255D is a plan view of the stacked state of the conductor layer A and the conductor layer B, FIG. 255E is a plan view of the stacked state of the conductor layer A and the conductor layer C, and Fin FIG. 255F is a plan view of the stacked state of the conductor layer B and the conductor layer C. Note that FIGS. 255A, 255B, 255C, 255D, 255E, and 255F may be regarded as depicting the entire region of each conductor layer or may be regarded as depicting a partial region of each conductor layer.

The conductor layer A in FIG. 255A includes rectangular relay conductors 2341, and the mesh conductor 2331 connected to the second power supply Vss1. In other words, the conductor layer A in FIG. 255A has a configuration in which the relay conductors 2341 are added in gap regions of the mesh conductor 2331 depicted in FIG. 254A, but the gap regions of the mesh conductor 2331 are formed larger than those of the mesh conductor 2331 in FIG. 254A in order to arrange the relay conductors 2341 therein. The relay conductors 2341 are arranged in non-conductor gap regions in the mesh conductor 2331, are electrically insulated from the mesh conductor 2331, and, for example, are electrically connected to the mesh conductor 2332 in the conductor layer B, and another conductor layer.

The conductor layer B in FIG. 255B includes the mesh conductor 2332 connected to the first power supply Vdd, similarly to the seventh configuration example depicted in FIGS. 254A, 254B, 254C, 254D, 254E, and 254F.

The conductor layer C in FIG. 255C includes rectangular relay conductors 2342, and the mesh conductor 2333 connected to the third power supply Vss2. In other words, the conductor layer C in FIG. 255C has a configuration in which the relay conductors 2342 are added in gap regions of the mesh conductor 2333 depicted in FIG. 254C, but the gap regions of the mesh conductor 2333 are formed larger than those of the mesh conductor 2333 in FIG. 254C in order to arrange the relay conductors 2342 therein. The relay conductors 2342 are arranged in non-conductor gap regions in the mesh conductor 2333, are electrically insulated from the mesh conductor 2333, and, for example, are electrically connected to the mesh conductor 2332 in the conductor layer B, and another conductor layer.

In the modification example of the seventh configuration example also, as depicted in F in FIGS. 255D and 255F, the stacking of the conductor layer A and the conductor layer B forms a light-blocking structure, and the stacking of the conductor layer B and the conductor layer C forms a light-blocking structure. Thereby, hot carrier light emissions can be blocked.

Note that while the stacking of two layers realizes a light-blocking structure in the configurations in the seventh configuration example and the modification example thereof in FIG. 254A, 254B, 254C, 254D, 254E, 254F, 255A, 255B. 2550, 255D, 255E, and 255F, the stacking of two layers may not form a light-blocking structure, but the stacking of three layers may form a light-blocking structure in one possible configuration.

<Eighth Configuration Example of Three Power Supplies>

FIGS. 256A, 256B, 256C, 256D, 256E, and 256F depict an eighth configuration example of three power supplies.

In the coordinate system in FIGS. 256A, 256B, 256C, 256D, 256E, and 256F, the X axis lies in the lateral direction, the Y axis lies in the longitudinal direction, and the Z axis lies in a direction perpendicular to the XY plane.

Figures 256A, 256B, 256C, 256D, 256E, 256F:
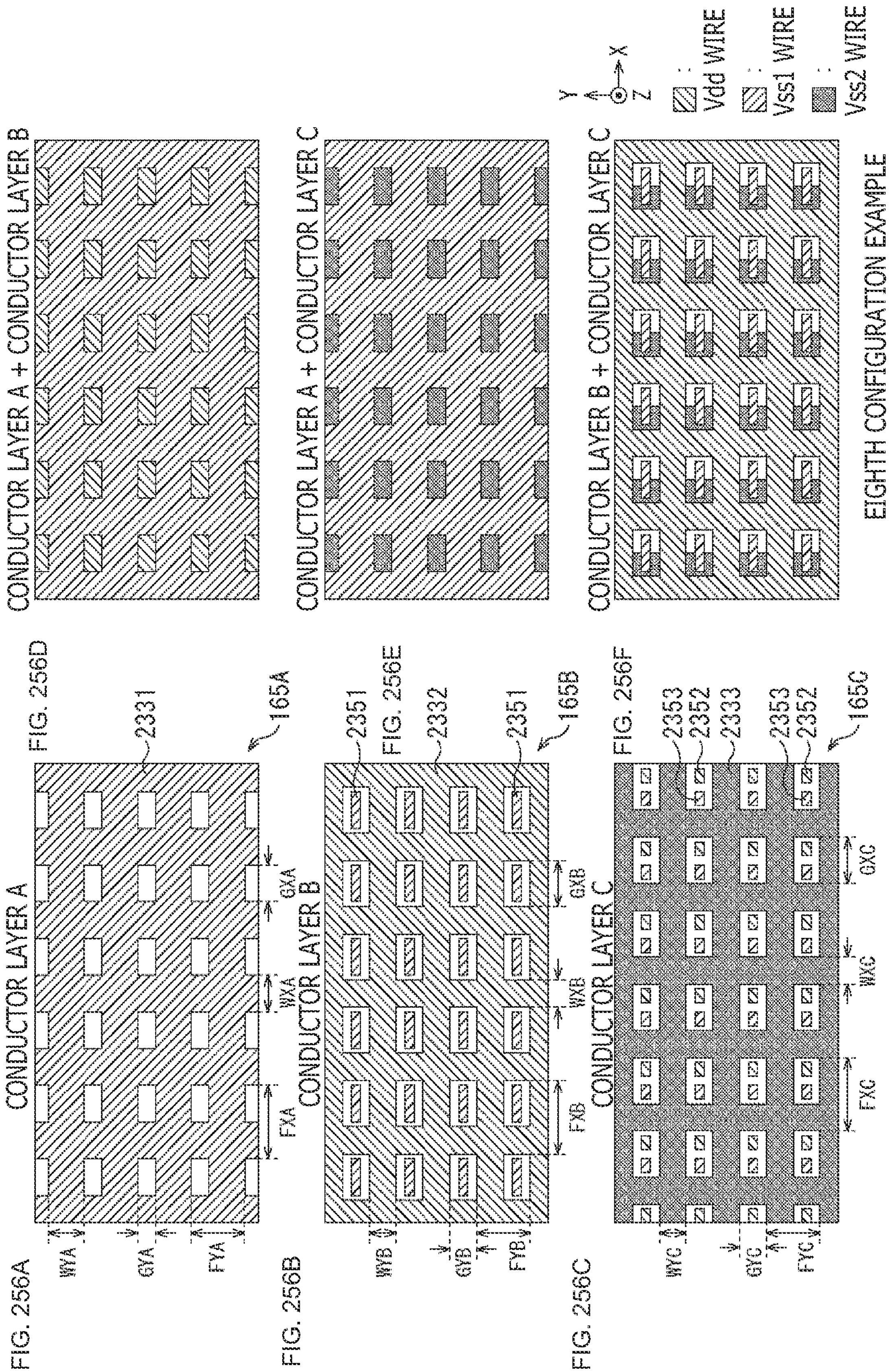

FIG. 256A depicts the conductor layer A (wiring layer 165A), B in

FIG. 256B depicts the conductor layer B (wiring layer 165B), and FIG. 256C depicts the conductor layer C (wiring layer 165C).

In addition, FIG. 256D is a plan view of the stacked state of the conductor layer A and the conductor layer B, FIG. 256E is a plan view of the stacked state of the conductor layer A and the conductor layer C, and FIG. 256F is a plan view of the stacked state of the conductor layer B and the conductor layer C. Note that FIGS. 256A, 256B, 256C, 256D, 256E, and 256F may be regarded as depicting the entire region of each conductor layer or may be regarded as depicting a partial region of each conductor layer.

The conductor layer A in FIG. 256A includes the mesh conductor 2331 connected to the second power supply Vss1, similarly to the seventh configuration example depicted in FIGS. 254A, 254B, 254C, 254D, 254E, and 254F.

The conductor layer B in FIG. 256B includes rectangular relay conductors 2351, and the mesh conductor 2332 connected to the first power supply Vdd. In other words, the conductor layer B in FIG. 256B has a configuration in which the relay conductors 2351 are added in gap regions of the mesh conductor 2332 in the seventh configuration example depicted in FIG. 254B, but the gap regions of the mesh conductor 2332 are formed larger than those of the mesh conductor 2332 in FIG. 254B in order to arrange the relay conductors 2351 therein. The relay conductors 2351 are arranged in non-conductor gap regions in the mesh conductor 2332, are electrically insulated from the mesh conductor 2332, and, for example, are electrically connected to the mesh conductor 2331 in the conductor layer A and relay conductors 2353 in the conductor layer C.

The conductor layer C in FIG. 256C includes rectangular relay conductors 2352 and 2353, and the mesh conductor 2333 connected to the third power supply Vss2. In other words, the conductor layer C in FIG. 256C has a configuration in which the relay conductors 2352 and 2353 are added in gap regions of the mesh conductor 2333 in the seventh configuration example depicted in-G in FIG. 254C, but the gap regions of the mesh conductor 2333 are formed larger than those of the mesh conductor 2333 in FIG. 254C in order to arrange the relay conductors 2352 and 2353 therein. The relay conductors 2352 are arranged in non-conductor gap regions in the mesh conductor 2333, are electrically insulated from the mesh conductor 2333, and, for example, are electrically connected to the mesh conductor 2332 in the conductor layer B, and another conductor layer. The relay conductors 2353 are arranged in non-conductor gap regions in the mesh conductor 2333, are electrically insulated from the mesh conductor 2333, and, for example, are electrically connected to the relay conductors 2351 in the conductor layer B, and another conductor layer.

The X-direction positions of the conductor sections of the mesh conductor 2331 in the conductor layer A and the mesh conductor 2332 in the conductor layer B overlap partially, but the Y-direction positions of the conductor sections of the mesh conductor 2331 in the conductor layer A and the mesh conductor 2332 in the conductor layer B are displaced. Thereby, the stacking of the conductor layer A and the conductor layer B forms a light-blocking structure. In addition, both the X-direction positions and Y-direction positions of conductor sections of the mesh conductor 2331 in the conductor layer A and the mesh conductor 2333 in the conductor layer C are displaced. Thereby, the stacking of the conductor layer A and the conductor layer C forms a light-blocking structure. Thereby, hot carrier light emissions can be blocked.

In the eighth configuration example in FIGS. 256A, 256B, 256C 256D, 256E, and 256F, by adopting an arrangement in which the X-direction positions of conductor sections of the mesh conductors in the conductor layer B and the conductor layer C are displaced, Vdd conductors and Vss conductors in the conductor layer A and the conductor layer B can be electrically connected to a layer below or above the conductor layer C through a short path via conductor vias extending in the Z direction, or the like.

Note that while relay conductors are not provided in the conductor layer A including a mesh conductor with the largest conductor widths among the conductor layers A to C in the eighth configuration example in FIGS. 256A, 256B, 256C 256D, 256E, and 256F, relay conductors may be provided also in the conductor layer A.

<First Modification Example of Eighth Configuration Example of Three Power Supplies>

FIGS. 257A, 257B, 257C, 257D, 257E, 257F, 258A, 258B, 258C, 258D, 258E, 258F, 259A, 259B, 259C, 259D, 259E, 259F, 260A, 260B, 260C, 260D, 260E, and 260E depict a first modification example to a fourth modification example of the eighth configuration example of three power supplies.

FIGS. 257A, 257B, 257C, 257D, 257E, 257F, 258A, 258B, 258C, 258D, 258E, 258F, 259A, 259B, 259C, 259D, 259E, 259F, 260A, 260B, 260C. 260D, 260E, and 260E, the conductor layer A (wiring layer 165A), the conductor layer B (wiring layer 165B), the conductor layer C (wiring layer 165C), and the arrays in a plan view of the stacked state of the conductor layer A and the conductor layer B, a plan view of the stacked state of the conductor layer A and the conductor layer C, and a plan view of the stacked state of the conductor layer B and the conductor layer C are similar to those in FIGS. 248A, 248B, 248C, 248D, 248E, and 248F. The coordinate systems also are similar.

FIGS. 257A, 257B, 2570, 257D, 257E, and 257F depict a first modification example of the eighth configuration example of three power supplies.

Figures 257A, 257B, 257C, 257D, 257E, 257F:
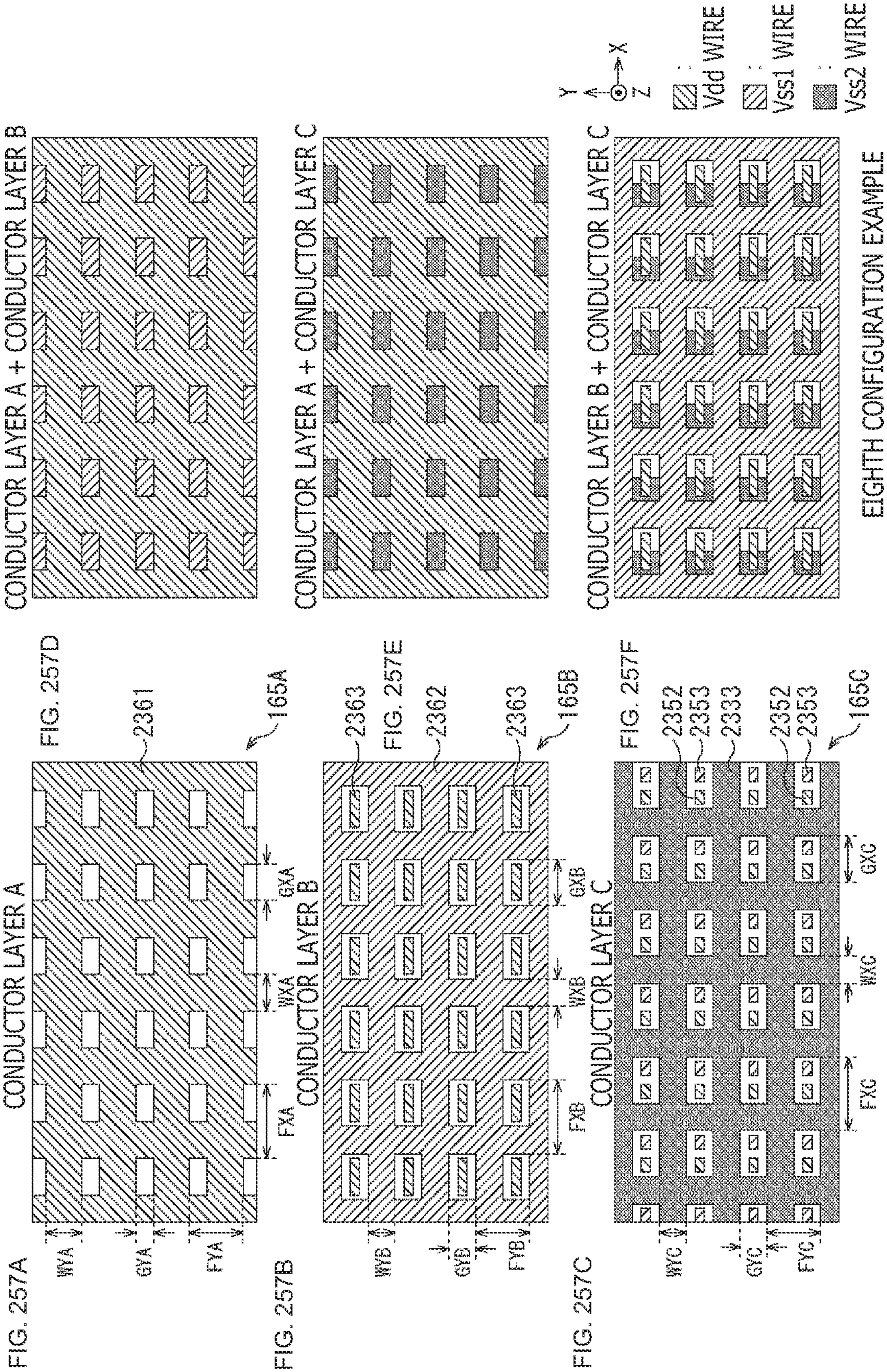

The conductor layer A in FIG. 257A includes a mesh conductor 2361. That is, the mesh conductor 2361 has the X-direction conductor width WXA, gap width GXA, and conductor pitch FXA and has the Y-direction conductor width WYA, gap width GYA, and conductor pitch FYA. The mesh conductor 2361 is a conductor with a shape in which the basic pattern with the conductor pitch FXA and the conductor pitch FYA is arranged repetitively on the same plane. The mesh conductor 2361 is a wire (Vdd wire) connected to the first power supply Vdd, for example.

The conductor layer B in FIG. 257B includes rectangular relay conductors 2363, and a mesh conductor 2362 connected to the second power supply Vss1. The relay conductors 2363 are arranged in non-conductor gap regions in the mesh conductor 2362, are electrically insulated from the mesh conductor 2362, and, for example, are electrically connected to the mesh conductor 2361 in the conductor layer A and the relay conductors 2352 in the conductor layer C.

Similarly to the eighth configuration example depicted in FIGS. 256A, 256B, 256C, 256D, 256E, and 256F, the conductor layer C in FIG. 257C includes the mesh conductor 2333 connected to the third power supply Vss2, the rectangular relay conductors 2352 connected to the first power supply Vdd, and the rectangular relay conductors 2353 connected to the second power supply Vss1.

Accordingly, the first modification example in FIGS. 257A, 257B, 257C, 257D, 257E, and 257F has a configuration in which power supplies to which the conductor layer A and the conductor layer B are connected are replaced in the eighth configuration example in FIGS. 256A, 256B, 256C, 256D, 256E, and 256F. The first modification example in FIGS. 257A, 257B, 257C, 257D, 257E, and 257F has a configuration in which, for example, in a case in which the conductor layer A is a conductor layer with a sheet resistance lower than the sheet resistance of the conductor layer B or the conductor layer C, the conductor layer A with the lower sheet resistance is made a Vdd conductor. In such a case, it is desirable in terms of voltage drops if the conductor layer A has a configuration not provided with relay conductors. In this manner, the conductor layer A with a low sheet resistance can be made a conductor layer (Vdd conductor) connected to a power supply in common used in a configuration in which the second power supply Vss1 and the third power supply Vss2 are switched selectively.

<Second Modification Example of Eighth Configuration Example of

Three Power Supplies>FIGS. 258A, 258B, 258C, 258D, 258E, and 258F depict a second modification example of the eighth configuration example of three power supplies.

Figures 258A, 258B, 258C, 258D, 258E, 258F:
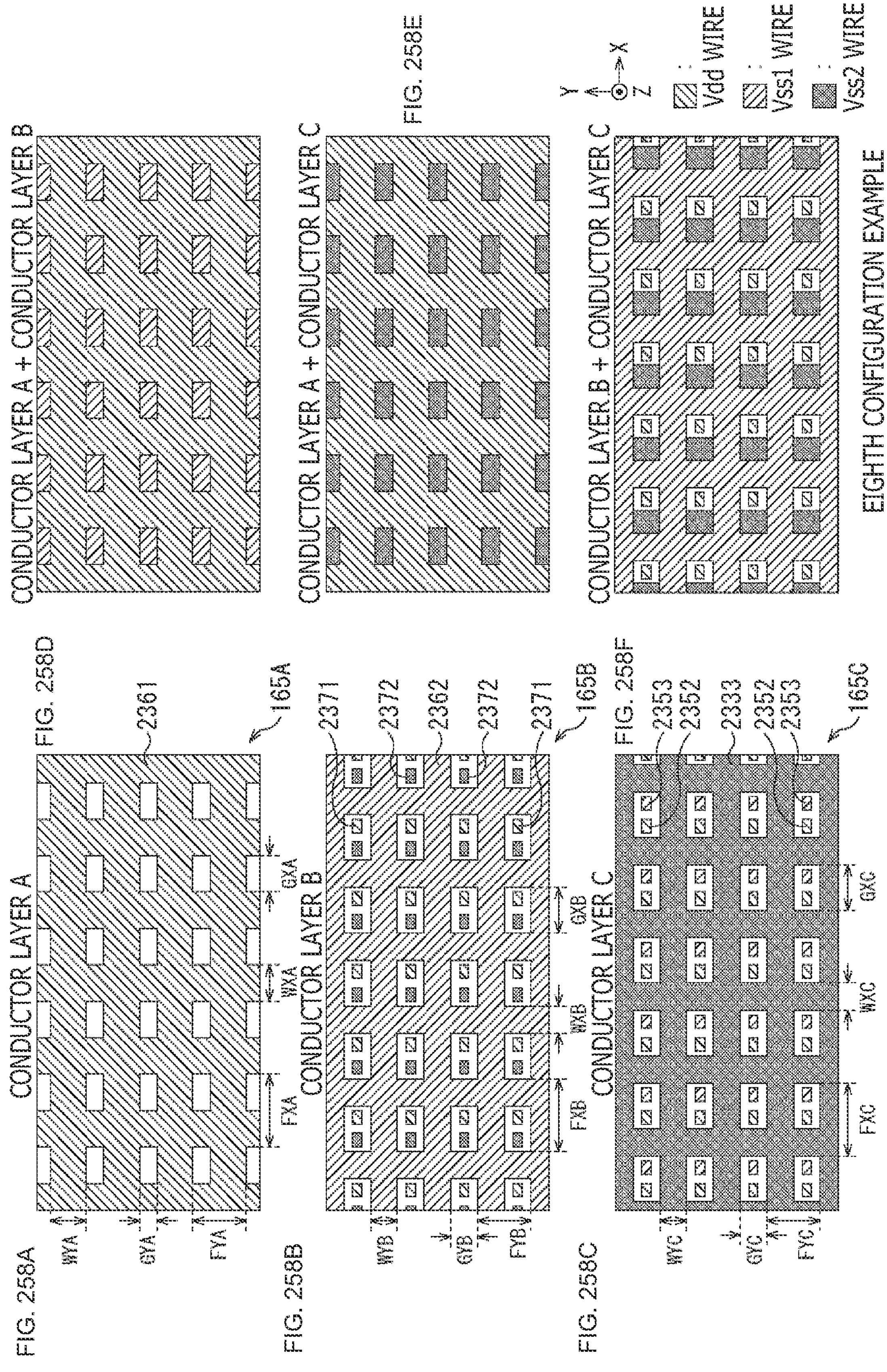

The conductor layer A in FIG. 258A includes the mesh conductor 2361 connected to the first power supply Vdd, similarly to the first modification example in A in-FIG. 257A.

The conductor layer B in FIG. 258B includes rectangular relay conductors 2371 and 2372, and the mesh conductor 2362 connected to the second power supply Vss1. The relay conductors 2371 are arranged in non-conductor gap regions in the mesh conductor 2362, are electrically insulated from the mesh conductor 2362, and, for example, are electrically connected to the mesh conductor 2361 in the conductor layer A and the relay conductors 2352 in the conductor layer C. The relay conductors 2372 are arranged in non-conductor gap regions in the mesh conductor 2362, are electrically insulated from the mesh conductor 2362, and, for example, are electrically connected to the mesh conductor 2333 in the conductor layer C, and another conductor layer.

Similarly to the eighth configuration example depicted in FIGS. 256A, 256B, 256C, 256D, 256E, and 256F, the conductor layer C in FIG. 258C includes the mesh conductor 2333 connected to the third power supply Vss2, the rectangular relay conductors 2352 connected to the first power supply Vdd, and the rectangular relay conductors 2353 connected to the second power supply Vss1.

Accordingly, the second modification example in FIGS. 258A, 258B. 2580, 258D, 258E, and 258F has a configuration in which relay conductors in the conductor layer B are replaced in the first modification example in FIGS. 257A, 257B, 257C, 257D, 257E, and 257F.

<Third Modification Example of Eighth Configuration Example of Three Power Supplies>

FIGS. 259A, 259B, 259C, 259D, 259E, and 259F depict a third modification example of the eighth configuration example of three power supplies.

Figures 259A, 259B, 259C, 259D, 259E, 259F:
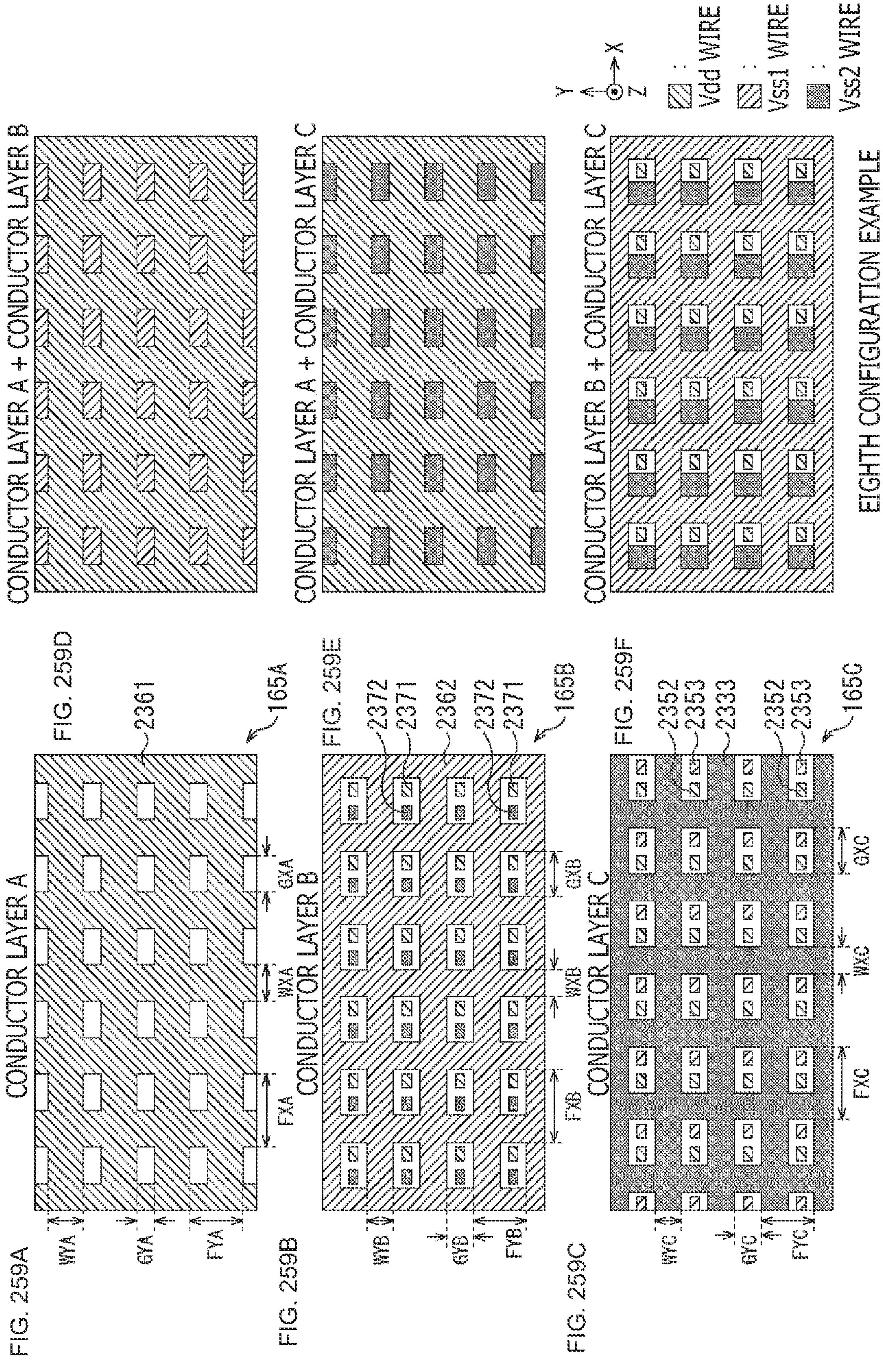

The conductor layer A in FIG. 259A includes the mesh conductor 2361 connected to the first power supply Vdd, similarly to the second modification example in FIG. 258A.

Similarly to the second modification example in FIG. 258B, the conductor layer B in FIG. 259B includes the mesh conductor 2362 connected to the second power supply Vss1, the rectangular relay conductors 2371 connected to the first power supply Vdd, and the rectangular relay conductors 2372 connected to the third power supply Vss2.

Similarly to the second modification example in FIG. 258C, the conductor layer C in FIG. 259C includes the mesh conductor 2333 connected to the third power supply Vss2, the rectangular relay conductors 2352 connected to the first power supply Vdd, and the rectangular relay conductors 2353 connected to the second power supply Vss1.

Accordingly, the third modification example in FIGS. 259A, 259B. 259C, 259D, 259E, and 259F is the same as the second modification example depicted in FIGS. 258A, 258B, 258C, 258D, 258E, and 258F in terms of conductor configurations, but is different from the second modification example in terms of the positional relation among the conductor layers A to C.

Specifically, if the second modification example depicted in FIGS. 258A, 258B, 258C, 258D, 258E, and 258F, and the third modification example in FIGS. 259A, 259B, 259C, 259D, 259E, and 259F are compared in terms of the X-direction positions of the conductor layer A and the conductor layer B, while conductor sections of the mesh conductor 2362 in the conductor layer B are arranged at the positions of gap regions of the mesh conductor 2361 in the conductor layer A in the second modification example depicted in FIGS. 258A, 258B, 258C, 258D, 258E, and 258F, conductor sections of the mesh conductor 2362 in the conductor layer B are arranged at the positions of conductor sections of the mesh conductor 2361 in the conductor layer A in the third modification example in FIGS. 259A, 259B, 259C, 259D. 259E, and 259F. The positional relation between the conductor layer B and the conductor layer C is the same in the second modification example and the third modification example.

The stacked state of two layers in FIGS. 259D, 259E, and 259F is the same in the second modification example and the third modification example.

The second modification example depicted in FIGS. 258A, 258B, 258C, 258D, 258E, and 258F, and the third modification example in FIGS. 259A, 259B, 259C, 259D, 259E, and 259F have a commonality in that they have configurations in which the conductor layer B and the conductor layer C include mesh conductors as Vss1 conductors or Vss2 conductors, and two rectangular relay conductors are arranged in each gap region of the mesh conductors. In the configurations of the second modification example and the third modification example, the shape of the Vss1 conductors, and the shape of the Vss2 conductors become spuriously the same, and so this is suitable in some cases because the combination of the Vdd conductors and the Vss1 conductors, and the combination of the Vdd conductors and the Vss2 conductors can reduce the difference in voltage drops, and the difference in inductive noise. Note that, needless to say, the shape of the Vss1 conductors and the shape of the Vss2 conductors may not be spuriously the same in another possible configuration.

<Fourth Modification Example of Eighth Configuration Example of Three Power Supplies>

FIGS. 260A, 260B, 260C, 260D, 260E, and 260F depict a fourth modification example of the eighth configuration example of three power supplies.

Figures 260A, 260B, 260C, 260D, 260E, 260F:
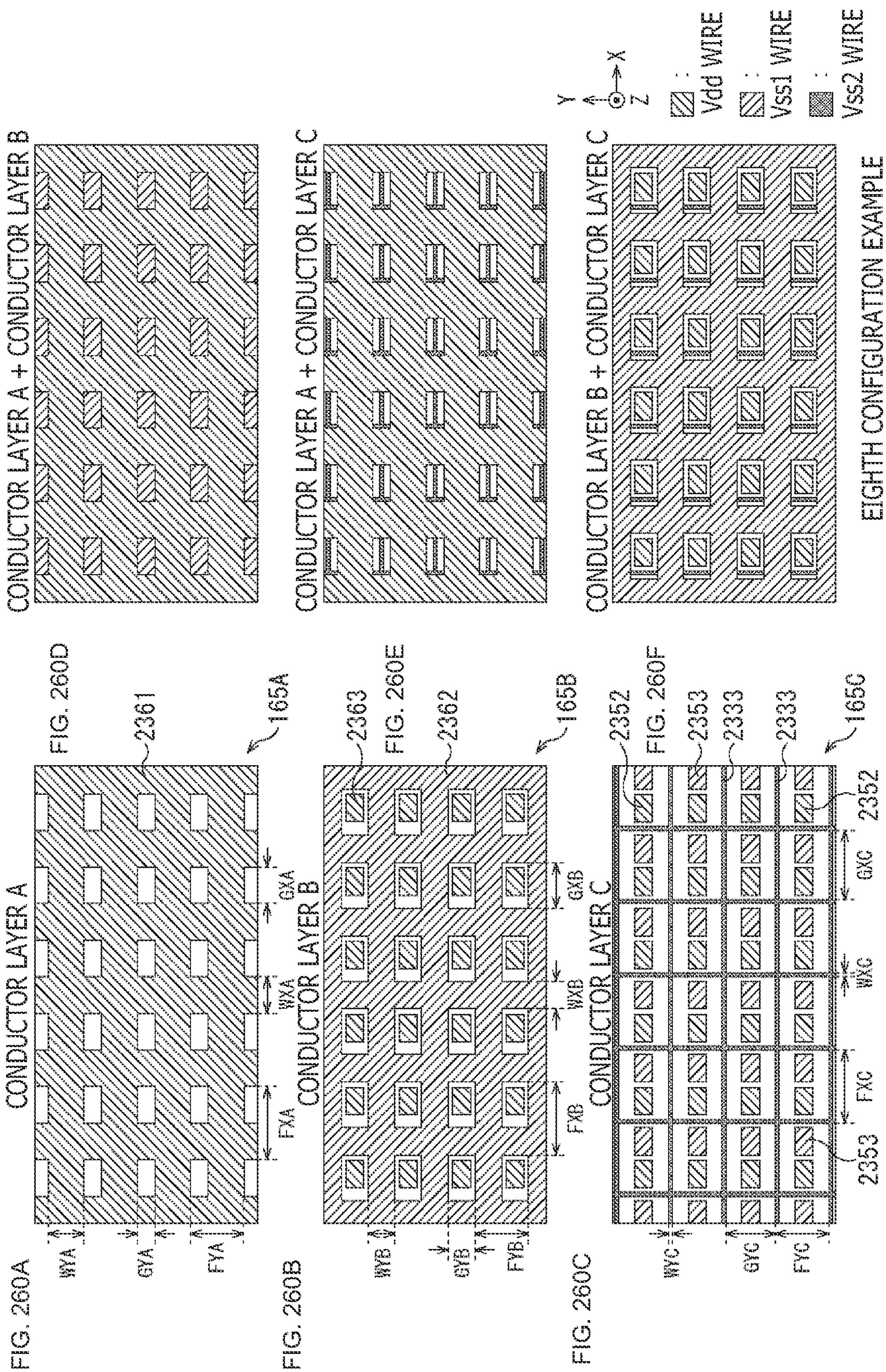

The conductor layer A in FIG. 260A includes the mesh conductor 2361 connected to the first power supply Vdd, similarly to the second modification example in FIG. 258A.

The conductor layer B in FIG. 260B includes the mesh conductor 2362 connected to the second power supply Vss1, and the rectangular relay conductors 2363 connected to the first power supply Vdd. Accordingly, the conductor layer B has a commonality with the conductor layer B in the first modification example depicted in FIG. 257B in that the conductor layer B includes the mesh conductor 2362 and the rectangular relay conductors 2363, but is different from the first modification example in terms of the rectangular shape of the relay conductors 2363. While the rectangular shape of the relay conductors 2363 is a rectangular shape with a large difference between the X-direction and Y-direction conductor widths in the first modification example, the rectangular shape is a rectangular shape with a small difference between the X-direction and Y-direction conductor widths, and is close to a square in the fourth modification example.

The conductor layer C in FIG. 260C includes the mesh conductor 2333 connected to the third power supply Vss2, the rectangular relay conductors 2352 connected to the first power supply Vdd, and the rectangular relay conductors 2353 connected to the second power supply Vss1. Accordingly, while the conductor layer C has a commonality with the conductor layer C in the first modification example depicted in FIG. 257C in that the conductor layer C includes the mesh conductor 2333, the relay conductors 2352 and the relay conductors 2353, the conductor widths (the conductor width WXB and the conductor width WYB), and the gap widths (the gap width GXB and the gap width GYB) of the mesh conductor 2333 are different. The conductor widths in the fourth modification example in FIG. 260C are formed extremely thinner than the conductor widths in the first modification example depicted in FIG. 257C. Thereby, gap regions of the mesh conductor 2333 are modified to be large, and the X-direction and Y-direction conductor widths of the relay conductors 2352 and 2353 in the fourth modification example are conversely modified to be larger than those of the relay conductors 2352 and 2353 in the first modification example.

Accordingly, in the fourth modification example, the conductor widths of the mesh conductor 2333, which is the Vss2 conductor, is made extremely smaller than the conductor widths of the mesh conductor 2361, which is the Vdd conductor, and the conductor widths of the mesh conductor 2362, which is the Vss1 conductor. In this manner, by giving the Vdd conductor and the Vss1 conductor the largest possible conductor widths, the Vdd conductor and the Vss1 conductor are prioritized in terms of voltage drops, in one possible configuration. Alternatively, the conductor widths of the mesh conductor 2362, which is the Vss1 conductor, also may be made extremely smaller than the conductor widths of the mesh conductor 2361, which is the Vdd conductor, and only the Vdd conductor may be prioritized in terms of voltage drops, in one possible configuration. Conversely, at least one of the Vss1 conductor or the Vss2 conductor may be prioritized over the Vdd conductor in terms of voltage drops, in one possible configuration.

<Ninth Configuration Example of Three Power Supplies>

FIGS. 261A, 261B, 261C, 261D, 261E, and 261F depict a ninth configuration example of three power supplies.

In the coordinate system in FIGS. 261A, 261B, 261C, 261D, 261E, and 261F, the X axis lies in the lateral direction, the Y axis lies in the longitudinal direction, and the Z axis lies in a direction perpendicular to the XY plane.

Figure 261A:
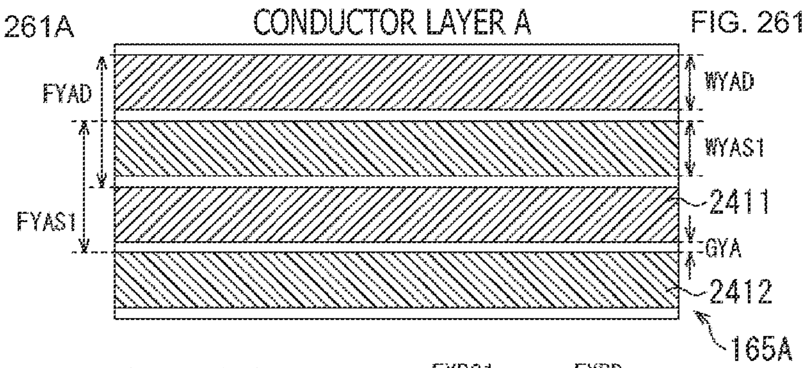
Figure 261B:
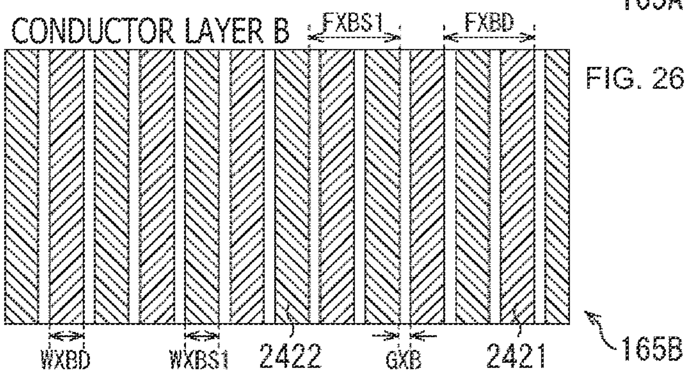
Figure 261C:
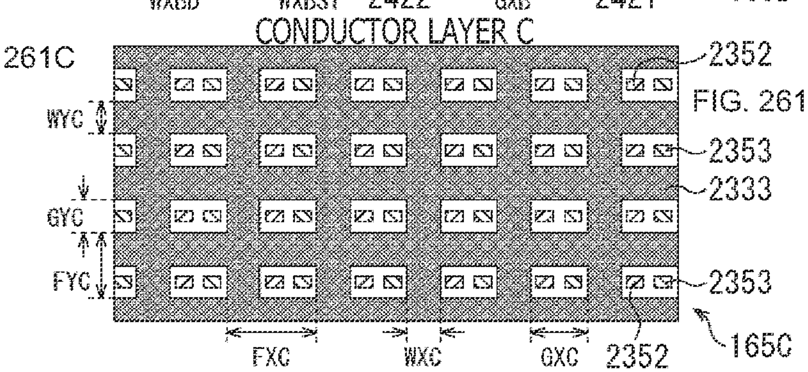

FIG. 261A depicts the conductor layer A (wiring layer 165A), B in FIG. 261B depicts the conductor layer B (wiring layer 165B), and FIG. 261C depicts the conductor layer C (wiring layer 165C).

Figure 261D:
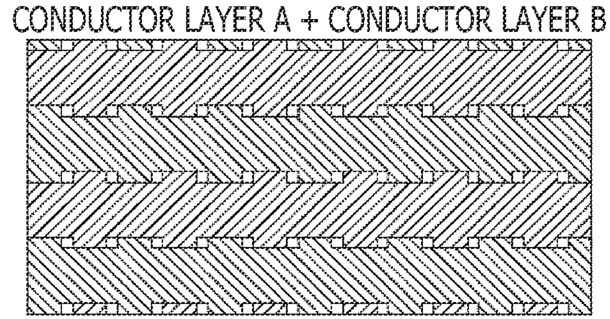
Figure 261E:
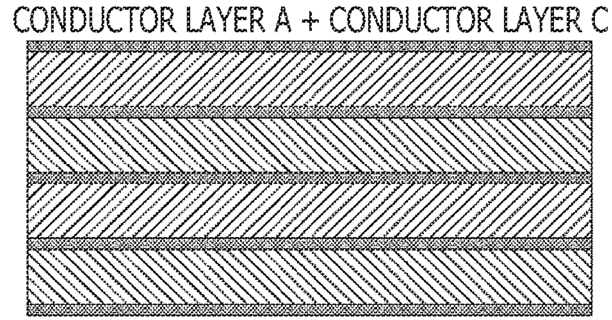
Figure 261F:
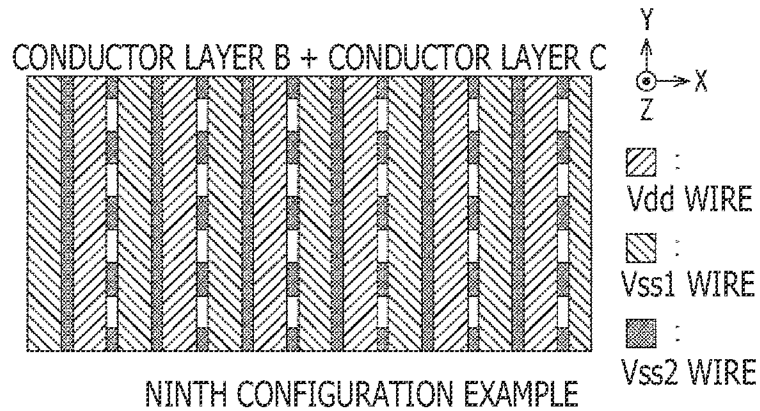

In addition, FIG. 261D is a plan view of the stacked state of the conductor layer A and the conductor layer B, E in FIG. 261E is a plan view of the stacked state of the conductor layer A and the conductor layer C, and FIG. 261F is a plan view of the stacked state of the conductor layer B and the conductor layer C. Note that FIGS. 261A, 261B, 261C, 261D, 261E, and 261F may be regarded as depicting the entire region of each conductor layer or may be regarded as depicting a partial region of each conductor layer.

In the conductor layer A in FIG. 261A, linear conductors 2411 that are long in the X direction, and linear conductors 2412 that are long in the X direction are arranged regularly alternately in the Y direction.

For example, the linear conductors 2411 are wires (Vdd wires) connected to the first power supply Vdd. For example, the linear conductors 2412 are wires (Vss1 wires) connected to the second power supply Vss1. The linear conductors 2411 and the linear conductors 2412 are differential conductors (differential structures) in which currents flow in mutually opposite directions.

The linear conductors 2411 have the Y-direction conductor width WYAD, the linear conductors 2412 have the Y-direction conductor width WYAS1, and, for example, the conductor width WYAD of the linear conductors 2411, and the conductor width WYAS1 of the linear conductors 2412 are the same ((conductor width WYAD)=(conductor width WYAS1)). There is a gap with a gap width GYA between each linear conductor 2411 and each linear conductor 2412 in the Y direction.

The linear conductors 2411 that are long in the X direction are arranged regularly in the Y direction at a conductor pitch FYAD (=(conductor width WYAD)+(conductor width WYAS1)+2×(gap width GYA)). The linear conductors 2412 that are long in the X direction are arranged regularly in the Y direction at a conductor pitch FYAS1 (=(conductor width WYAD)+(conductor width WYAS1)+2×(gap width GYA)). For example, the conductor pitch FYAD of the linear conductors 2411, and the conductor pitch FYAS1 of the linear conductors 2412 are the same ((conductor pitch FYAD)=(conductor pitch FYAS1)).

In the conductor layer B in FIG. 261B, linear conductors 2421 that are long in the Y direction, and linear conductors 2422 that are long in the Y direction are arranged regularly alternately in the X direction.

For example, the linear conductors 2421 are wires (Vdd wires) connected to the first power supply Vdd. For example, the linear conductors 2422 are wires (Vss1 wires) connected to the second power supply Vss1. The linear conductors 2421 and the linear conductors 2422 are differential conductors (differential structures) in which currents flow in mutually opposite directions.

The linear conductors 2421 have the X-direction conductor width WXBD, the linear conductors 2422 have the X-direction conductor width WXBS1, and, for example, the conductor width WXBD of the linear conductors 2421, and the conductor width WXBS1 of the linear conductors 2422 are the same ((conductor width WXBD)=(conductor width WXBS1)). There is a gap with the gap width GXB between each linear conductor 2421 and each linear conductor 2422 in the X direction.

The linear conductors 2421 that are long in the Y direction are arranged regularly in the X direction at the conductor pitch FXBD (=(conductor width WXBD)+(conductor width WXBS1)+2×(gap width GXB)). The linear conductors 2422 that are long in the Y direction are arranged regularly in the X direction at the conductor pitch FXBS1 (=(conductor width WXBD)+(conductor width WXBS1)+2×(gap width GXB)). For example, the conductor pitch FXBD of the linear conductors 2421, and the conductor pitch FXBS1 of the linear conductors 2422 are the same ((conductor pitch FXBD)=(conductor pitch FXBS1)).

Similarly to the eighth configuration example depicted in FIGS. 256A, 256B, 256C, 256D, 256E, and 256F, the conductor layer C in FIG. 261C includes the mesh conductor 2333 connected to the third power supply Vss2, the rectangular relay conductors 2352 connected to the first power supply Vdd, and the rectangular relay conductors 2353 connected to the second power supply Vss1.

As depicted in F in FIG. 261D, 261E, 261F, the stacking of the conductor layer A and the conductor layer B, and the stacking of the conductor layer B and the conductor layer C cannot form full light-blocking structures, but as depicted in FIG. 261E, the stacking of the conductor layer A and the conductor layer C forms a light-blocking structure.

As in FIGS. 261A, 261B, 261C, 261D, 261E, and 261F, in the ninth configuration example, the conductor layer A has a differential configuration of Vdd conductors and Vss1 conductors, the conductor layer B has a differential configuration of Vdd conductors and Vss1 conductors, and the conductor layer A and the conductor layer B form a configuration in which wiring directions are orthogonal to each other. Then, the conductor layer C includes a mesh conductor (Vss2 conductor) connected to the third power supply Vss2. In addition, the conductor layer C is provided with the rectangular relay conductors 2352 connected to the first power supply Vdd, and the rectangular relay conductors 2353 connected to the second power supply Vss1. Either one of or both the relay conductors 2352 and the relay conductors 2353 may be omitted.

<Modification Example of First to Ninth Configuration Examples of Three Power Supplies>

Matters that are related to the linear conductors, mesh conductors, or rectangular conductors in the first configuration example to the ninth configuration example including three power supplies mentioned above, and are explained as being the same may be substantially the same. For example, the same conductor widths, the same conductor pitches and the same conductor area sizes may be substantially the same conductor widths, substantially the same conductor pitches and substantially the same conductor area sizes, respectively. Here, being substantially the same means that the differences are so small that they can be deemed to be the same, and it is sufficient if at least the differences are 200%-differences or smaller, for example.

In regions where conductors that are in any two conductor layers in the conductor layers A to C and are connected to the same power supplies overlap, the conductors can be connected electrically via conductor vias extending in the Z direction, or the like, as necessary.

In the examples of the stacking of two layers, the conductor layer A and the conductor layer B, or the three layers, the conductor layers A to C, mentioned above, any stacking order can be decided as the stacking order of the conductor layer A and the conductor layer B. In addition, in each configuration example mentioned above, conductors explained as being conductors connected to the first power supply Vdd (Vdd conductors) may be made conductors connected to the second power supply Vss1 or the third power supply Vss2, conductors explained as being conductors connected to the second power supply Vss1 (Vss1 conductors) may be made conductors connected to the first power supply Vdd or the third power supply Vss2, and conductors explained as being conductors connected to the third power supply Vss2 (Vss2 conductors) may be made conductors connected to the first power supply Vdd or the second power supply Vss1. While each of the gap widths GXA, GXB, GYA and GYB is the same irrespective of positions in the examples used for the explanation of each configuration example mentioned above, these gap widths may be varied depending on positions, and may be modulated according to positions. In addition, while each of the conductor widths WXAD, WXAS1, WXAS2, WXBD, WXBS1, WXBS2, WYAD, WYAS1, WYAS2, WYBD, WYBS1 and WYBS2 is the same irrespective of positions in some examples used for explanations, these conductor widths may be varied depending on positions, and may be modulated according to positions. In addition, while it is considered suitable if "(conductor width WYAD)=(conductor width WYAS1)=(conductor width WYAS2)" is satisfied, the relation may not be satisfied in one possible configuration. In addition, while each of the conductor pitches FXAD, FXAS1, FXAS2, FXBD, FXBS1, FXBS2, FYAD, FYAS1, FYBD, FYBS1, FYBS2, FXA, FXB, FXC, FYA, FYB and FYC is the same irrespective of positions in some examples used for explanations, these conductor pitches may be varied depending on positions, and may be modulated according to positions. In addition, while it is considered suitable if the condition, "(conductor pitch FXAD)=(conductor pitch FXAS1)=(conductor pitch FXAS2)," "(conductor pitch FXBD)=(conductor pitch FXBS1)=(conductor pitch FXBS2)," "(conductor pitch FYAD)=(conductor pitch FYAS1)," "(conductor pitch FYBD)=(conductor pitch FYBS1)=(conductor pitch FYBS2)," "(conductor pitch FXA)=(conductor pitch FXB)=(conductor pitch FXC)," or "(conductor pitch FYA)=(conductor pitch FYB)=(conductor pitch FYC)" is satisfied, the condition may not be satisfied in one configuration. In addition, at least some or all of the mesh conductors mentioned above may be planar conductors or linear conductors. Note that while configuration examples and modification examples are explained about the case in which the solid-state image pickup apparatus has three power supplies, these can be applied to configuration examples and modification examples in which the solid-state image pickup apparatus can have four or more power supplies. For example, in the case of four power supplies, at least one of the first to third power supplies may be replaced with a fourth power supply, and at least one of the first path and the second path may be replaced with a third path connected to the fourth power supply. In addition, the fourth power supply may be added in addition to the first to third power supplies, and the third path connected to the fourth power supply may be added in addition to the first path and the second path. Similar principles can be applied also to a case in which the solid-state image pickup apparatus has five or more power supplies.

16. Configuration Examples of Image Pickup Apparatus

The solid-state image pickup apparatus 100 mentioned above can be applied, for example, to camera systems such as a digital camera or a video camera, mobile phones having the image pickup functionality, other equipment having the image pickup functionality or electronic equipment including a semiconductor apparatus having high-sensitivity analog elements such as a flash memory.

FIG. 262 is a block diagram depicting a configuration example of an image pickup apparatus 700 as one example of electronic equipment.

The image pickup apparatus 700 has a solid-state image pickup element 701, an optical system 702 that guides incident light to the solid-state image pickup element 701, a shutter mechanism 703 provided between the solid-state image pickup element 701 and the optical system 702, and a drive circuit 704 that drives the solid-state image pickup element 701. Furthermore, the image pickup apparatus 700 has a signal processing circuit 705 that processes output signals of the solid-state image pickup element 701.

The solid-state image pickup element 701 corresponds to the solid-state image pickup apparatus 100 mentioned above. The optical system 702 includes an optical lens group and the like, and causes image light (incident light) from a subject to enter the solid-state image pickup element 701. Thereby, a signal electric charge is accumulated in the solid-state image pickup element 701 for a predetermined period. The shutter mechanism 703 controls the light illumination period and light blocking period of incident light to enter the solid-state image pickup element 701.

The drive circuit 704 supplies drive signals to the solid-state image pickup element 701 and the shutter mechanism 703. Then, by means of the supplied drive signals, the drive circuit 704 controls the operation by the solid-state image pickup element 701 to output signals to the signal processing circuit 705, and the shutter operation by the shutter mechanism 703. That is, in this example, on the basis of the drive signals (timing signals) supplied from the drive circuit 704, the operation of transferring signals from the solid-state image pickup element 701 to the signal processing circuit 705 is performed.

The signal processing circuit 705 performs various types of signal processing on signals transferred from the solid-state image pickup element 701. Then, signals (video signals) on which various types of signal processing have been performed are stored on a storage medium (not depicted) such as a memory or output to a monitor (not depicted).

The electronic equipment such as the image pickup apparatus 700 mentioned above can suppress noise occurrence due to leakage, into light receiving elements, of light such as hot carrier light emissions from active elements such as a MOS transistor or a diode at the time of operation of peripheral circuit units in the solid-state image pickup element 701. Accordingly, high quality electronic equipment with enhanced image quality can be provided.

17. Examples of Application to In-Vivo Information Acquisition System

The technology (the present technology) according to the present disclosure can be applied to various products. For example, the technology according to the present disclosure may be applied to patient in-vivo information acquisition systems using capsule type endoscopes.

FIG. 263 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light)

of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 263, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

One example of the in-vivo information acquisition system to which the technology according to the present disclosure can be applied is explained above. The technology according to the present disclosure can be applied to the image pickup unit 10112 in the configuration explained above. Specifically, the solid-state image pickup apparatus 100 mentioned above can be applied as the image pickup unit 10112. By applying the technology according to the present disclosure to the image pickup unit 10112, by applying the technology according to the present disclosure to the image pickup unit 10112, the occurrence of noise is suppressed, and clearer images of surgical regions can be obtained. Accordingly, the precision of inspection is enhanced.

18. Examples of Application to Endoscopic Surgery System

The technology (the present technology) according to the present disclosure can be applied to various products. For example, the technology according to the present disclosure may be applied to endoscopic surgery systems.

FIG. 264 is a view depicting an example of a schematic configuration of an endoscopic surgery system to which the technology according to an embodiment of the present disclosure (present technology) can be applied.

In FIG. 264, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 265 is a block diagram depicting an example of a functional configuration of the camera head 11102 and the CCU 11201 depicted in FIG. 264.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure can be applied is explained above. The technology according to the present disclosure can be applied, for example, to the image pickup unit 11402 of the camera head 11102 in the configuration explained above. Specifically, the solid-state image pickup apparatus 100 mentioned above can be applied as the image pickup unit 11402. By applying the technology according to the present disclosure to the image pickup unit 11402, the occurrence of noise is suppressed, and clearer images of surgical regions can be obtained. Accordingly, it becomes possible for a surgeon to check surgical regions surely.

Note that while the endoscopic surgery system is explained as one example here, the technology according to the present disclosure may be applied to others, for example, microscopic surgery systems and the like.

19. Examples of Application to Mobile Body

Furthermore, the technology according to the present disclosure may be realized as an apparatus to be mounted on any type of mobile body such as, for example, an automobile, an electric automobile, a hybrid electric automobile, a motorcycle, a bicycle, a personal mobility, an airplane, a drone, a ship or a robot.

FIG. 266 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 266, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 266, an audio speaker 12061, a display section 12062, and an instrument panel 12063 are illustrated as the output device. The display section 12062 may, for example, include at least one of an on-board display and a head-up display.

FIG. 267 is a diagram depicting an example of the installation position of the imaging section 12031.

In FIG. 267, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 267 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure can be applied is explained above. The technology according to the present disclosure can be applied, for example, to the imaging section 12031 in the configuration explained above. Specifically, the solid-state image pickup apparatus 100 mentioned above can be applied as the imaging section 12031. By applying the technology according to the present disclosure to the imaging section 12031, the occurrence of noise is suppressed, and captured images that are easier to see can be obtained. Accordingly, it becomes possible to assist driving by drivers appropriately.

Embodiments of the present technology are not limited to the embodiments mentioned above, and various modifications are possible within the scope not deviating from the gist of the present technology.

Note that the effects described in the present specification are described merely for illustrative purposes, but not for limiting purposes. There may be effects other than those described in the present specification.

Note that the present technology can have configurations like the ones mentioned below.

(1)

A circuit board including:

first conductors arranged regularly in a first direction;

second conductors arranged regularly in the first direction; and third conductors arranged regularly in the first direction, in which a first power supply connected to the first conductors, a second power supply connected to the second conductors, and a third power supply connected to the third conductors are different power supplies.

(2)

The circuit board according to (1) above, in which at least two of the first conductors, the second conductors, and the third conductors are arranged regularly in the first direction at a same or substantially a same pitch.

(3)

The circuit board according to (1) or (2) above, including:

a circuit block electrically connected with the first power supply, the second power supply, and the third power supply via the first conductors, the second conductors, and the third conductors.

(4)

The circuit board according to (3) above, including:

a selecting unit capable of selecting a first path including at least the first power supply, the circuit block, and the second power supply, and a second path including at least the first power supply, the circuit block, and the third power supply.

(5)

The circuit board according to (4) above, in which total power consumption in a case in which the first path is selected is same as or larger than total power consumption in a case in which the second path is selected.

(6)

The circuit board according to (4) or (5) above, in which a total current amount in a case in which the first path is selected is same as or larger than a total current amount in a case in which the second path is selected.

(7)

The circuit board according to any of (1) to (6) above, in which a power supply voltage value of the second power supply is same as or larger than a power supply voltage value of the third power supply.

(8)

The circuit board according to any of (1) to (7) above, in which the first power supply, the second power supply, and the third power supply have power supply voltage values different from each other.

(9)

The circuit board according to any of (1) to (8) above, in which a conductor area size of the first conductors in a predetermined range is same or substantially same as a conductor area size of the second conductors in the predetermined range.

(10)

The circuit board according to any of (1) to (9) above, in which a conductor area size of the first conductors in a predetermined range is different from a conductor area size of the third conductors in the predetermined range.

(11)

The circuit board according to any of (1) to (10) above, in which a conductor area size of the second conductors in a predetermined range is different from a conductor area size of the third conductors in the predetermined range.

(12)

The circuit board according to any of (1) to (11) above, in which at least two of the first conductors, the second conductors, and the third conductors are arranged regularly in a second direction orthogonal to the first direction.

(13)

The circuit board according to (12) above, in which at least two of the first conductors, the second conductors, and the third conductors are arranged being provided with pitch displacement in the second direction according to positions in the first direction.

(14)

The circuit board according to any of (1) to (13) above, in which at least two of the first conductors, the second conductors, and the third conductors are arranged in one conductor layer.

(15)

The circuit board according to any of (1) to (14) above, in which the first conductors are arranged in a first conductor layer, the second conductors are arranged in a second conductor layer, and the third conductors are arranged in a third conductor layer.

(16)

The circuit board according to any of (1) to (15) above, further including:

fourth conductors connected to the first power supply;

fifth conductors connected to the second power supply; and sixth conductors connected to the third power supply, in which the first conductors, the second conductors, and the third conductors are arranged in a first conductor layer, and the fourth conductors, the fifth conductors, and the sixth conductors are arranged in a second conductor layer.

(17)

The circuit board according to (16) above, in which the fourth conductors, the fifth conductors, and the sixth conductors are arranged regularly in the first direction.

(18)

The circuit board according to (16) or (17) above, in which the fourth conductors, the fifth conductors, and the sixth conductors are arranged regularly in a second direction orthogonal to the first direction.

(19)

A semiconductor apparatus including:

a circuit board including first conductors arranged regularly in a first direction, second conductors arranged regularly in the first direction, and third conductors arranged regularly in the first direction, a first power supply connected to the first conductors, a second power supply connected to the second conductors, and a third power supply connected to the third conductors being different power supplies.

(20)

Electronic equipment including:

a semiconductor apparatus including a circuit board including first conductors arranged regularly in a first direction, second conductors arranged regularly in the first direction, and third conductors arranged regularly in the first direction, a first power supply connected to the first conductors, a second power supply connected to the second conductors, and a third power supply connected to the third conductors being different power supplies.

REFERENCE SIGNS LIST

10: Pixel board
11: Victim conductor loop
20: Logic board
21: Power supply wire
100: Solid-state image pickup apparatus
101: First semiconductor board
102: Second semiconductor board
111: Pixel/analog processing unit
112: Digital processing unit
121: Pixel array
122: A/D converting unit
123: Vertical scanning unit
131: Pixel
132: Signal line
133: Control line
141: Photodiode
Vdd: First power supply
Vss1: Second power supply
Vss2: Third power supply
165A to 165C: Wiring layer
2001: Circuit block
2002: Selecting unit
2003: Control unit
2021 to 2023: Wire
2101 to 2103: Linear conductor
2111 to 2113: Linear conductor

2121 to 2123: Linear conductor
2131 to 2133: Linear conductor
2141 to 2143: Linear conductor
2151 to 2153: Linear conductor
2161 to 2163: Linear conductor
2171 to 2173: Linear conductor
2181 to 2183: Linear conductor
2191 to 2193: Linear conductor
2201 to 2203: Linear conductor
2211 to 2213: Rectangular conductor
2221 to 2223: Linear conductor
2251 to 2253: Rectangular conductor
2271: Linear conductor
2272, 2273: Rectangular conductor
2281, 2282: Rectangular conductor
2283: Linear conductor
2301 to 2303: Mesh conductor
2304, 2305: Relay conductor
2306: Mesh conductor
2311, 2312: Relay conductor
2321 to 2323: Mesh conductor
2331 to 2333: Mesh conductor
2341, 2342: Relay conductor
2251 to 2253: Relay conductor
2361, 2362: Mesh conductor
2363: Relay conductor
2371, 2372: Relay conductor
2411, 2412: Linear conductor
2421, 2422: Linear conductor

The invention claimed is:

1. A circuit board, comprising:
- a plurality of sets of conductors at regular intervals in a first direction, wherein each set of the plurality of sets of conductors comprises a first conductor,
- a second conductor, and a third conductor,
  - the first conductor is connected to a first power supply,
  - the second conductor is connected to a second power supply,
  - the third conductor is connected to a third power supply,
  - the plurality of sets of conductors comprises a first set of conductors and a second set of conductors, and
  - a distance between the first conductor of the first set of conductors and the first conductor of the second set of conductors in the first direction is equal to a distance between the second conductor of the first set of conductors and the second conductor of the second set of conductors in the first direction;
- a circuit block electrically connected with:
  - the first power supply via the first conductor,
  - the second power supply via the second conductor, and
  - the third power supply via the third conductor; and
- a selecting unit configured to select:
  - a first path including at least the first power supply, the circuit block, and the second power supply; and
  - a second path including at least the first power supply, the circuit block, and the third power supply.

2. The circuit board according to claim 1, wherein a total power consumption in a case in which the first path is selected is one of same as or larger than a total power consumption in a case in which the second path is selected.

3. The circuit board according to claim 1, wherein a total current amount in a case in which the first path is selected is one of same as or larger than a total current amount in a case in which the second path is selected.

4. The circuit board according to claim 1, wherein a power supply voltage value of the second power supply is one of same as or larger than a power supply voltage value of the third power supply.

5. The circuit board according to claim 1, wherein
- the first power supply has a power supply voltage value different from each of a power supply voltage value of the second power supply and a power supply voltage value of the third power supply, and
- the power supply voltage value of the second power supply is different from the power supply voltage value of the third power supply.

6. The circuit board according to claim 1, wherein a conductor area size of the first conductor across the plurality of sets of conductors in a determined range is one of same or substantially same as a conductor area size of the second conductor across the plurality of sets of conductors in the determined range.

7. The circuit board according to claim 1, wherein a conductor area size of the first conductor across the plurality of sets of conductors in a determined range is different from a conductor area size of the third conductor across the plurality of sets of conductors in the determined range.

8. The circuit board according to claim 1, wherein a conductor area size of the second conductor across the plurality of sets of conductors in a determined range is different from a conductor area size of the third conductor across the plurality of sets of conductors in the determined range.

9. The circuit board according to claim 1, wherein at least two of the first conductor, the second conductor, and the third conductor are at regular intervals in a second direction orthogonal to the first direction.

10. The circuit board according to claim 9, wherein at least two of the first conductor, the second conductor, and the third conductor have pitch displacement in the second direction based on a position of each conductor of the plurality of sets of conductors in the first direction.

11. The circuit board according to claim 1, wherein the first conductor is in a first conductor layer, the second conductor is in a second conductor layer, and the third conductor is in a third conductor layer.

12. A semiconductor apparatus, comprising:
- a circuit board including a plurality of sets of conductors at regular intervals in a first direction, wherein
  - each set of the plurality of sets of conductors comprises a first conductor, a second conductor, and a third conductor;
  - a first power supply connected to the first conductor;
  - a second power supply connected to the second conductor;
  - a third power supply connected to the third conductor;
  - the plurality of sets of conductors comprises a first set of conductors and a second set of conductors; and
  - a distance between the first conductor of the first set of conductors and the first conductor of the second set of conductors in the first direction is equal to a distance between the second conductor of the first set of conductors and the second conductor of the second set of conductors in the first direction;
- a circuit block electrically connected with:
  - the first power supply via the first conductor,
  - the second power supply via the second conductor, and
  - the third power supply via the third conductor; and
- a selecting unit configured to select:
  - a first path including at least the first power supply, the circuit block, and the second power supply; and a second path including at least the first power supply, the circuit block, and the third power supply.

13. An electronic equipment, comprising:

a semiconductor apparatus including:

a circuit board which includes a plurality of sets of conductors at regular intervals in a first direction, wherein each set of the plurality of sets of conductors comprises a first conductor, a second conductor, and a third conductor;

a first power supply connected to the first conductor;

a second power supply connected to the second conductor;

a third power supply connected to the third conductor;

the plurality of sets of conductors comprises a first set of conductors and a second set of conductors; and a distance between the first conductor of the first set of conductors and the first conductor of the second set of conductors in the first direction is equal to a distance between the second conductor of the first set of conductors and the second conductor of the second set of conductors in the first direction;

a circuit block electrically connected with:

the first power supply via the first conductor;

the second power supply via the second conductor; and the third power supply via the third conductor; and a selecting unit configured to select:

a first path including at least the first power supply, the circuit block, and the second power supply; and a second path including at least the first power supply, the circuit block, and the third power supply.

14. A circuit board, comprising:

a plurality of sets of conductors at regular intervals in a first direction, wherein each set of the plurality of sets of conductors comprises a first conductor, a second conductor, and a third conductor, the first conductor is connected to a first power supply, the second conductor is connected to a second power supply, the third conductor is connected to a third power supply, fourth conductors connected to the first power supply;

fifth conductors connected to the second power supply; and sixth conductors connected to the third power supply, wherein the first conductor, the second conductor, and the third conductor are in a first conductor layer, the fourth conductors, the fifth conductors, and the sixth conductors are in a second conductor layer, the fourth conductors, the fifth conductors, and the sixth conductors are in at regular intervals in a second direction which is orthogonal to the first direction, and each of the fourth conductors, the fifth conductors, and the sixth conductors extends in the second direction;

a circuit block electrically connected with:

the first power supply via the first conductor, the second power supply via the second conductor, and the third power supply via the third conductor; and a selecting unit configured to select:

a first path including at least the first power supply, the circuit block, and the second power supply; and a second path including at least the first power supply, the circuit block, and the third power supply.

15. The circuit board according to claim 1, wherein at least two of the first conductor, the second conductor, and the third conductor are in one conductor layer.

16. The circuit board according to claim 1, further comprising:

fourth conductors connected to the first power supply;

fifth conductors connected to the second power supply; and sixth conductors connected to the third power supply, wherein the first conductor, the second conductor, and the third conductor are in a first conductor layer, and the fourth conductors, the fifth conductors, and the sixth conductors are in a second conductor layer.

17. The circuit board according to claim 16, wherein the fourth conductors, the fifth conductors, and the sixth conductors are at regular intervals in the first direction.

18. The circuit board according to claim 16, wherein the fourth conductors, the fifth conductors, and the sixth conductors are at regular intervals in a second direction orthogonal to the first direction.

* * * * *